US011685859B2

(12) United States Patent
Ha et al.

(10) Patent No.: US 11,685,859 B2
(45) **Date of Patent: *Jun. 27, 2023**

(54) ORGANIC LIGHT EMITTING DEVICE

(71) Applicant: LG CHEM, LTD., Seoul (KR)

(72) Inventors: Jae Seung Ha, Daejeon (KR); Yeon Hwan Kim, Daejeon (KR); Sang Young Jeon, Daejeon (KR); Sung Kil Hong, Daejeon (KR); Yong Bum Cha, Daejeon (KR); Seong Mi Cho, Daejeon (KR)

(73) Assignee: LG CHEM, LTD., Seoul (KR)

( * ) Notice: Subject to any disclaimer, the term of this patent is extended or adjusted under 35 U.S.C. 154(b) by 445 days.

This patent is subject to a terminal disclaimer.

(21) Appl. No.: 16/754,904

(22) PCT Filed: Oct. 5, 2018

(86) PCT No.: PCT/KR2018/011790

§ 371 (c)(1),
(2) Date: Apr. 9, 2020

(87) PCT Pub. No.: WO2019/117440

PCT Pub. Date: Jun. 20, 2019

(65) Prior Publication Data

US 2021/0009894 A1 Jan. 14, 2021

(30) Foreign Application Priority Data

Dec. 12, 2017 (KR) ........................ 10-2017-0170536

(51) Int. Cl.
*C09K 11/06* (2006.01)
*H10K 50/15* (2023.01)
*H10K 50/165* (2023.01)
*H10K 85/60* (2023.01)

(52) U.S. Cl.
CPC ............ *C09K 11/06* (2013.01); *H10K 50/156* (2023.02); *H10K 50/165* (2023.02); *H10K 85/631* (2023.02); *H10K 85/6572* (2023.02); *C09K 2211/1014* (2013.01); *C09K 2211/1029* (2013.01)

(58) Field of Classification Search
CPC ............ C09K 11/06; C09K 2211/1014; C09K 2211/1029; H01L 51/0059; H01L 51/0072; H01L 51/5064; H01L 51/5076
See application file for complete search history.

(56) References Cited

U.S. PATENT DOCUMENTS 7,274,141 B2 9/2007 Leo et al.
10,454,056 B1 * 10/2019 Chun .................. H10K 85/631
11,581,494 B2 * 2/2023 Lee ...................... H10K 85/657
11,594,685 B2 * 2/2023 Huh ....................... H10K 50/00
2007/0090351 A1 * 4/2007 Park .................... H01L 51/0545 257/66
2010/0224856 A1 * 9/2010 Iizumi .................... H05B 33/14 977/950
2014/0039221 A1 * 2/2014 Yokoyama .......... H01L 51/0059 564/434
2014/0319472 A1 * 10/2014 Cho .................... H01L 51/0061 257/40

(Continued)

FOREIGN PATENT DOCUMENTS

CN 102027613 4/2011
CN 103619833 A 3/2014

(Continued)

*Primary Examiner* — Alexander R Pagano
(74) *Attorney, Agent, or Firm* — Dentons US LLP

(57) ABSTRACT

Provided is a compound of Chemical Formula 1:

Chemical Formula 1

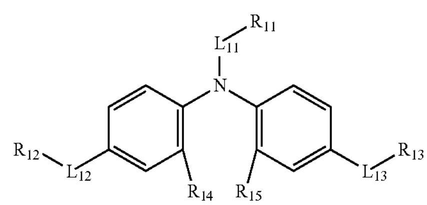

wherein:

$L_{11}$ is a single bond or a substituted or unsubstituted $C_{6-60}$ arylene;

$L_{12}$ and $L_{13}$ are each independently a single bond or a substituted or unsubstituted $C_{6-60}$ arylene;

$R_{11}$ is a substituted or unsubstituted $C_{6-60}$ aryl;

$R_{12}$ and $R_{13}$ are each independently any one substituent selected from the group consisting of the following:

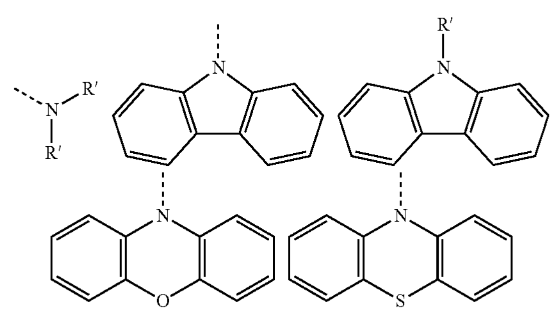

wherein, each R' is independently a substituted or unsubstituted $C_{6-60}$ aryl, and $R_{14}$ and $R_{15}$ are hydrogen, or are linked to each other, and an organic light emitting device including the same.

15 Claims, 1 Drawing Sheet

(56) References Cited

U.S. PATENT DOCUMENTS

| | | | |
|---|---|---|---|
| 2016/0093808 A1 | 3/2016 | Adamovich et al. | |
| 2017/0054087 A1 | 2/2017 | Zeng et al. | |
| 2017/0125487 A1* | 5/2017 | Song | H01L 51/56 |
| 2017/0244050 A1* | 8/2017 | Lee | H01L 51/005 |
| 2017/0365788 A1 | 12/2017 | Cha et al. | |
| 2018/0151819 A1* | 5/2018 | Kim | H01L 51/5056 |
| 2018/0287069 A1 | 10/2018 | Cha et al. | |
| 2018/0337348 A1* | 11/2018 | Jung | C07D 409/14 |
| 2019/0006590 A1 | 1/2019 | Park et al. | |
| 2019/0013490 A1* | 1/2019 | Cho | H01L 51/0054 |
| 2019/0198780 A1* | 6/2019 | Kim | H10K 85/654 |
| 2019/0296244 A1 | 9/2019 | Mun et al. | |
| 2019/0296248 A1 | 9/2019 | Mun et al. | |
| 2019/0312223 A1* | 10/2019 | Chun | H01L 51/0059 |

FOREIGN PATENT DOCUMENTS

| | | | |
|---|---|---|---|
| CN | 107108498 A | 8/2017 | |
| JP | 2017107992 | 6/2017 | |
| KR | 10-20000051826 | 8/2000 | |
| KR | 2009028943 A * | 3/2009 | |
| KR | 10-2011-0018311 | 2/2011 | |
| KR | 10-20150136028 | 12/2015 | |
| KR | 10-20160080090 | 7/2016 | |
| KR | 2016076883 A * | 7/2016 | |
| KR | 10-1744248 | 6/2017 | |
| KR | 1744248 B1 * | 6/2017 | C07C 211/54 |
| KR | 10-20170123955 | 11/2017 | |
| KR | 10-20170134163 | 12/2017 | |
| KR | 10-20170134215 | 12/2017 | |
| KR | 10-20170136391 | 12/2017 | |
| TW | 201726638 | 8/2017 | |
| WO | 2003012890 | 2/2003 | |
| WO | 2009-139475 | 11/2009 | |
| WO | 2012-141499 | 10/2012 | |
| WO | 2016108596 | 7/2016 | |
| WO | WO-2018093015 A1 * | 5/2018 | C07D 209/82 |

* cited by examiner

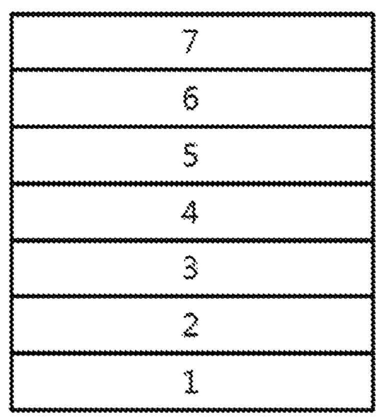
7
6
5
4
3
2
1

ORGANIC LIGHT EMITTING DEVICE

CROSS-REFERENCE TO RELATED APPLICATION(S)

This application is a National Stage Application of International Application No. PCT/KR2018/011790 filed on Oct. 5, 2018, which claims priority to or the benefit of Korean Patent Application No. 10-2017-0170536 filed with the Korean Intellectual Property Office on Dec. 12, 2017, the disclosure of which is incorporated herein by reference in its entirety.

TECHNICAL FIELD

The present invention relates to an organic light emitting device.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

PRIOR ART LITERATURE

Patent Literature (Patent Literature 1) Korean Unexamined Patent Publication No. 10-2000-0051826

BRIEF DESCRIPTION

Technical Problem

It is an object of the present invention to provide an organic light emitting device.

Technical Solution

In one aspect of the invention, there is provided the following organic light emitting device:

An organic light emitting device including an anode;

a hole transport layer;

a hole control layer;

a light emitting layer;

an electron transport layer; and a cathode, wherein the hole control layer includes a compound of the following Chemical Formula 1, and wherein the light emitting layer includes (i) a compound of the following Chemical Formula 2-1, or a compound of the following Chemical Formula 2-2; and (ii) a compound of the following Chemical Formula 3:

Chemical Formula 1

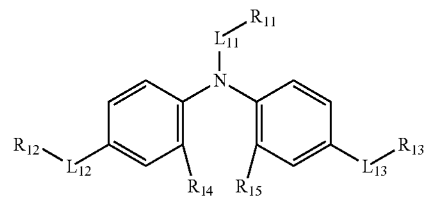

wherein, in Chemical Formula 1:

$L_{11}$ is a single bond or a substituted or unsubstituted $C_{6-60}$ arylene;

$L_{12}$ and $L_{13}$ are each independently a single bond or a substituted or unsubstituted $C_{6-60}$ arylene;

$R_{11}$ is a substituted or unsubstituted $C_{6-60}$ aryl;

$R_{12}$ and $R_{13}$ are each independently any one substituent selected from the group consisting of the following:

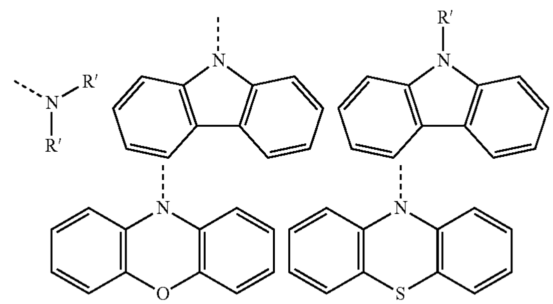

wherein, each R' is independently a substituted or unsubstituted $C_{6-60}$ aryl;

$R_{14}$ and $R_{15}$ are hydrogen, or are linked to each other;

Chemical Formula 2-1

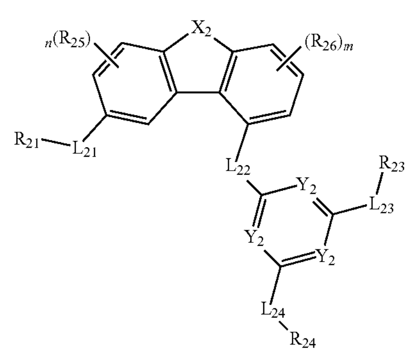

-continued

Chemical Formula 2-2

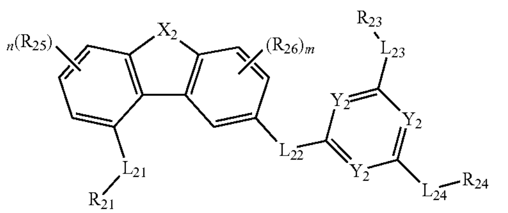

wherein, in Chemical Formulas 2-1 and 2-2:

$X_2$ is O, or S;

each $Y_2$ is independently N or CH, with the proviso that at least one of $Y_2$ is N;

$L_{21}$, $L_{22}$, $L_{23}$, and $L_{24}$ are each independently a single bond or a substituted or unsubstituted $C_{6-60}$ arylene;

$R_{21}$ is a substituted or unsubstituted $C_{6-60}$ aryl or the following substituent:

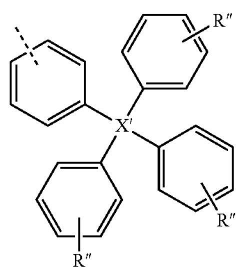

wherein, X' is C or Si, and each R" is independently hydrogen, $C_{1-60}$ alkyl, or $Si(C_{1-60}\ alkyl)_3$;

$R_{23}$ and $R_{24}$ are each independently a substituted or unsubstituted $C_{6-60}$ aryl or a substituted or unsubstituted $C_{2-60}$ heteroaryl containing any one or more heteroatoms selected from the group consisting of N, O, and S;

$R_{25}$ and $R_{26}$ are each independently hydrogen, deuterium, a substituted or unsubstituted $C_{1-60}$ alkyl, cyano, or a substituted or unsubstituted $C_{6-60}$ aryl;

n and m are each independently an integer of 1 to 3;

Chemical Formula 3

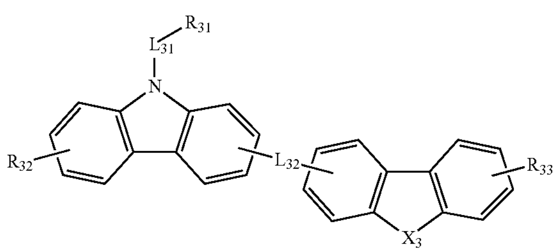

wherein, in Chemical Formula 3:

$L_{31}$ is a single bond or a substituted or unsubstituted $C_{6-60}$ arylene;

$L_{32}$ is a single bond or a substituted or unsubstituted $C_{6-60}$ arylene;

$R_{31}$ is a substituted or unsubstituted $C_{3-60}$ cycloalkyl, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

$R_{32}$ and $R_{33}$ are each independently hydrogen, cyano, a substituted or unsubstituted $C_{1-60}$alkyl; a substituted or unsubstituted $C_{6-60}$ aryl; or a substituted or unsubstituted $C_{2-60}$ heteroaryl containing any one or more heteroatoms selected from the group consisting of N, O and S;

$X_3$ is O, S, $C(CH_3)_2$, N—$R_{34}$, or

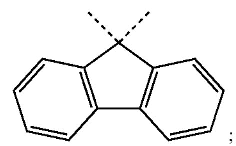

;

and $R_{34}$ is a substituted or unsubstituted $C_{6-60}$ aryl.

Advantageous Effects

The organic light emitting device described above can improve the efficiency, achieve low driving voltage and/or improve lifetime characteristics in the organic light emitting device by adjusting the compound included in the hole control layer and the light emitting layer.

BRIEF DESCRIPTION OF THE DRAWINGS

FIG. 1 shows an example of an organic light emitting device comprising a substrate 1, an anode 2, a hole transport layer 3, a hole control layer 4, a light emitting layer 5, an electron transport layer 6, and a cathode 7.

DETAILED DESCRIPTION

Hereinafter, embodiments of the present invention will be described in more detail to facilitate understanding of the invention.

The present invention provides the compound of Chemical Formula 1.

As used herein, the notation

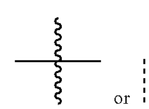

means a bond linked to another substituent group.

As used herein, the term "substituted or unsubstituted" means being unsubstituted or substituted with one or more substituents selected from the group consisting of deuterium, a halogen group, a nitrile group, a nitro group, a hydroxy group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, and a heterocyclic group containing at least one of N, O and S atoms, or being unsubstituted or substituted with a substituent to which two or more substituents are linked among the substituents exemplified above. For example, "the substituent to which two or more substituents are linked" can be a biphenyl group. That is, the biphenyl group can also be an aryl group and can be interpreted as a substituent to which two phenyl groups are linked.

In the present specification, the number of carbon atoms of a carbonyl group is not particularly limited, but is preferably 1 to 40. Specifically, the carbonyl group can be a compound having the following structural formulas, but is not limited thereto:

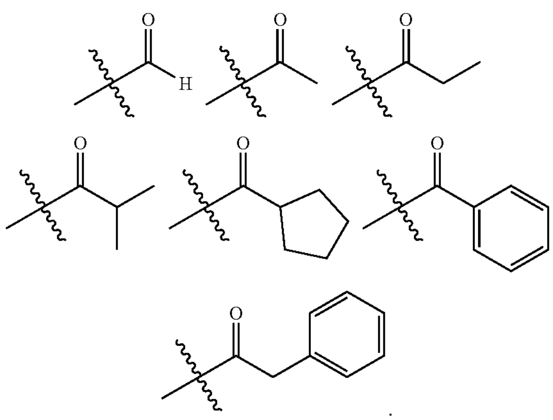

In the present specification, an ester group can have a structure in which oxygen of the ester group can be substituted by a straight-chain, branched-chain, or cyclic alkyl group having 1 to 25 carbon atoms, or an aryl group having 6 to 25 carbon atoms. Specifically, the ester group can be a compound having the following structural formulas, but is not limited thereto:

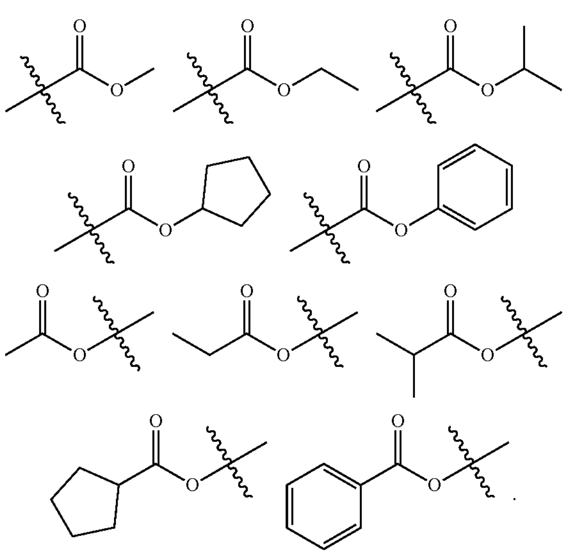

In the present specification, the number of carbon atoms of an imide group is not particularly limited, but is preferably 1 to 25. Specifically, the imide group can be a compound having the following structural formulas, but is not limited thereto:

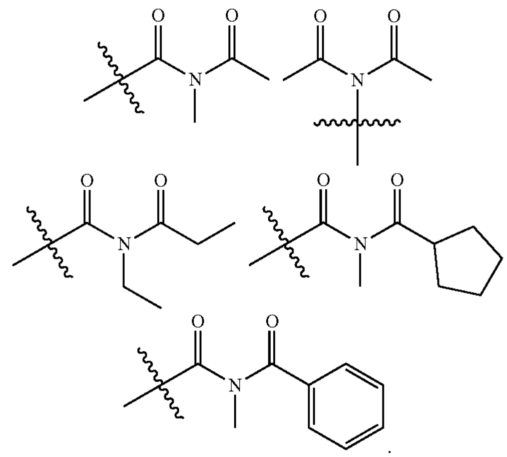

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group can be straight-chain or branched-chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group can be straight-chain or branched-chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethyl-cyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and it can be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group can be a phenyl group, a biphenyl group, a terphenyl group or the like as the monocyclic aryl group, but is not limited thereto. The polycyclic aryl group includes a naphthyl group, an anthracenyl group, a phenanthryl group, a pyrenyl group, a perylenyl group, a chrysenyl group, a fluorenyl group or the like, but is not limited thereto.

In the present specification, a fluorenyl group can be substituted, and two substituent groups can be bonded to each other to form a spiro structure. In the case where the fluorenyl group is substituted,

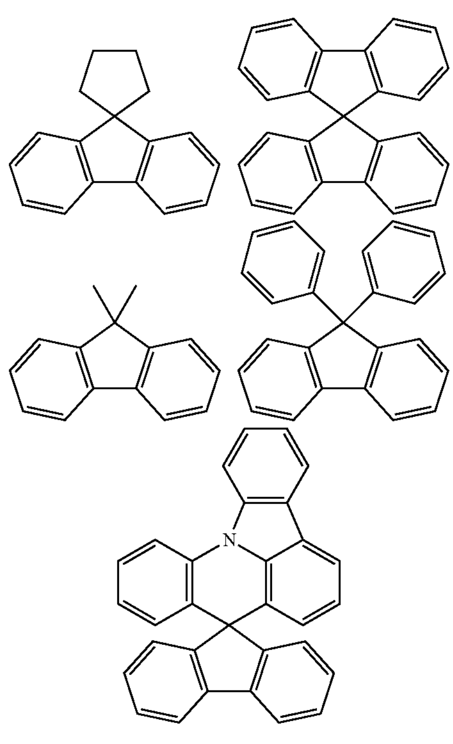

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group can be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocyclic group is not a monovalent group but formed by combining two substituent groups.

An embodiment of the present invention provides an organic light emitting device including an anode; a hole transport layer; a hole control layer; a light emitting layer; an electron transport layer; and a cathode, wherein the hole control layer includes a compound of the following Chemical Formula 1, and wherein the light emitting layer includes (i) the compound of Chemical Formula 2-1, or the compound of Chemical Formula 2-2; and (ii) the compound of Chemical Formula 3.

The organic light emitting device according the present invention can improve the efficiency, achieve low driving voltage and/or improve lifetime characteristics in the organic light emitting device by adjusting the compound included in the hole control layer and the light emitting layer.

Hereinafter, the present invention will be described in detail with respect to each component.

Anode and Cathode

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Also, a hole injection layer can be further included on the anode. The hole injection layer is made of a hole injection material, and the hole injection material is preferably a compound which has a capability of transporting the holes, thus has a hole injecting effect in the anode and an excellent hole-injecting effect to the light emitting layer or the light emitting material, prevents excitons produced in the light emitting layer from moving to an electron injection layer or the electron injection material, and is excellent in the ability to form a thin film.

It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present invention is a layer receiving holes from the hole injection layer which is formed on the anode or the cathode, and transporting the holes to the light emitting layer. The hole transport material is suitably a material having large mobility to the holes, which can receive holes from the anode or the hole injection layer and transfer the holes to the light emitting layer.

Specific examples thereof include an arylamine-based organic material, a conductive polymer, a block copolymer in which a conjugate portion and a non-conjugate portion are present together, and the like, but are not limited thereto.

Hole Control Layer

The hole control layer refers to a layer that serves to control the mobility of holes according to the energy level of the light emitting layer in the organic light emitting device. In particular, in the present invention, the compound of Chemical Formula 1 is used as a material of the hole control layer.

Preferably, $L_{11}$ is a single bond.

Preferably, $L_{12}$ and $L_{13}$ are each independently a single bond, phenylene, or biphenyldiyl.

Preferably, $R_{11}$ is phenyl, biphenylyl, terphenylyl, naphthyl, or dimethylfluorenyl.

Preferably, each R' is independently phenyl, biphenylyl, or naphthyl.

Representative examples of the compound of Chemical Formula 1 are as follows:

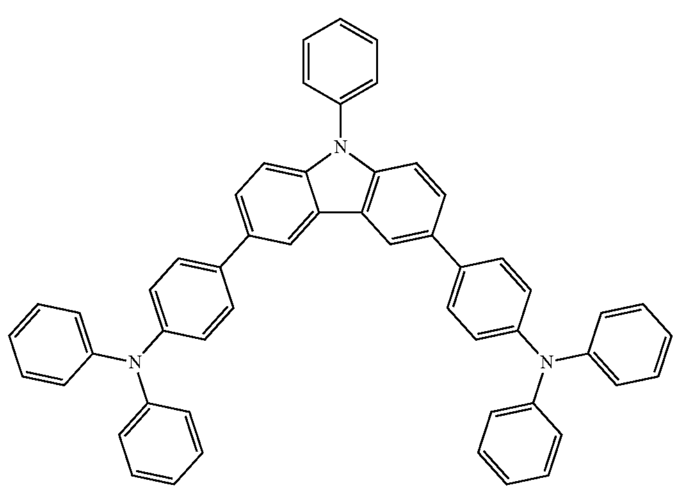

-continued
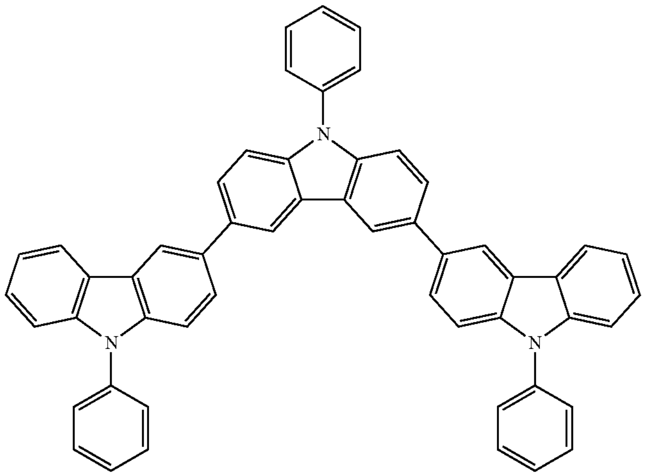
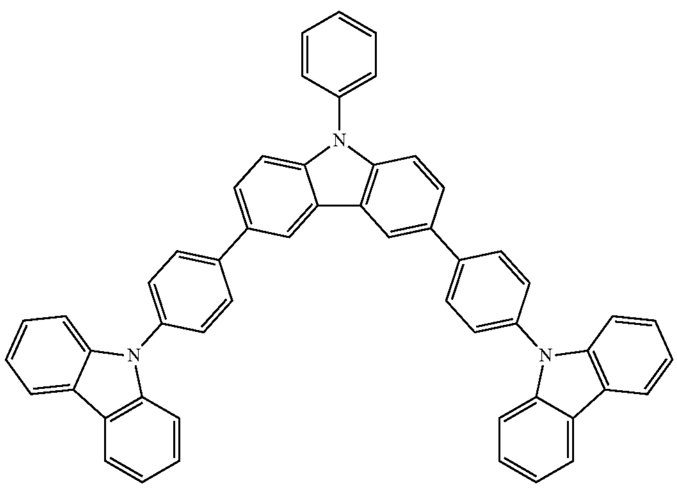
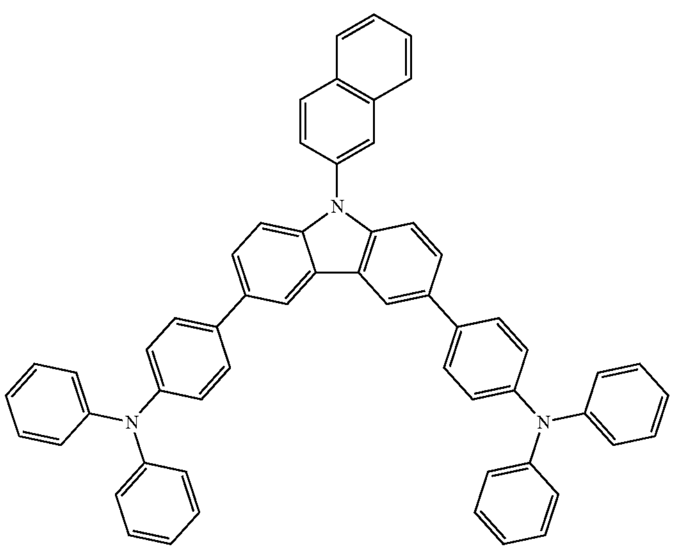

-continued
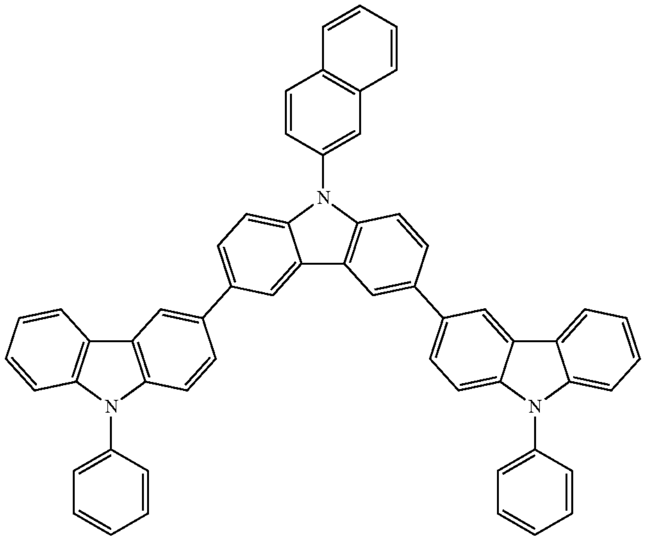
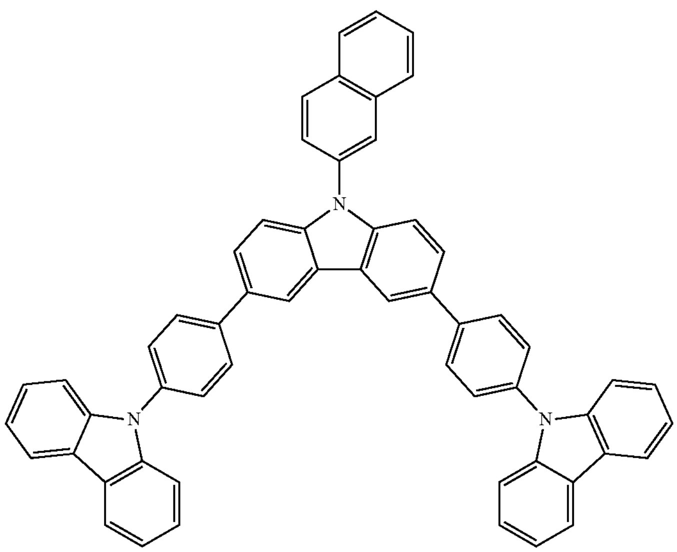
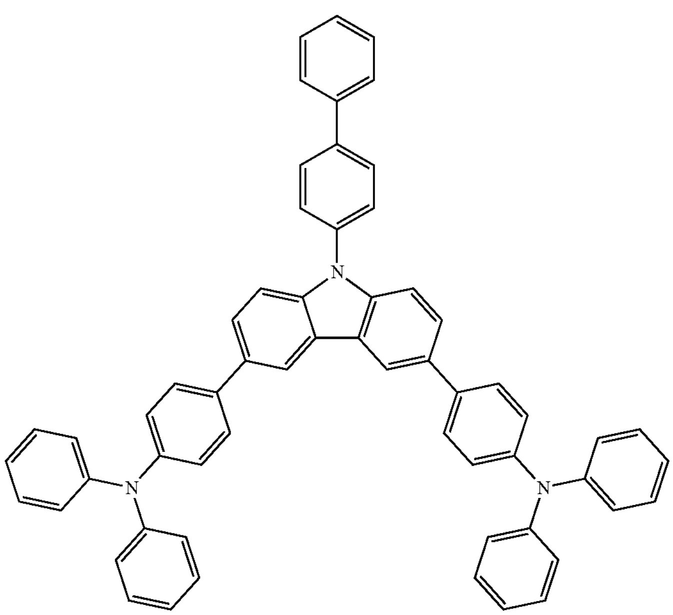

-continued
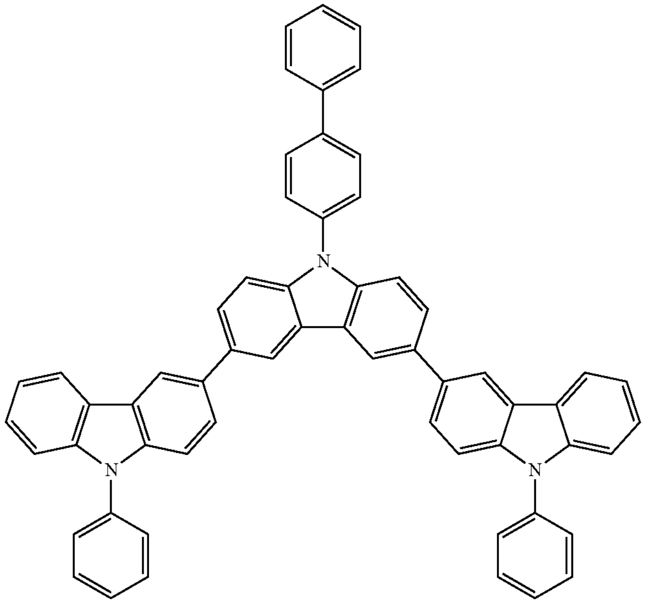
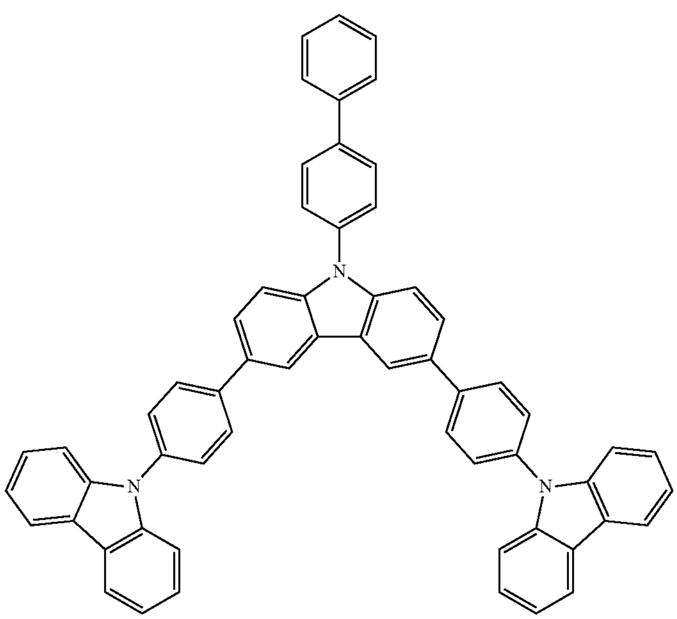

-continued
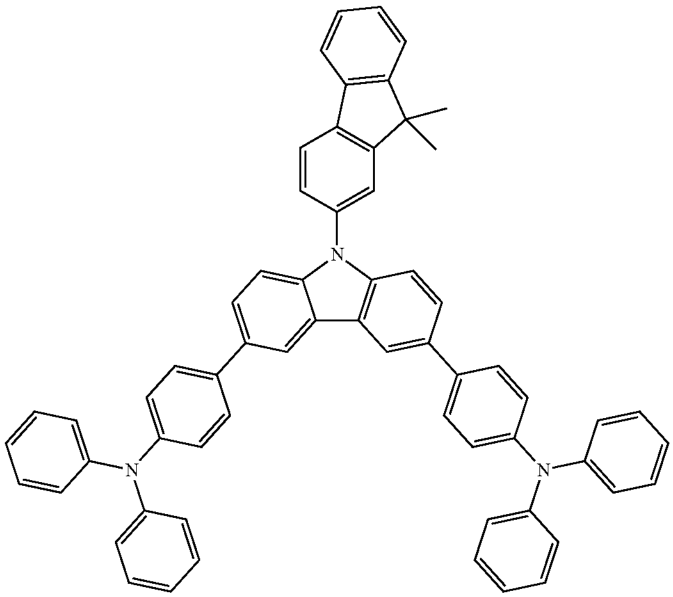
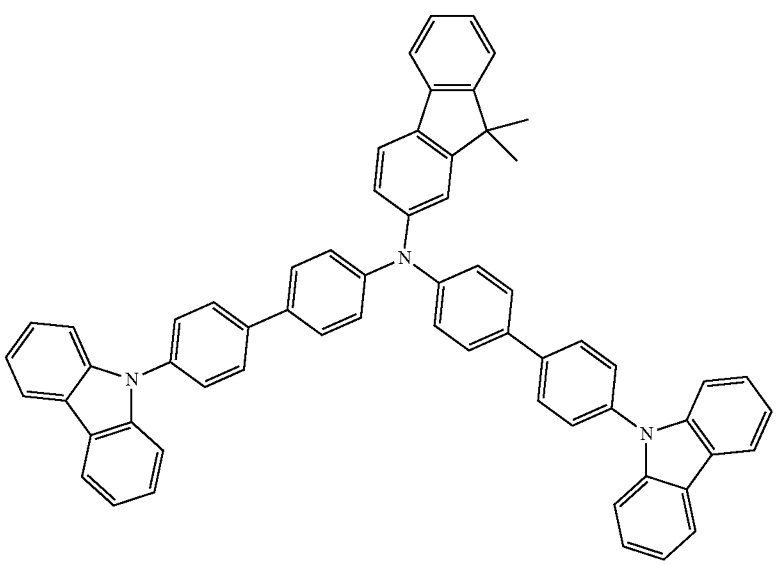

-continued
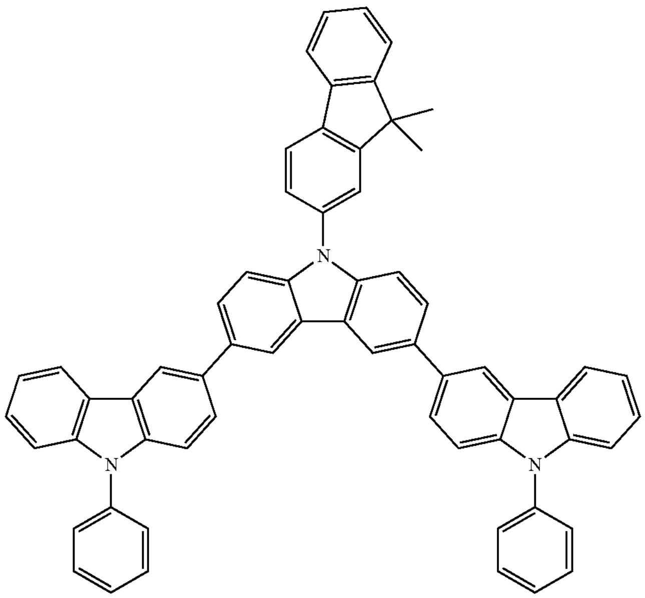
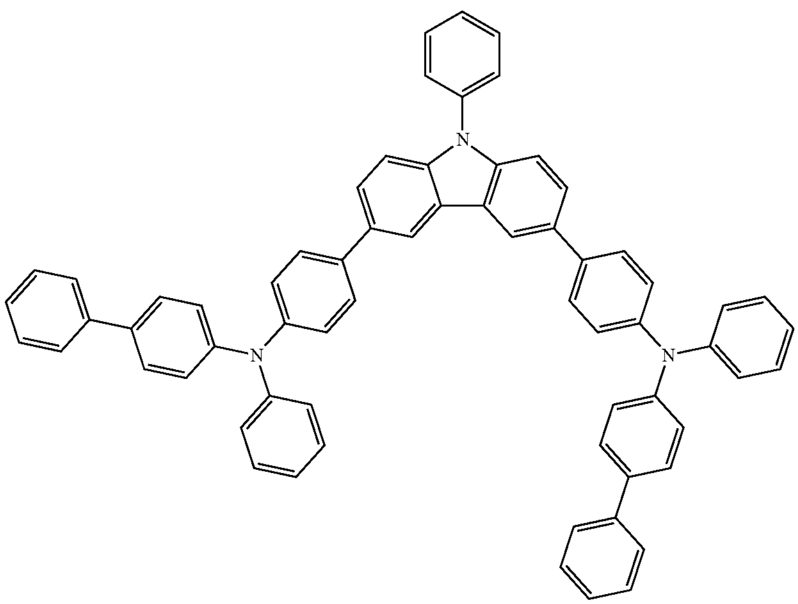
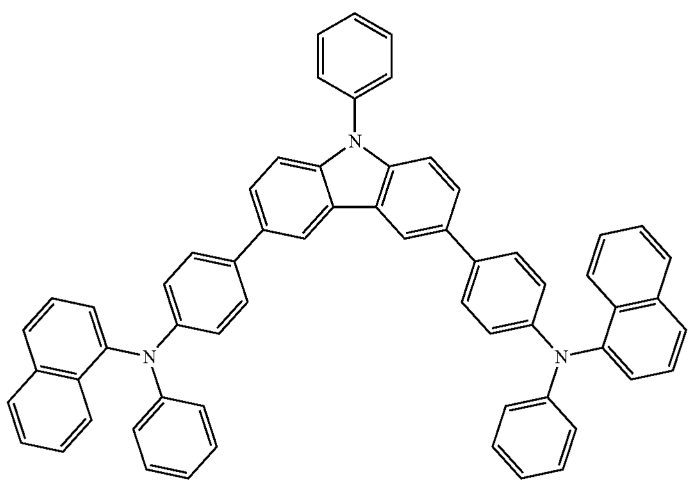

-continued
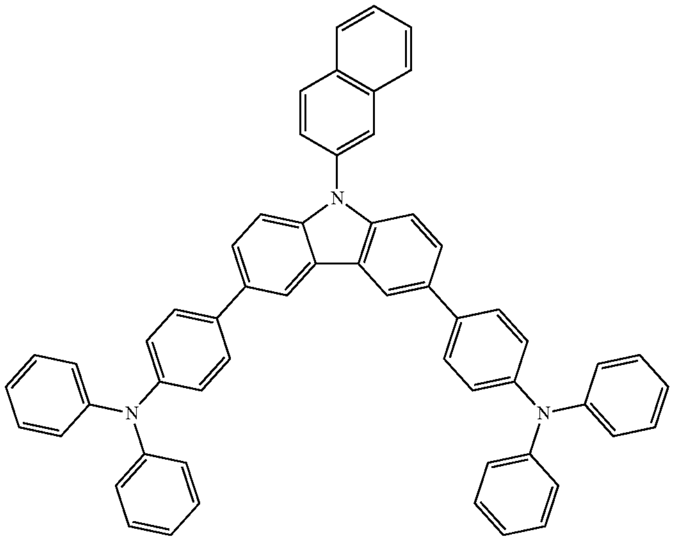
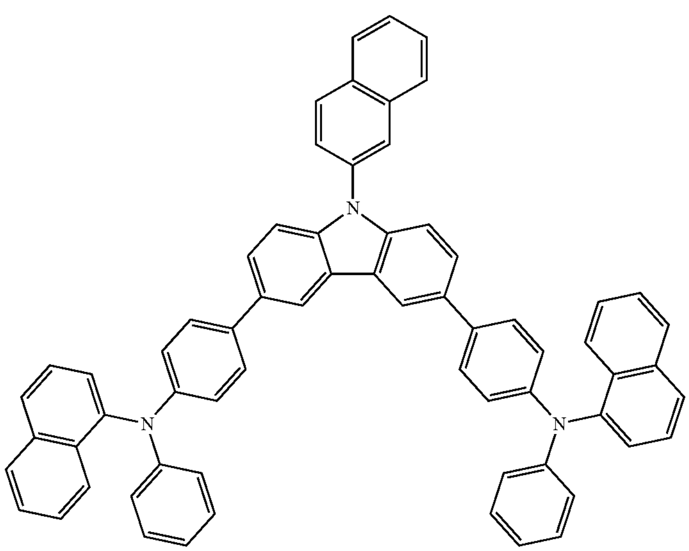

-continued
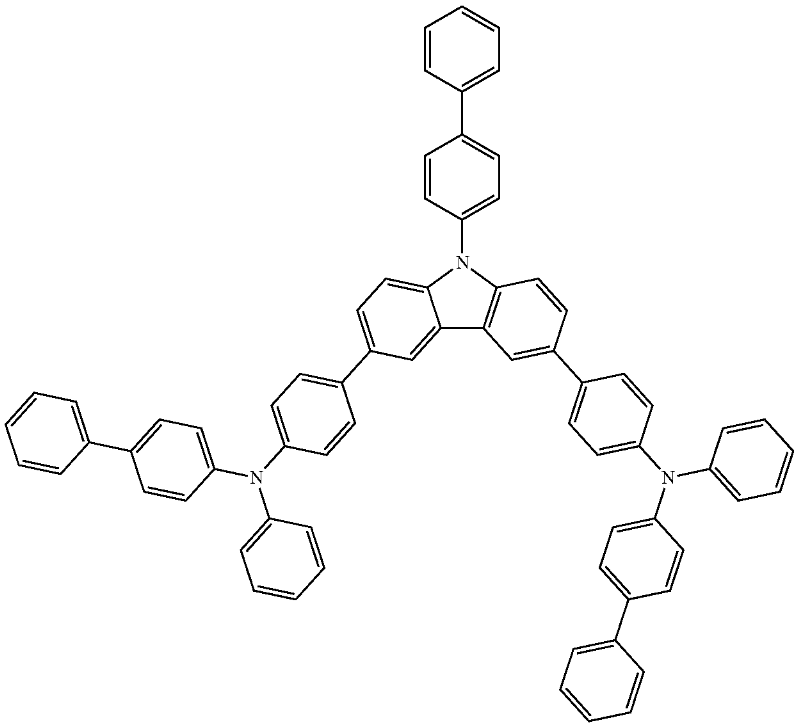
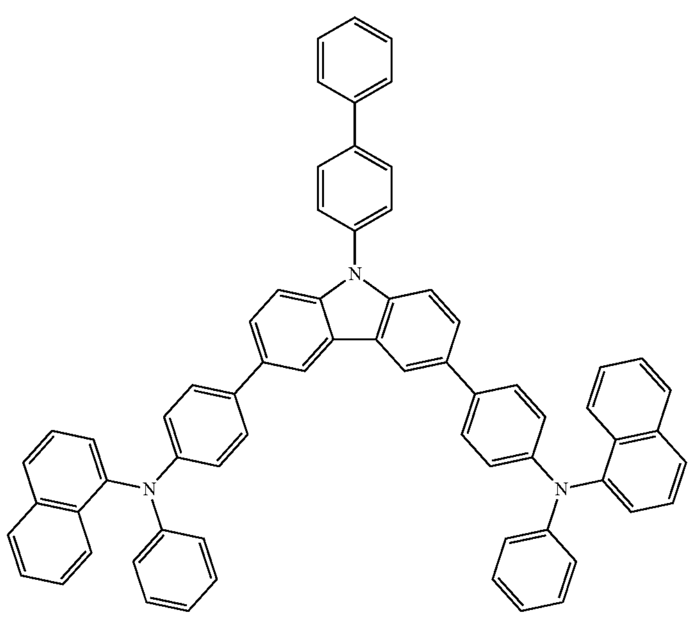

-continued
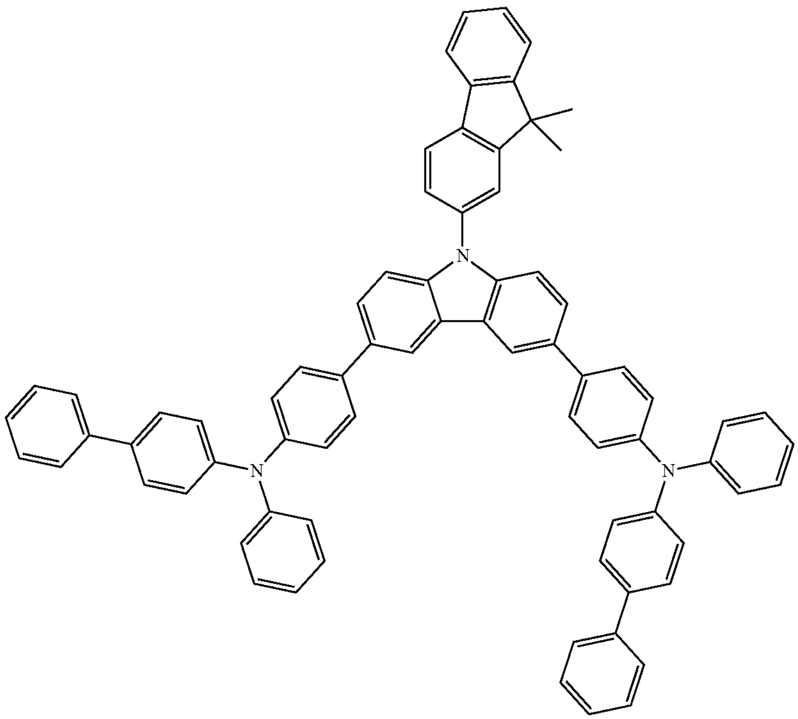
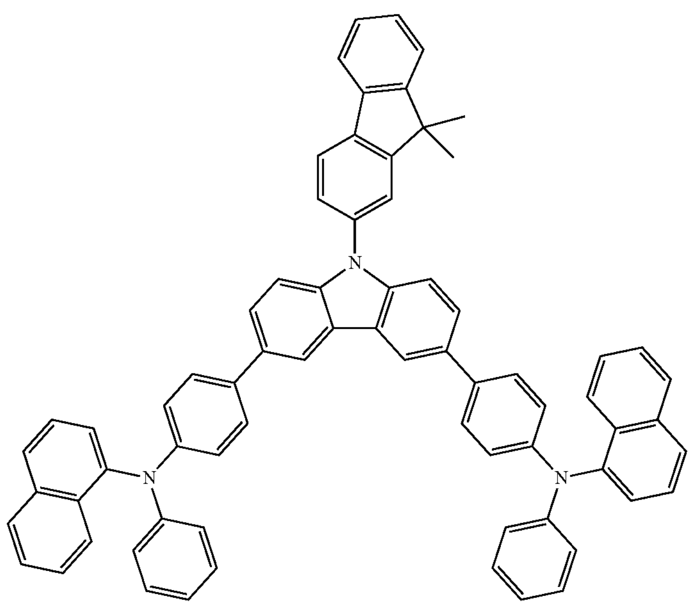

-continued
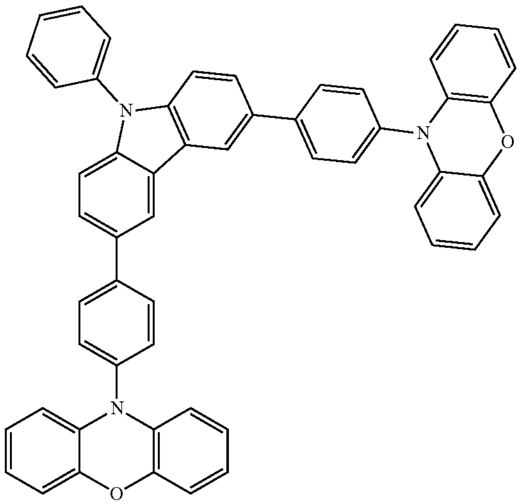
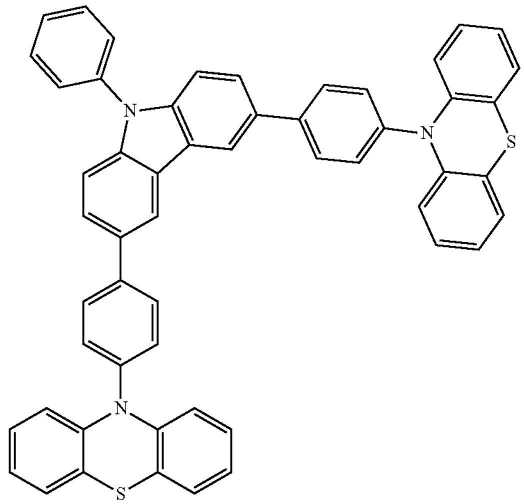
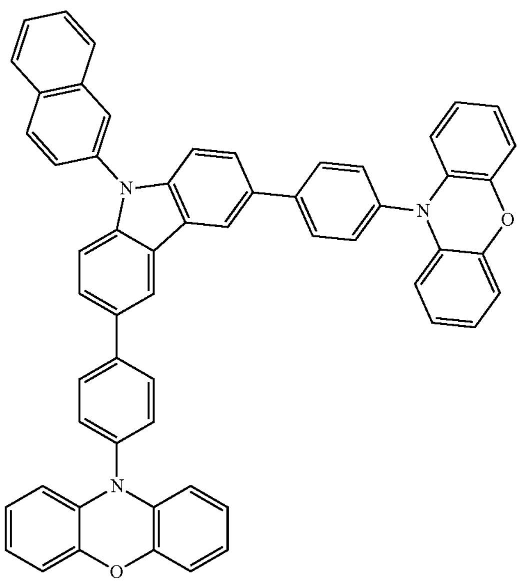
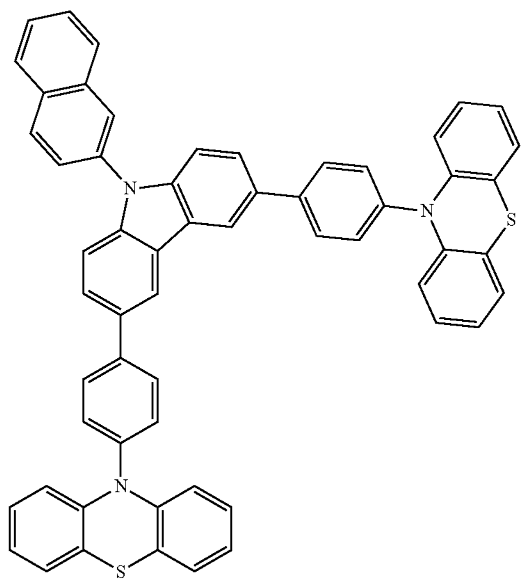
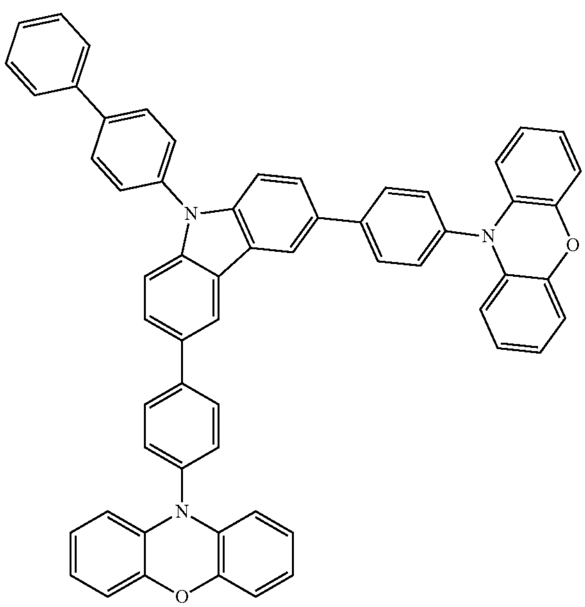
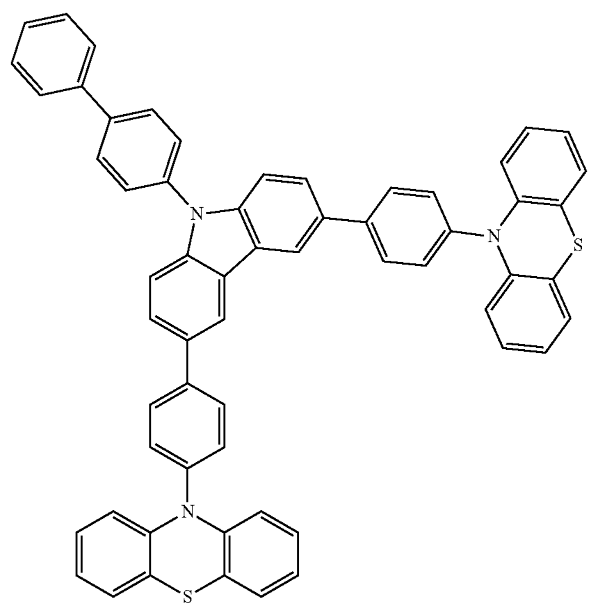

-continued
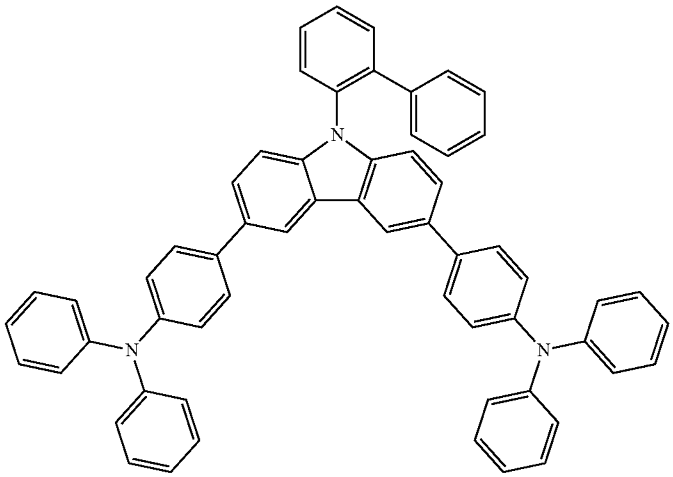
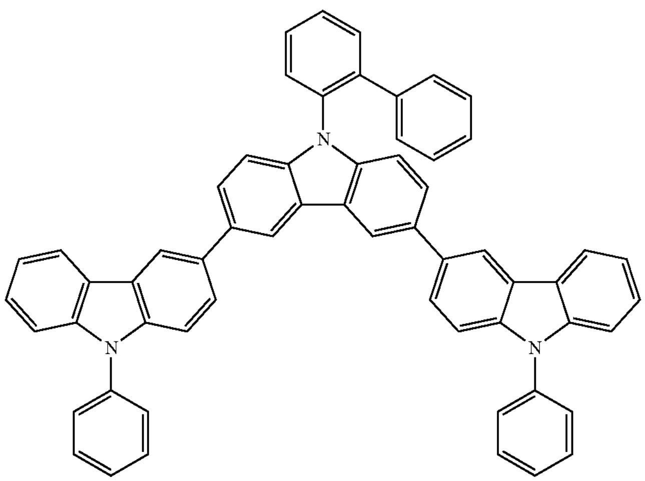
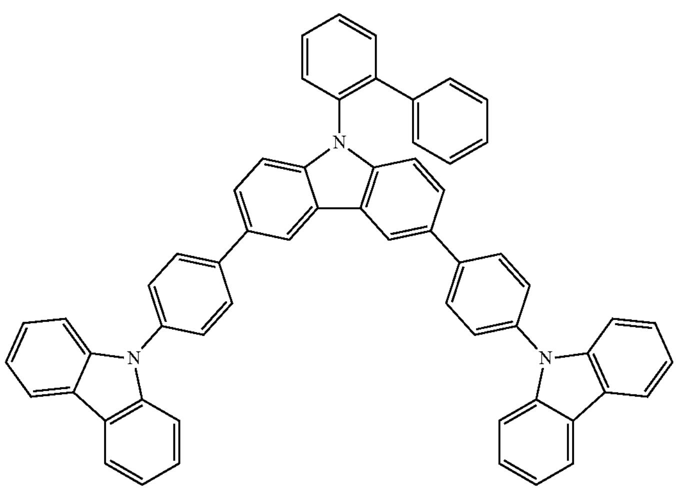

-continued
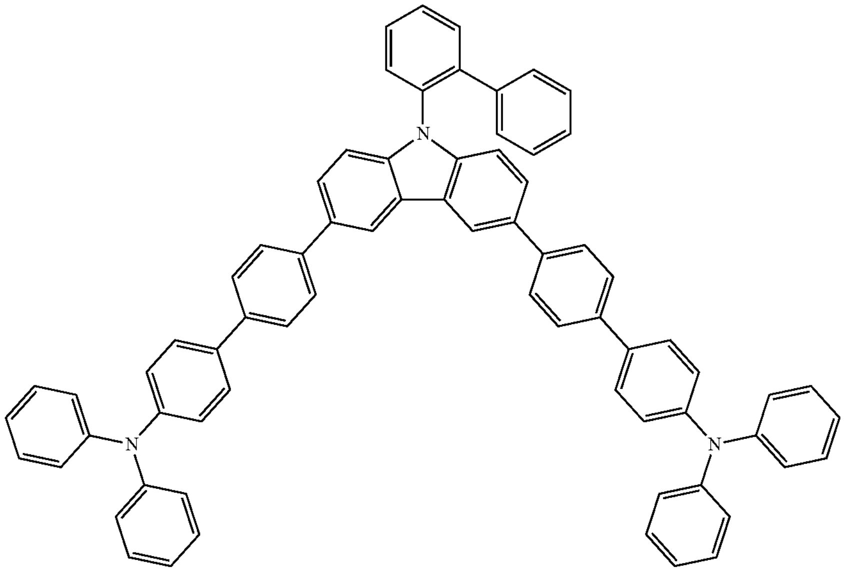
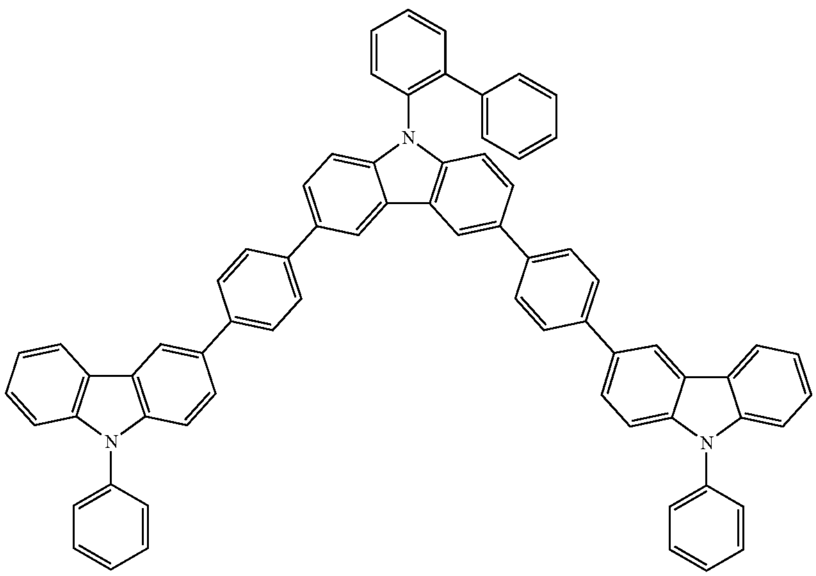
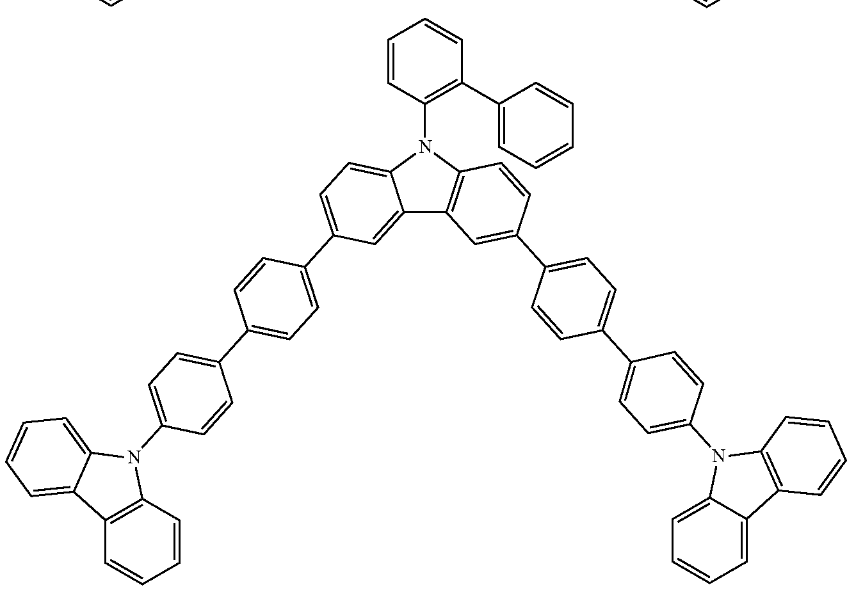

-continued
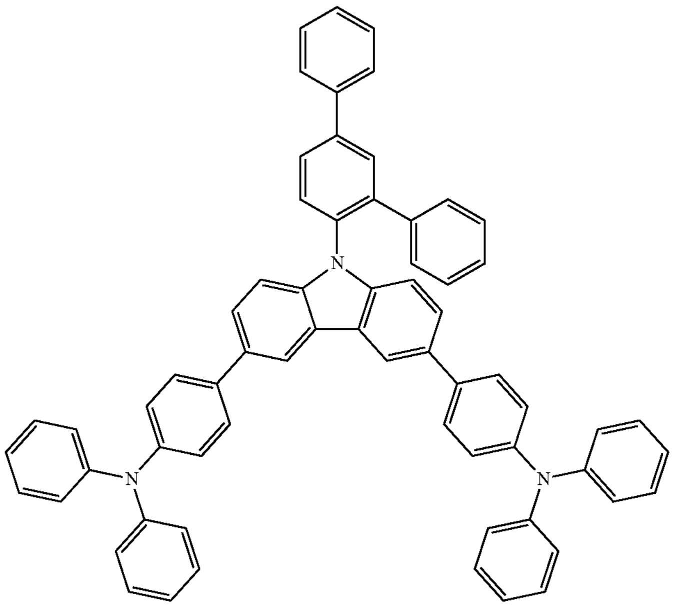
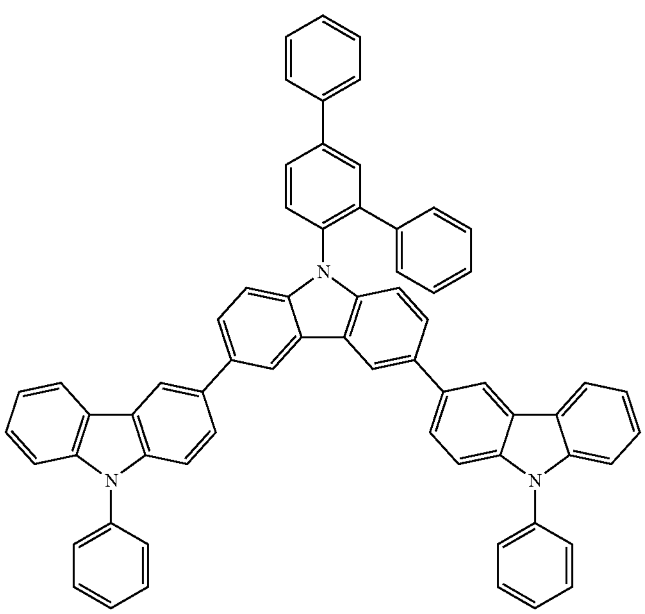

-continued
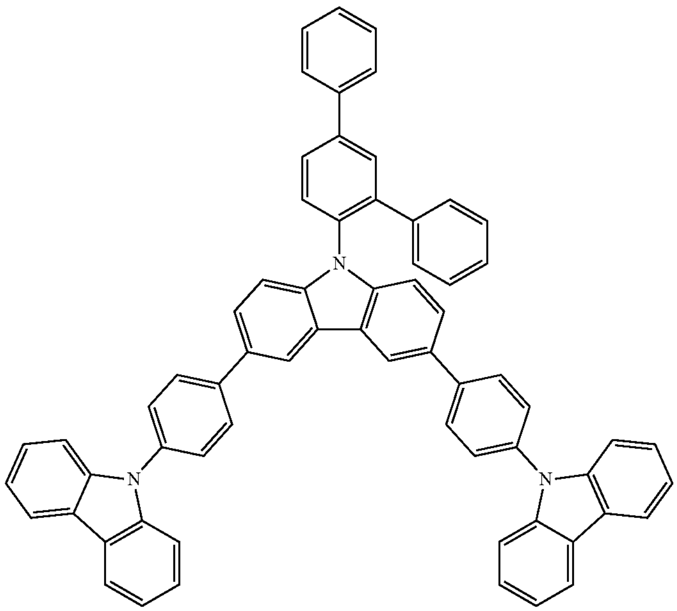
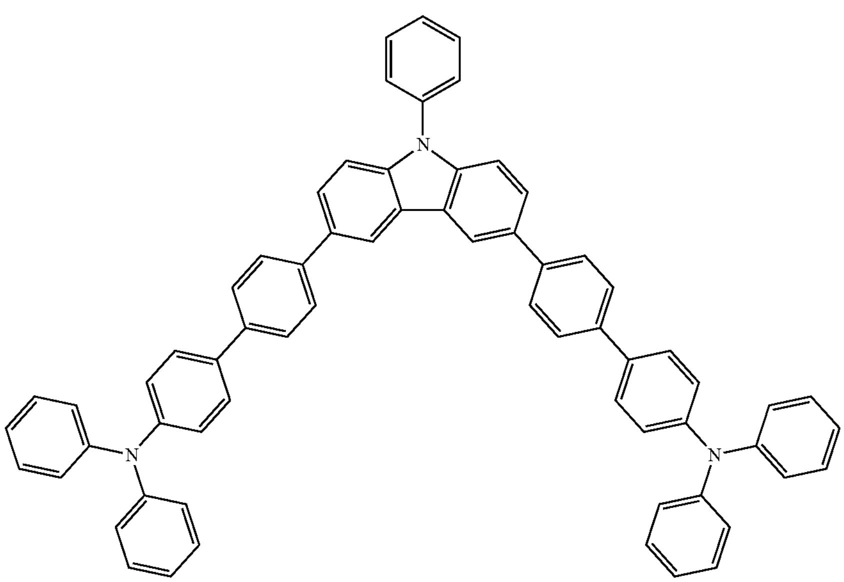

-continued
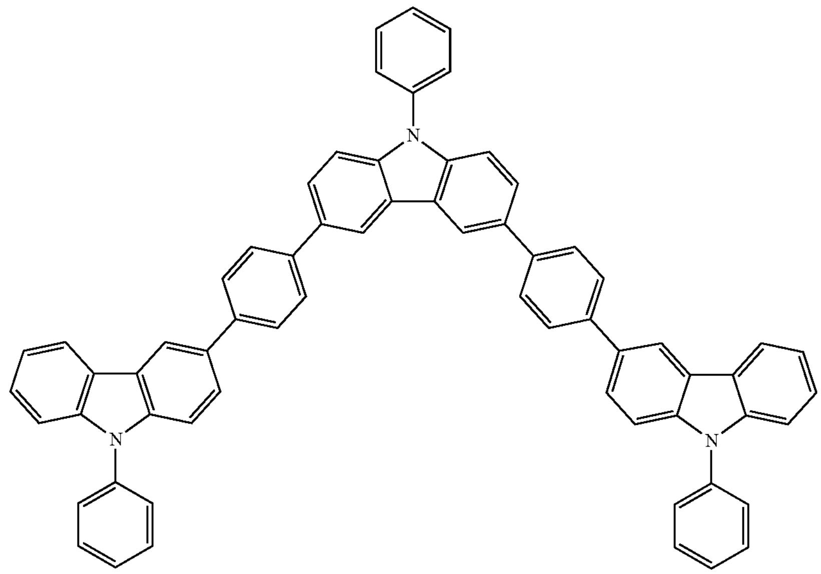
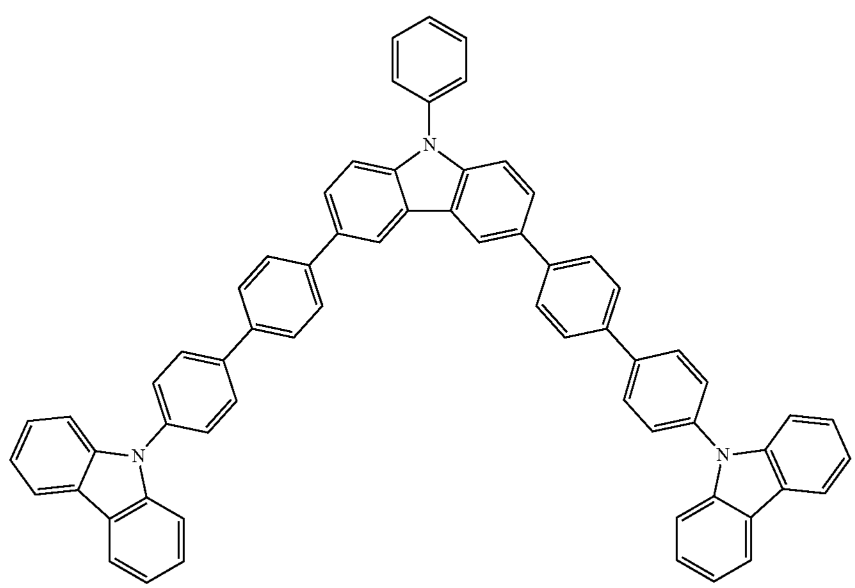

-continued
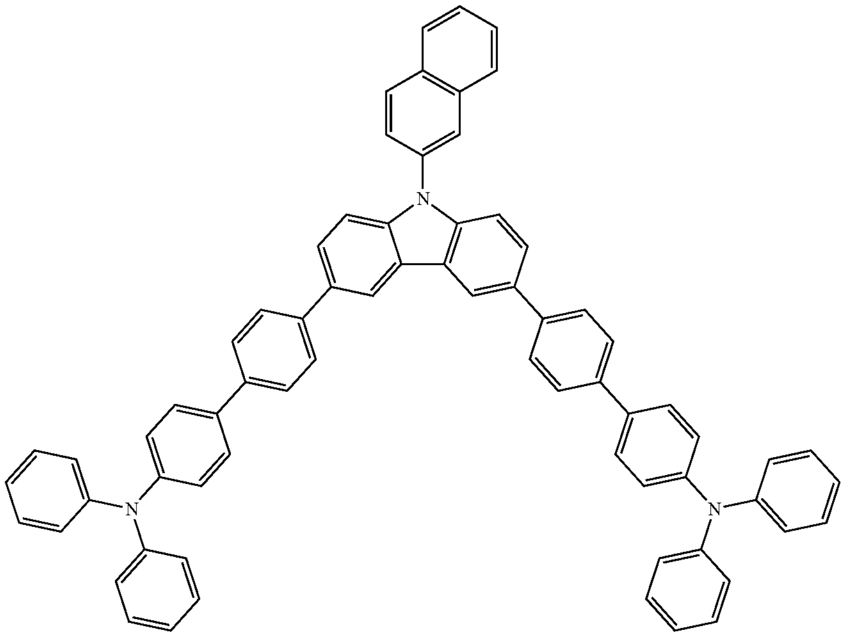
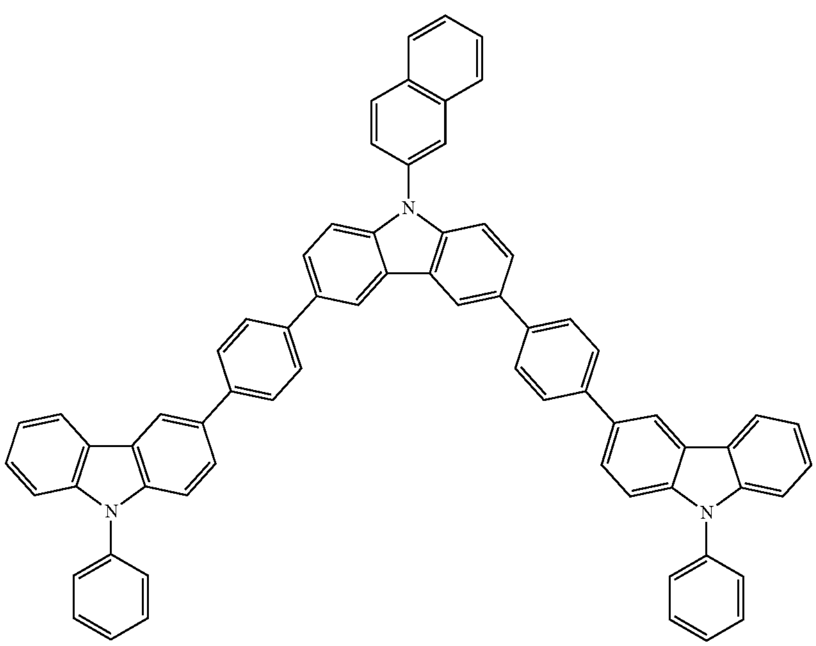

-continued
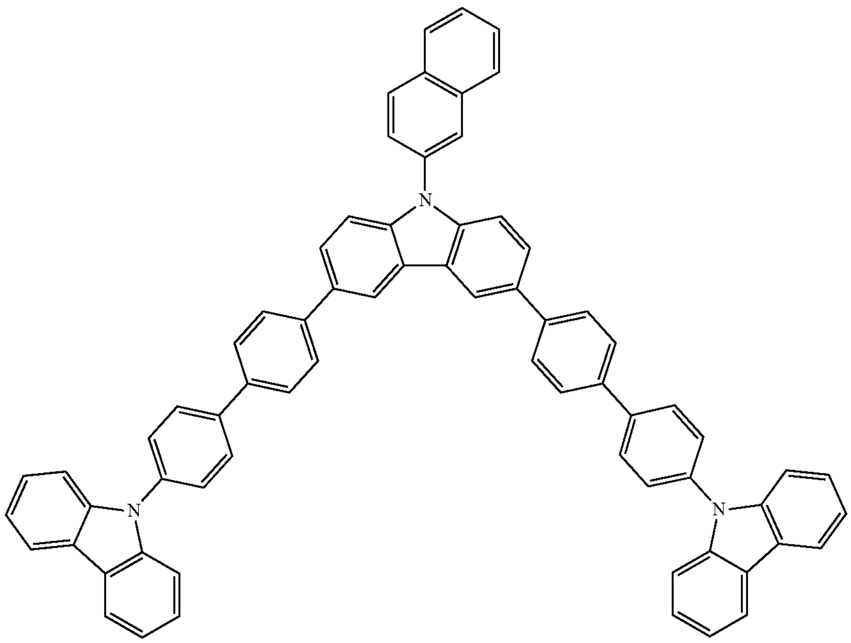
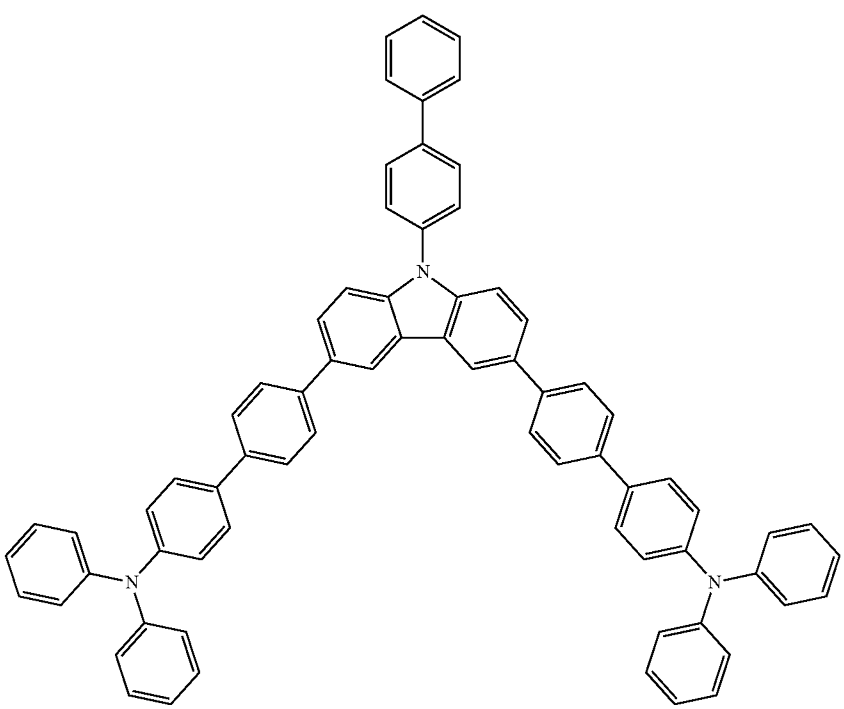

-continued
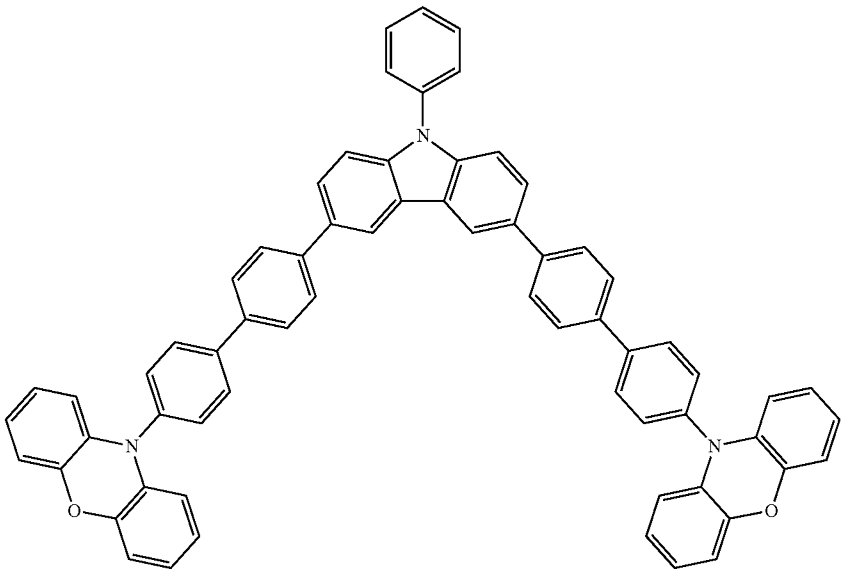
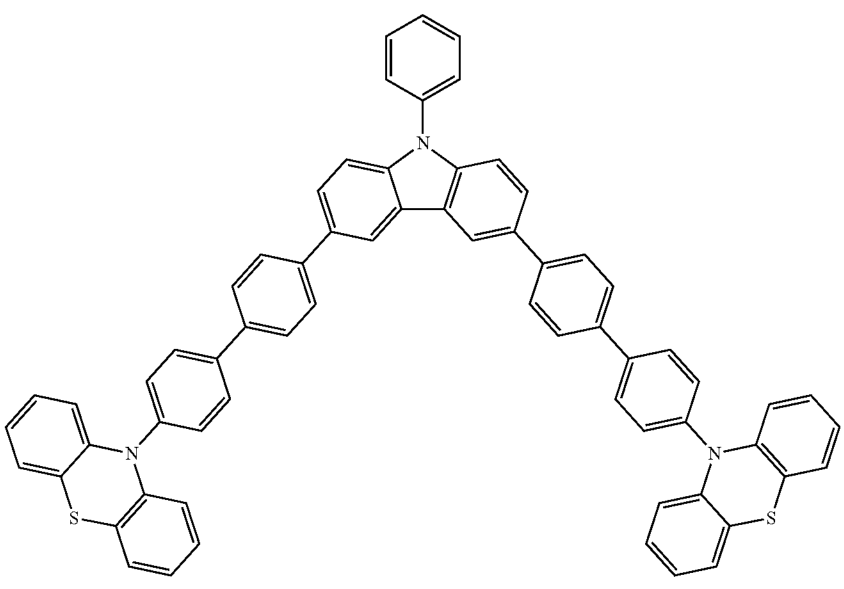

-continued
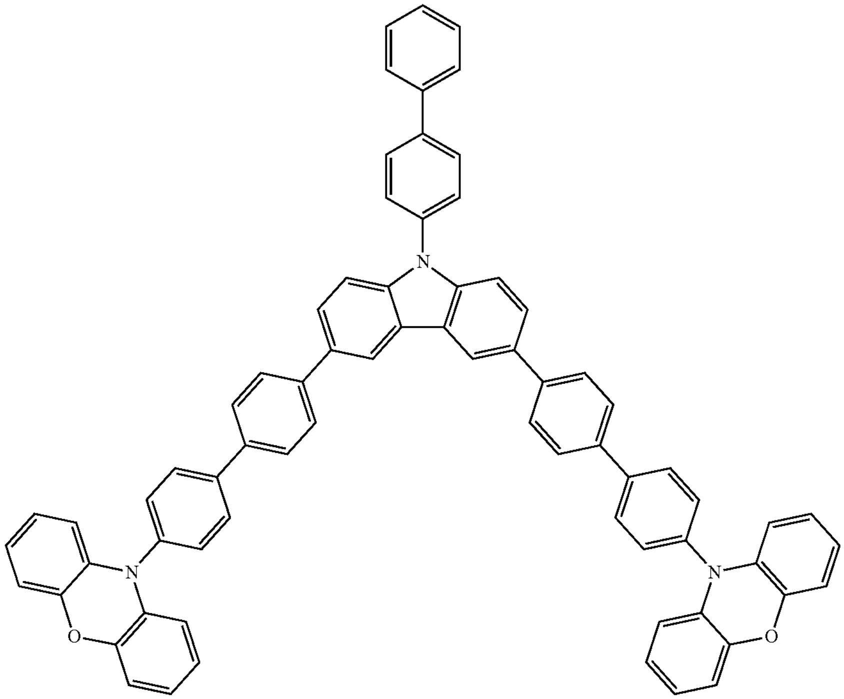
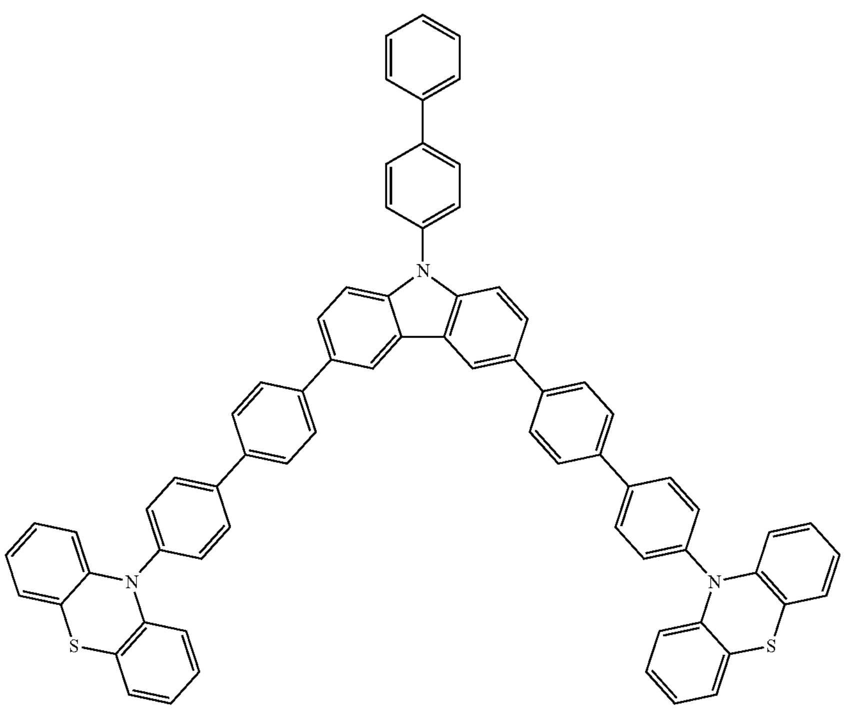

-continued
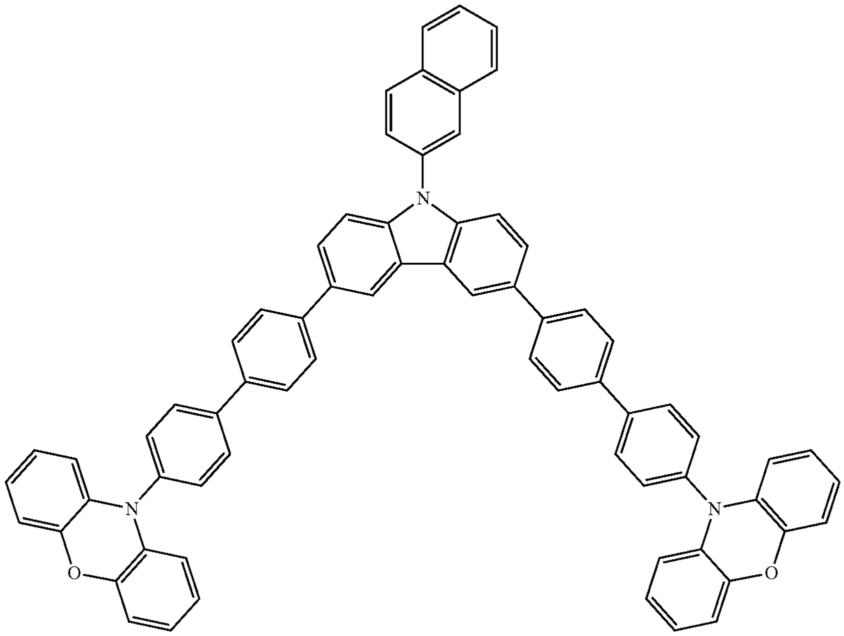
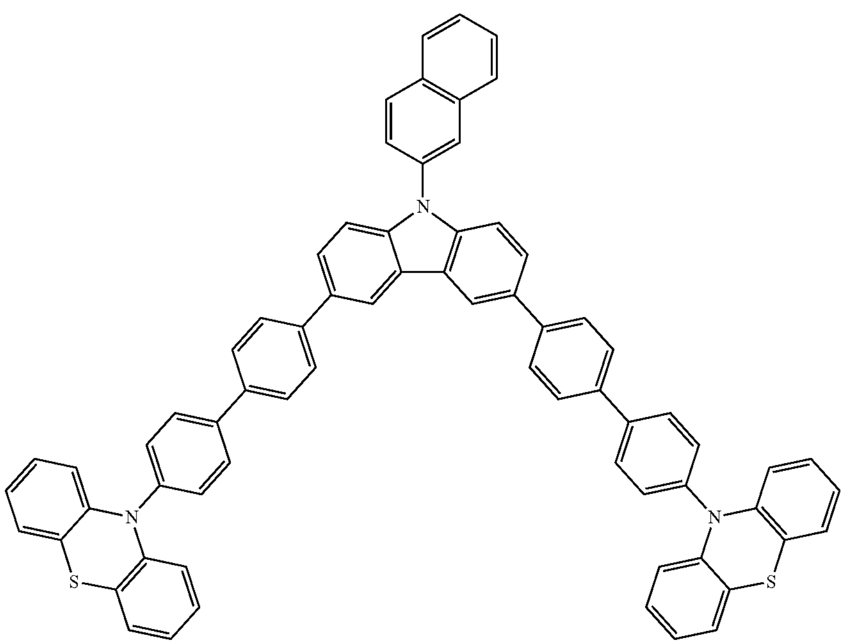

-continued
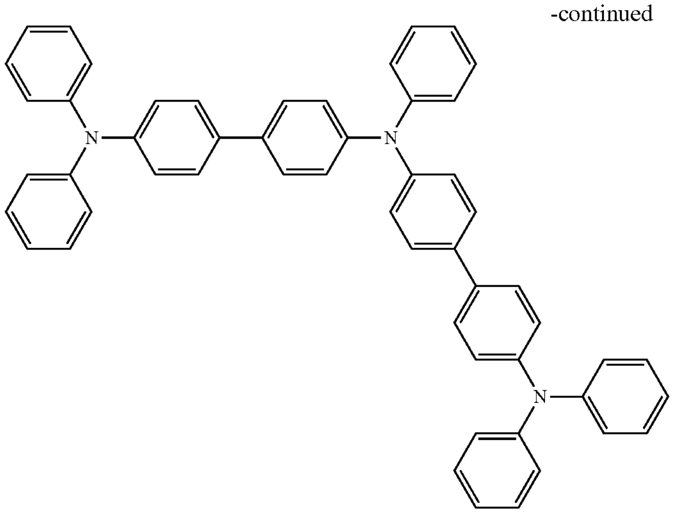
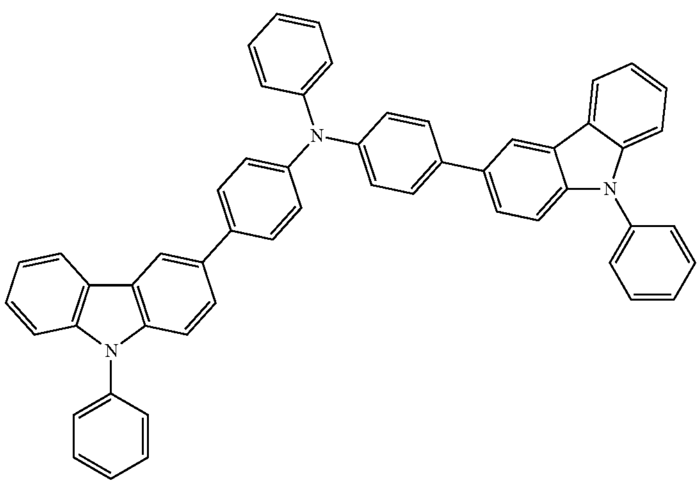
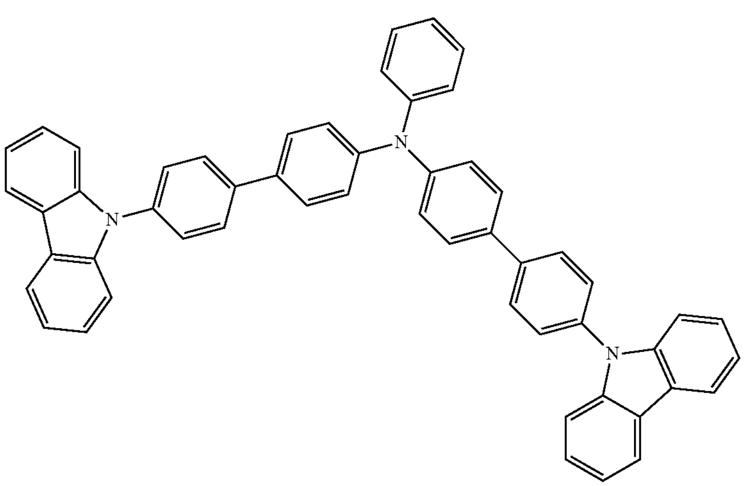

-continued
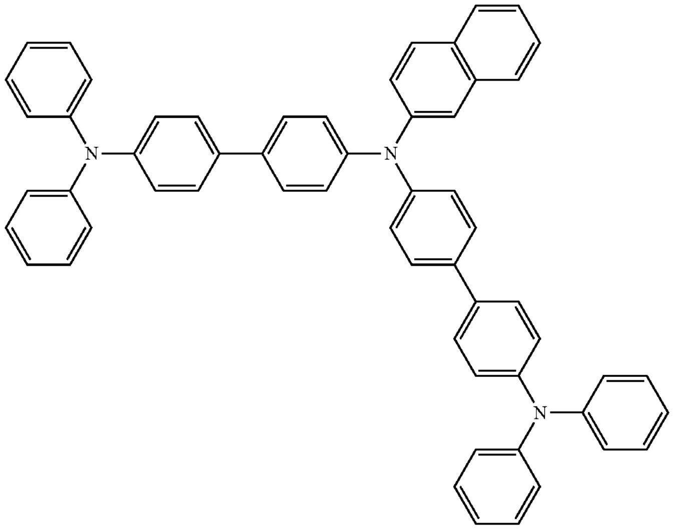
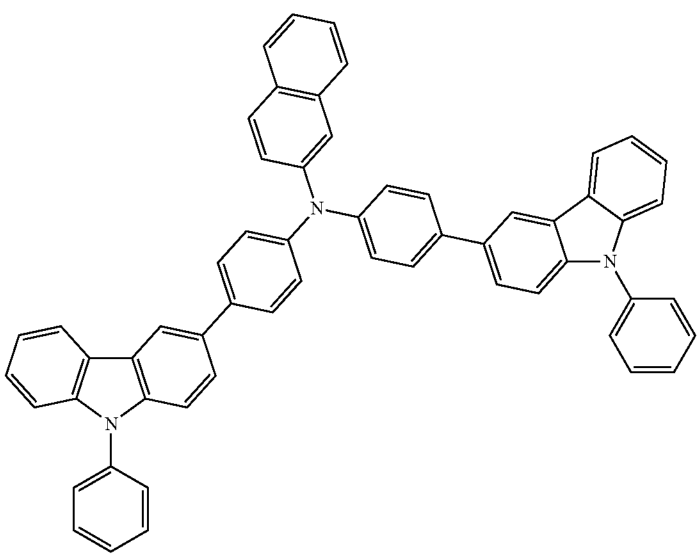

-continued
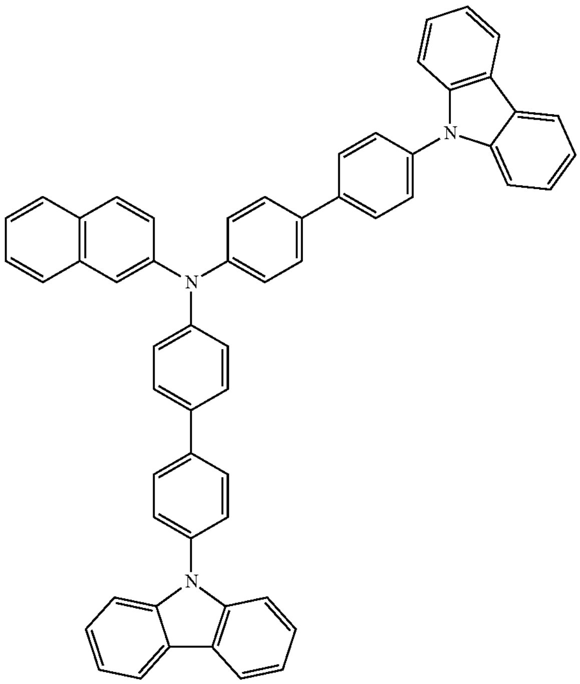
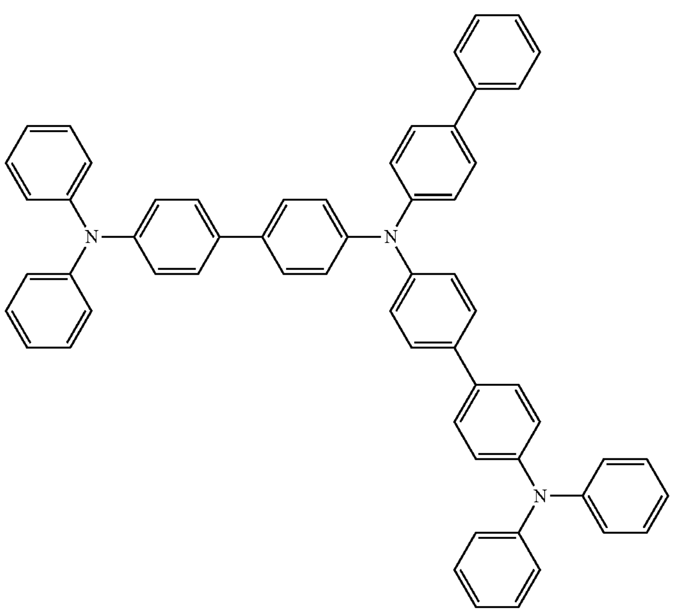

-continued
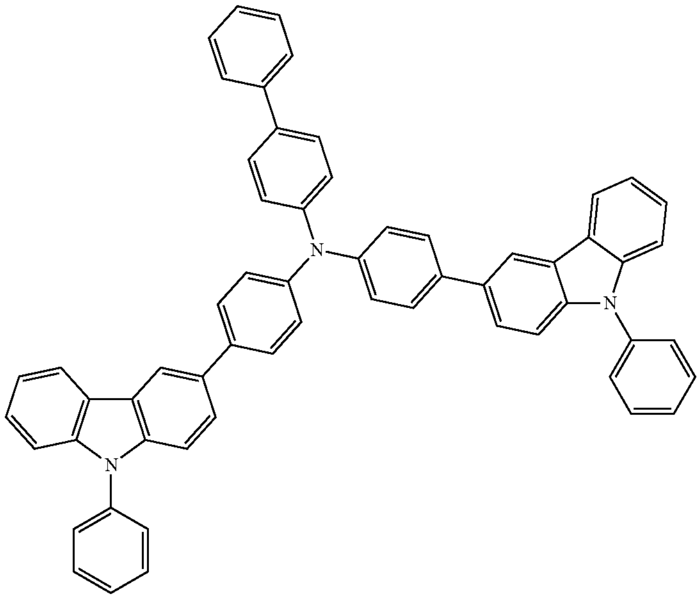
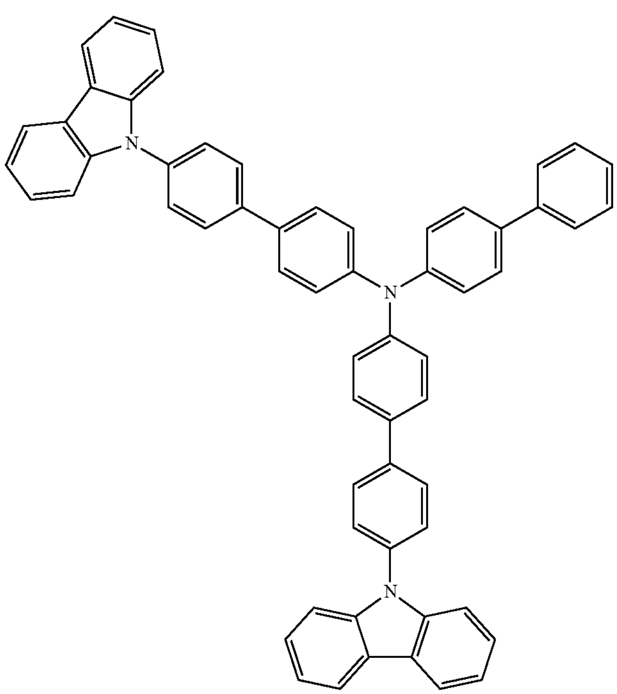

-continued
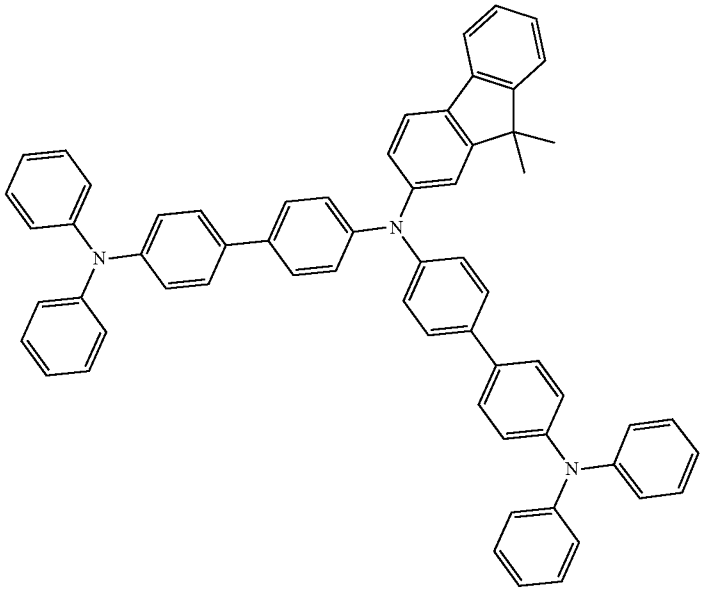
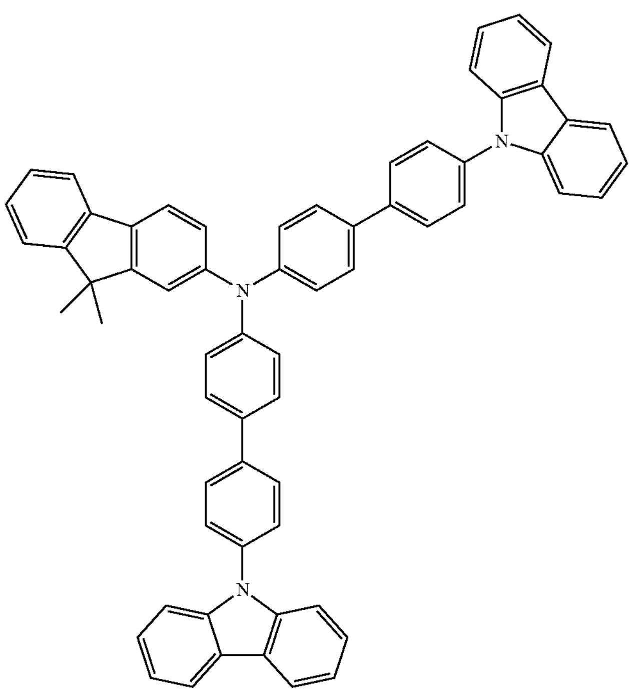

-continued
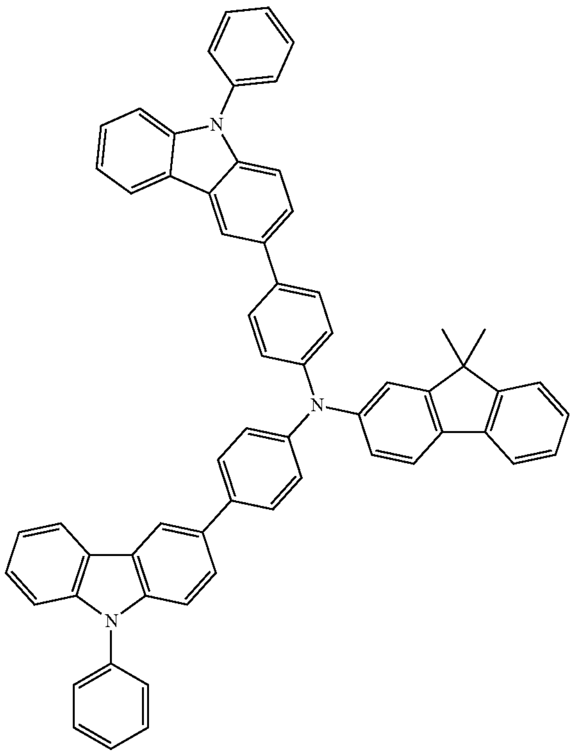
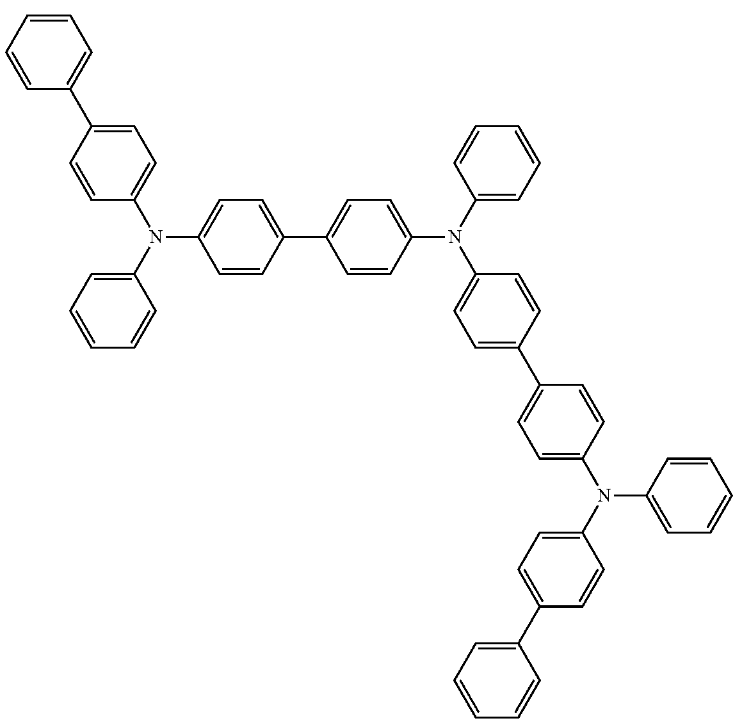

-continued
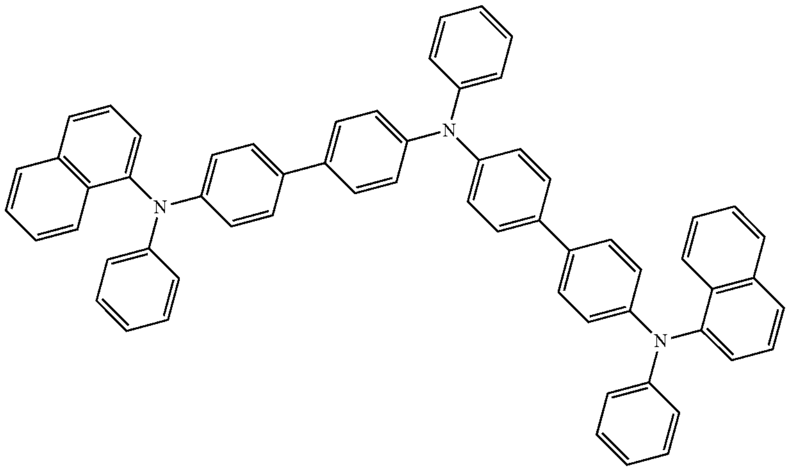
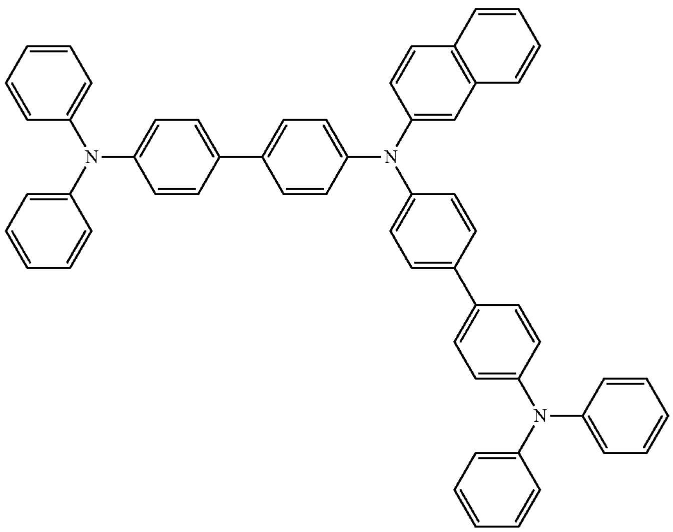
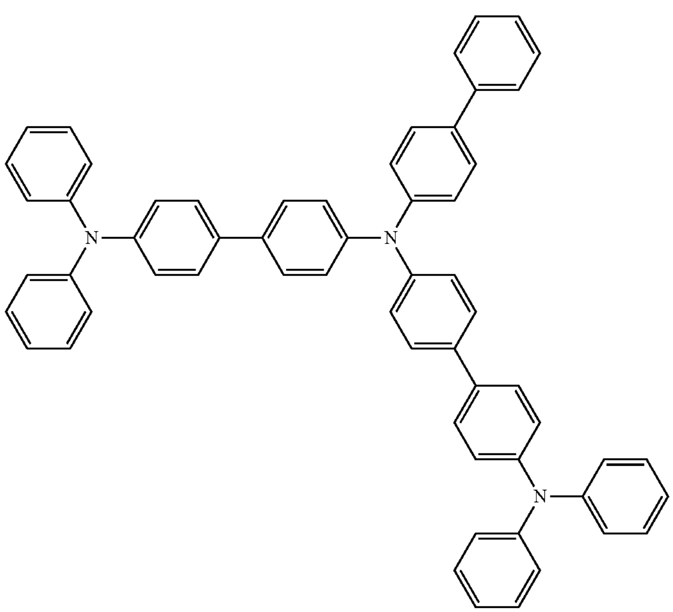

-continued
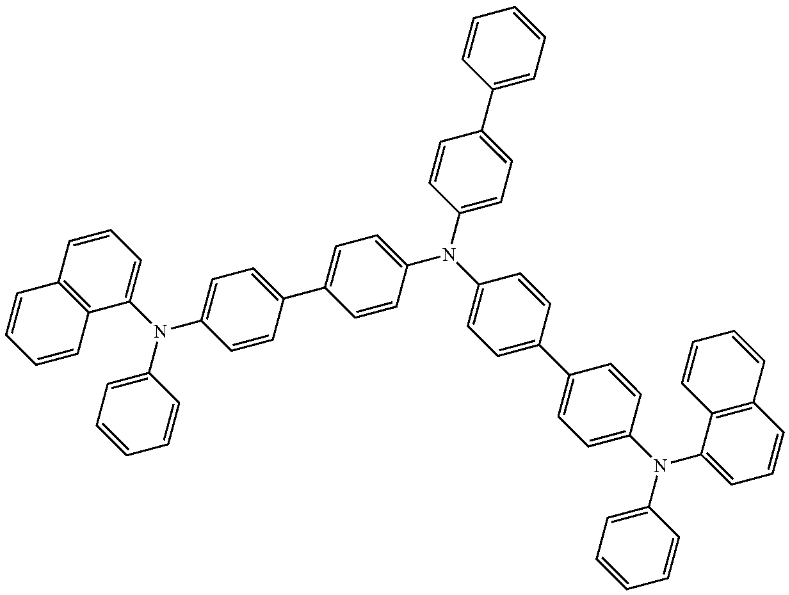
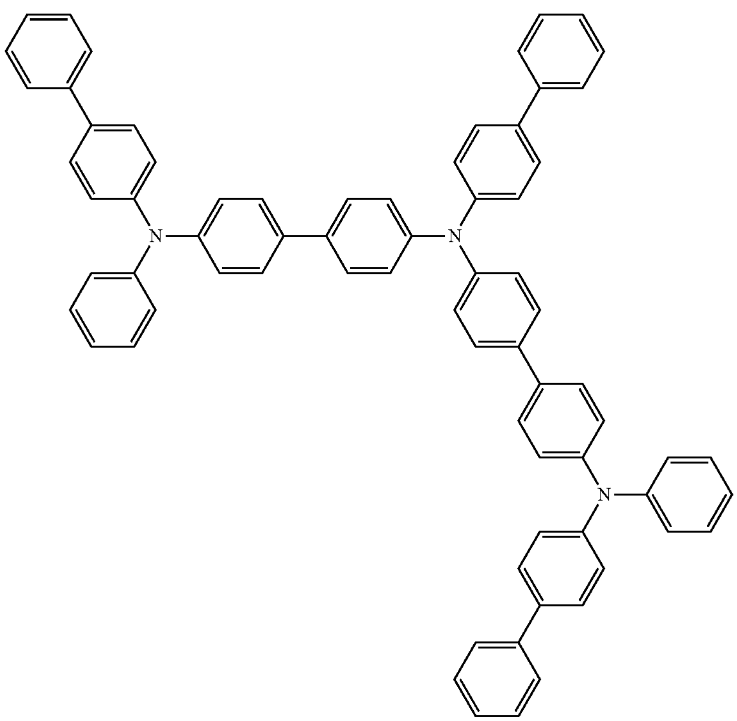

-continued
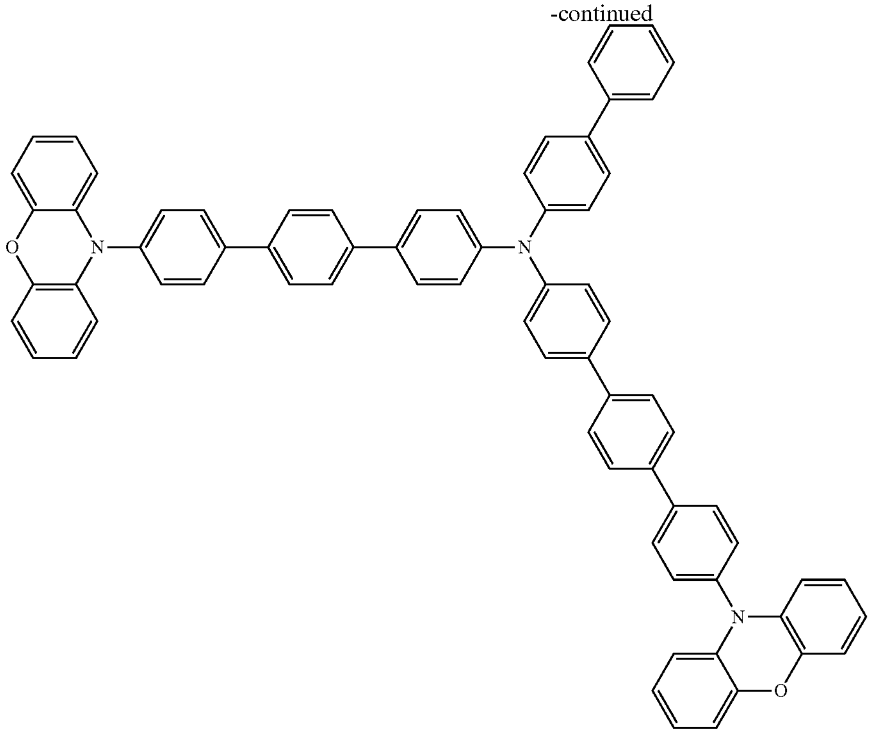
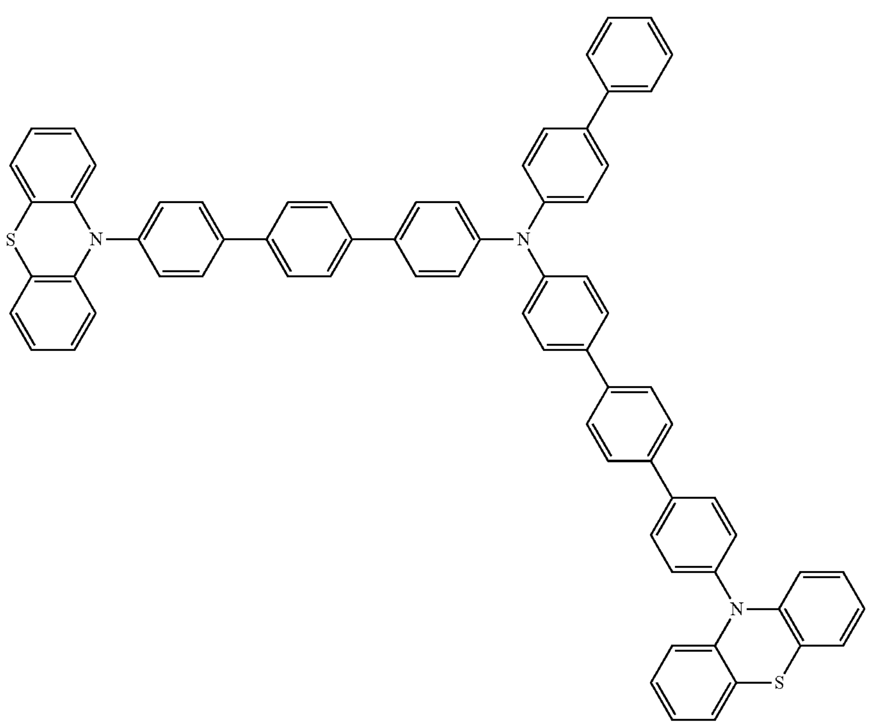

-continued
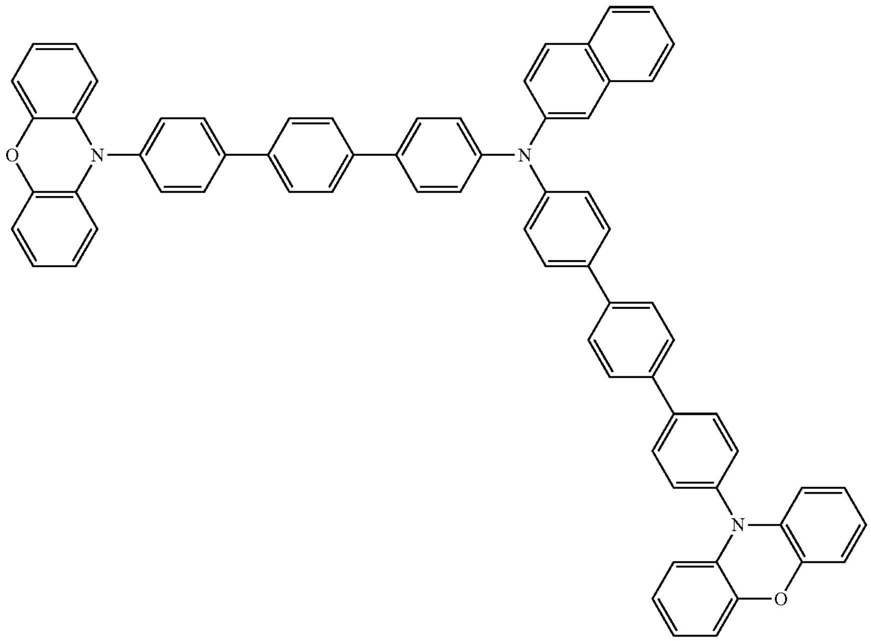
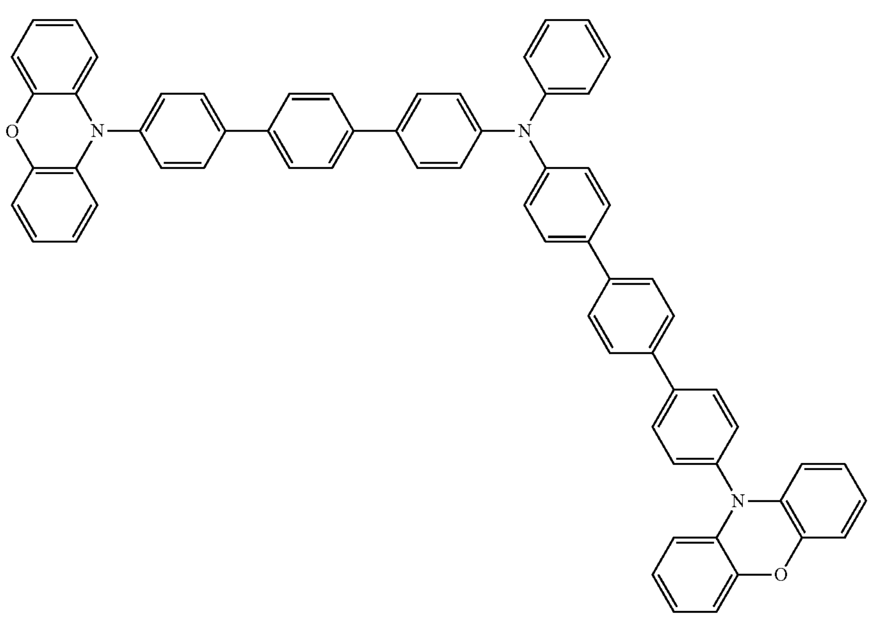

-continued
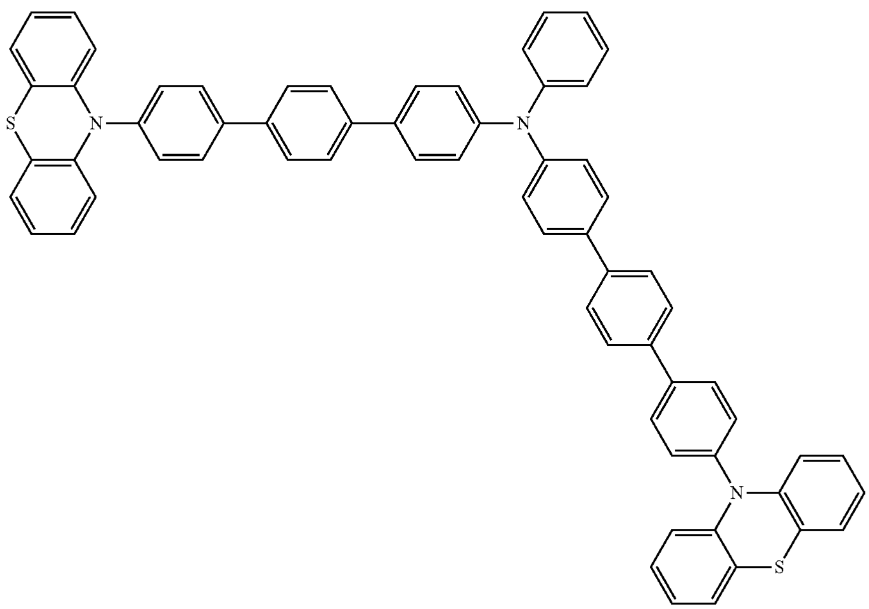
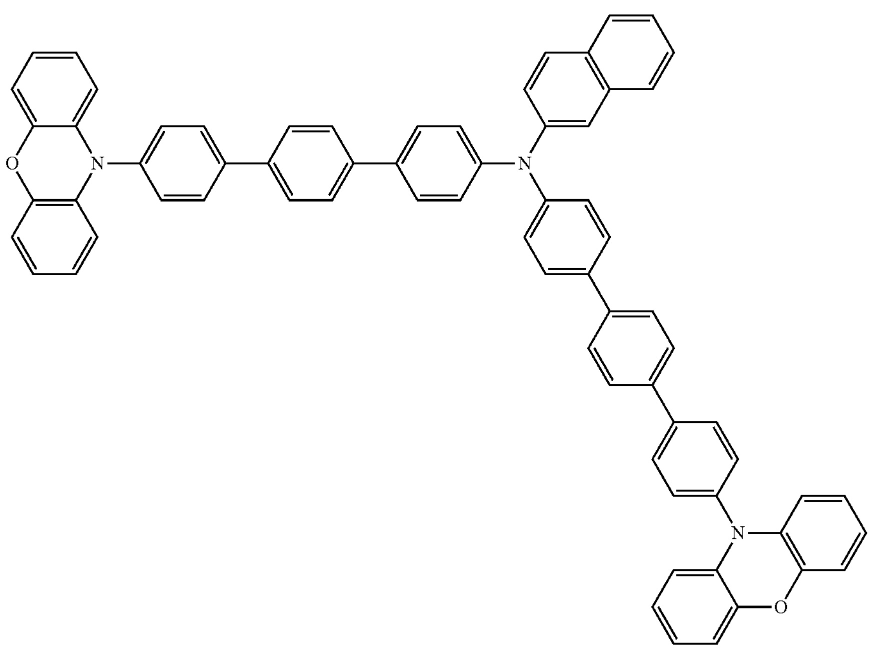

-continued
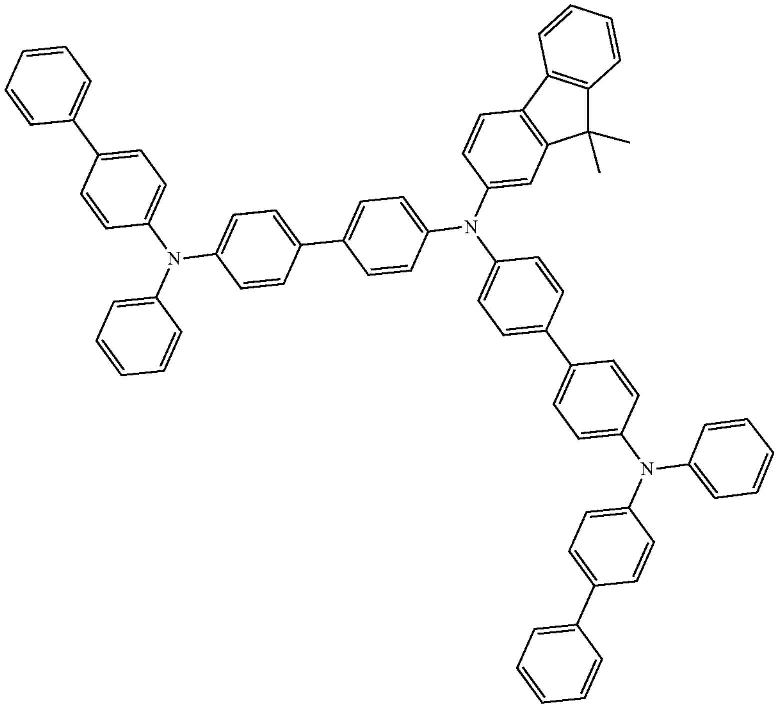
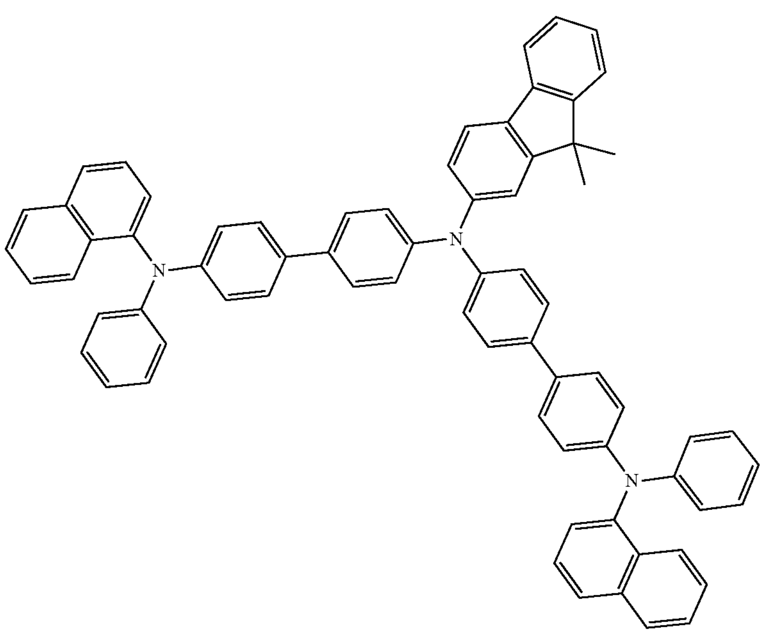

-continued
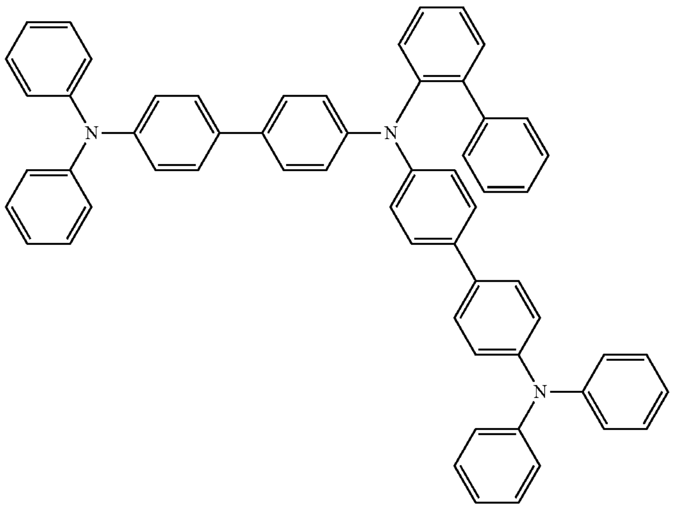
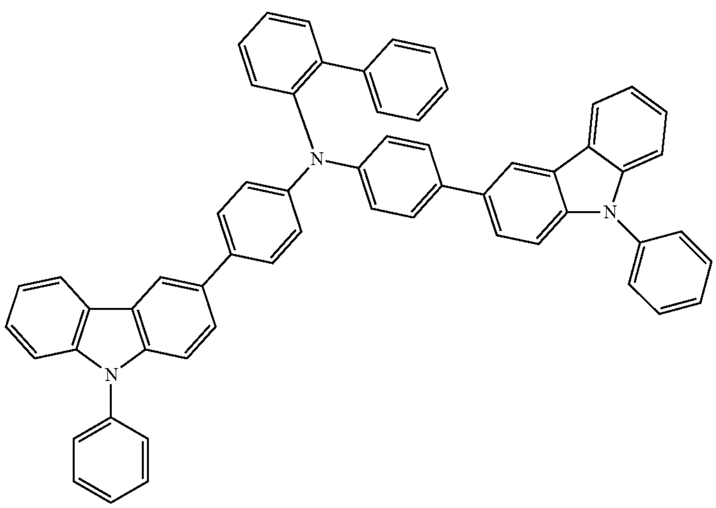
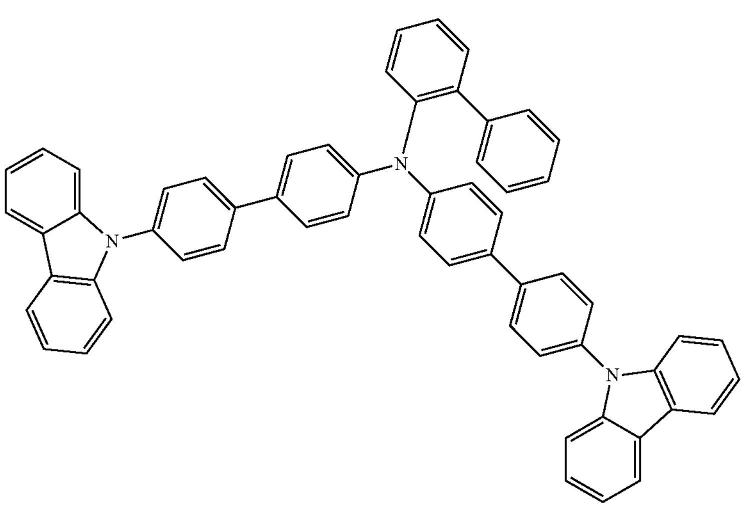

-continued
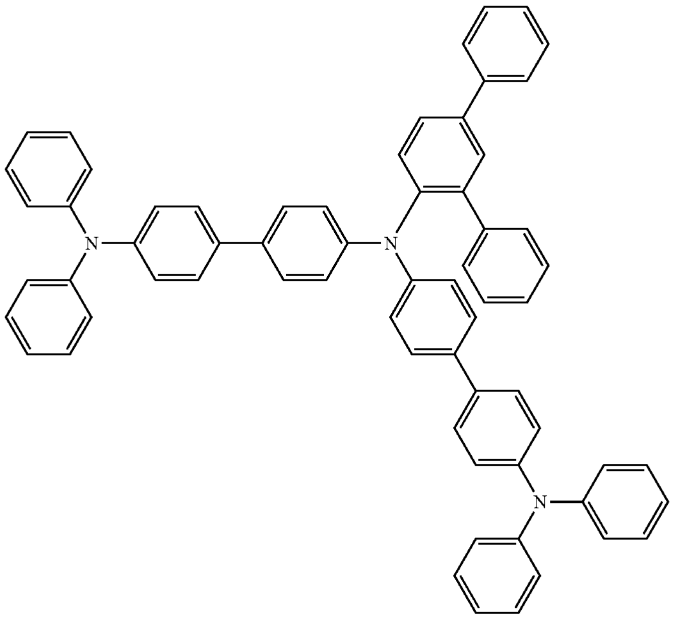
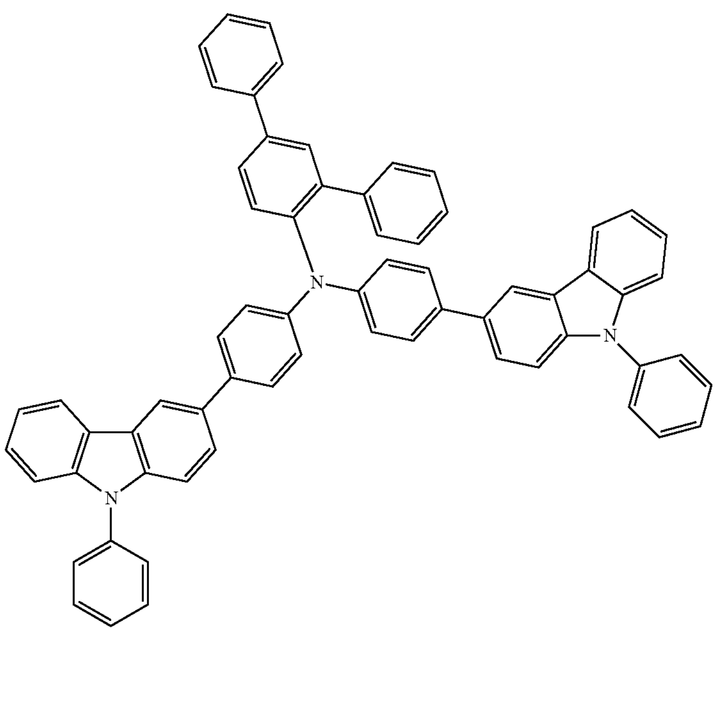

-continued
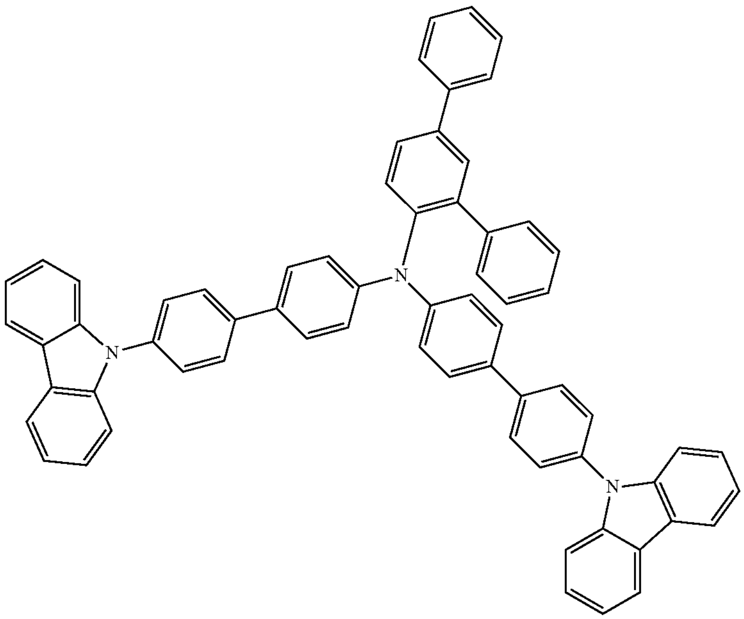
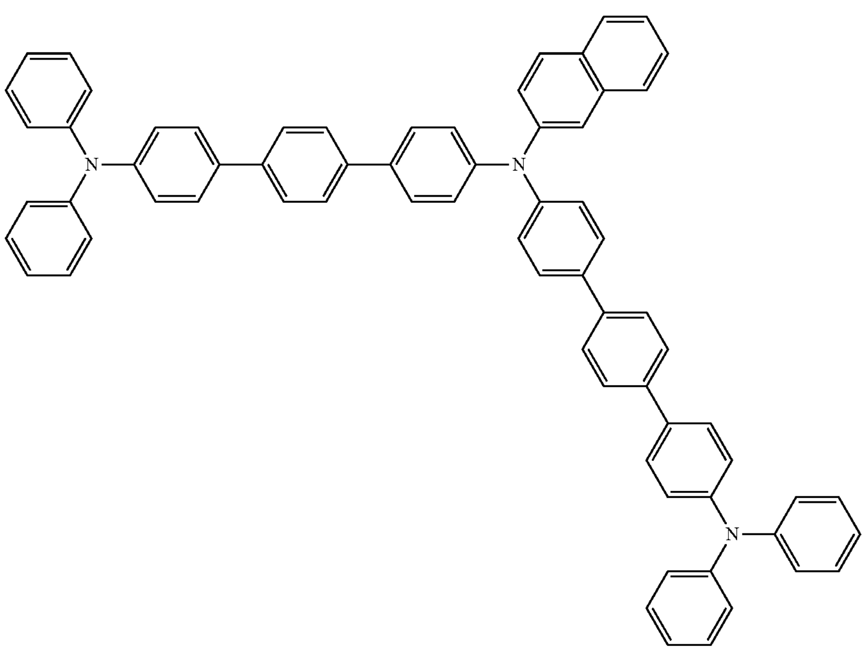

-continued
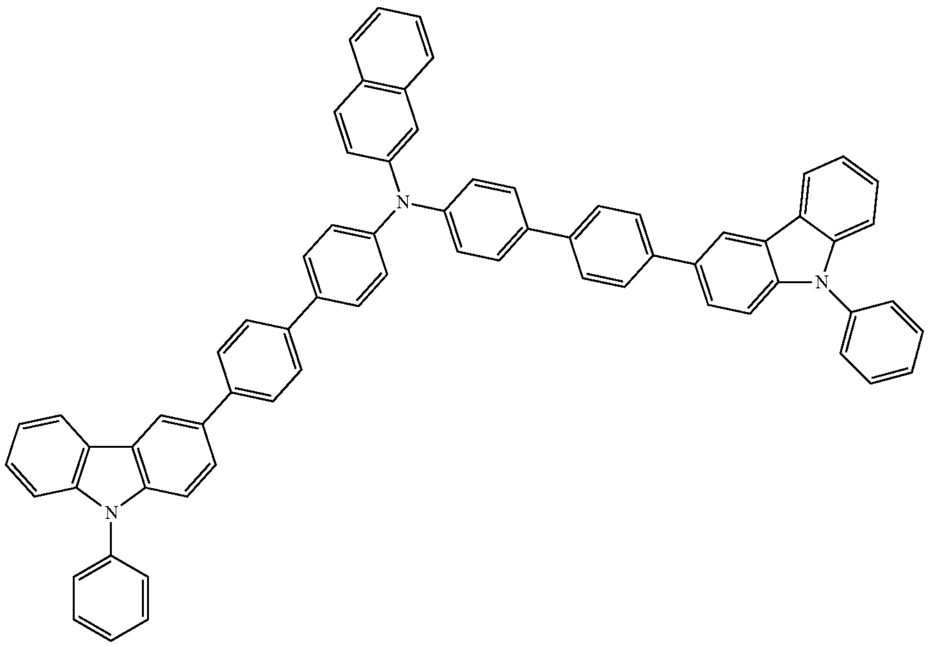
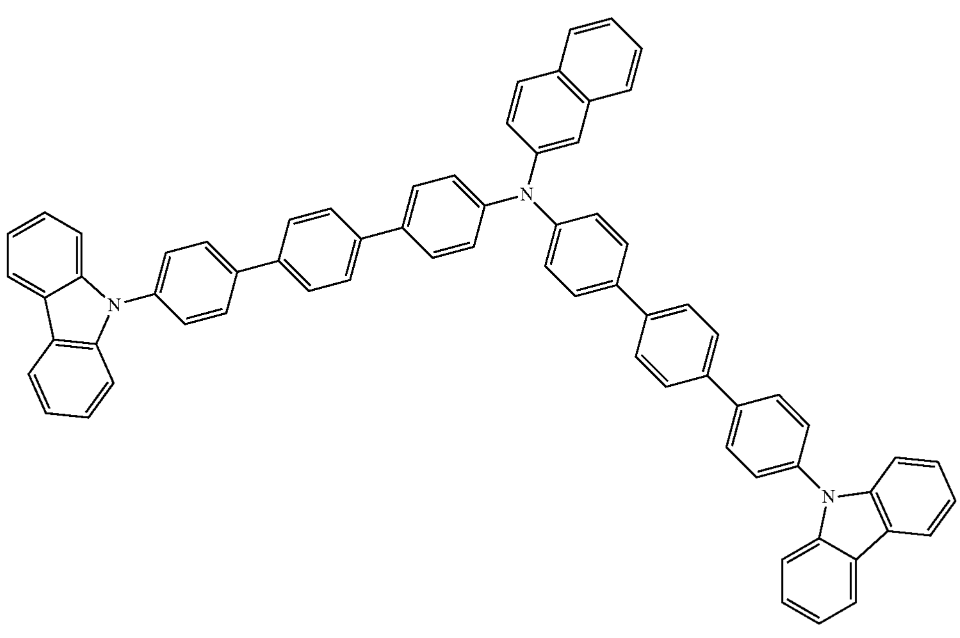

-continued
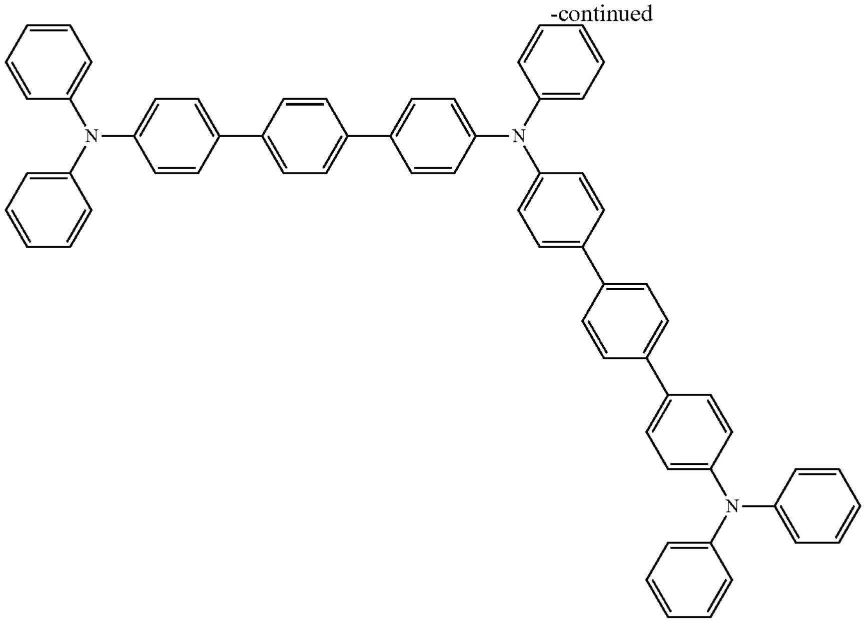
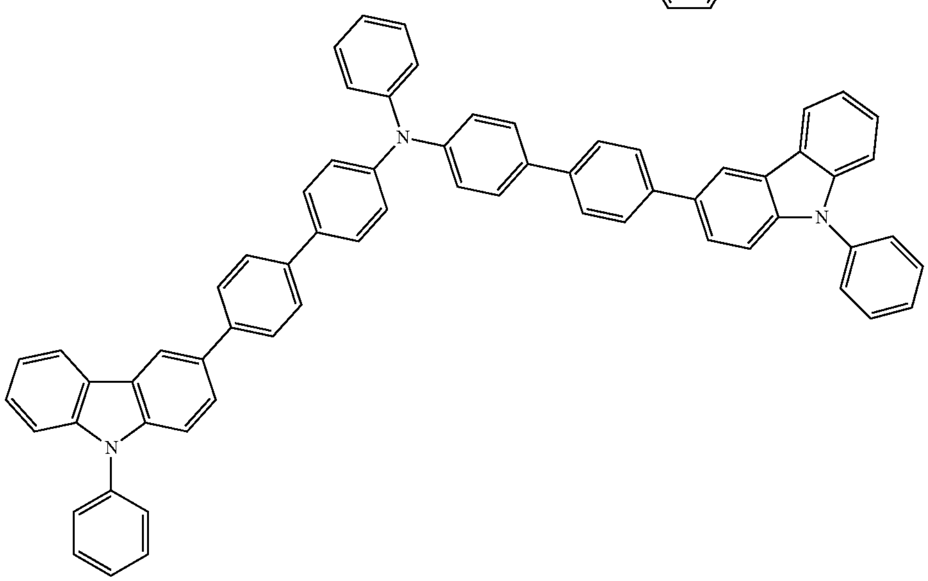
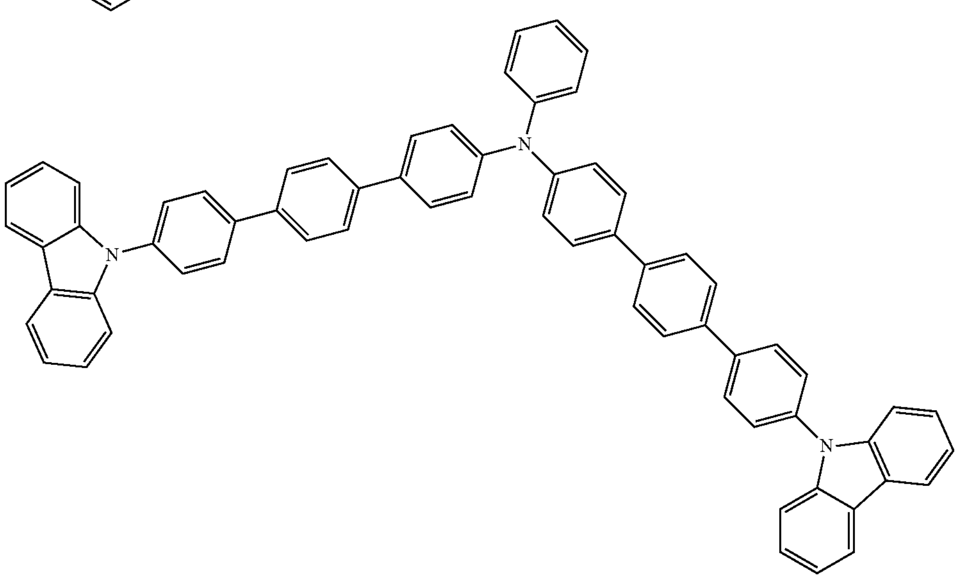

-continued
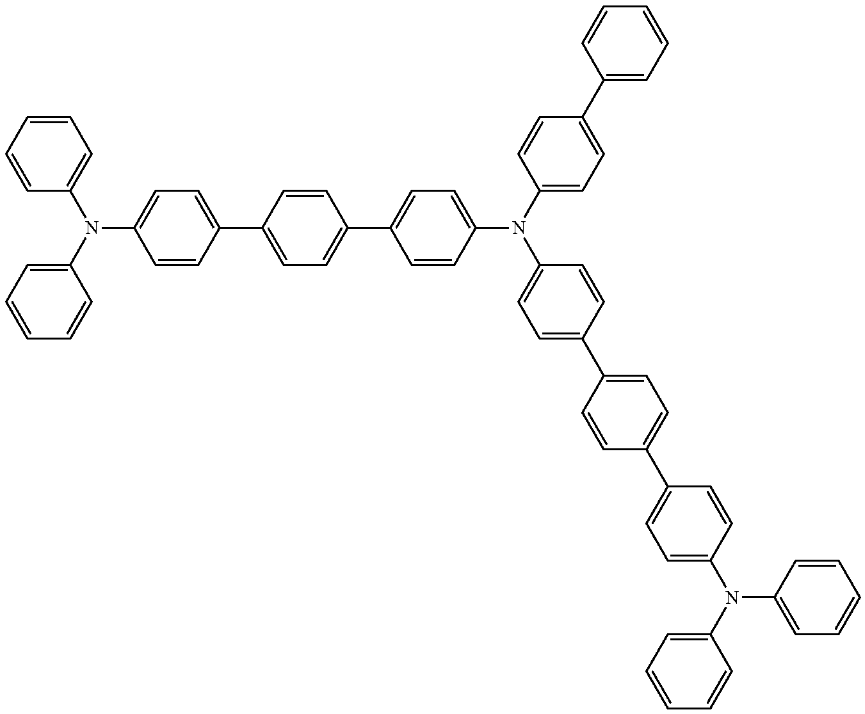
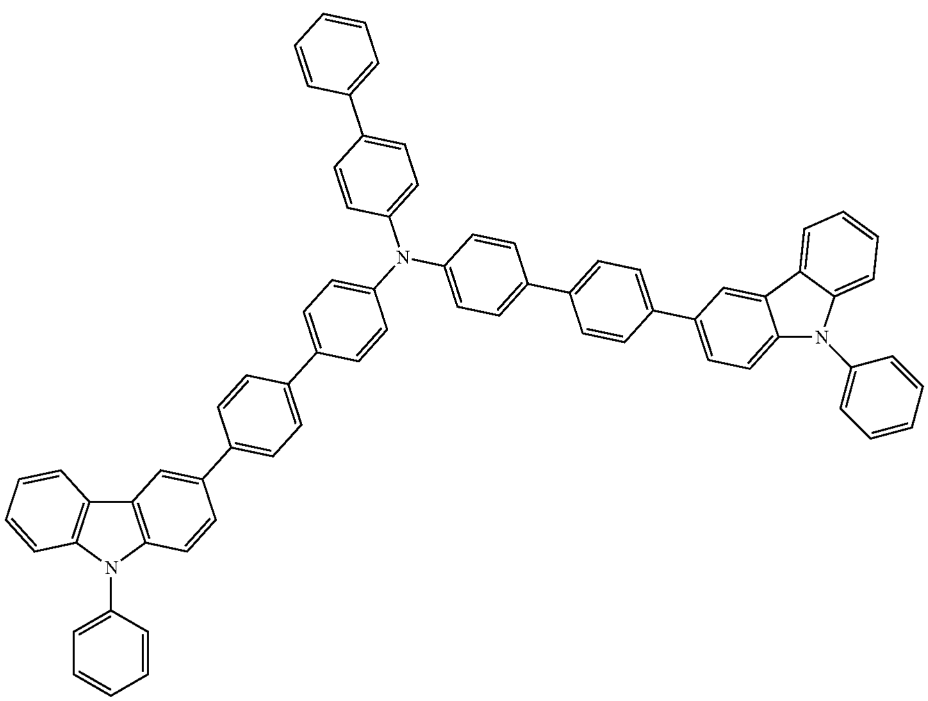

-continued
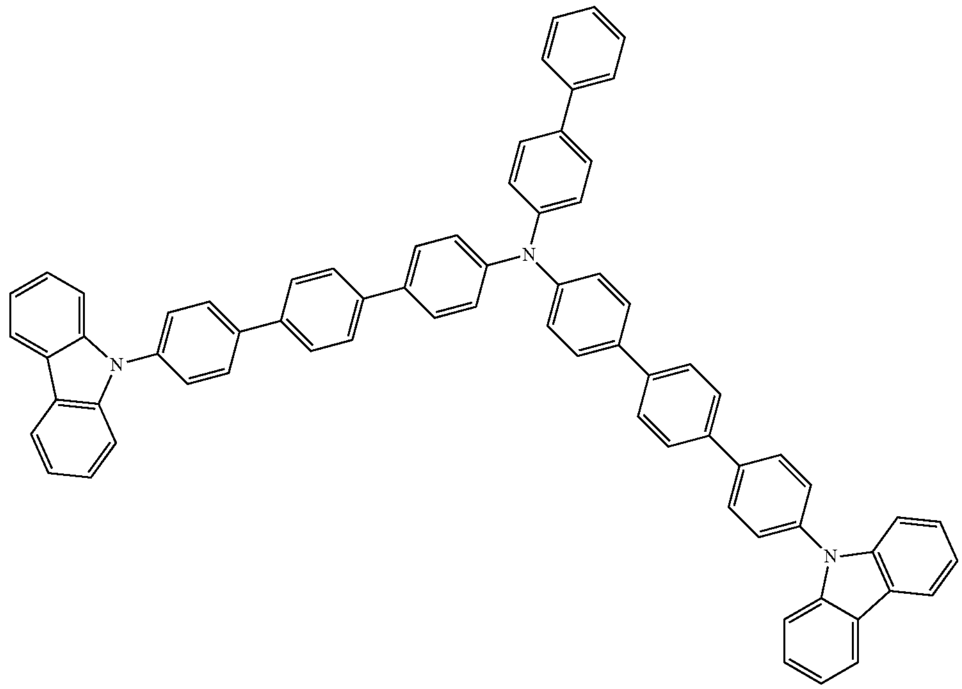
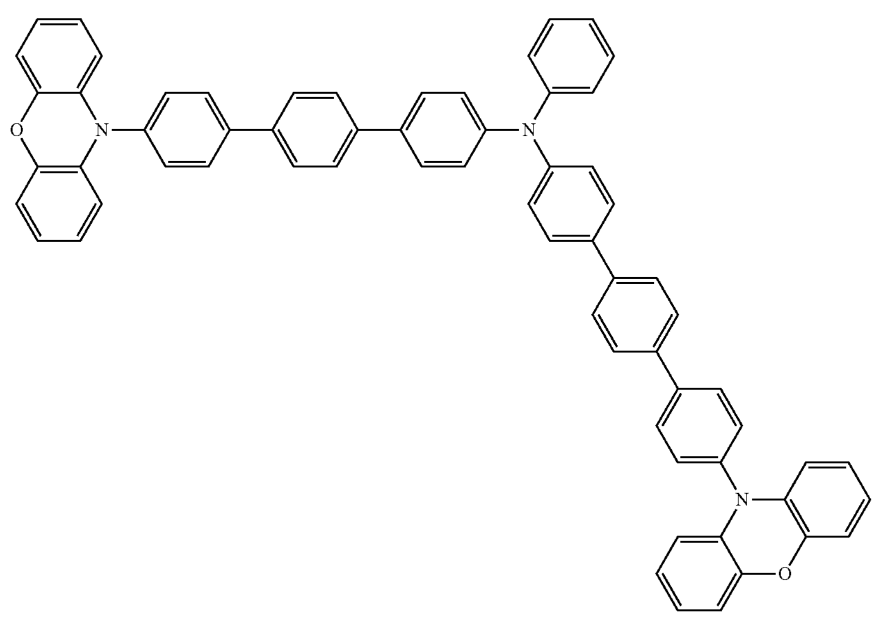

-continued
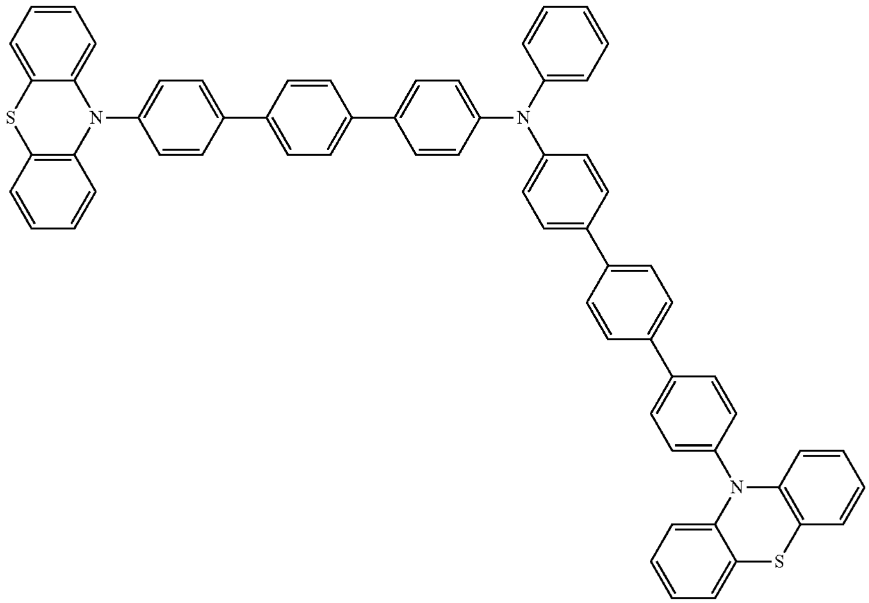
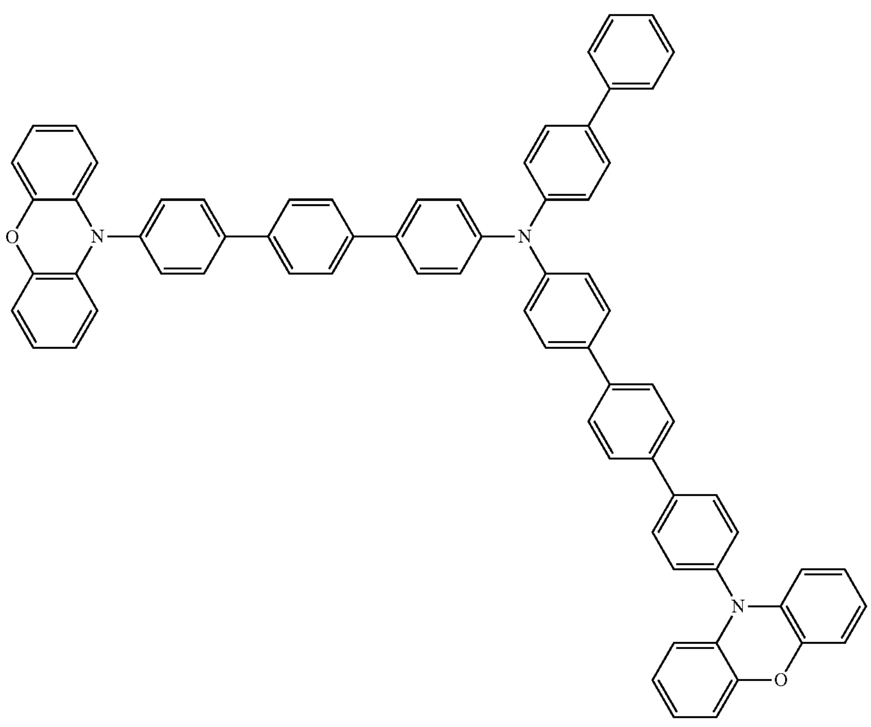

-continued
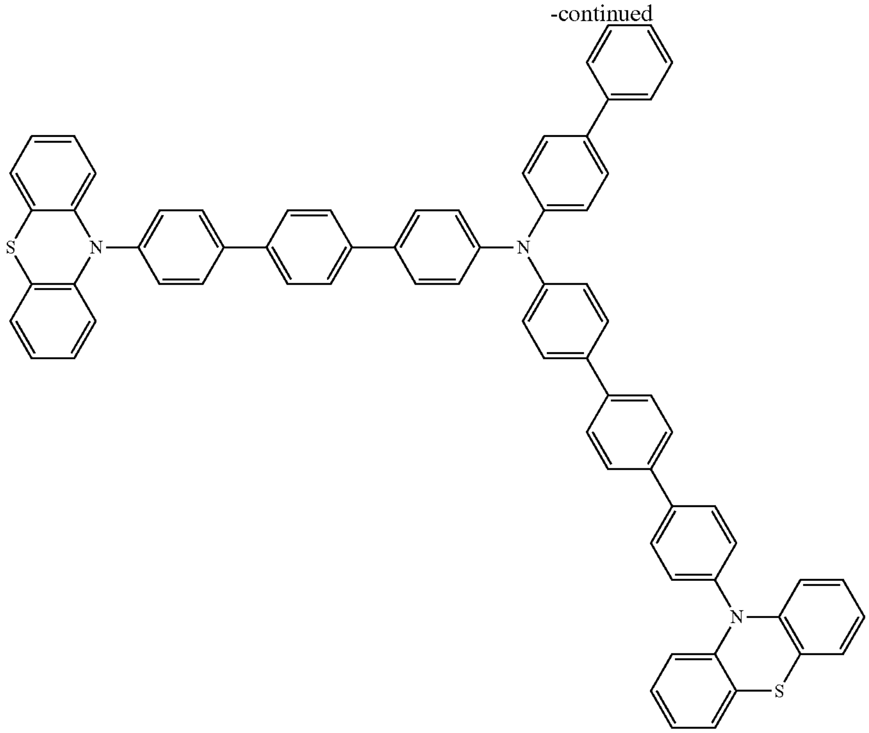
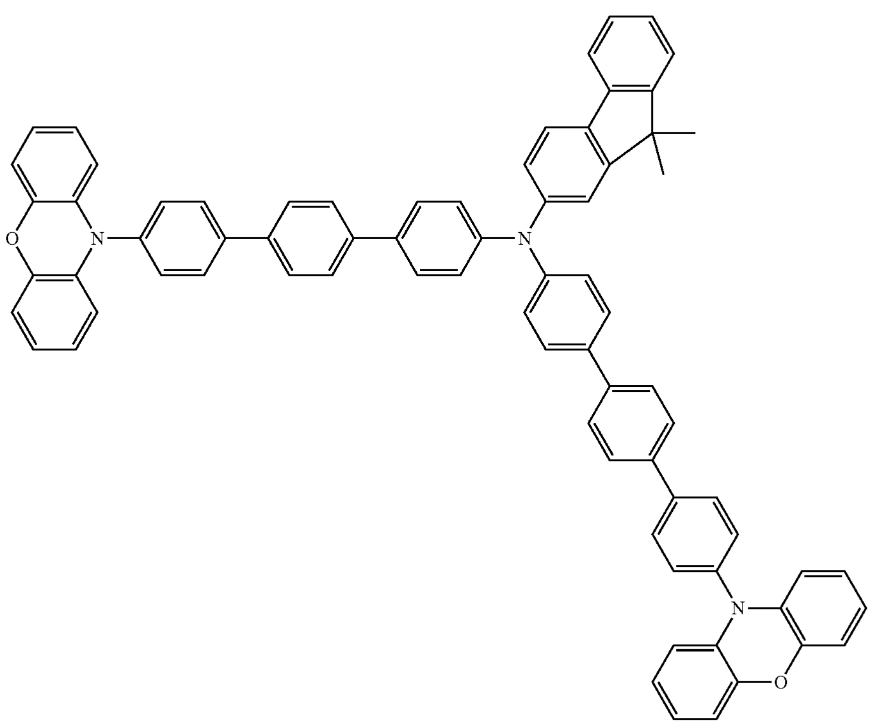

-continued
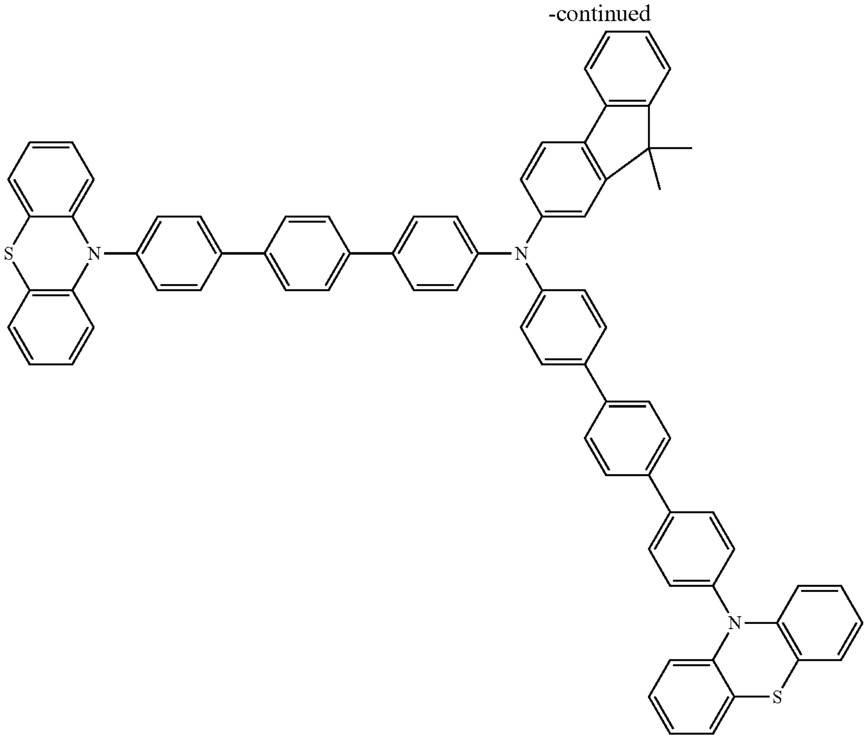
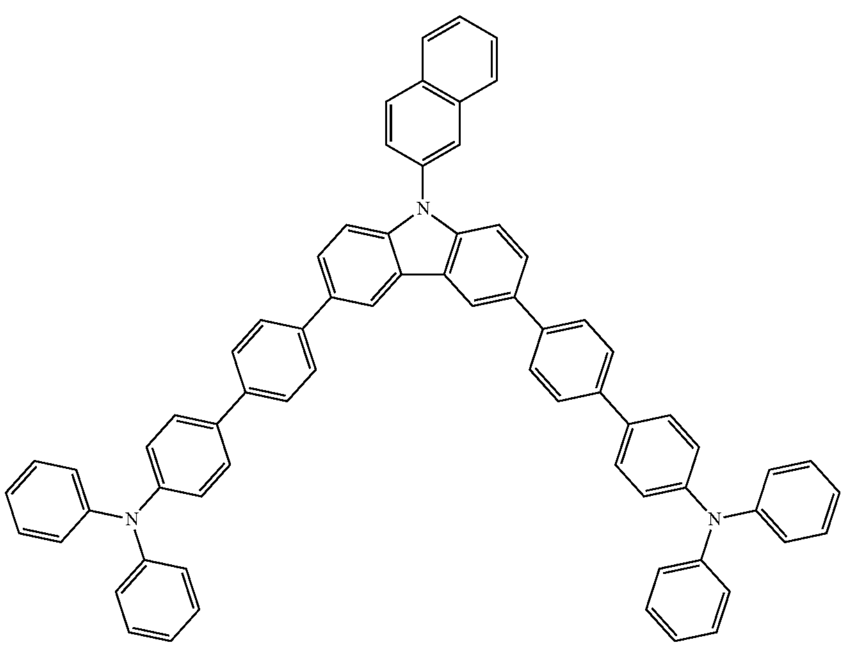

-continued
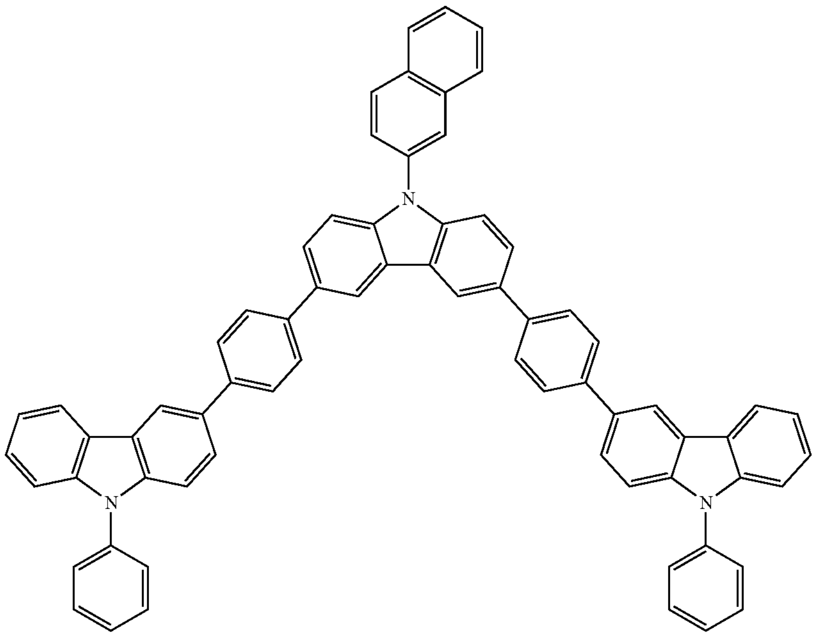
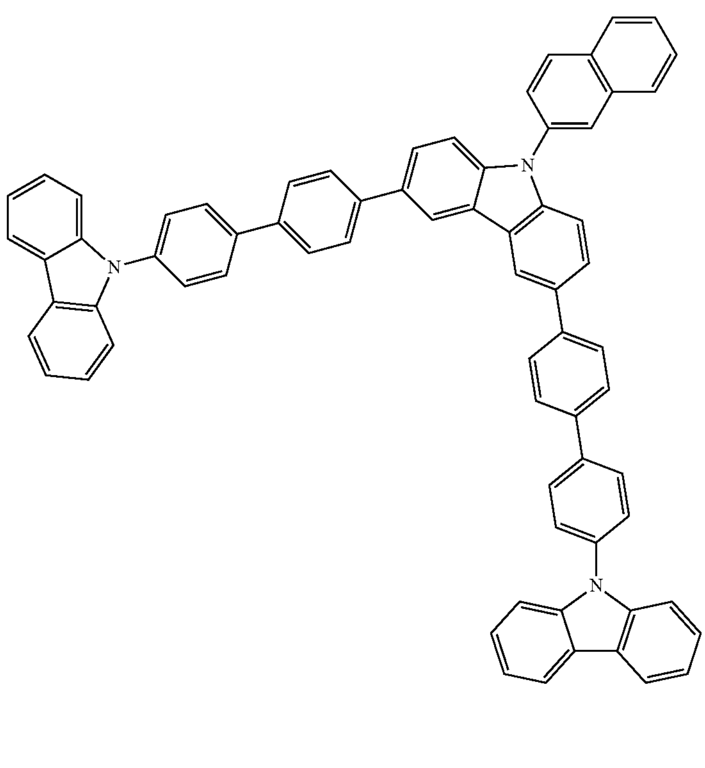

-continued
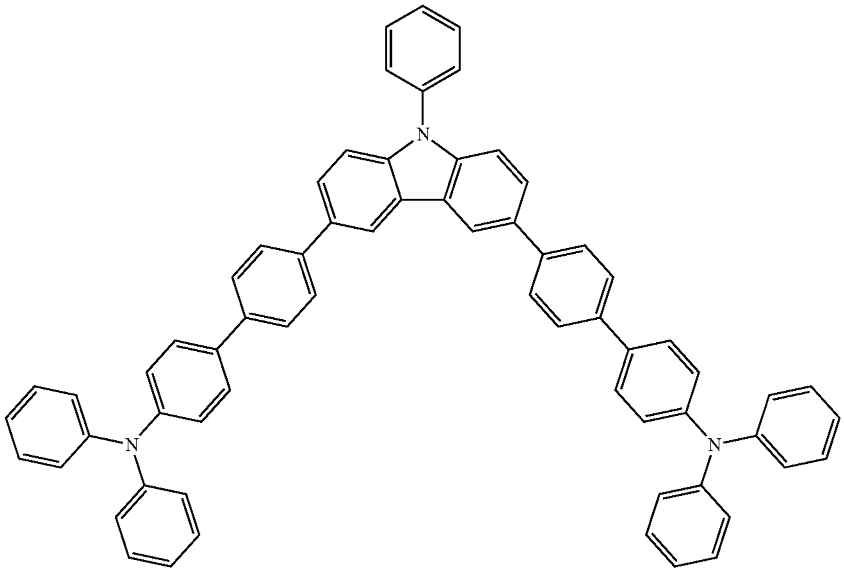
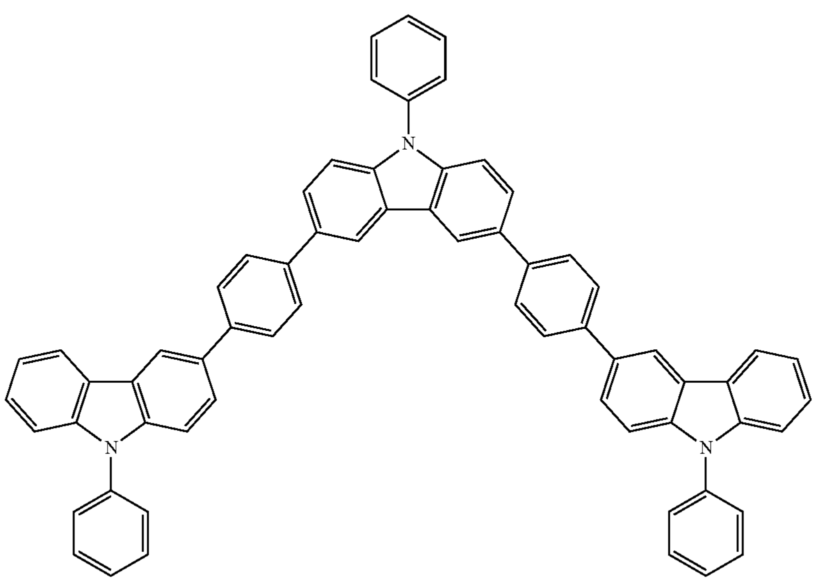

-continued
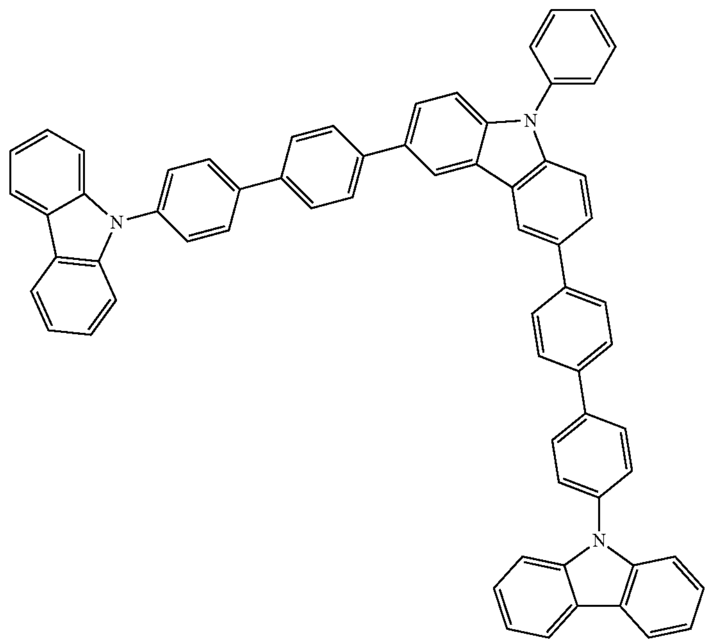
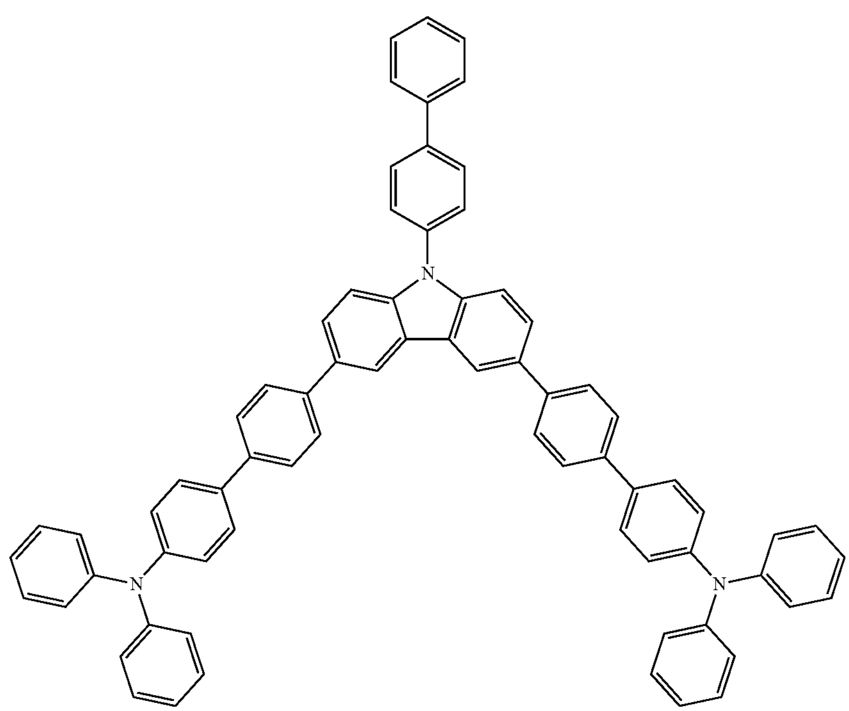

-continued
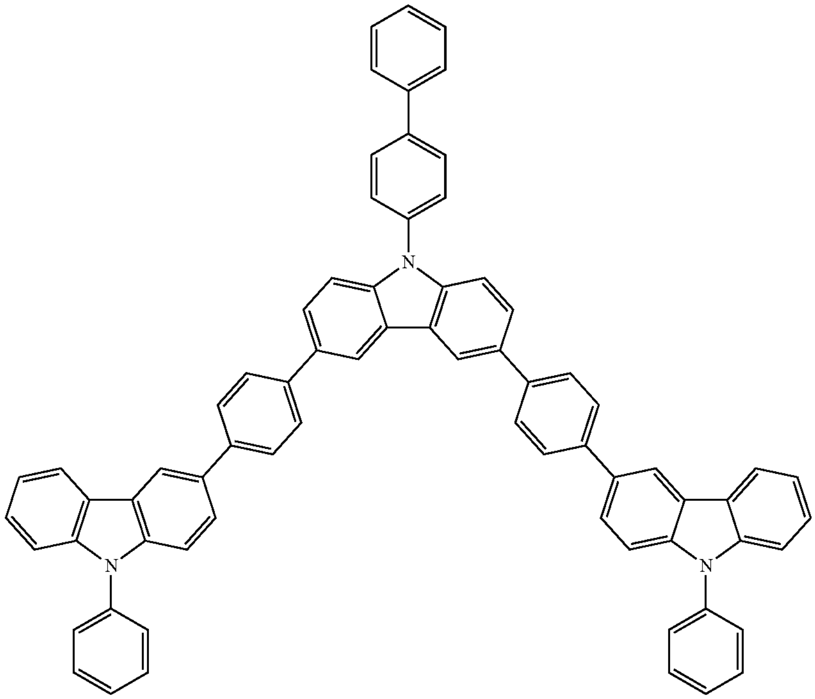
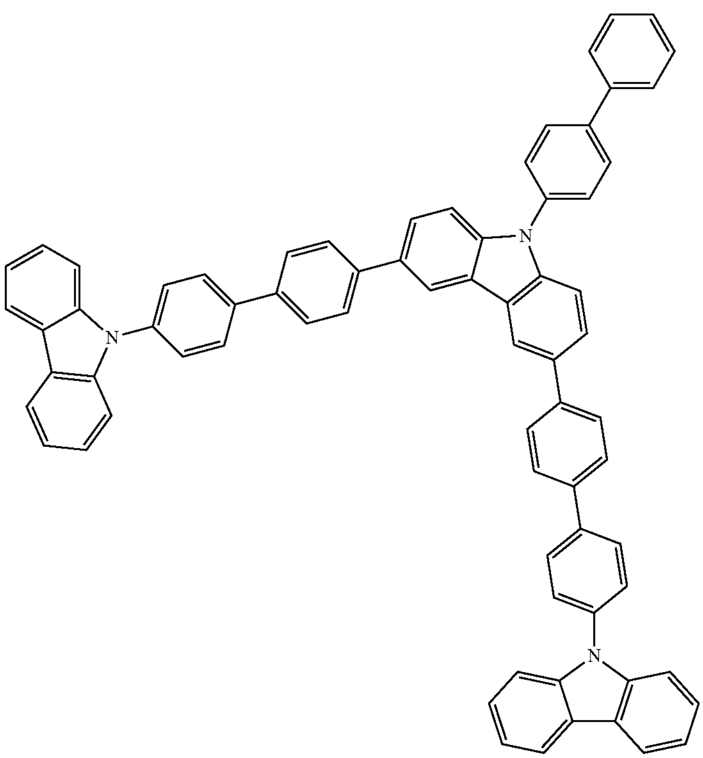

-continued
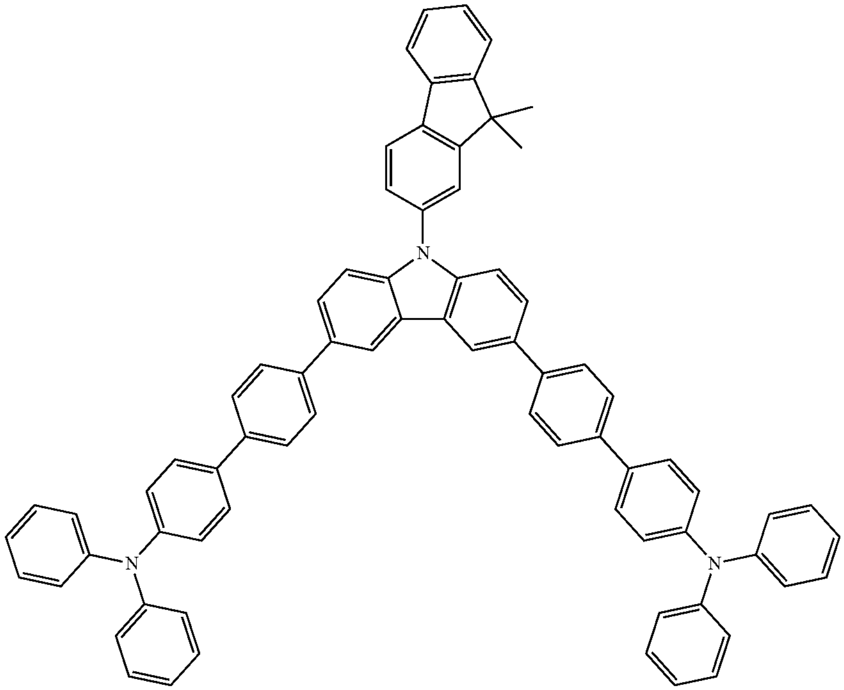
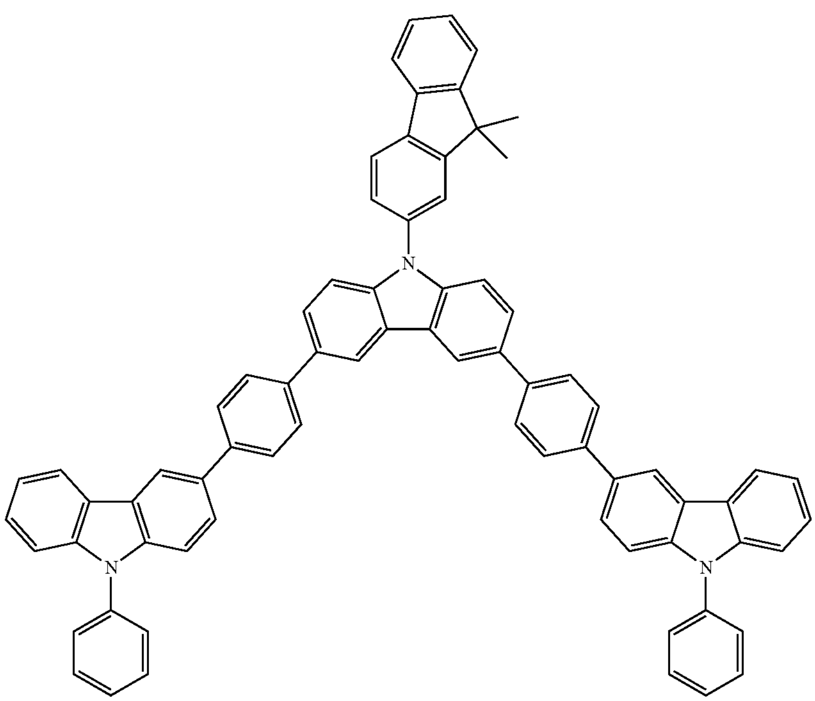

-continued

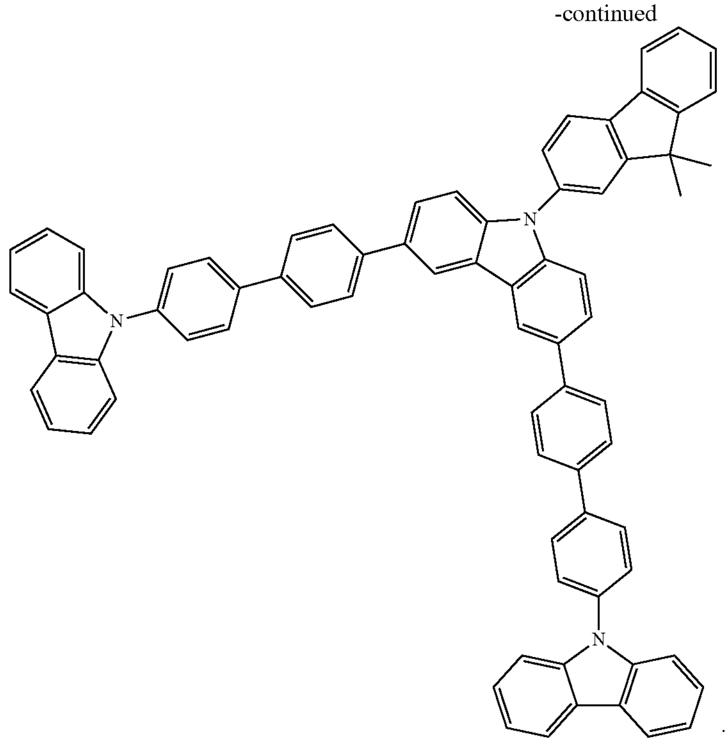

In addition, in Chemical Formula 1, when $R_{12}$ and $R_{13}$ are

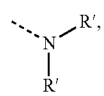

the compound can be prepared by the method as shown in Reaction Scheme 1 below, which can be applied to the remaining compounds.

[Reaction Scheme 1]

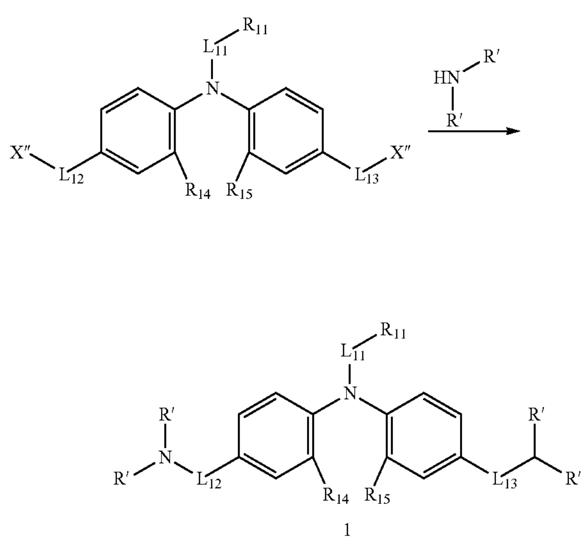

In Reaction Scheme 1, the remaining substituents excluding X" are the same as defined above, and X" is halogen and more preferably bromo or chloro.

The above reaction is an amine substitution reaction, which is preferably carried out in the presence of a palladium catalyst and a base, and a reactive group for the amine substitution reaction can be modified as known in the art. The above preparation method will be more specifically described in the Preparation Examples described hereinafter.

Light Emitting Layer

The light emitting material included in the light emitting layer is a material capable of emitting light in a visible light region by receiving holes and electrons from the hole control layer and the electron transport layer, respectively, and combining them, and is preferably a material having favorable quantum efficiency for fluorescence or phosphorescence.

The light emitting layer can include a host material and a dopant material. In particular, in the present invention, the host material includes (i) the compound of Chemical Formula 2-1, or the compound of Chemical Formula 2-2; and (ii) the compound of Chemical Formula 3.

In Chemical Formulas 2-1 and 2-2, preferably, two of $Y_2$ are N or all of them are N.

Preferably, $L_{21}$ is a single bond, phenylene, naphthylene, or phenanthrendiyl.

Preferably, $L_{22}$ is a single bond or phenylene.

Preferably, $L_{23}$ and $L_{24}$ are each independently a single bond or phenylene.

Preferably, $R_{21}$ is phenyl, biphenylyl, terphenylyl, or the following substituent:

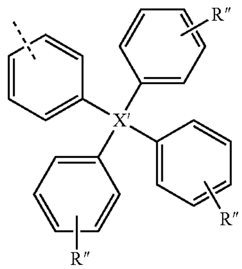

wherein, X' is C or Si, and each R" is independently hydrogen, methyl, tert-butyl, or Si(methyl)$_3$.

Preferably, $R_{23}$ and $R_{24}$ are each independently phenyl, phenyl substituted with 1 to 5 deuteriums, biphenylyl, terphenylyl, naphthyl, phenanthrenyl, fluoranthenyl, phenylfluoranthenyl, triphenylenyl, pyrenyl, chrysenyl, perylenyl, dimethylfluorenyl, dibenzofuranyl, or dibenzothiophenyl.

Preferably, $R_{25}$ and $R_{26}$ are each independently hydrogen, deuterium, $CD_3$, cyano, or phenyl.

Preferably, n and m are one.

Representative examples of the compound of Chemical Formula 2-1 or 2-2 are as follows:

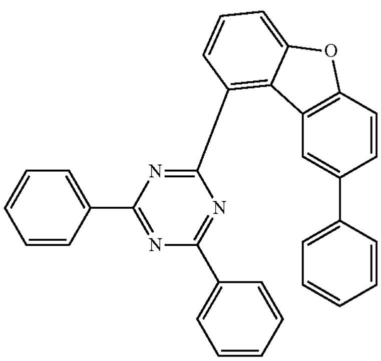

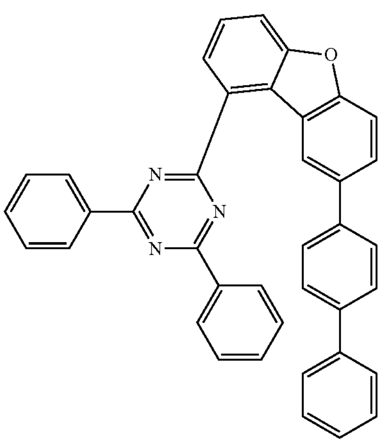

-continued

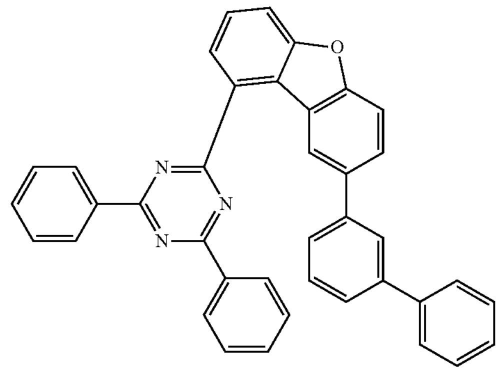

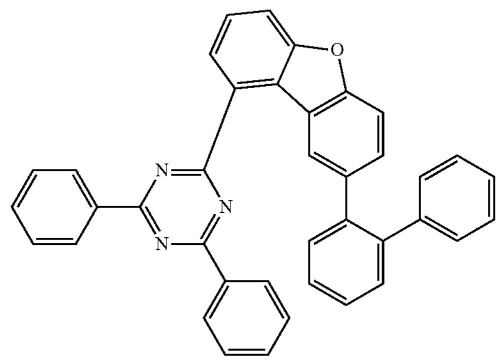

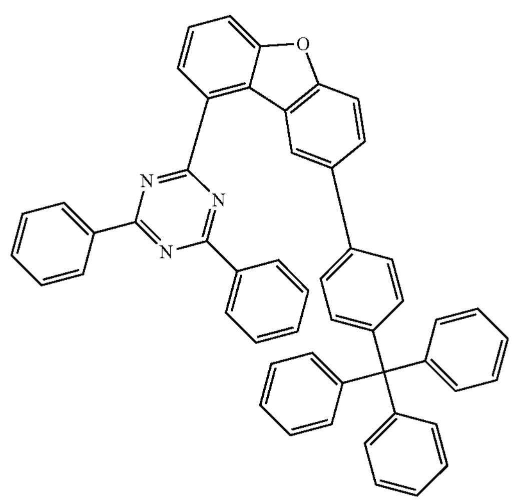

-continued
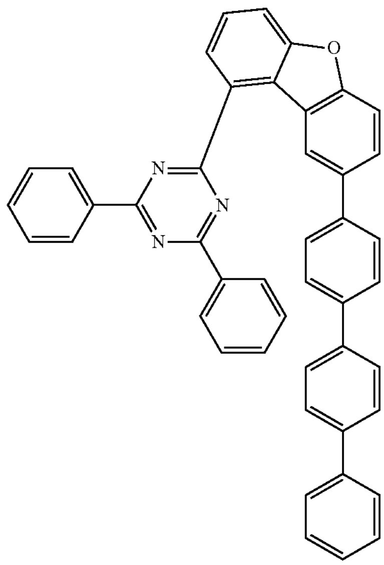
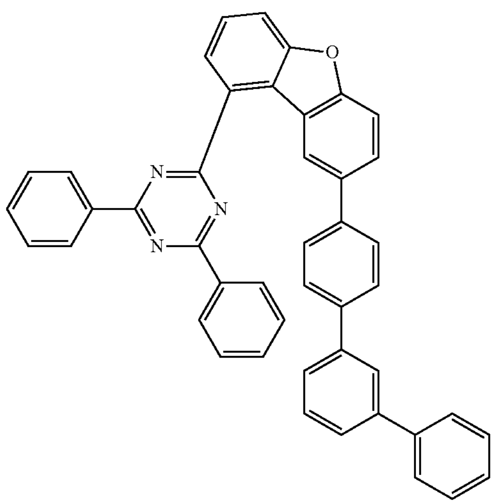
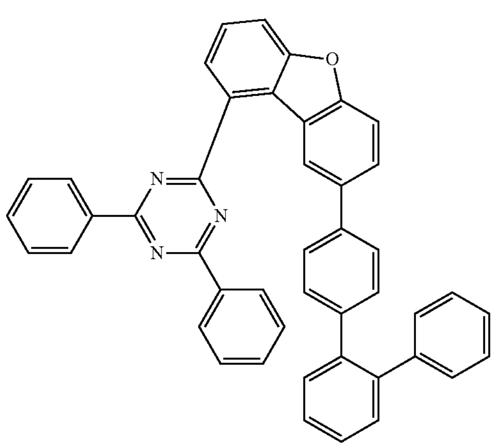
-continued
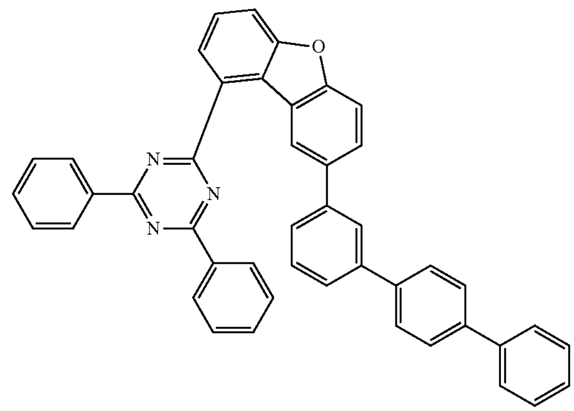
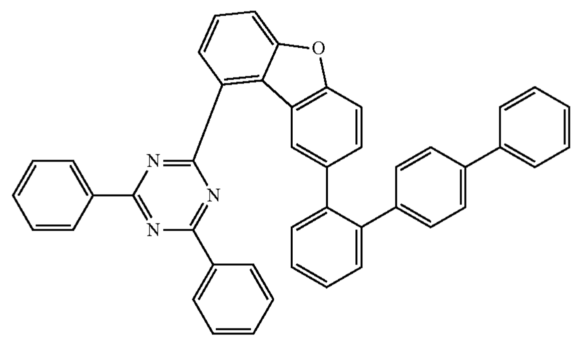
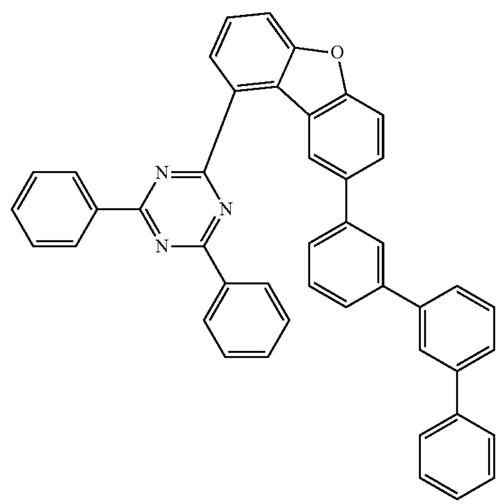
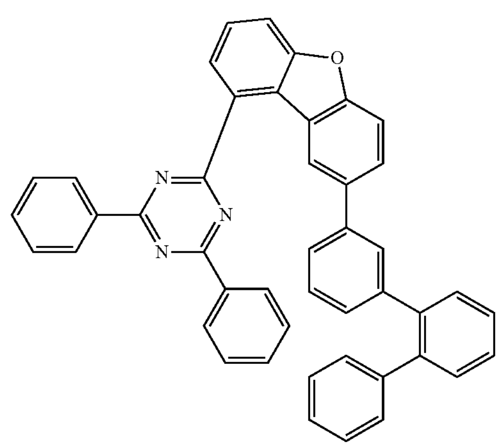

-continued
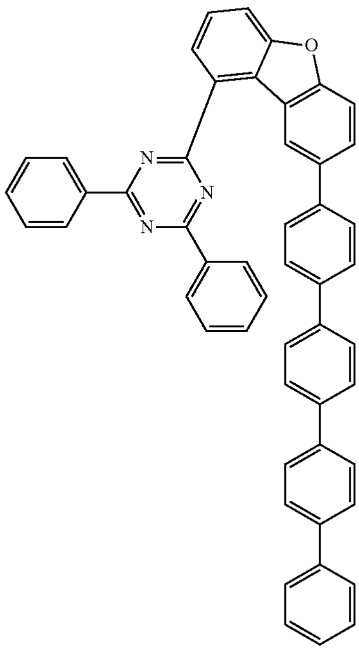
-continued
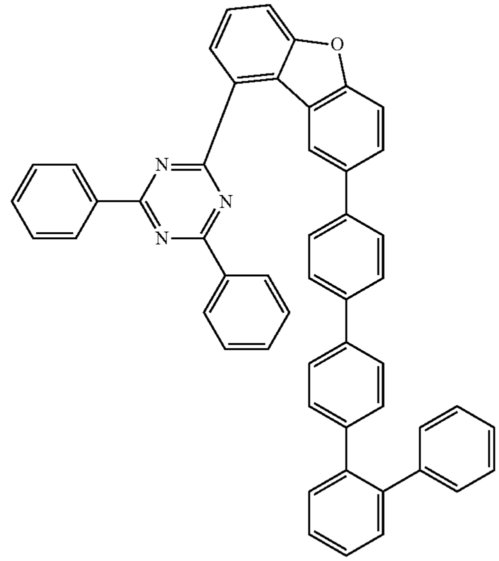
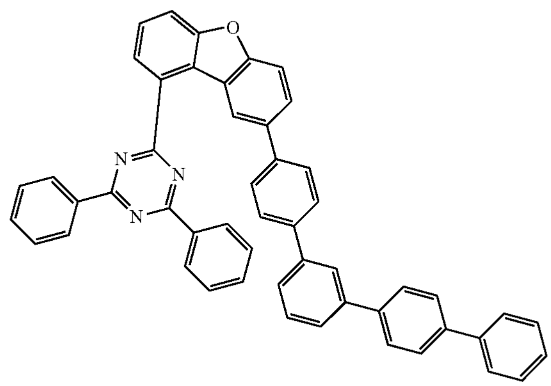
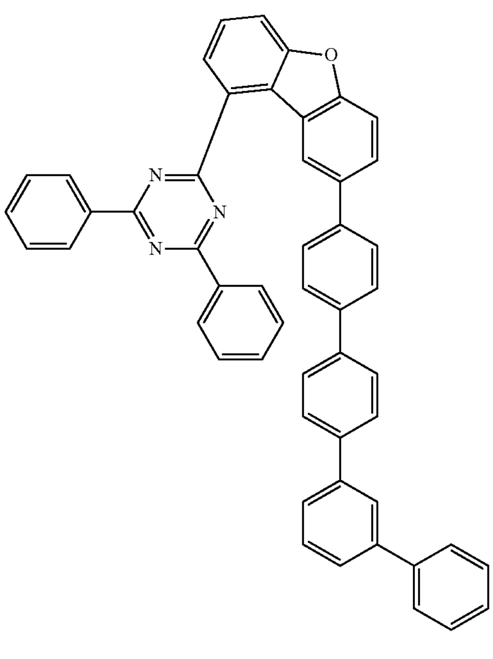
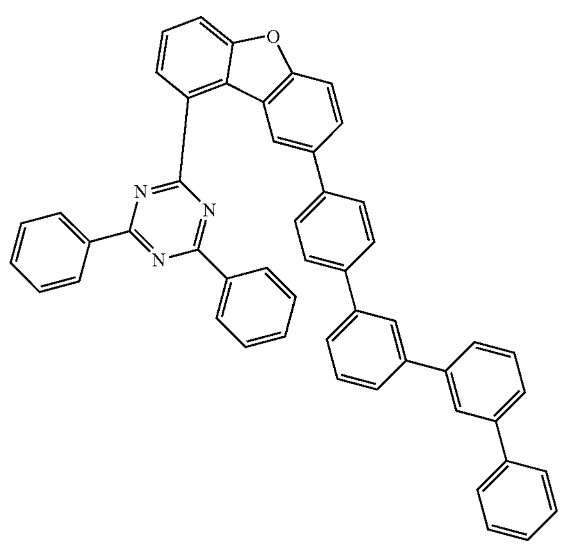

-continued
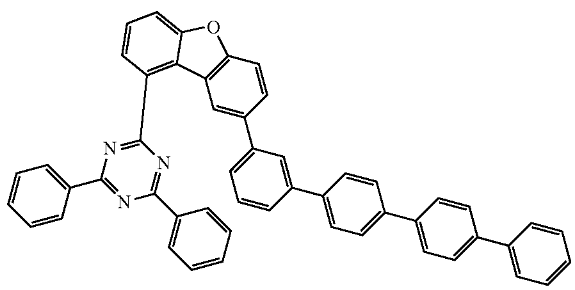
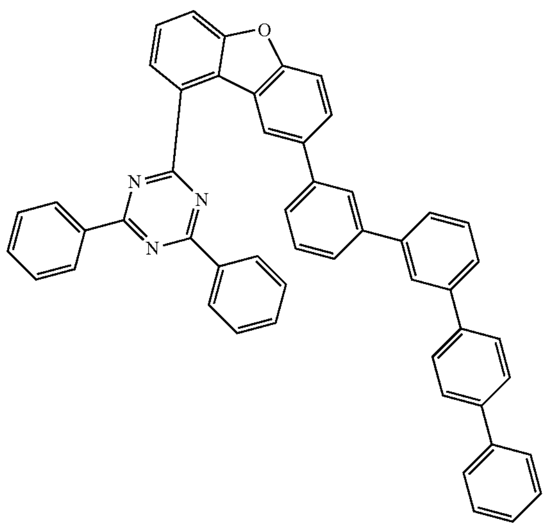
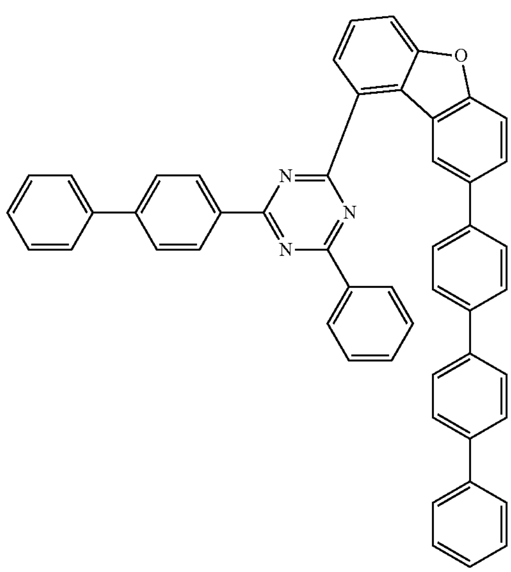
-continued
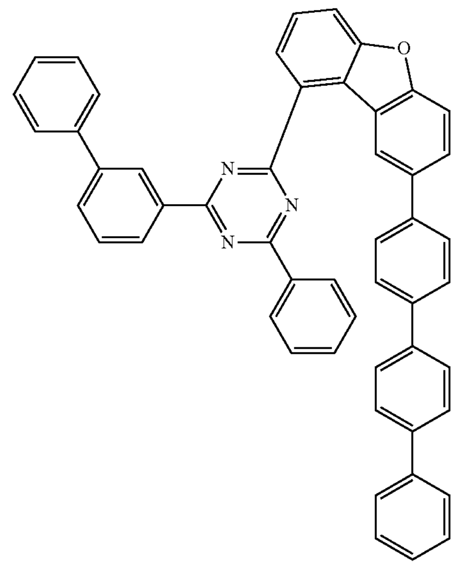
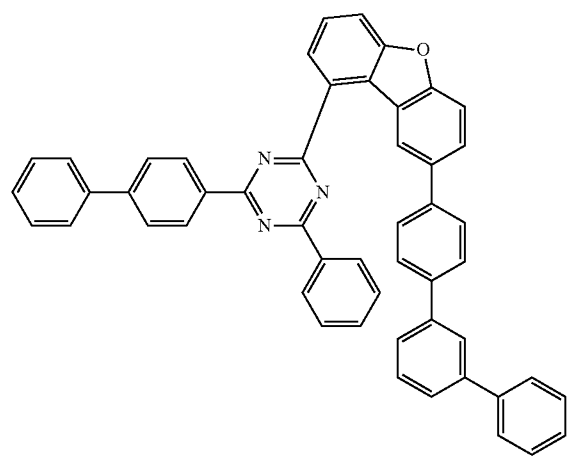
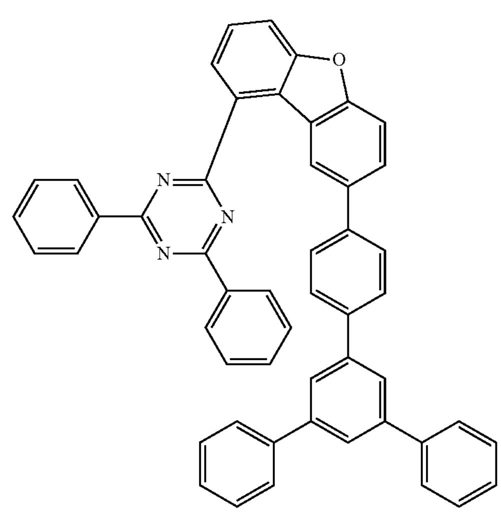

-continued
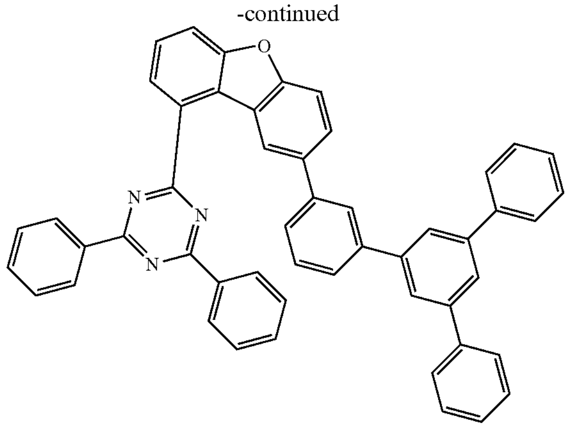
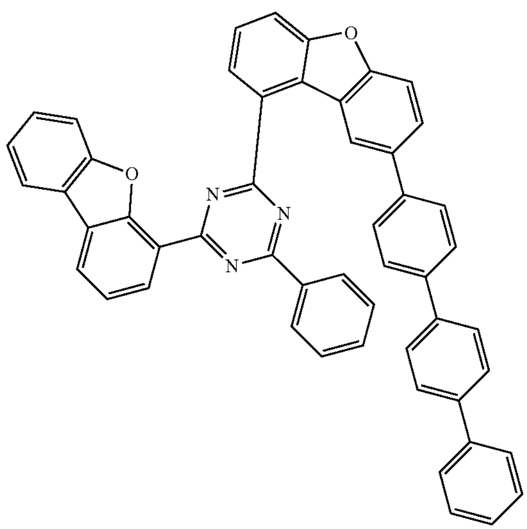
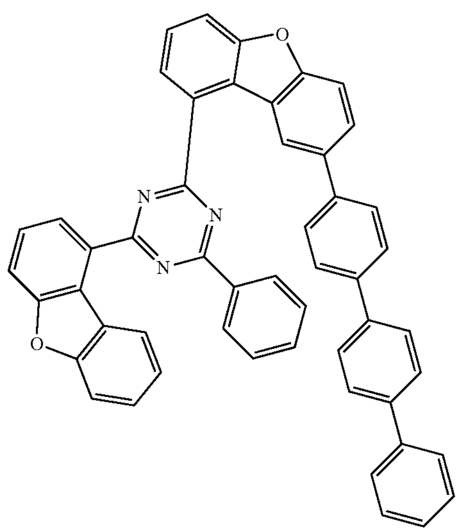
-continued
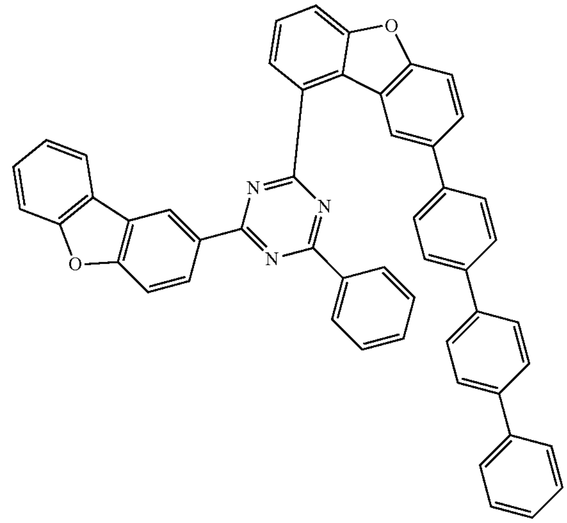
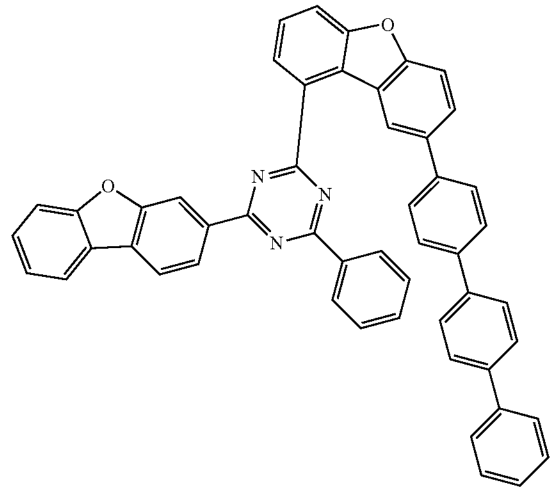
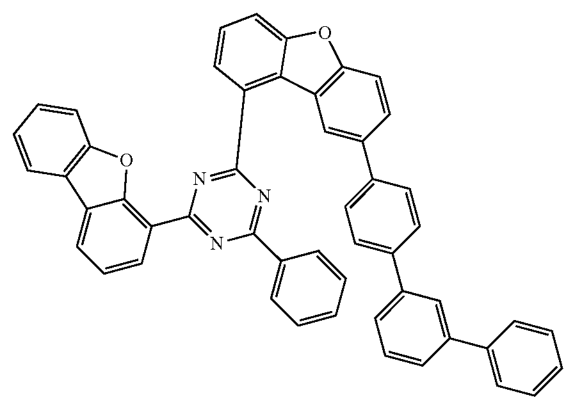

-continued
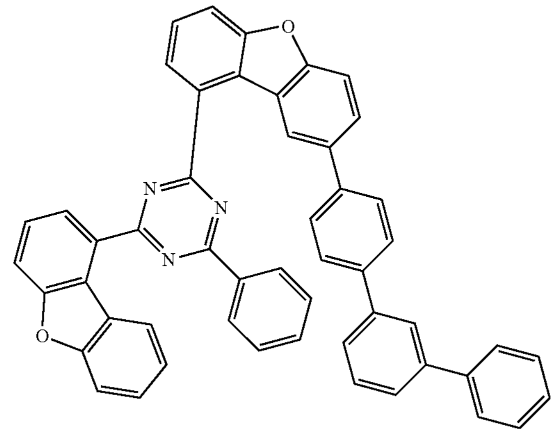
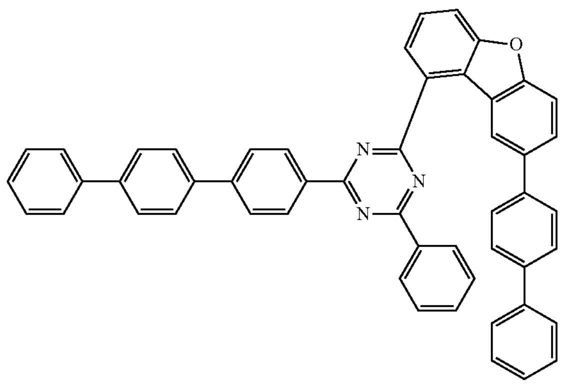
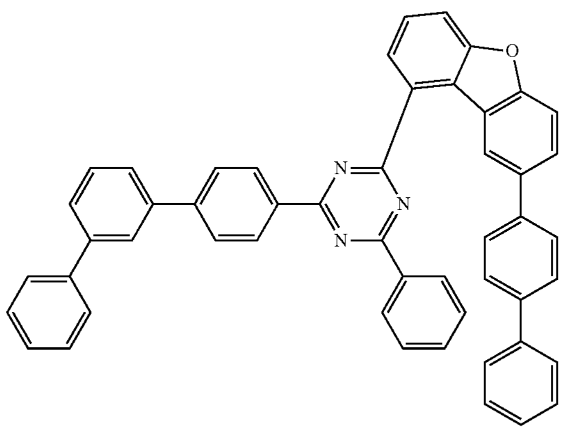
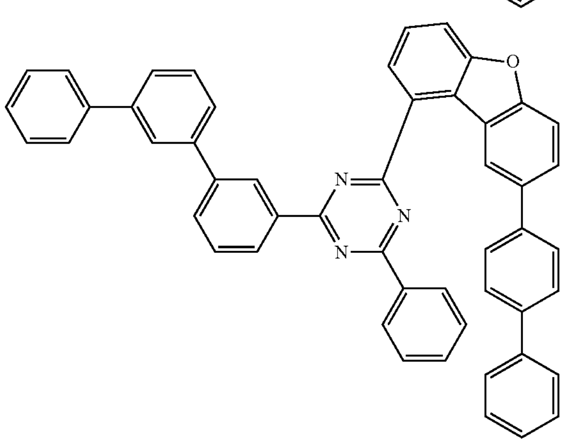
-continued
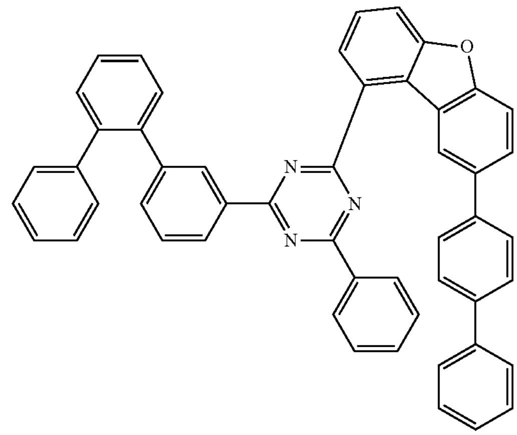
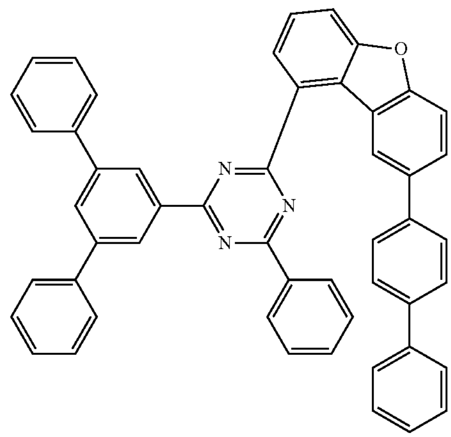
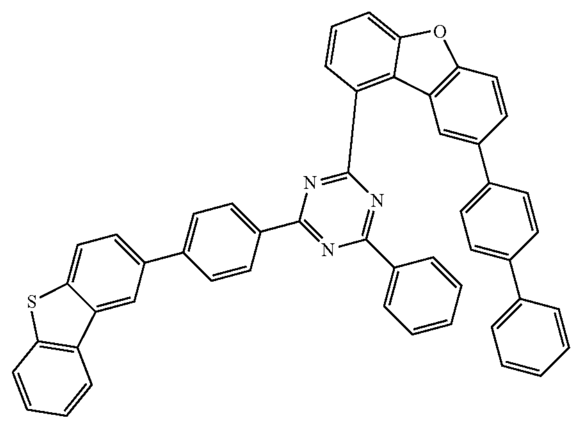
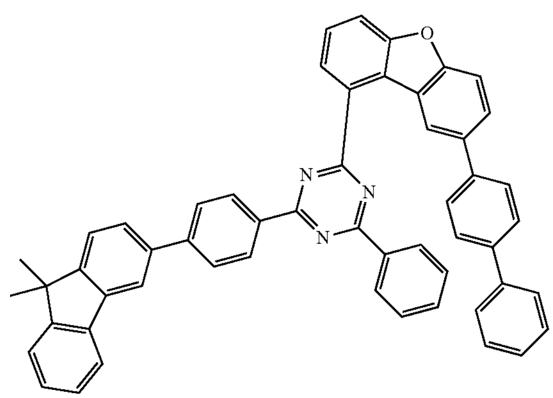

-continued
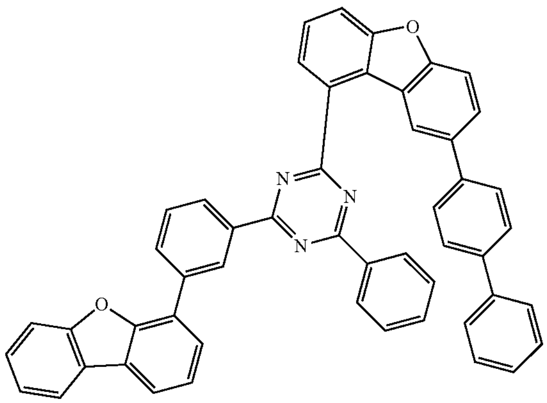
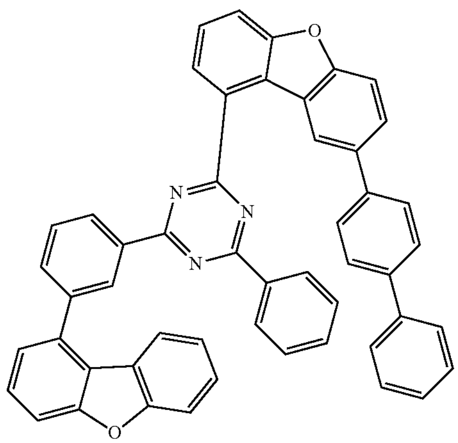
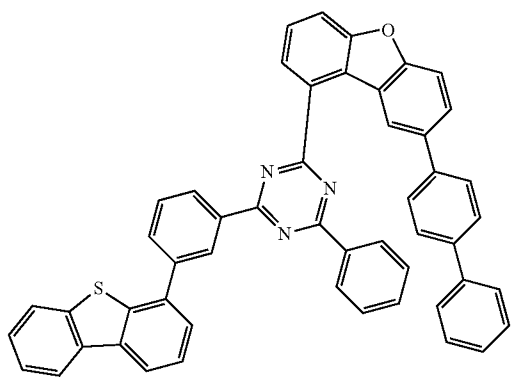
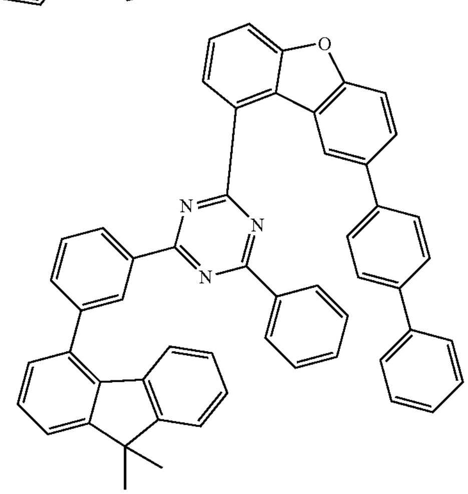
-continued
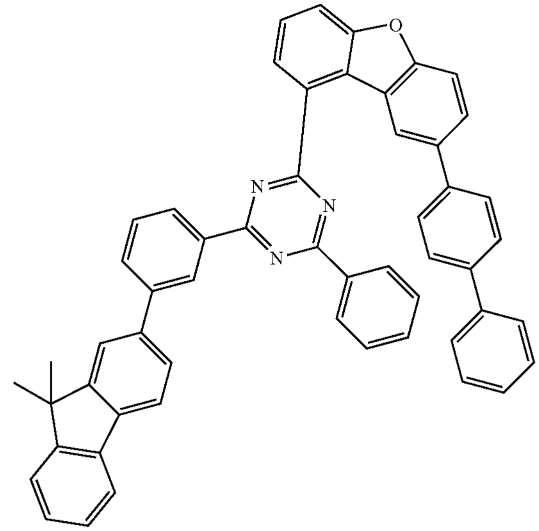
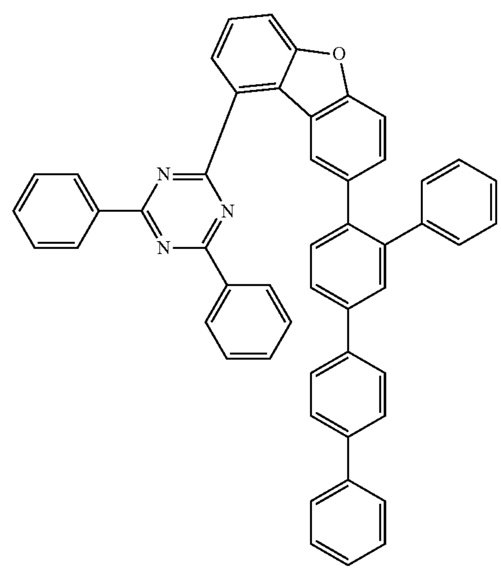
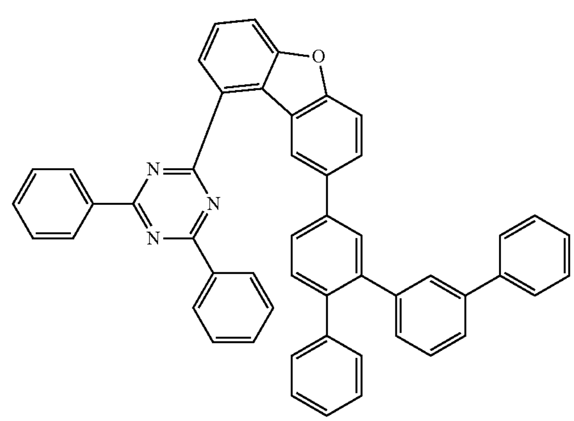

-continued
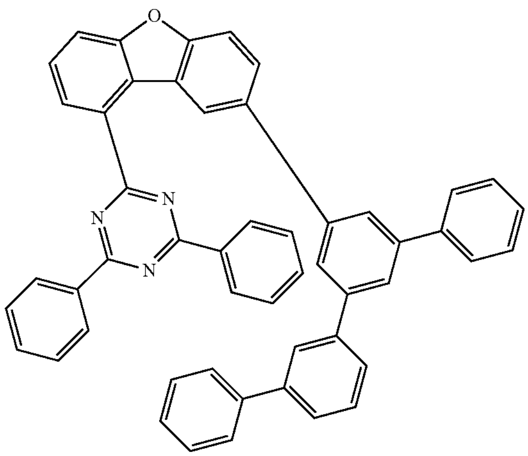
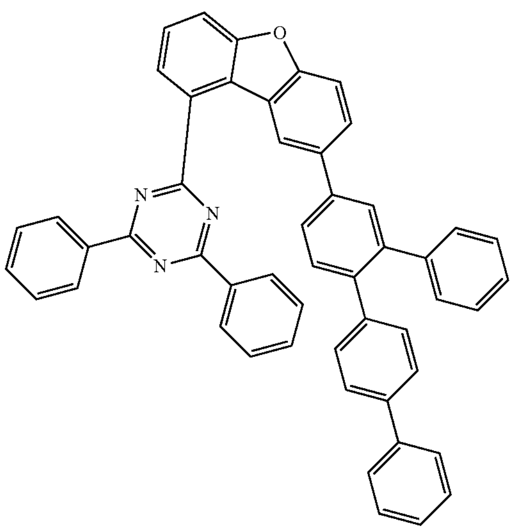
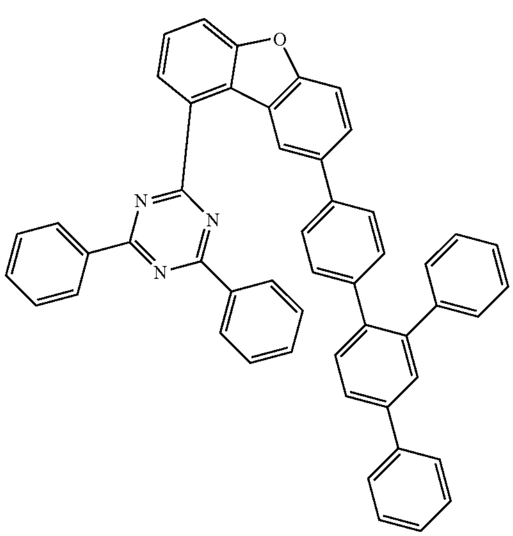
-continued
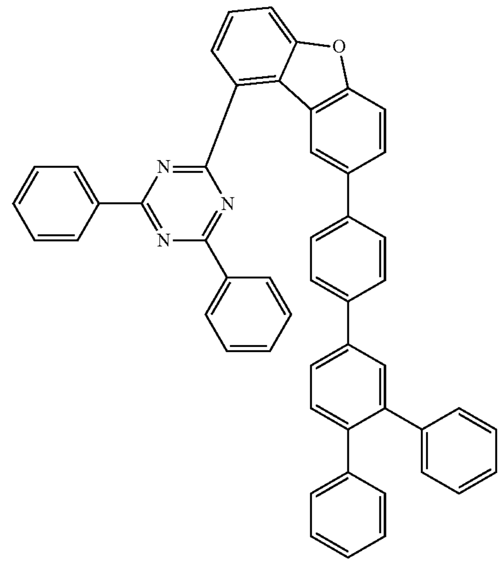
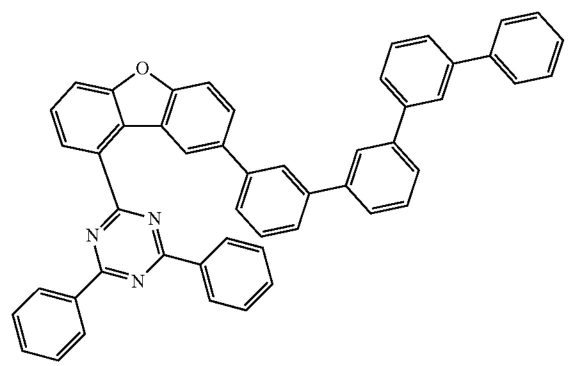
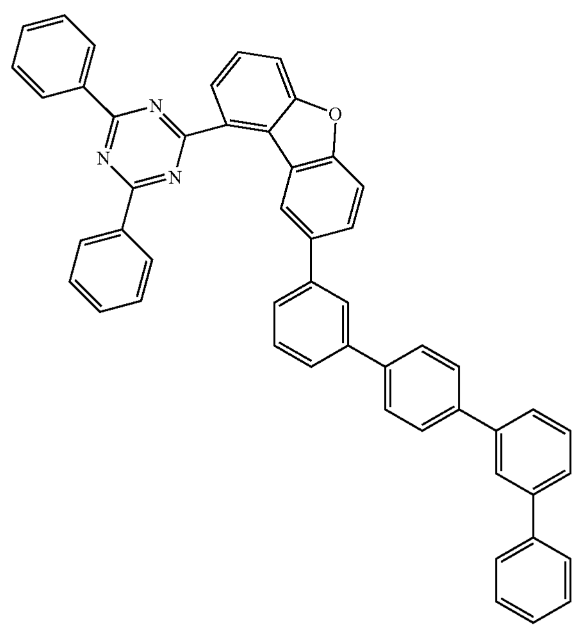

-continued
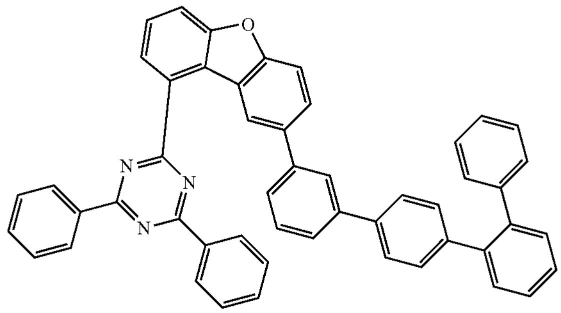
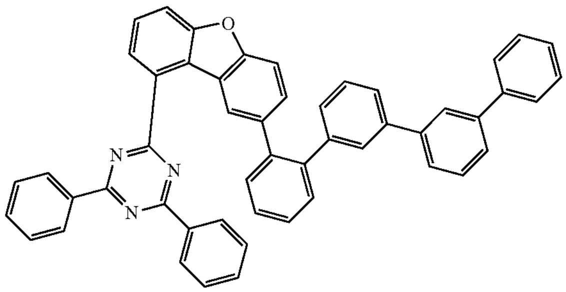
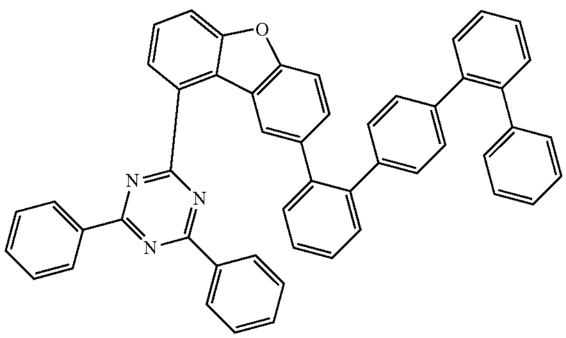
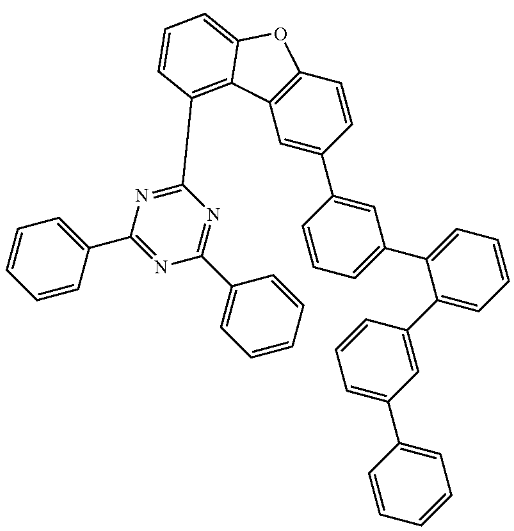
-continued
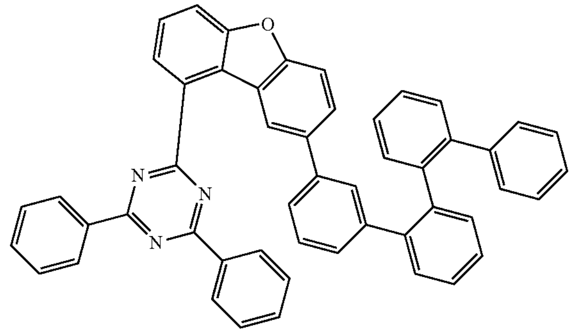
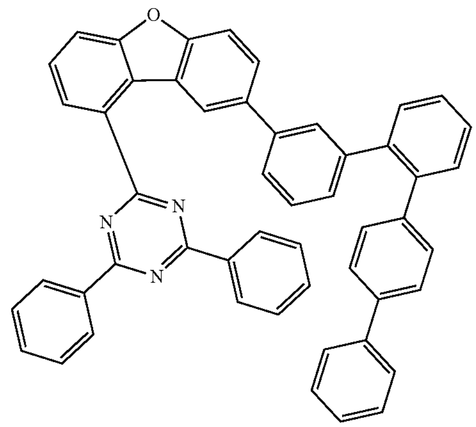
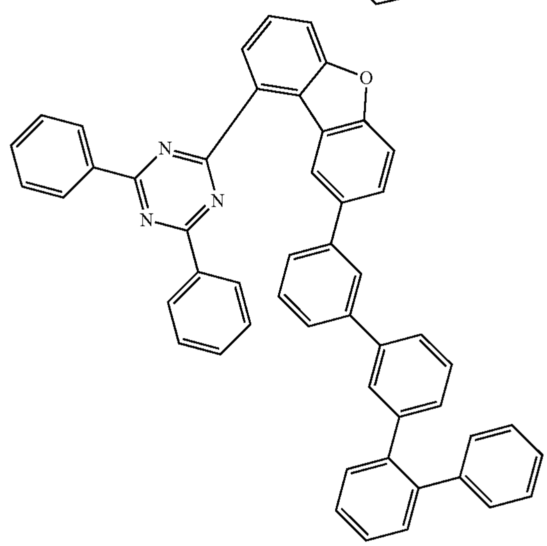
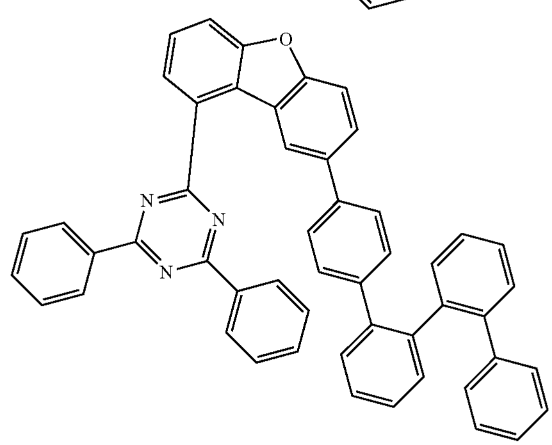

-continued
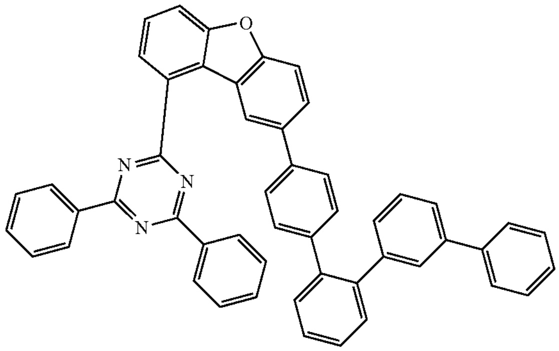
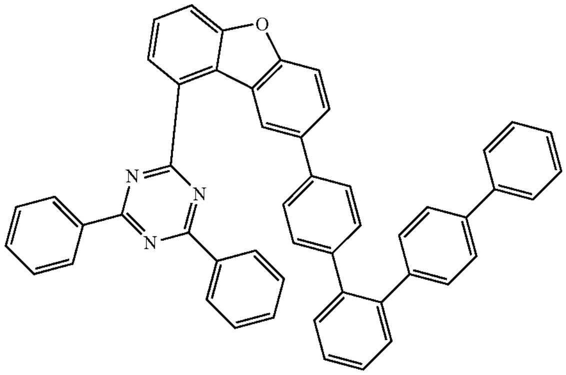
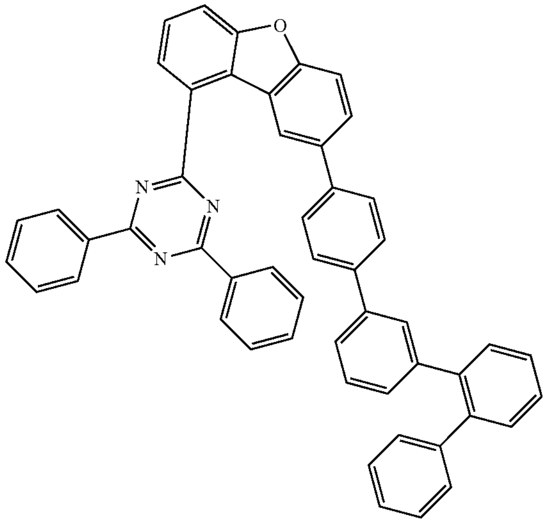
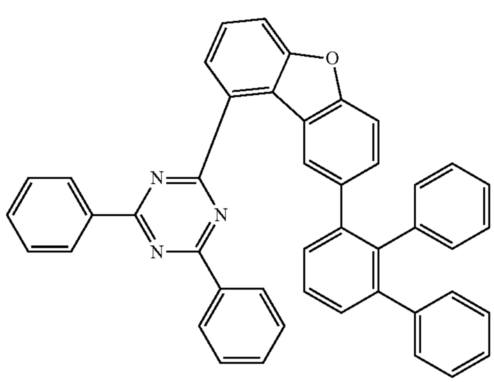
-continued
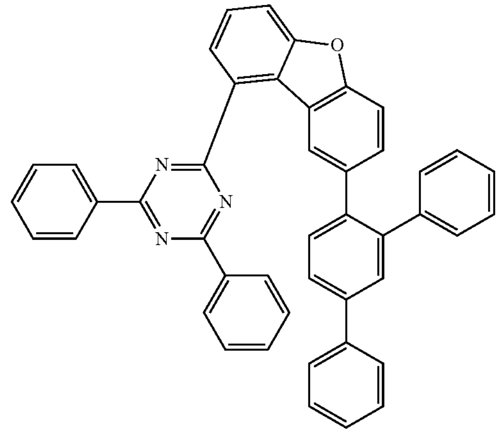
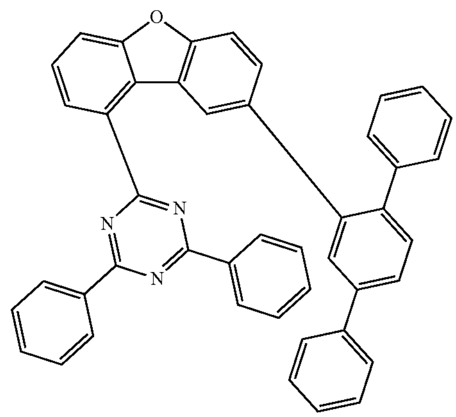
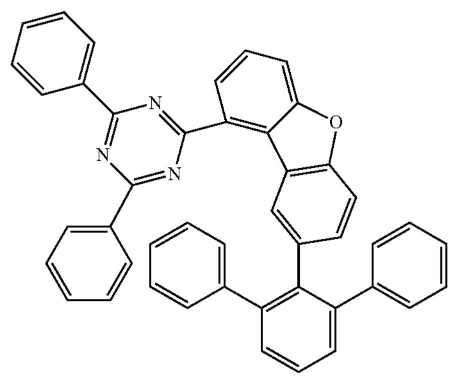
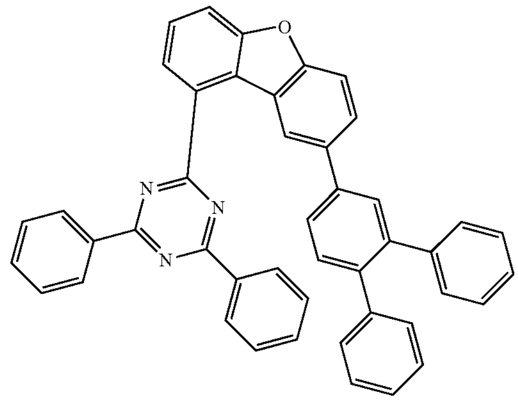

-continued
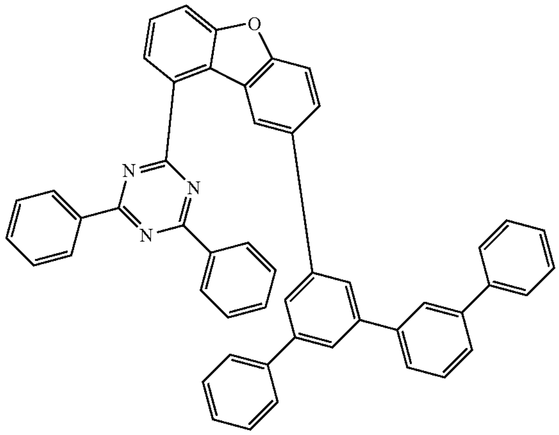
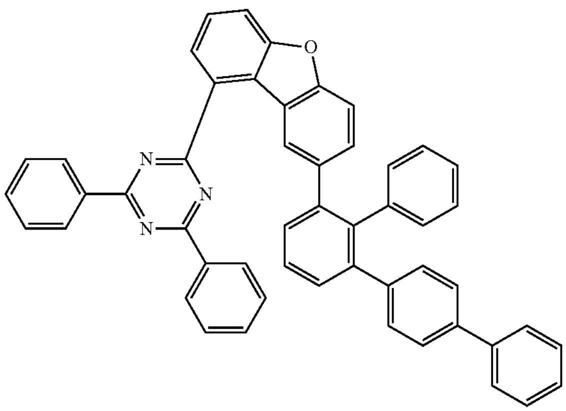
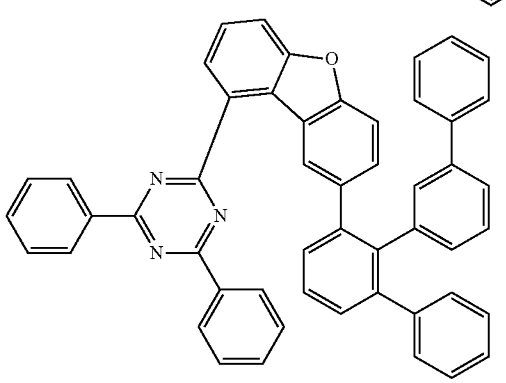
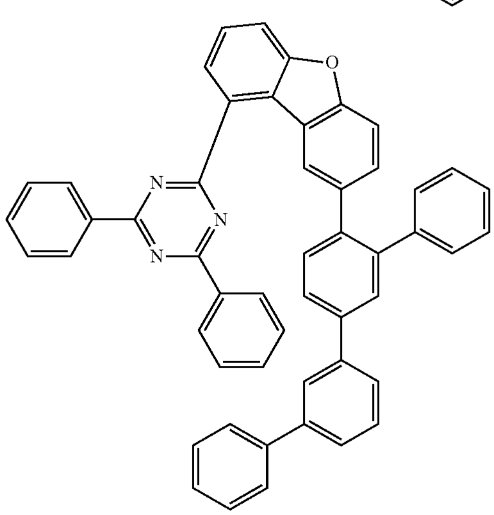
-continued
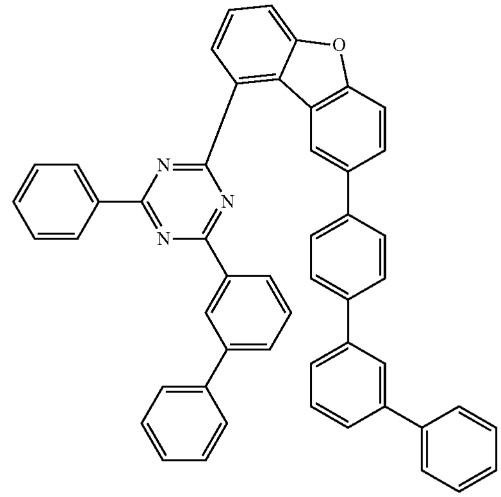
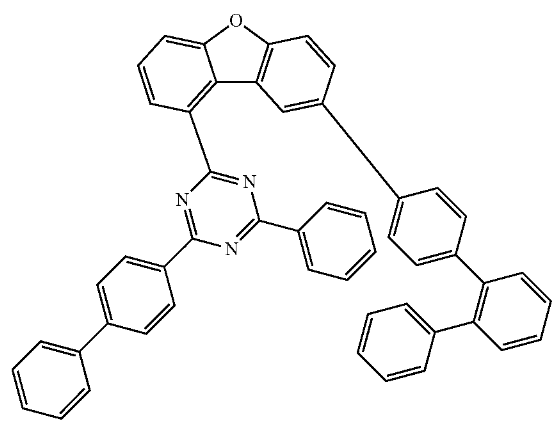
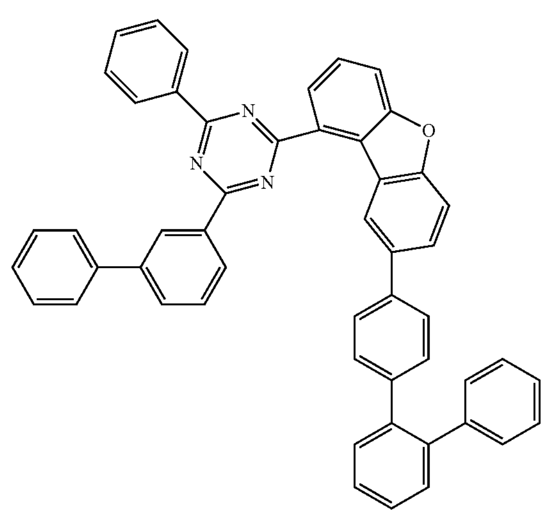

-continued
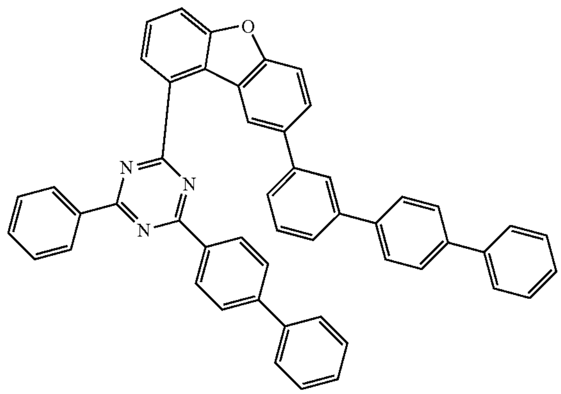
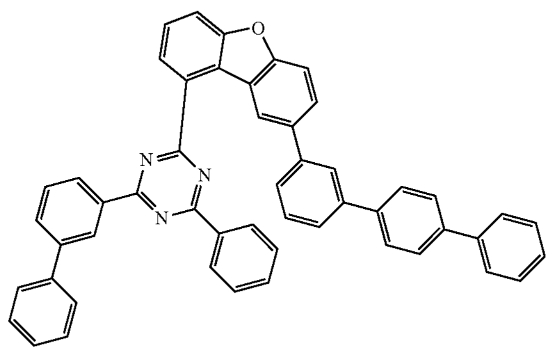
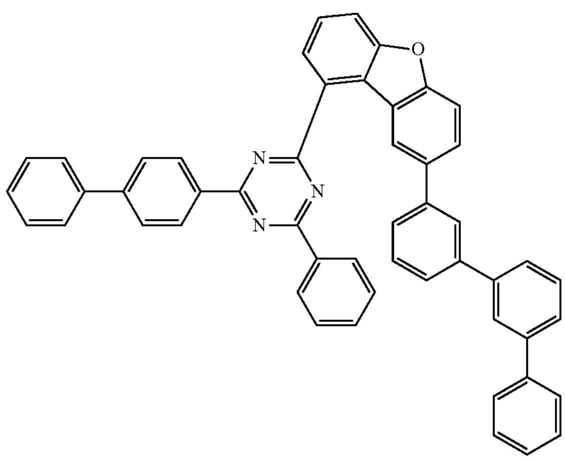
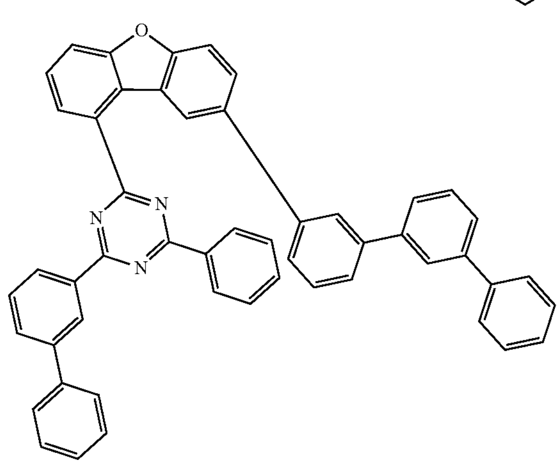
-continued
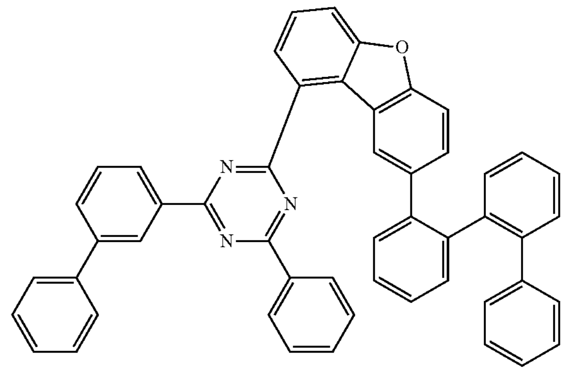
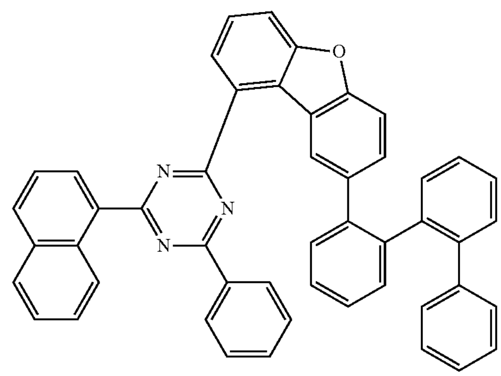
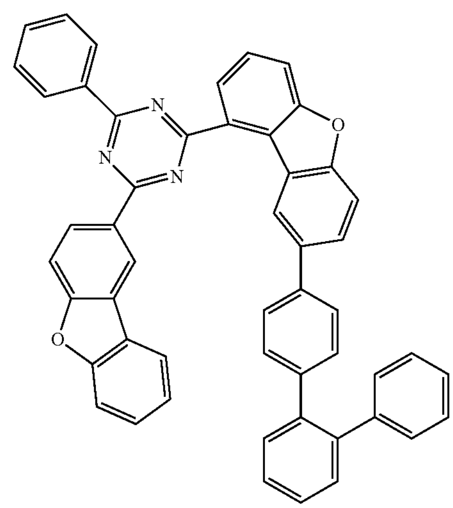
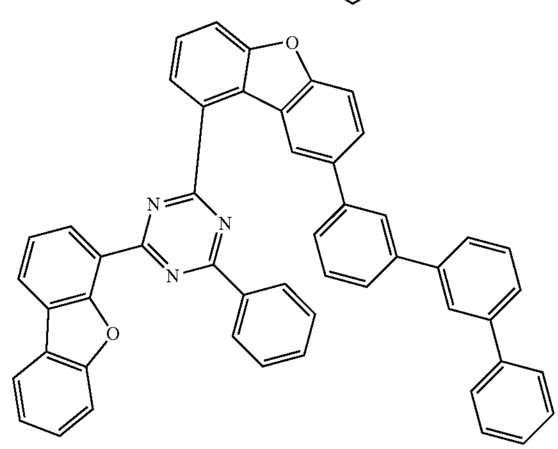

-continued
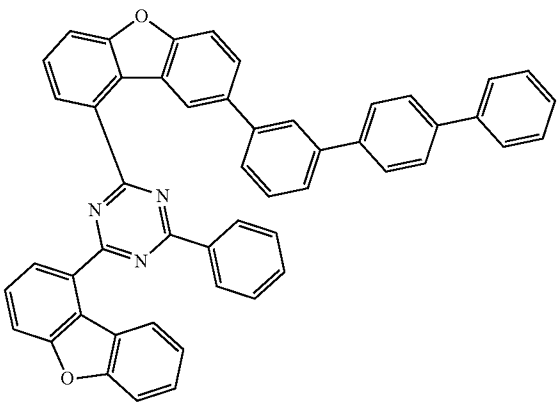
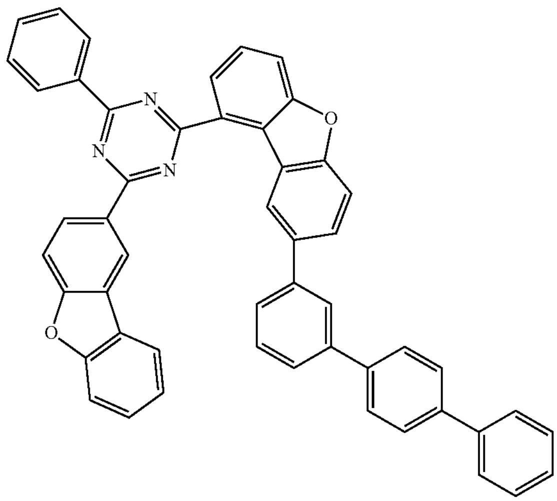
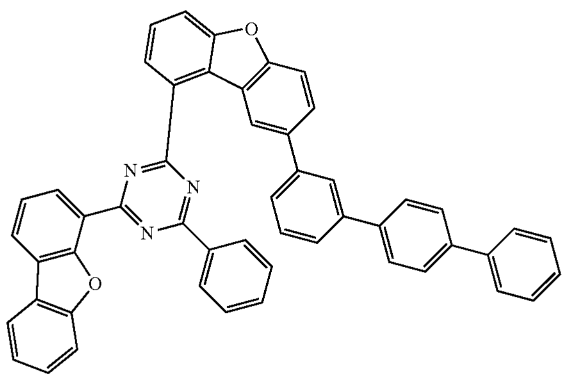
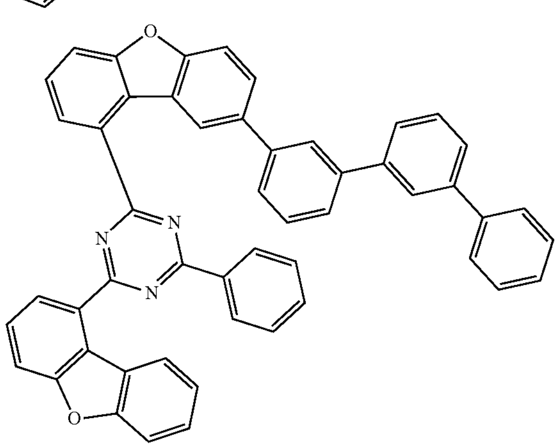
-continued
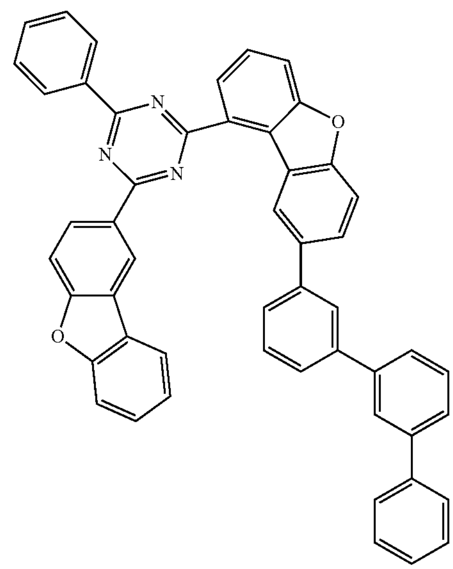
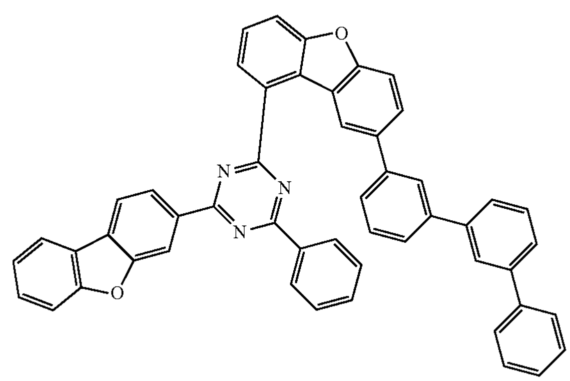
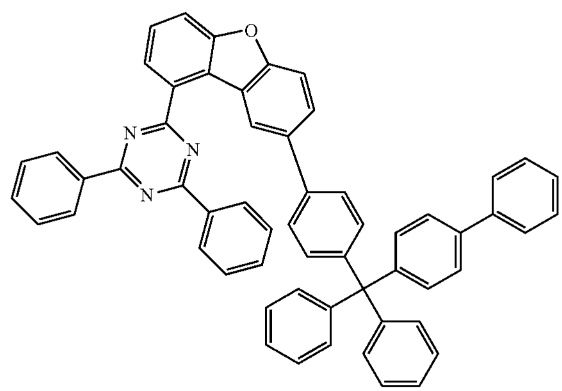

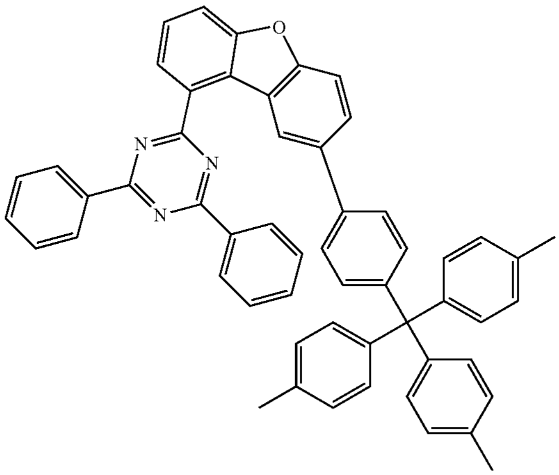
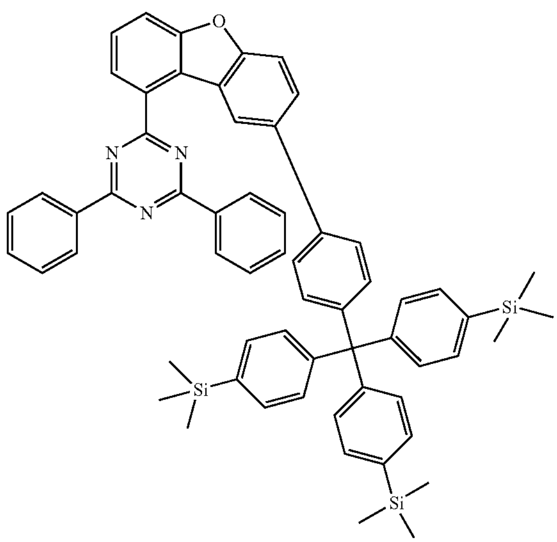
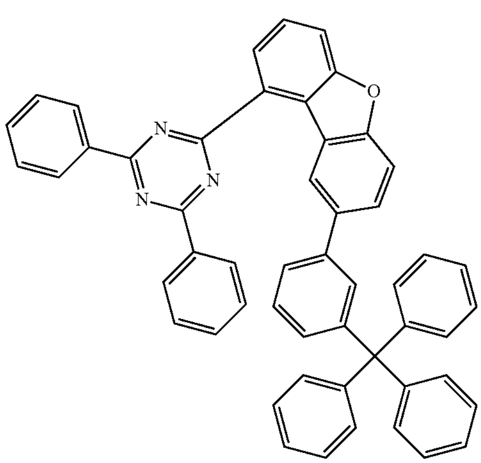
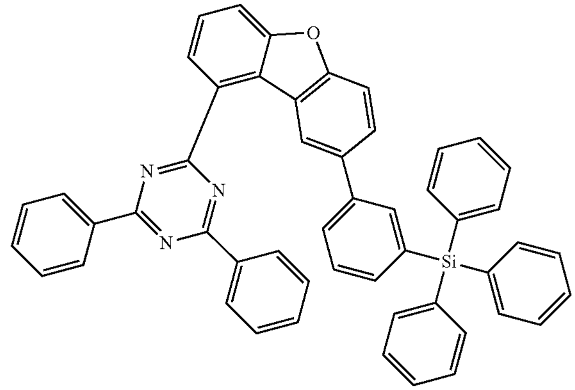
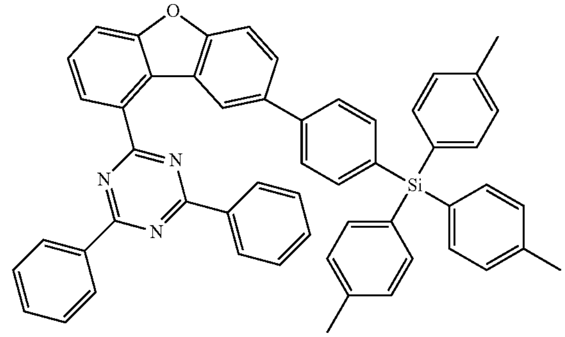
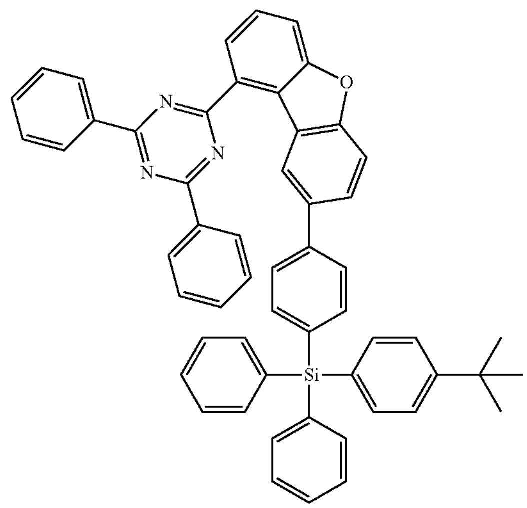
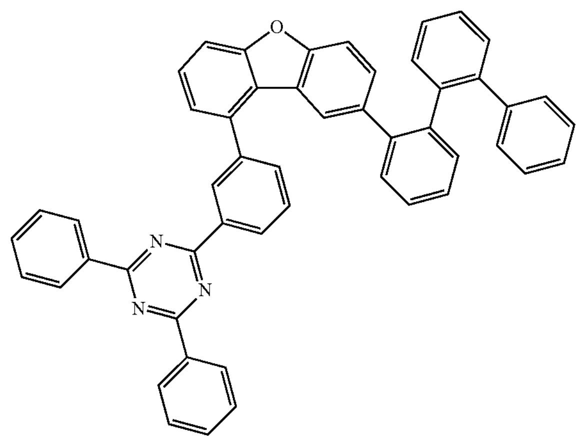

-continued
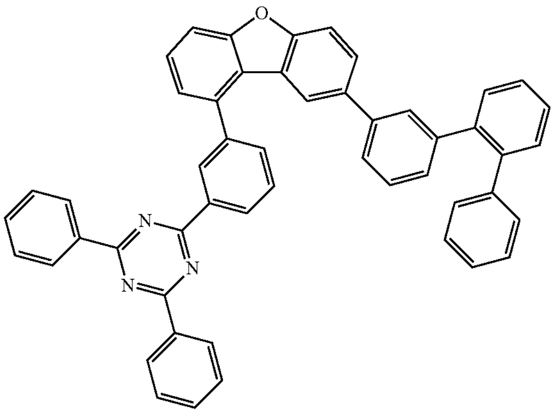
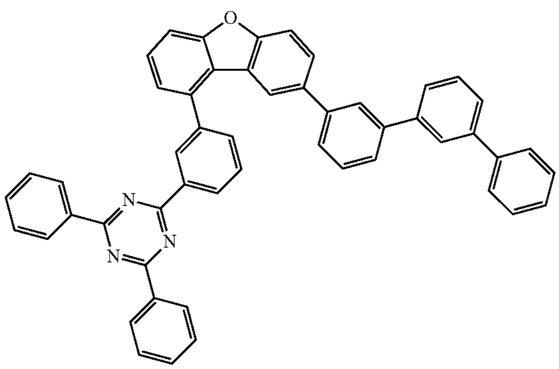
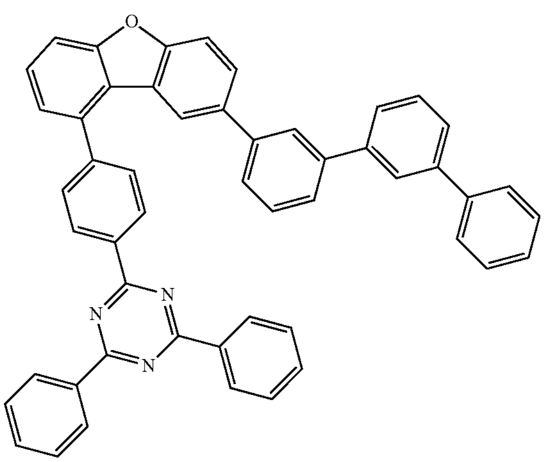
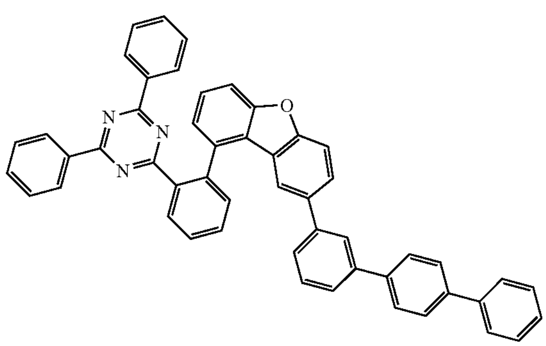
-continued
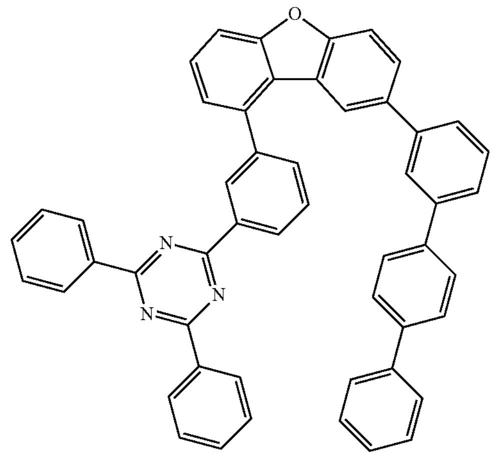
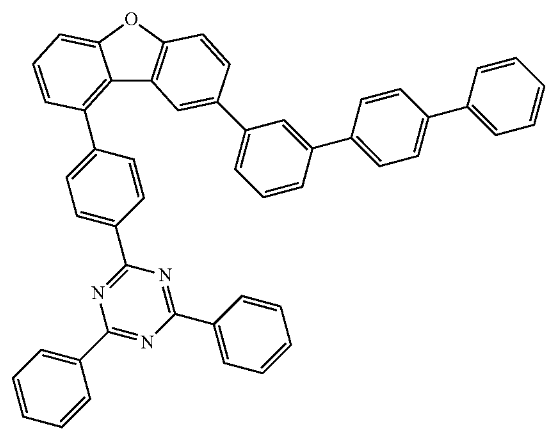
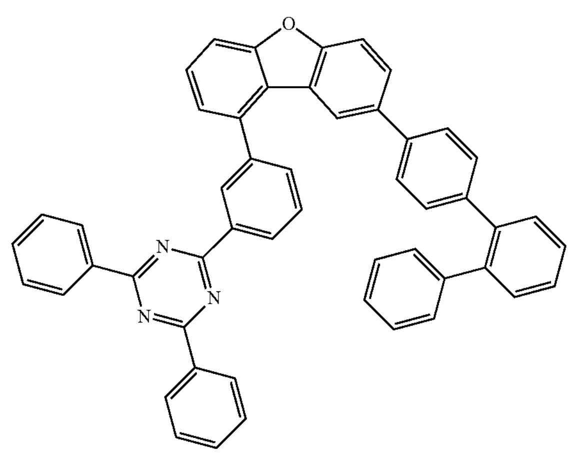

-continued
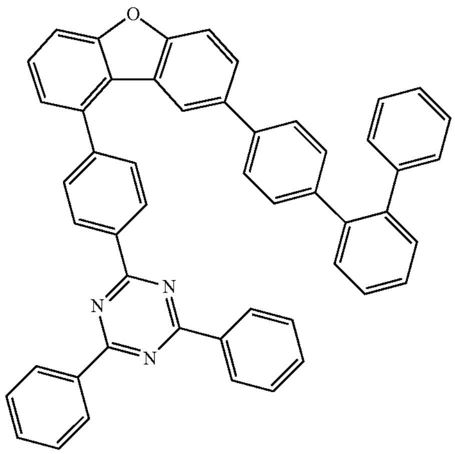
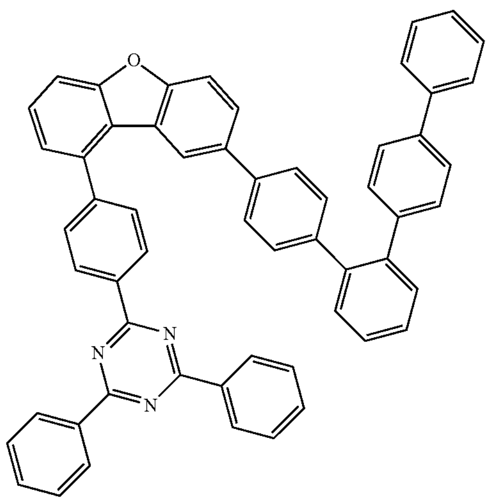
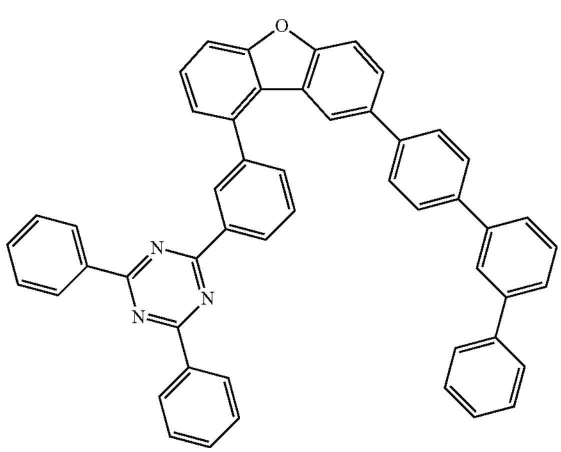
-continued
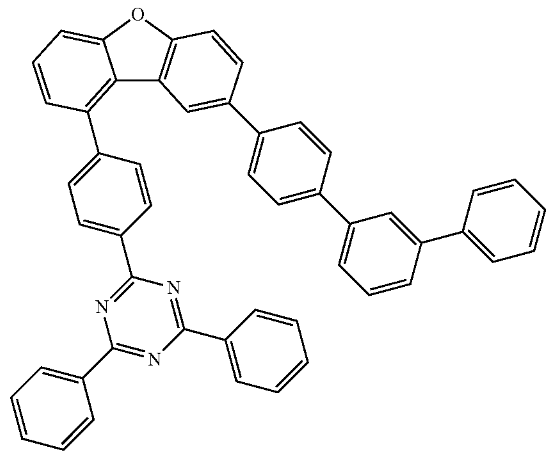
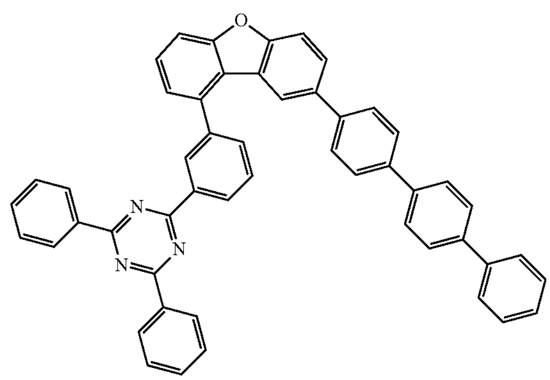
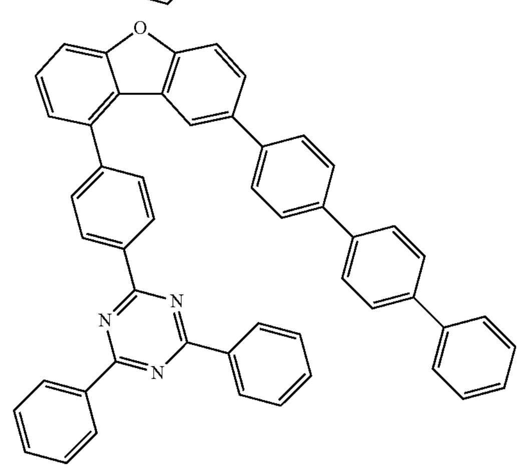
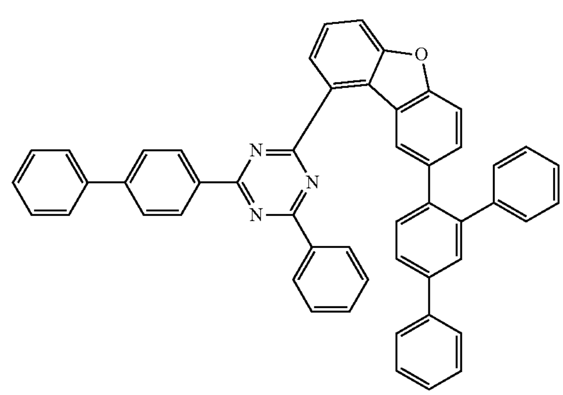

-continued
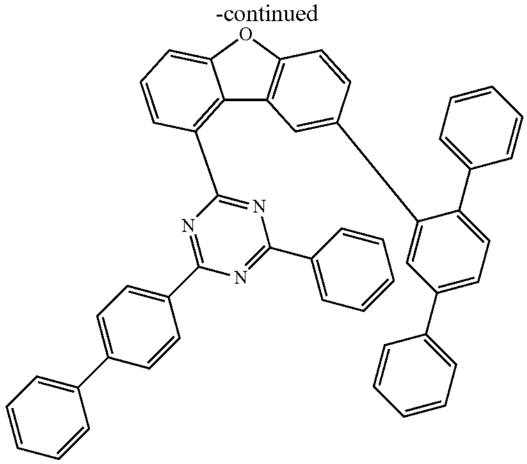
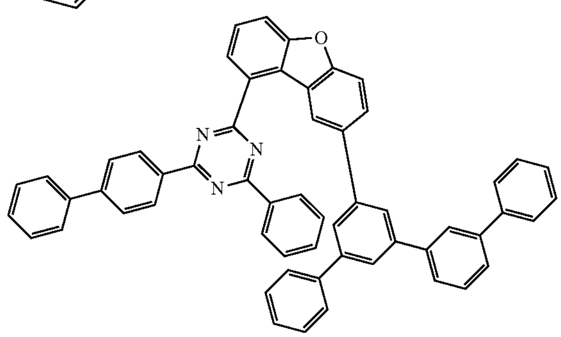
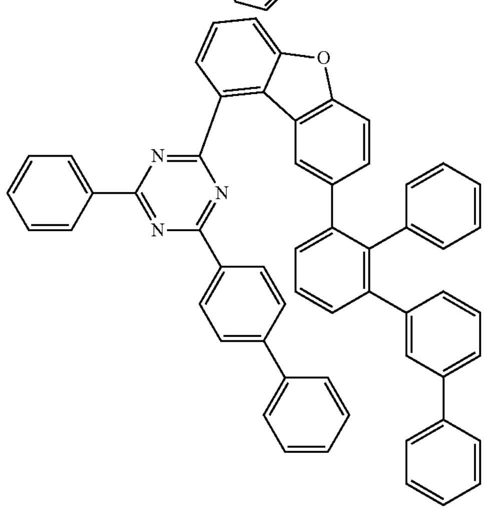
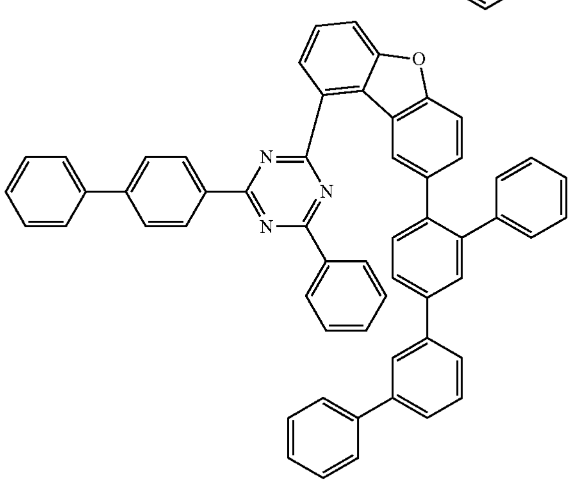
-continued
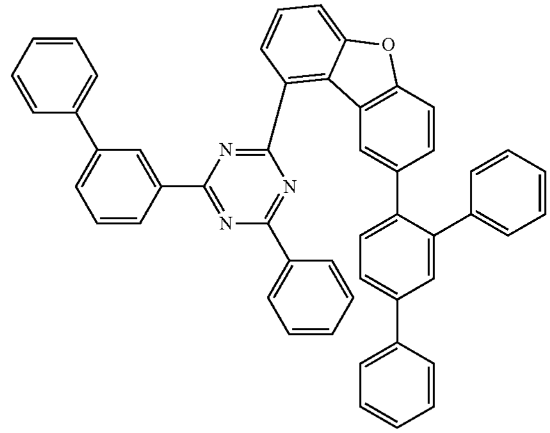
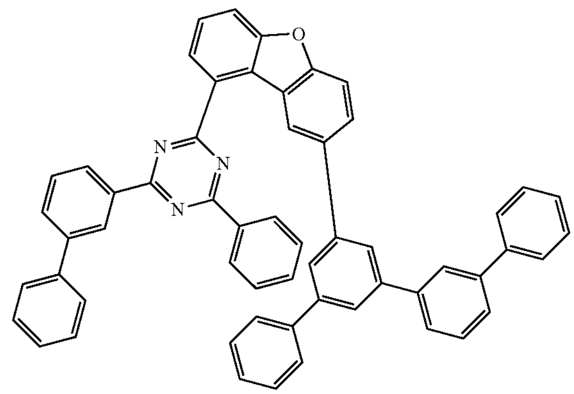
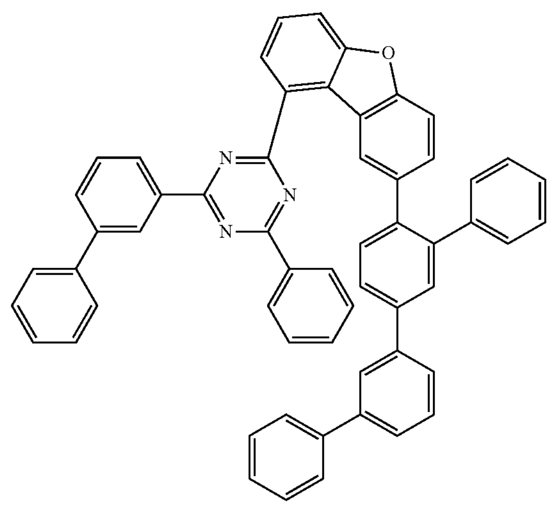
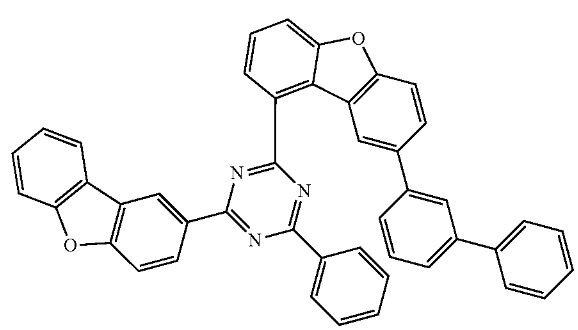

-continued
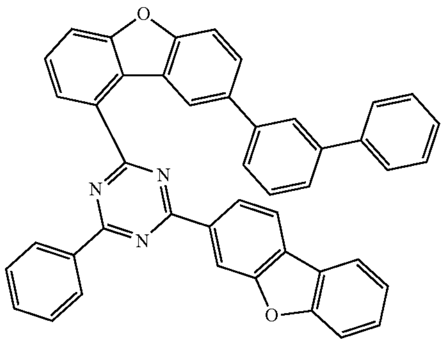
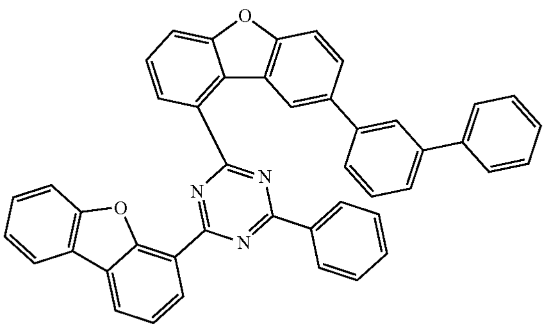
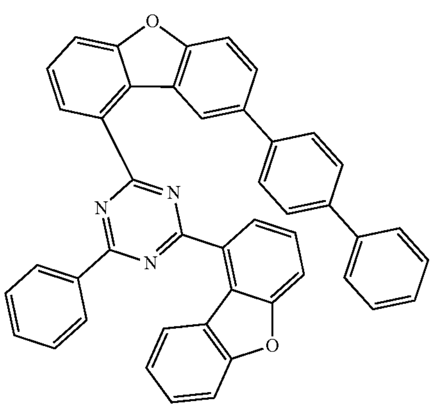
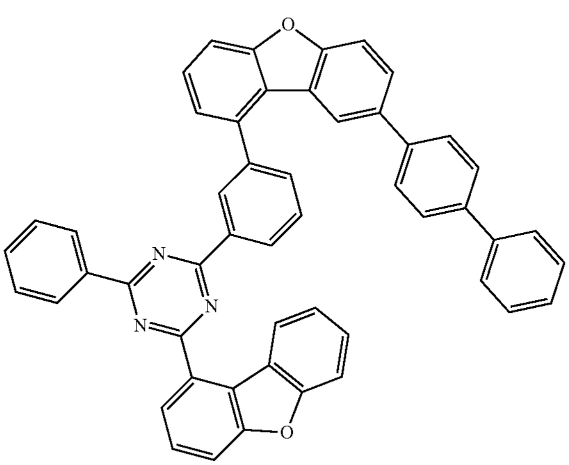
-continued
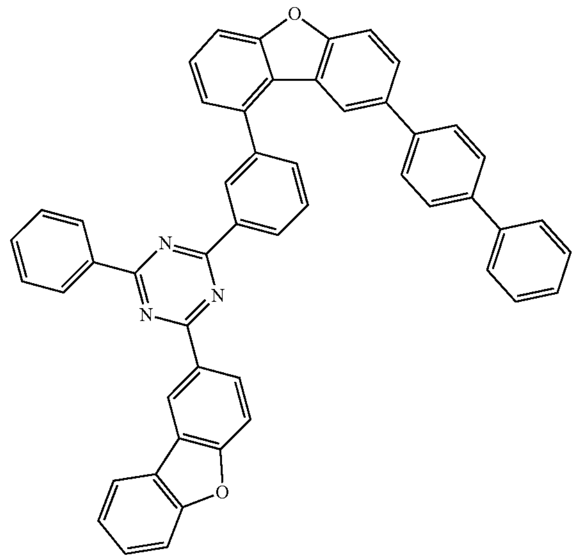
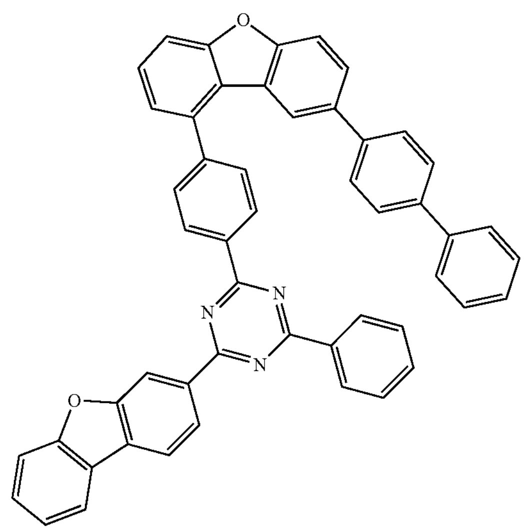
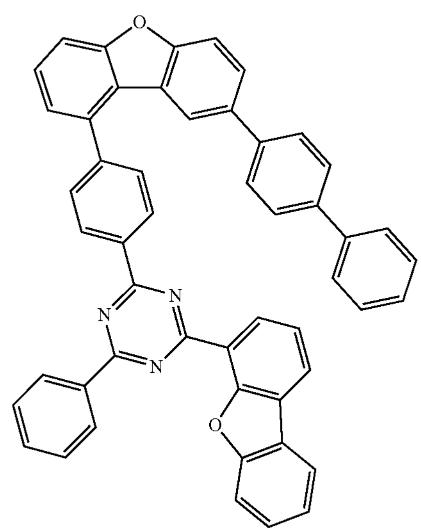

-continued
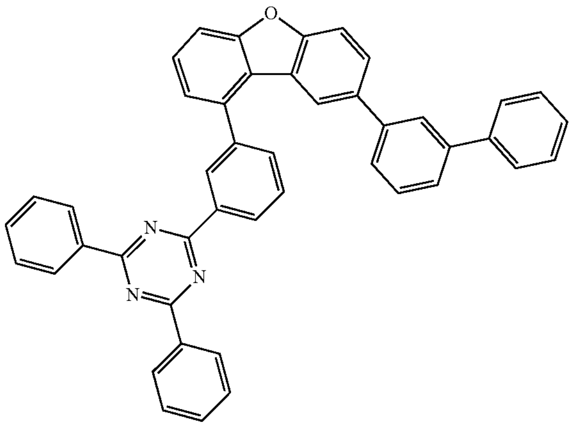
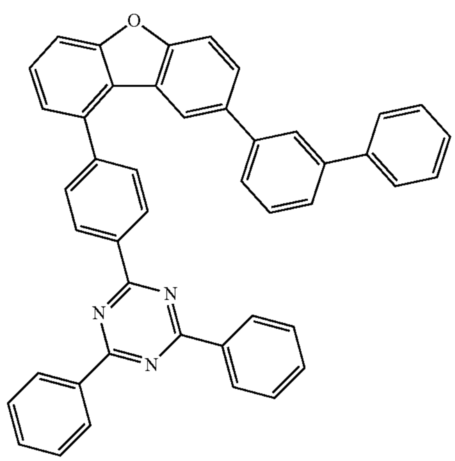
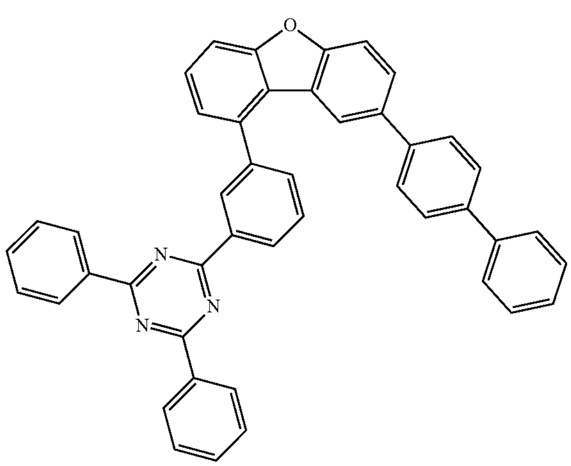
-continued
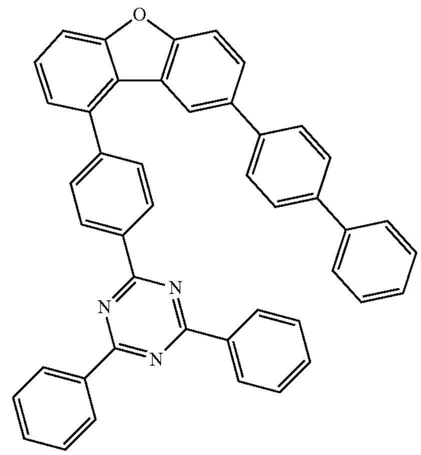
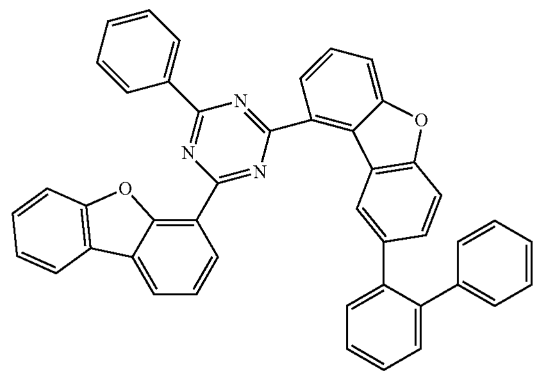
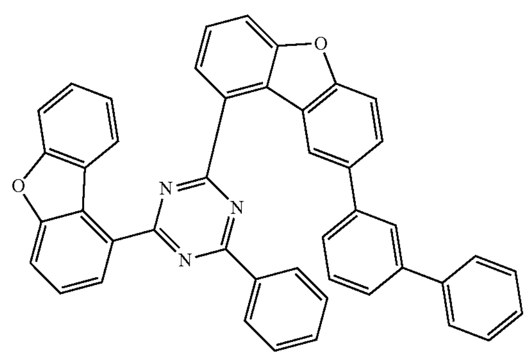
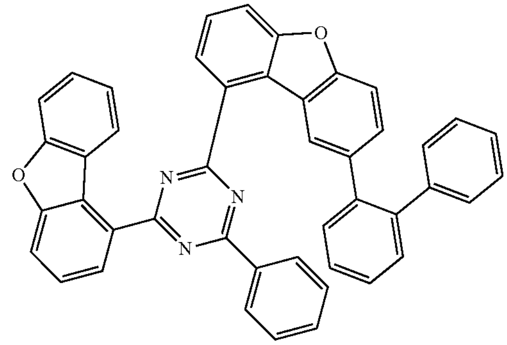

-continued
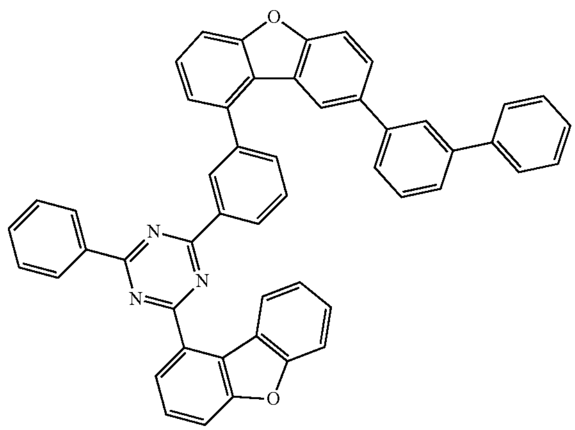
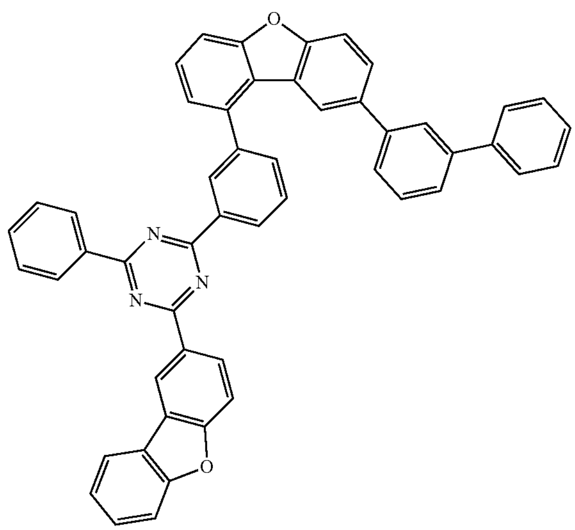
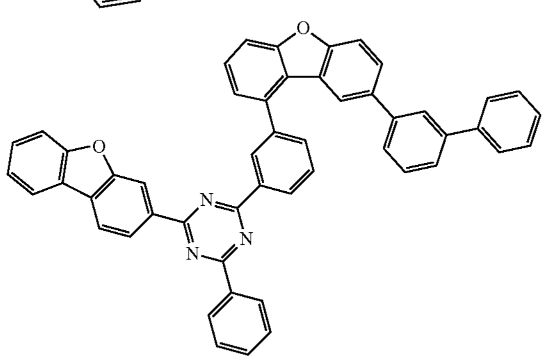
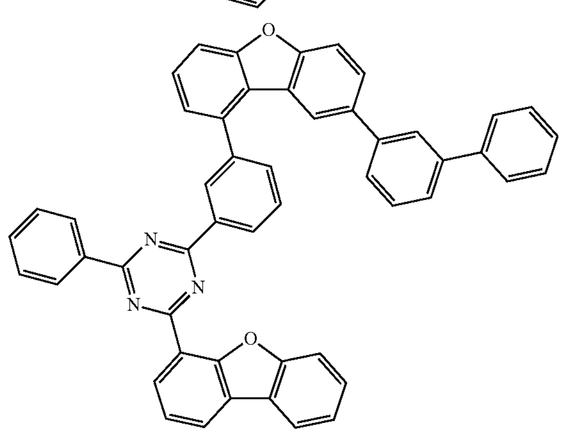
-continued
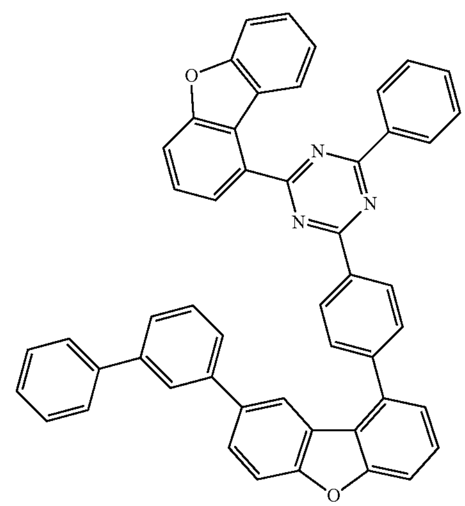
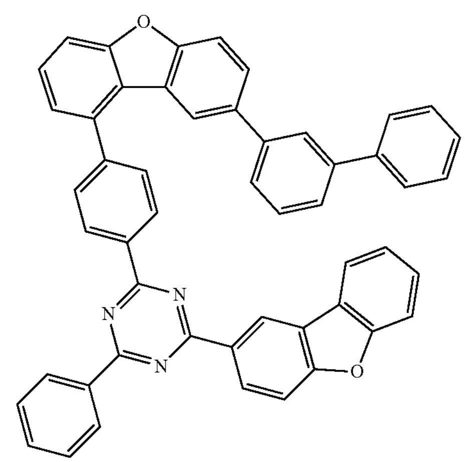
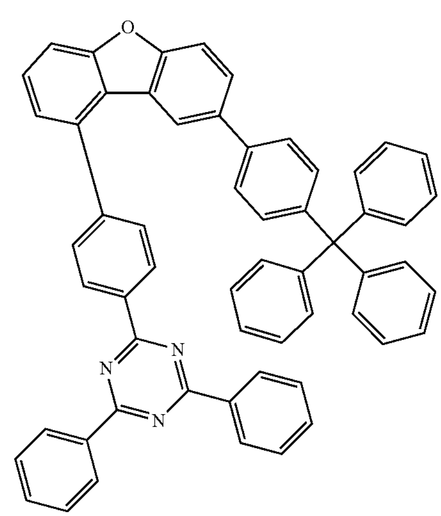

-continued
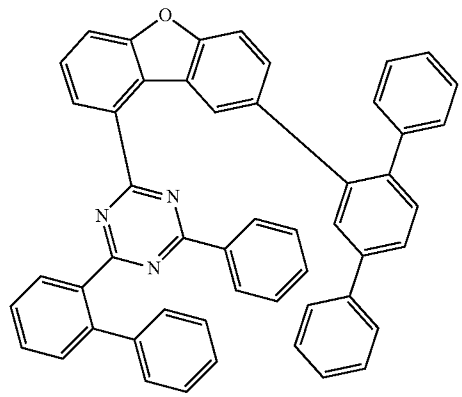
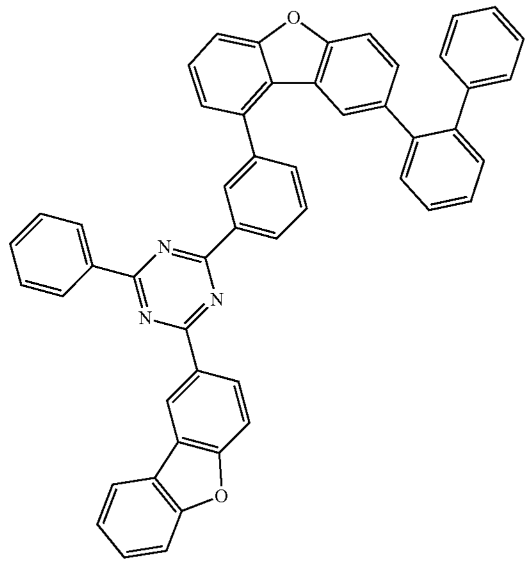
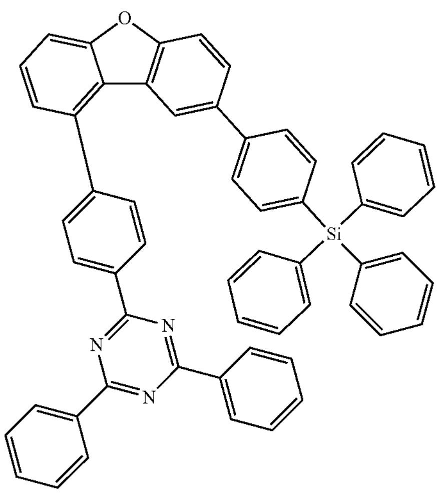
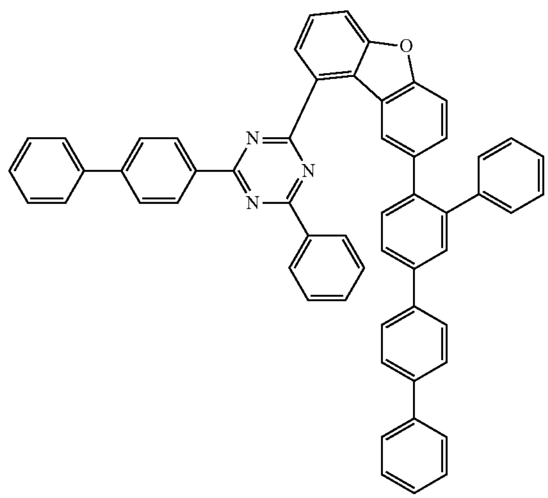
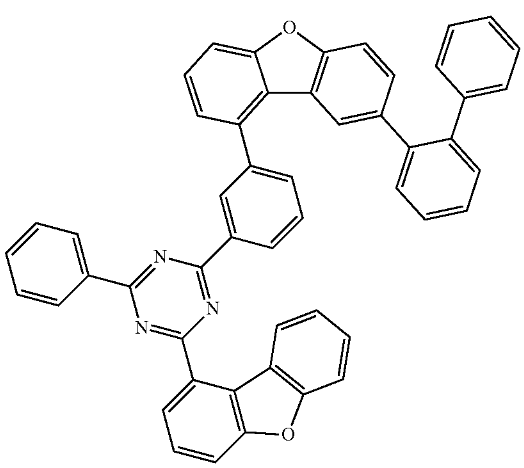
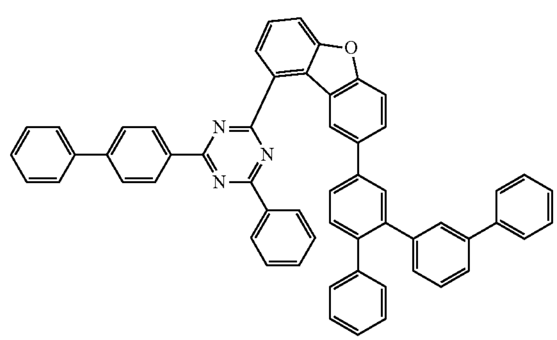

-continued
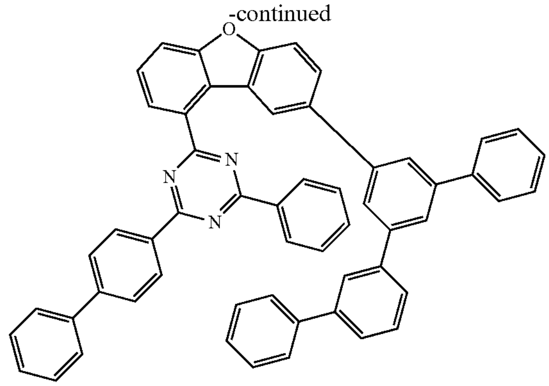
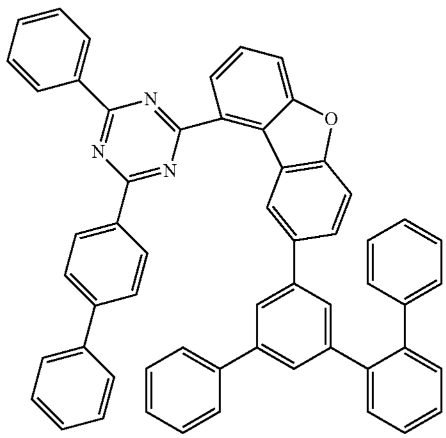
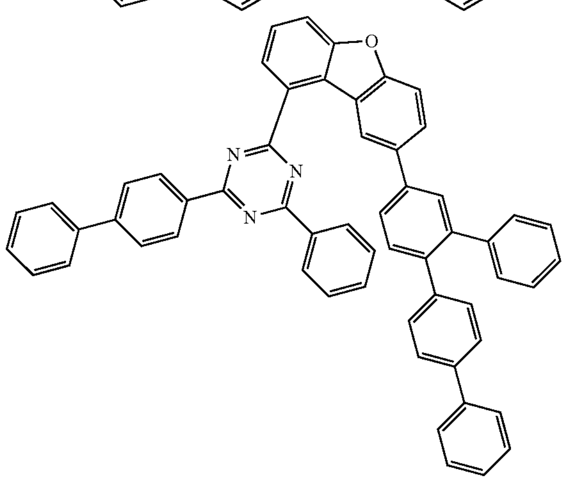
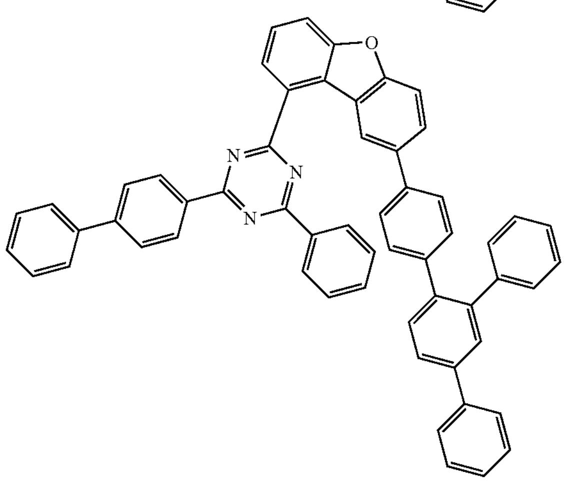
-continued
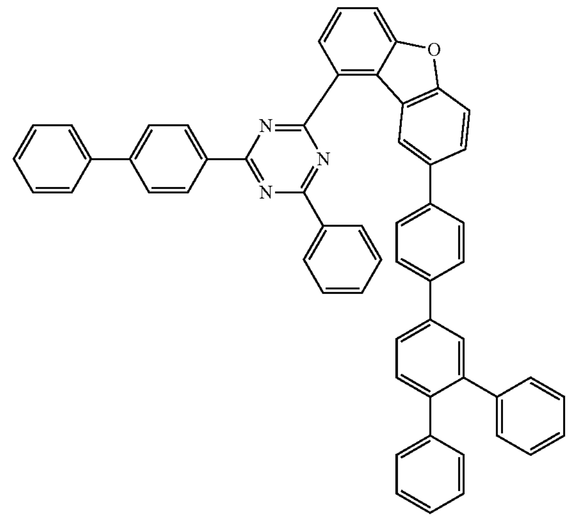
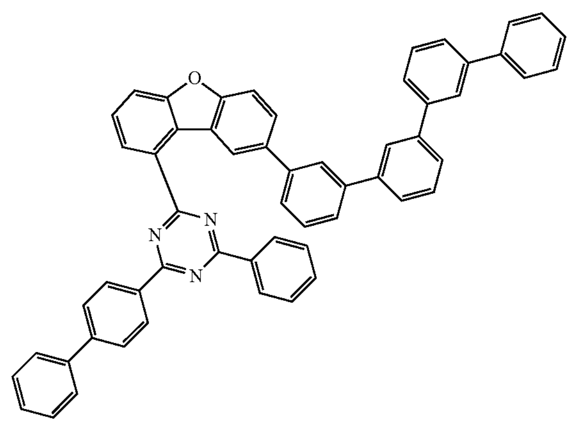
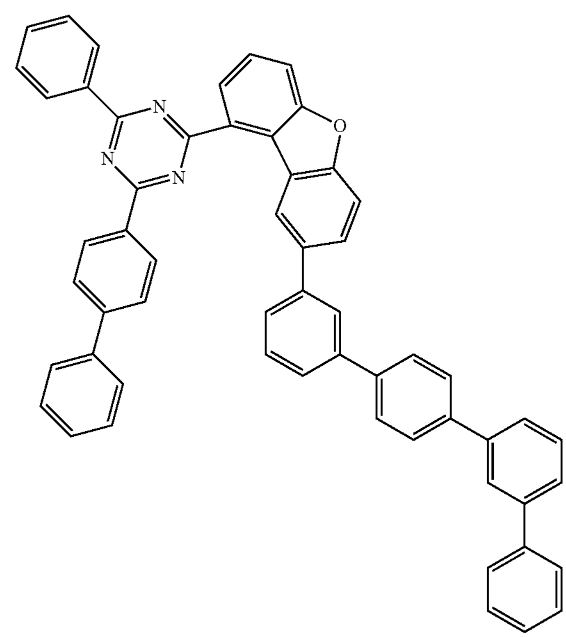

-continued
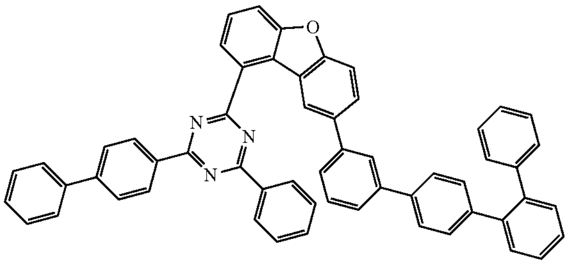
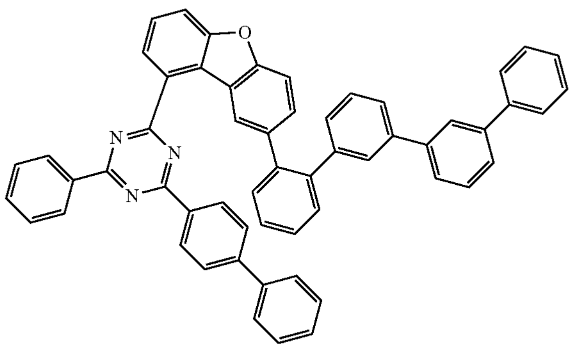
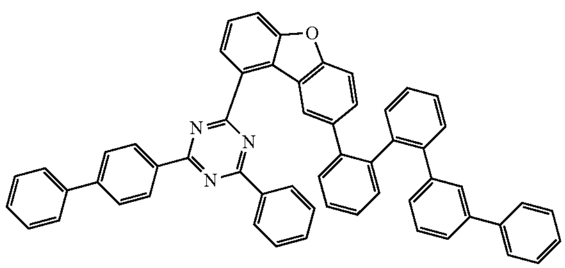
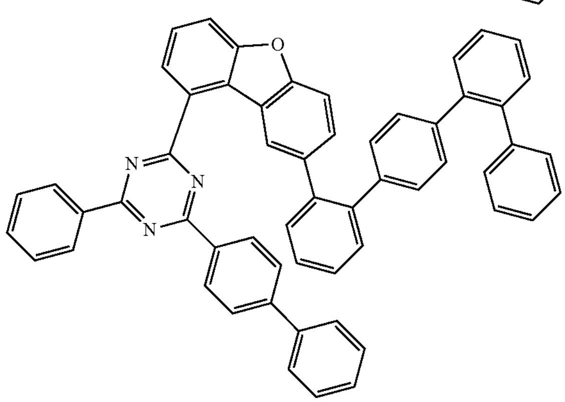
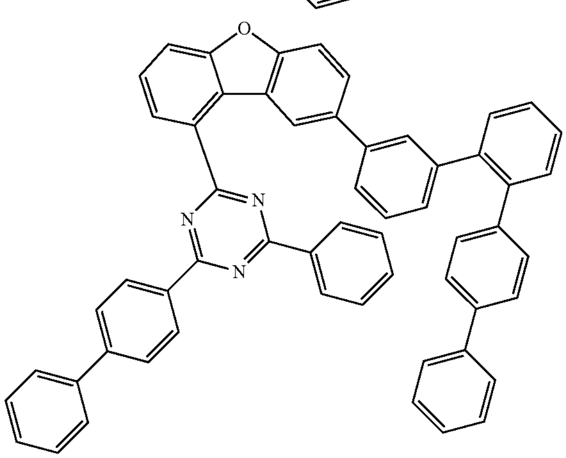
-continued
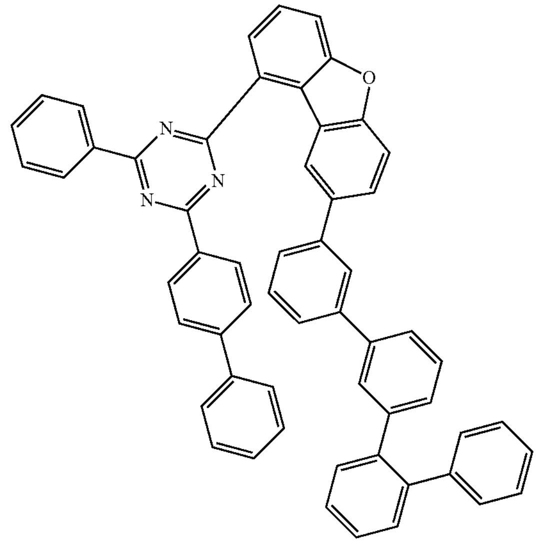
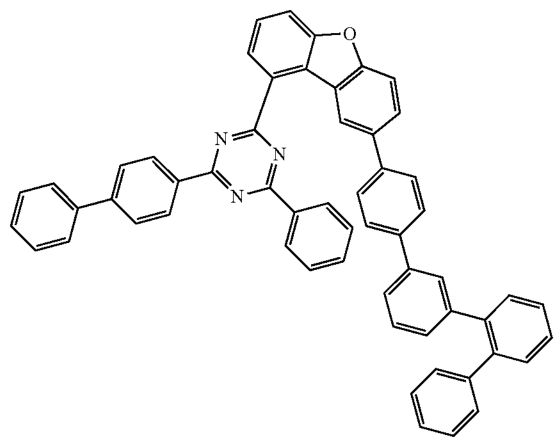
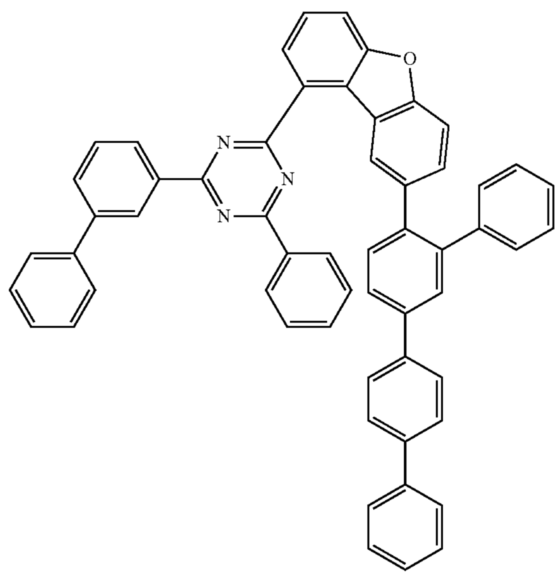

-continued
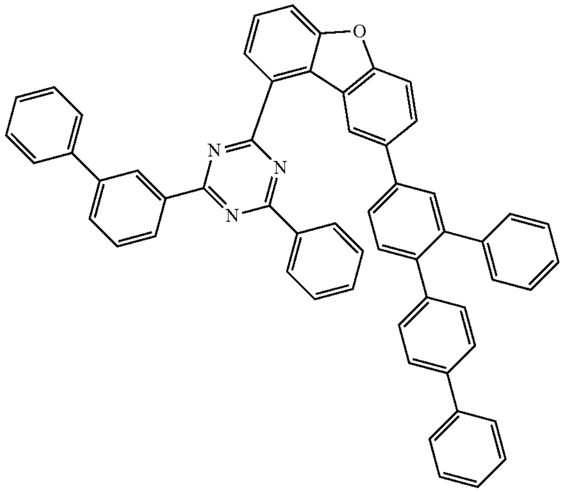
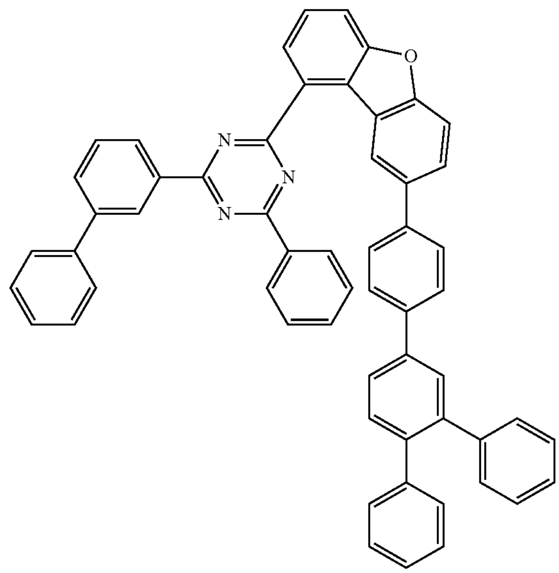
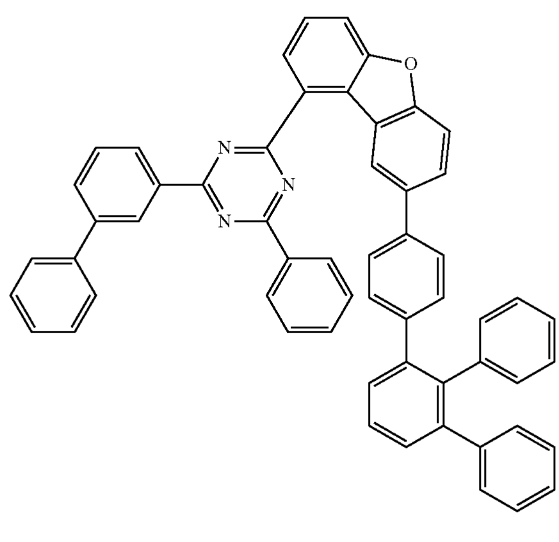
-continued
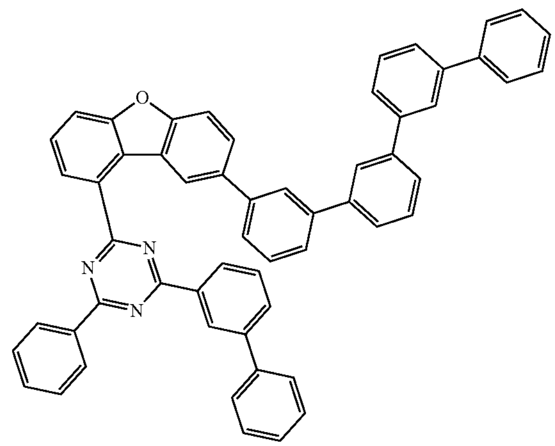
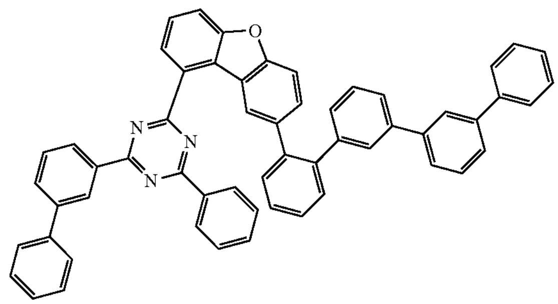
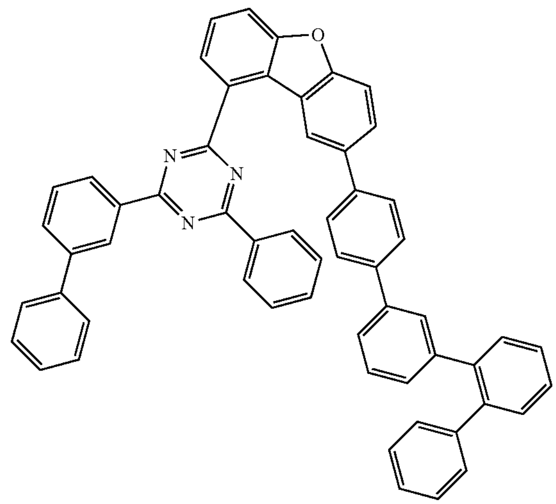
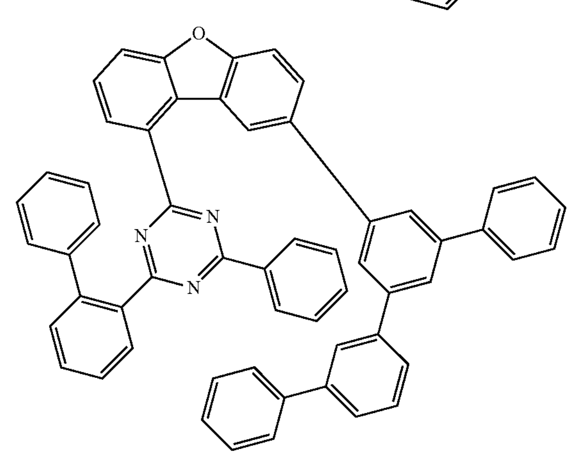

-continued
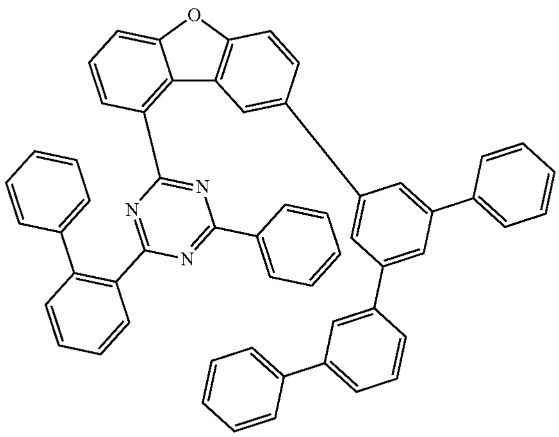
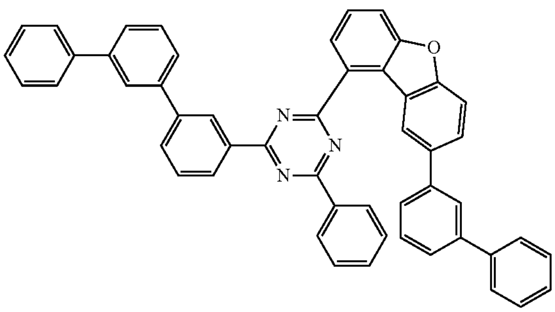
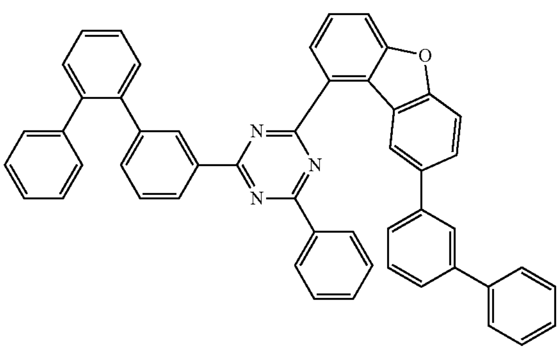
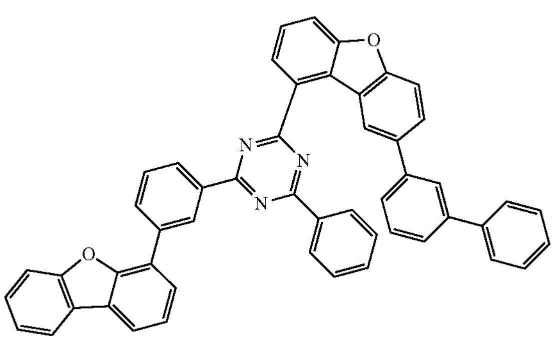
-continued
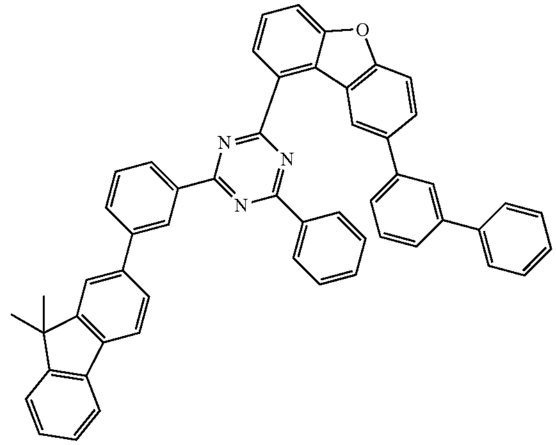
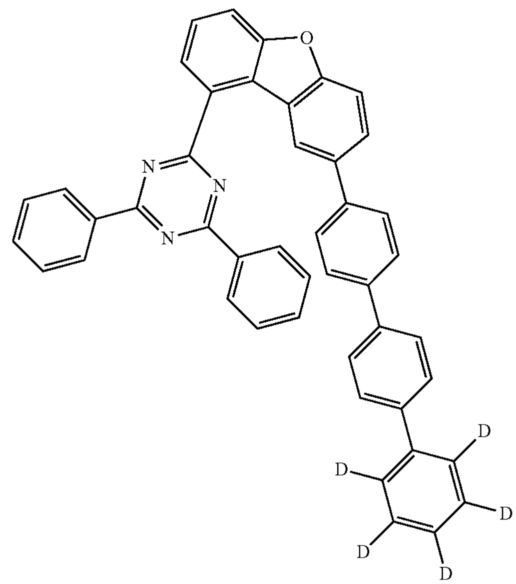
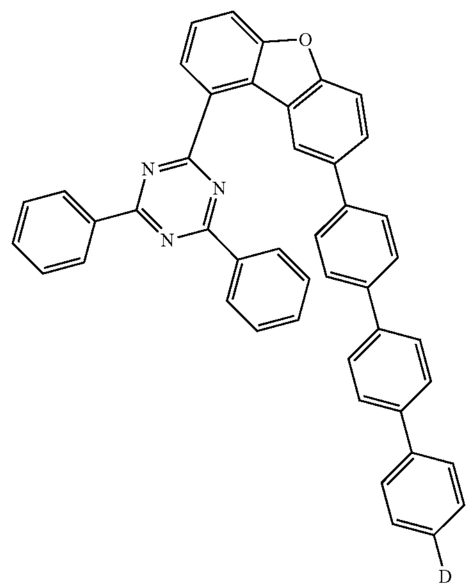

-continued
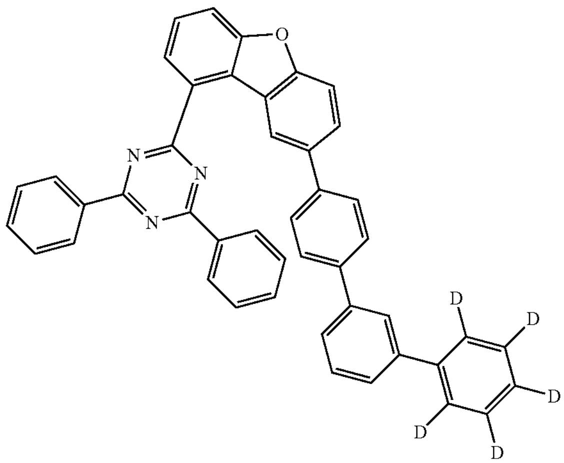
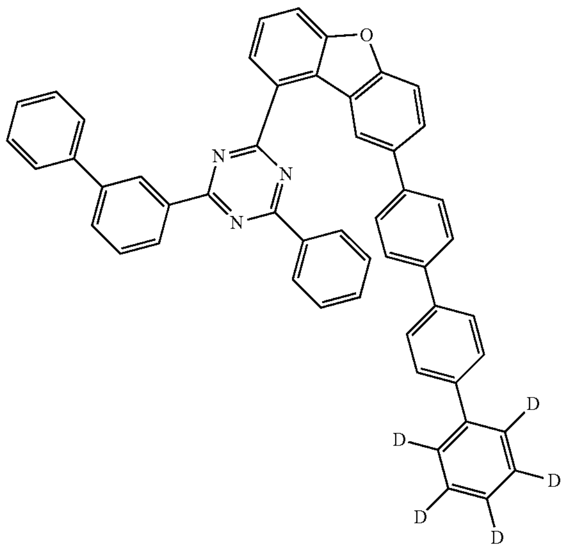
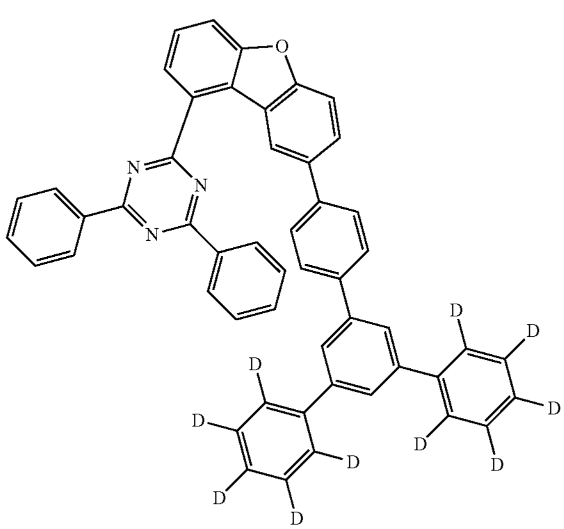
-continued
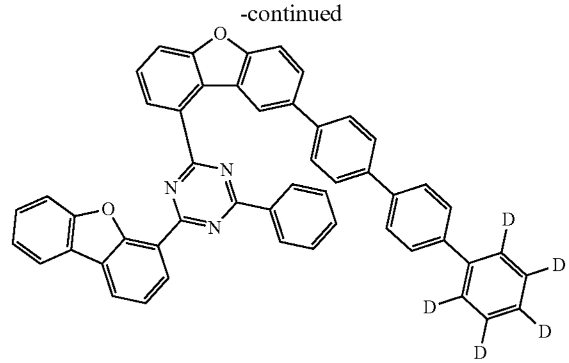
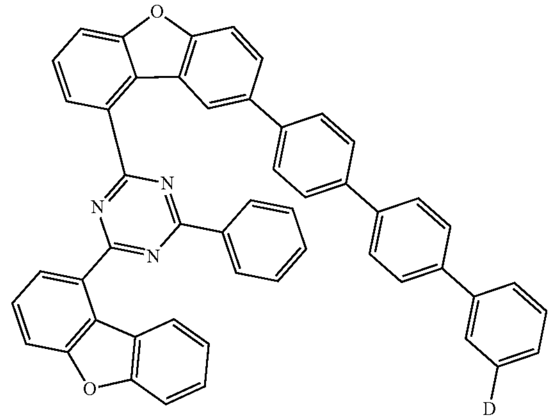
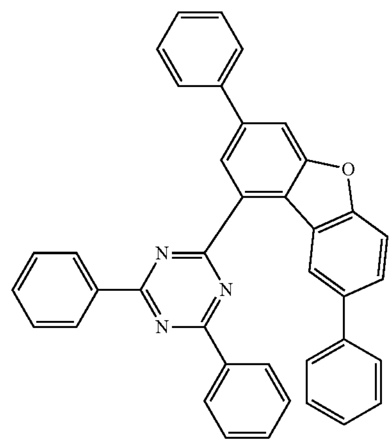
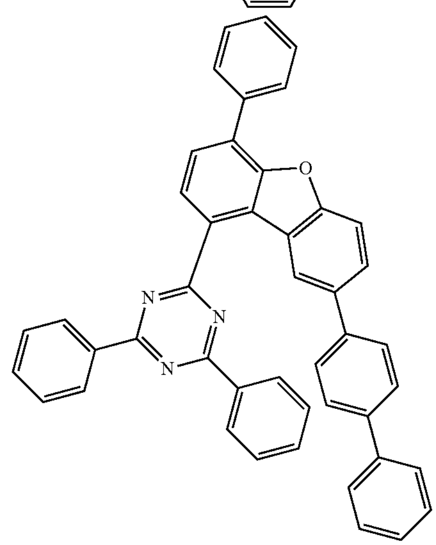

-continued
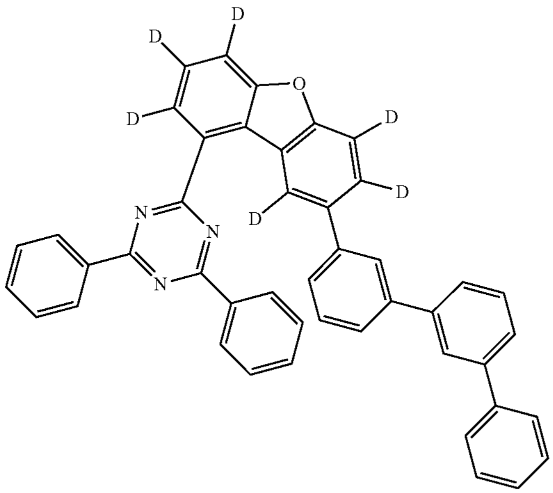
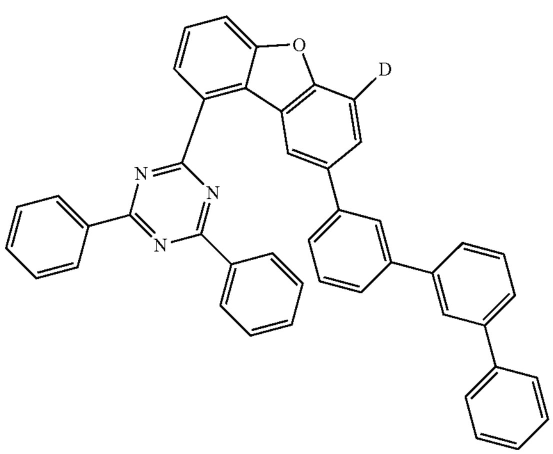
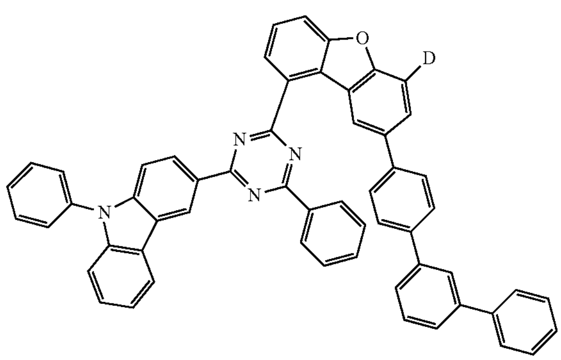
-continued
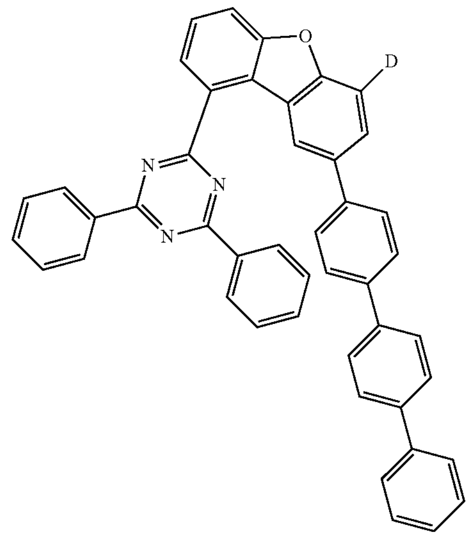
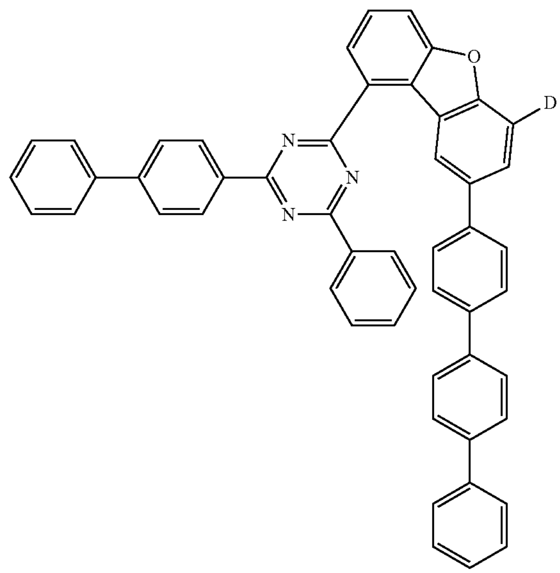
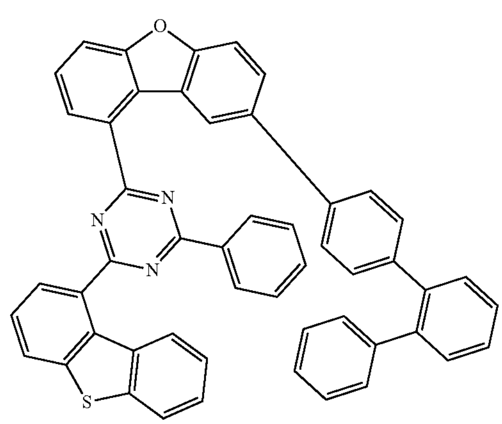

-continued
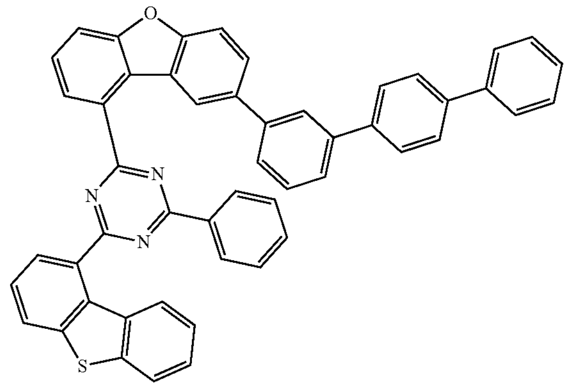
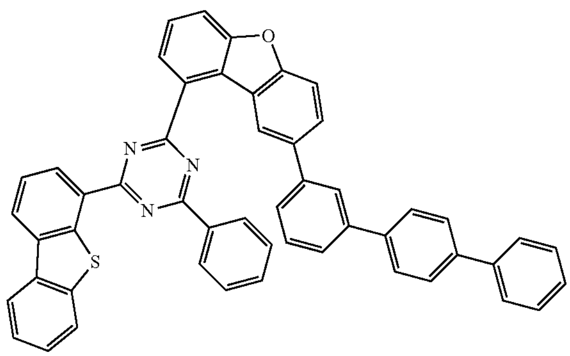
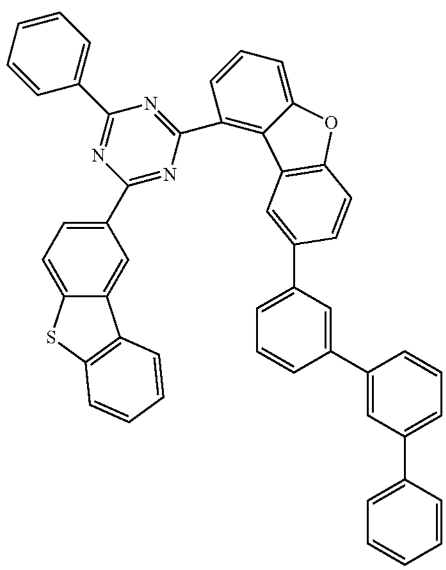
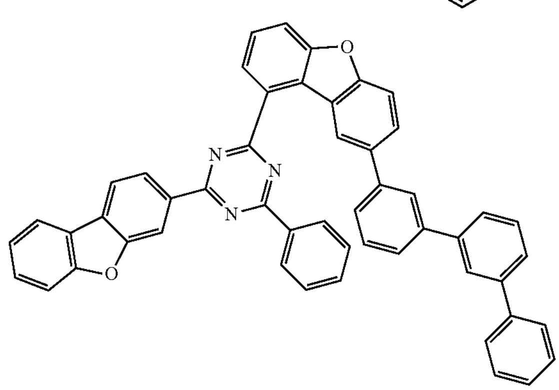
-continued
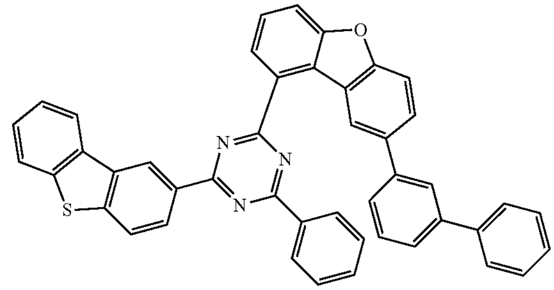
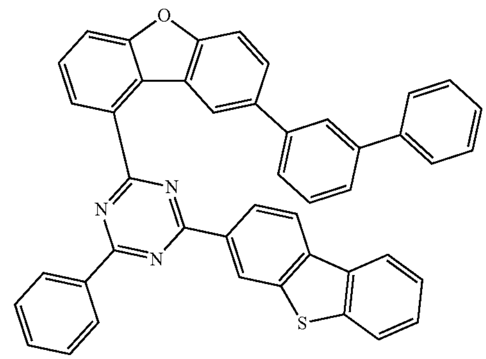
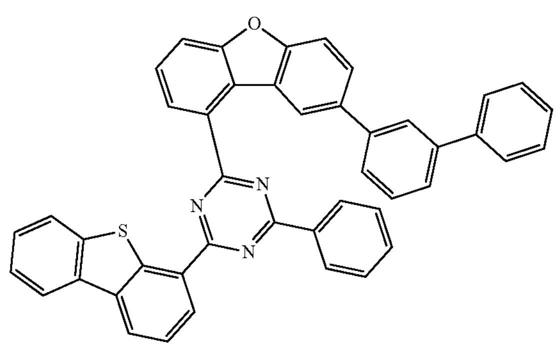
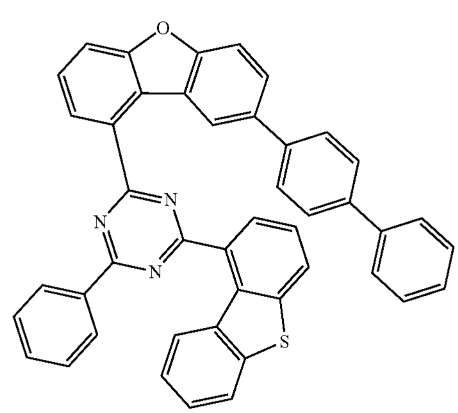

-continued
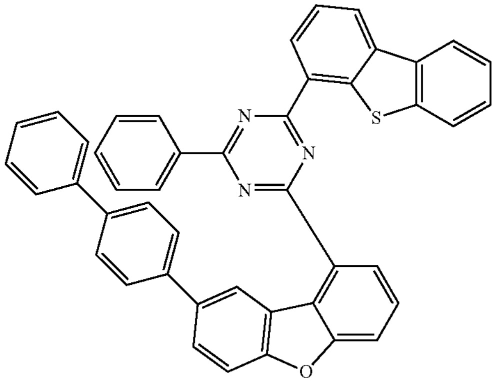
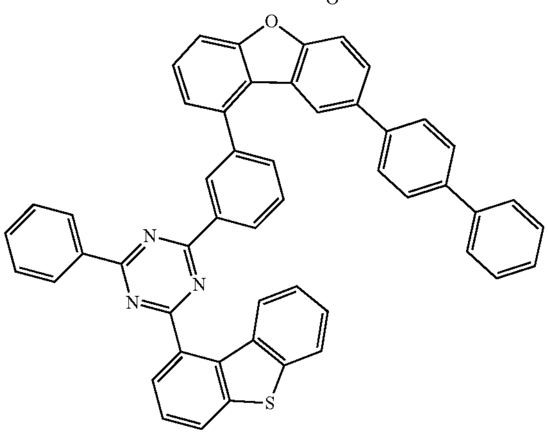
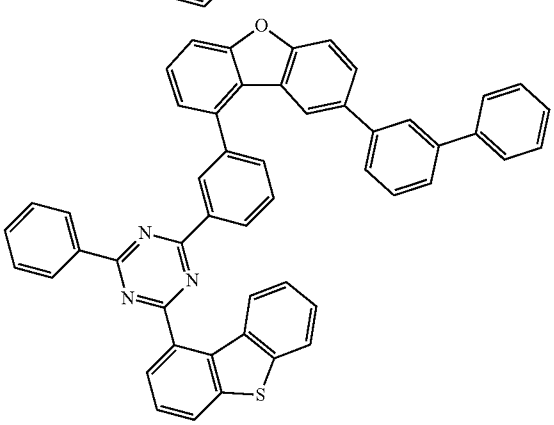
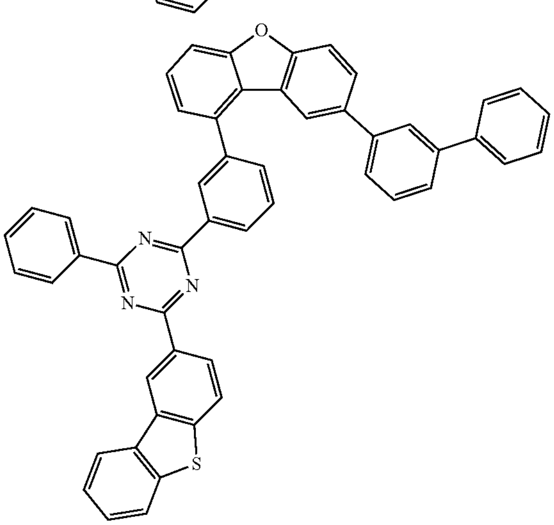
-continued
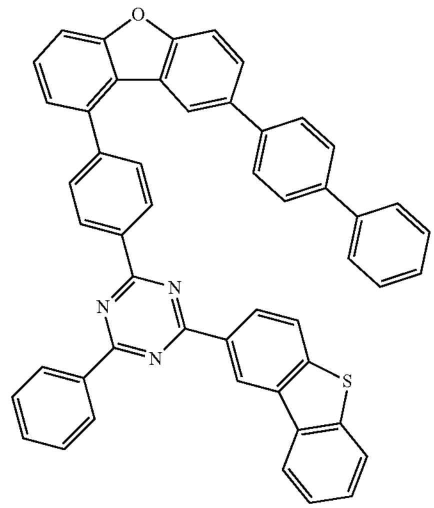
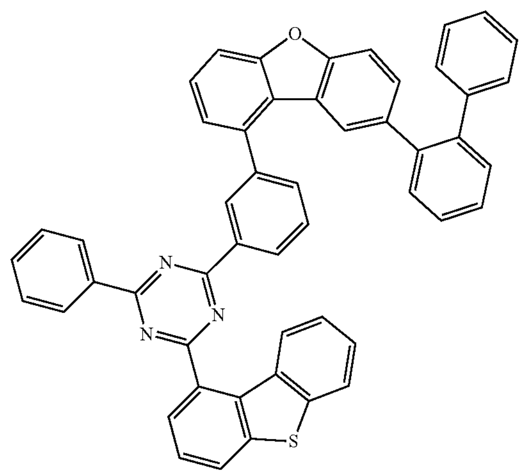
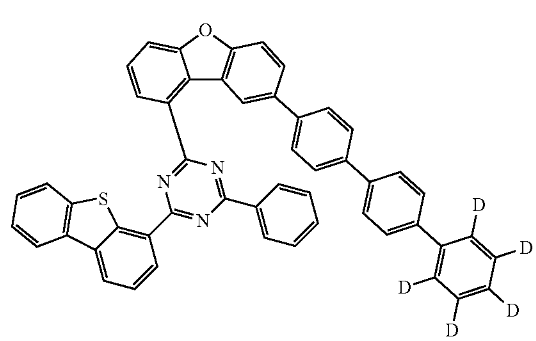

-continued
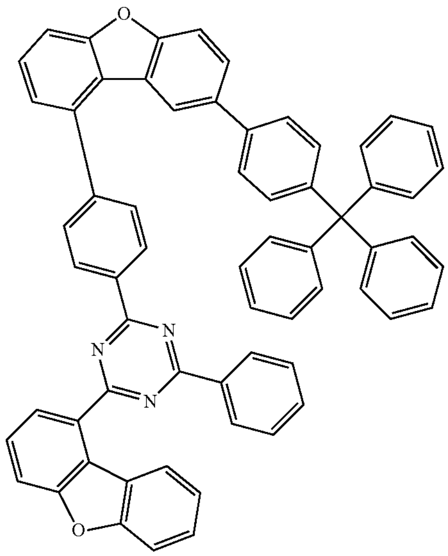
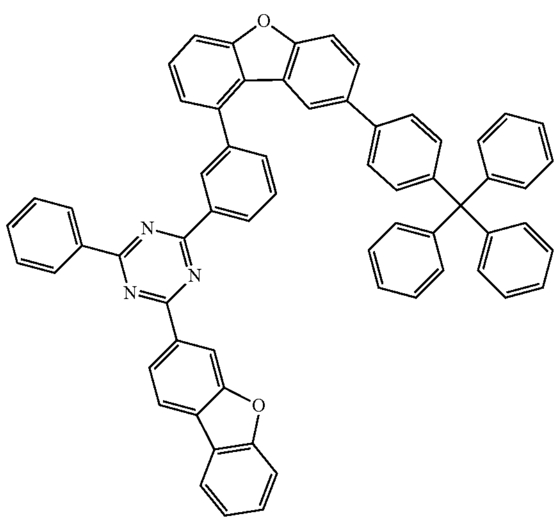
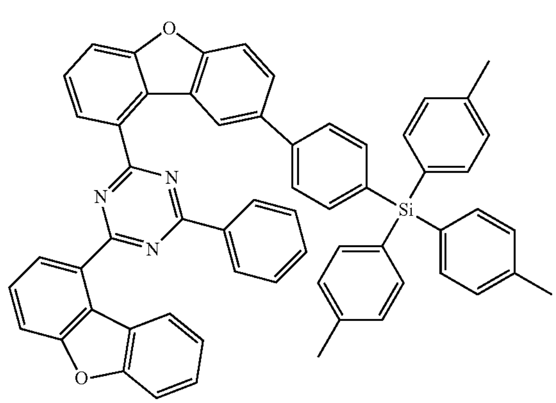
-continued
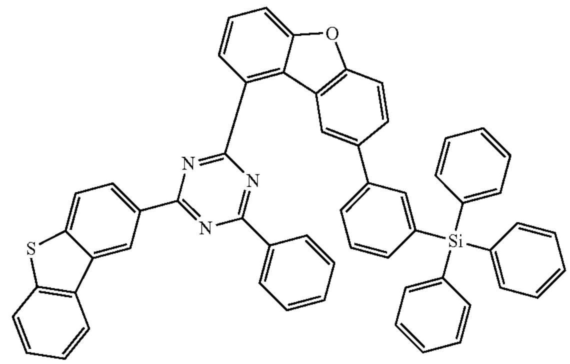
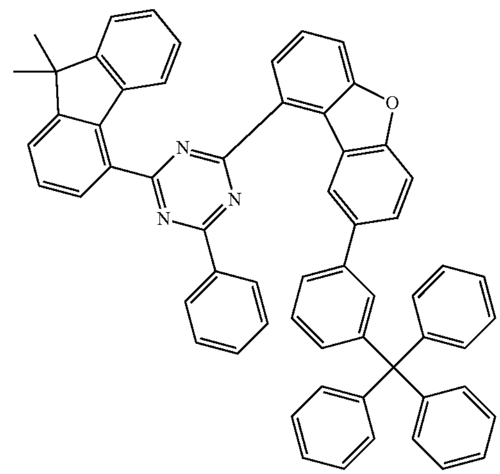
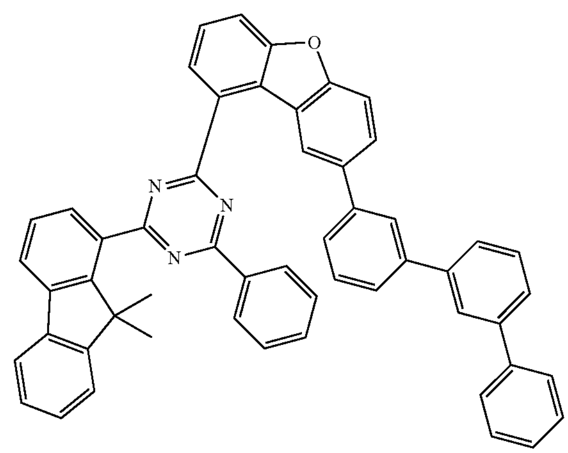
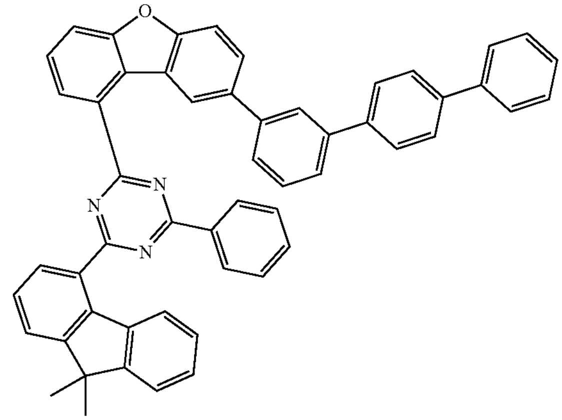

-continued
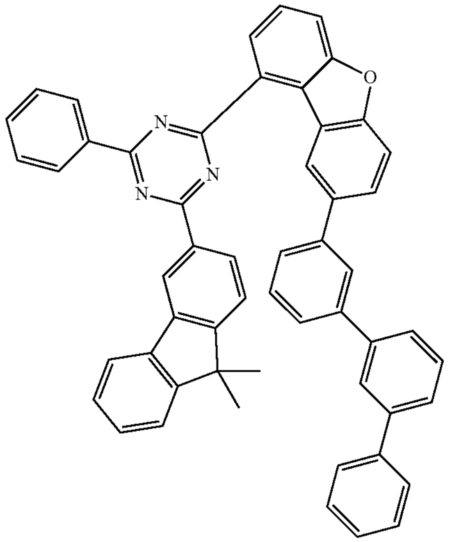
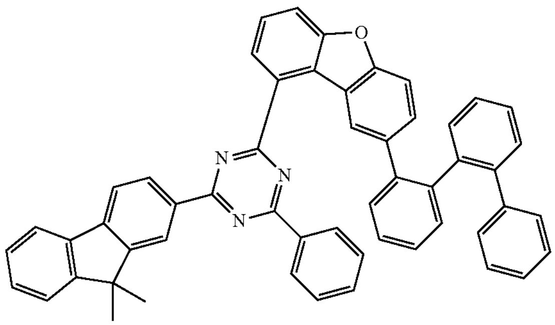
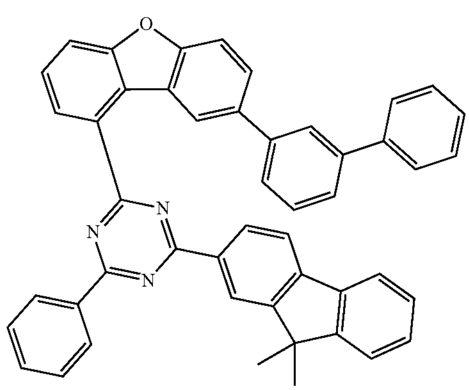
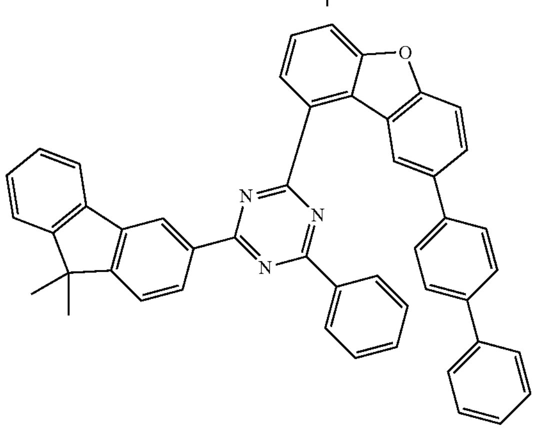
-continued
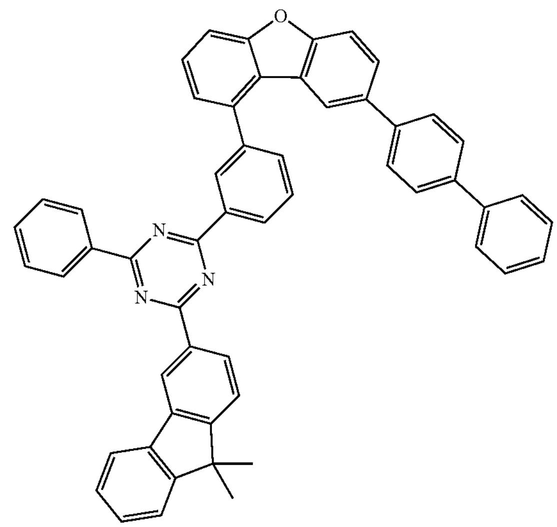
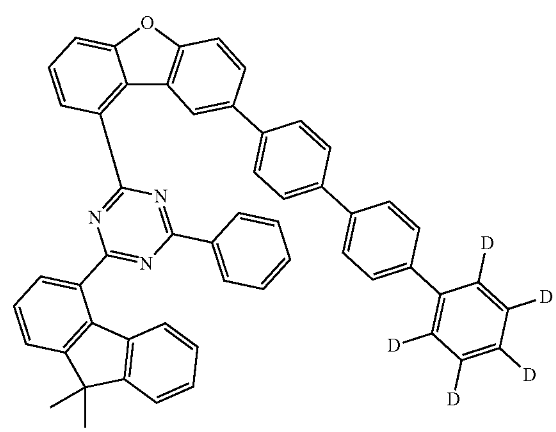
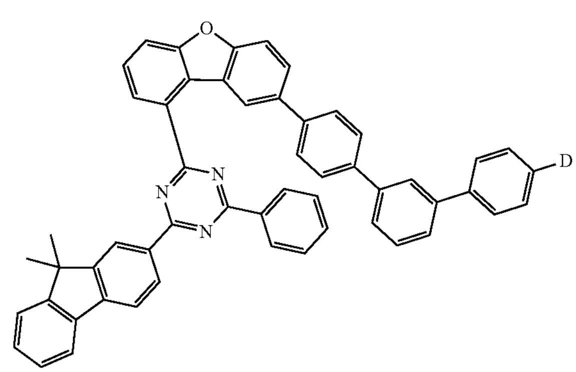

-continued
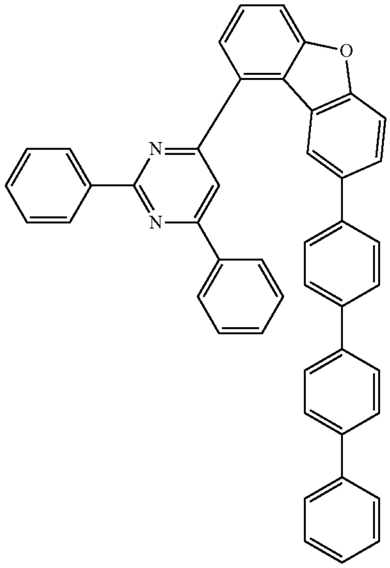
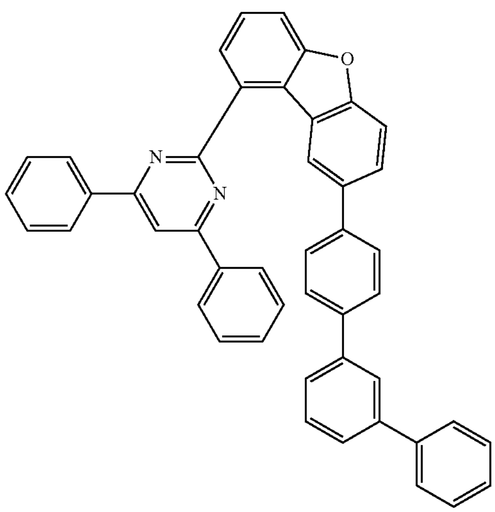
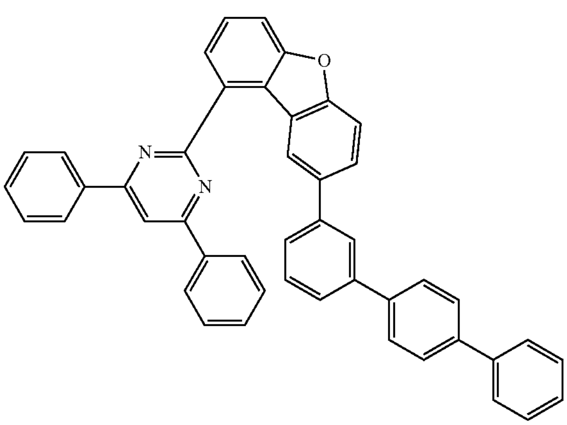
-continued
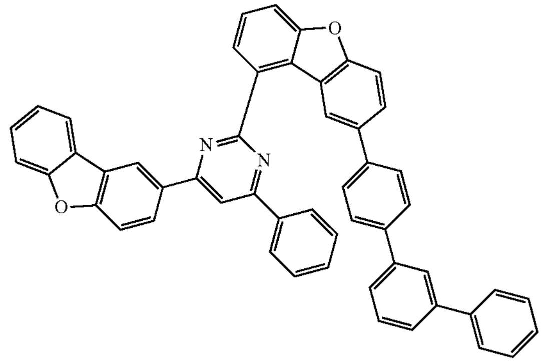
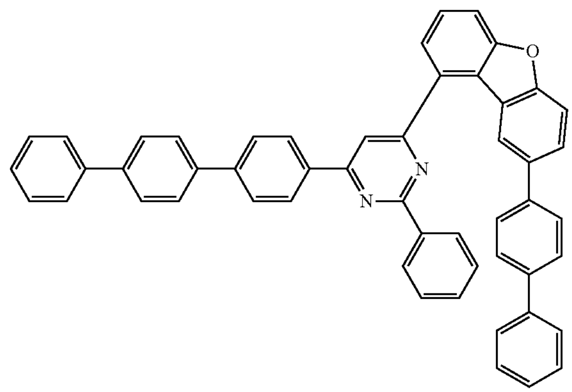
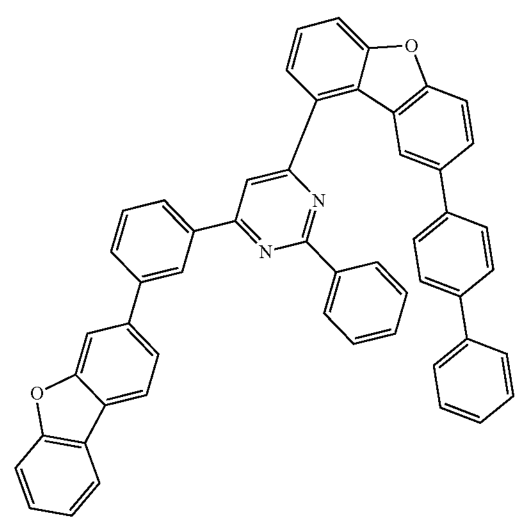

-continued
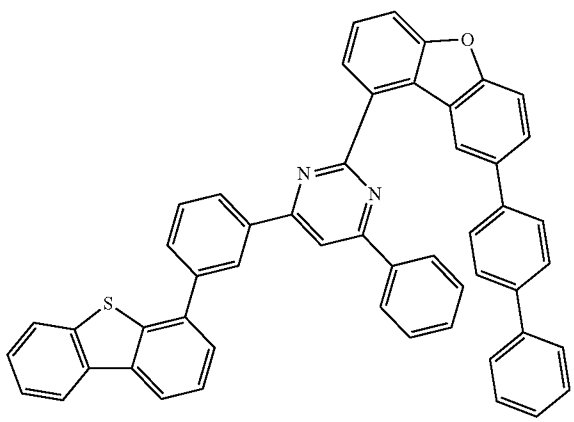
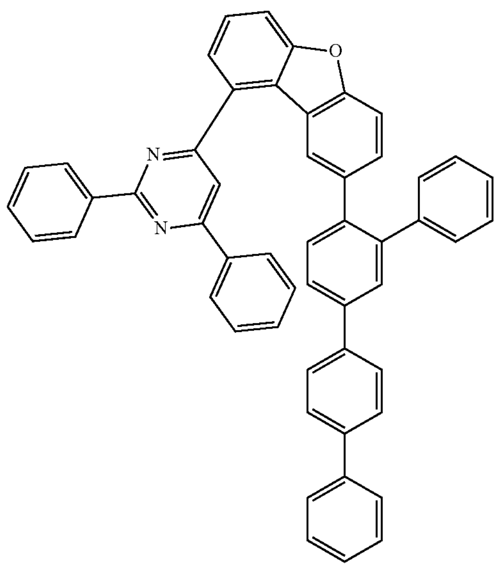
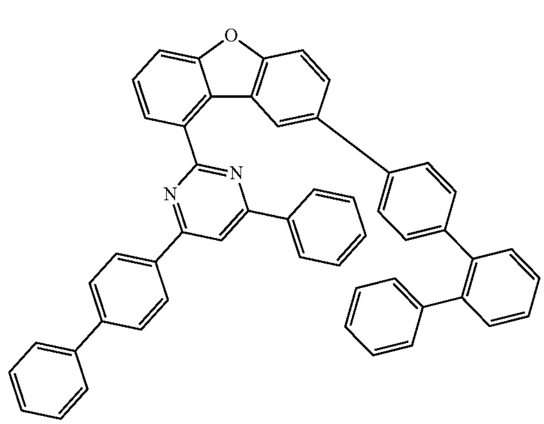
-continued
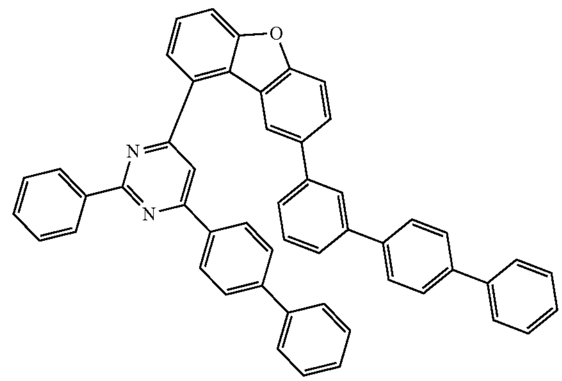
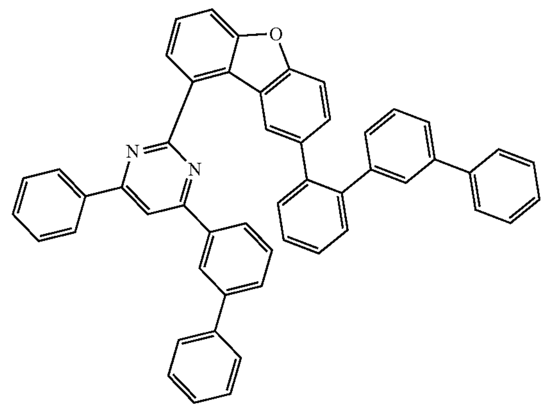
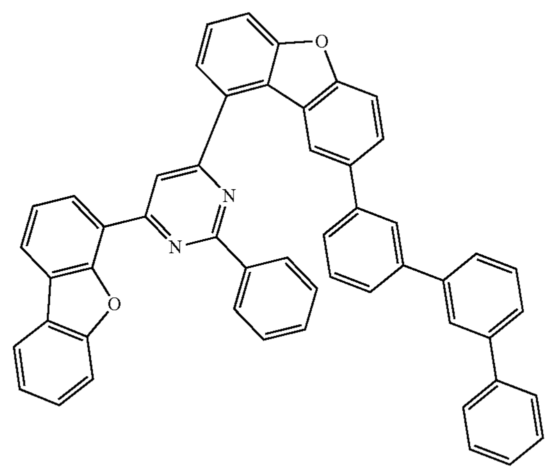
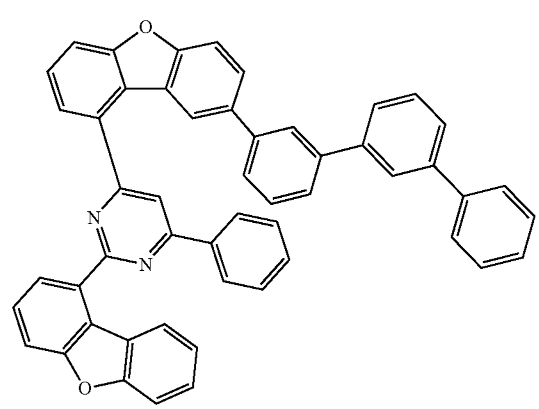

-continued
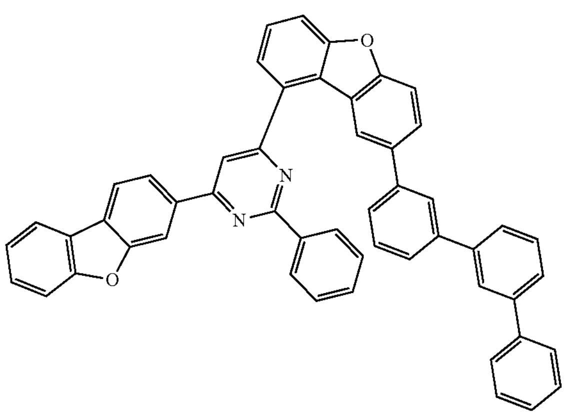
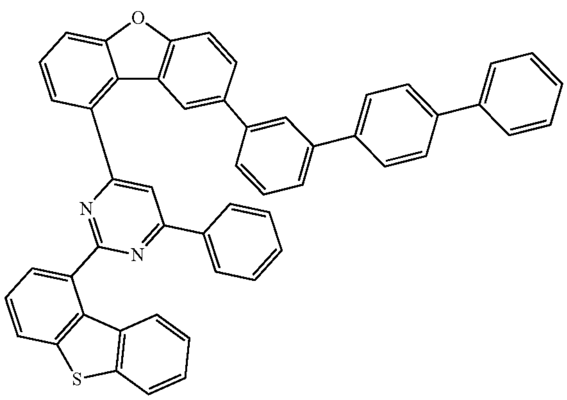
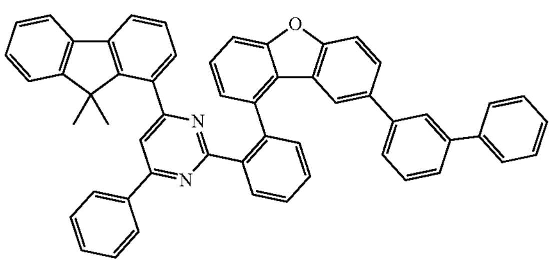
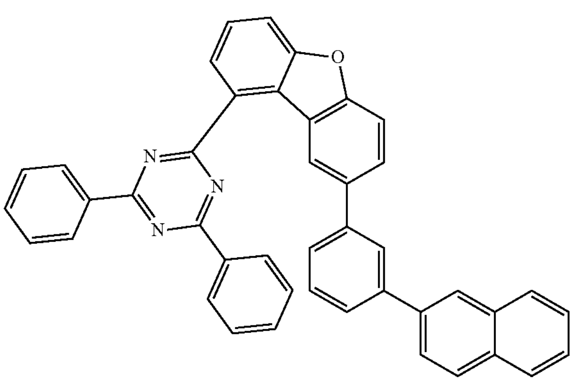
-continued
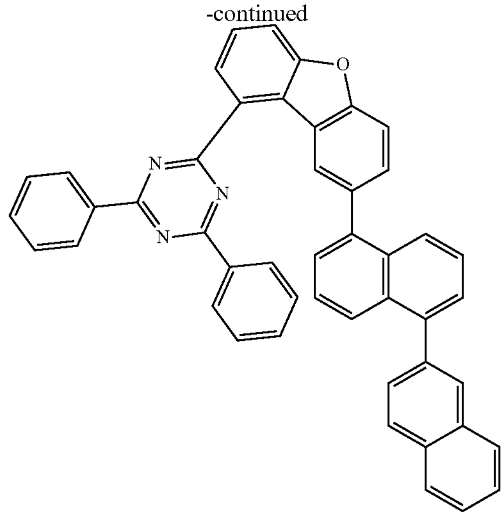
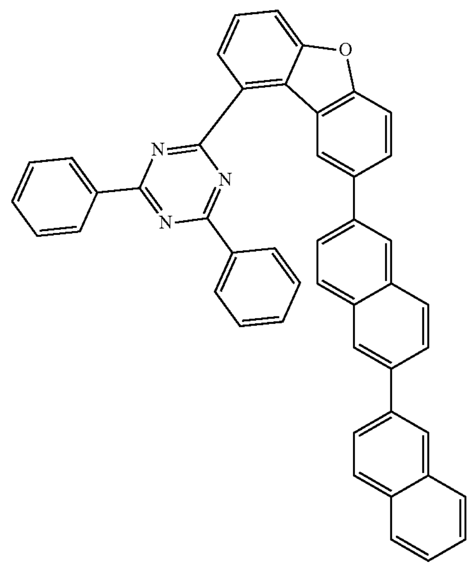
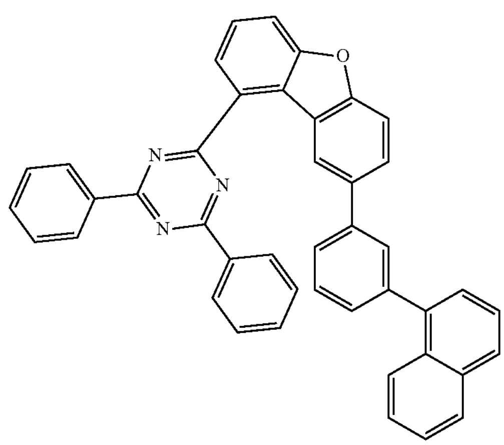

-continued
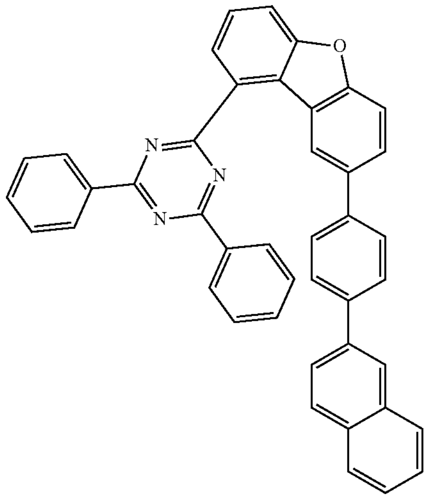
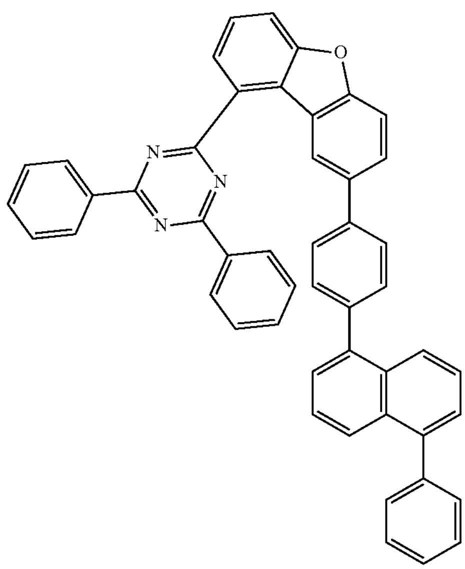
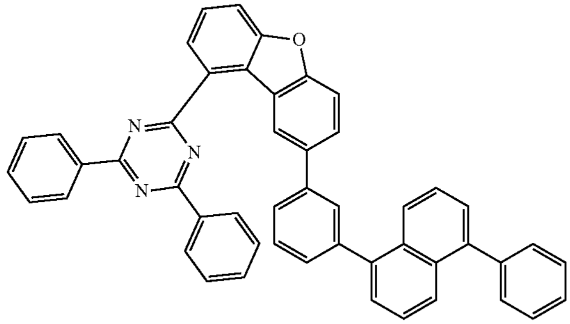
-continued
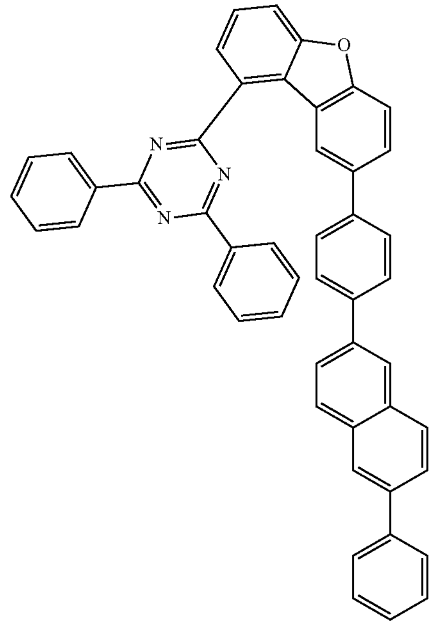
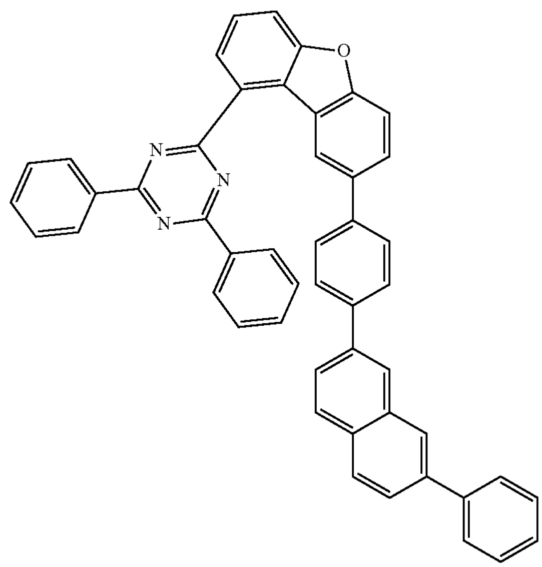
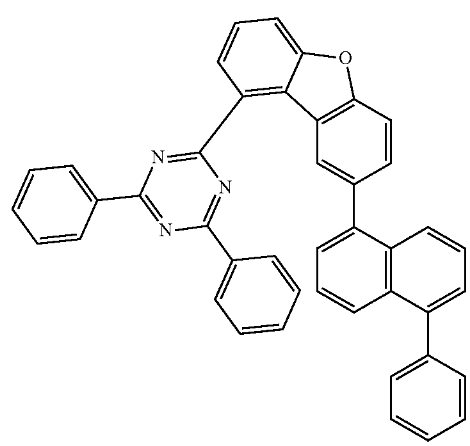

-continued
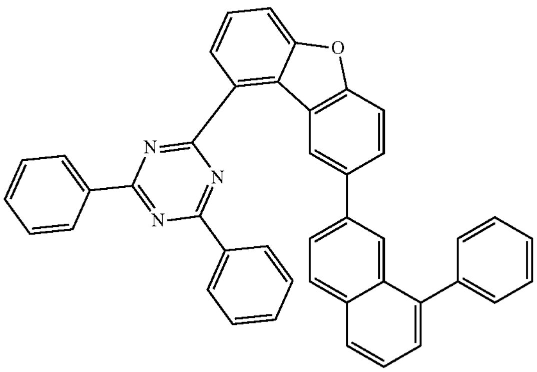
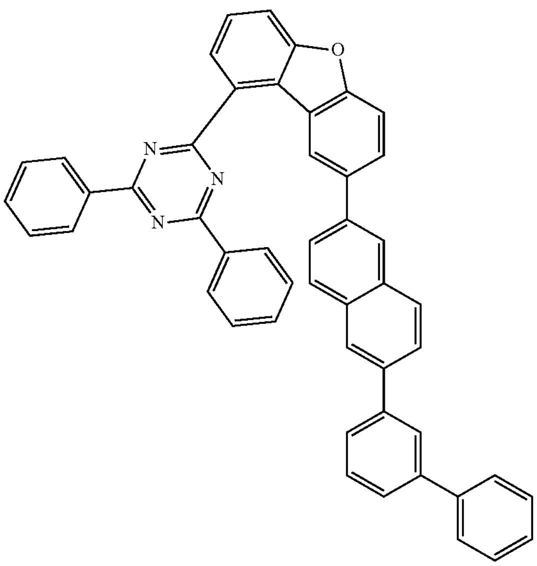
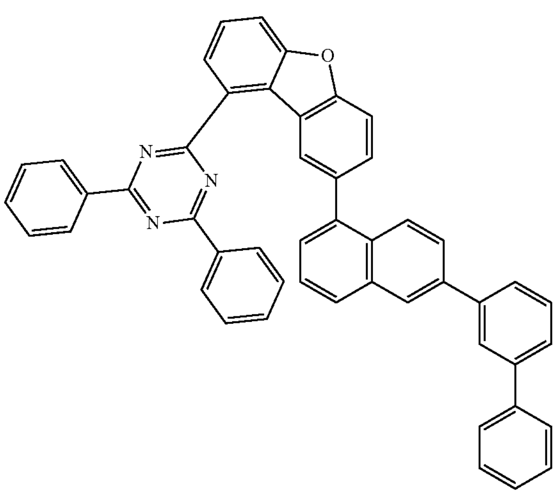
-continued
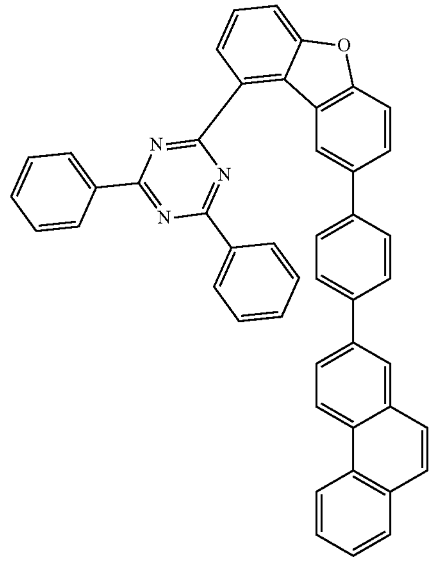
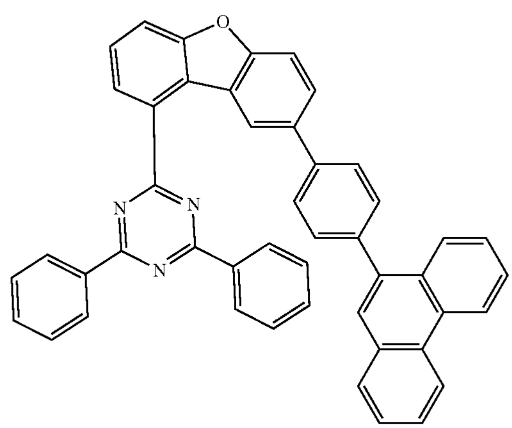
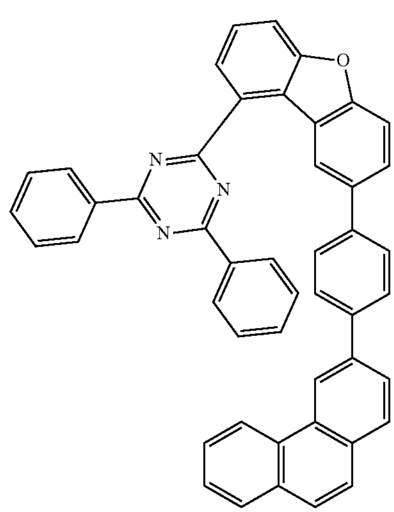

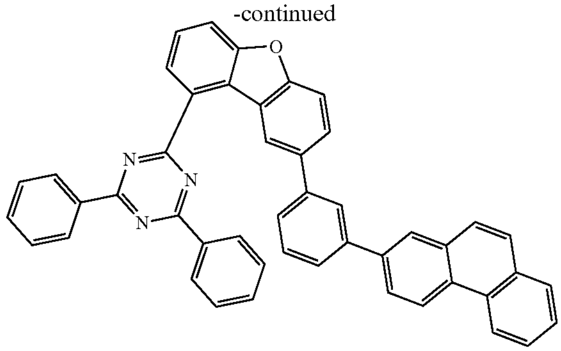
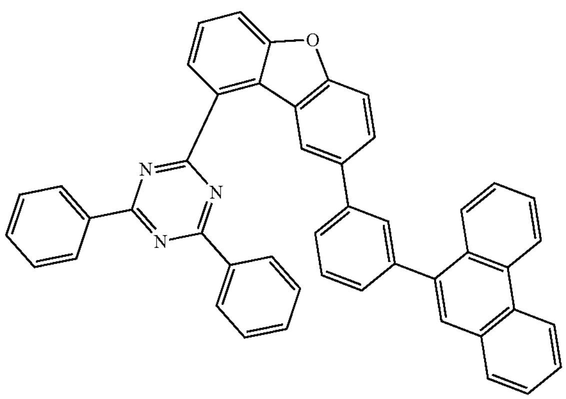
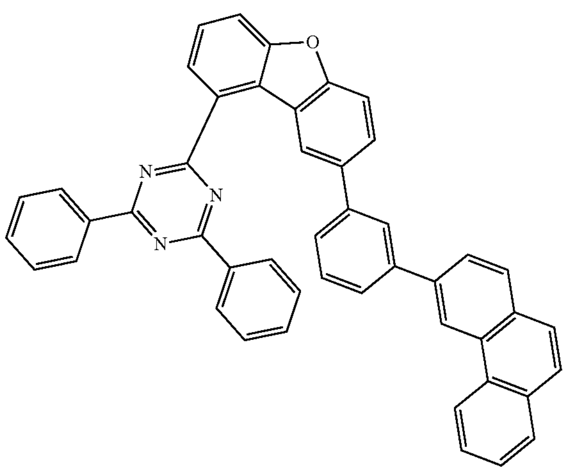
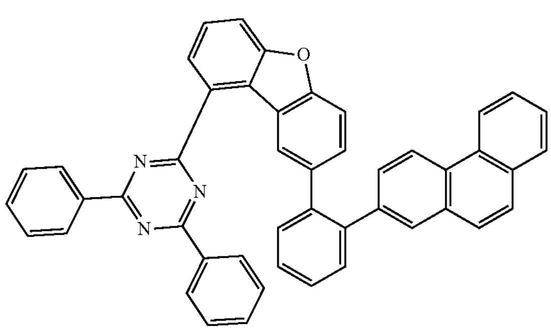
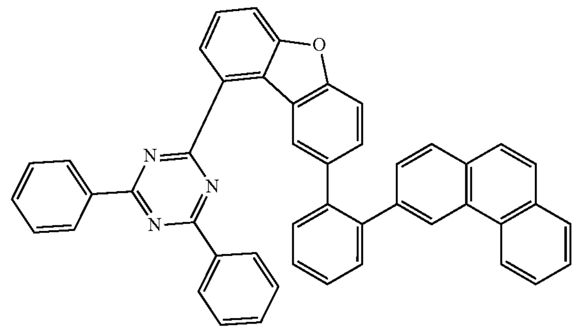
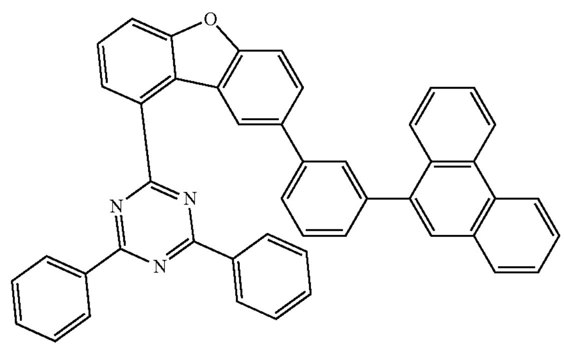
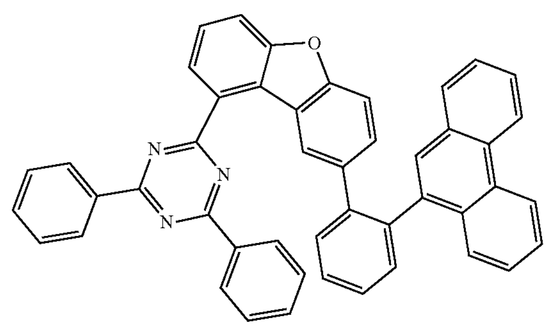
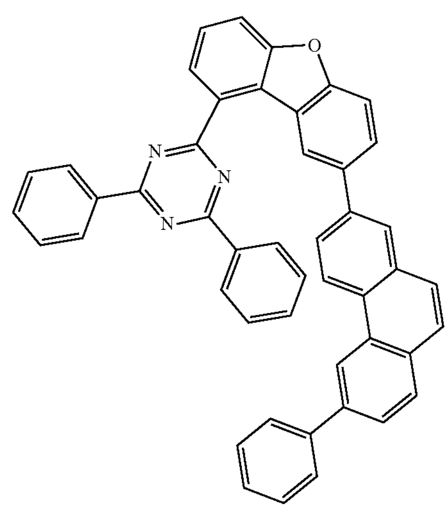

-continued
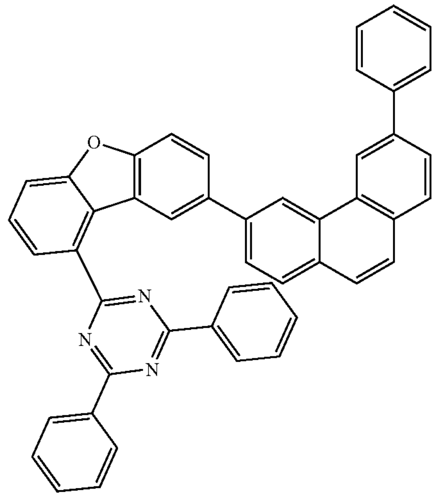
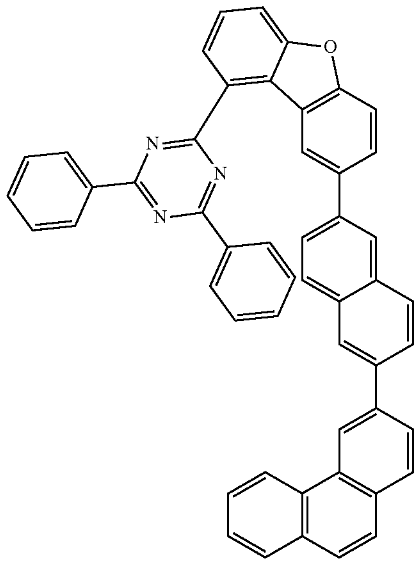
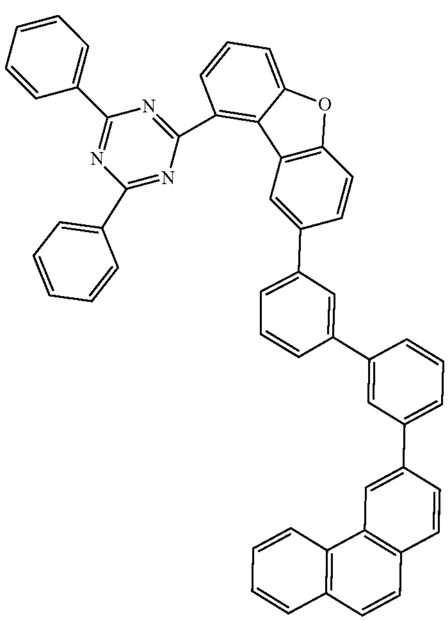
-continued
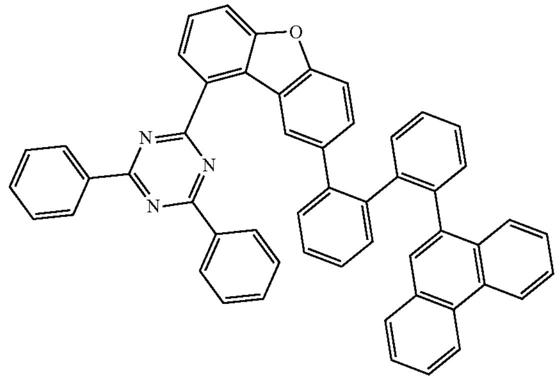
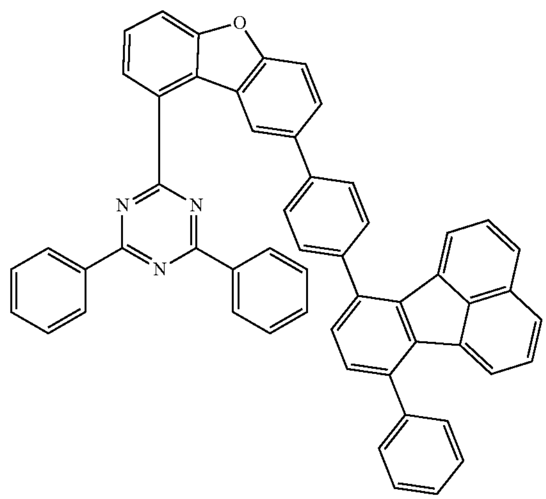
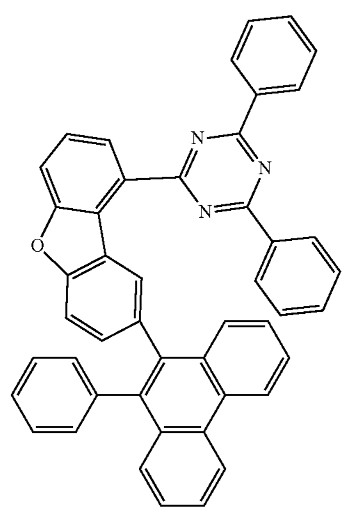

-continued
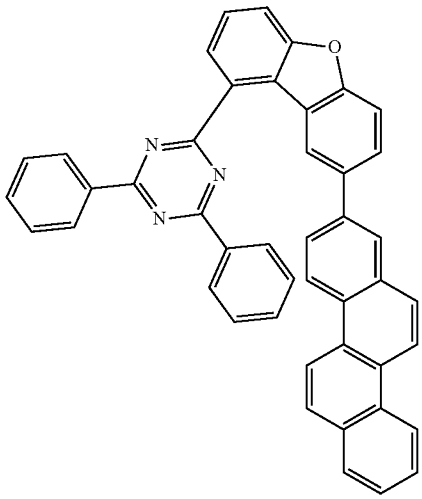
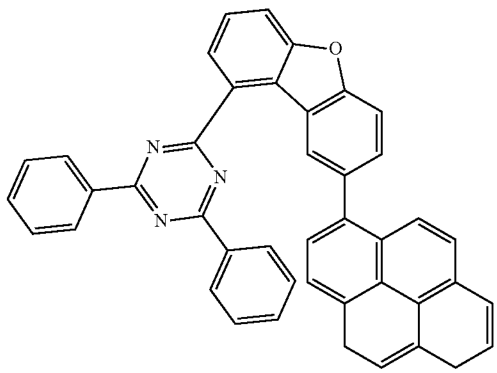
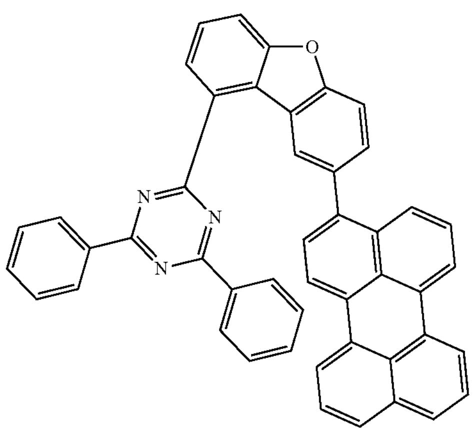
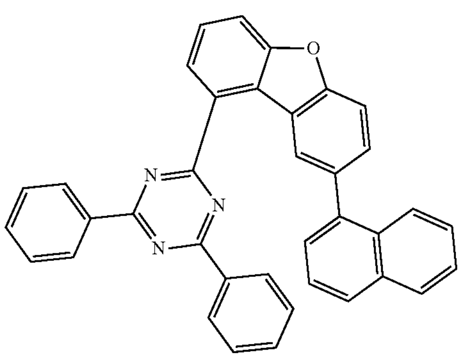
-continued
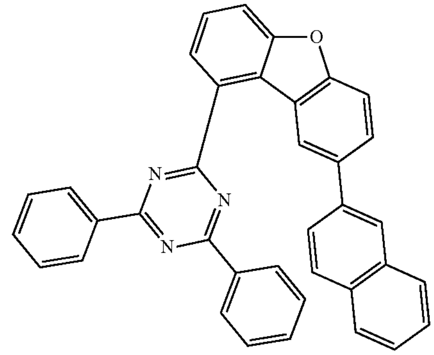
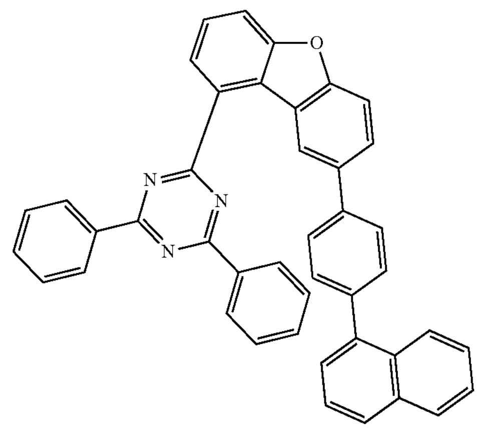
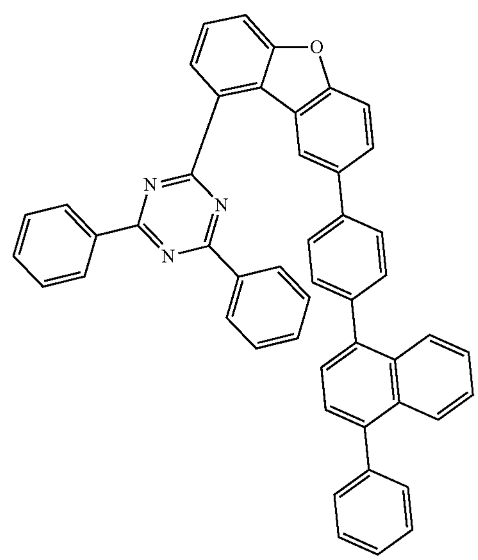

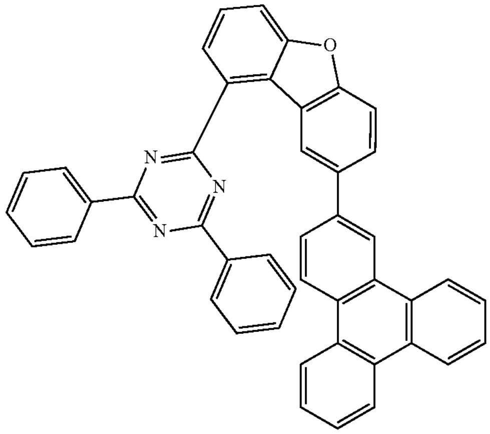
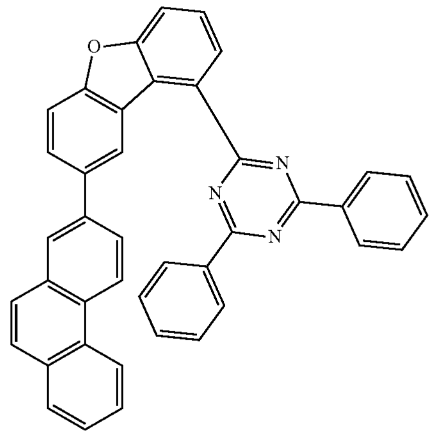
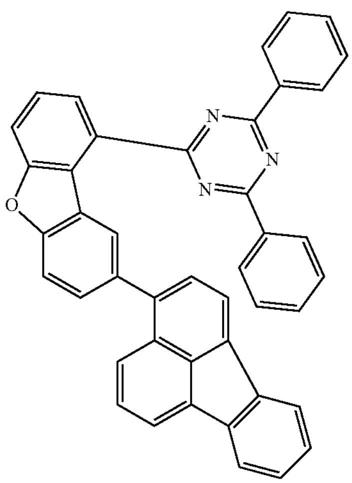
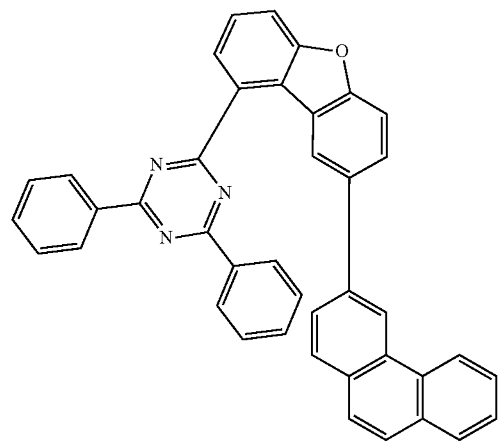
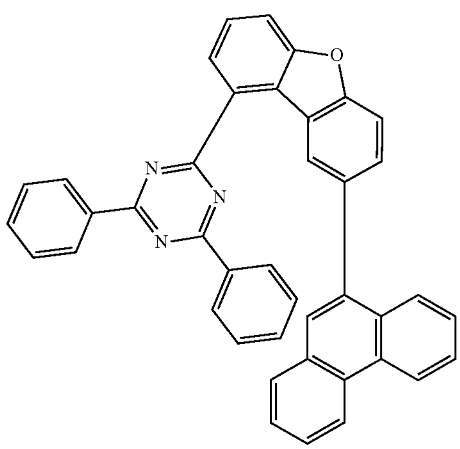
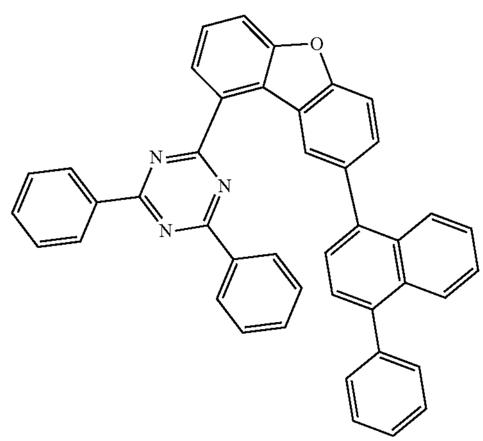
N
N
N
O

-continued
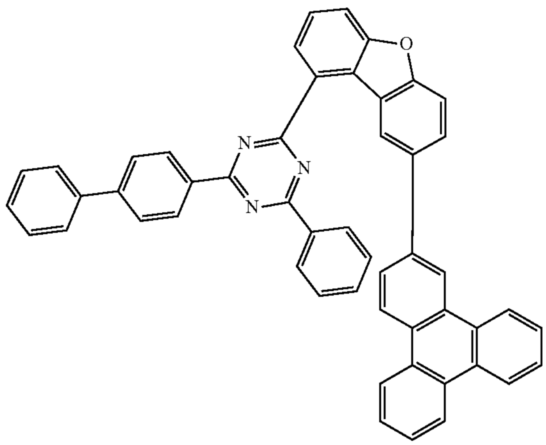
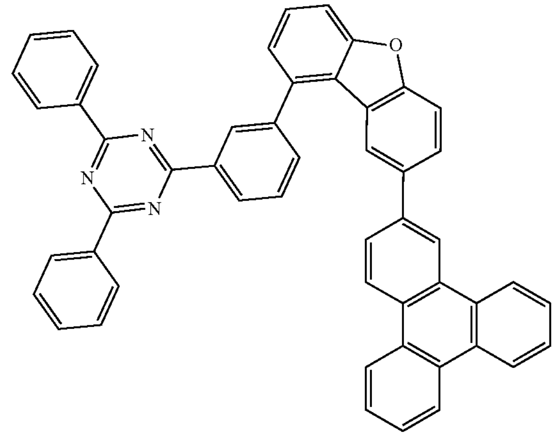
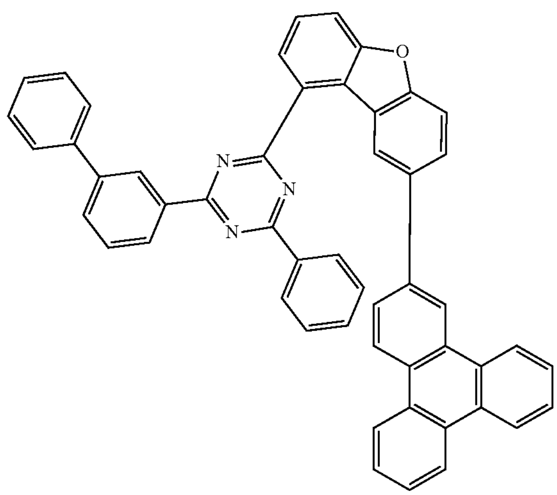
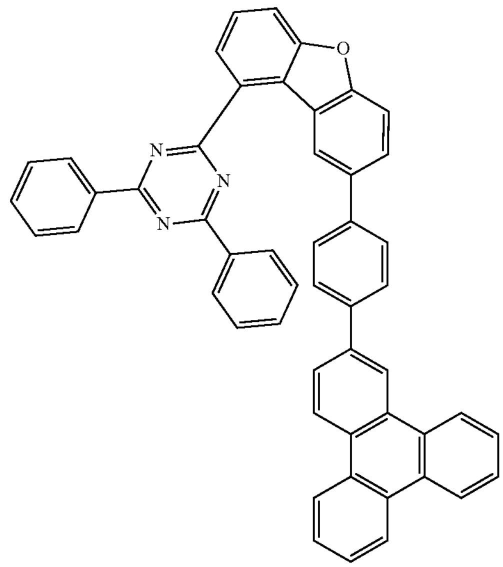
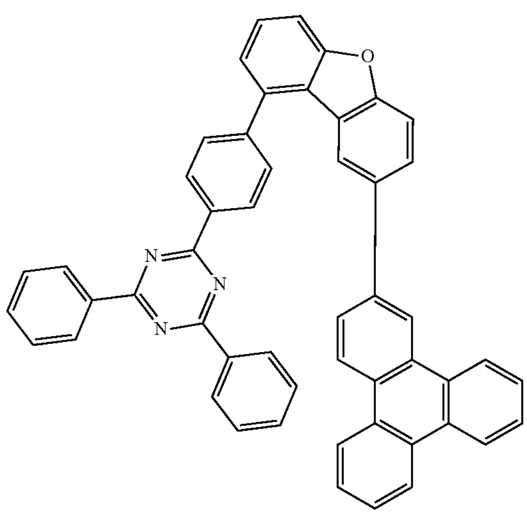
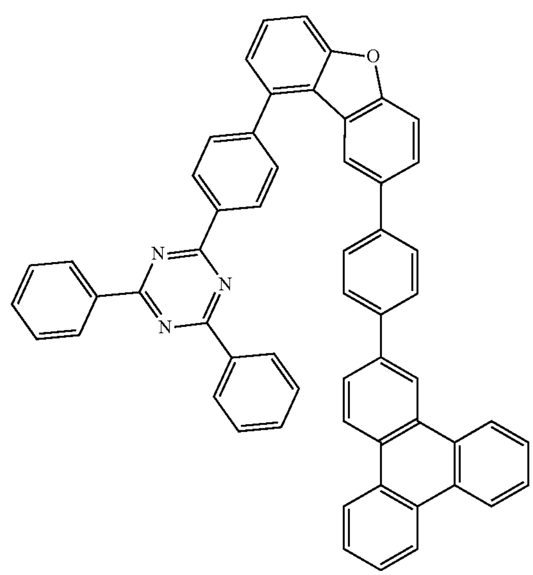

-continued
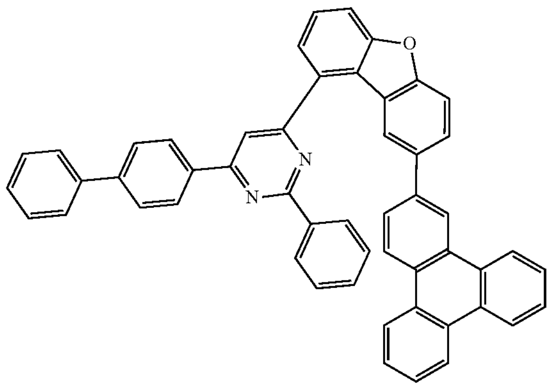
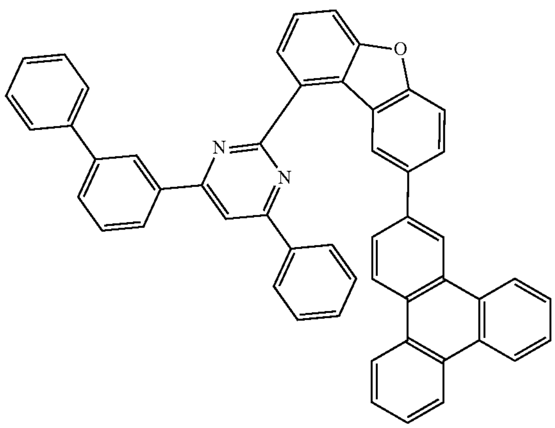
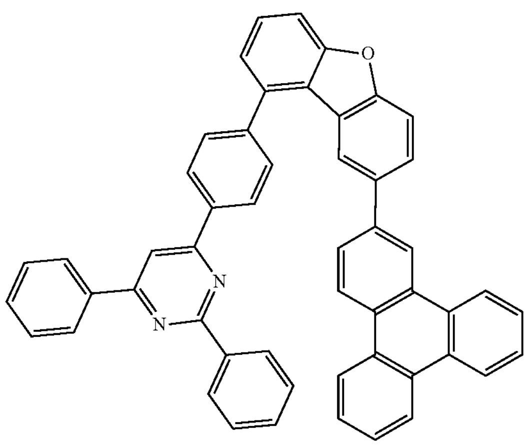
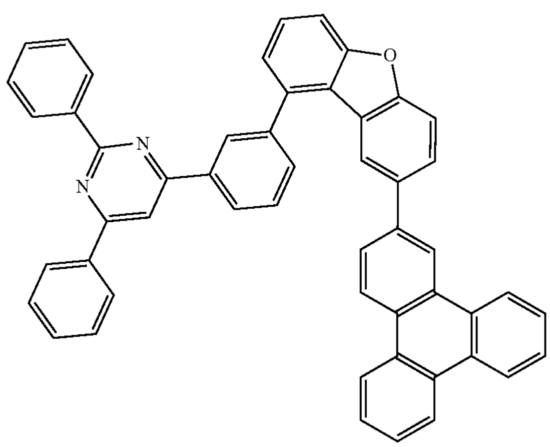
-continued
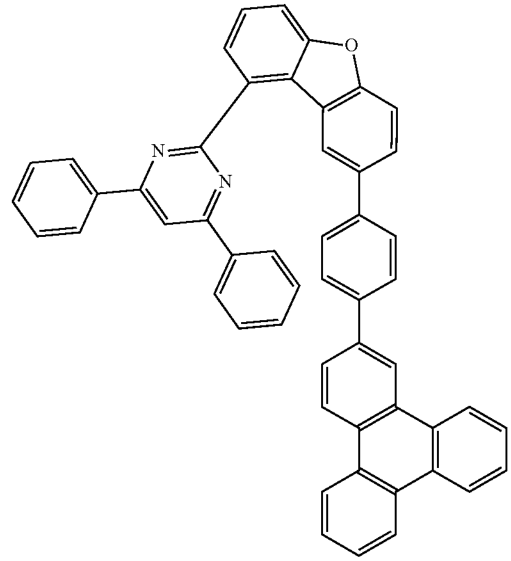
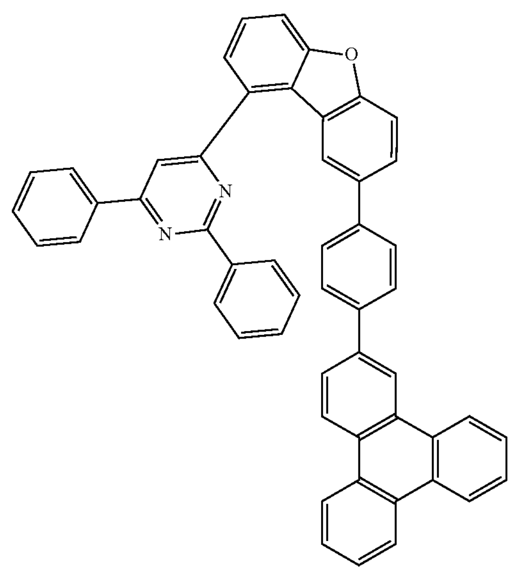
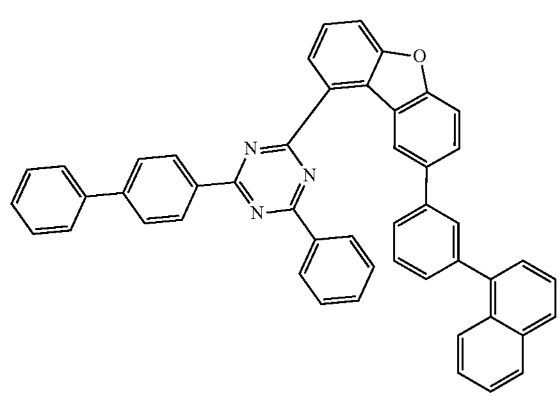

-continued
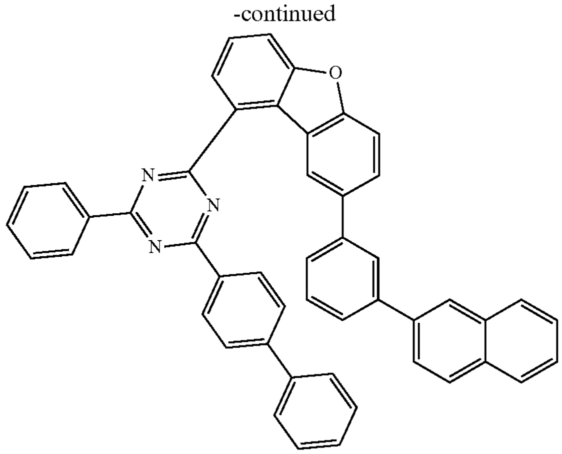
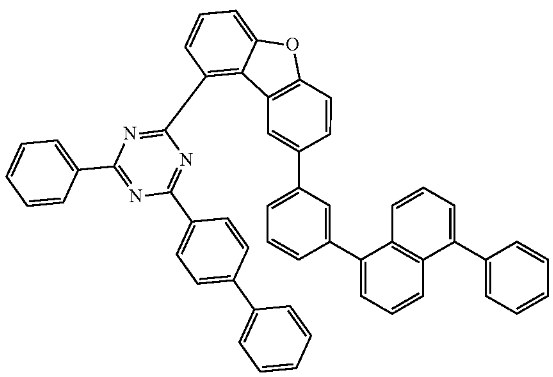
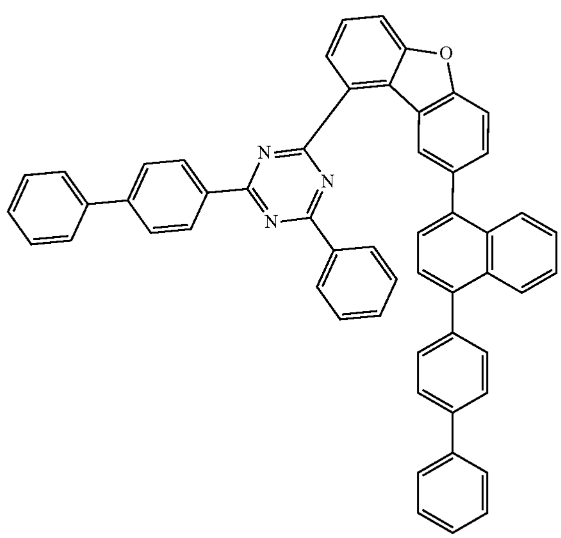
-continued
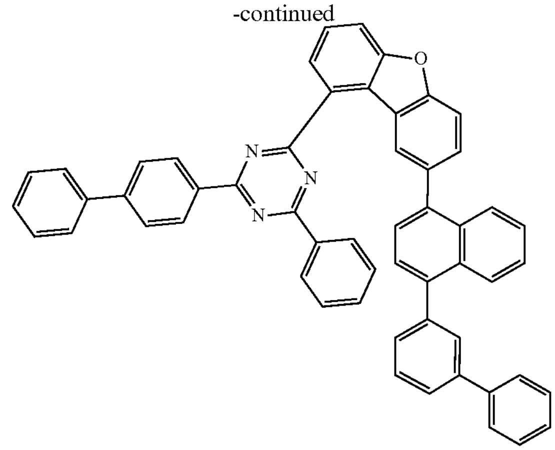
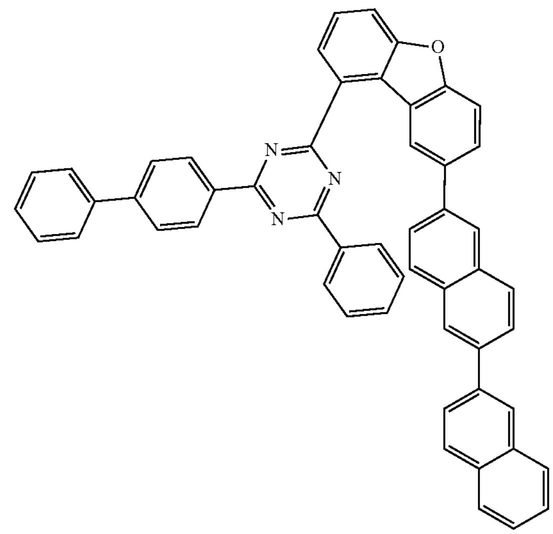
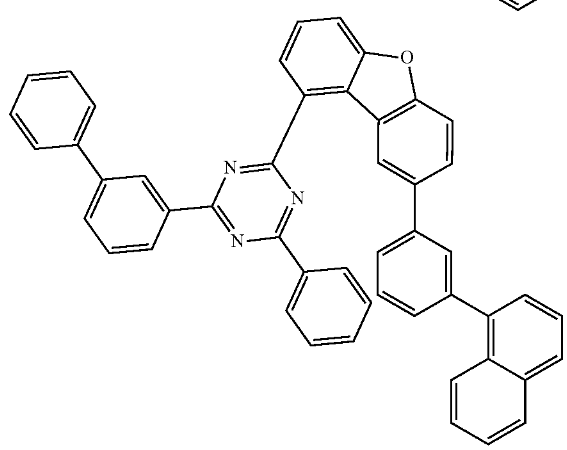
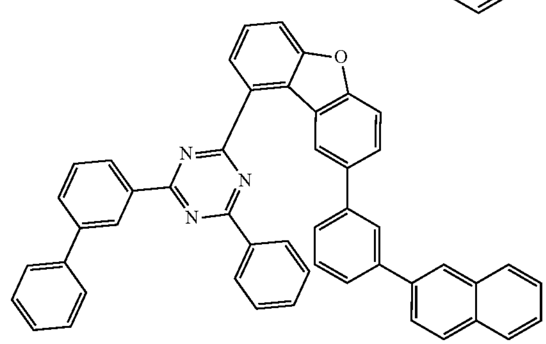

-continued
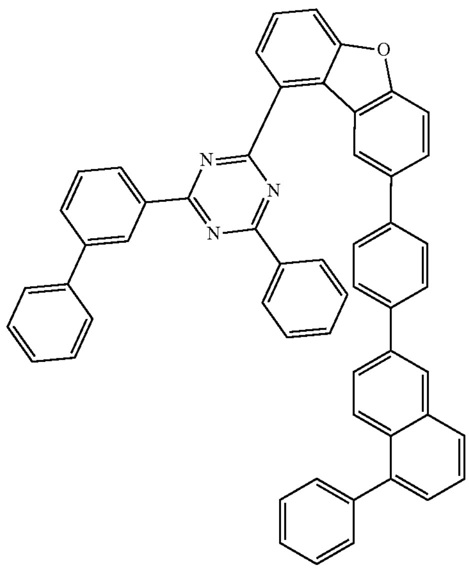
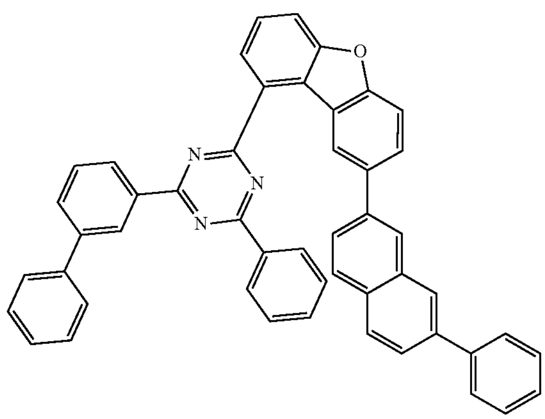
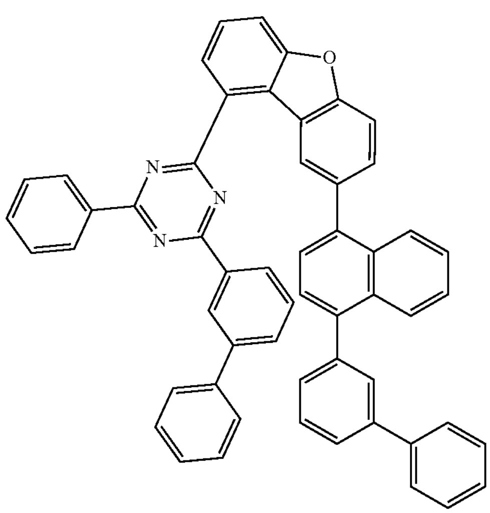
-continued
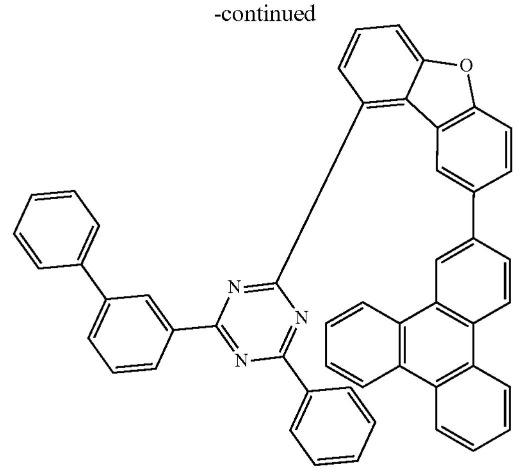
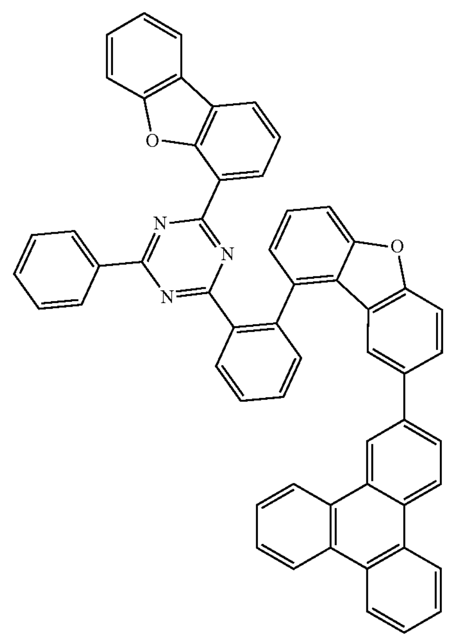
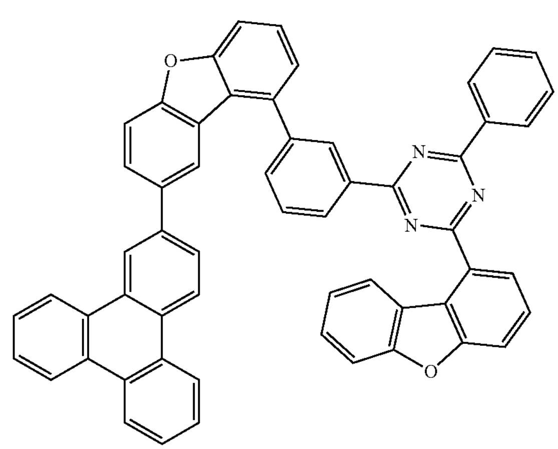

-continued
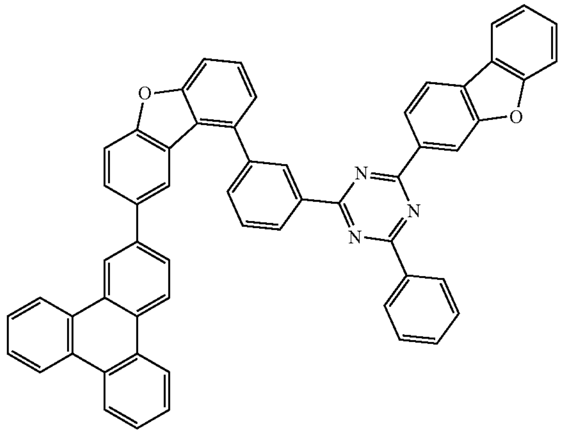
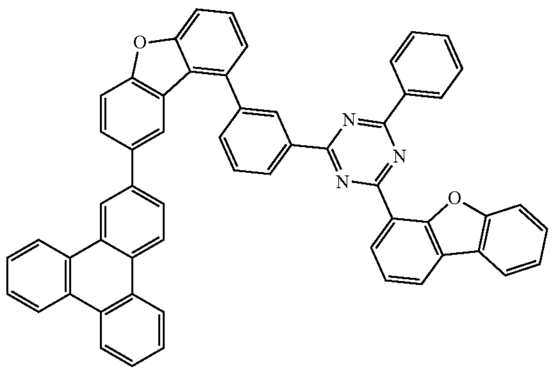
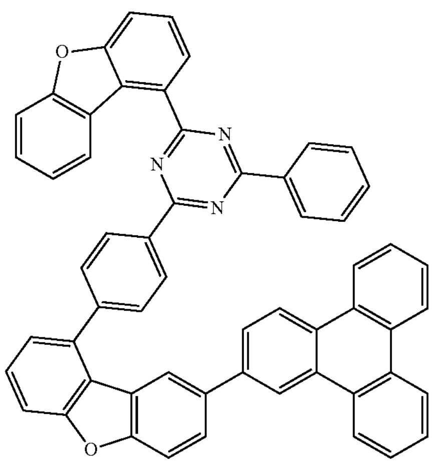
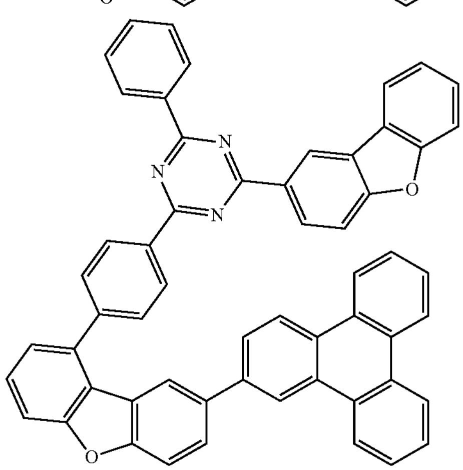
-continued
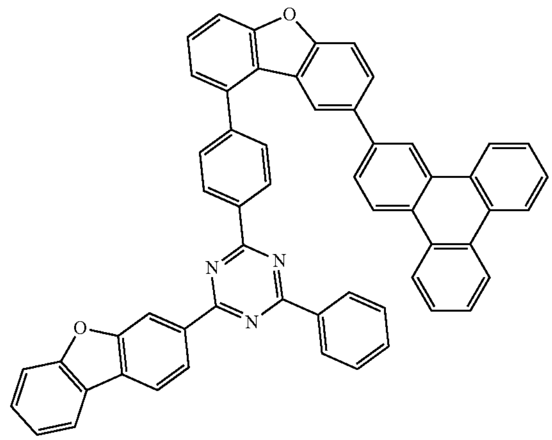
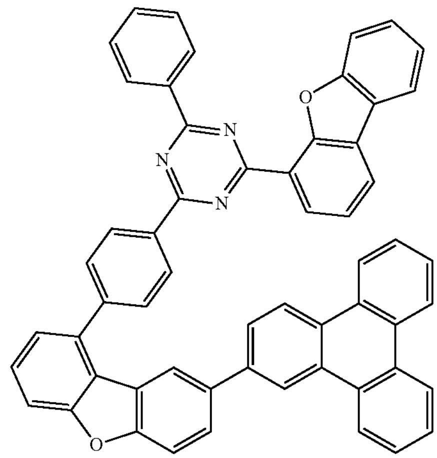
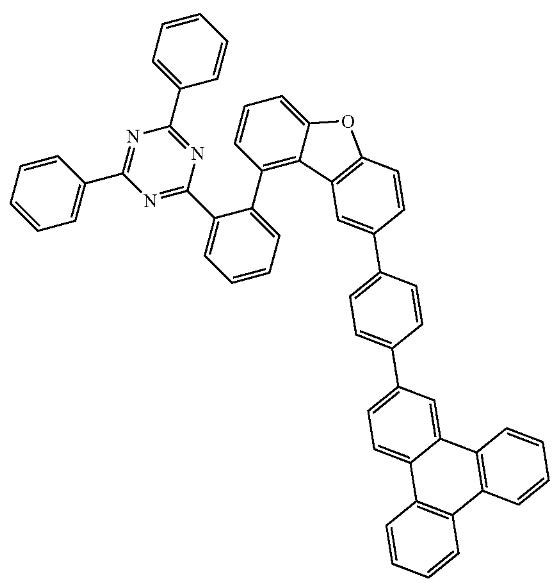

-continued
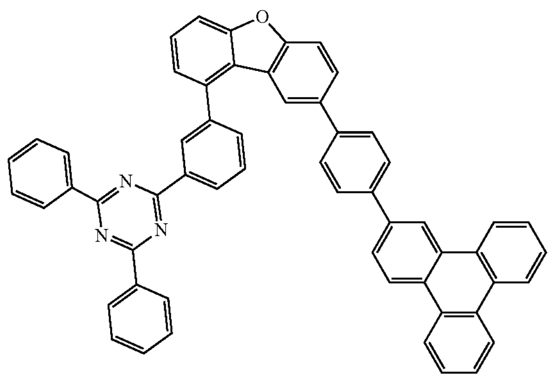
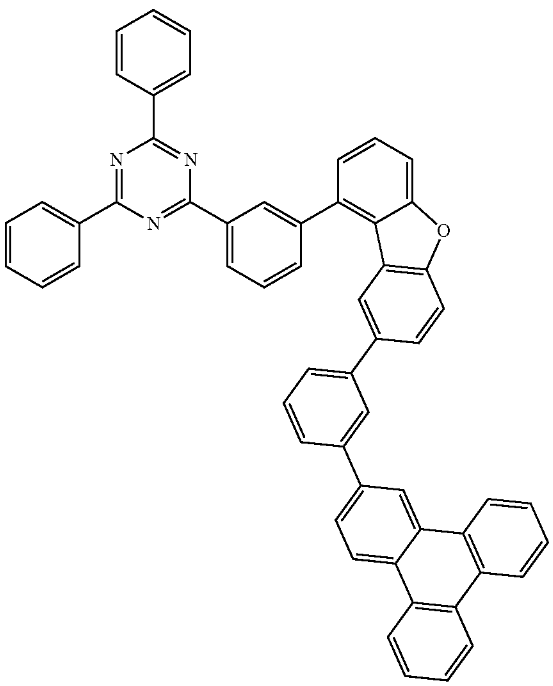
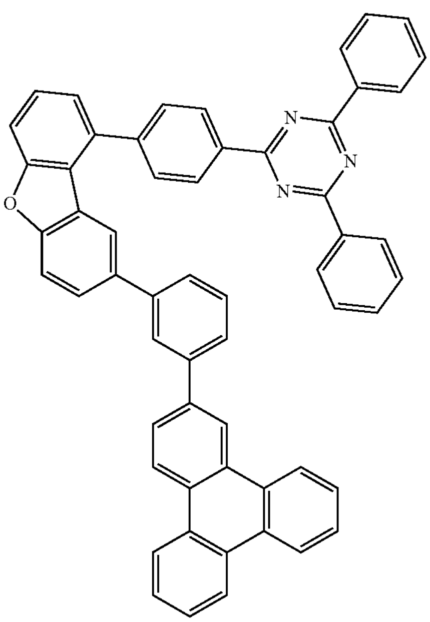
-continued
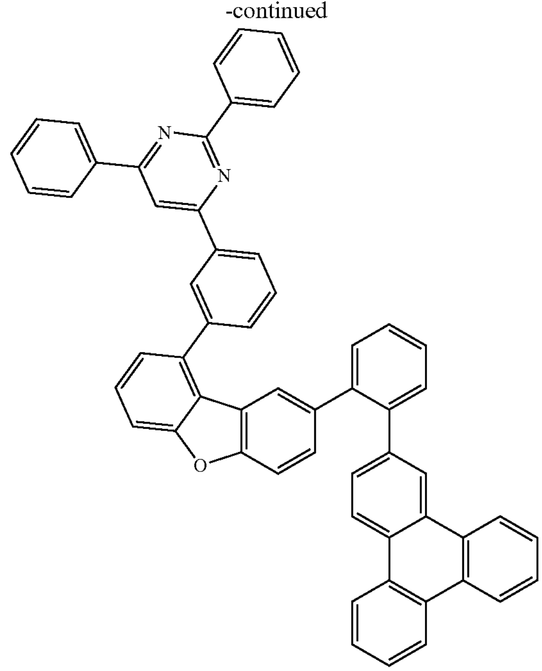
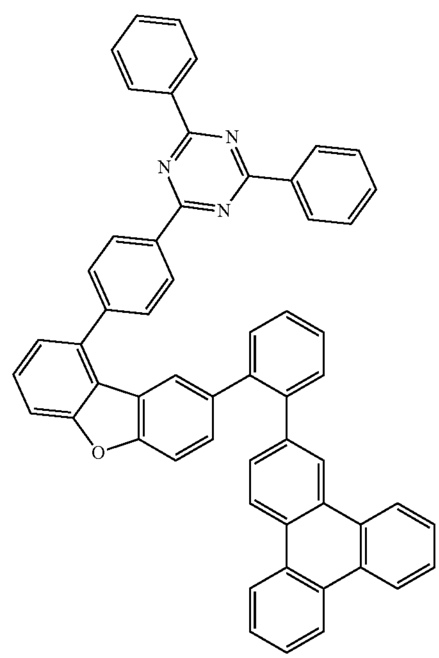

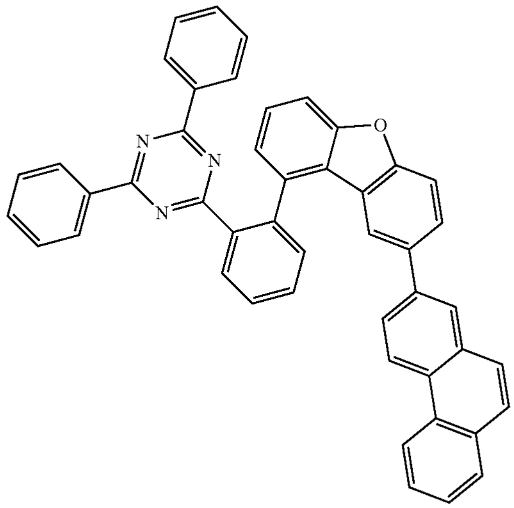
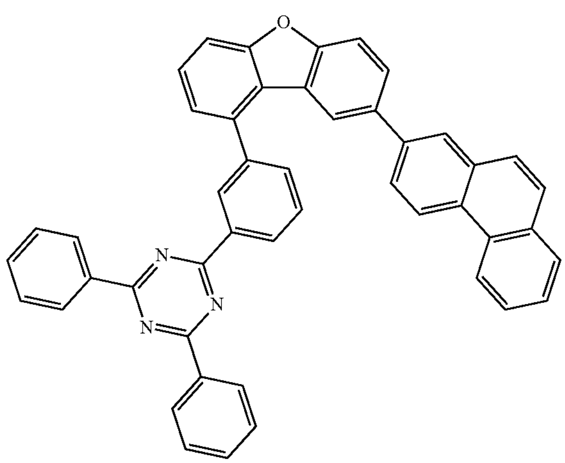
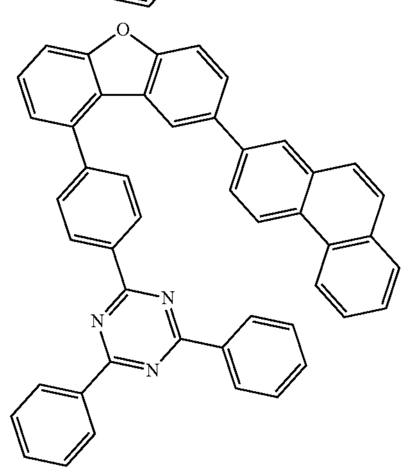
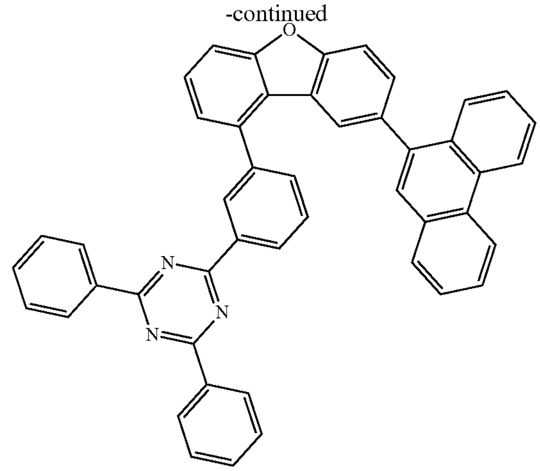
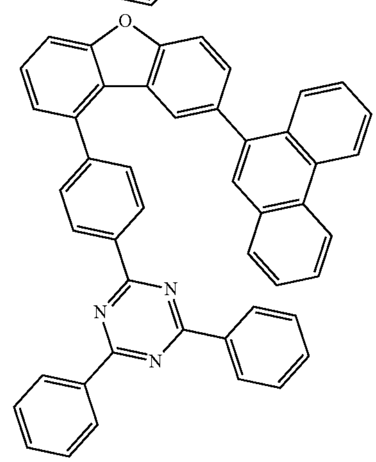
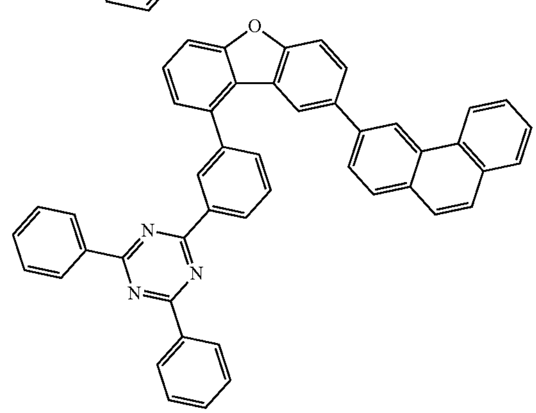
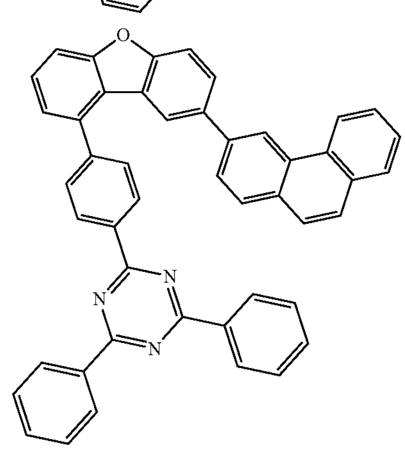

-continued
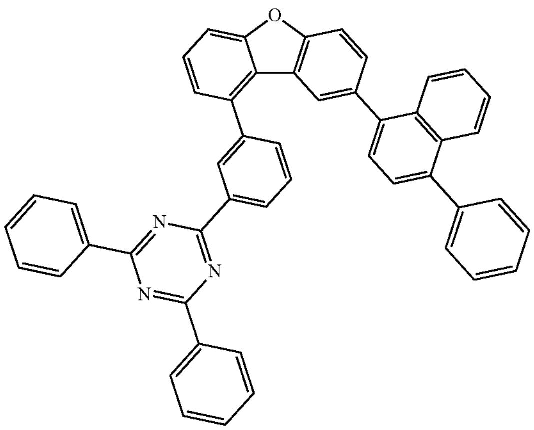
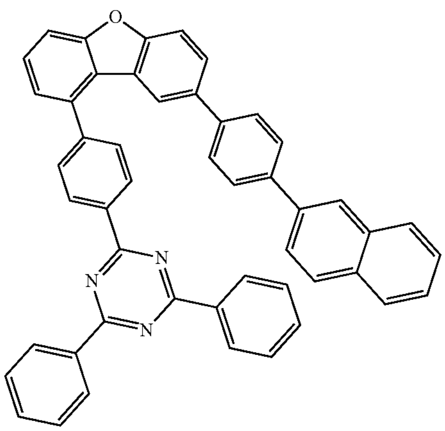
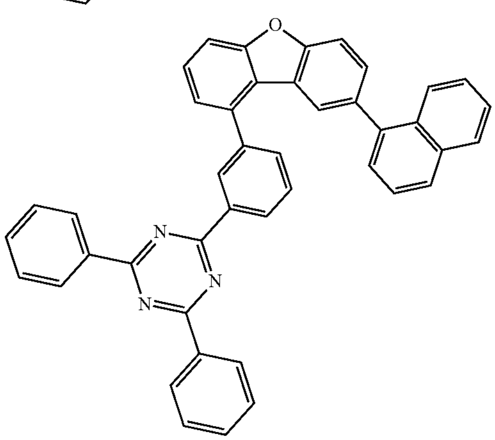
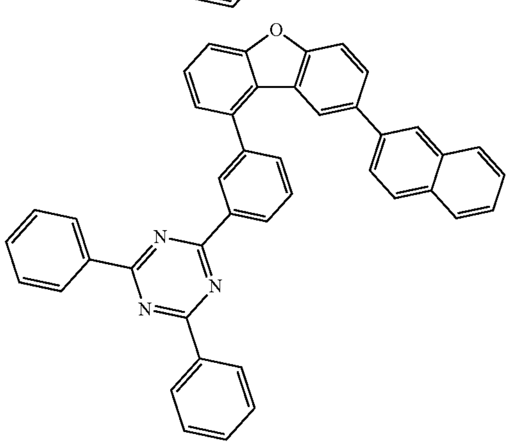
-continued
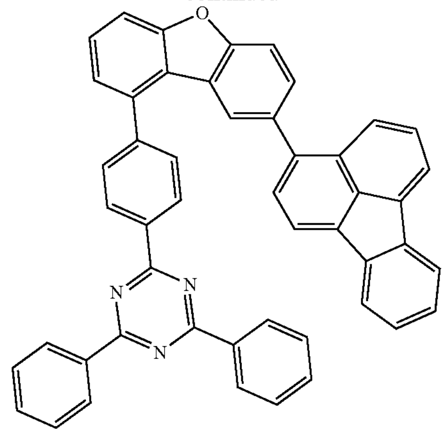
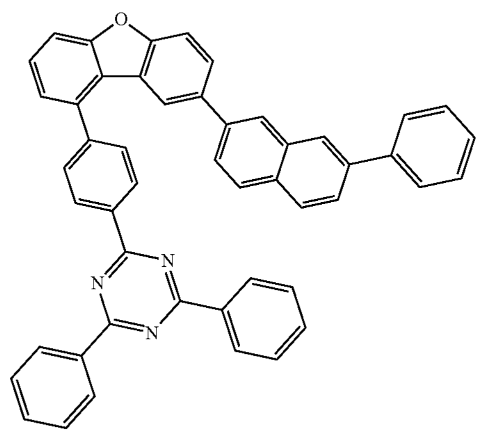
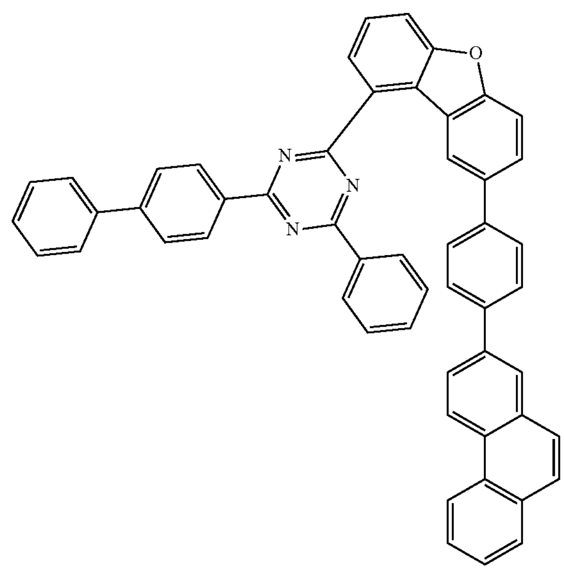

-continued
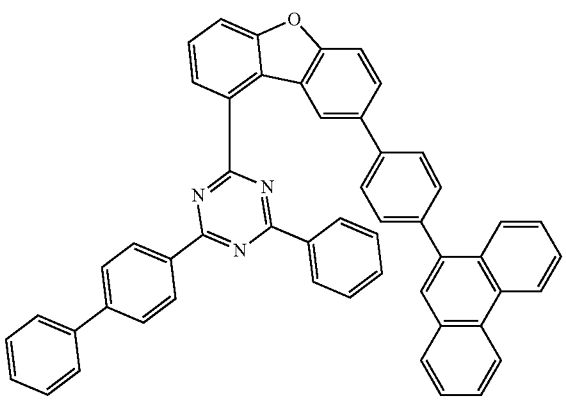
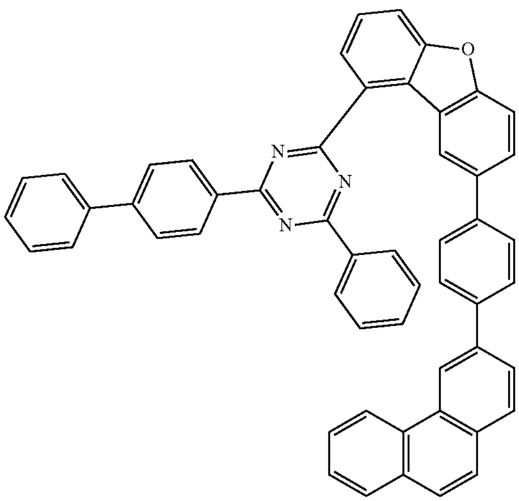
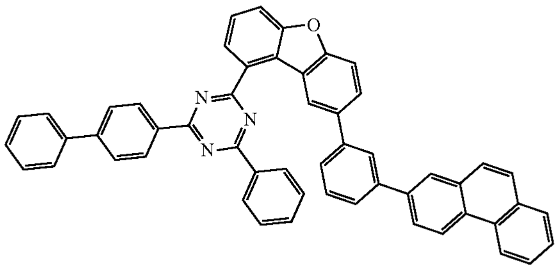
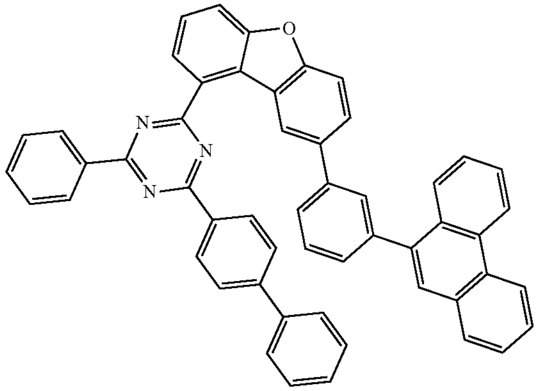
-continued
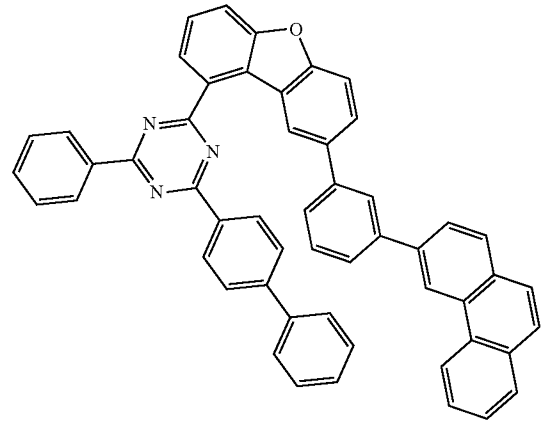
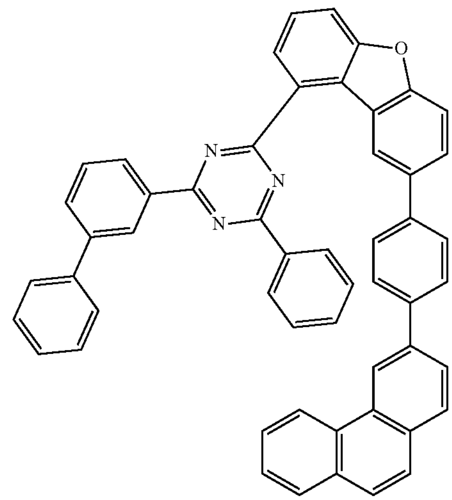
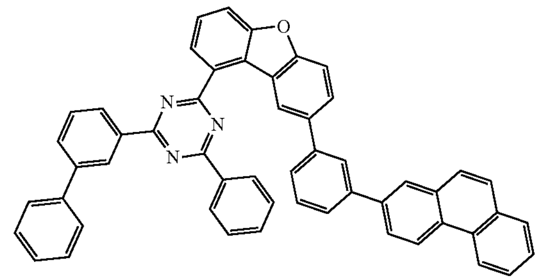
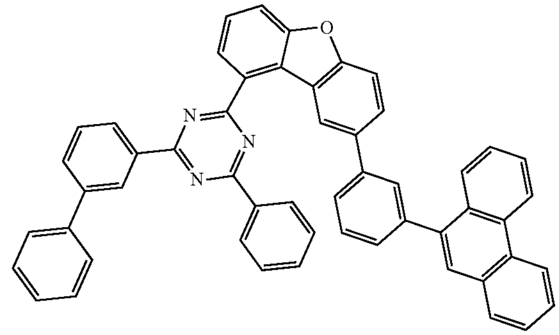

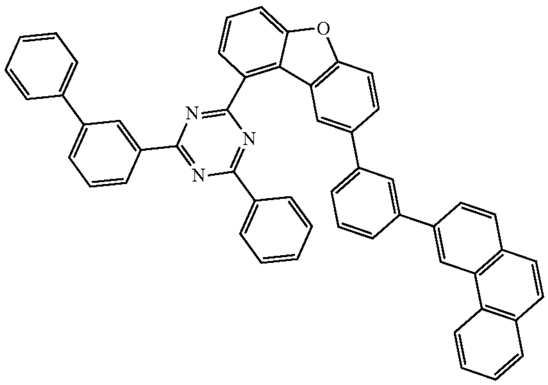
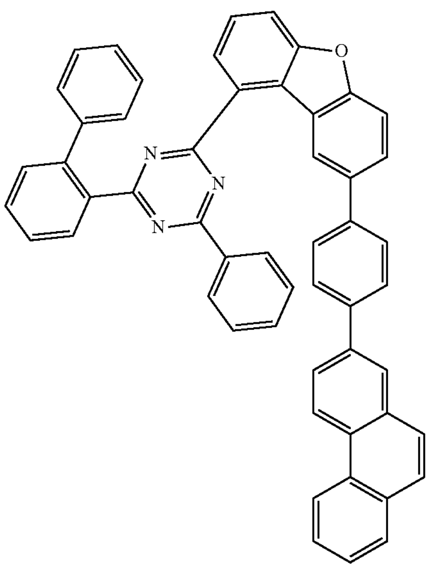
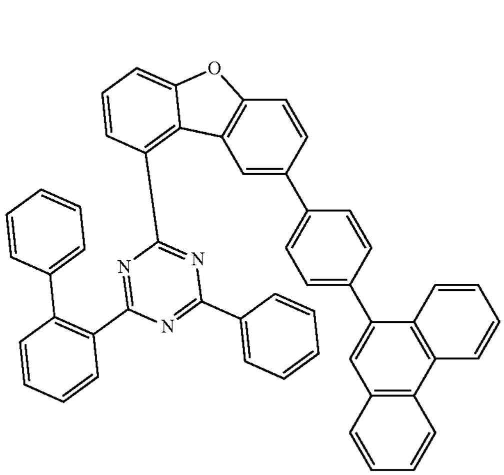
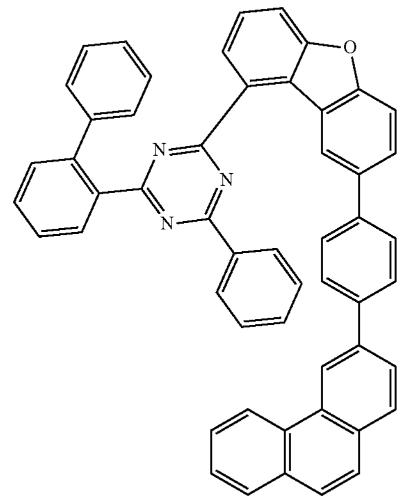
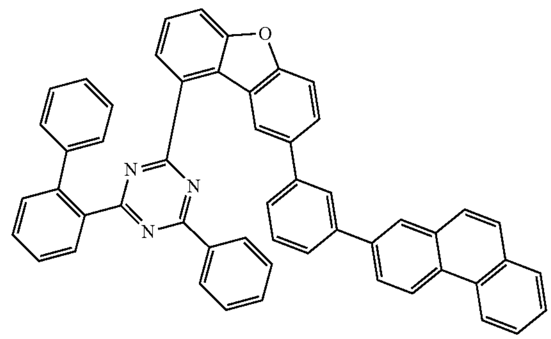
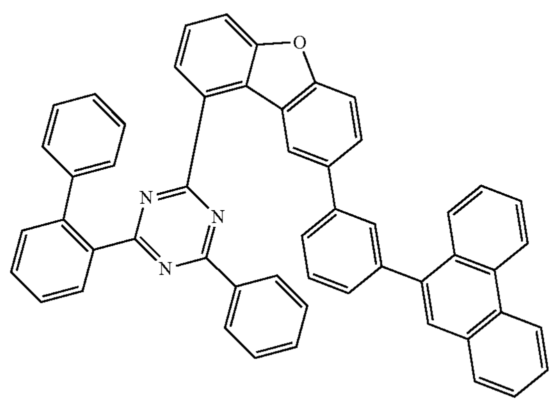
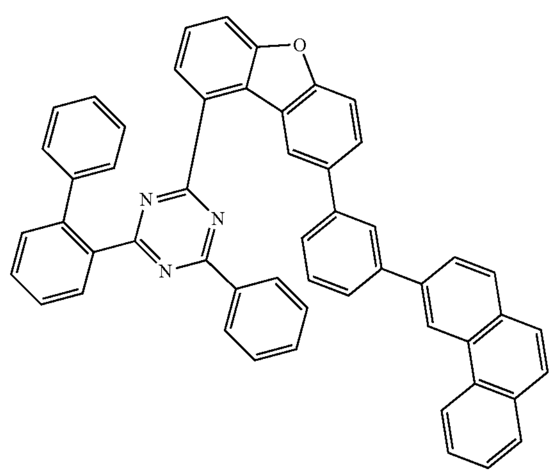

-continued
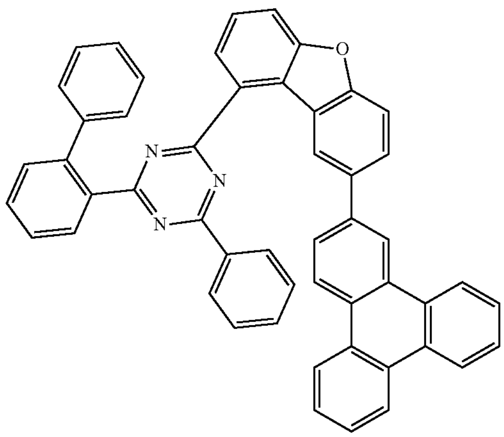
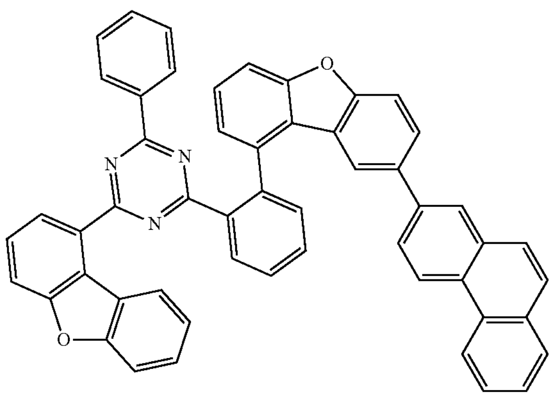
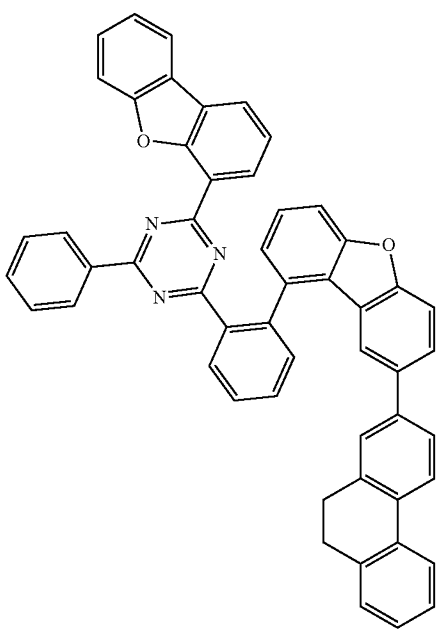
-continued
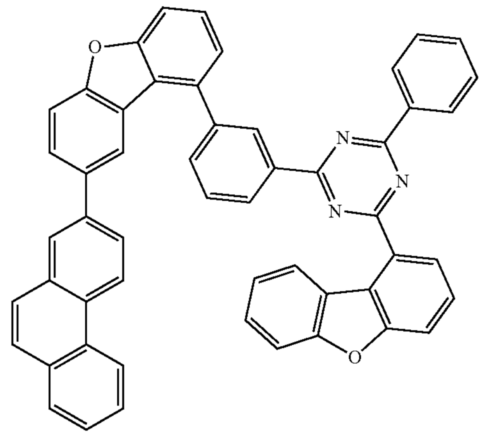
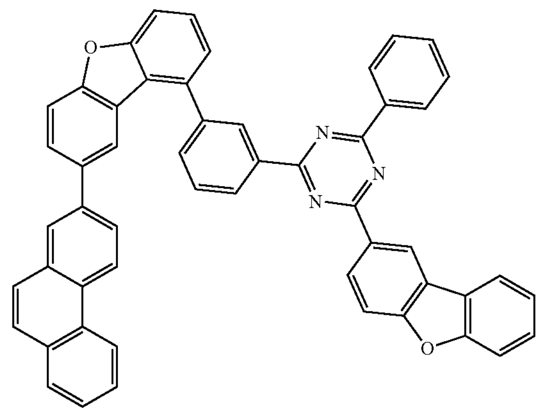
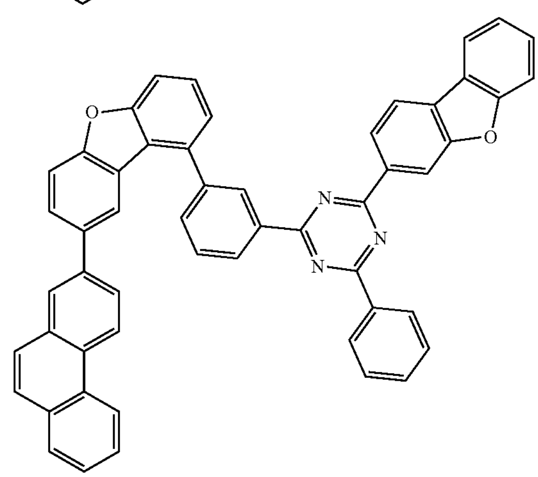
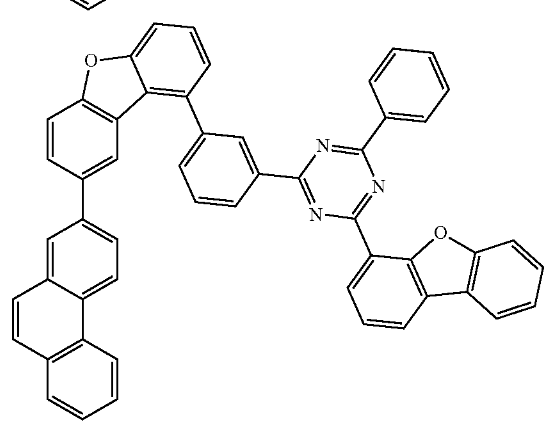

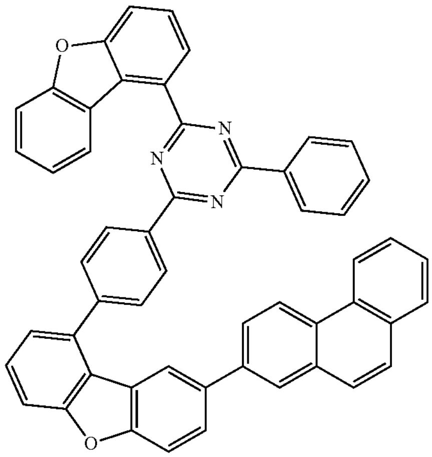
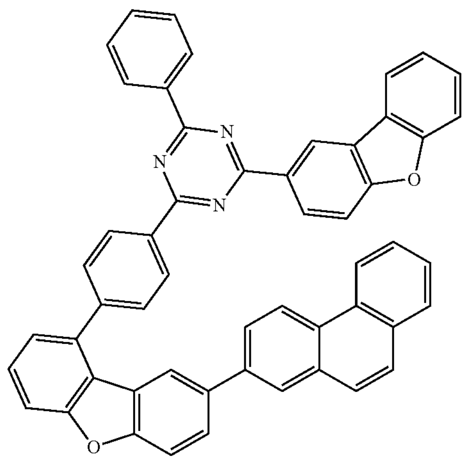
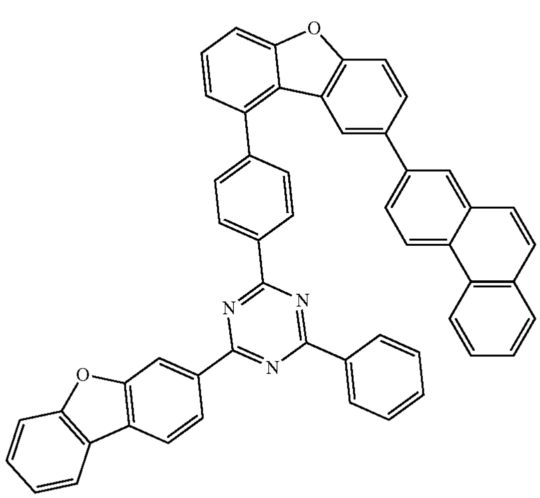
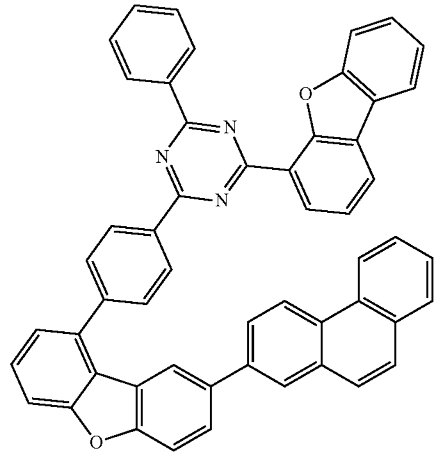
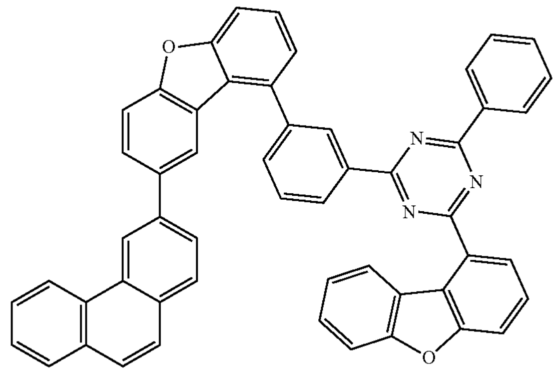
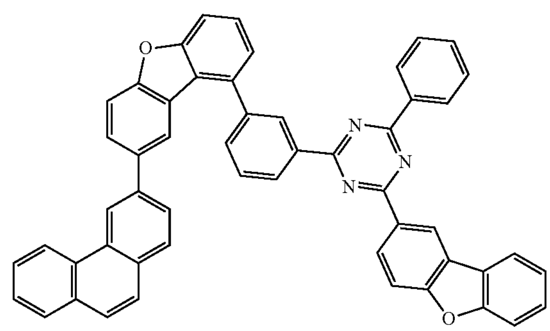
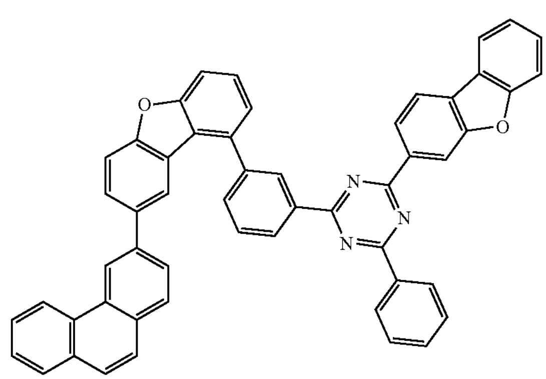

-continued
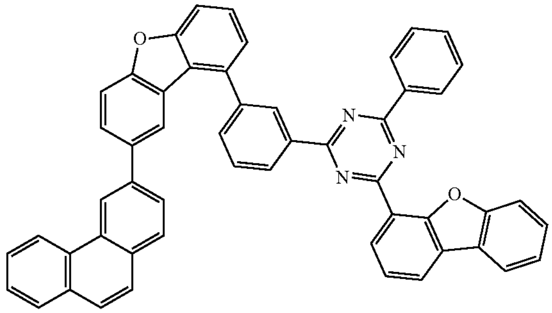
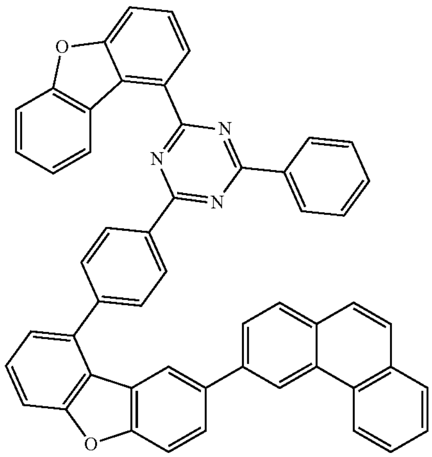
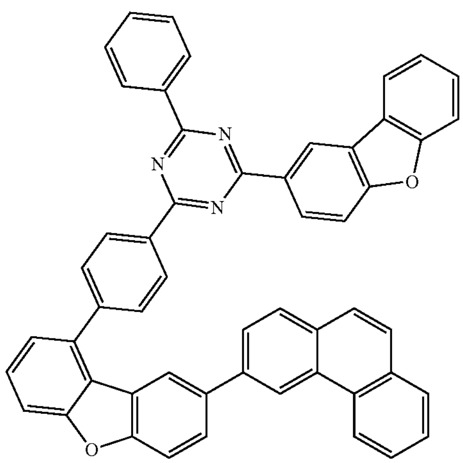
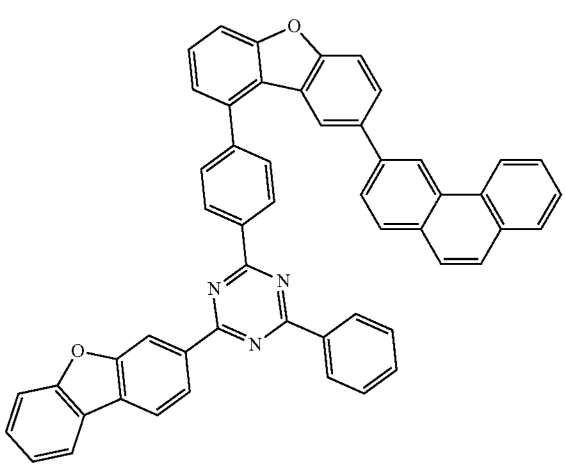
-continued
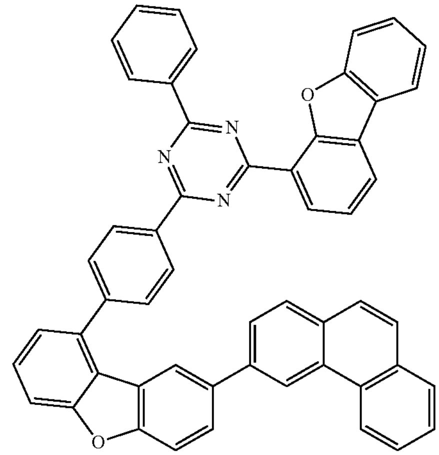
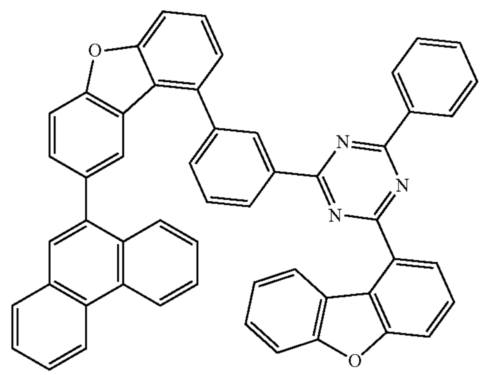
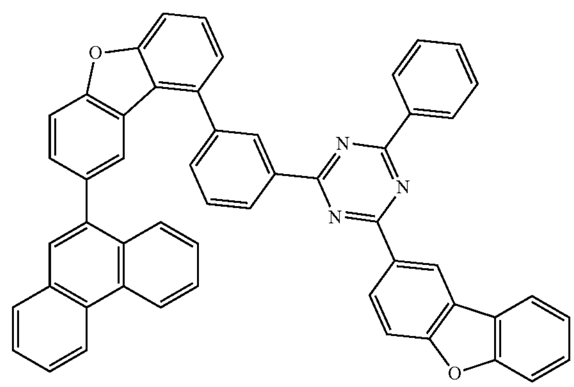
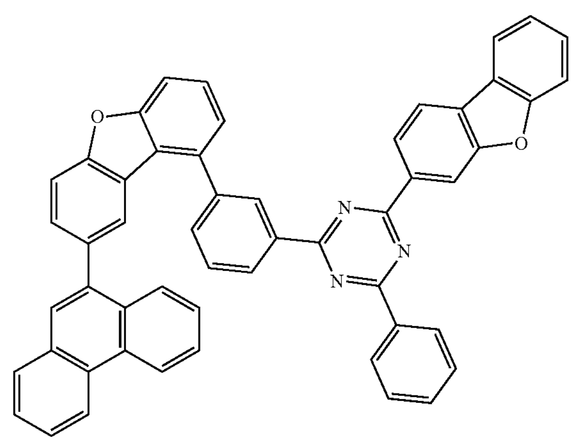

-continued
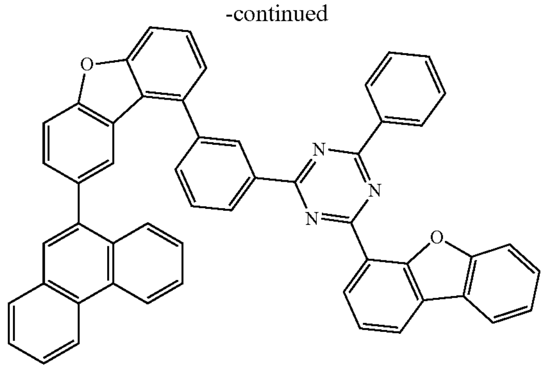
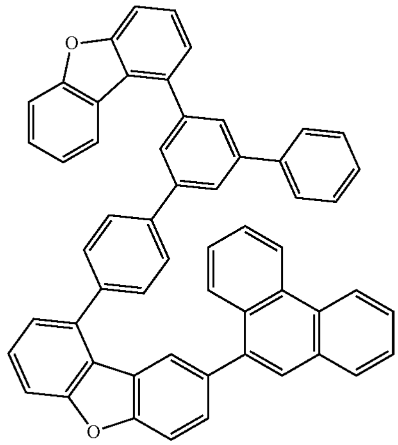
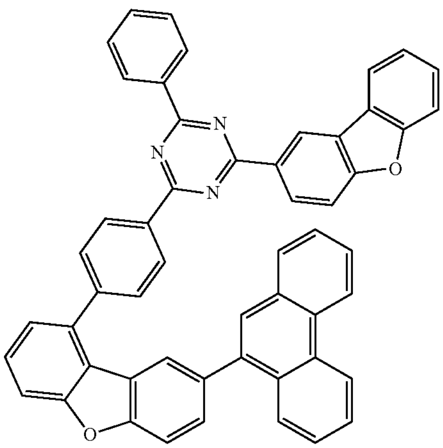
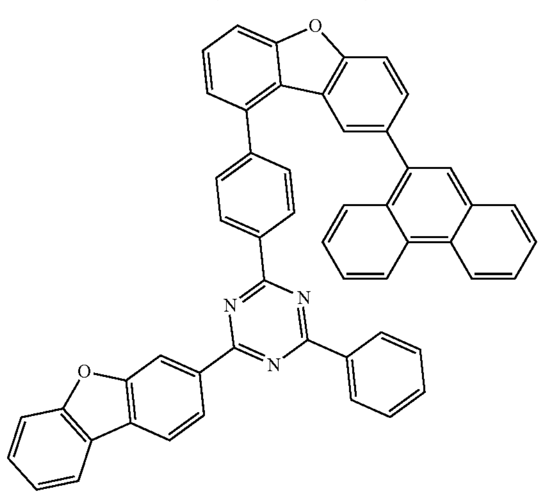
-continued
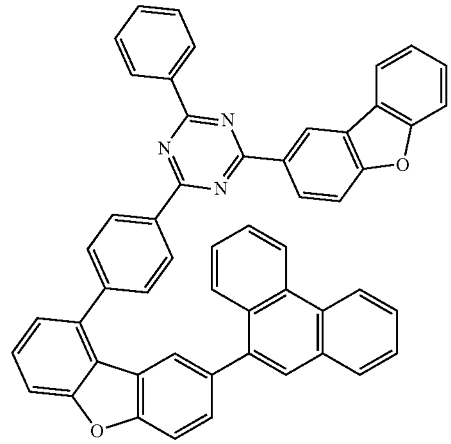
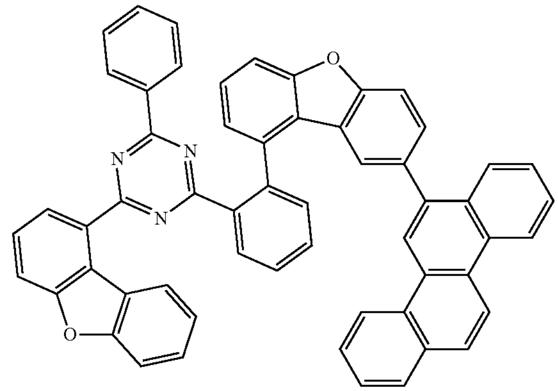
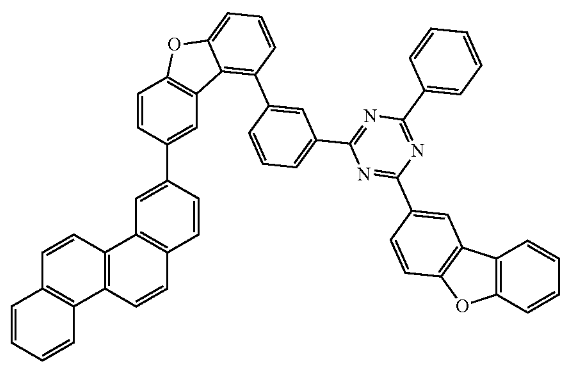
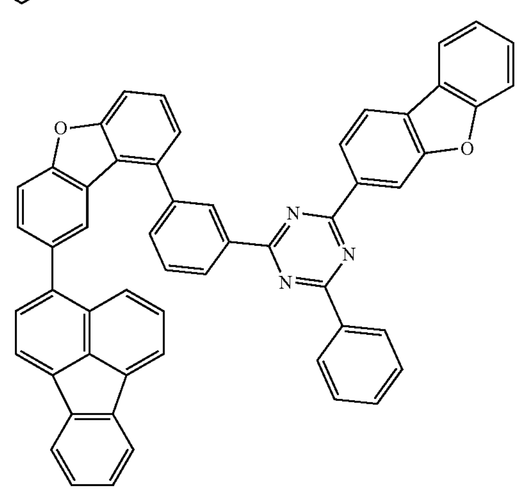

-continued
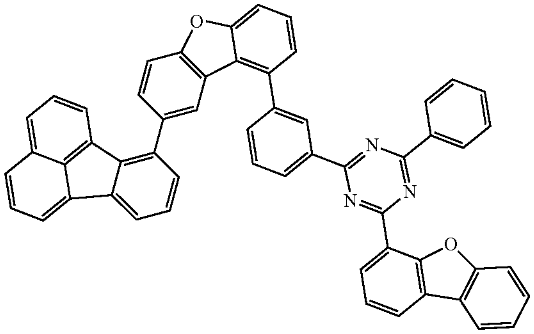
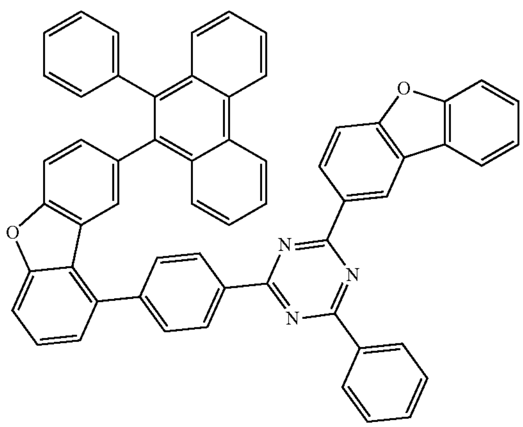
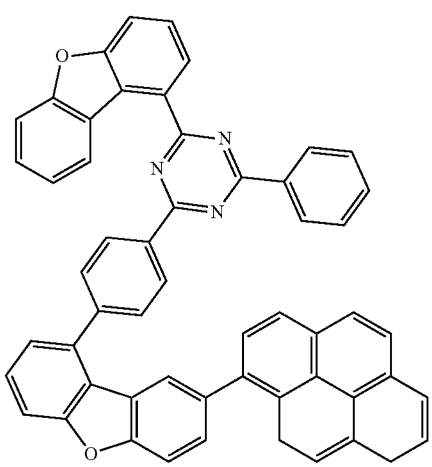
-continued
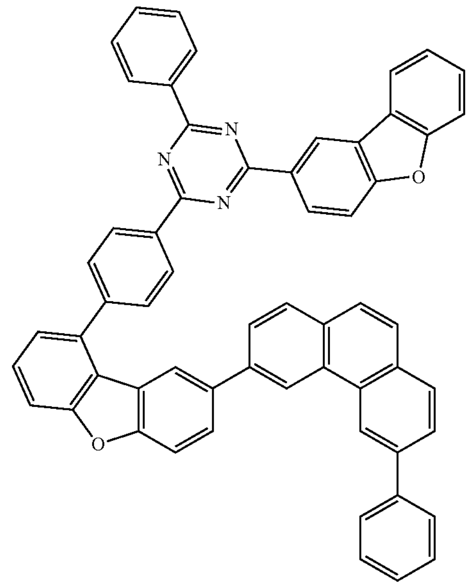
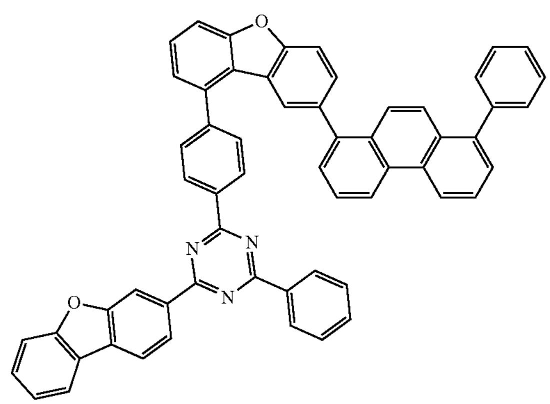
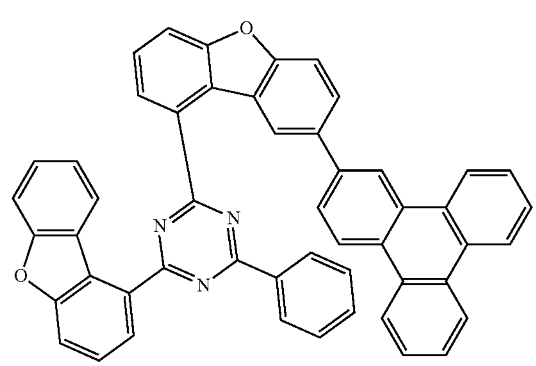

-continued
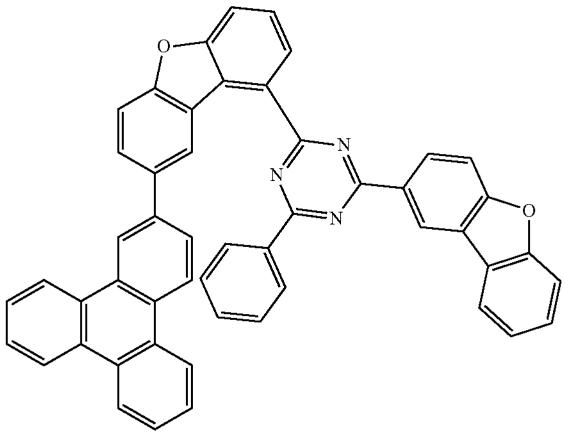
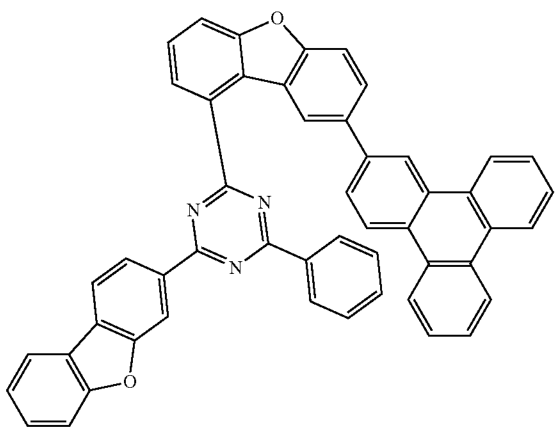
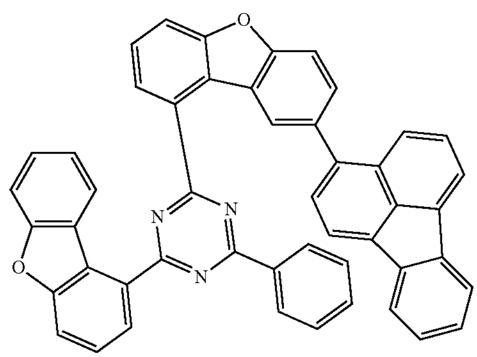
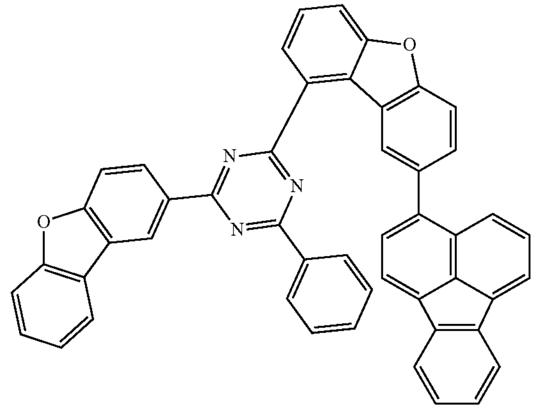
-continued
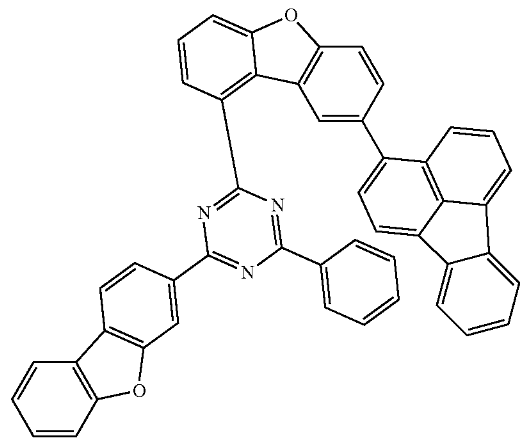
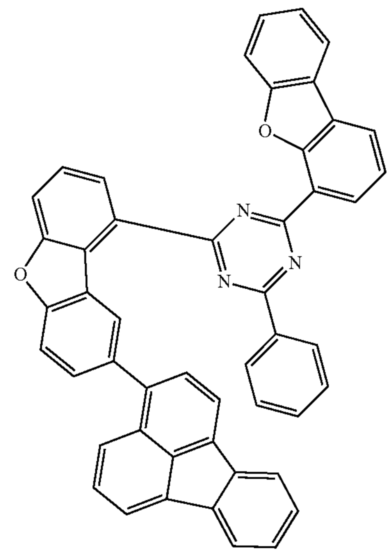
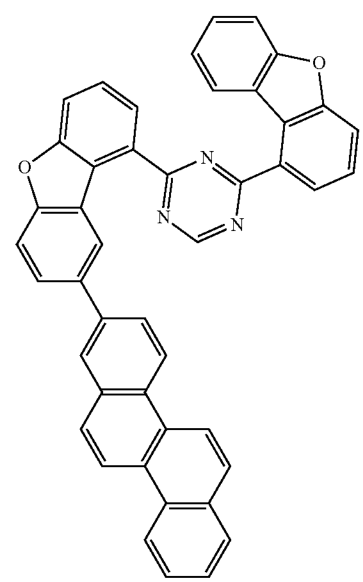

-continued
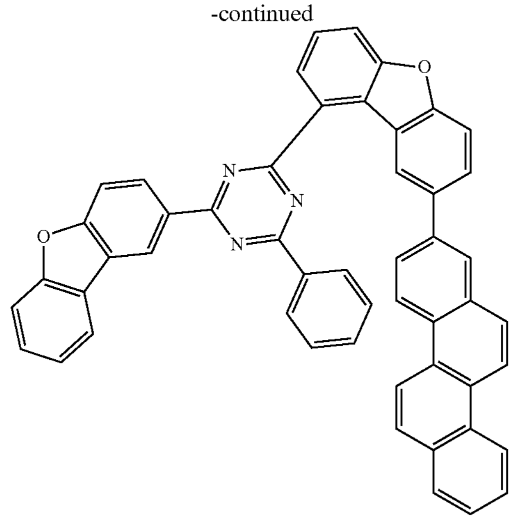
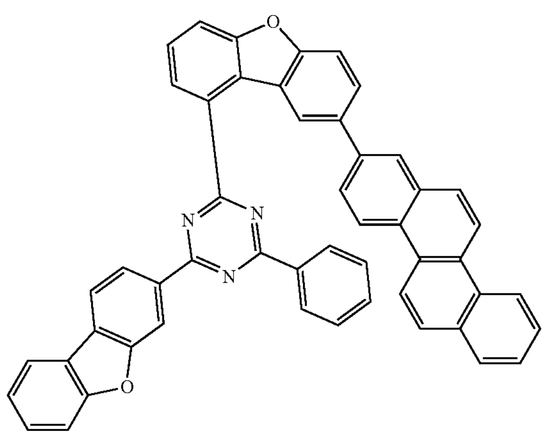
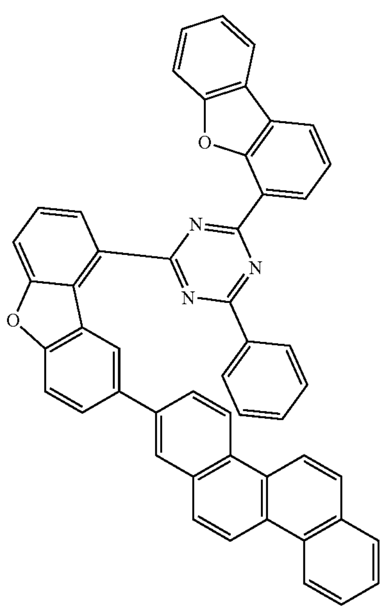
-continued
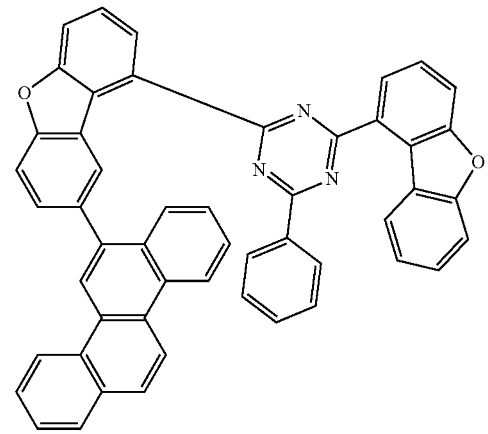
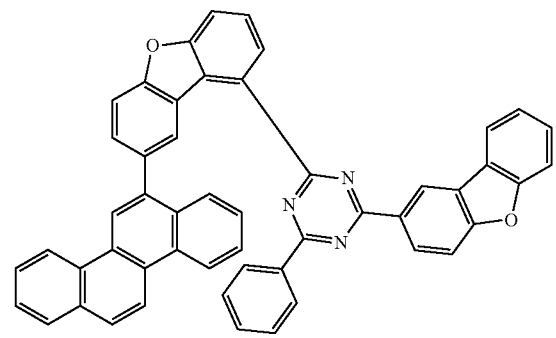
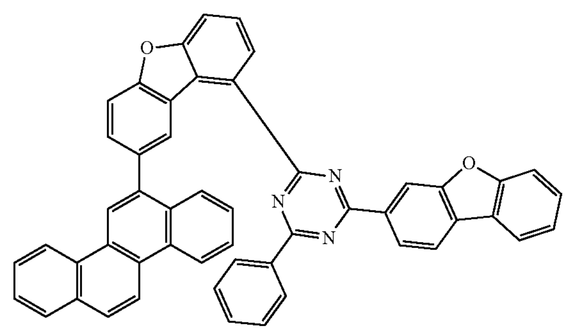
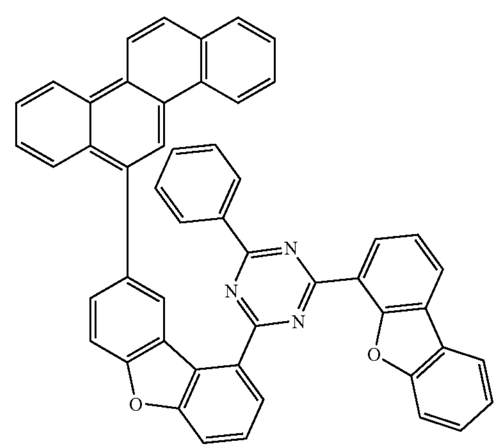

-continued
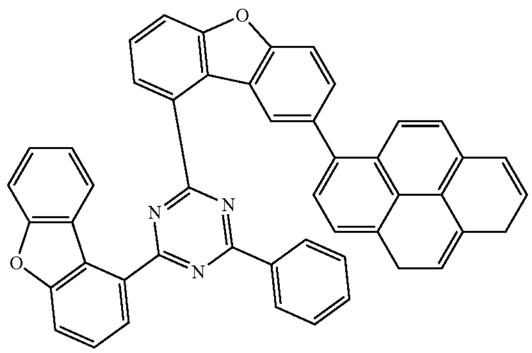
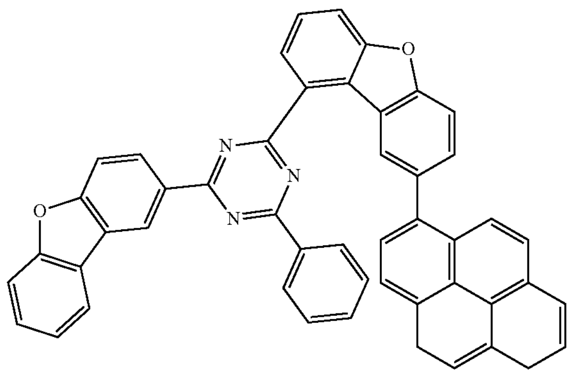
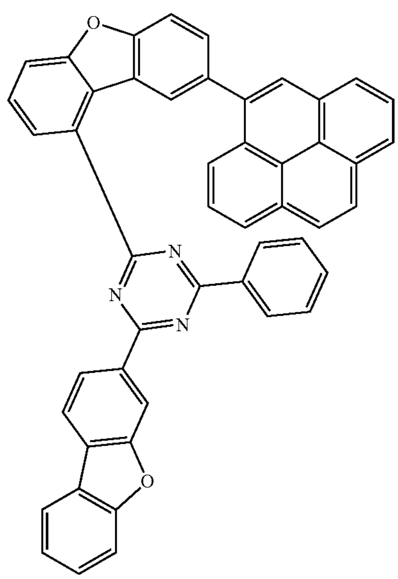
-continued
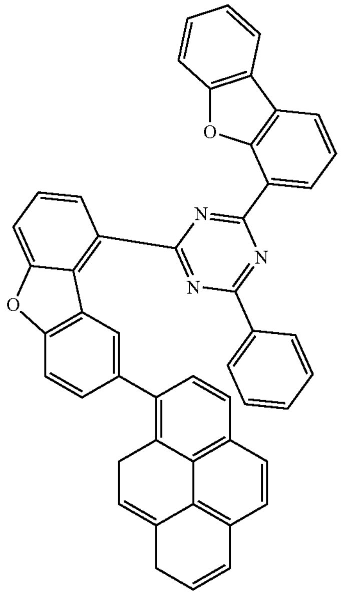
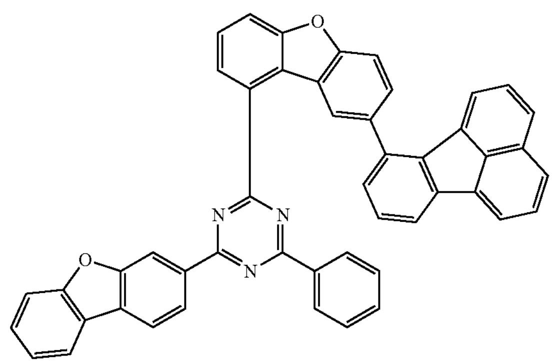
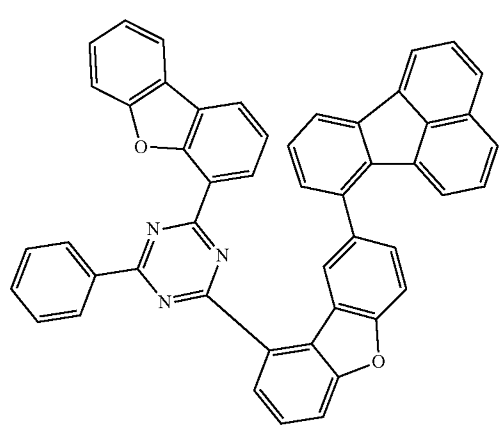

-continued
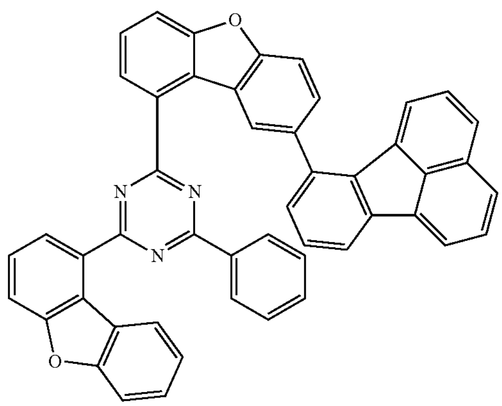
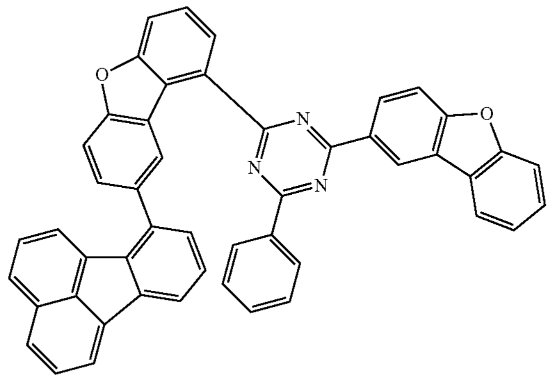
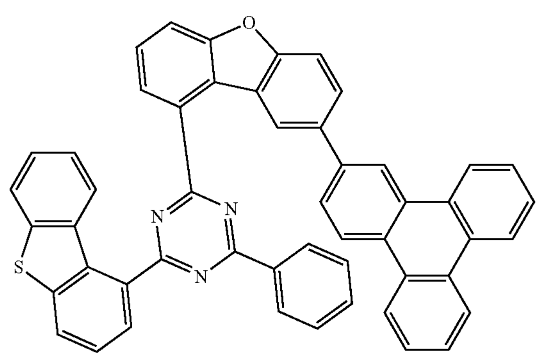
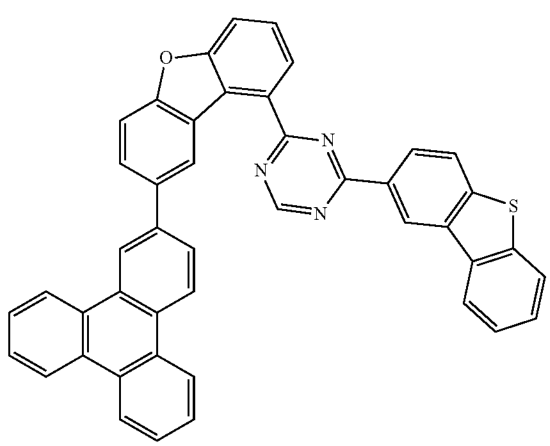
-continued
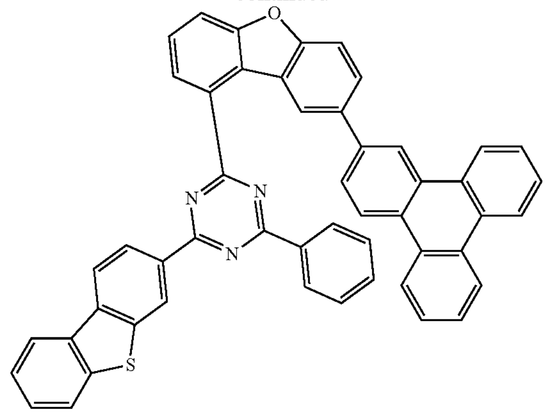
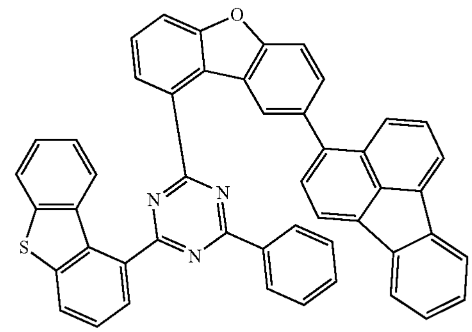
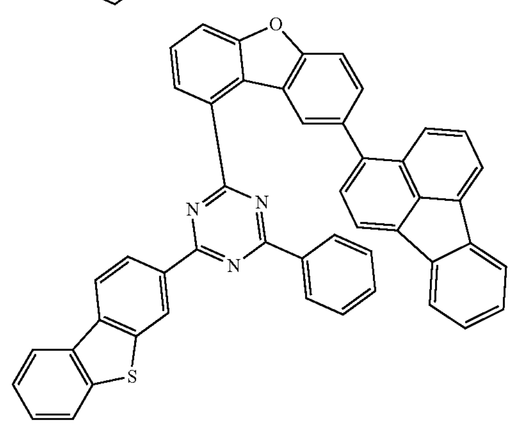
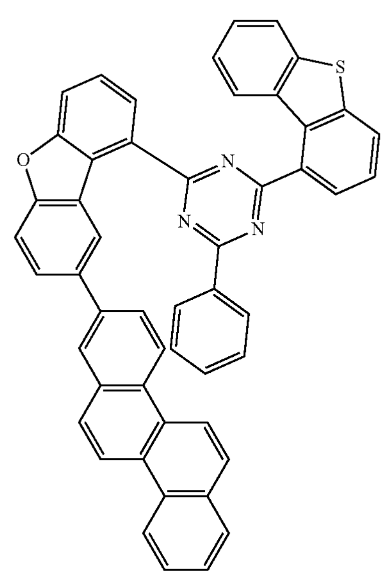

-continued
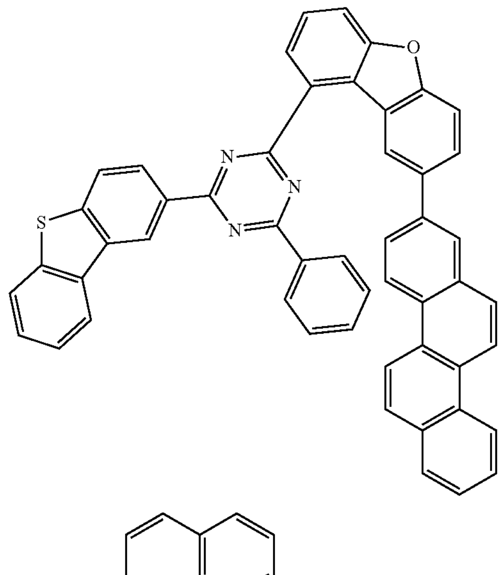
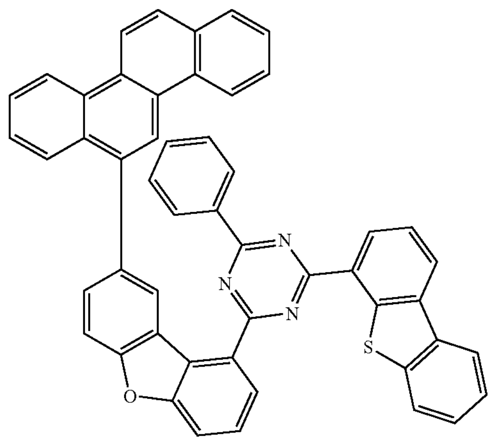
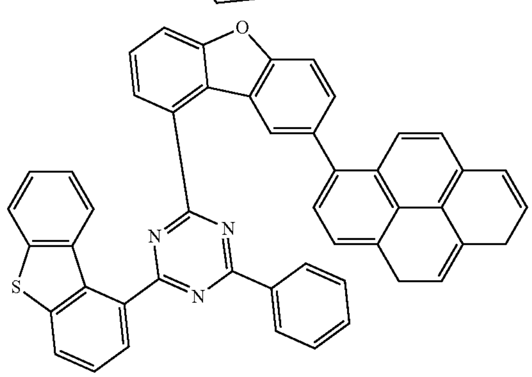
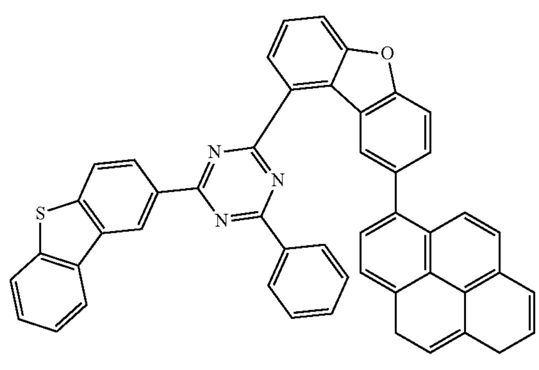
-continued
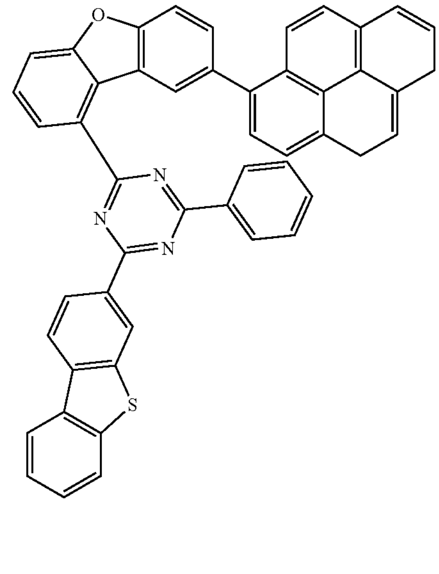
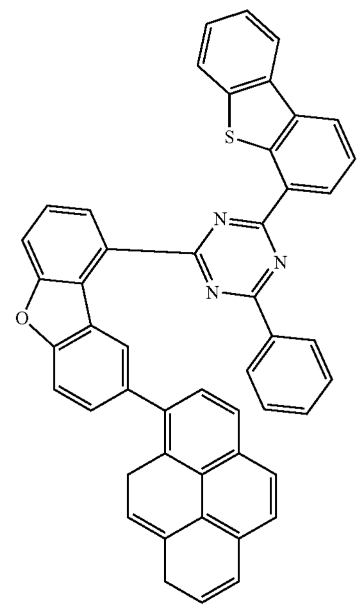
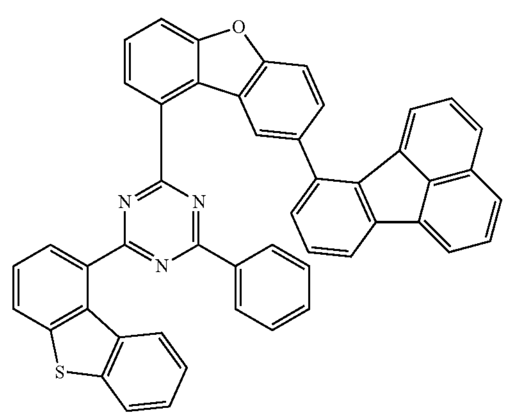

-continued
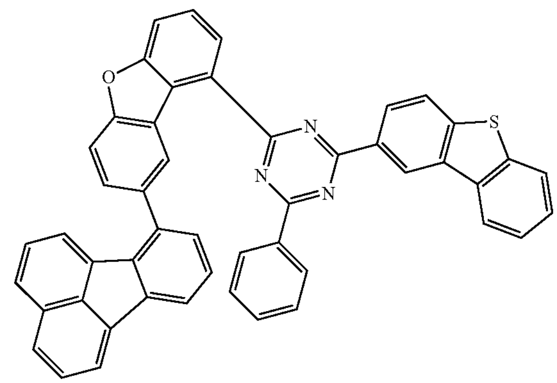
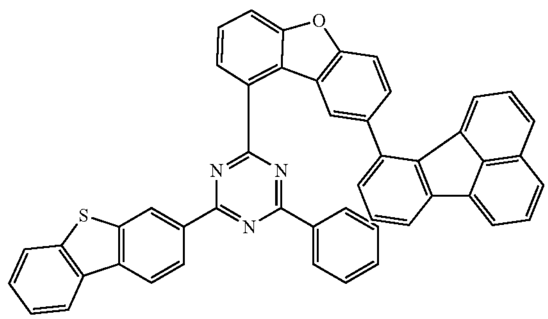
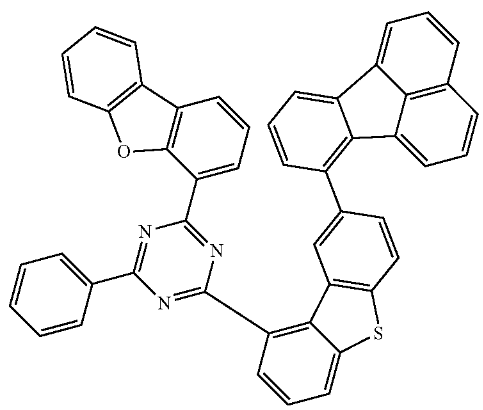
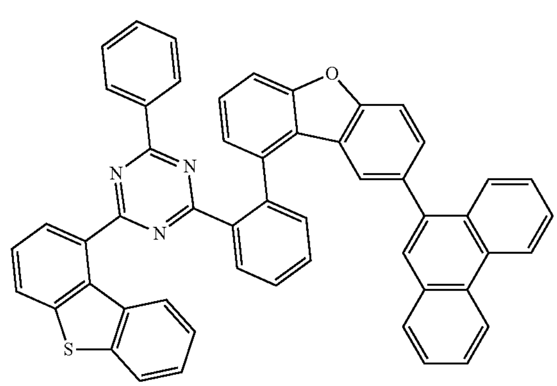
-continued
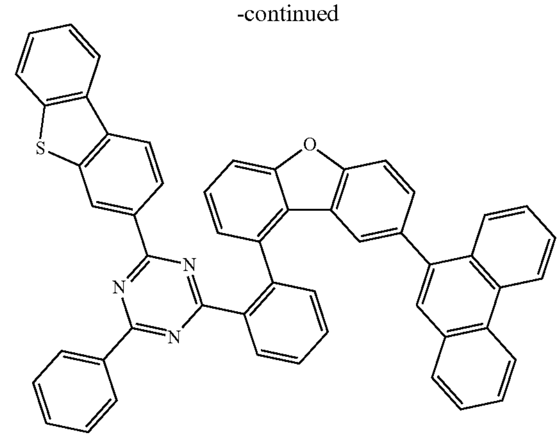
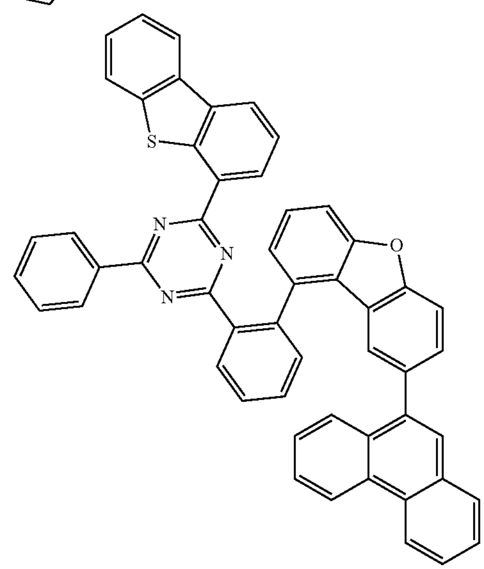
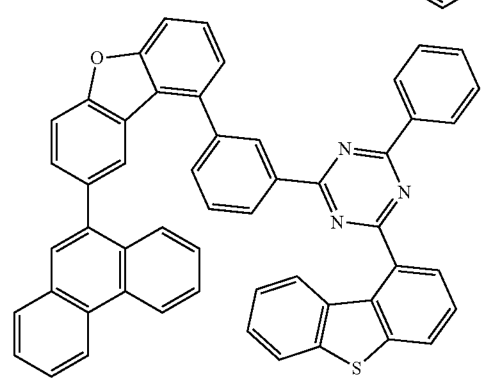
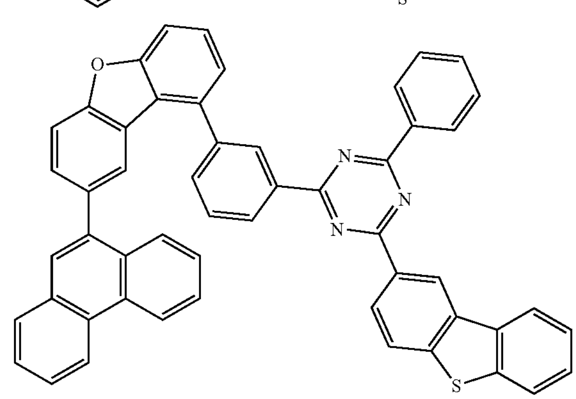

-continued
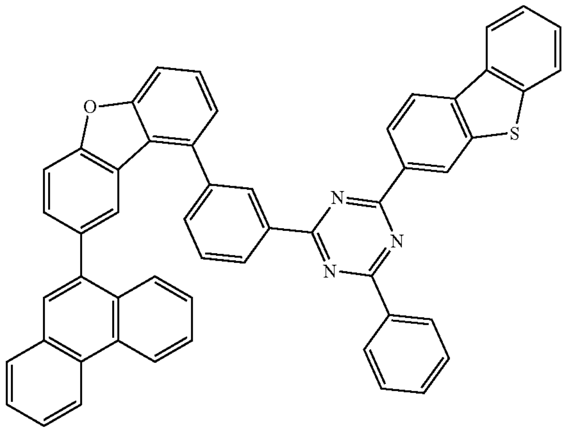
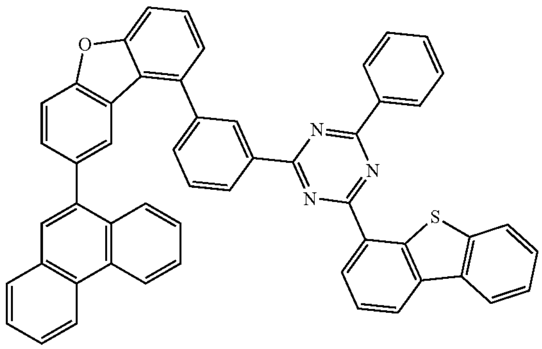
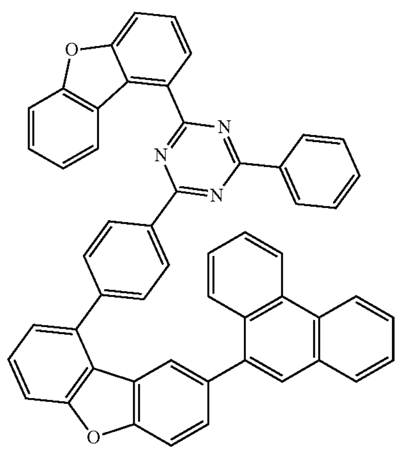
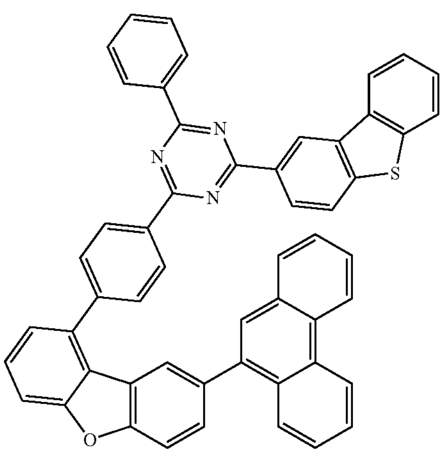
-continued
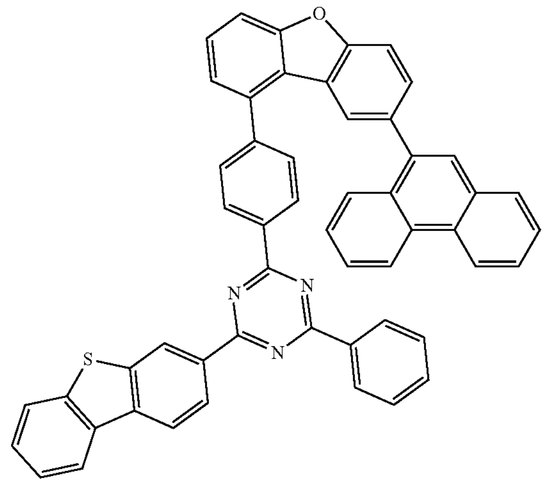
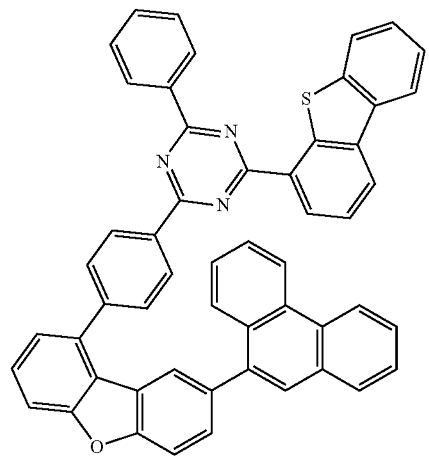
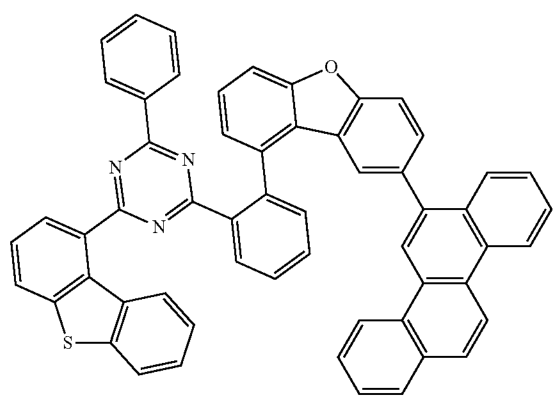
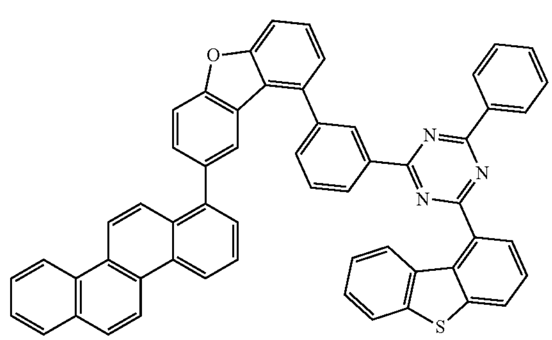

-continued
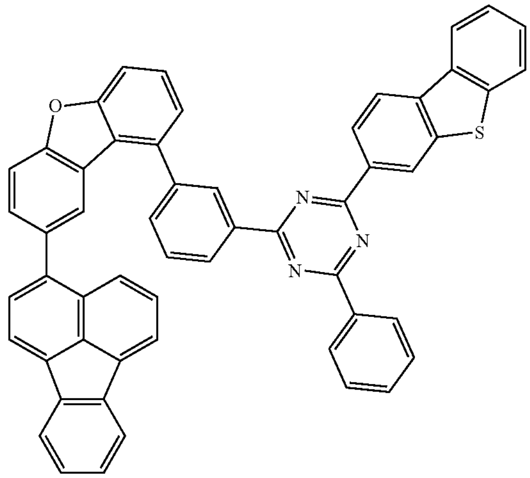
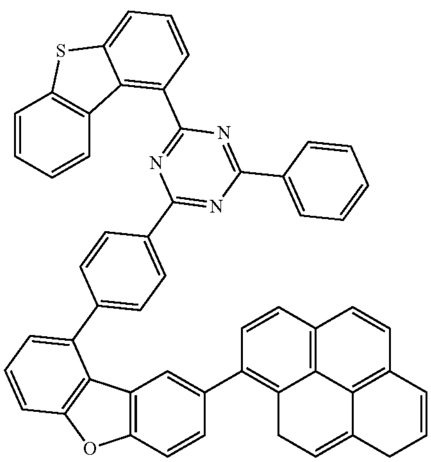
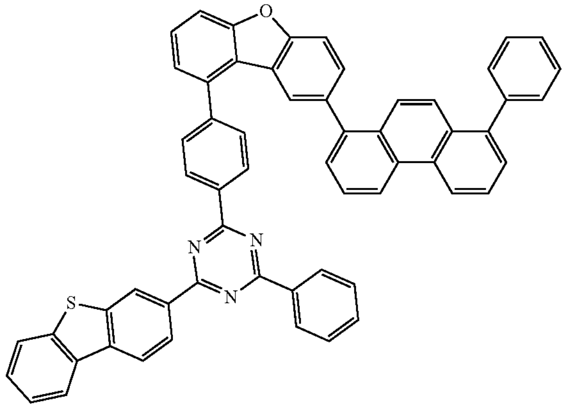
-continued
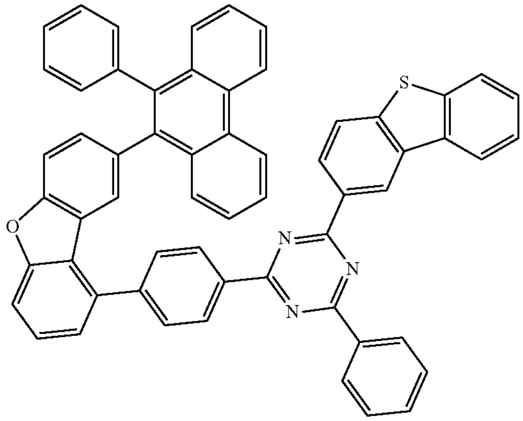
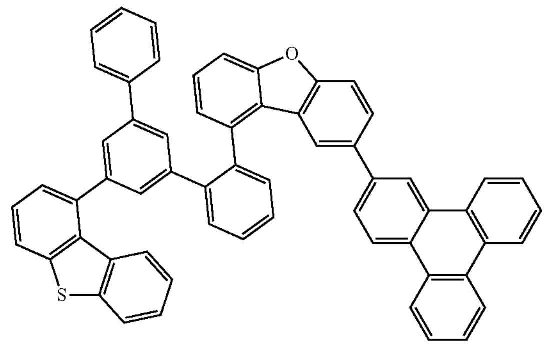
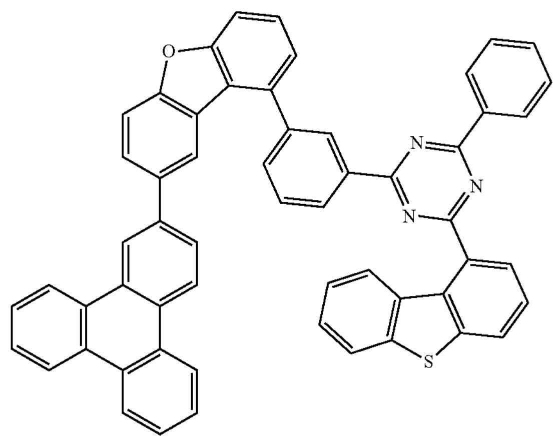
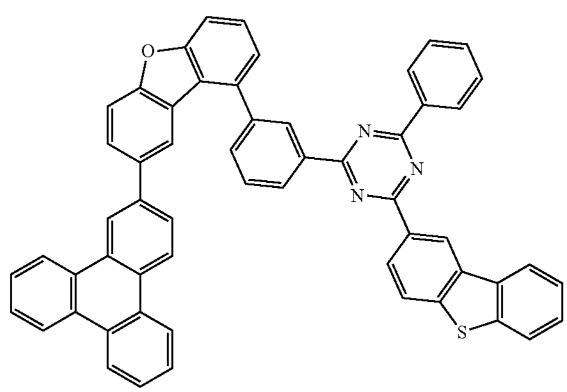

-continued
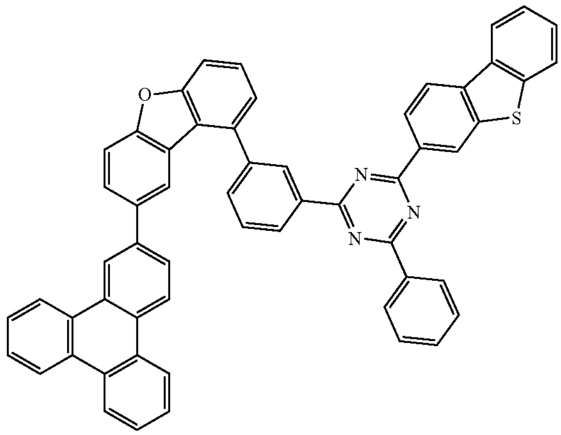 [SMILES: c1ccc(-c2nc(-c3cccc(-c4cccc5oc6ccc(-c7ccc8c9ccccc9c9ccccc9c8c7)cc6c45)c3)nc(-c3ccc4c(c3)sc3ccccc34)n2)cc1]
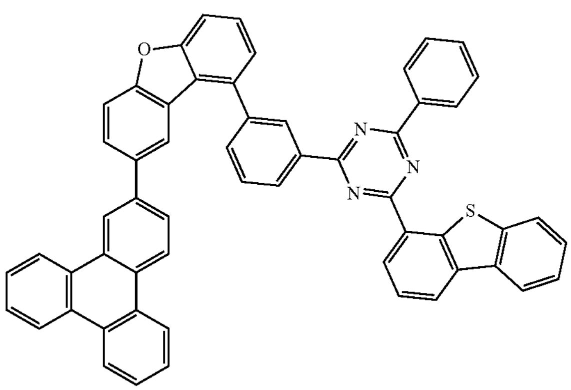
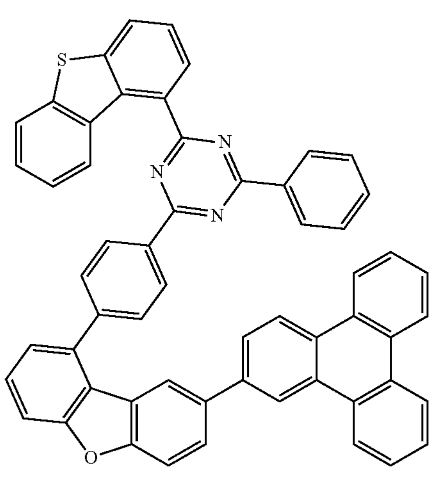
-continued
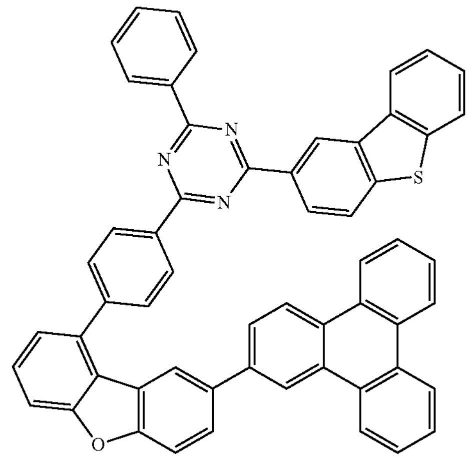
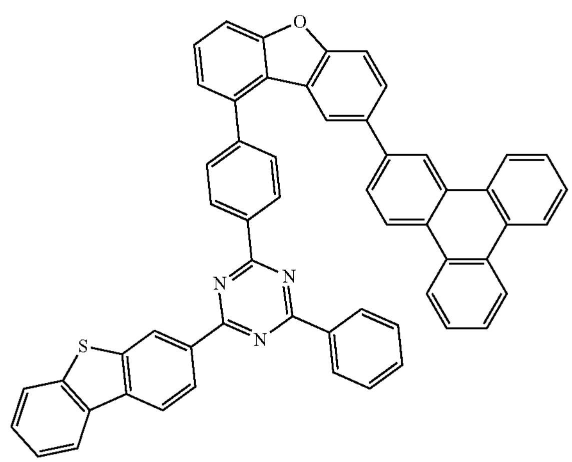
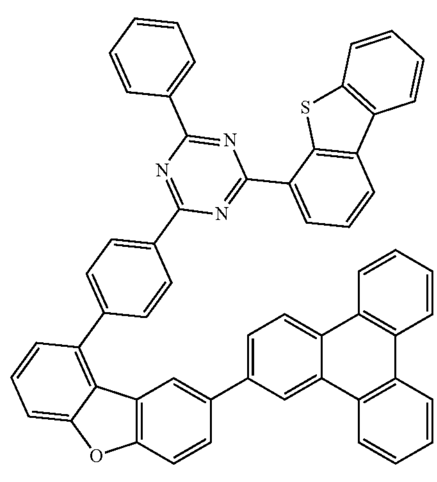

-continued
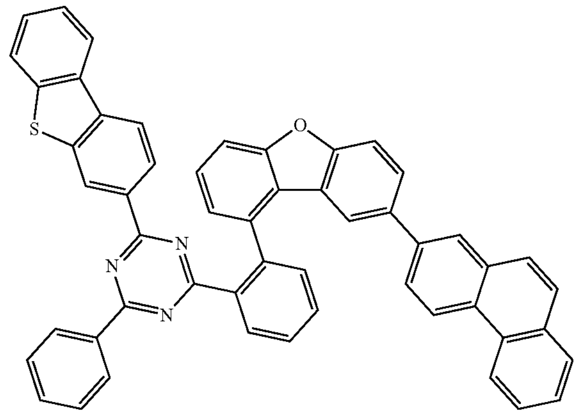
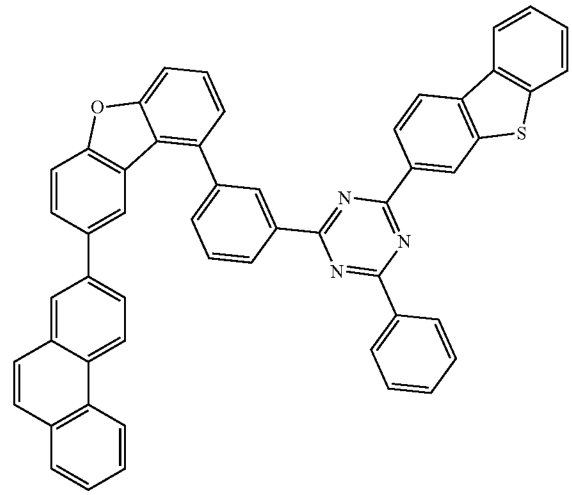
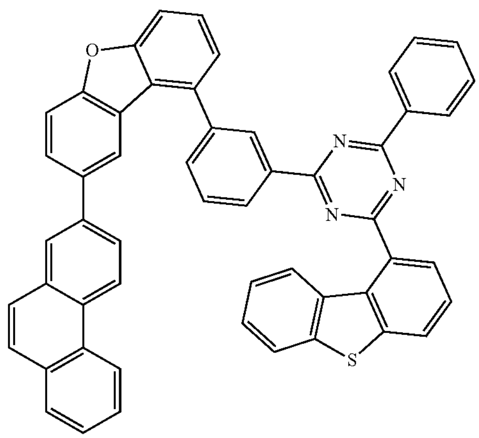
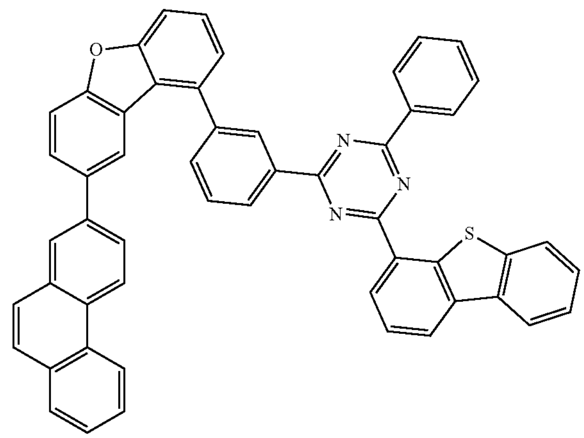
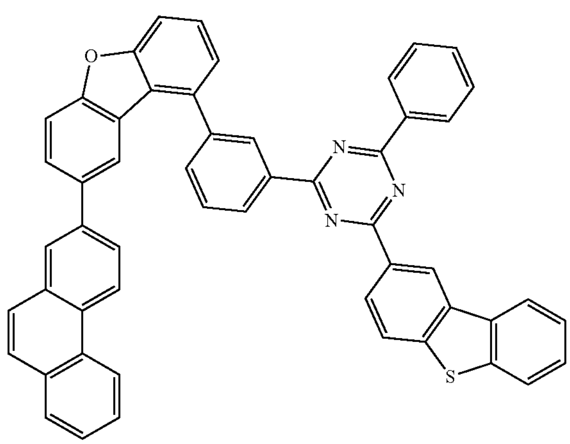
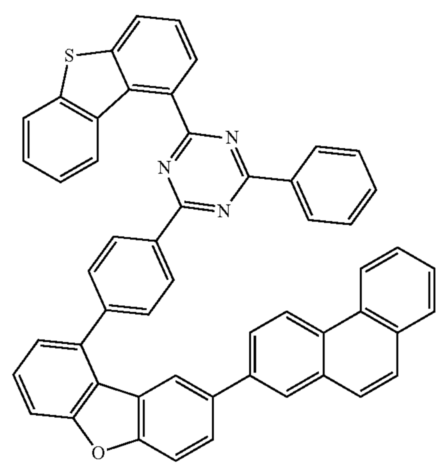

-continued
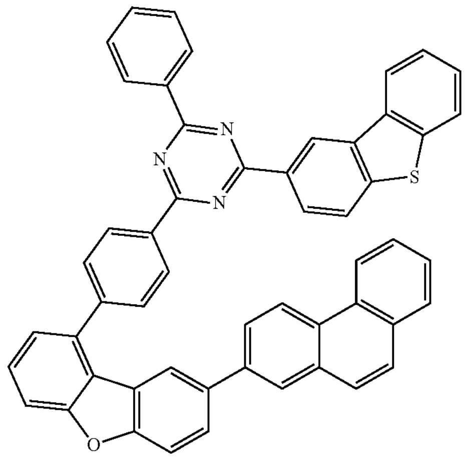 [SMILES: c1ccc(-c2nc(-c3ccc(-c4cccc5oc6ccc(-c7ccc8c(ccc9ccccc98)c7)cc6c45)cc3)nc(-c3ccc4sc5ccccc5c4c3)n2)cc1]
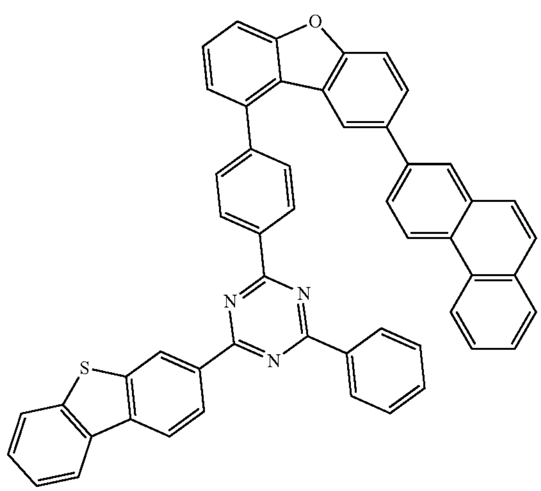 [SMILES: c1ccc(-c2nc(-c3ccc(-c4cccc5oc6ccc(-c7ccc8c(ccc9ccccc98)c7)cc6c45)cc3)nc(-c3ccc4c(c3)sc3ccccc34)n2)cc1]
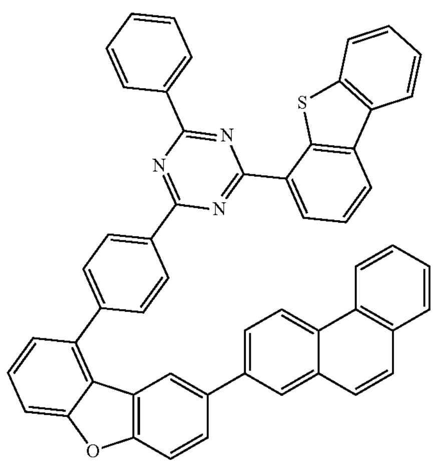
-continued
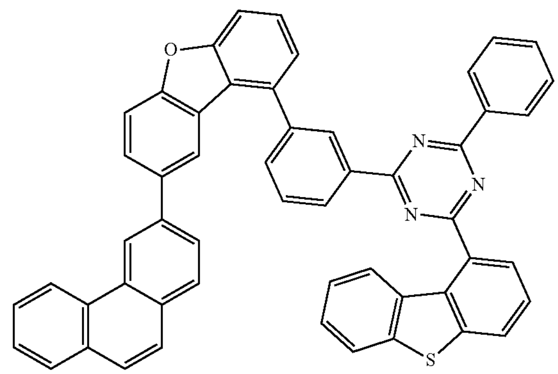
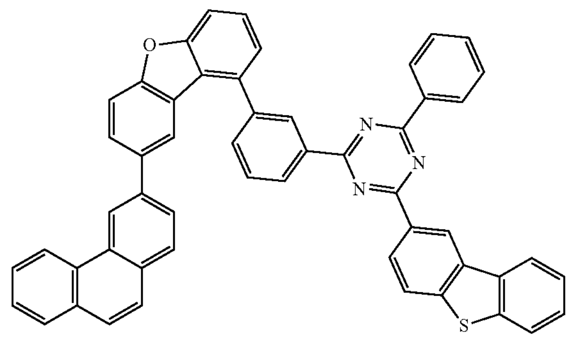
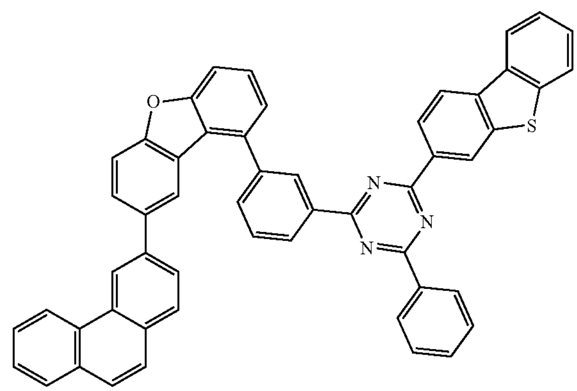
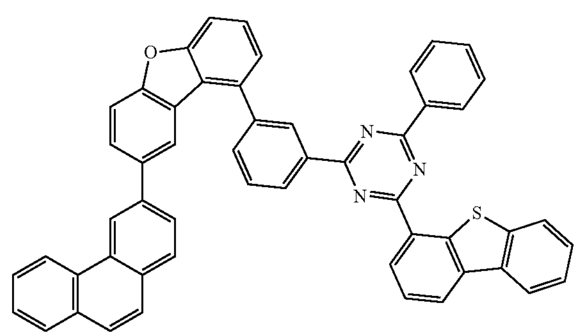

-continued
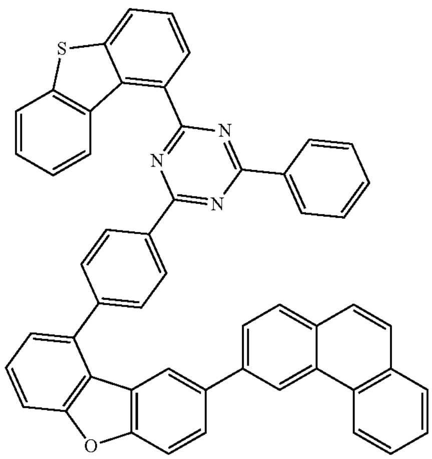
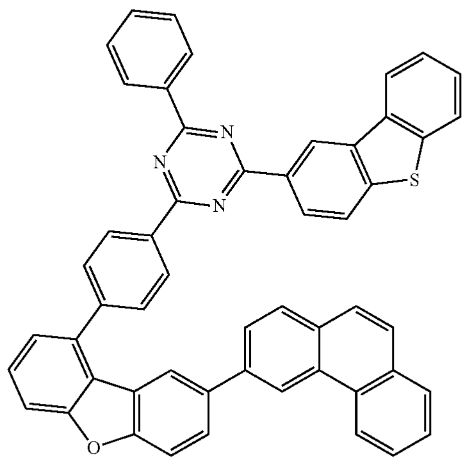
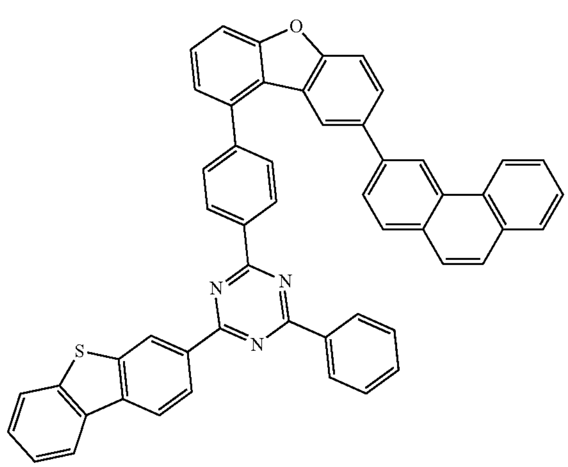
-continued
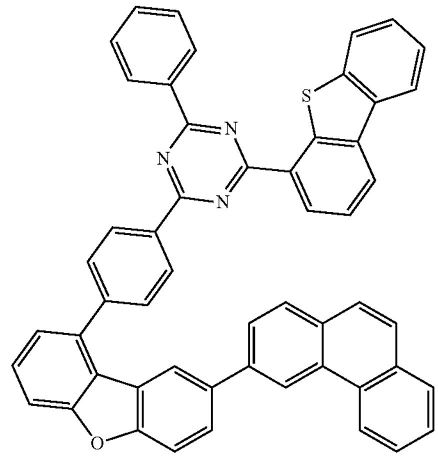
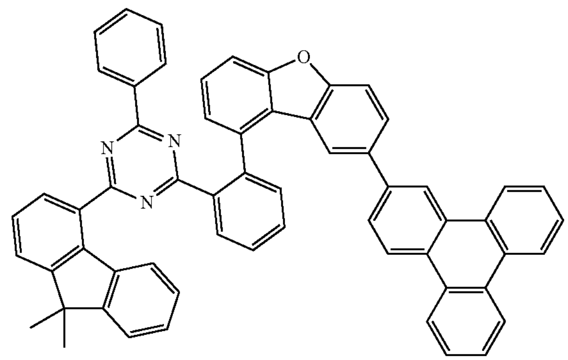
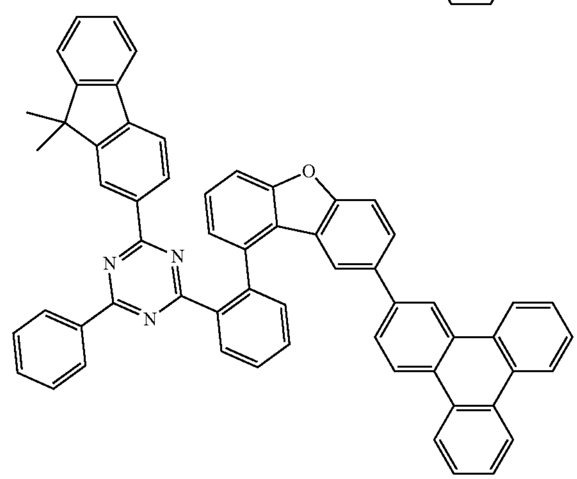
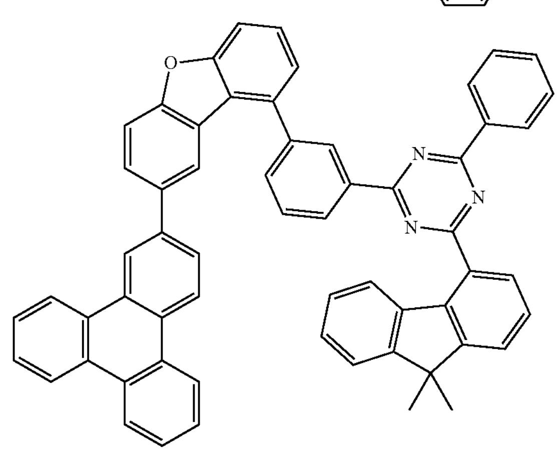

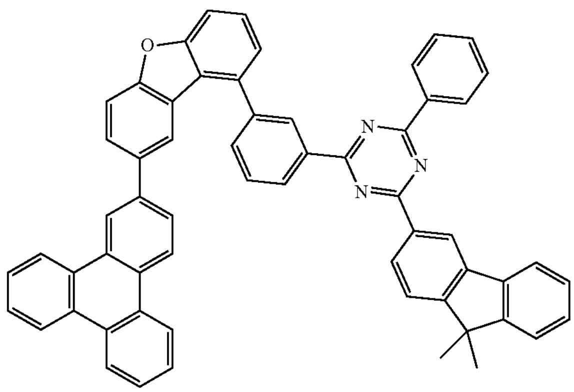
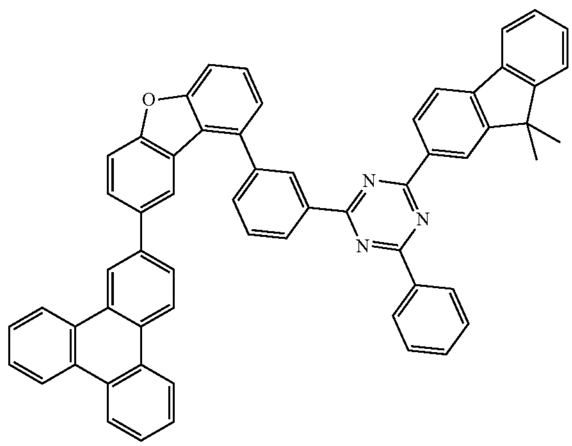
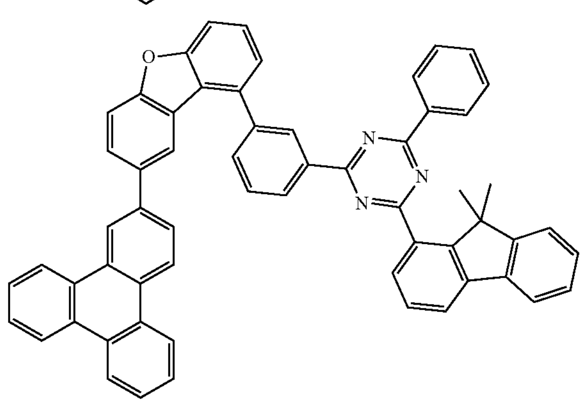
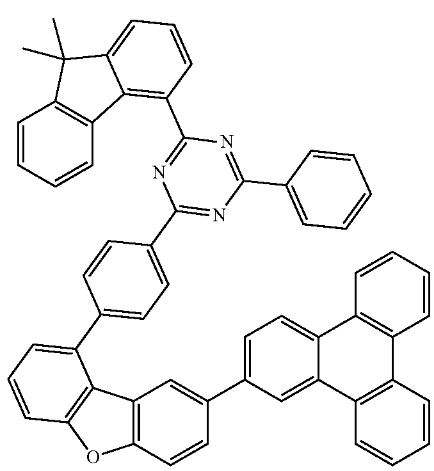
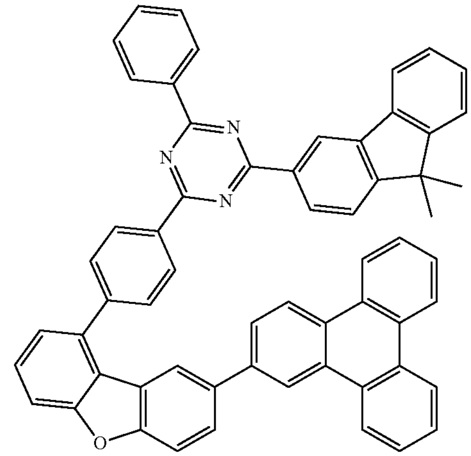
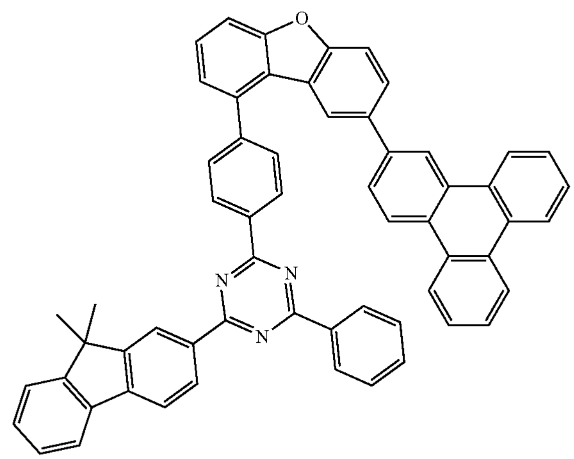
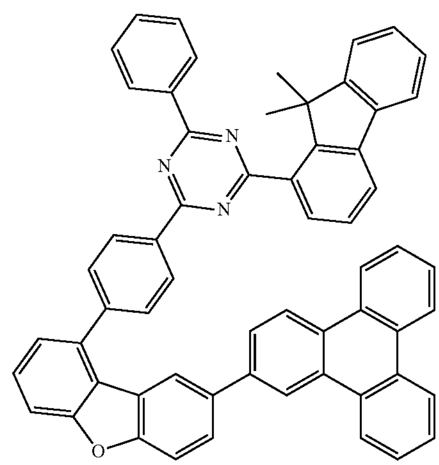
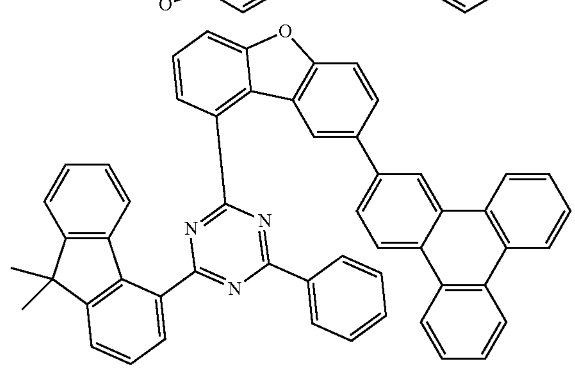

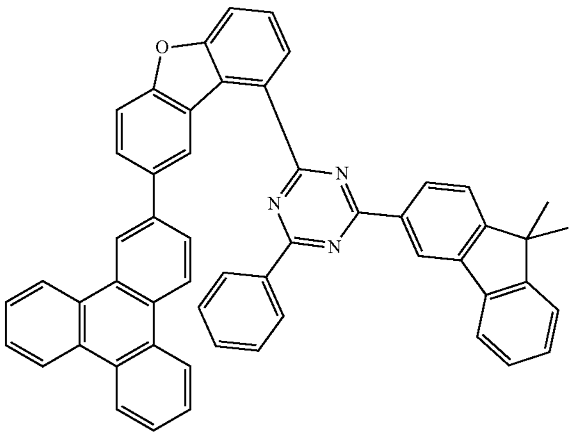
O
N
N
N
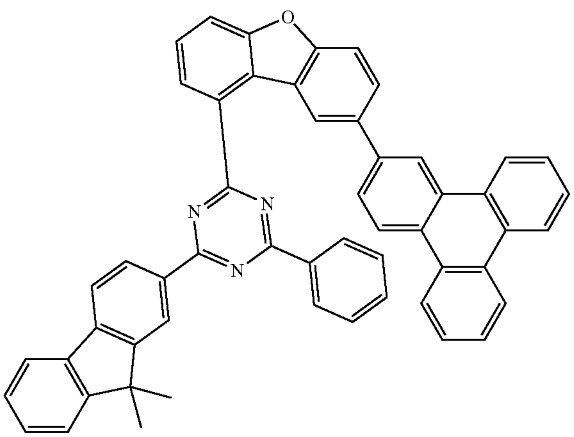
O
N
N
N
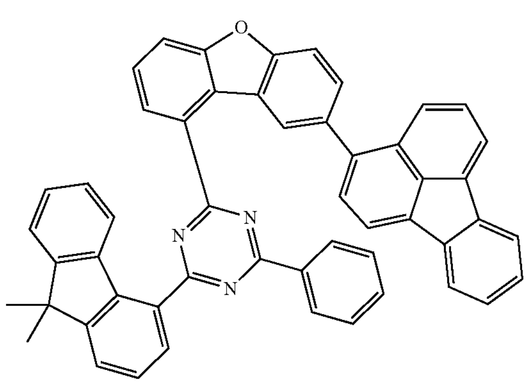
O
N
N
N
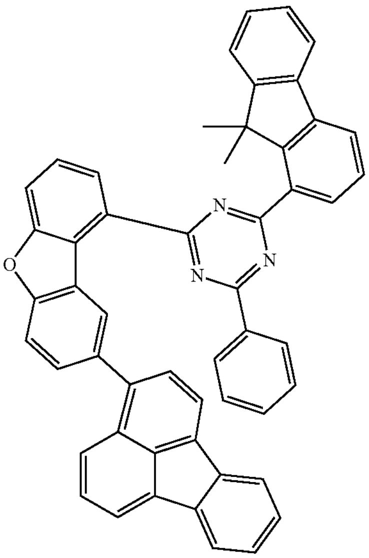
O
N
N
N
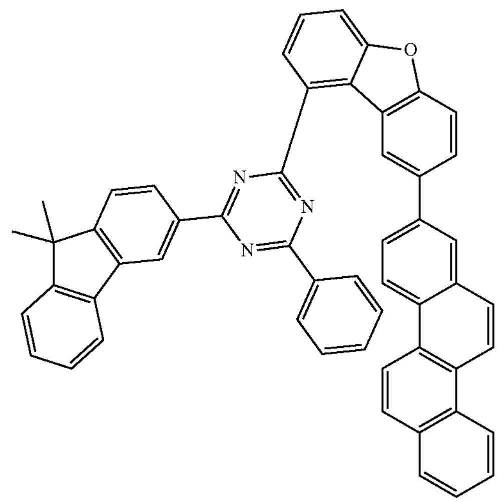
O
N
N
N
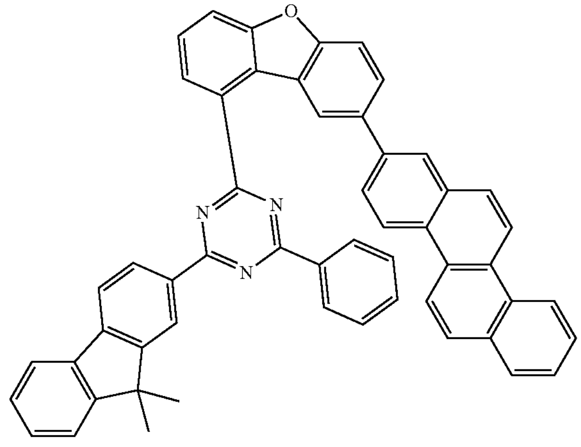
O
N
N
N -continued
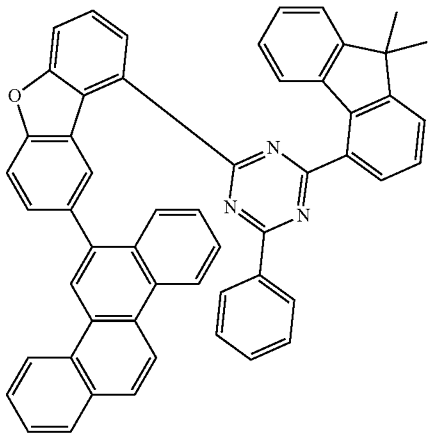
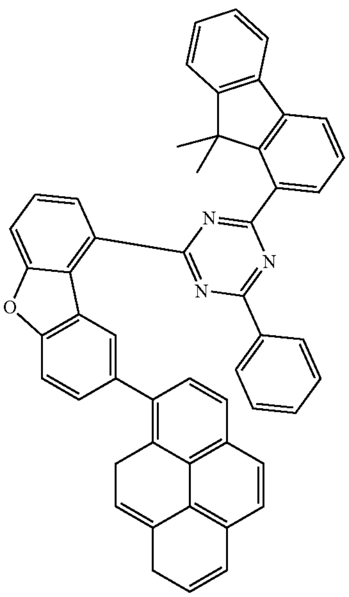
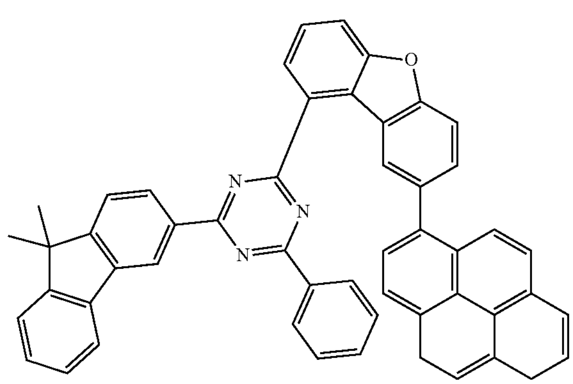
-continued
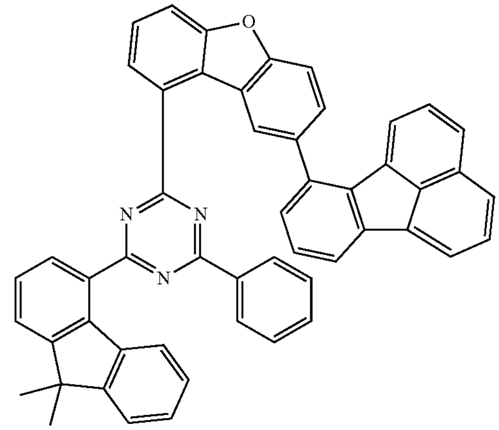
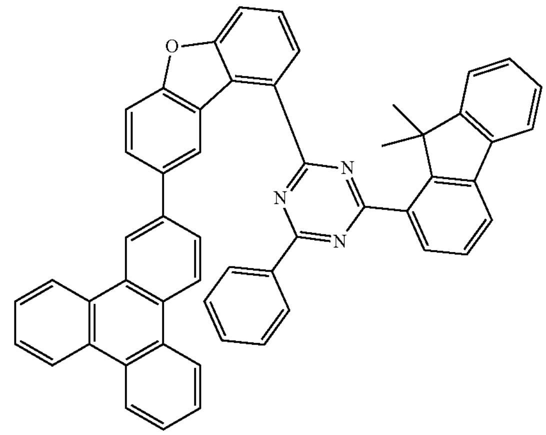
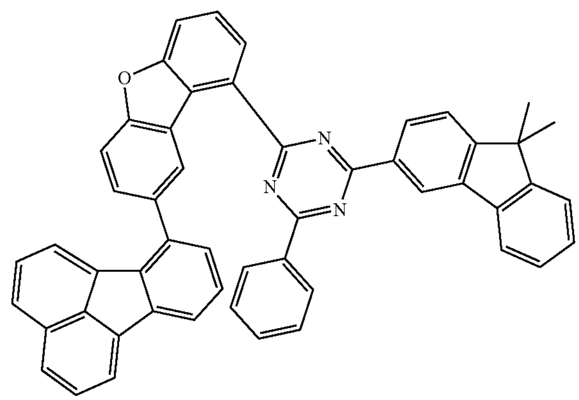
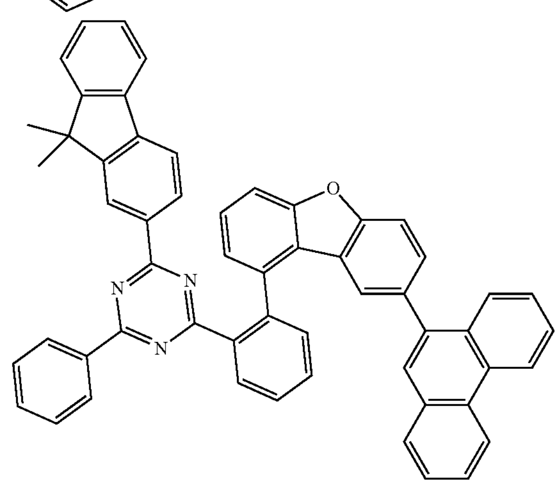

-continued
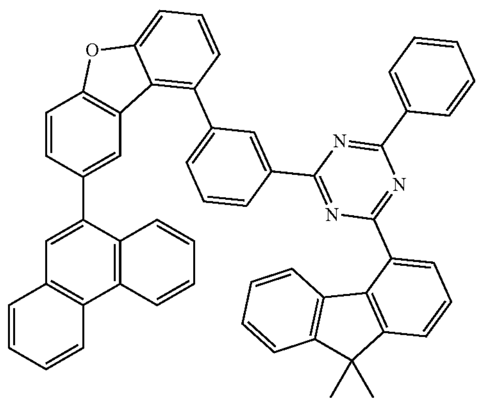
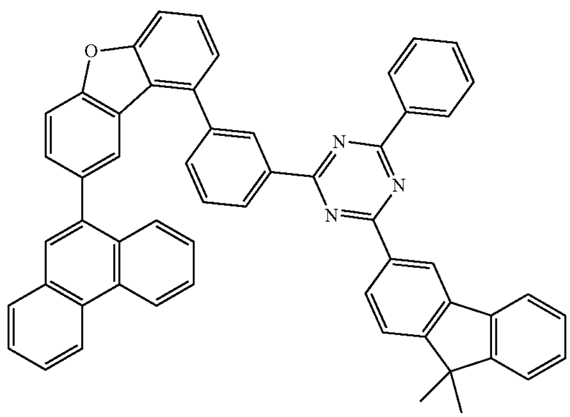
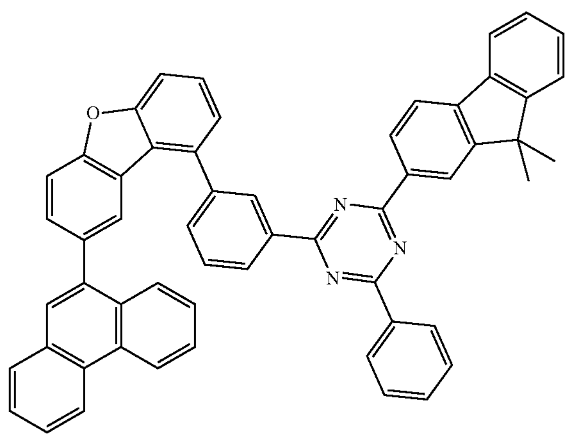
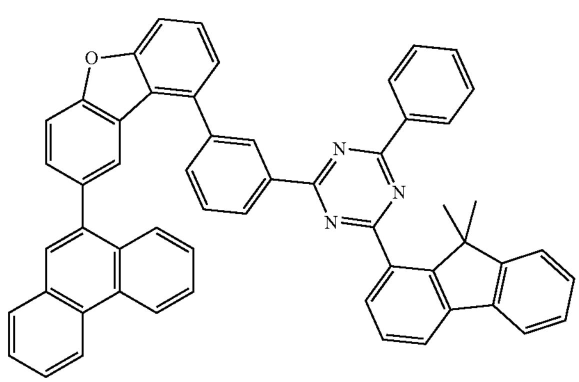
-continued
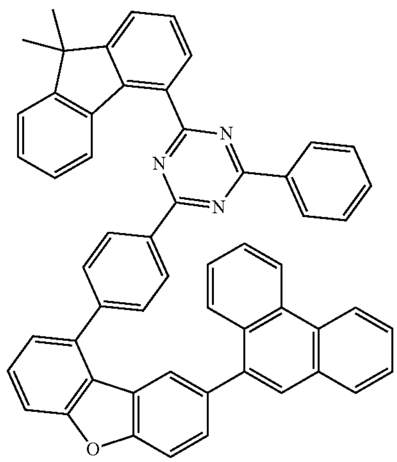
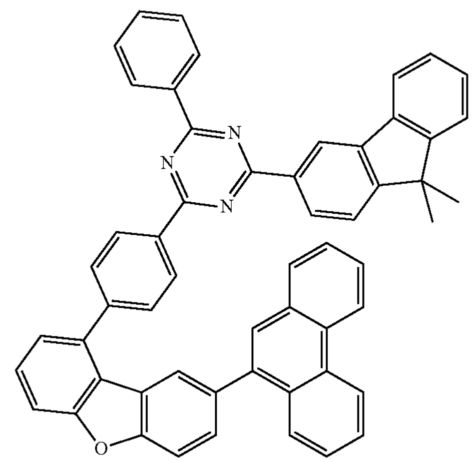
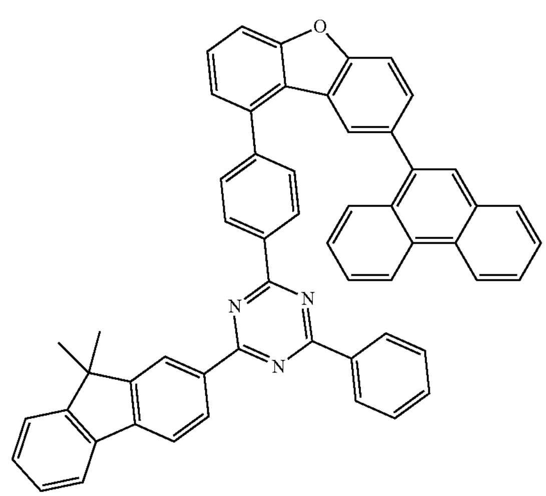

-continued
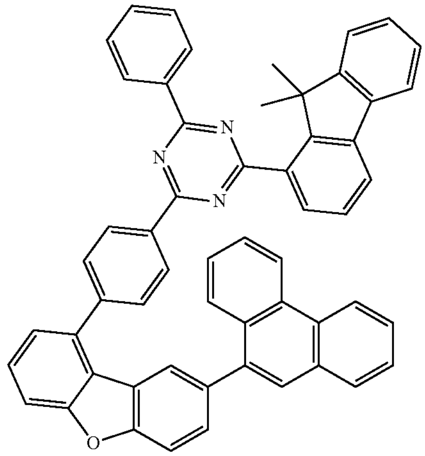
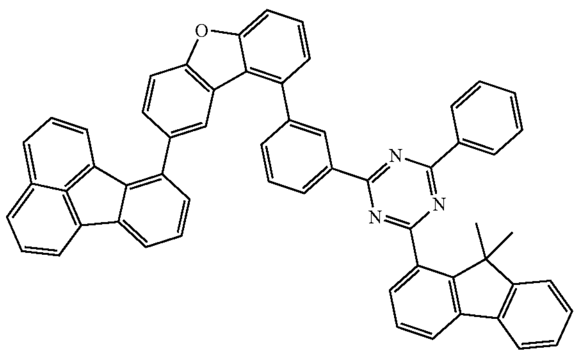
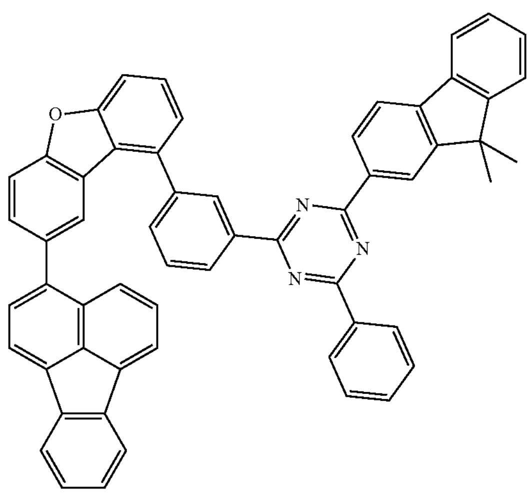
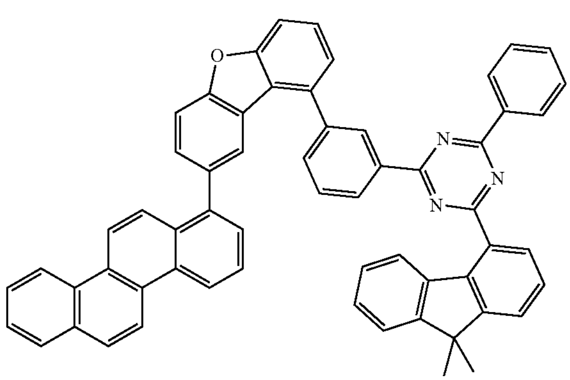
-continued
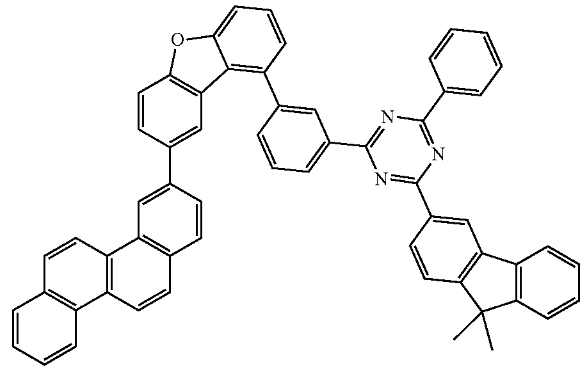
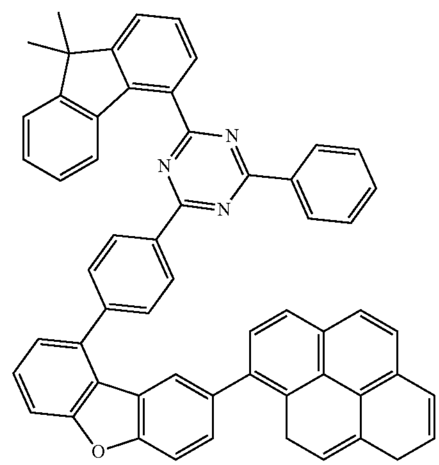
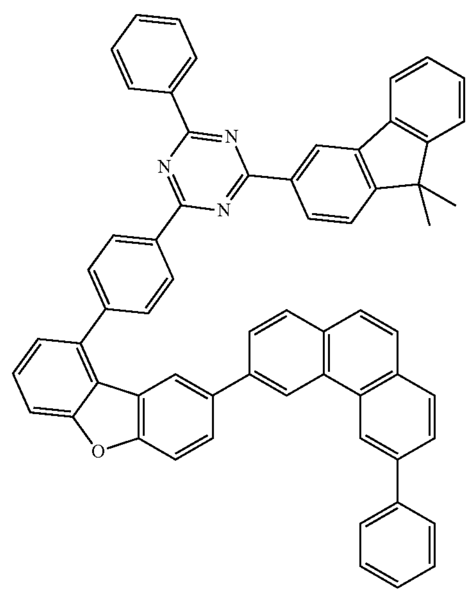

-continued
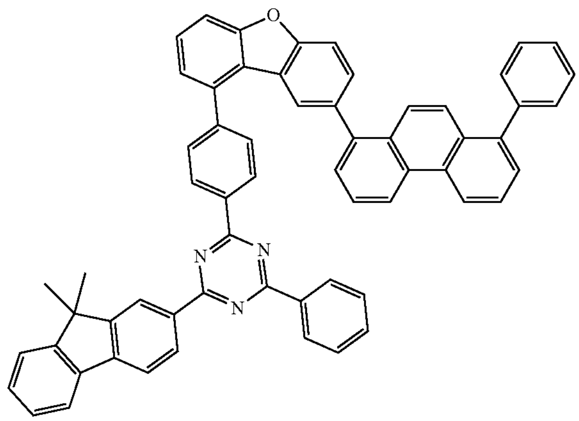
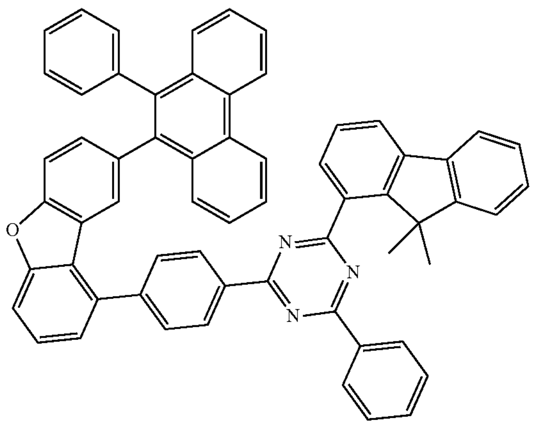
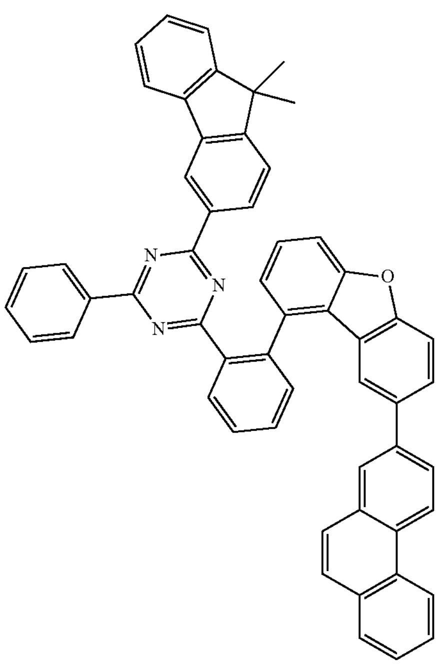
-continued
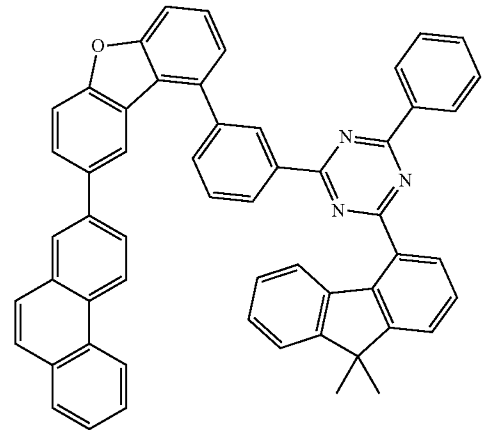
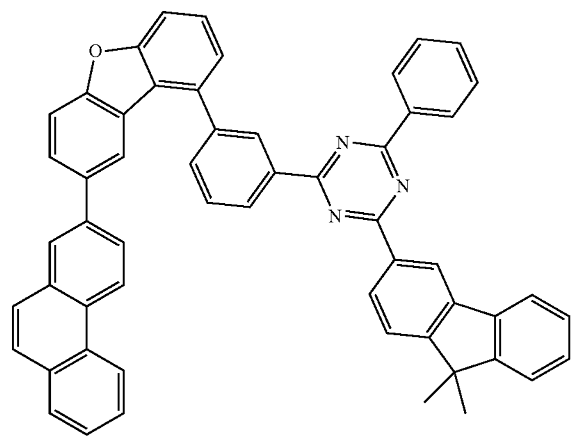
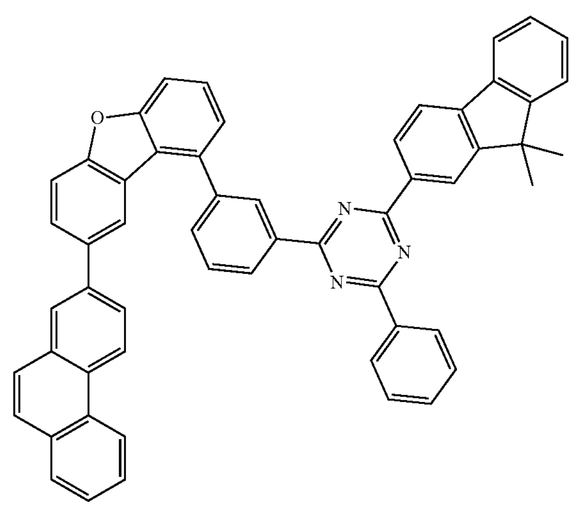

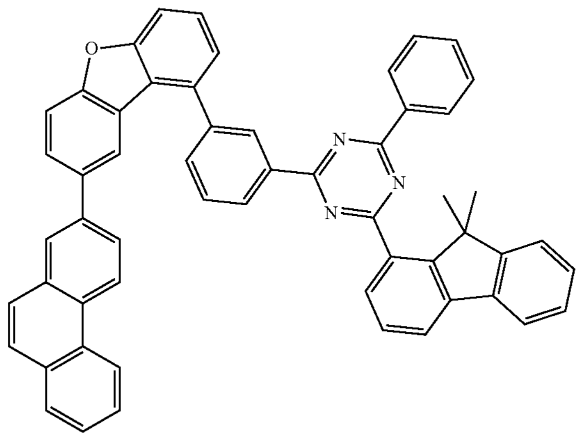
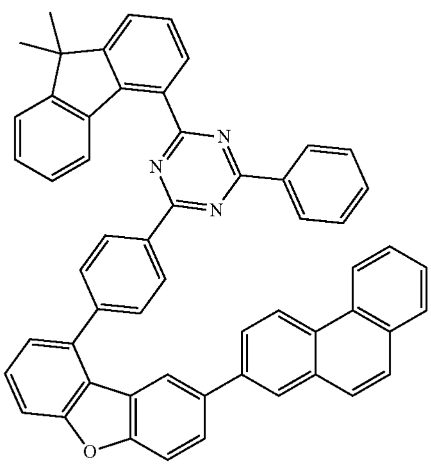
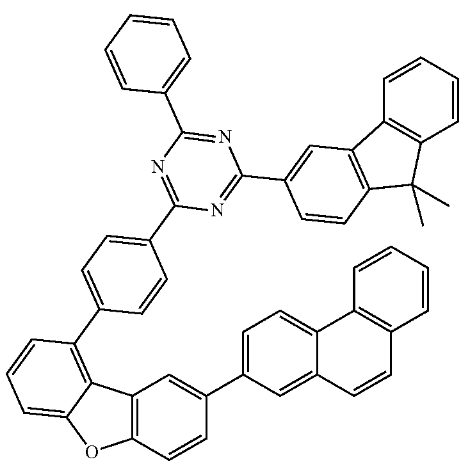
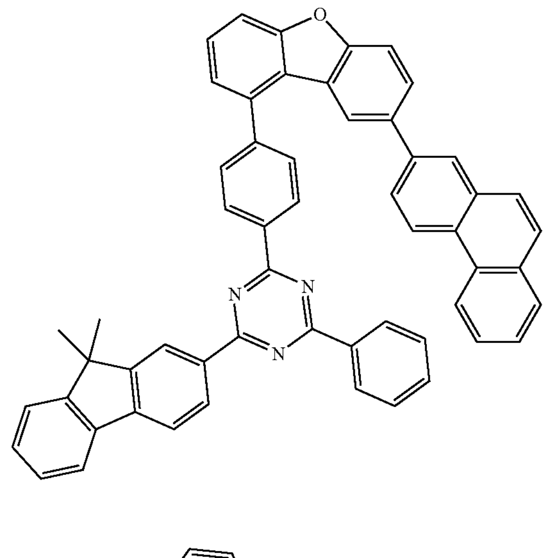
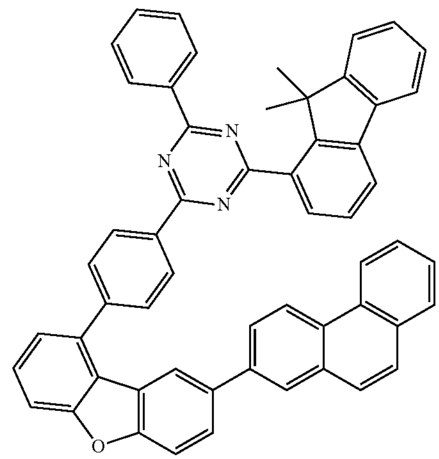
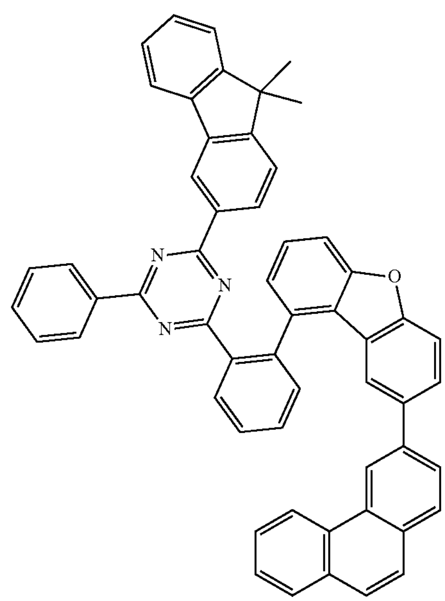

-continued
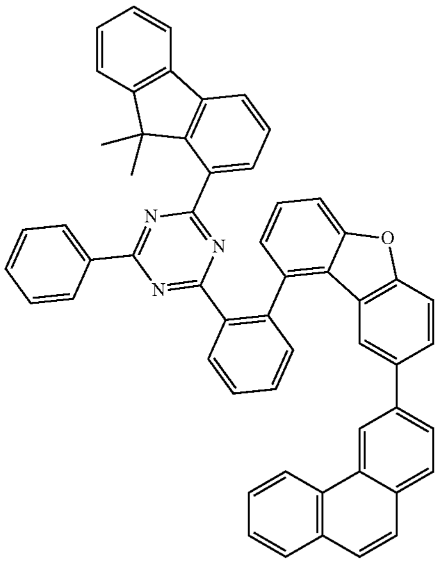
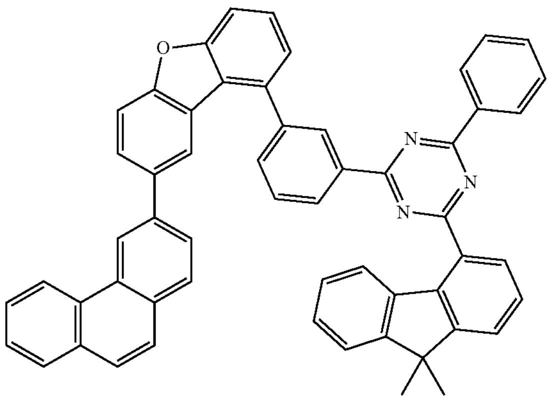
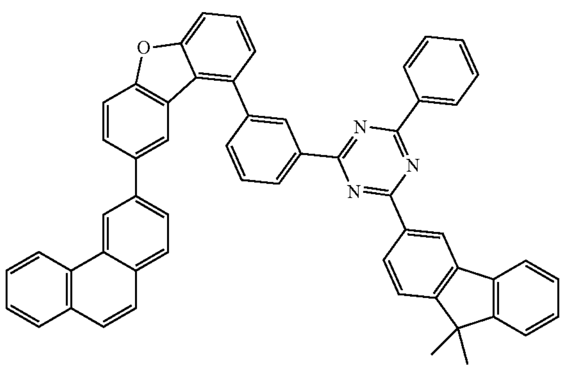
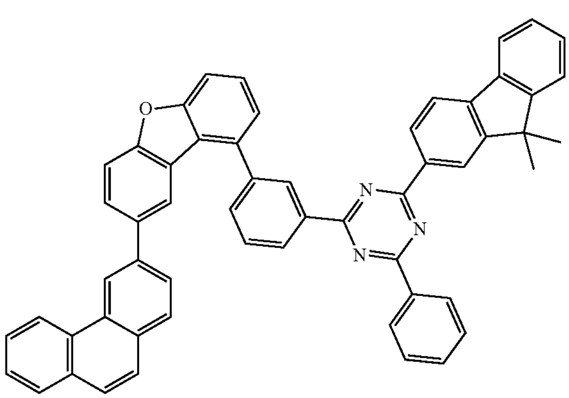
-continued
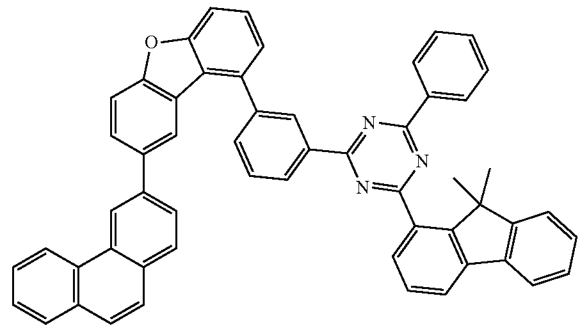
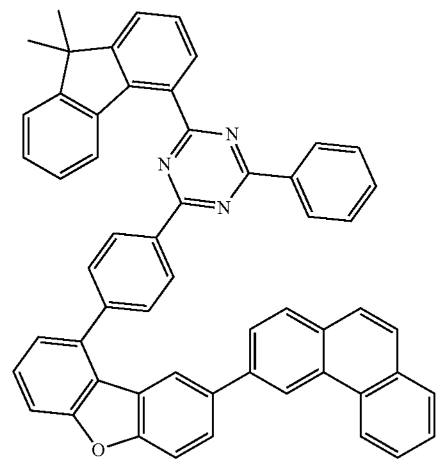
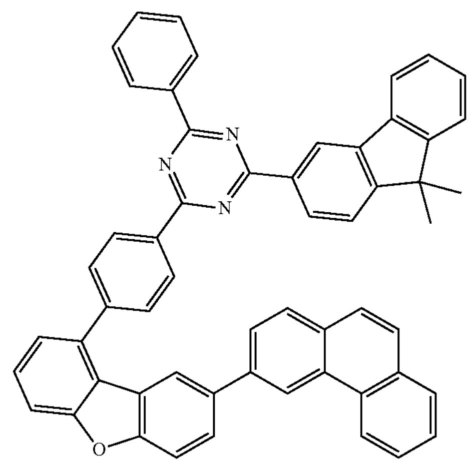
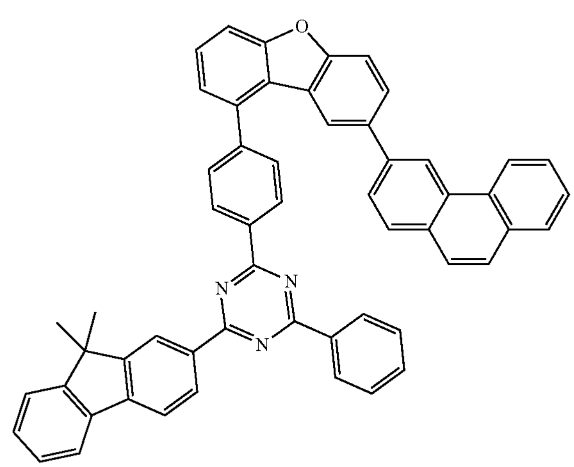

-continued
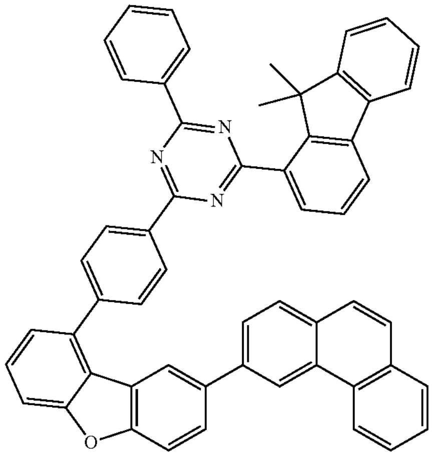
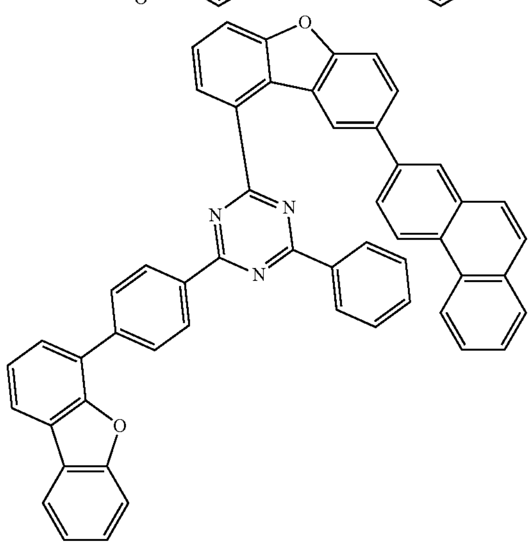
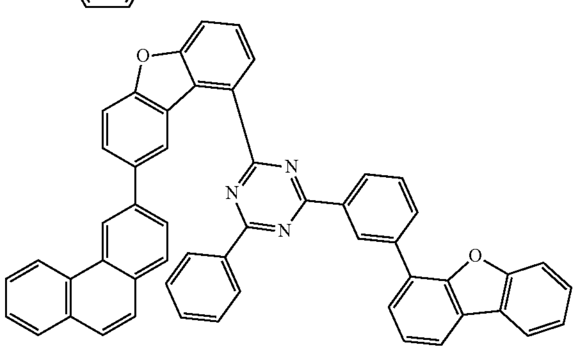
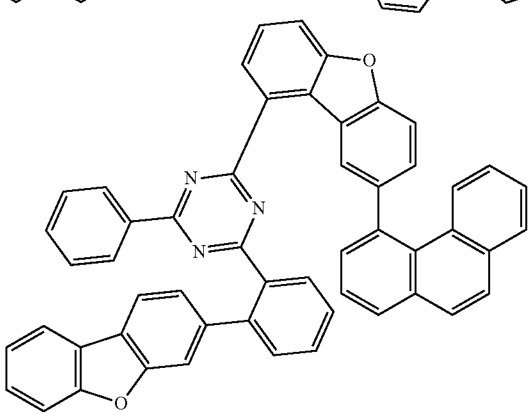
-continued
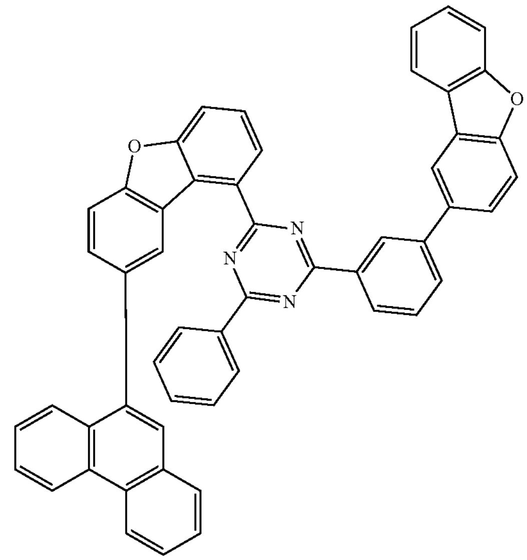
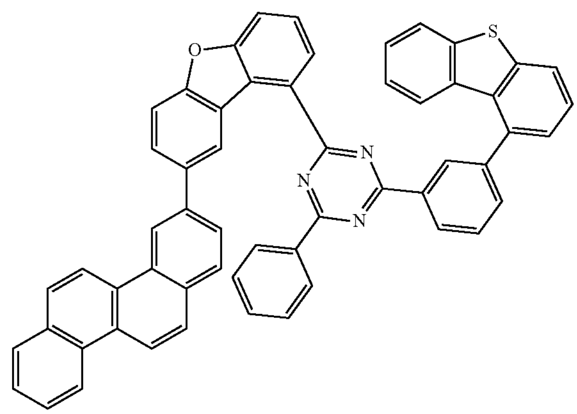
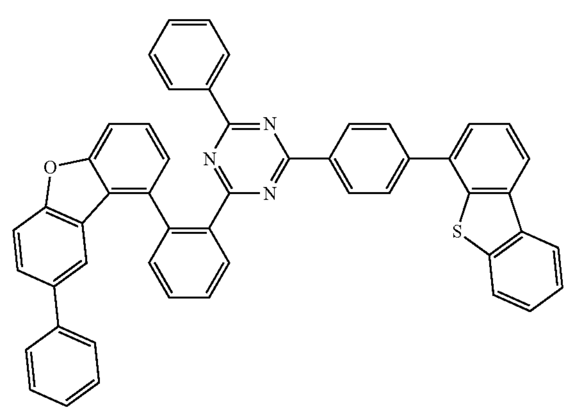

-continued
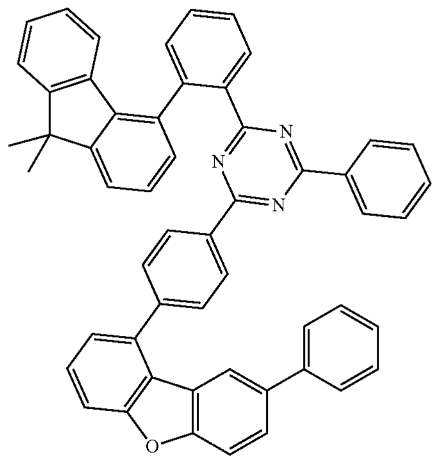
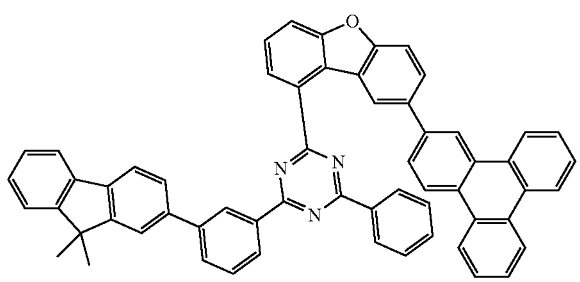
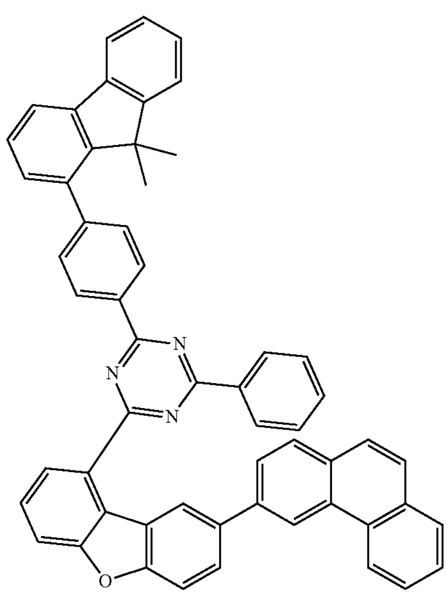
-continued
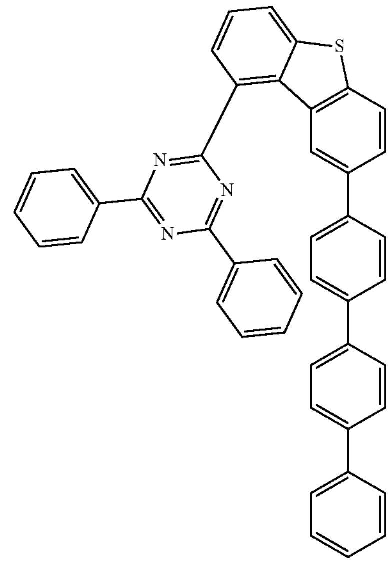
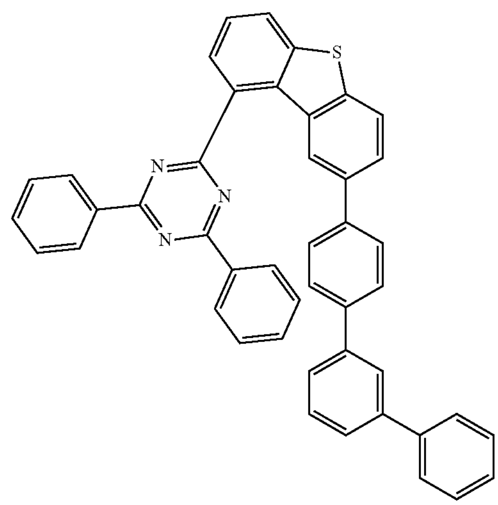
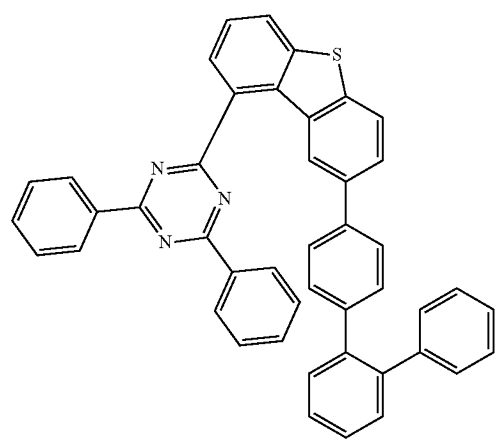

-continued
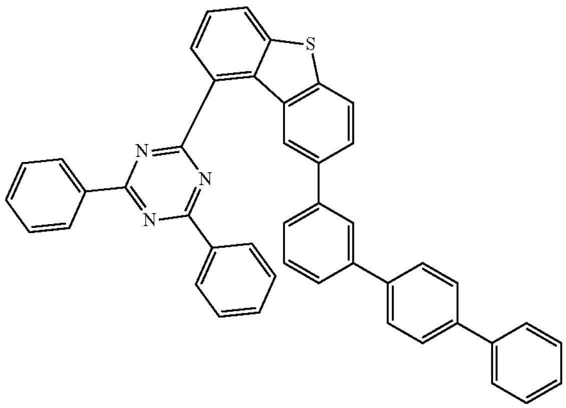
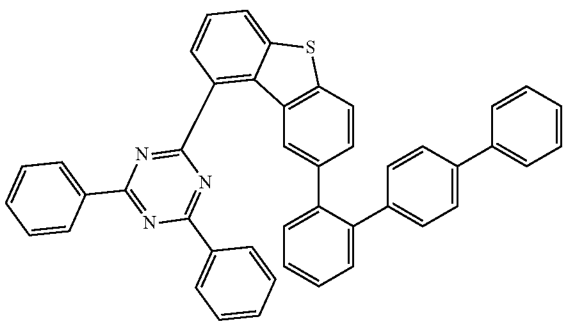
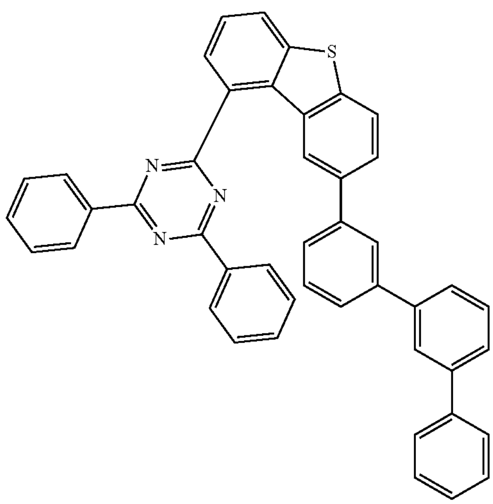
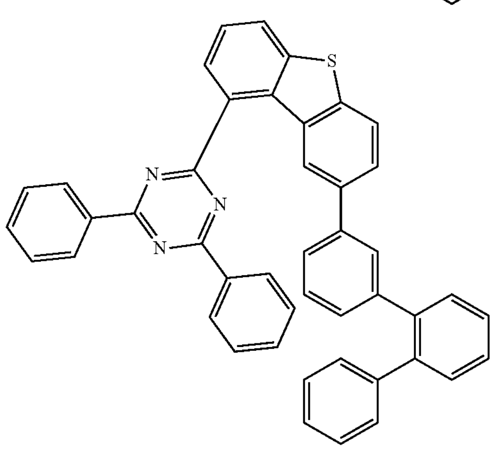
-continued
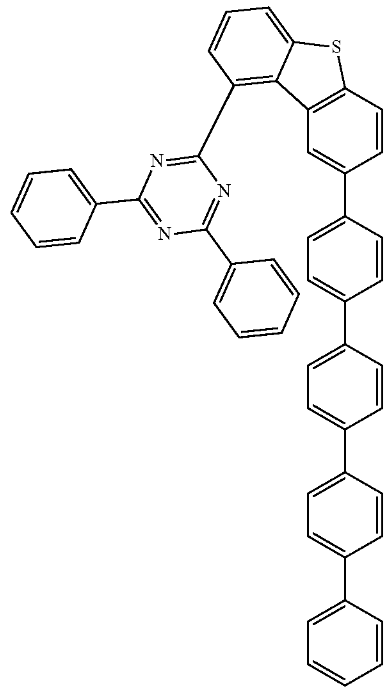
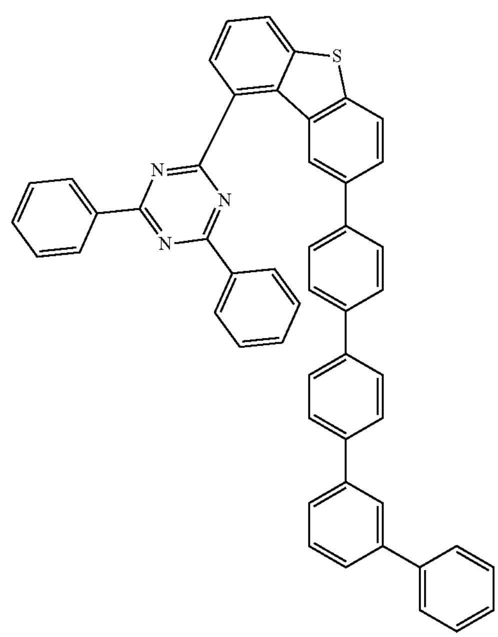

-continued
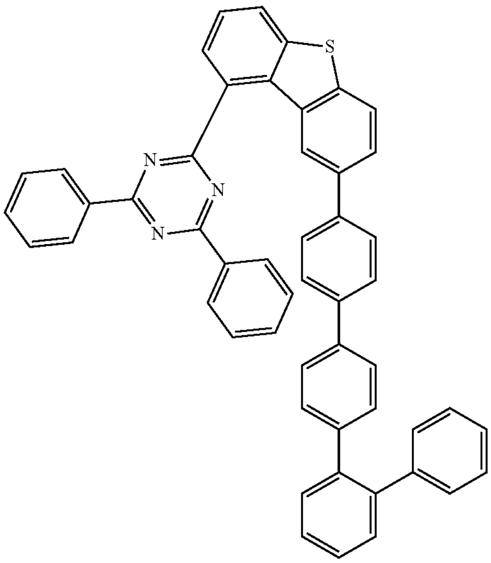
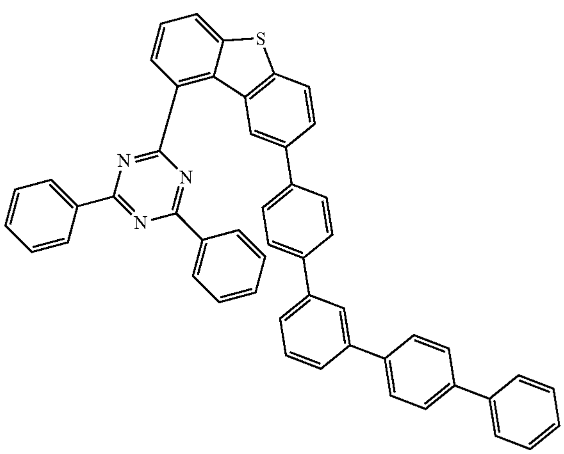
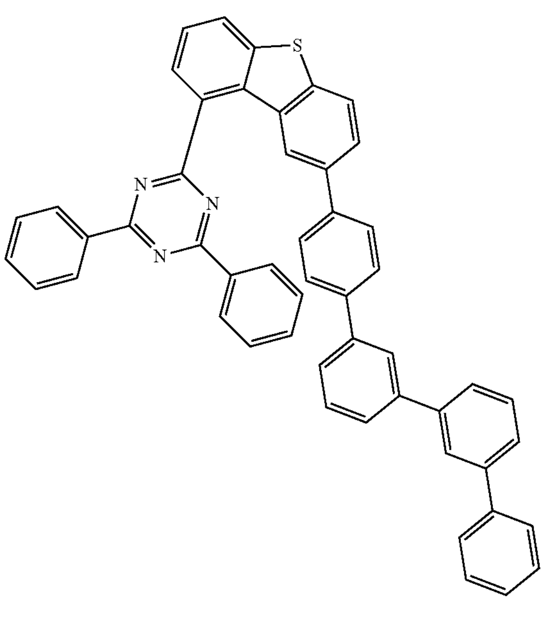
-continued
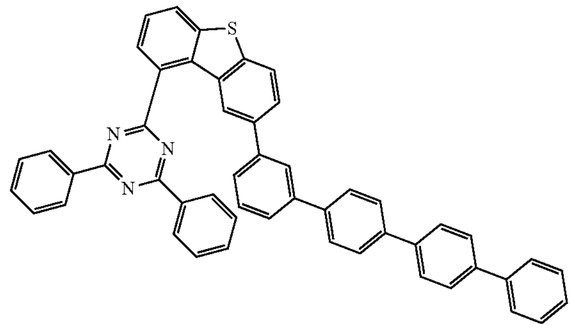
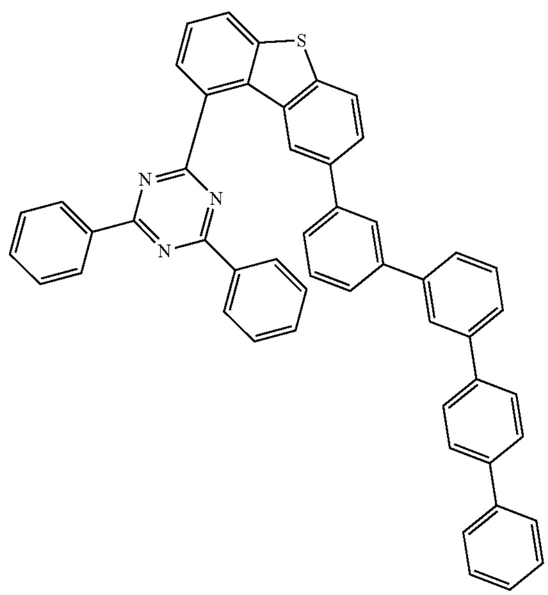
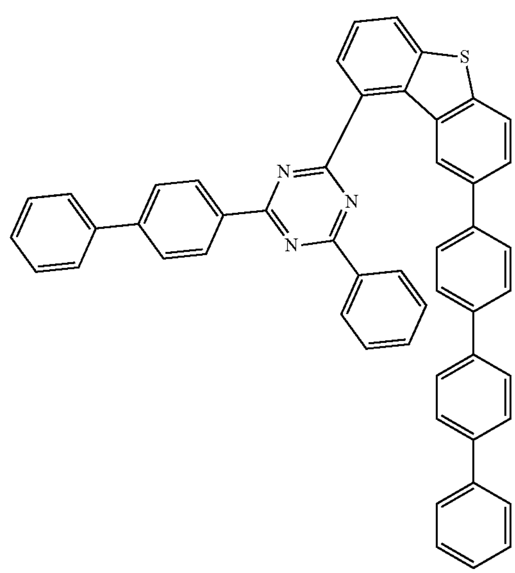

-continued
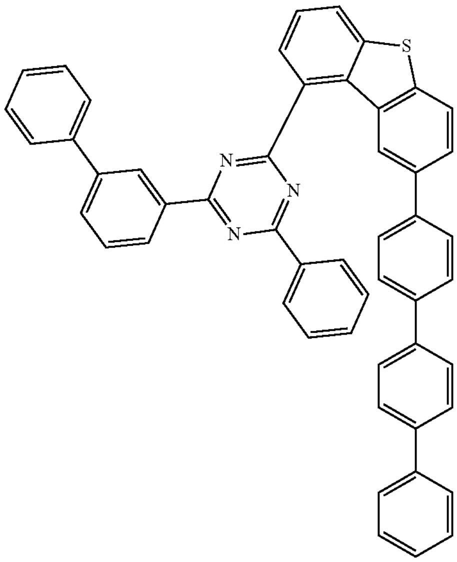
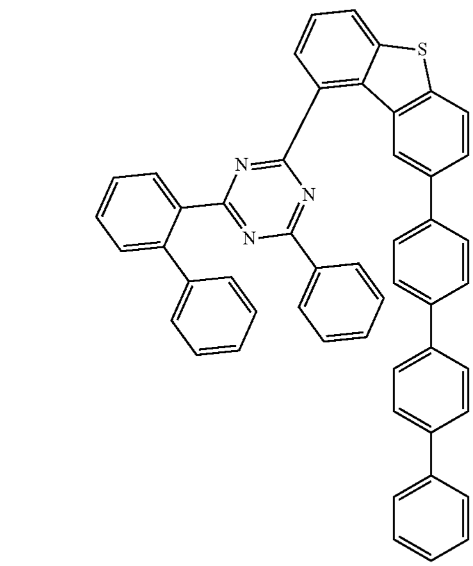
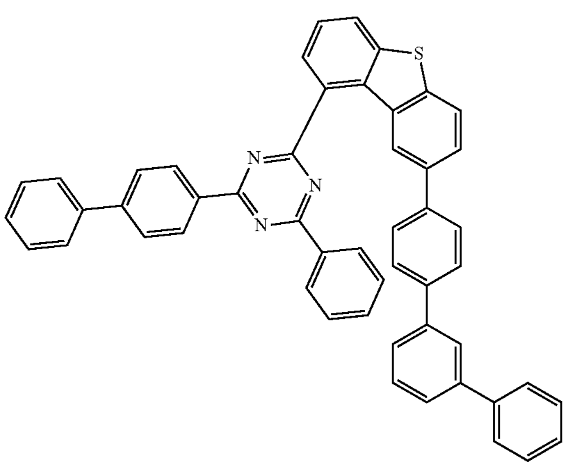
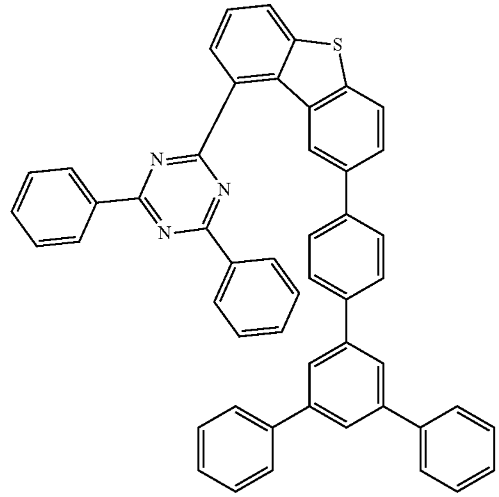
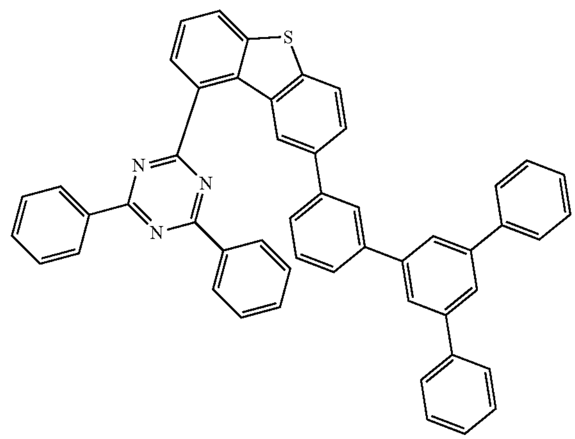
-continued
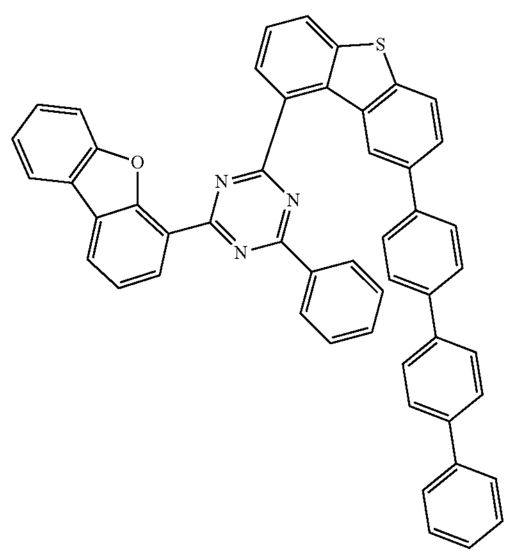

-continued
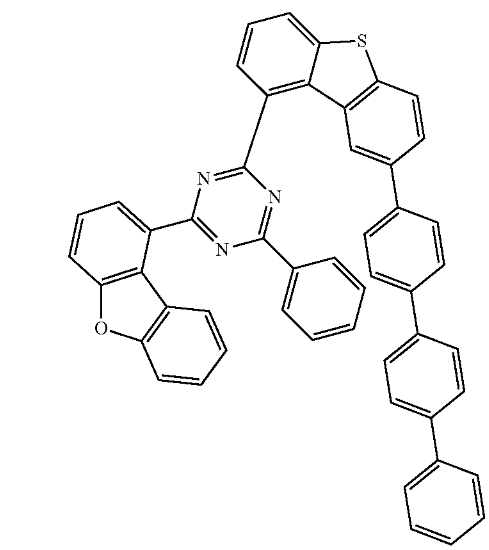
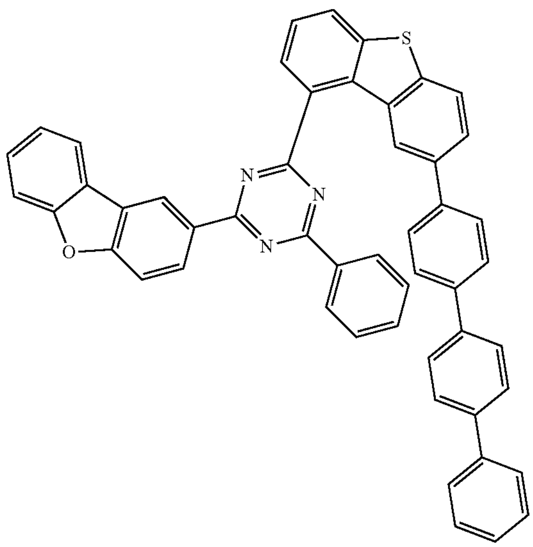
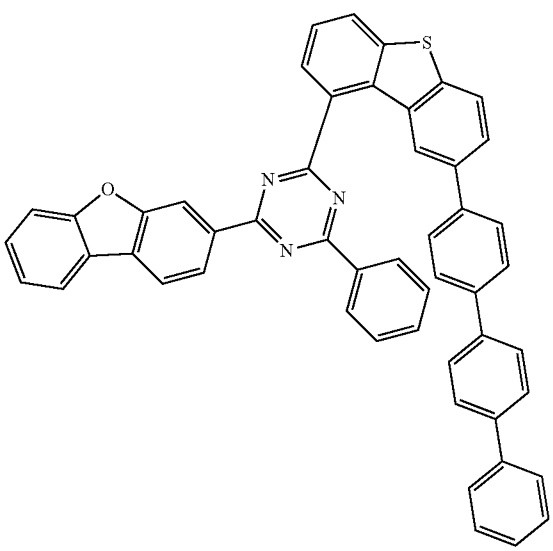
-continued
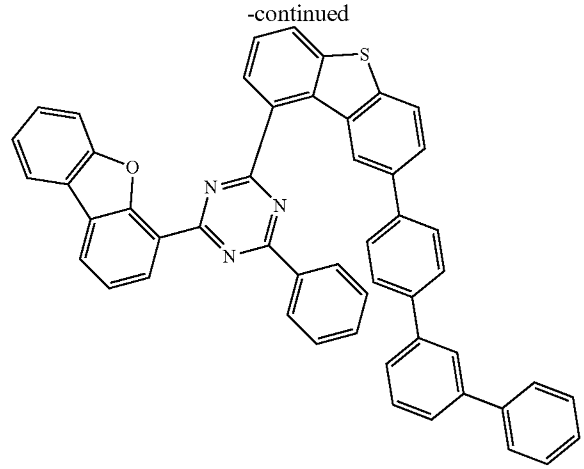
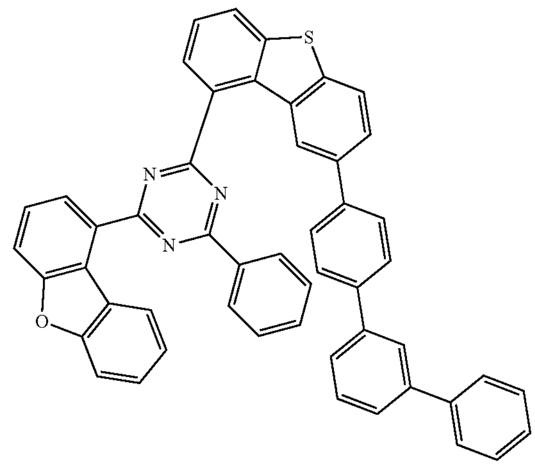
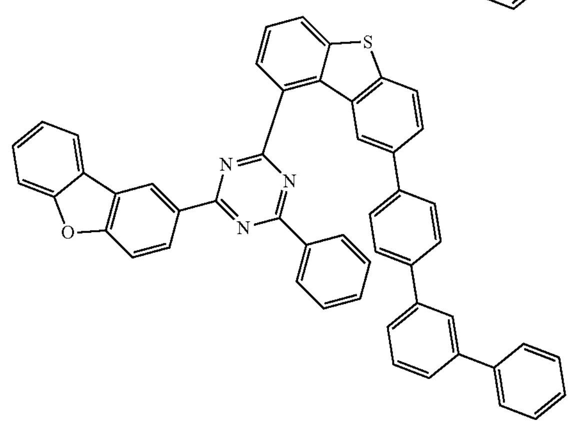
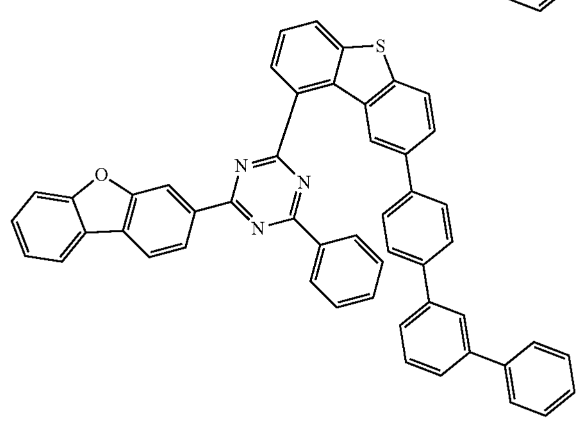

-continued
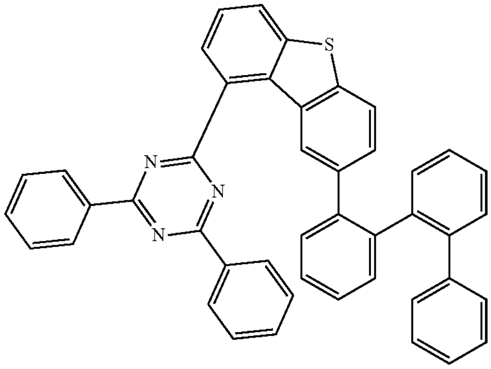
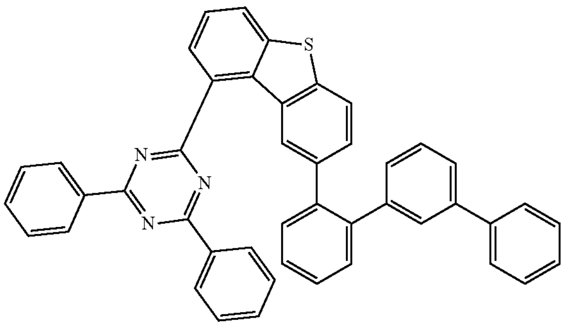
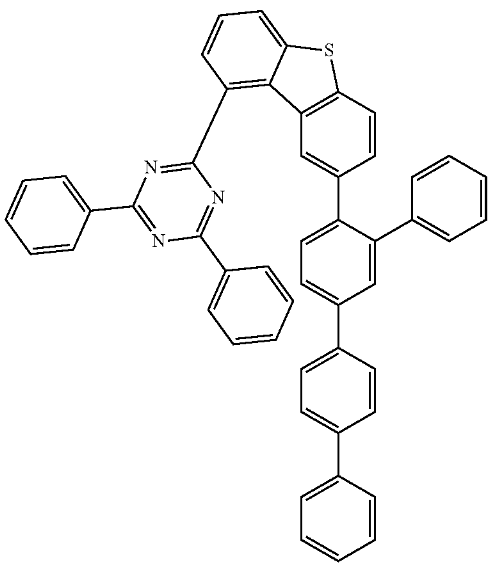
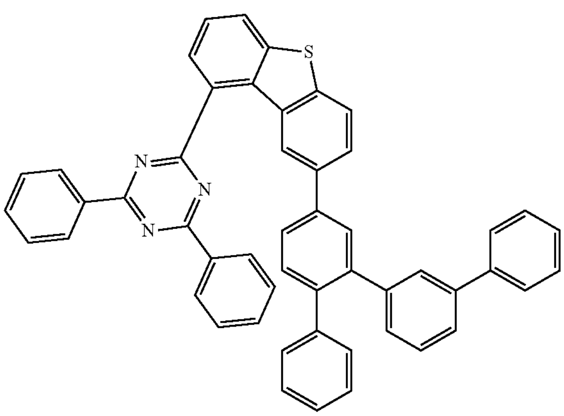
-continued
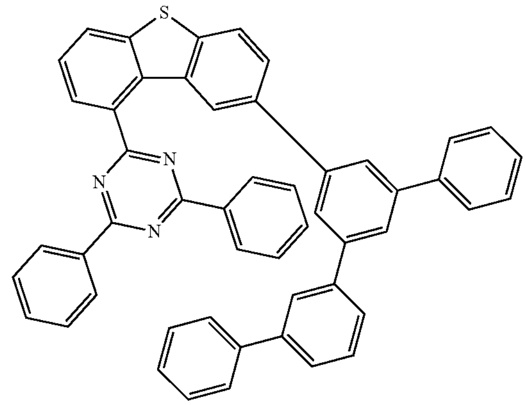
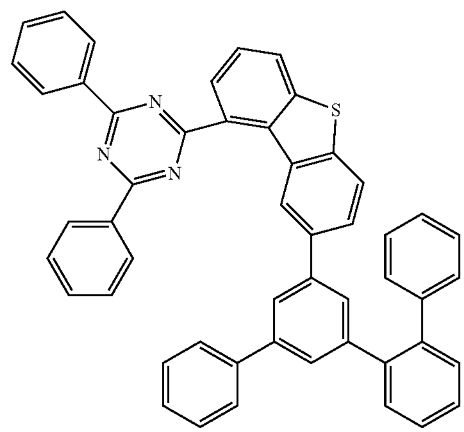
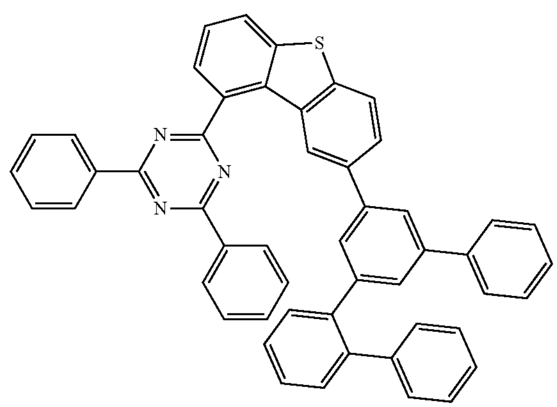

-continued
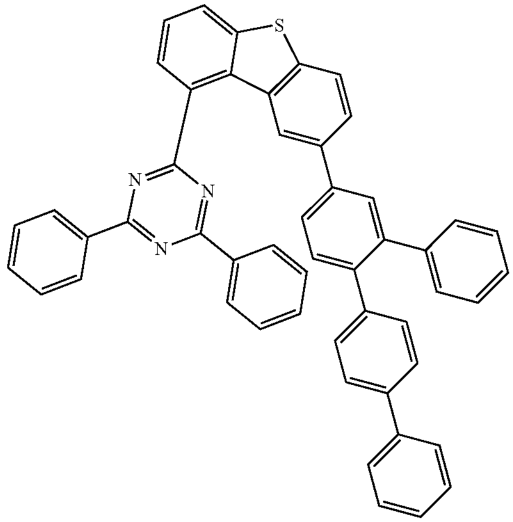
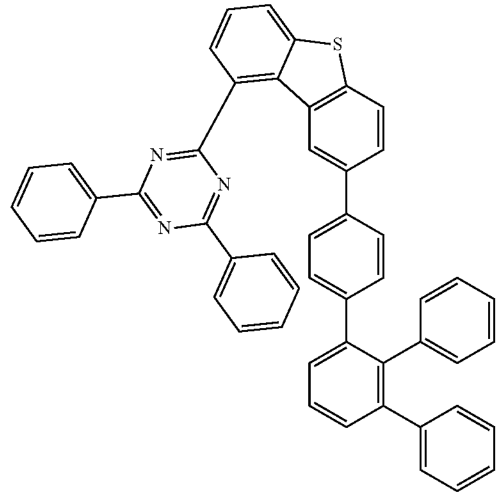
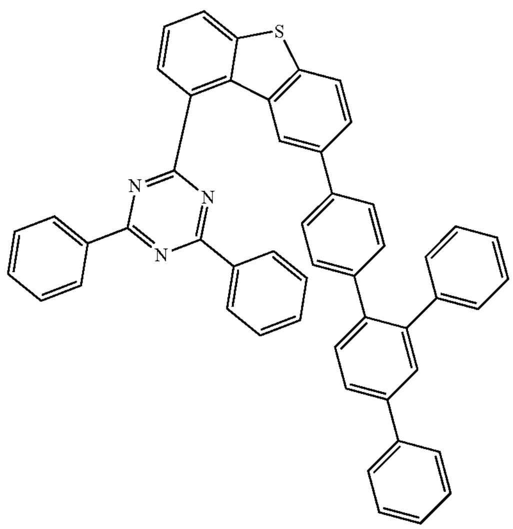
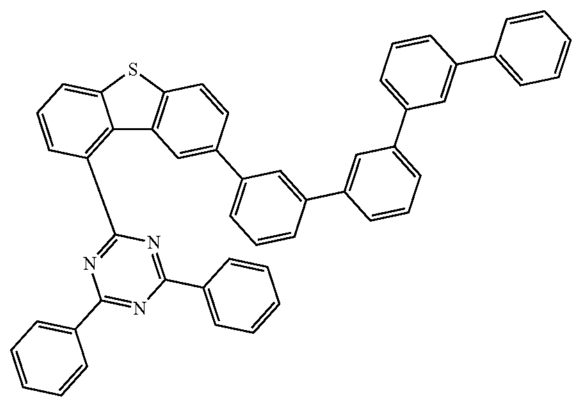
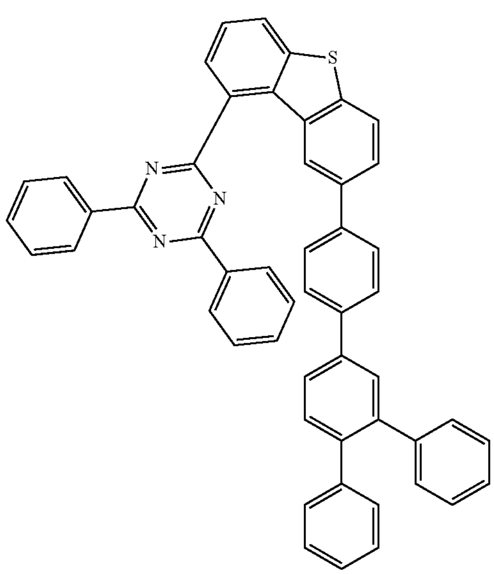
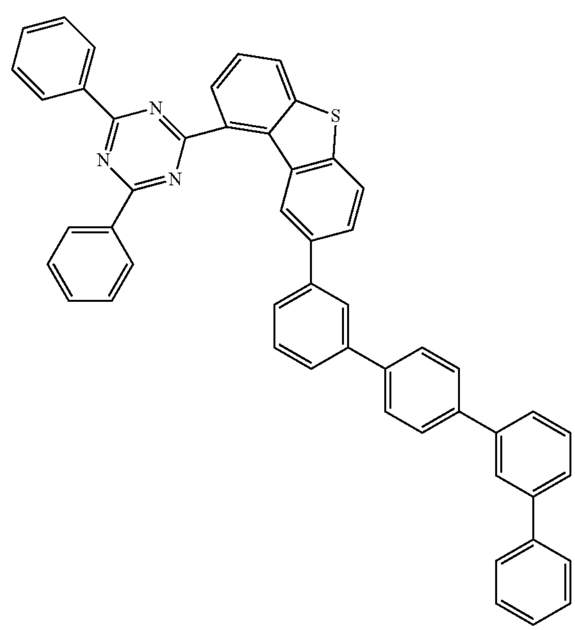

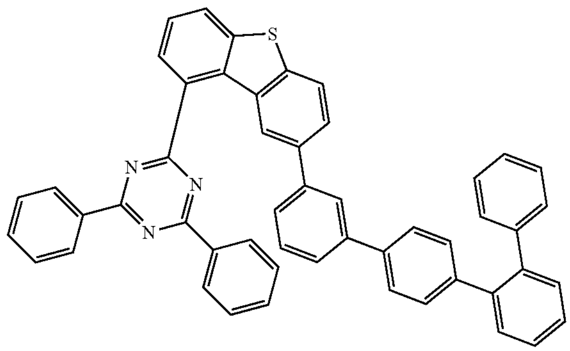
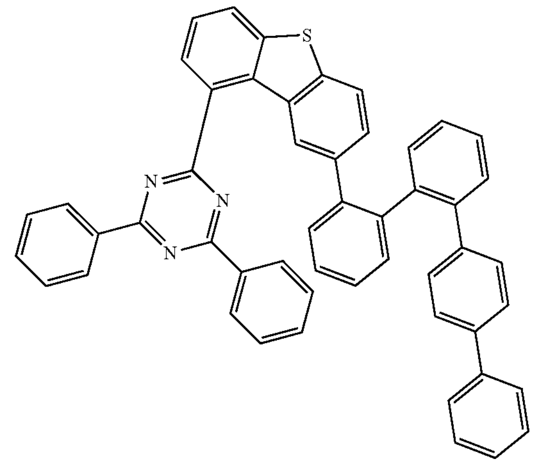
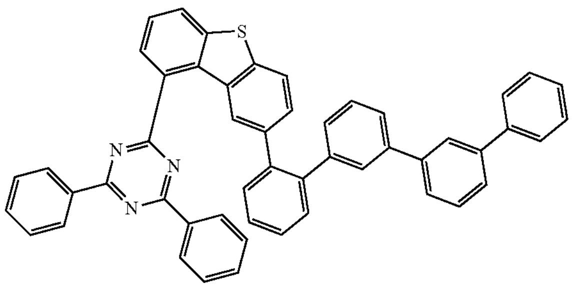
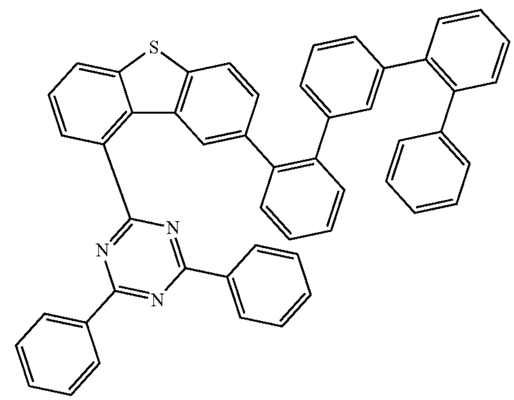
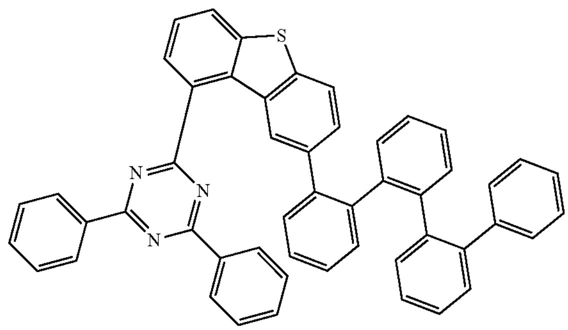
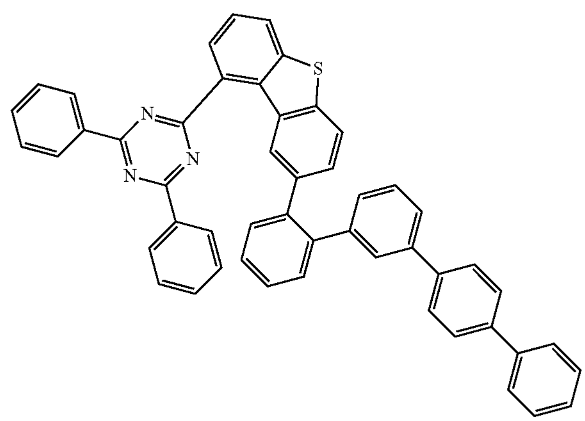
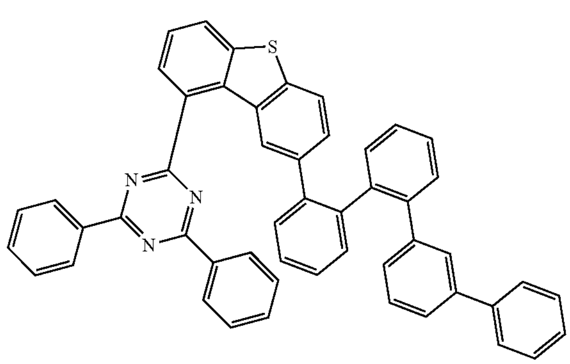
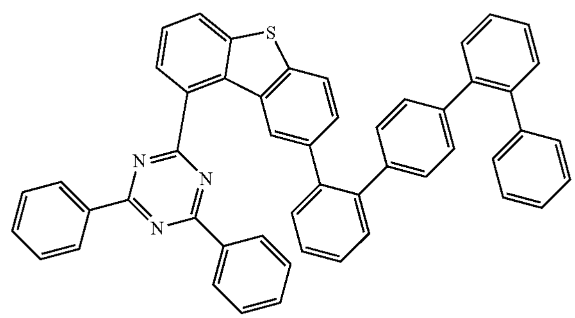

-continued
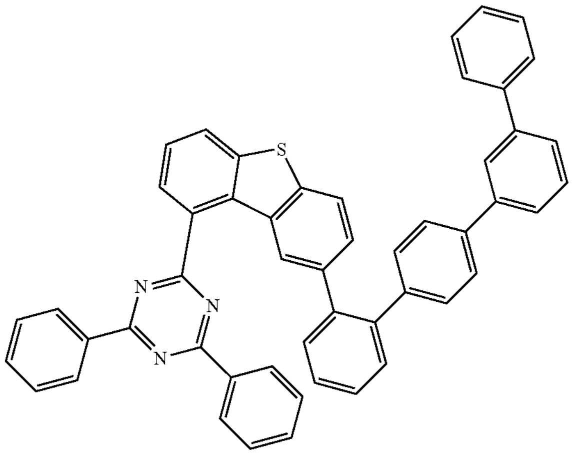
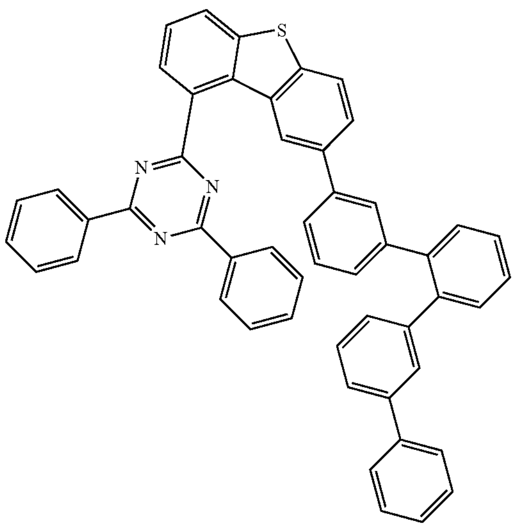
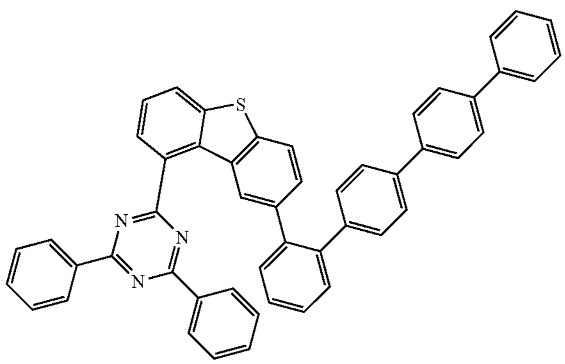
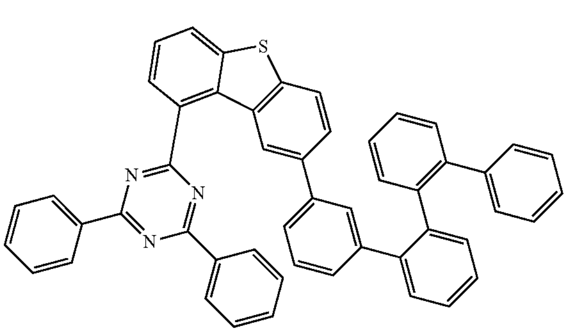
-continued
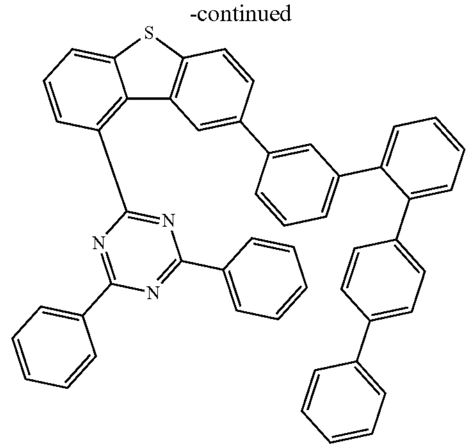
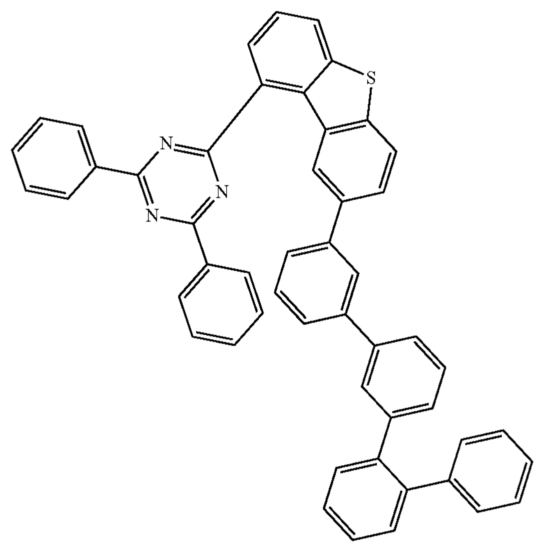
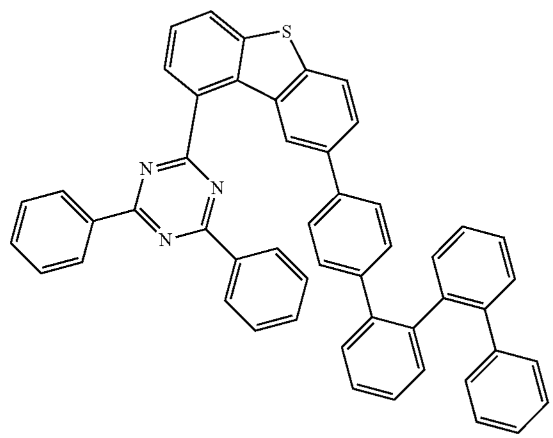

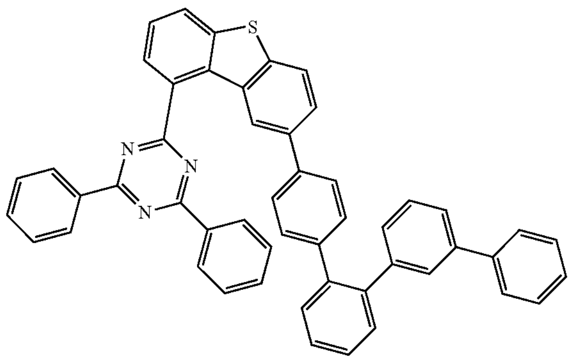
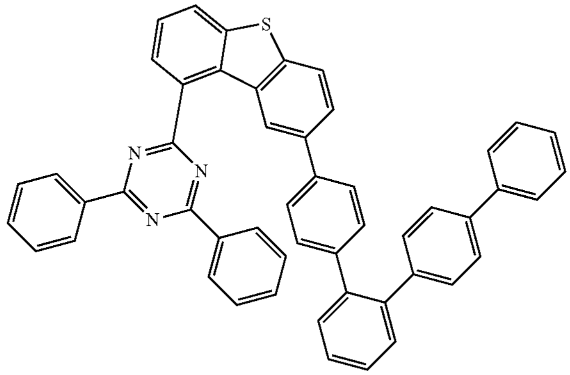
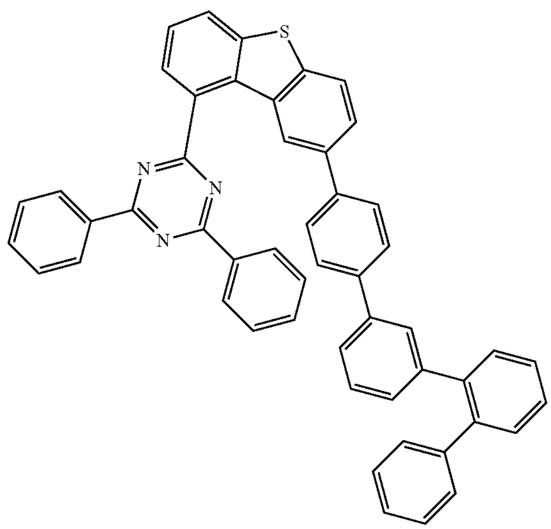
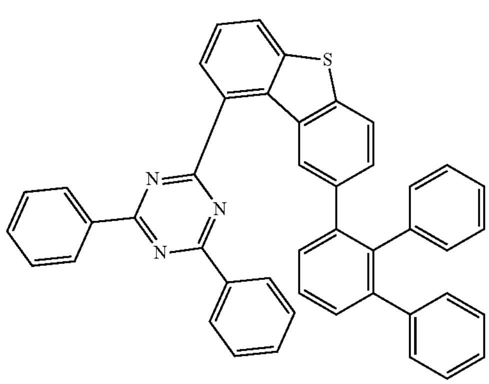
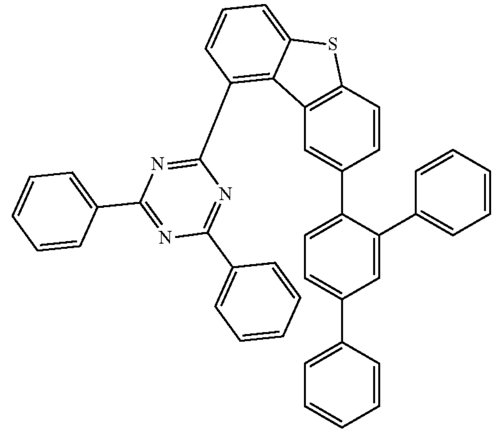
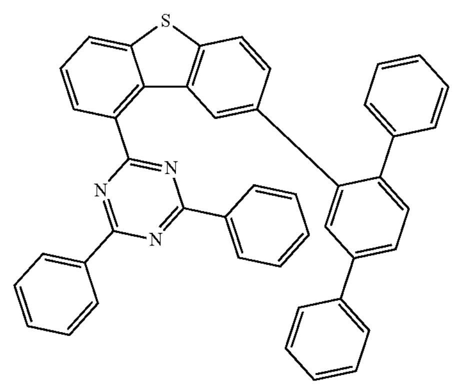
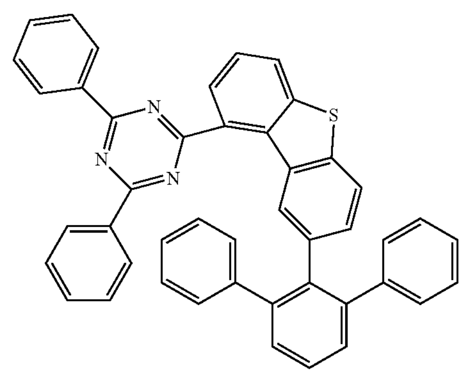
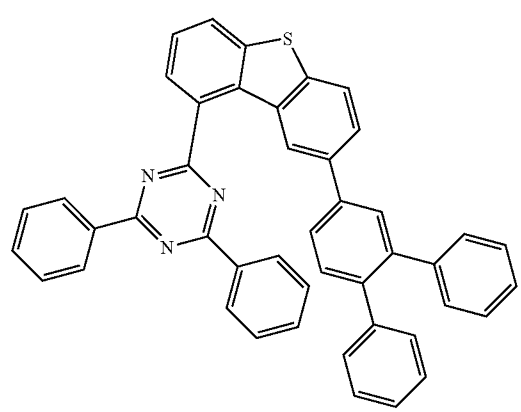

-continued
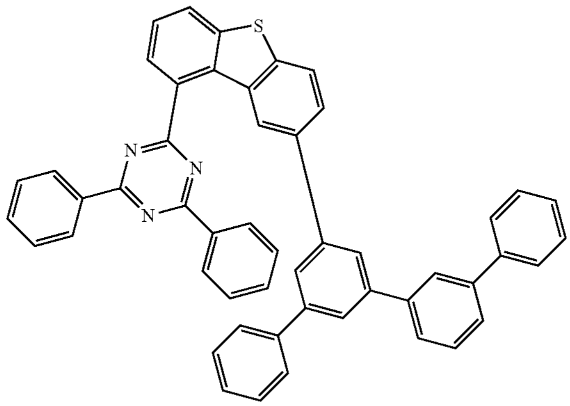
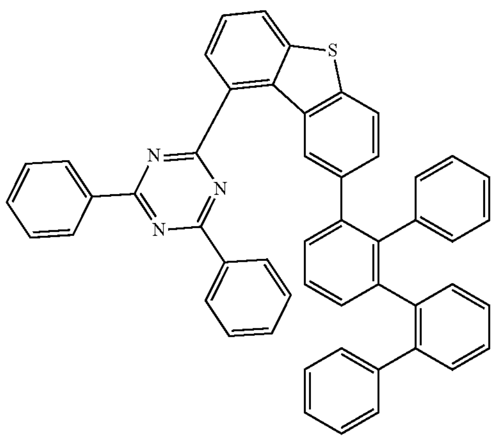
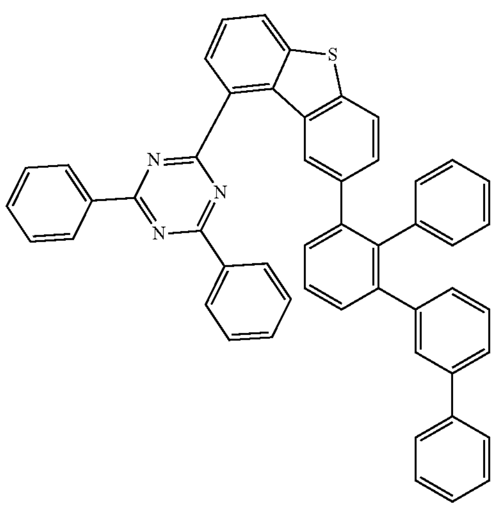
-continued
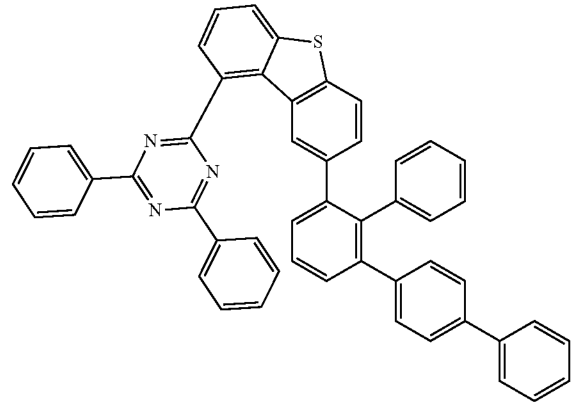 [SMILES: c1ccc(-c2ccc(-c3cccc(-c4ccc5sc6cccc(-c7nc(-c8ccccc8)nc(-c8ccccc8)n7)c6c5c4)c3-c3ccccc3)cc2)cc1]
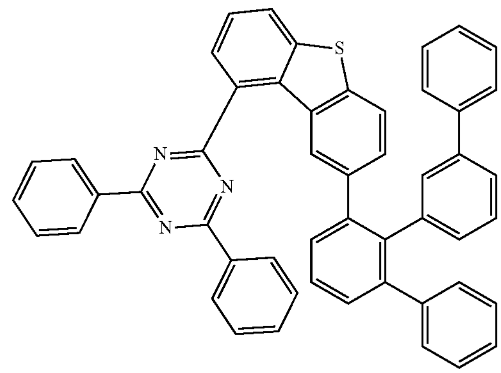
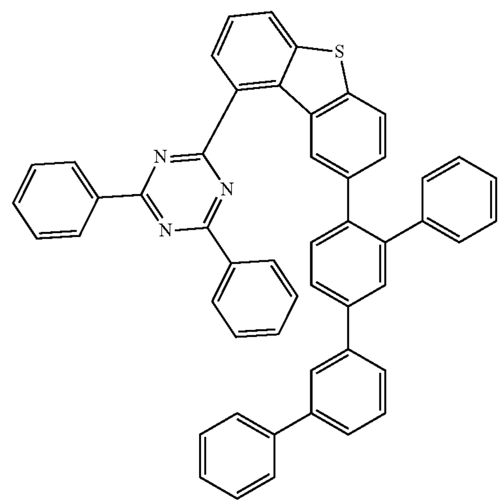
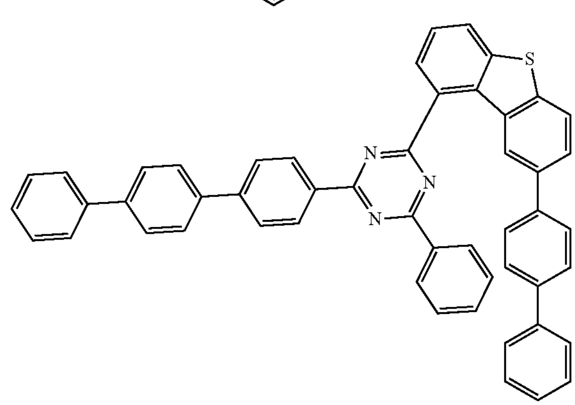

-continued
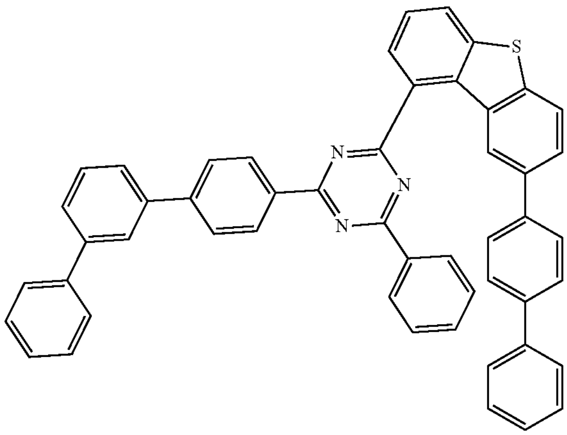
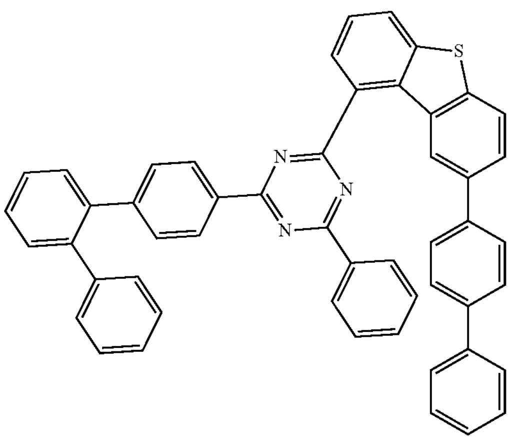
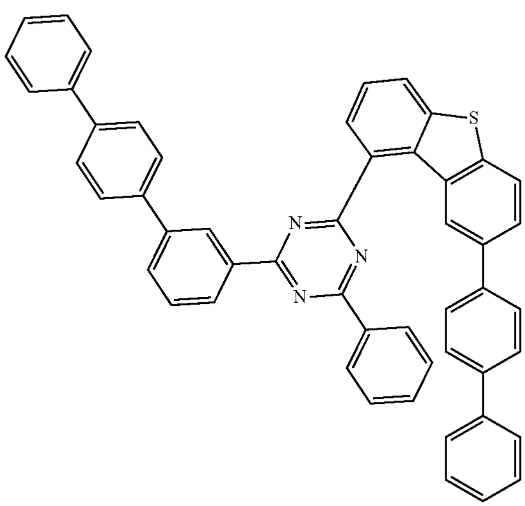
-continued
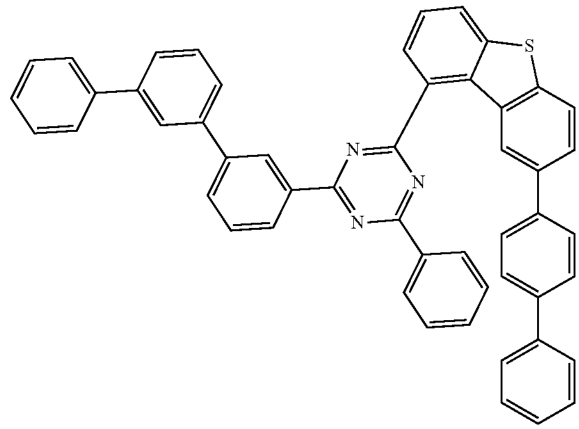
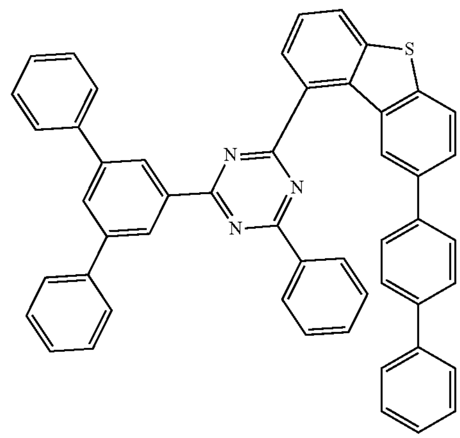
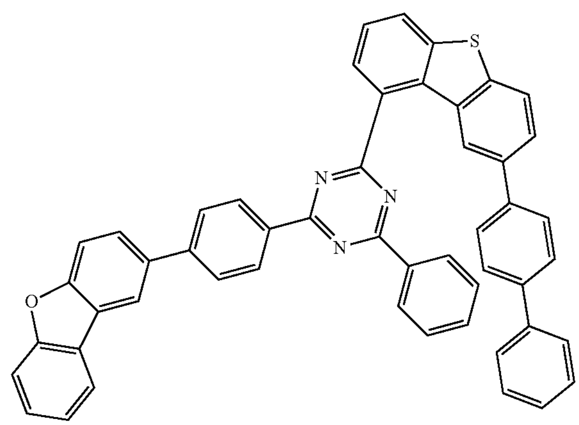
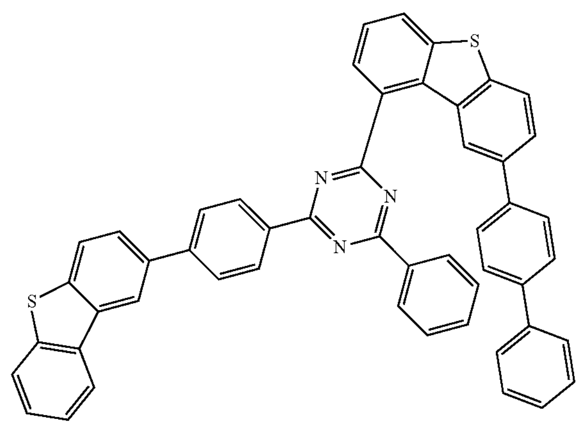

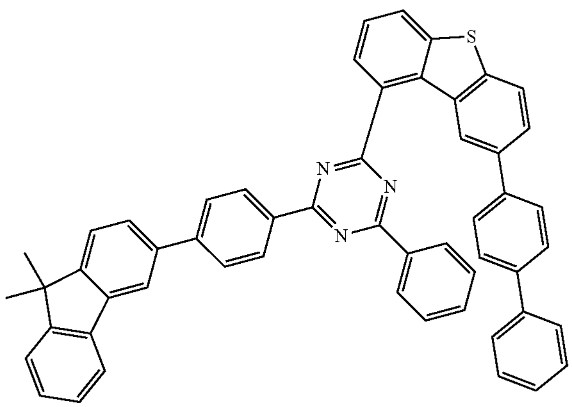
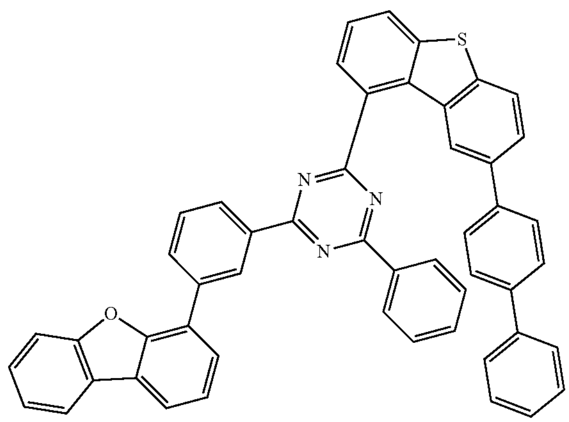
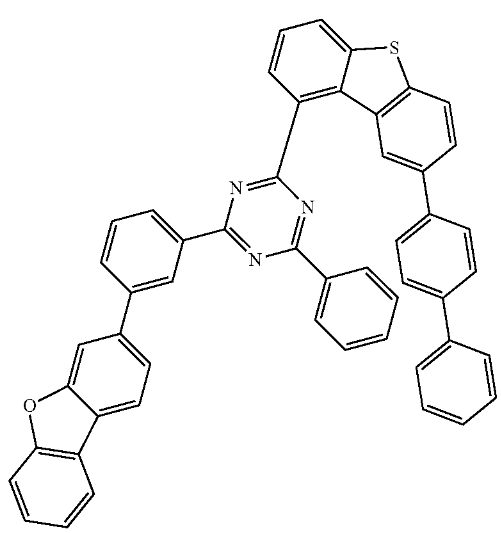
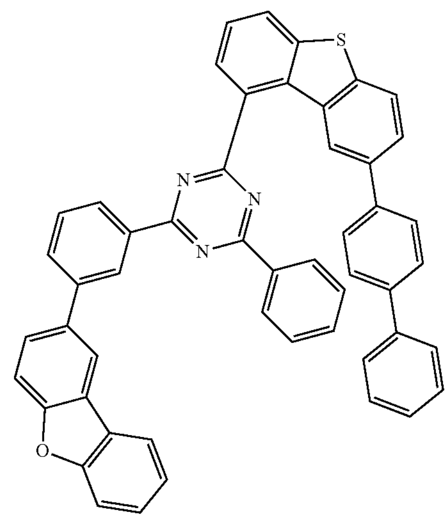
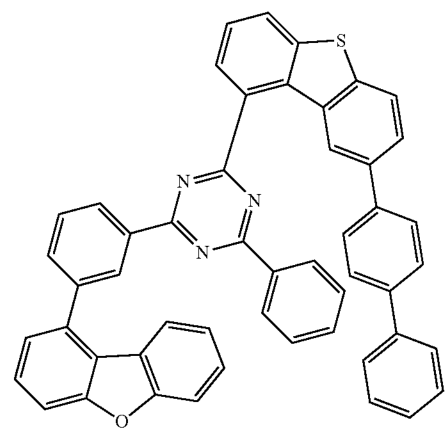
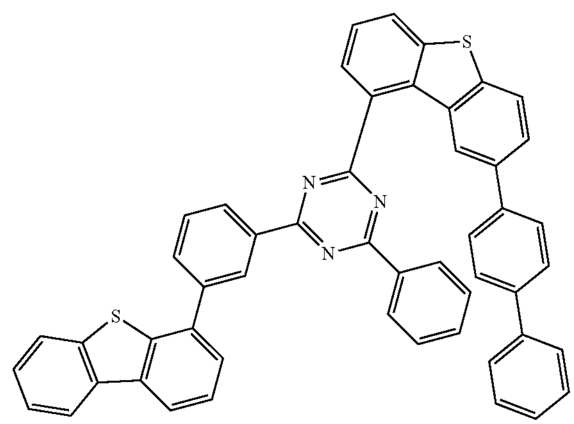

-continued
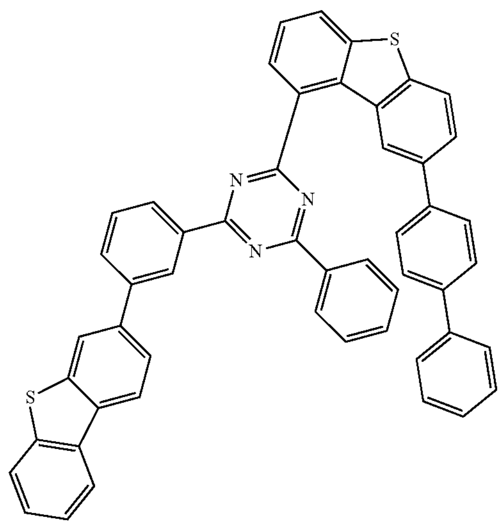
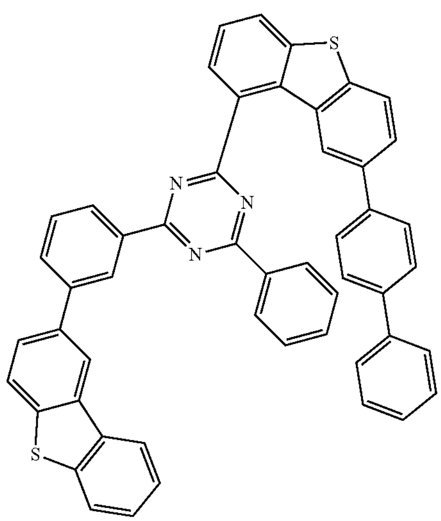
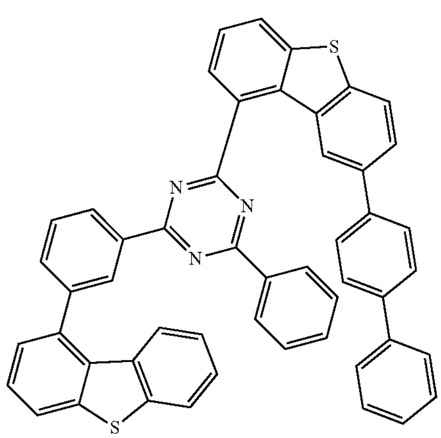
-continued
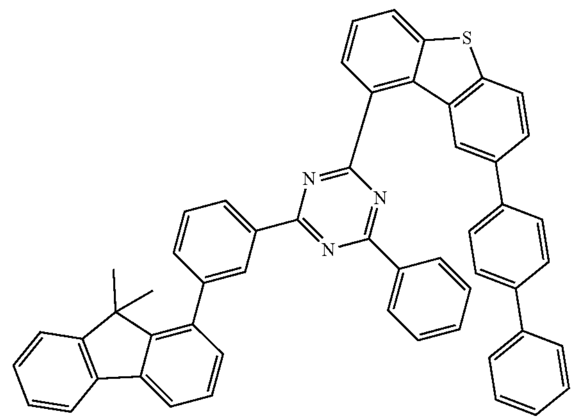
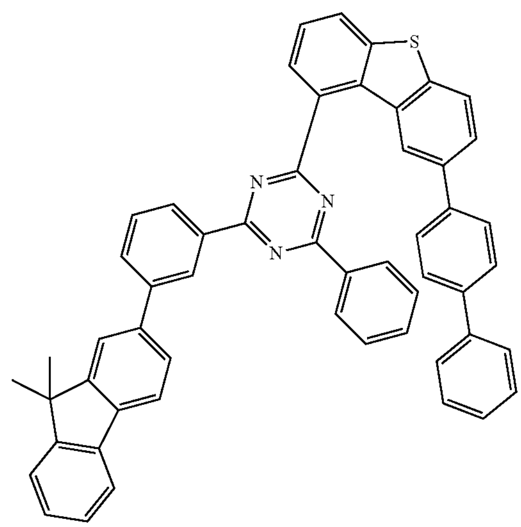
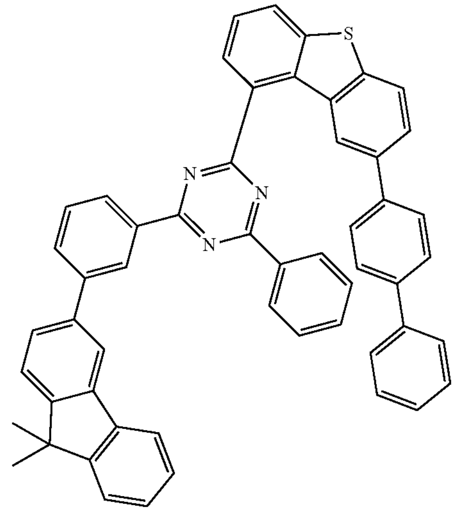

-continued
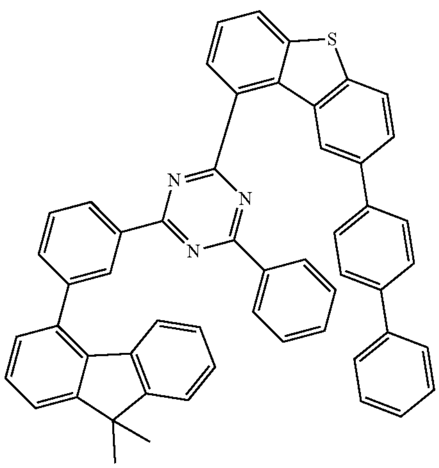
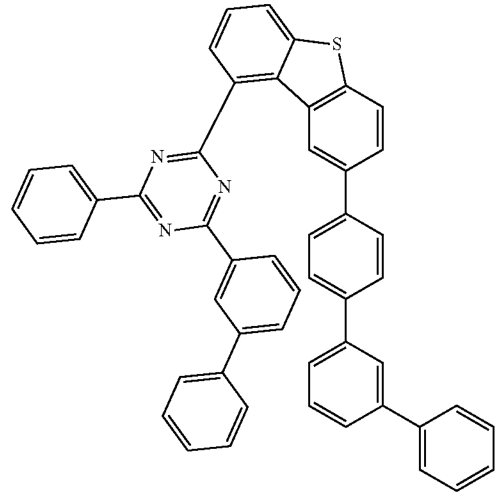
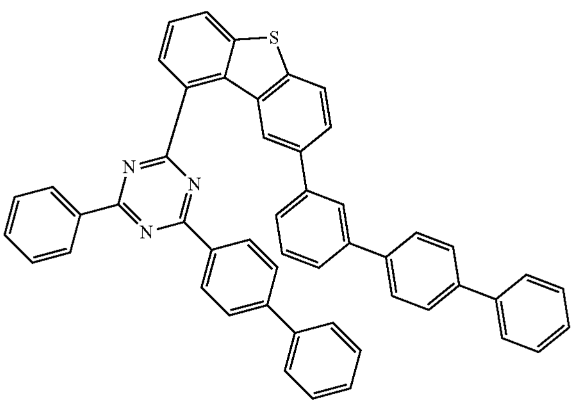
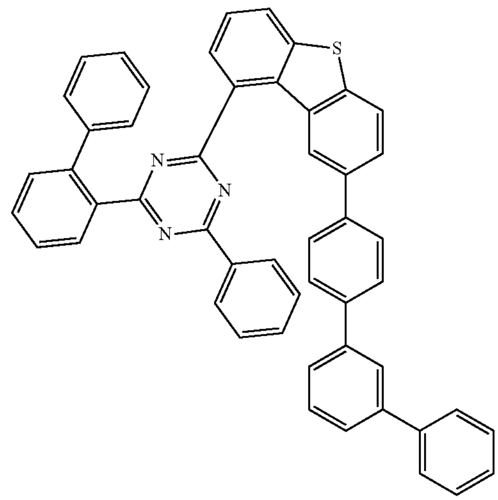
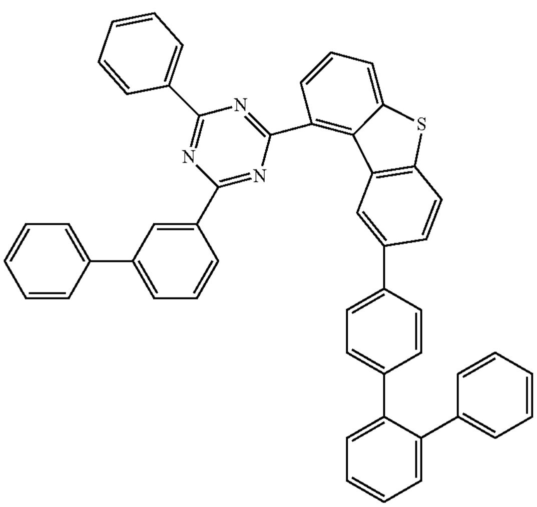
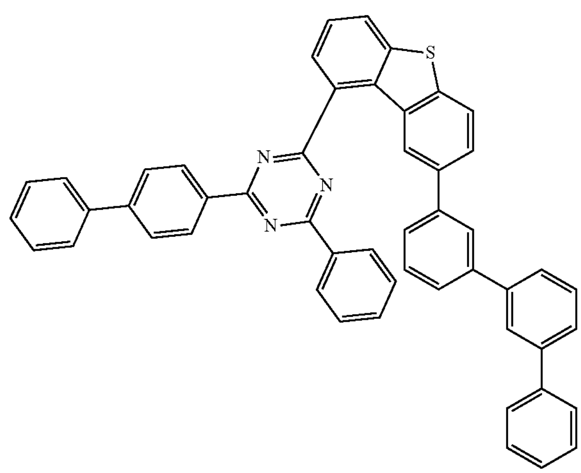

-continued
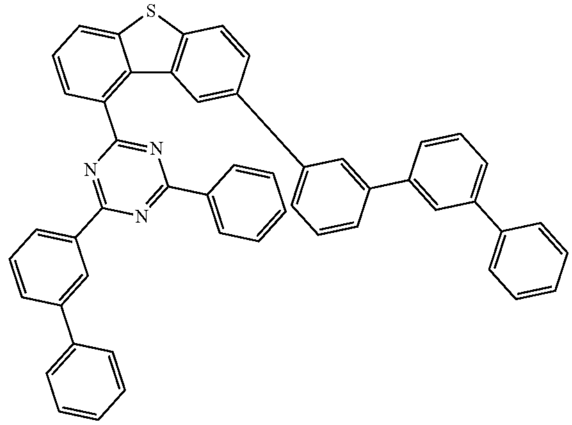
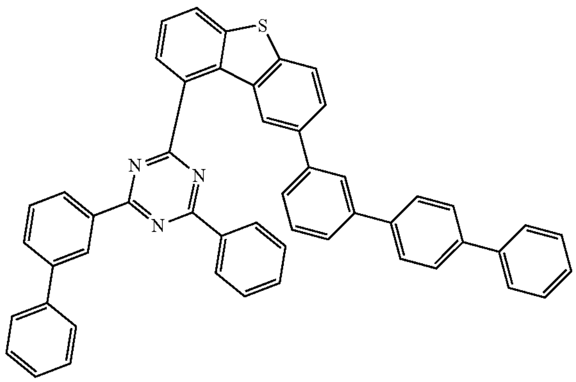
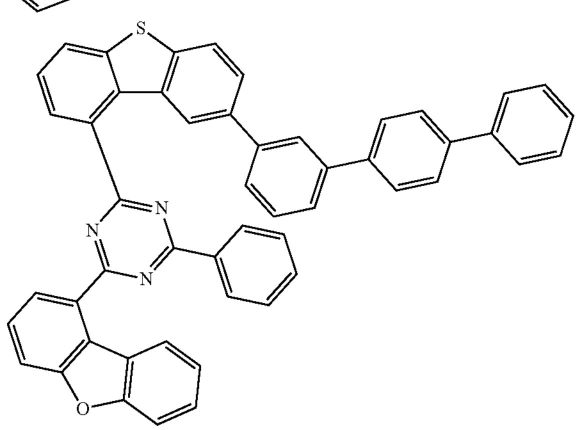
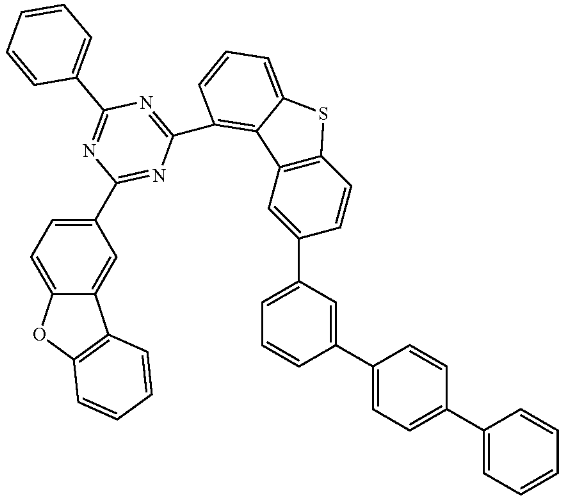
-continued
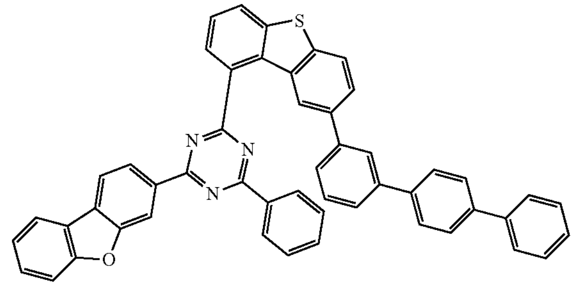
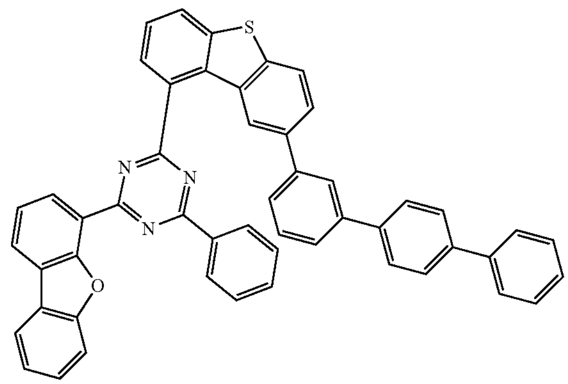
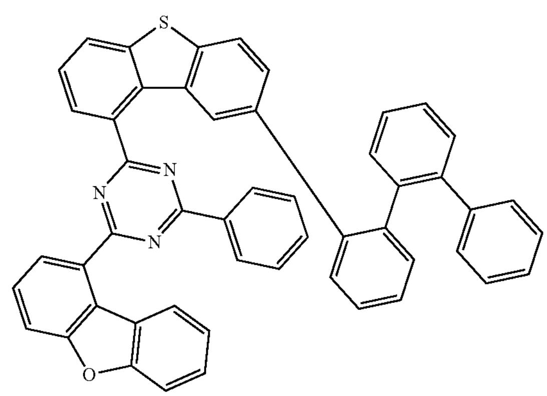
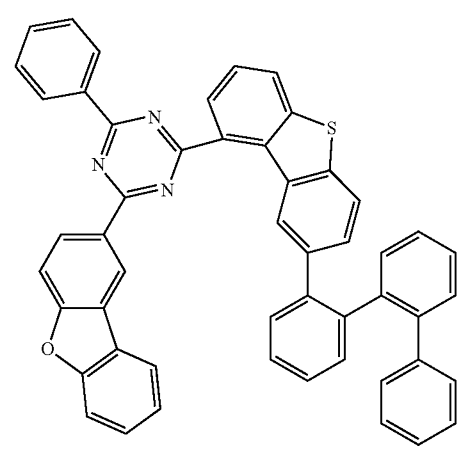

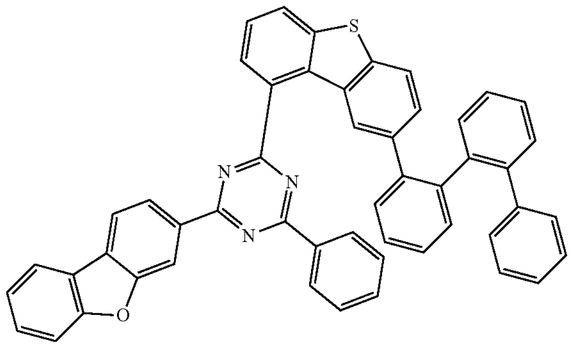
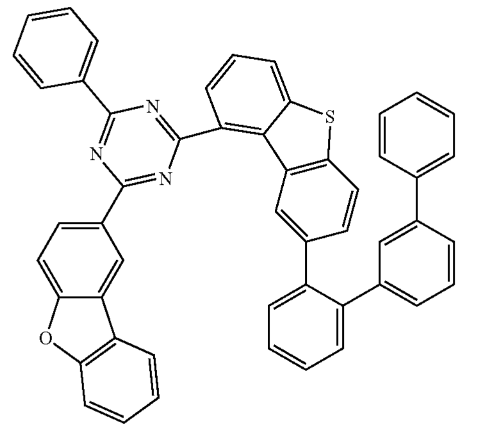
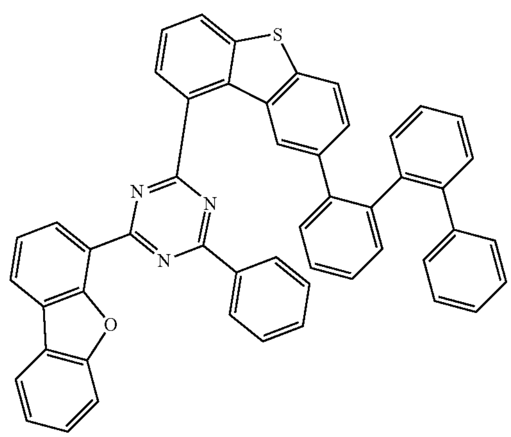
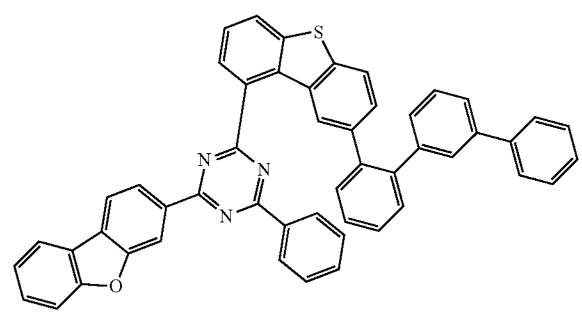
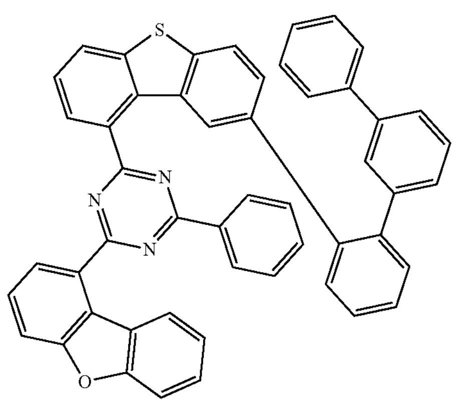
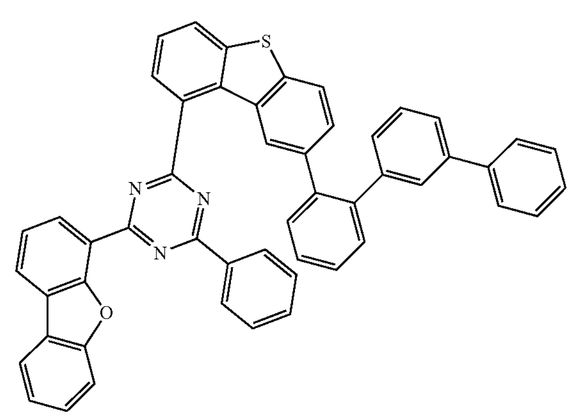

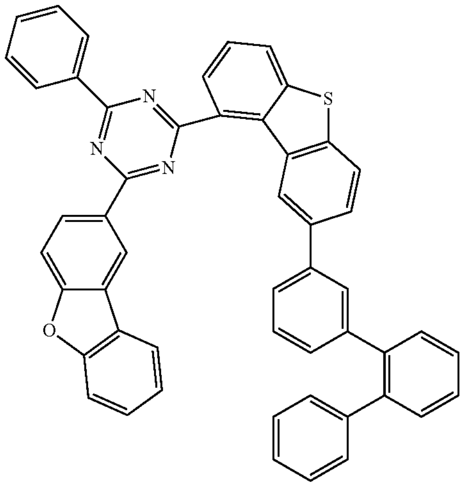
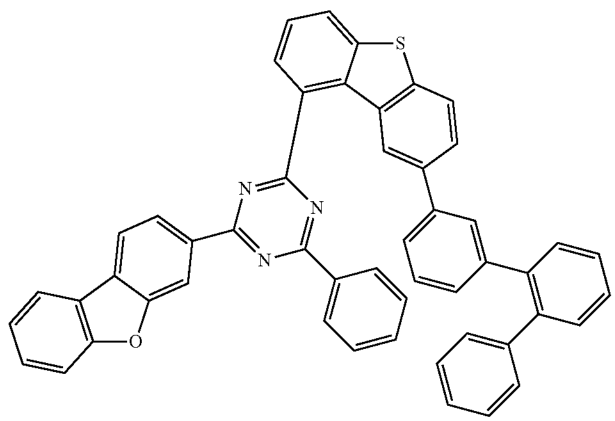
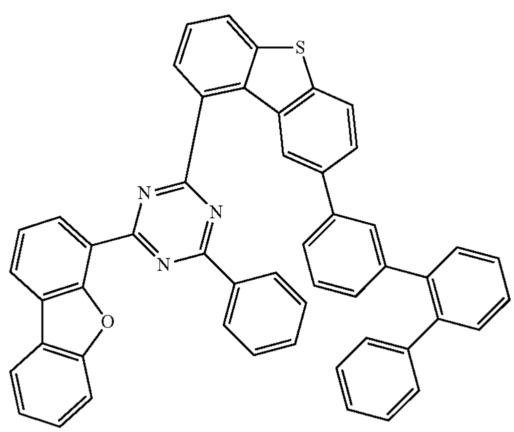
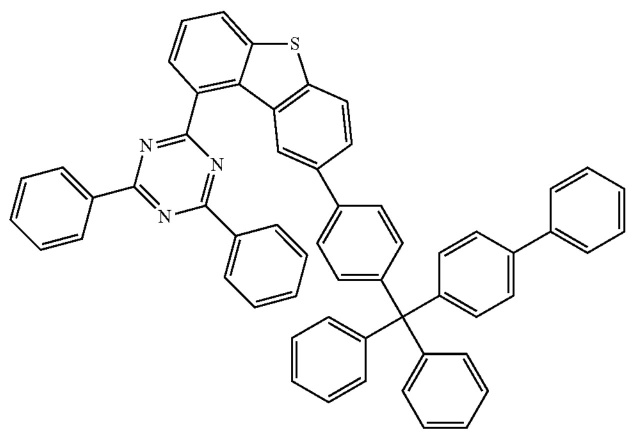
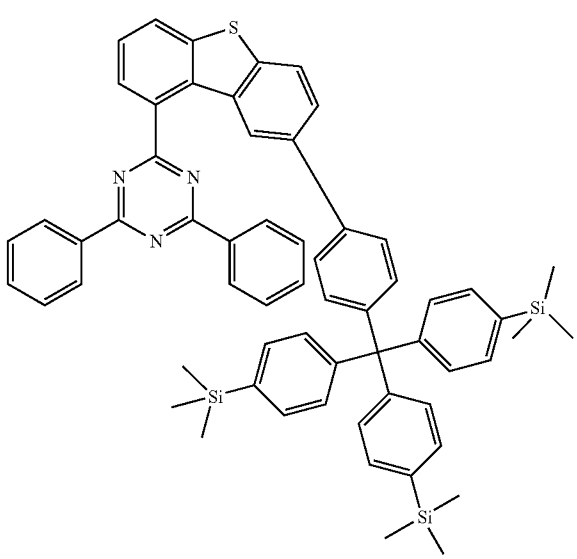
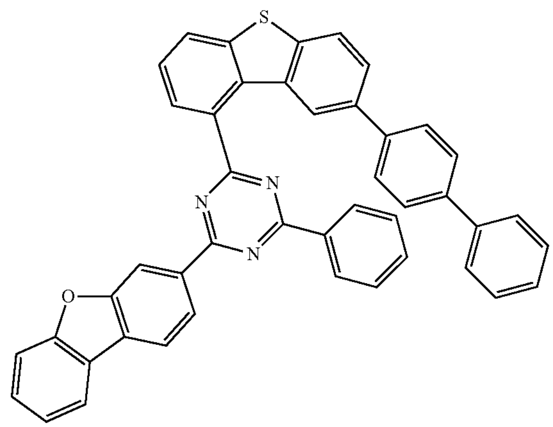

-continued
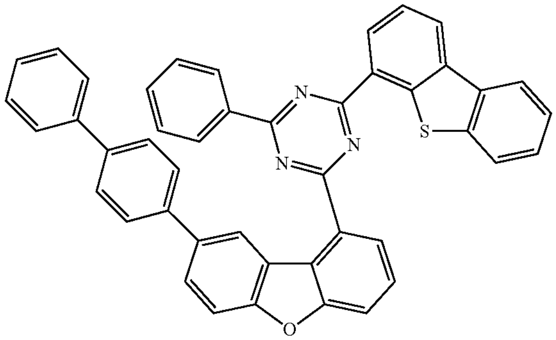
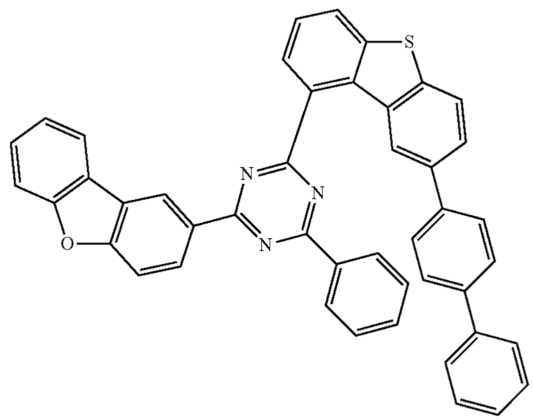
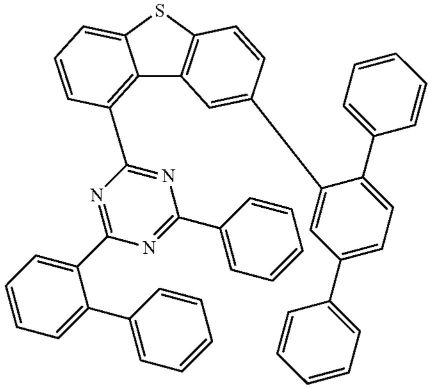
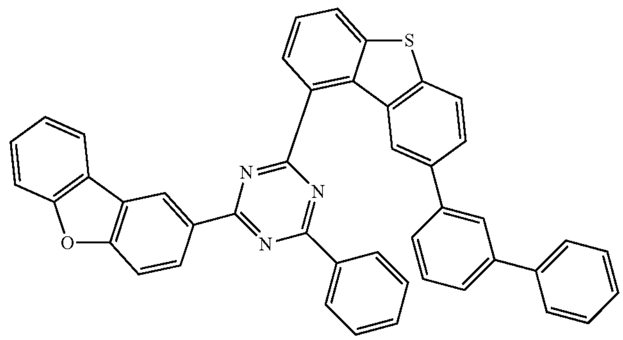
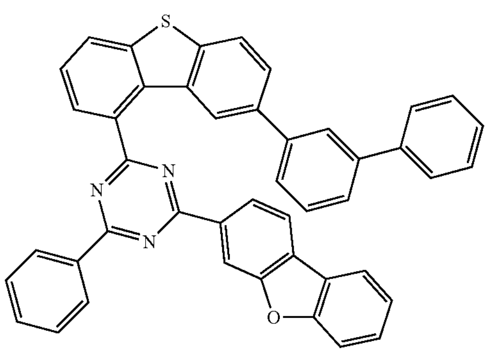
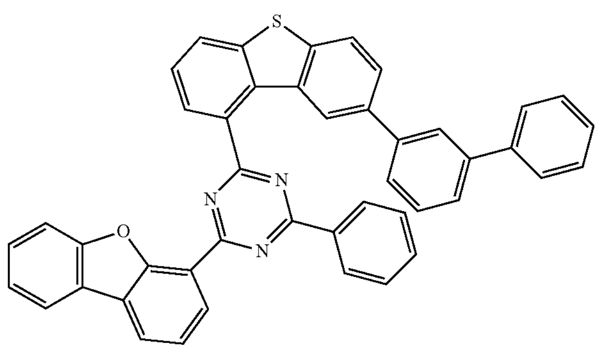
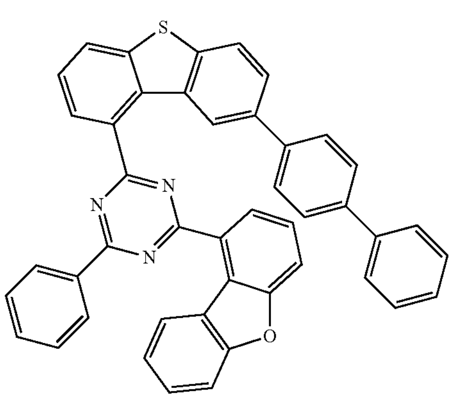
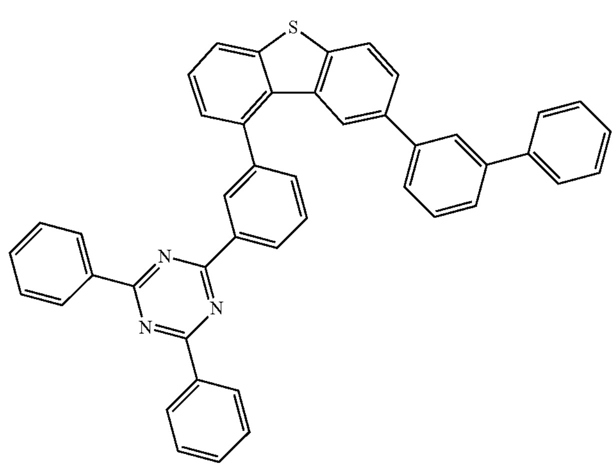

-continued
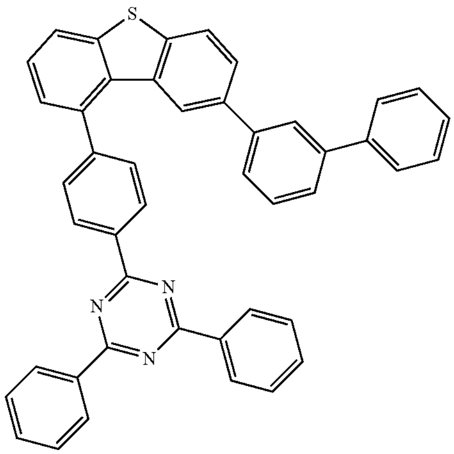
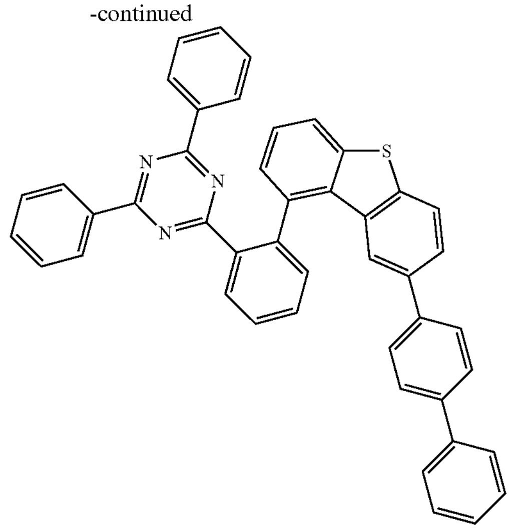
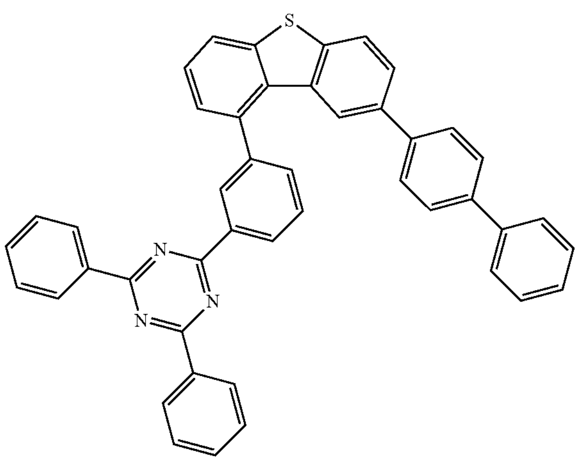
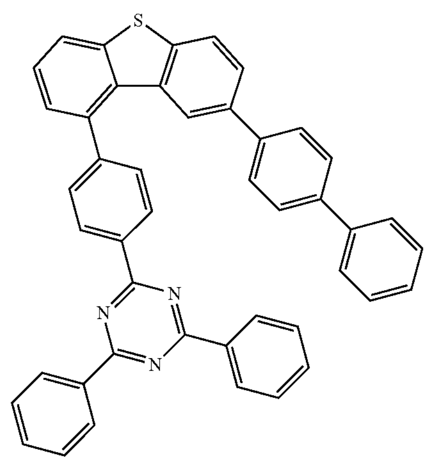
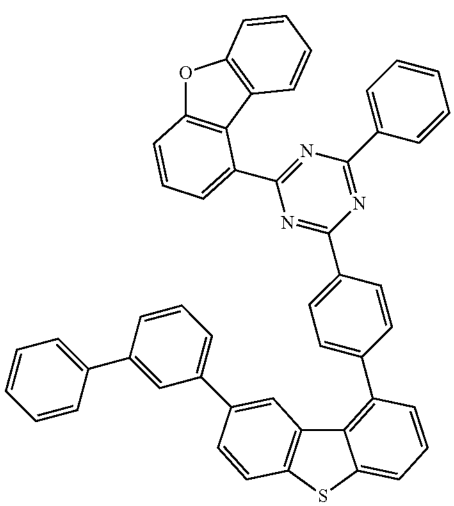
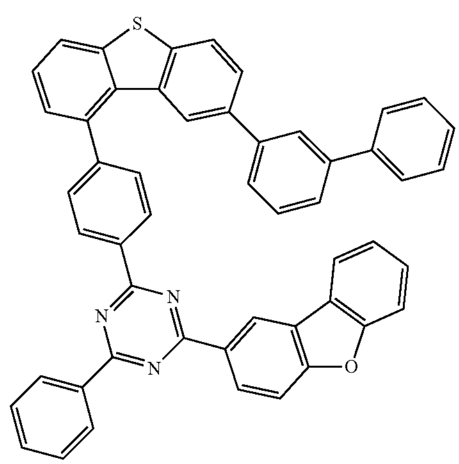

-continued
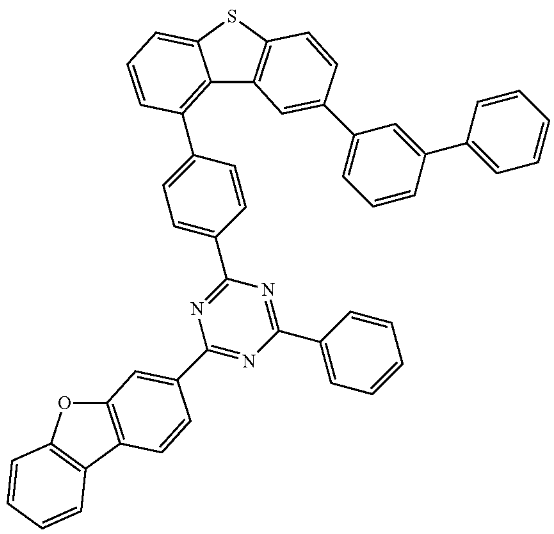
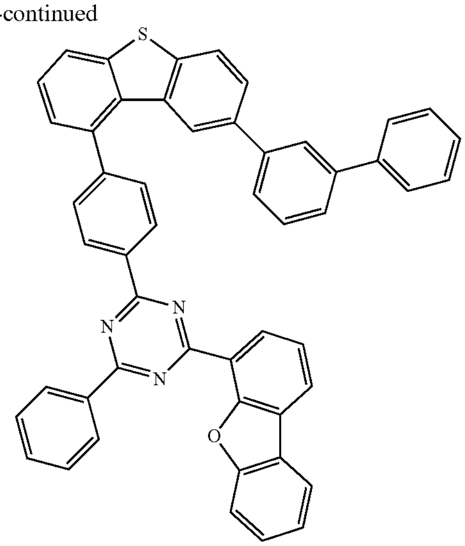
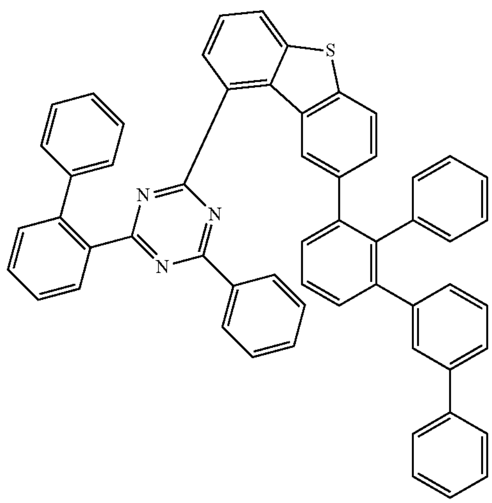
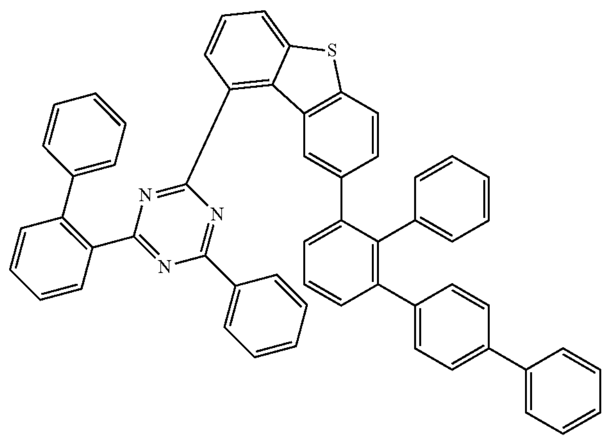
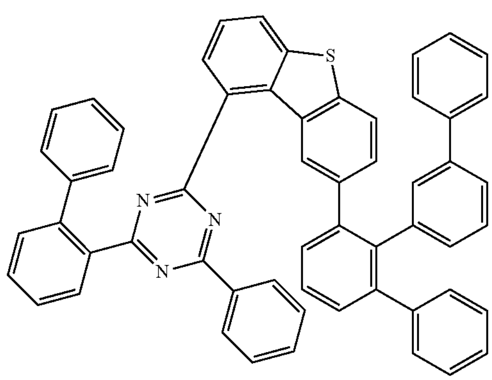
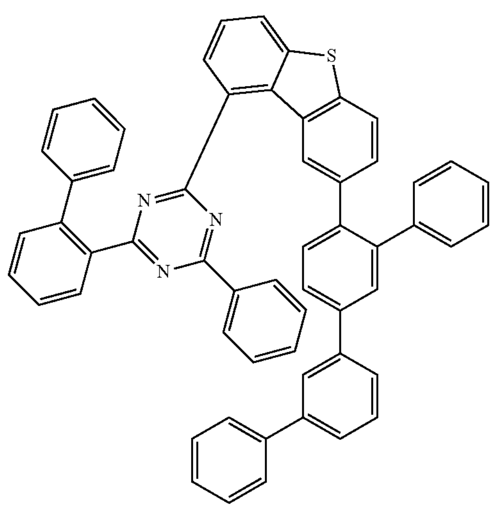

-continued
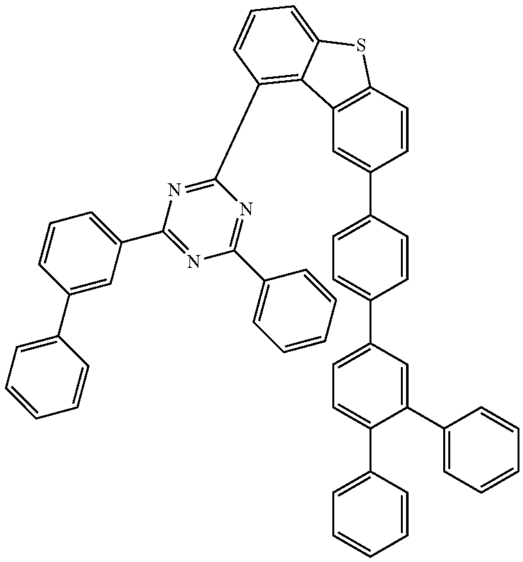
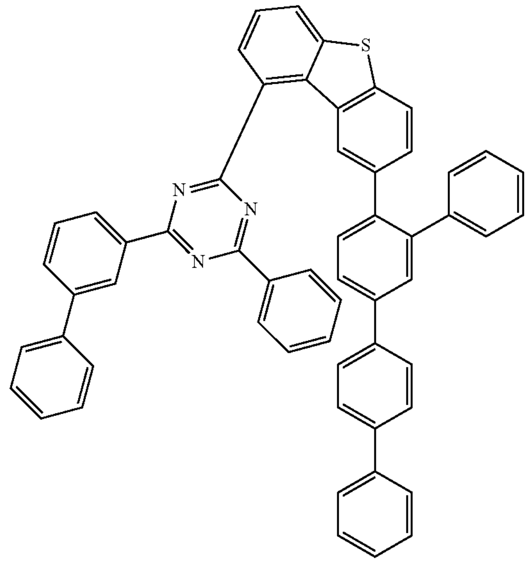
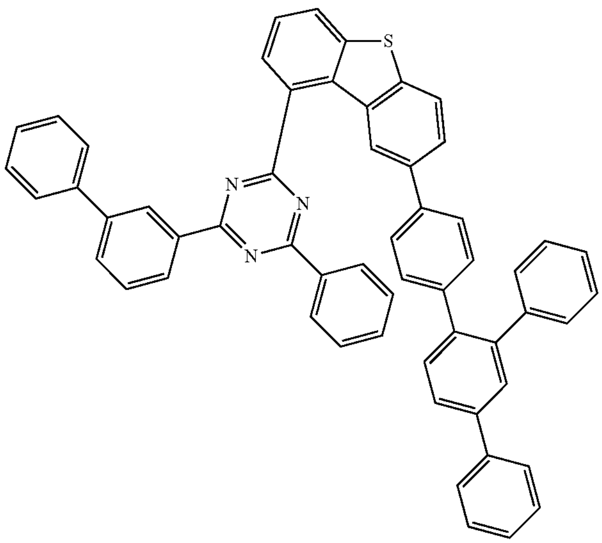
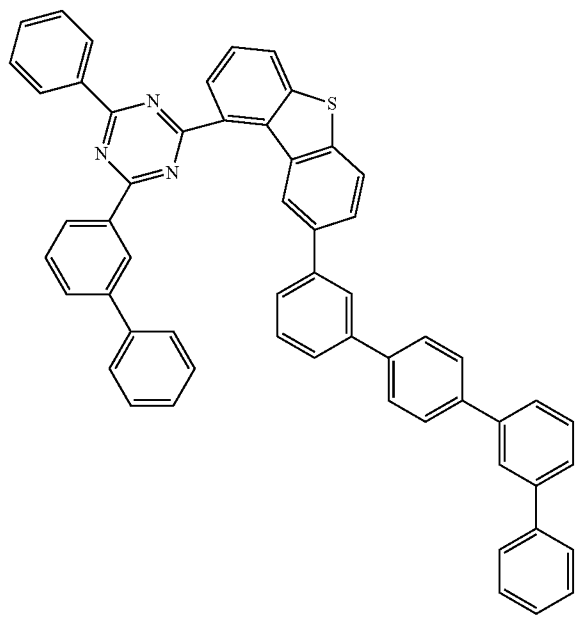
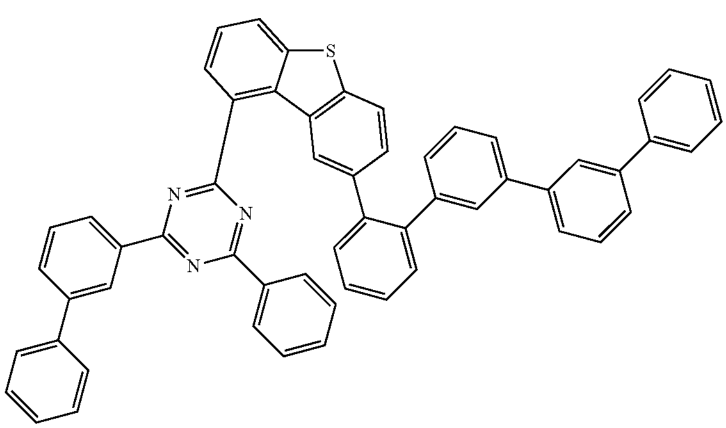

-continued
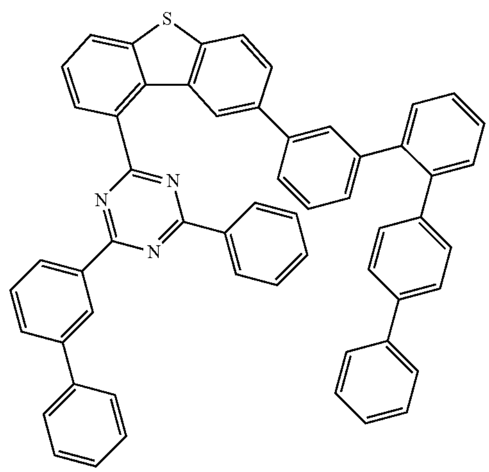
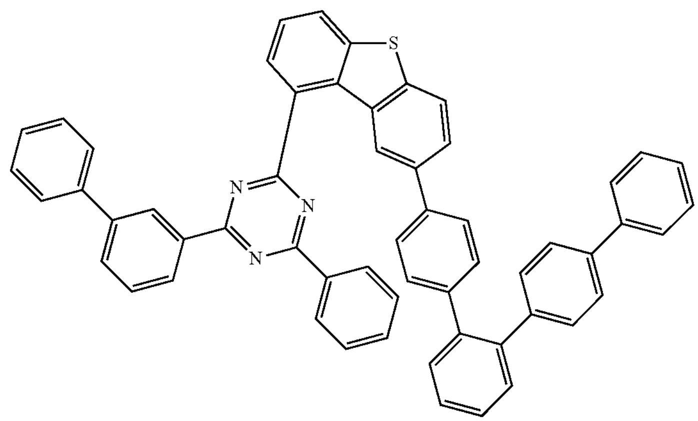
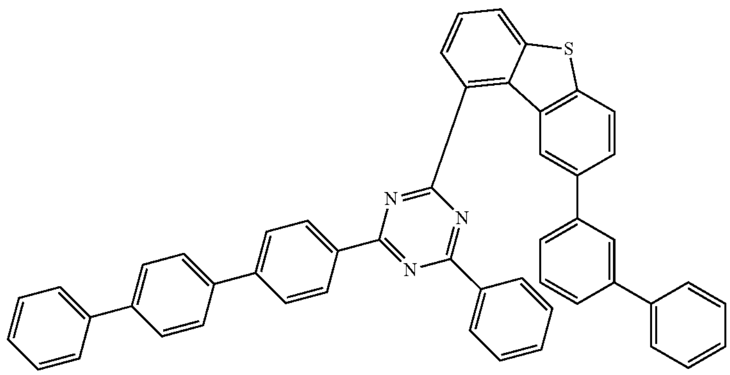
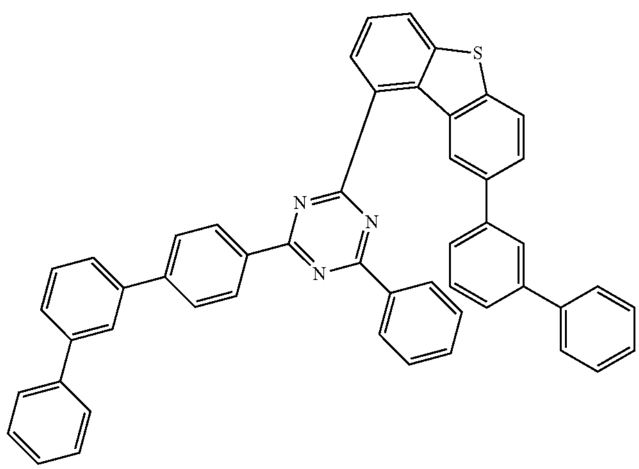
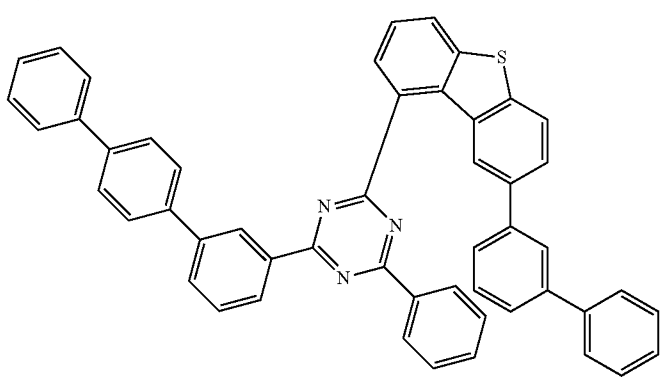

-continued
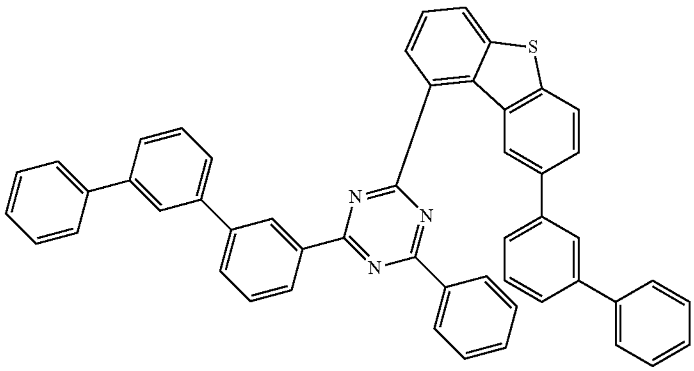
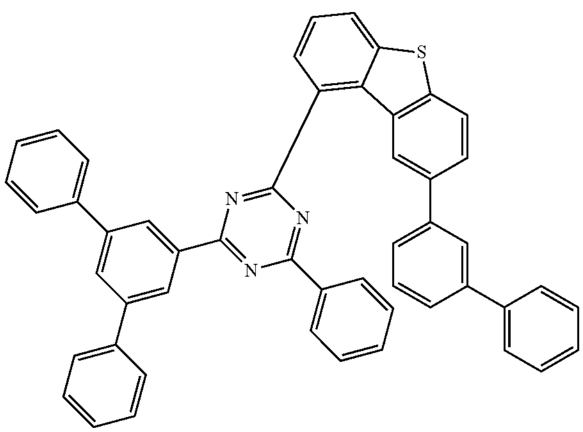
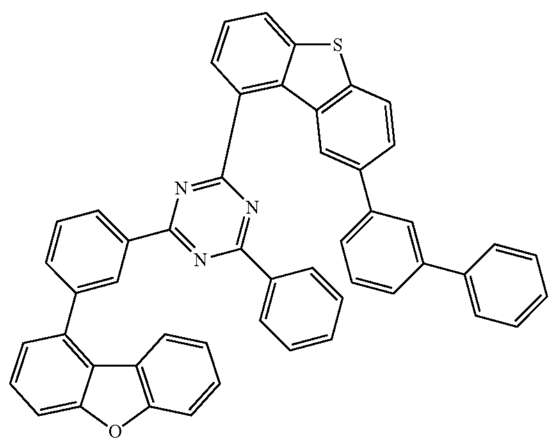
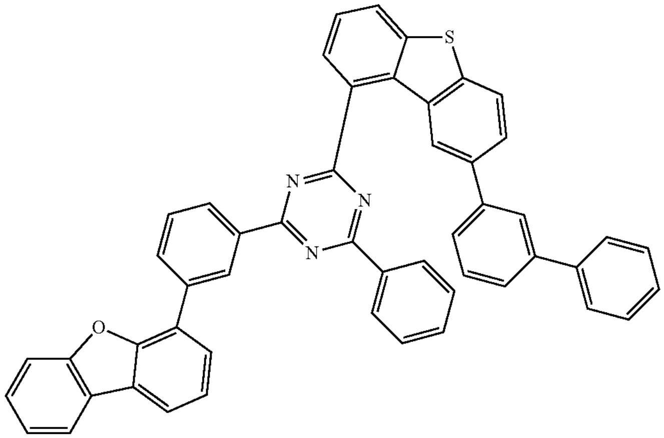

-continued
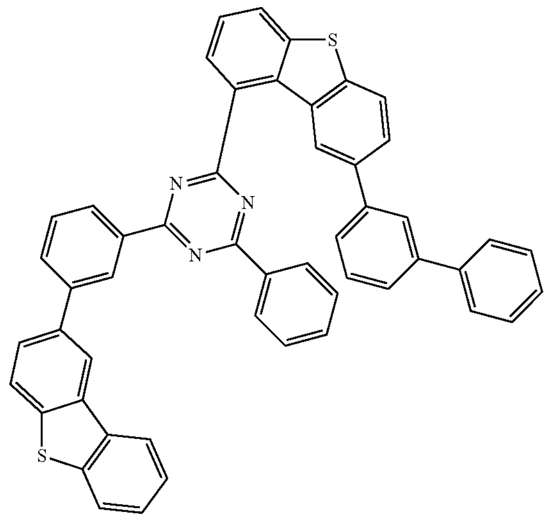
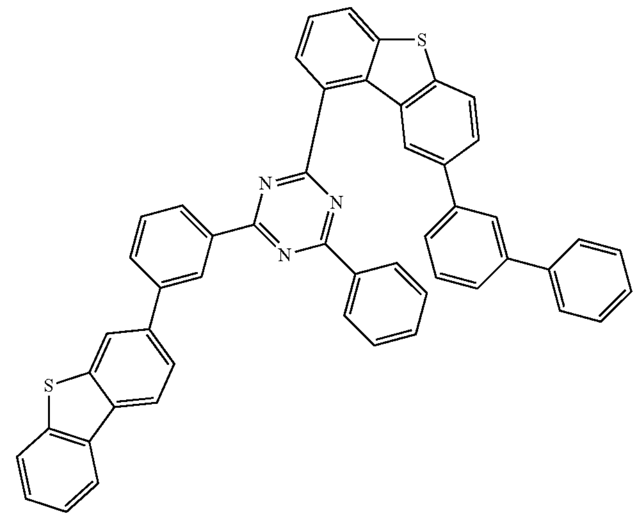
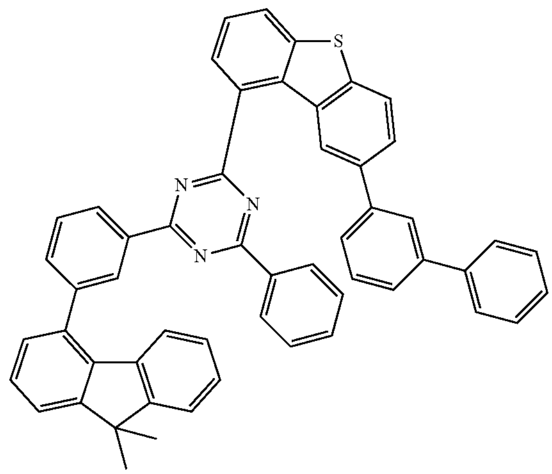
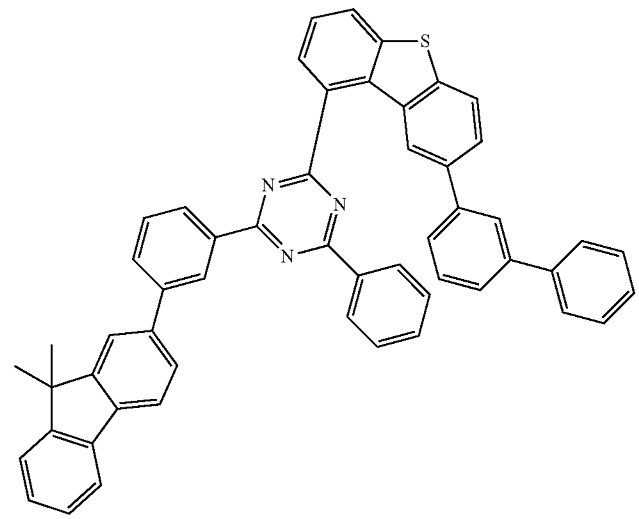
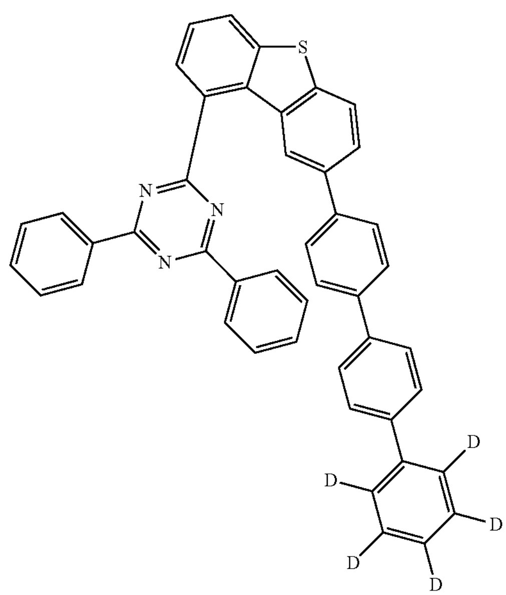
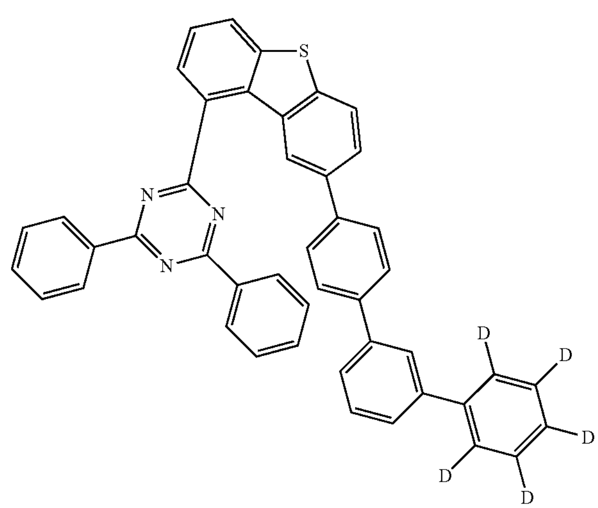

-continued
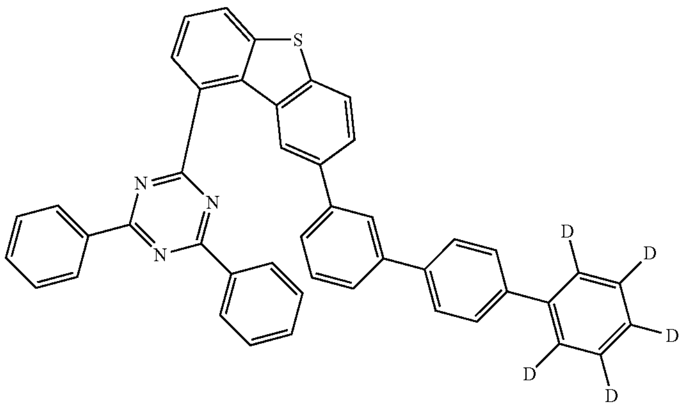
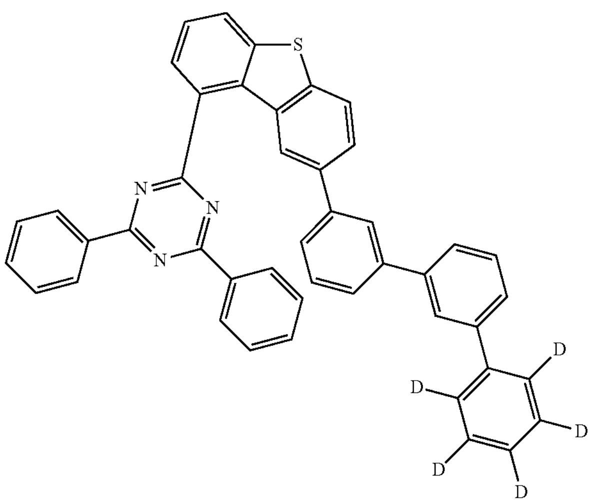
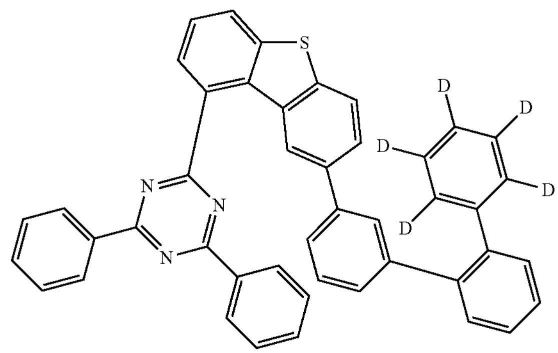
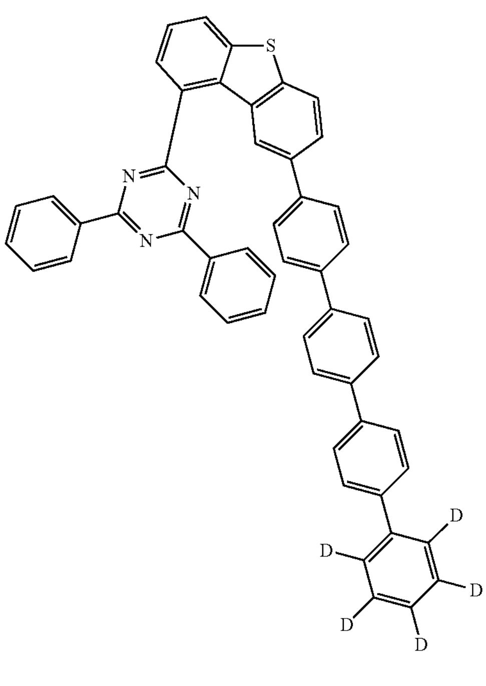

-continued
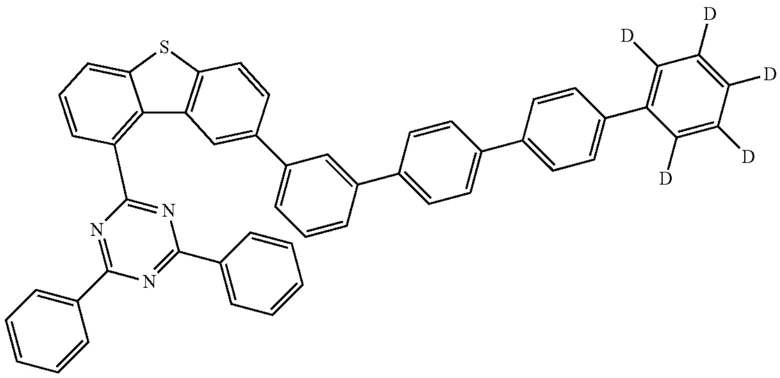
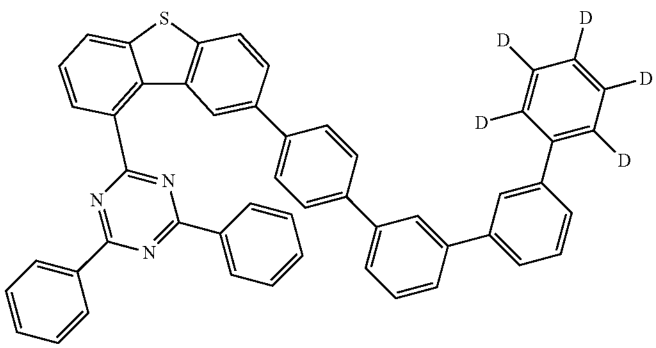
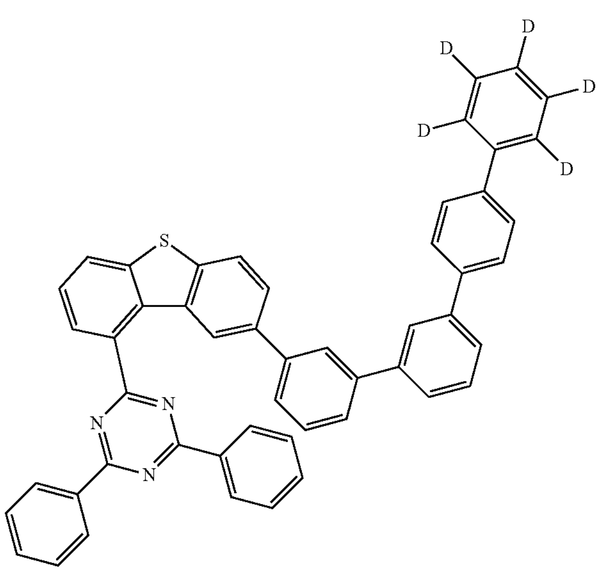

-continued
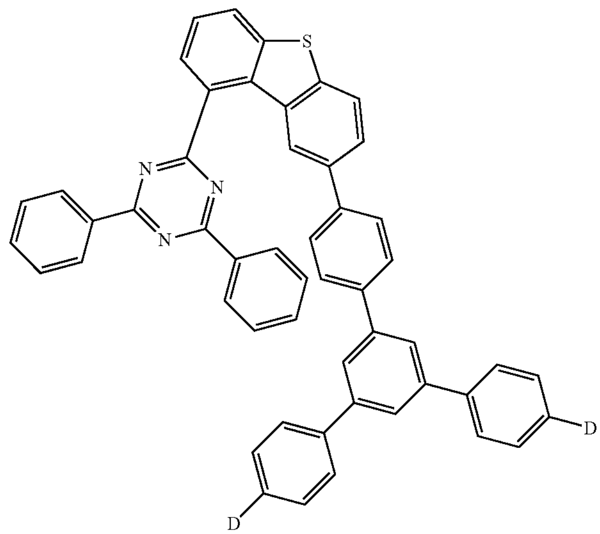
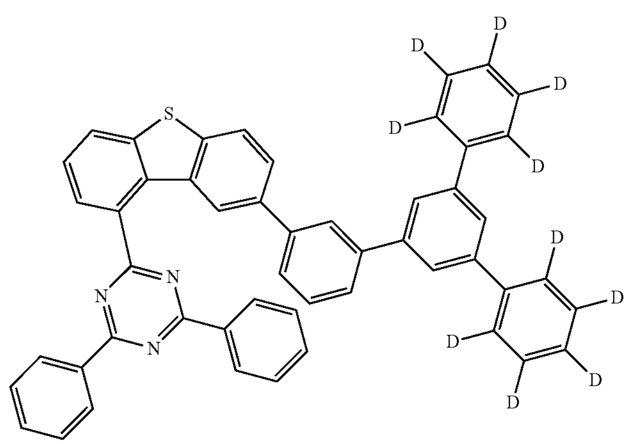
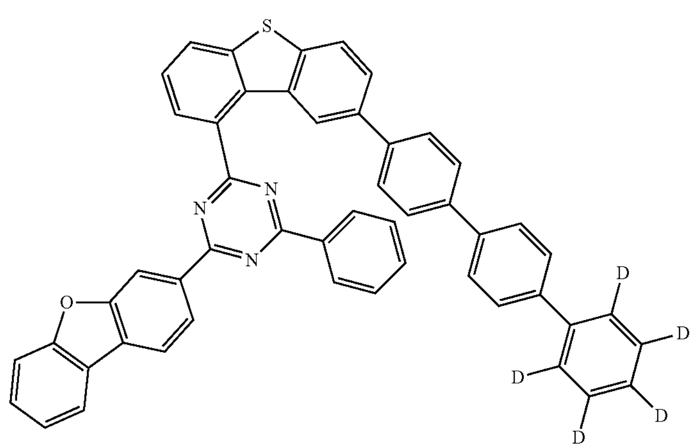

-continued
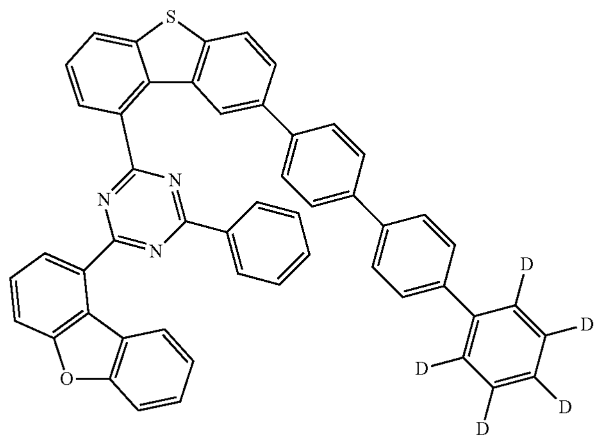
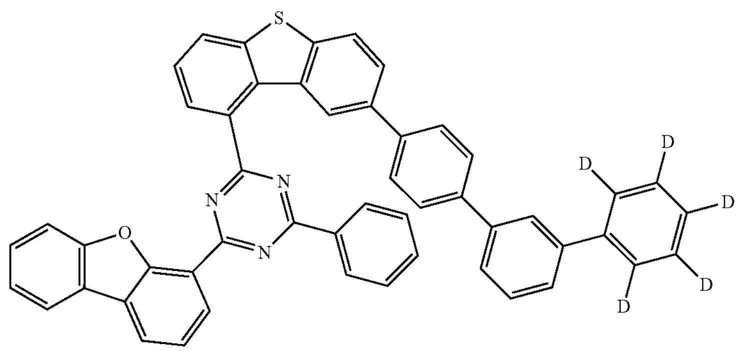
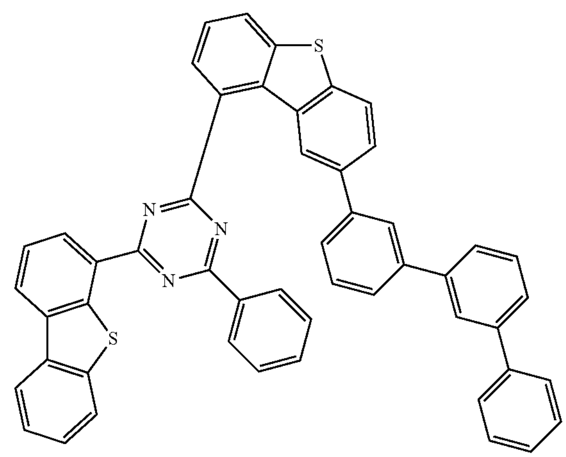
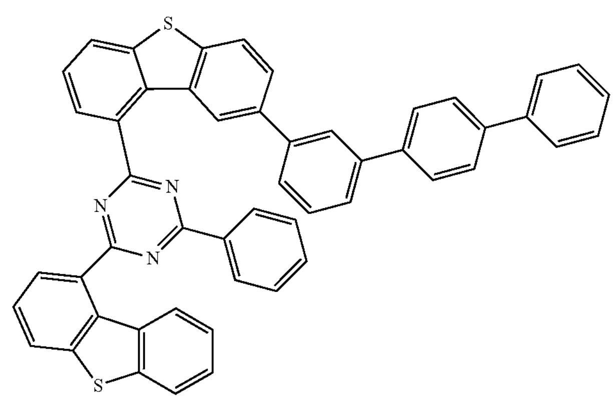
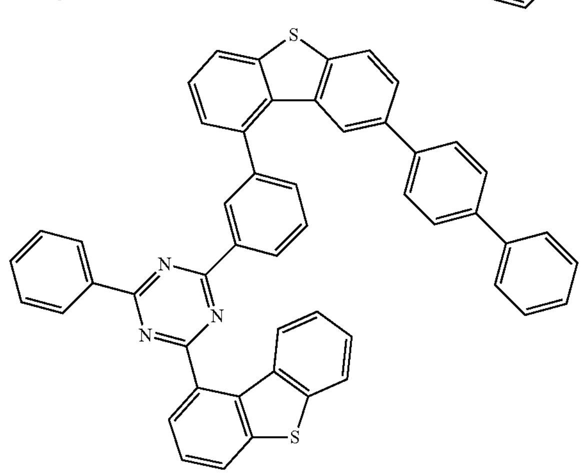
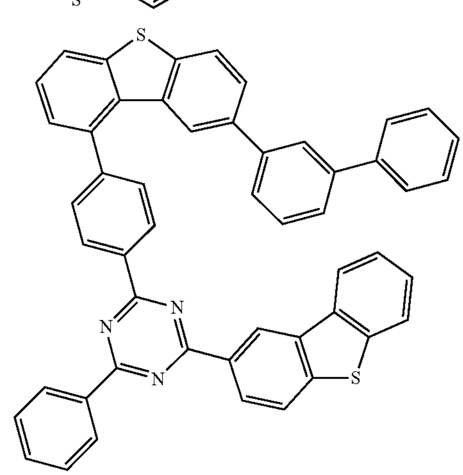

-continued
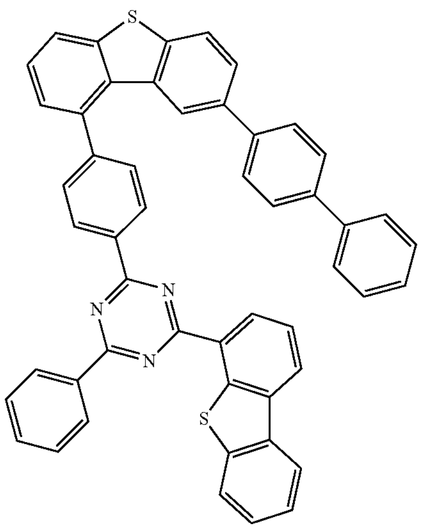
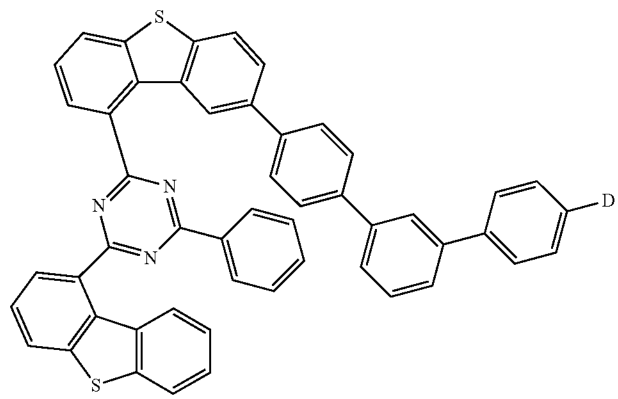
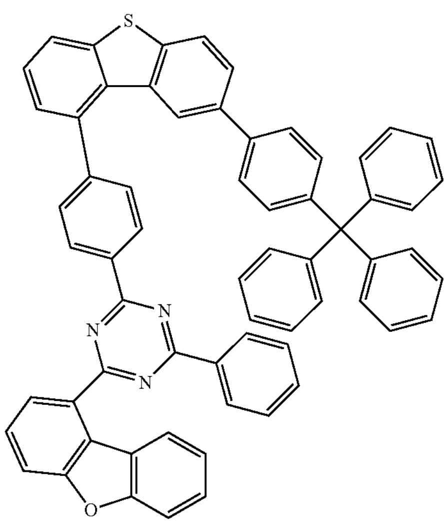
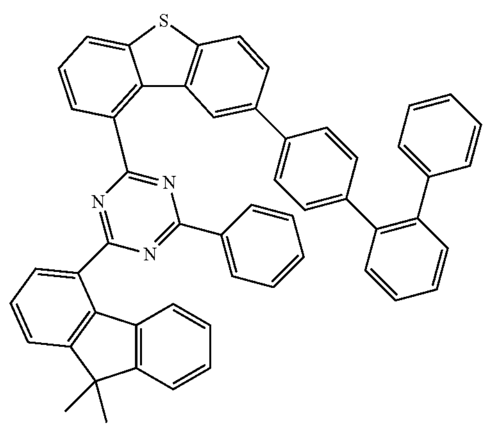
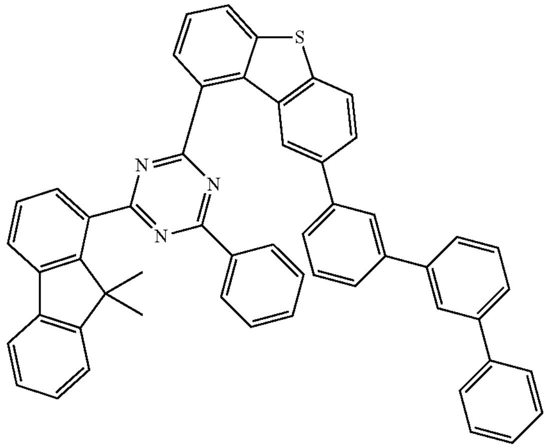
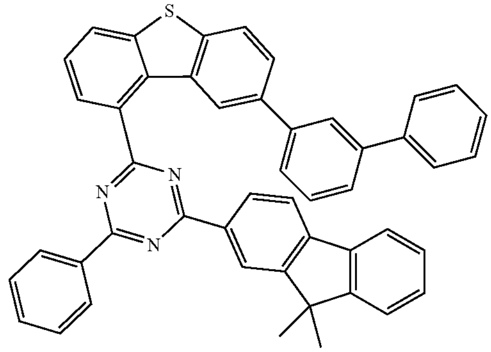

-continued
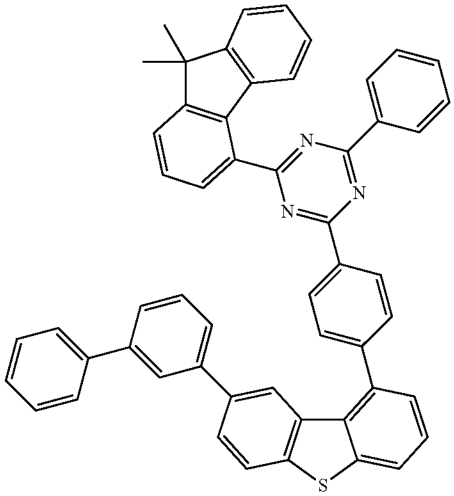
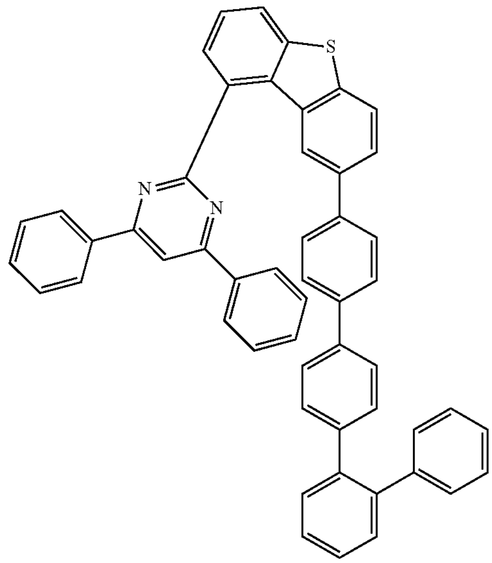
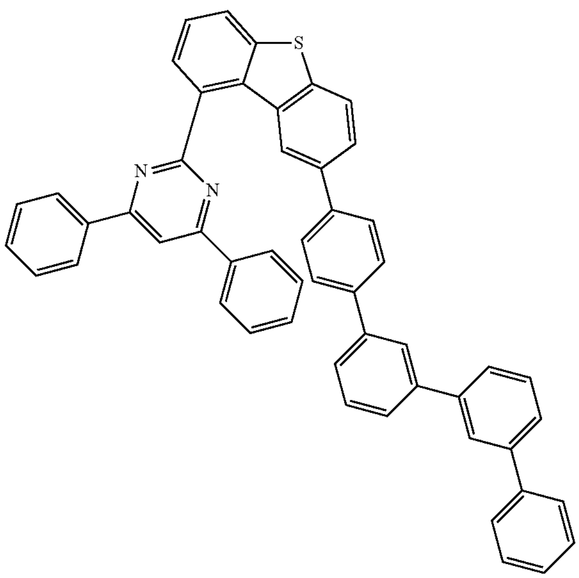
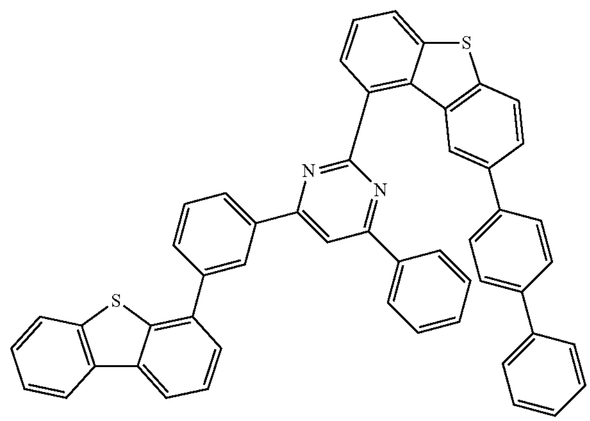
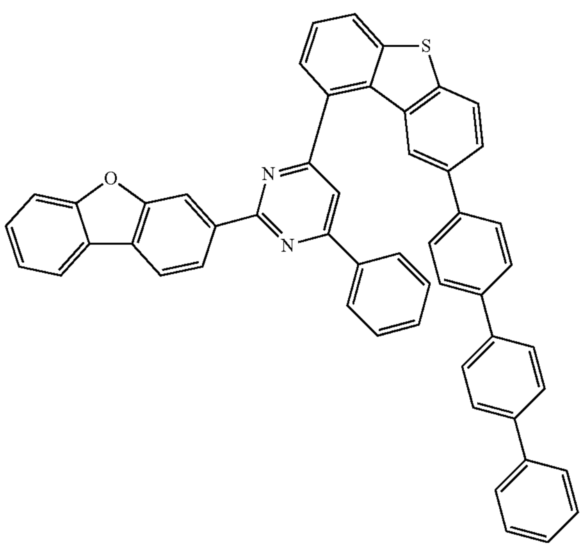
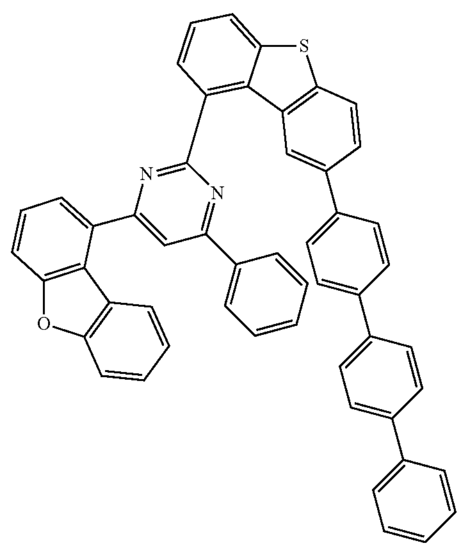

-continued
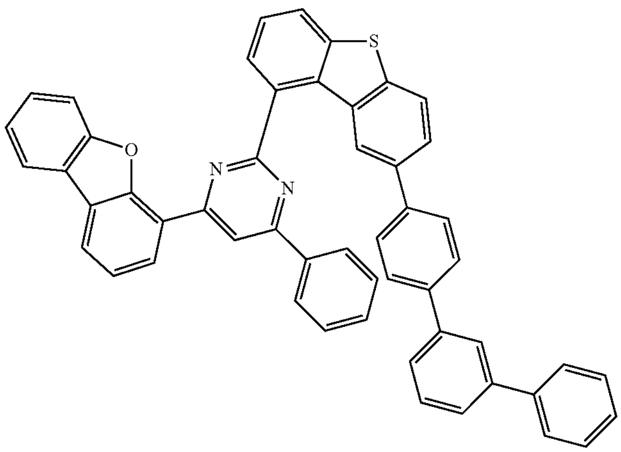
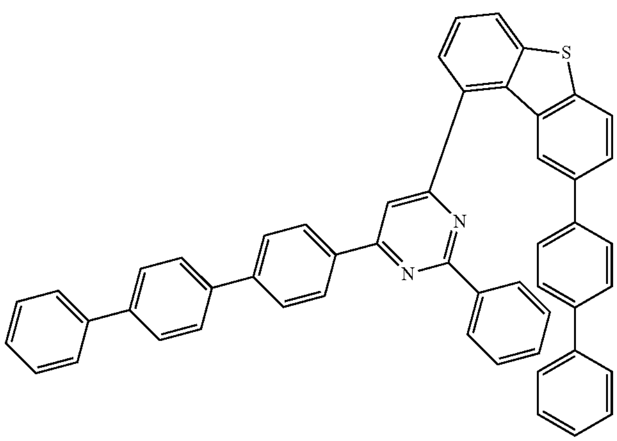
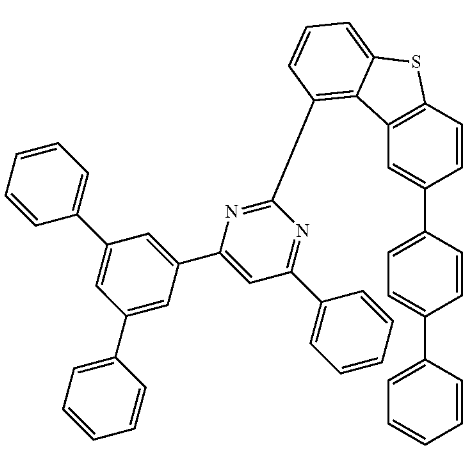
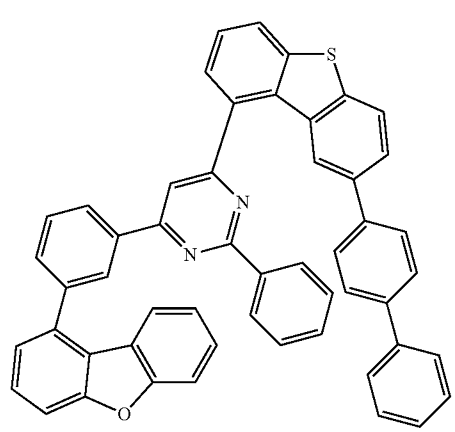

-continued
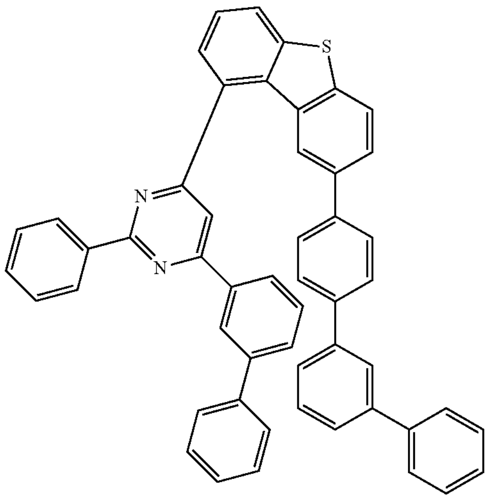
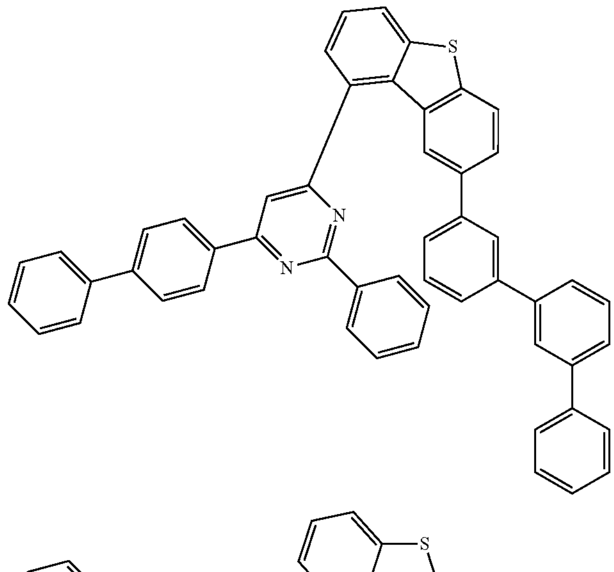
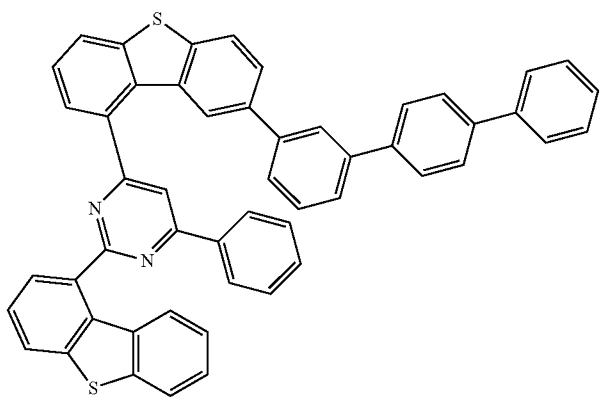
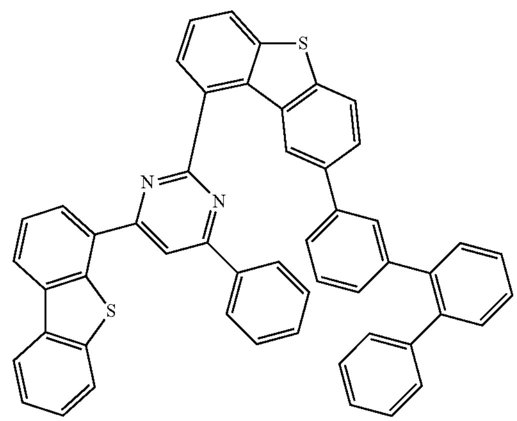
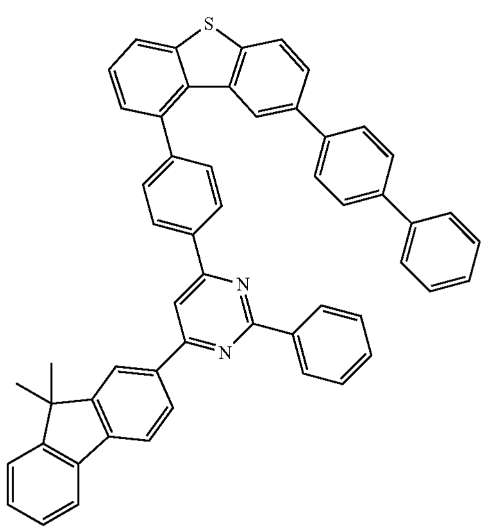
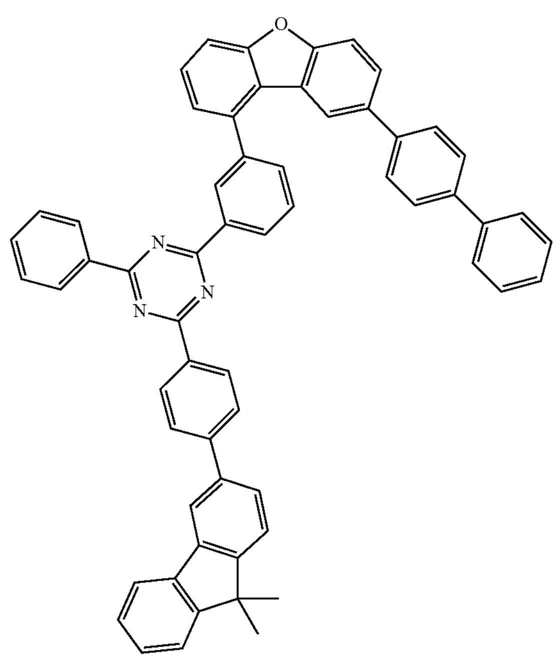

-continued
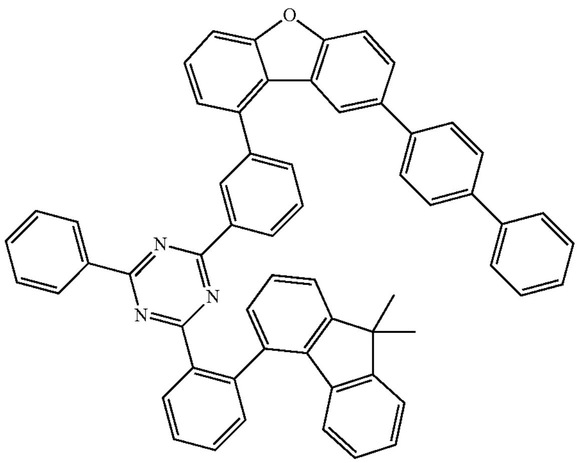
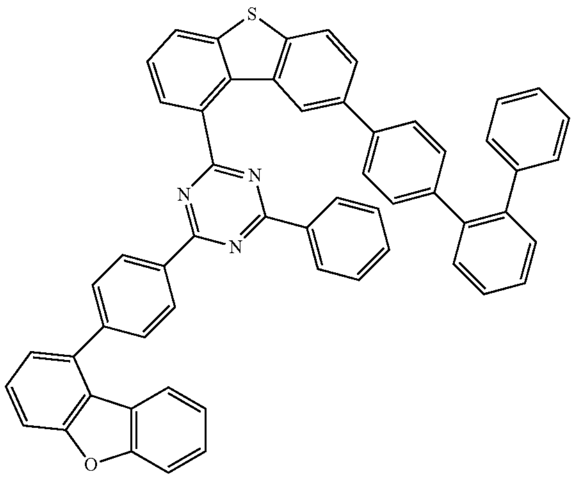
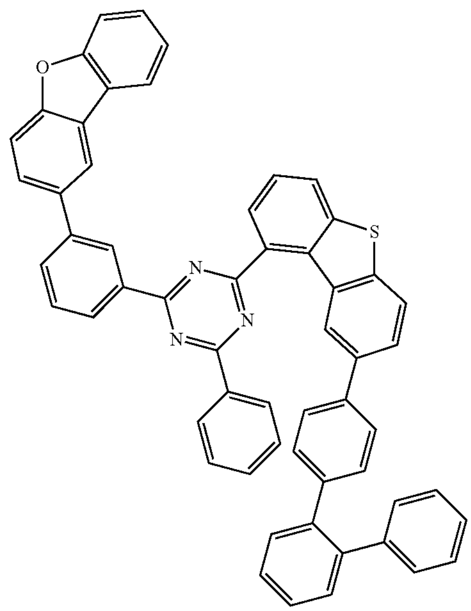
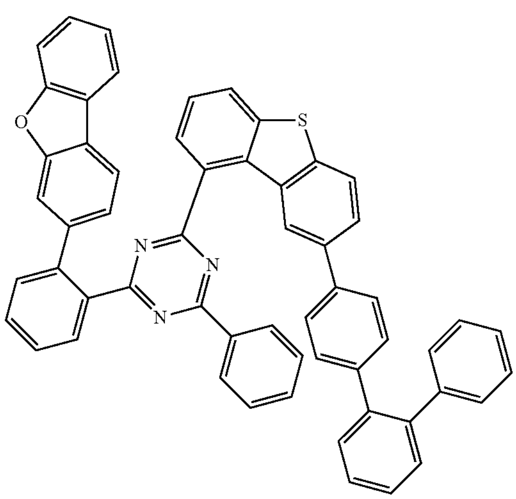
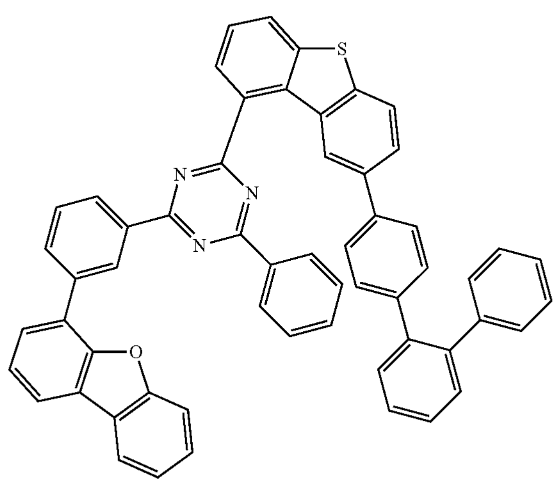

-continued
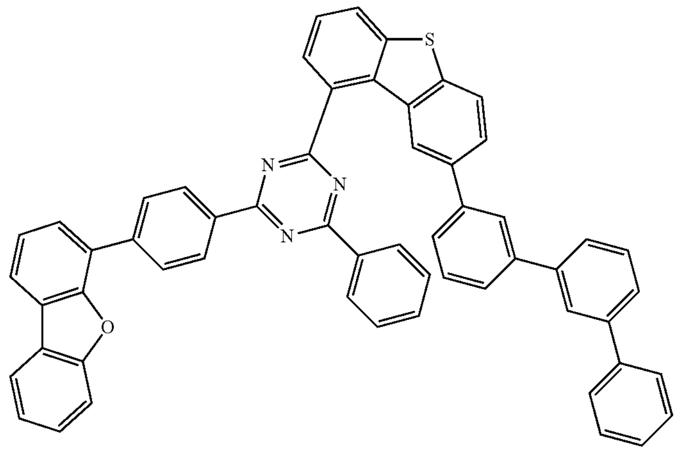
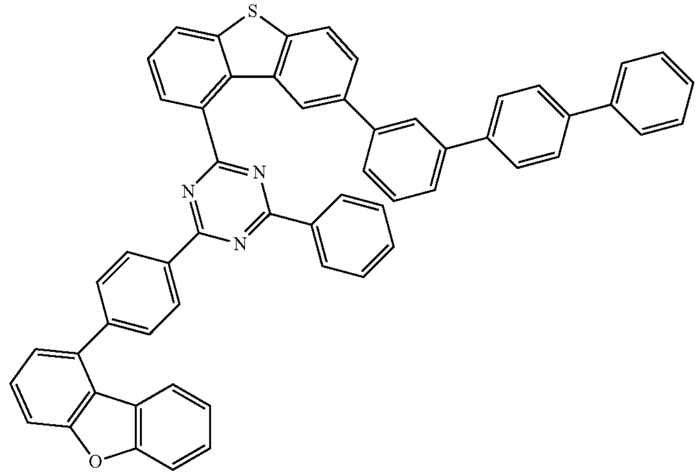
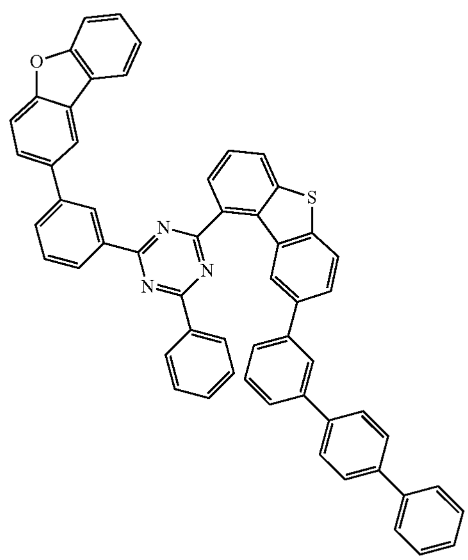
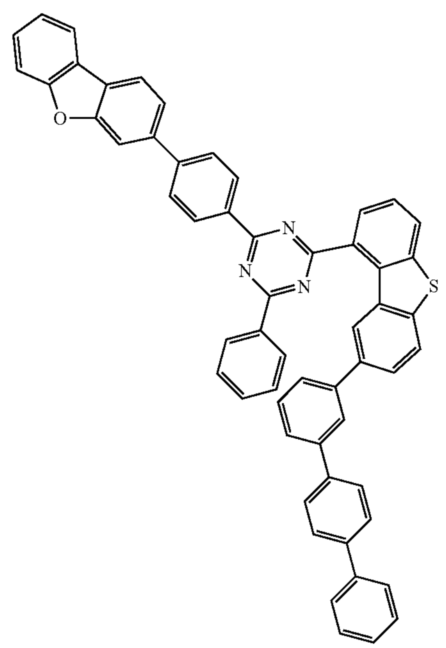

-continued
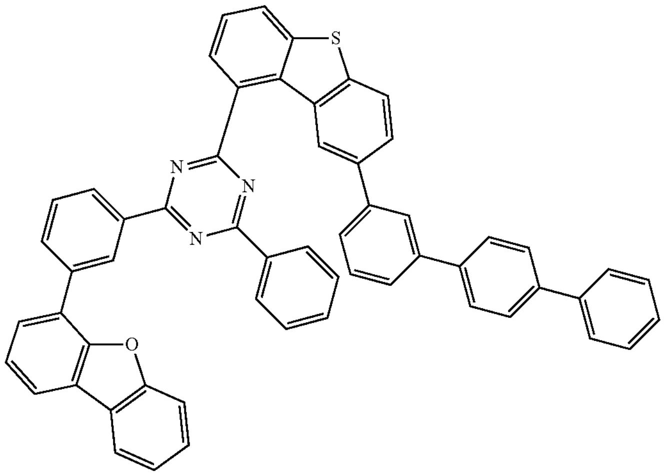
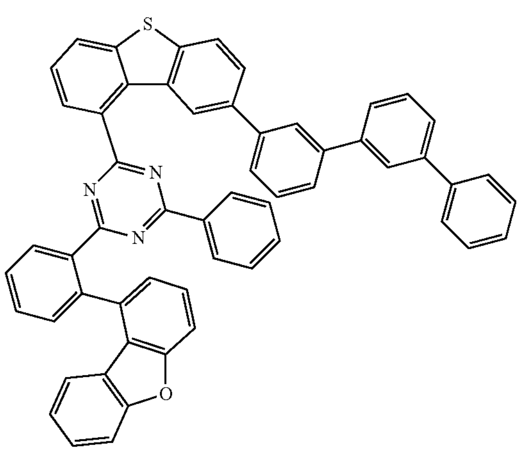
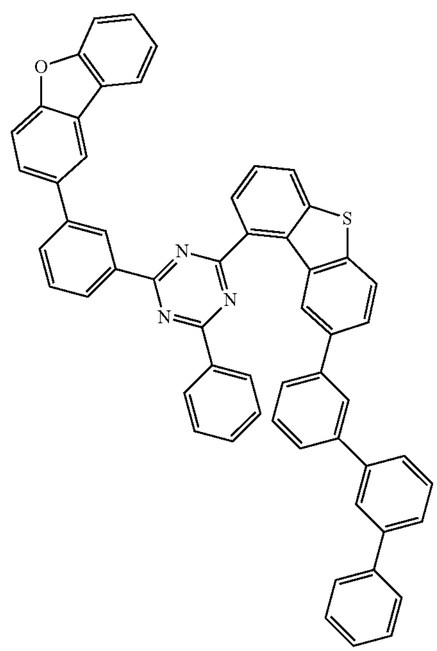

-continued
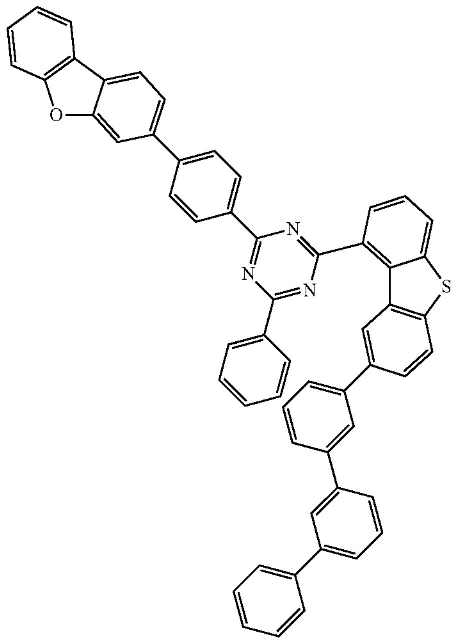
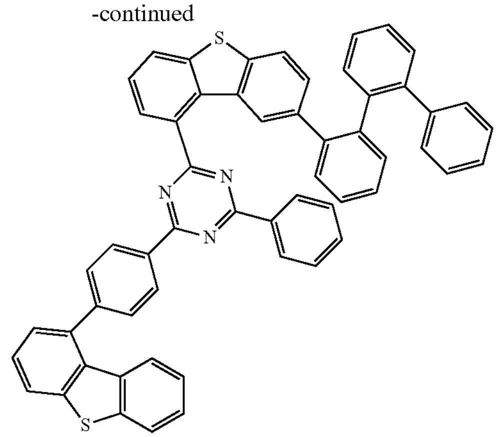
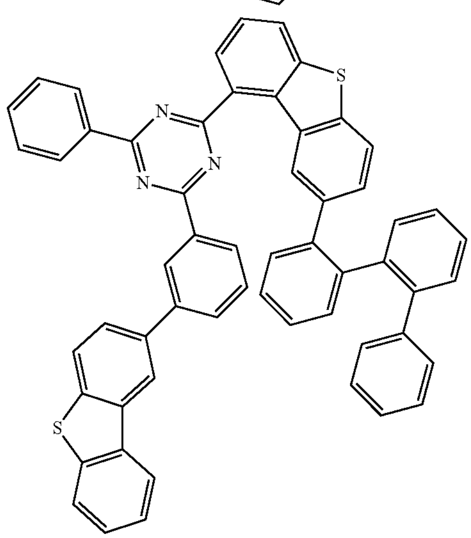
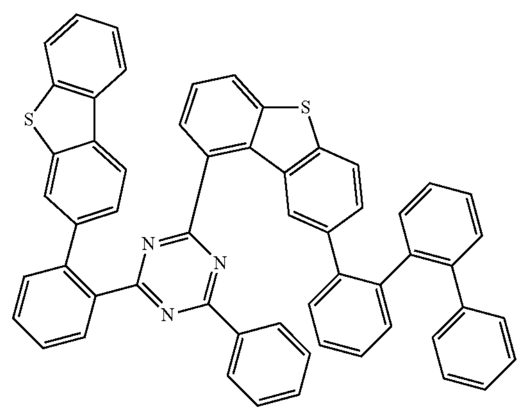
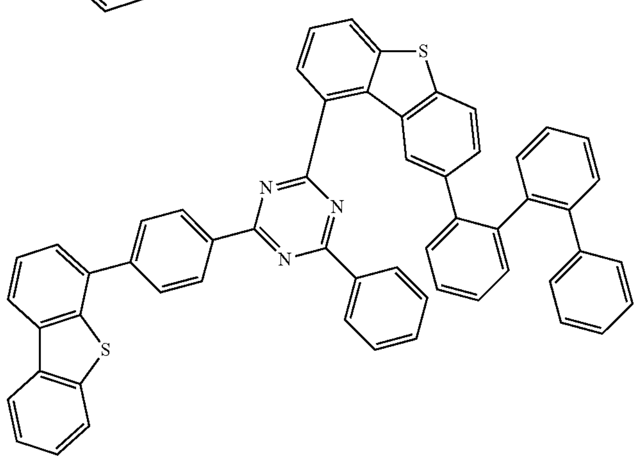
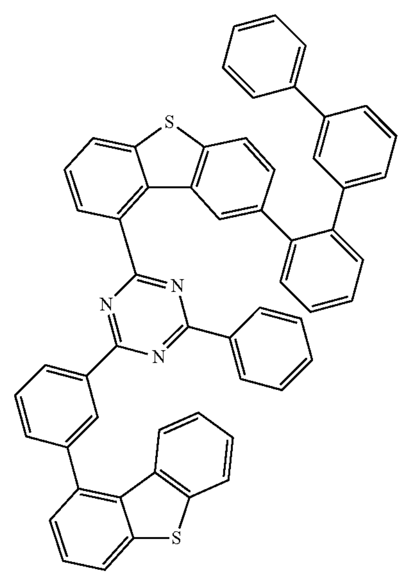

-continued
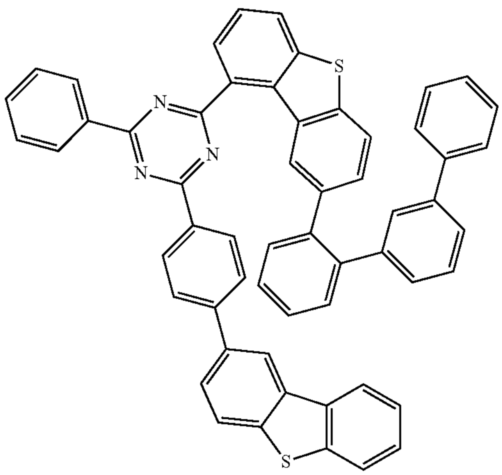
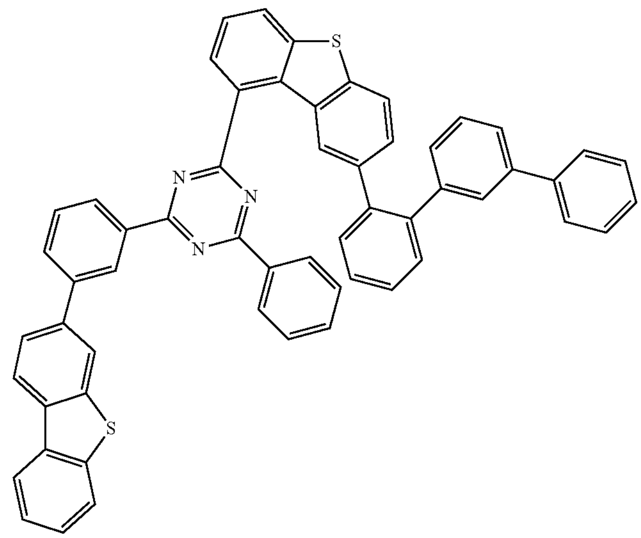
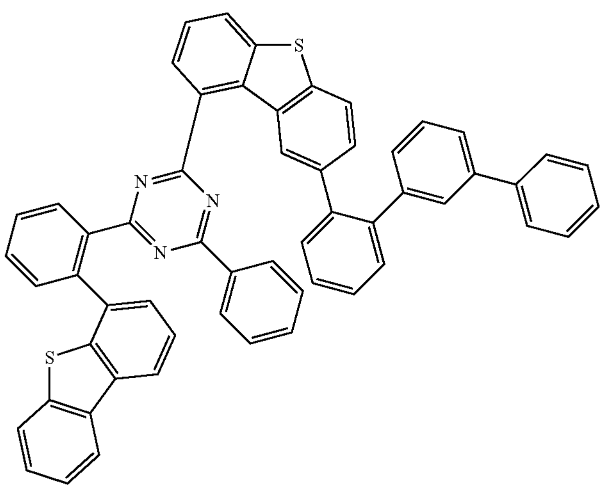
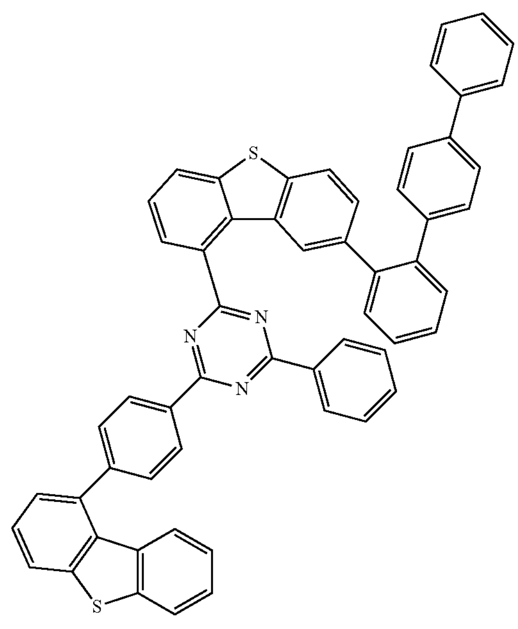

-continued
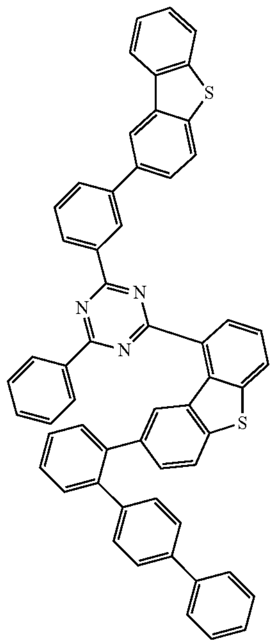
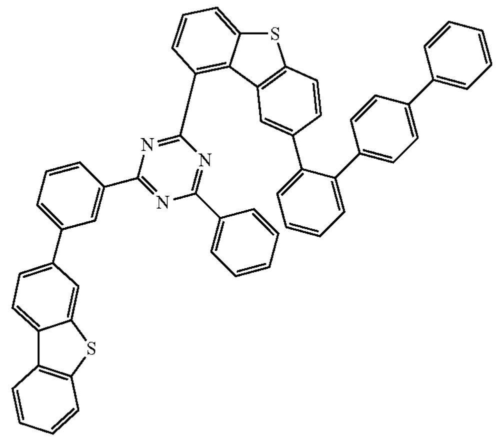
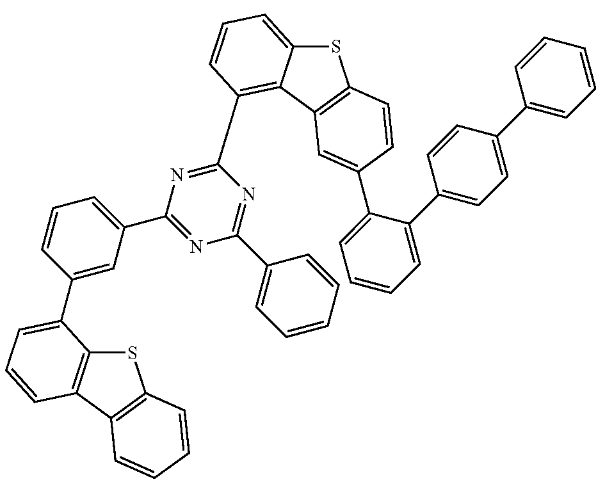
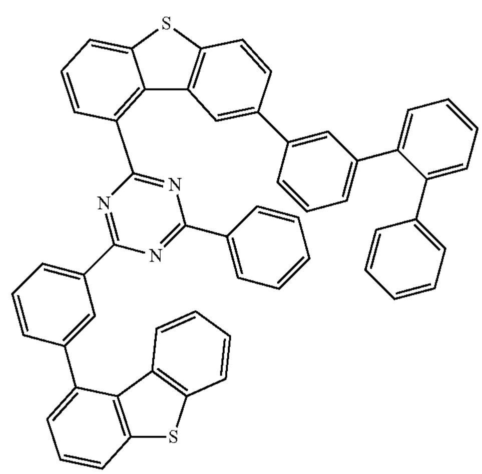

-continued
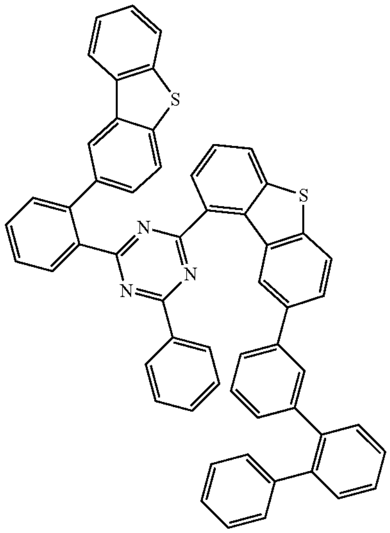
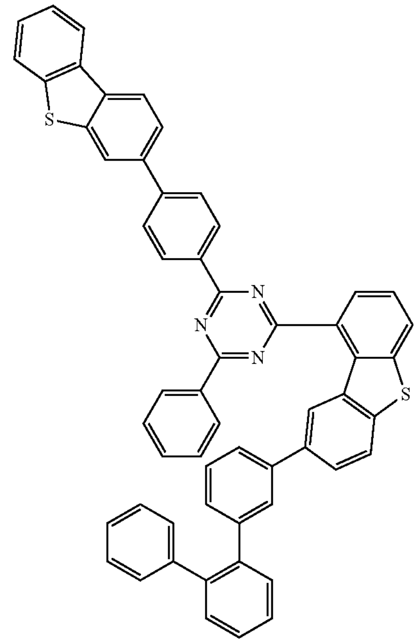
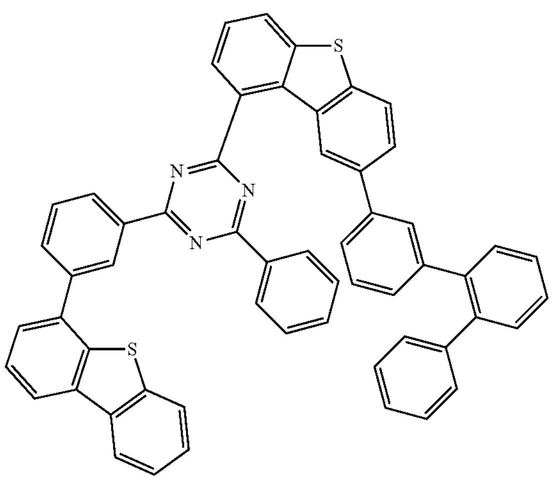
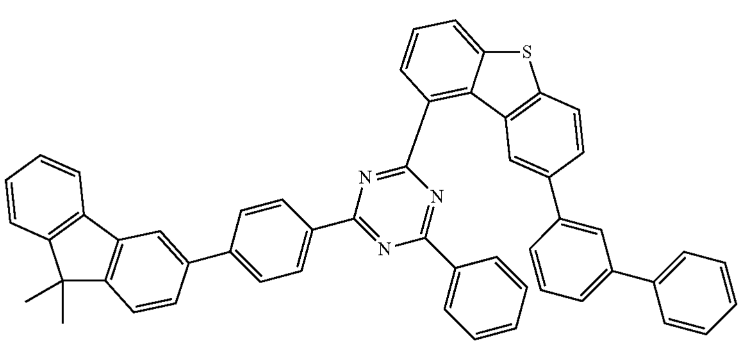

-continued
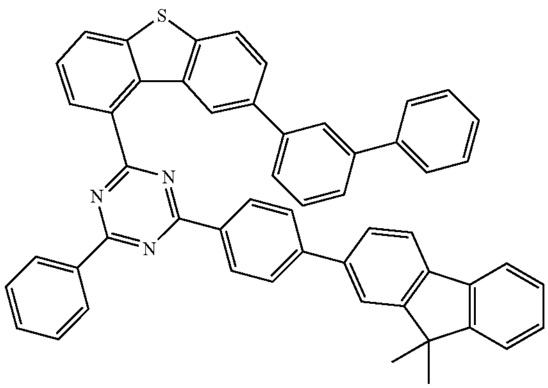
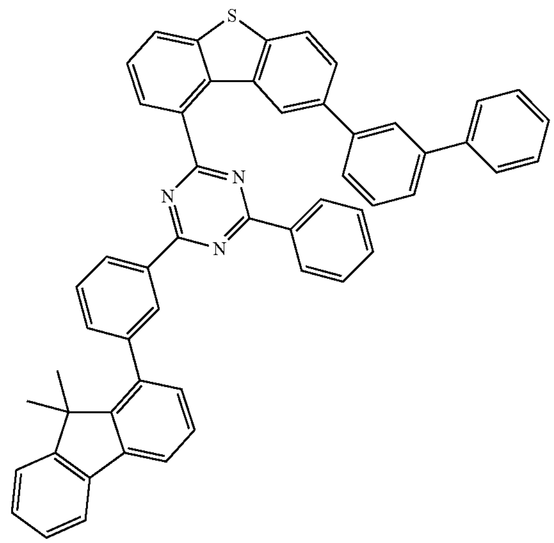
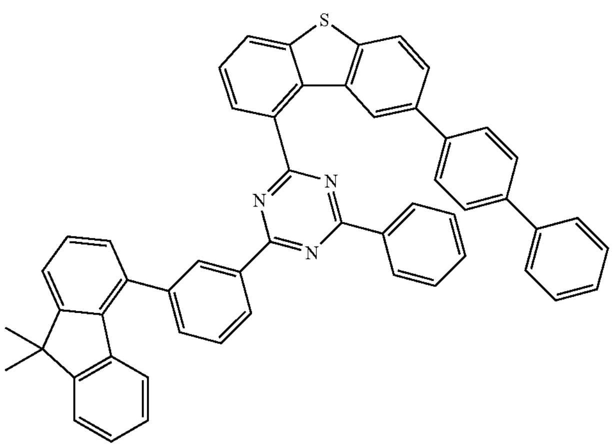
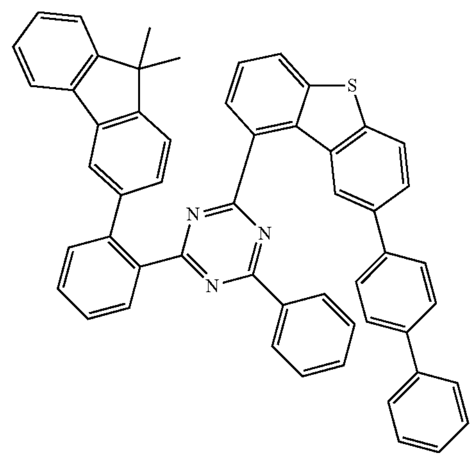
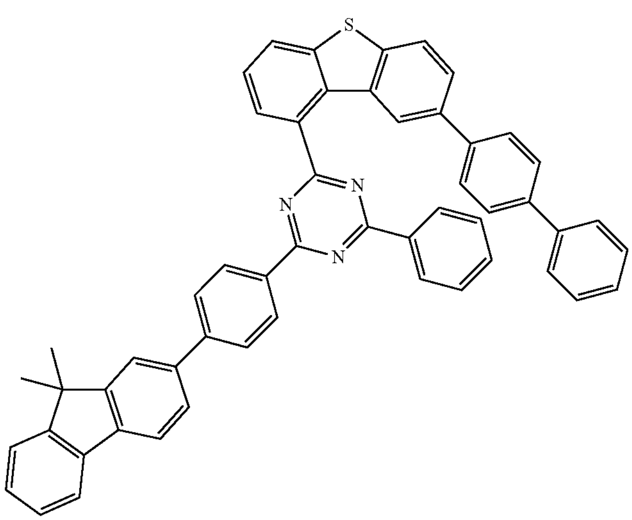

-continued
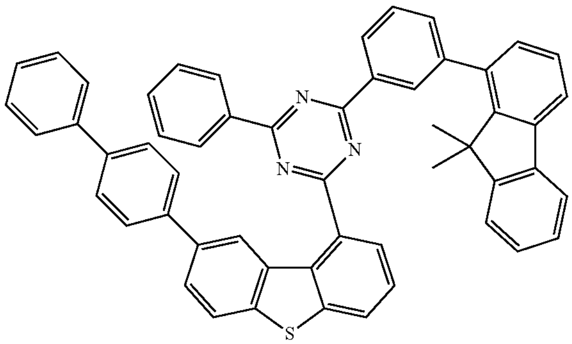
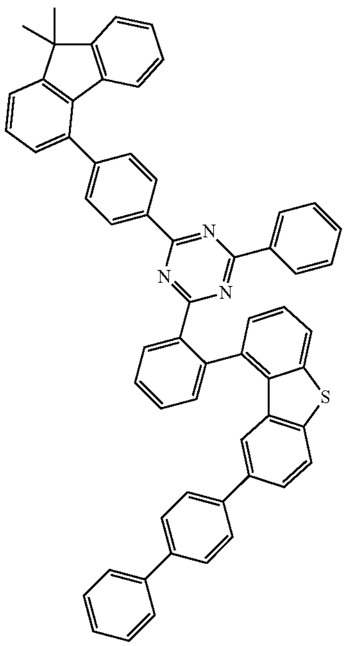
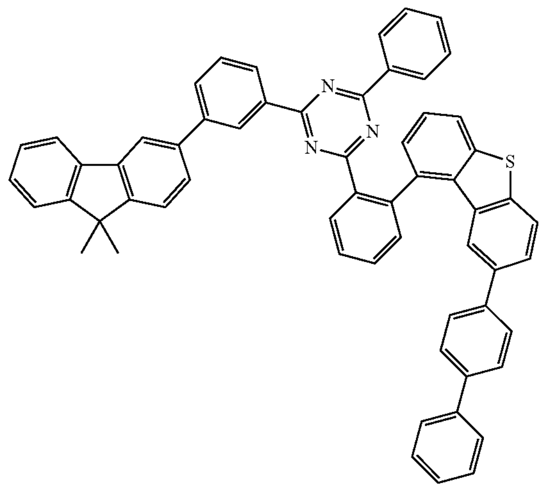
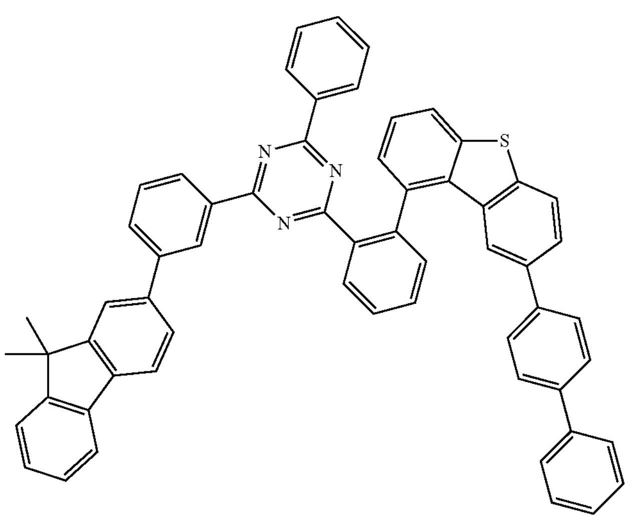

-continued
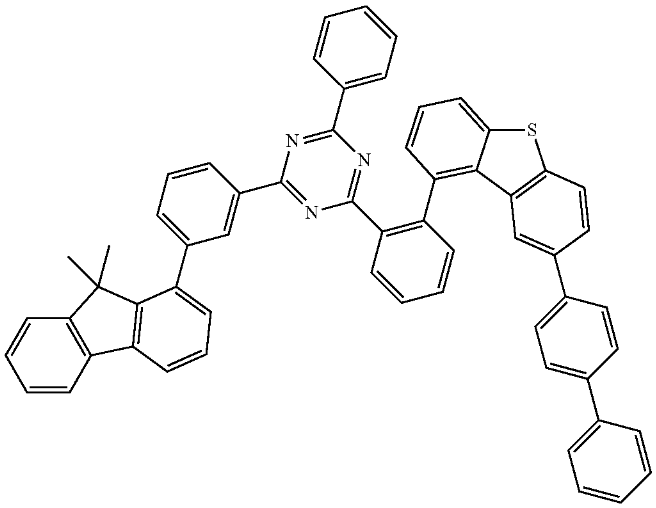
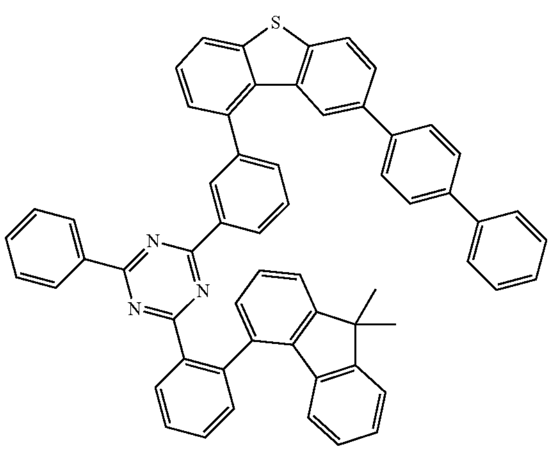
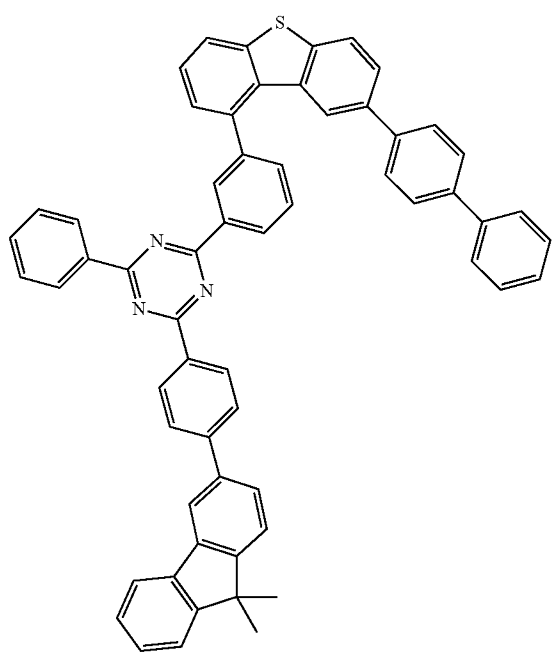

-continued
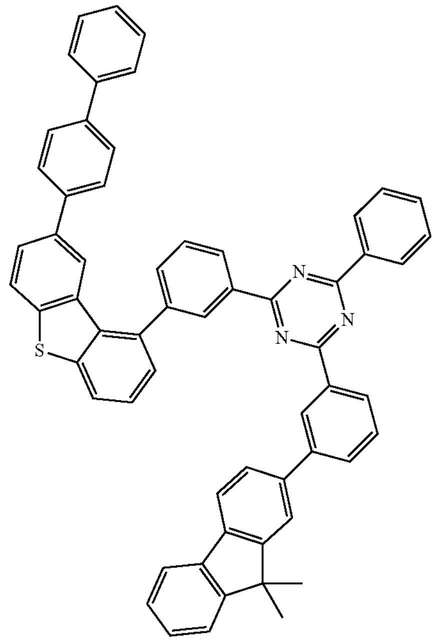
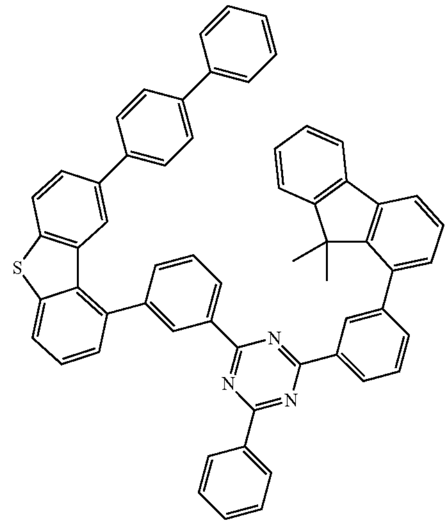
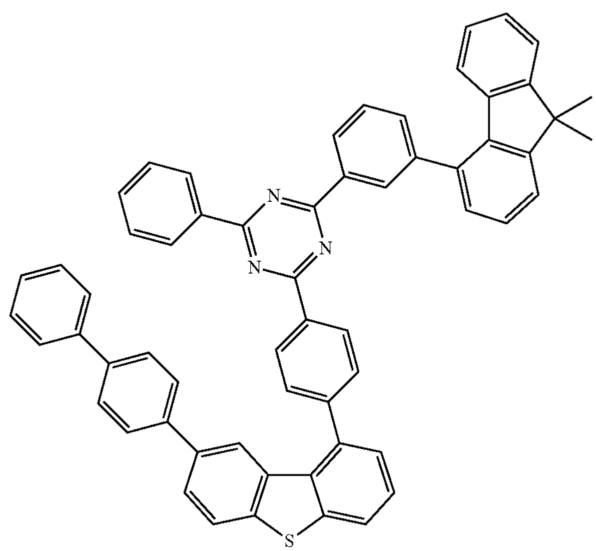
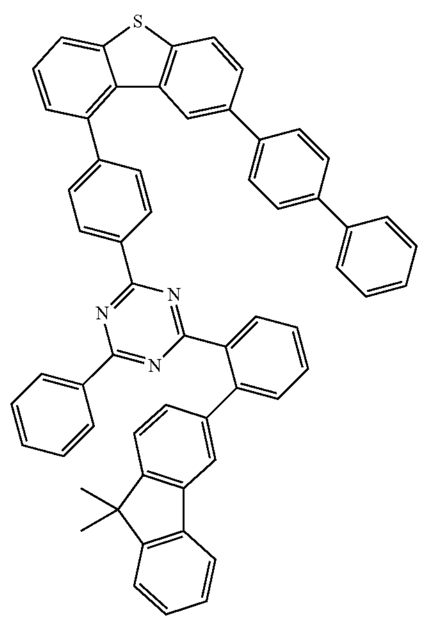
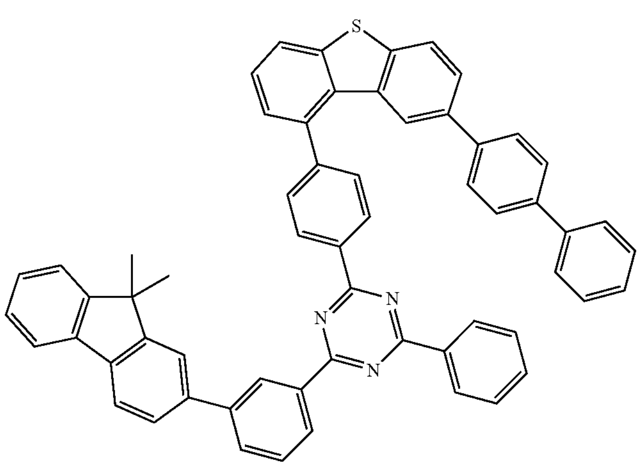

-continued
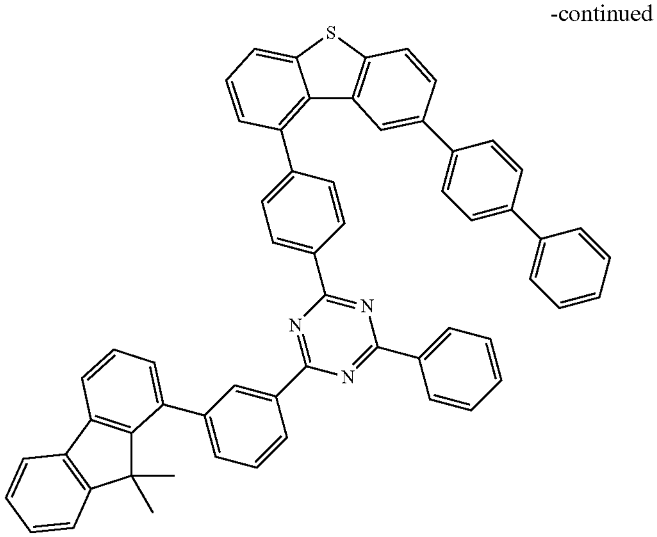
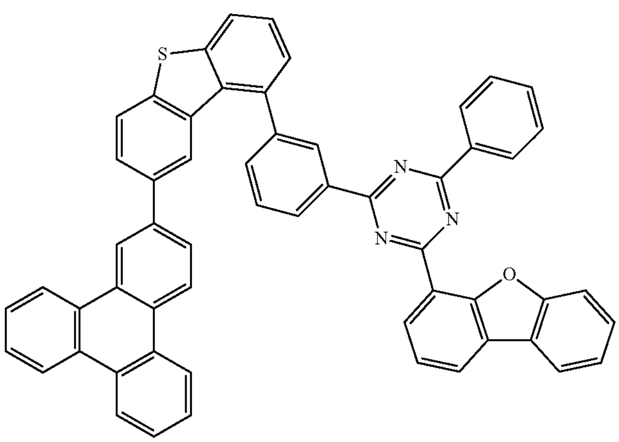
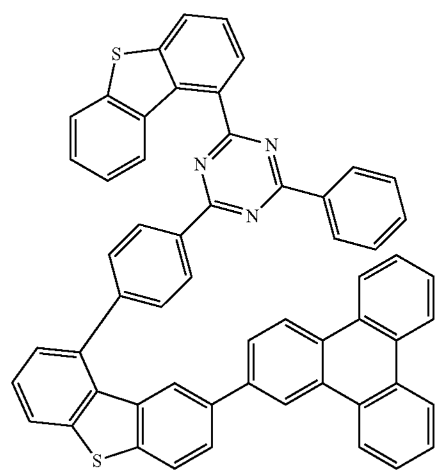
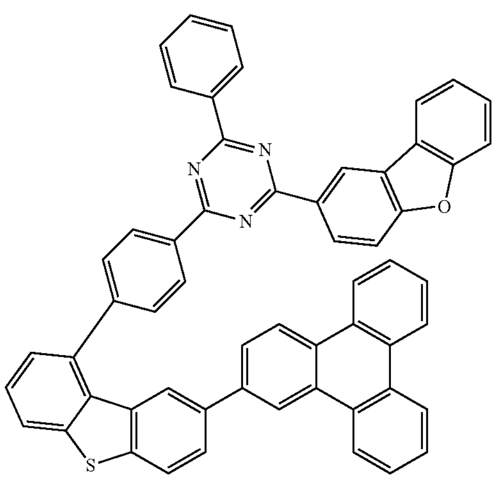
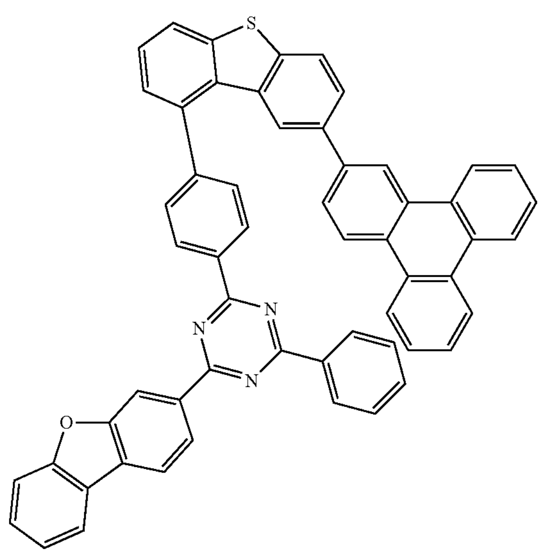

-continued
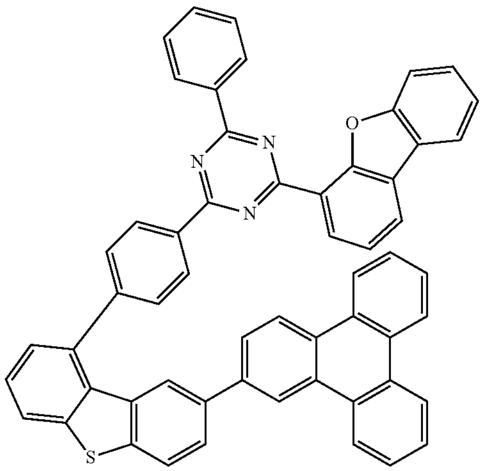
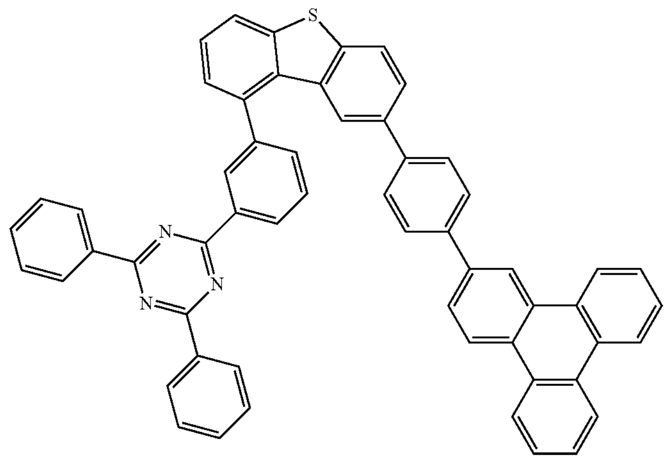
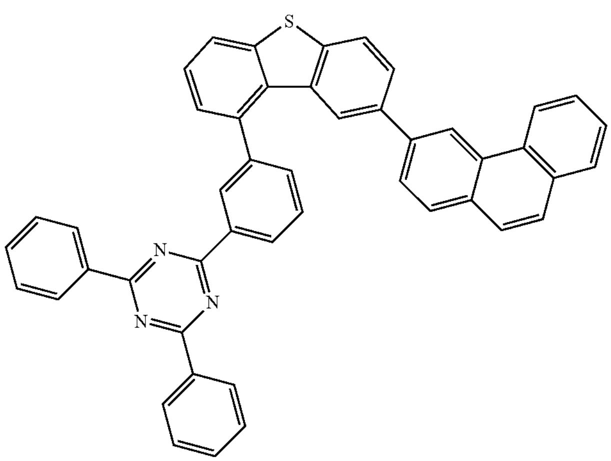
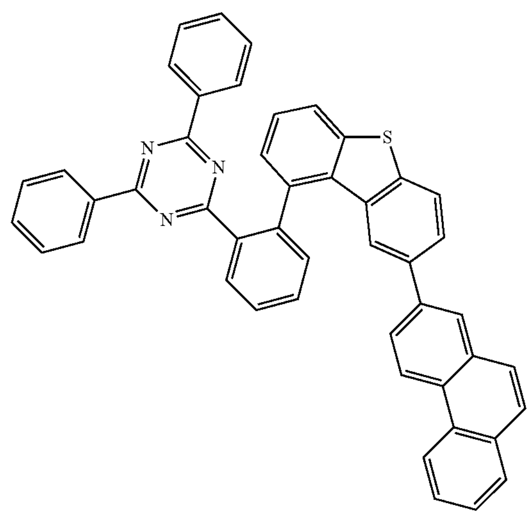
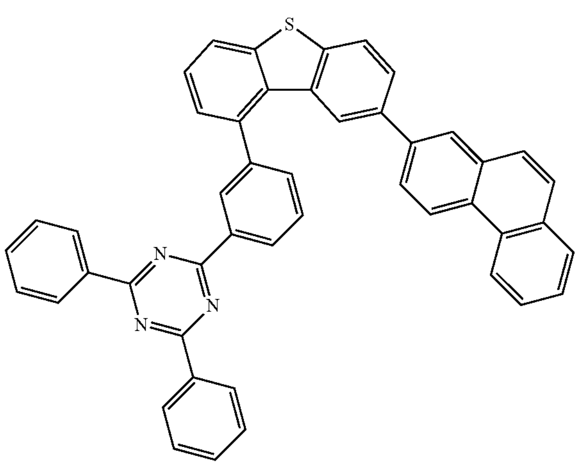
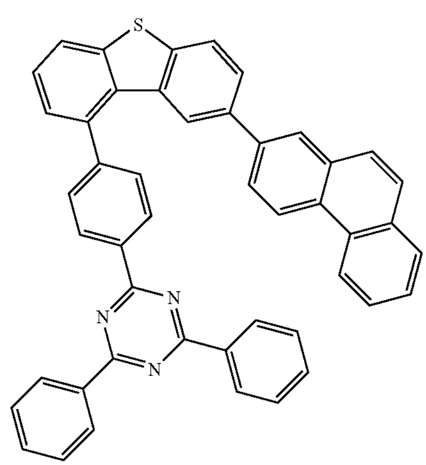

-continued
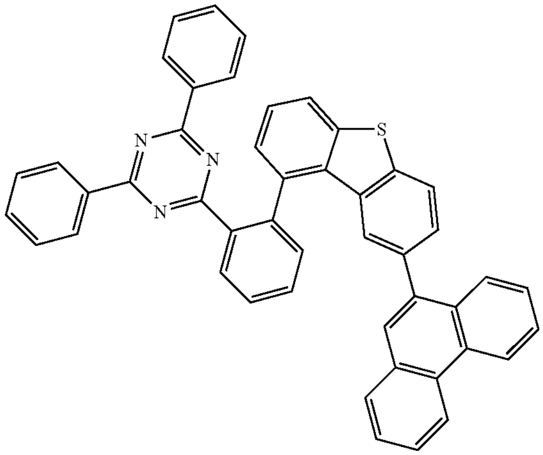
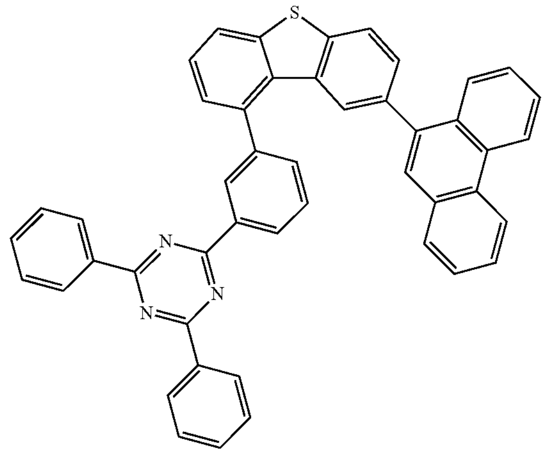
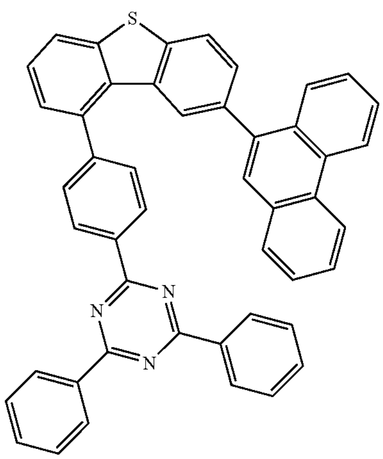
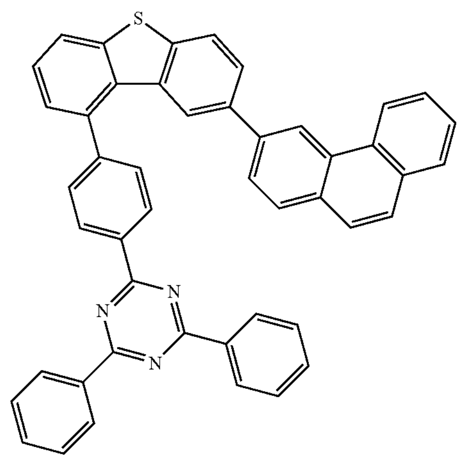
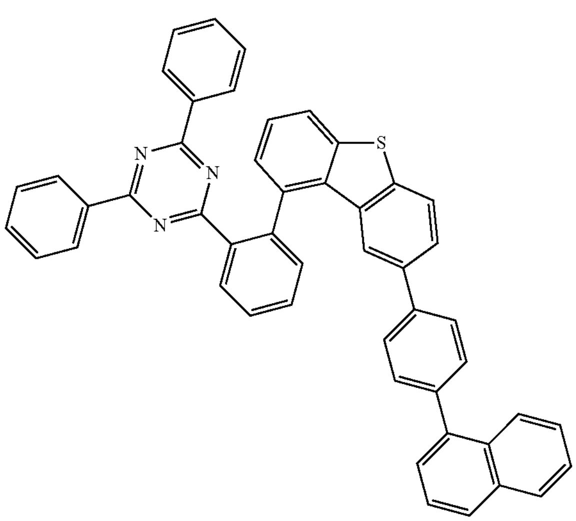
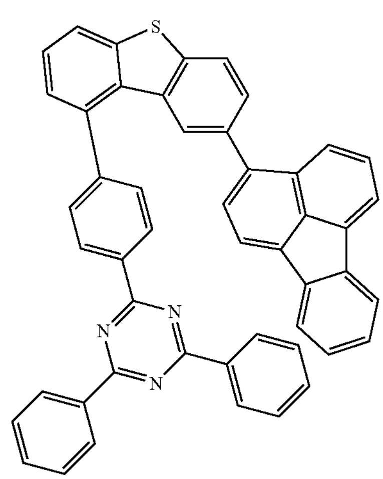

-continued
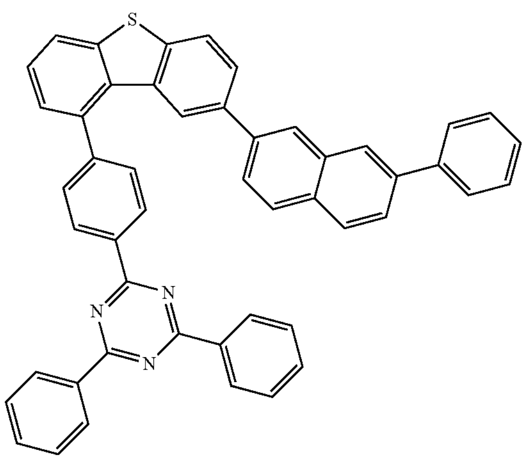
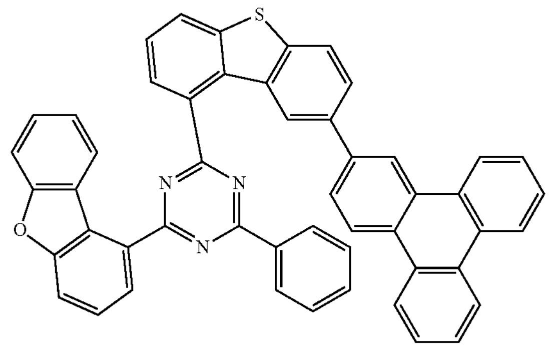
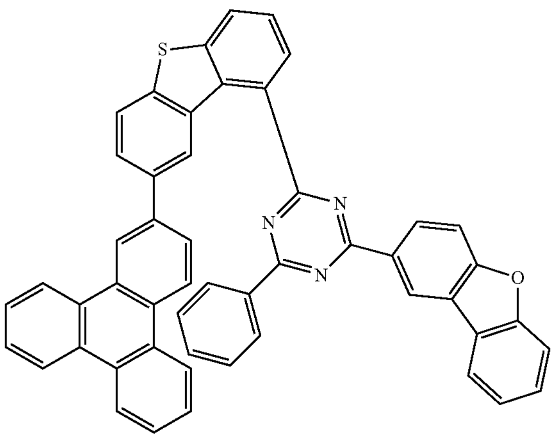
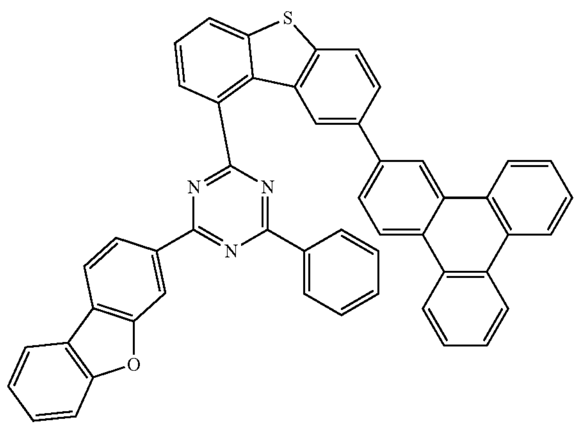
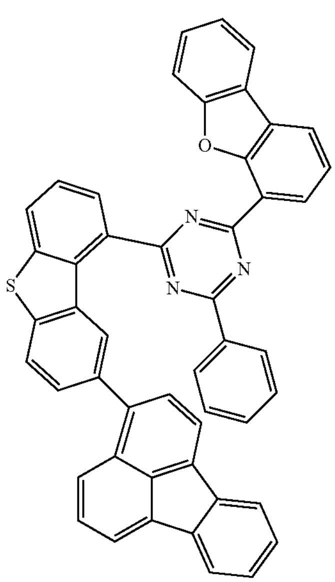
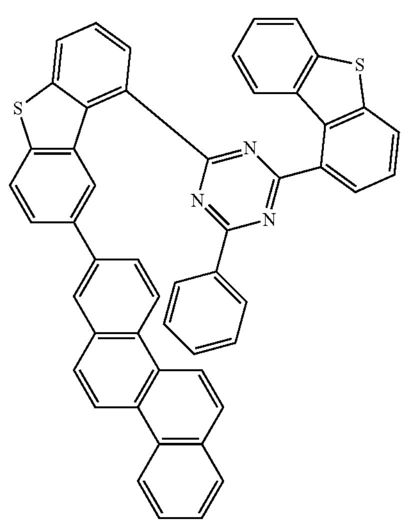

-continued
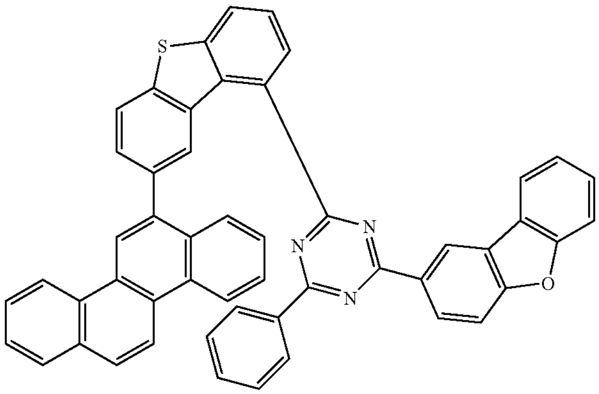
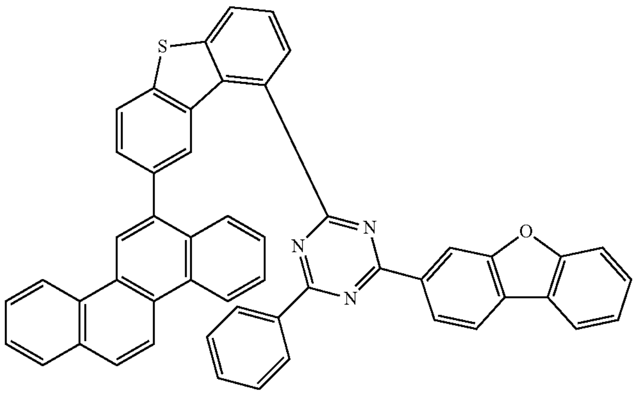
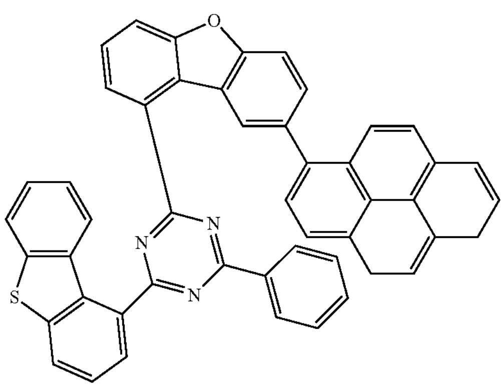
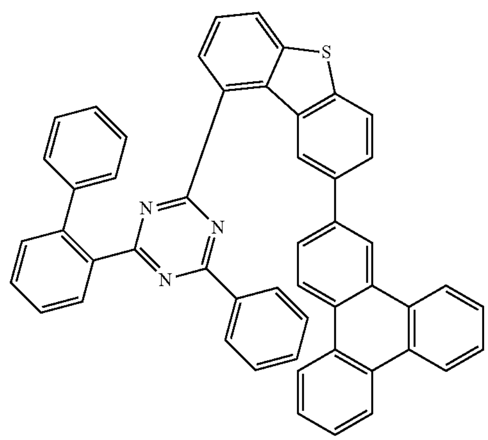
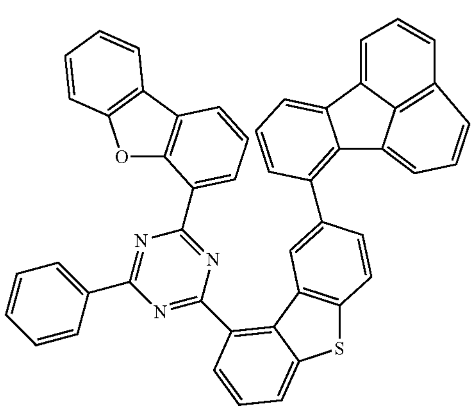
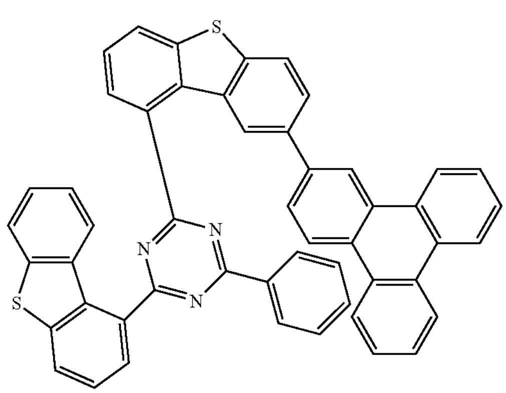

-continued
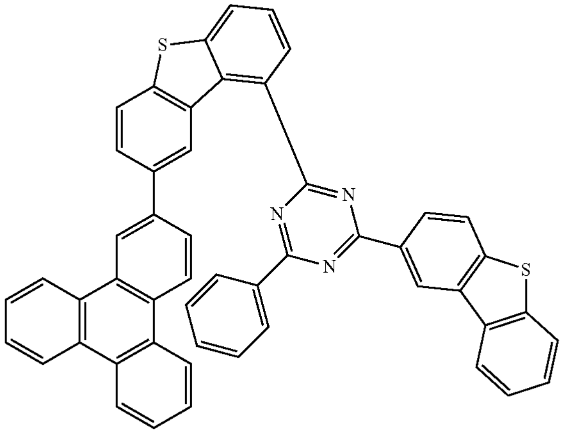
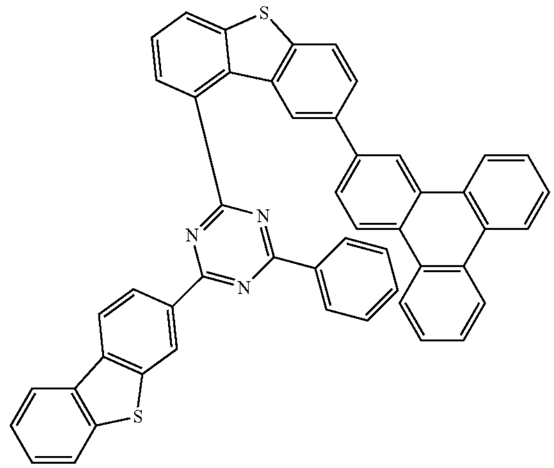
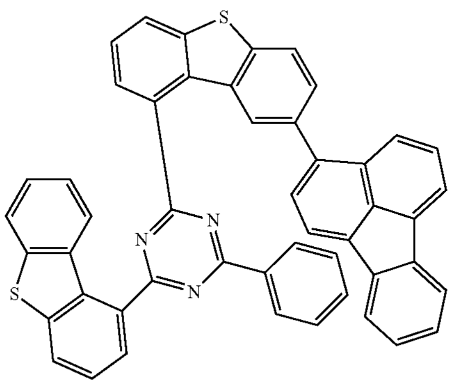
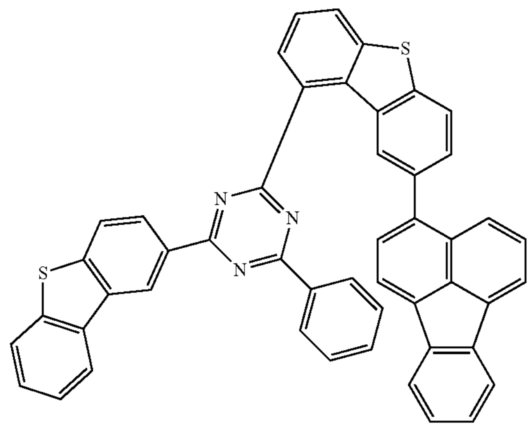
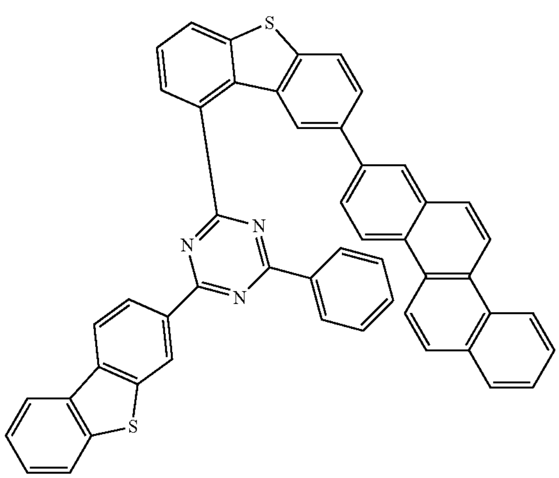
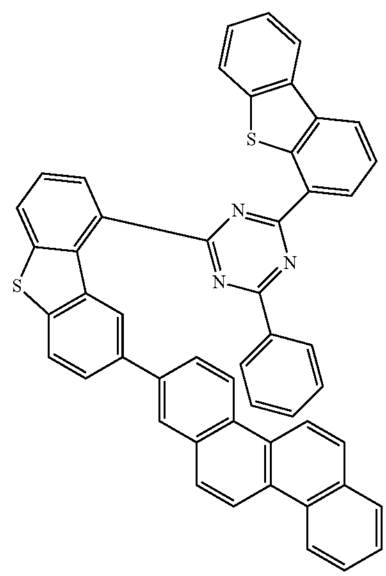

-continued
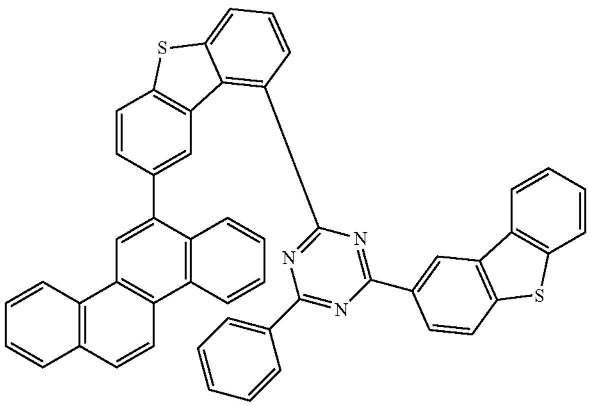
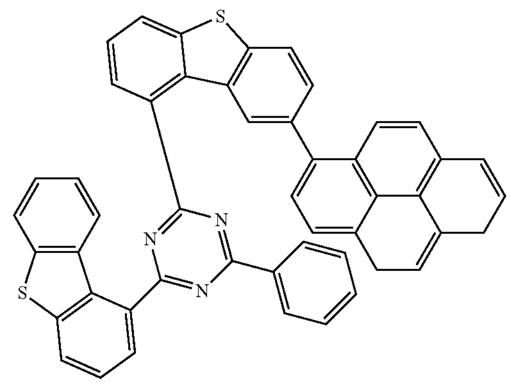
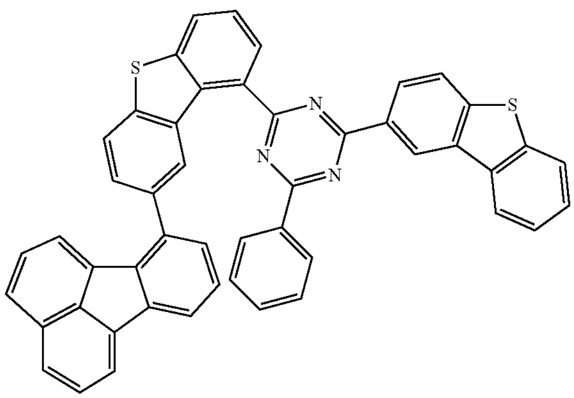
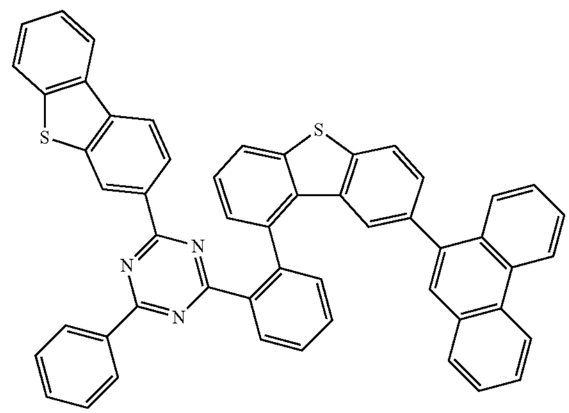
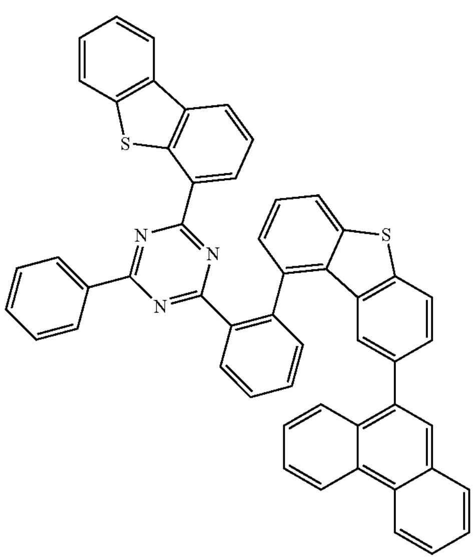
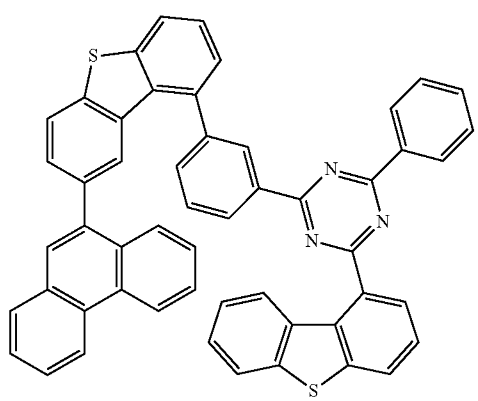

-continued
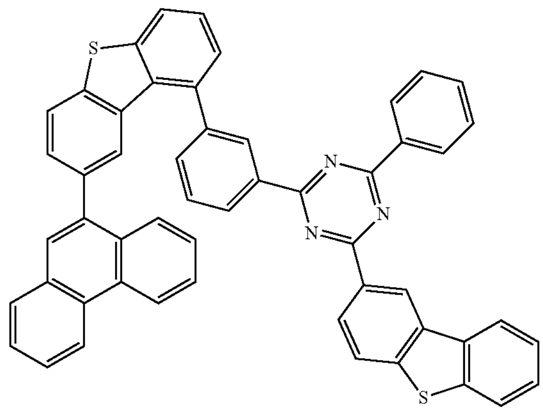
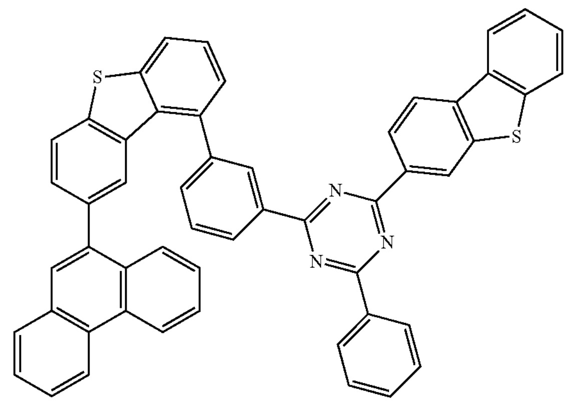
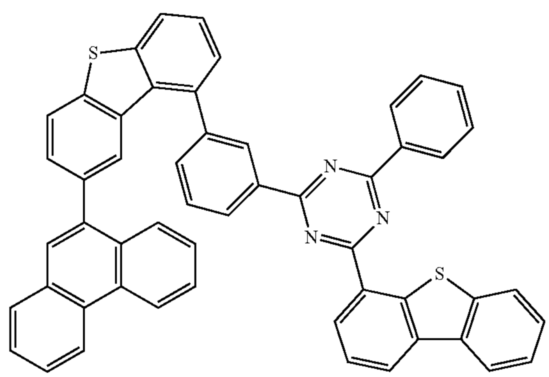
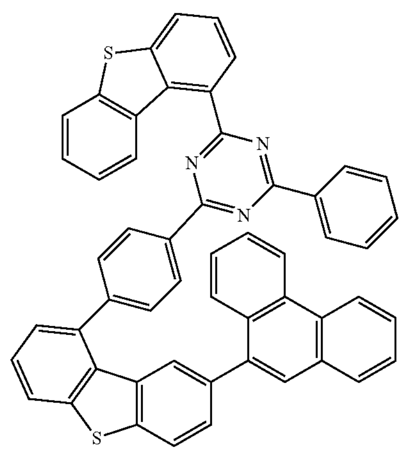
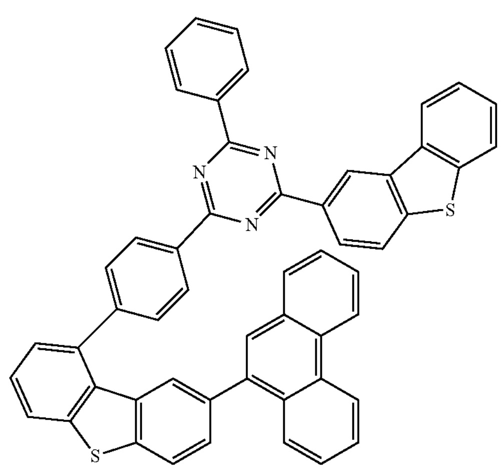
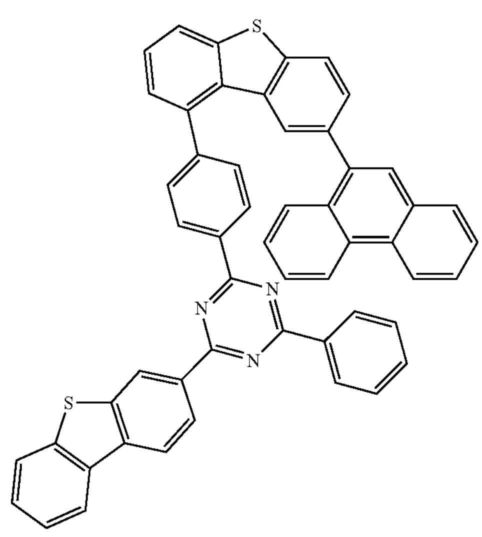

-continued
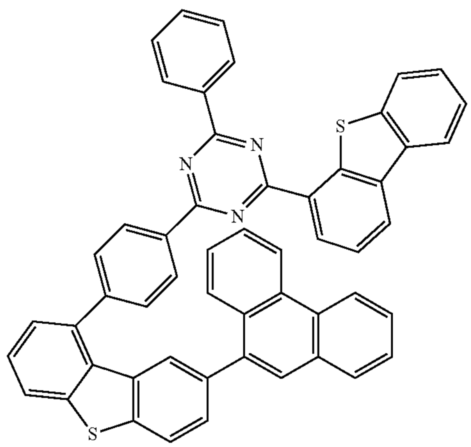
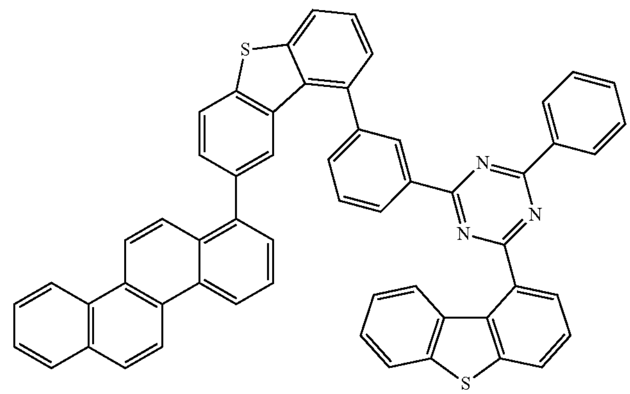
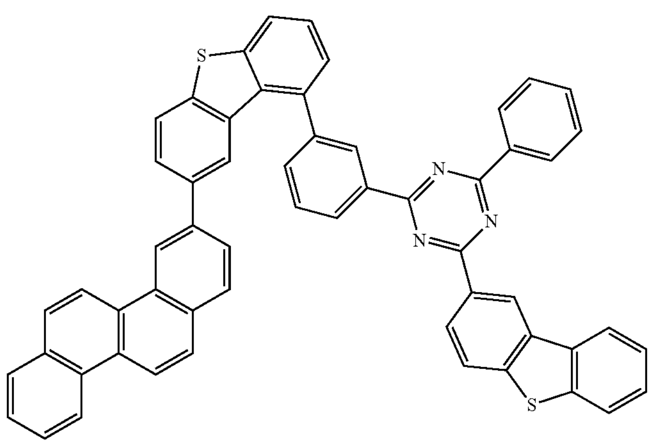
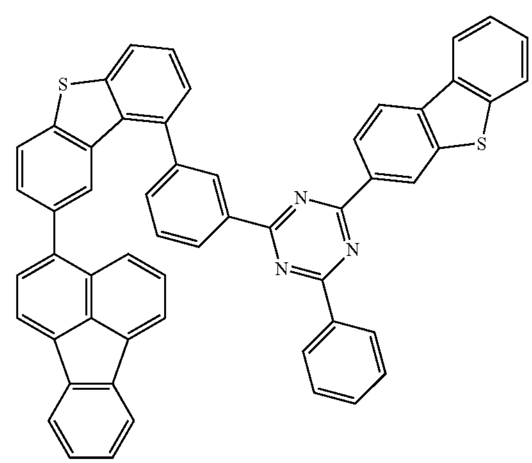
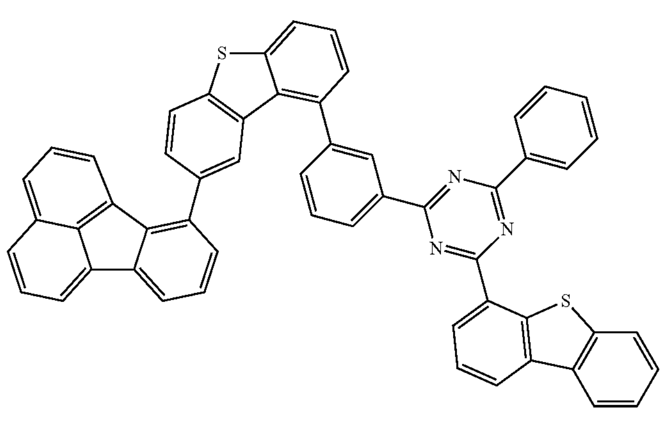
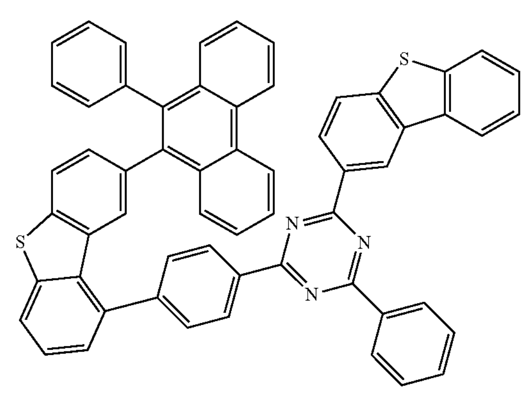

-continued
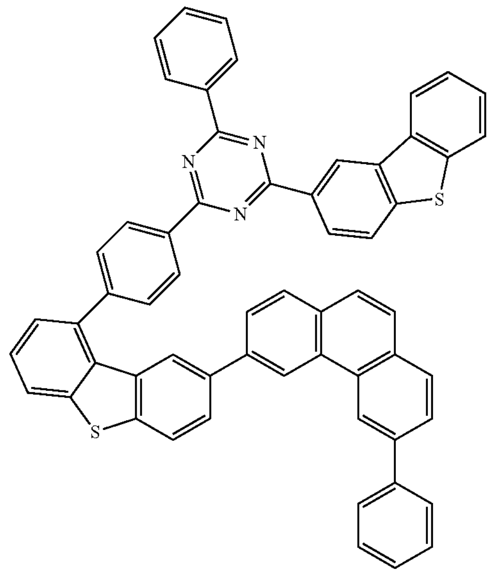
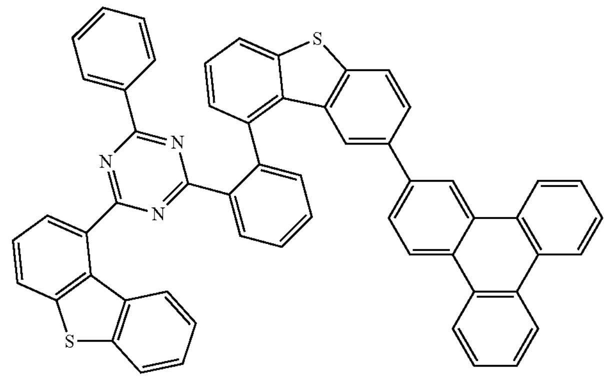
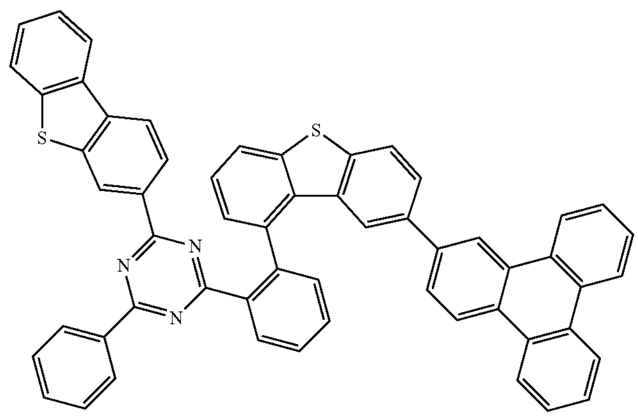
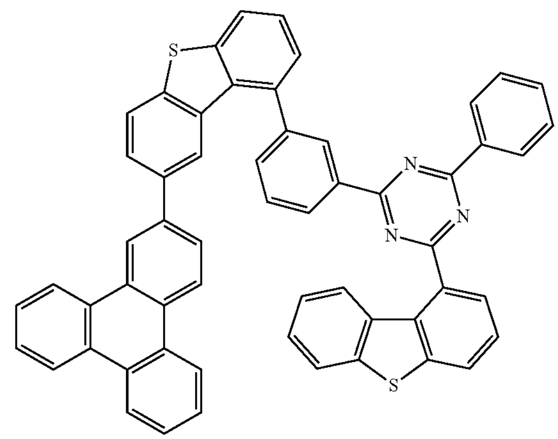
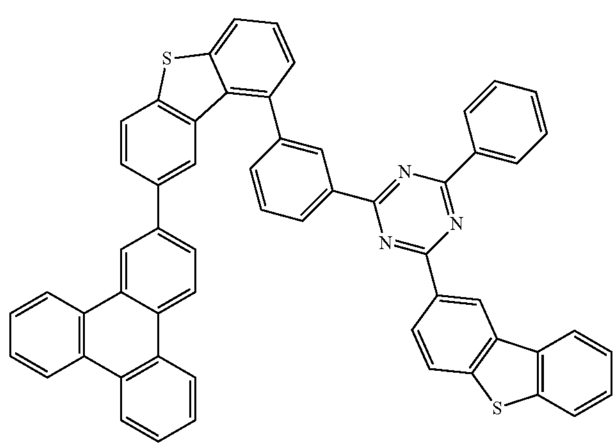

-continued
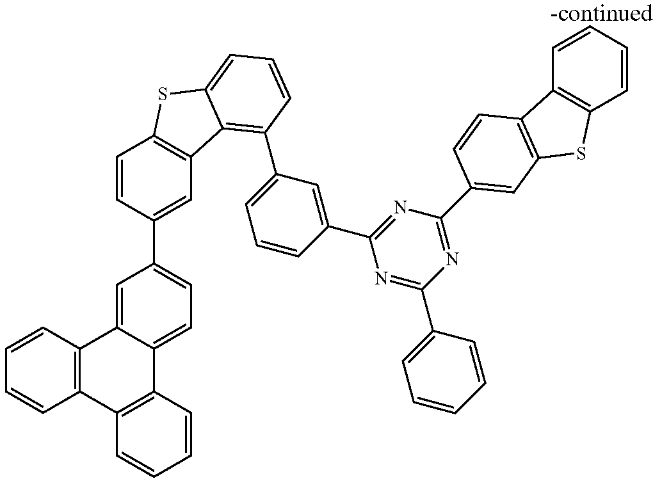
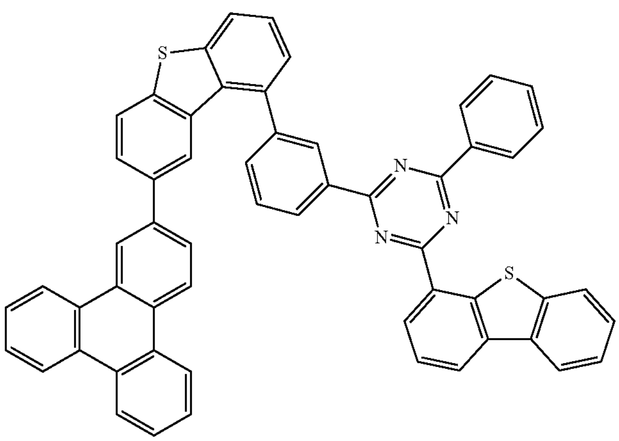
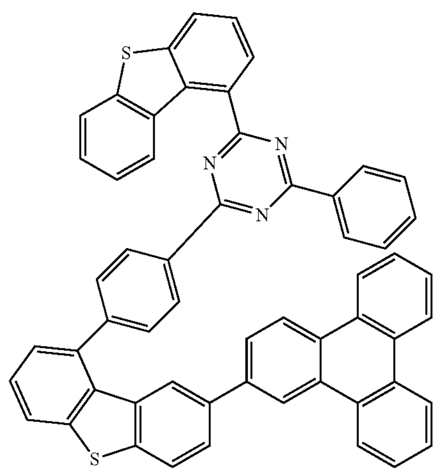
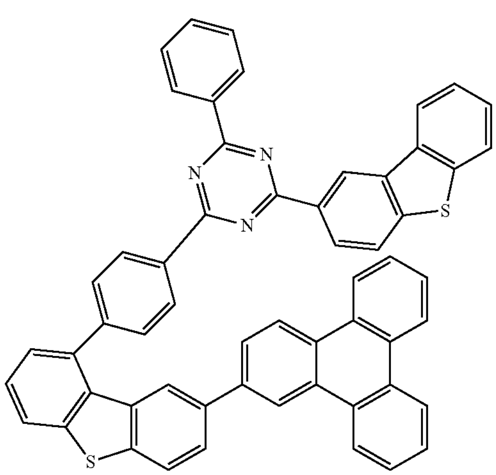
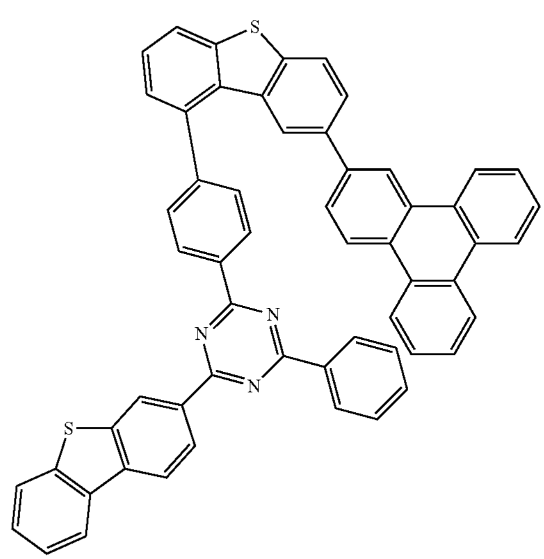

-continued
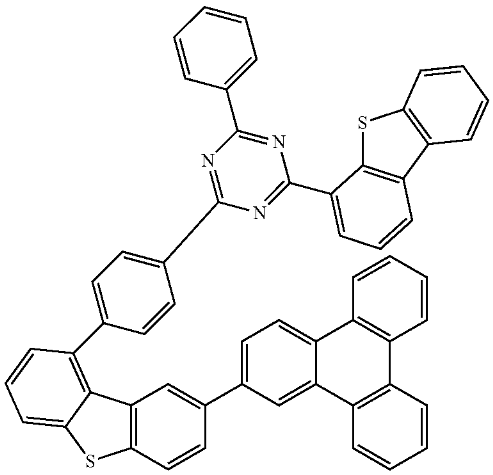
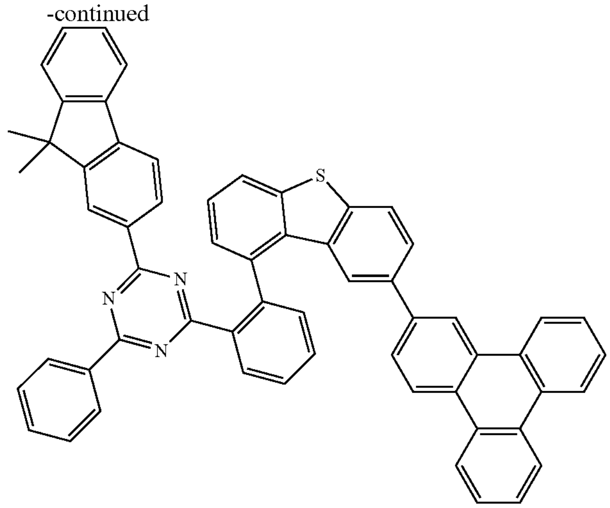
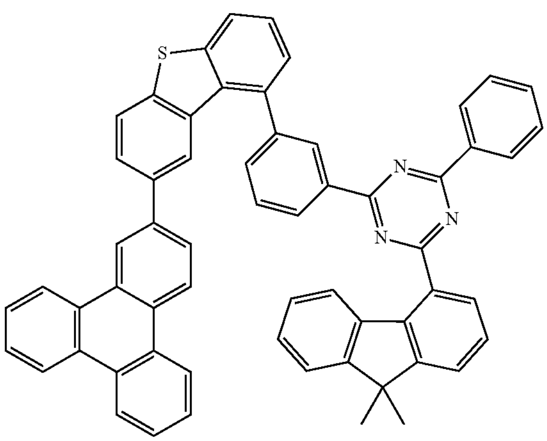
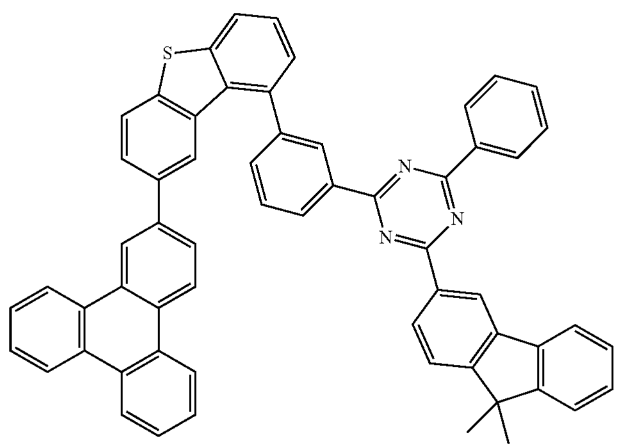
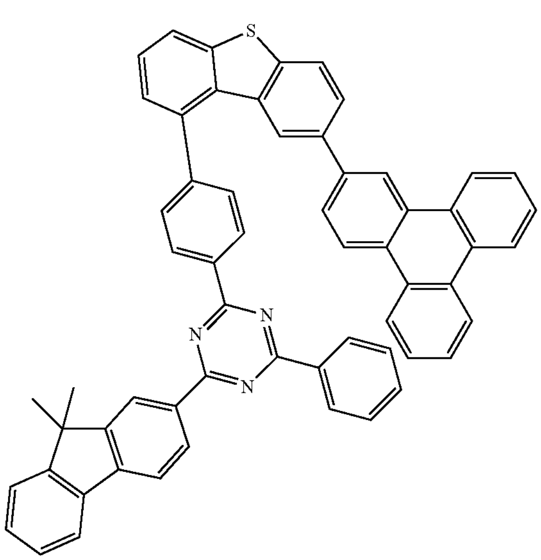
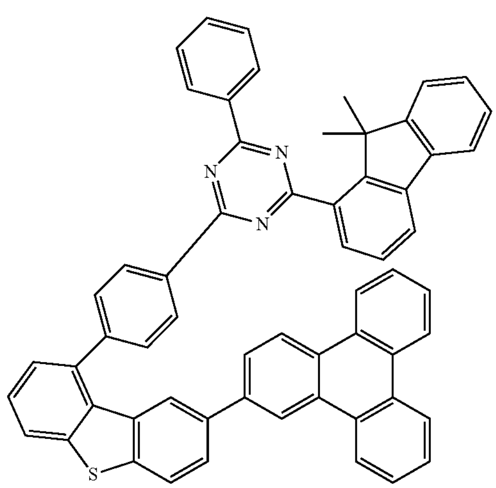

-continued
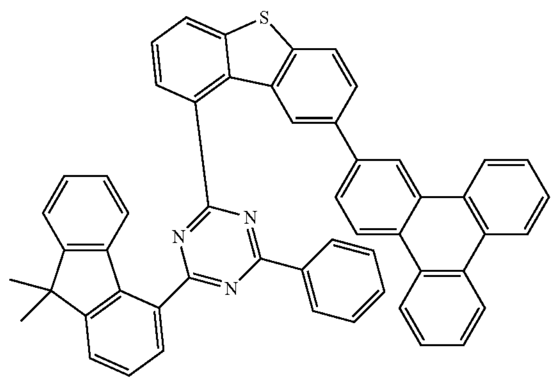
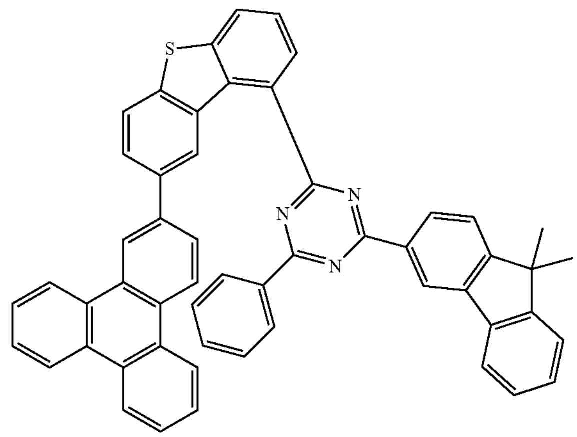
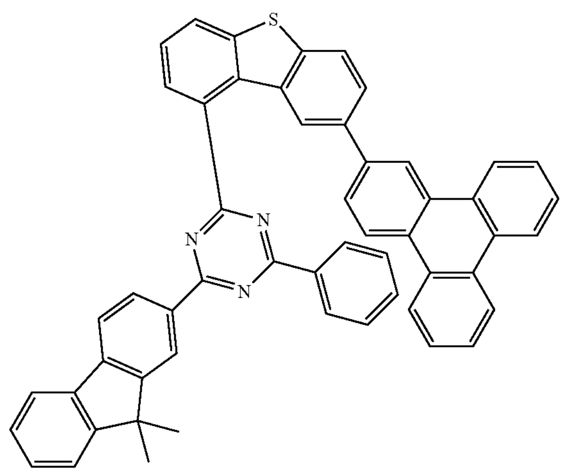
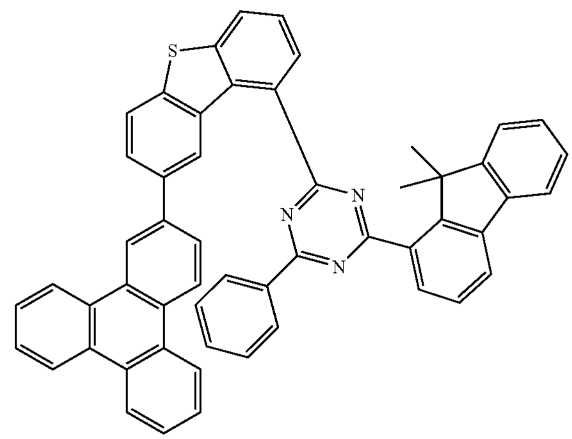
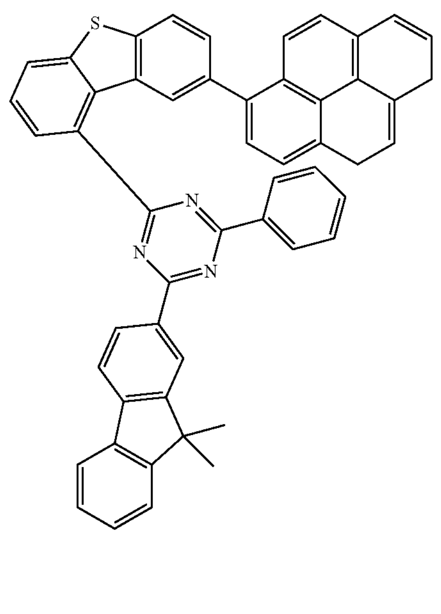
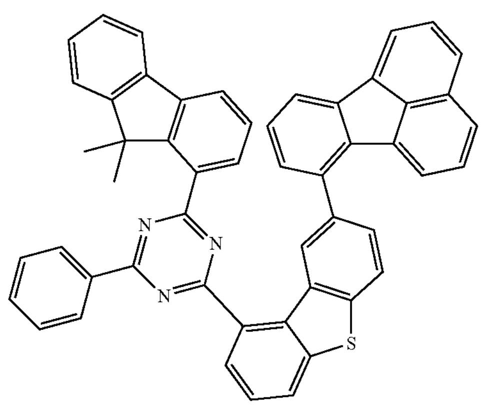

-continued
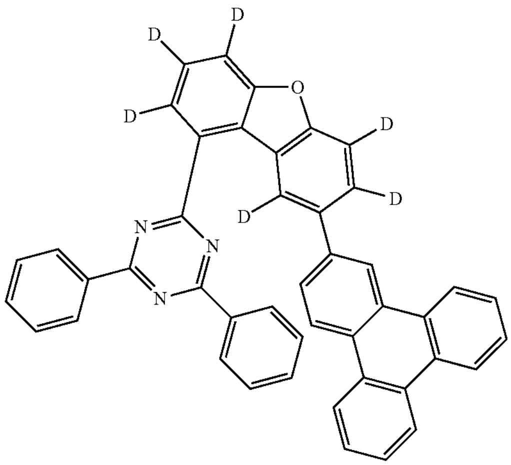
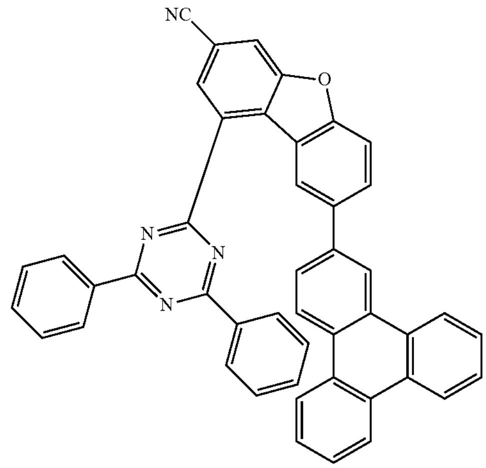
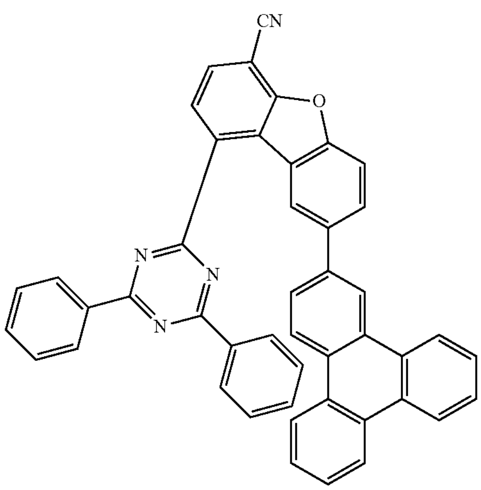
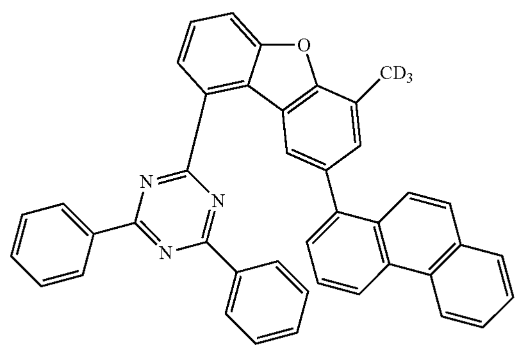
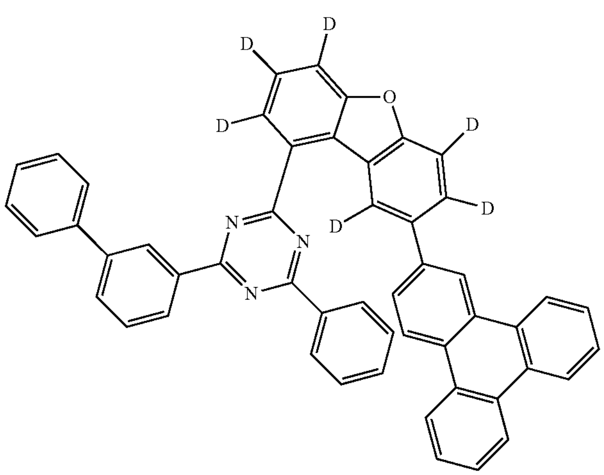
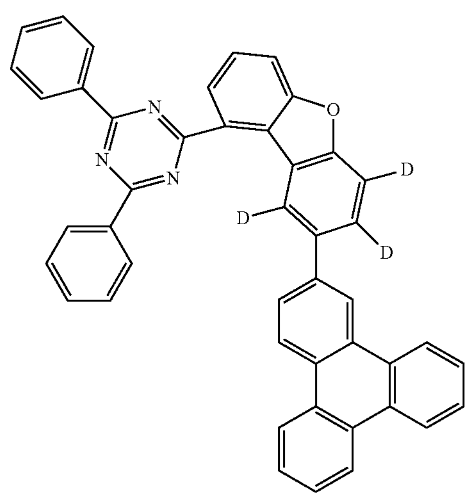

-continued
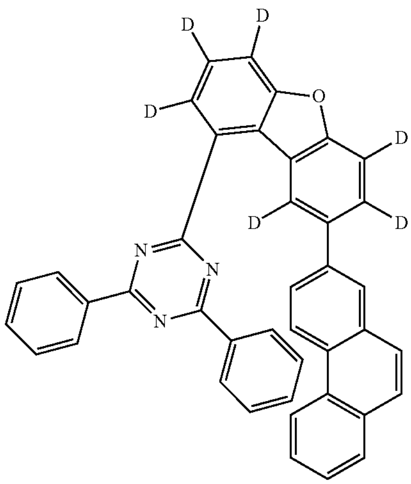
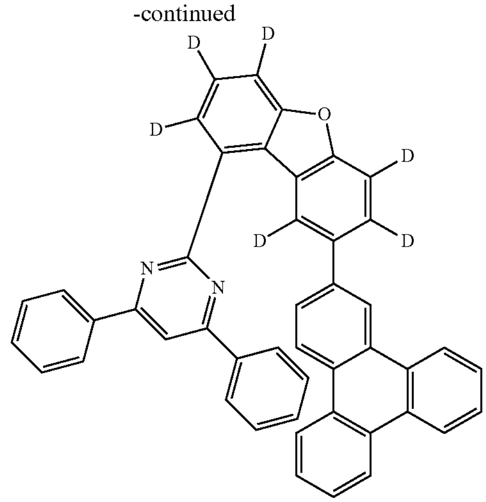
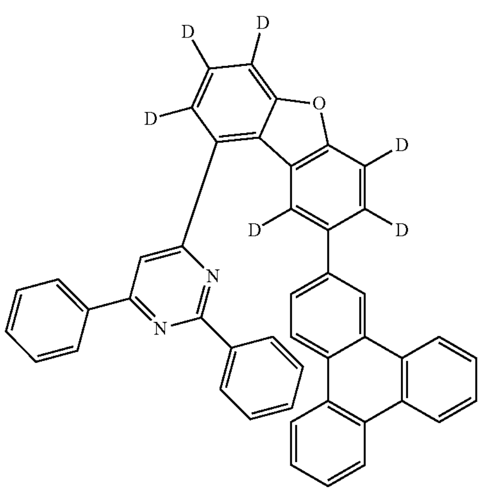
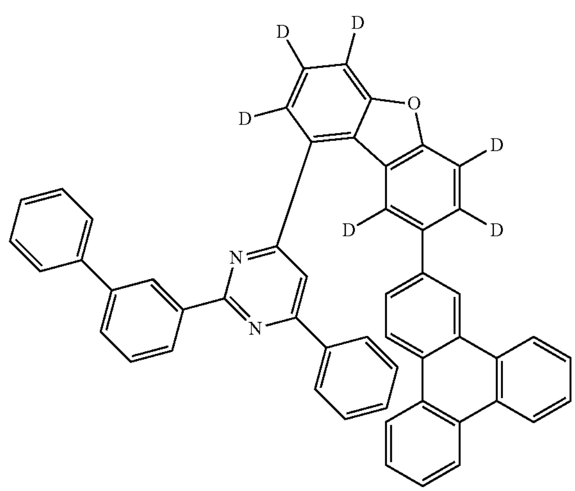
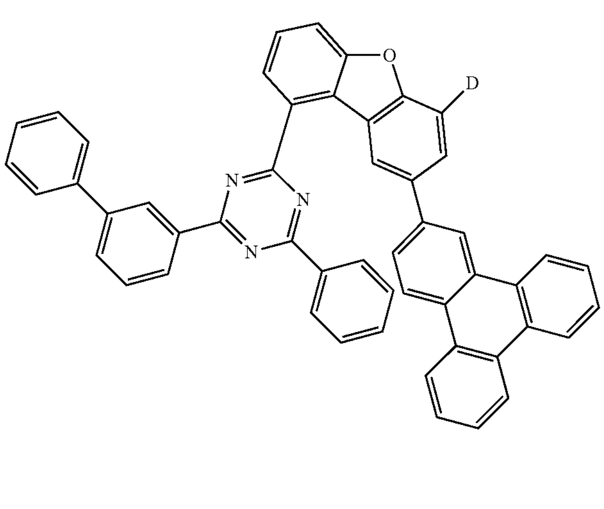
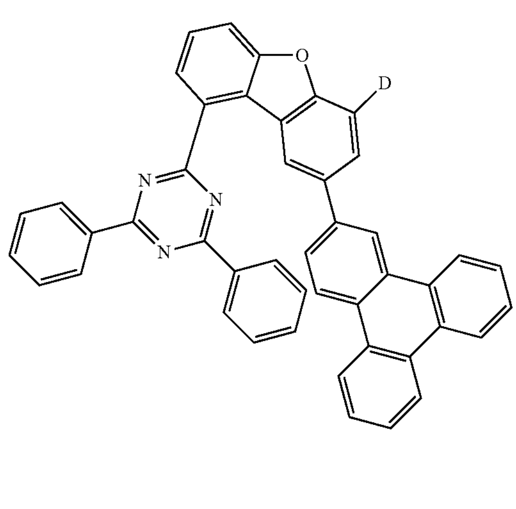

-continued
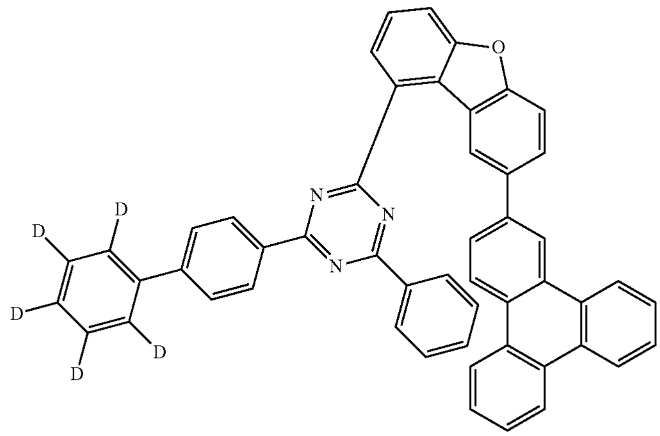
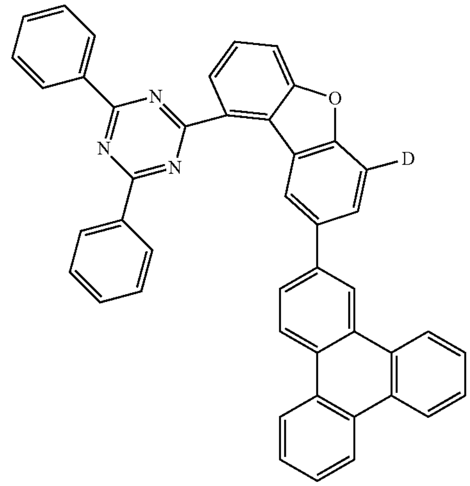
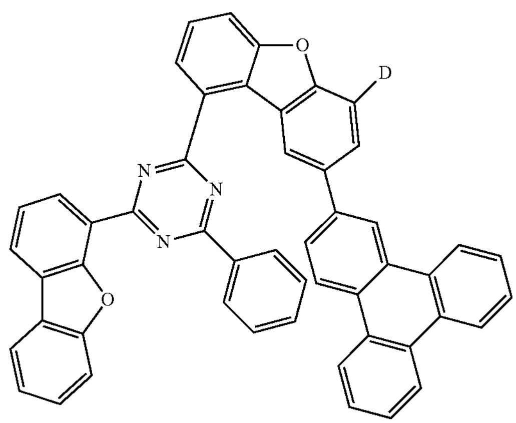
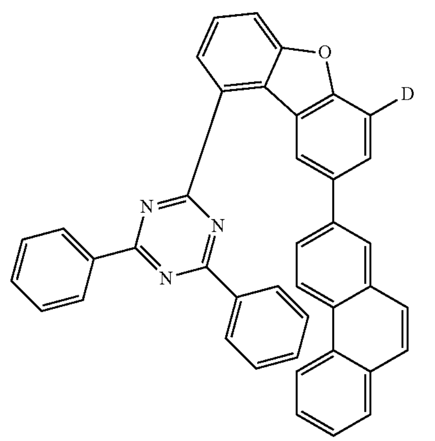
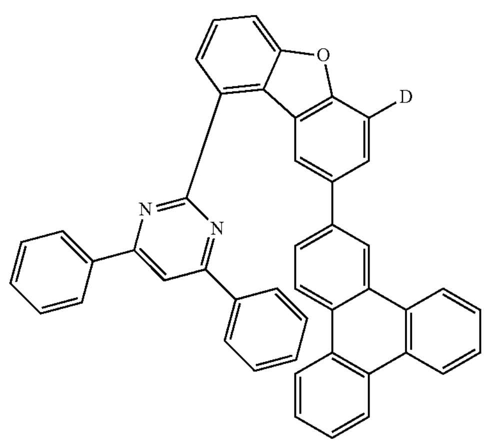
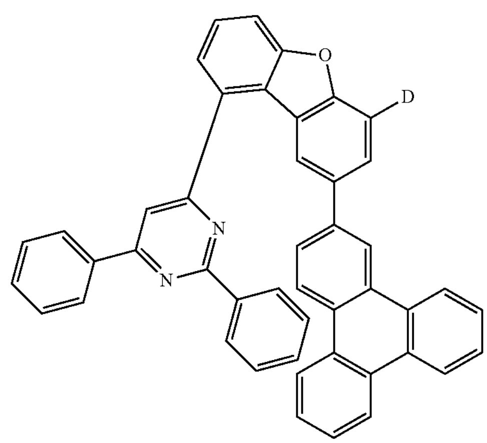

-continued
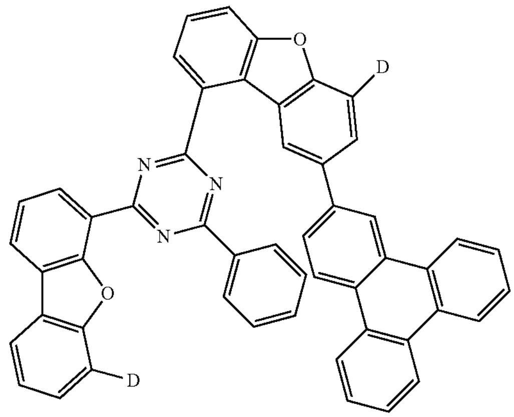
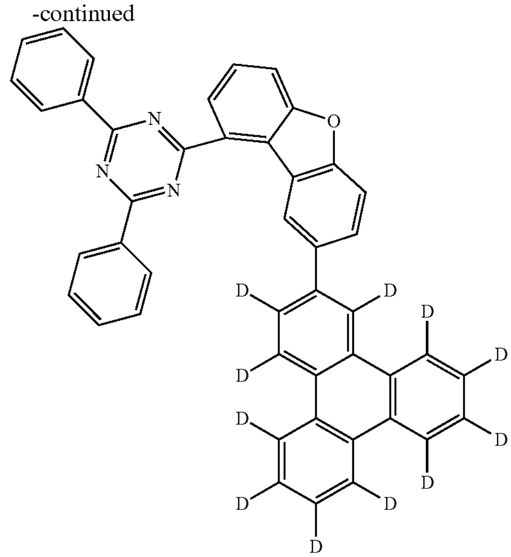
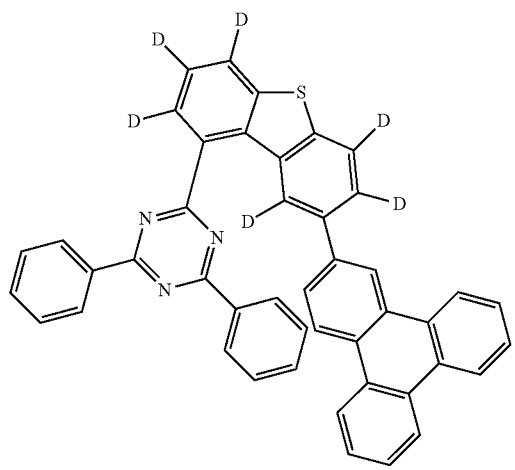
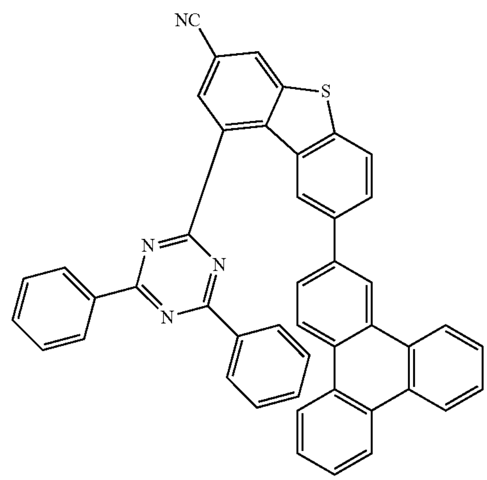
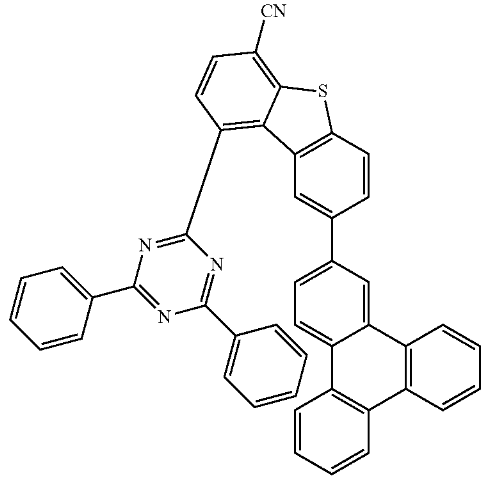
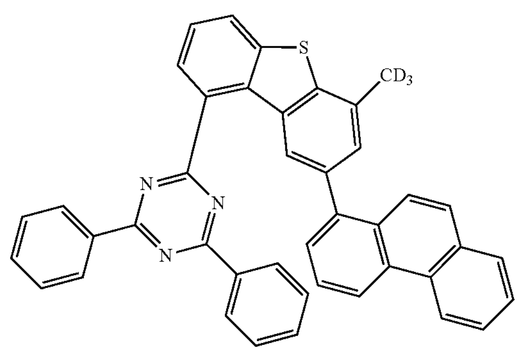

-continued
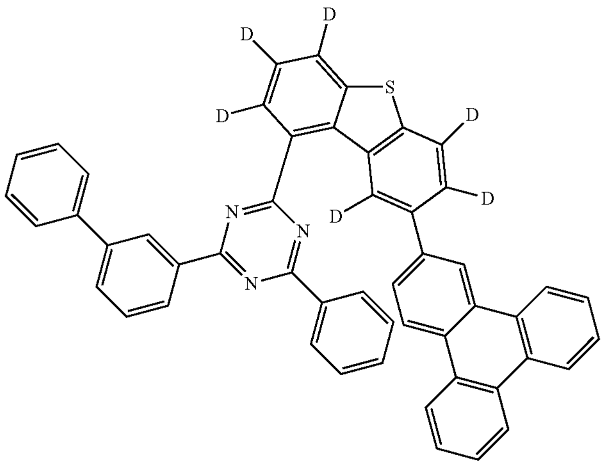
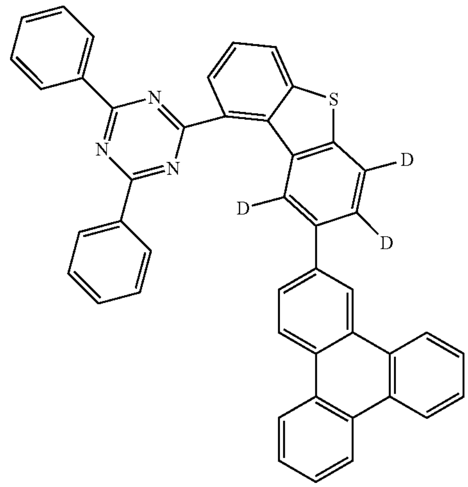
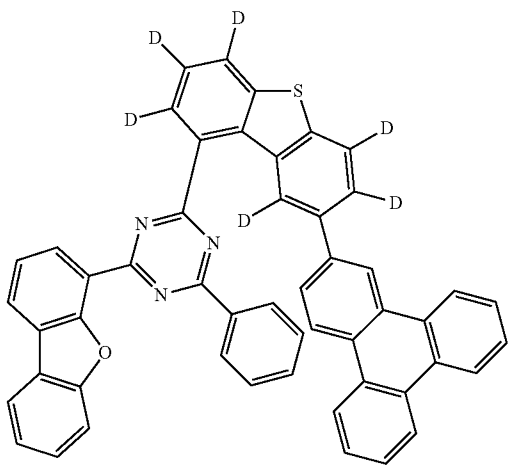
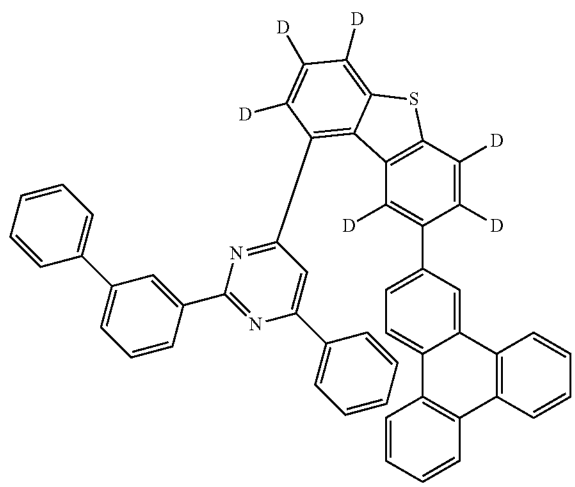
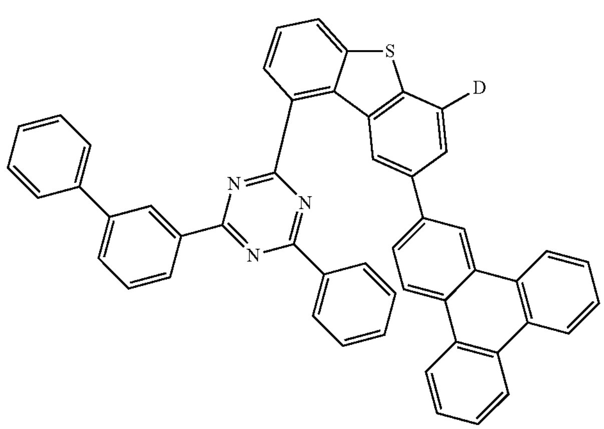
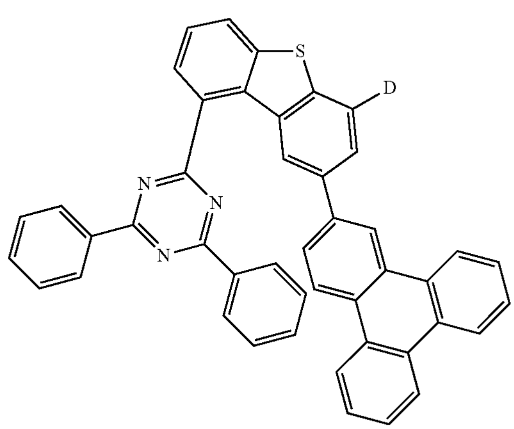

-continued
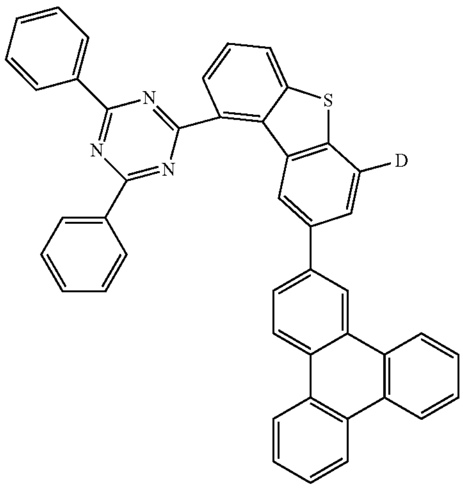
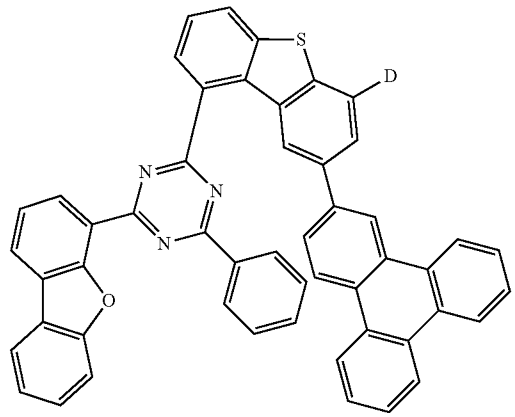
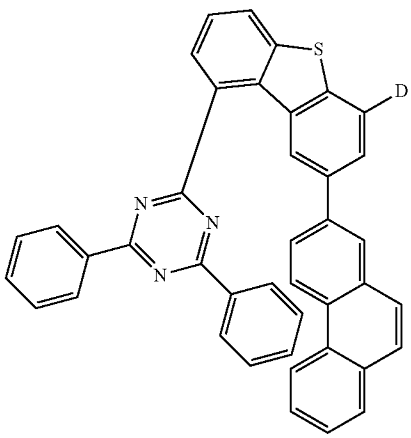
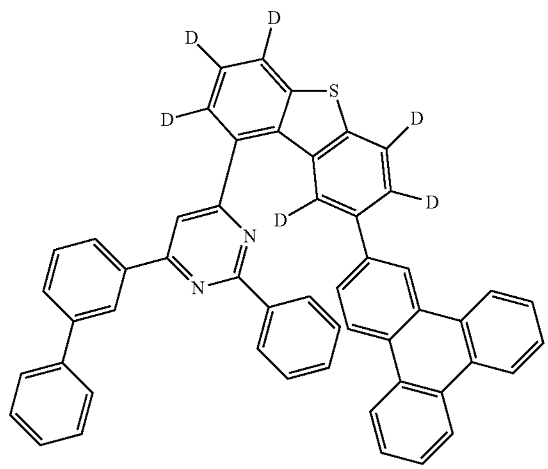
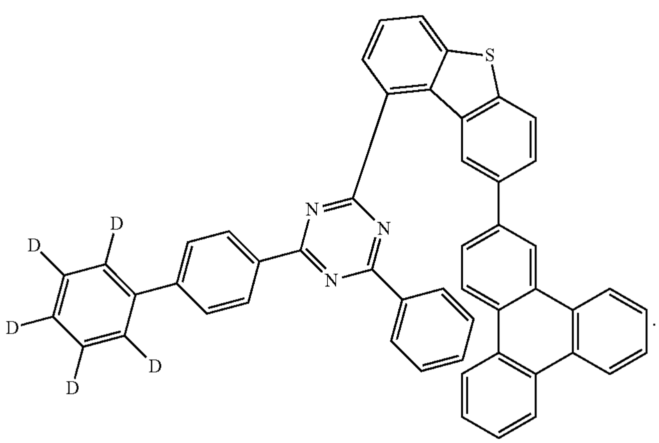

Further, the compound of Chemical Formula 2-1 can be prepared by the method as shown in Reaction Scheme 2 below, which can be applied to the Chemical Formula 2-2.

[Reaction Scheme 2]

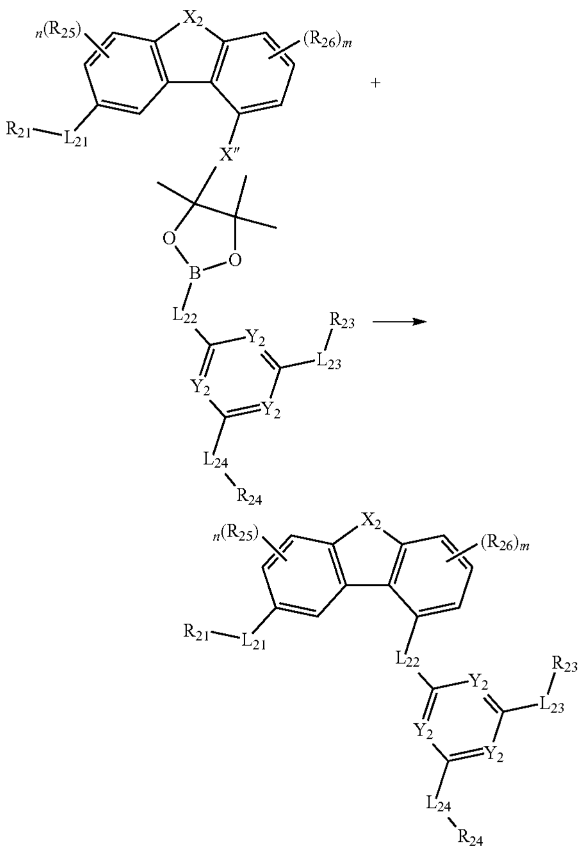

2-1

In Reaction Scheme 2, the remaining substituents excluding X" are the same as defined above, and X" is halogen and more preferably bromo or chloro.

The above reaction is a Suzuki coupling reaction, which is preferably carried out in the presence of a palladium catalyst and a base, and a reactive group for the Suzuki coupling reaction can be modified as known in the art. The above preparation method will be more specifically described in the Preparation Examples described hereinafter.

In Chemical Formula 3, preferably, $L_{31}$ is a single bond or phenylene.

Preferably, $L_{32}$ is a single bond or phenylene.

Preferably, $R_{31}$ is cyclohexyl, phenyl, phenyl substituted with tert-butyl, phenyl substituted with cyano, biphenylyl, terphenylyl, naphthyl, phenanthrenyl, triphenylenyl, dimethylfluorenyl, dibenzofuranyl, dibenzothiophenyl, or 9-phenylcarbazolyl.

Preferably, $R_{32}$ and $R_{33}$ are each independently hydrogen, cyano, tert-butyl, phenyl, phenyl substituted with cyano, or pyridinyl.

Preferably, $R_{34}$ is phenyl, biphenylyl, terphenylyl, quarterphenylyl, naphthyl, or phenanthrenyl.

Representative examples of the compound of Chemical Formula 3 are as follows:

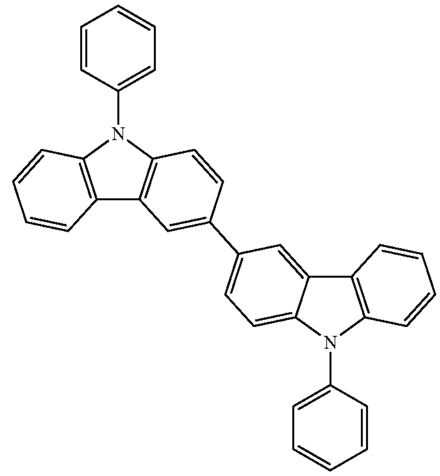

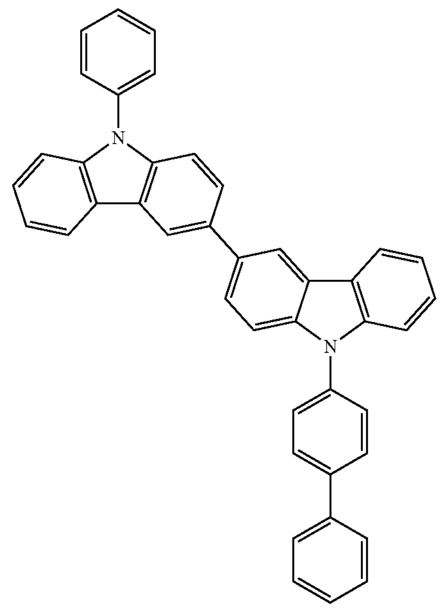

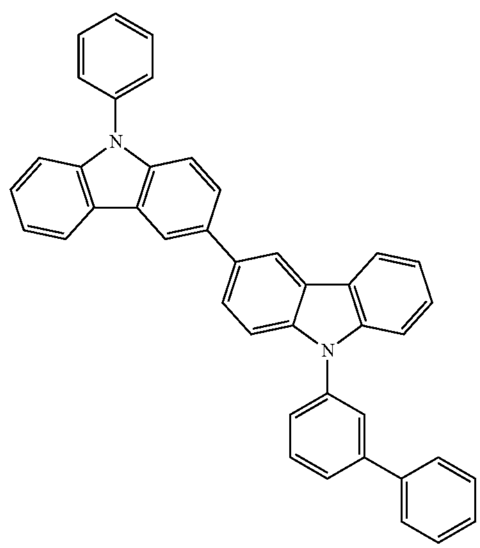

-continued
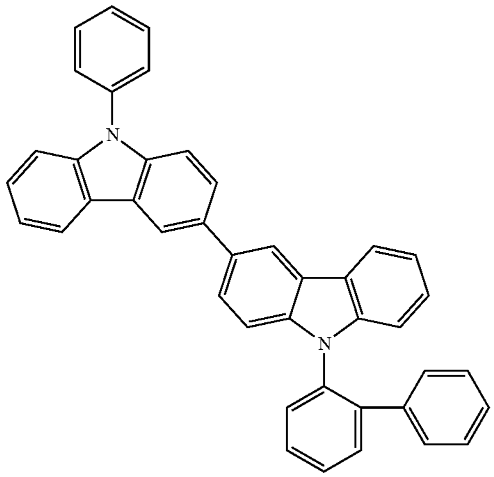
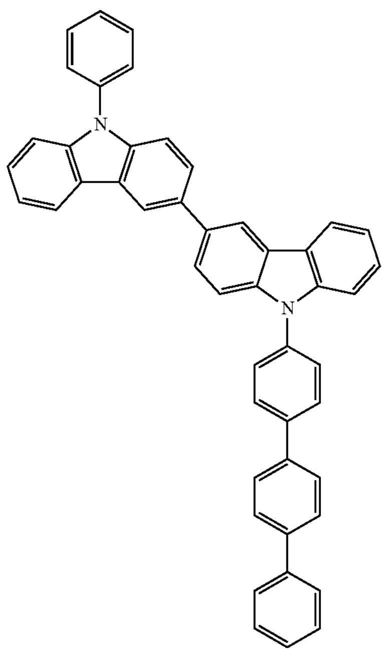
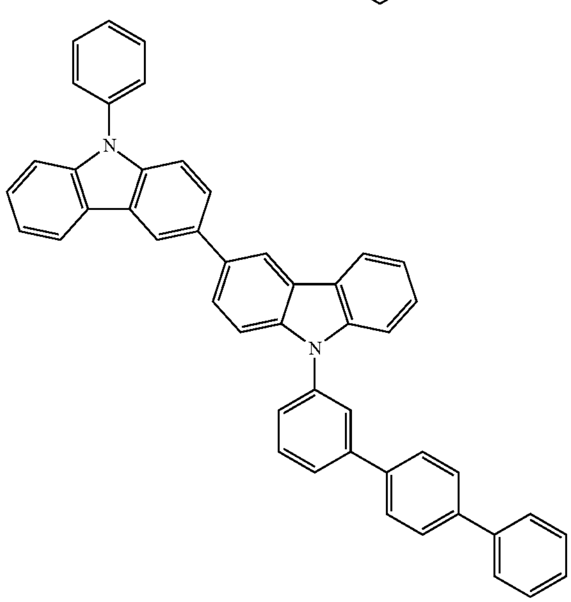
-continued
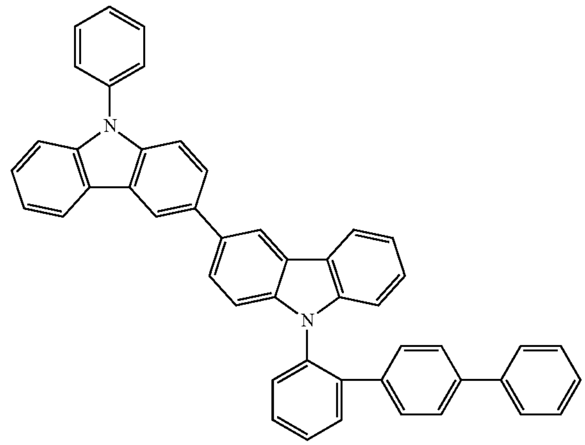
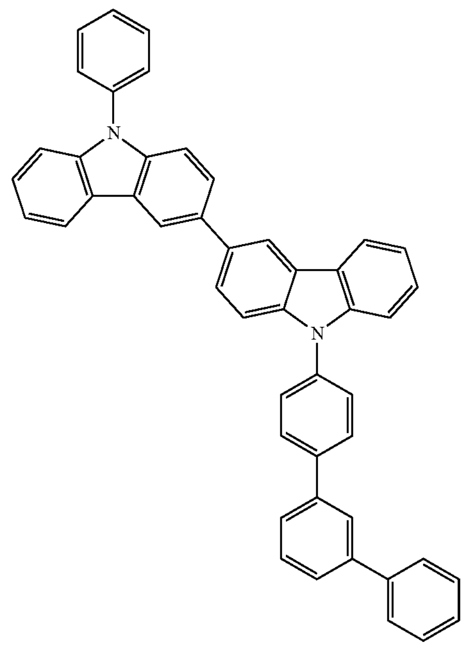
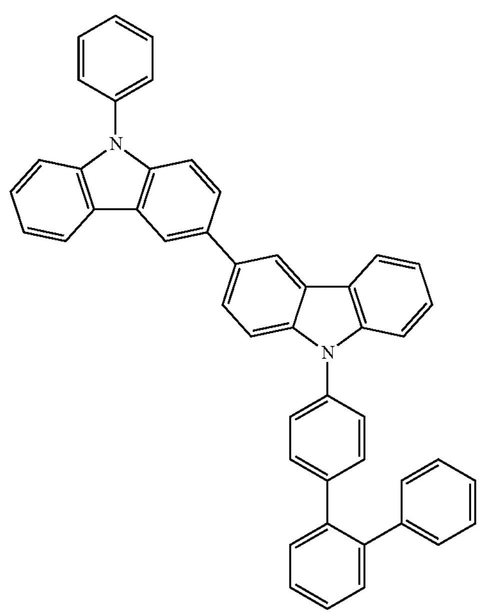

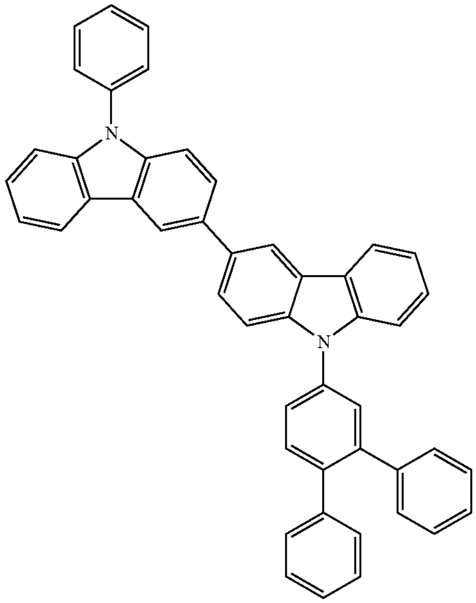
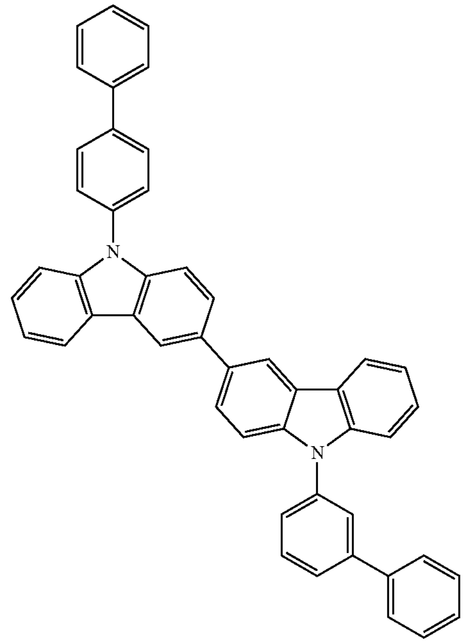
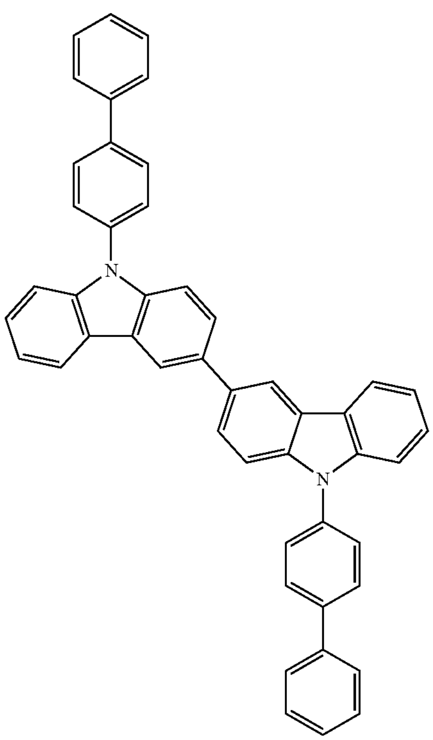
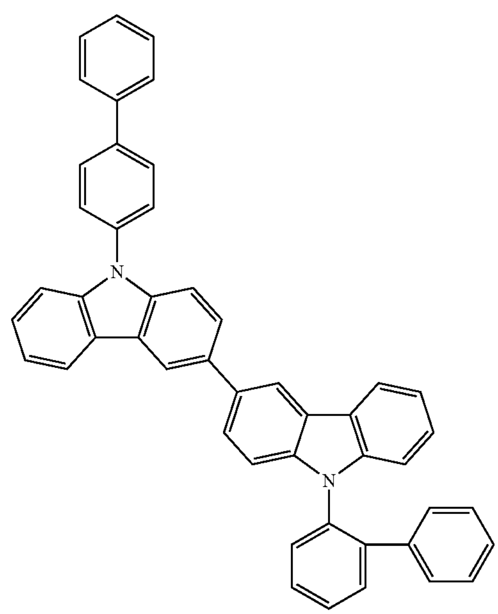

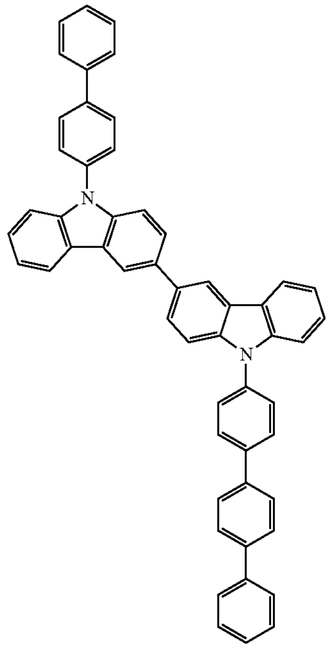
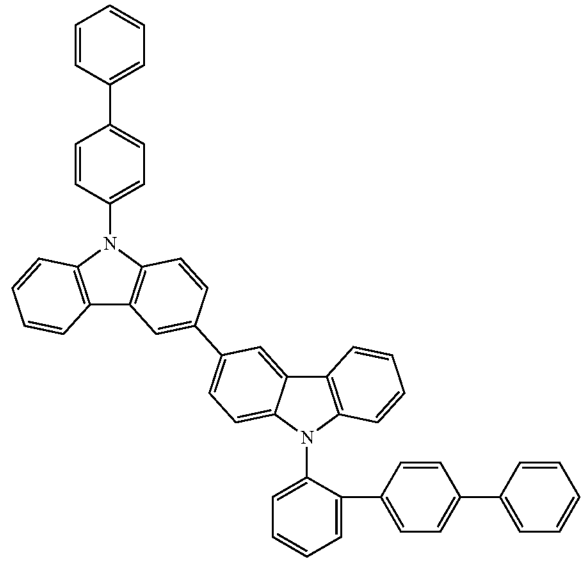
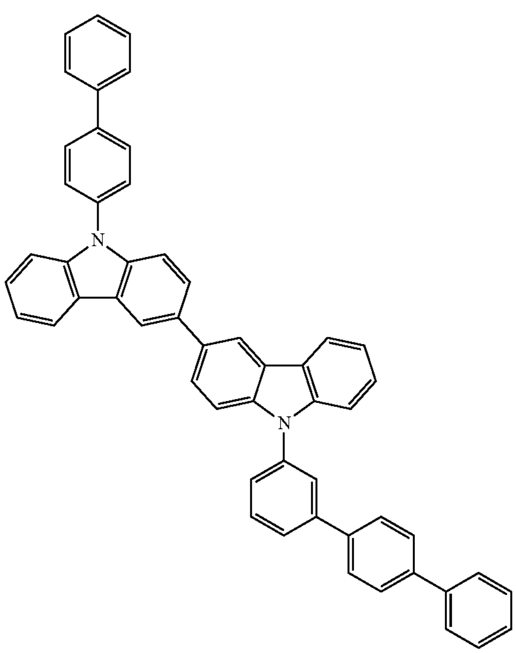
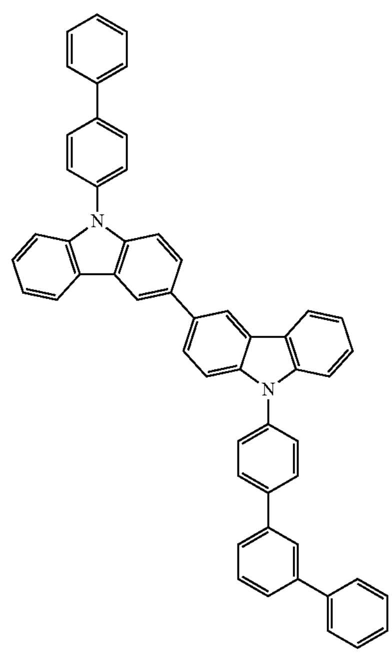

-continued
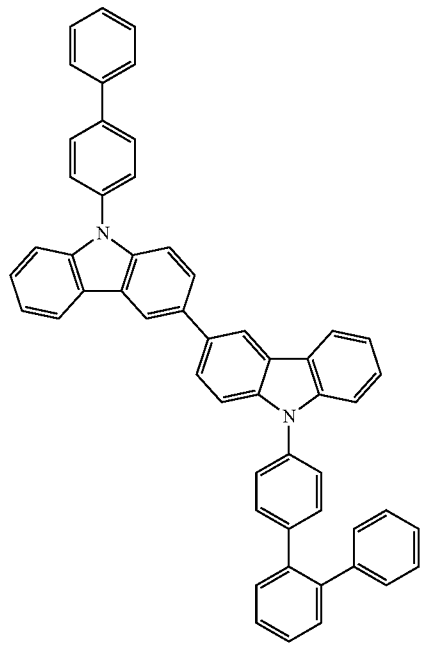
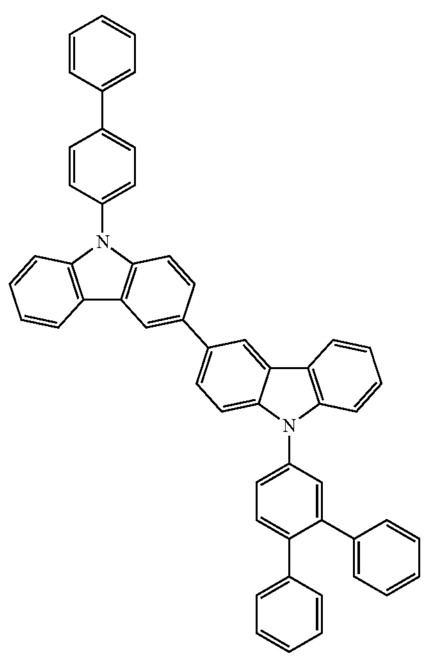
-continued
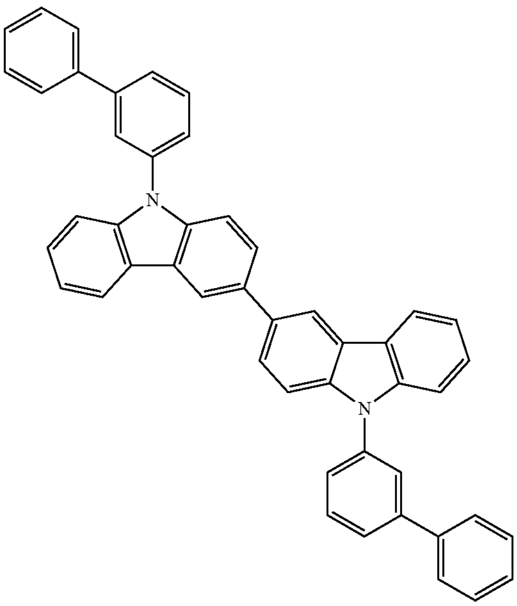
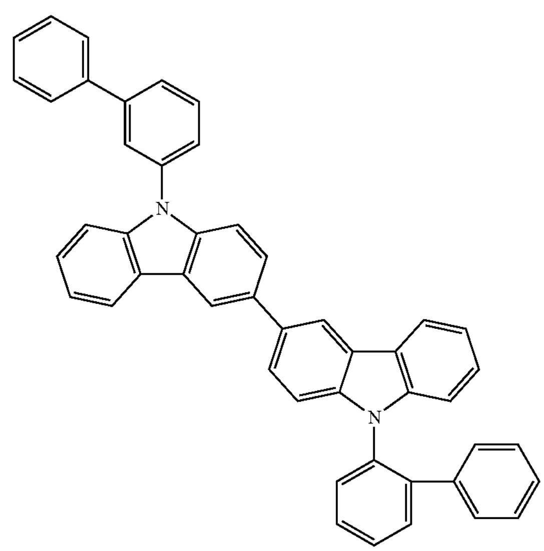

-continued
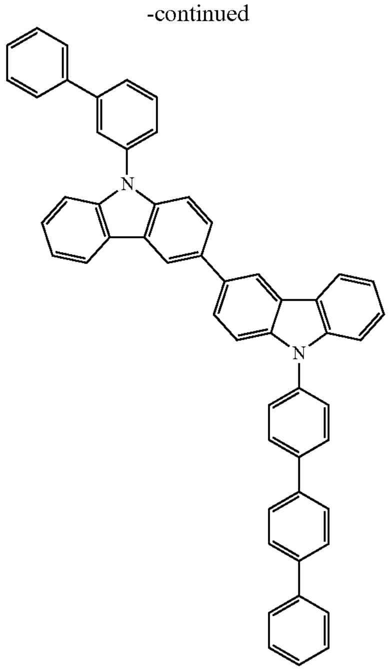
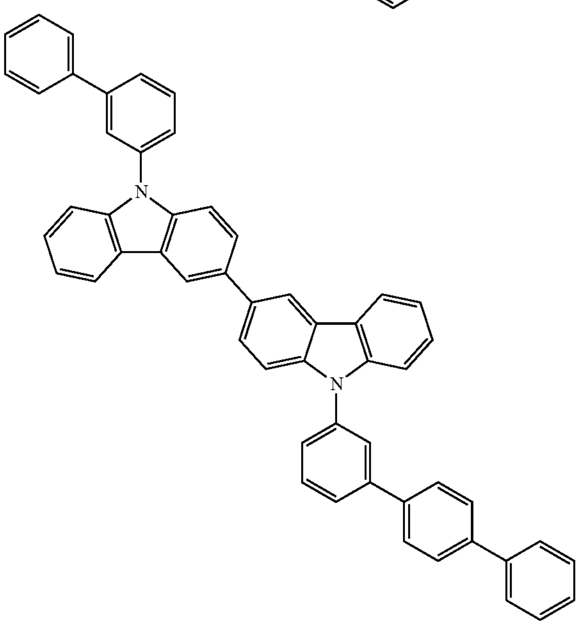
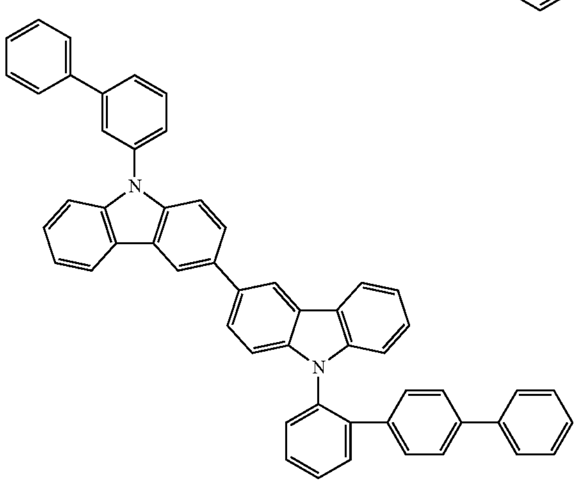
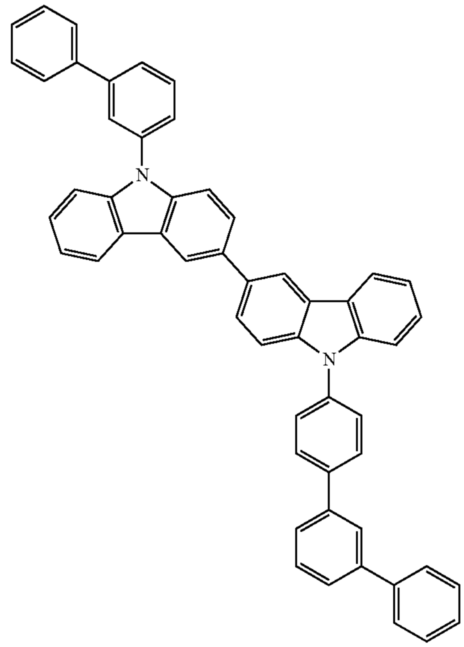
-continued
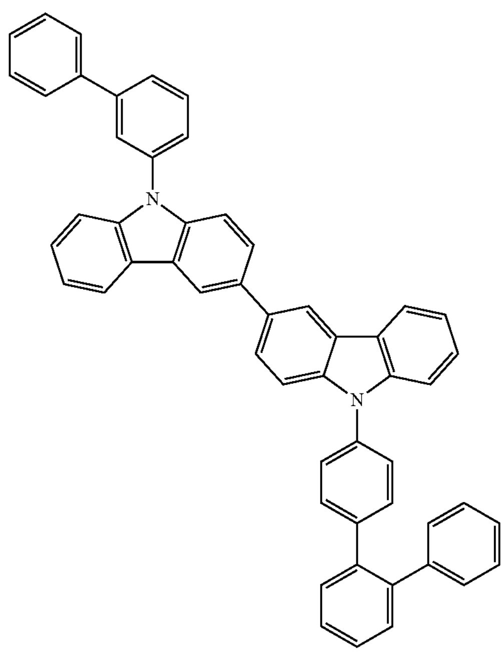

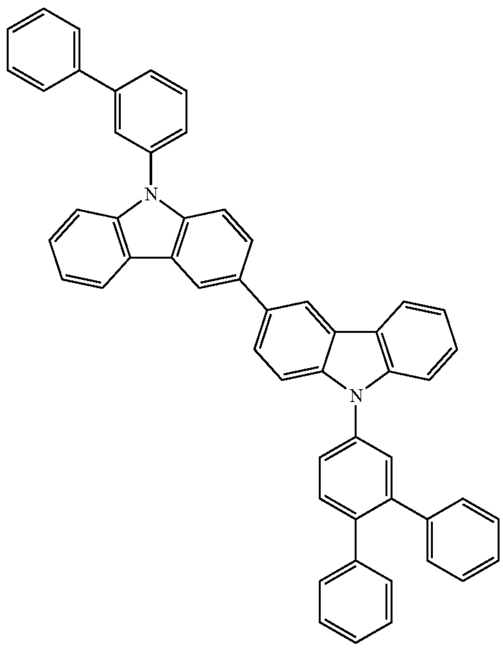
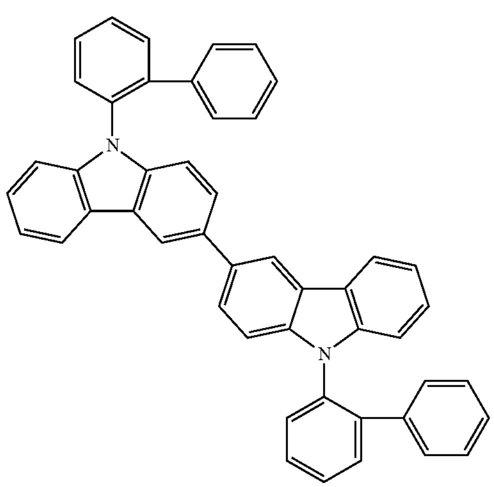
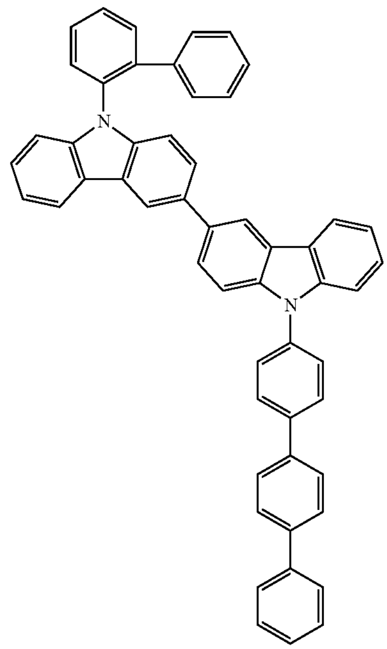
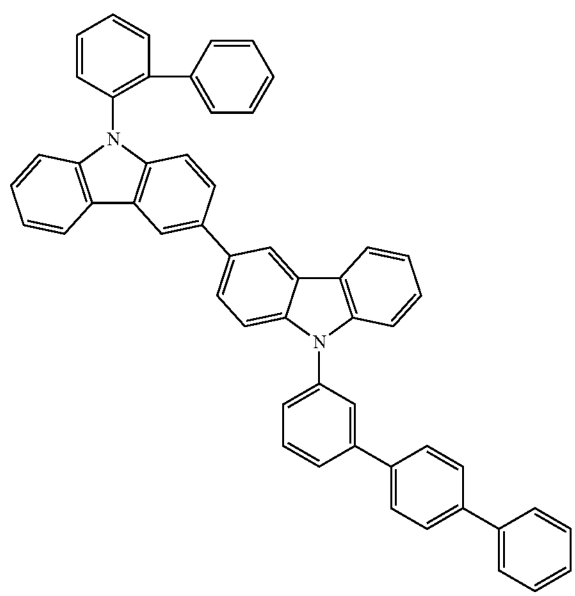
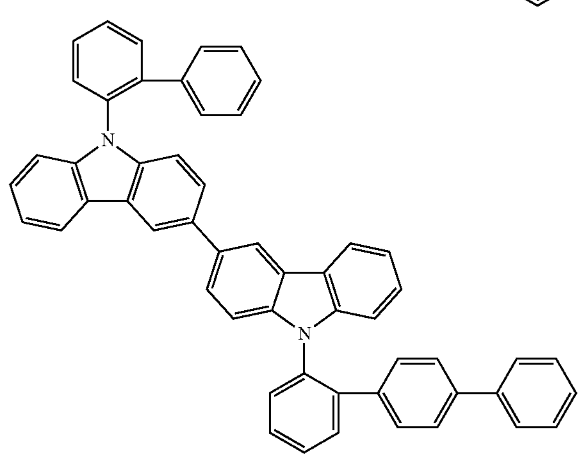

-continued
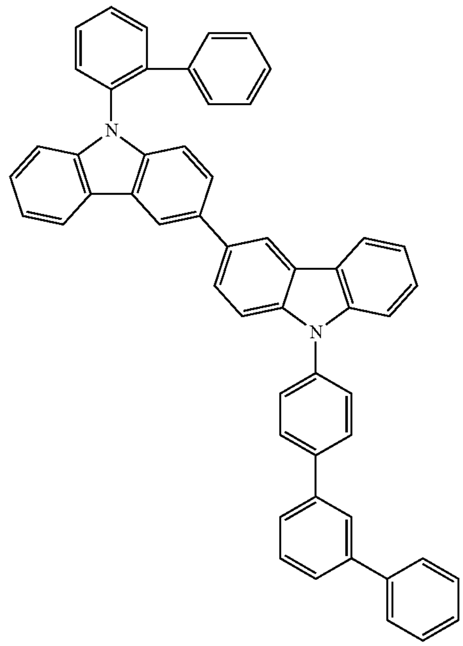
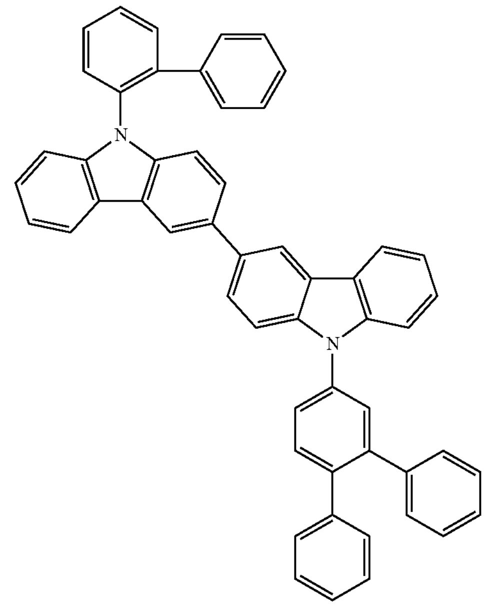
-continued
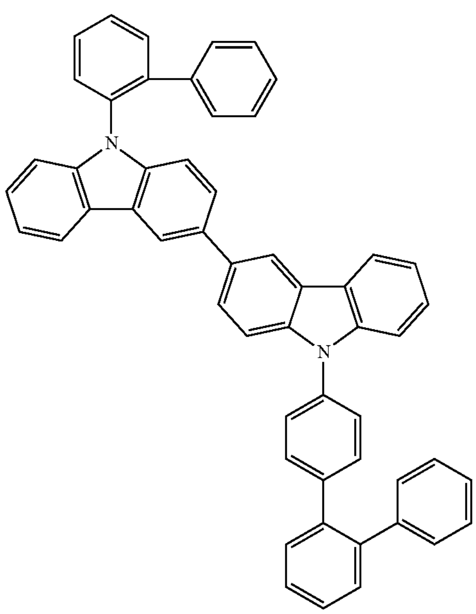
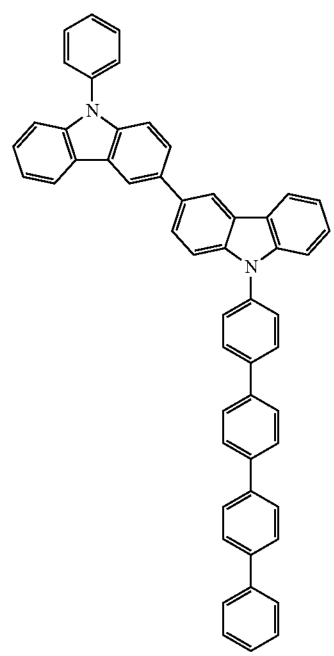

-continued
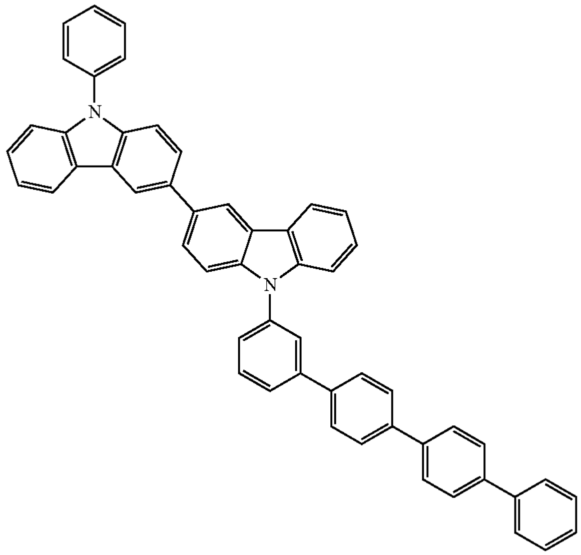
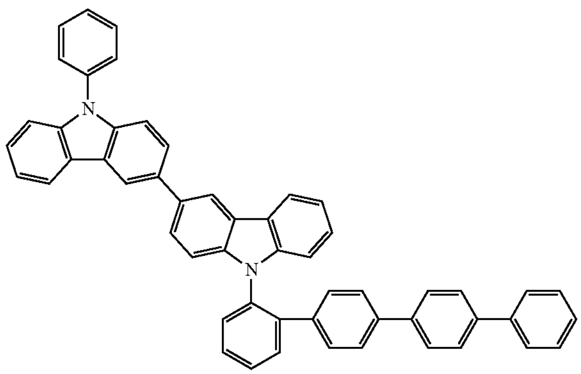
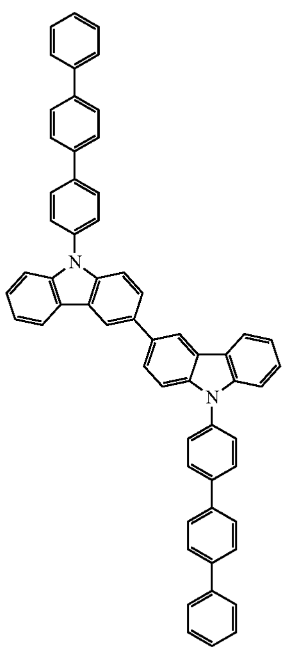
-continued
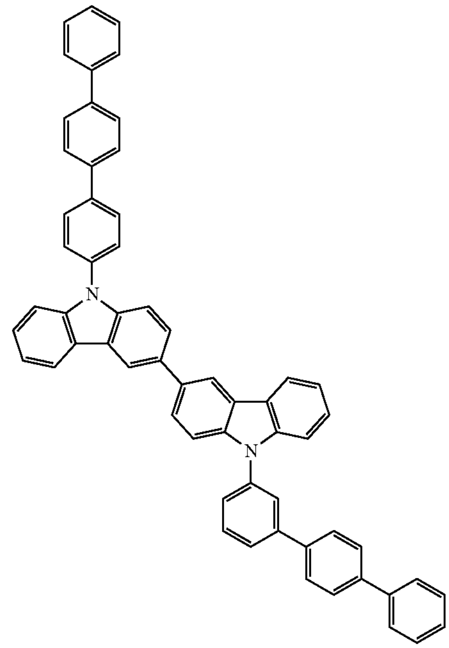
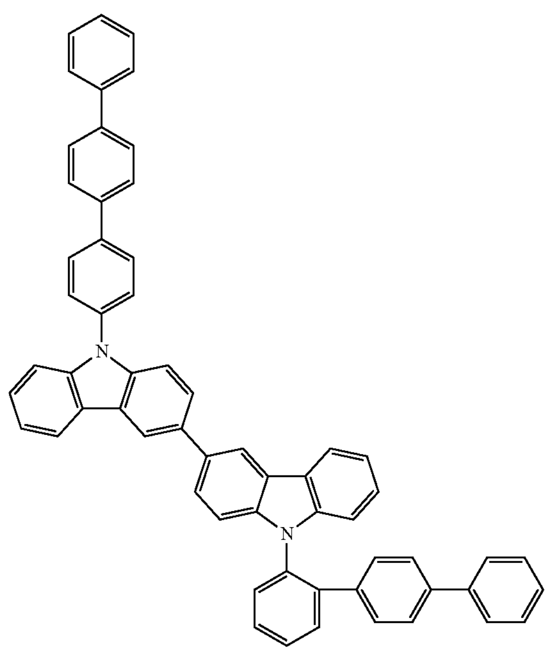

-continued
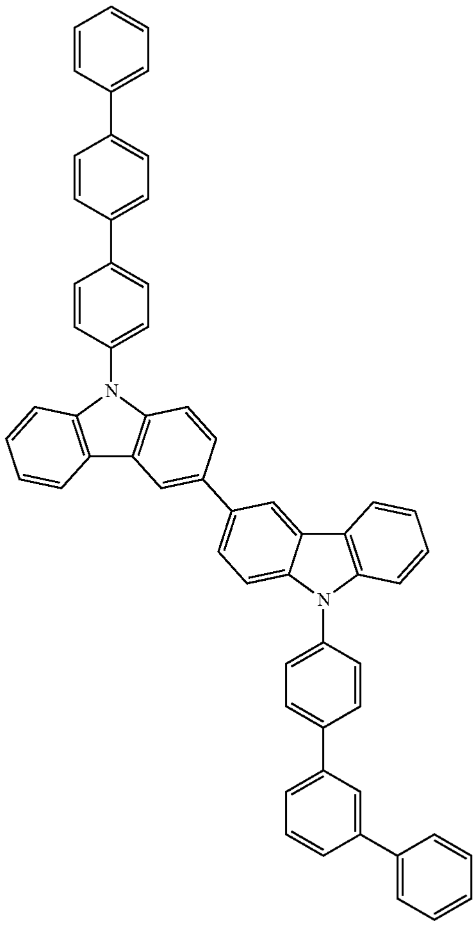
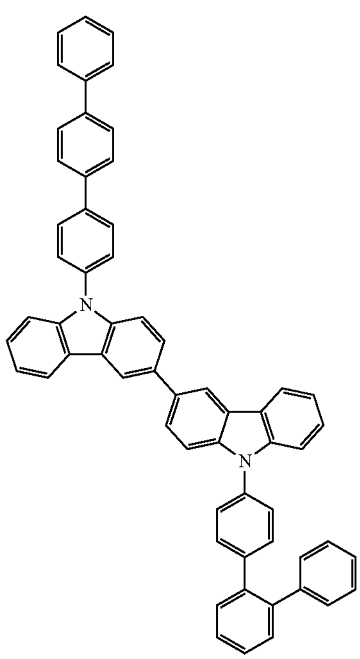
-continued
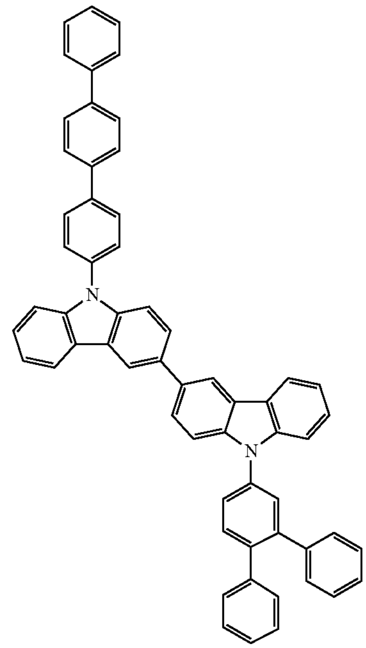
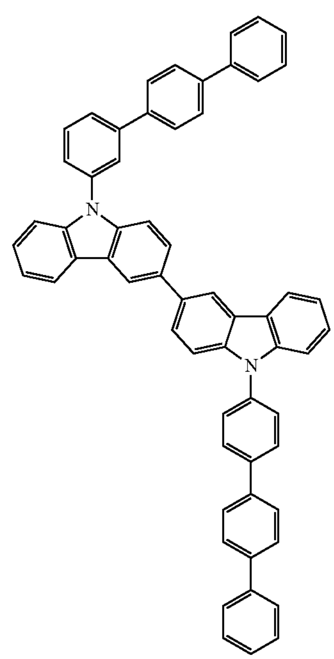

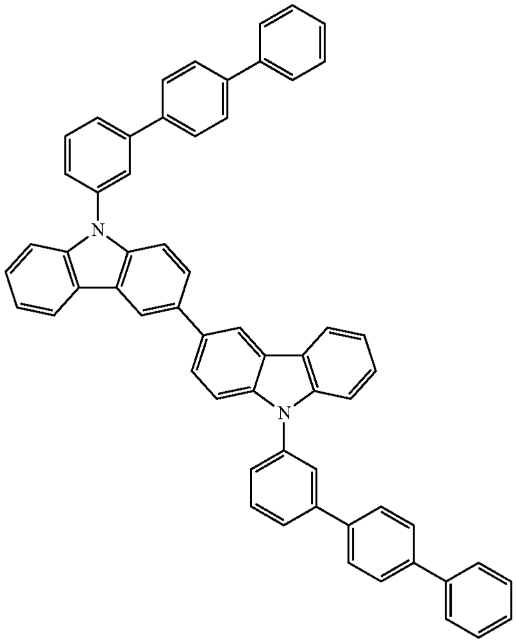
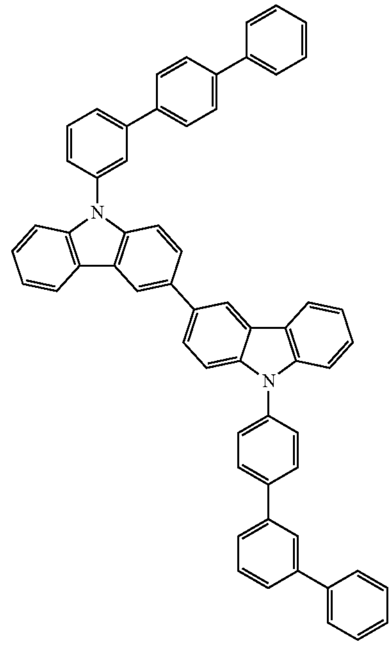
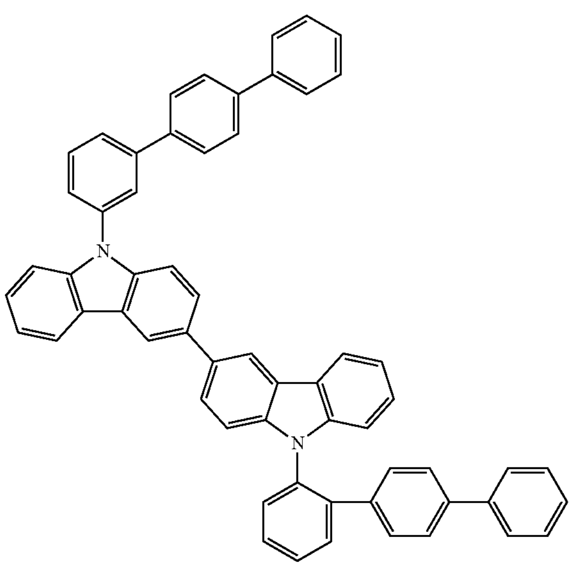
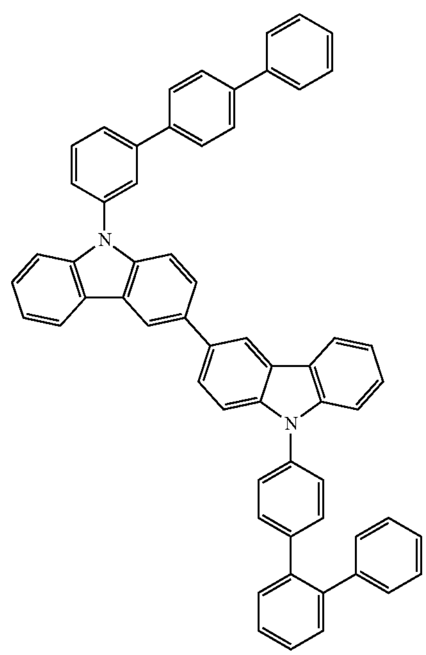

-continued
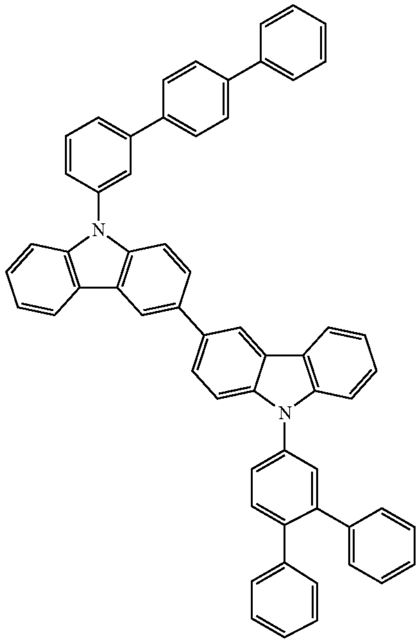
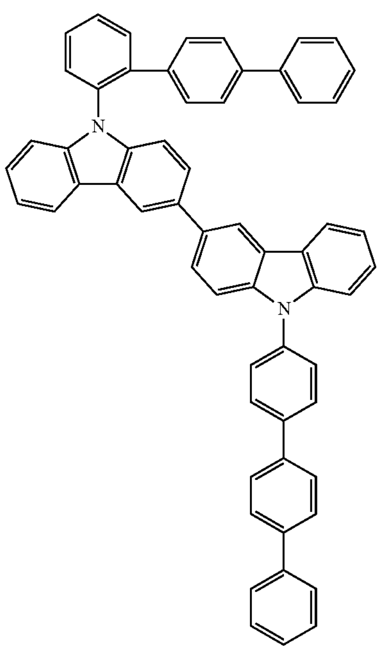
-continued
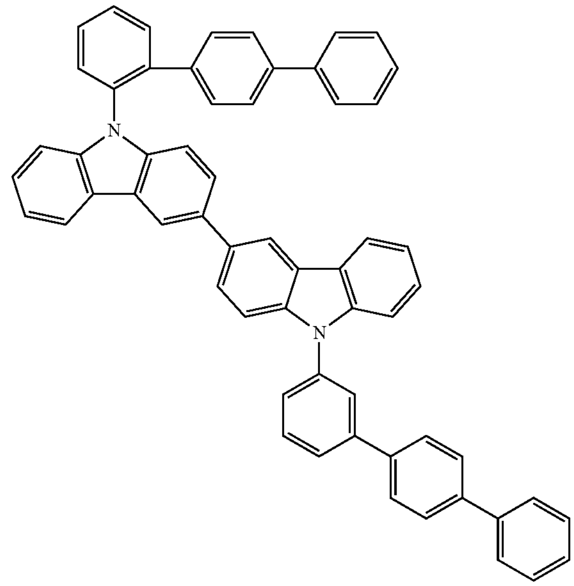
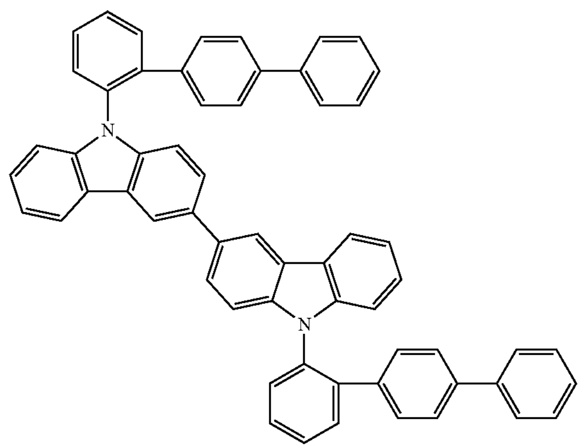
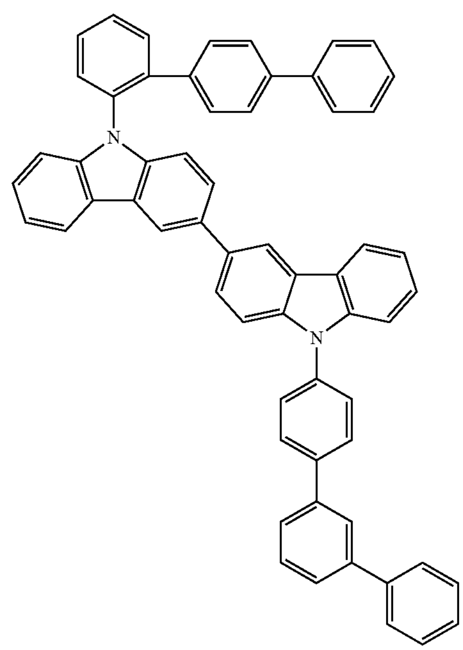

-continued
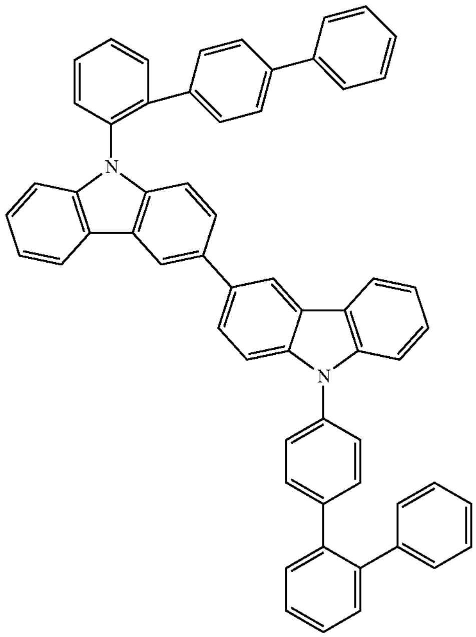
-continued
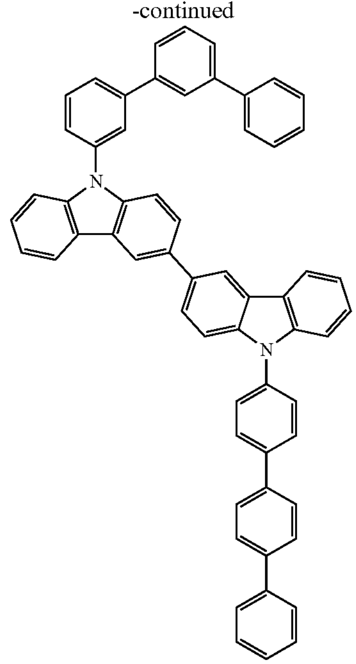
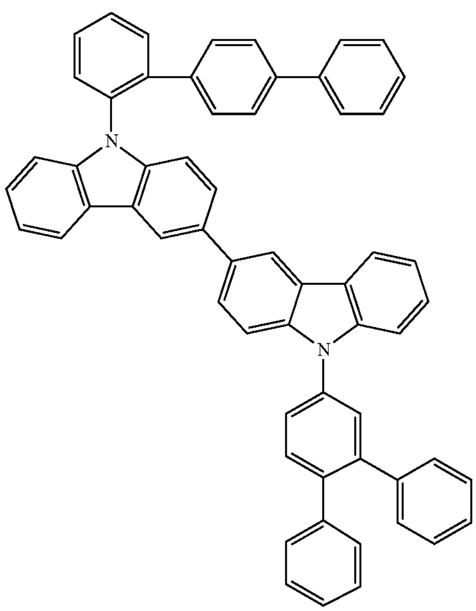
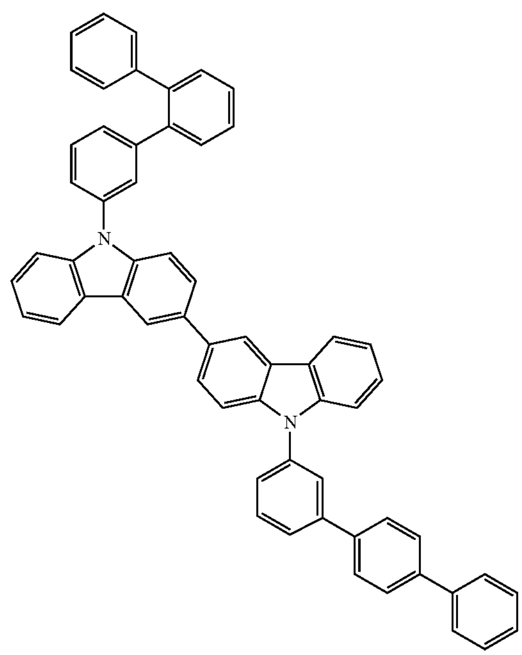

-continued
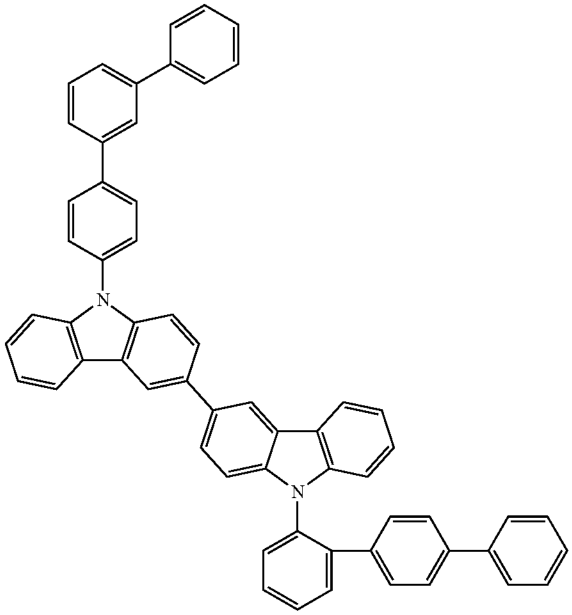
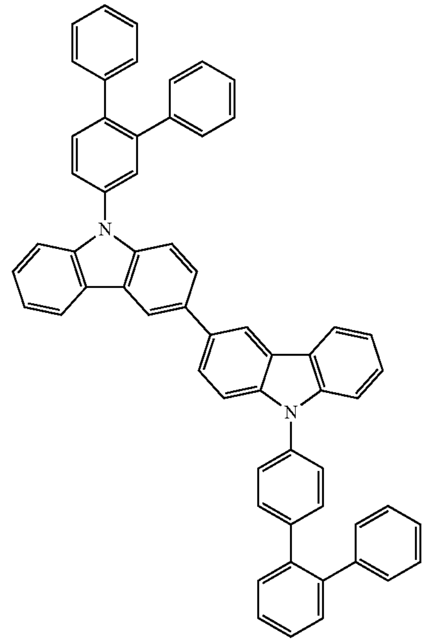
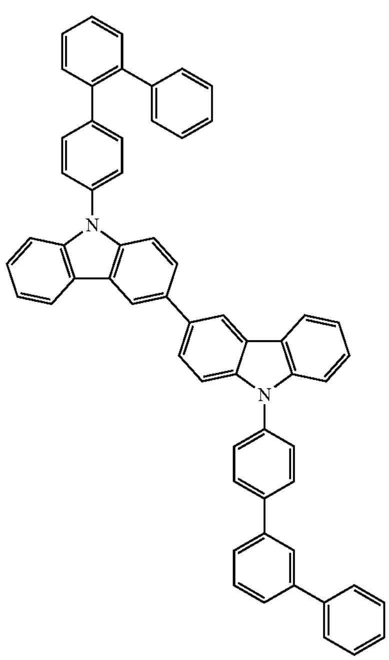
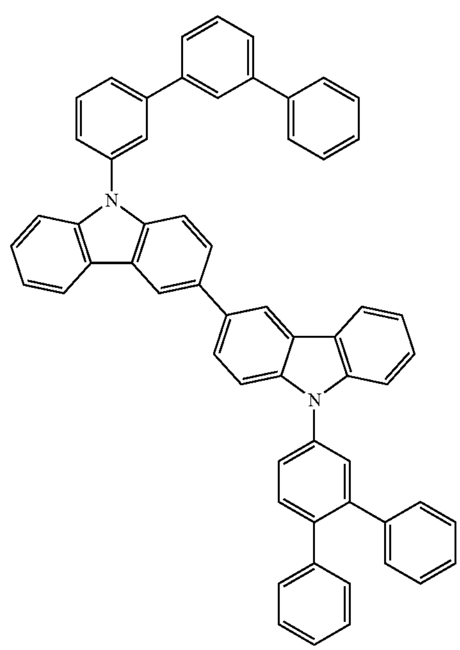

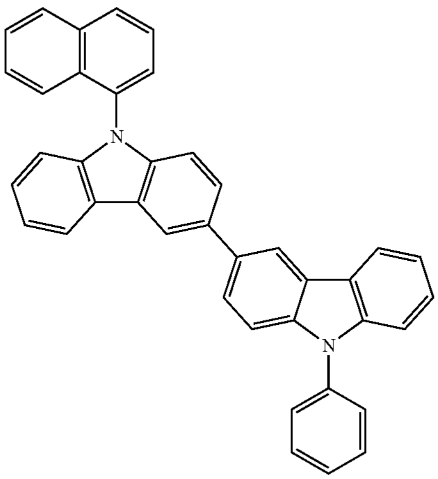
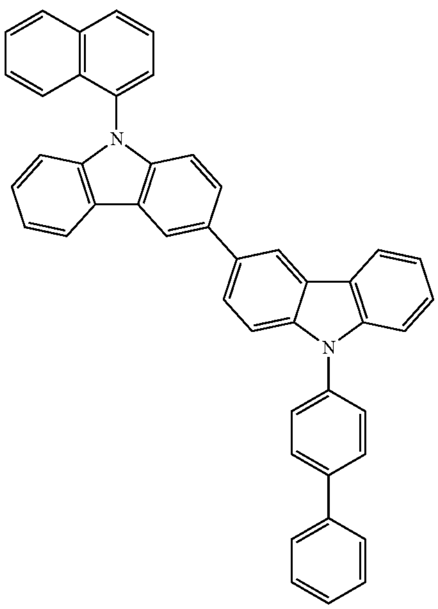
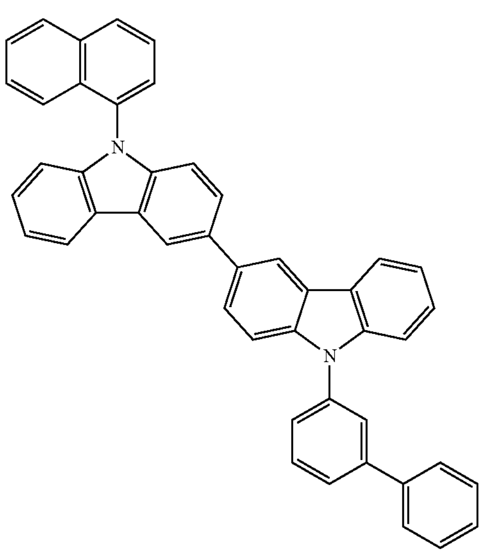
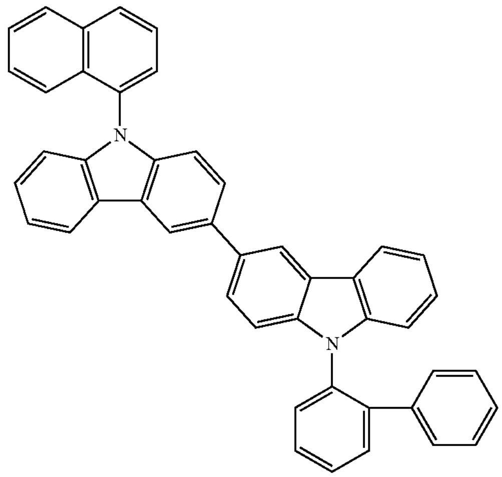
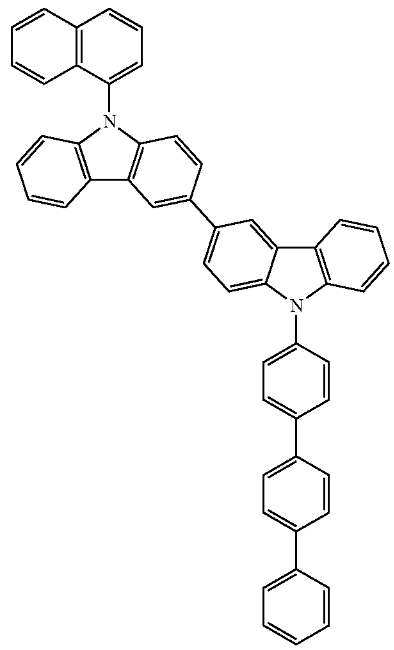
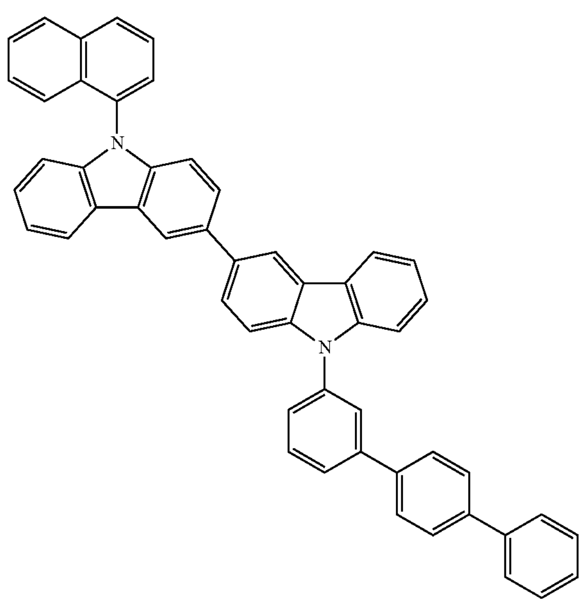
N
N -continued
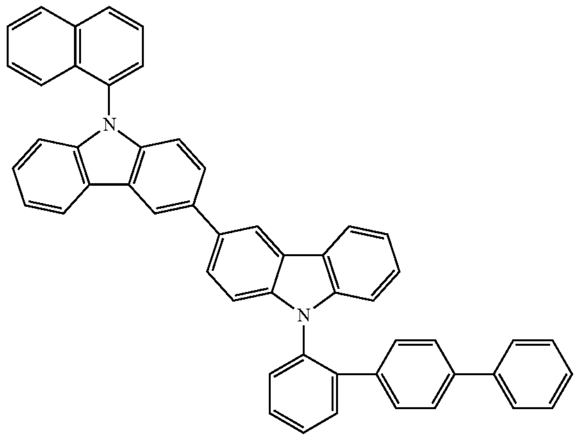
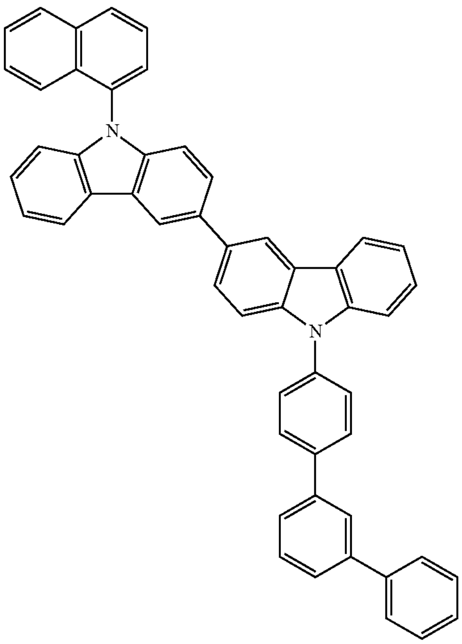
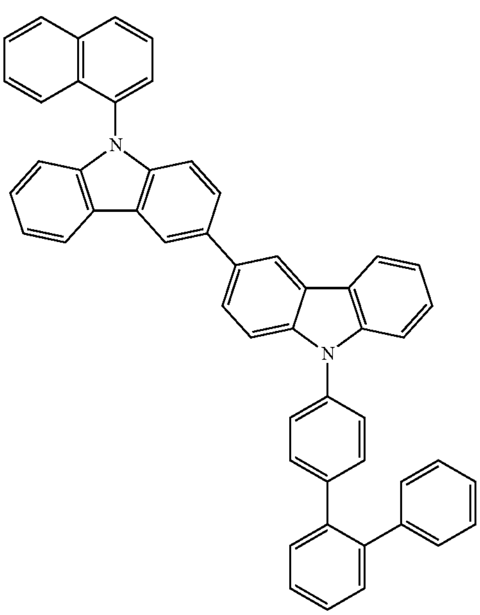
-continued
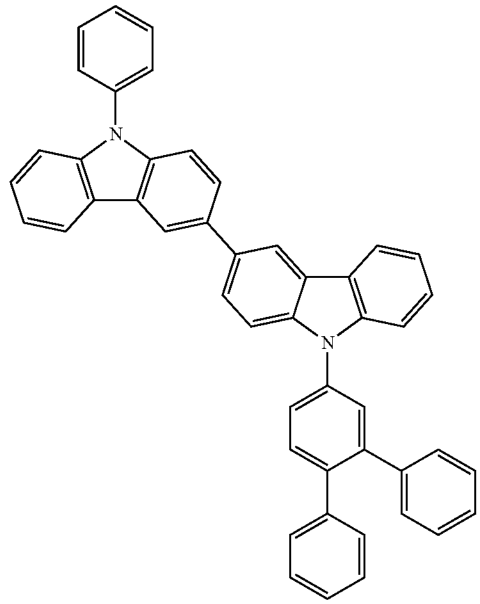
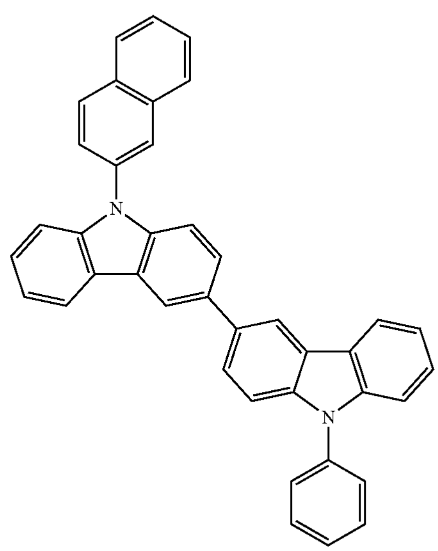

-continued
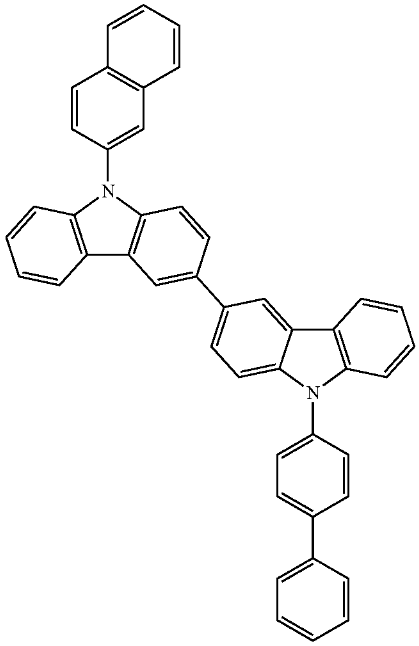
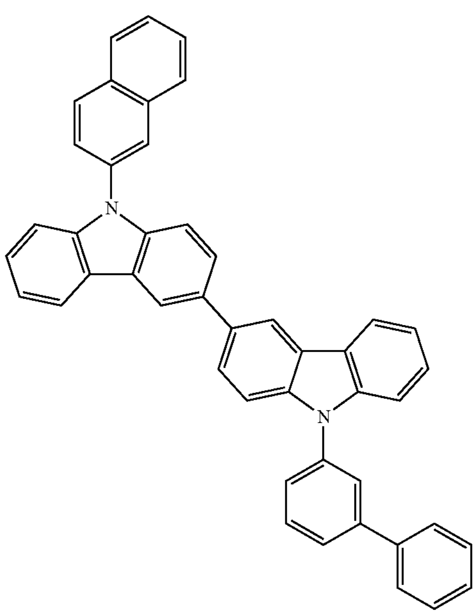
-continued
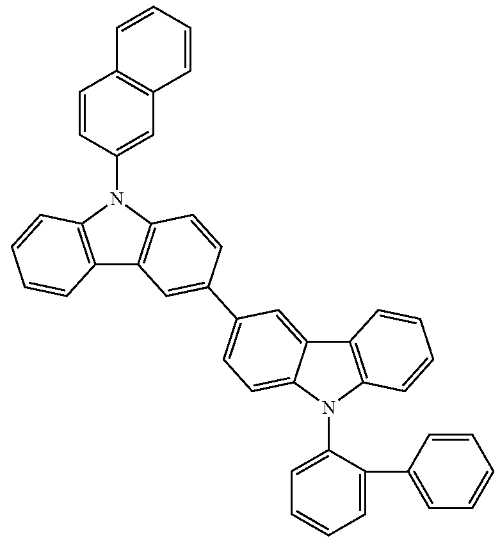
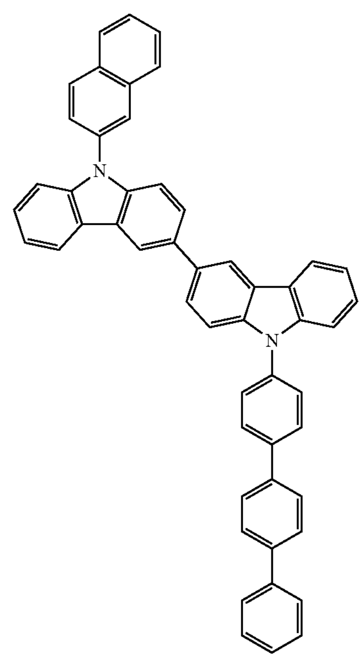

-continued
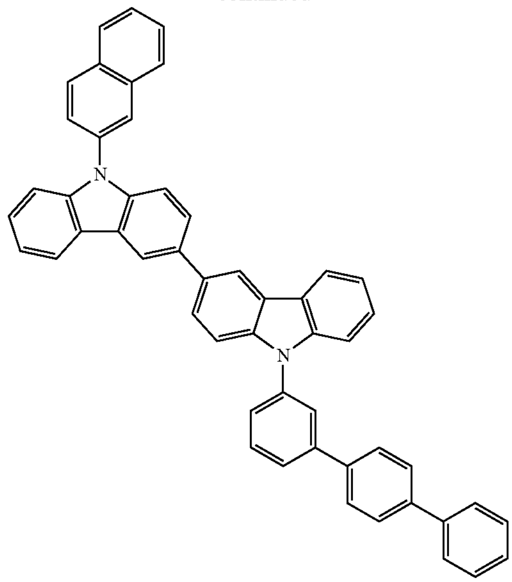
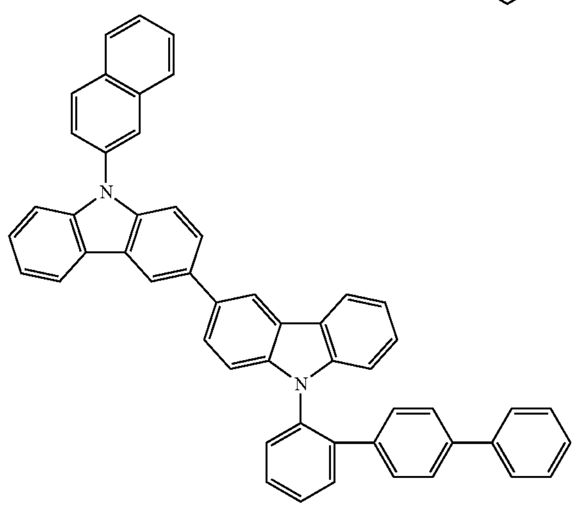
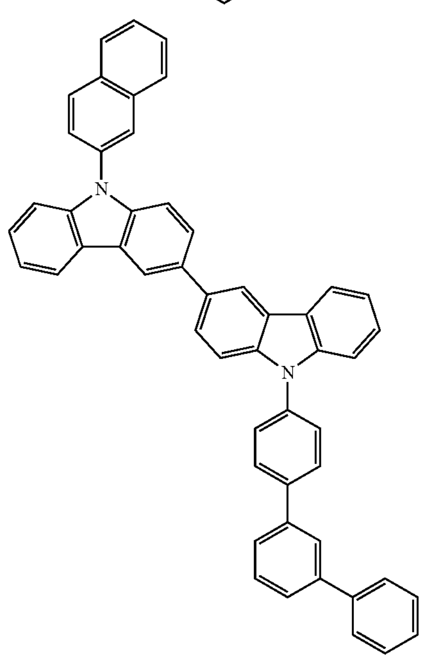
-continued
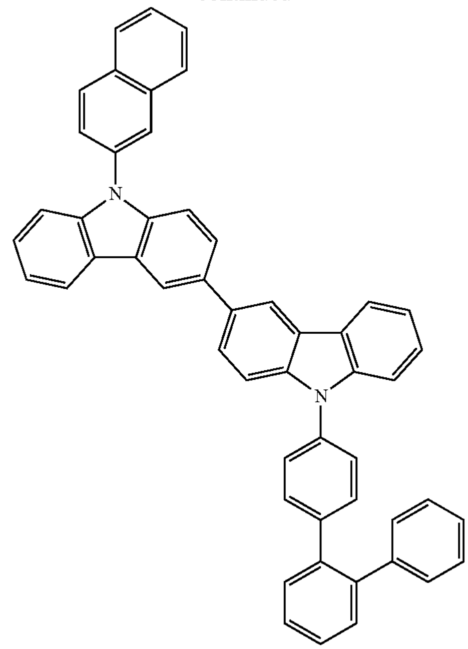
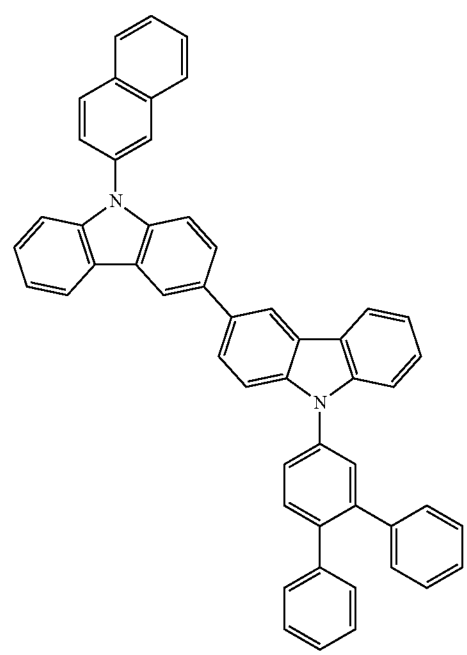

-continued
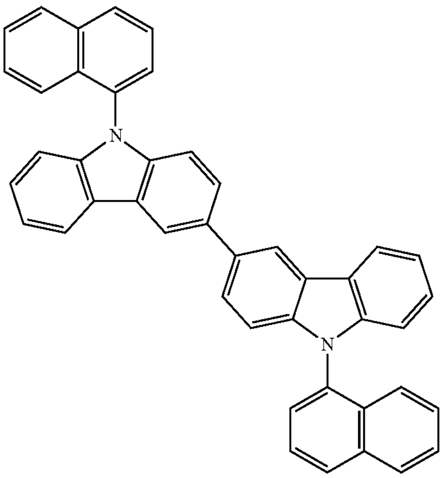
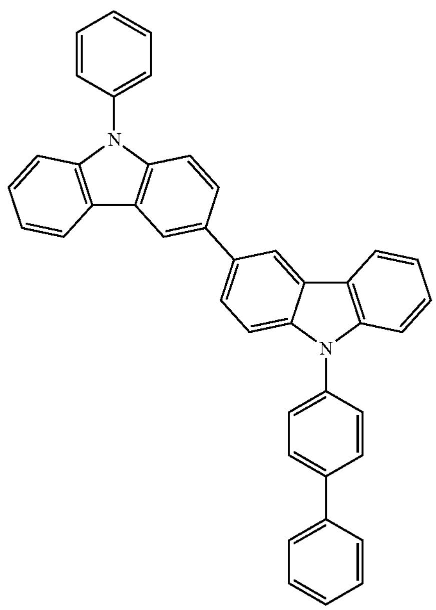
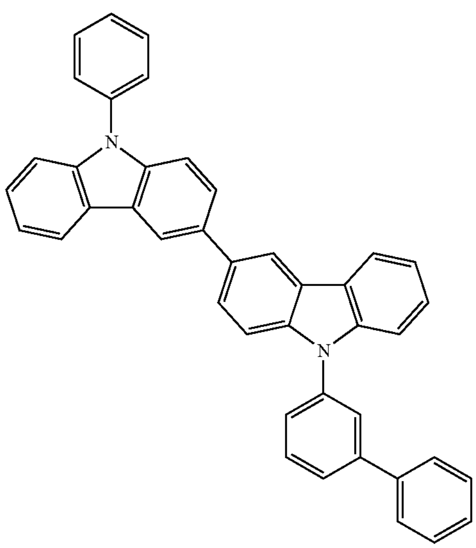
-continued
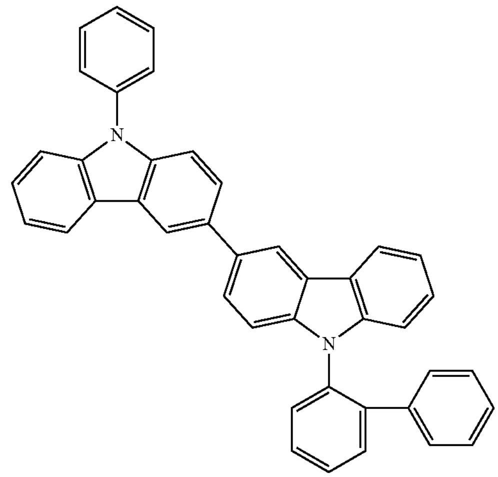
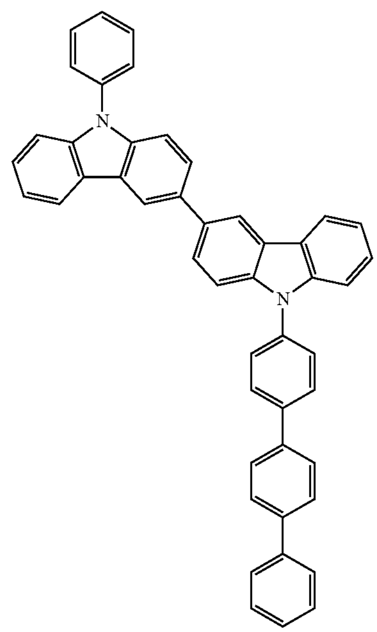
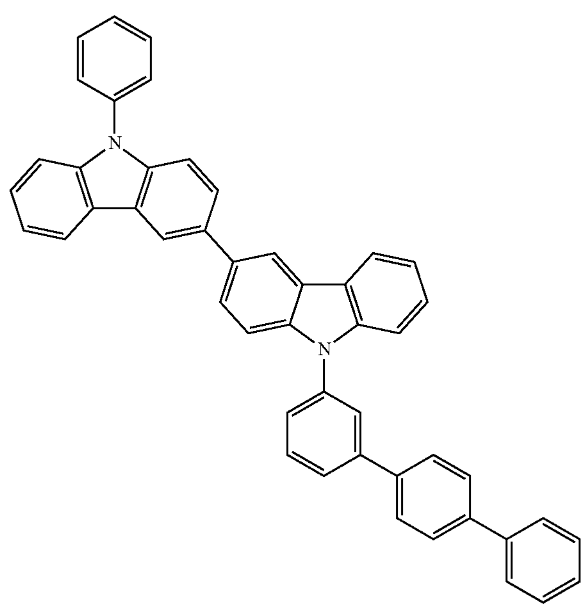

-continued
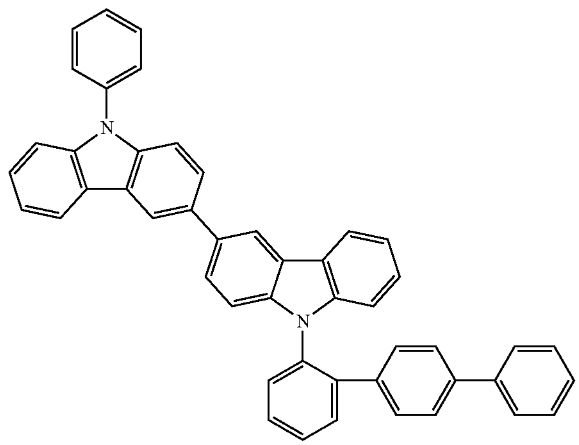
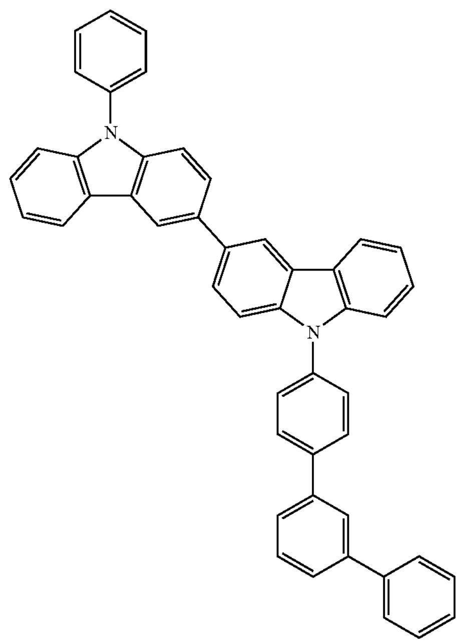
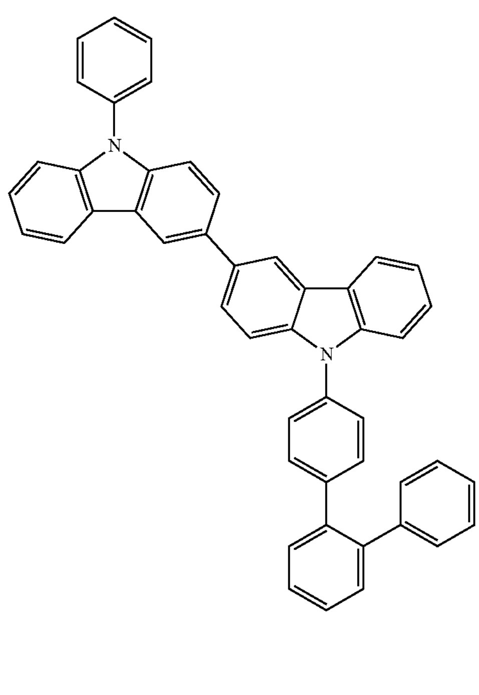
-continued
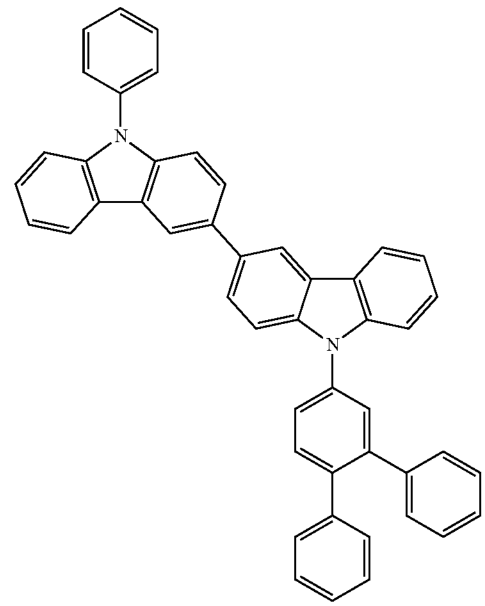
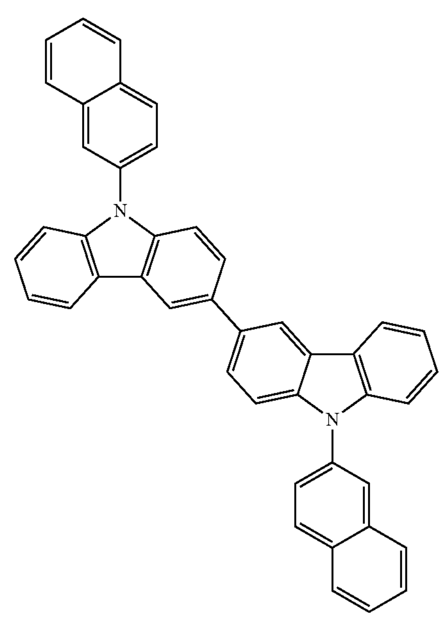

-continued
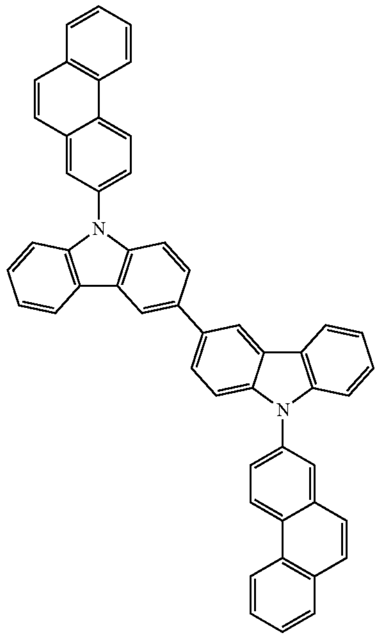
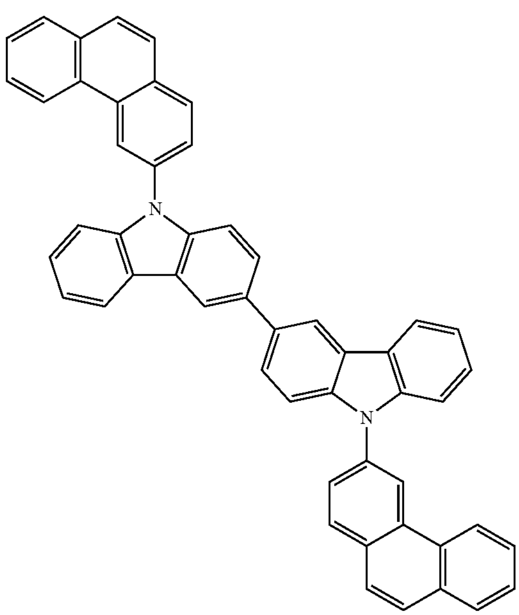
-continued
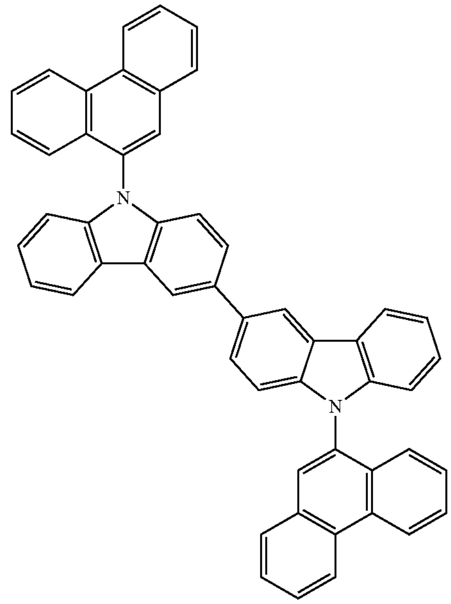
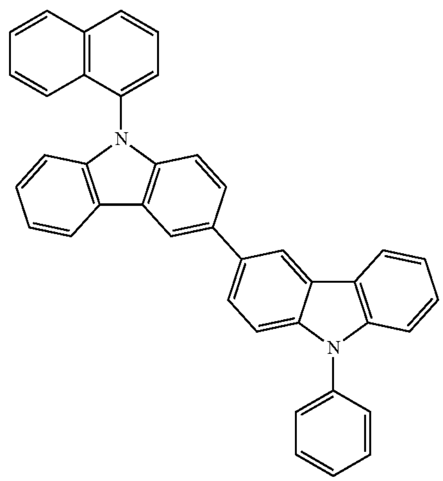
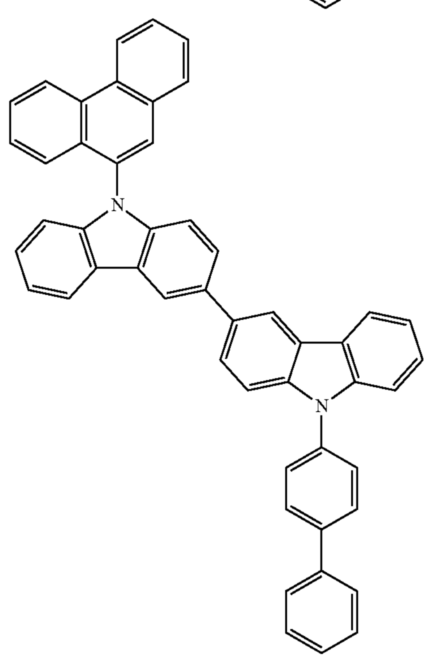

-continued
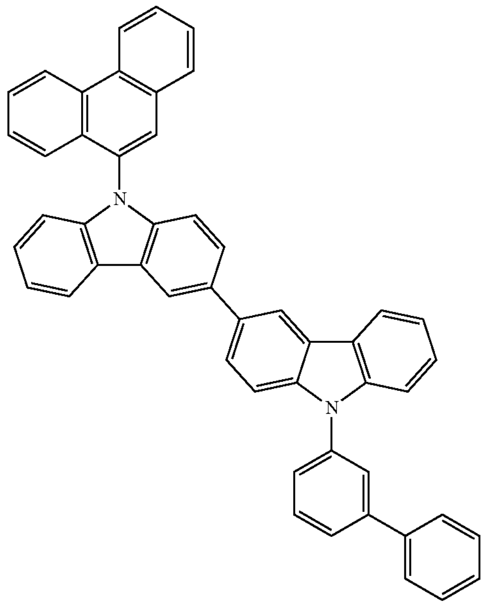
-continued
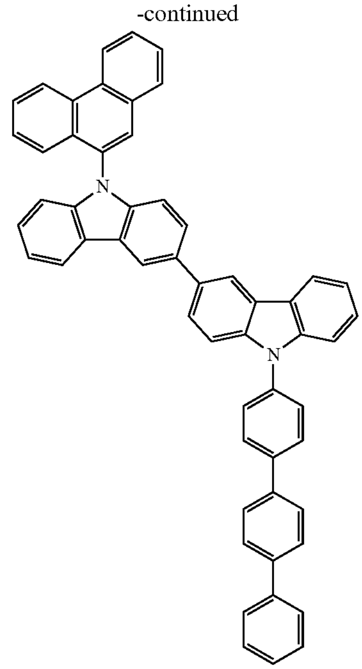
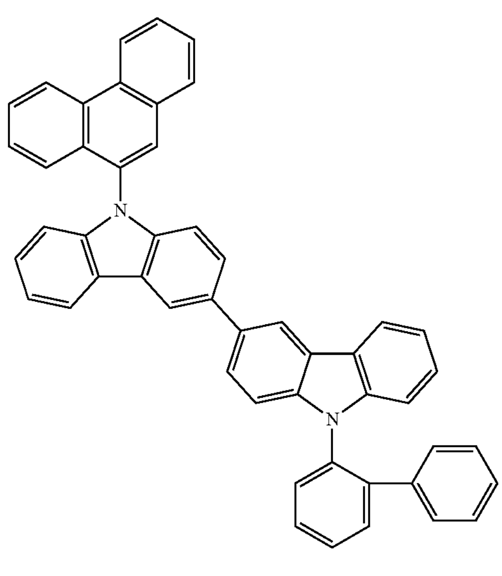
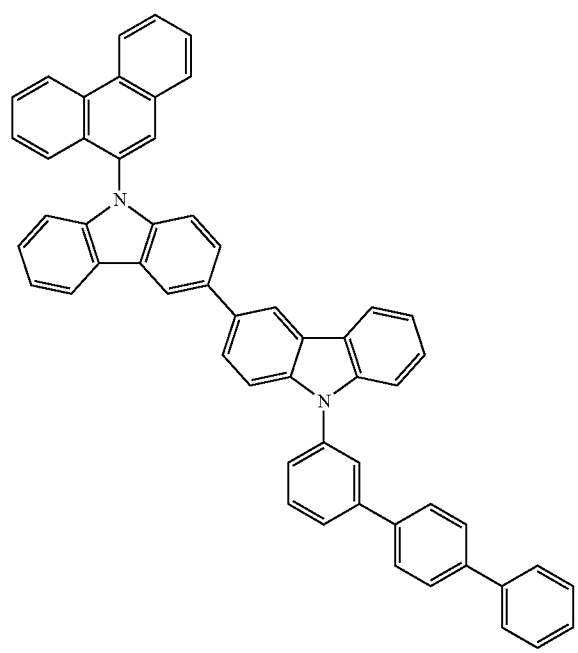

-continued
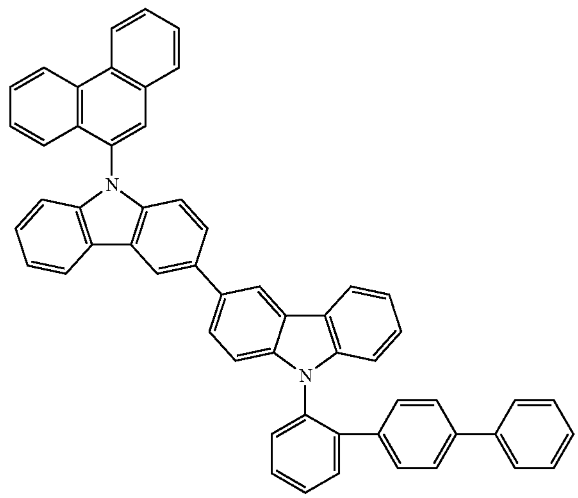
-continued
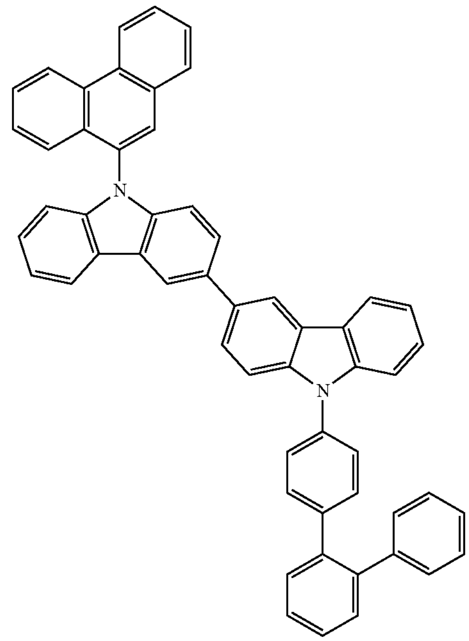
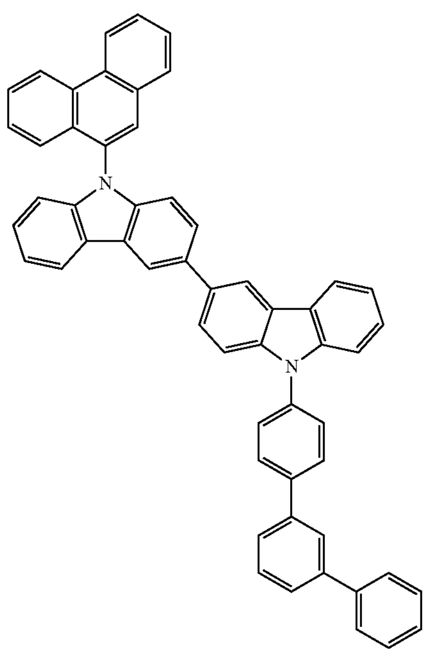

-continued
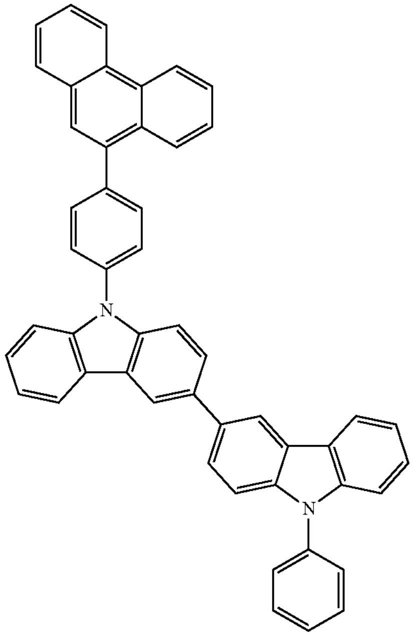
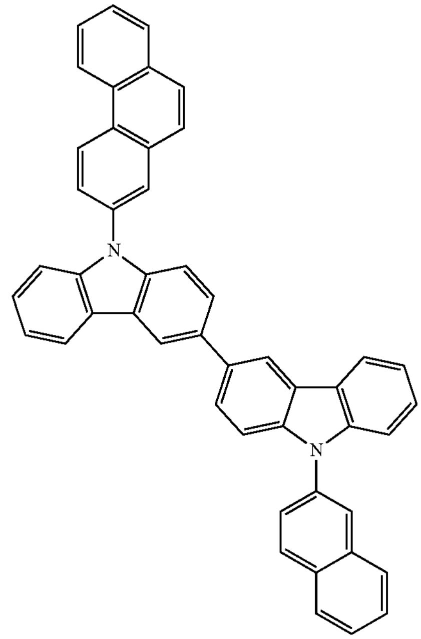
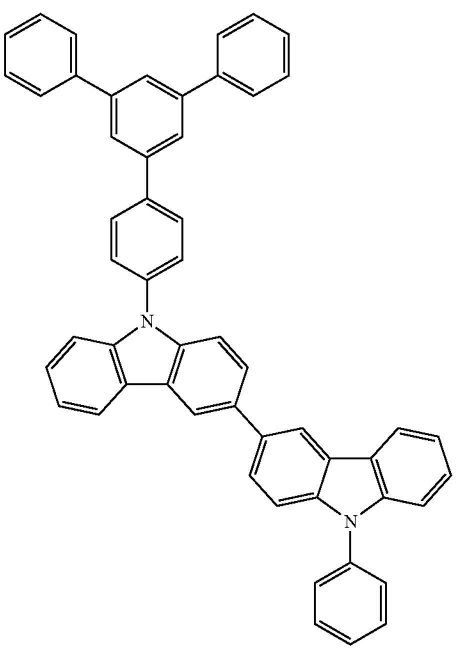
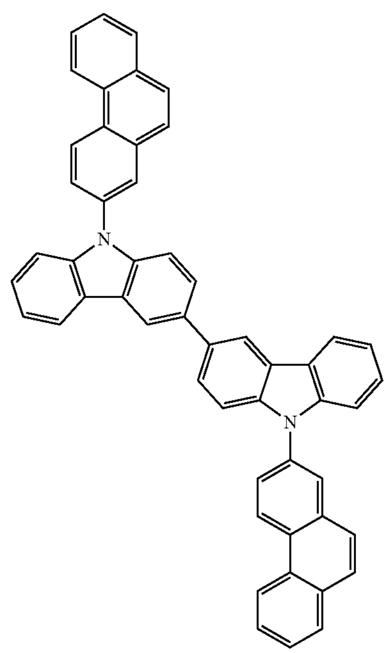

-continued
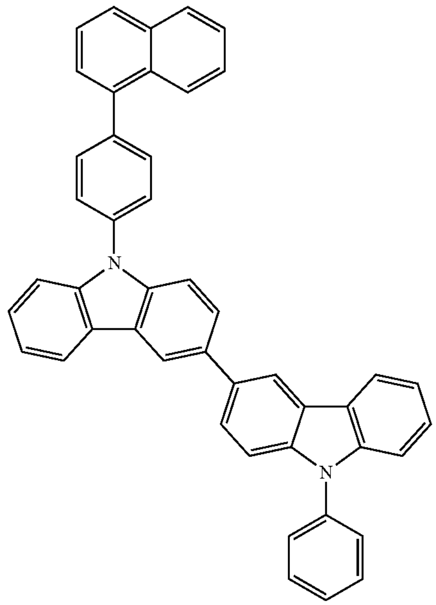
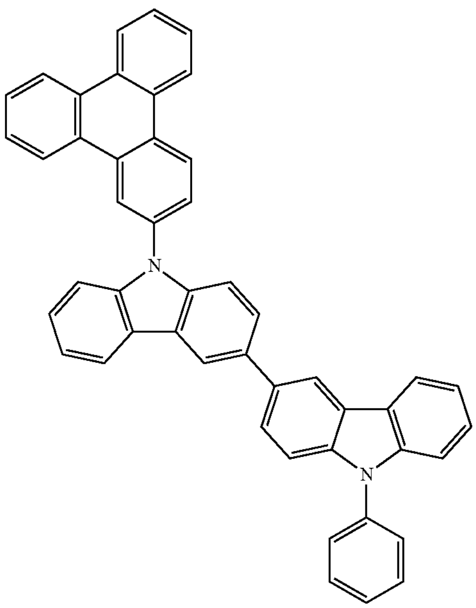
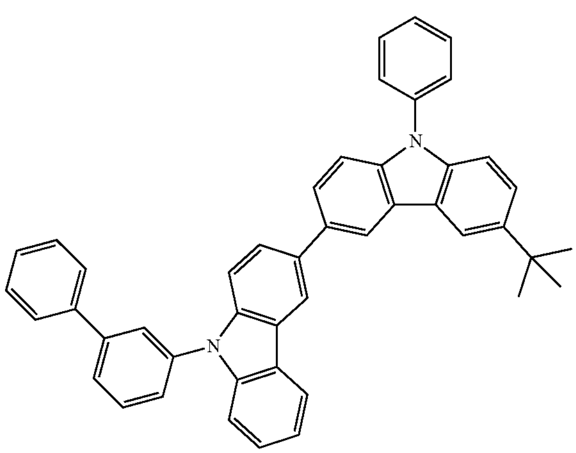
-continued
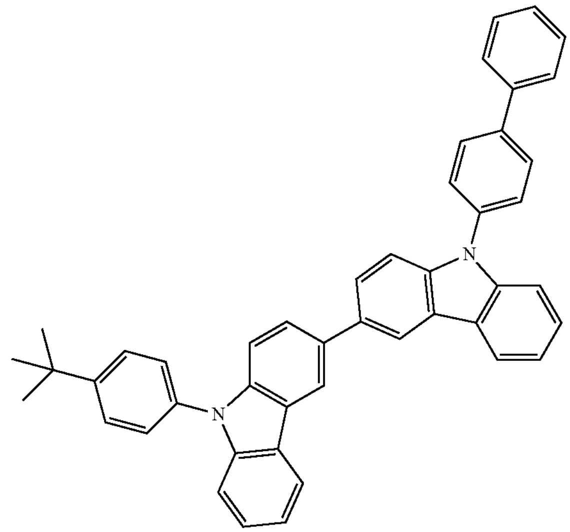
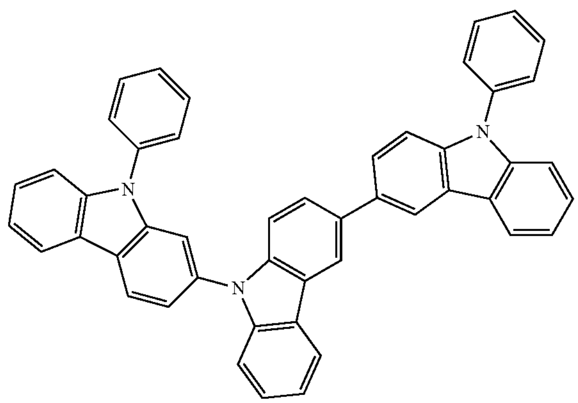
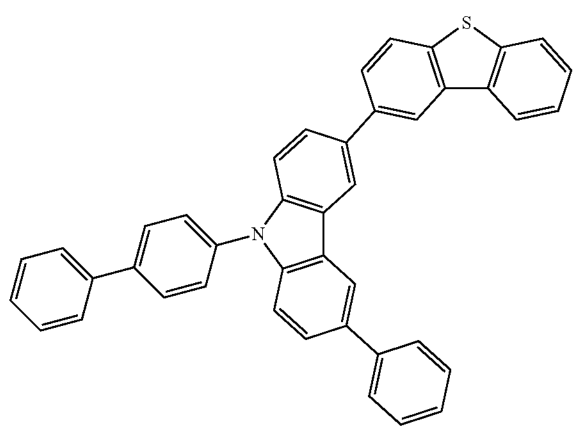
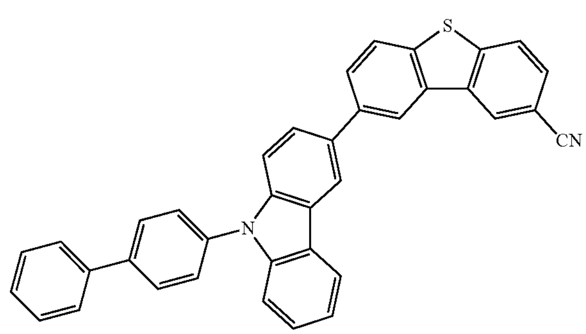

-continued
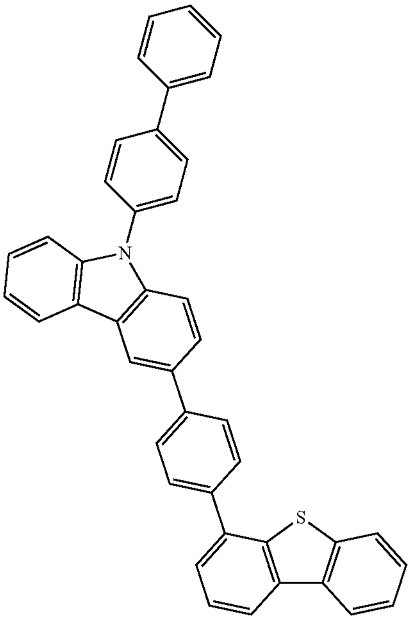
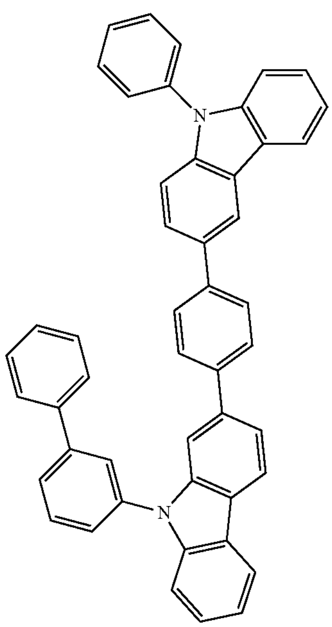
-continued
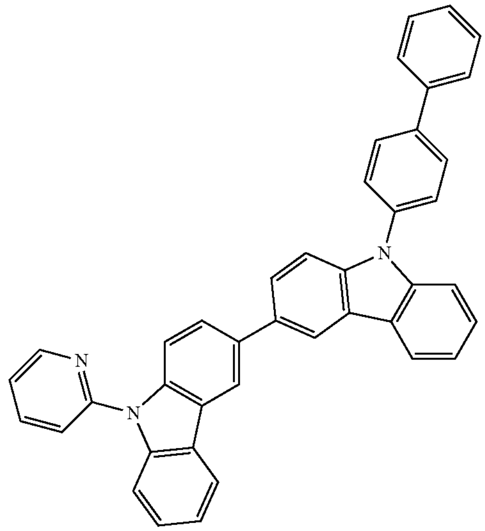
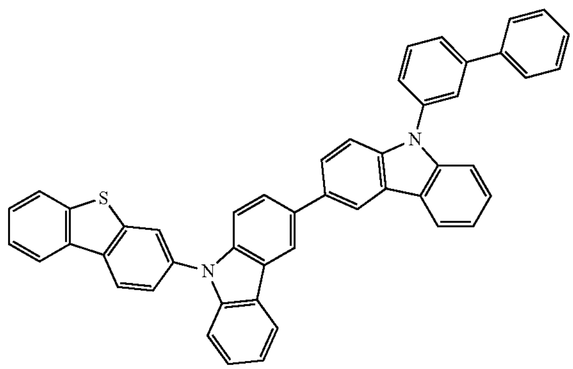
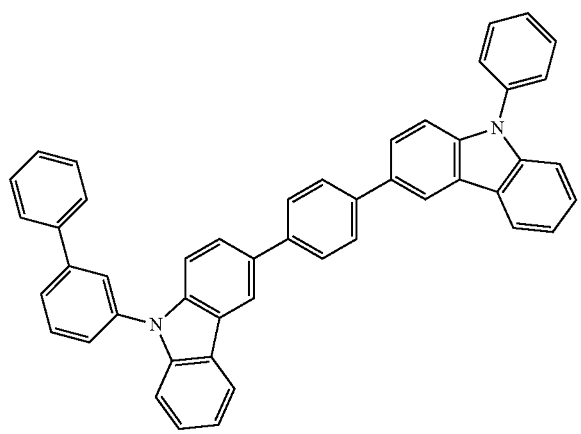
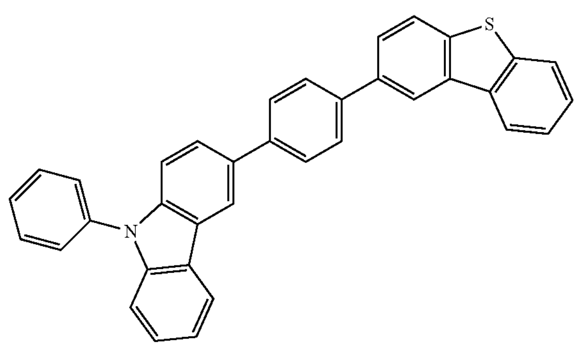

-continued
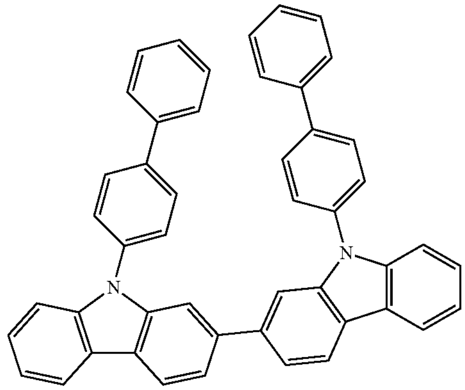
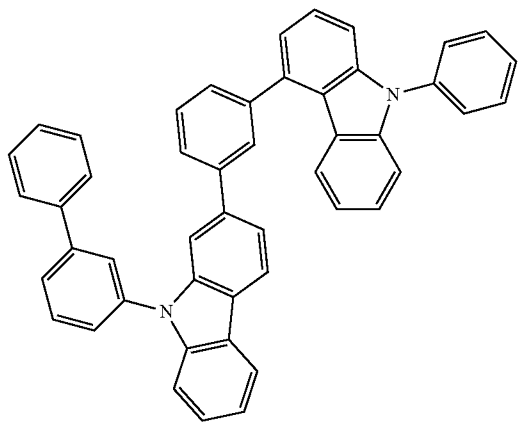
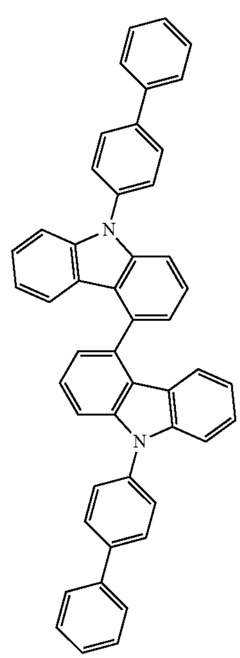
-continued
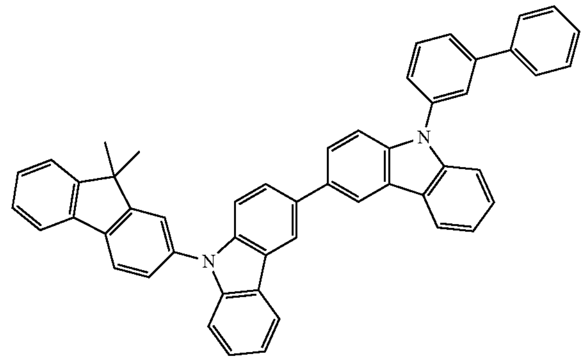
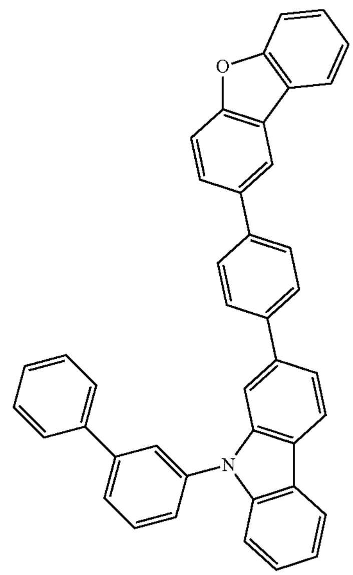
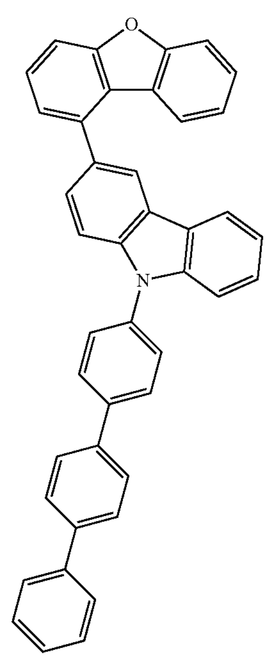

-continued
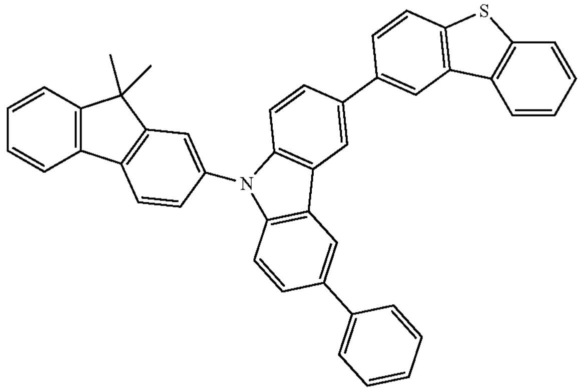
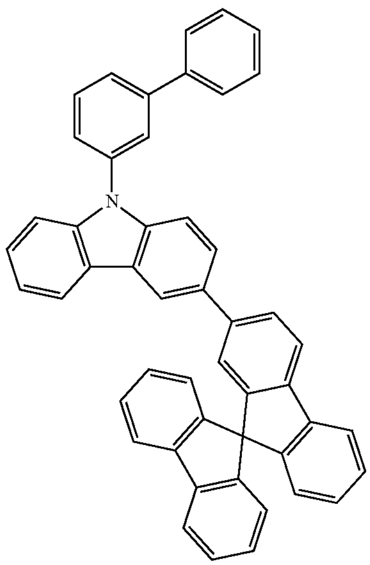
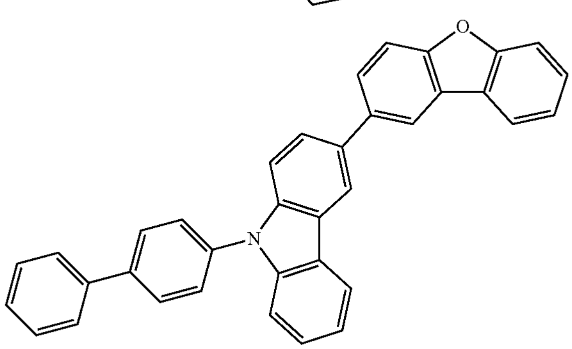
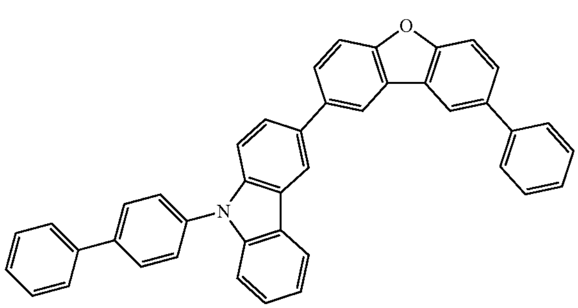
-continued
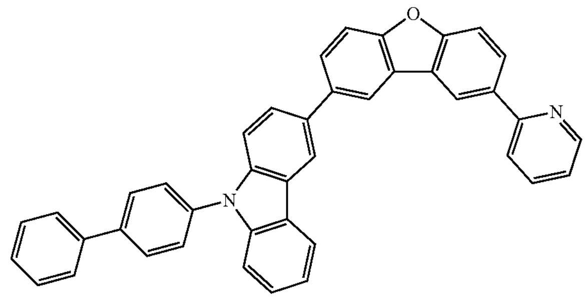
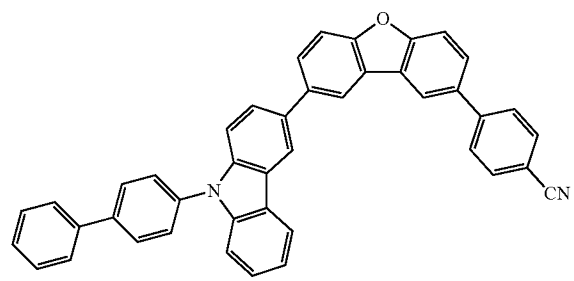
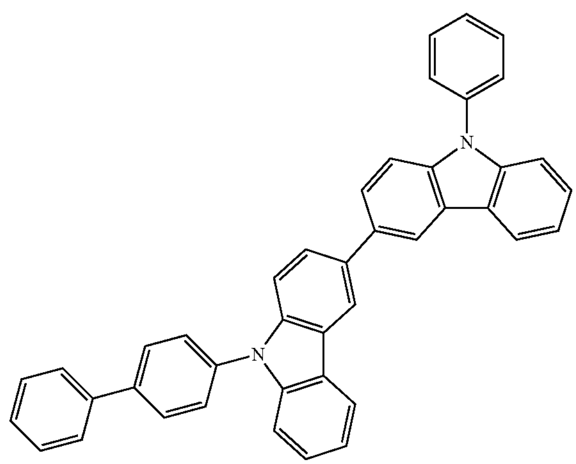
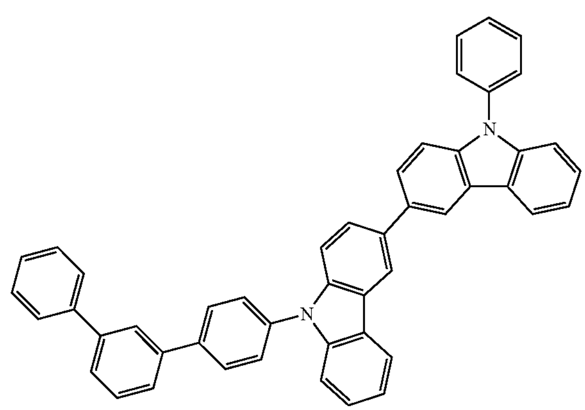

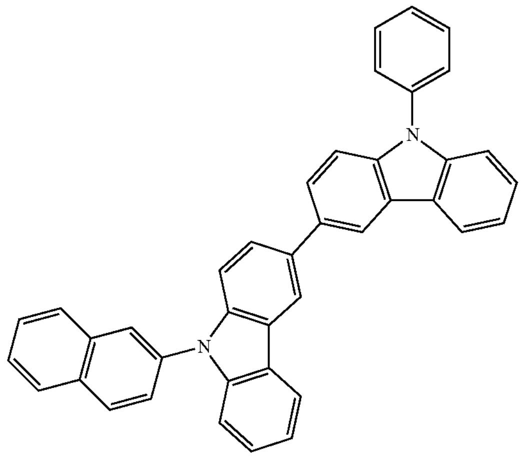
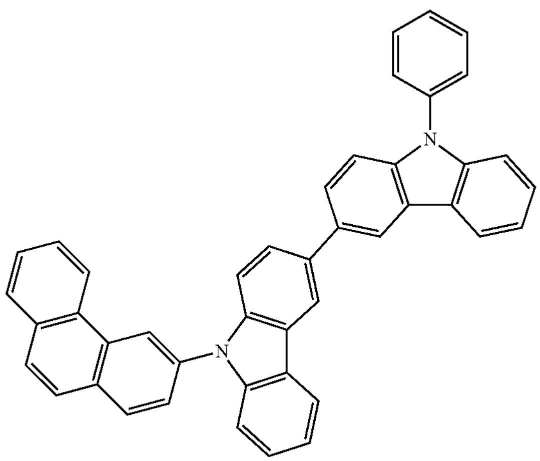
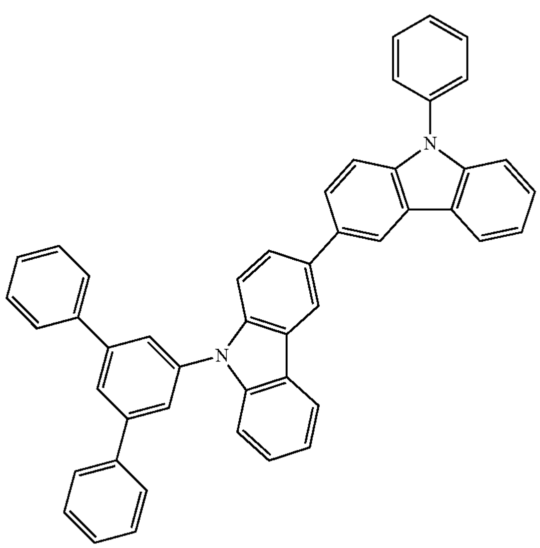
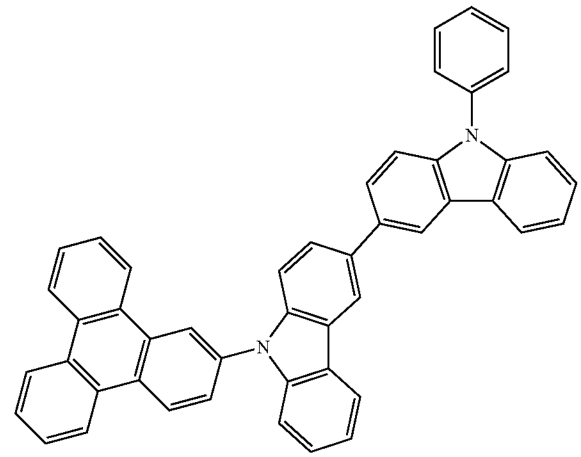
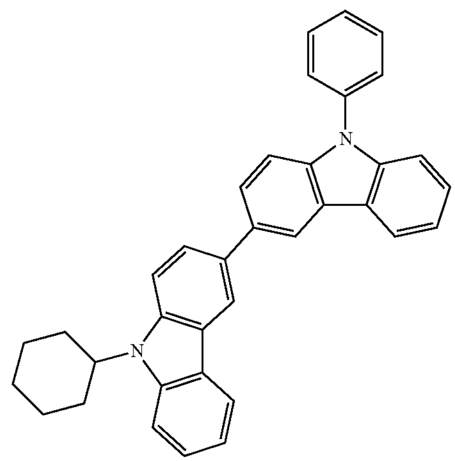
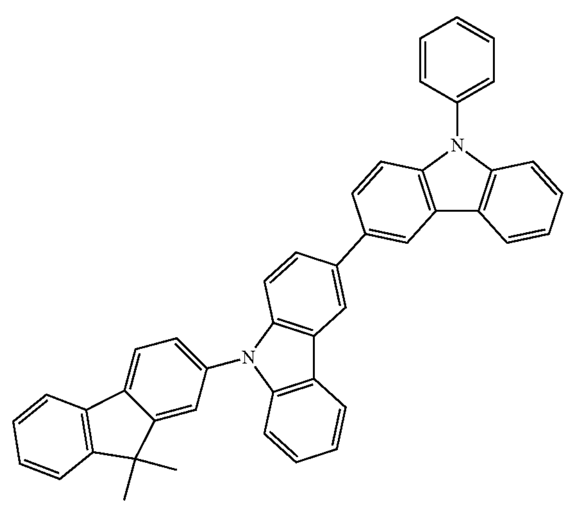

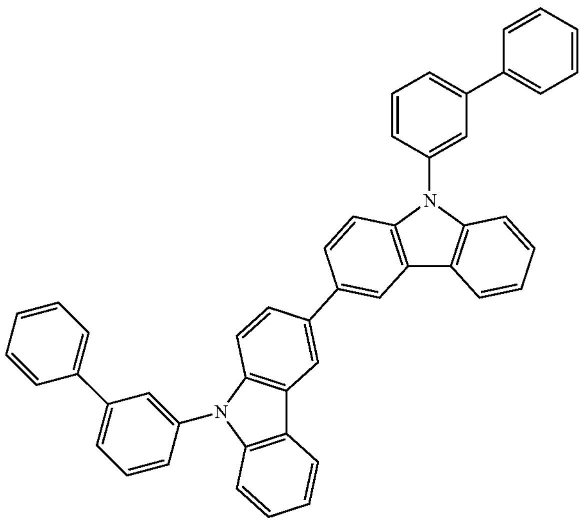
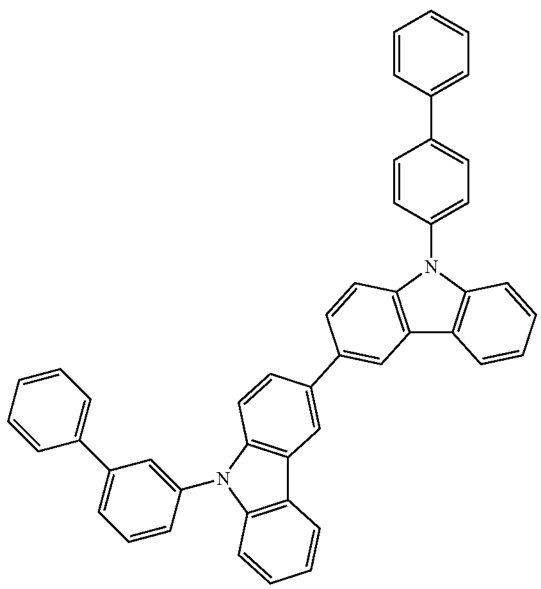
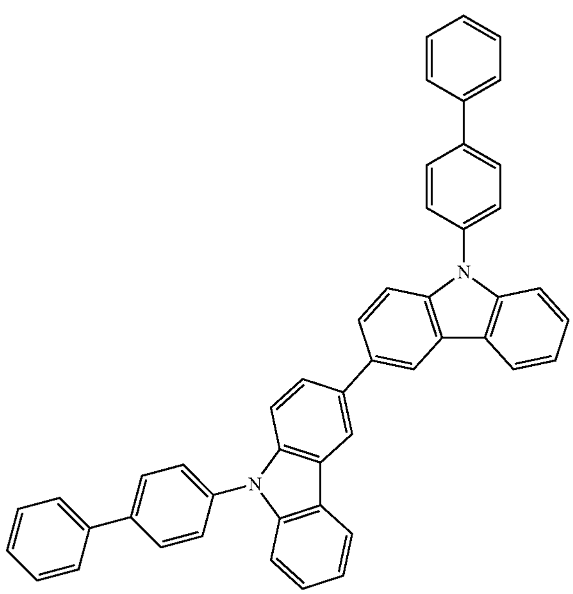
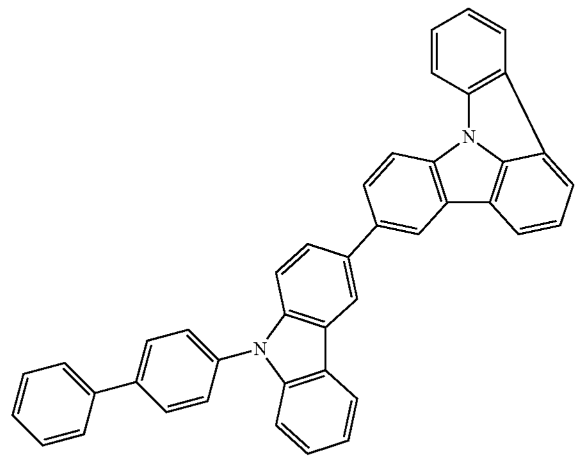
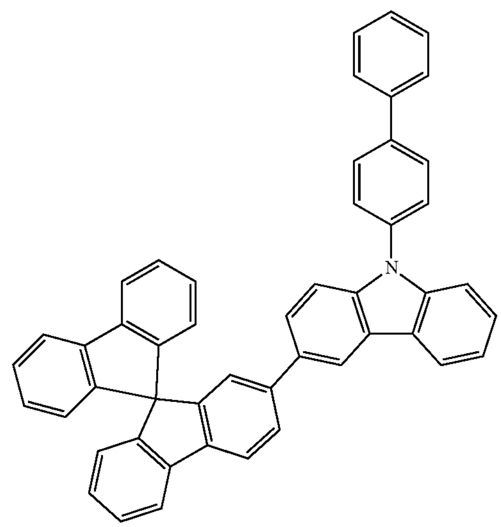
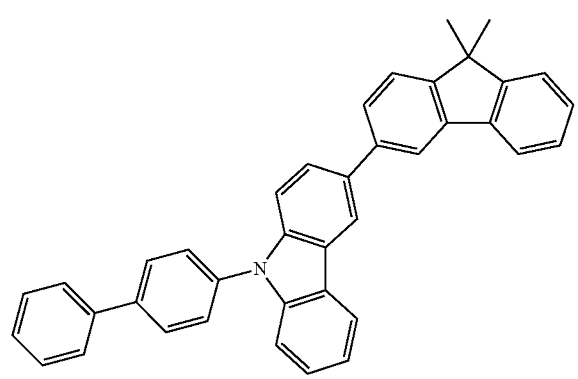

-continued

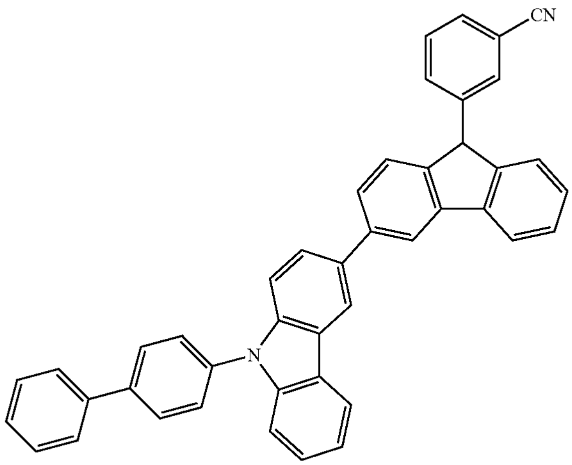

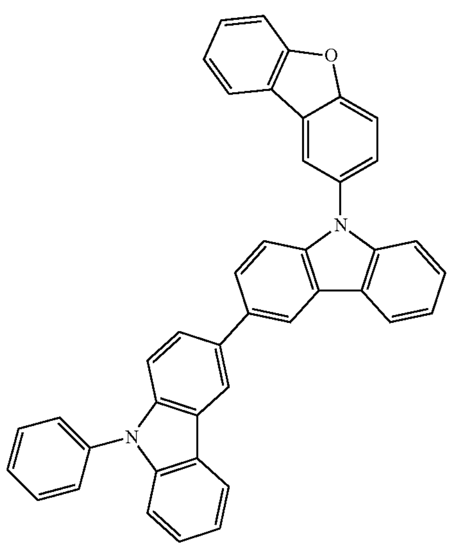

Further, the compound of Chemical Formula 3 can be prepared by the method as shown in Reaction Scheme 3 below.

[Reaction Scheme 3]

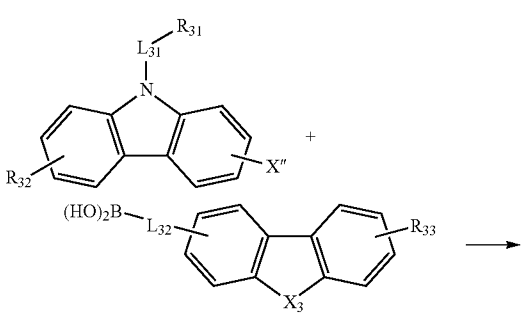

-continued

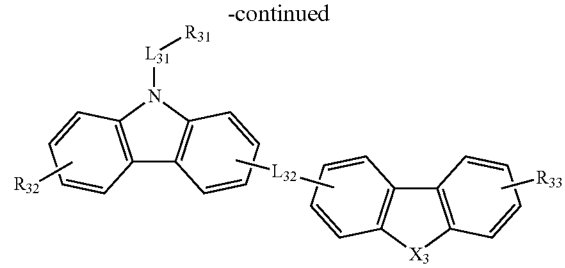

3

In Reaction Scheme 3, the remaining substituents excluding X" are the same as defined above, and X" is halogen and more preferably bromo or chloro.

The above reaction is a Suzuki coupling reaction, which is preferably carried out in the presence of a palladium catalyst and a base, and a reactive group for the Suzuki coupling reaction can be modified as known in the art. The above preparation method will be more specifically described in the Preparation Examples described hereinafter.

In the light emitting layer, the volume ratio of (i) the compound of Chemical Formula 2-1, or the compound of Chemical Formula 2-2; and (ii) the compound of Chemical Formula 3 is preferably 99:1 to 1:99, or 95:5 to 5:95.

Meanwhile, the dopant material can be an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

Electron Transport Layer

The electron transport layer is a layer which receives electrons from an electron injection layer and transports the electrons to a light emitting layer, and an electron transport material is suitably a material which can receive electrons well from a cathode and transfer the electrons to a light emitting layer and has large mobility for electrons. Specific examples thereof include: an Al complex of 8-hydroxyquinoline; a complex including $Alq_3$; an organic radical compound; a hydroxyflavone-metal complex, and the like, but are not limited thereto. The electron transport layer can be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present invention can include the electron injection layer between the electron transport layer and the cathode, if necessary.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)-gallium, bis(2-methyl-8-quinolinato)(1-naphtholato)aluminum, bis(2-methyl-8-quinolinato)(2-naphtholato)gallium, and the like, but are not limited thereto.

Organic Light Emitting Device

The structure of an organic light emitting device according to an embodiment of the present invention is illustrated in FIG. 1. FIG. 1 shows an example of an organic light emitting device comprising a substrate 1, an anode 2, a hole transport layer 3, a hole control layer 4, a light emitting layer 5, an electron transport layer 6, and a cathode 7.

The organic light emitting device according to the present invention can be manufactured by sequentially laminating the above-mentioned components. In this case, the organic light emitting device can be manufactured can be manufactured by depositing a metal, metal oxides having conductivity, or an alloy thereof on the substrate using a PVD (physical vapor deposition) method such as a sputtering method or an e-beam evaporation method to form an anode, forming the above-mentioned respective layers thereon, and then depositing a material that can be used as the cathode thereon. In addition to such a method, the organic light emitting device can be manufactured by sequentially depositing a cathode material, an organic material layer and an anode material on a substrate. Further, the light emitting layer can be formed using the host and the dopant by a solution coating method as well as a vacuum deposition method. Herein, the solution coating method means a spin coating, a dip coating, a doctor blading, an inkjet printing, a screen printing, a spray method, a roll coating, or the like, but is not limited thereto.

In addition to such a method, the organic light emitting device can be manufactured by sequentially depositing a cathode material, an organic material layer and an anode material on a substrate (International Publication WO2003/012890). However, the manufacturing method is not limited thereto.

Meanwhile, the organic light emitting device according to the present invention can be a front side emission type, a backside emission type, or a double-sided emission type according to the used material.

Hereinafter, exemplary Examples will be presented to help with understanding of the present invention. However, the following Examples are merely provided such that the present invention can be more fully understood, and are not intended to limit the scope of the present invention.

PREPARATION EXAMPLE 1

Preparation Example 1-1: Preparation of Compound 1-1

1) Preparation of Compound 1-1-A

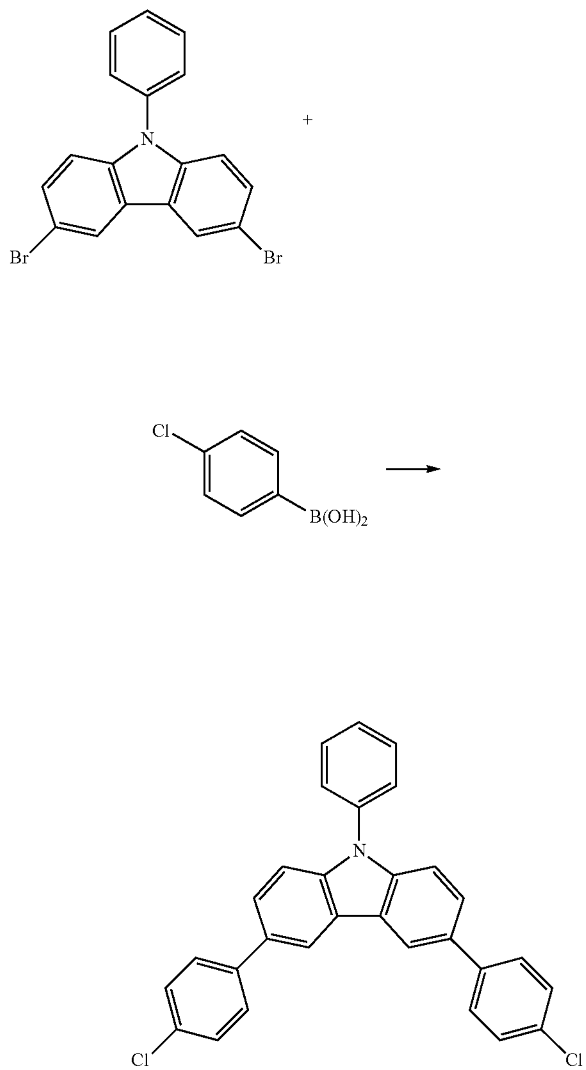

1-1-A 3,6-Dibromo-9-phenyl-9H-carbazole (1 eq), 4-chlorophenylboronic acid (2 eq), $Pd(PPh_3)_4$ (0.002 eq), $K_2CO_3$(aq) (2 eq), and THF were added simultaneously to a round bottom flask under a nitrogen atmosphere, and the mixture was refluxed and stirred at 110° C. The reaction solution was cooled down to room temperature, the organic layer was separated, dried under reduced pressure, and then purified by column chromatography to give Compound 1-1-A.

2) Preparation of Compound 1-1

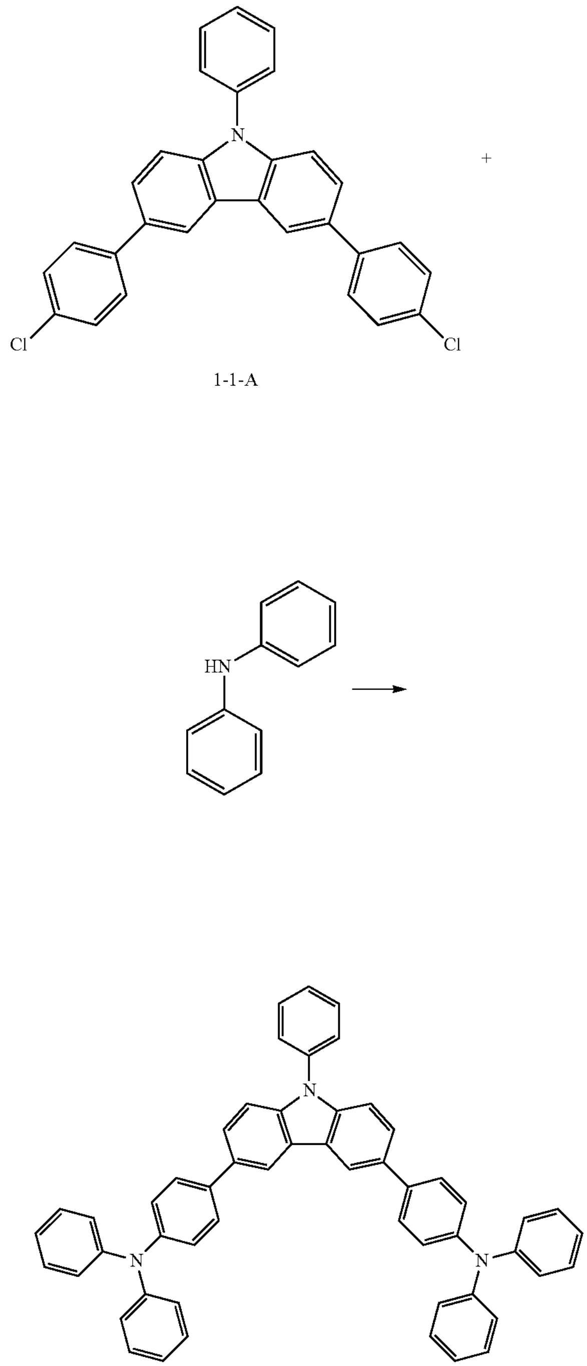

1-1-A 1-1

Compound 1-1-A (1 eq), diphenylamine (2 eq), Pd(P-$tBu_3)_2$ (0.001 eq), NaOtBu (2 eq), and toluene were added simultaneously to a round bottom flask under a nitrogen atmosphere, and the mixture was refluxed and stirred at 110° C. The reaction solution was cooled down to room temperature, the organic layer was separated, dried under reduced pressure, and then purified by column chromatography to give Compound 1-1 (MS: $[M+H]^+$=729).

Preparation Example 1-2: Preparation of Compound 1-2

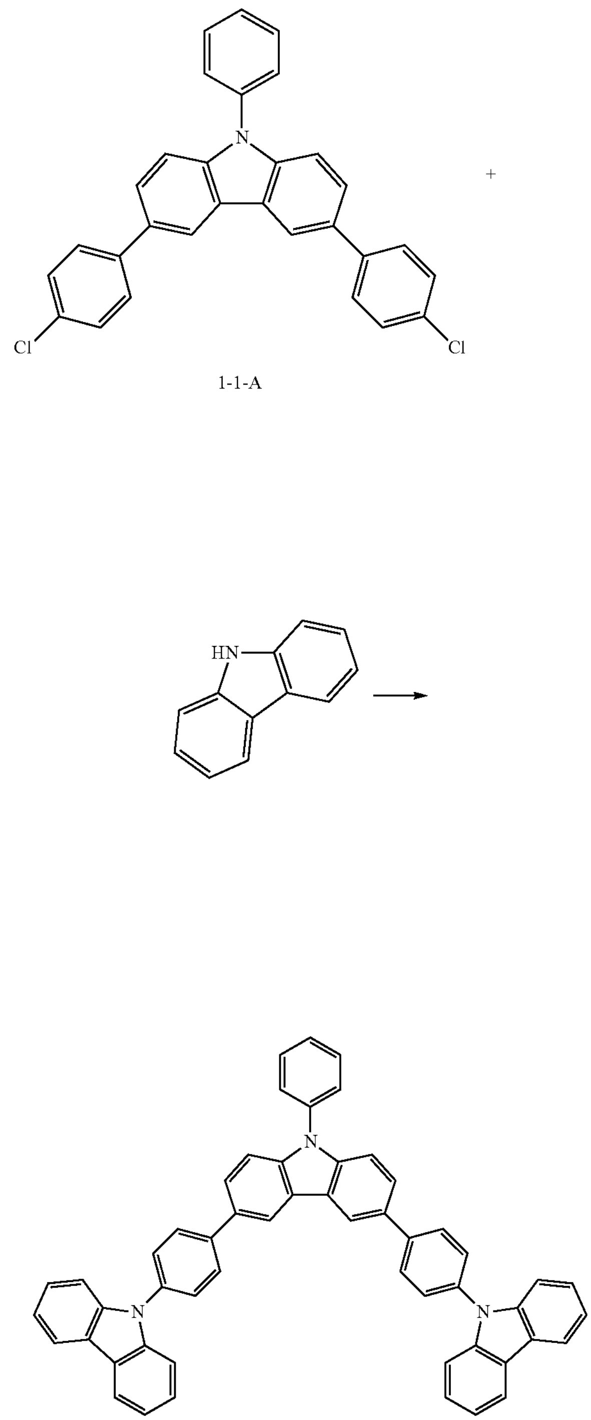

1-1-A 1-2

Compound 1-2 (MS: $[M+H]^+$=725) was obtained in the same manner as in the preparation method of Compound 1-1 by using 9H-carbazole.

Preparation Example 1-3: Preparation of Compound 1-3

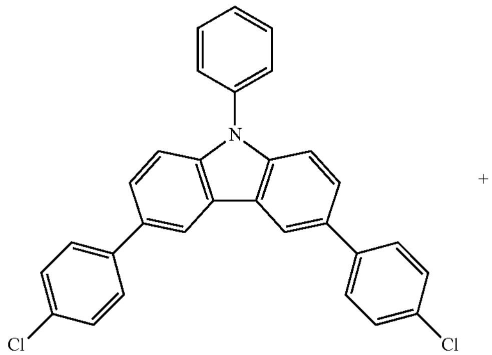

1-1-A

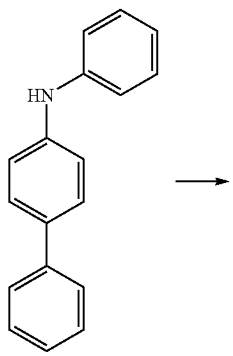

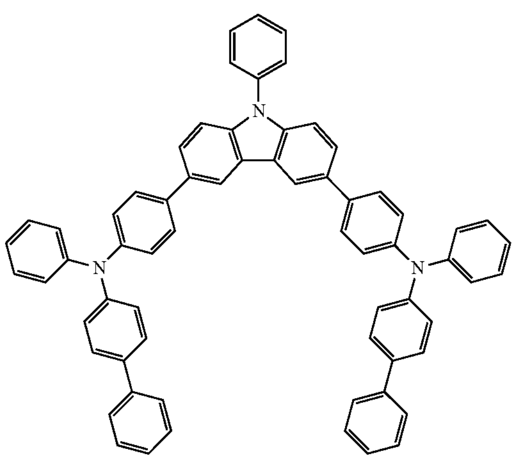

1-3

Compound 1-3 (MS: $[M+H]^+$=881) was obtained in the same manner as in the preparation method of Compound 1-1 by using N-phenylbiphenyl-4-amine.

Preparation Example 1-4: Preparation of Compound 1-4

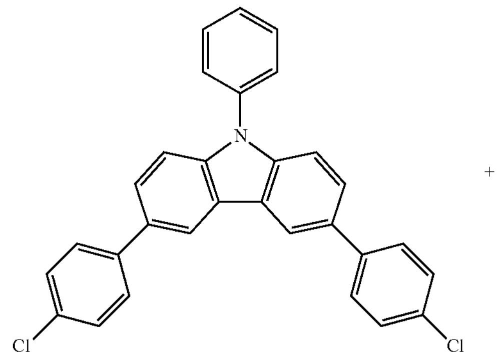

1-1-A

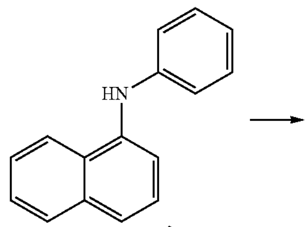

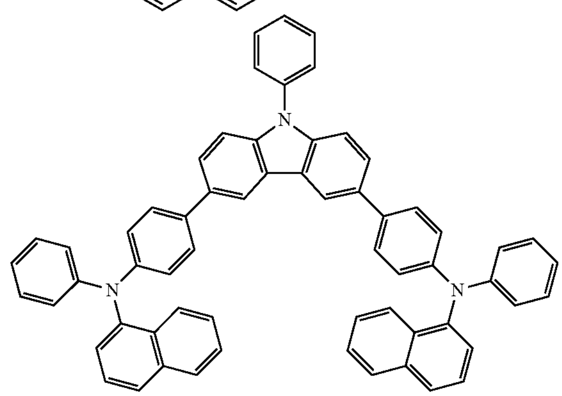

1-4

Compound 1-4 (MS: $[M+H]^+$=829) was obtained in the same manner as in the preparation method of Compound 1-1 by using N-phenylnaphthalen-1-amine.

Preparation Example 1-5: Preparation of Compound 1-5

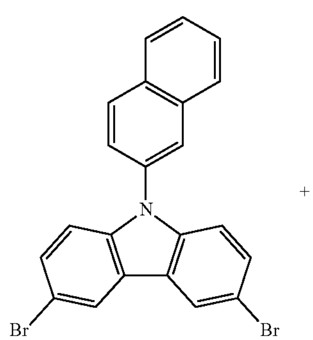

-continued

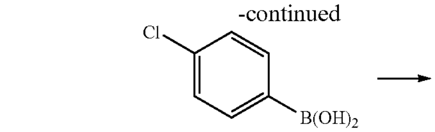

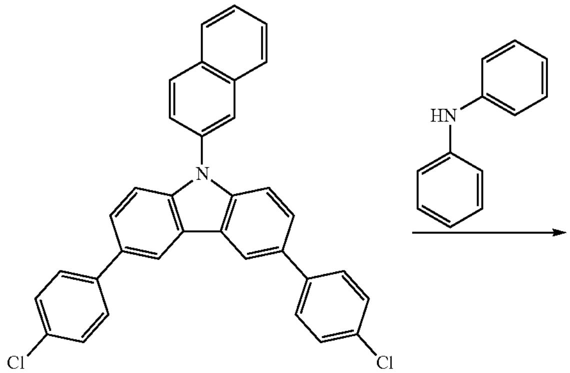

1-5-A

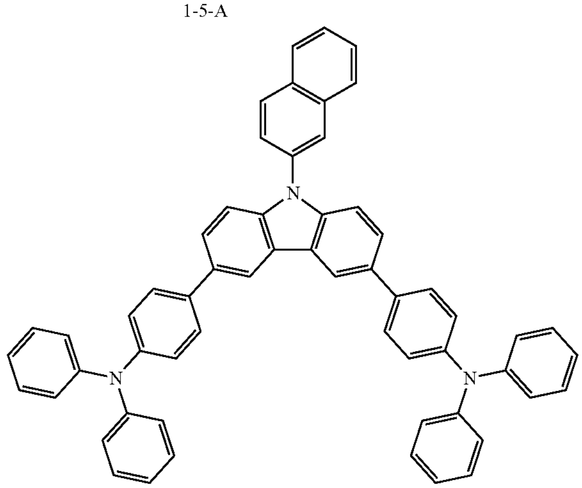

1-5

Compound 1-5 (MS: $[M+H]^+$=779) was obtained in the same manner as in the preparation method of Compound 1-1 by using 3,6-dibromo-9-(naphthalen-2-yl)-9H-carbazole.

Preparation Example 1-6: Preparation of Compound 1-6

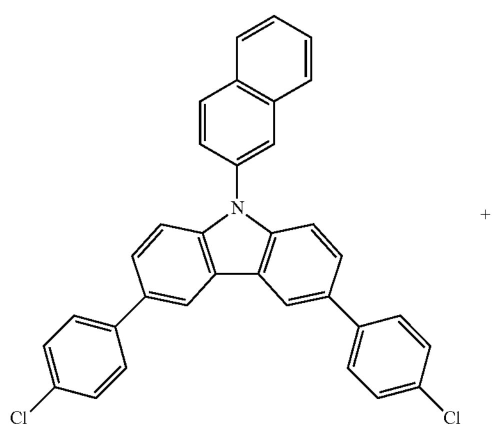

1-5-A

-continued

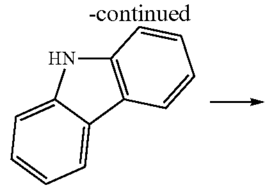

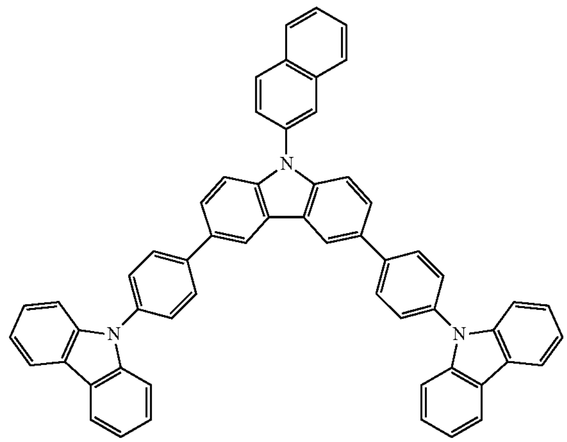

1-6

Compound 1-6 (MS: $[M+H]^+$=775) was obtained in the same manner as in the preparation method of Compound 1-5 by using 9H-carbazole.

Preparation Example 1-7: Preparation of Compound 1-7

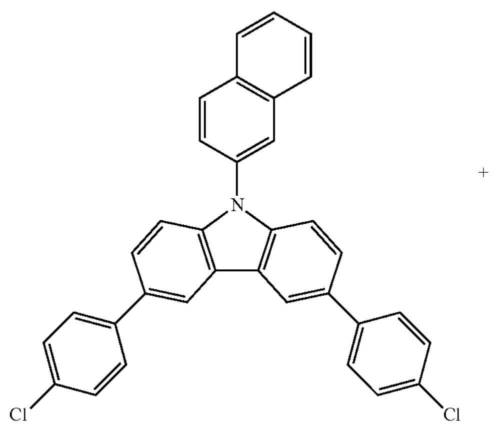

1-5-A

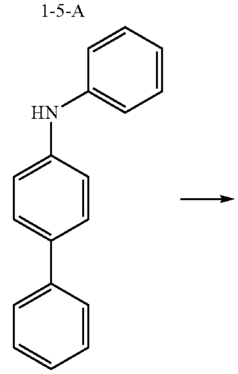

-continued

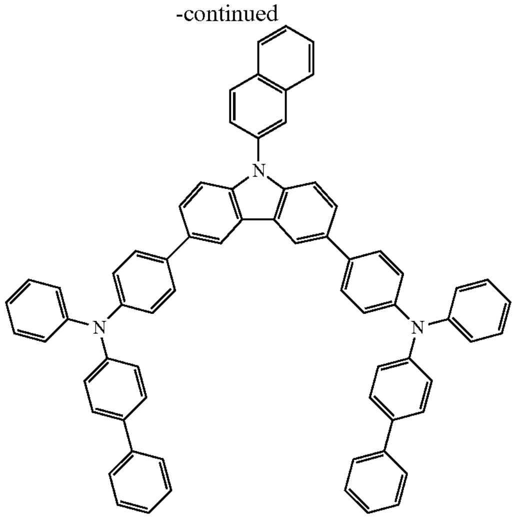

1-7

Compound 1-7 (MS: $[M+H]^+$=931) was obtained in the same manner as in the preparation method of Compound 1-5 by using N-phenylbiphenyl-4-amine.

Preparation Example 1-8: Preparation of Compound 1-8

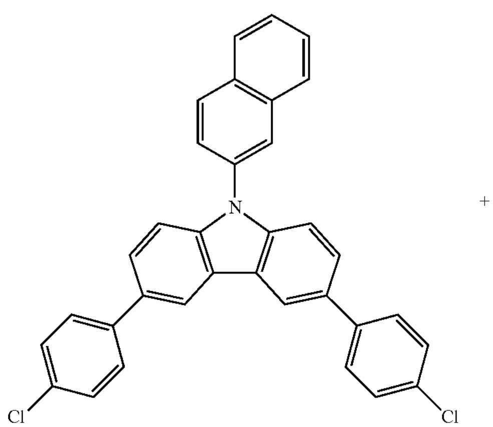

1-5-A

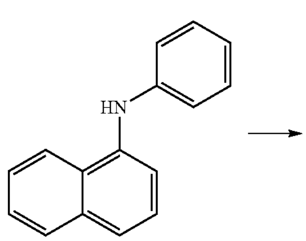

-continued

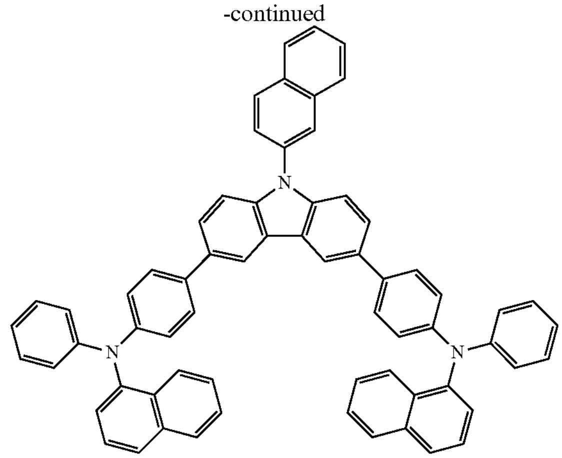

1-8

Compound 1-8 (MS: $[M+H]^+$=879) was obtained in the same manner as in the preparation method of Compound 1-5 by using N-phenylnaphthalen-1-amine.

Preparation Example 1-9: Preparation of Compound 1-9

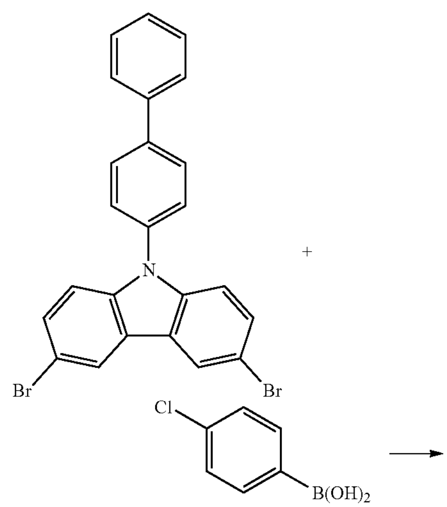

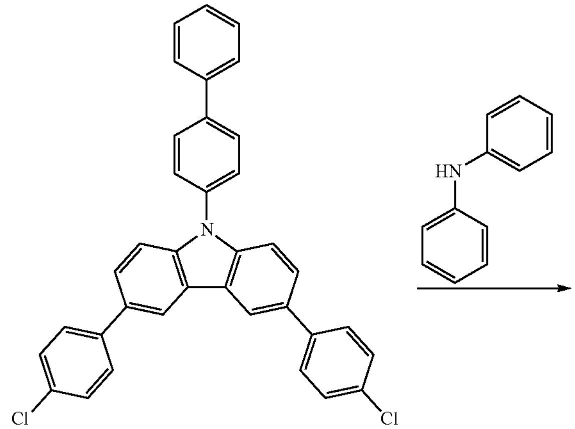

1-9-A

-continued

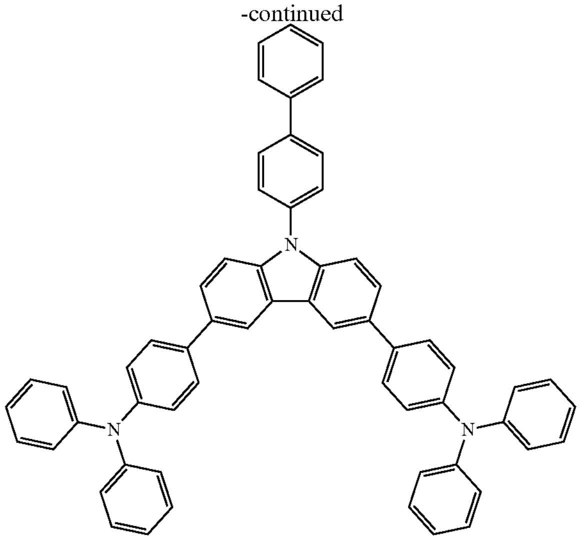

1-9

Compound 1-9 (MS: $[M+H]^+$=805) was obtained in the same manner as in the preparation method of Compound 1-1 by using 9-(biphenyl-4-yl)-3,6-dibromo-9H-carbazole.

Preparation Example 1-10: Preparation of Compound 1-10

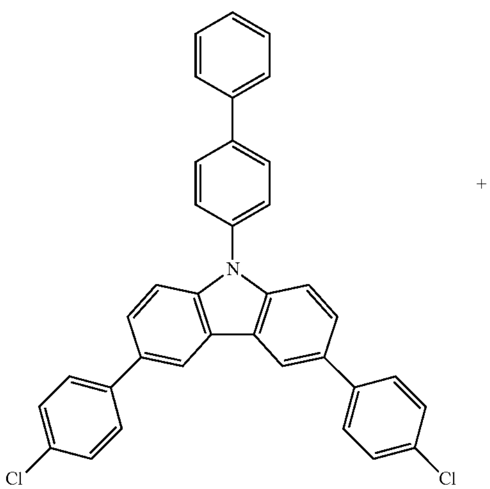

1-9-A

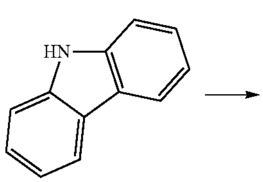

-continued

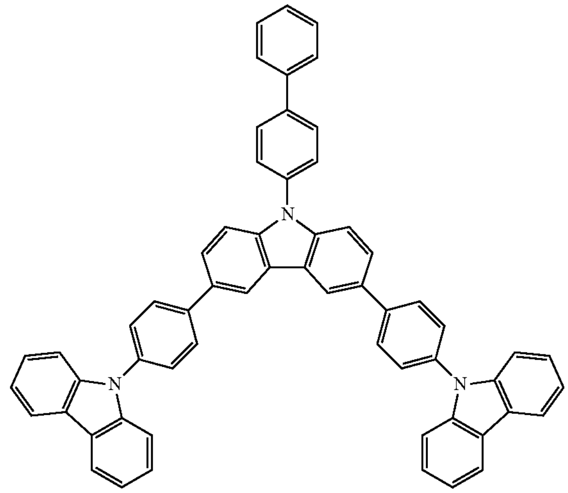

1-10

Compound 1-10 (MS: $[M+H]^+$=801) was obtained in the same manner as in the preparation method of Compound 1-9 by using 9H-carbazole.

Preparation Example 1-11: Preparation of Compound 1-11

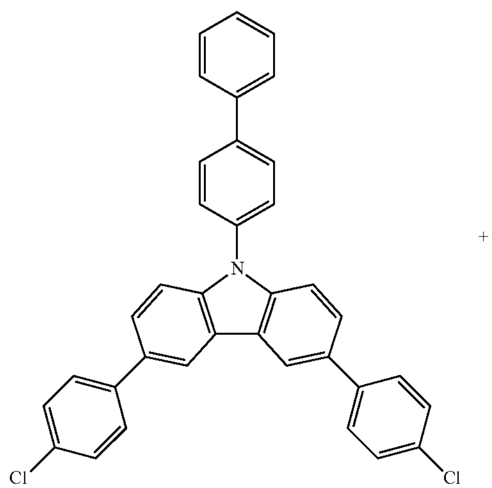

1-9-A

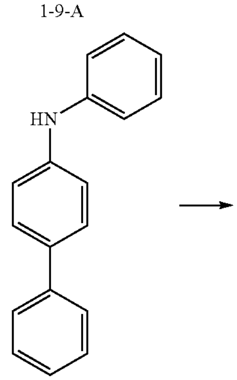

-continued

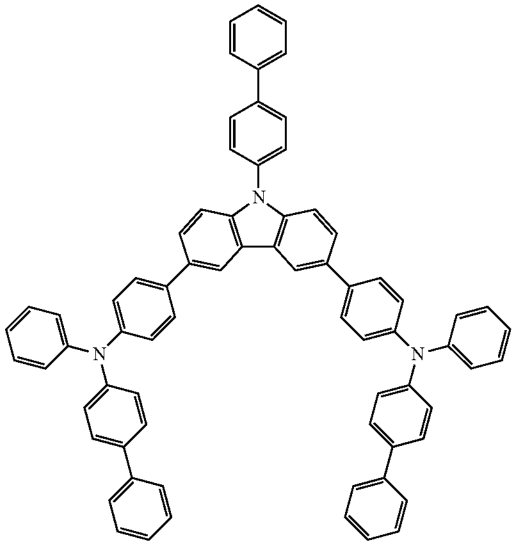

1-11

Compound 1-11 (MS: $[M+H]^+$=957) was obtained in the same manner as in the preparation method of Compound 1-9 by using N-phenylbiphenyl-4-amine.

Preparation Example 1-12: Preparation of Compound 1-12

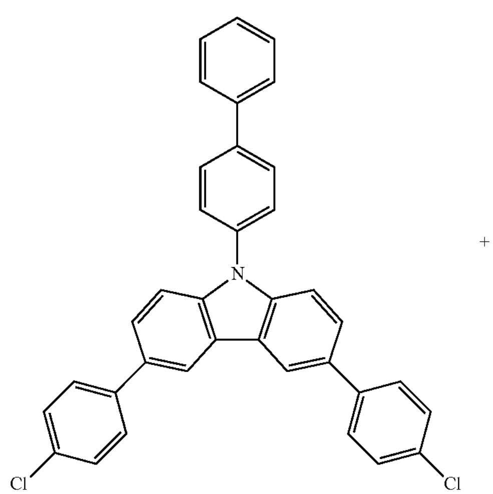

1-9-A

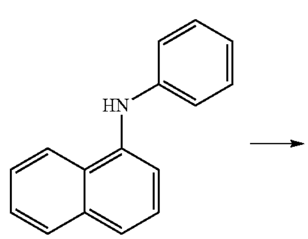

-continued

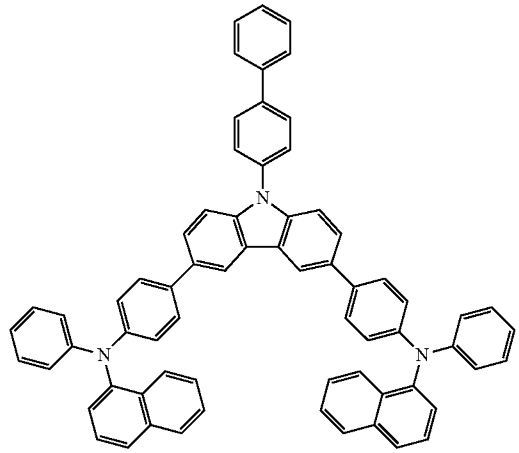

1-12

Compound 1-12 (MS: $[M+H]^+$=905) was obtained in the same manner as in the preparation method of Compound 1-9 by using N-phenylnaphthalen-1-amine.

Preparation Example 1-13: Preparation of Compound 1-13

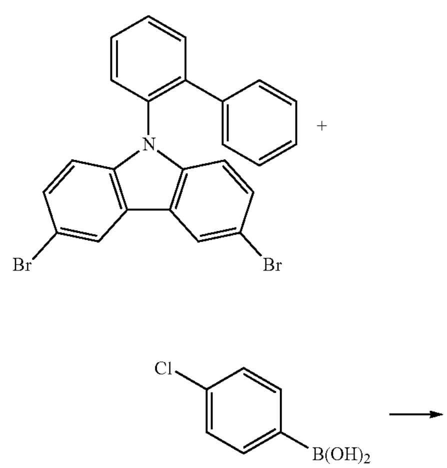

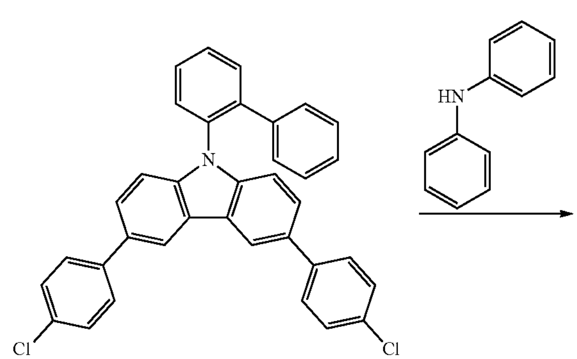

1-13-A

-continued

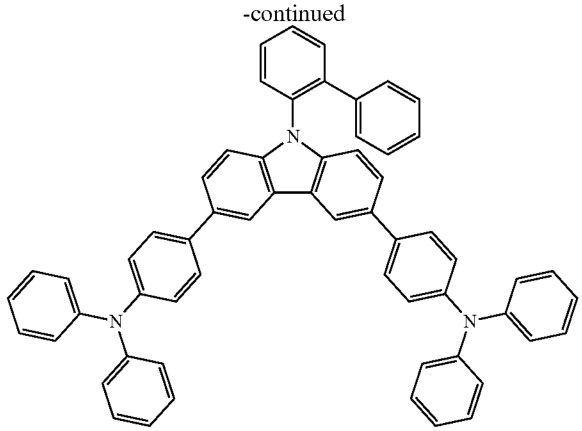

1-13

Compound 1-13 (MS: $[M+H]^+$=805) was obtained in the same manner as in the preparation method of Compound 1-1 by using 9-(biphenyl-2-yl)-3,6-dibromo-9H-carbazole.

Preparation Example 1-14: Preparation of Compound 1-14

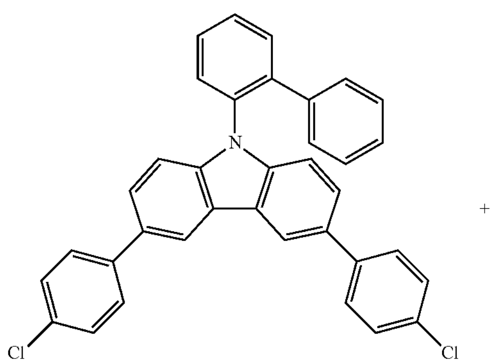

1-13-A

-continued

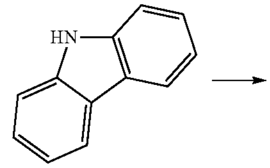

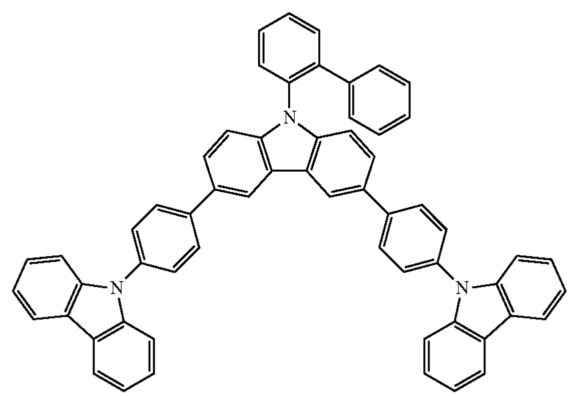

1-14

Compound 1-14 (MS: $[M+H]^+$=801) was obtained in the same manner as in the preparation method of Compound 1-13 by using 9H-carbazole.

Preparation Example 1-15: Preparation of Compound 1-15

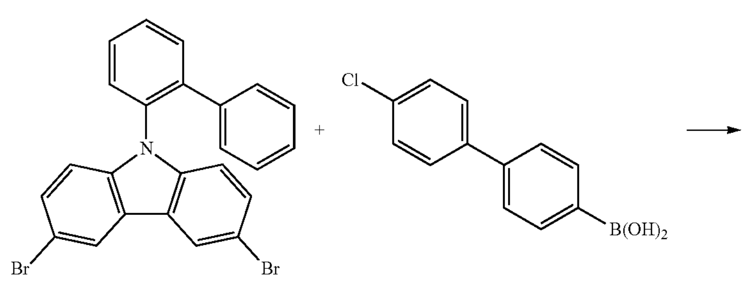

-continued
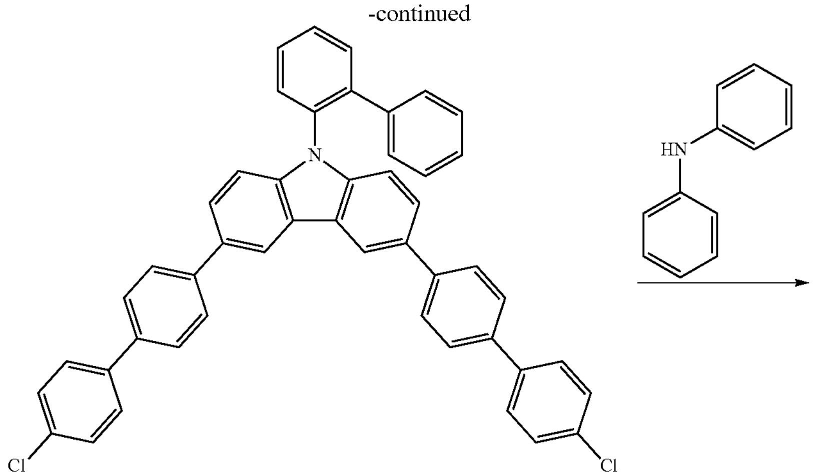
1-15-A
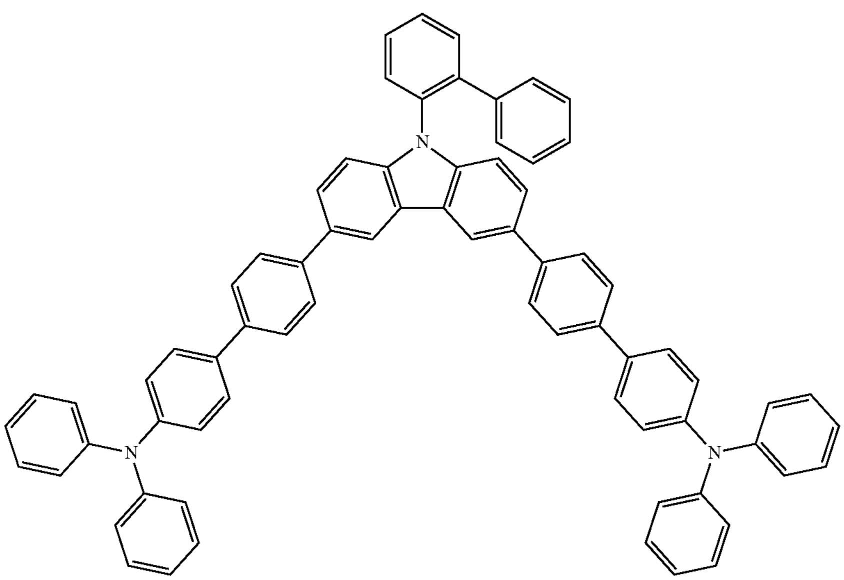
1-15
Compound 1-15 (MS: $[M+H]^+$=957) was obtained in the same manner as in the preparation method of Compound 1-13 by using 4'-chlorobiphenyl-4-ylboronic acid.

Preparation Example 1-16: Preparation of Compound 1-16
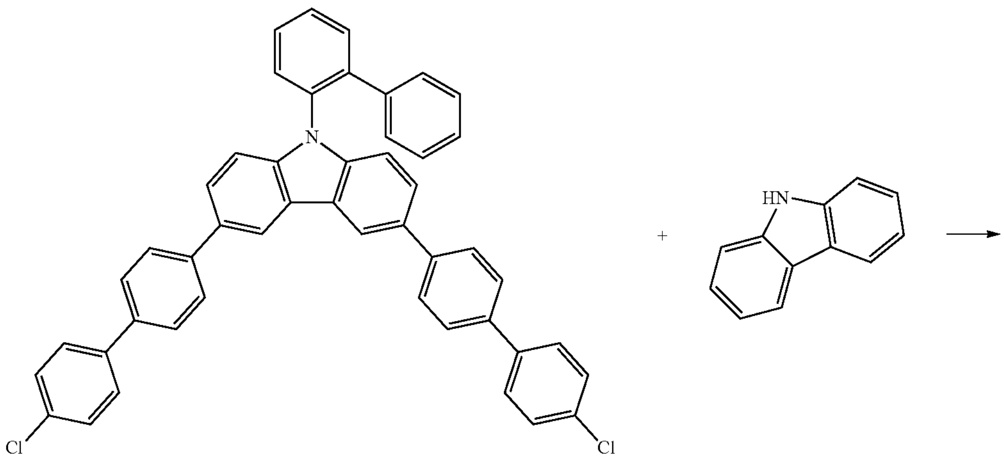
1-15-A
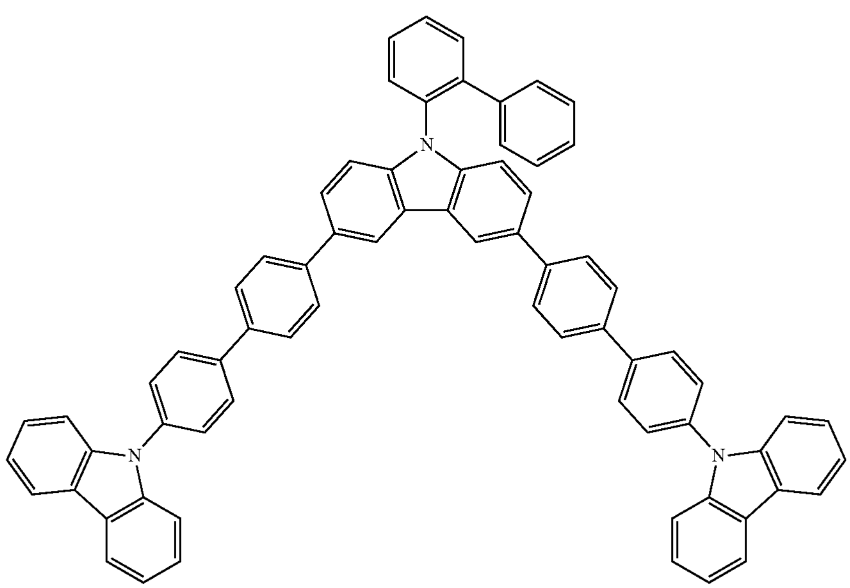
1-16
Compound 1-16 (MS: $[M+H]^+=953$) was obtained in the same manner as in the preparation method of Compound 1-15 by using 9H-carbazole.

Preparation Example 1-17: Preparation of Compound 1-17
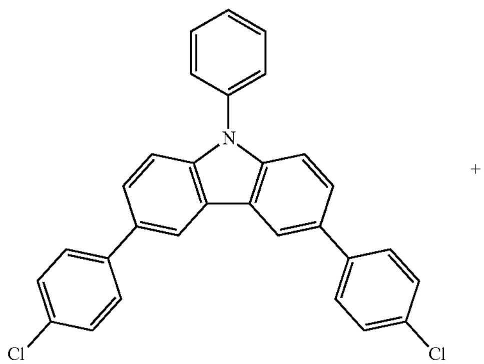
1-1-A
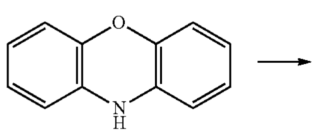
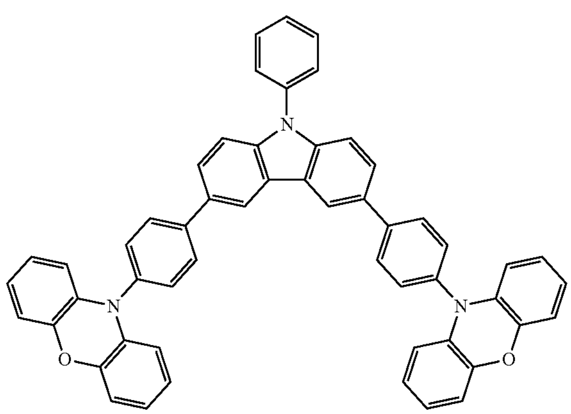
1-17
Compound 1-17 (MS: $[M+H]^+$=757) was obtained in the same manner as in the preparation method of Compound 1-1 by using 10H-phenoxazine.
Preparation Example 1-18: Preparation of Compound 1-18
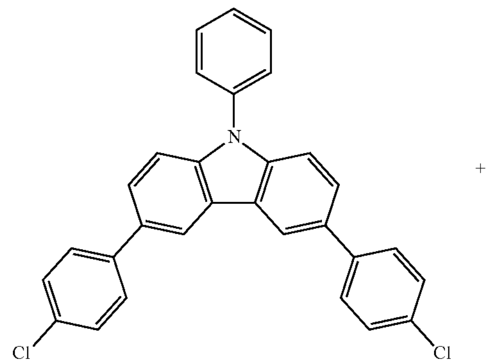
1-1-A
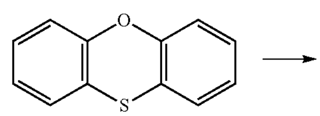
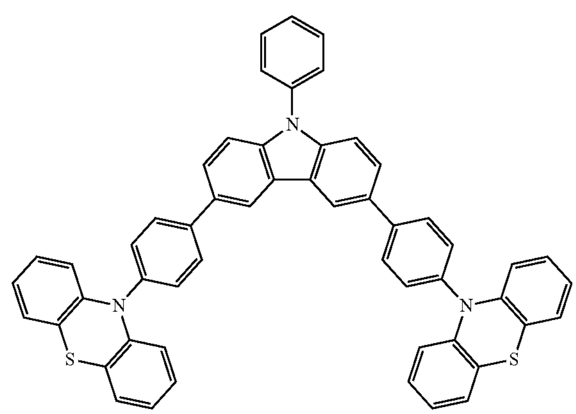
1-18
Compound 1-18 (MS: $[M+H]^+$=789) was obtained in the same manner as in the preparation method of Compound 1-1 by using phenoxanthine.

Preparation Example 1-19: Preparation of Compound 1-19
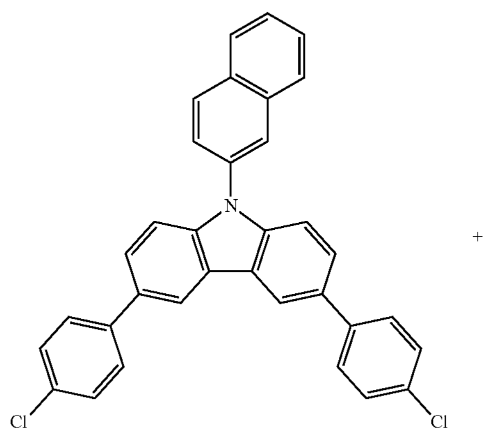
1-5-A
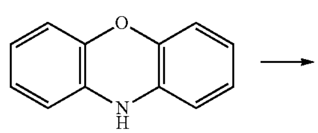
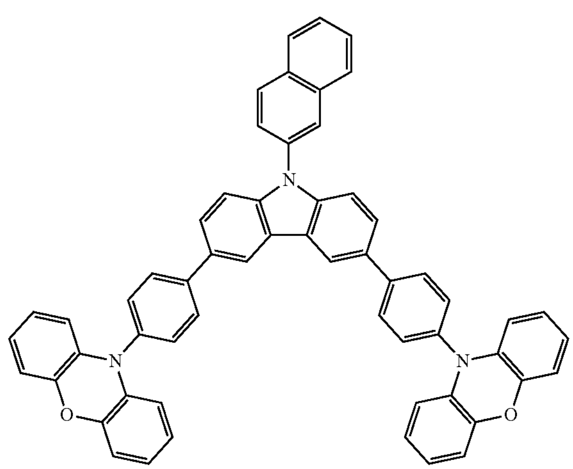
1-19
Compound 1-19 (MS: $[M+H]^+=807$) was obtained in the same manner as in the preparation method of Compound 1-5 by using 10H-phenoxazine.
Preparation Example 1-20: Preparation of Compound 1-20
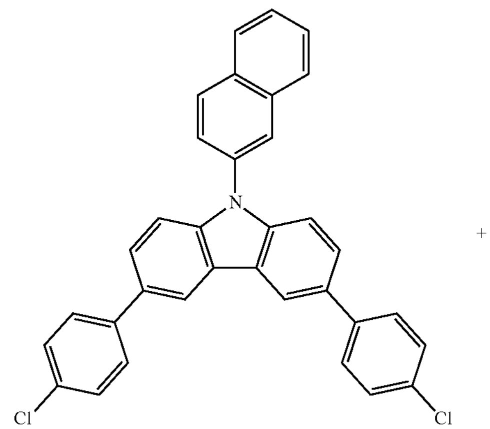
1-5-A
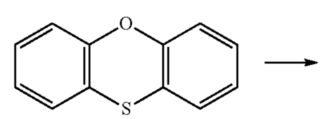
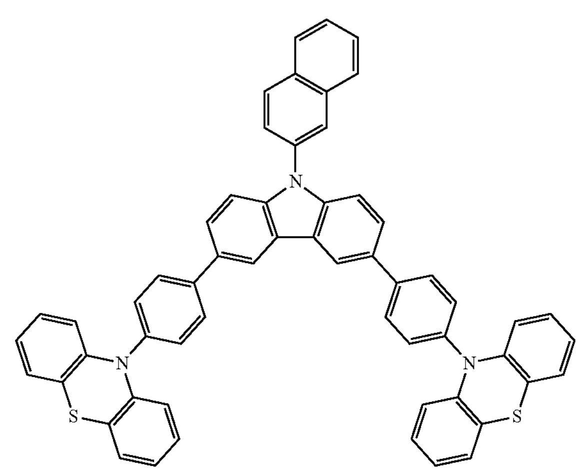
1-20
Compound 1-20 (MS: $[M+H]^+=839$) was obtained in the same manner as in the preparation method of Compound 1-5 by using phenoxanthine.

Preparation Example 1-21: Preparation of Compound 1-21
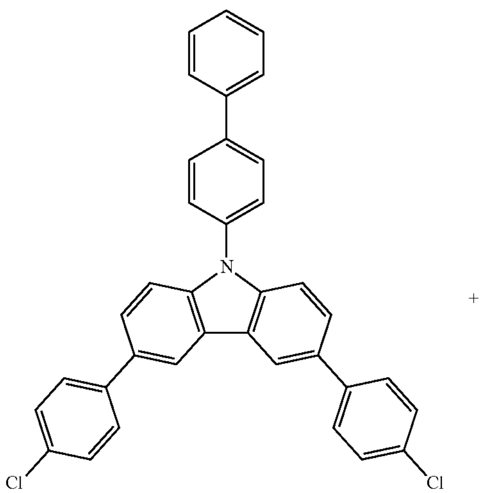
1-9-A
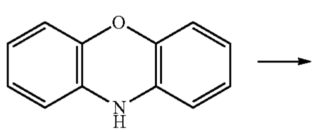
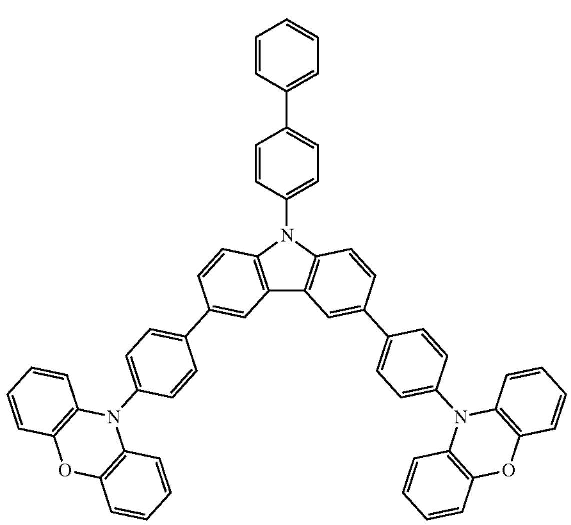
1-21
Compound 1-21 (MS: $[M+H]^+$=833) was obtained in the same manner as in the preparation method of Compound 1-9 by using 10H-phenoxazine.
Preparation Example 1-22: Preparation of Compound 1-22
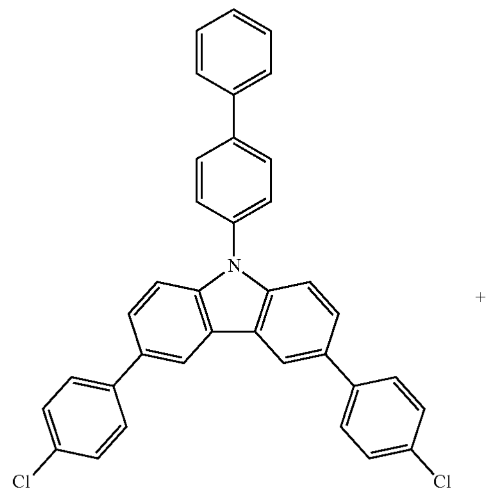
1-9-A
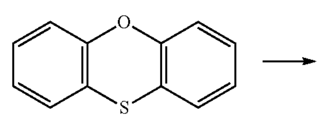
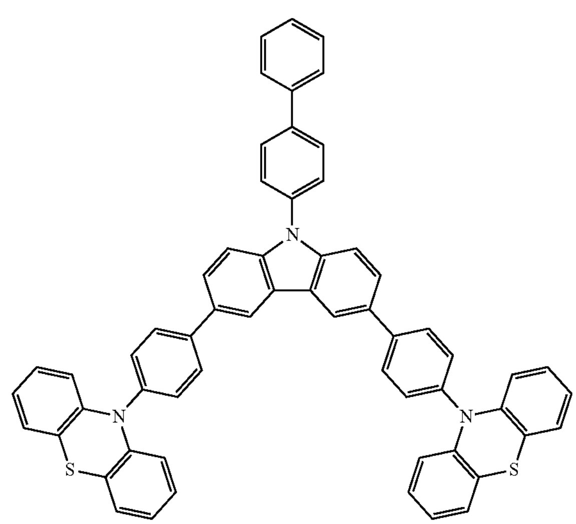
1-22
Compound 1-22 (MS: $[M+H]^+$=865) was obtained in the same manner as in the preparation method of Compound 1-9 by using phenoxanthine.

PREPARATION EXAMPLE 2

Preparation of Compound P-4

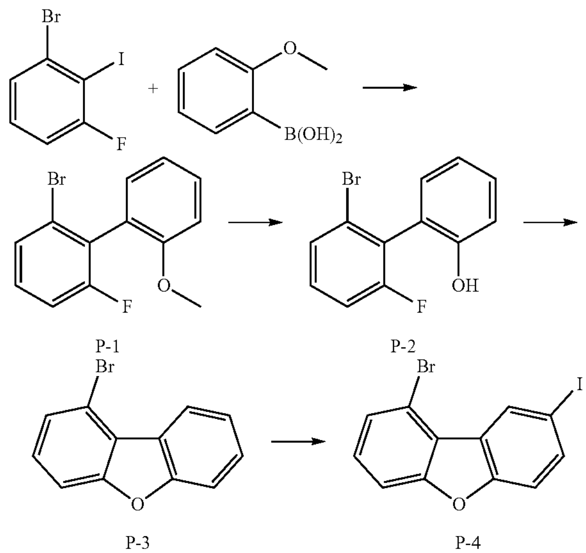

1) Preparation of Compound P-1

1-Bromo-3-fluoro-2-iodobenzene (100 g, 333.5 mmol), and (2-methoxyphenyl)boronic acid (50.6 g, 333.5 mmol) was dissolved in THF (800 ml). 2M $Na_2CO_3$ solution (500 mL) and $Pd(PPh_3)_4$ (7.7 g, 6.7 mmol) were added thereto, and the mixture was refluxed for 12 hours. After completion of the reaction, the reaction mixture was cooled down to room temperature, and the resulting mixture was extracted three times with water and toluene. The toluene layer was separated, then dried over magnesium sulfate and filtered. The filtrate was distilled under reduced pressure, and then recrystallized three times using chloroform and ethanol to give Compound P-1 (49.7 g, yield: 53%; MS: $[M+H]^+$=281).

2) Preparation of Compound P-2

Compound P-1 (45 g, 158 mmol) was dissolved in dichloromethane (600 ml) and then cooled to 0° C. Boron tribromide (15.8 ml, 166.4 mmol) was slowly added dropwise and then stirred for 12 hours. After completion of the reaction, the reaction mixture was washed three times with water, dried over magnesium sulfate and filtered. The filtrate was distilled under reduced pressure and purified by column chromatography to give Compound P-2 (40 g, yield: 85%; MS: $[M+H]^+$=298).

3) Preparation of Compound P-3

Under a nitrogen atmosphere, Compound P-2 (33 g, 110 mmol) was added to DMF (200 ml) and then stirred. Potassium carbonate (30.4 g, 220 mmol) was added thereto and then refluxed. After 2 hours, the reaction mixture was cooled down to room temperature and filtered. The filtrate was extracted with chloroform and water, and then the organic layer was dried using magnesium sulfate. The resulting mixture was distilled under reduced pressure, and then recrystallized from chloroform and ethyl acetate to give Compound P-3 (20.3 g, yield: 75%; MS: $[M+H]^+$=247).

4) Preparation of Compound P-4

Under a nitrogen atmosphere, iodine (2.06 g, 40 mmol) and iodic acid (3.13 g, 17.8 mmol) were added to Compound P-3 (20 g, 80 mmol), to which a mixture of acetic acid (80 mL) and sulfuric acid (20 mL) was added as a solvent. Water (10 mL) and chloroform (4 mL) were further added thereto and stirred at 65° C. for 3 hours. After cooling, water was added to the mixture, and the precipitated solid was filtered and washed three times with water. Then, the resultant product was recrystallized from toluene and hexane to give Compound P-4 (20.0 g, yield: 67%; MS: $[M+H]^+$=374).

Preparation Example 2-1 Preparation of Compound 2-1

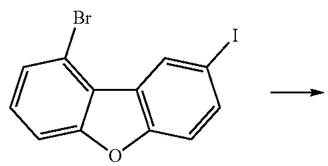

P-4

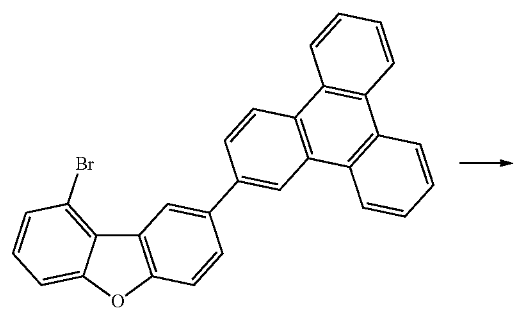

2-1-A

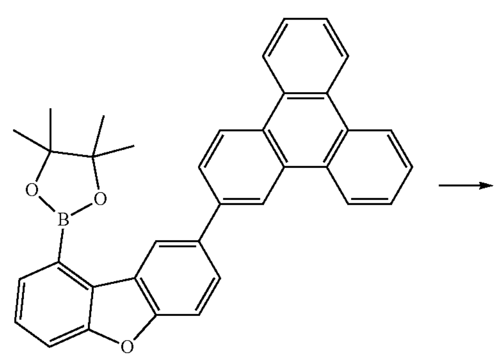

2-1-B

-continued

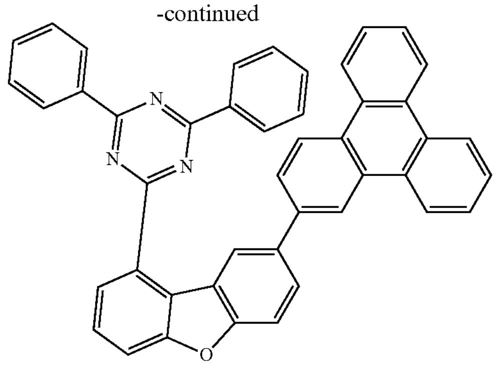

2-1

1) Preparation of Compound 2-1-A

After Compound P-4 (20 g, 54 mmol) and triphenylene-2-ylboronic acid (15 g, 54 mmol) were dispersed in THF (200 ml), 2M aqueous potassium carbonate solution (aq. $K_2CO_3$) (80 ml, 162 mmol) was added and $Pd(PPh_3)_4$ (0.6 g, 1 mol %) was added, and then the mixture was stirred and refluxed for 5 hours. The temperature was lowered to room temperature and the resulting solid was filtered. The filtered solid was recrystallized with chloroform and ethyl acetate, filtered and then dried to give Compound 2-1-A (20.7 g, yield: 81%).

2) Preparation of Compound 2-1-B

Compound 2-1-A (20 g, 42.2 mmol), bis(pinacolato) diboron (14.5 g, 50.6 mmol) and potassium acetate (8.5 g, 85 mmol) were added to 1,4-dioxane (100 mL). Under refluxing and stirring conditions, dibenzylideneacetonepalladium (0.73 g, 1.3 mmol) and tricyclohexylphosphine (0.71 g, 1.3 mmol) were added thereto, and the mixture was refluxed and stirred for 12 hours. After completion of the reaction, the reaction mixture was cooled down to room temperature and filtered through Celite. The filtrate was concentrated under reduced pressure, then chloroform was added to and dissolved in the residue and washed with water. The organic layer was separated, and then dried over anhydrous magnesium sulfate. This was distilled under reduced pressure and stirred with ethyl acetate and ethanol to give Compound 2-1-B (19.3 g, yield: 88%).

3) Preparation of Compound 2-1

After Compound 2-1-B (20 g, 38 mmol) and 2-chloro-4,6-diphenyl-1,3,5-triazine (10.3 g, 38 mmol) were dispersed in THF (150 ml), 2M aqueous potassium carbonate solution (aq. $K_2CO_3$) (58 ml, 115 mmol) was added and $Pd(PPh_3)_4$ (0.45 g, 1 mol %) were added thereto, and the mixture was stirred and refluxed for 6 hours. The temperature was lowered to room temperature and the resulting solid was filtered. The filtered solid was recrystallized from chloroform and ethyl acetate, filtered and then dried to give Compound 2-1 (17.5 g, yield: 73%, MS: $[M+H]^+$=626).

Preparation Example 2-2: Preparation of Compound 2-2

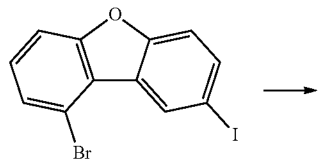

P-4

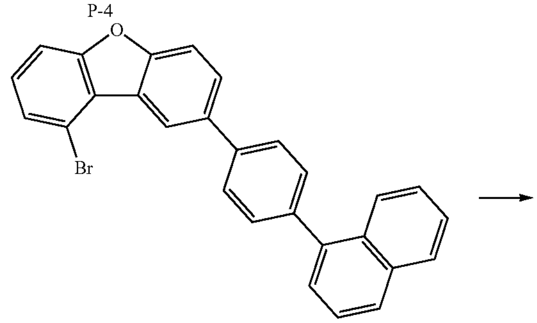

2-2-A

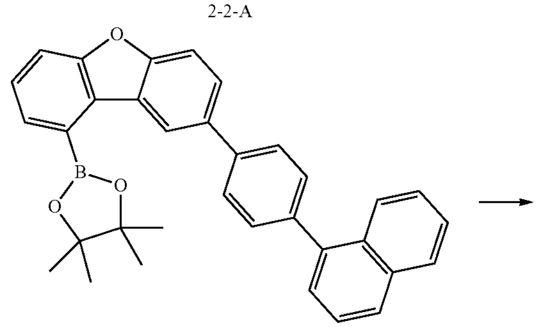

2-2-B

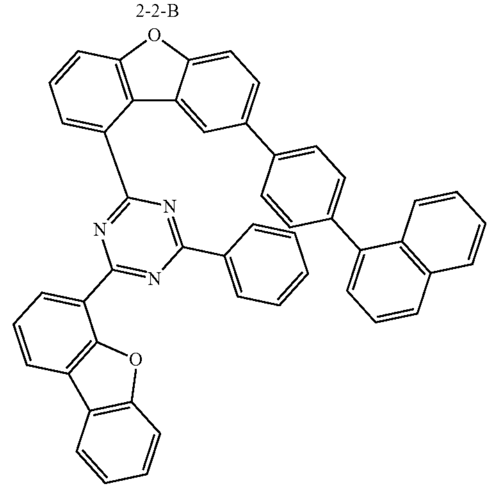

2-2

1) Preparation of Compound 2-2-A

After Compound P-4 (20 g, 54 mmol) and (4-(naphthalen-1-yl)phenyl)boronic acid (13.3 g, 54 mmol) were dispersed in THF (200 ml), 2M aqueous potassium carbonate (aq. $K_2CO_3$) (80 ml, 160 mmol) was added and $Pd(PPh_3)_4$ (0.6 g, 1 mol %) was added, and then the mixture was stirred and refluxed for 5 hours. The temperature was lowered to room temperature and the resulting solid was filtered. The filtered solid was recrystallized with chloroform and ethyl acetate, filtered and then dried to give Compound 2-2-A (17.0 g, yield: 82%).

2) Preparation of Compound 2-2-B

Compound 2-2-A (20 g, 44.5 mmol), bis (pinacolato) diboron (15.3 g, 53.4 mmol) and potassium acetate (8.7 g, 89 mmol) were added to 1,4-dioxane (200 mL). Under refluxing and stirring conditions, dibenzylideneacetone palladium (0.8 g, 1.3 mmol) and tricyclohexylphosphine (0.8 g, 1.3 mmol) were added thereto, and the mixture was refluxed and stirred for 12 hours. After completion of the reaction, the reaction mixture was cooled down to room temperature and filtered through Celite. The filtrate was concentrated under reduced pressure, then chloroform was added to and dissolved in the residue and washed with water. The organic layer was separated, and then dried over anhydrous magnesium sulfate. This was distilled under reduced pressure and stirred with ethyl acetate and ethanol to give Compound 2-2-B (19 g, yield: 86%).

3) Preparation of Compound 2-2

After Compound 2-2-B (20 g, 40 mmol) and 2-chloro-4-(dibenzo[b,d]furan-4-yl)-6-phenyl-1,3,5-triazine (14.4 g, 40 mmol) were dispersed in THF (180 ml), 2M aqueous potassium carbonate solution (aq. $K_2CO_3$) (60 ml, 121 mmol) was added and $Pd(PPh_3)_4$ (0.47 g, 1 mol %) were added thereto, and then the mixture was stirred and refluxed for 6 hours. The temperature was lowered to room temperature and the resulting solid was filtered. The filtered solid was recrystallized from chloroform and ethyl acetate, filtered and then dried to give Compound 2-2 (19.5 g, yield: 70%, MS: $[M+H]^+=692$).

Preparation Example 2-3: Preparation of Compound 2-3

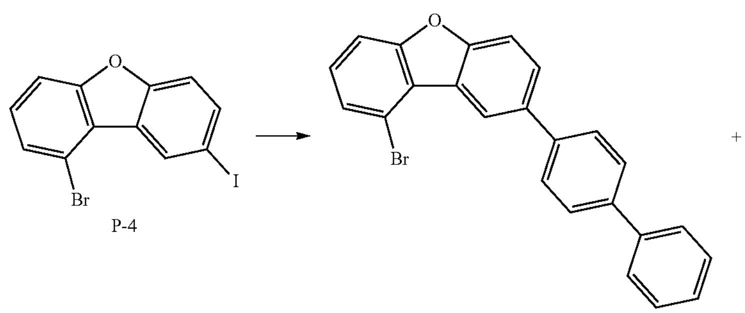

P-4

2-3-A

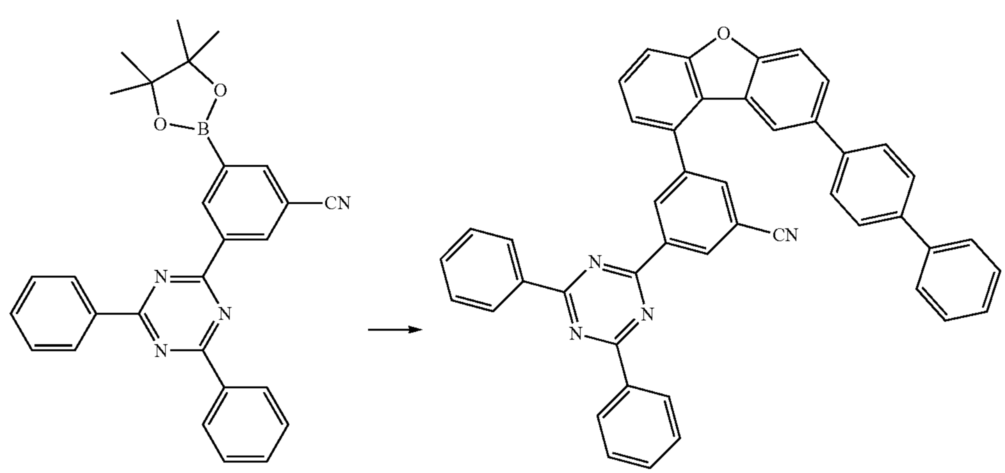

2-3-C 2-3

-continued

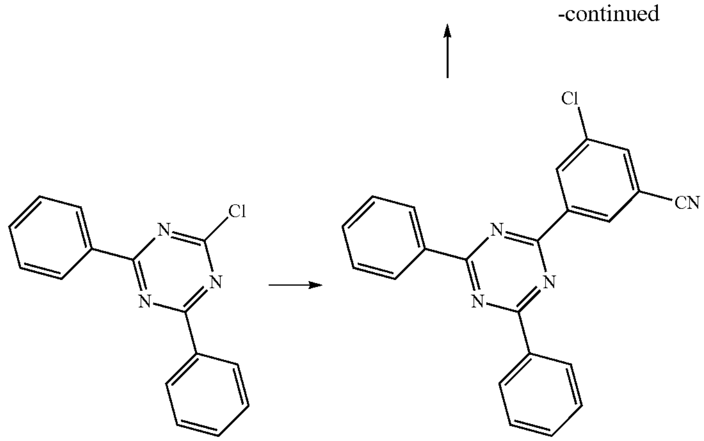

2-3-B

1) Preparation of Compound 2-3-A

Compound 2-3-A (18.4 g, yield 86%) was prepared in the same manner as in the preparation method of Compound 2-1-A by using Compound P-4 (20 g, 54 mmol) and [1,1'-biphenyl]-4-ylboronic acid.

2) Preparation of Compound 2-3-B

After 2-chloro-4,6-diphenyl-1,3,5-triazine (30 g, 112 mmol) and (3-chloro-5-cyanophenyl)boronic acid (20 g, 112 mmol) were dispersed in THF (480 ml), 2M aqueous potassium carbonate solution (aq. $K_2CO_3$) (160 ml, 336 mmol) was added and $Pd(PPh_3)_4$ (1.2 g, 1 mol %) was added, and then the mixture was stirred and refluxed for 5 hours. The temperature was lowered to room temperature, the aqueous layer was removed, concentrated under reduced pressure, ethanol and ethyl acetate were added thereto, stirred, and then filtered. The resulting solid was washed with water and ethanol and then dried to give Compound 2-3-B (32.0 g, yield: 91%).

3) Preparation of Compound 2-3-C

Compound 2-3-C (19 g, yield 76%) was prepared in the same manner as in the preparation method of Compound 2-2-B by using Compound 2-3-B (20 g, 54 mmol).

4) Preparation of Compound 2-3

Compound 2-3 (20.7 g, yield: 73%, MS: $[M+H]^+$=653) was prepared in the same manner as in the preparation method of Compound 2-1 by using Compound 2-3-A (17.3 g, 43 mmol) and Compound 2-3-C (20 g, 43 mmol).

Preparation Example 2-4: Preparation of Compound 2-4

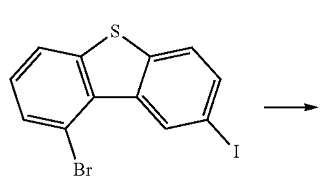

S-4

-continued

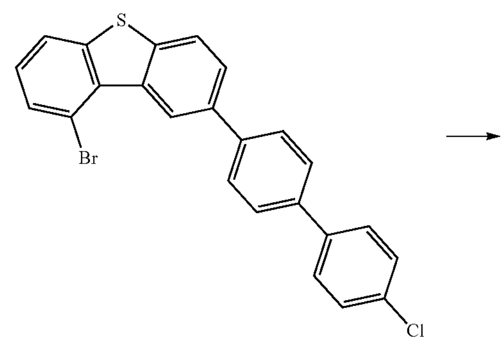

2-4-A

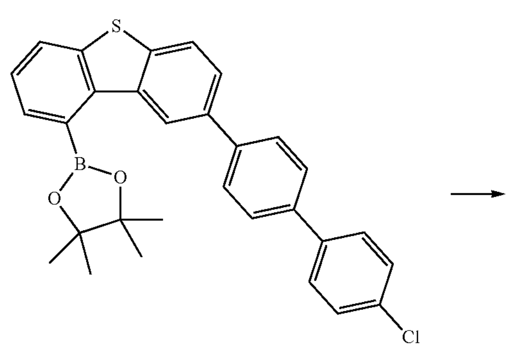

2-4-B

-continued

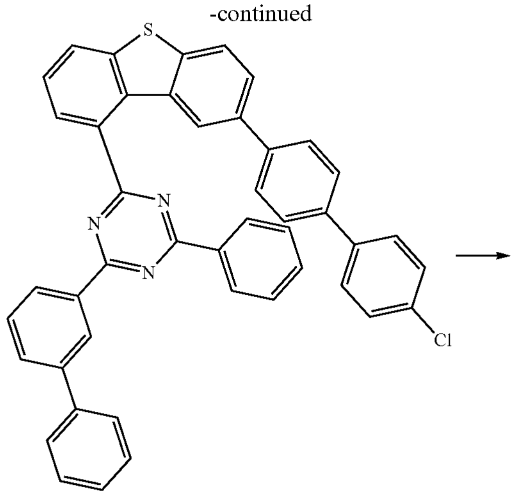

2-4-C

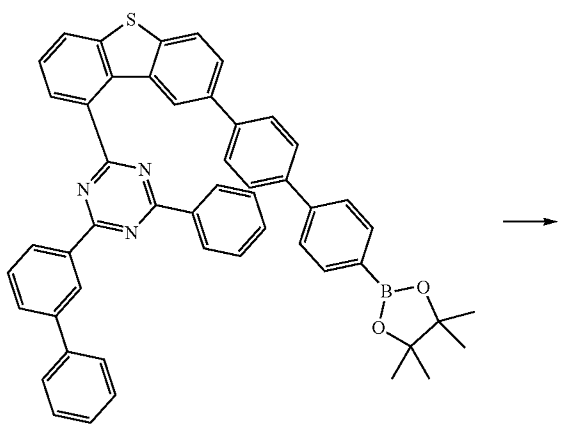

2-4-D

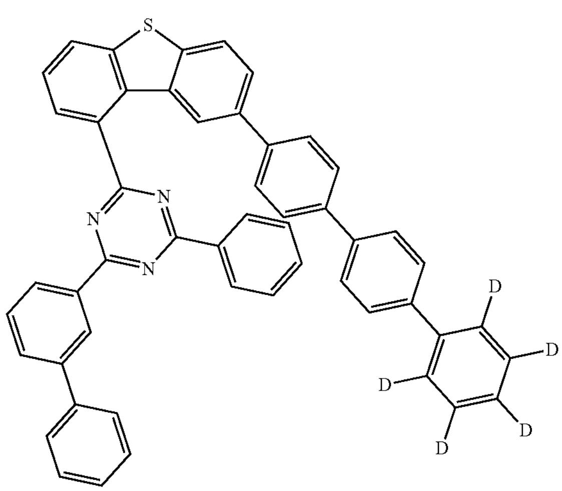

2-4

1) Preparation of Compound S-4

Compound S-4 (16.5 g, yield: 65%; MS: $[M+H]^+=390$) was prepared in the same manner as in the preparation method of Compound P-4 by using 1-bromo-dibenzothiophene (20, g, 76 mmol).

2) Preparation of Compound 2-4-A

Compound 2-4-A (20 g, yield: 83%) was prepared in the same manner as in the preparation method of Compound 2-1-A by using Compound S-4 (20 g, 51 mmol) and (4'-chloro-[1,1'-biphenyl]-4-yl)boronic acid (13.2 g, 57 mmol).

3) Preparation of Compound 2-4-B

Compound 2-4-B (19 g, yield: 86%) was prepared in the same manner as in the preparation method of Compound 2-1-B by using Compound 2-4-A (20 g, 44.5 mmol).

4) Preparation of Compound 2-4-C

Compound 2-4-C (19 g, yield: 86%) was prepared in the same manner as in the preparation method of Compound 2-1 by using Compound 2-4-B (20 g, 40.3 mmol) and 2-([1,1'-biphenyl-3-yl]-4-chloro-6-phenyl-1,3,5-triazine (13.8 g, 40.3 mmol).

5) Preparation of Compound 2-4-D

Compound 2-4-D (16 g, yield: 82%) was prepared in the same manner as in the preparation method of Compound 2-3-C by using Compound 2-4-C (20 g, 30 mmol).

6) Preparation of Compound 2-4

Compound 2-4 (13 g, yield: 70%, MS: $[M+H]^+=726$) was prepared in the same manner as in the preparation method of Compound 2-1 by using Compound 2-4-D (20 g, 26 mmol) and bromobenzene-d5 (5 g, 31 mmol).

Preparation Example 2-5: Preparation of Compound 2-5
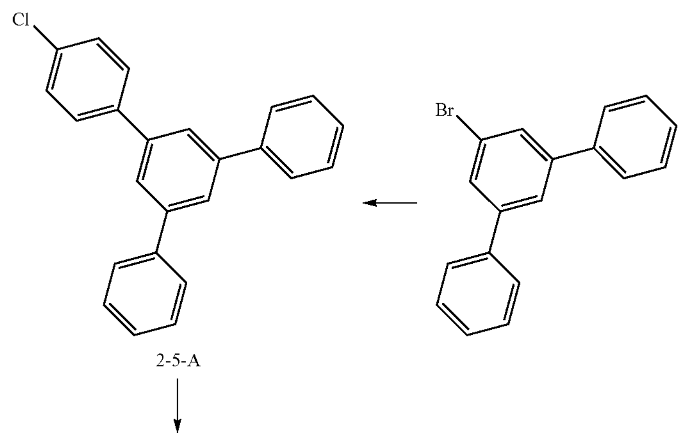
2-5-A
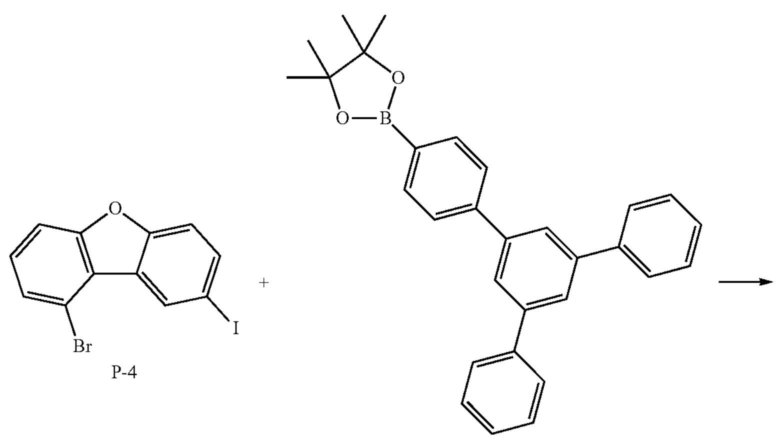
P-4 2-5-B
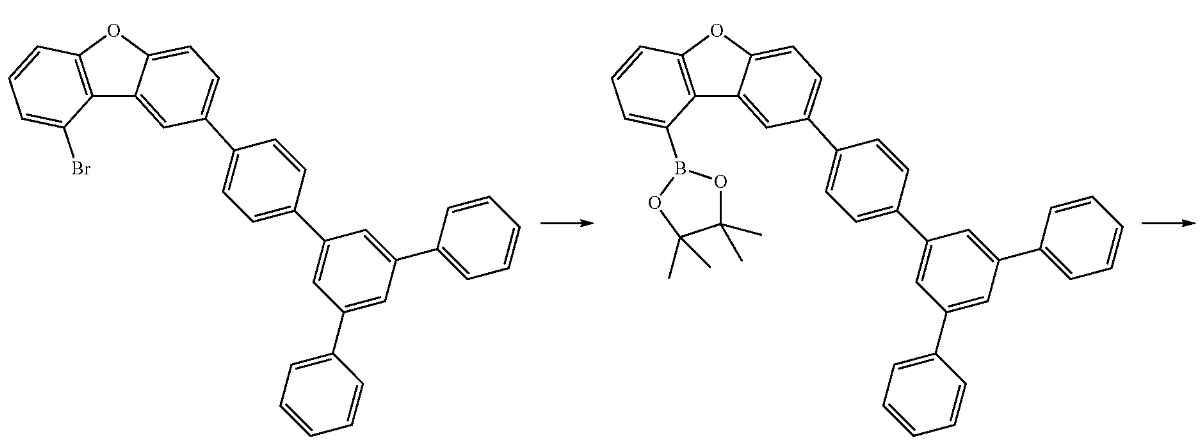
2-5-C 2-5-D -continued

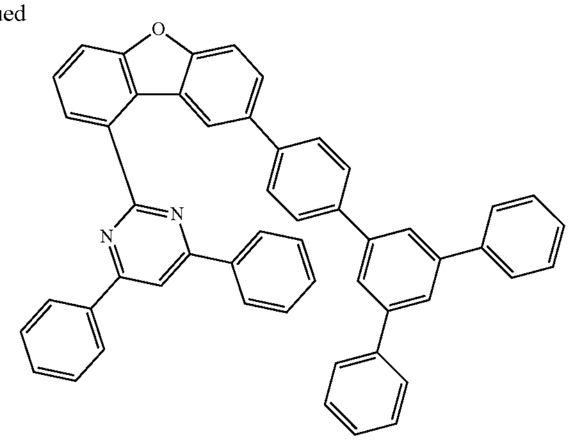

2-5

1) Preparation of Compound 2-5-A

Compound 2-5-A (19 g, yield: 86%) was prepared in the same manner as in the preparation method of Compound 2-1-A by using 5'-bromo-1,1':3',1"-terphenyl (20 g, 65 mmol) and (4-chlorophenyl)boronic acid (12.1 g, 78 mmol).

2) Preparation of Compound 2-5-B

Compound 2-5-B (21 g, yield: 81%) was prepared in the same manner as in the preparation method of Compound 2-1-B by using Compound 2-5-A (20 g, 59 mmol).

3) Preparation of Compound 2-5-C

Compound 2-5-C (19.3 g, yield: 76%) was prepared in the same manner as in the preparation method of Compound 2-1-A by using Compound 2-5-B (20 g, 46 mmol) and Compound P-4 (17 g, 46 mmol).

4) Preparation of Compound 2-5-D

Compound 2-5-D (11.5 g, yield: 80%) was prepared in the same manner as in the preparation method of Compound 2-1-B by using Compound 2-5-C (15 g, 27 mmol).

5) Preparation of Compound 2-5

Compound 2-5 (8.2 g, yield: 77%, MS: $[M+H]^+=703$) was prepared in the same manner as in the preparation method of Compound 2-1 by using Compound 2-5-D (12 g, 20 mmol) and 2-chloro-4,6-diphenylpyrimidine (5.7 g, 20 mmol).

Preparation Example 2-7: Preparation of Compound 2-7

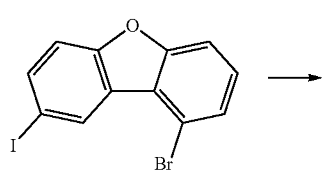

P-4

-continued

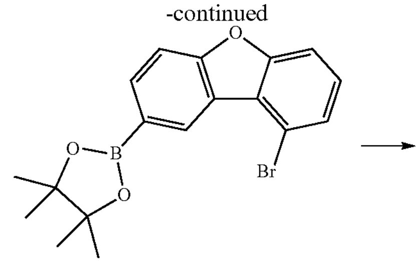

2-7-A

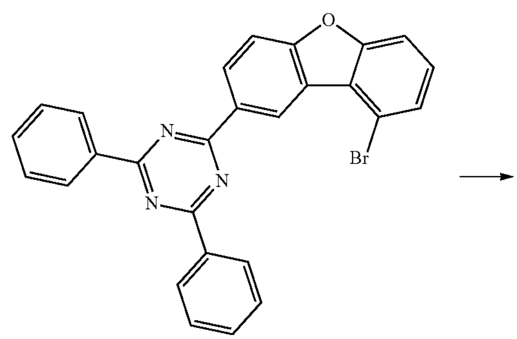

2-7-B

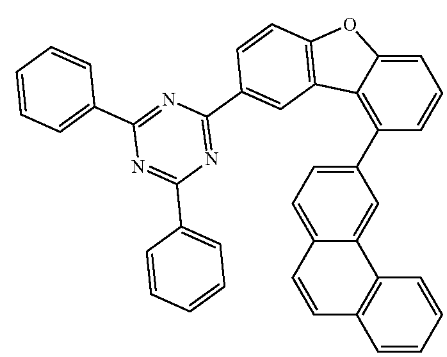

2-7

1) Preparation of Compound 2-7-A

Compound 2-7-A (11.6 g, yield: 77%) was prepared in the same manner as in the preparation method of Compound 2-1-B by using Compound P-4 (15 g, 40 mmol).

2) Preparation of Compound 2-7-B

Compound 2-7-B (9.0 g, yield: 82%) was prepared in the same manner as in the preparation method of Compound 2-1 by using Compound 2-7-A (11 g, 23 mmol) and 2-chloro-4,6-diphenyl-1,3,5-triazine (6.2 g, 23 mmol).

3) Preparation of Compound 2-7

Compound 2-7 (8.4 g, yield: 77%, MS: $[M+H]^+$=576) was prepared in the same manner as in the preparation method of Compound 2-1 by using Compound 2-7-B (9.0 g, 18.8 mmol) and phenanthren-3-ylboronic acid (4.2 g, 19 mmol).

PREPARATION EXAMPLE 3

Preparation Example 3-1: Preparation of Compound 3-1

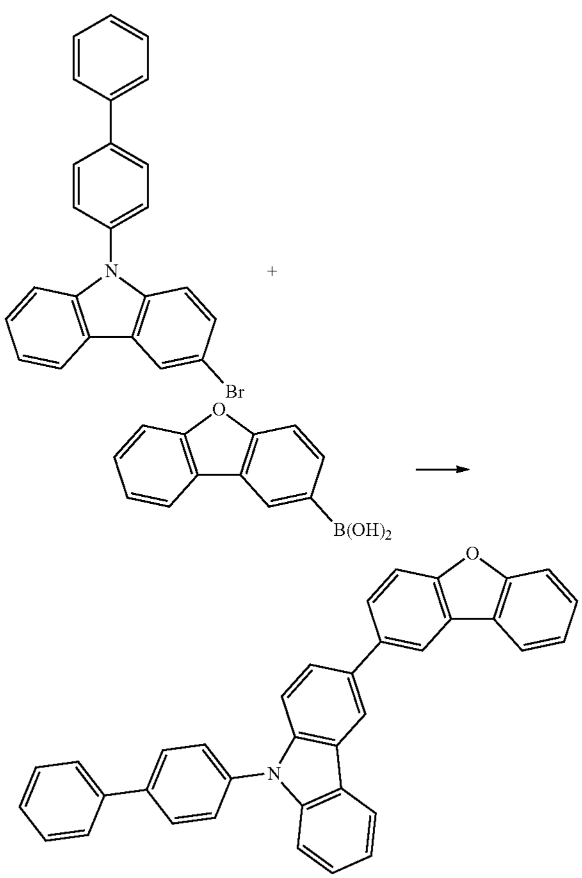

3-1

After 9-(1,1'-biphenyl)-4-yl)-3-bromo-9H-carbazole (15 g, 27 mmol) and dibenzo[b,d]furan-2-ylboronic acid (5.7 g, 27 mmol) were dispersed in THF (80 ml), 2M aqueous potassium carbonate solution (aq. $K_2CO_3$) (40 ml, 81 mmol) was added and $Pd(PPh_3)_4$ (0.3 g, 1 mol %) was added, and then the mixture was stirred and refluxed for 6 hours. The temperature was lowered to room temperature, the aqueous layer was removed and concentrate under reduced pressure. Ethyl acetate was added thereto, stirred under reflux for 1 hour, cooled down to room temperature, and then the solid was filtered. Chloroform was added to the resulting solid, dissolved under reflux, and recrystallized from ethyl acetate to give Compound 3-1 (11.5 g, yield: 73%, MS: $[M+H]^+$= 486).

Preparation Example 3-2: Preparation of Compound 3-2

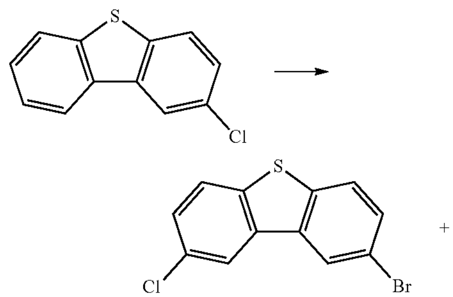

3-2-A

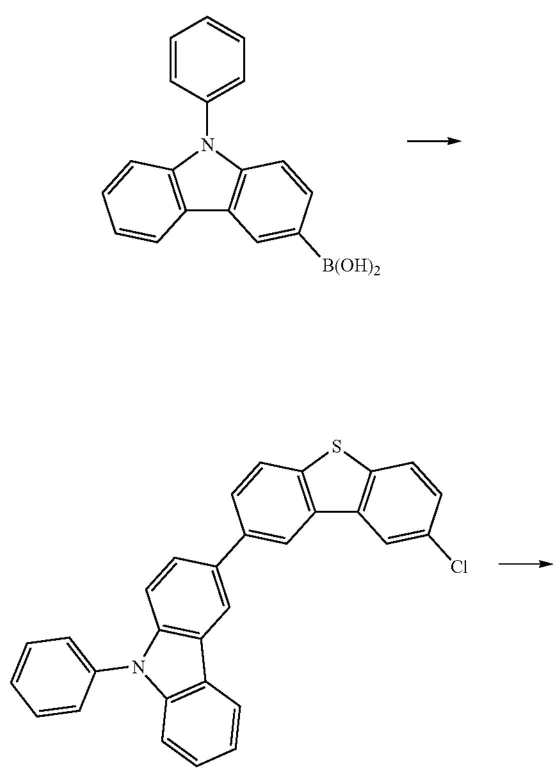

3-2-B

-continued

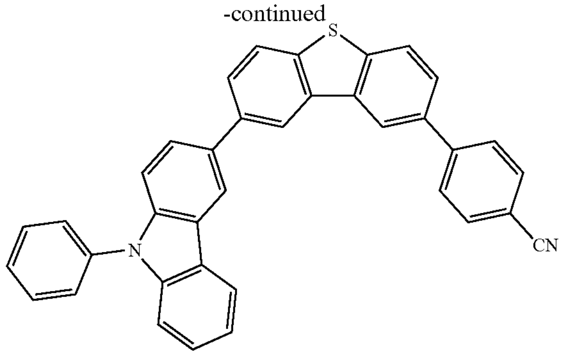

3-2

1) Preparation of Compound 3-2-A

2-Chlorodibenzo[b,d]thiophene (22 g, 101 mmol) was dissolved in chloroform (50 mL), cooled down to 0° C., and $Br_2$ solution (5.5 mL, 108 mmol) was slowly added dropwise thereto. When the reaction was terminated by stirring for 3 hours, an aqueous sodium bicarbonate solution was added and stirred. The aqueous layer was separated, the organic layer was collected, dried over anhydrous magnesium sulfate, filtered, and concentrated under reduced pressure. The concentrated compound was purified by column chromatography to give Compound 3-2-A (10 g, yield: 49%).

2) Preparation of Compound 3-2-B

After Compound 3-2-A (15 g, 50 mmol) and (9-phenyl-9H-carbazol-3-yl)boronic acid (15.2 g, 53 mmol) were dispersed in THF (200 ml), 2M aqueous potassium carbonate solution (aq. $K_2CO_3$) (75 ml, 151 mmol) was added and $Pd(PPh_3)_4$ (0.6 g, 1 mol %) was added, and then the mixture was stirred and refluxed for 6 hours. The temperature was lowered to room temperature, the aqueous layer was removed and concentrated under reduced pressure. Ethyl acetate was added thereto, stirred for 3 hours, and the precipitated solid was filtered. The resulting solid was further stirred with a mixed solution of chloroform and ethanol, and then filtered to give Compound 3-2-B (18.8 g, yield: 81%).

3) Preparation of Compound 3-2

After Compound 3-2-B (17 g, 37 mmol) and (4-cyanophenyl)boronic acid (5.7 g, 38.8 mmol) were dispersed in THF (160 ml), 2M aqueous potassium carbonate (aq. $K_2CO_3$) (65 ml, 111 mmol) was added and $Pd(PPh_3)_4$ (0.4 g, 1 mol %) was added, and then the mixture was stirred and refluxed for 6 hours. The temperature was lowered to room temperature, and the aqueous layer was removed and concentrated under reduced pressure. The concentrated compound was dissolved in chloroform (300 mL), washed with water and separated. The organic layer was treated with anhydrous magnesium sulfate and filtered. The filtrate was heated and removed by about half under reflux. The result was recrystallized with ethyl acetate (100 mL) to give compound 3-2 (14.2 g, yield: 73%, MS: $[M+H]^+=527$).

Preparation Example 3-3 Preparation of Compound 3-3

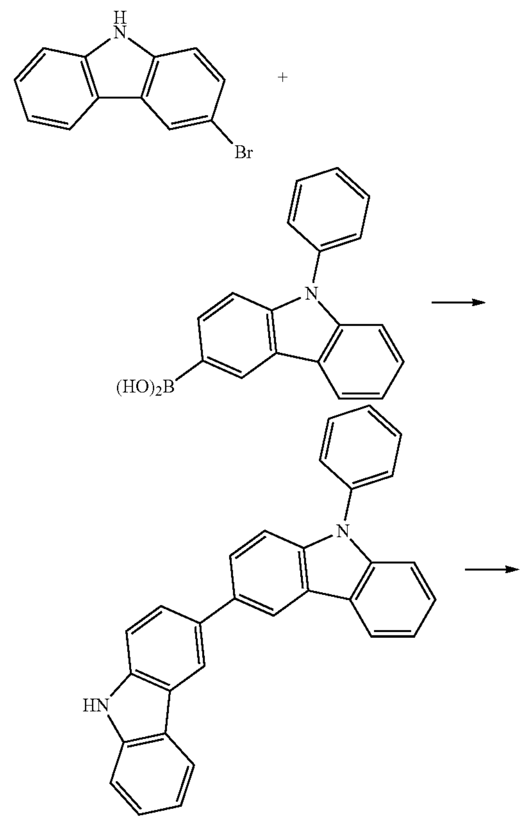

3-3-A

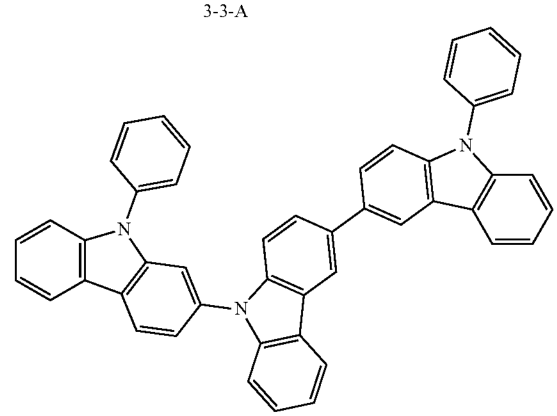

3-3

1) Preparation of Compound 3-3-A

Compound 3-3-A (20.2 g, yield: 81%) was prepared in the same manner as in the preparation method of Compound 3-1 by using 3-bromo-9H-carbazole (15 g, 61 mmol) and (9-phenyl-9H-carbazol-3-yl)boronic acid (18.4 g, 64 mmol).

2) Preparation of Compound 3-3

Compound 3-3-A (12 g, 30 mmol) and 2-bromo-9-phenyl-9H-carbazole (9.5 g, 30 mmol) were added to and dissolved in toluene (150 mL), and sodium tert-butoxide (5.6 g, 59 mmol) was added and heated. Bis(tri-tert-butylphosphine)palladium (0.15 g, 1 mol %) was added thereto, and the mixture was refluxed and stirred for 12 hours. After completion of the reaction, the temperature was lowered to room temperature, and the produced solid was filtered. The pale yellow solid was dissolved in chloroform, washed twice with water, and then the organic layer was separated. Anhydrous magnesium sulfate and acid clay were added, stirred, then filtered and distilled under reduced pressure. It was recrystallized from chloroform and ethyl acetate to give Compound 3-3 (14.5 g, yield: 76%, MS: [M+H]$^+$=650) as a white solid compound.

Preparation Example 3-4: Preparation of Compound 3-4

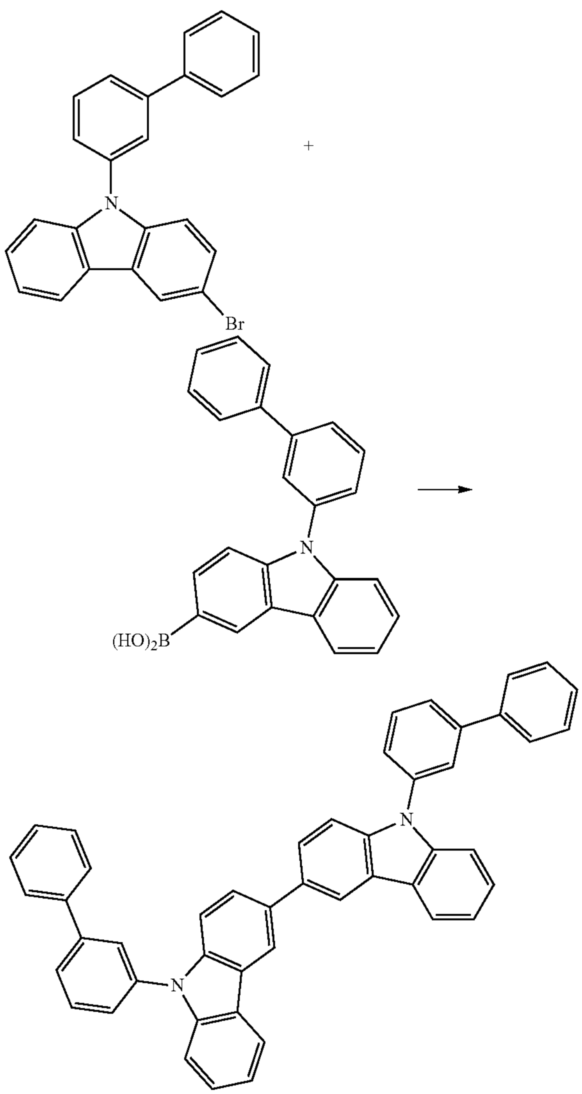

3-4

Compound 3-4 (19.7 g, yield: 77%, MS: [M+H]$^+$=637) was prepared in the same manner as in the preparation method of Compound 3-1 by using 9-([1,1'-biphenyl]-3-yl)-3-bromo-9H-carbazole (16 g, 40 mmol) and 9-([1,1'-biphenyl]-3-yl)-9H-carbazol-3-yl)boronic acid (14.6 g, 40 mmol).

Preparation Example 3-5: Preparation of Compound 3-5

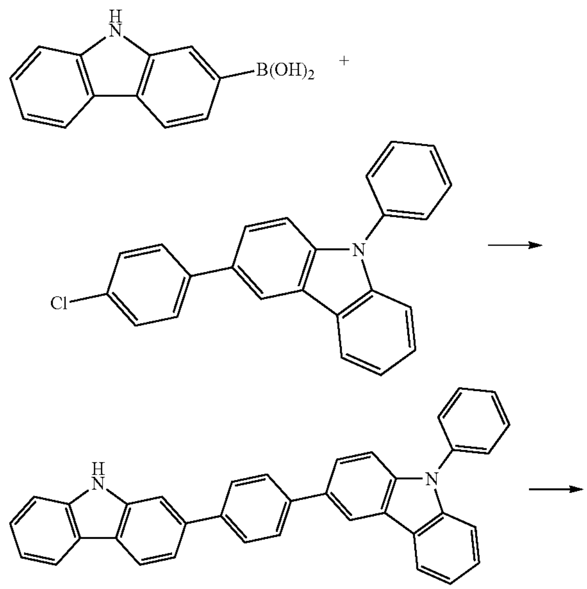

3-5-A

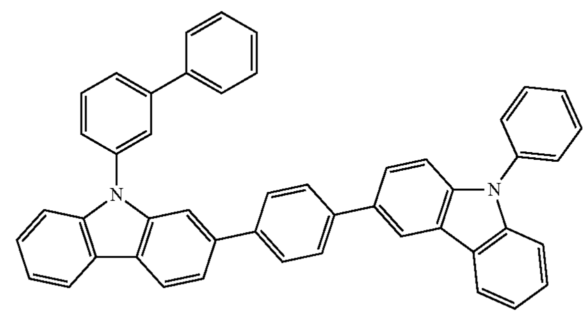

3-5

1) Preparation of Compound 3-5-A

Compound 3-5-A (38 g, yield: 83%) was prepared in the same manner as in the preparation method of Compound 3-1 by using (9H-carbazol-2-yl) boronic acid (20 g, 95 mmol) and 3-(4-chlorophenyl)-9-phenyl-9H-carbazole (33.5 g, 95 mmol).

2) Preparation of Compound 3-5

Compound 3-5 (15 g, yield: 76%, MS: [M+H]$^+$=637) was prepared in the same manner as in the preparation method of Compound 3-3 by using Compound 3-5-A (15 g, 31 mmol) and 3-bromo-1,1'-biphenyl (7.2 g, 31 mmol).

Preparation Example 3-6: Preparation of Compound 3-6

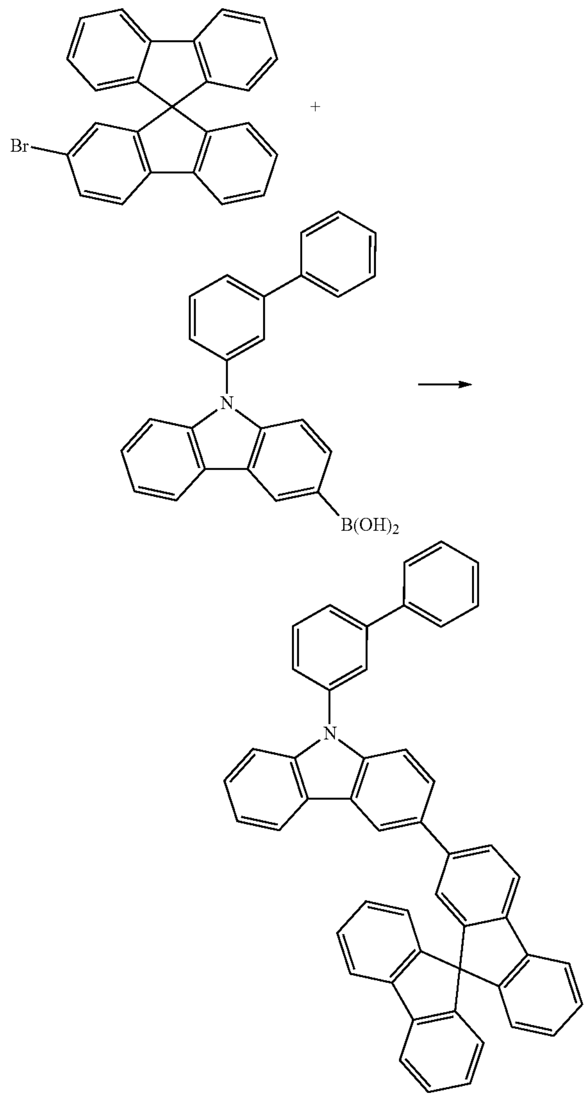

3-6

Compound 3-6 (13.5 g, yield: 75%, MS: $[M+H]^+$=634) was prepared in the same manner as in the preparation method of Compound 3-1 by using 2-bromo-9,9'-spirobi[fluorene] (11 g, 29 mmol) and 9-([1,1'-biphenyl]-3-yl)-9H-carbazol-3-yl)boronic acid (10.4 g, 29 mmol).

Preparation Example 3-7: Preparation of Compound 3-7

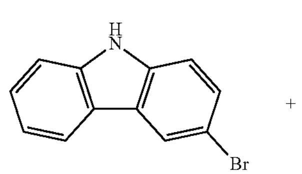

-continued

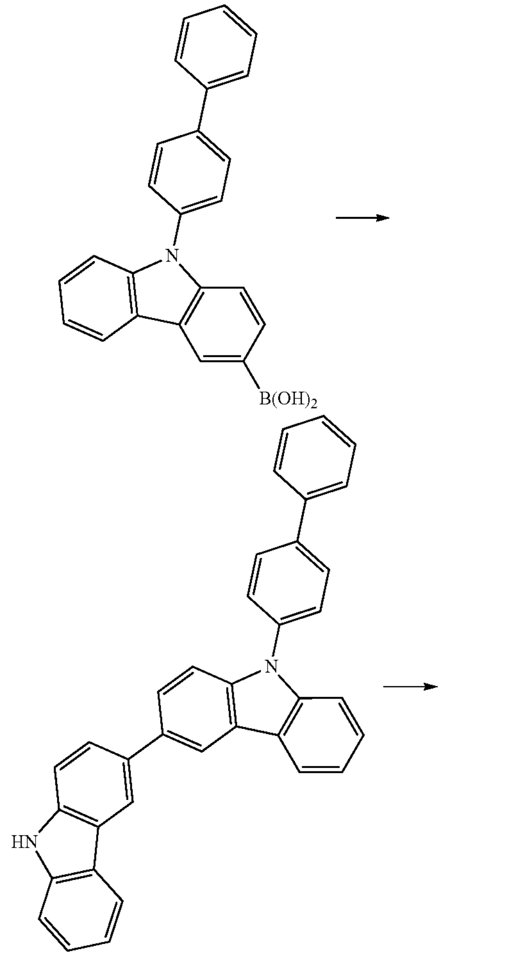

3-7-A

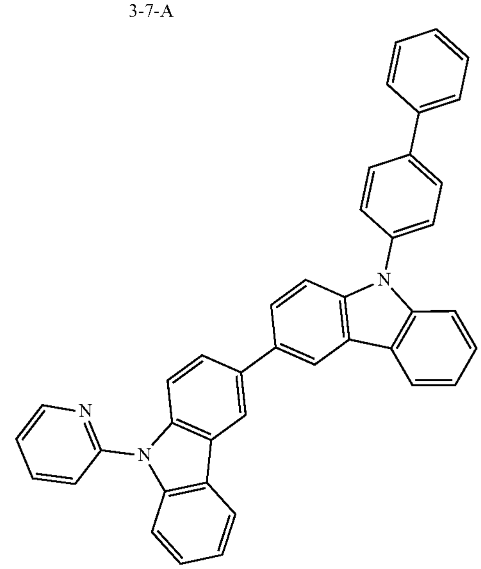

3-7

1) Preparation of Compound 3-7-A

Compound 3-7-A (24 g, yield: 81%) was prepared in the same manner as in the preparation method of Compound 3-1 by using 3-bromo-9H-carbazole (15 g, 61 mmol) and 9-([1,1'-biphenyl]-4-yl)-9H-carbazol-3-yl) boronic acid (22 g, 61 mmol).

2) Preparation of Compound 3-7

Compound 3-7 (8.5 g, yield: 65%, MS: $[M+H]^+=562$) was prepared in the same manner as in the preparation method of Compound 3-3 by using Compound 3-7-A (13 g, 27 mmol) and 2-bromopyridine (4.3 g, 27 mmol).

EXAMPLES

Example 1

A glass substrate on which ITO (indium tin oxide) was coated as a thin film to a thickness of 1,300 Å was put into distilled water in which a detergent was dissolved, and ultrasonically cleaned. A product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. The substrate was cleaned for 5 minutes using oxygen plasma and then transferred to a vacuum depositor.

On the ITO transparent electrode thus prepared, the compound HI-1 shown below was thermally vacuum-deposited in a thickness of 50 Å to form a hole injection layer. The compound HT-1 shown below was thermally vacuum-deposited in a thickness of 850 Å on the hole injection layer to form a hole transport layer. The compound 1-1 prepared previously was vacuum-deposited in a thickness of 350 Å on the hole transport layer to form a hole control layer. The compound 2-1 and compound 3-1 previously prepared as a host were deposited by co-evaporation at a volume ratio of Table 1 below to a thickness of 400 Å on the hole control layer. At this time, the compound GD-1 shown below was co-deposited as a dopant at a weight ratio of Table 1 to form a light emitting layer. The compound ET-1 shown below was vacuum-deposited in a thickness of 50 Å on the light emitting layer to form a hole blocking layer, and the compound ET-2 shown below and the compound LiQ shown below were vacuum-deposited at a weight ratio of 1:1 to a thickness of 250 Å on the hole blocking layer to form an electron transport layer. Lithium fluoride (LiF) in a thickness of 10 Å and aluminum in a thickness of 1000 Å were sequentially deposited on the electron transport layer to form a cathode.

HI-1

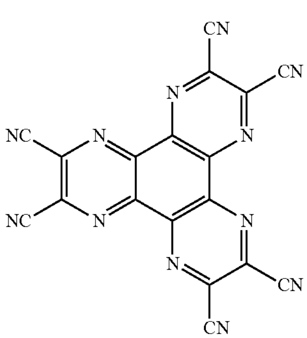

-continued

HT-1

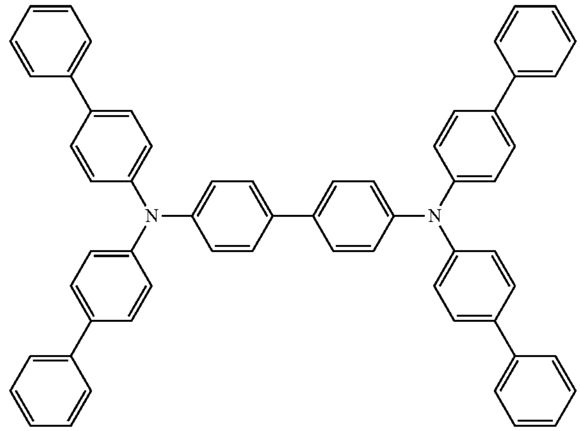

GD-1

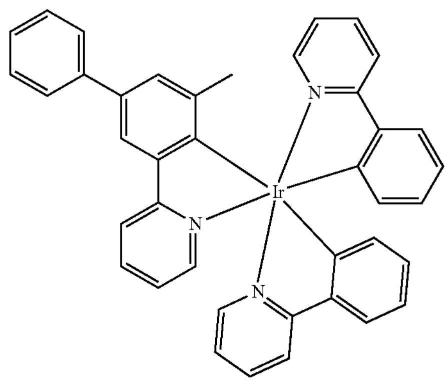

ET-1

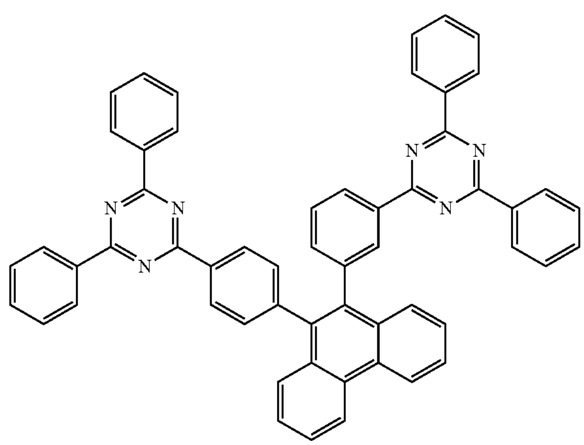

ET-2

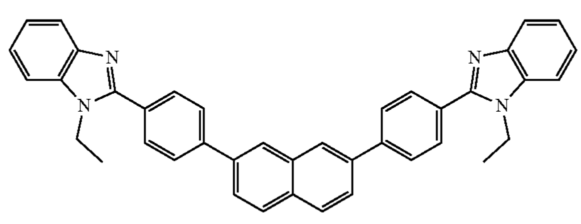

-continued

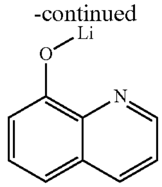

LiQ

In the above-mentioned process, the vapor deposition rate of the organic material was maintained at 0.4 to 0.7 Å/sec, the deposition rate of aluminum was maintained at 2 Å/sec, and the degree of vacuum during the deposition was maintained at $1\times10^{-7}$ to $5\times10^{-8}$ torr.

Examples 2 to 35, and 43 to 49

The organic light emitting devices were manufactured in the same manner as in Example 1, except that the combination of the hole control layer and the host of the light emitting layer, the ratio of the light emitting layer, and the dopant content were changed as shown in Tables 1 to 3 below.

Comparative Examples 1 to 14

The organic light emitting devices were manufactured in the same manner as in Example 1, except that the combination of the hole control layer and the host of the light emitting layer, the ratio of the light emitting layer, and the dopant content were changed as shown in Table 3 below. In Table 3 below, PH-1, PH-2, PH-3, PH-4 and HT-2 are as follows, respectively.

PH-1

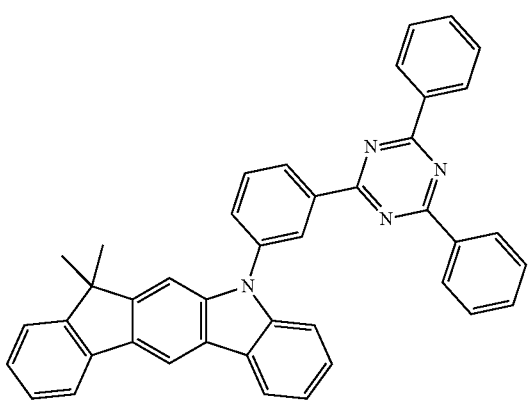

PH-2

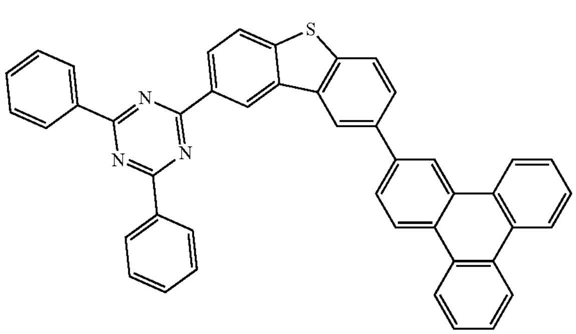

-continued

PH-3

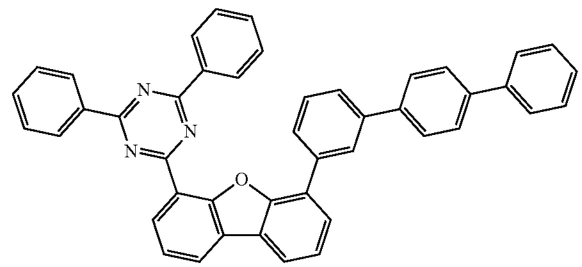

PH-4

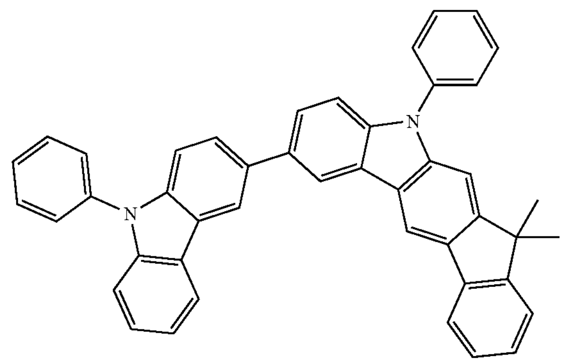

HT-2

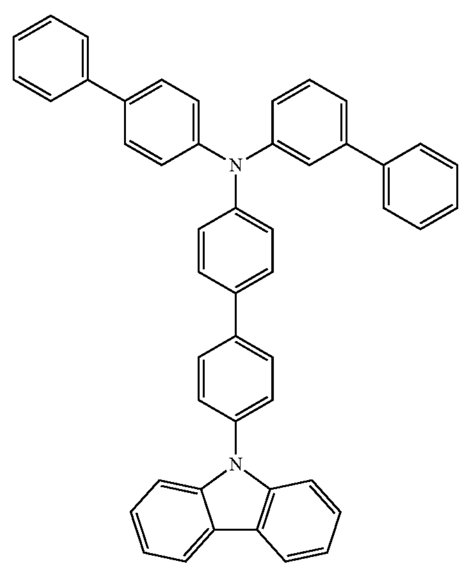

The voltage, efficiency, luminance, color coordinate and lifetime were measured by applying a current to the organic light emitting devices manufactured in Examples and Comparative Examples, and the results are shown in Tables 1 to 3 below. T95 means the time required for the luminance to be reduced to 95% of an initial luminance, when the initial luminance at the current density of 20 mA/$cm^2$ is assumed as 100%. Meanwhile, the number of the hole control layer and the host in Tables 1 to 3 below means the compound prepared in each of the previous Preparation Examples.

TABLE 1

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Example 1 | 1-1 | 2-1:3-1:GD-1 (200:200), 6 wt % | 3.52 | 137.2 | (0.22, 0.72) | 189.5 |
| Example 2 | 1-2 | 2-1:3-2:GD-1 (200:200), 6 wt % | 3.42 | 140.5 | (0.22, 0.72) | 180.0 |
| Example 3 | 1-3 | 2-1:3-3:GD-1 (200:200), 6 wt % | 3.62 | 138.1 | (0.22, 0.72) | 140.9 |
| Example 4 | 1-4 | 2-1:3-4:GD-1 (200:200), 6 wt % | 3.58 | 134.8 | (0.22, 0.72) | 123.5 |
| Example 5 | 1-5 | 2-1:3-5:GD-1 (200:200), 6 wt % | 3.55 | 139.2 | (0.22, 0.72) | 158.1 |
| Example 6 | 1-6 | 2-1:3-6:GD-1 (200:200), 6 wt % | 3.42 | 142.1 | (0.23, 0.70) | 130.8 |
| Example 7 | 1-7 | 2-1:3-7:GD-1 (200:200), 6 wt % | 3.56 | 137.5 | (0.22, 0.72) | 133.7 |
| Example 8 | 1-8 | 2-2:3-1:GD-1 (200:200), 6 wt % | 3.62 | 139.2 | (0.22, 0.72) | 158.4 |
| Example 9 | 1-9 | 2-2:3-2:GD-1 (200:200), 6 wt % | 3.33 | 138.4 | (0.22, 0.72) | 155.2 |
| Example 10 | 1-10 | 2-2:3-3:GD-1 (200:200), 6 wt % | 3.52 | 137.2 | (0.23, 0.70) | 178.5 |
| Example 11 | 1-11 | 2-2:3-4:GD-1 (200:200), 6 wt % | 3.48 | 141.1 | (0.22, 0.72) | 155.2 |
| Example 12 | 1-12 | 2-2:3-5:GD-1 (200:200), 6 wt % | 3.55 | 138.9 | (0.22, 0.73) | 164.2 |
| Example 13 | 1-13 | 2-2:3-6:GD-1 (200:200), 6 wt % | 3.44 | 132.8 | (0.22, 0.73) | 158.3 |
| Example 14 | 1-14 | 2-2:3-7:GD-1 (200:200), 6 wt % | 3.57 | 137.4 | (0.24, 0.70) | 160.5 |
| Example 15 | 1-15 | 2-3:3-1:GD-1 (200:200), 6 wt % | 3.50 | 135.8 | (0.23, 0.70) | 166.2 |
| Example 16 | 1-16 | 2-3:3-2:GD-1 (200:200), 6 wt % | 3.49 | 139.5 | (0.22, 0.71) | 170.2 |
| Example 17 | 1-17 | 2-3:3-3:GD-1 (200:200), 6 wt % | 3.61 | 132.8 | (0.23, 0.70) | 171.2 |
| Example 18 | 1-18 | 2-3:3-4:GD-1 (200:200), 6 wt % | 3.60 | 136.5 | (0.23, 0.72) | 168.2 |
| Example 19 | 1-19 | 2-3:3-5:GD-1 (200:200), 6 wt % | 3.59 | 138.2 | (0.23, 0.70) | 169.2 |
| Example 20 | 1-20 | 2-3:3-6:GD-1 (200:200), 6 wt % | 3.55 | 142.3 | (0.23, 0.70) | 170.1 |
| Example 21 | 1-21 | 2-3:3-7:GD-1 (200:200), 6 wt % | 3.57 | 140.1 | (0.22, 0.71) | 155.8 |
| Example 22 | 1-22 | 2-4:3-1:GD-1 (200:200), 6% | 3.55 | 128.9 | (0.22, 0.73) | 190.0 |

TABLE 2

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Example 23 | 1-1 | 2-4:3-2:GD-1 (200:200), 6 wt % | 3.49 | 138.1 | (0.22, 0.73) | 180.5 |
| Example 24 | 1-2 | 2-4:3-3:GD-1 (200:200), 6 wt % | 3.61 | 141.1 | (0.24, 0.70) | 142.5 |
| Example 25 | 1-3 | 2-4:3-4:GD-1 (200:200), 6 wt % | 3.60 | 135.2 | (0.23, 0.70) | 131.5 |
| Example 26 | 1-4 | 2-4:3-5:GD-1 (200:200), 6 wt % | 3.52 | 136.1 | (0.22, 0.72) | 144.5 |
| Example 27 | 1-5 | 2-4:3-6:GD-1 (200:200), 6 wt % | 3.48 | 132.8 | (0.22, 0.73) | 135.0 |
| Example 28 | 1-6 | 2-4:3-7:GD-1 (200:200), 6 wt % | 3.38 | 133.4 | (0.22, 0.73) | 138.1 |
| Example 29 | 1-7 | 2-5:3-1:GD-1 (200:200), 6 wt % | 3.48 | 141.2 | (0.24, 0.70) | 138.2 |
| Example 30 | 1-8 | 2-5:3-2:GD-1 (200:200), 6 wt % | 3.57 | 138.2 | (0.23, 0.70) | 140.1 |
| Example 31 | 1-9 | 2-5:3-3:GD-1 (200:200), 6 wt % | 3.48 | 134.1 | (0.22, 0.71) | 155.2 |

TABLE 2-continued

| | Hole control layer | Host:Dopant (Volume ratio), Dopant content | @10 mA/cm² Voltage (V) | Efficiency (cd/A) | Color coordinate (x, y) | Lifetime (T95, h) (@20 mA/cm²) |
|---|---|---|---|---|---|---|
| Example 32 | 1-10 | 2-5:3-4:GD-1 (200:200), 6 wt % | 3.56 | 141.2 | (0.23, 0.70) | 160.2 |
| Example 33 | 1-11 | 2-5:3-5:GD-1 (200:200), 6 wt % | 3.62 | 140.8 | (0.22, 0.71) | 177.2 |
| Example 34 | 1-12 | 2-5:3-6:GD-1 (200:200), 6 wt % | 3.33 | 139.9 | (0.23, 0.70) | 161.2 |
| Example 35 | 1-13 | 2-5:3-7:GD-1 (200:200), 6 wt % | 3.55 | 139.2 | (0.23, 0.72) | 158.8 |
| Example 43 | 1-21 | 2-7:3-1:GD-1 (200:200), 6 wt % | 3.58 | 134.8 | (0.24, 0.71) | 189.5 |
| Example 44 | 1-22 | 2-7:3-2:GD-1 (200:200), 6 wt % | 3.66 | 138.2 | (0.23, 0.70) | 180.0 |

TABLE 3

| | Hole control layer | Host:Dopant (Volume ratio), Dopant content | @10 mA/cm² Voltage (V) | Efficiency (cd/A) | Color coordinate (x, y) | Lifetime (T95, h) (@20 mA/cm²) |
|---|---|---|---|---|---|---|
| Example 45 | 1-1 | 2-7:3-3:GD-1 (200:200), 6 wt % | 3.61 | 137.5 | (0.23, 0.70) | 140.9 |
| Example 46 | 1-4 | 2-7:3-4:GD-1 (200:200), 6 wt % | 3.51 | 141.2 | (0.23, 0.70) | 123.5 |
| Example 47 | 1-5 | 2-7:3-5:GD-1 (200:200), 6 wt % | 3.34 | 141.3 | (0.22, 0.72) | 158.1 |
| Example 48 | 1-11 | 2-7:3-6:GD-1 (200:200), 6 wt % | 4.06 | 137.5 | (0.22, 0.73) | 130.8 |
| Example 49 | 1-16 | 2-7:3-7:GD-1 (200:200), 6 wt % | 4.20 | 139.2 | (0.22, 0.73) | 133.7 |
| Comparative Example 1 | HT-2 | PH-1:PH-4:GD-1 (200:200), 6 wt % | 4.06 | 121.1 | (0.23, 0.70) | 61.8 |
| Comparative Example 2 | HT-2 | PH-1:PH-5:GD-1 (200:200), 6 wt % | 4.07 | 118.2 | (0.23, 0.70) | 65.0 |
| Comparative Example 3 | HT-2 | PH-2:PH-4:GD-1 (200:200), 6 wt % | 4.03 | 122.5 | (0.23, 0.70) | 34.9 |
| Comparative Example 4 | 1-1 | PH-3:PH-5:GD-1 (200:200), 6 wt % | 4.05 | 118.1 | (0.33, 0.64) | 37.0 |
| Comparative Example 5 | 1-8 | PH-2:PH-5:GD-1 (200:200), 6 wt % | 4.12 | 117.2 | (0.23, 0.70) | 55.0 |
| Comparative Example 6 | 1-20 | PH-1:PH-4:GD-1 (200:200), 6 wt % | 3.93 | 121.2 | (0.23, 0.70) | 59.0 |
| Comparative Example 7 | HT-2 | 2-1:PH-4:GD-1 (200:200), 6 wt % | 4.11 | 123.8 | (0.22, 0.72) | 61.0 |
| Comparative Example 8 | HT-2 | 2-4:PH-5:GD-1 (200:200), 6 wt % | 4.06 | 130.1 | (0.22, 0.72) | 48.0 |
| Comparative Example 9 | HT-2 | PH-1:3-1:GD-1 (200:200), 6 wt % | 4.20 | 122.8 | (0.22, 0.72) | 55.0 |
| Comparative Example 10 | HT-2 | PH-2:3-5:GD-1 (200:200), 6 wt % | 4.15 | 114.6 | (0.23, 0.70) | 58.0 |
| Comparative Example 11 | 1-4 | PH-1:3-1:GD-1 (200:200), 6 wt % | 4.20 | 117.6 | (0.22, 0.72) | 56.0 |
| Comparative Example 12 | 1-12 | PH-3:3-5:GD-1 (200:200), 6 wt % | 4.22 | 119.2 | (0.22, 0.73) | 57.0 |
| Comparative Example 13 | HT-2 | 1-1:GD-1 (350) 6 wt % | 3.93 | 120.1 | (0.22, 0.72) | 22.3 |
| Comparative Example 14 | HT-2 | PH-1:GD-1 (350) 6 wt % | 4.11 | 119.2 | (0.22, 0.72) | 34.9 |

Example 50

A glass substrate on which ITO (indium tin oxide) was coated as a thin film to a thickness of 1,300 Å was put into distilled water in which a detergent was dissolved, and ultrasonically cleaned. A product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone, and methanol, dried, and then transferred to a plasma cleaner. The substrate was cleaned for 5 minutes using oxygen plasma and then transferred to a vacuum depositor.

On the ITO transparent electrode thus prepared, the compound HI-1 shown below was thermally vacuum-deposited in a thickness of 50 Å to form a hole injection layer. The compound HT-1 shown below was thermally vacuum-deposited in a thickness of 850 Å on the hole injection layer to form a hole transport layer. The compound 1-1 prepared previously was vacuum-deposited in a thickness of 250 Å on the hole transport layer to form a first hole control layer, and a compound HT-3 shown below was vacuum-deposited in a thickness of 100 Å on the first hole control layer to form a second hole control layer. The compound 2-1 and compound 3-1 previously prepared as a host were deposited by co-evaporation at a volume ratio of Table 4 below to a thickness of 400 Å on the second hole control layer. At this time, the compound GD-1 shown below was co-deposited as a dopant at a weight ratio of Table 4 to form a light emitting layer. The compound ET-1 shown below was vacuum-deposited in a thickness of 50 Å on the light emitting layer to form a hole blocking layer, and the compound ET-2 shown below and the compound LiQ shown below were vacuum-deposited at a weight ratio of 1:1 to a thickness of 250 Å on the hole blocking layer to form an electron transport layer. Lithium fluoride (LiF) in a thickness of 10 Å and aluminum in a thickness of 1000 Å were sequentially deposited on the electron transport layer to form a cathode.

HI-1

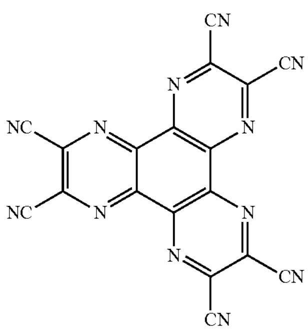

HT-1

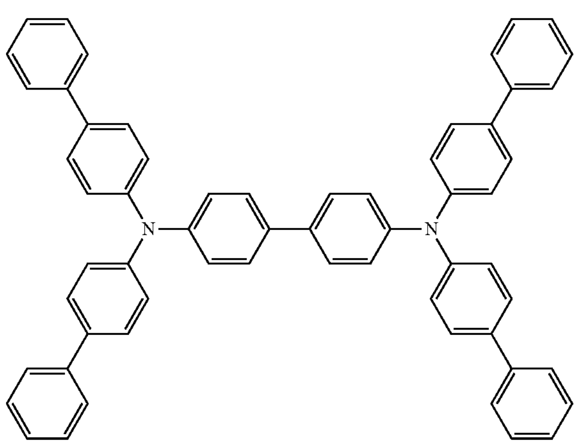

-continued

HT-3

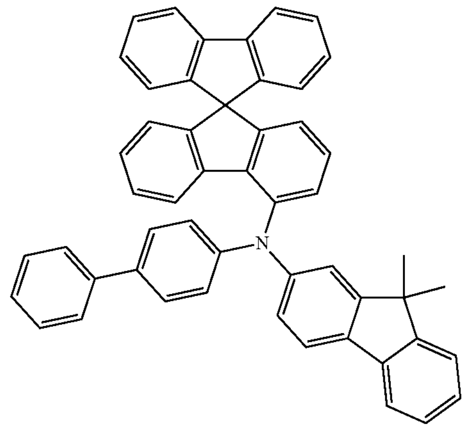

GD-1

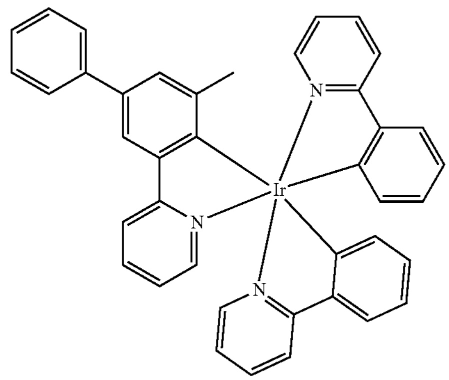

ET-1

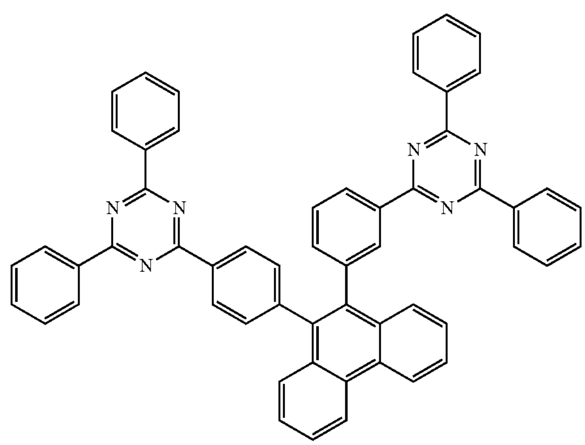

ET-2

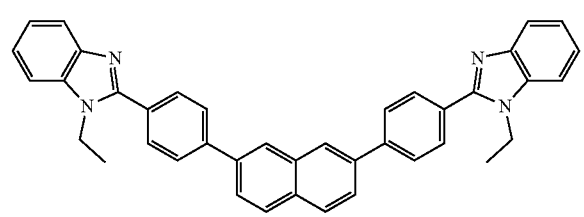

-continued

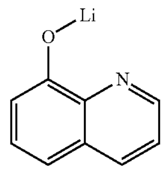

LiQ

In the above-mentioned process, the vapor deposition rate of the organic material was maintained at 0.4 to 0.7 Å/sec, the deposition rate of aluminum was maintained at 2 Å/sec, and the degree of vacuum during the deposition was maintained at $1\times10^{-7}$ to $5\times10^{-8}$ torr.

Examples 51 to 84, and 92 to 106

The organic light emitting devices were manufactured in the same manner as in Example 50, except that the combination of the hole control layer and the host of the light emitting layer, the ratio of the light emitting layer, and the dopant content were changed as shown in Tables 4 to 6 below.

Comparative Examples 15 to 32

The organic light emitting devices were manufactured in the same manner as in Example 50, except that the combination of the hole control layer and the host of the light emitting layer, the ratio of the light emitting layer, and the dopant content were changed as shown in Table 7 below. In Table 7 below, PH-1, PH-2, PH-3, PH-4, PH-5 and HT-2 are as follows, respectively.

PH-1

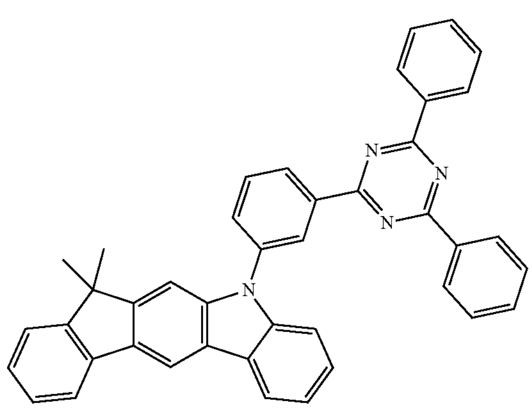

-continued

PH-2

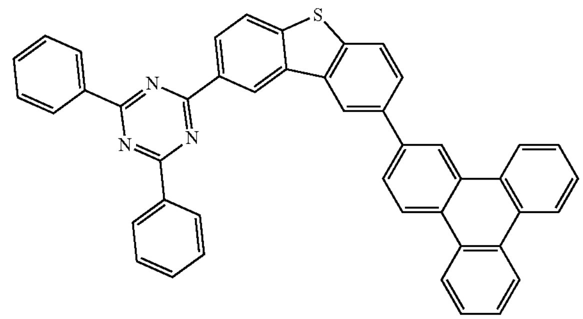

PH-3

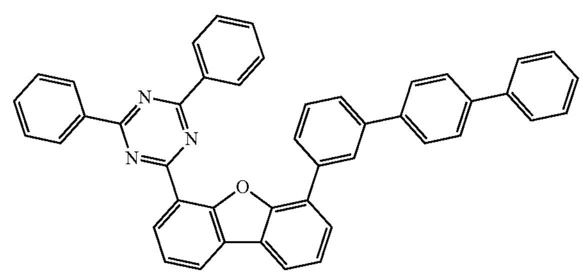

PH-4

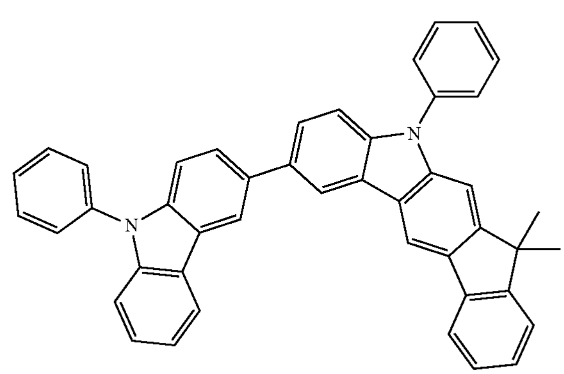

-continued

PH-5

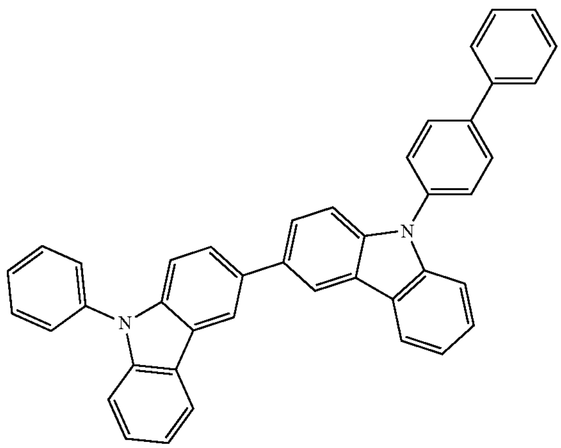

-continued

HT-2

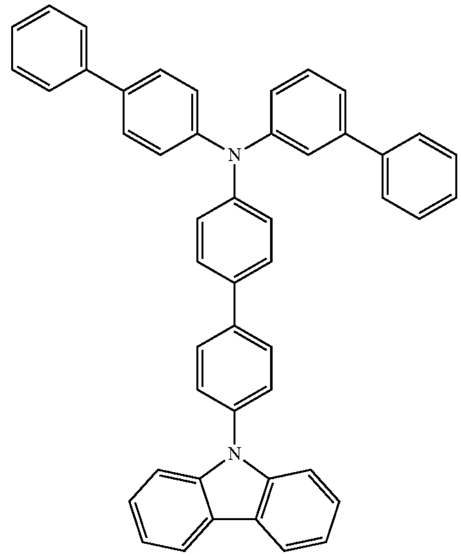

The voltage, efficiency, luminance, color coordinate and lifetime were measured by applying a current to the organic light emitting devices manufactured in Examples 50 to 106 and Comparative Examples 15 to 32, and the results are shown in Tables 4 to 7 below. T95 means the time required for the luminance to be reduced to 95% of an initial luminance, when the initial luminance at the current density of 20 mA/cm$^2$ is assumed as 100%. Meanwhile, the number of the hole control layer and the host in Tables 4 to 7 below means the compound prepared in each of the previous Preparation Examples.

TABLE 4

| | Hole control layer | Host:Dopant (Volume ratio), Dopant content | @10 mA/cm$^2$ Voltage (V) | @10 mA/cm$^2$ Efficiency (cd/A) | Color coordinate (x, y) | Lifetime (T95, h) (@20 mA/cm$^2$) |
|---|---|---|---|---|---|---|
| Example 50 | 1-1 | 2-1:3-1:GD-1 (200:200), 6 wt % | 3.45 | 141.2 | (0.23, 0.71) | 201.0 |
| Example 51 | 1-4 | 2-1:3-2:GD-1 (200:200), 6 wt % | 3.54 | 139.9 | (0.23, 0.70) | 190.2 |
| Example 52 | 1-3 | 2-1:3-3:GD-1 (200:200), 6 wt % | 3.44 | 139.2 | (0.23, 0.70) | 180.5 |
| Example 53 | 1-2 | 2-1:3-4:GD-1 (200:200), 6 wt % | 3.57 | 138.5 | (0.23, 0.70) | 190.4 |
| Example 54 | 1-5 | 2-1:3-5:GD-1 (200:200), 6 wt % | 3.59 | 139.4 | (0.23, 0.70) | 179.9 |
| Example 55 | 1-6 | 2-1:3-6:GD-1 (200:200), 6 wt % | 3.49 | 141.1 | (0.23, 0.64) | 150.8 |
| Example 56 | 1-8 | 2-1:3-7:GD-1 (200:200), 6 wt % | 3.58 | 140.8 | (0.23, 0.70) | 188.0 |
| Example 57 | 1-9 | 2-2:3-1:GD-1 (200:200), 6 wt % | 3.38 | 135.8 | (0.22, 0.72) | 178.2 |
| Example 58 | 1-7 | 2-2:3-2:GD-1 (210:140), 6 wt % | 3.48 | 139.2 | (0.24, 0.71) | 182.3 |
| Example 59 | 1-10 | 2-2:3-3:GD-1 (200:200), 6 wt % | 3.57 | 143.1 | (0.23, 0.70) | 188.2 |

TABLE 4-continued

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Example 60 | 1-14 | 2-2:3-4:GD-1 (200:200), 6 wt % | 3.48 | 132.1 | (0.23, 0.70) | 175.3 |
| Example 61 | 1-12 | 2-2:3-5:GD-1 (200:200), 6 wt % | 3.43 | 140.1 | (0.24, 0.71) | 170.5 |
| Example 62 | 1-13 | 2-2:3-6:GD-1 (200:200), 6 wt % | 3.42 | 138.2 | (0.24, 0.70) | 168.5 |
| Example 63 | 1-11 | 2-2:3-7:GD-1 (200:200), 6 wt % | 3.52 | 139.5 | (0.23, 0.70) | 173.5 |
| Example 64 | 1-15 | 2-3:3-1:GD-1 (200:200), 6 wt % | 3.42 | 137.5 | (0.23, 0.70) | 174.5 |
| Example 65 | 1-16 | 2-3:3-2:GD-1 (200:200), 6 wt % | 3.55 | 139.5 | (0.23, 0.70) | 180.2 |
| Example 66 | 1-17 | 2-3:3-3:GD-1 (200:200), 6 wt % | 3.56 | 138.7 | (0.24, 0.71) | 190.5 |
| Example 67 | 1-18 | 2-3:3-4:GD-1 (200:200), 6 wt % | 3.61 | 140.2 | (0.23, 0.70) | 179.8 |
| Example 68 | 1-19 | 2-3:3-5:GD-1 (200:200), 6 wt % | 3.52 | 141.3 | (0.23, 0.70) | 180.1 |
| Example 69 | 1-20 | 2-3:3-6:GD-1 (200:200), 6 wt % | 3.55 | 134.8 | (0.23, 0.70) | 193.5 |
| Example 70 | 1-21 | 2-3:3-7:GD-1 (200:200), 6 wt % | 3.44 | 141.8 | (0.23, 0.70) | 172.3 |

TABLE 5

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Example 71 | 1-22 | 2-4:3-1:GD-1 (200:200), 6% | 3.67 | 138.2 | (0.22, 0.72) | 210.0 |
| Example 72 | 1-20 | 2-4:3-2:GD-1 (200:200), 6% | 3.58 | 142.3 | (0.22, 0.72) | 195.4 |
| Example 73 | 1-19 | 2-4:3-3:GD-1 (200:200), 6% | 3.69 | 141.1 | (0.23, 0.70) | 170.5 |
| Example 74 | 1-18 | 2-4:3-4:GD-1 (200:200), 6% | 3.50 | 135.2 | (0.22, 0.72) | 166.7 |
| Example 75 | 1-4 | 2-4:3-5:GD-1 (200:200), 6% | 3.49 | 136.1 | (0.22, 0.73) | 167.8 |
| Example 76 | 1-5 | 2-4:3-6:GD-1 (200:200), 6% | 3.60 | 132.8 | (0.22, 0.73) | 170.8 |
| Example 77 | 1-6 | 2-4:3-7:GD-1 (200:200), 6% | 3.52 | 133.4 | (0.24, 0.70) | 180.2 |
| Example 78 | 1-7 | 2-5:3-1:GD-1 (200:200), 6% | 3.48 | 141.2 | (0.23, 0.70) | 189.2 |
| Example 79 | 1-8 | 2-5:3-2:GD-1 (200:200), 6% | 3.38 | 138.2 | (0.22, 0.71) | 199.3 |
| Example 80 | 1-9 | 2-5:3-3:GD-1 (200:200), 6% | 3.49 | 134.1 | (0.23, 0.70) | 170.5 |
| Example 81 | 1-10 | 2-5:3-4:GD-1 (200:200), 6% | 3.51 | 141.2 | (0.23, 0.70) | 189.5 |
| Example 82 | 1-11 | 2-5:3-5:GD-1 (200:200), 6% | 3.55 | 135.8 | (0.23, 0.70) | 189.4 |
| Example 83 | 1-12 | 2-5:3-6:GD-1 (200:200), 6% | 3.53 | 139.2 | (0.23, 0.70) | 175.8 |
| Example 84 | 1-13 | 2-5:3-7:GD-1 (200:200), 6% | 3.51 | 143.1 | (0.24, 0.71) | 177.4 |

TABLE 6

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Example 92 | 1-21 | 2-7:3-1:GD-1 (200:200), 6 wt % | 3.55 | 138.9 | (0.24, 0.70) | 198.2 |
| Example 93 | 1-22 | 2-7:3-2:GD-1 (200:200), 6 wt % | 3.61 | 141.1 | (0.23, 0.70) | 201.5 |
| Example 94 | 1-1 | 2-7:3-3:GD-1 (200:200), 6 wt % | 3.51 | 135.2 | (0.22, 0.71) | 200.5 |
| Example 95 | 1-4 | 2-7:3-4:GD-1 (200:200), 6 wt % | 3.34 | 136.1 | (0.23, 0.70) | 188.9 |
| Example 96 | 1-5 | 2-7:3-5:GD-1 (200:200), 6 wt % | 3.53 | 132.8 | (0.23, 0.70) | 178.1 |
| Example 97 | 1-11 | 2-7:3-6:GD-1 (200:200), 6 wt % | 3.51 | 132.8 | (0.24, 0.70) | 164.8 |
| Example 98 | 1-16 | 2-7:3-7:GD-1 (200:200), 6 wt % | 3.61 | 133.4 | (0.23, 0.70) | 165.2 |
| Example 99 | 1-1 | 2-7:3-7:GD-1 (210:140), 6 wt % | 3.66 | 141.2 | (0.22, 0.72) | 189.5 |
| Example 100 | 1-3 | 2-7:3-7:GD-1 (140:210), 6 wt % | 3.61 | 138.2 | (0.22, 0.73) | 180.0 |
| Example 101 | 1-20 | 2-7:3-7:GD-1 (210:140), 12 wt % | 3.57 | 134.1 | (0.22, 0.73) | 140.9 |
| Example 102 | 1-11 | 2-7:3-7:GD-1 (140:210), 12 wt % | 3.48 | 139.4 | (0.24, 0.70) | 123.5 |
| Example 103 | 1-22 | 2-7:3-7:GD-1 (210:140), 5 wt % | 3.56 | 141.1 | (0.23, 0.70) | 158.1 |
| Example 104 | 1-5 | 2-7:3-7:GD-1 (140:210), 5 wt % | 3.62 | 140.8 | (0.22, 0.71) | 130.8 |
| Example 105 | 1-20 | 2-7:3-7:GD-1 (210:140), 10 wt % | 3.33 | 135.8 | (0.22, 0.72) | 133.7 |
| Example 106 | 1-21 | 2-7:3-7:GD-1 (140:210), 10 wt % | 3.46 | 139.2 | (0.22, 0.73) | 133.7 |

TABLE 7

| | Hole control layer | Host:Dopant (Volume ratio), Dopant content | @10 mA/cm² Voltage (V) | @10 mA/cm² Efficiency (cd/A) | Color coordinate (x, y) | Lifetime (T95, h) (@20 mA/cm²) |
|---|---|---|---|---|---|---|
| Comparative Example 15 | HT-2 | PH-1:PH-4:GD-1 (200:200), 6 wt % | 3.34 | 121.2 | (0.22, 0.73) | 72.5 |
| Comparative Example 16 | HT-2 | PH-1:PH-5:GD-1 (200:200), 6 wt % | 4.06 | 124.2 | (0.24, 0.70) | 73.5 |
| Comparative Example 17 | HT-2 | PH-3:PH-4:GD-1 (200:200), 6 wt % | 4.20 | 133.3 | (0.23, 0.70) | 48.5 |
| Comparative Example 18 | 1-3 | PH-1:PH-4:GD-1 (200:200), 6 wt % | 4.06 | 125.2 | (0.22, 0.71) | 40.2 |
| Comparative Example 19 | 1-6 | PH-2:PH-5:GD-1 (200:200), 6 wt % | 4.07 | 121.2 | (0.23, 0.70) | 60.5 |
| Comparative Example 20 | 1-21 | PH-2:PH-5:GD-1 (200:200), 6 wt % | 4.12 | 111.2 | (0.23, 0.70) | 66.1 |
| Comparative Example 21 | HT-2 | 2-1:PH-4:GD-1 (200:200), 6 wt % | 4.12 | 127.5 | (0.22, 0.72) | 70.5 |
| Comparative Example 22 | HT-2 | 2-4:PH-5:GD-1 (200:200), 6 wt % | 4.11 | 130.1 | (0.22, 0.73) | 68.5 |
| Comparative Example 23 | HT-2 | PH-1:3-1:GD-1 (200:200), 6 wt % | 3.88 | 126.8 | (0.22, 0.73) | 72.0 |
| Comparative Example 24 | HT-2 | PH-1:3-5:GD-1 (200:200), 6 wt % | 4.12 | 124.2 | (0.24, 0.70) | 67.1 |
| Comparative Example 25 | 1-4 | PH-1:3-1:GD-1 (200:200), 6 wt % | 4.20 | 125.3 | (0.23, 0.70) | 72.8 |
| Comparative Example 26 | 1-12 | PH-1:3-5:GD-1 (200:200), 6 wt % | 4.15 | 124.8 | (0.22, 0.71) | 68.1 |
| Comparative Example 27 | HT-2 | 1-1:GD-1 (350) 6 wt % | 4.20 | 125.5 | (0.23, 0.70) | 66.5 |
| Comparative Example 28 | HT-2 | PH-1:GD-1 (350) 6 wt % | 4.22 | 123.2 | (0.23, 0.70) | 57.4 |
| Comparative Example 29 | HT-2 | 2-1:PH-5:GD-1 (140:210), 6 wt % | 3.93 | 121.8 | (0.24, 0.71) | 57.5 |
| Comparative Example 30 | HT-2 | 2-4:PH-2:GD-1 (210:140), 6 wt % | 4.11 | 120.2 | (0.23, 0.70) | 68.4 |

TABLE 7-continued

| | Hole control layer | Host:Dopant (Volume ratio), Dopant content | @10 mA/cm² Voltage (V) | Efficiency (cd/A) | Color coordinate (x, y) | Lifetime (T95, h) (@20 mA/cm²) |
|---|---|---|---|---|---|---|
| Comparative Example 31 | 1-4 | PH-1:3-1:GD-1 (200:200), 5 wt % | 4.22 | 118.8 | (0.23, 0.70) | 60.2 |
| Comparative Example 32 | 1-12 | PH-1:3-5:GD-1 (200:200), 12 wt % | 4.05 | 119.5 | (0.23, 0.70) | 66.2 |

| Description of Symbols | |
|---|---|
| 1: substrate | 2: anode |
| 3: hole transport layer | 4: hole control layer |
| 5: light emitting layer | 6: electron transport layer |
| 7: cathode | |

In Claim 10, at Column 809, the first compound should appear as follows:
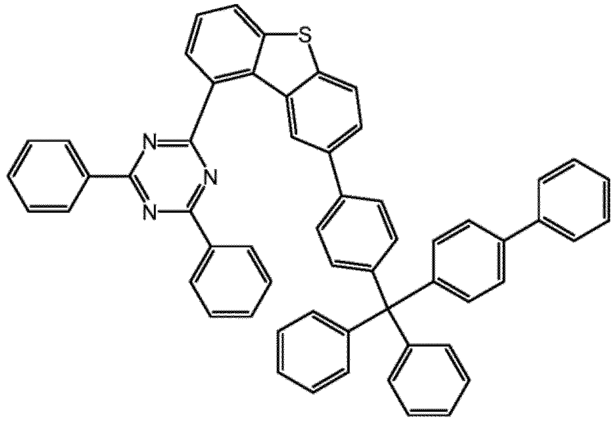
In Claim 10, at Column 825, the second compound should appear as follows:
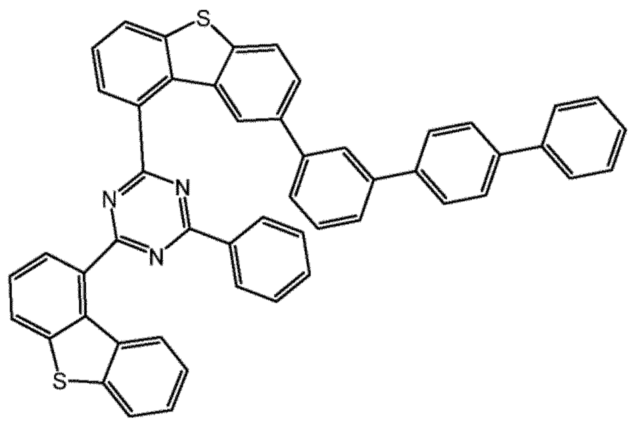
In Claim 10, at Column 876, the third compound should appear as follows:
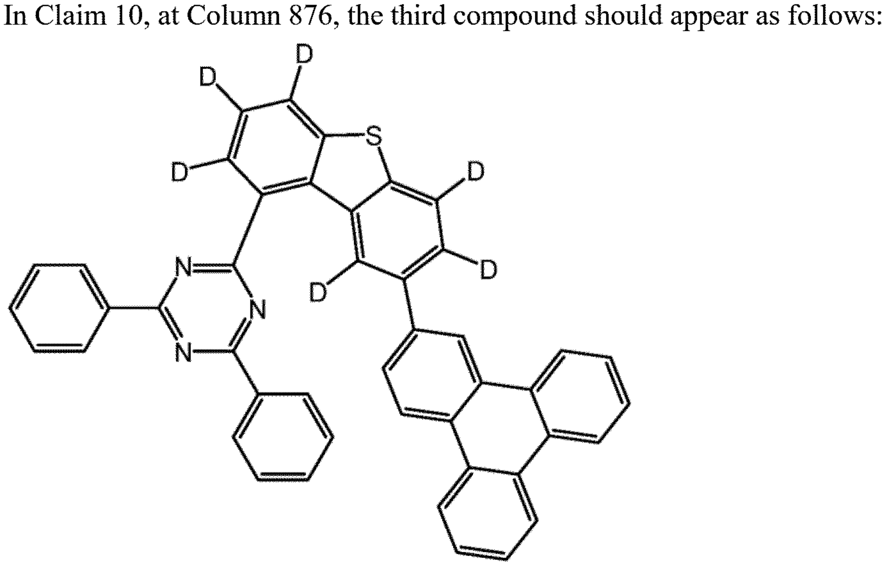

The invention claimed is:

1. An organic light emitting device comprising:

an anode;

a hole transport layer;

a hole control layer;

a light emitting layer;

an electron transport layer; and a cathode, wherein:

the hole control layer includes a compound of the following Chemical Formula 1, and the light emitting layer includes (i) a compound of the following Chemical Formula 2-1, or a compound of the following Chemical Formula 2-2; and (ii) a compound of the following Chemical Formula 3:

Chemical Formula 1

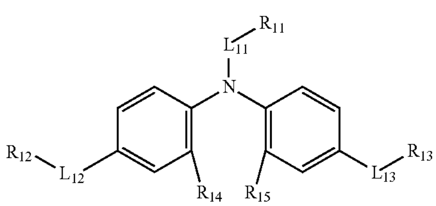

wherein, in Chemical Formula 1:

$L_{11}$ is a single bond or a substituted or unsubstituted $C_{6-60}$ arylene;

$L_{12}$ and $L_{13}$ are each independently a single bond or a substituted or unsubstituted $C_{6-60}$ arylene;

$R_{11}$ is a substituted or unsubstituted $C_{6-60}$ aryl;

$R_{12}$ and $R_{13}$ are each independently any one substituent selected from the group consisting of the following:

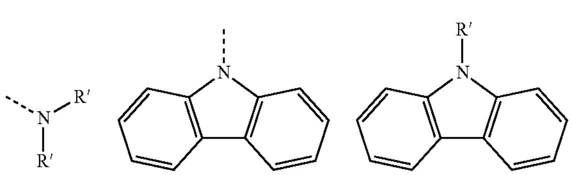

-continued

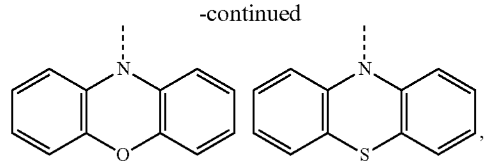

wherein, each R' is independently a substituted or unsubstituted $C_{6-60}$ aryl;

$R_{14}$ and $R_{15}$ are hydrogen, or are linked to each other;

Chemical Formula 2-1

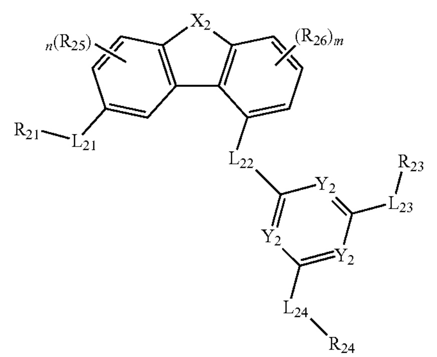

Chemical Formula 2-2

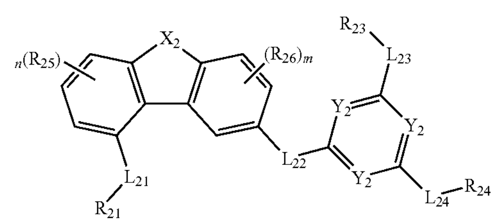

wherein, in Chemical Formulas 2-1 and 2-2;

$X_2$ is O or S;

each $Y_2$ is independently N or CH, with the proviso that at least one of $Y_2$ is N;

$L_{21}$, $L_{22}$, $L_{23}$, and $L_{24}$ are each independently a single bond or a substituted or unsubstituted $C_{6-60}$ arylene;

$R_{21}$ is a substituted or unsubstituted $C_{6-60}$ aryl or the following substituent:

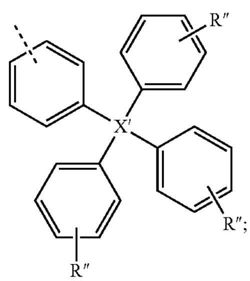

wherein:

X' is C or Si, and each R" is independently hydrogen, $C_{1-60}$ alkyl, or $Si(C_{1-60}\ alkyl)_3$;

$R_{23}$ and $R_{24}$ are each independently a substituted or unsubstituted $C_{6-60}$ aryl or a substituted or unsubstituted $C_{2-60}$ heteroaryl containing any one or more heteroatoms selected from the group consisting of N, O, and S;

$R_{25}$ and $R_{26}$ are each independently hydrogen, deuterium, a substituted or unsubstituted $C_{1-60}$ alkyl, cyano, or a substituted or unsubstituted $C_{6-60}$ aryl;

n and m are each independently an integer of 1 to 3;

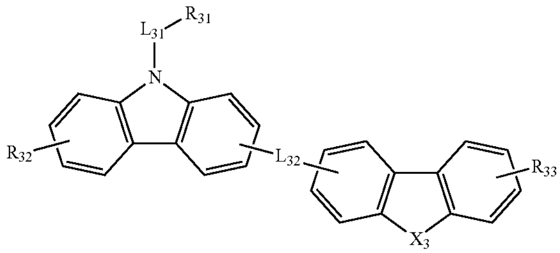

wherein, in Chemical Formula 3:

$L_{31}$ is a single bond or a substituted or unsubstituted $C_{6-60}$ arylene;

$L_{32}$ is a single bond or a substituted or unsubstituted $C_{6-60}$ arylene;

$R_{31}$ is a substituted or unsubstituted $C_{3-60}$ cycloalkyl, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

$R_{32}$ and $R_{33}$ are each independently hydrogen, cyano, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

$X_3$ is O, S, $C(CH_3)_2$, $N—R_{34}$, or

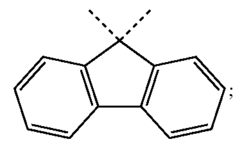

and $R_{34}$ is a substituted or unsubstituted $C_{6-60}$ aryl.

2. The organic light emitting device according to claim 1, wherein $L_{12}$ and $L_{13}$ are each independently a single bond, phenylene, or biphenyldiyl.

3. The organic light emitting device according to claim 1, wherein $R_{11}$ is phenyl, biphenylyl, terphenylyl, naphthyl, or dimethylfluorenyl.

4. The organic light emitting device according to claim 1, wherein each R' is independently phenyl, biphenylyl, or naphthyl.

5. The organic light emitting device according to claim 1, wherein the compound of Chemical Formula 1 is any one compound selected from the group consisting of the following:

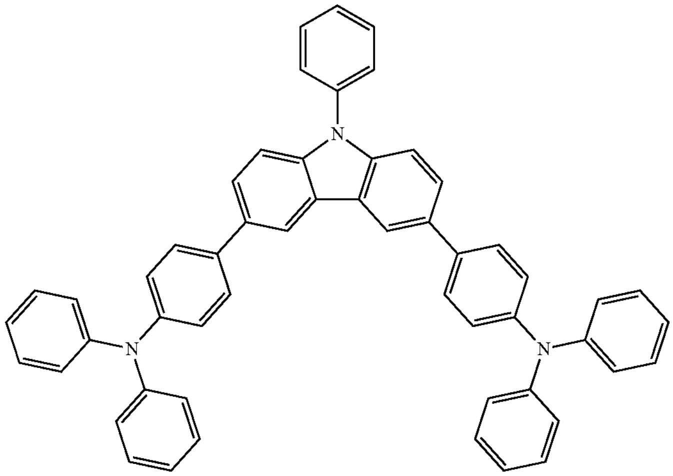

-continued
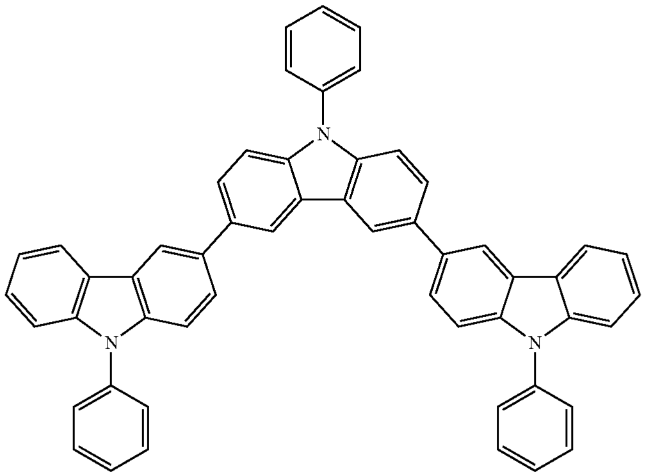
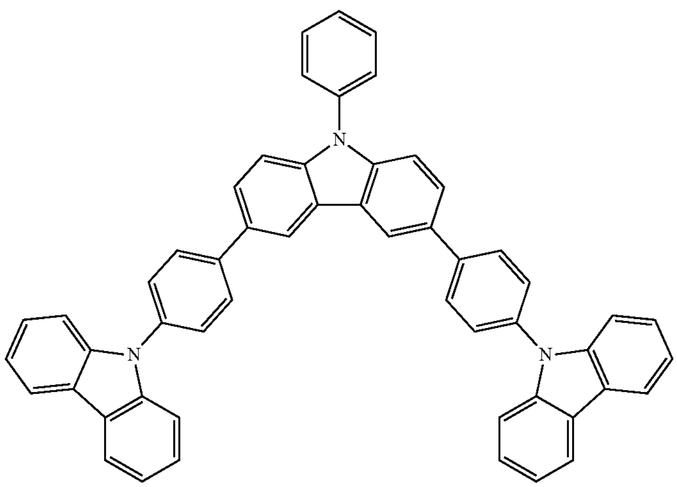
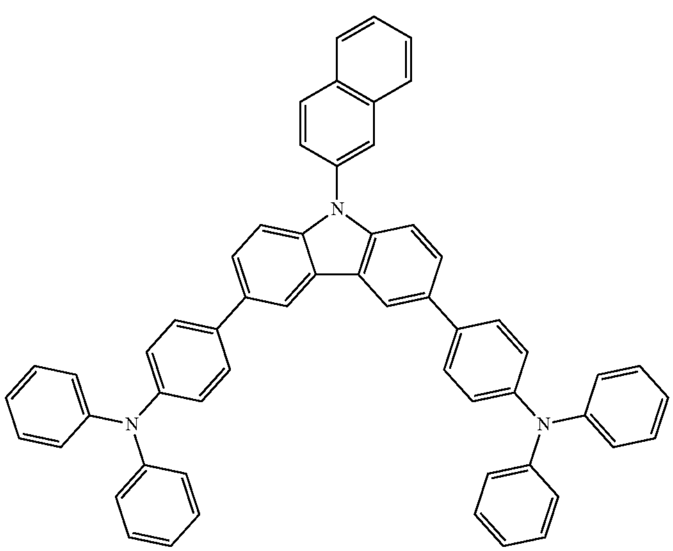

-continued
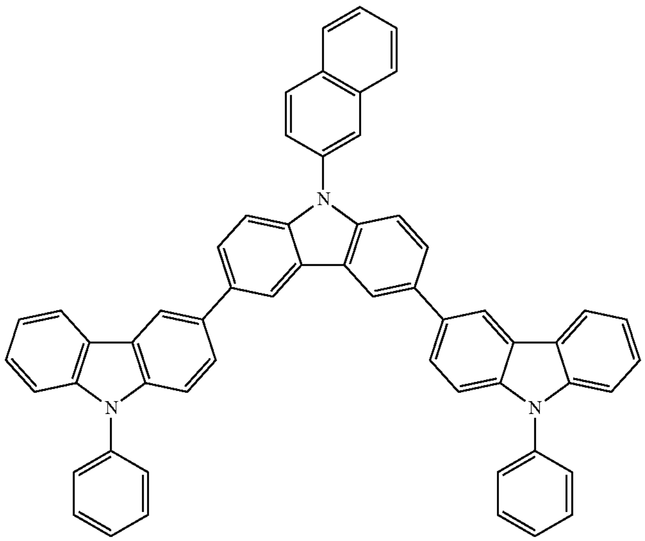
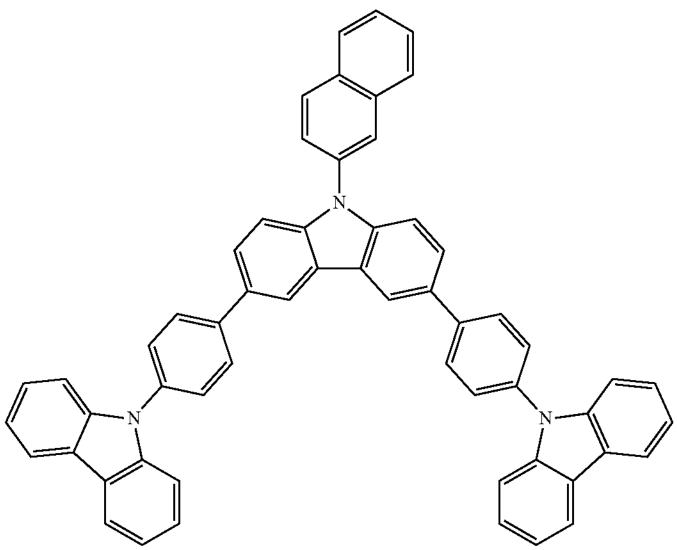
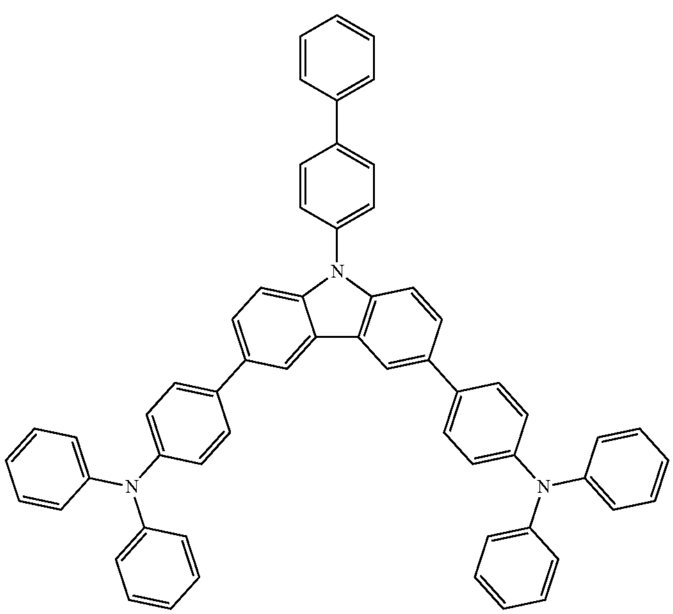

-continued
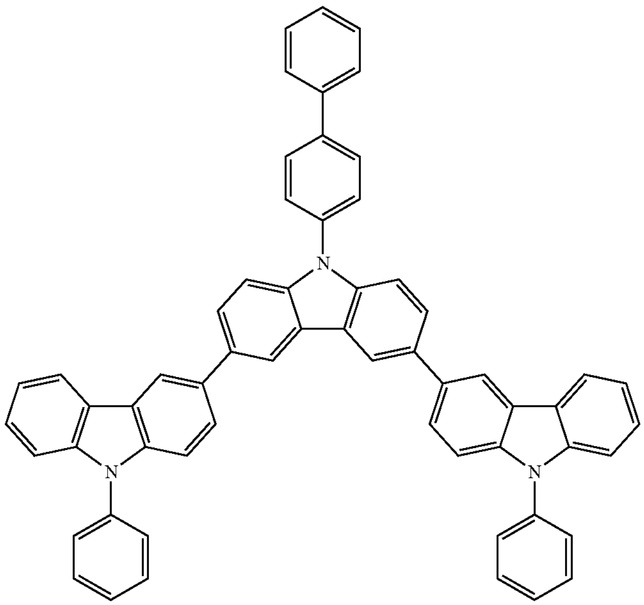
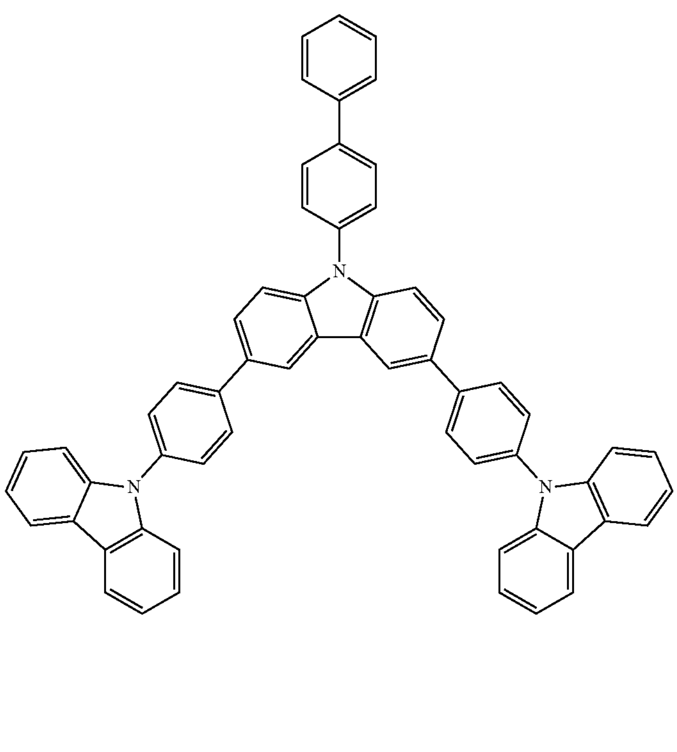

-continued
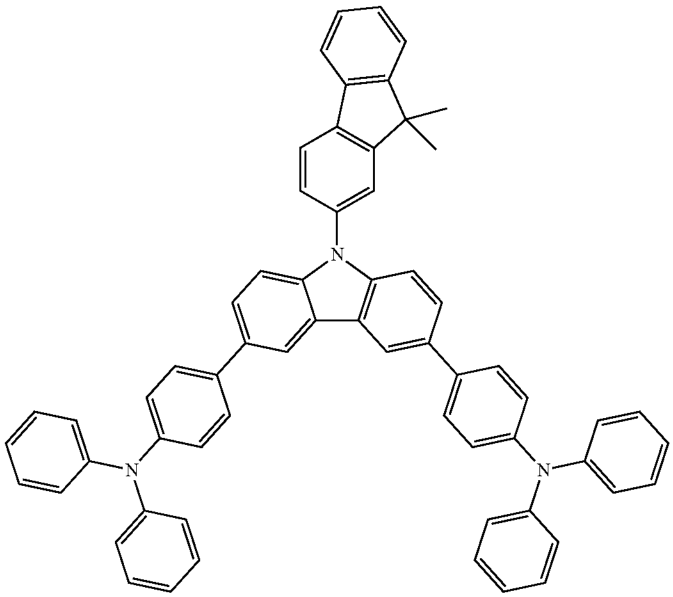
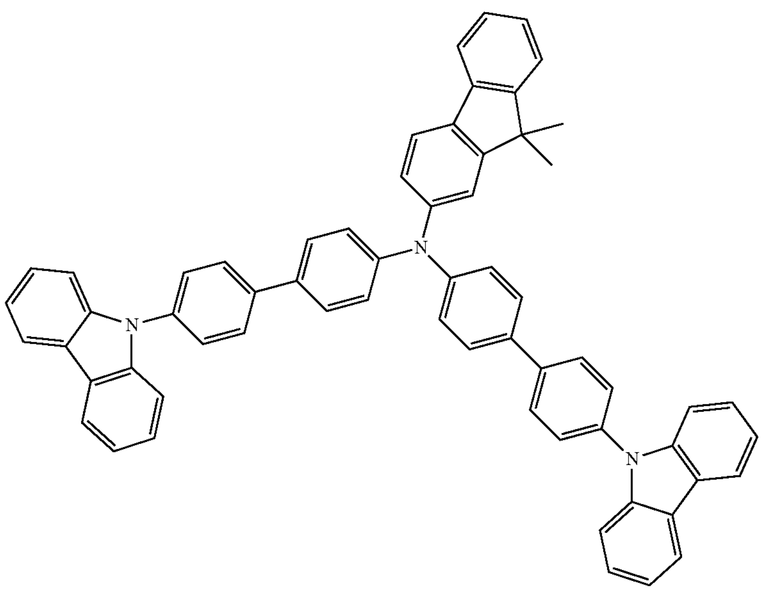

-continued
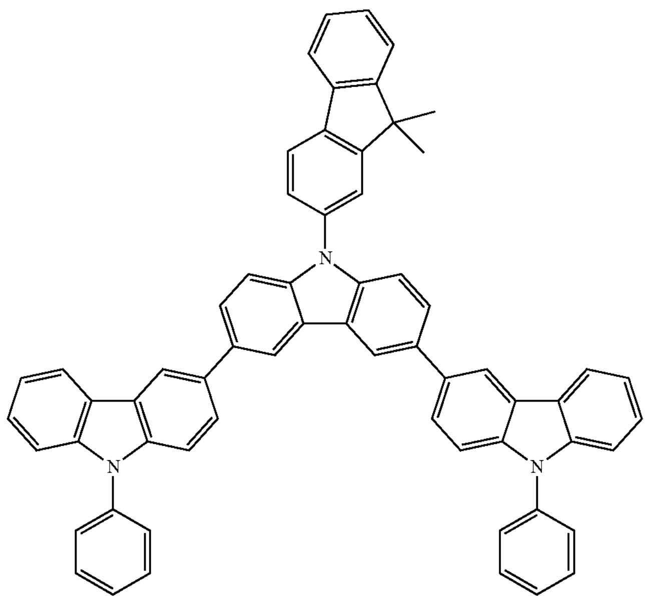
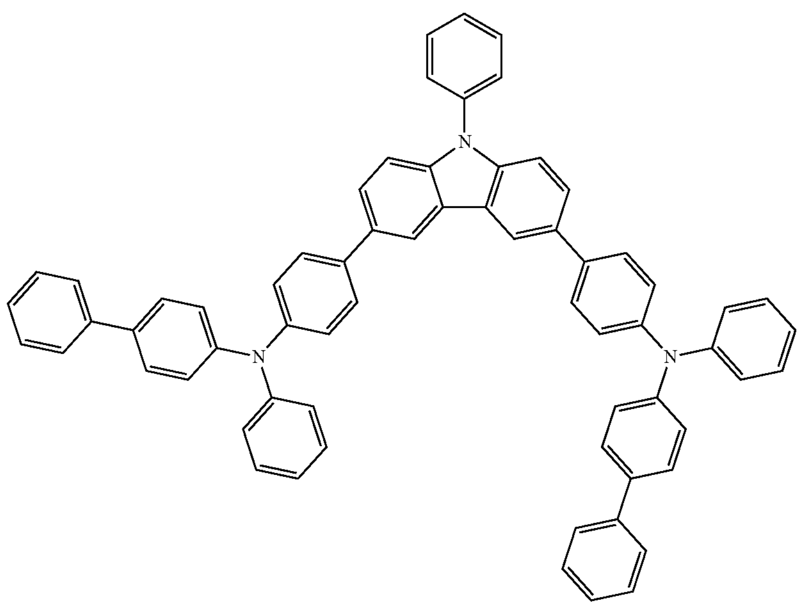
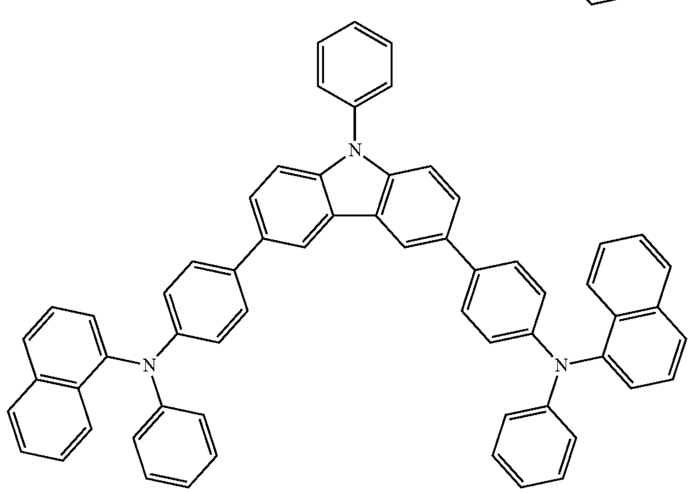

-continued
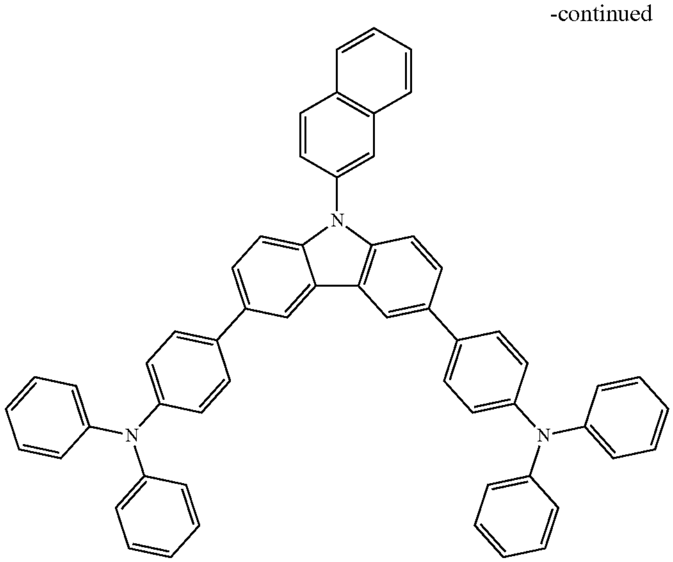
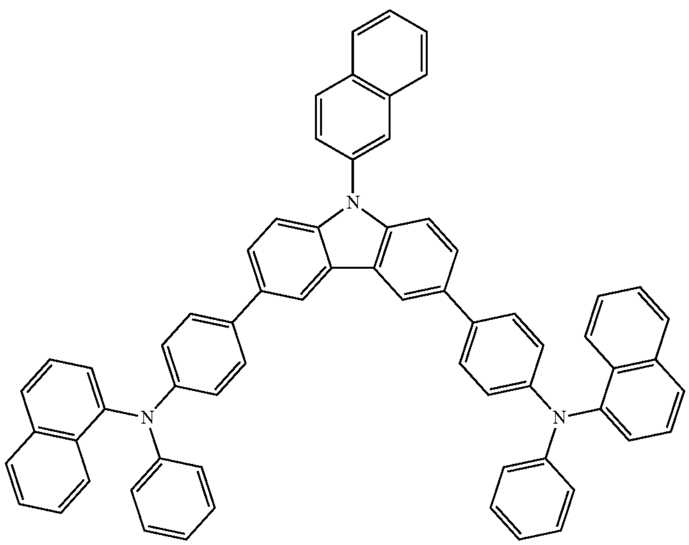
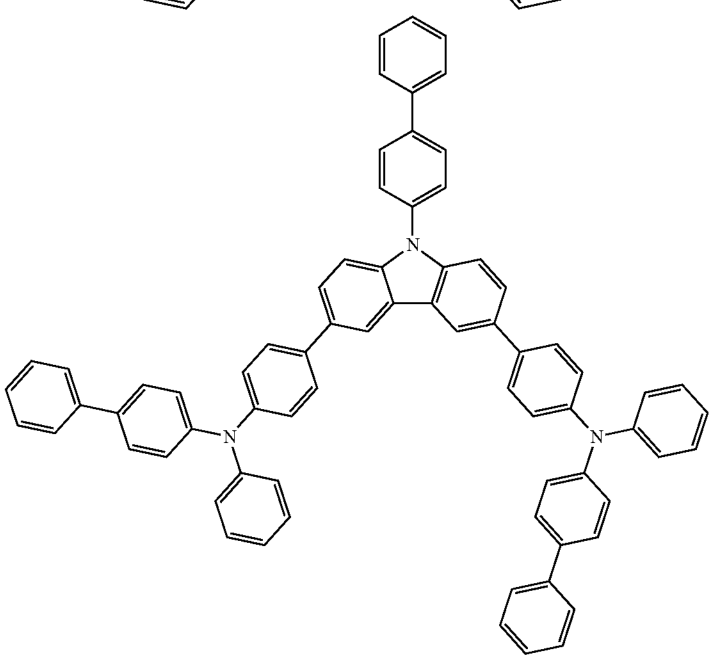

-continued
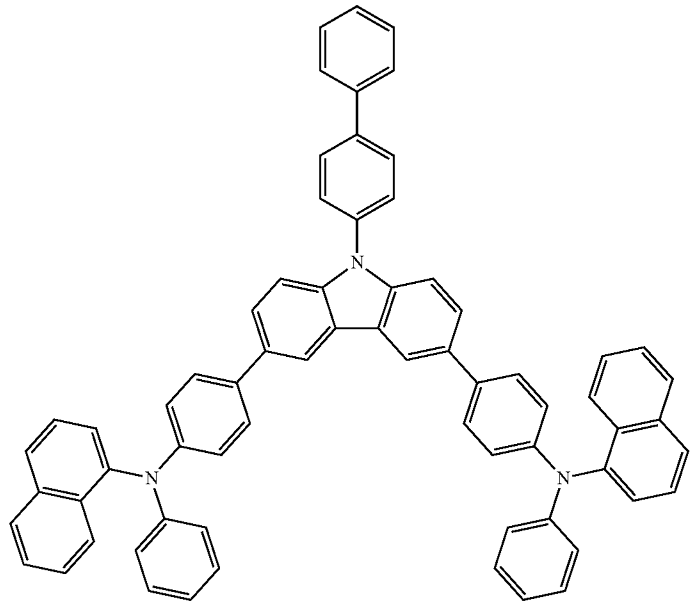
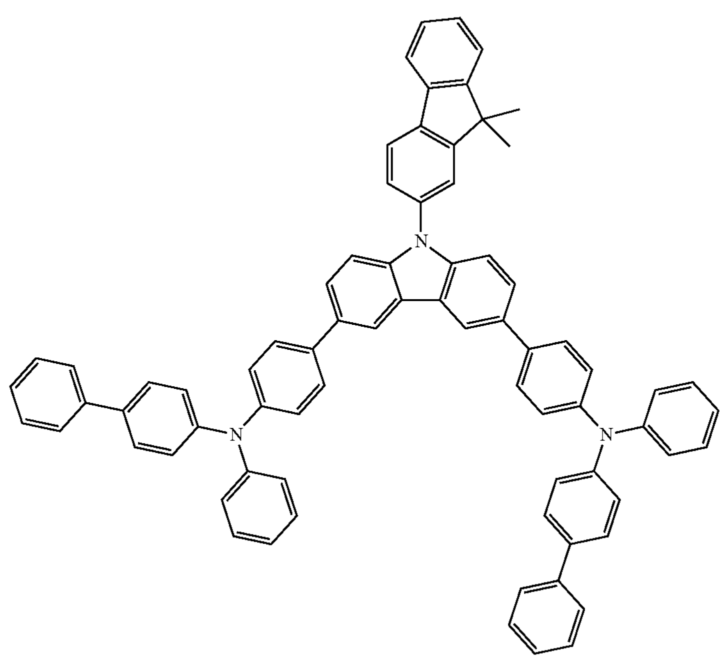

-continued
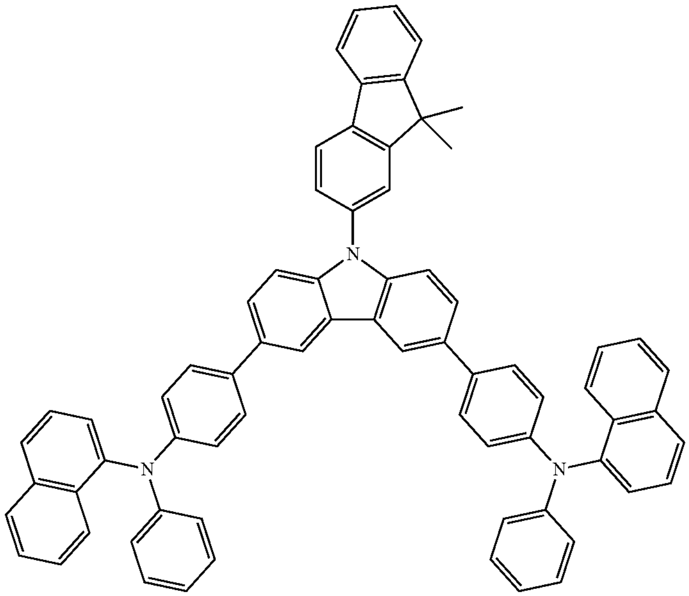
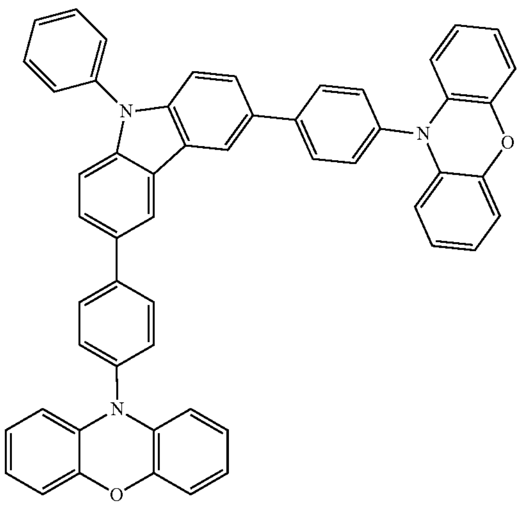
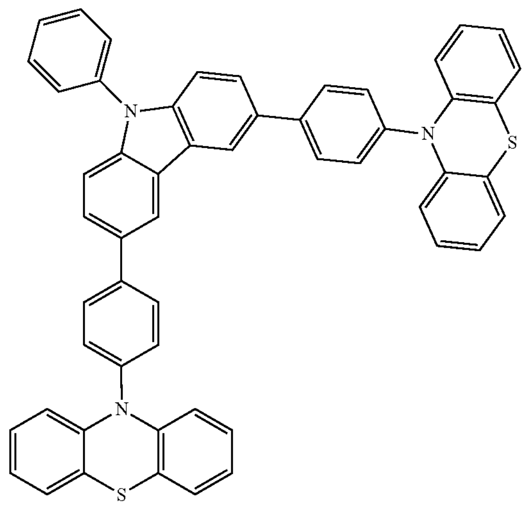
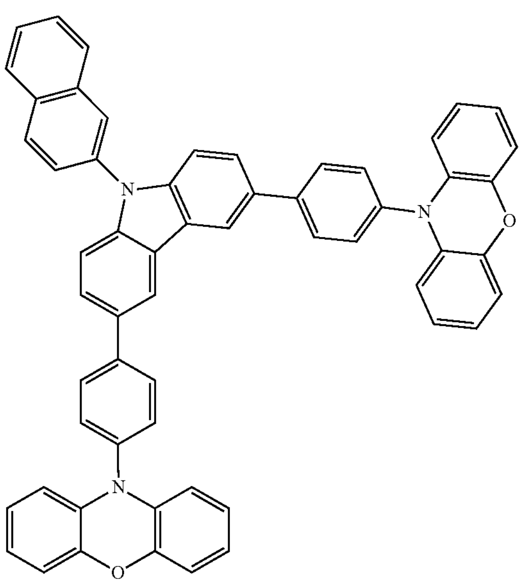
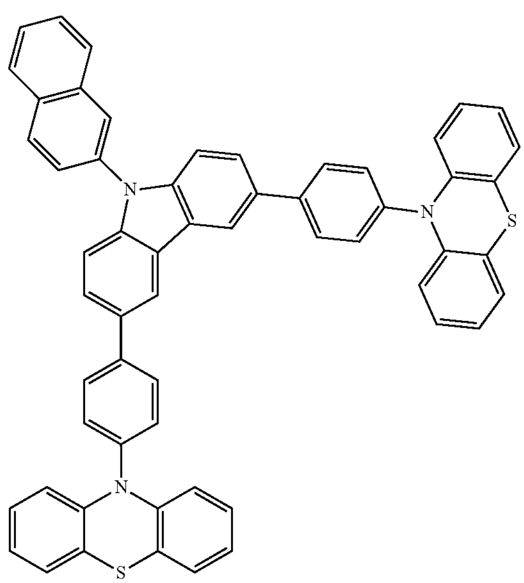

-continued
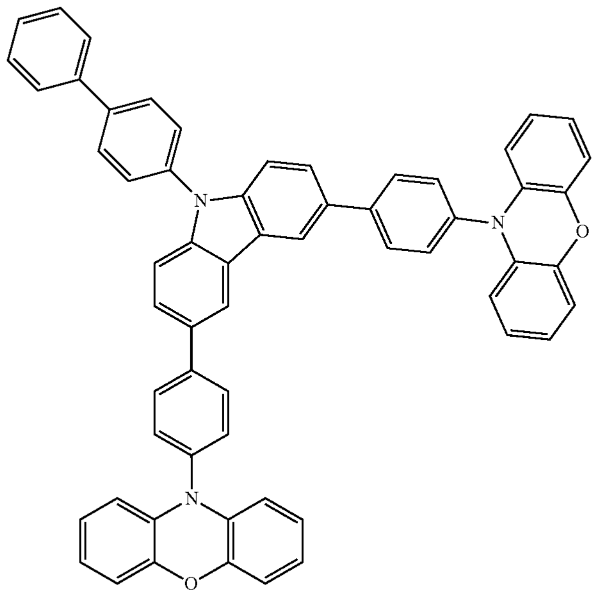
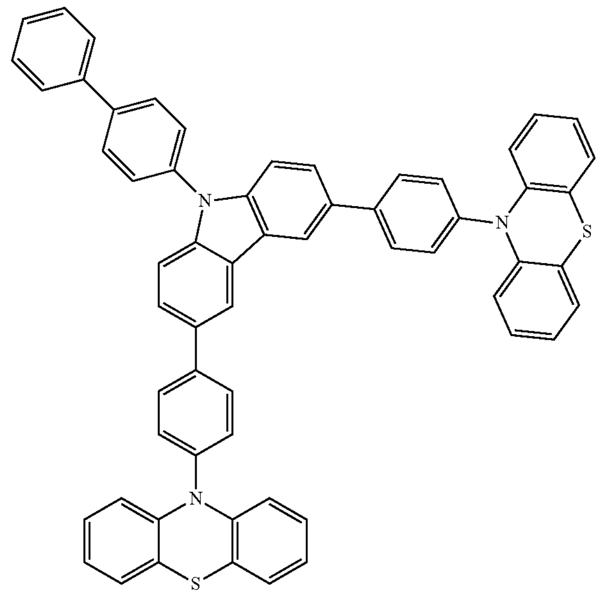
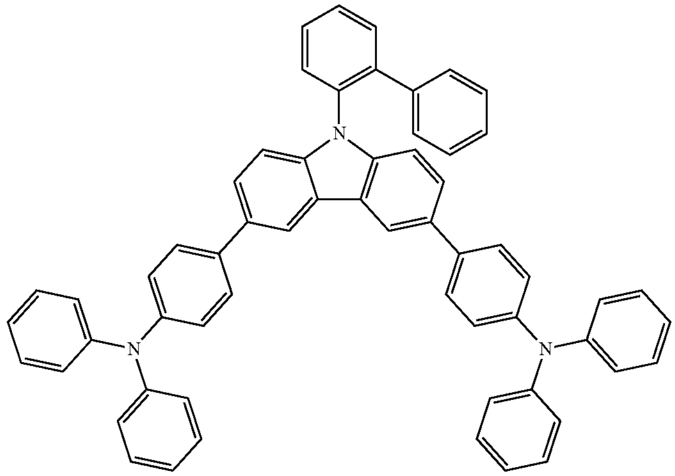
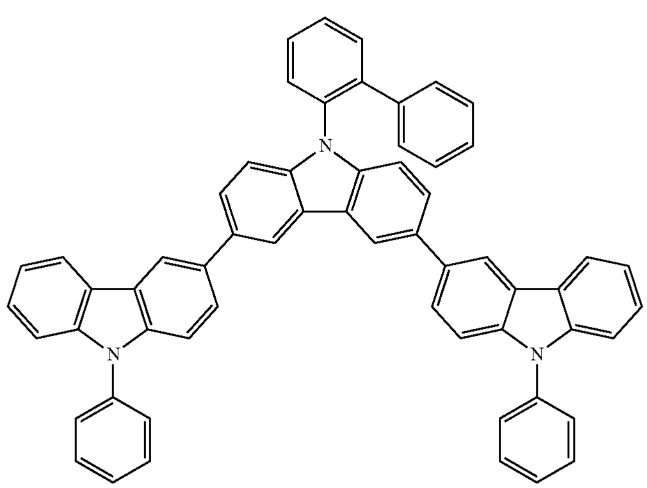

-continued
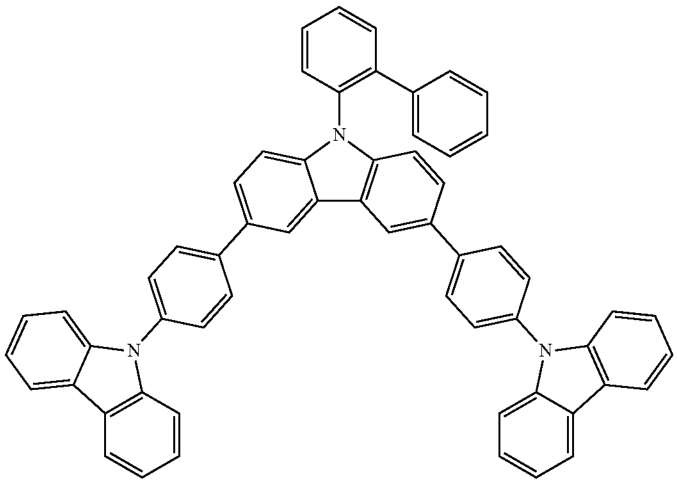
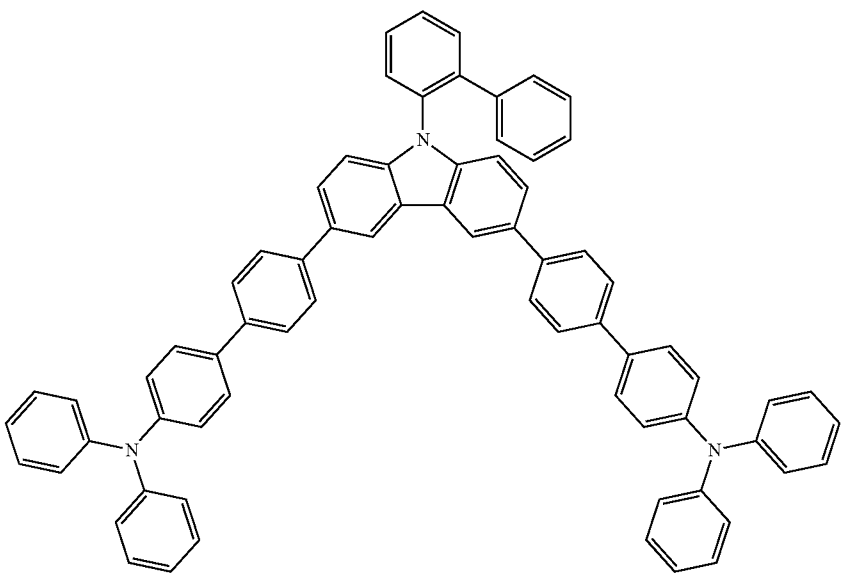
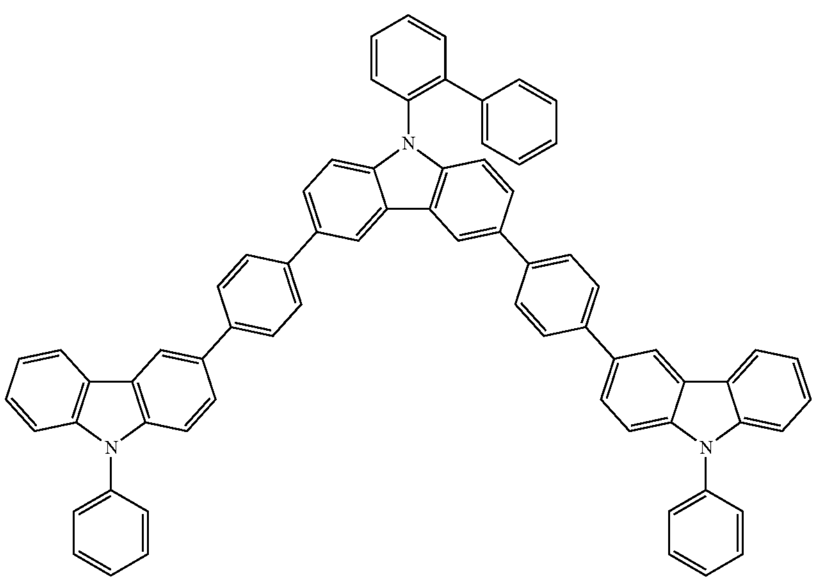

-continued
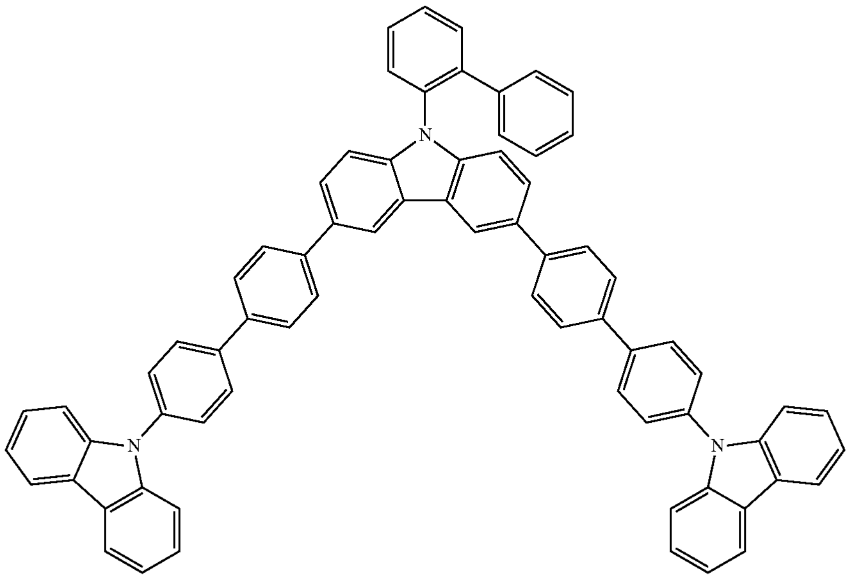
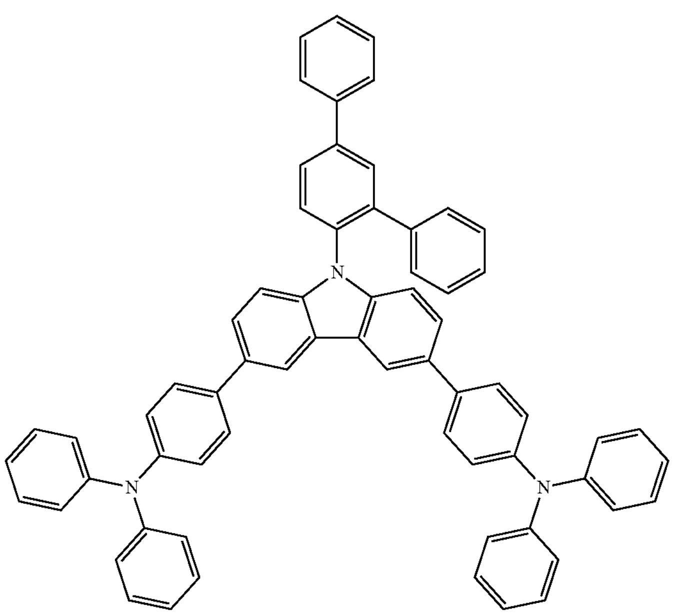

-continued
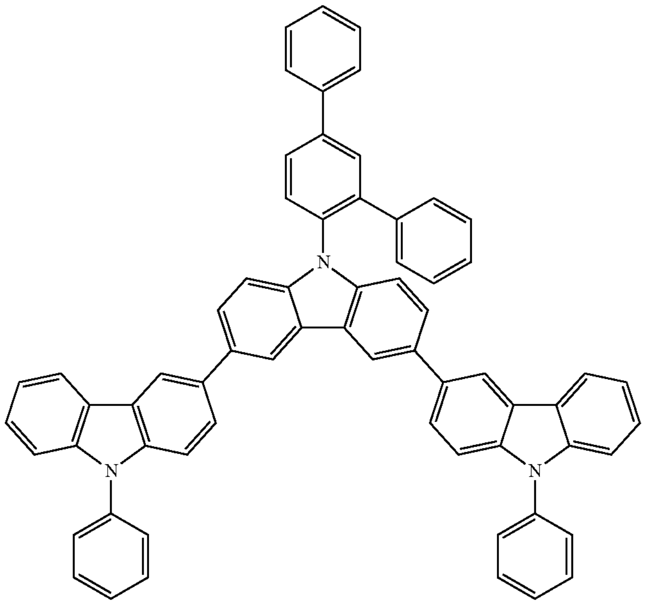
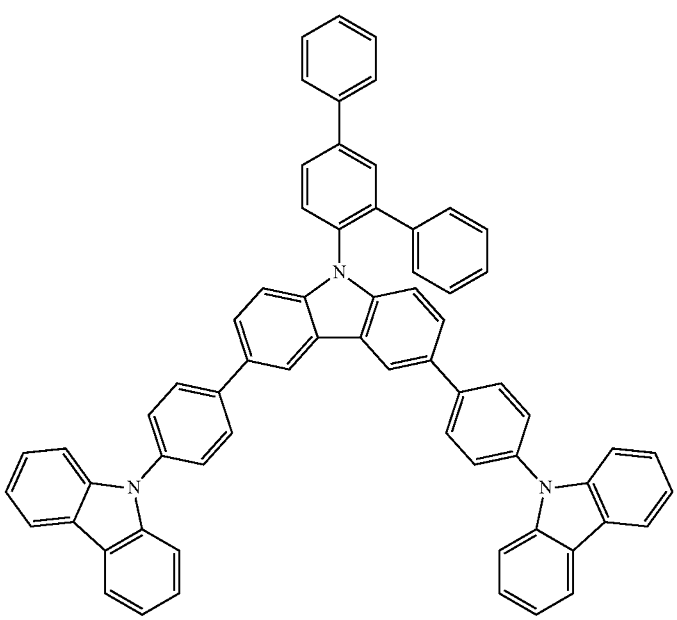

-continued
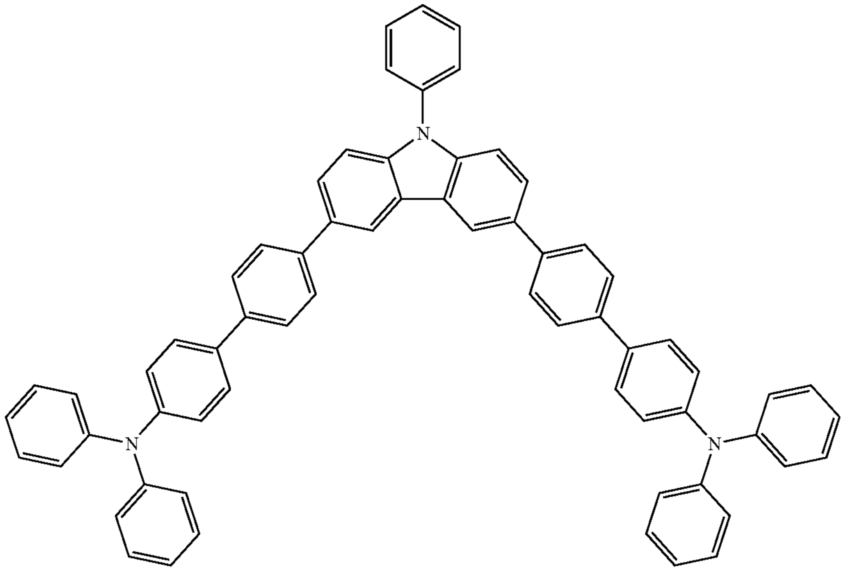
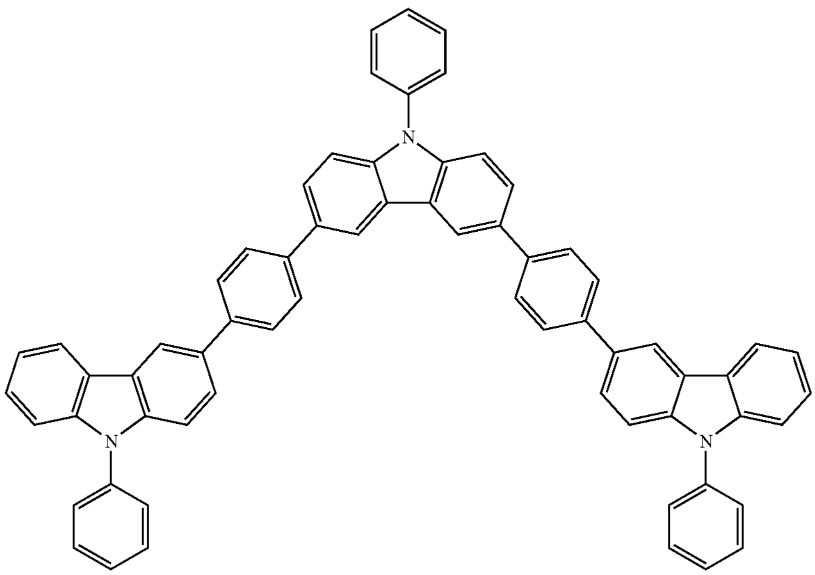
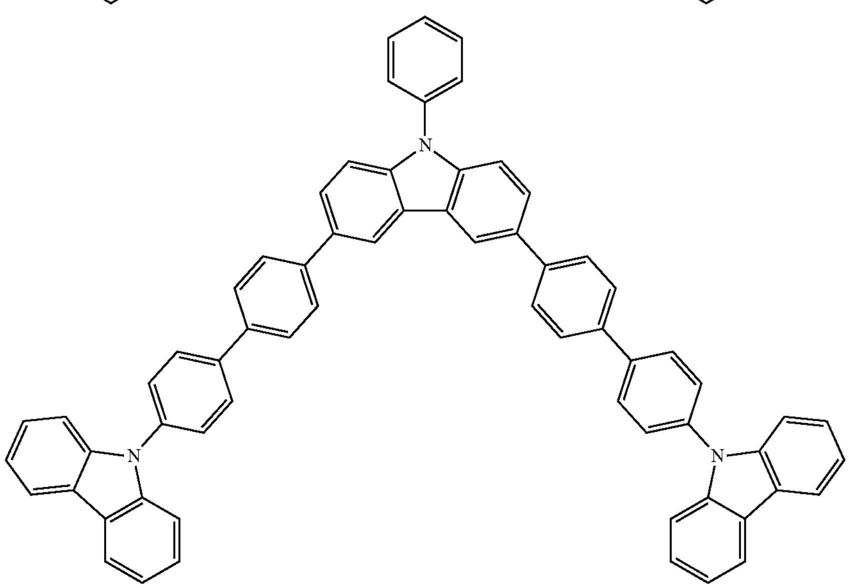

-continued
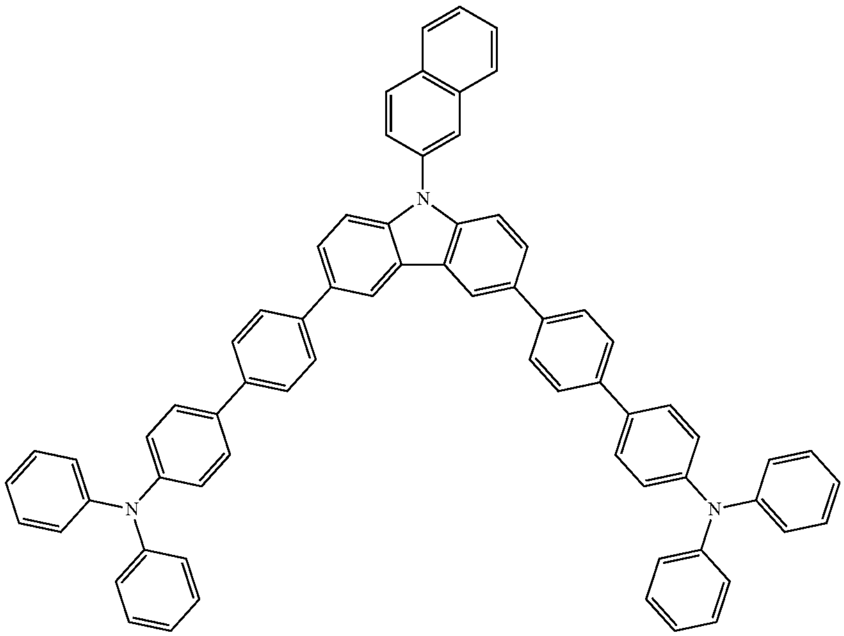
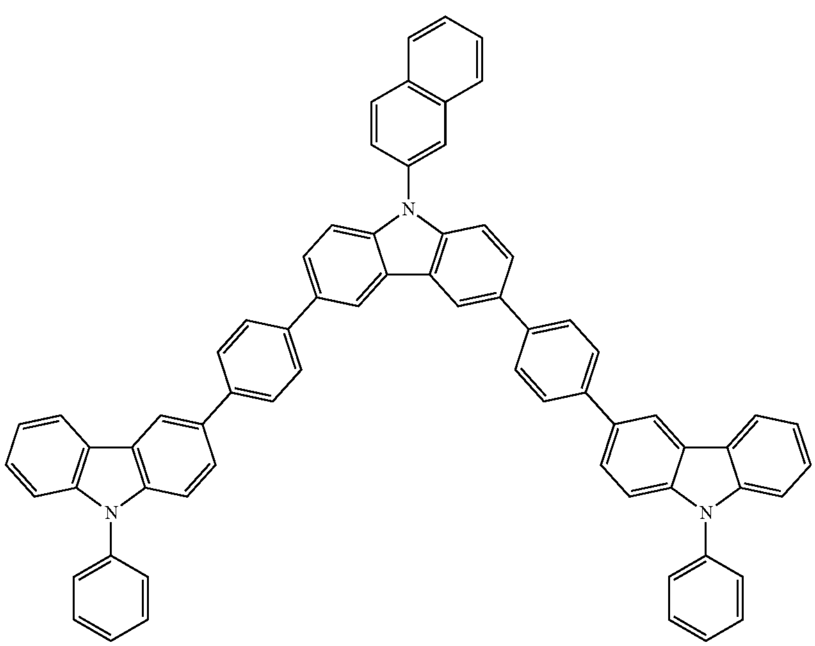

-continued
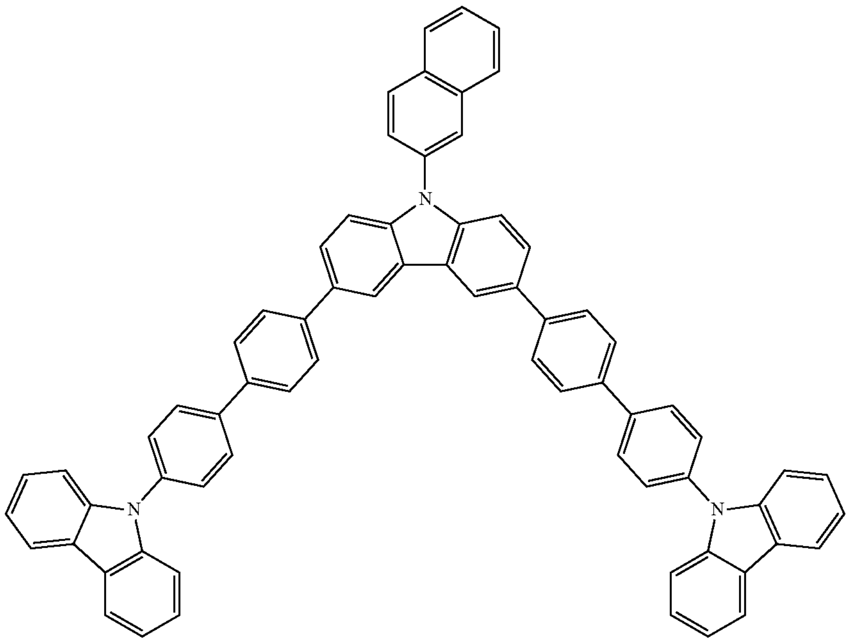
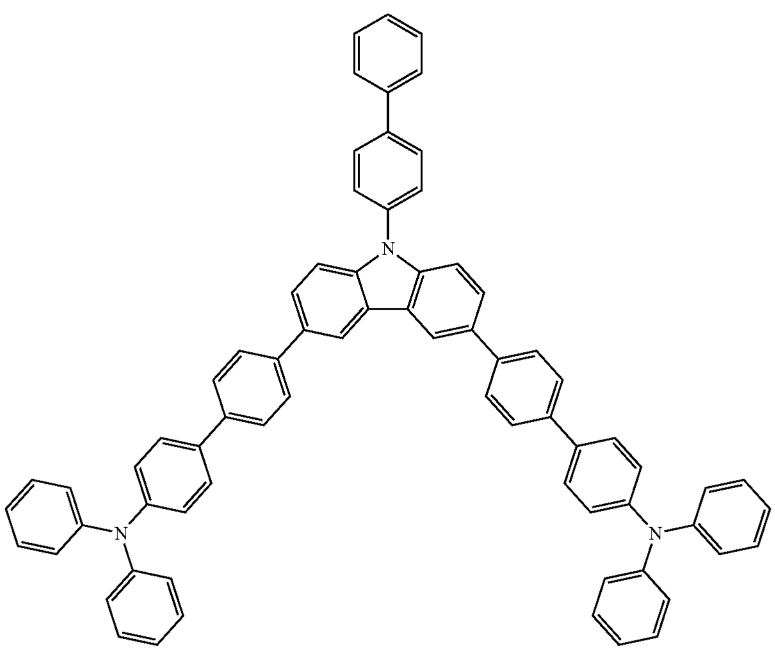

-continued
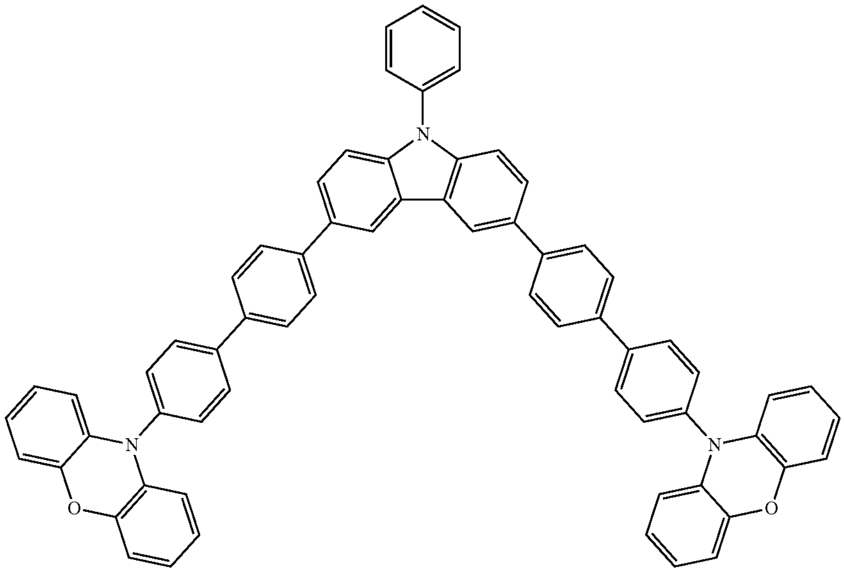
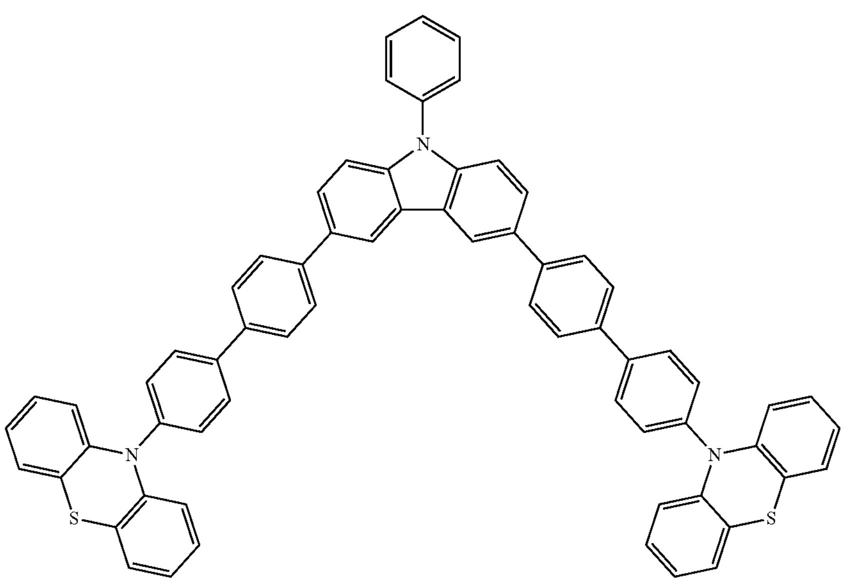

-continued
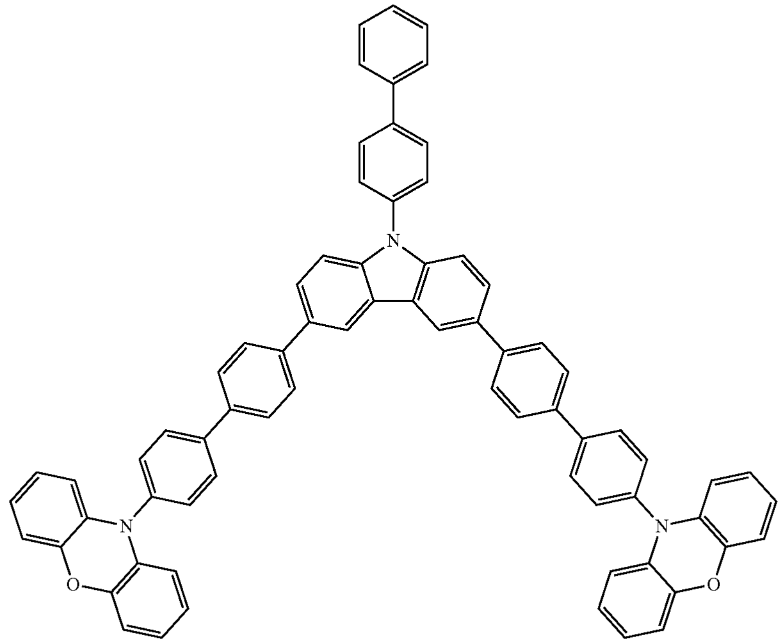
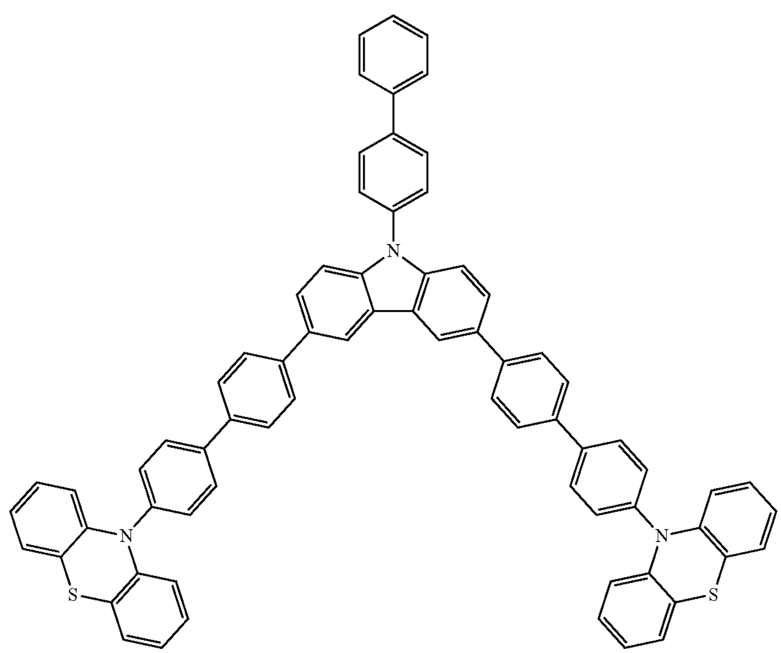

-continued
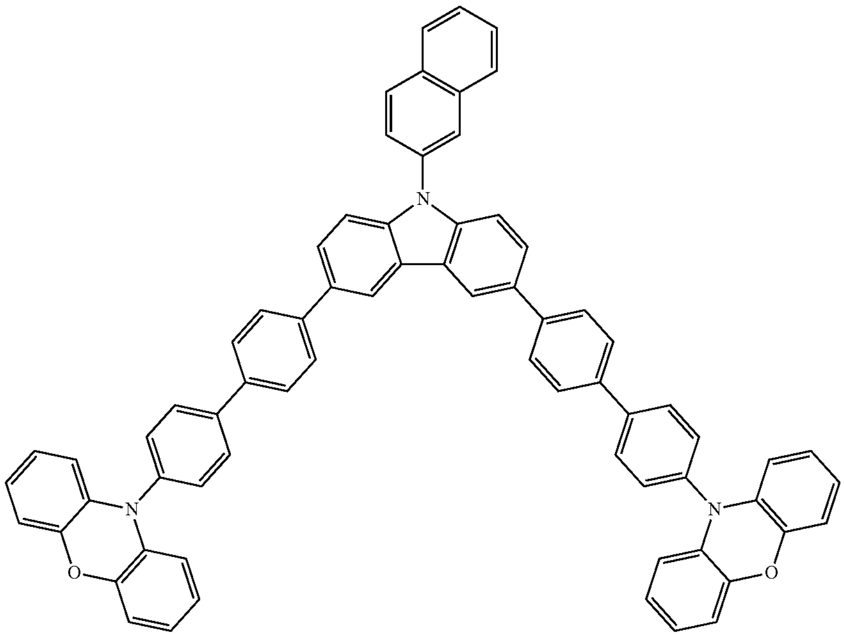
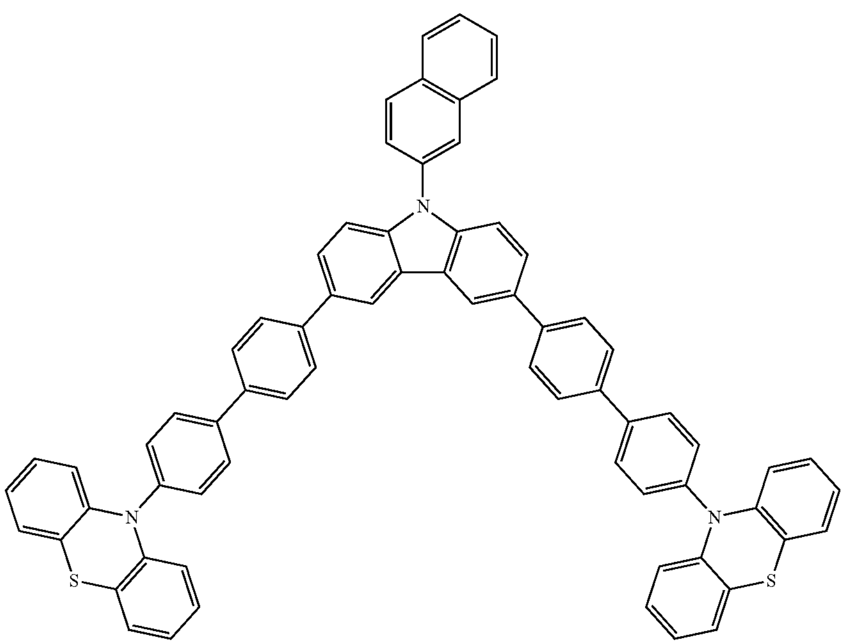

-continued
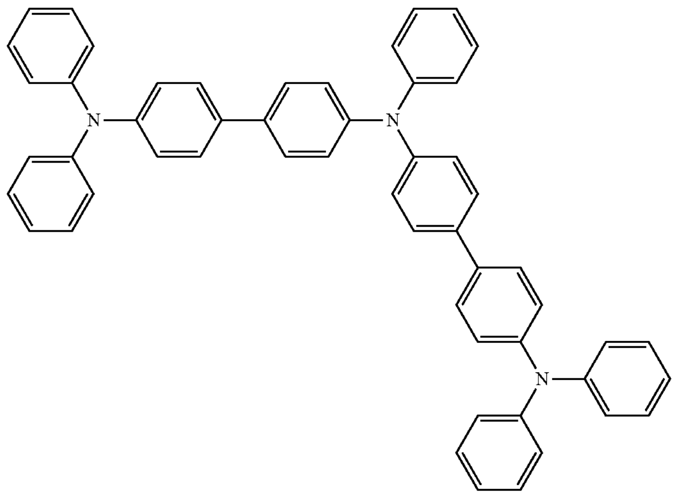
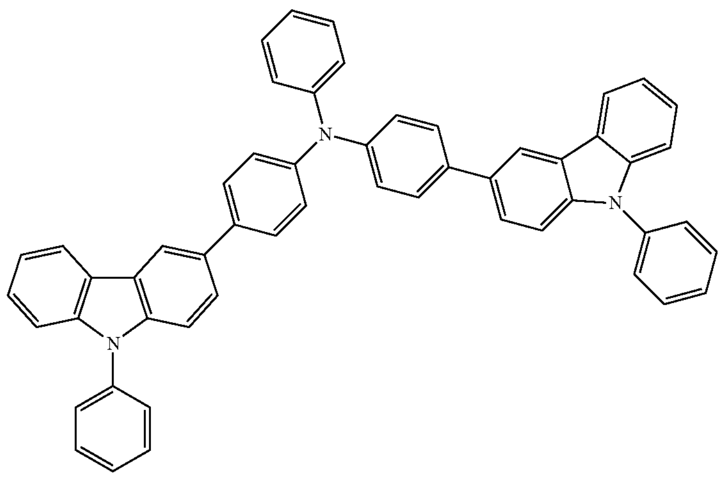
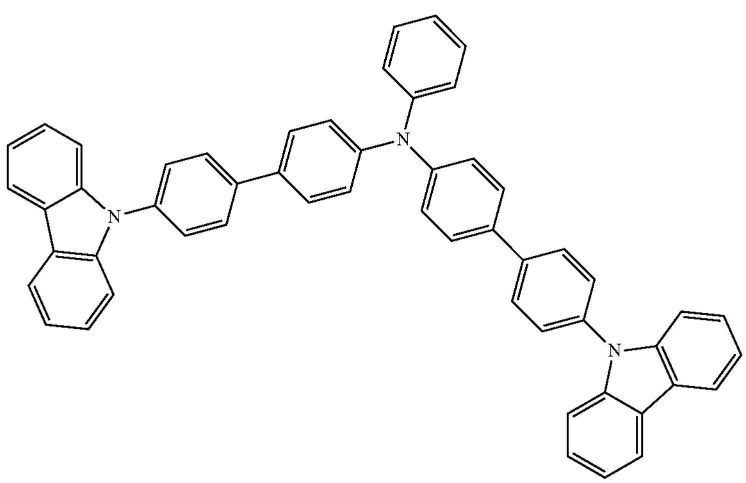

-continued
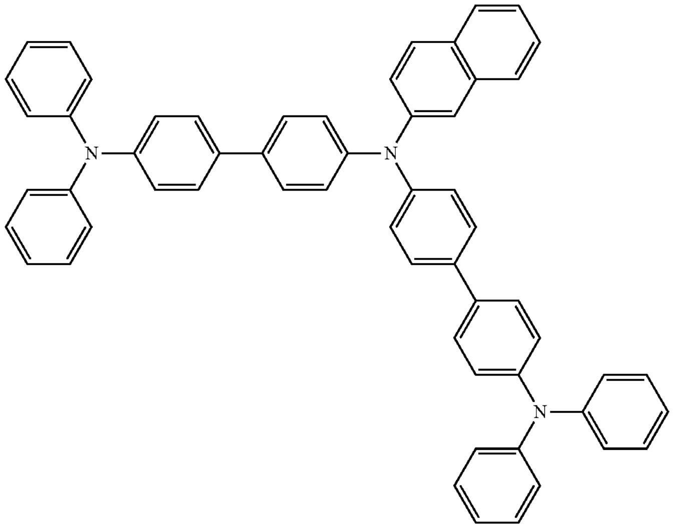
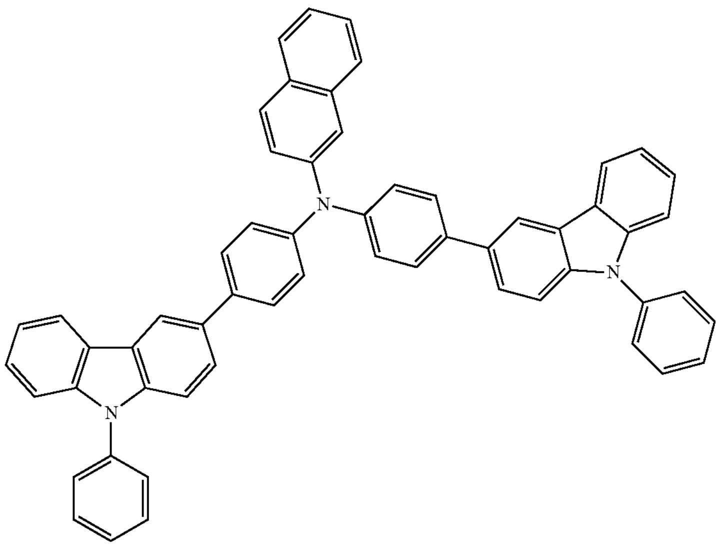
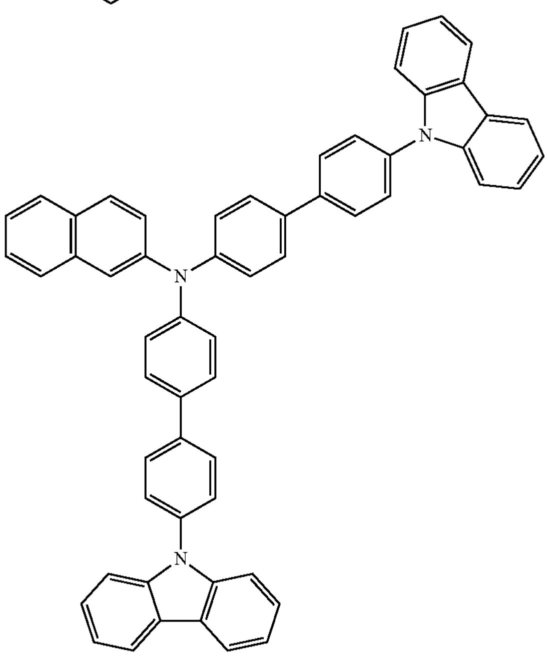

-continued
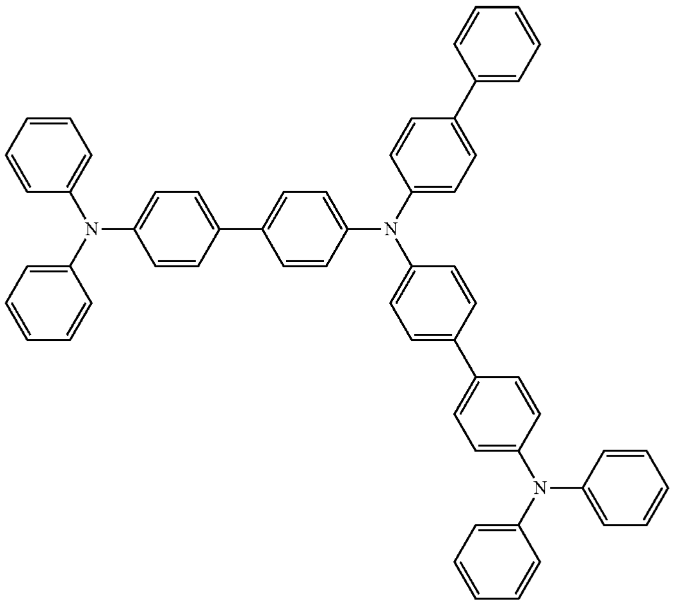
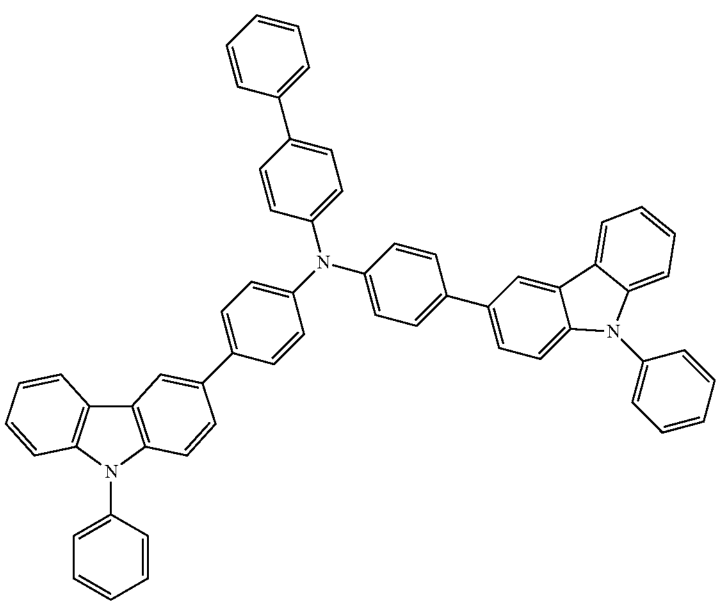

-continued
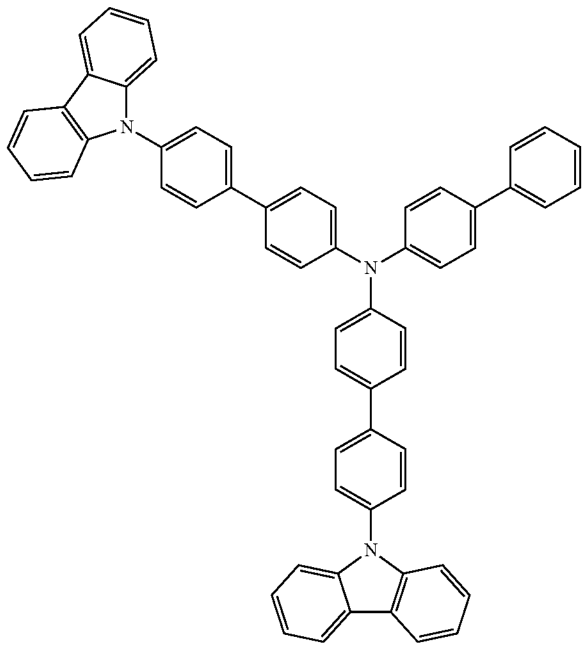
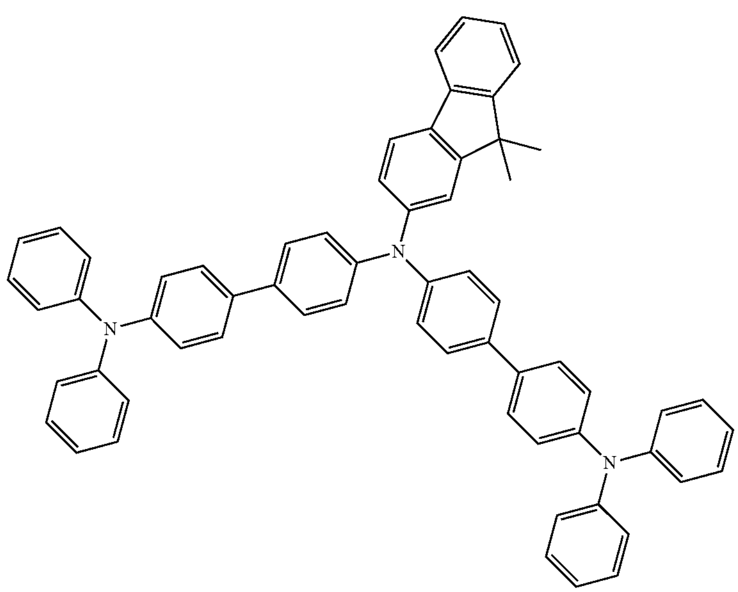

-continued
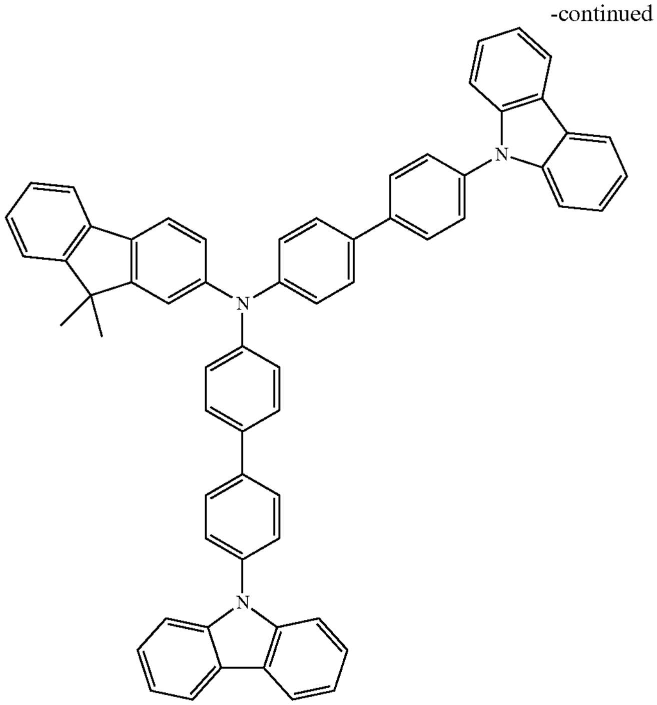
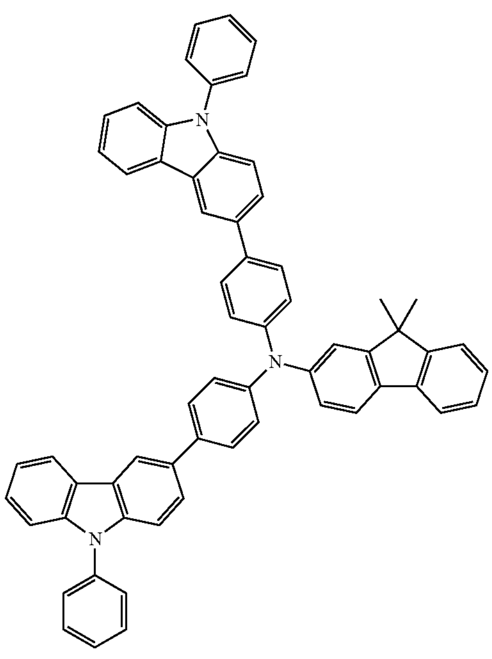

-continued
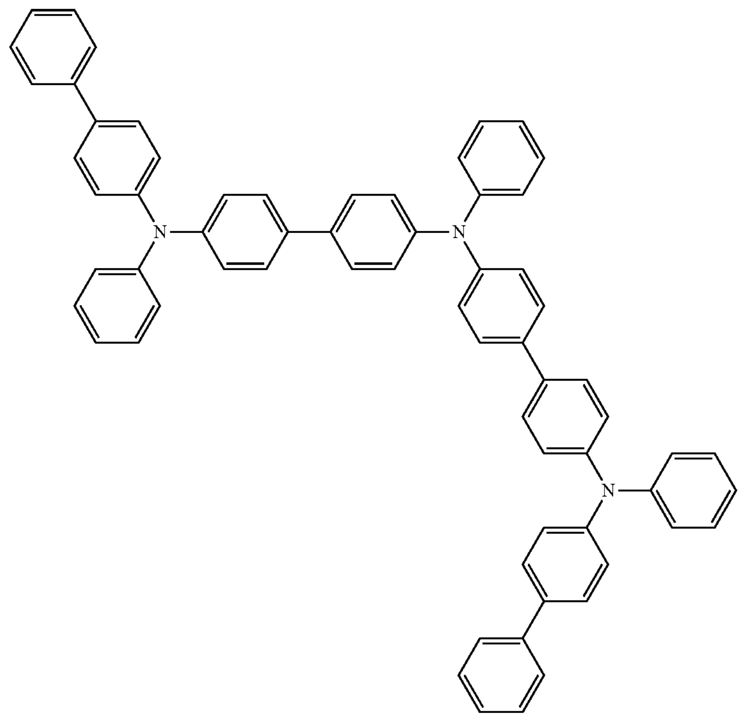
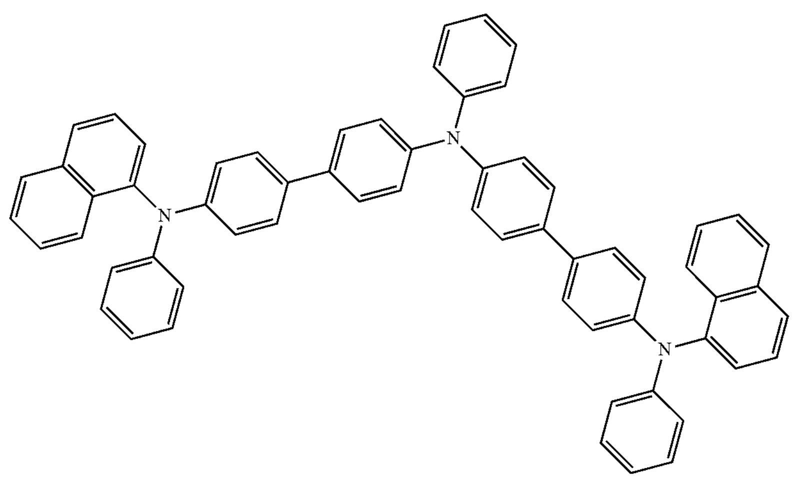
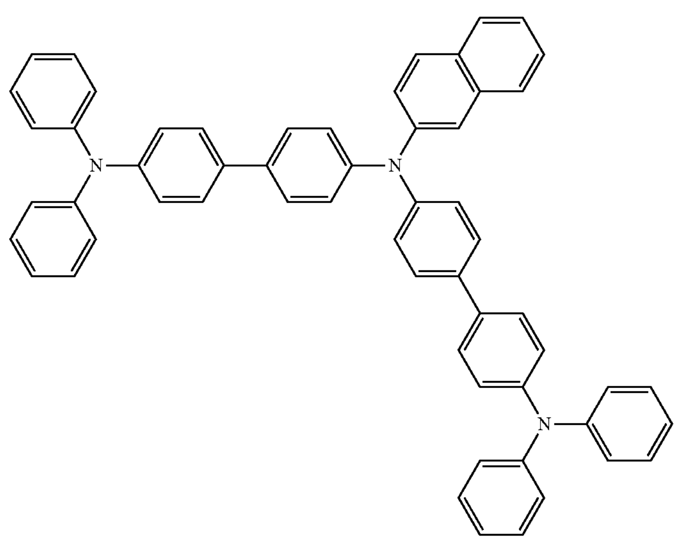

-continued
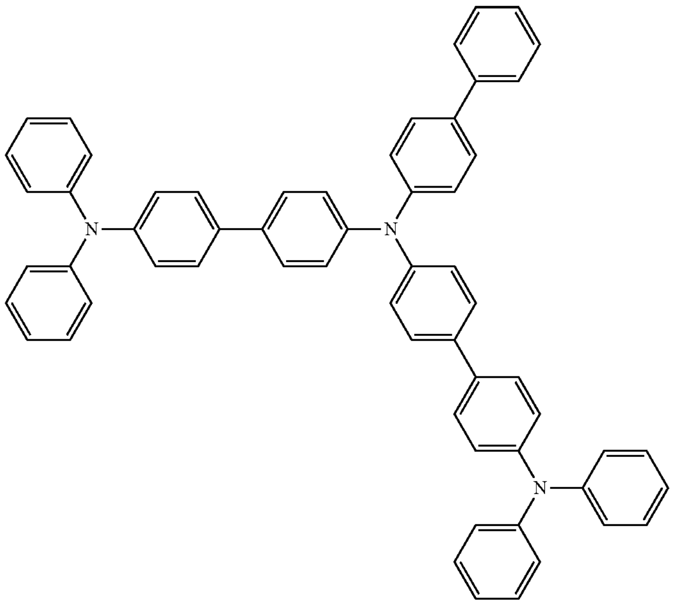
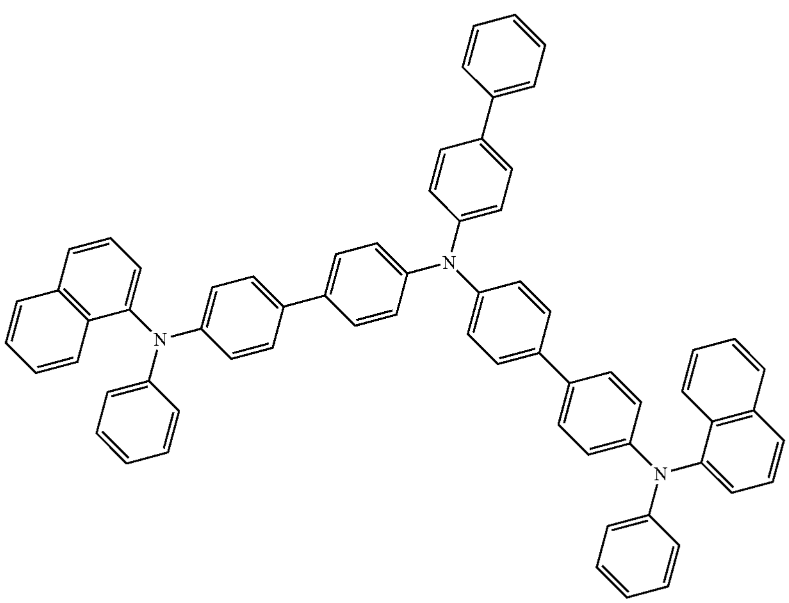

-continued
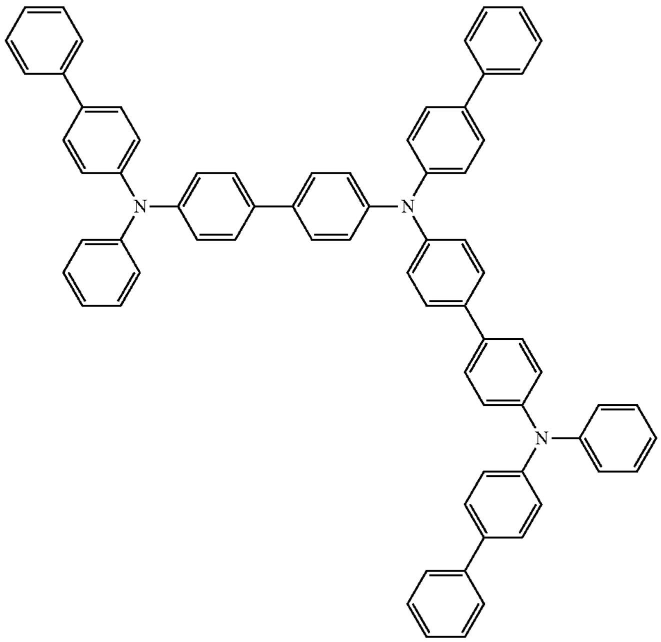
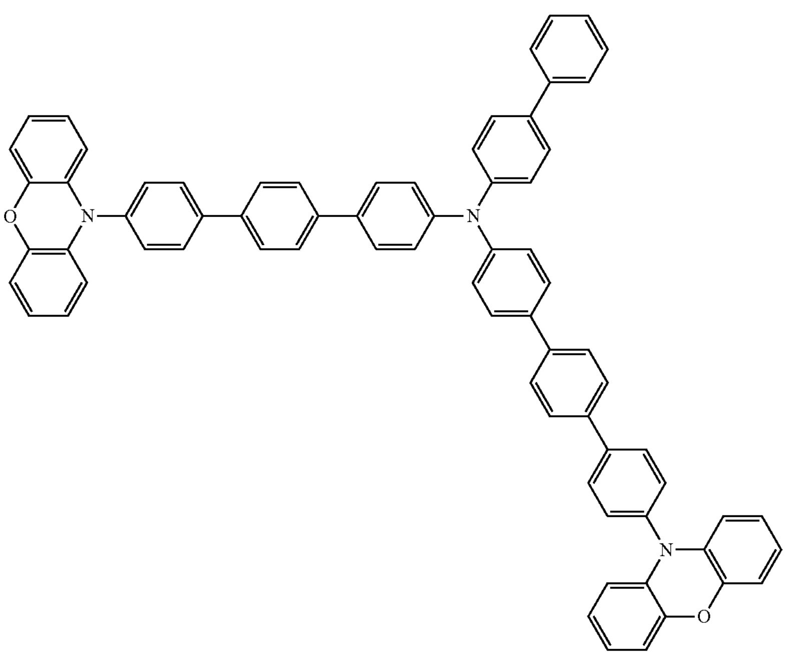

-continued
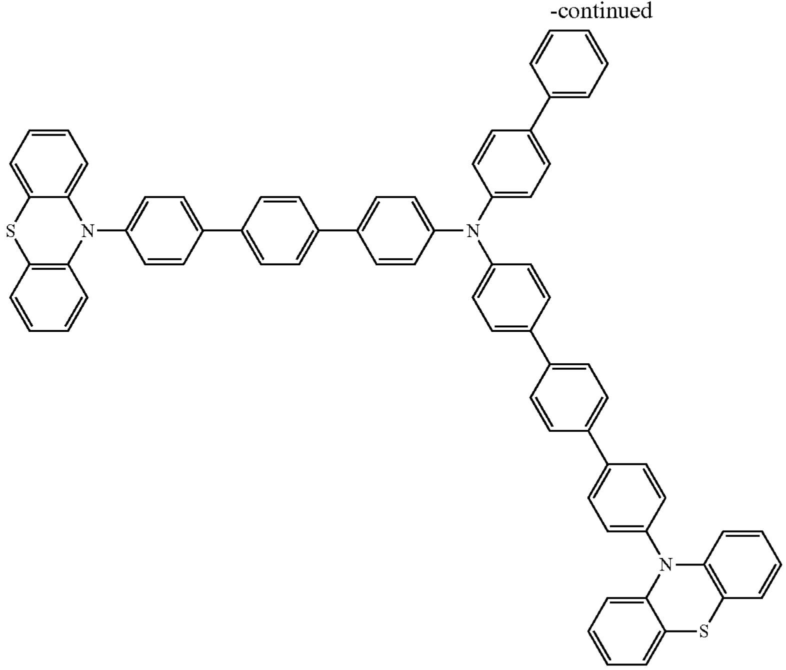
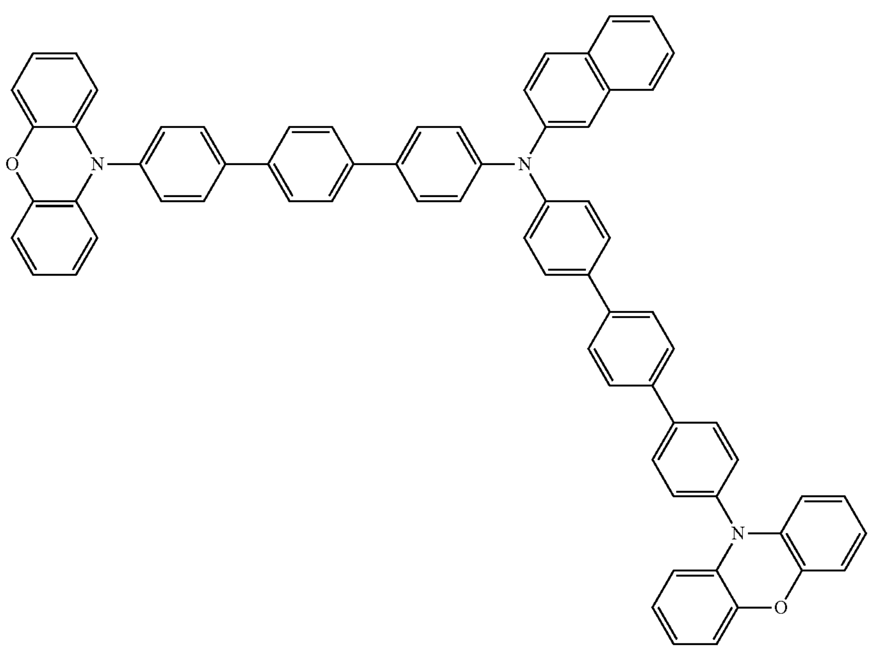

-continued
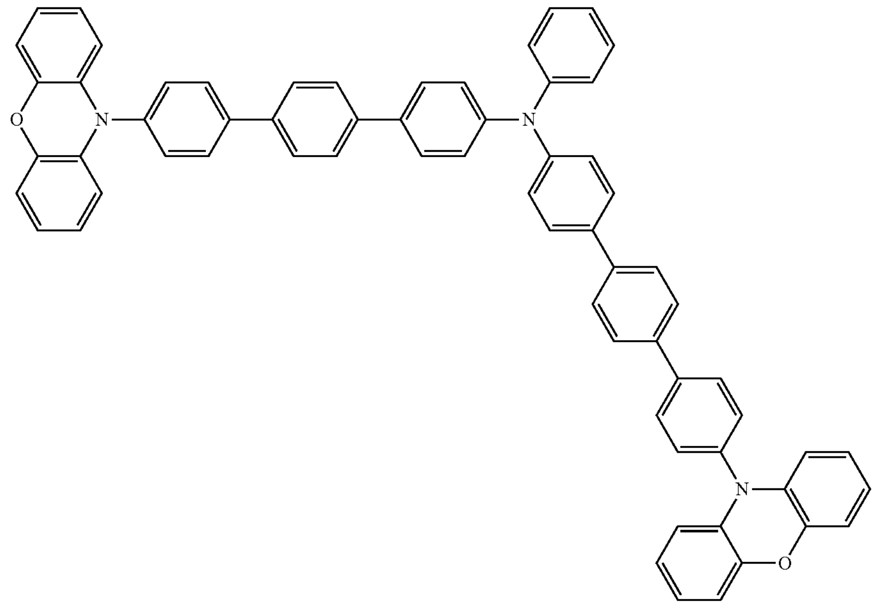
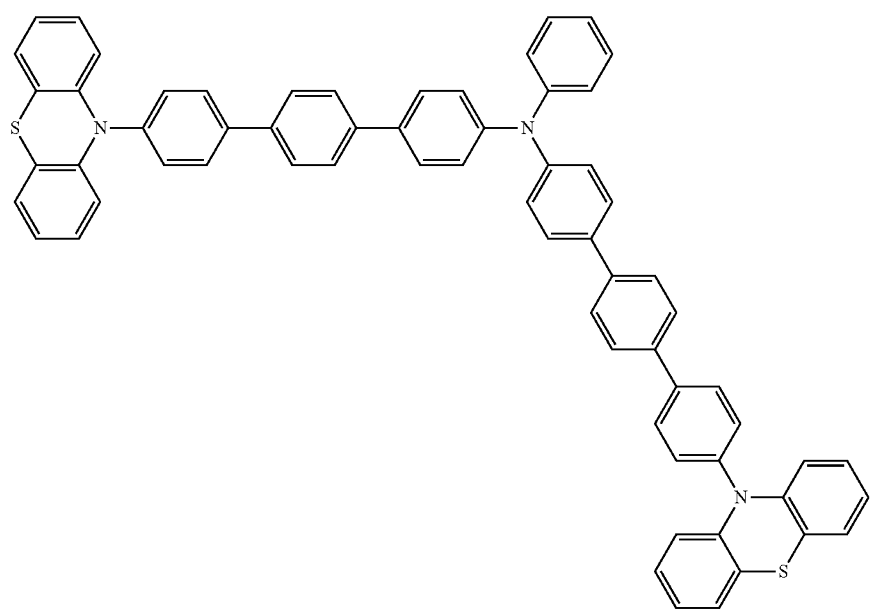

-continued
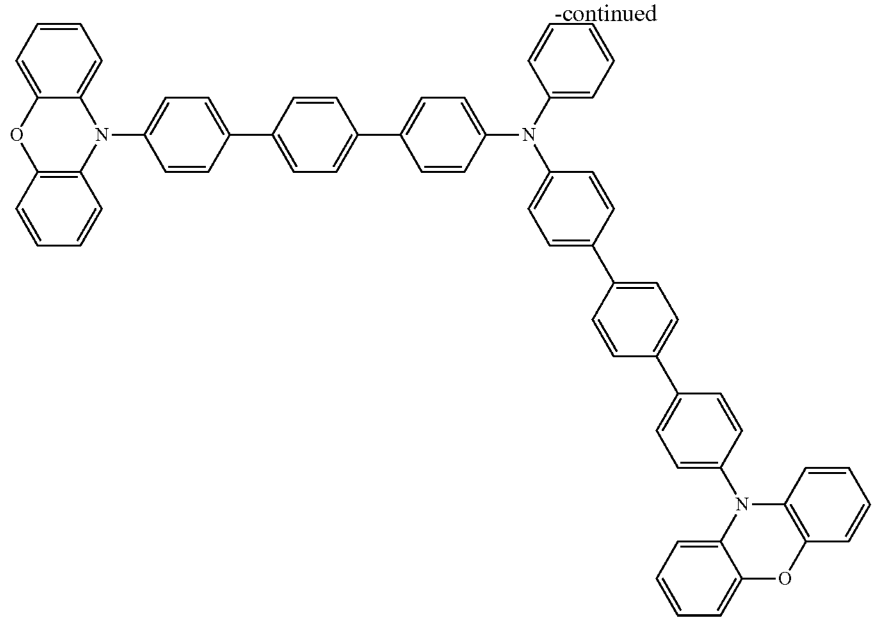
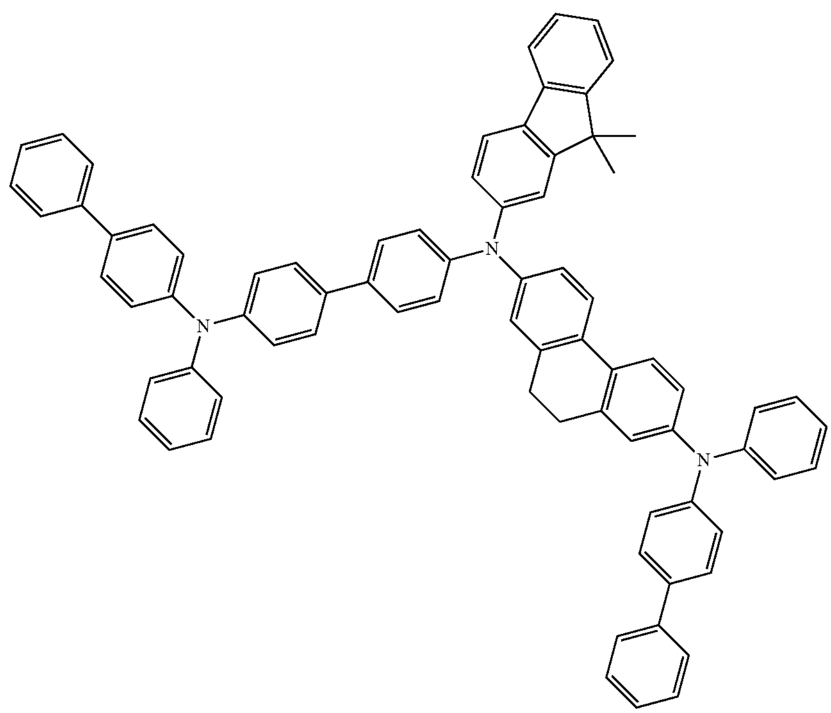

-continued
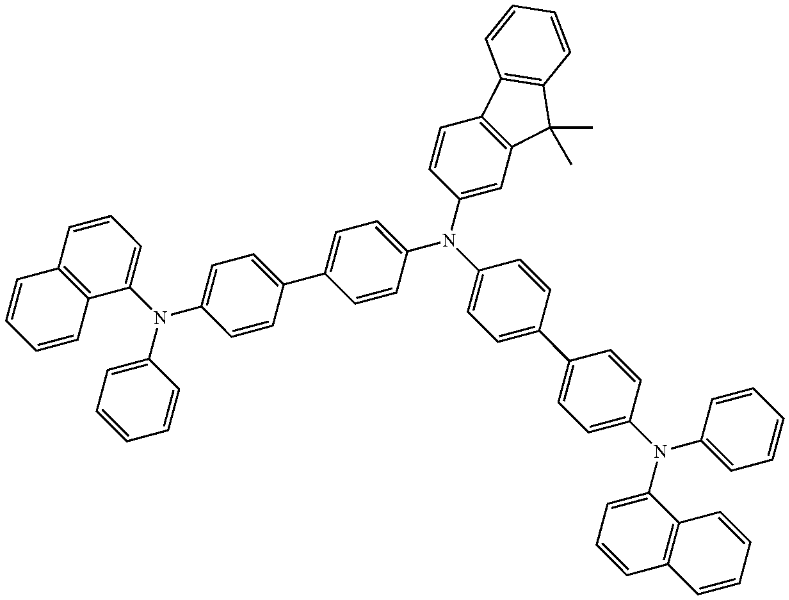
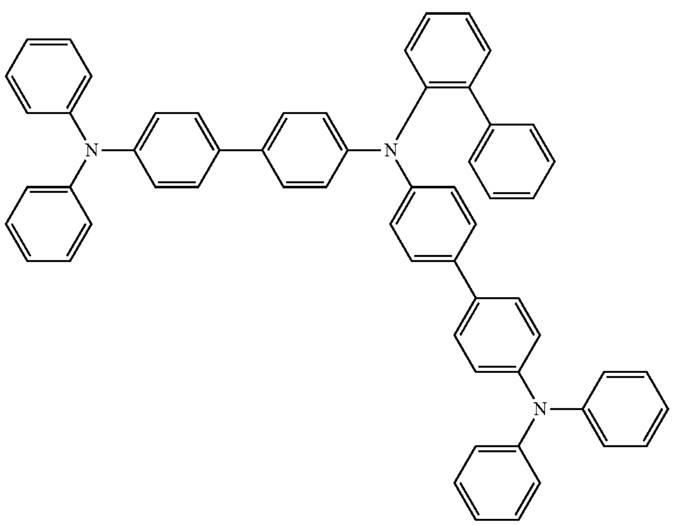
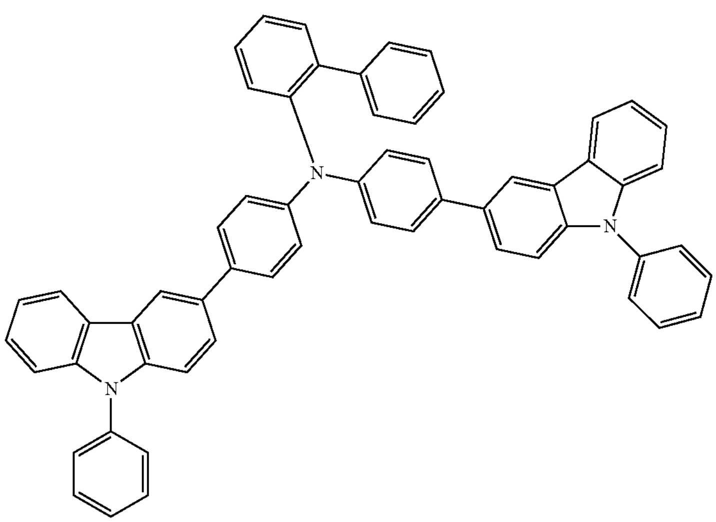

-continued
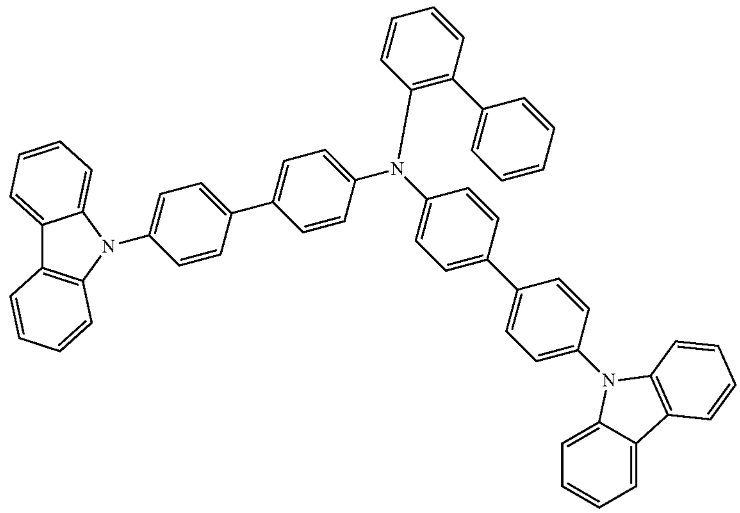
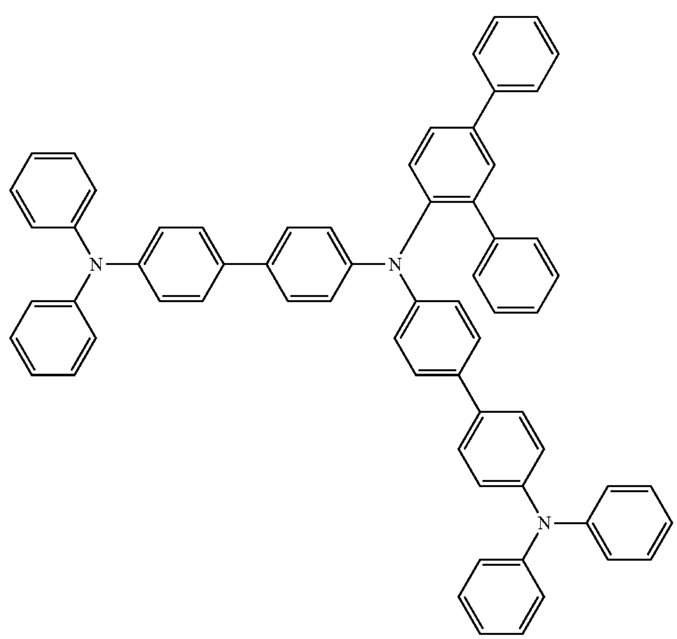

-continued
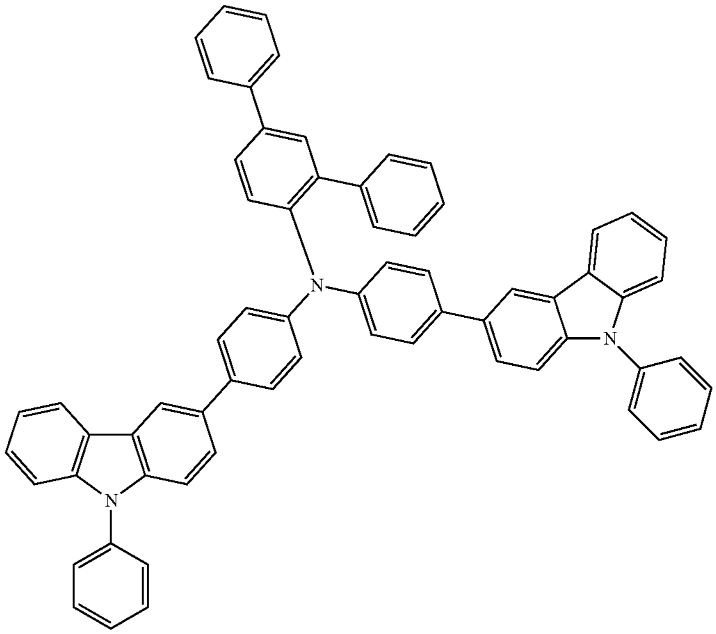
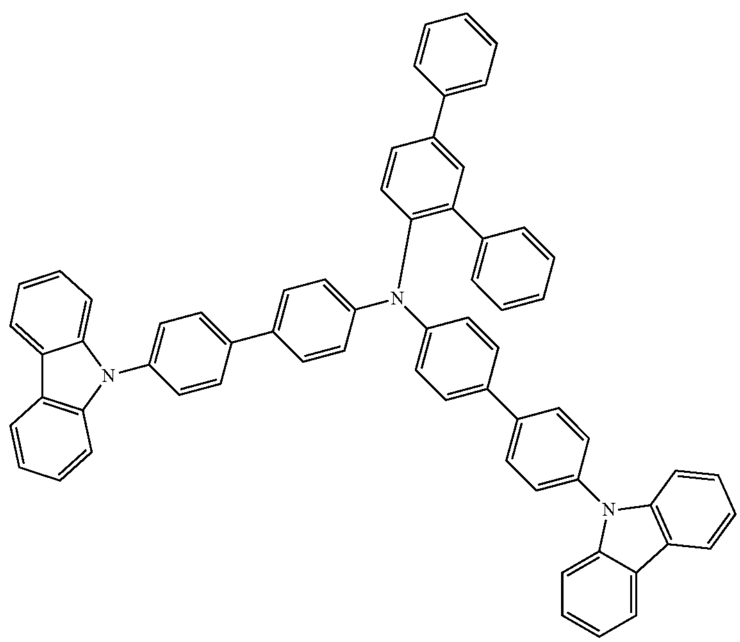

-continued
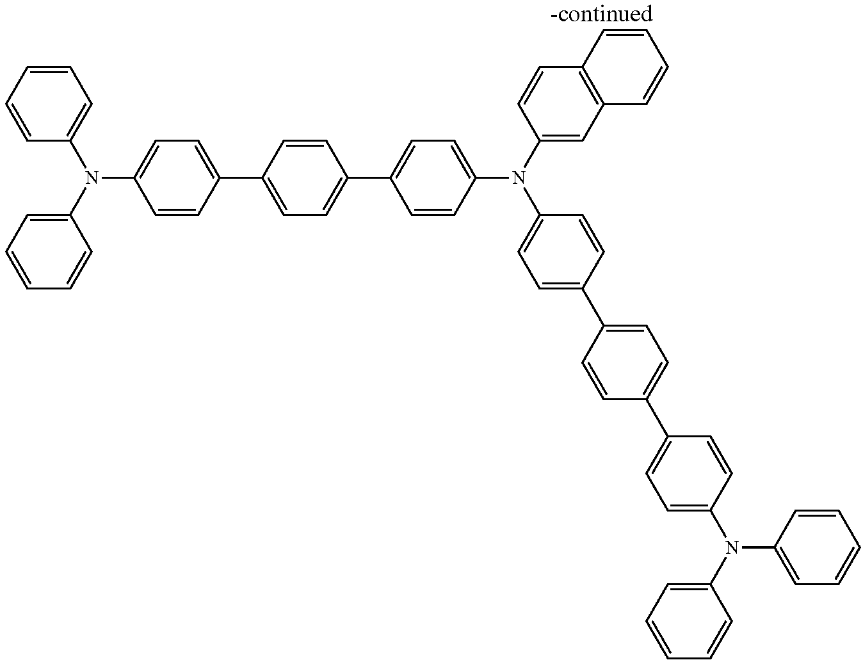
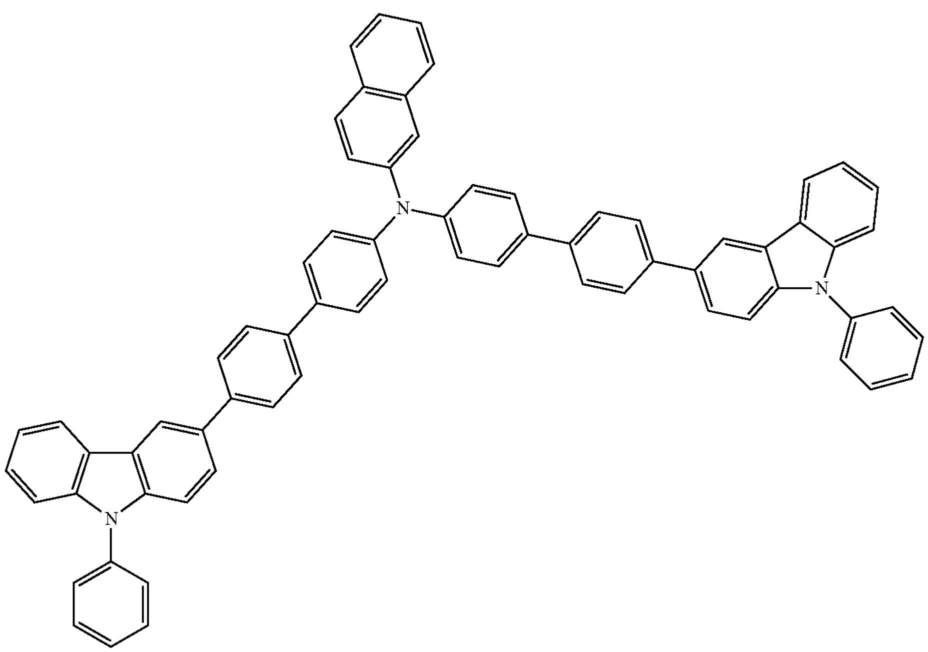

-continued
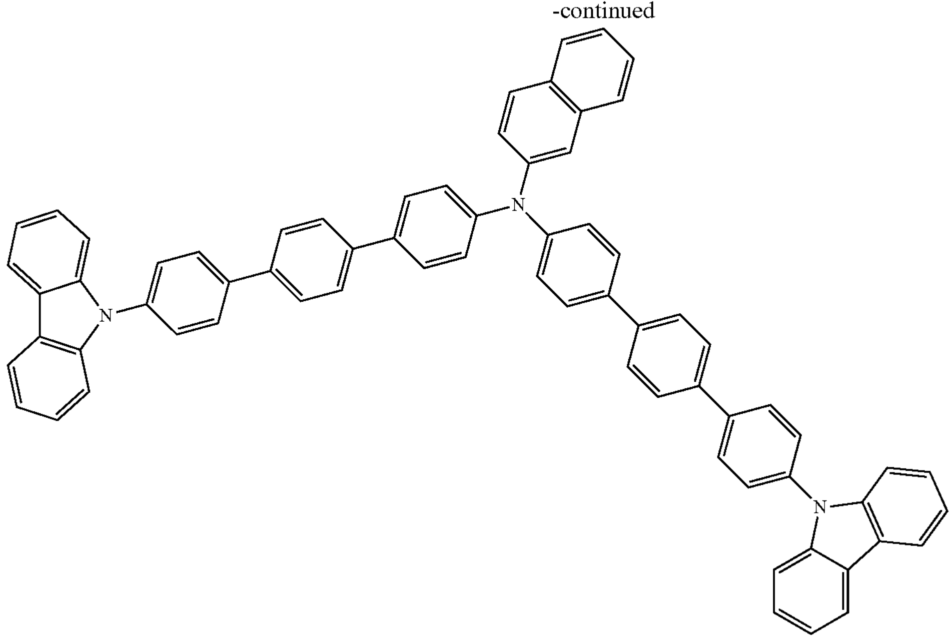
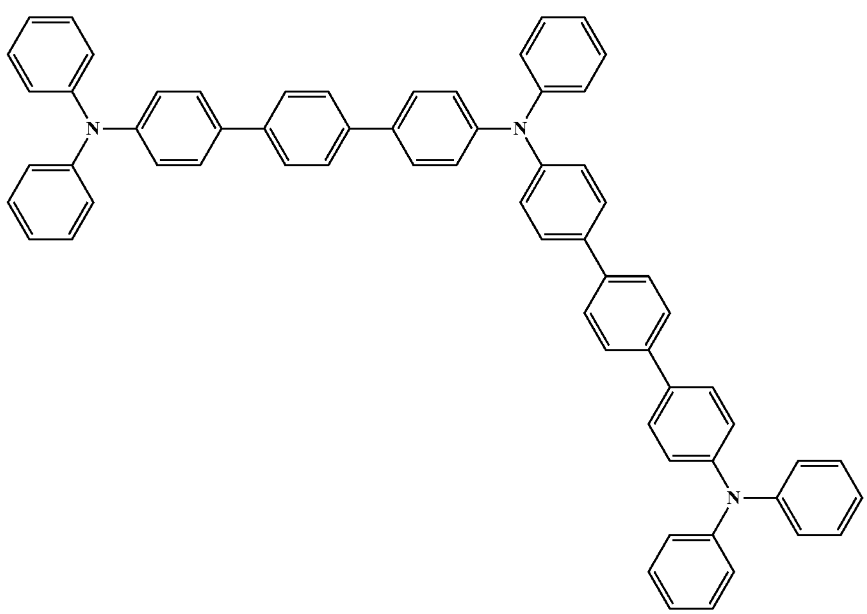

-continued
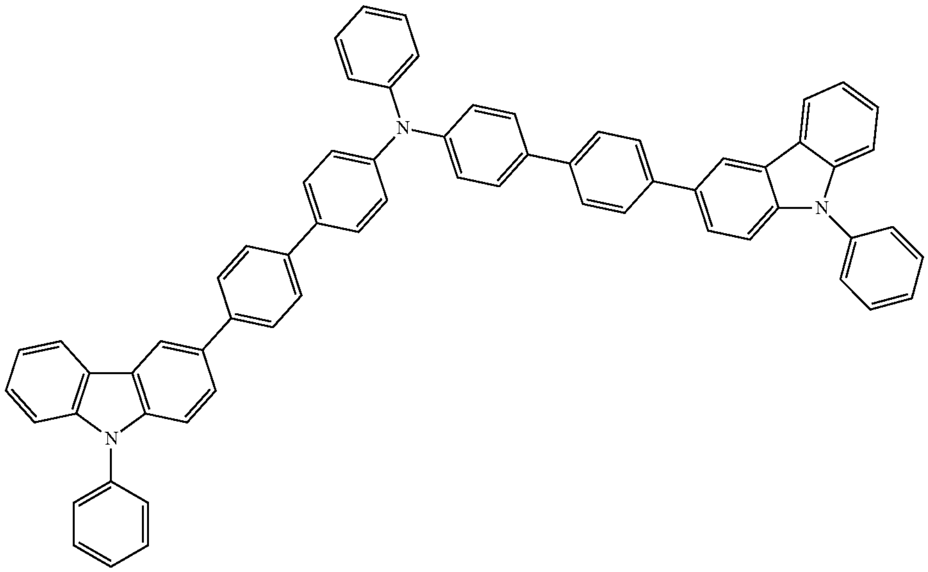
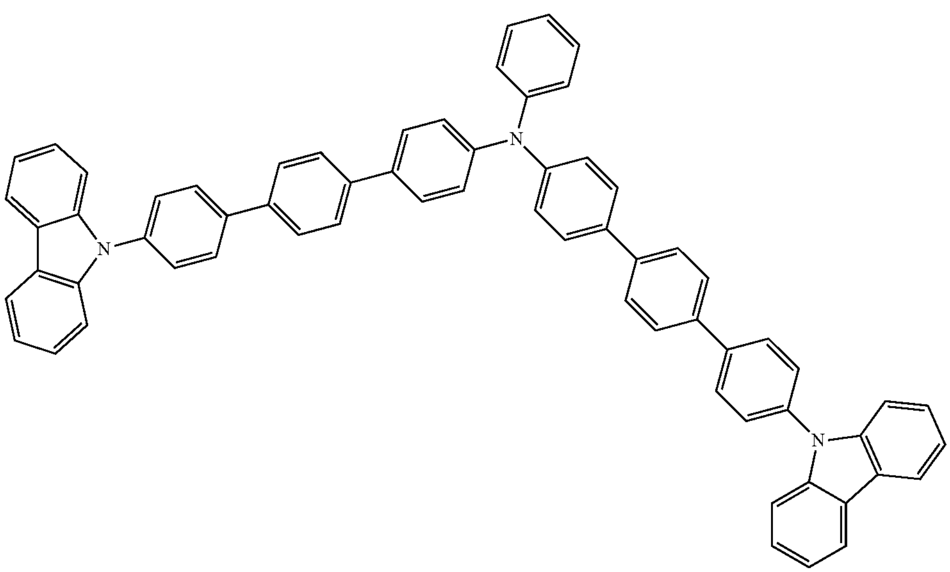

-continued
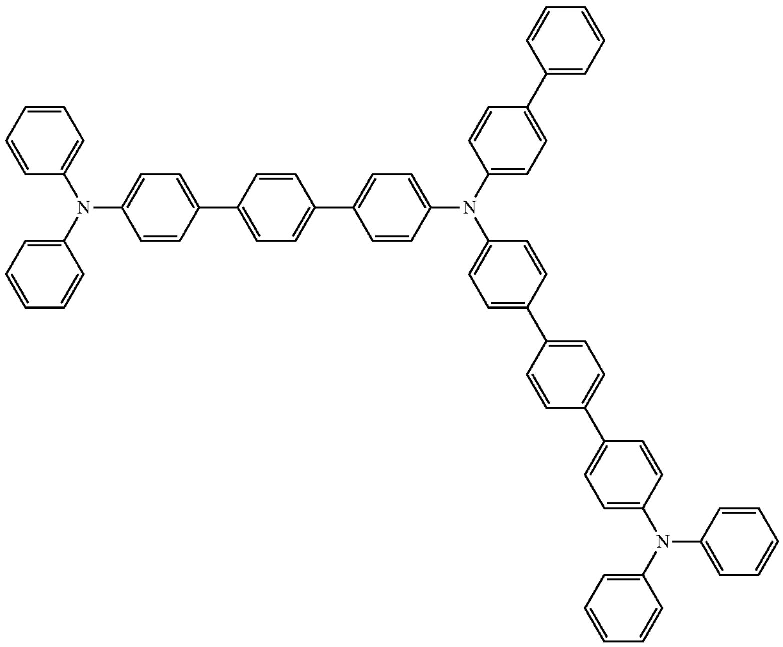
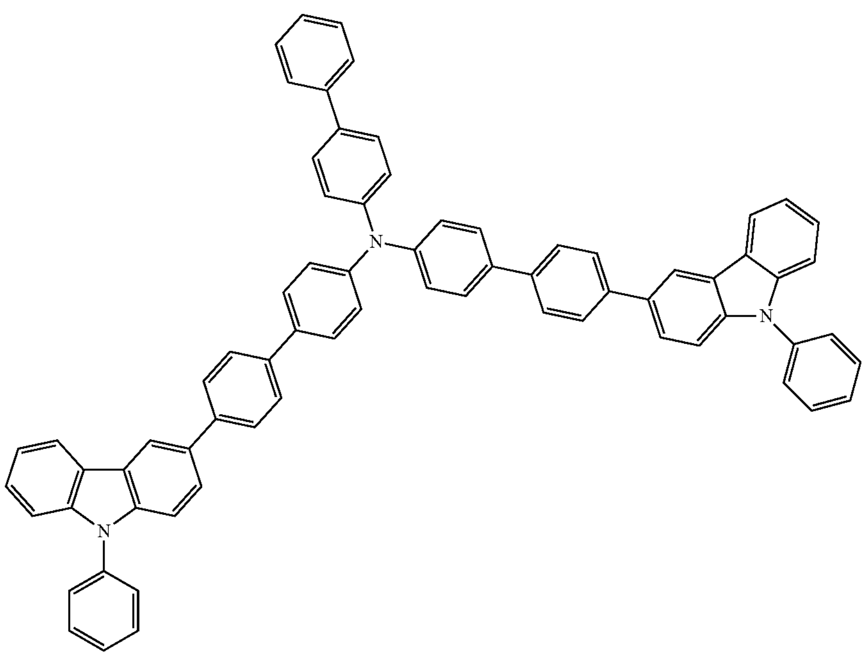

-continued
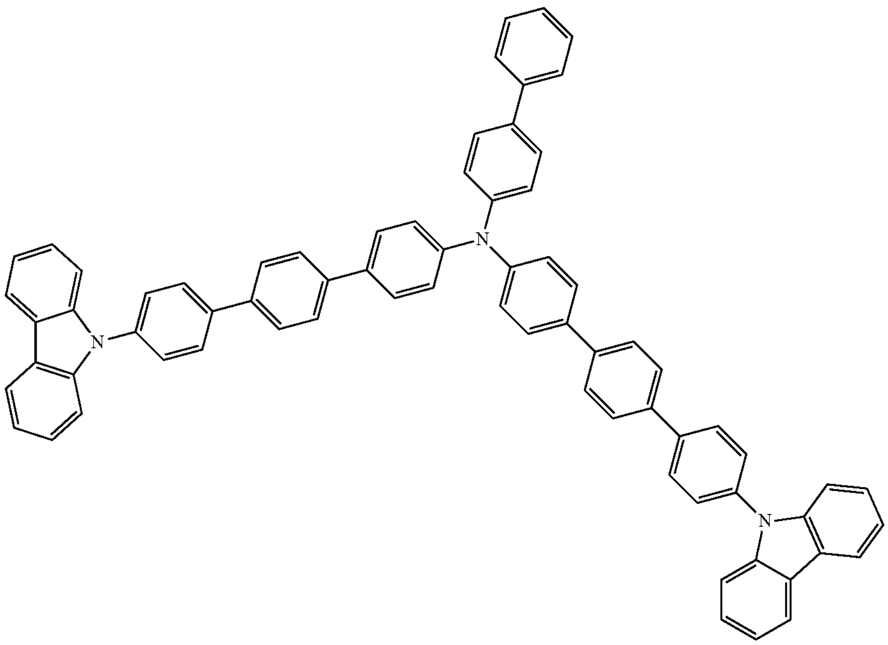
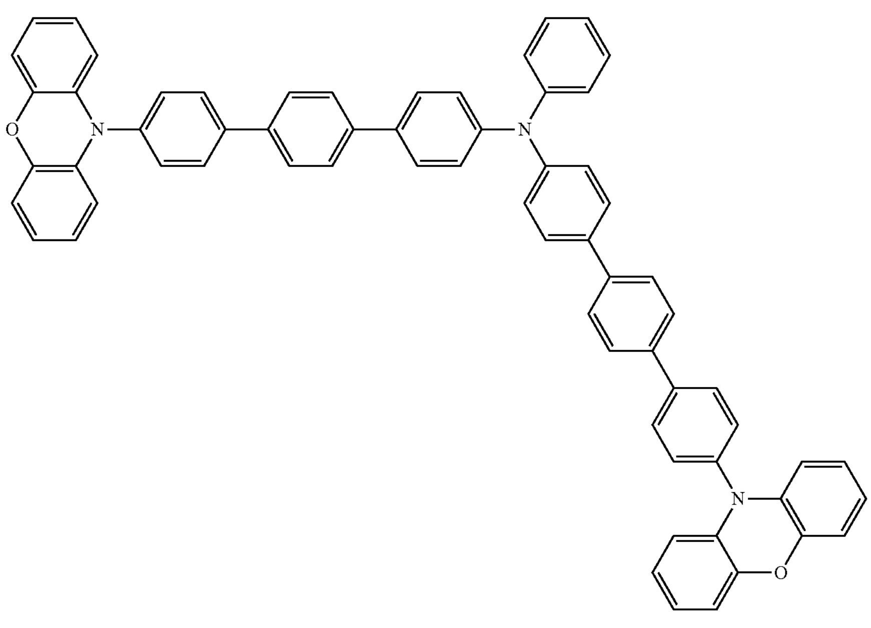

-continued
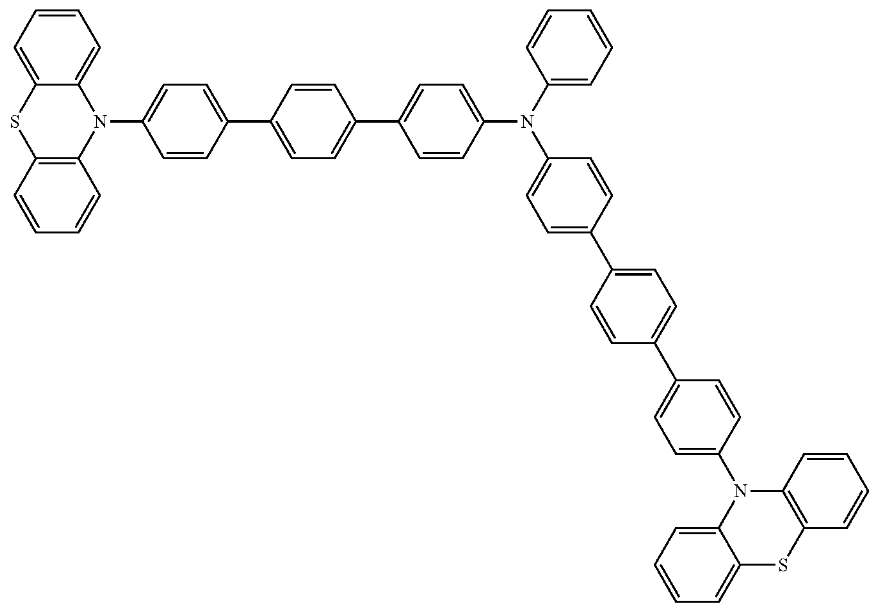
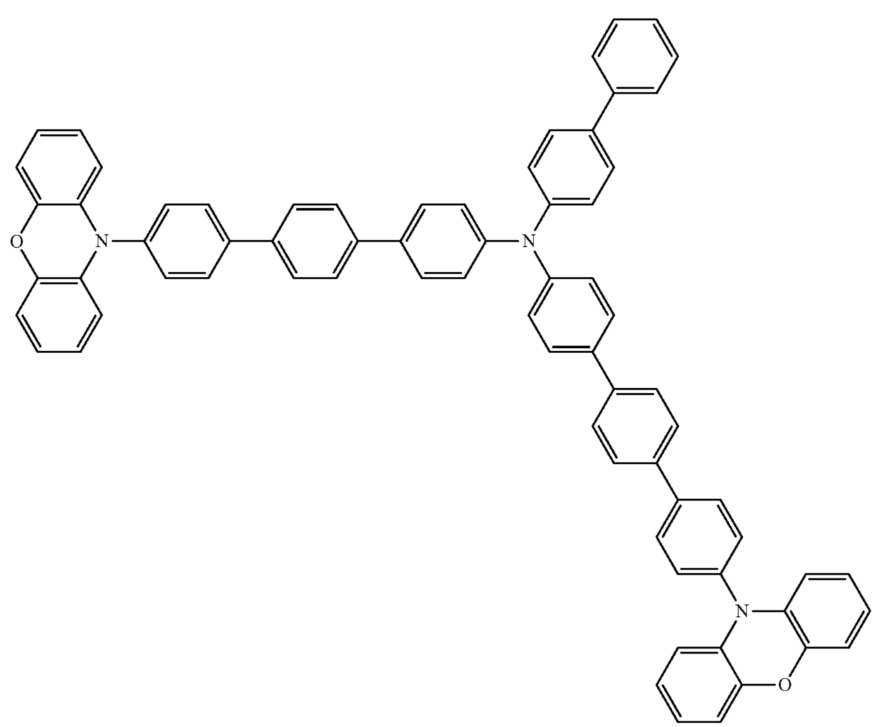

-continued
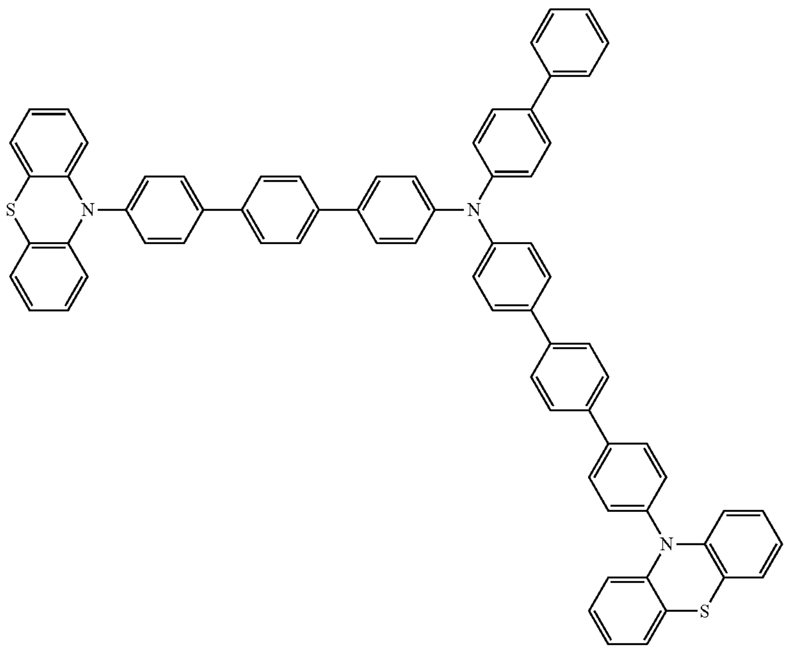
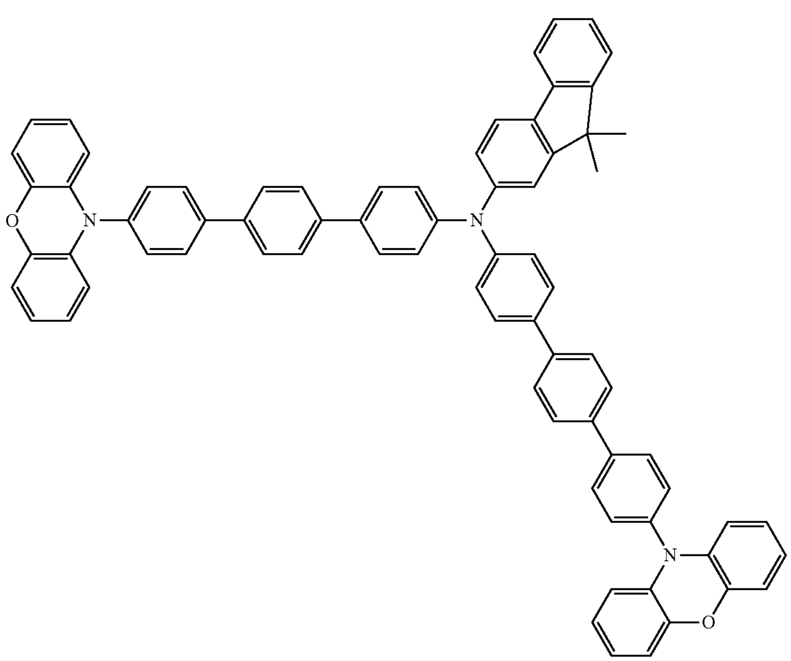

-continued
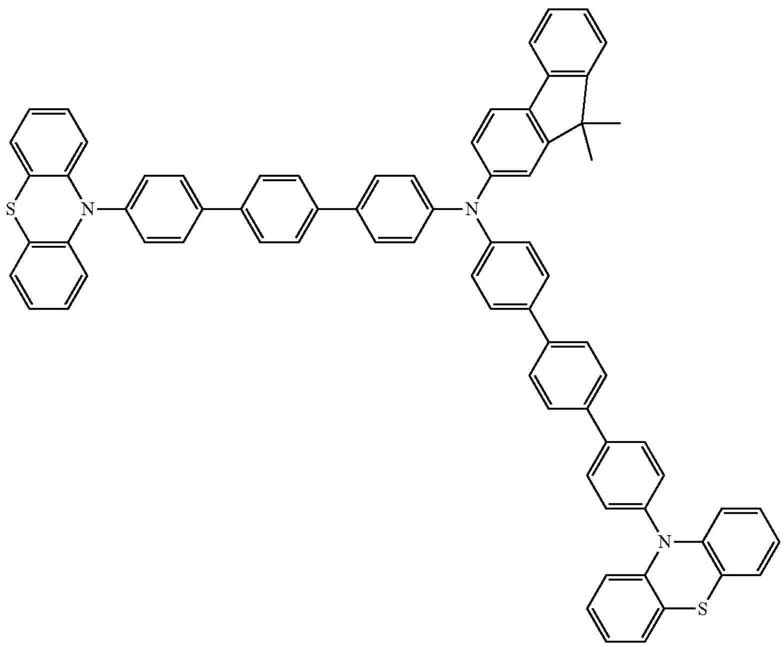
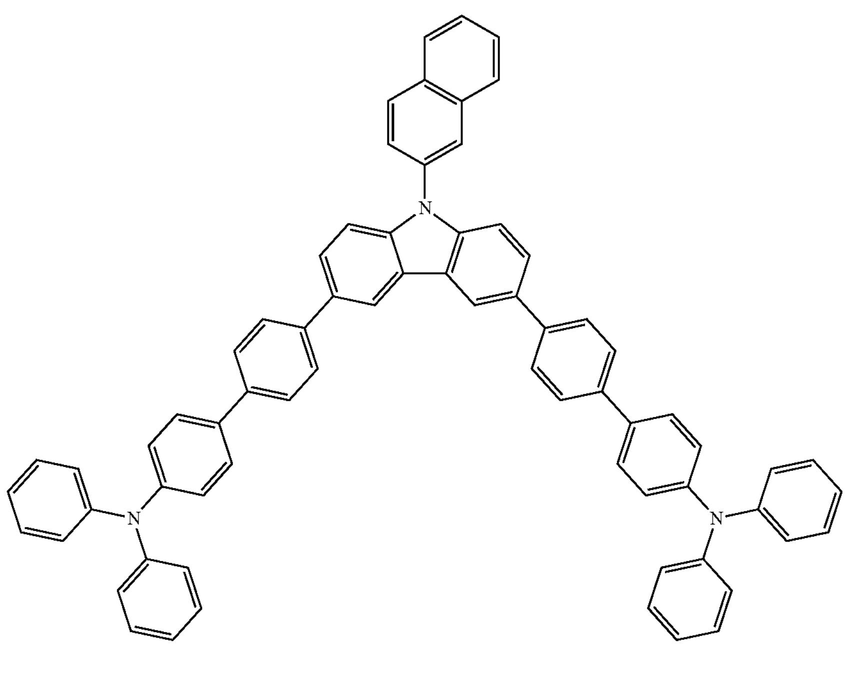

-continued
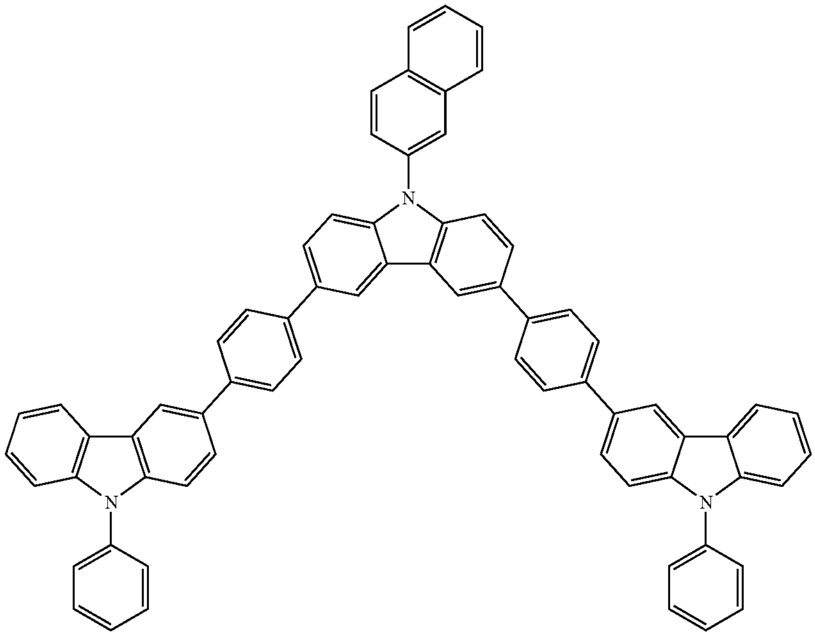
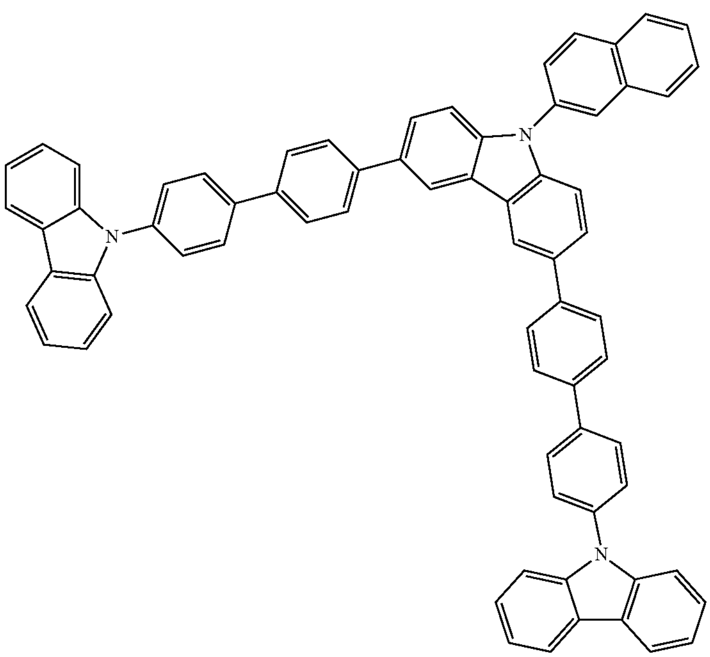

-continued
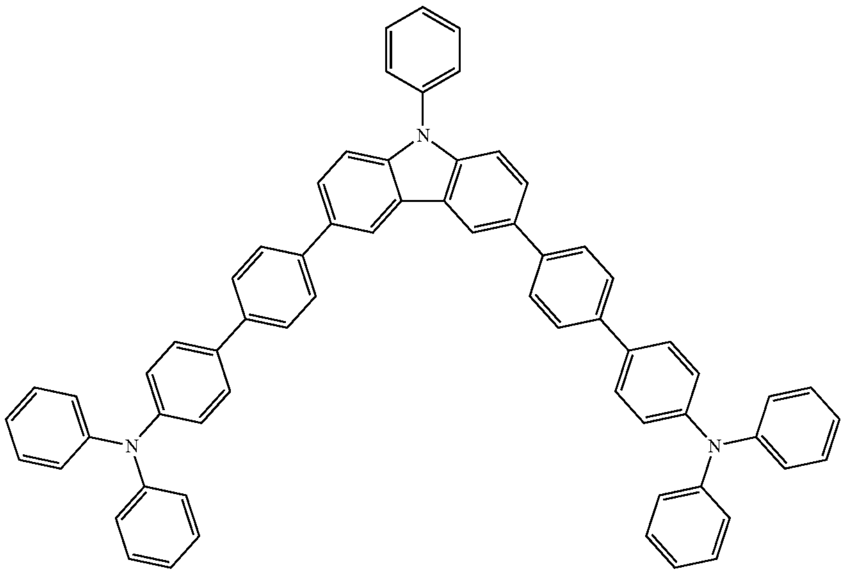
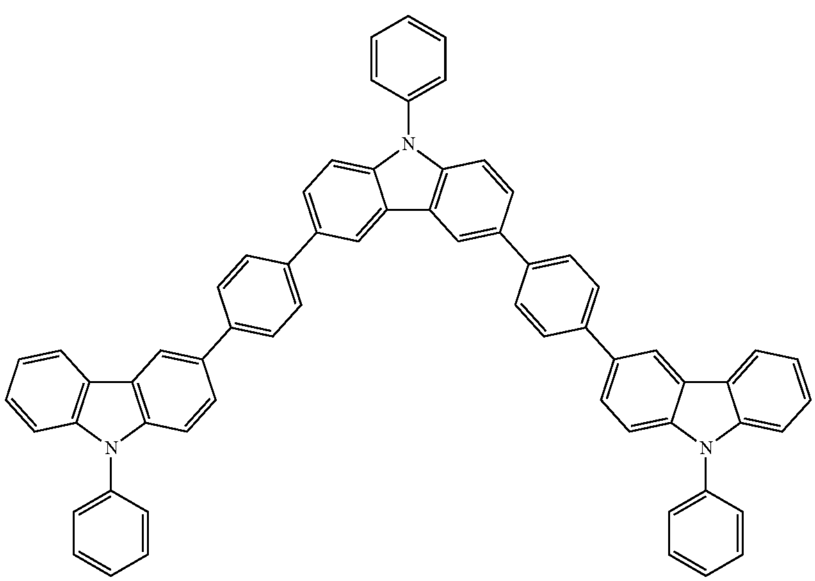

-continued
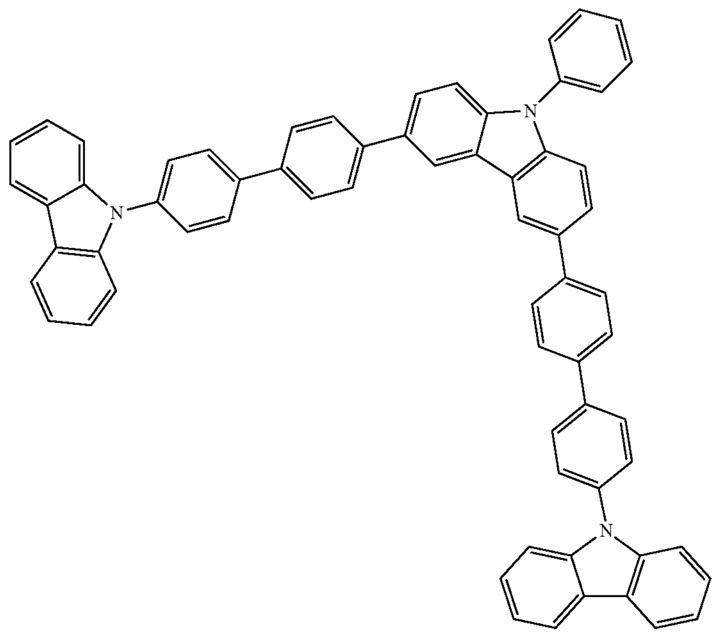
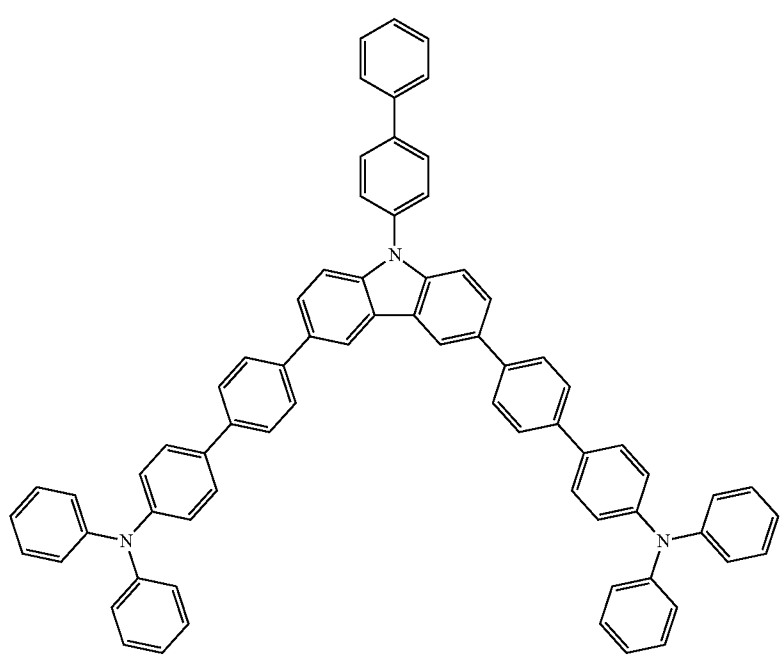

-continued
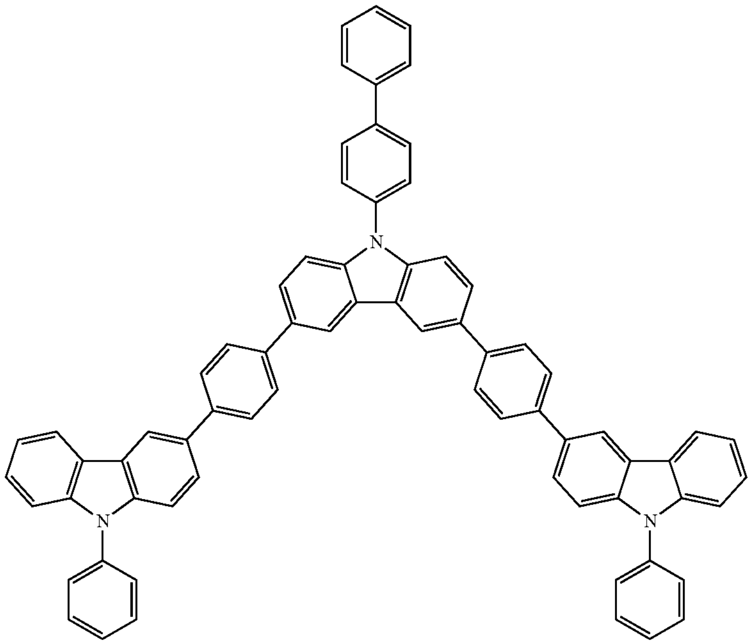
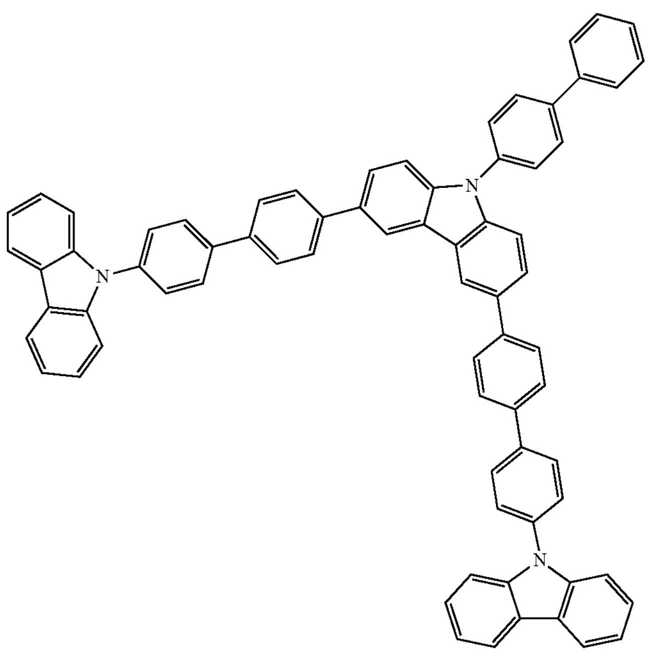

-continued
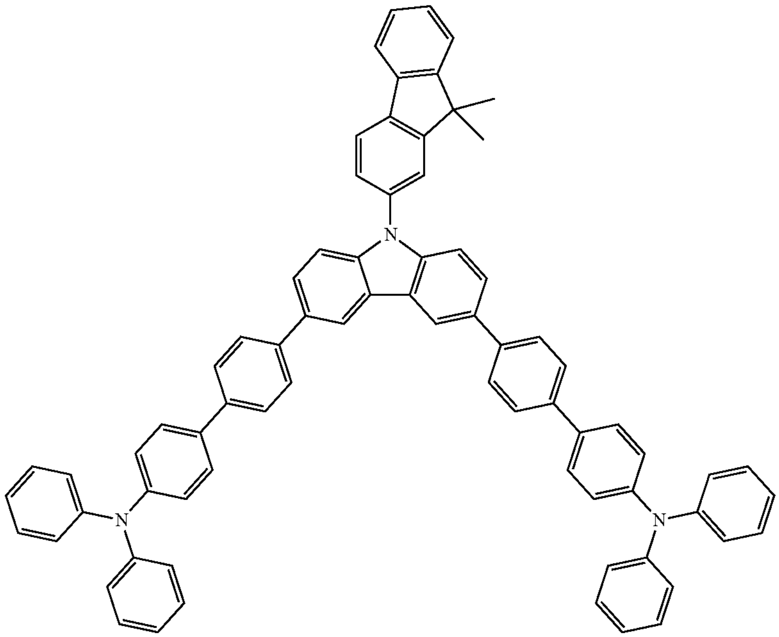
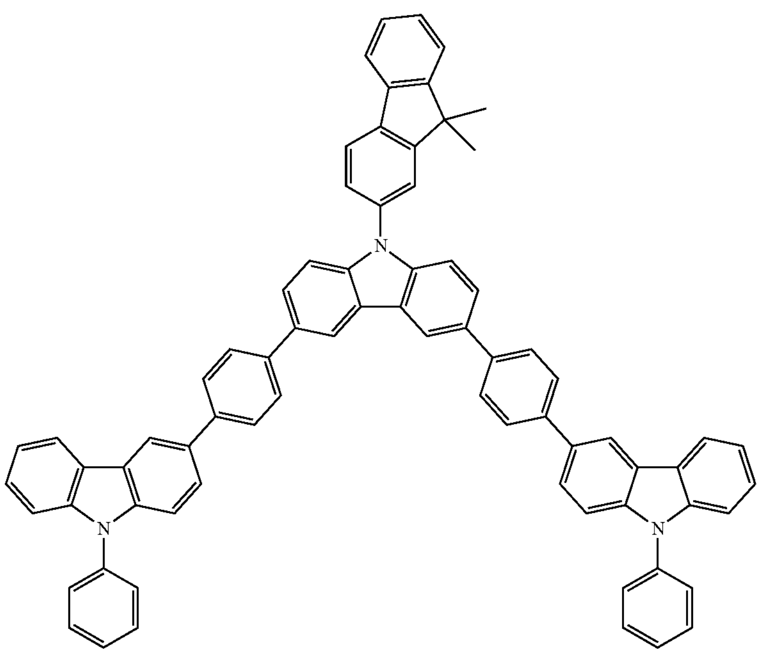

-continued

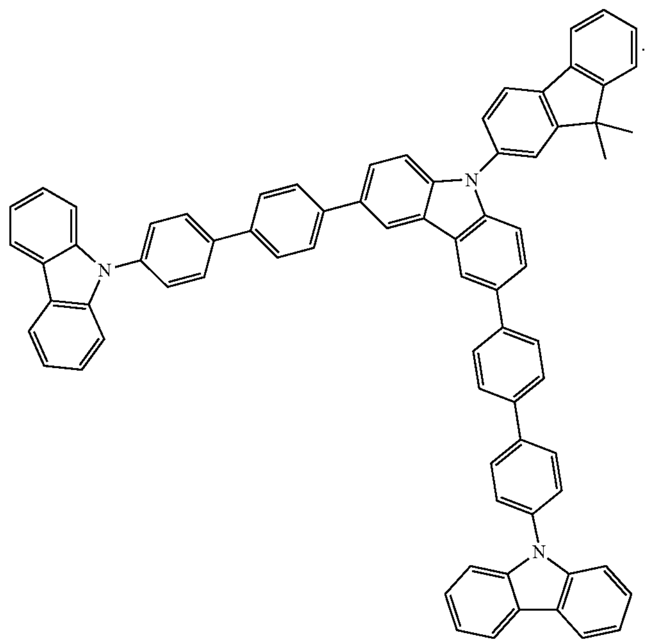 [SMILES: CC1(C)c2ccccc2-c2ccc(-n3c4ccc(-c5ccc(-c6ccc(-n7c8ccccc8c8ccccc87)cc6)cc5)cc4c4cc(-c5ccc(-c6ccc(-n7c8ccccc8c8ccccc87)cc6)cc5)ccc43)cc21]

6. The organic light emitting device according to claim 1, wherein $L_{21}$ is a single bond, phenylene, naphthylene, or phenanthrendiyl.

7. The organic light emitting device according to claim 1, wherein $L_{22}$ is a single bond or phenylene.

8. The organic light emitting device according to claim 1, wherein $R_{21}$ is phenyl, biphenylyl, terphenylyl, or the following substituent:

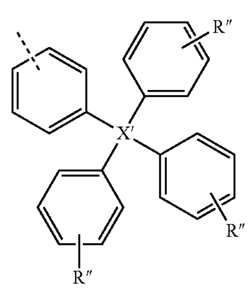

wherein:

X' is C, or Si; and each R" is independently hydrogen; methyl, tert-butyl, or $Si(methyl)_3$.

9. The organic light emitting device according to claim 1, wherein $R_{23}$ and $R_{24}$ are each independently phenyl, phenyl substituted with 1 to 5 deuteriums, biphenylyl, terphenylyl, naphthyl, phenanthrenyl, fluoranthenyl, phenylfluoranthenyl, triphenylenyl, pyrenyl, chrysenyl, perylenyl, dimethylfluorenyl, dibenzofuranyl, or dibenzothiophenyl.

10. The organic light emitting device according to claim 1, wherein the compound of Chemical Formula 2-1 or 2-2 is any one compound selected from the group consisting of the following:

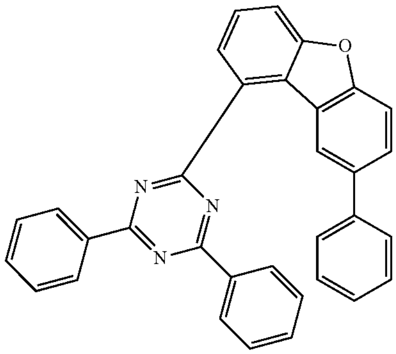
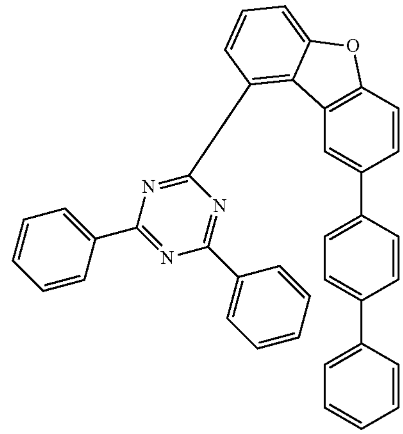
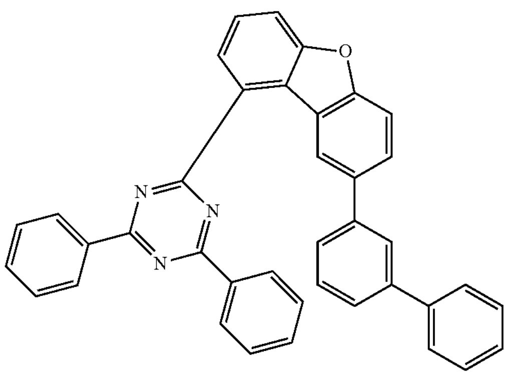
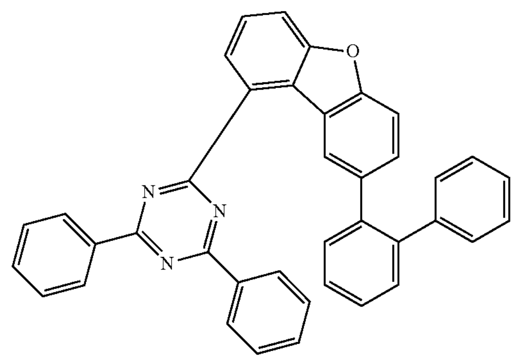
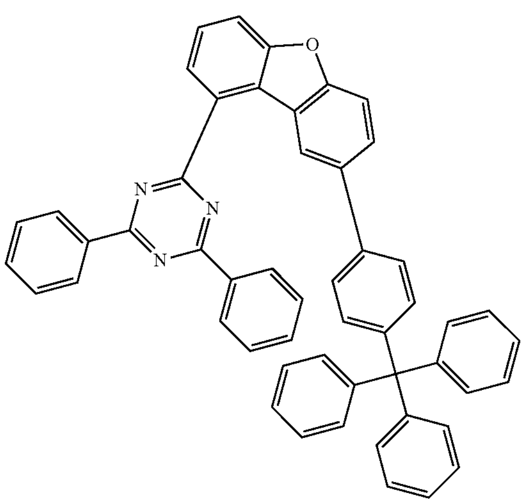
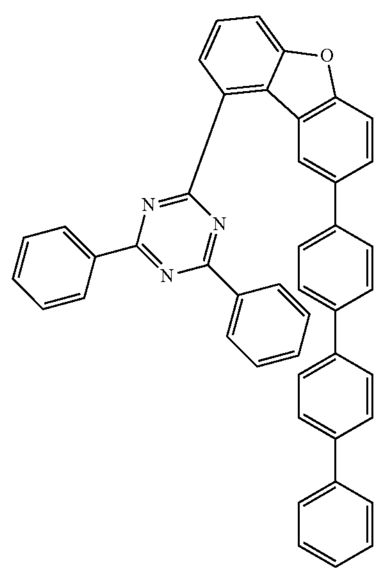
N
N
N
O -continued
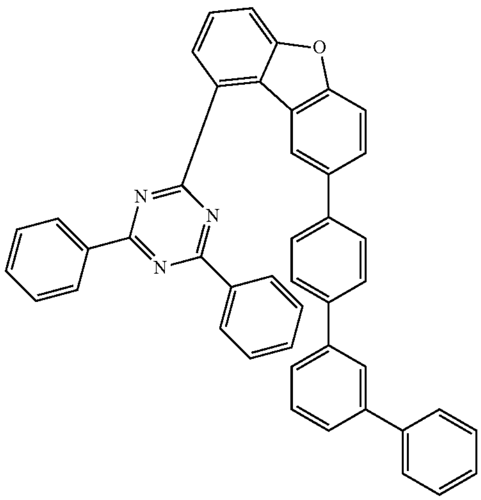
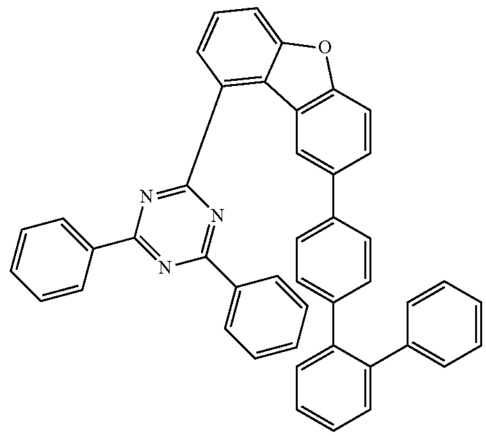
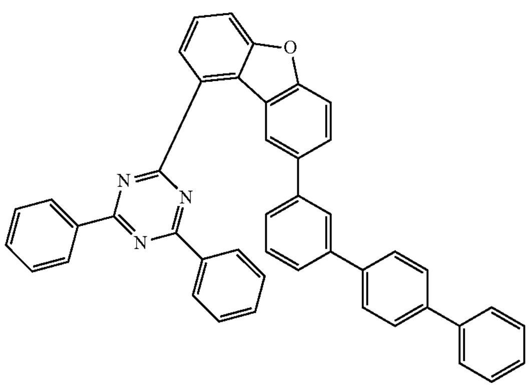
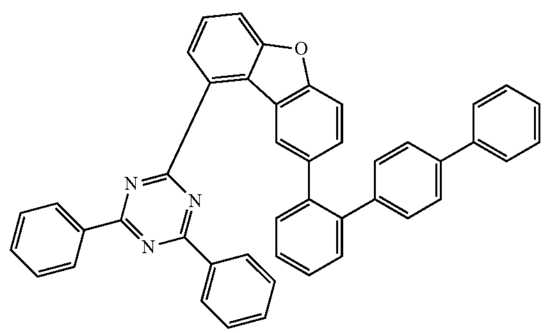
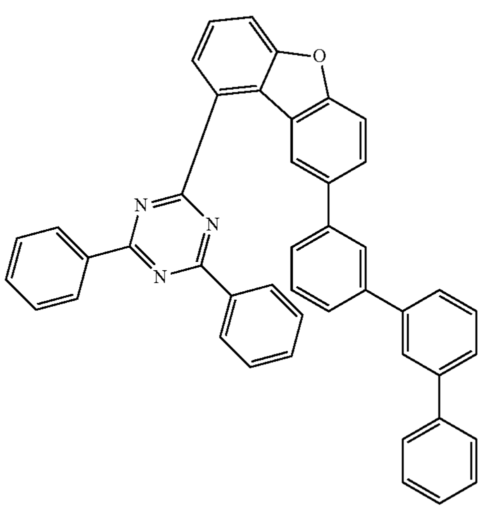
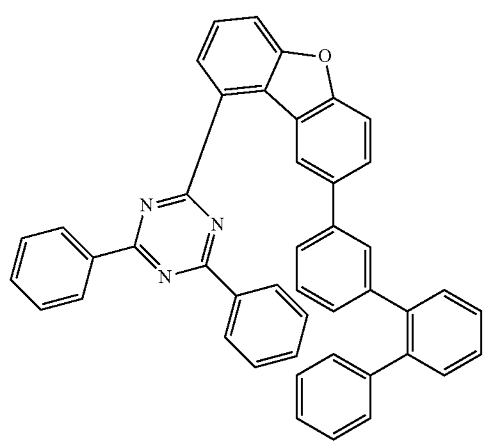

-continued
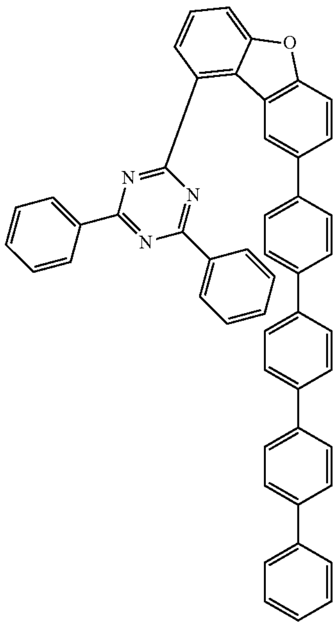
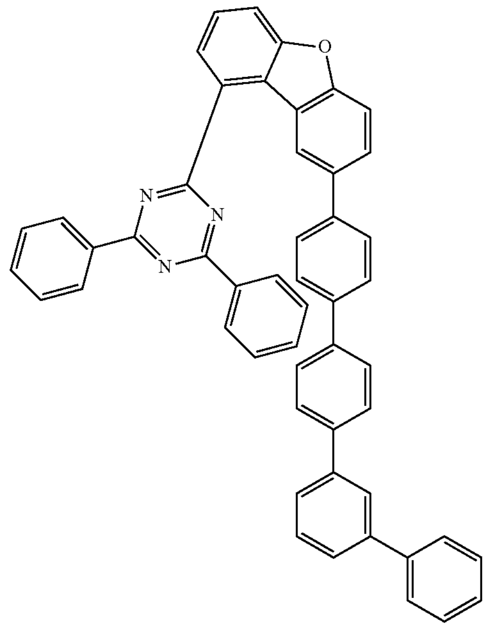
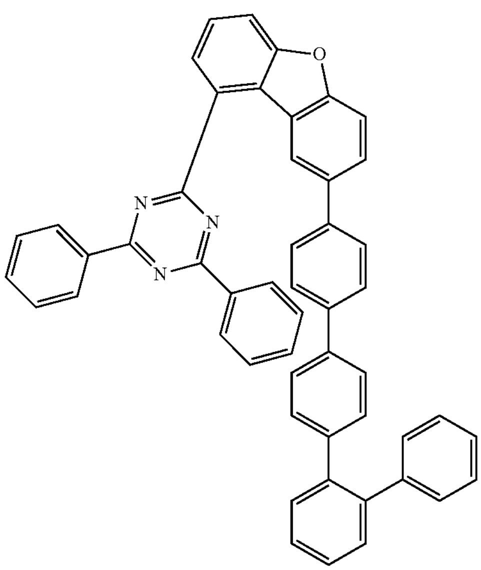
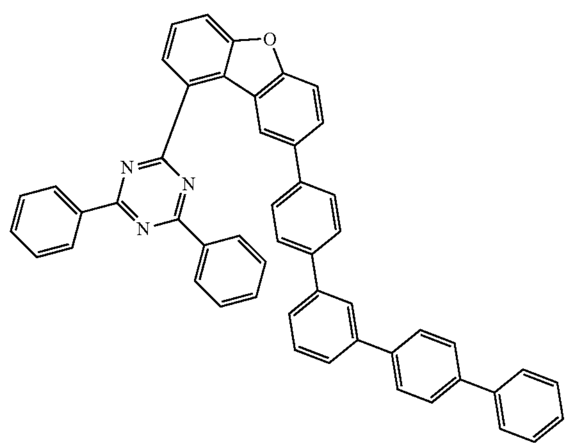

-continued
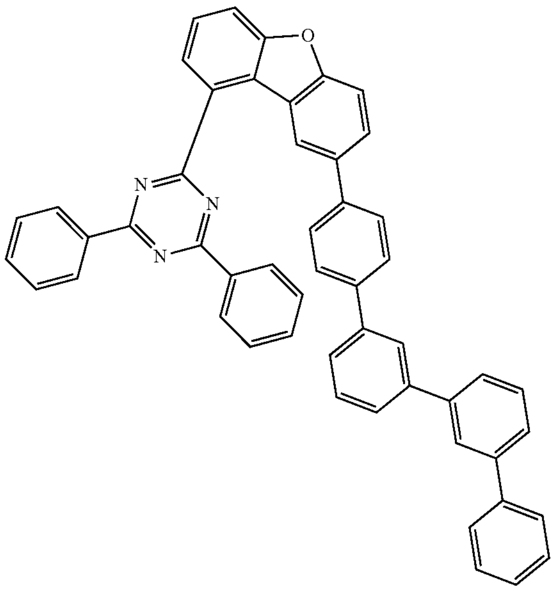
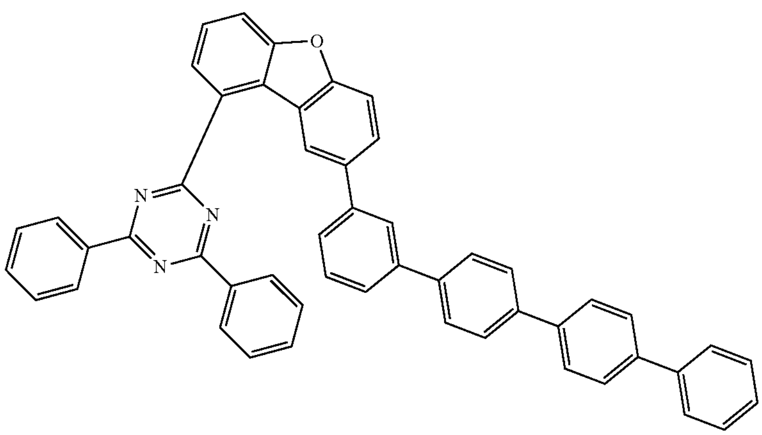
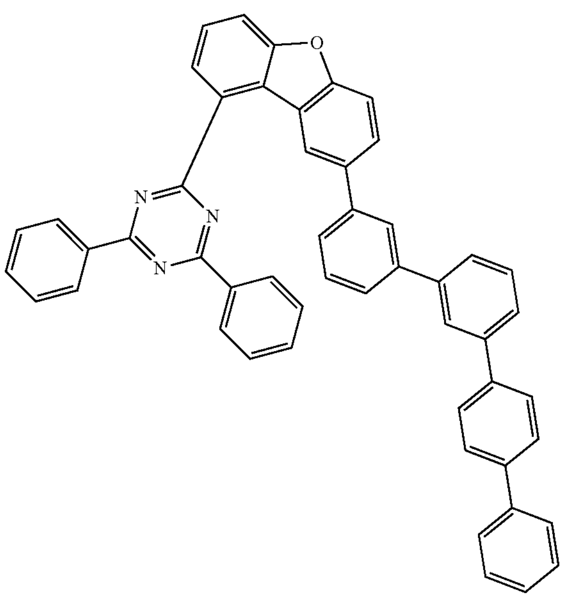
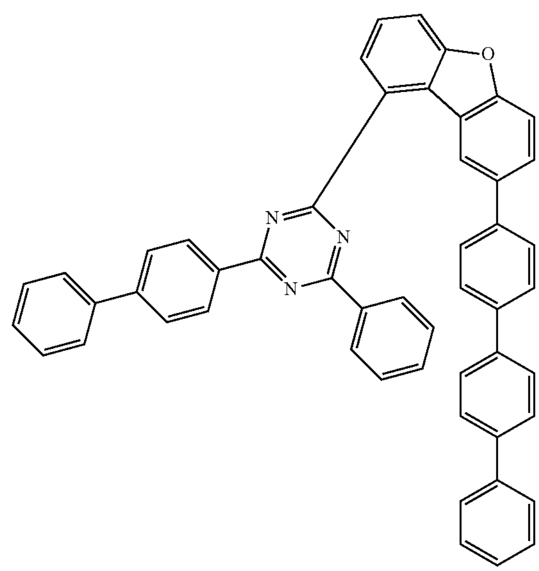

-continued
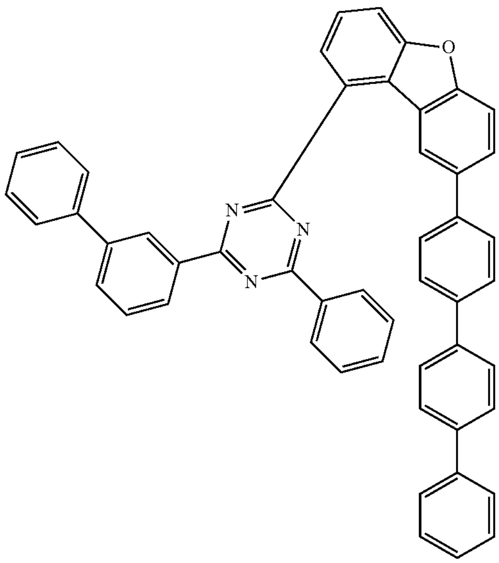
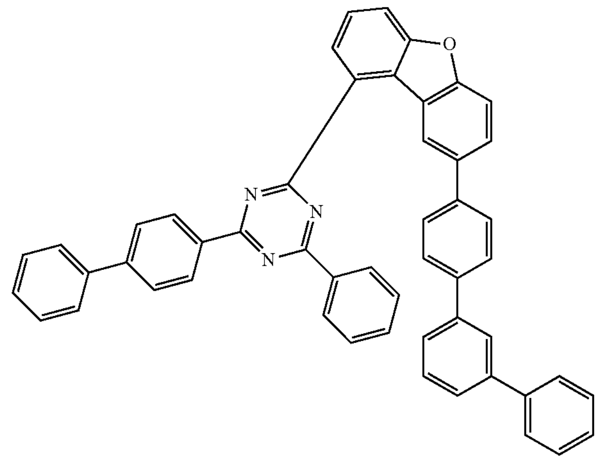
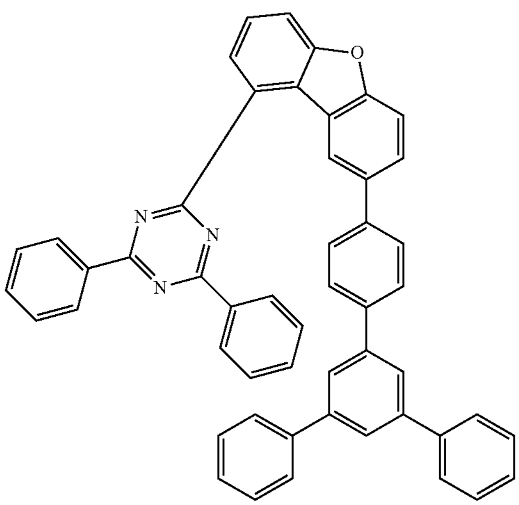
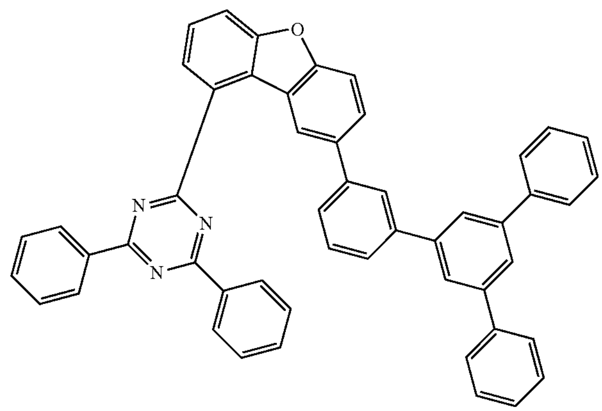
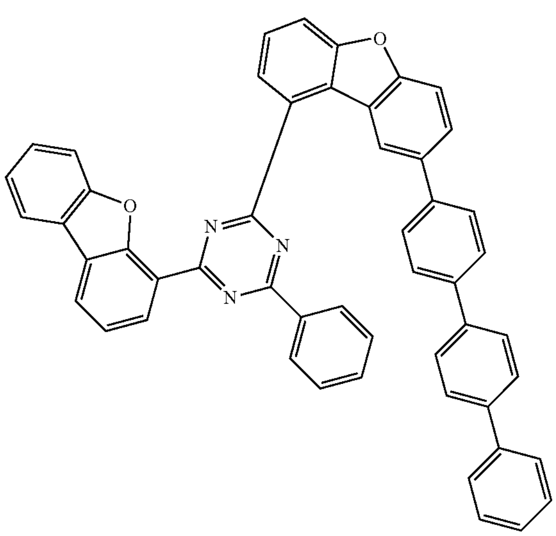
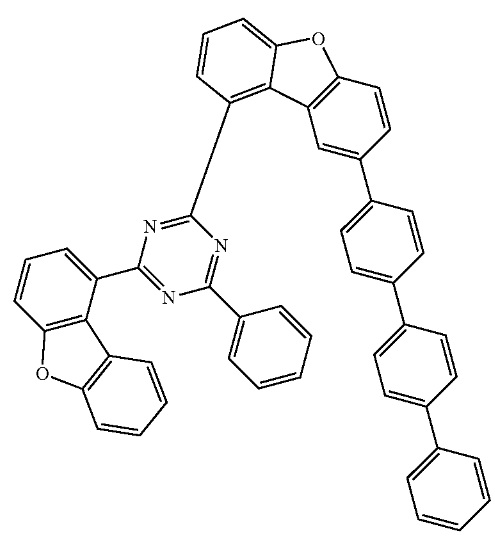

-continued
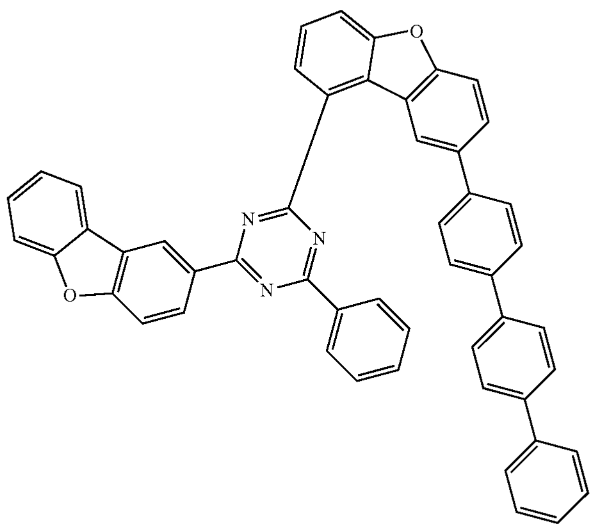
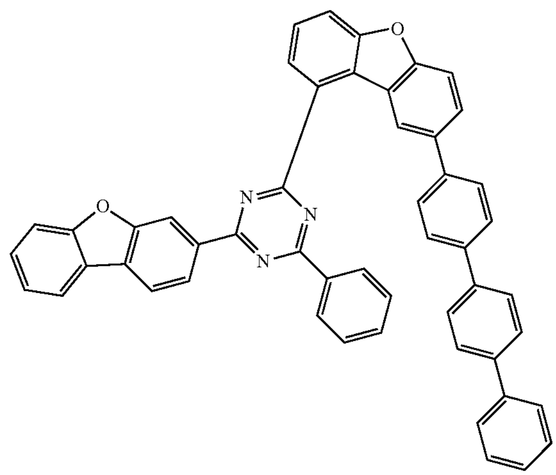
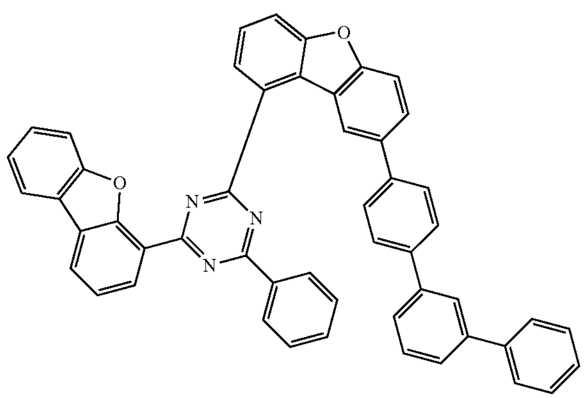
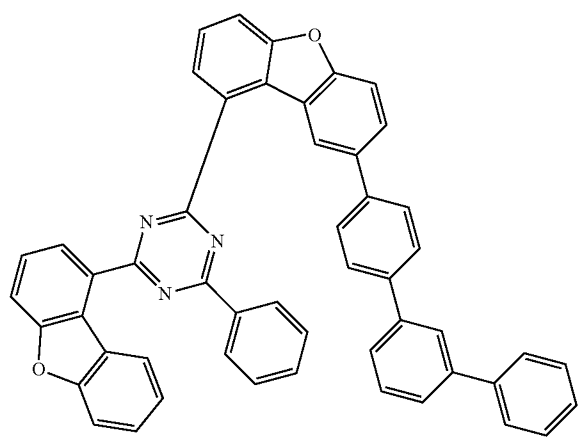
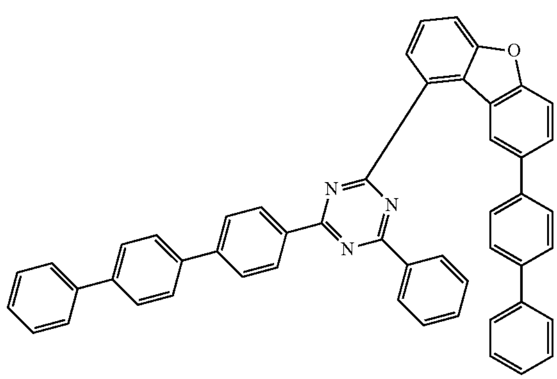
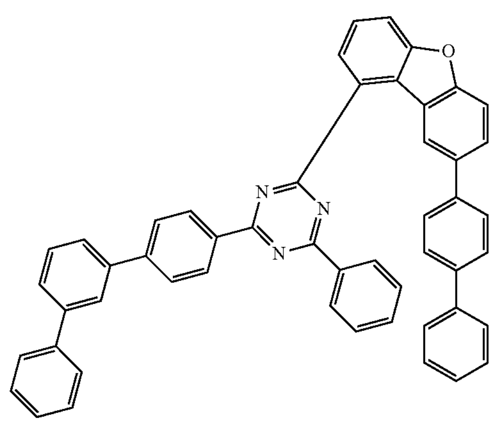

-continued
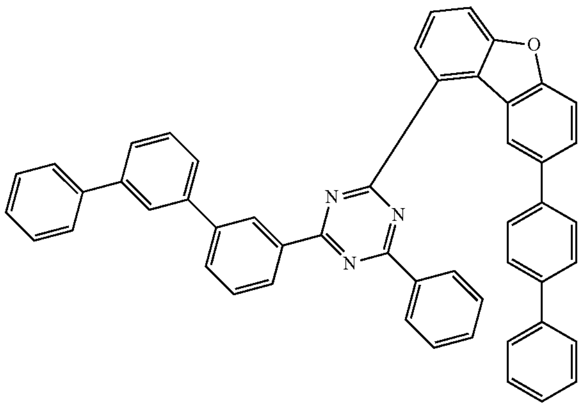
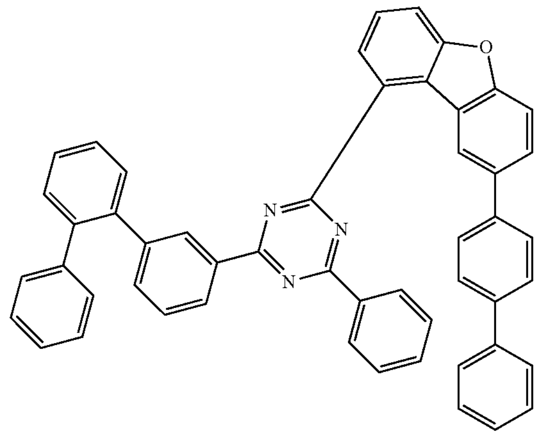
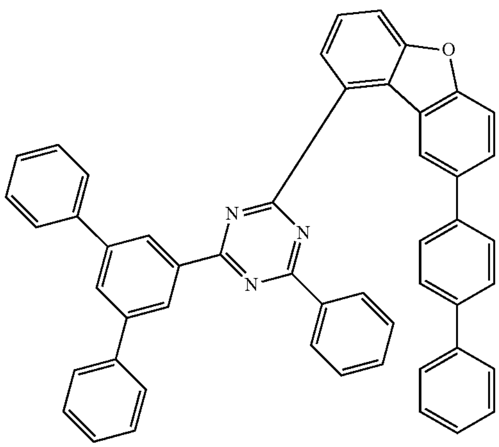
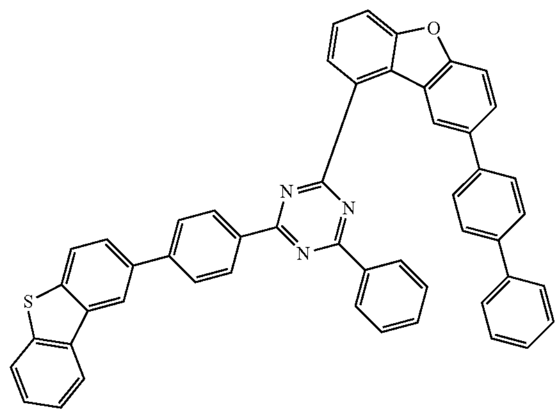
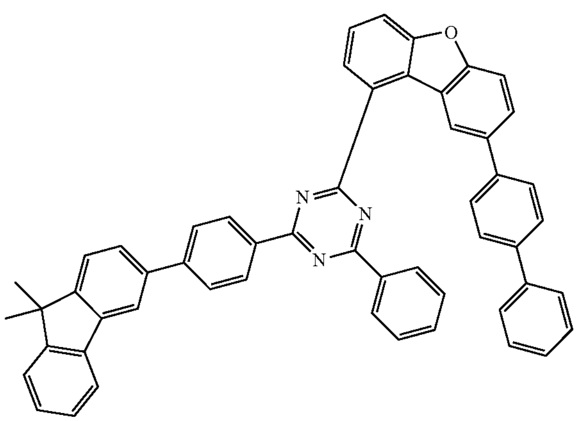
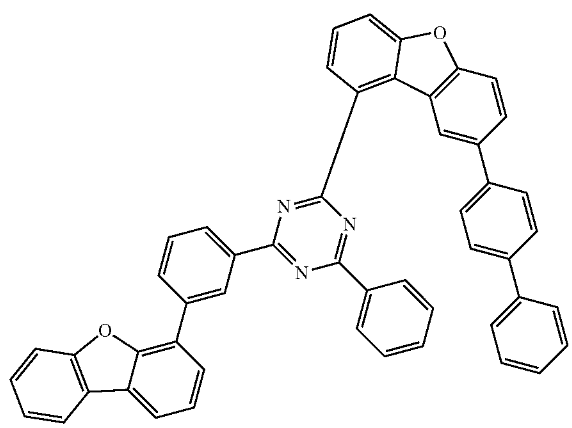

-continued
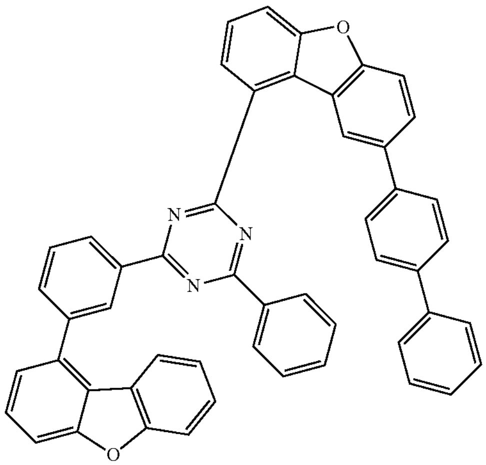
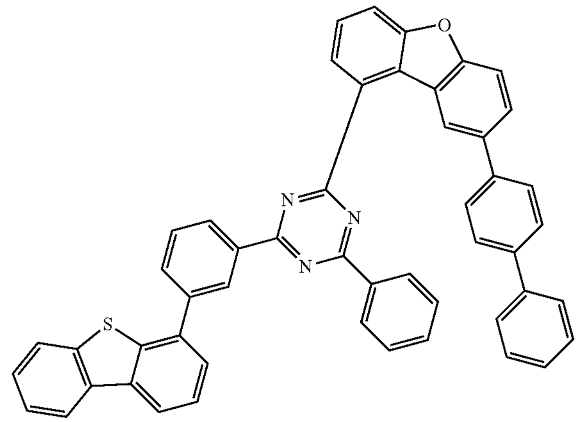
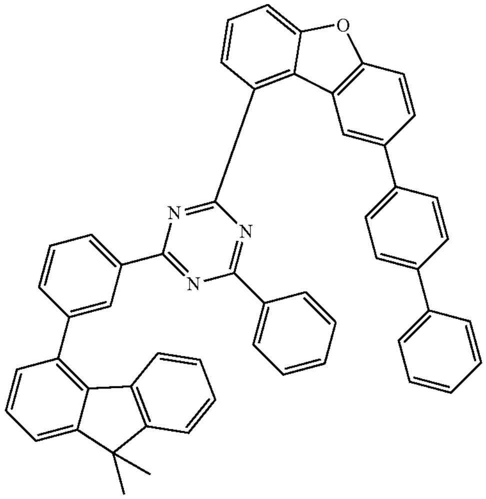
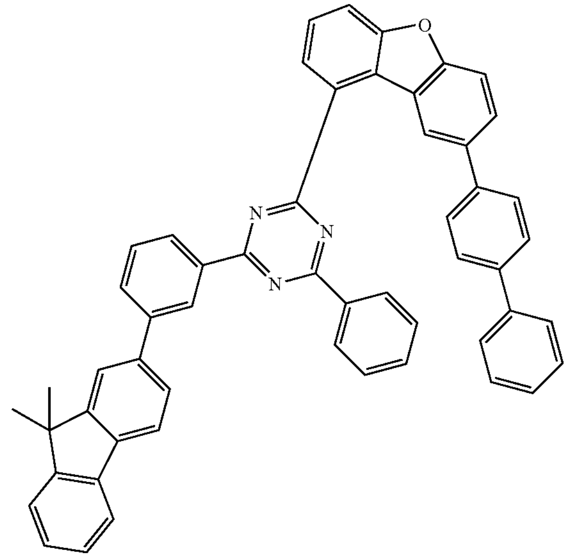
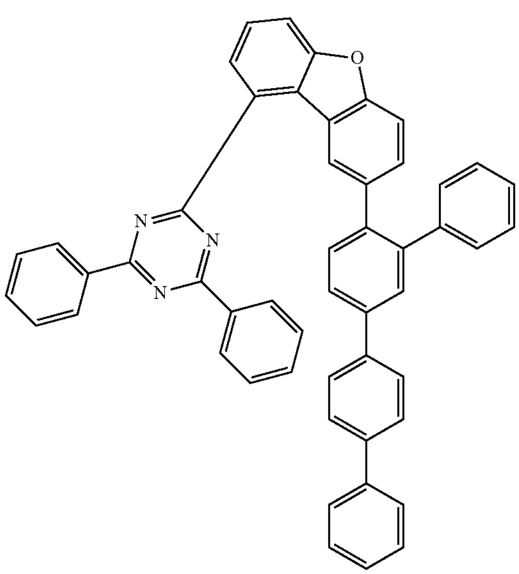
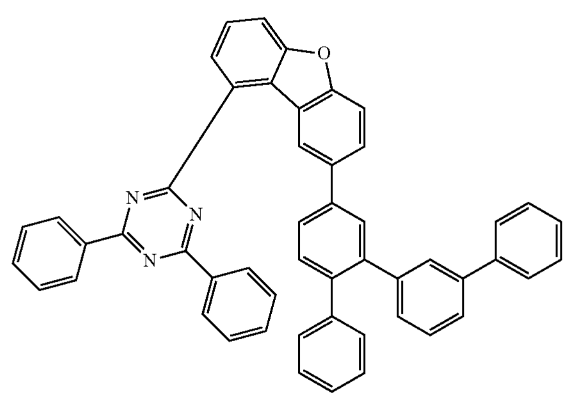

-continued
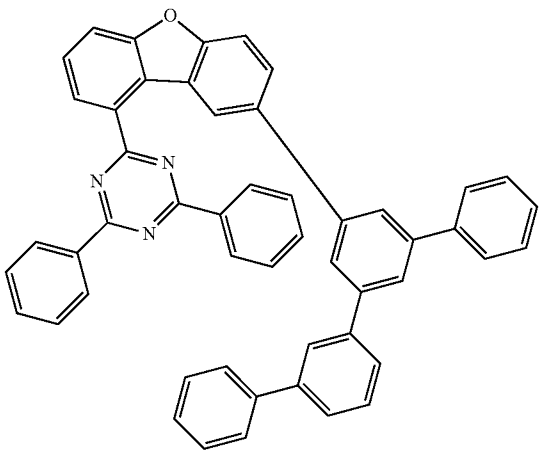
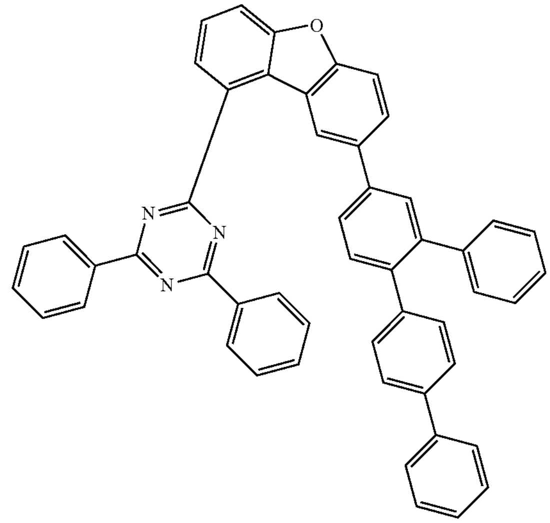
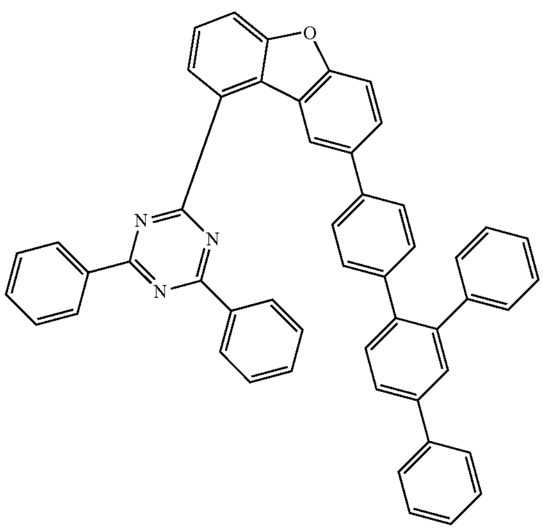
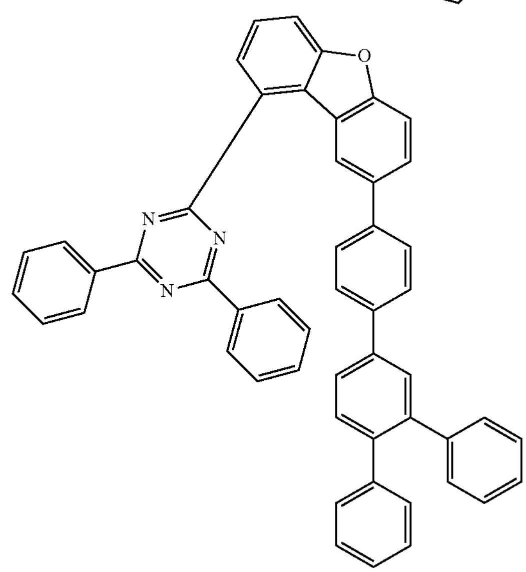
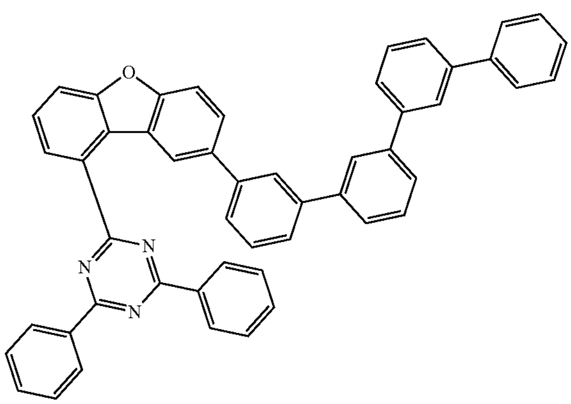
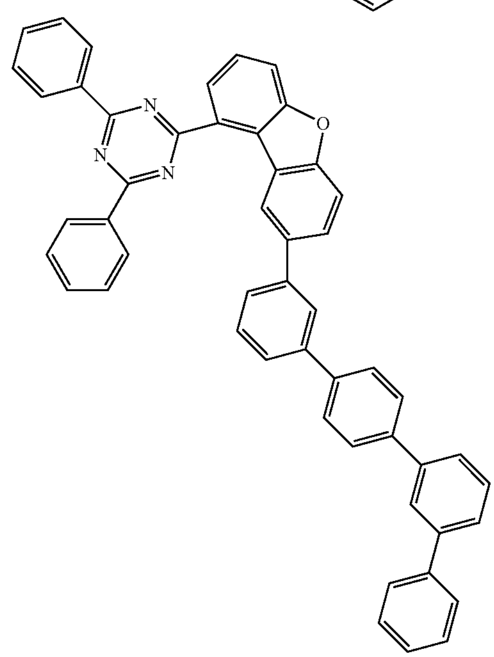

-continued
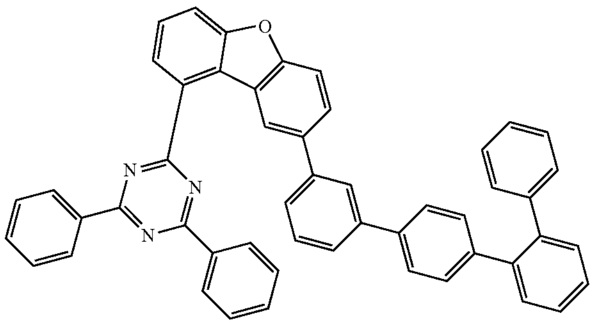
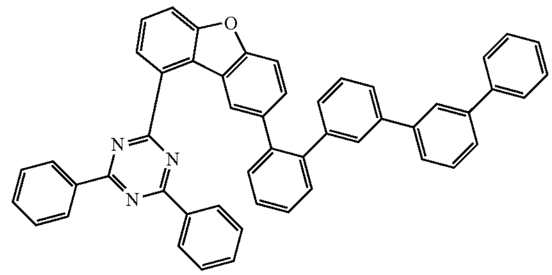
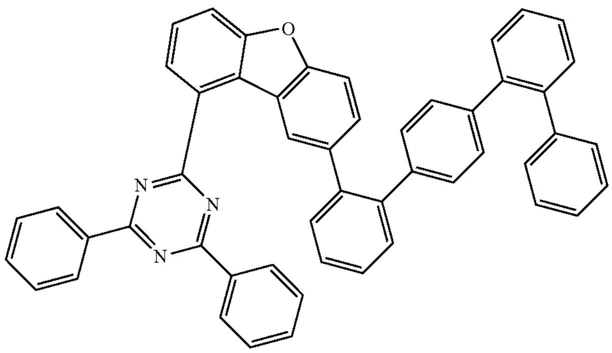
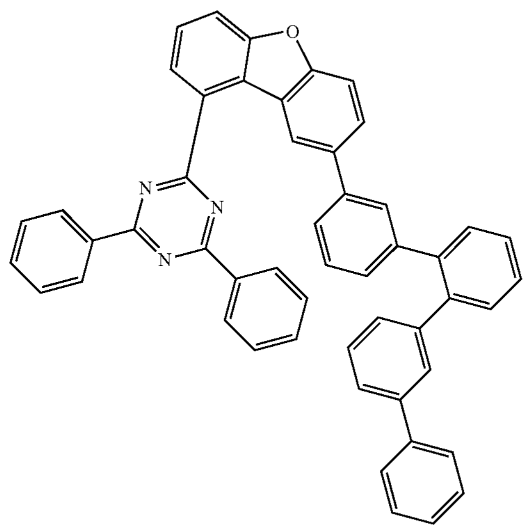
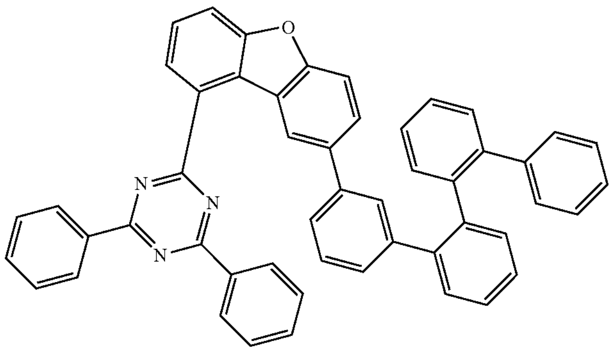
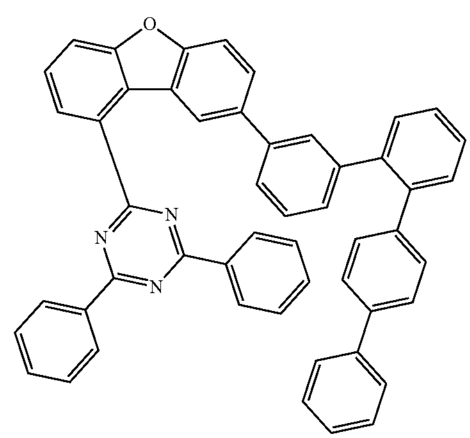

-continued
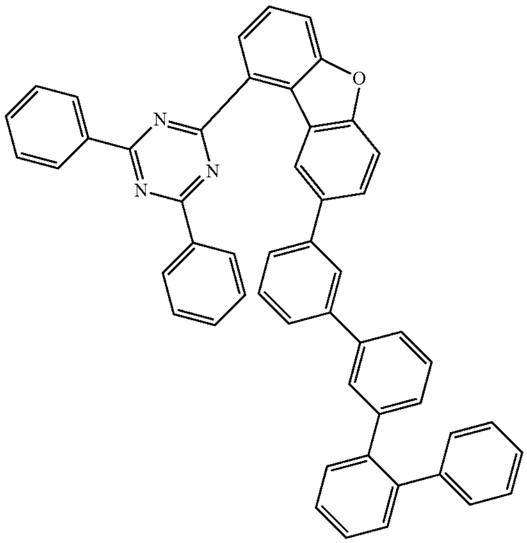
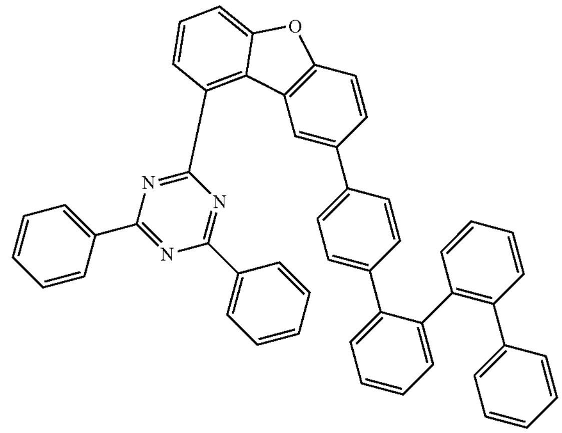
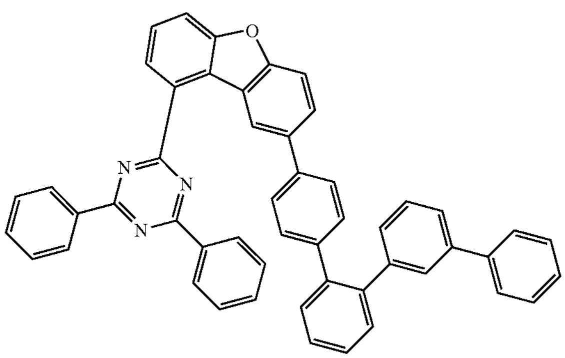
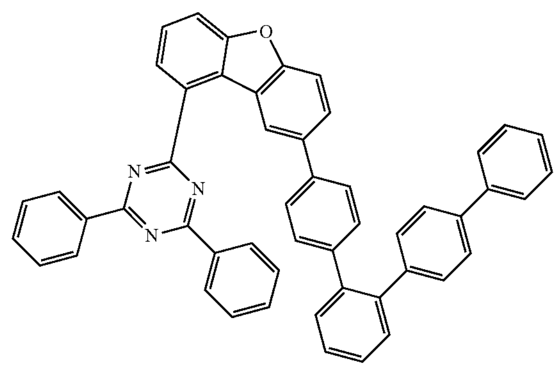
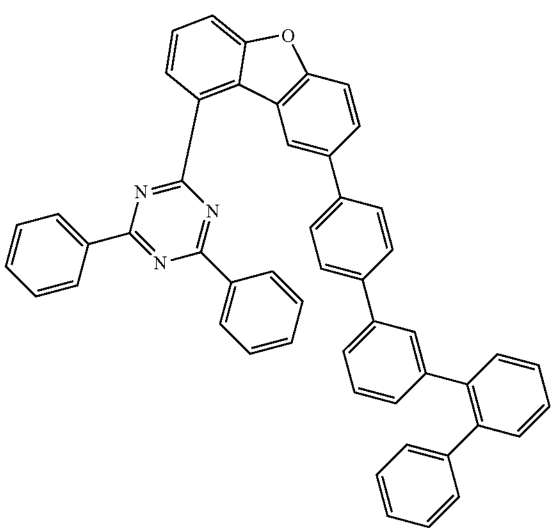
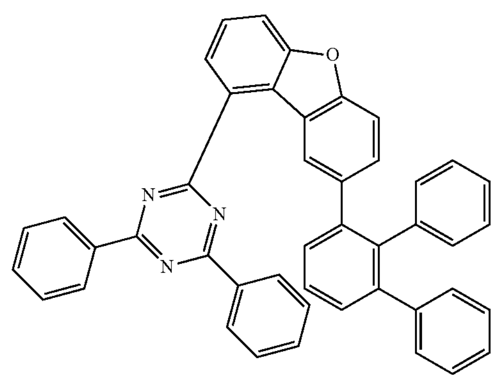

-continued
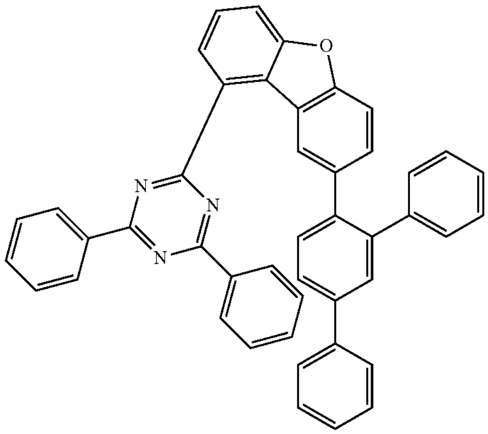
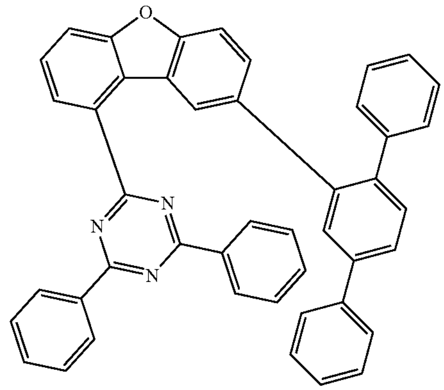
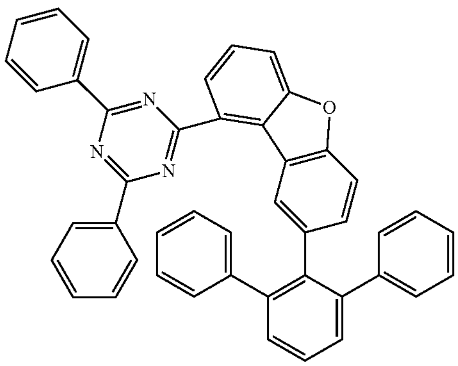
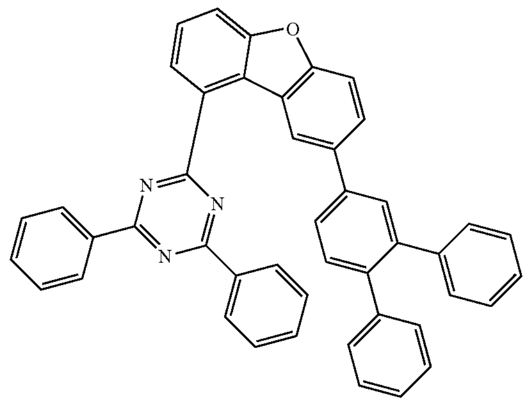
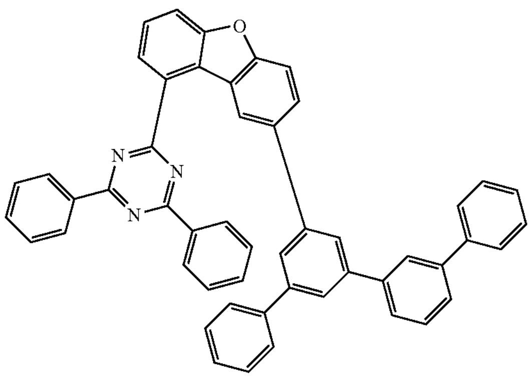
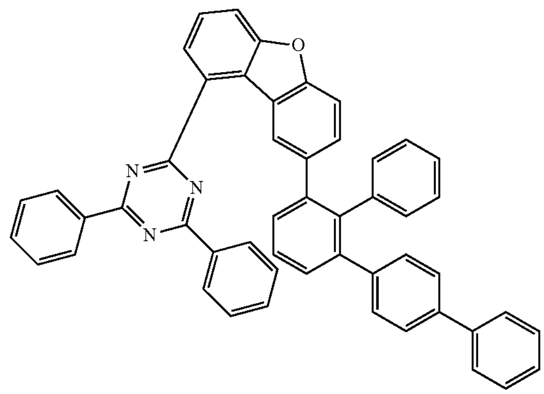
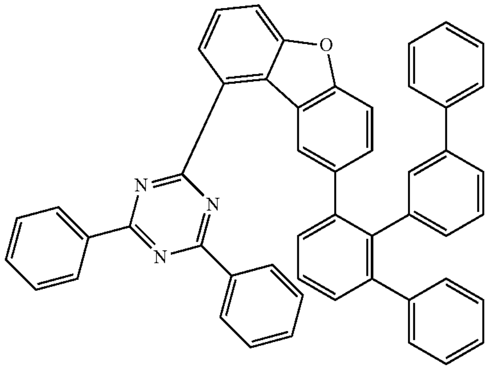
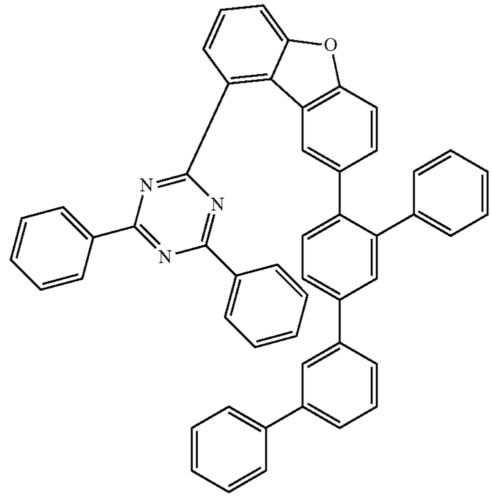

-continued
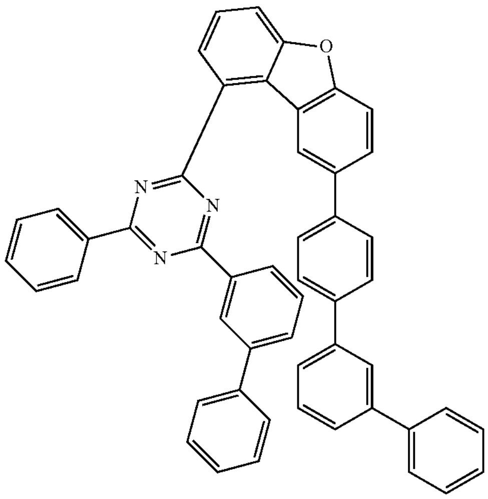
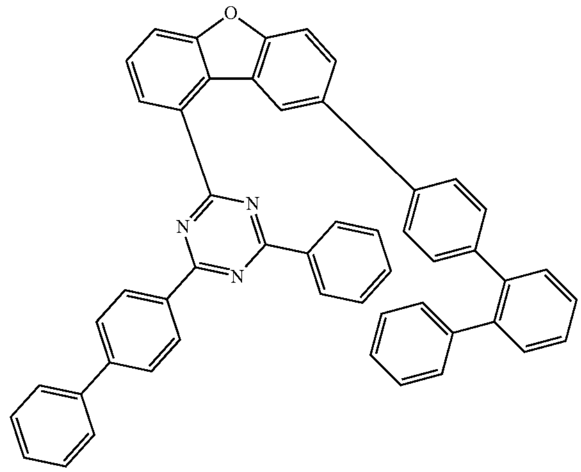
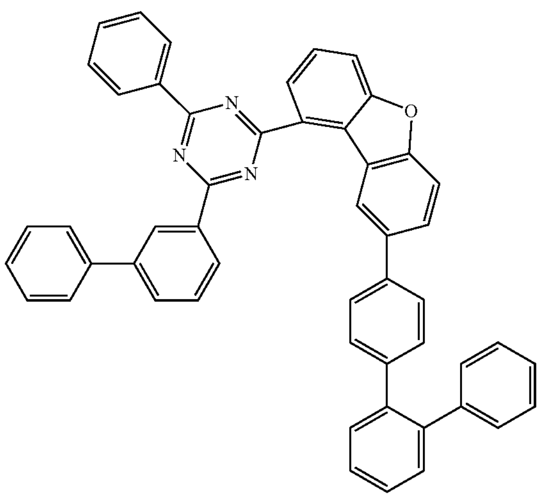
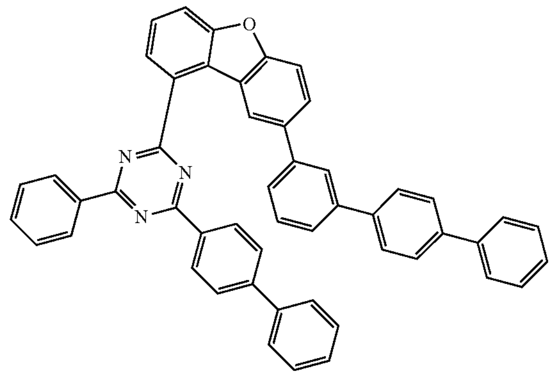
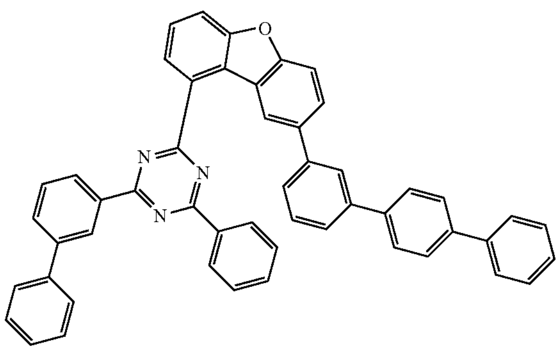
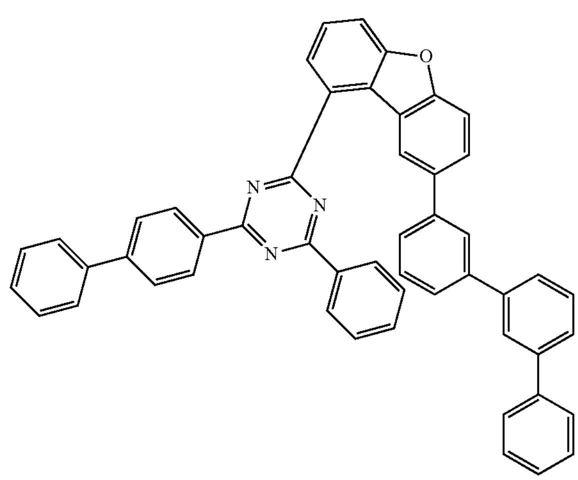

-continued
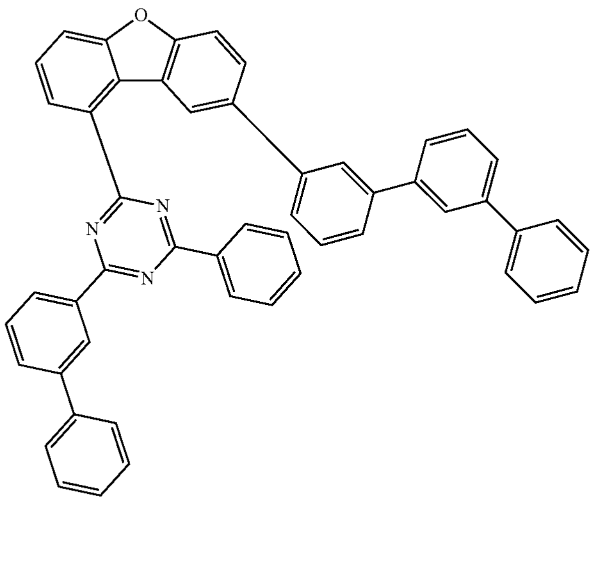
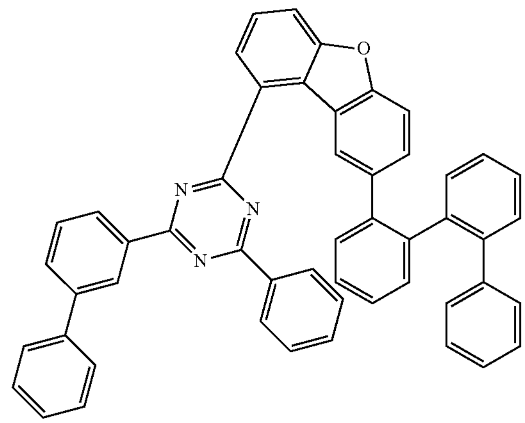
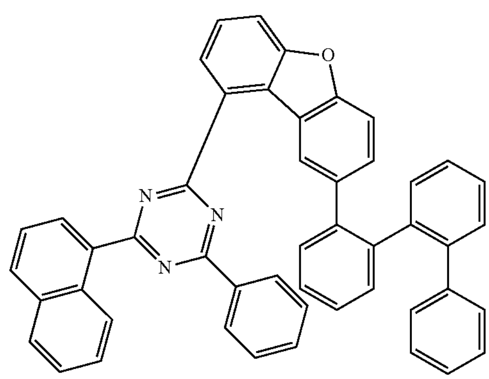
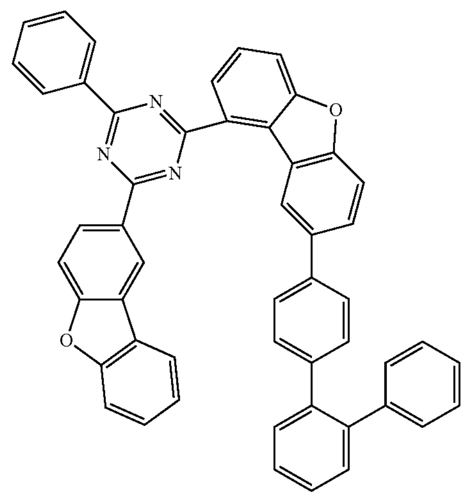
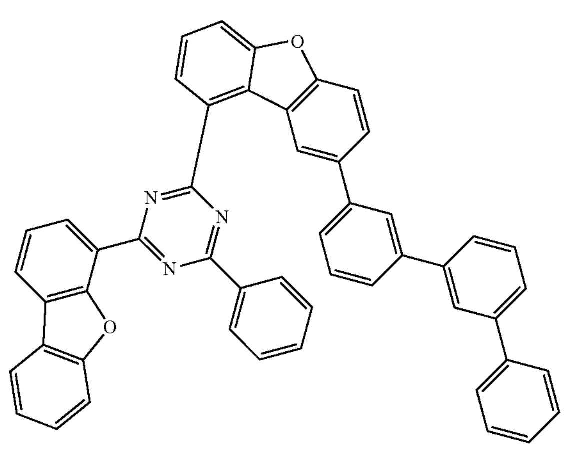
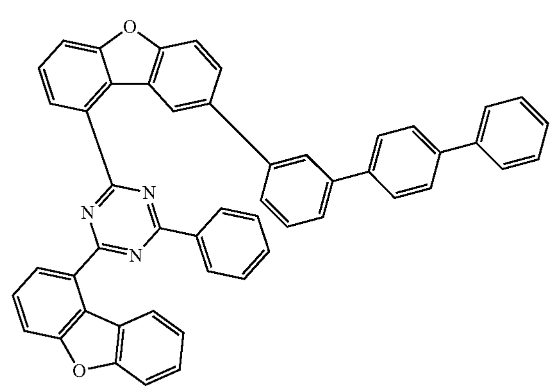

-continued
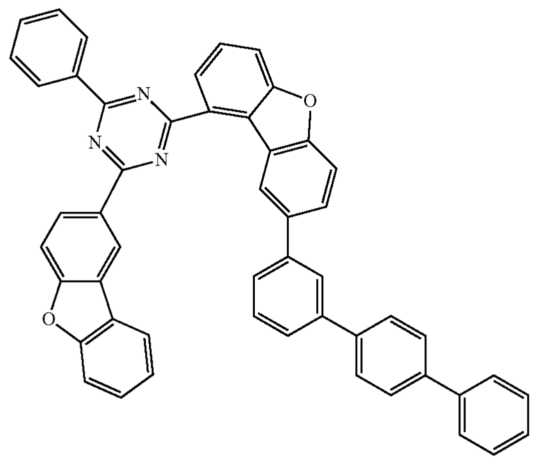
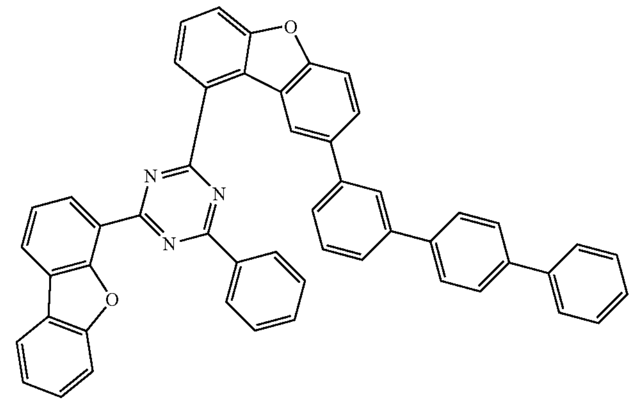
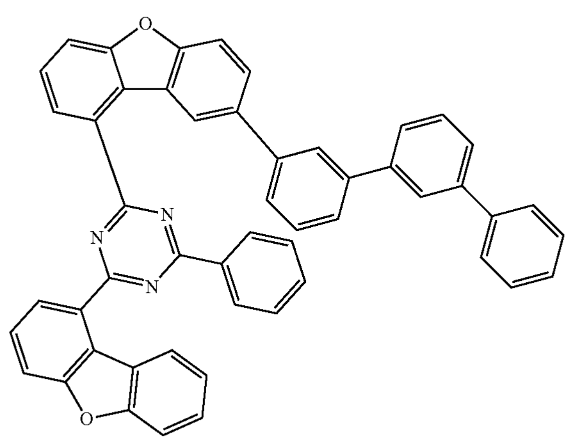
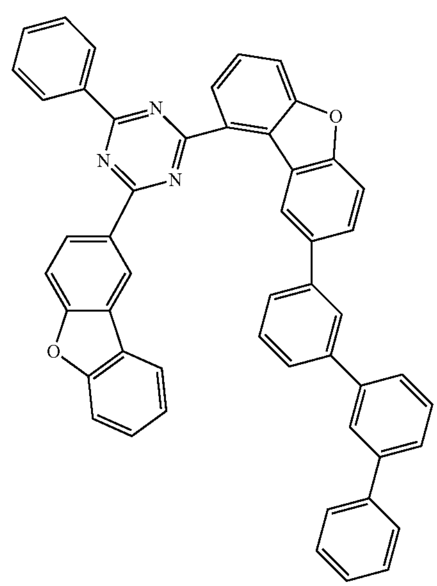
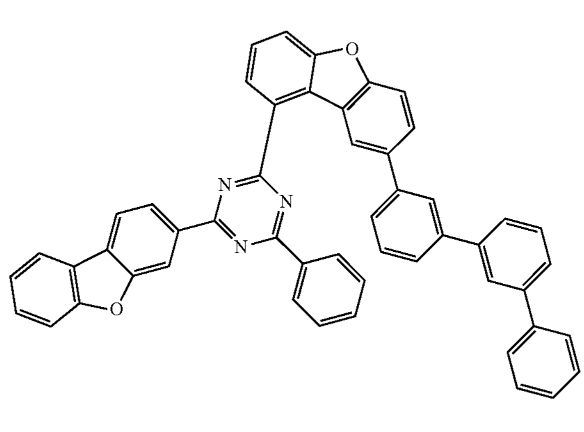
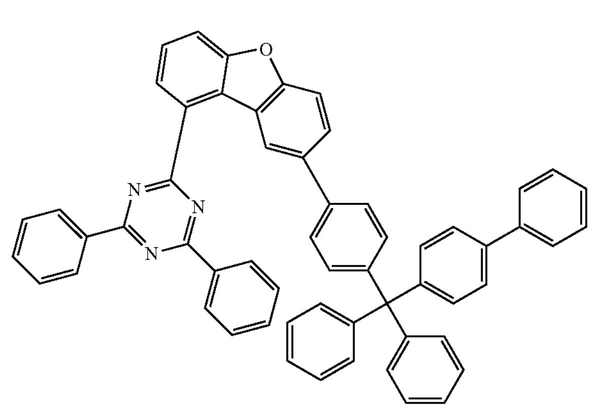

-continued
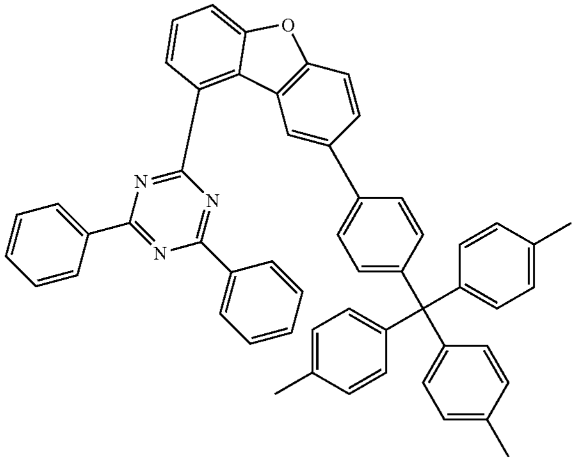
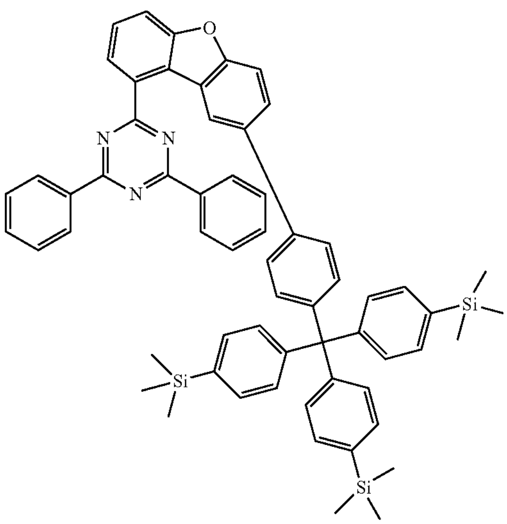
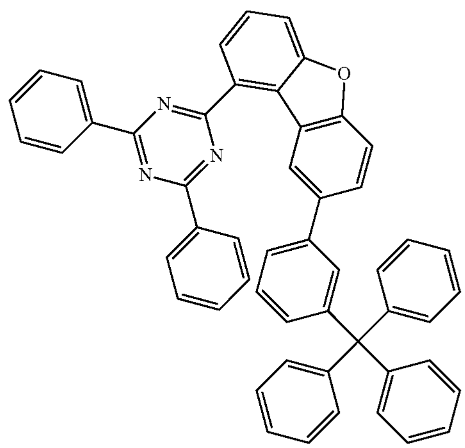
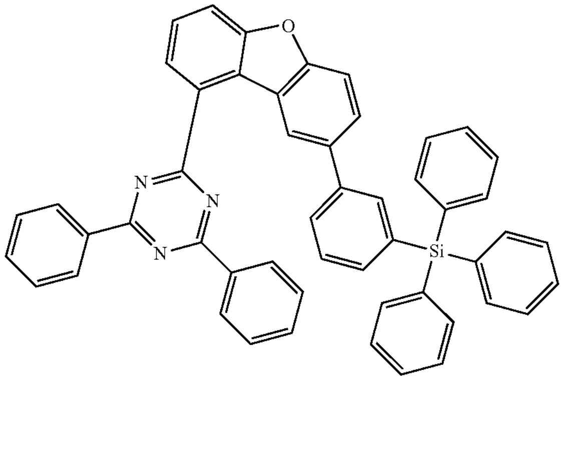
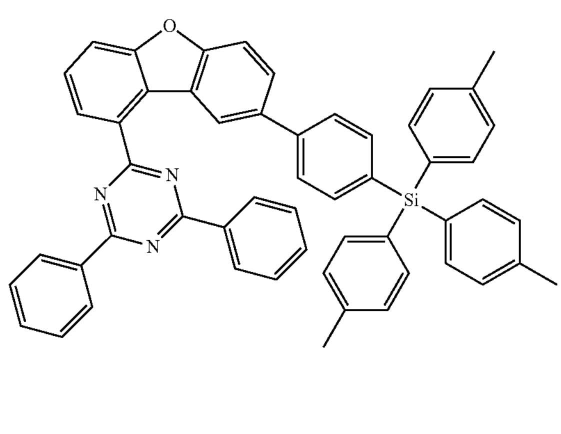

-continued
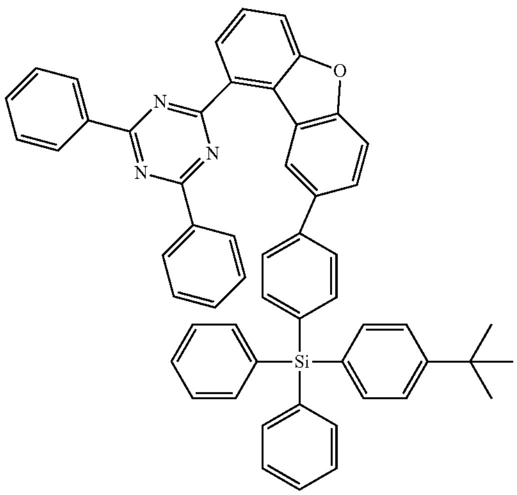
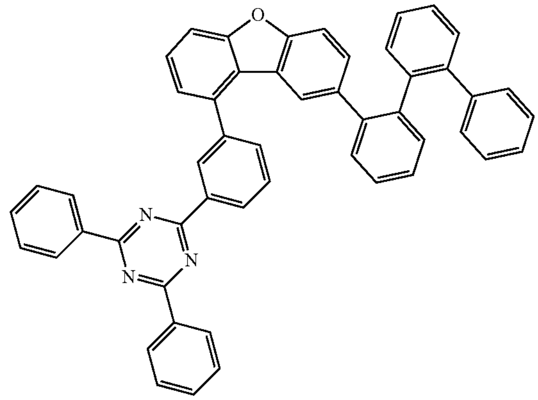
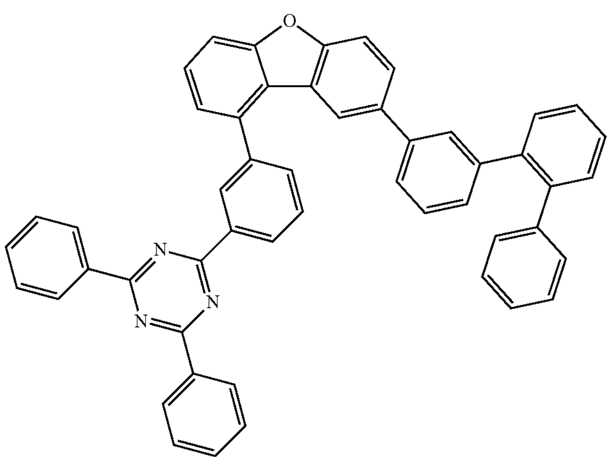
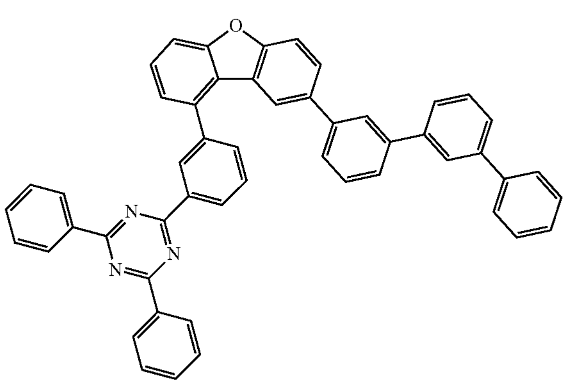
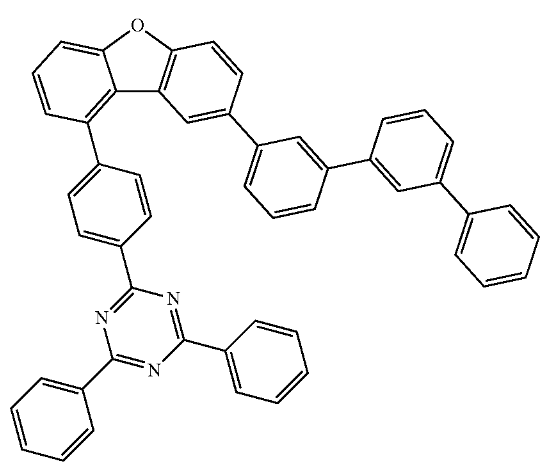

-continued
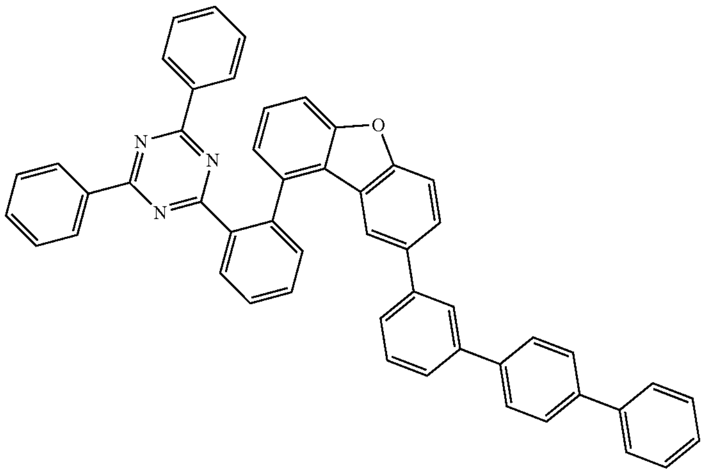
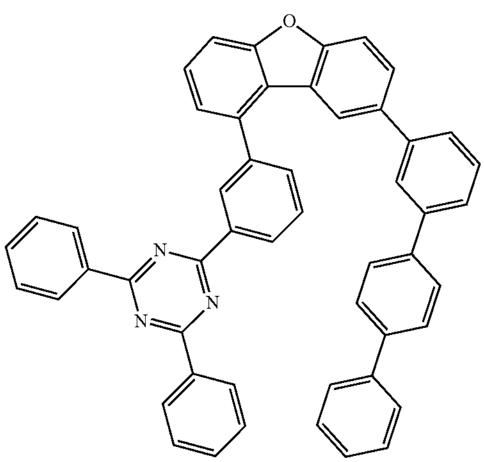
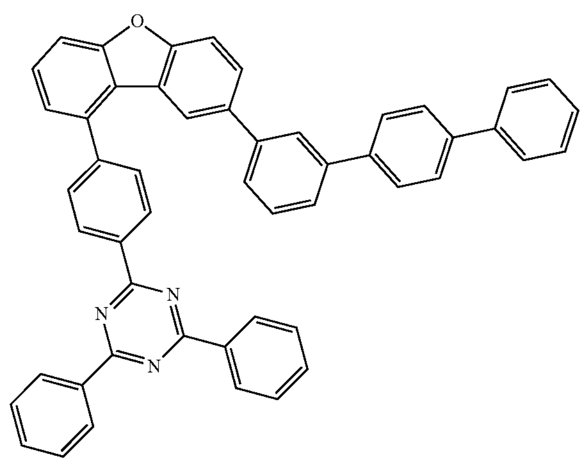
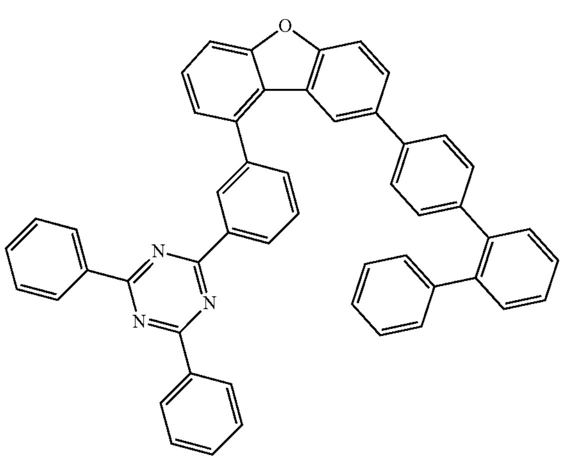
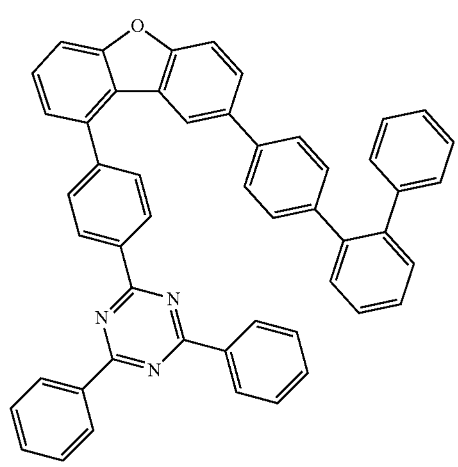

-continued
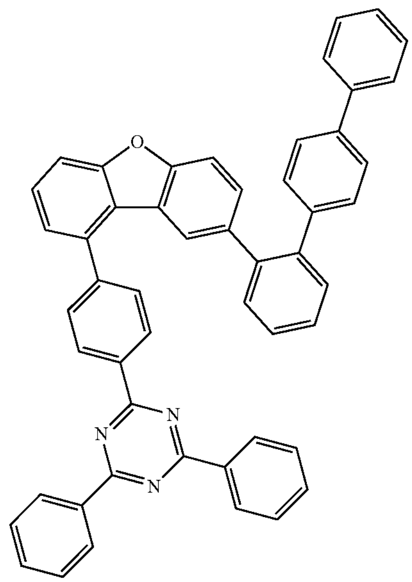
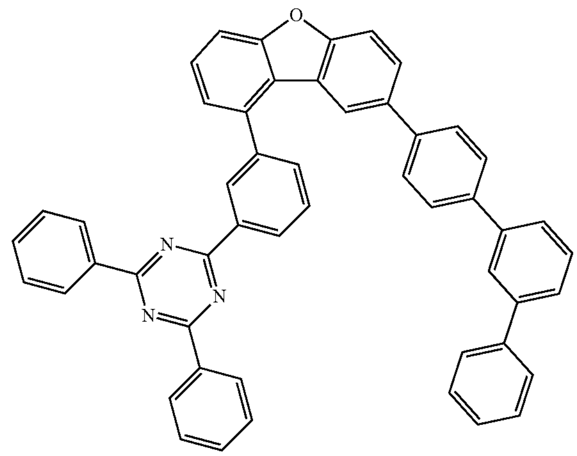
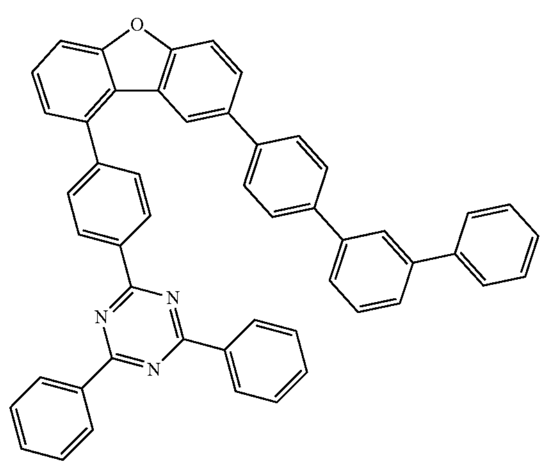
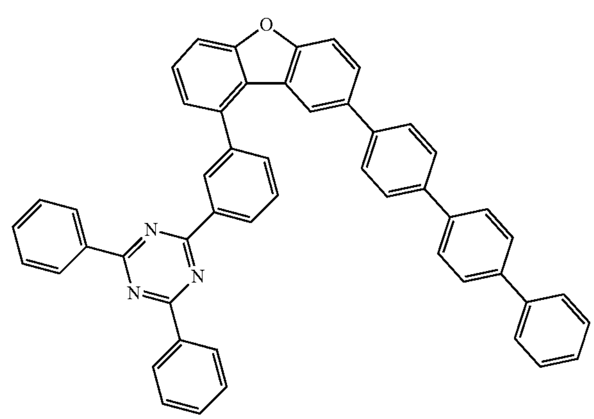
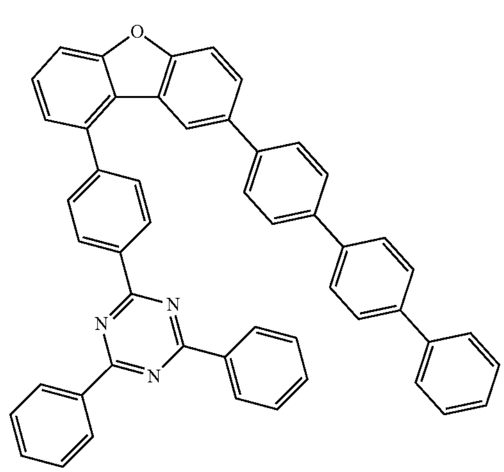
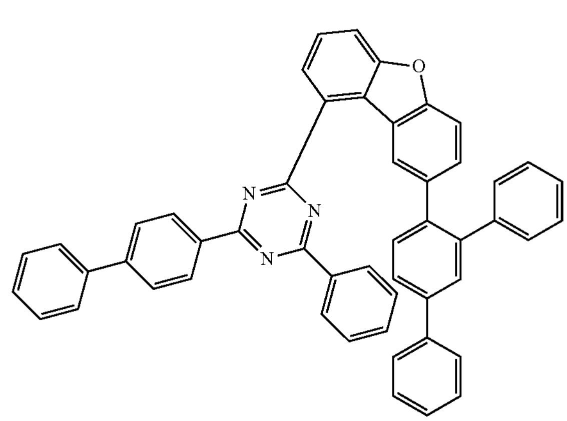

-continued
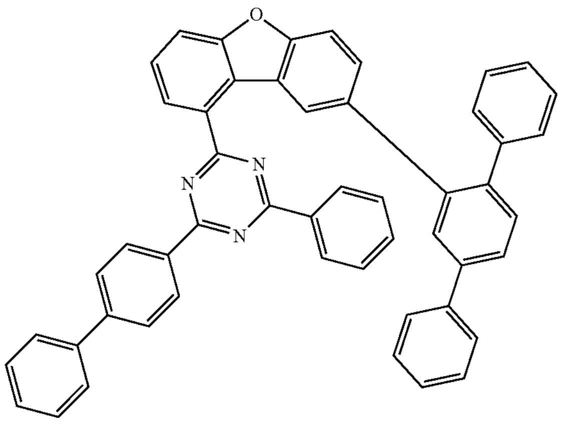
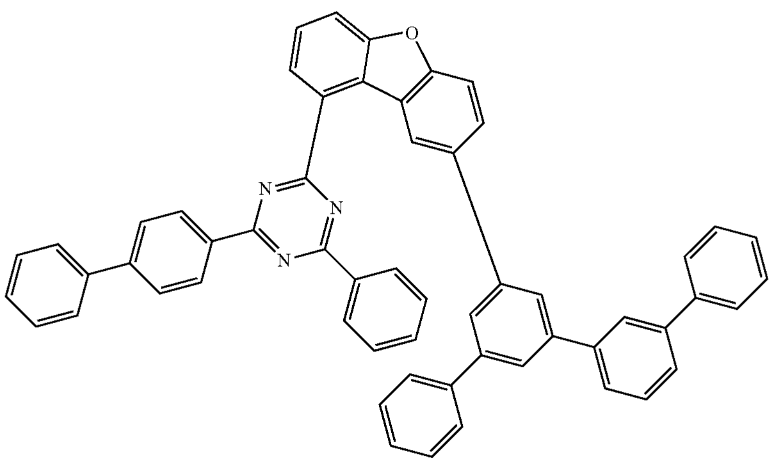
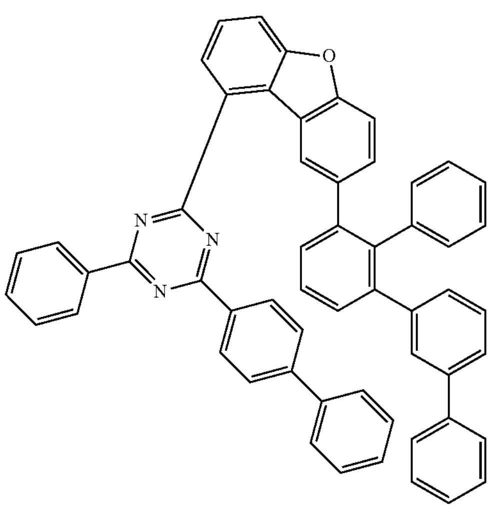
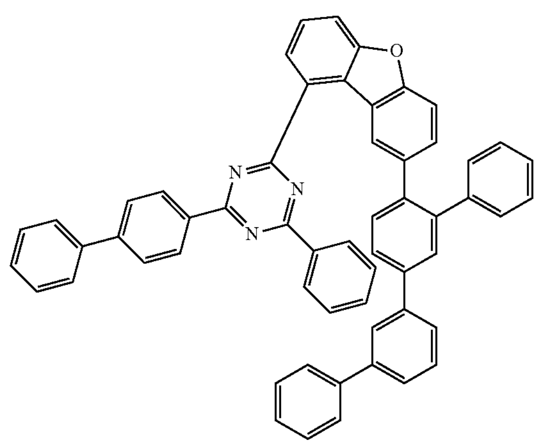

-continued
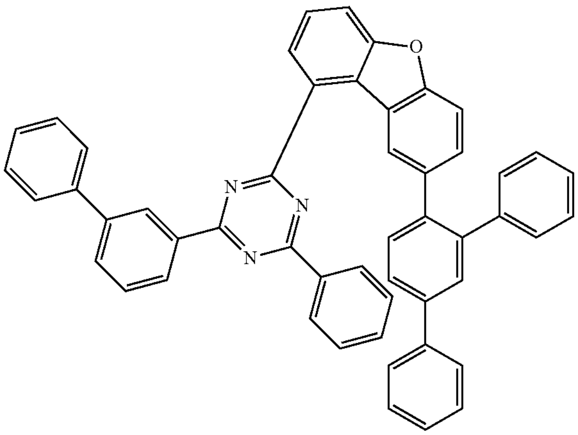
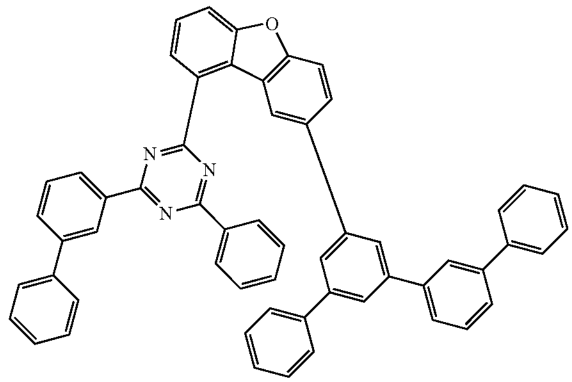
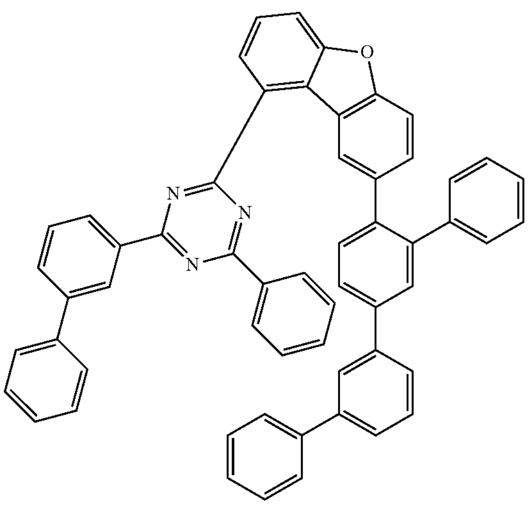
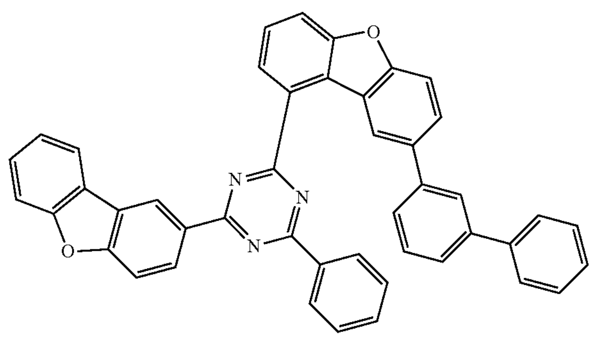
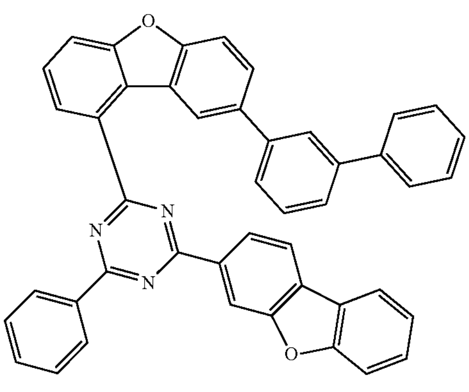
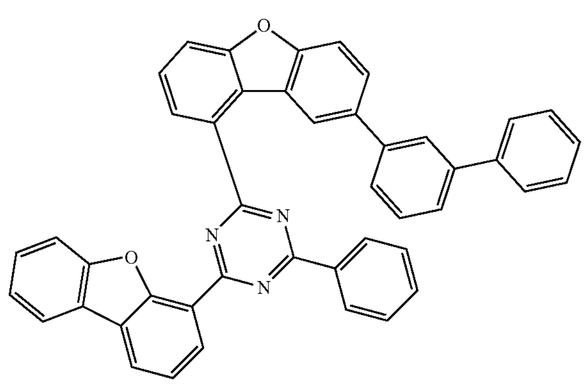

-continued
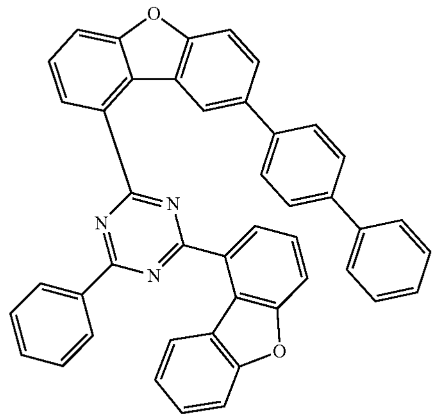
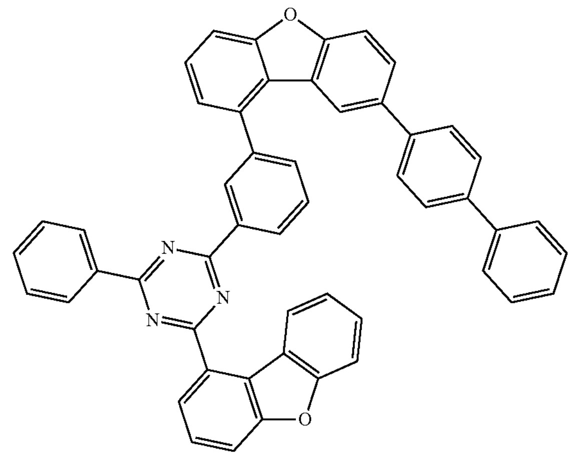
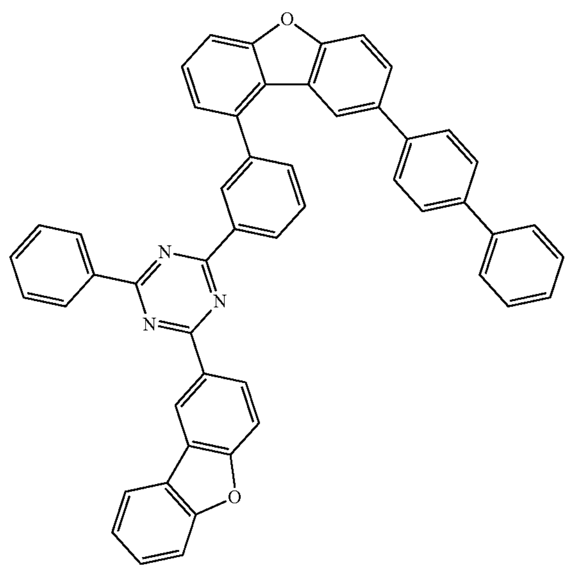
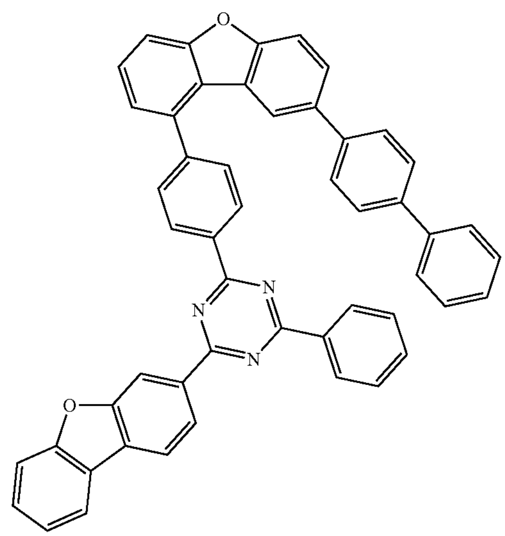
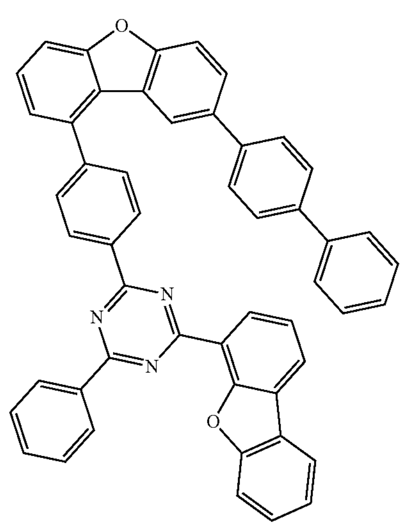
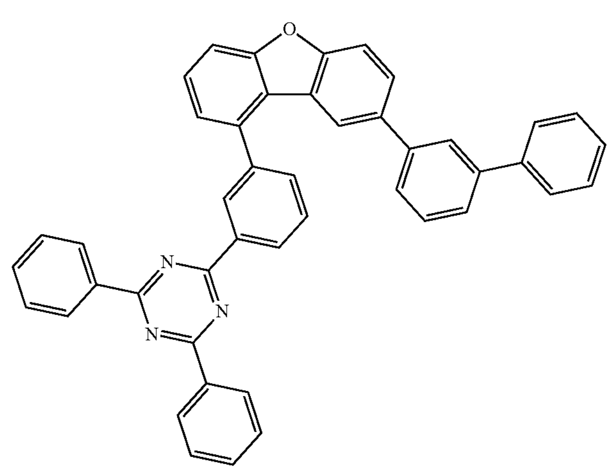

-continued
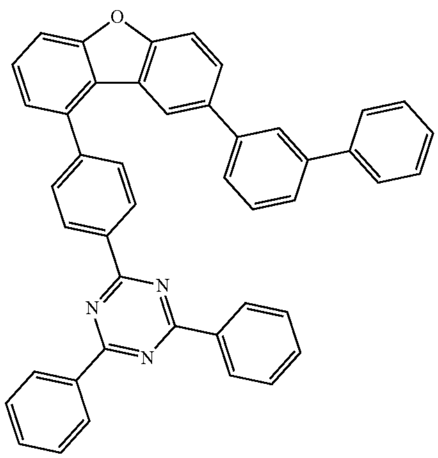
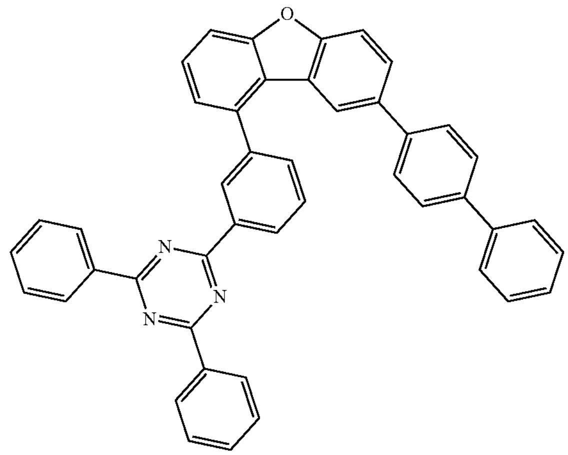
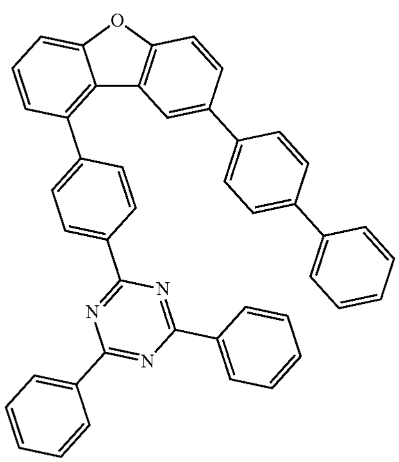
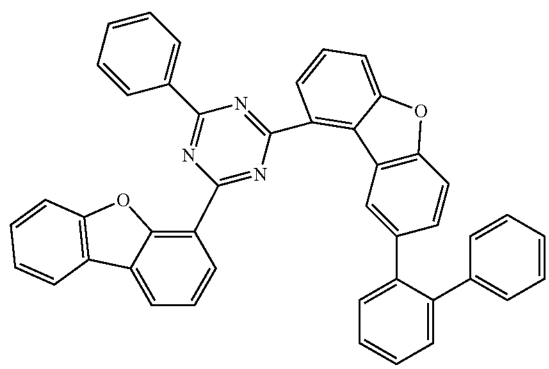
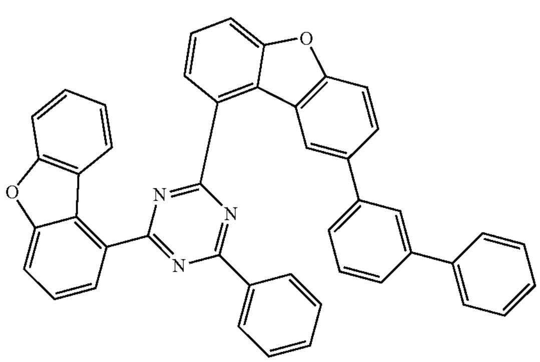
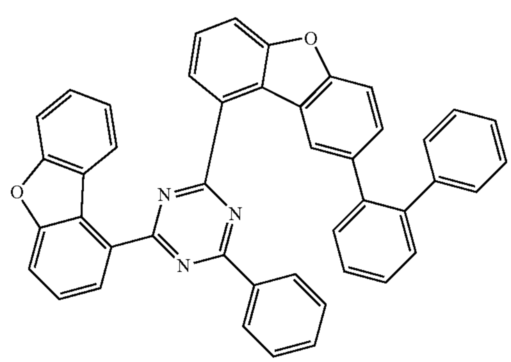

-continued
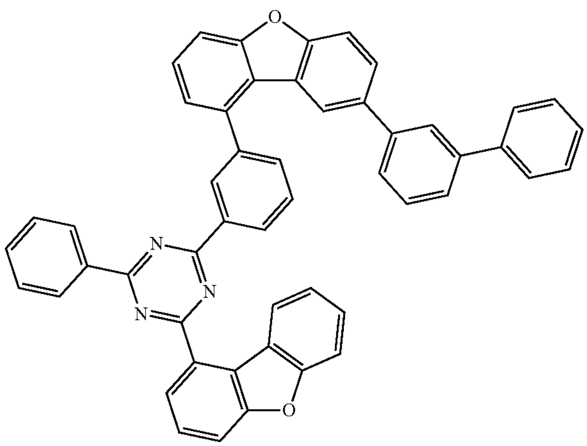
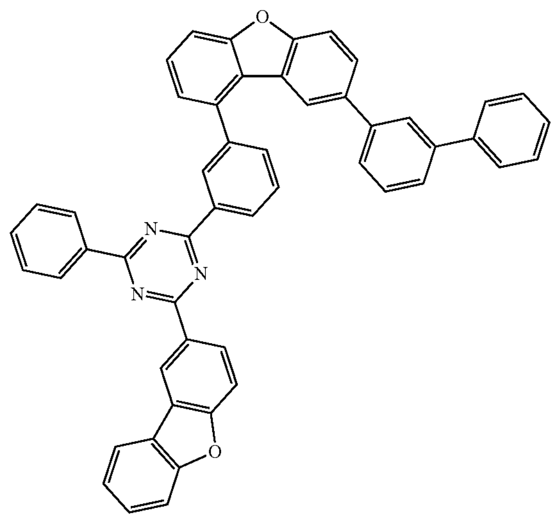
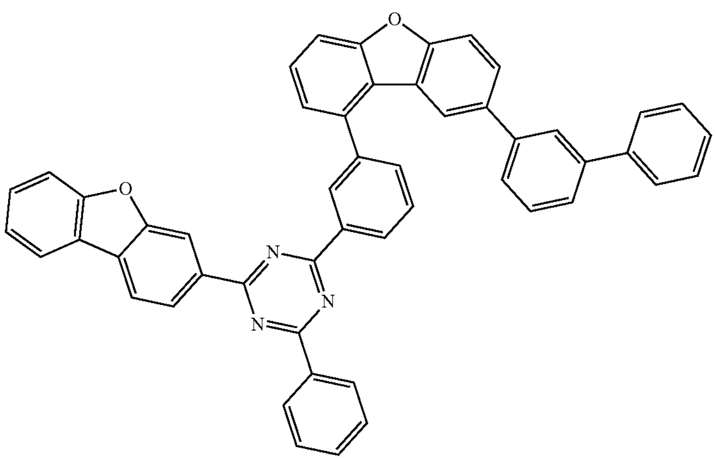
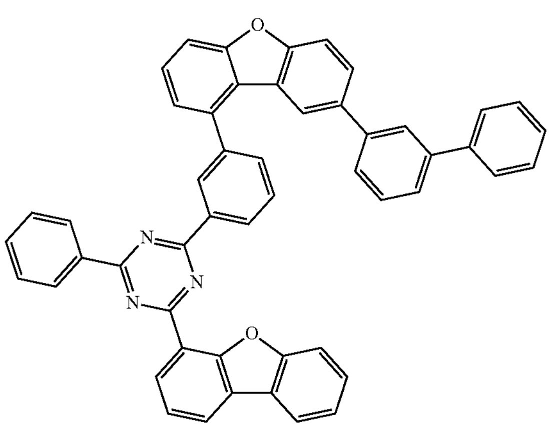
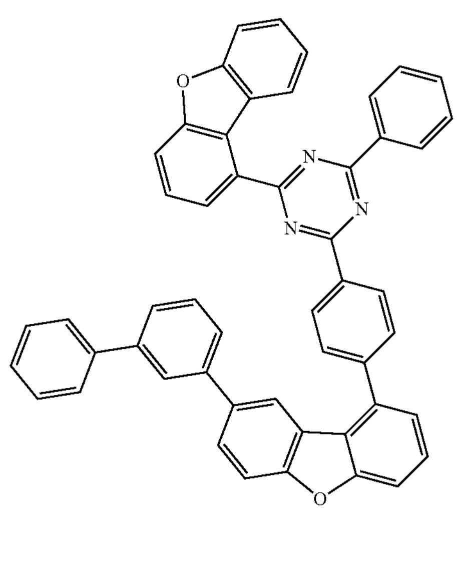

-continued
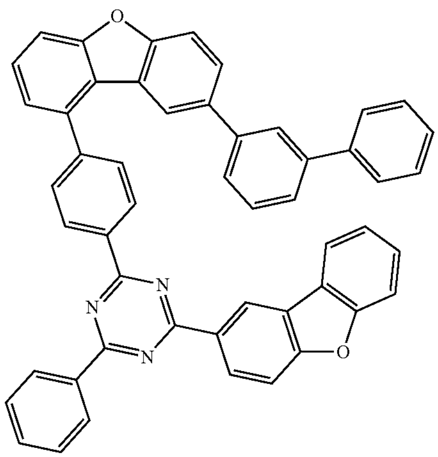
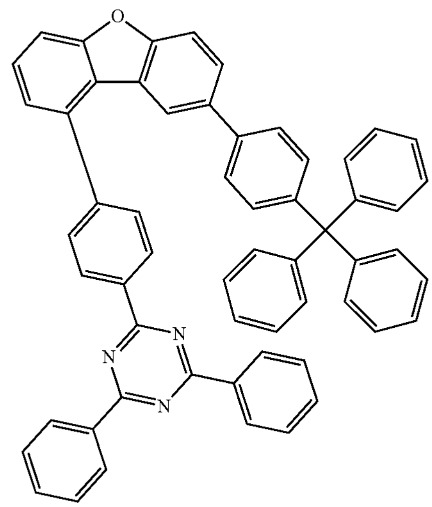
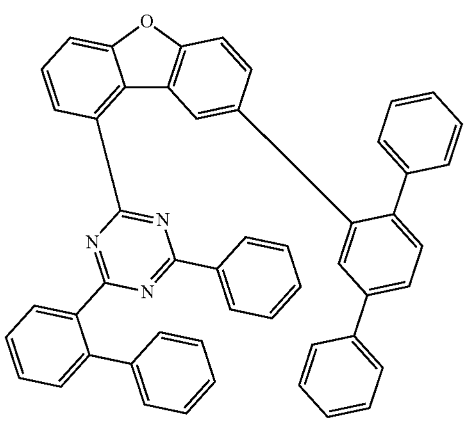
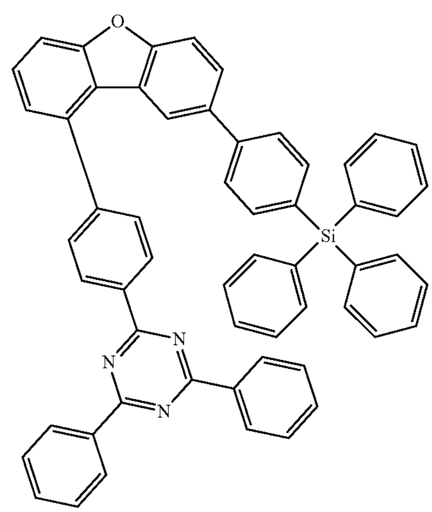
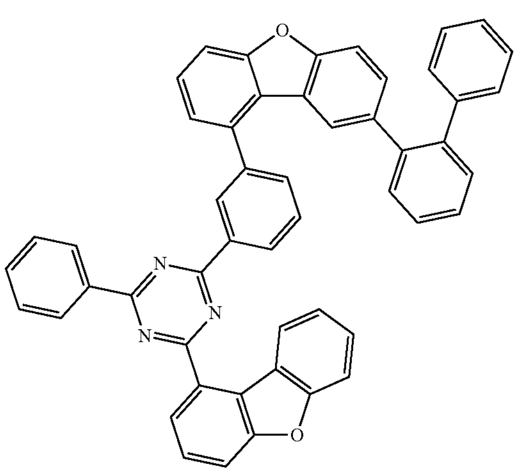
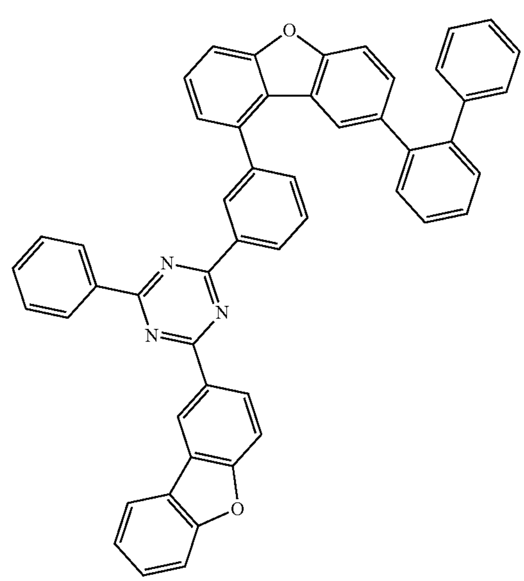

-continued
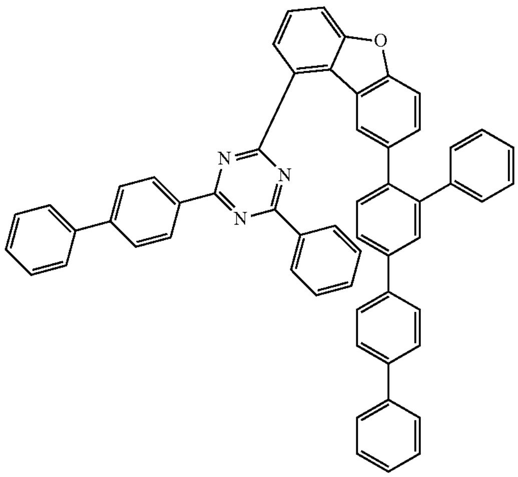
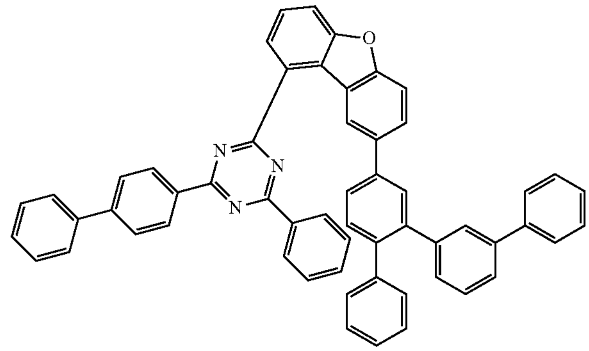
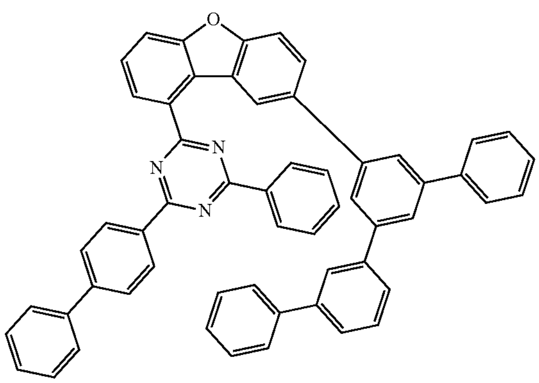
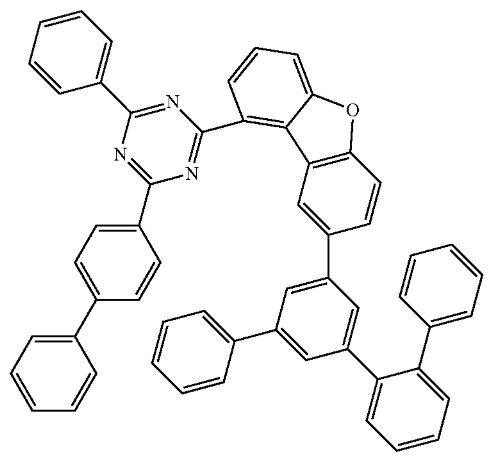
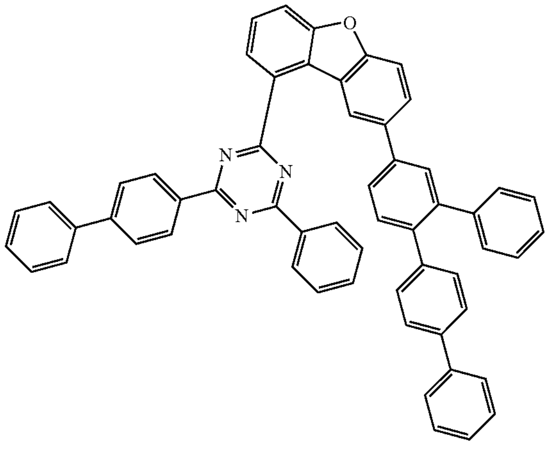
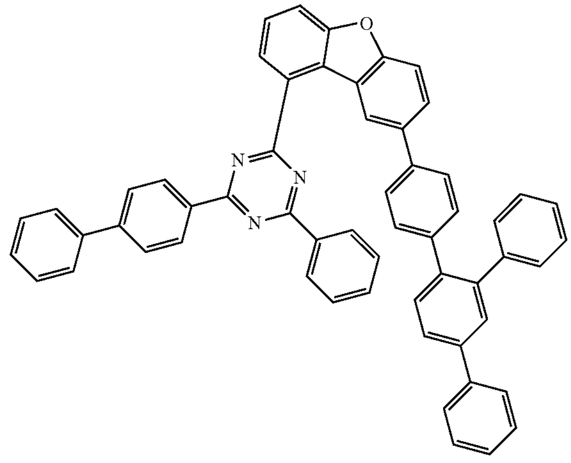

-continued
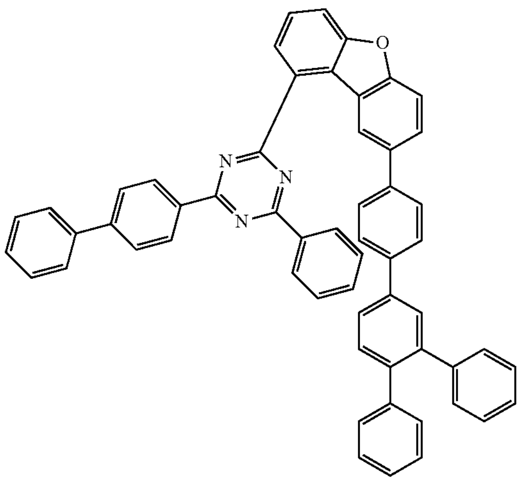
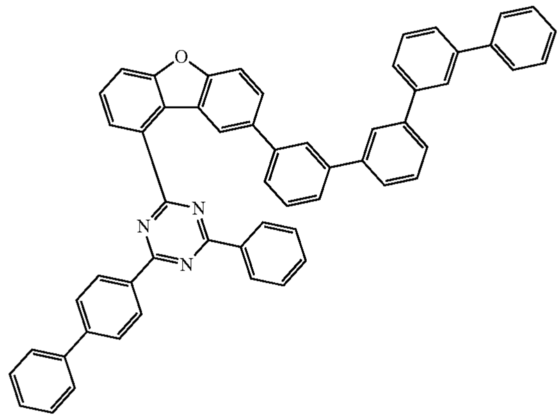
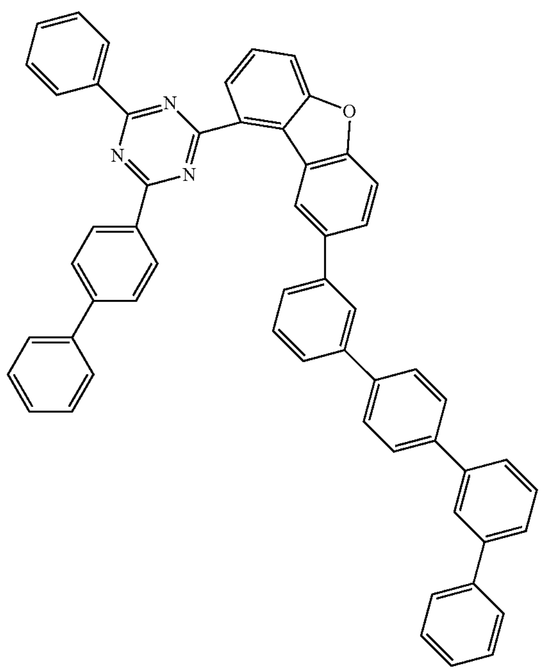
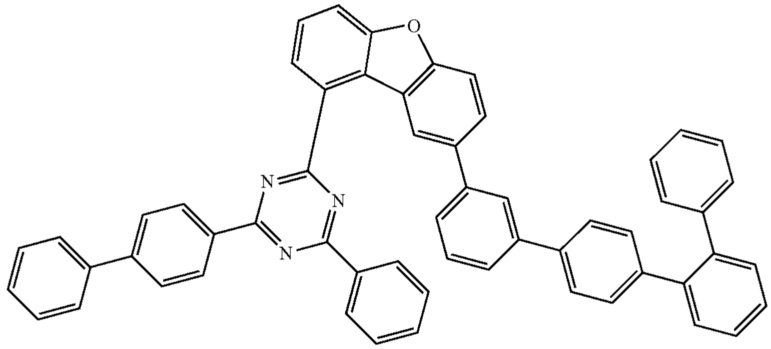

-continued
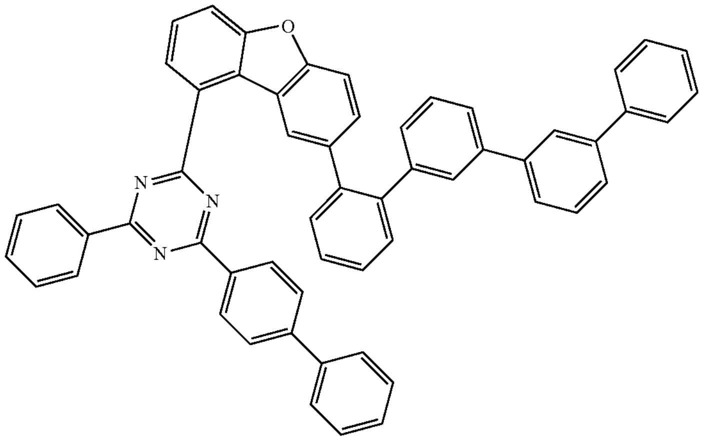
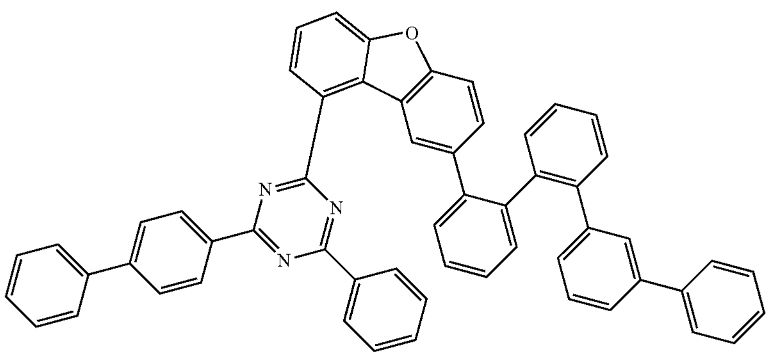
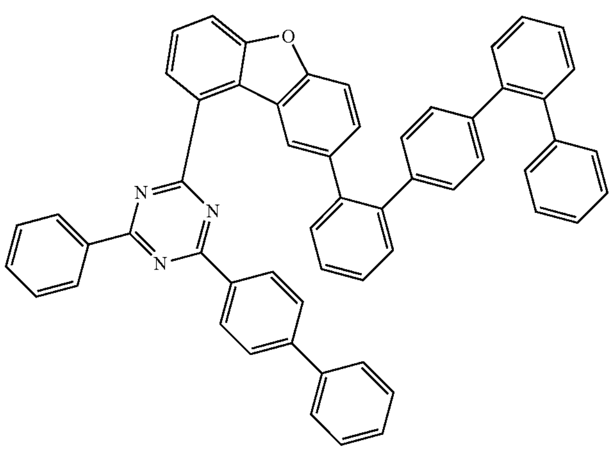
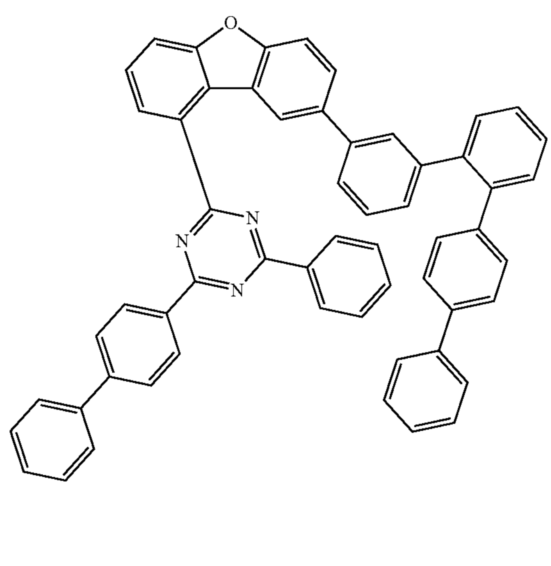

-continued
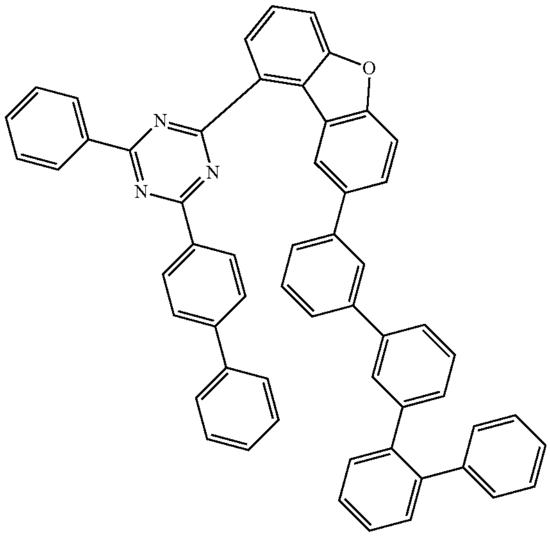
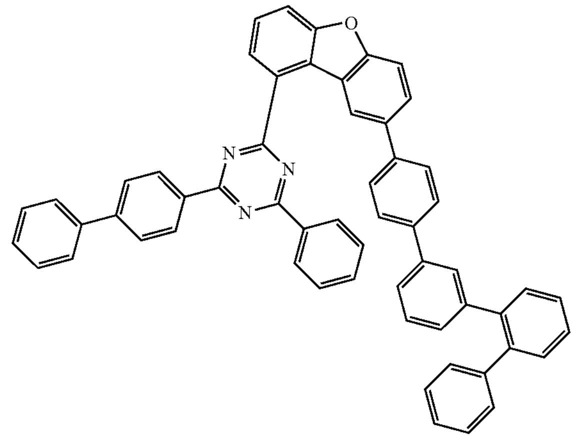
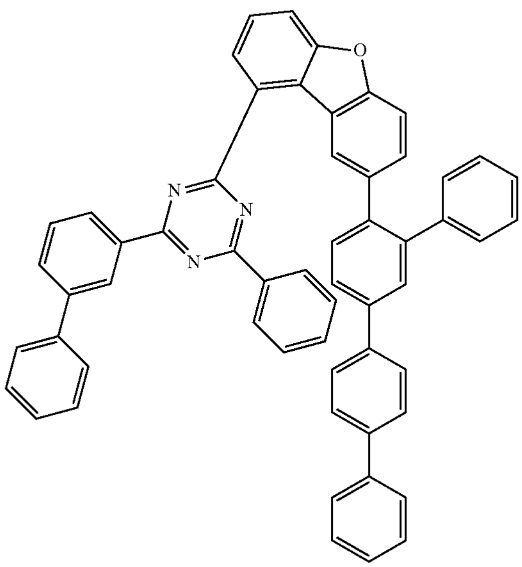
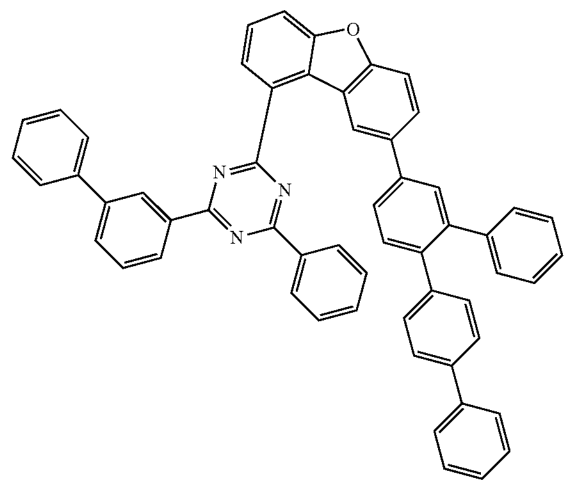
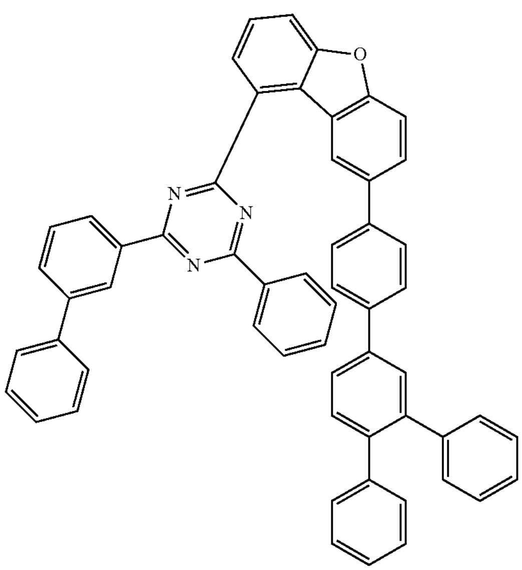
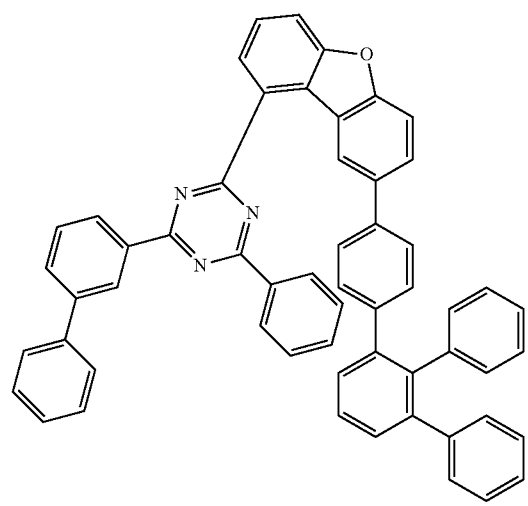

-continued
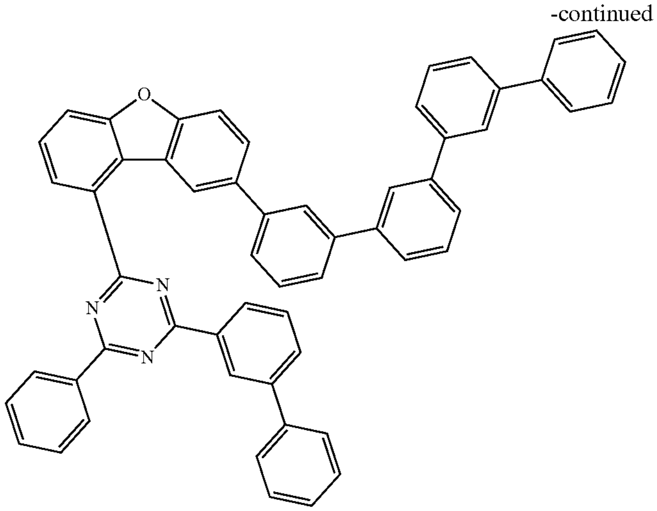
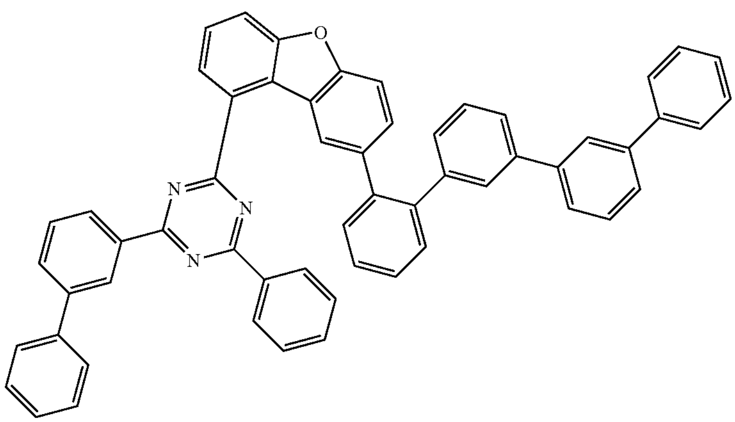
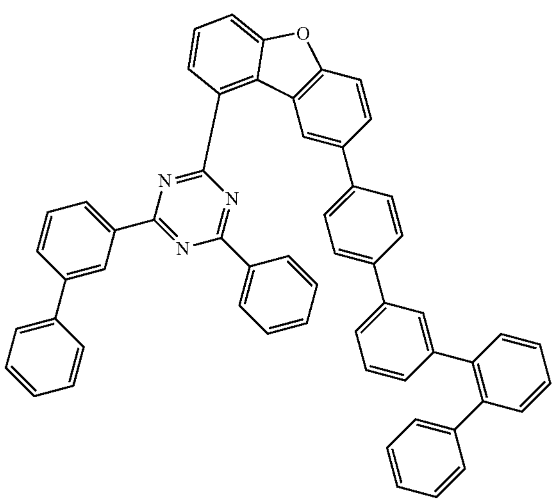
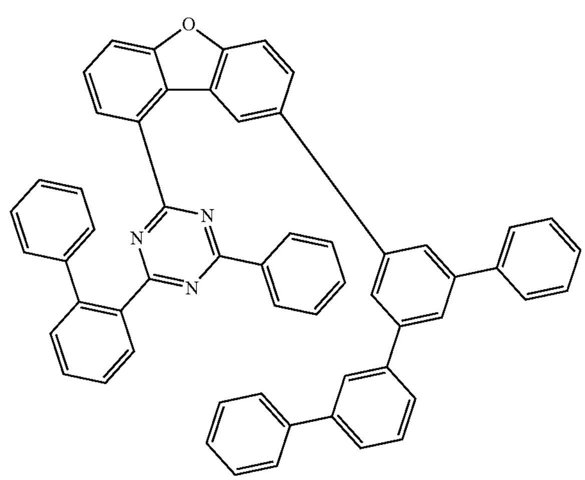

-continued
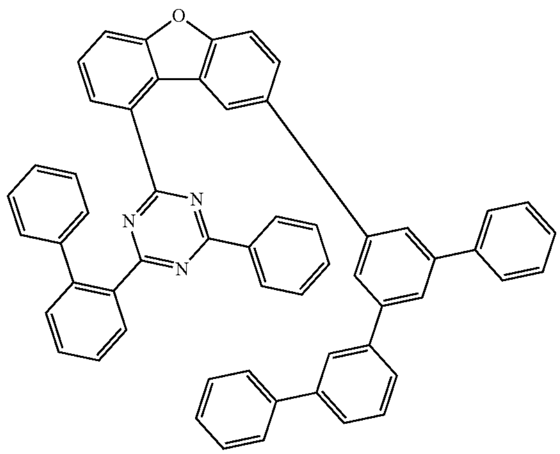
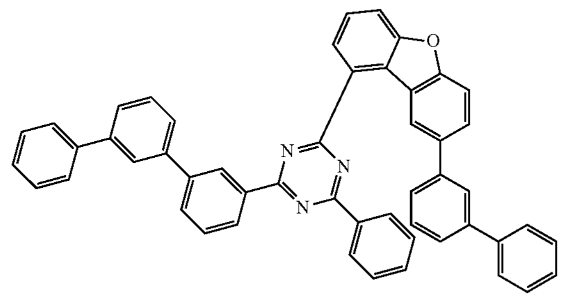
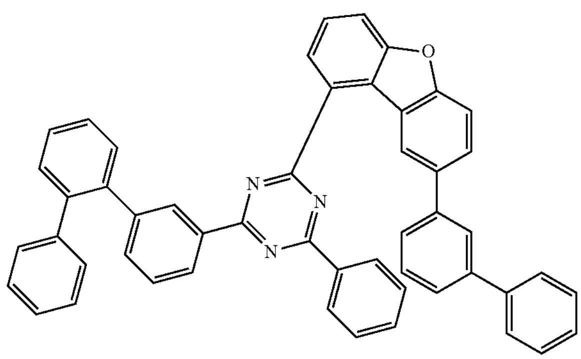
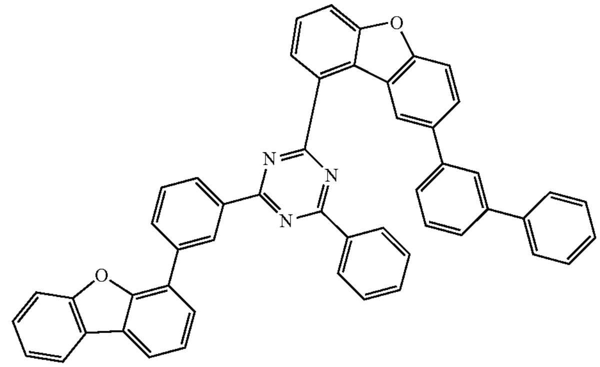
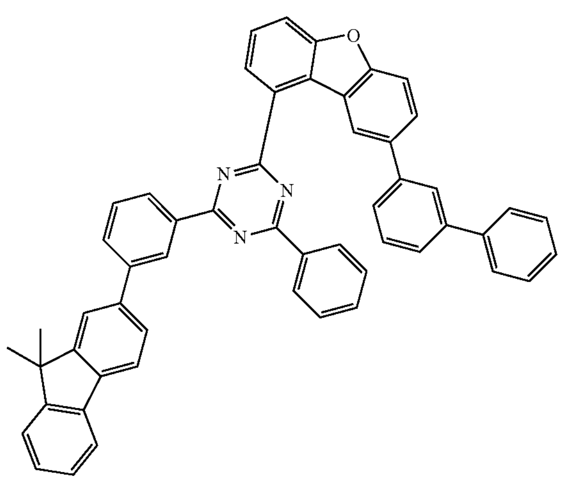
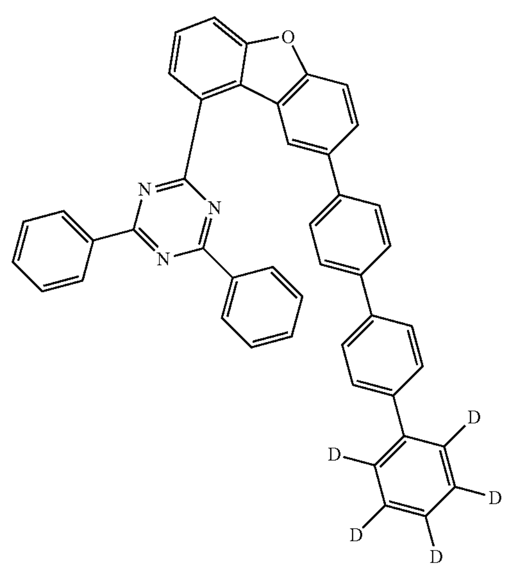

-continued
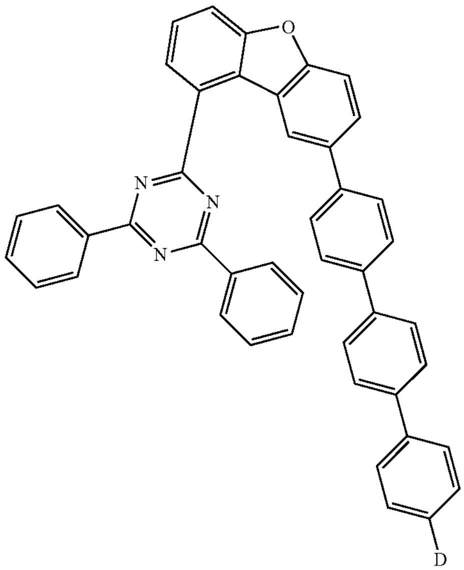
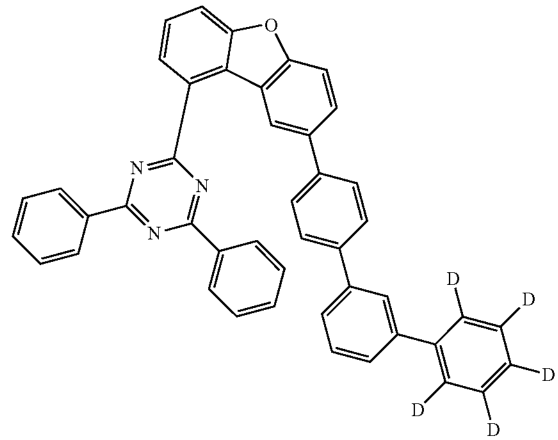
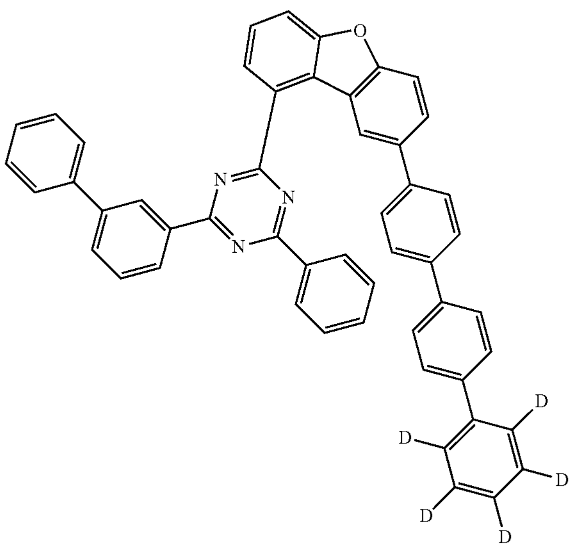
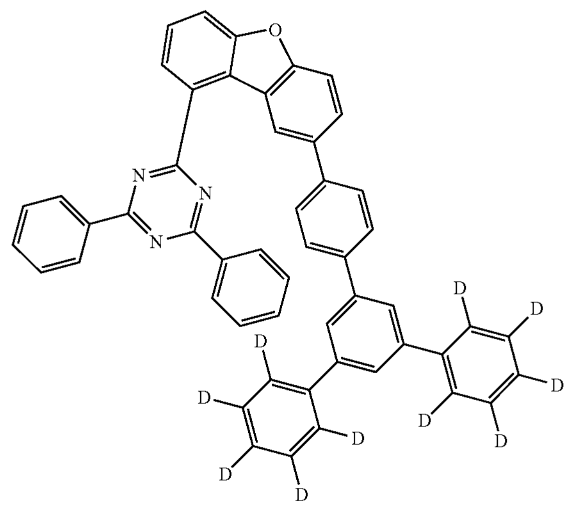
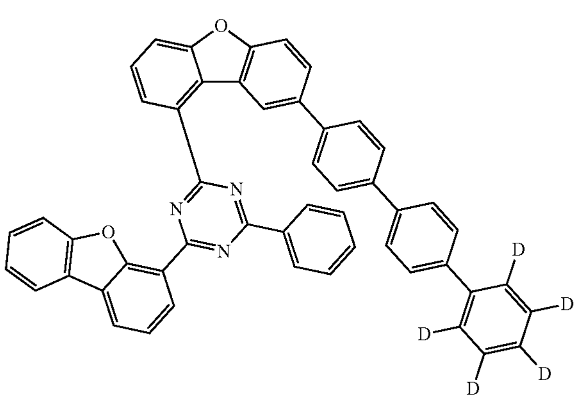
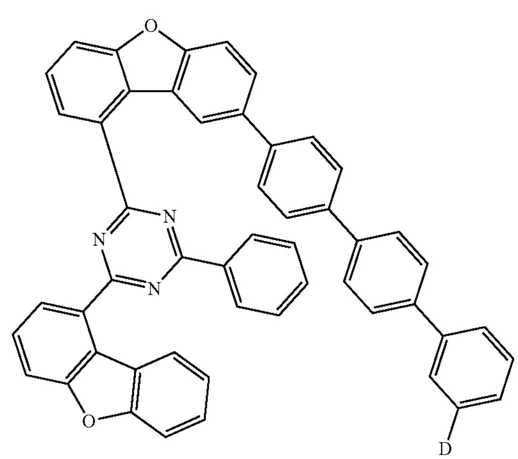

-continued
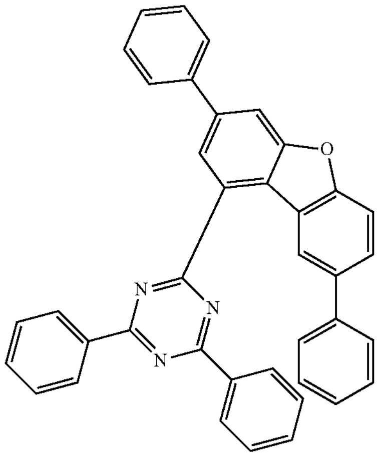
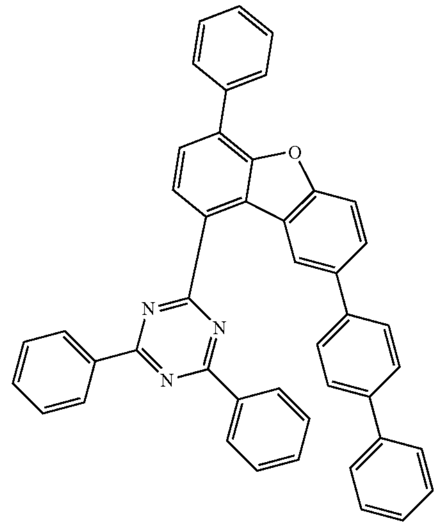
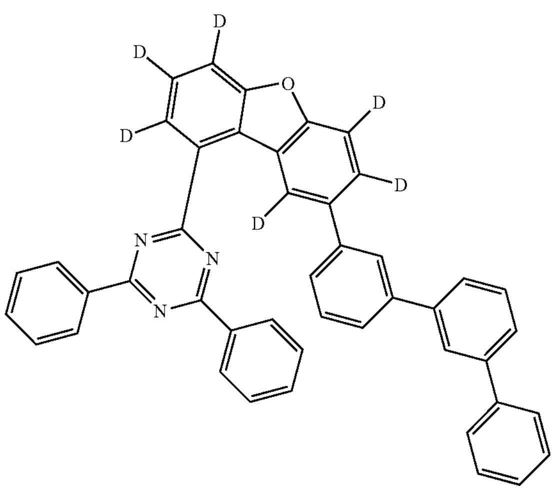
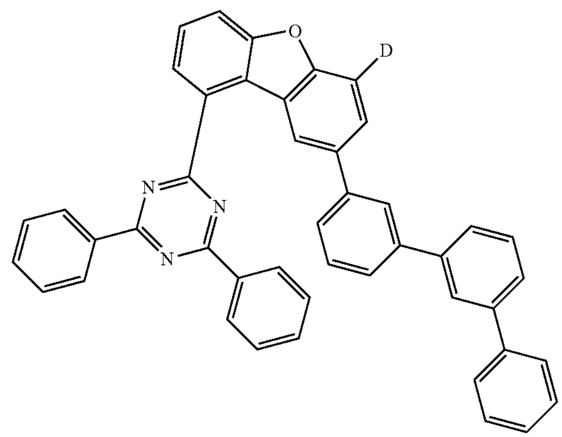
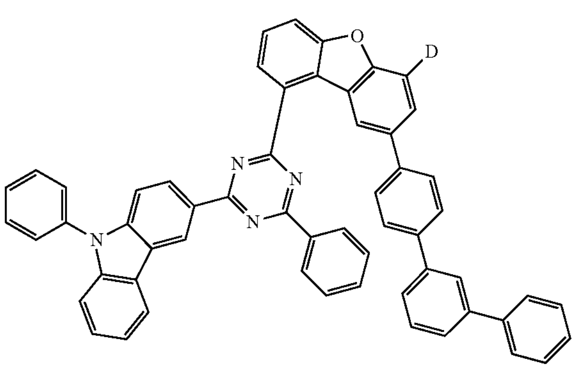
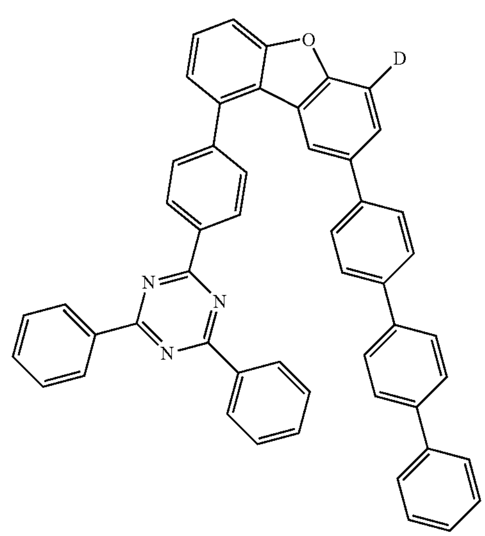

-continued
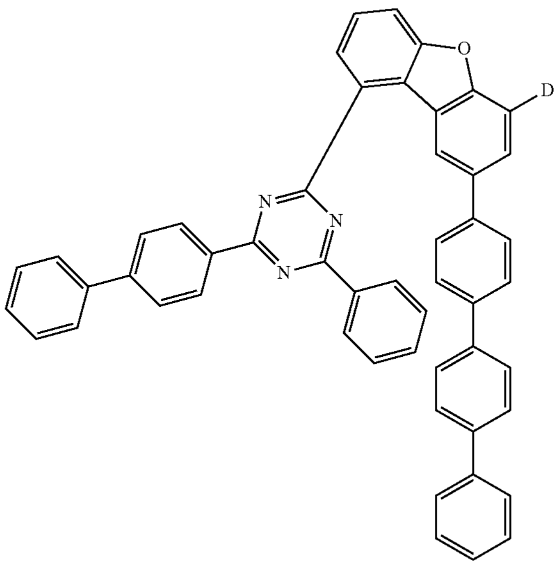
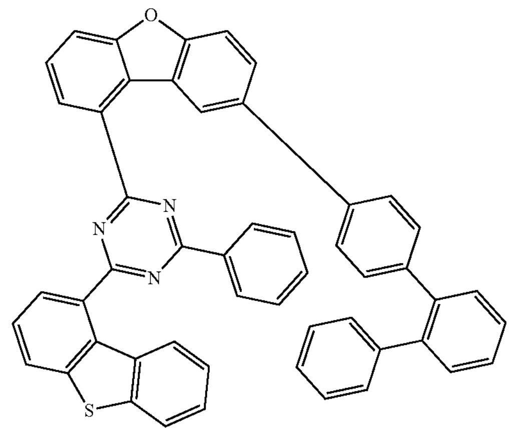
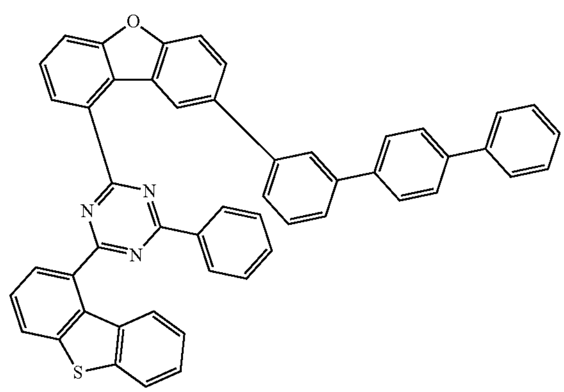
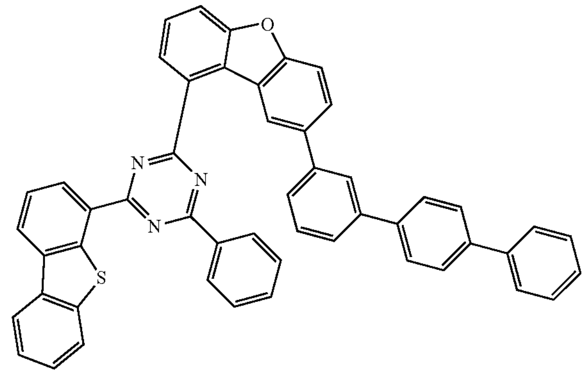
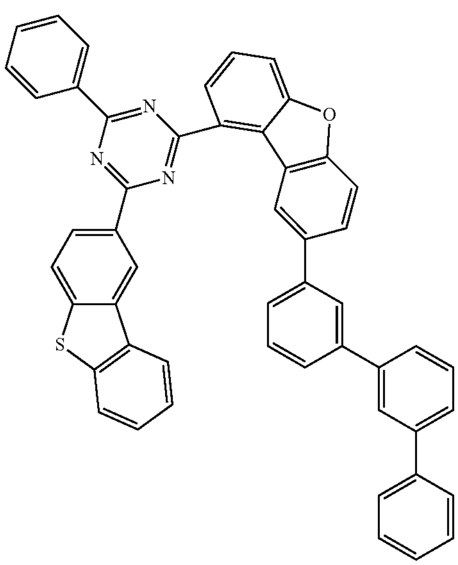
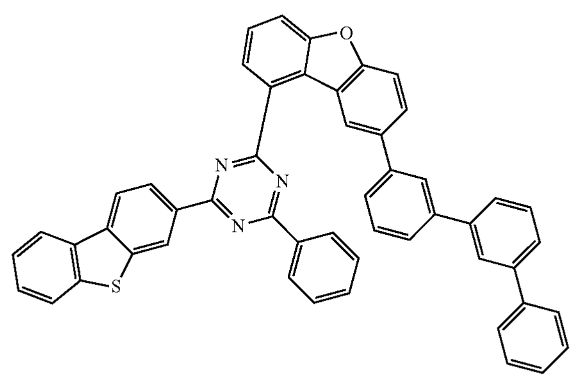

-continued
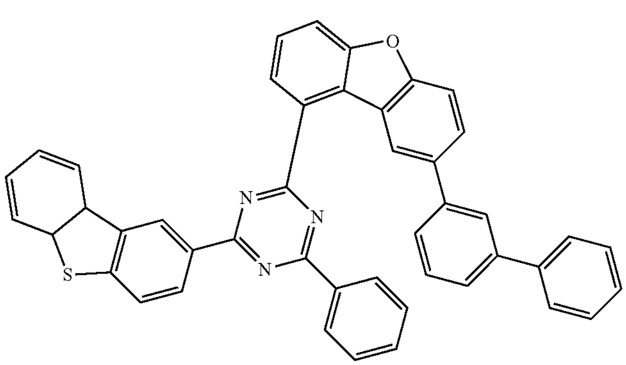
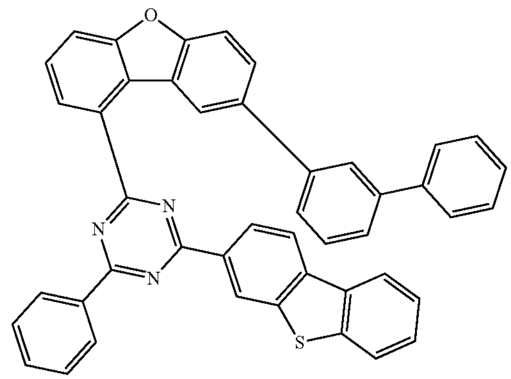
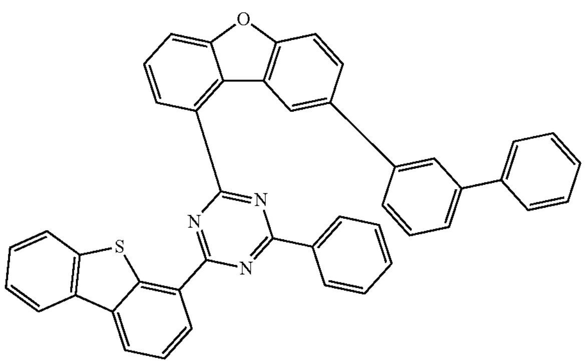
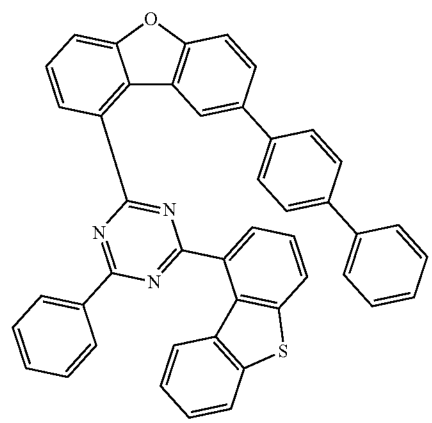
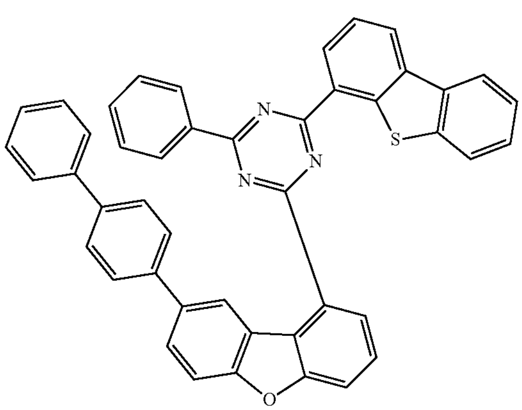
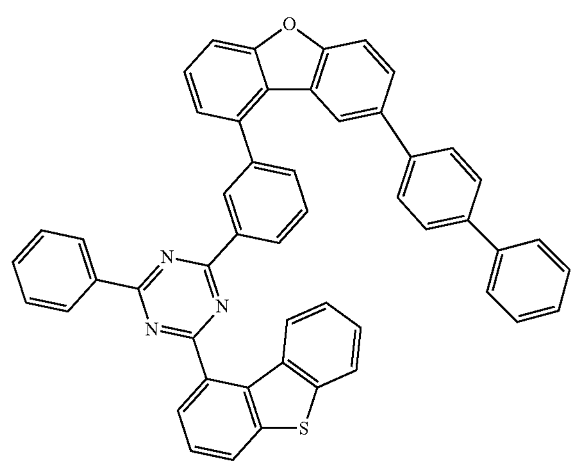

-continued
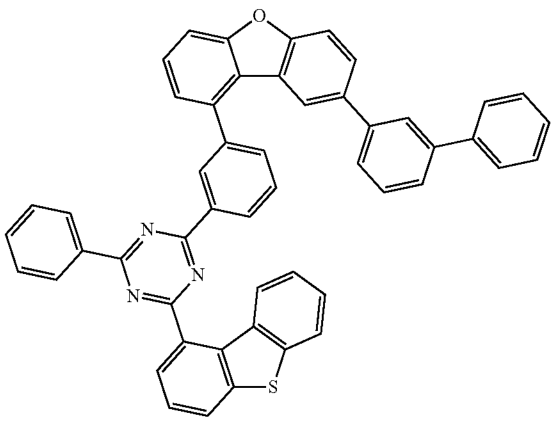
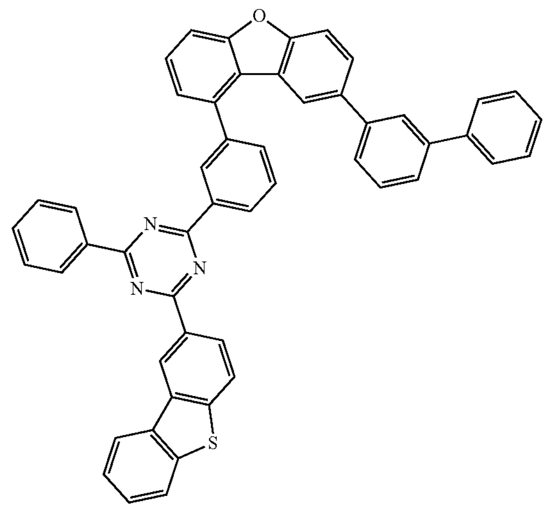
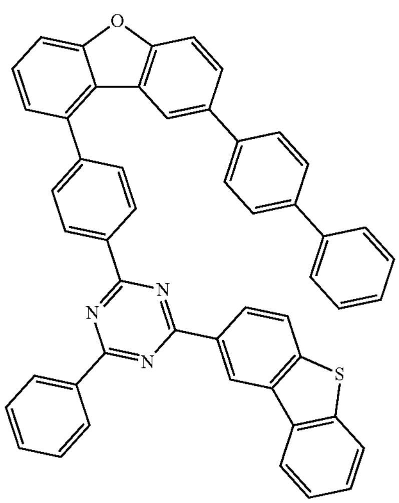
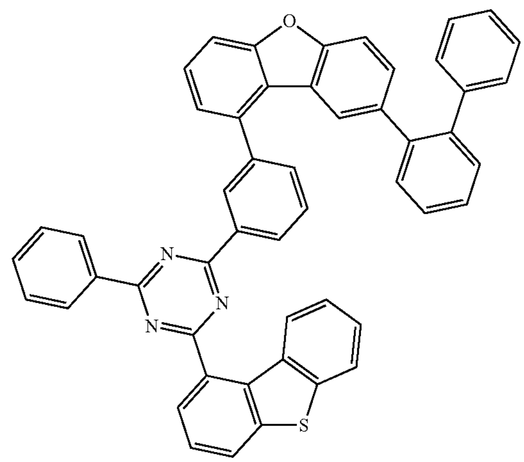
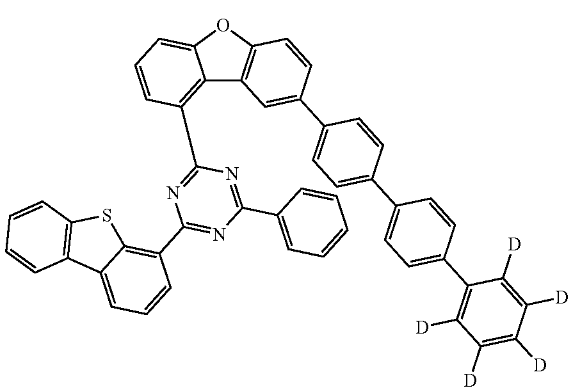
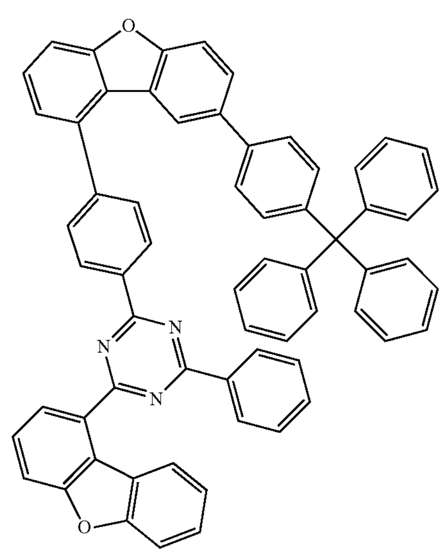

-continued
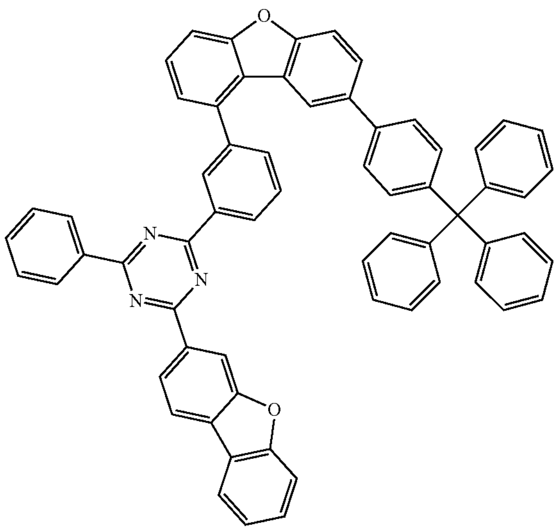
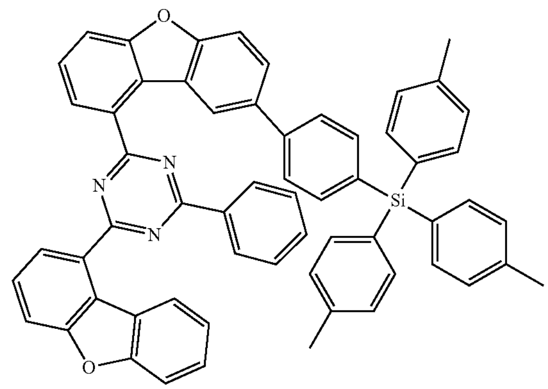
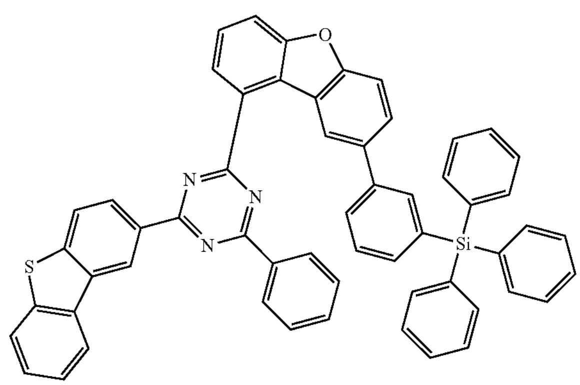
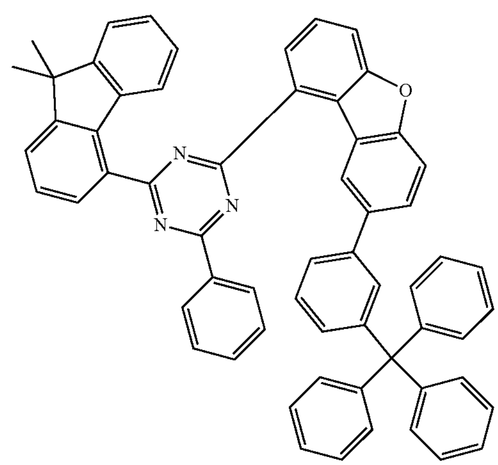
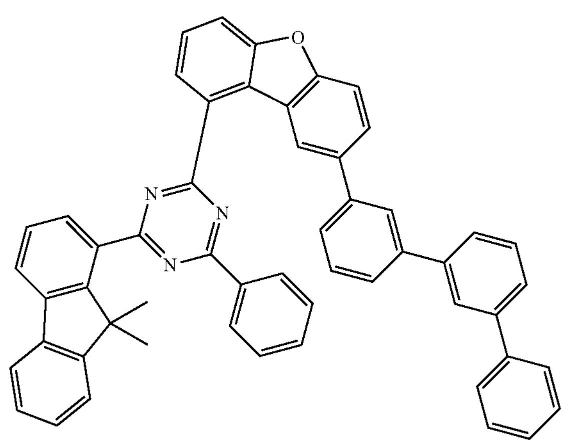
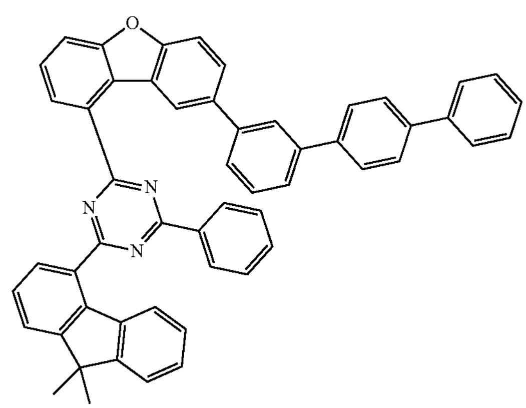

-continued
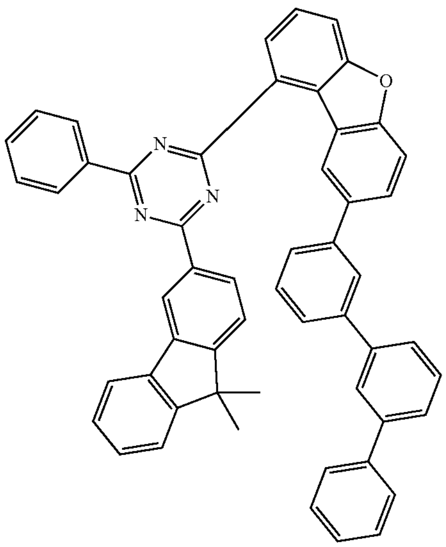
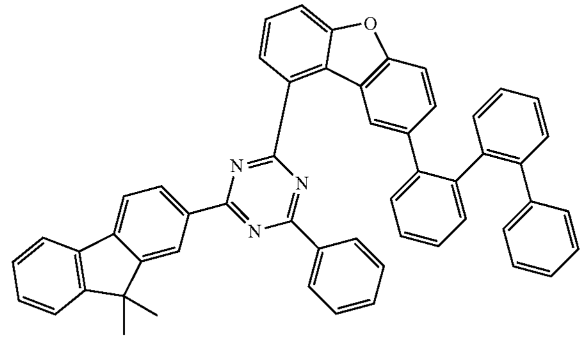
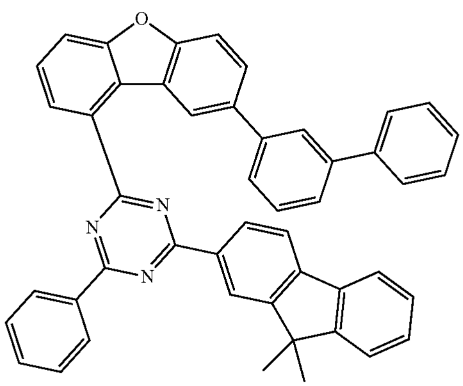
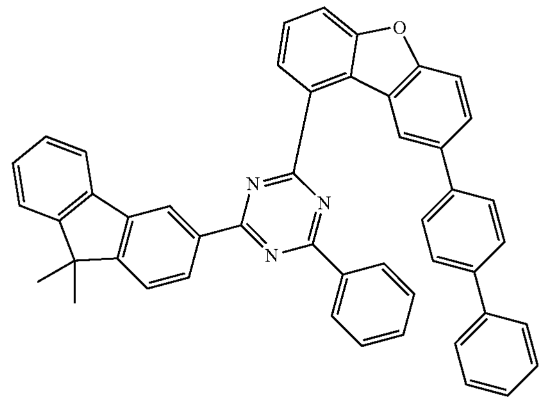
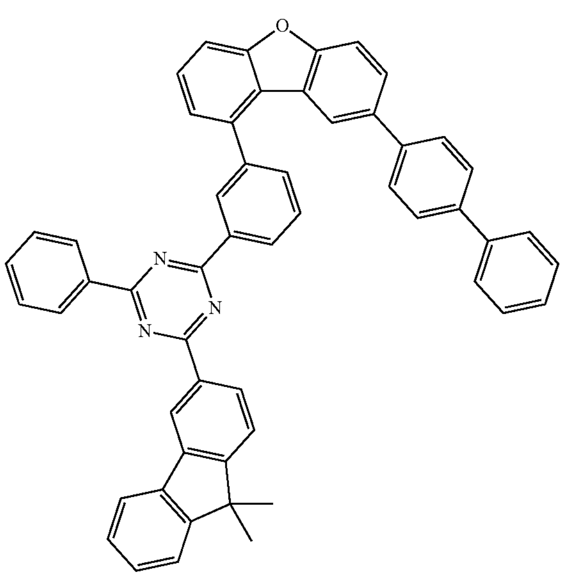
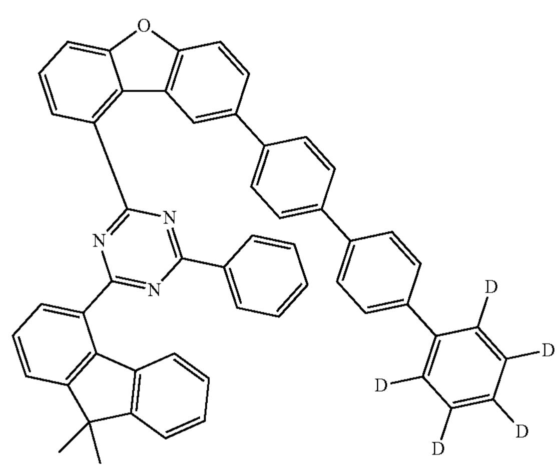

-continued
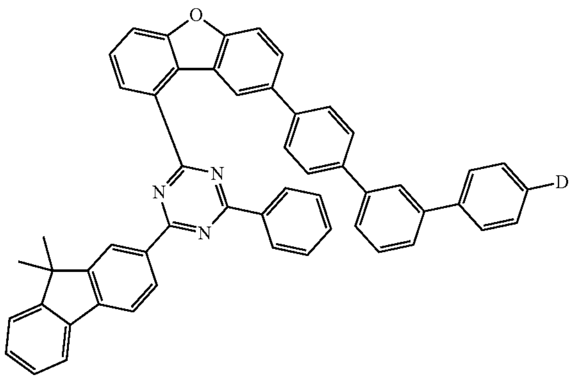
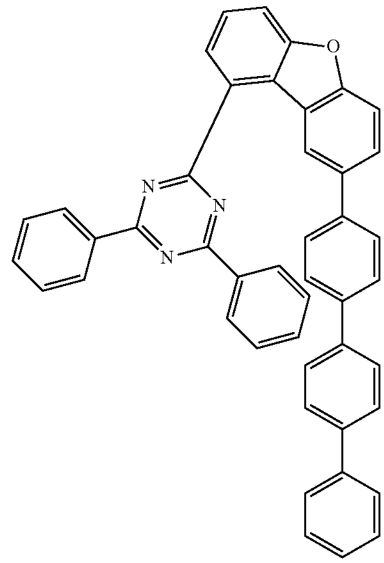
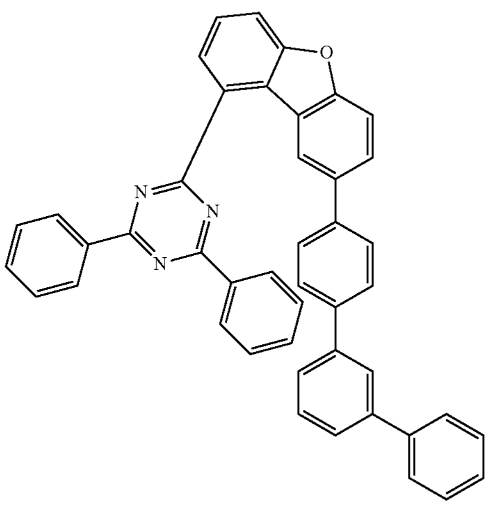
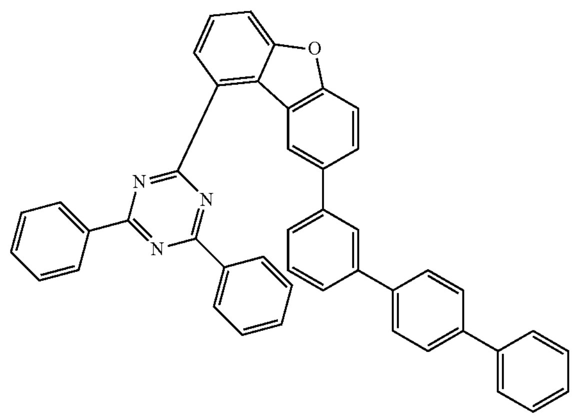
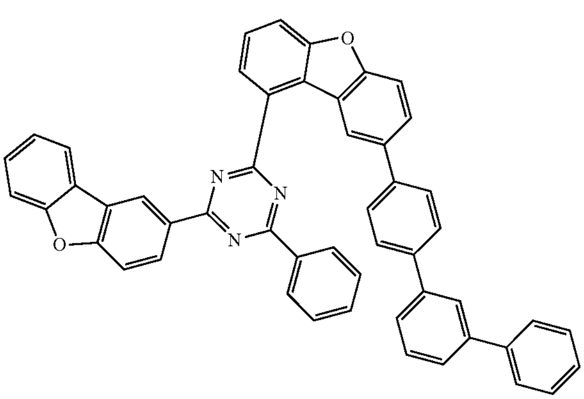
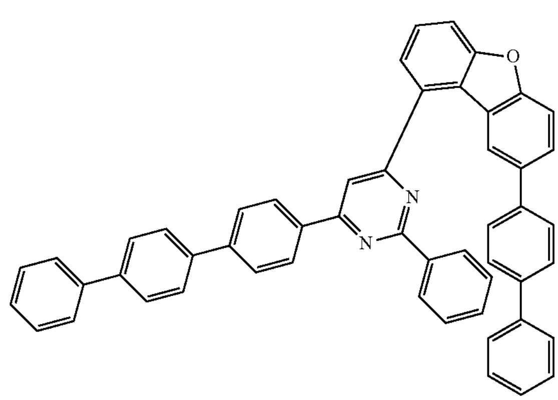

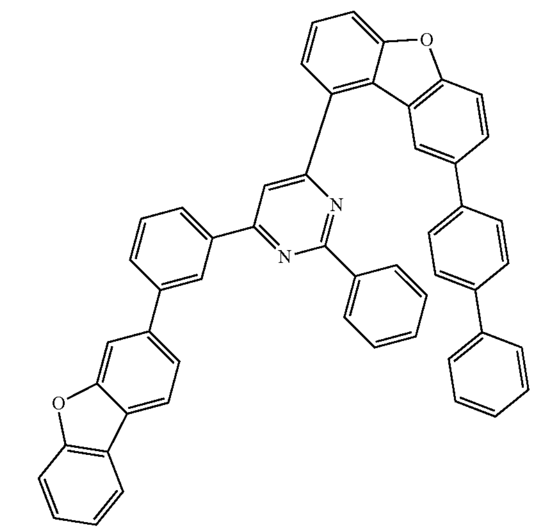
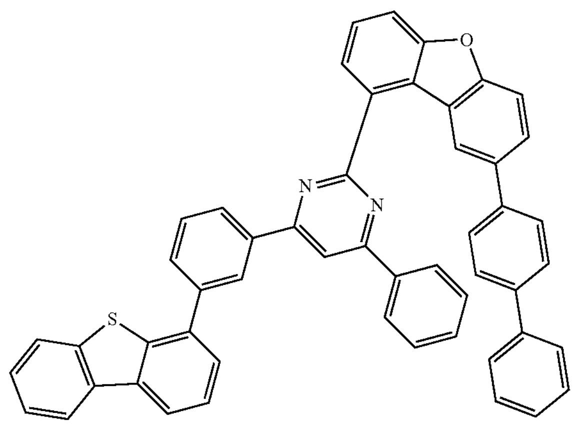
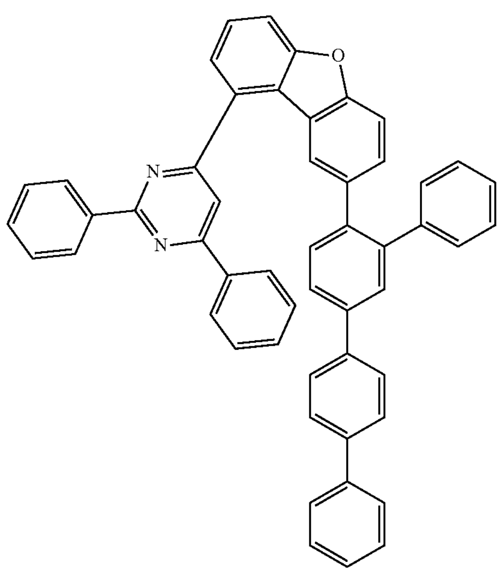
-continued
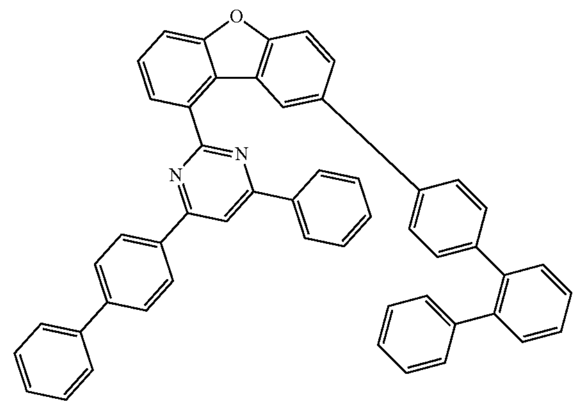
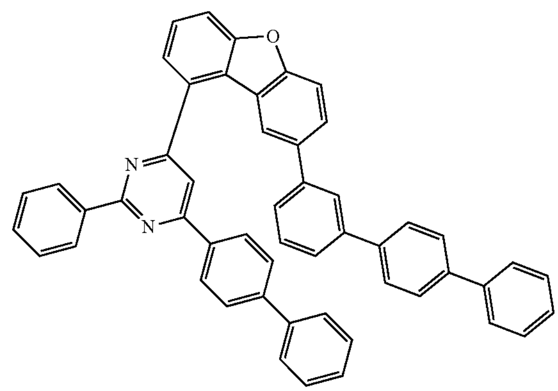
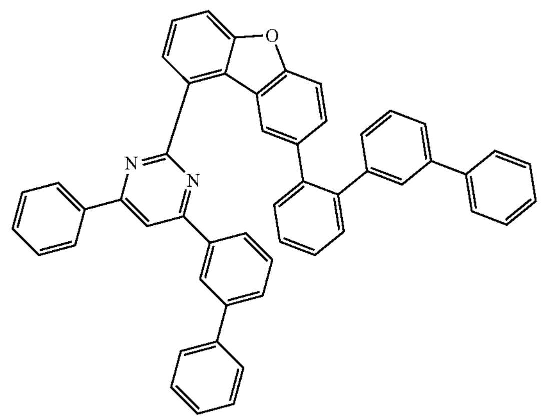
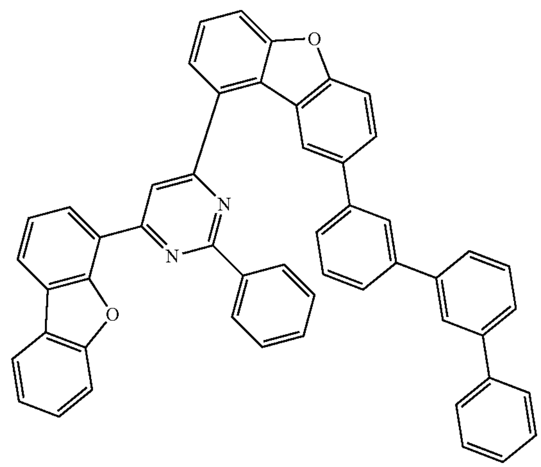

-continued
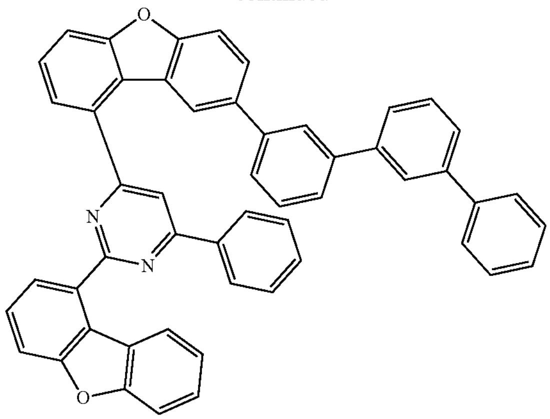
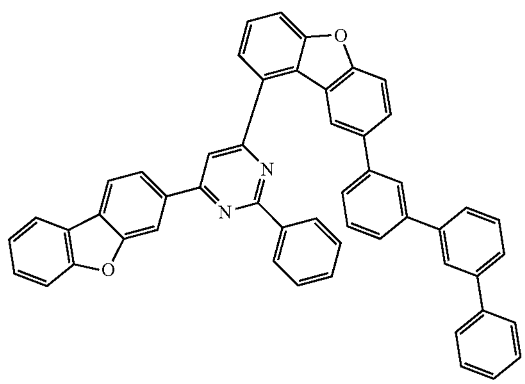
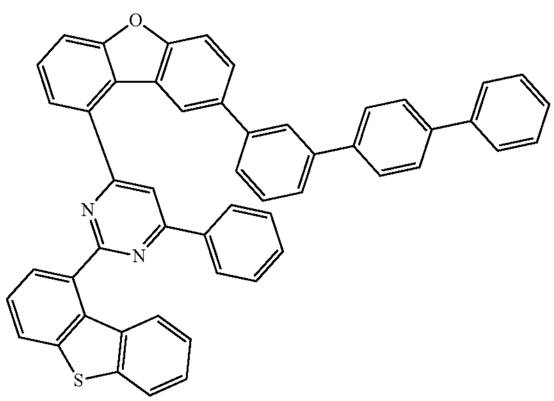
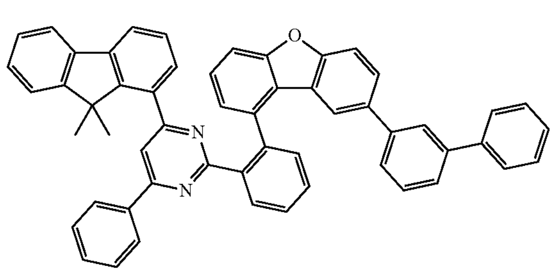
-continued
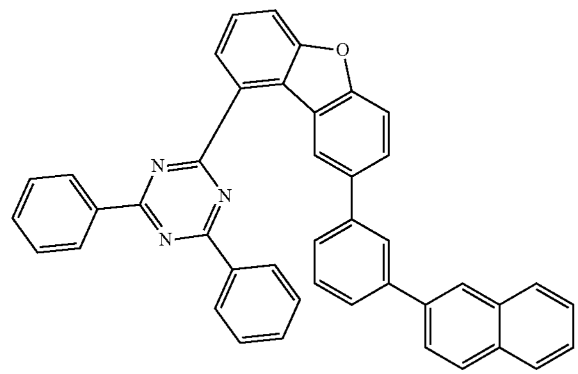
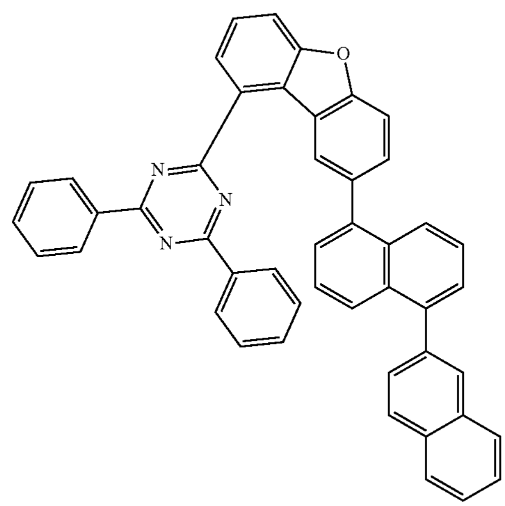
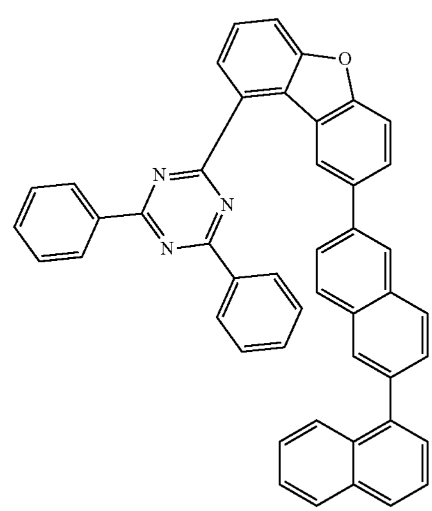

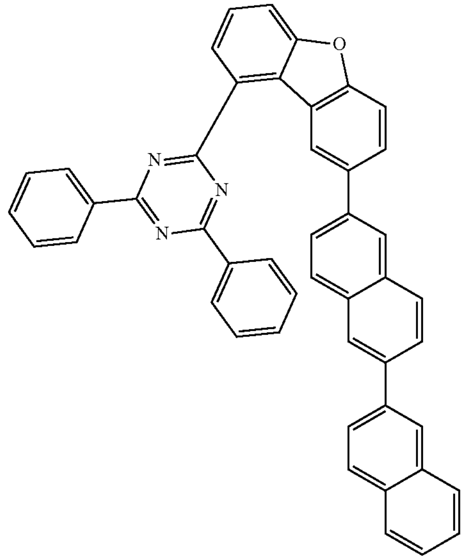
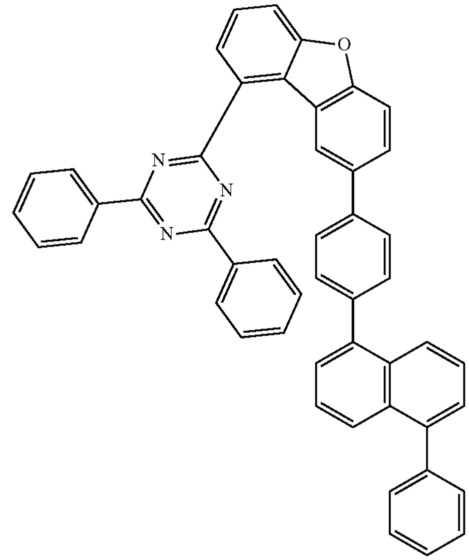
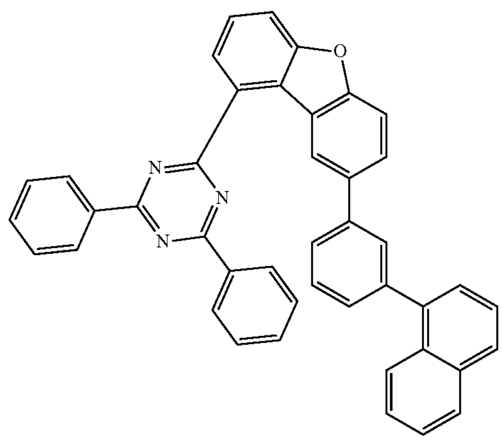
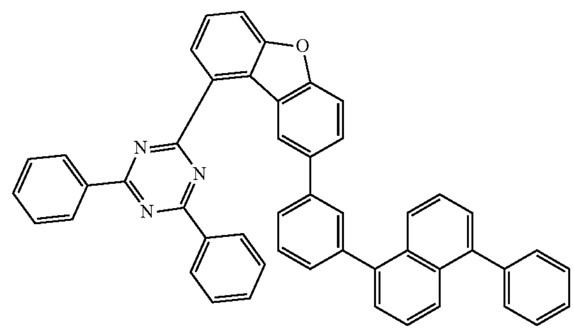
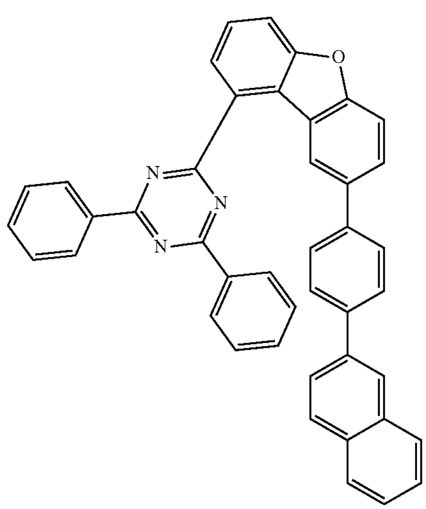
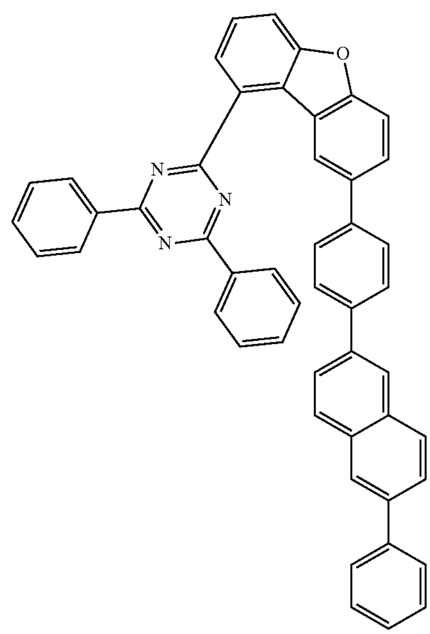
O
N
N
N -continued
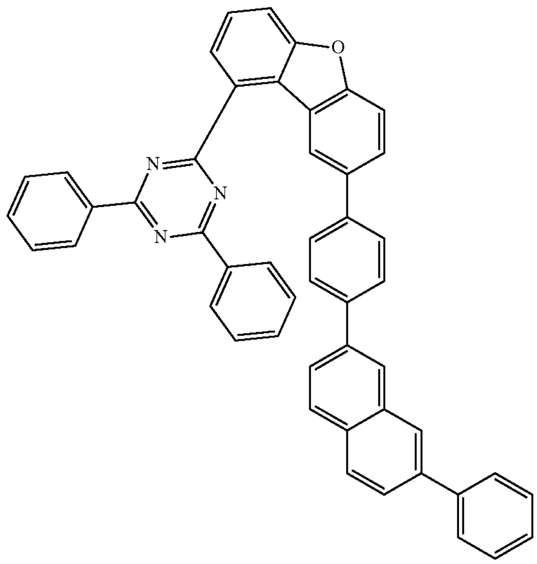
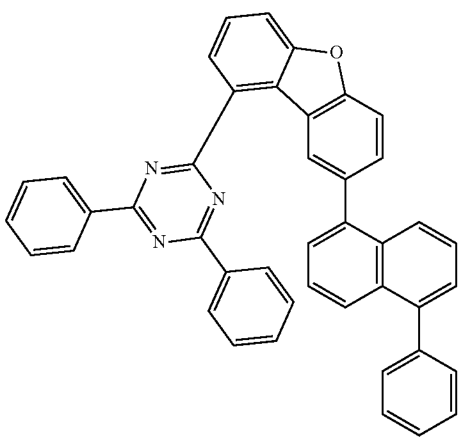
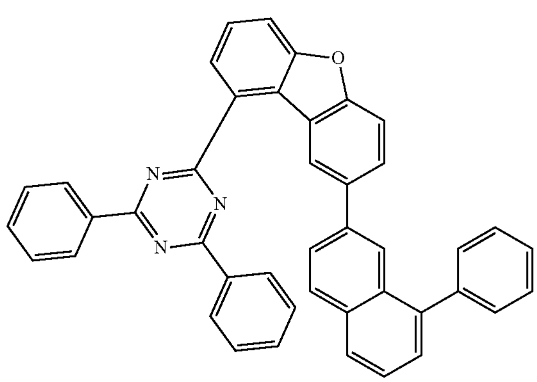
-continued
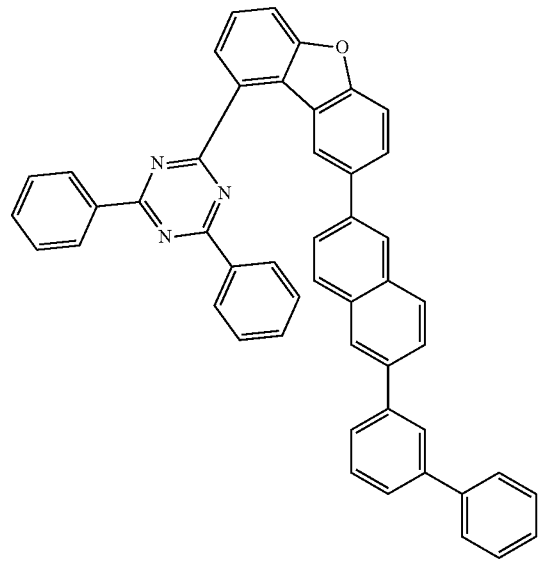 [SMILES: c1ccc(-c2cccc(-c3ccc4cc(-c5ccc6oc7cccc(-c8nc(-c9ccccc9)nc(-c9ccccc9)n8)c7c6c5)ccc4c3)c2)cc1]
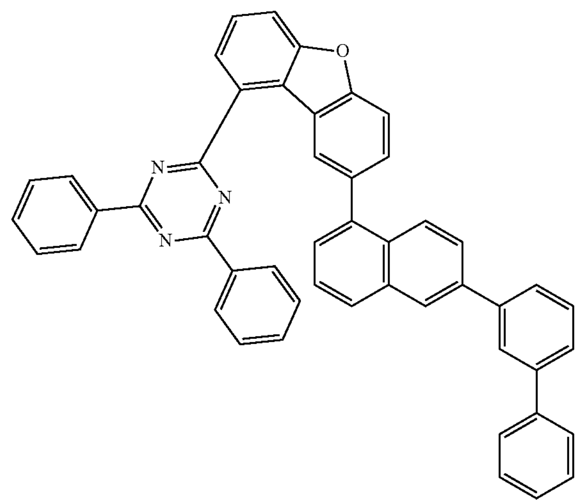
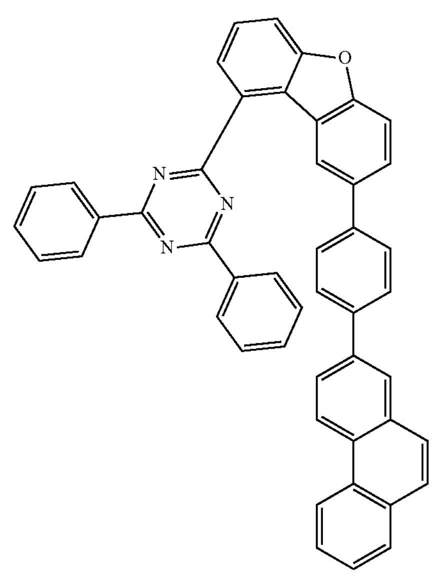

-continued
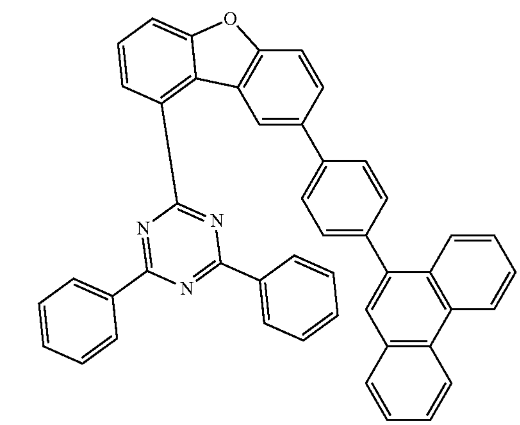
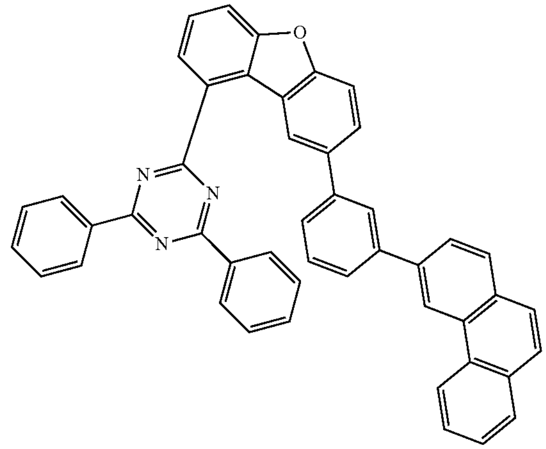
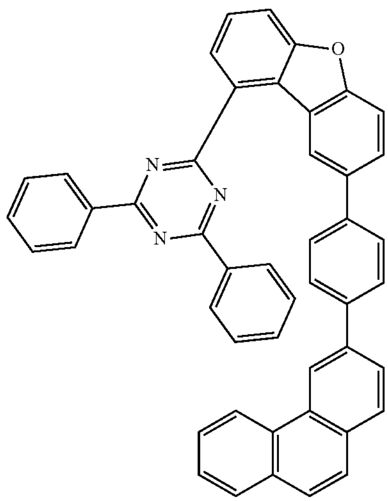
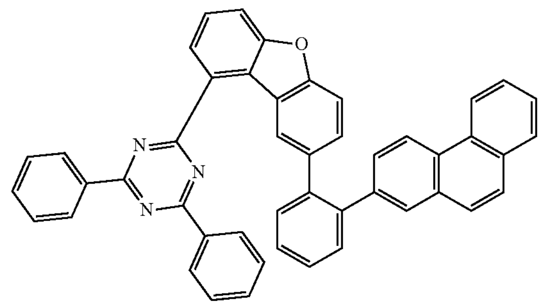
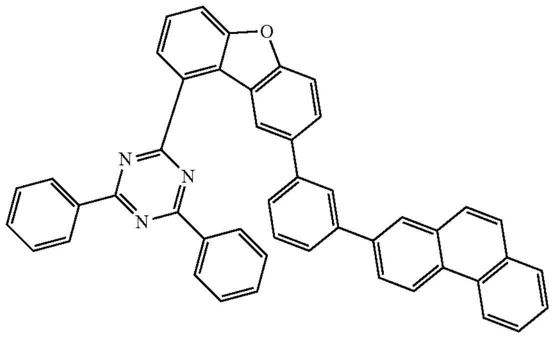
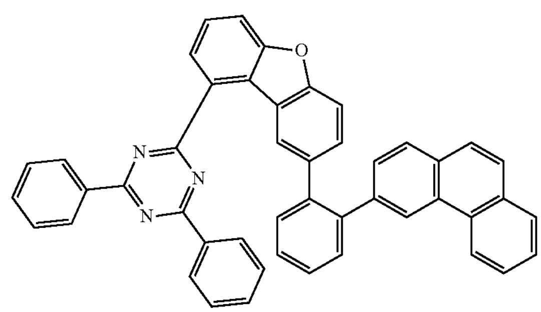
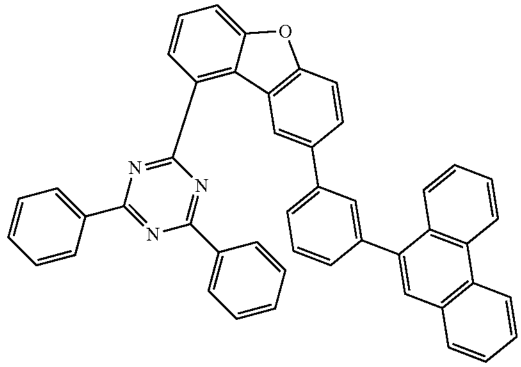
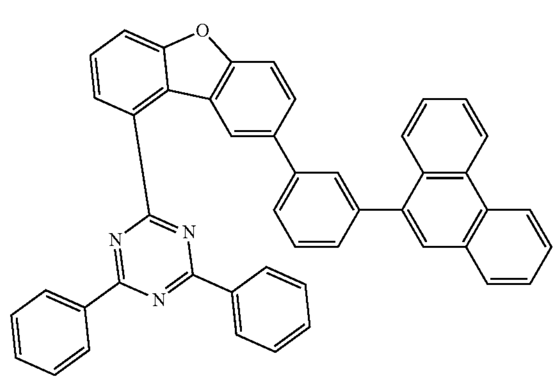

-continued
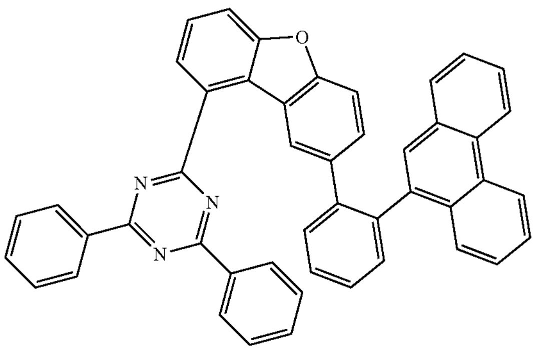
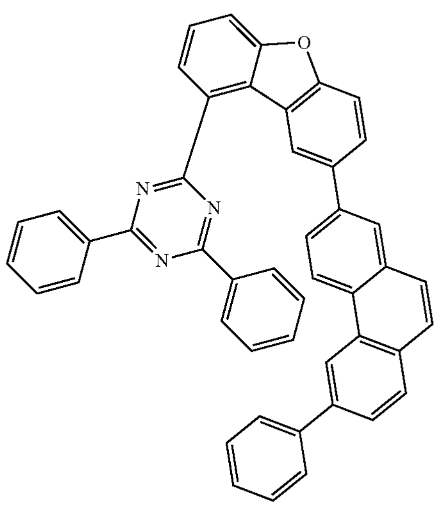
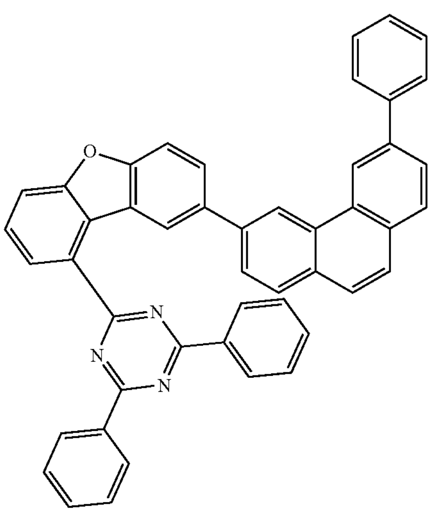
-continued
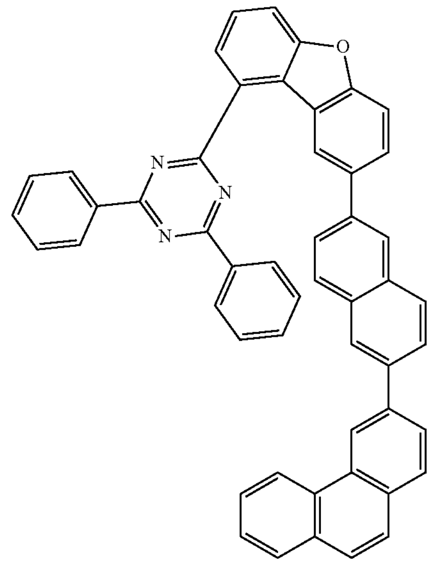
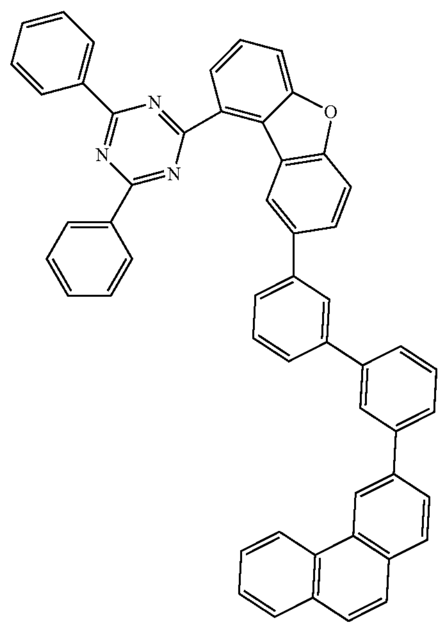
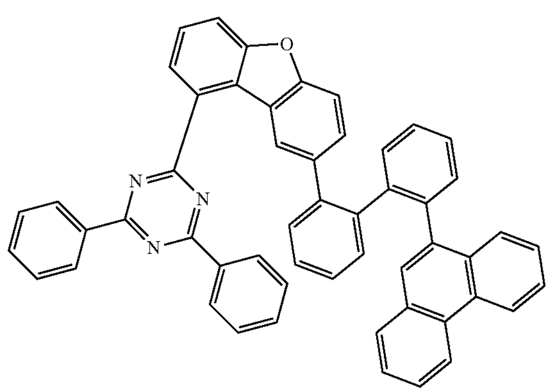

-continued
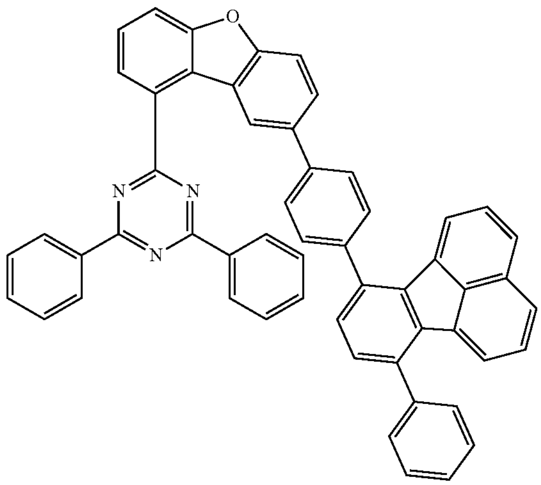
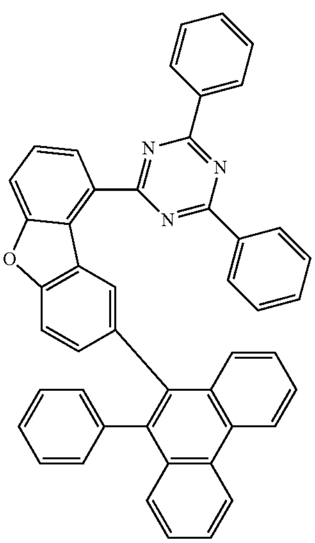
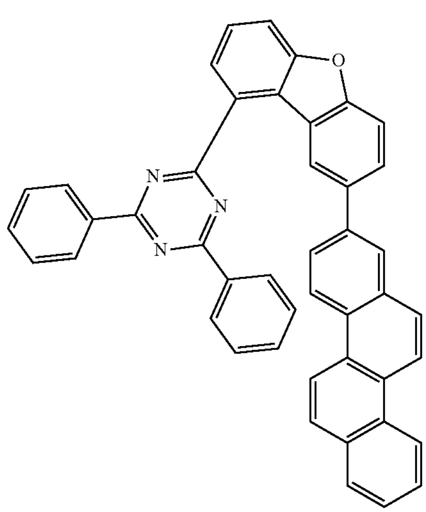
-continued
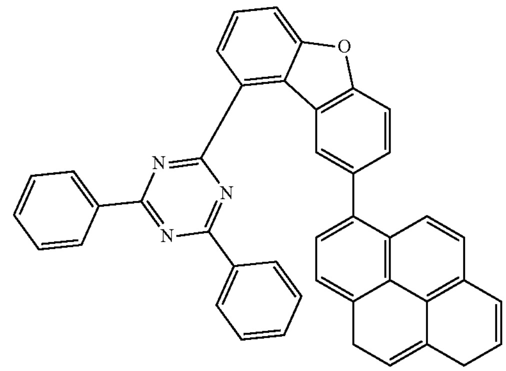
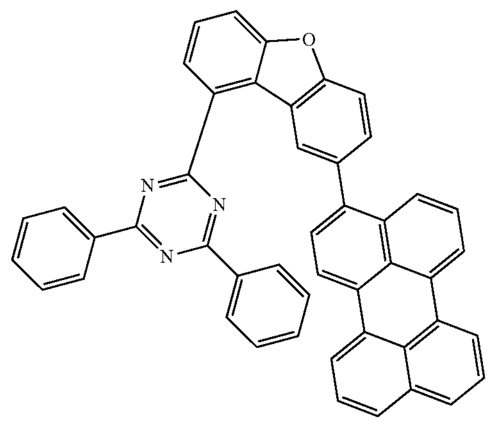
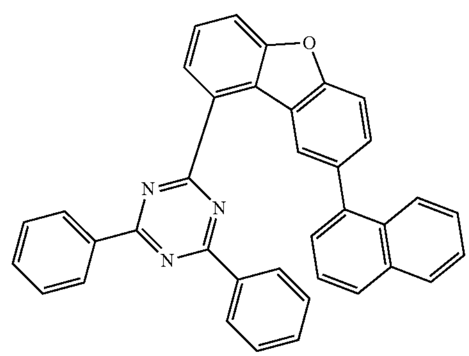
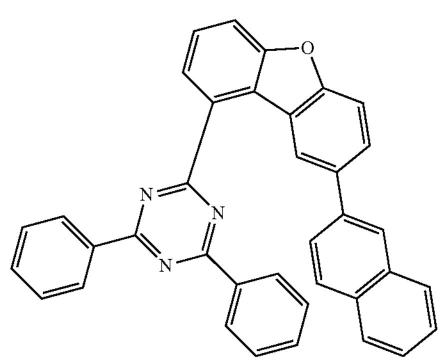

-continued
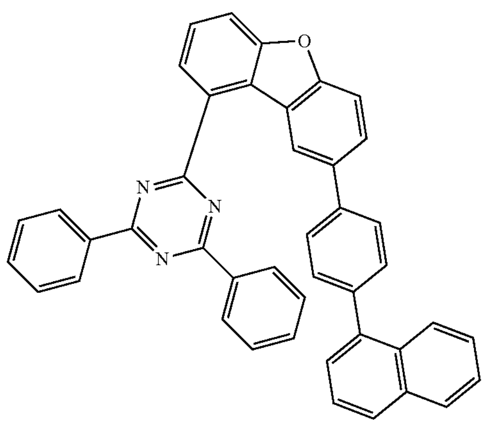
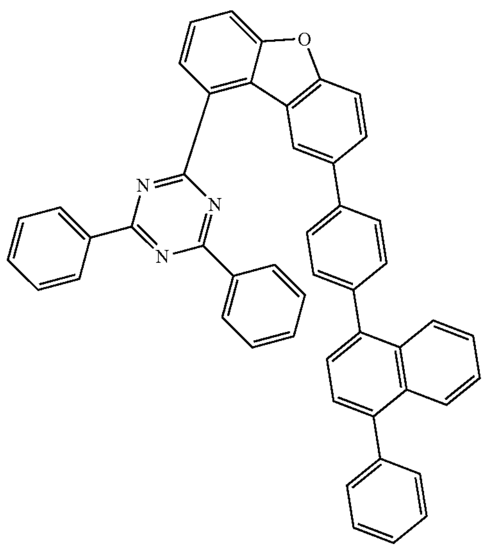
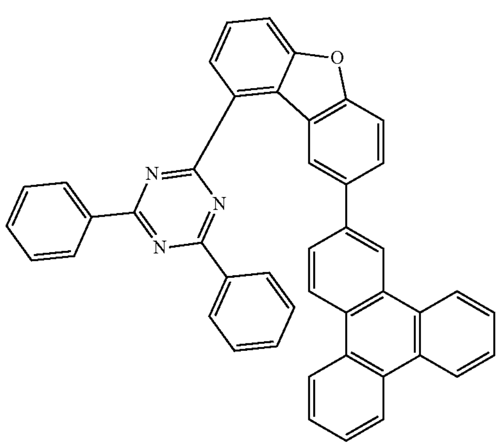
-continued
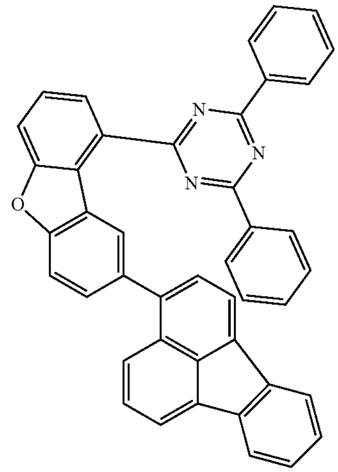
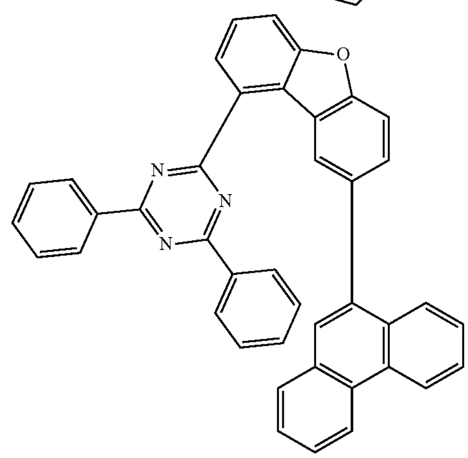
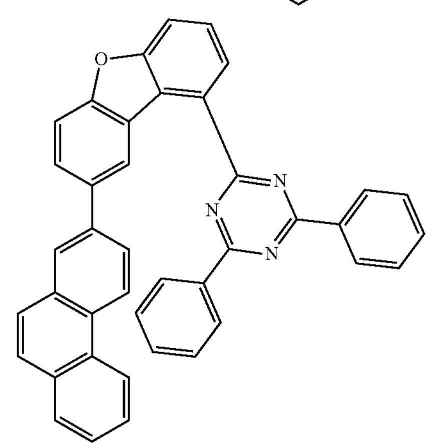
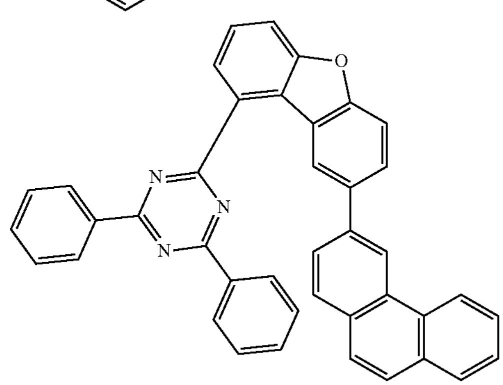

-continued
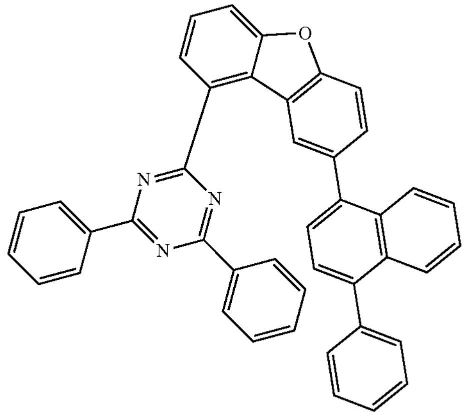
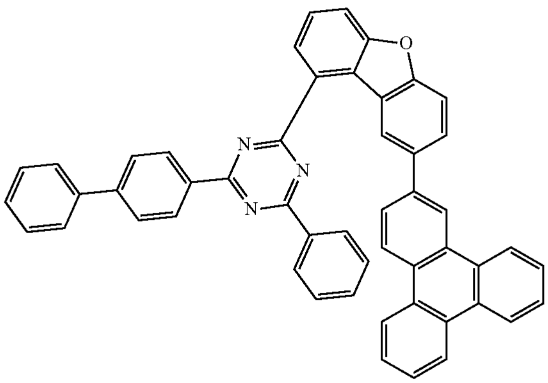
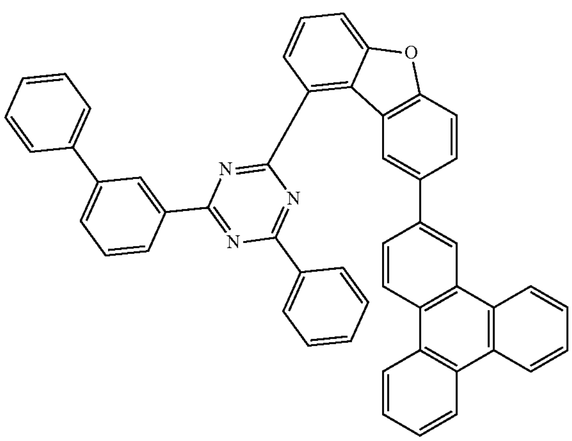
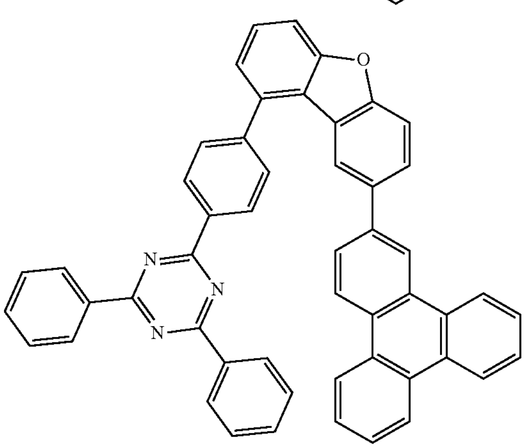
-continued
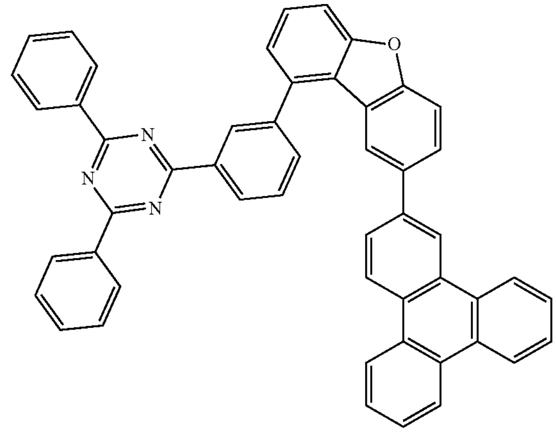
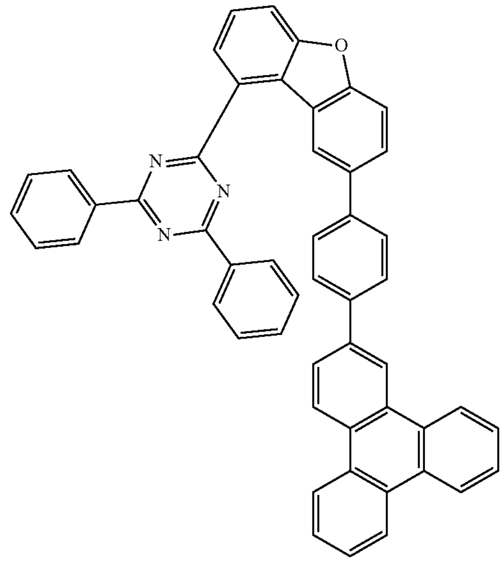
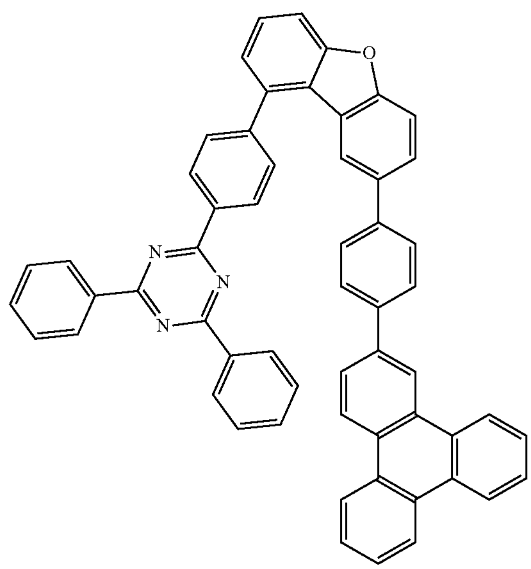

-continued
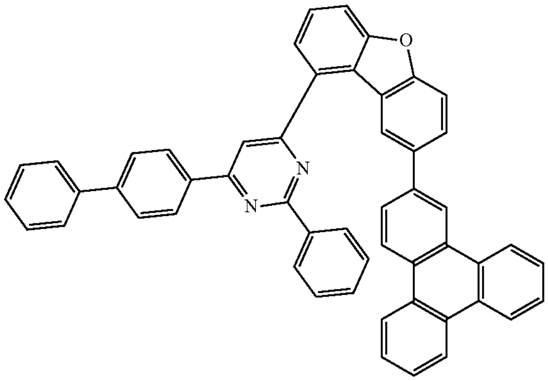
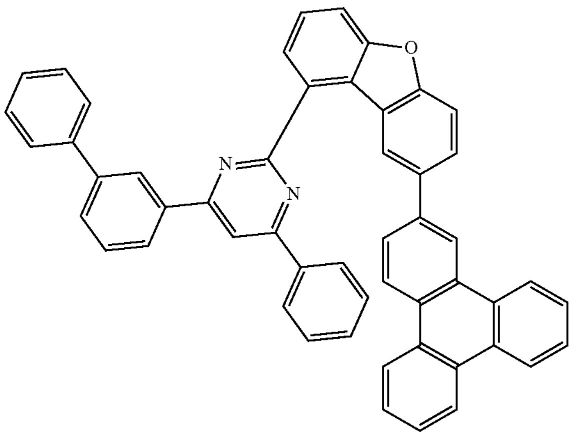
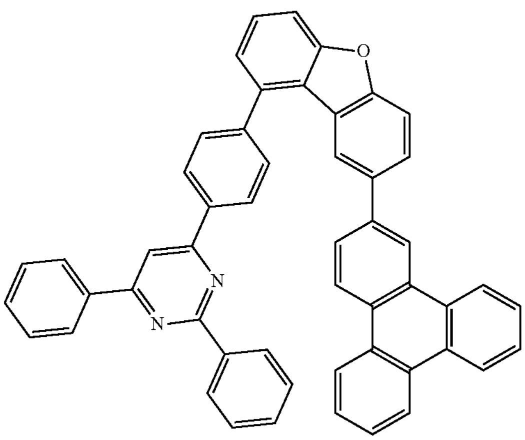
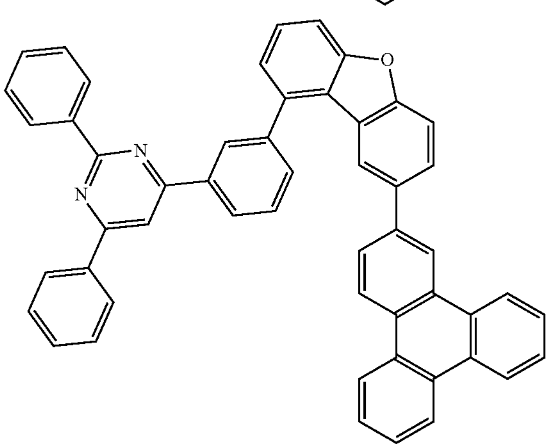
-continued
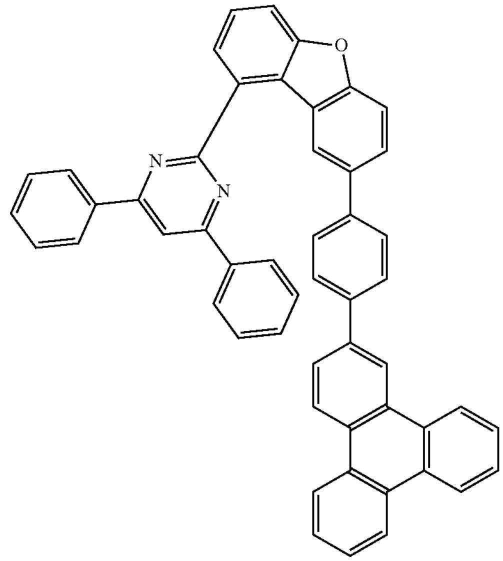
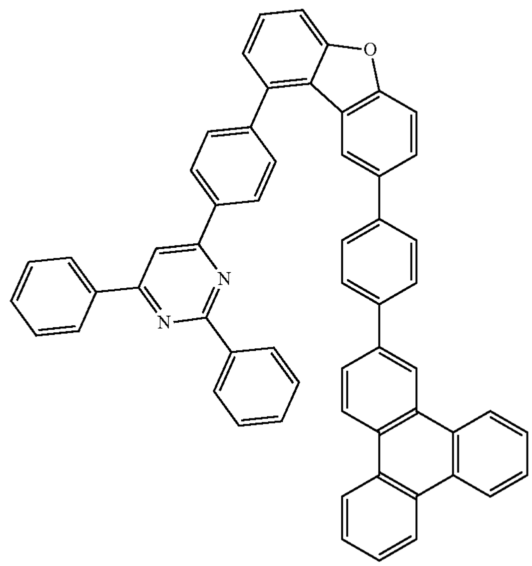
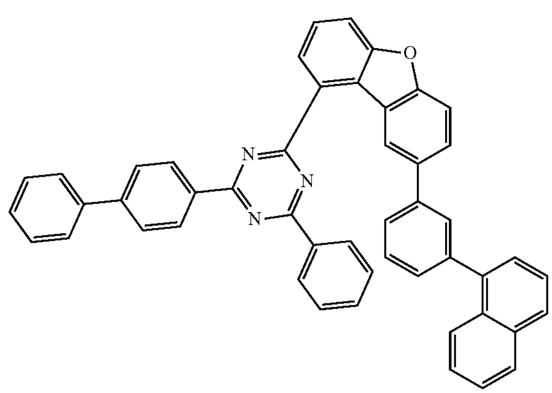

-continued
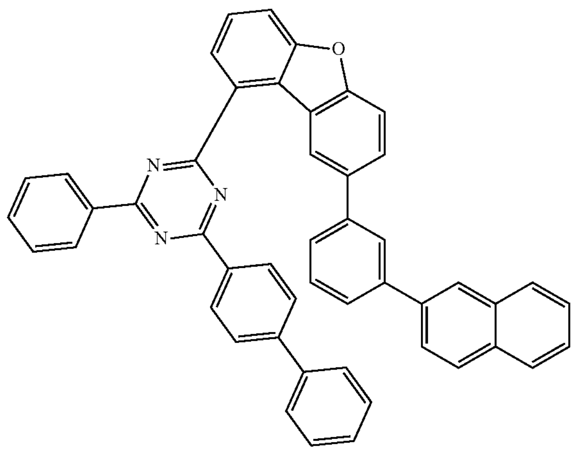
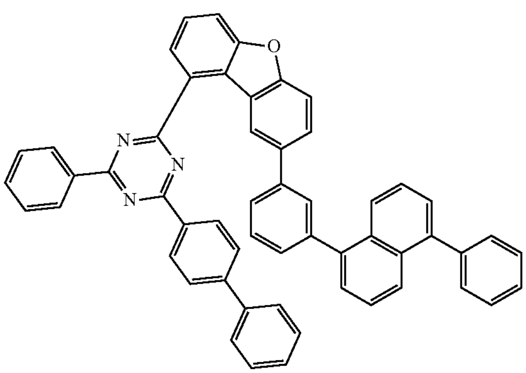
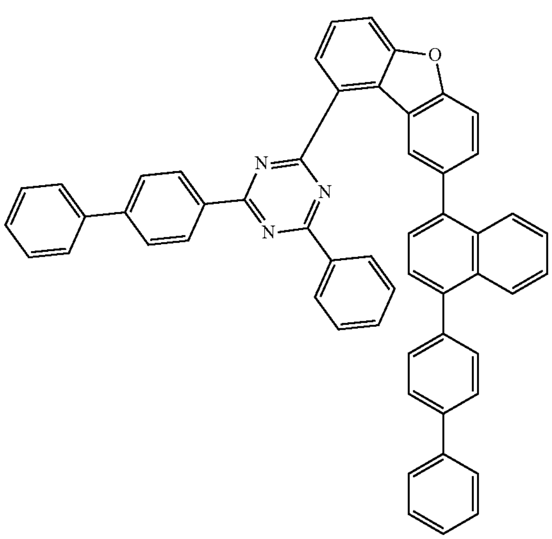
-continued
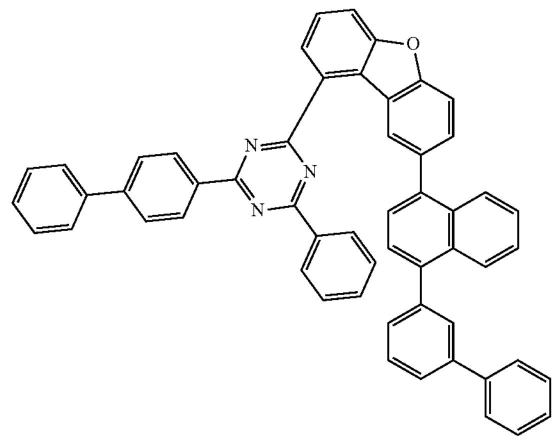
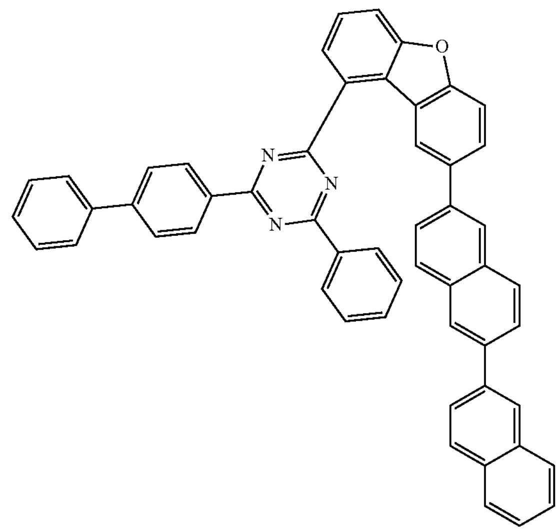
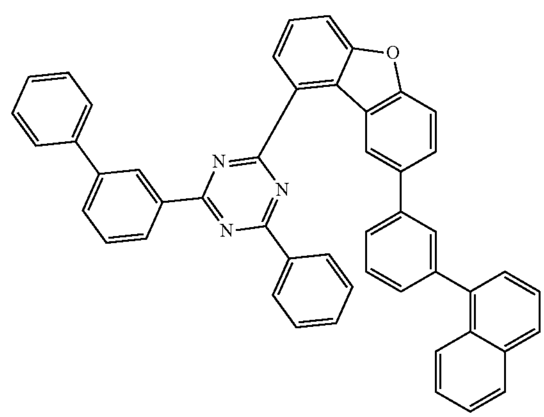
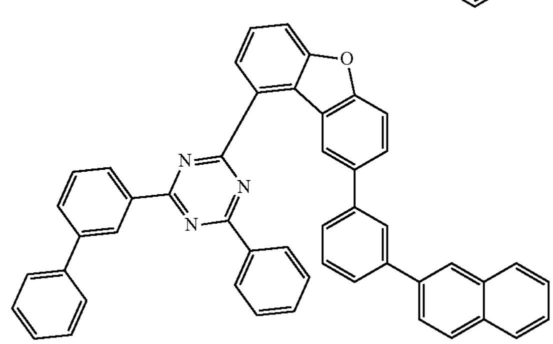

-continued
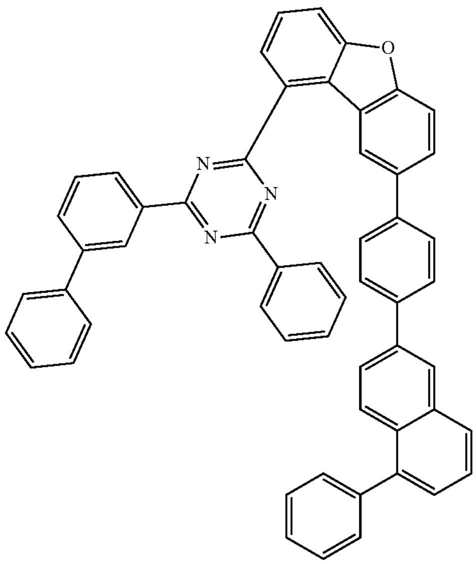
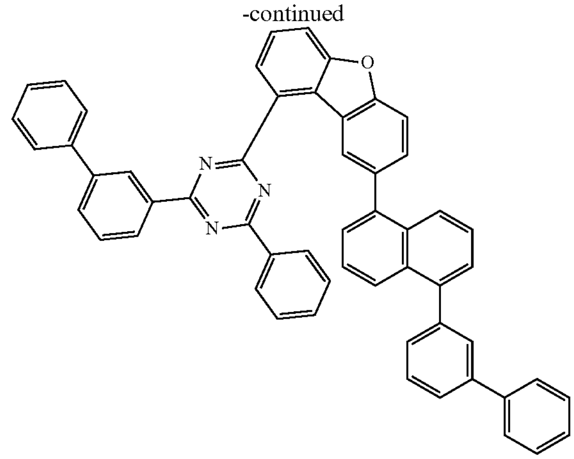
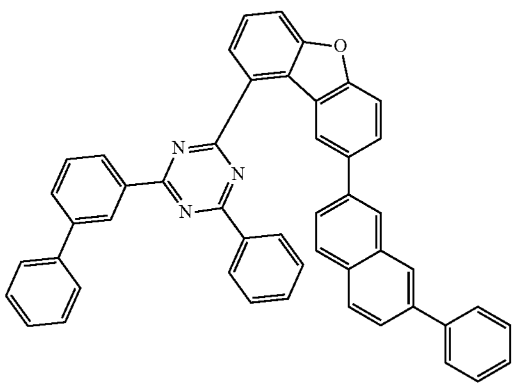
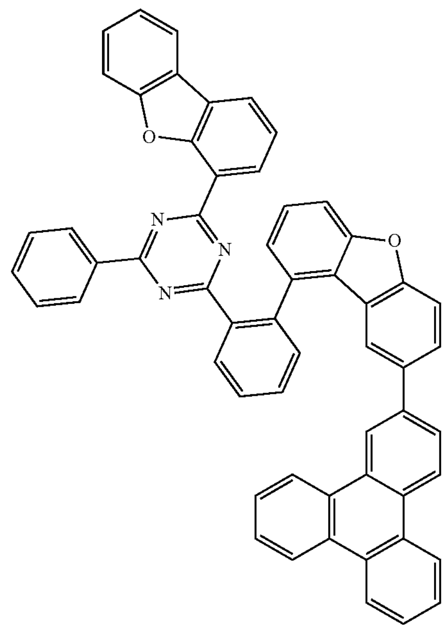
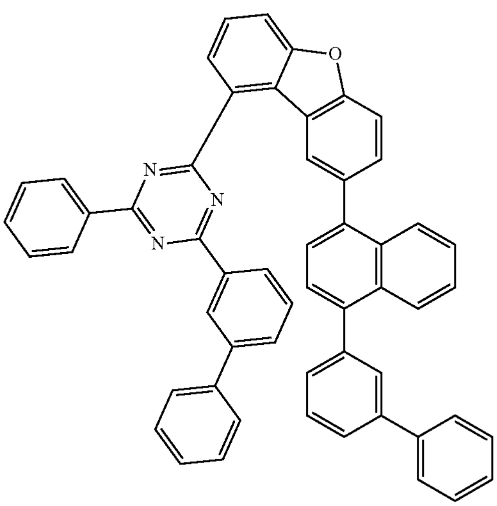
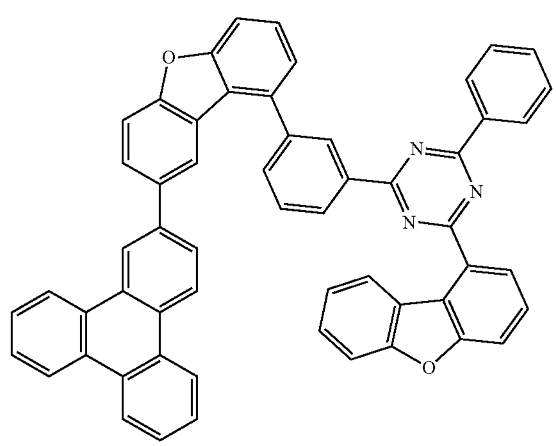
-continued -continued
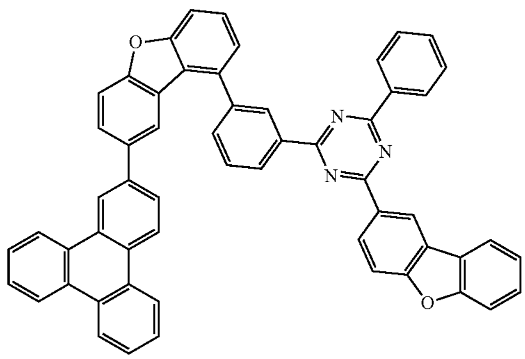
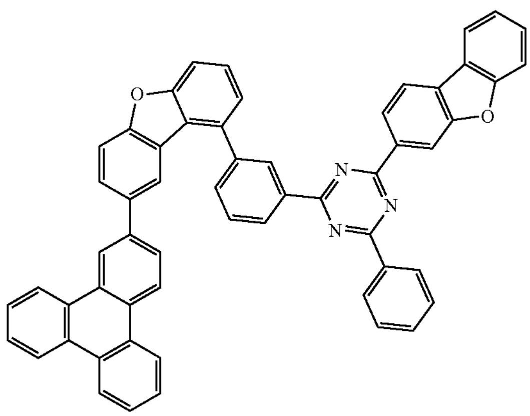
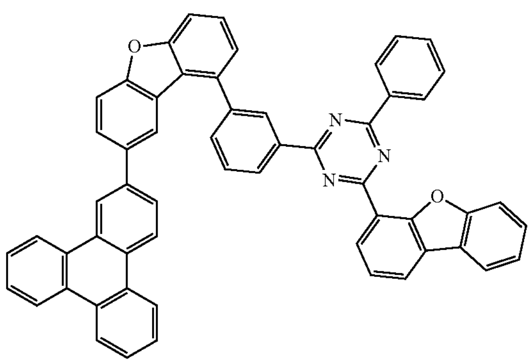
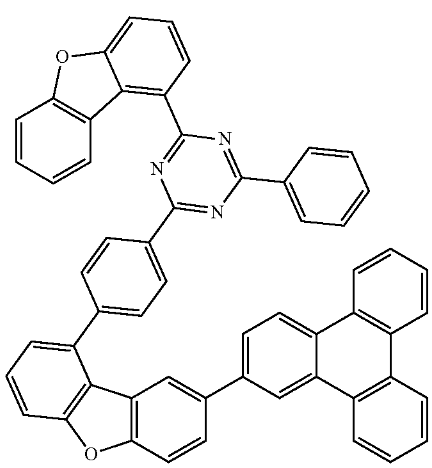
-continued
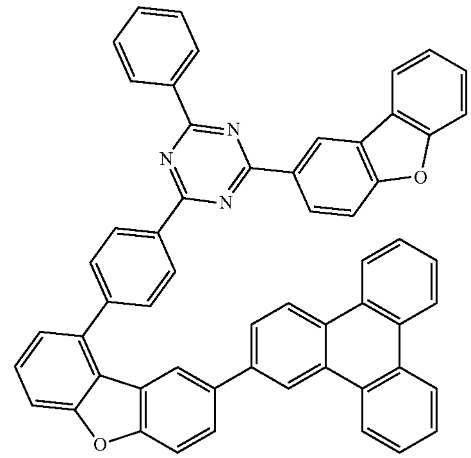
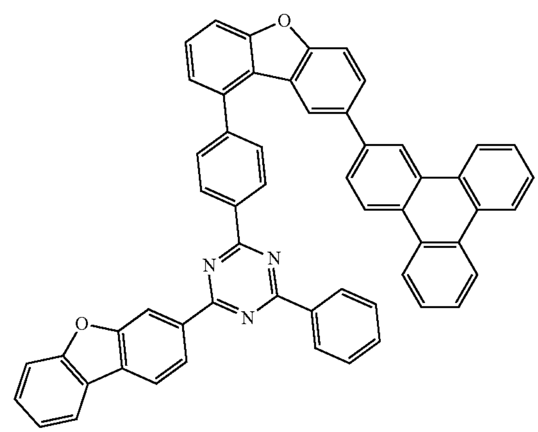
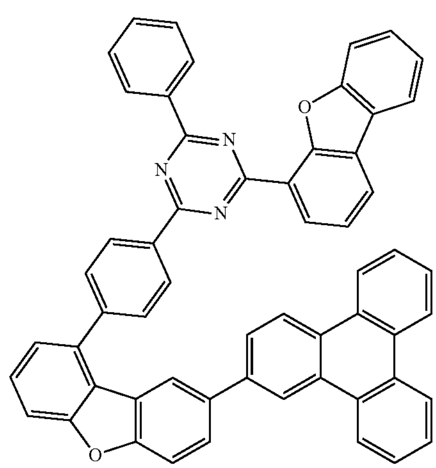

-continued
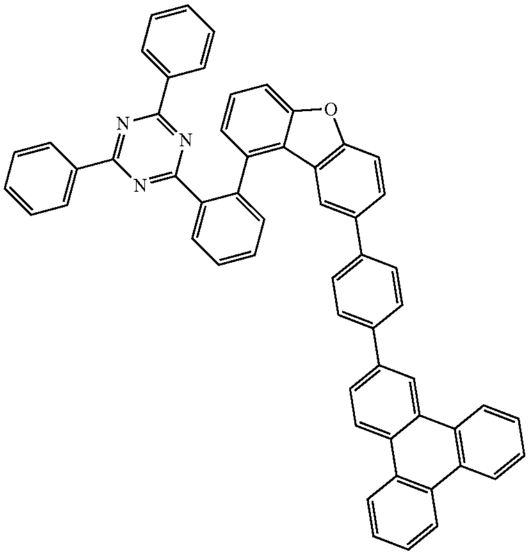
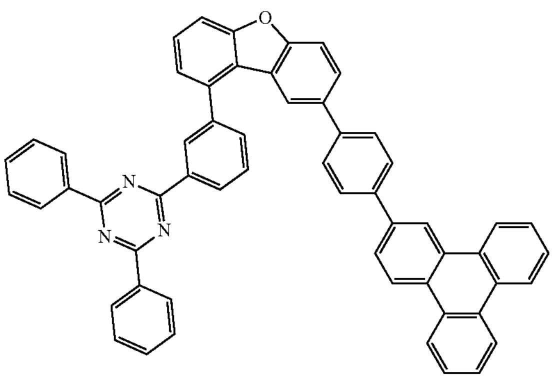
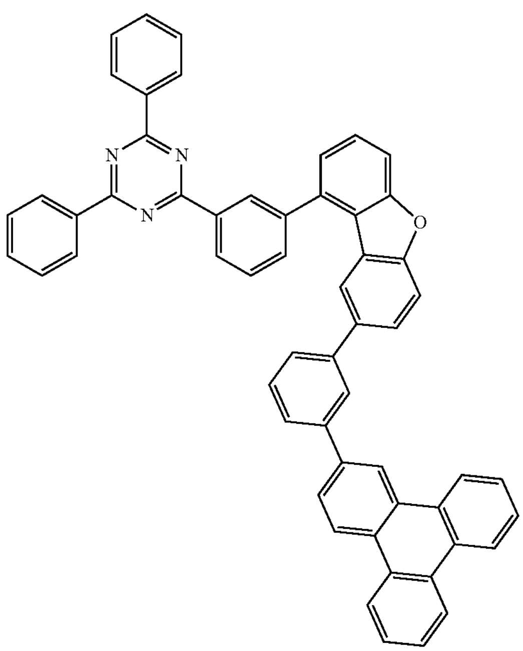
-continued
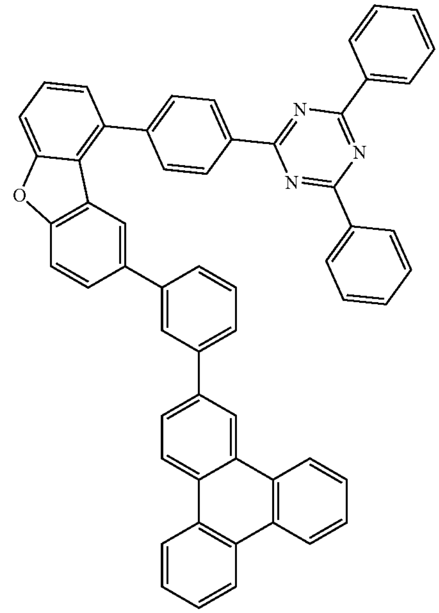
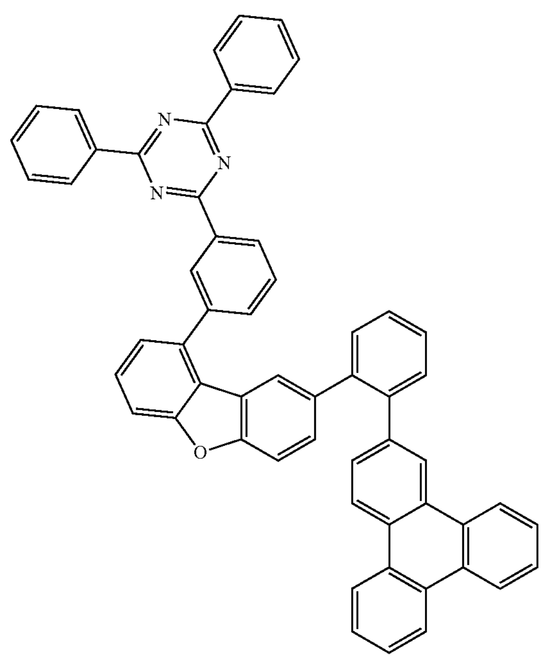

-continued
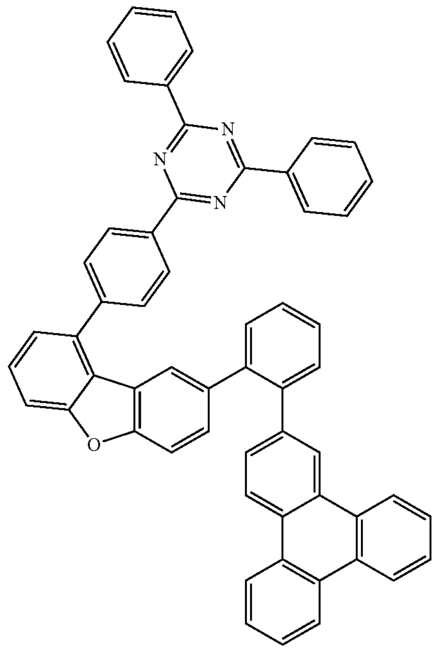
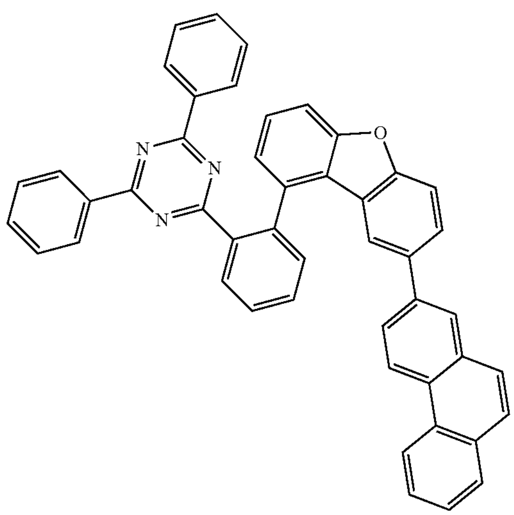
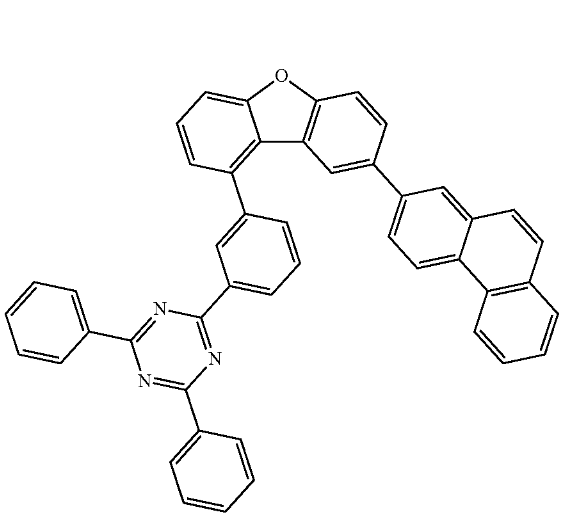
-continued
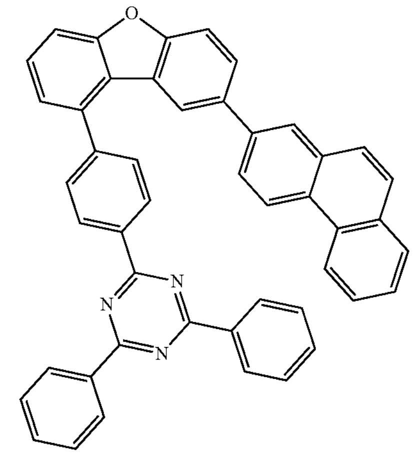
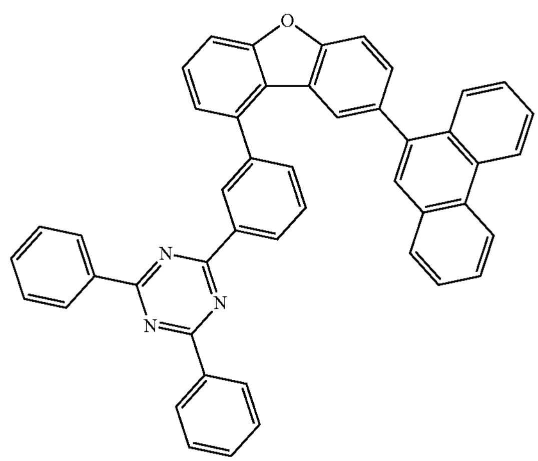
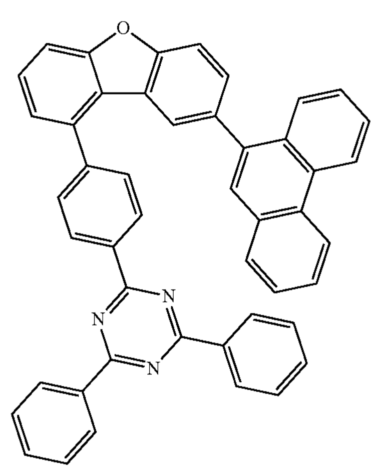

-continued
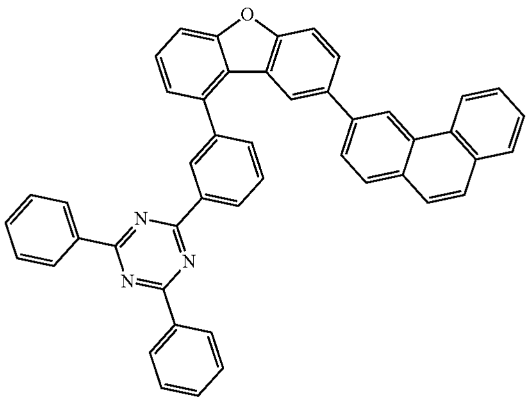
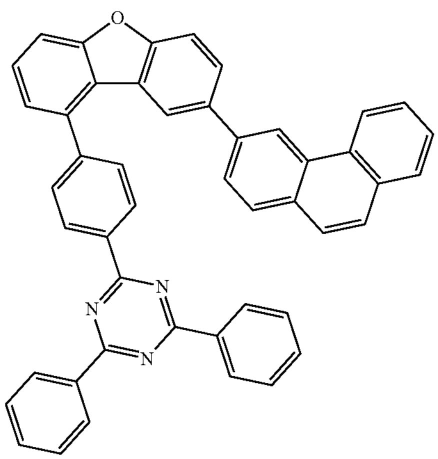
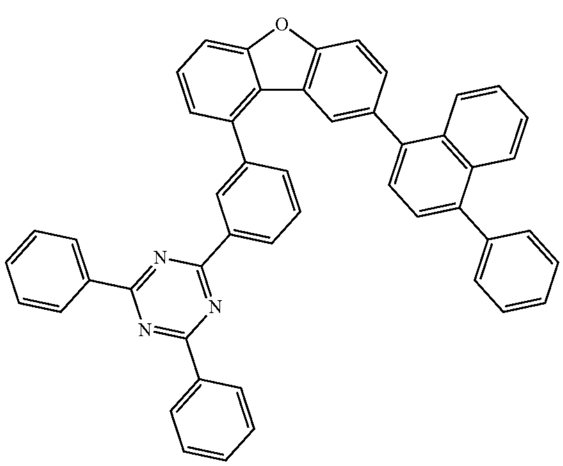
-continued
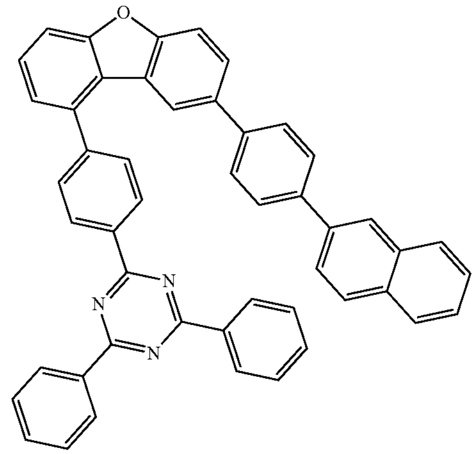
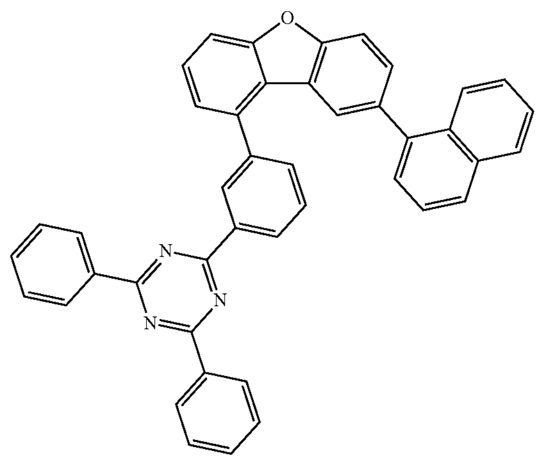
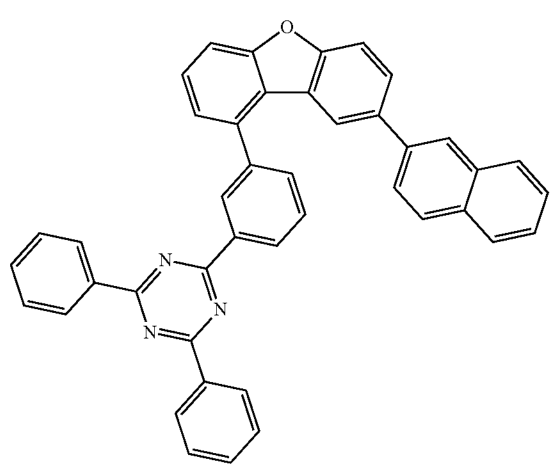

-continued
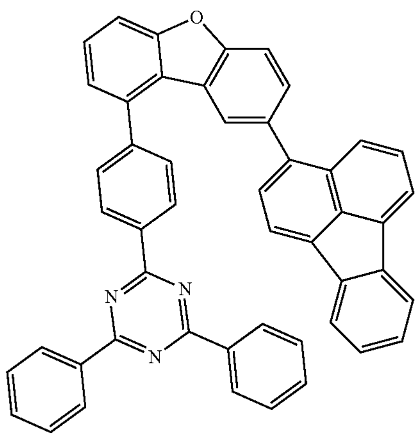
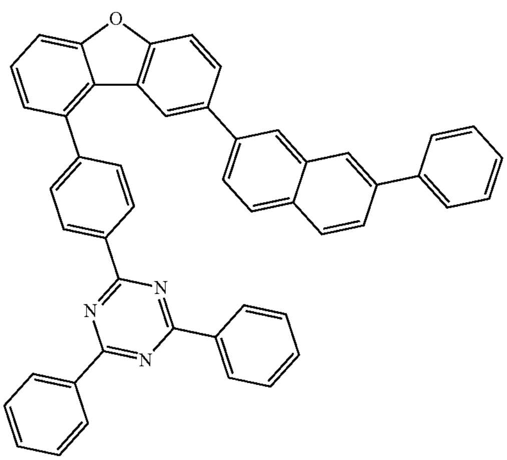
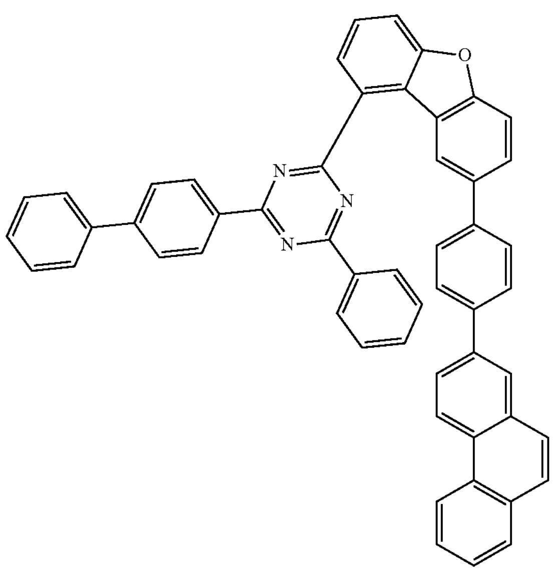
-continued
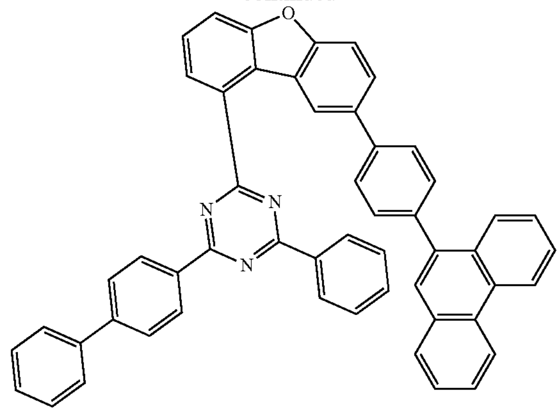
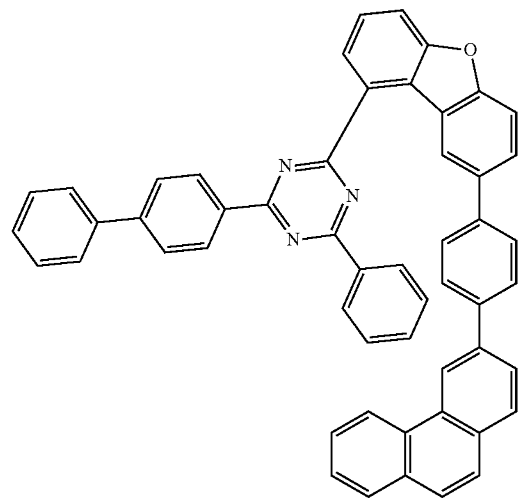
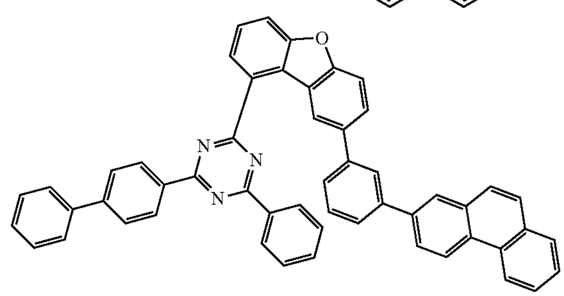
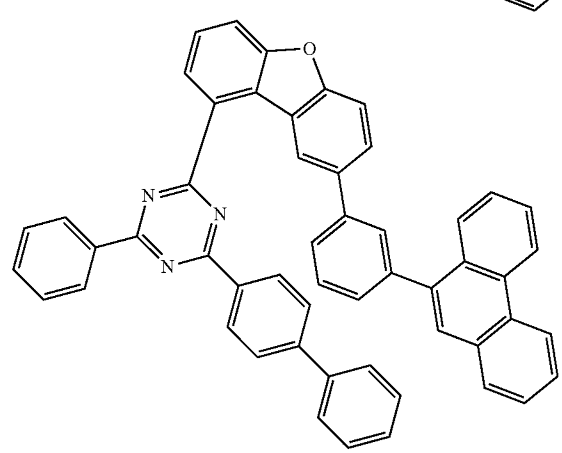

-continued
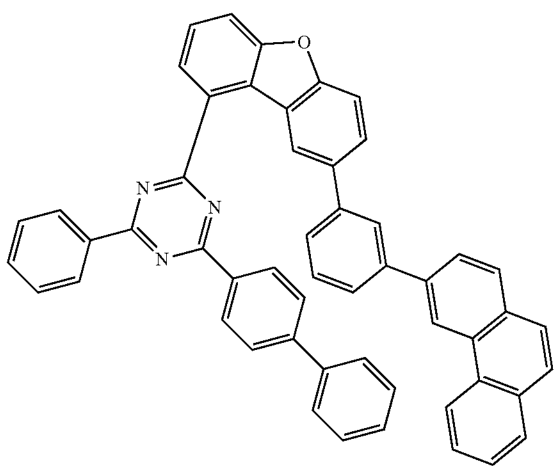
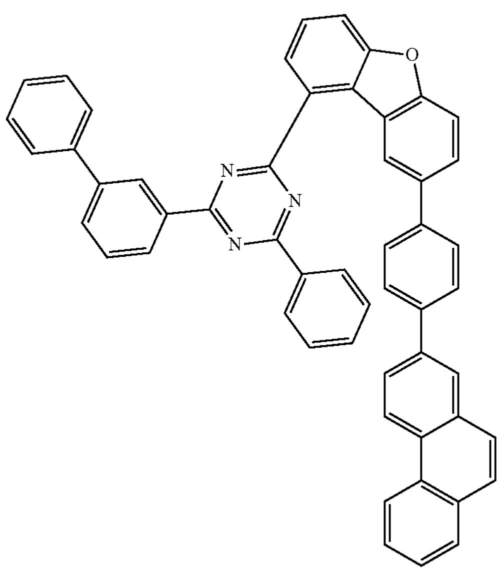
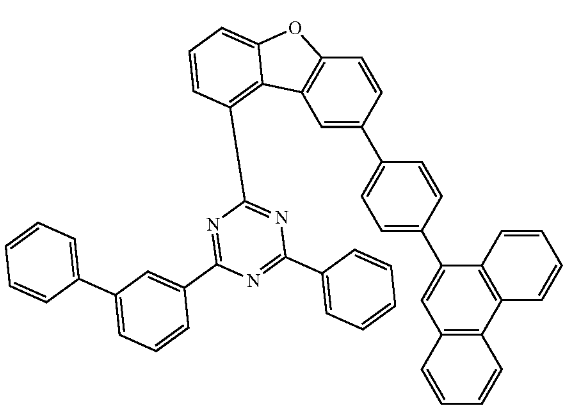
-continued
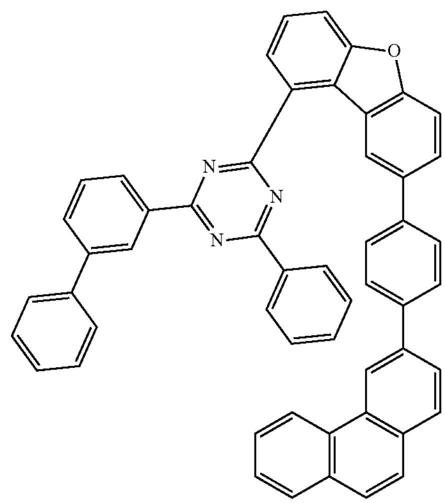
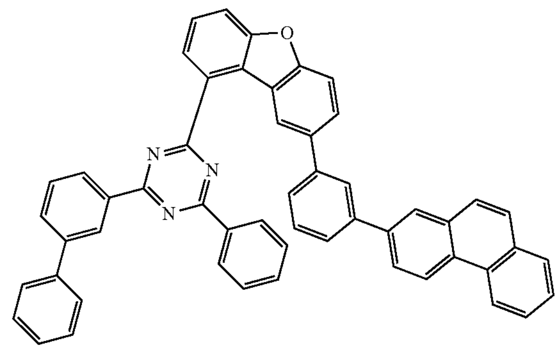
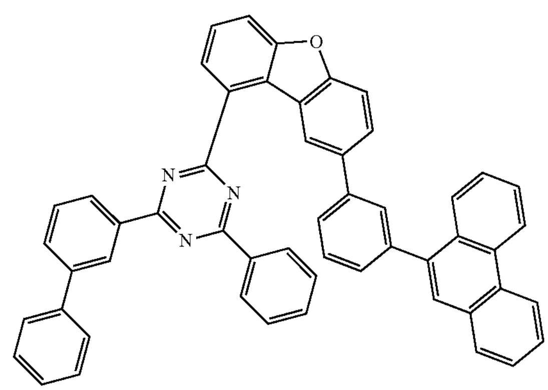
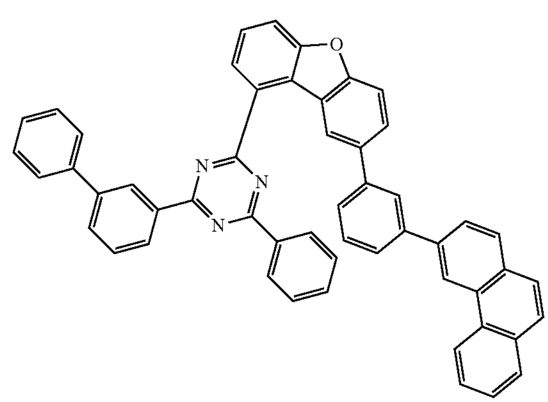

-continued
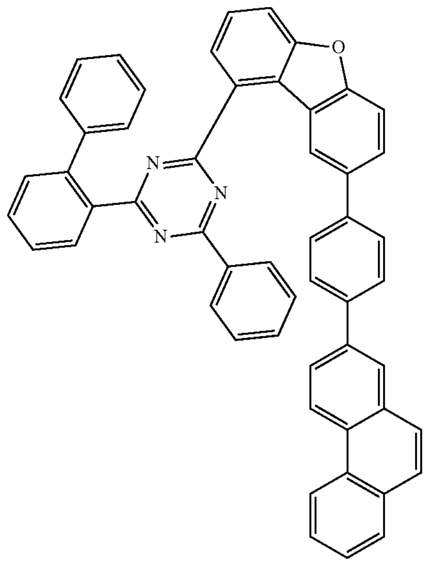
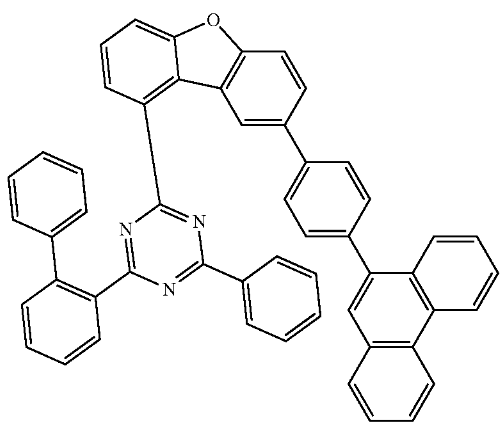
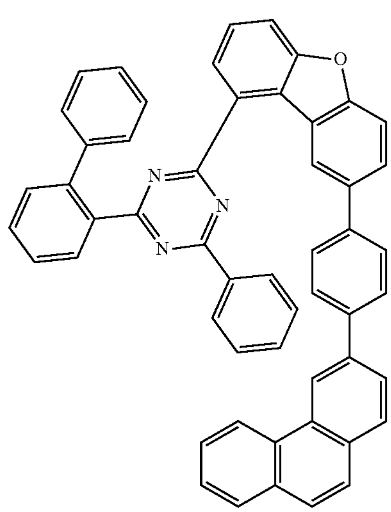
-continued
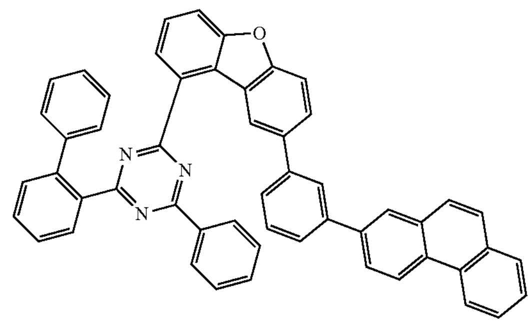
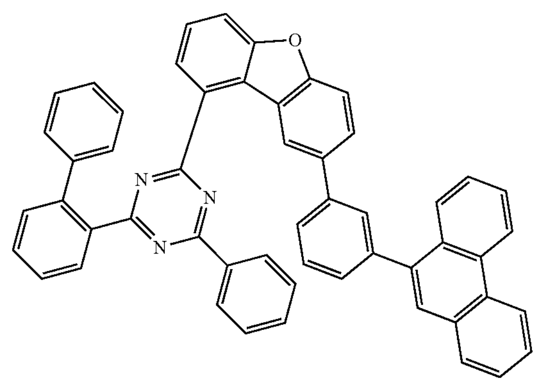
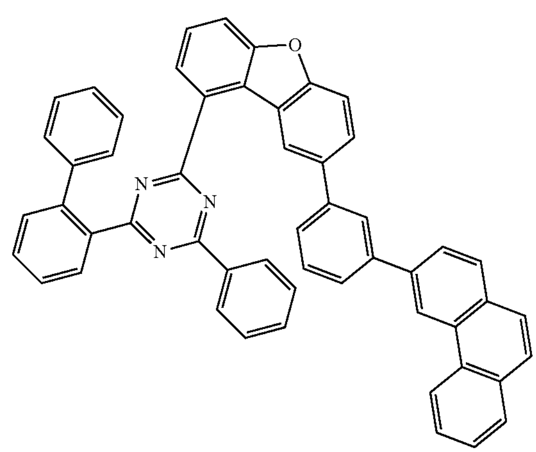
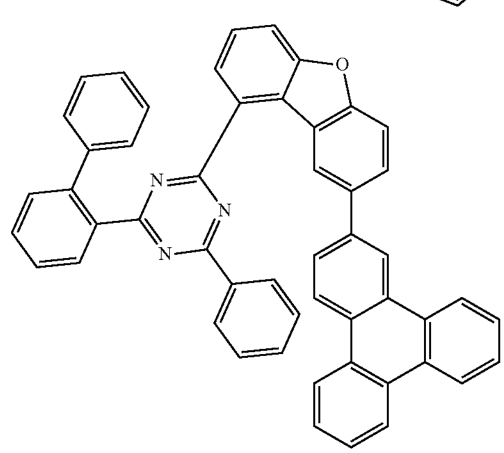

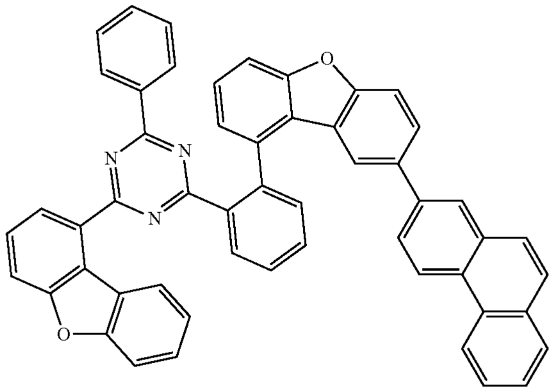
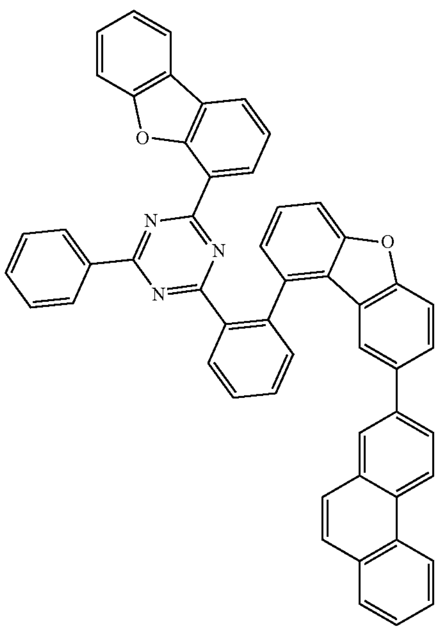
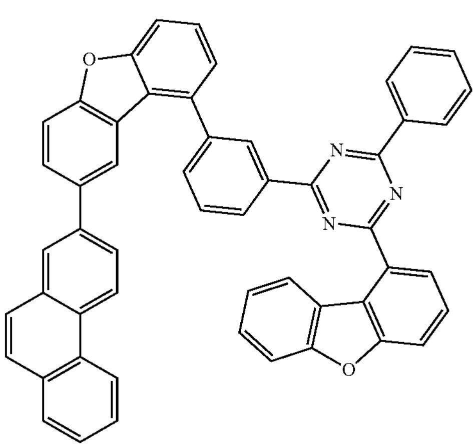
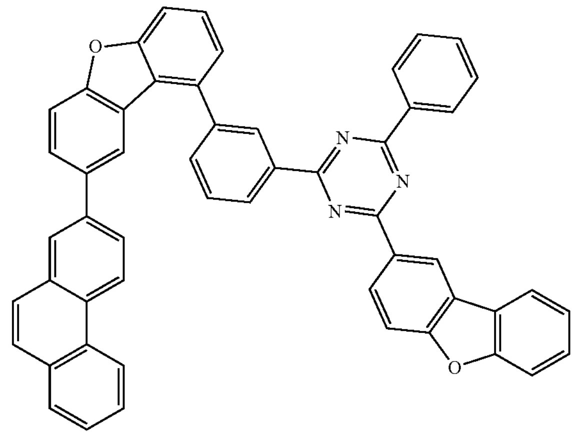
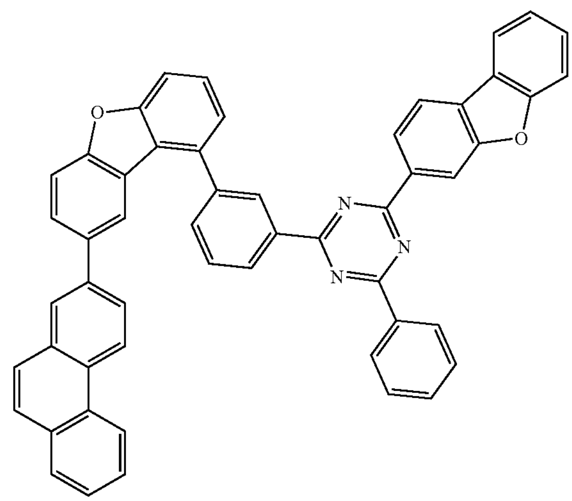
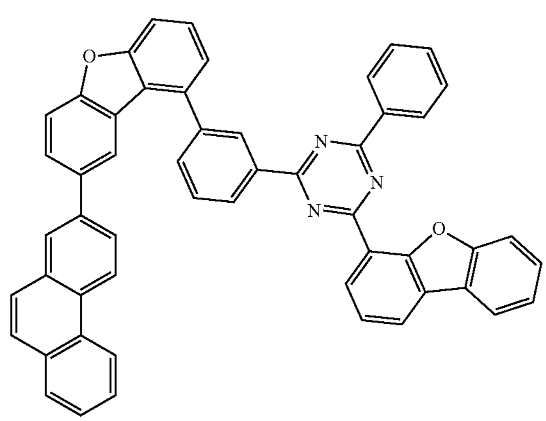

-continued
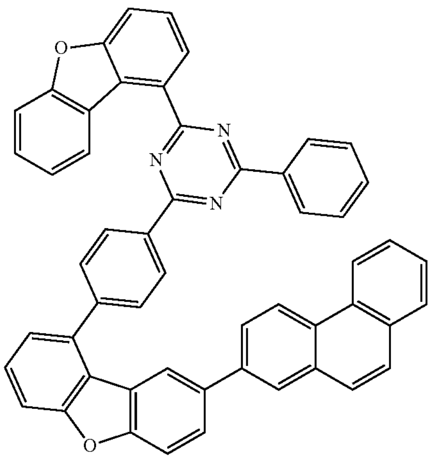
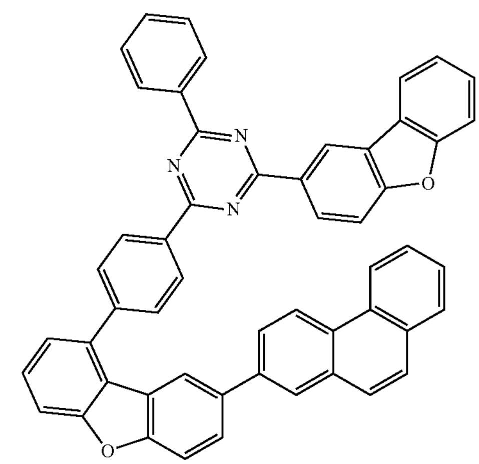
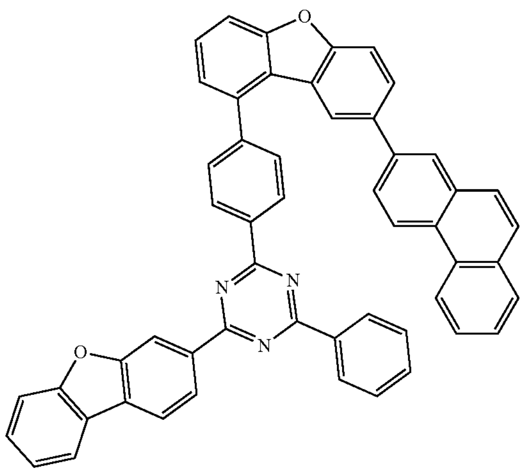
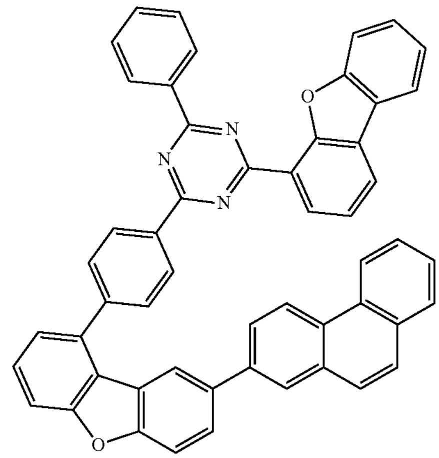
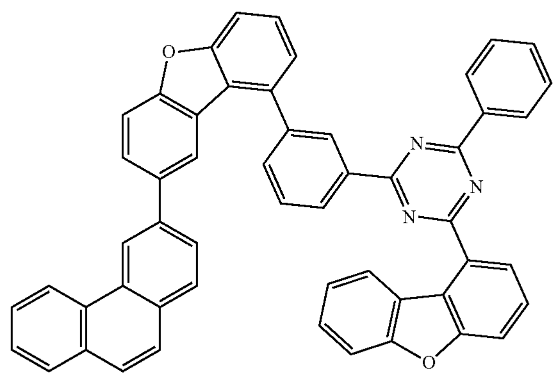
-continued
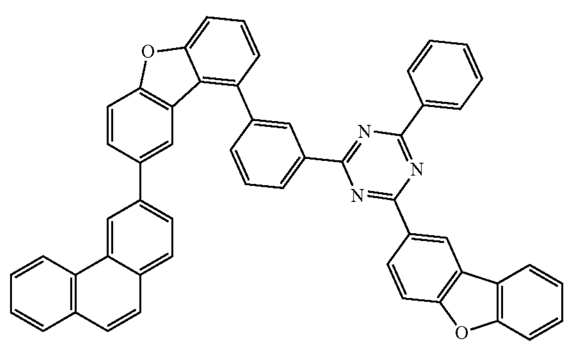
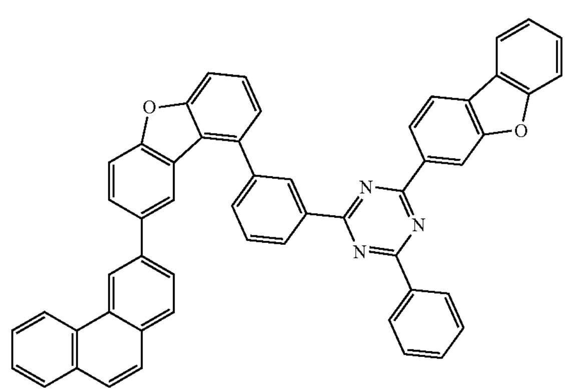

-continued
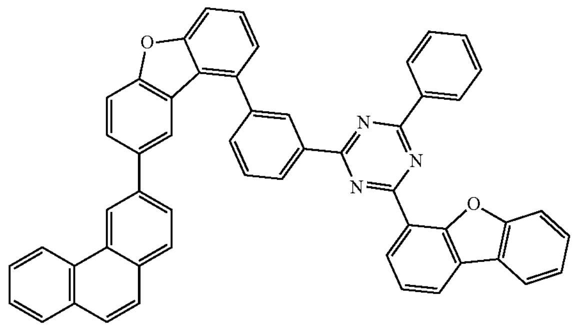
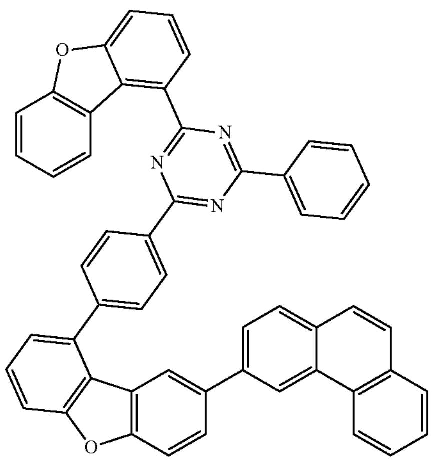
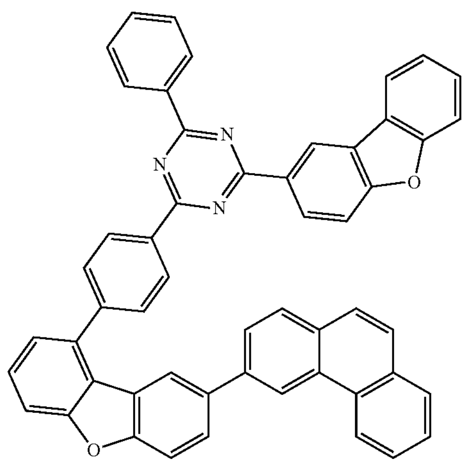
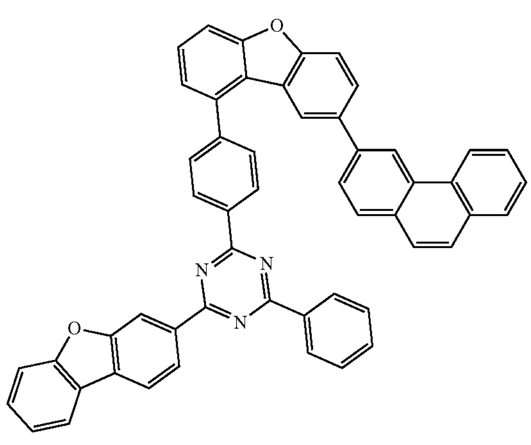
-continued
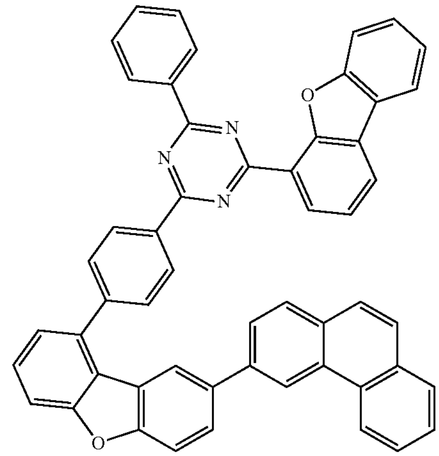
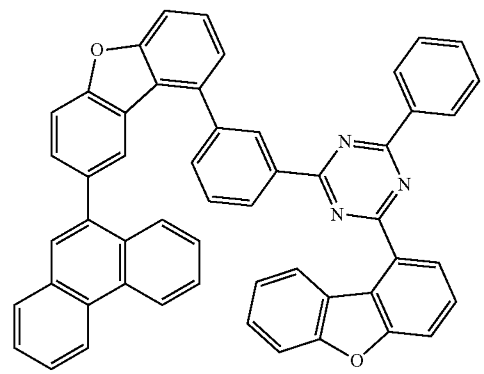
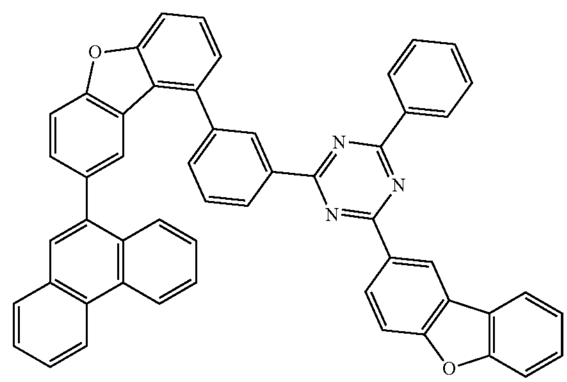
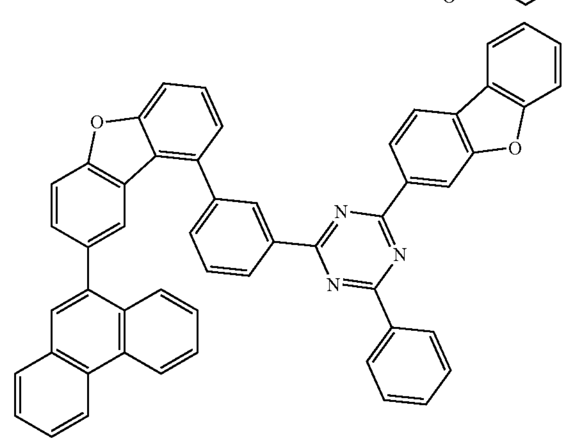

-continued
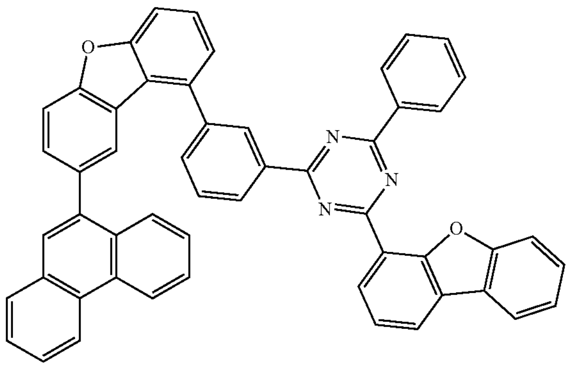
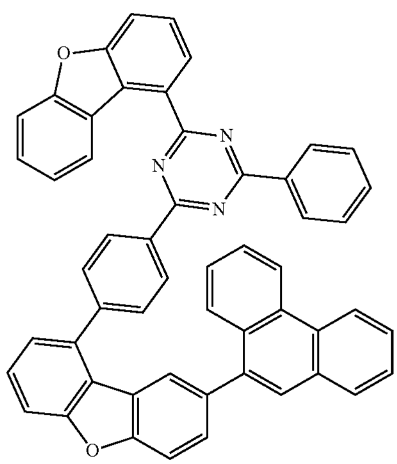
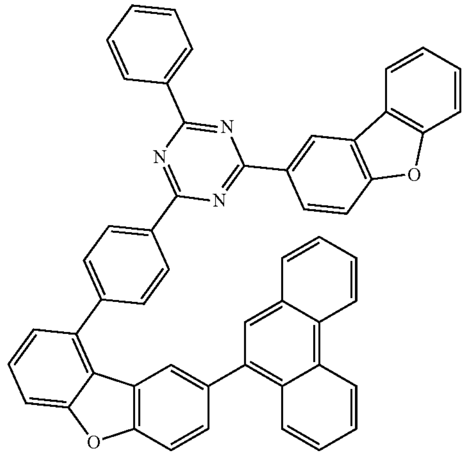
-continued
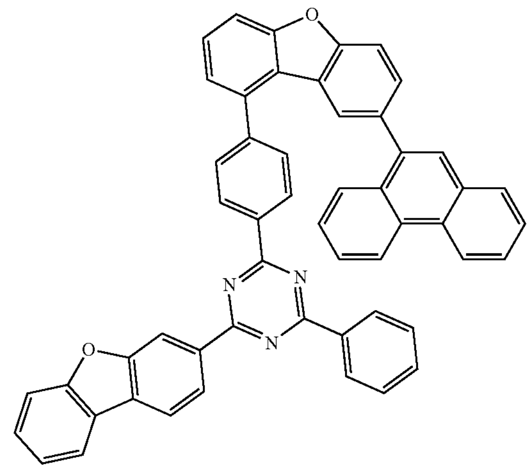
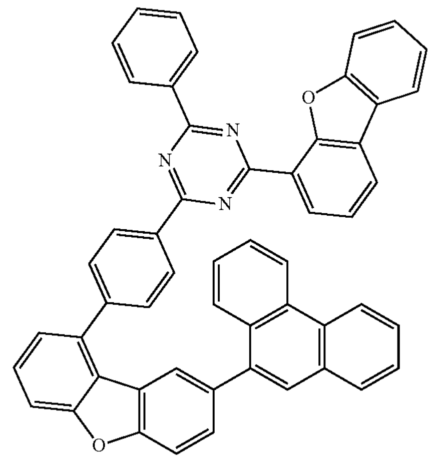
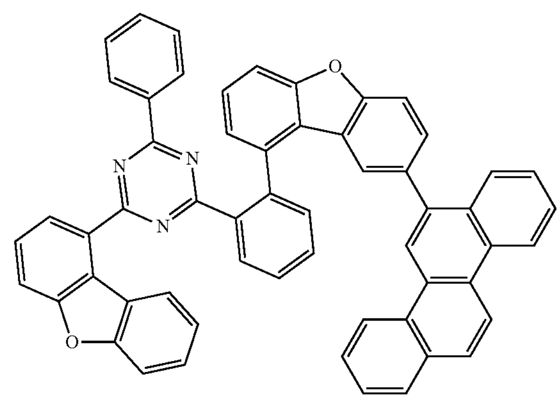
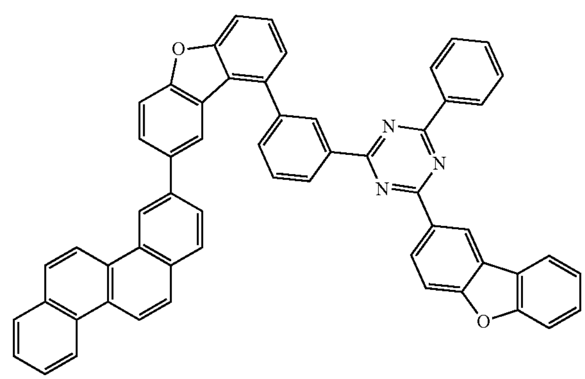

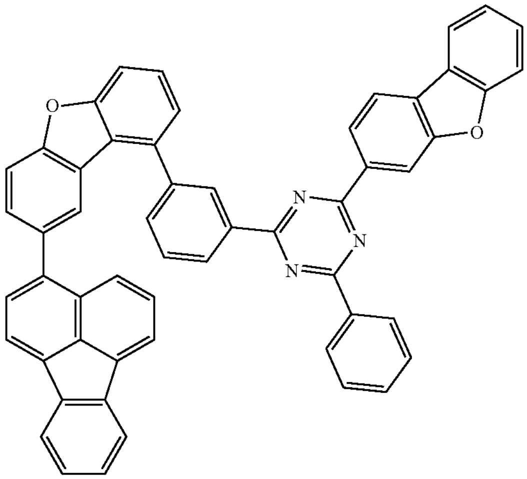
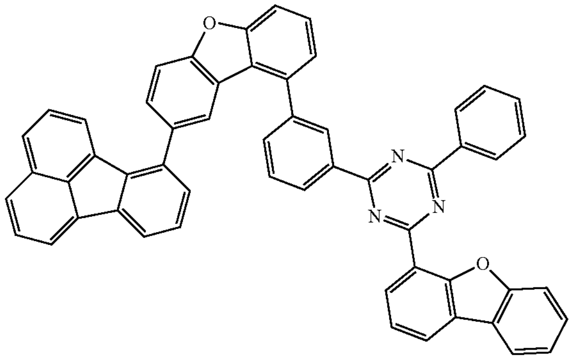
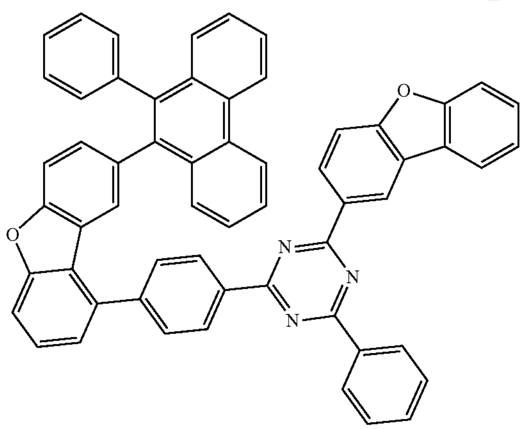
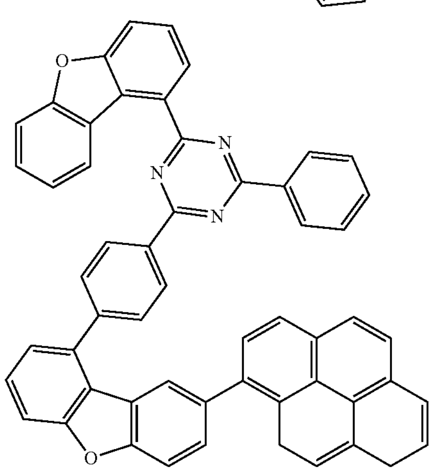
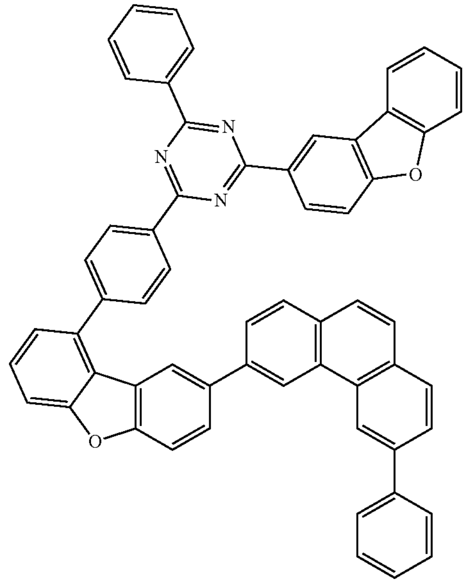
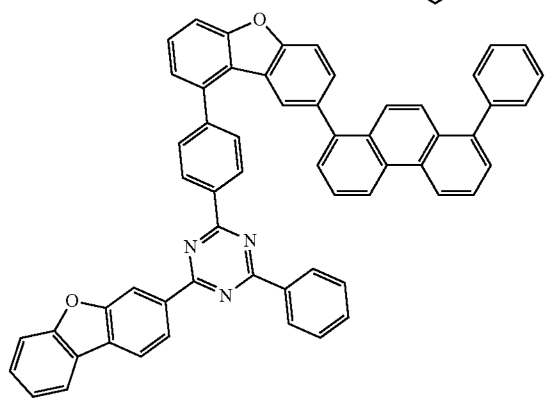
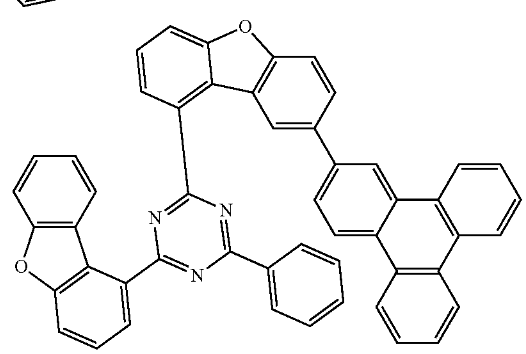
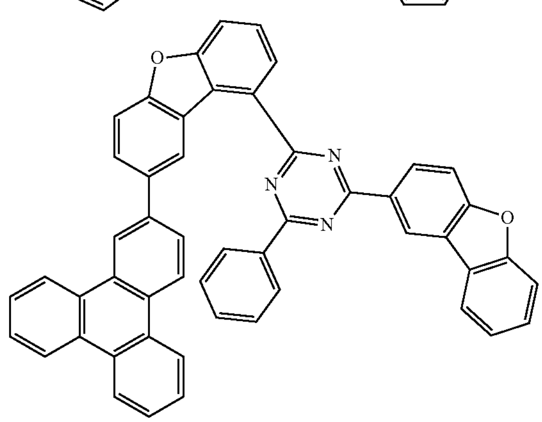

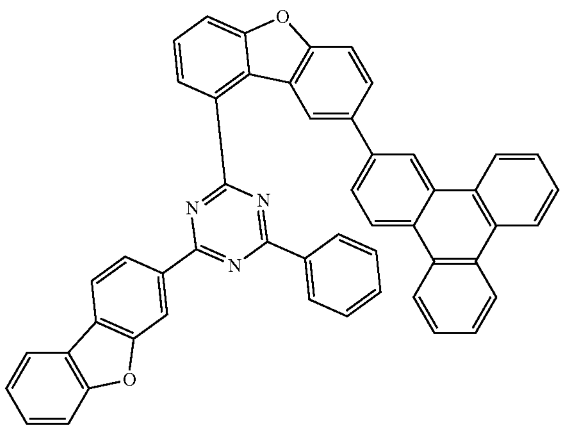
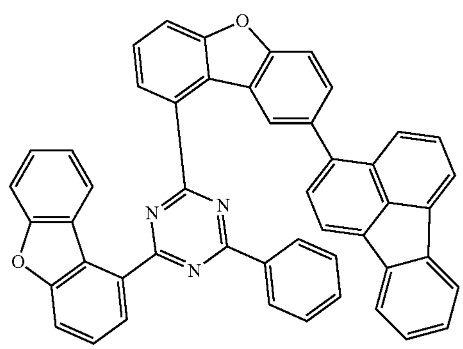
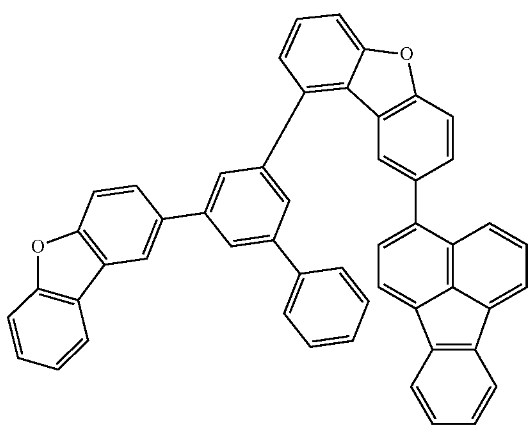
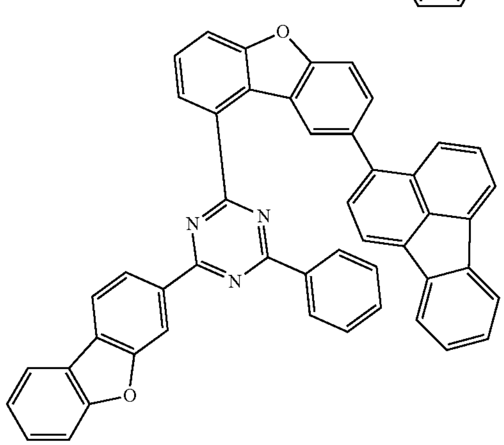
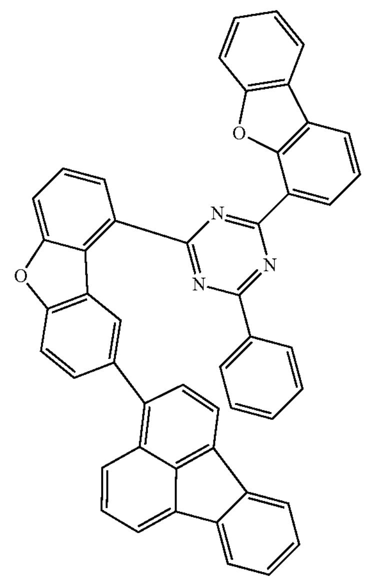
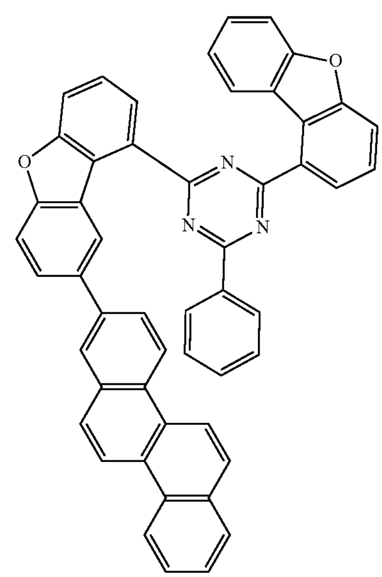
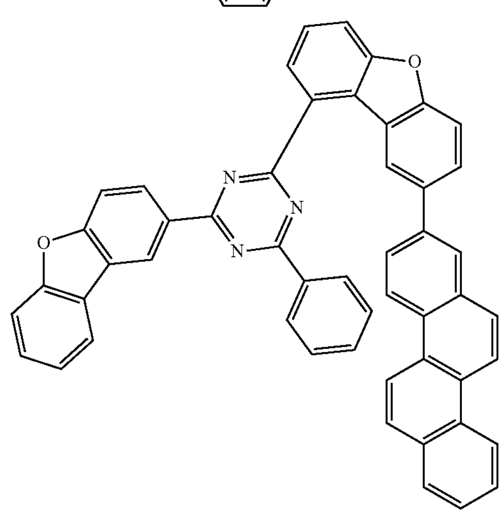

-continued
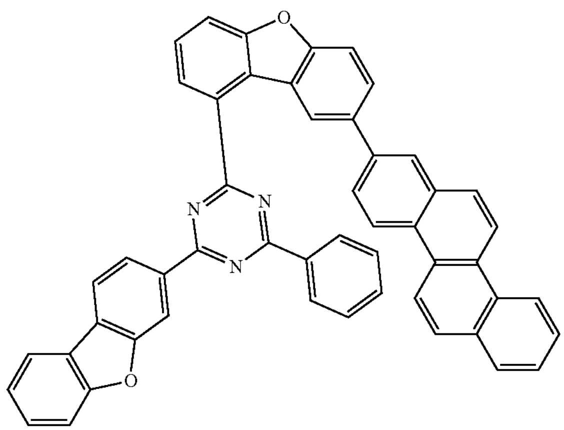
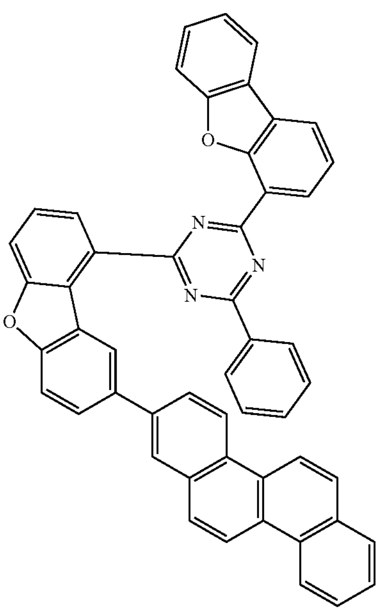
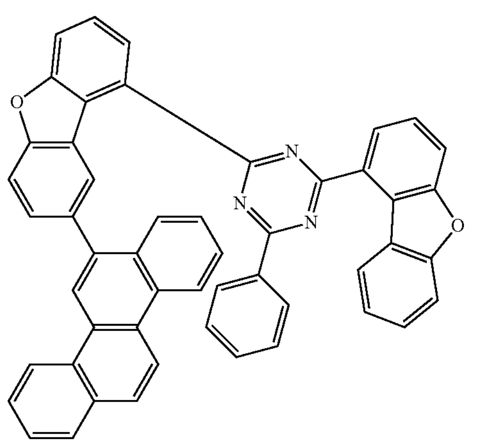
-continued
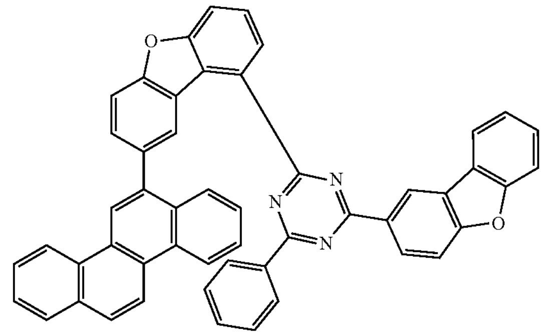
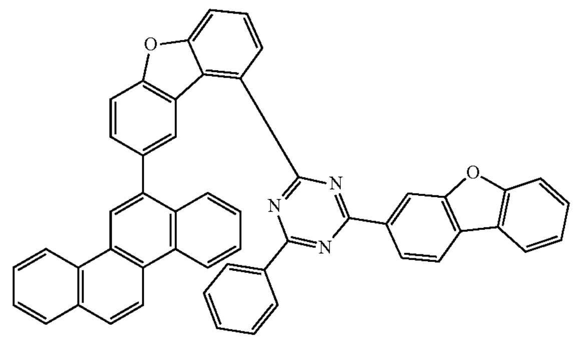
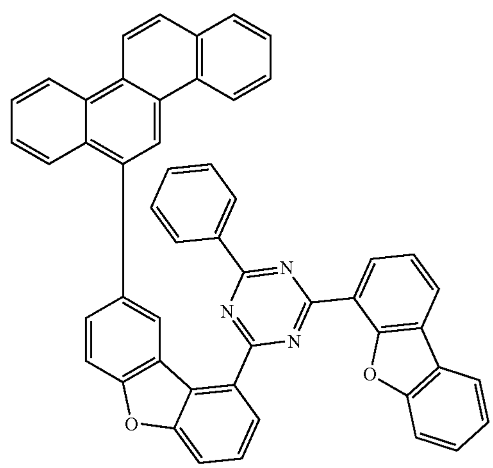
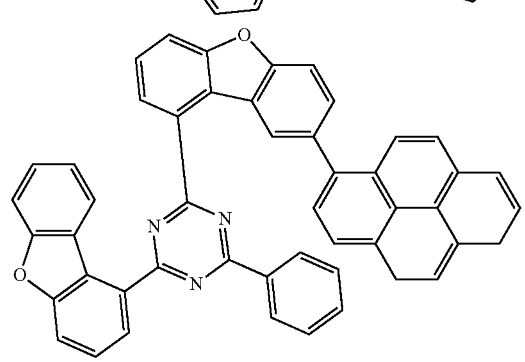

-continued
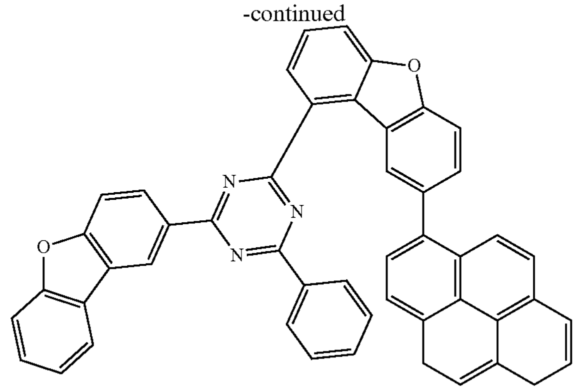
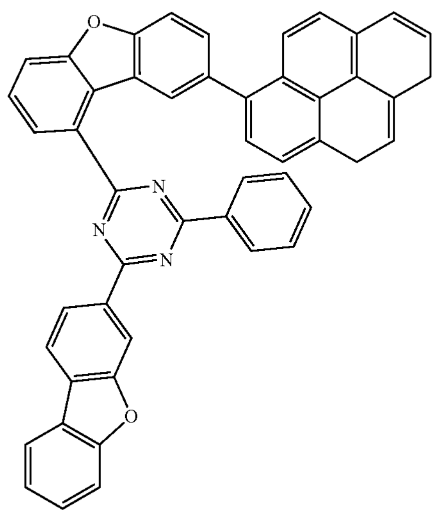
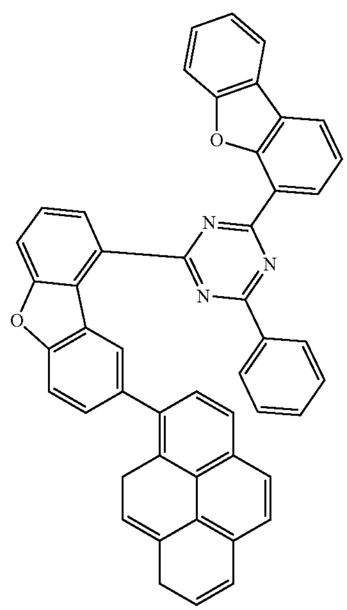
-continued
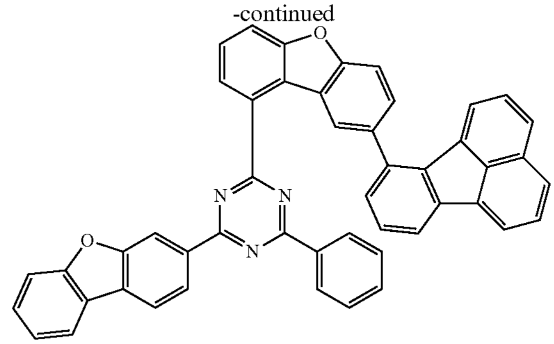
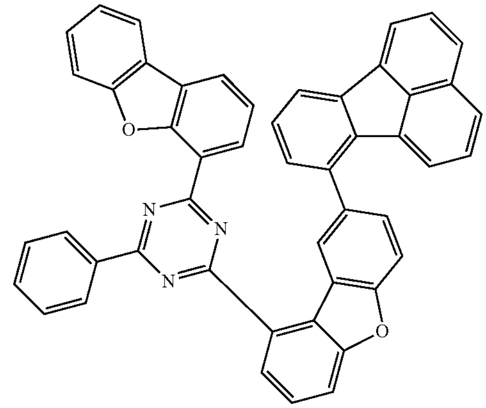
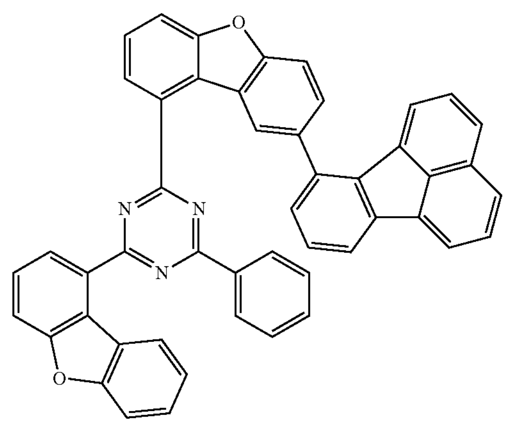
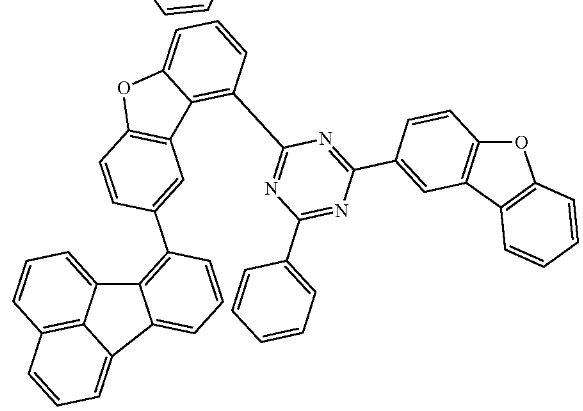

-continued
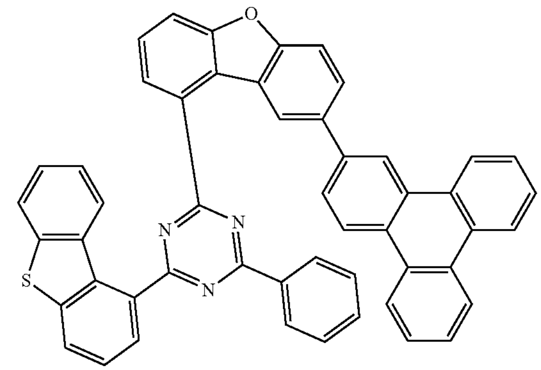
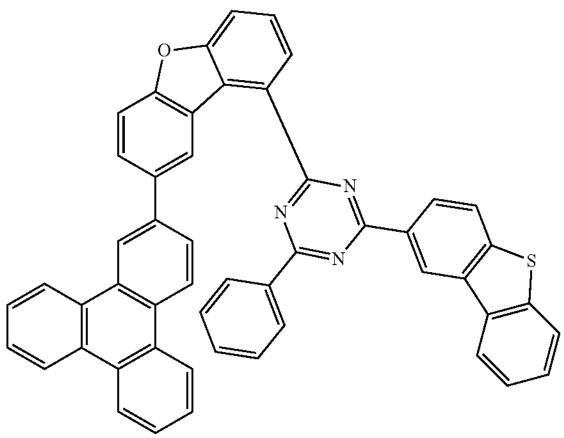
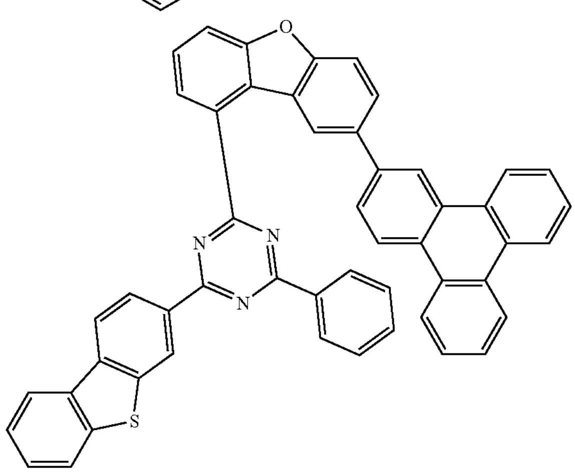
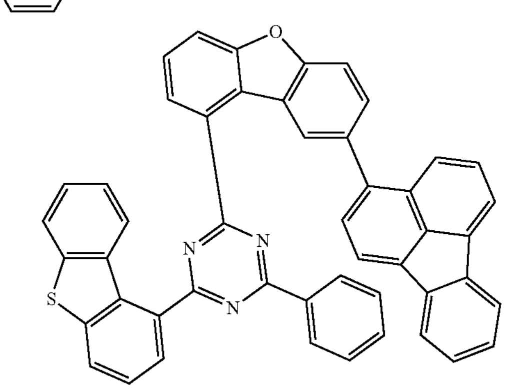
-continued
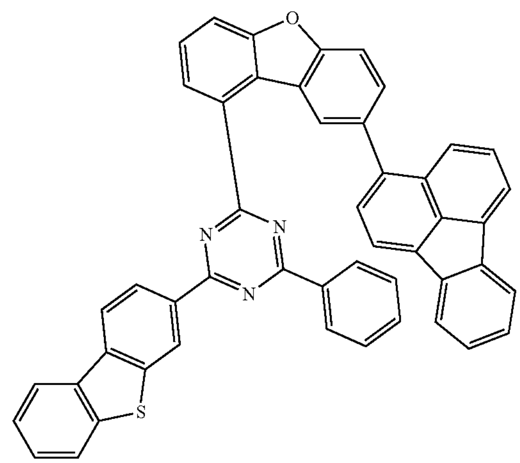
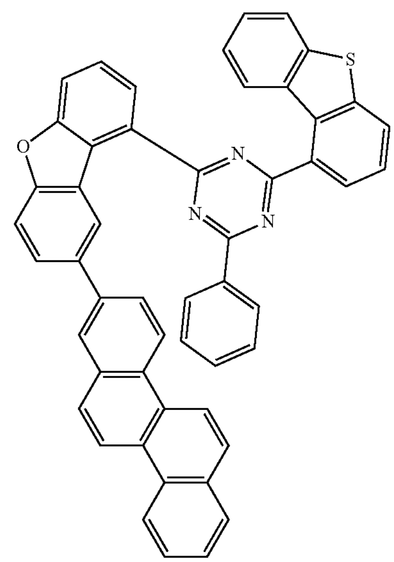
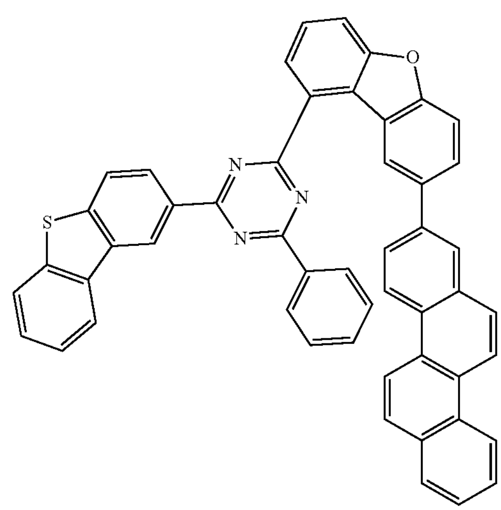

-continued
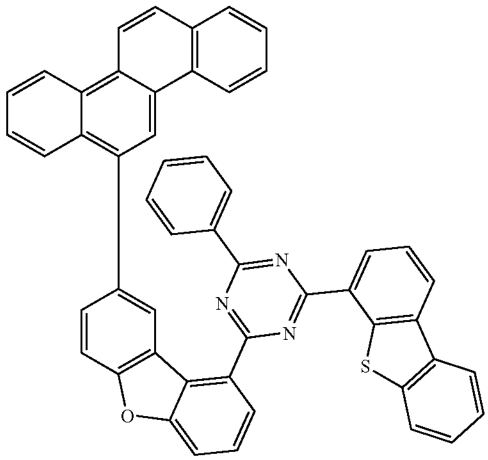
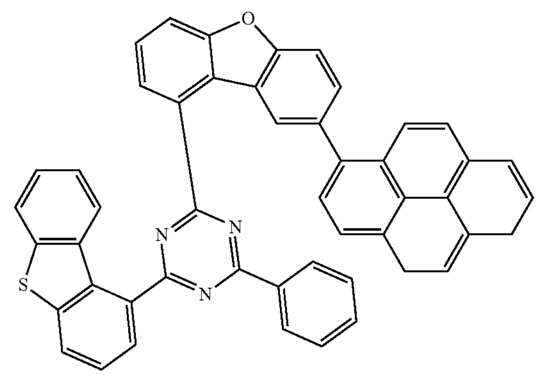
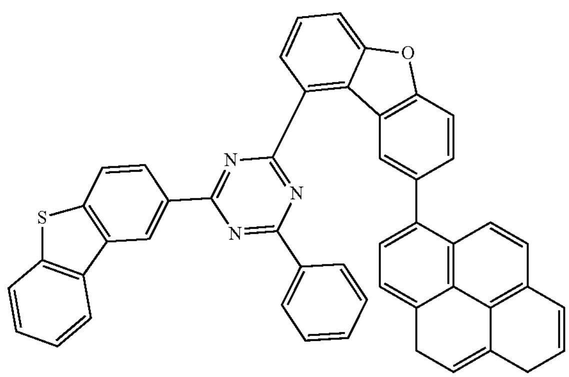
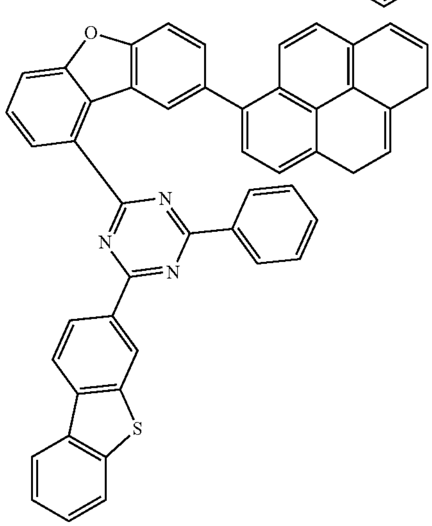
-continued
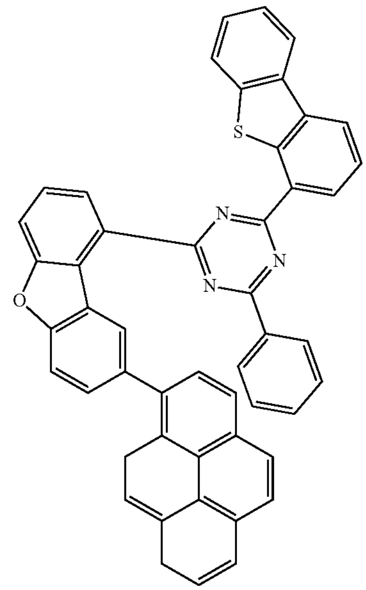
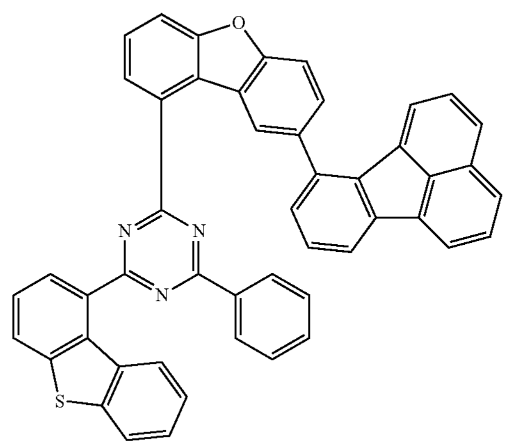
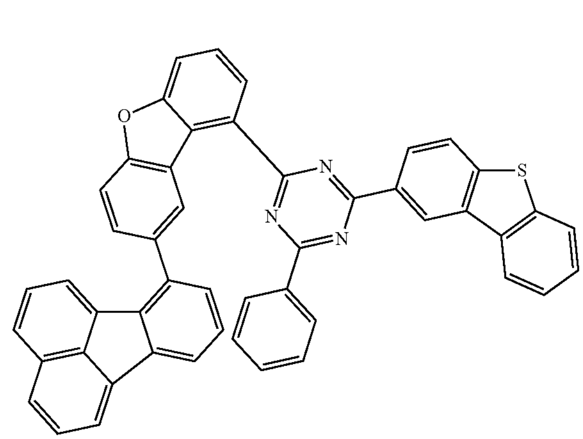

-continued
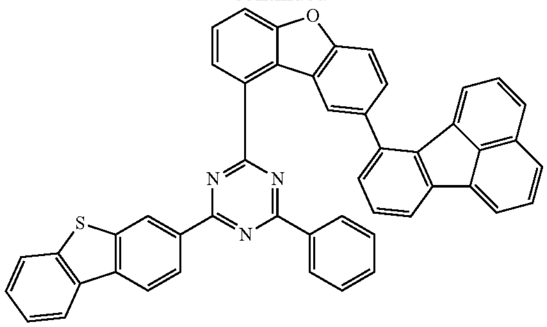
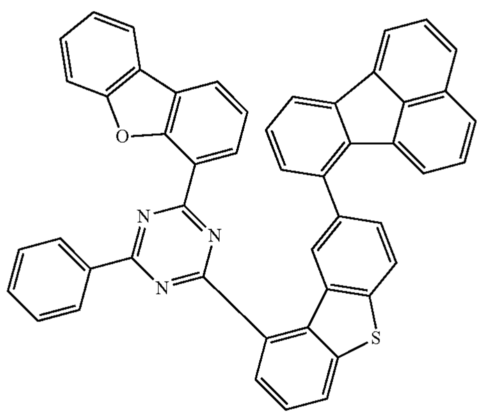
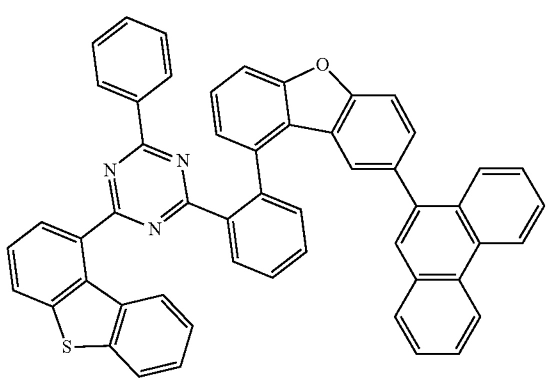
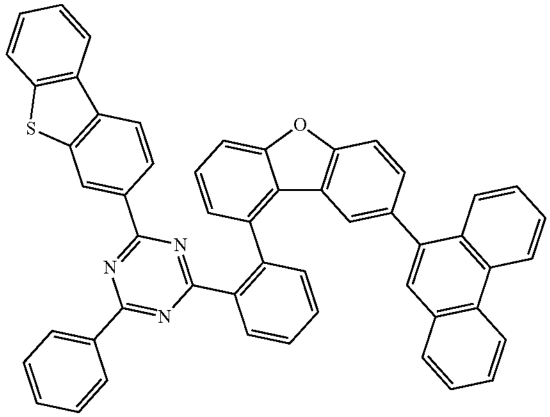
-continued
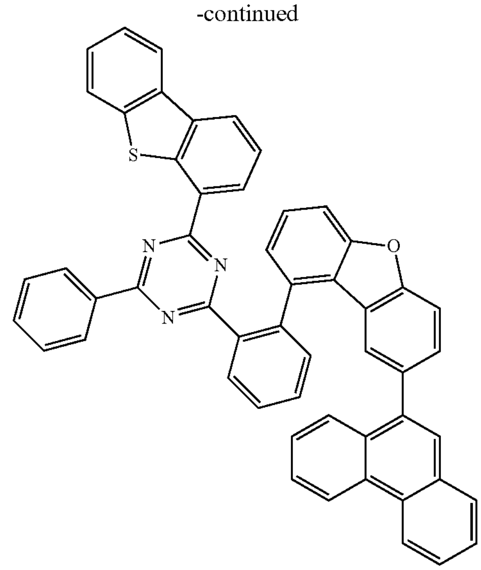
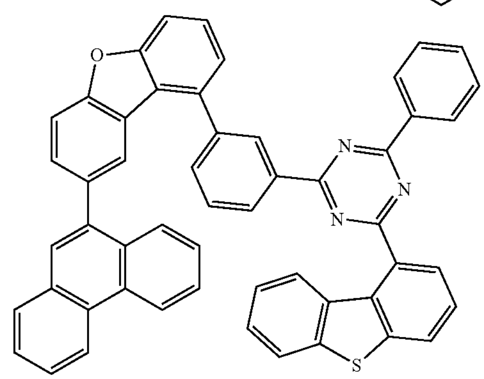
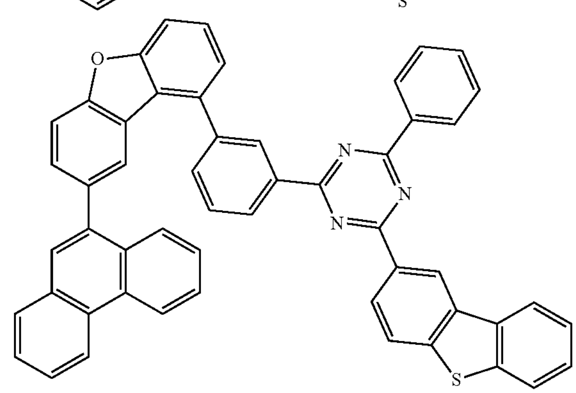
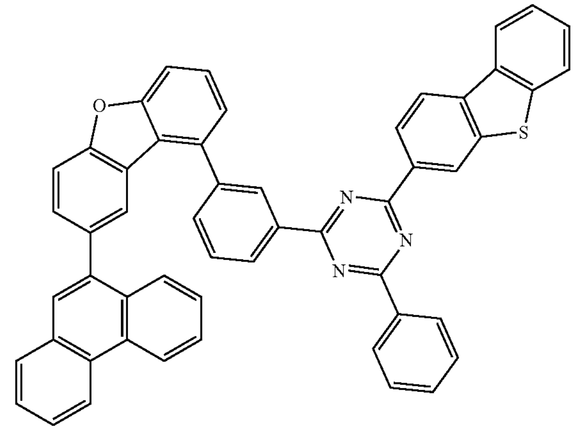

-continued
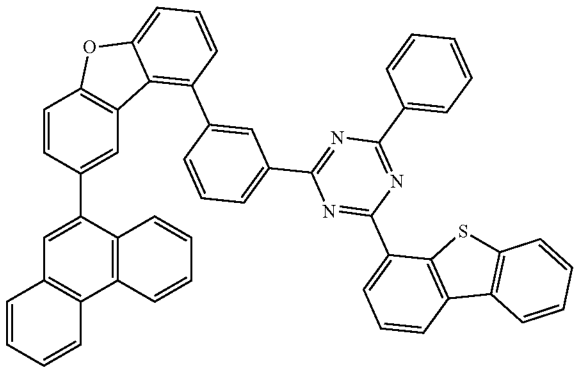
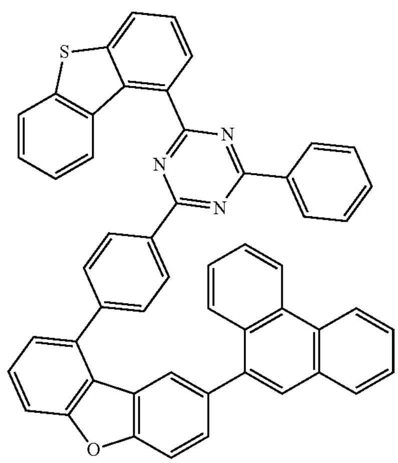
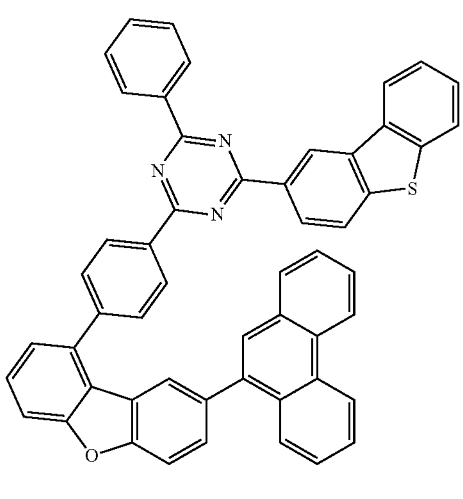
-continued
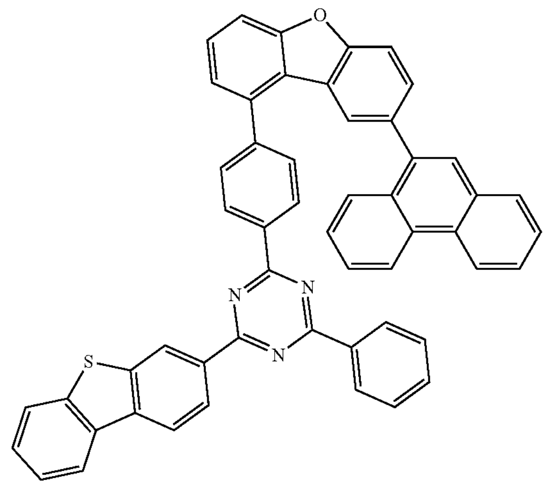
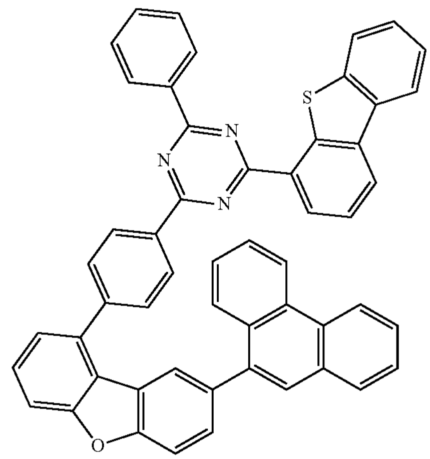
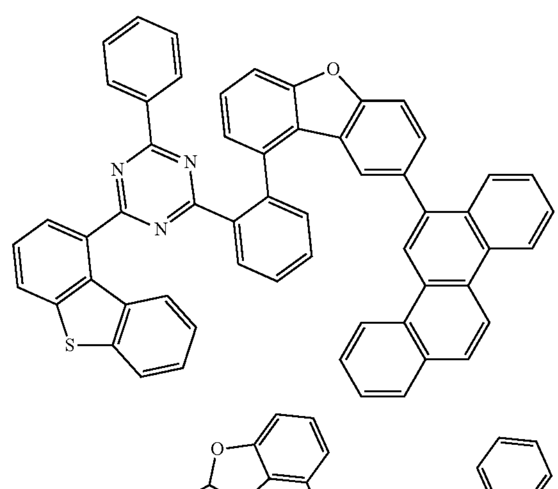
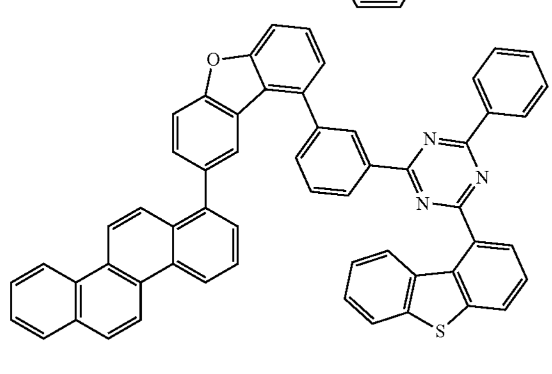

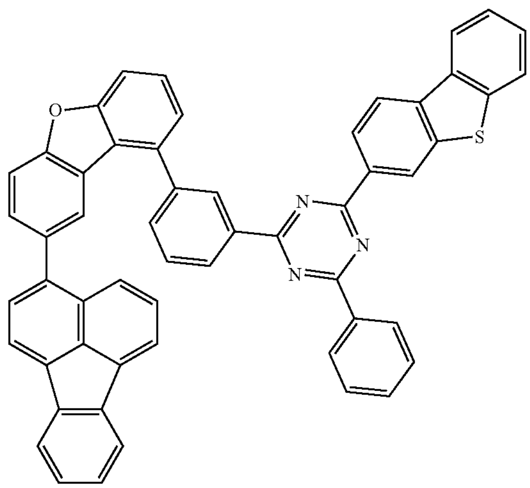
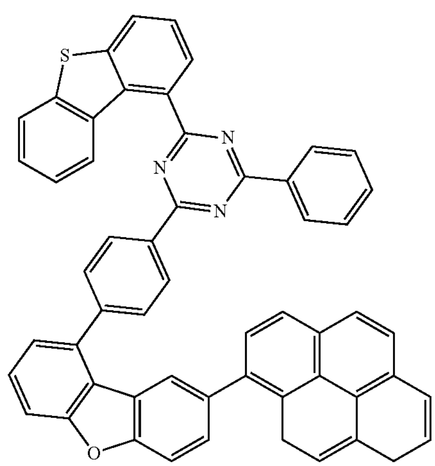
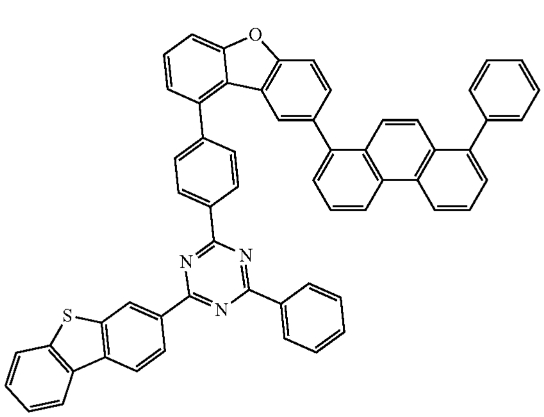
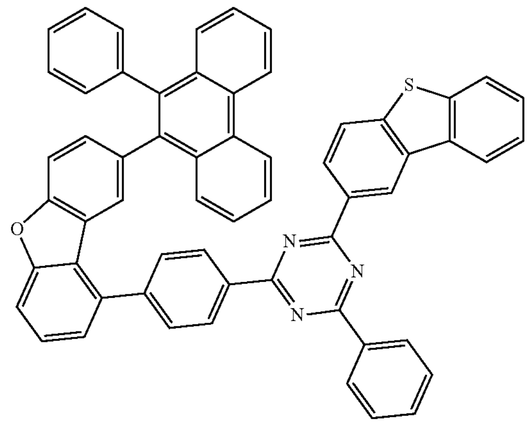
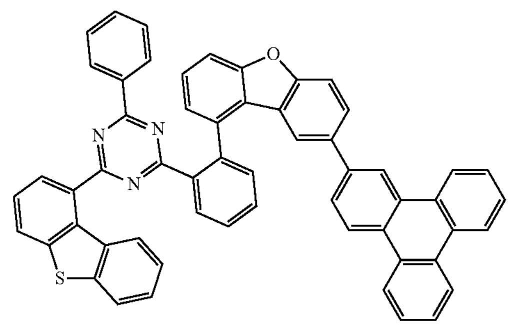
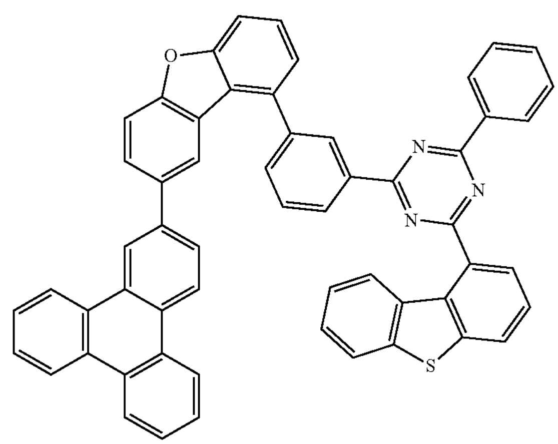
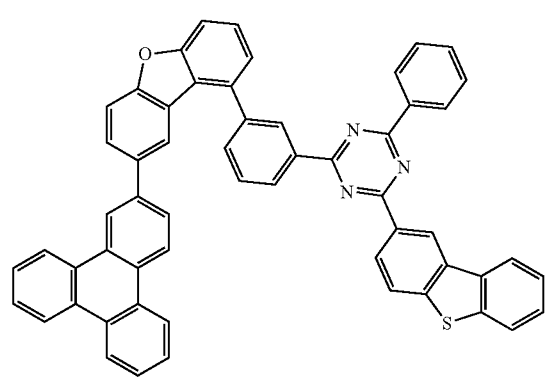

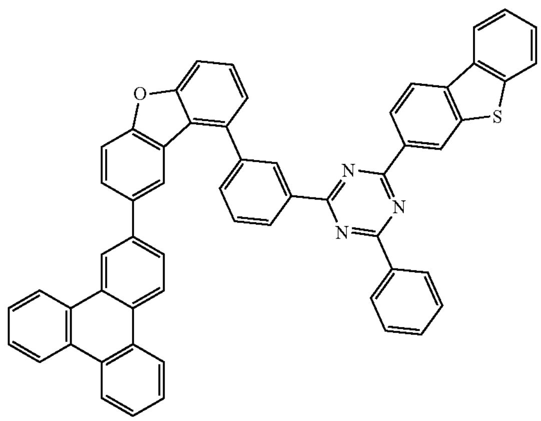 [SMILES: c1ccc(-c2nc(-c3cccc(-c4cccc5oc6ccc(-c7ccc8c9ccccc9c9ccccc9c8c7)cc6c45)c3)nc(-c3ccc4c(c3)sc3ccccc34)n2)cc1]
O
N
N
N
S
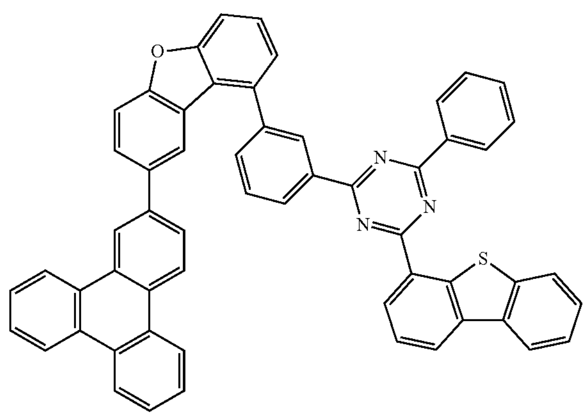
O
N
N
N
S
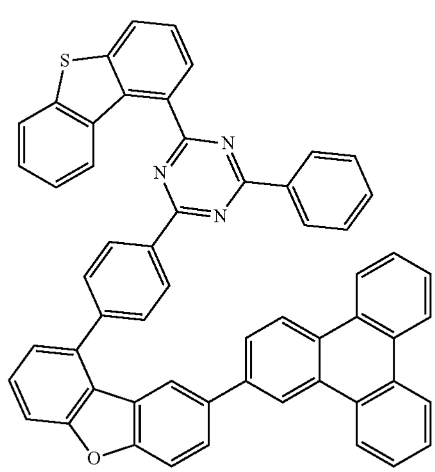
S
N
N
N
O
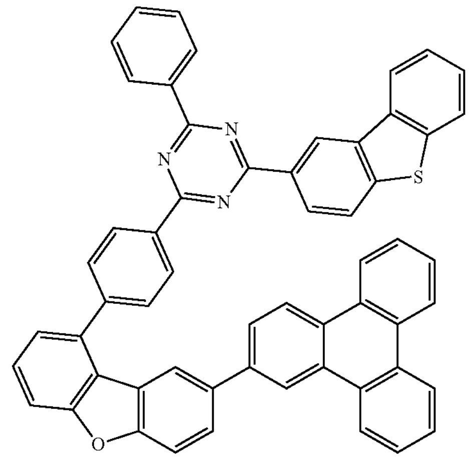
N
N
N
S
O
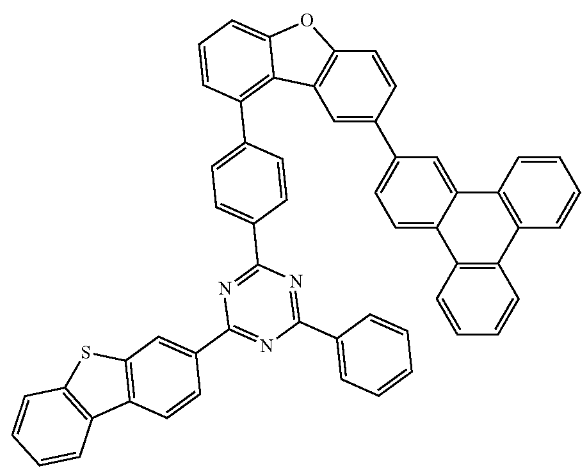
O
N
N
N
S
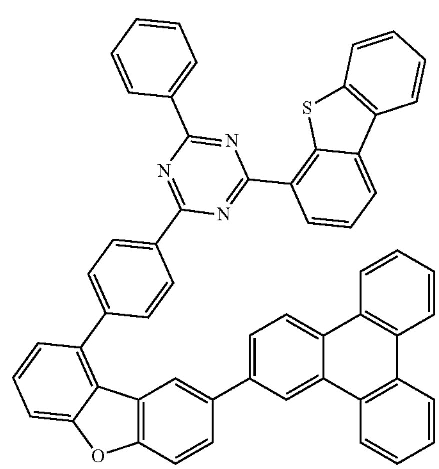
S
N
N
N
O

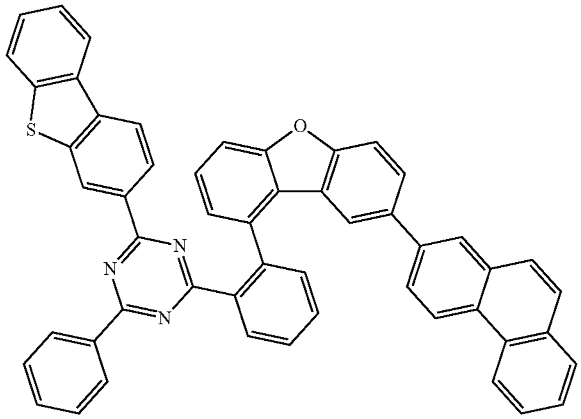
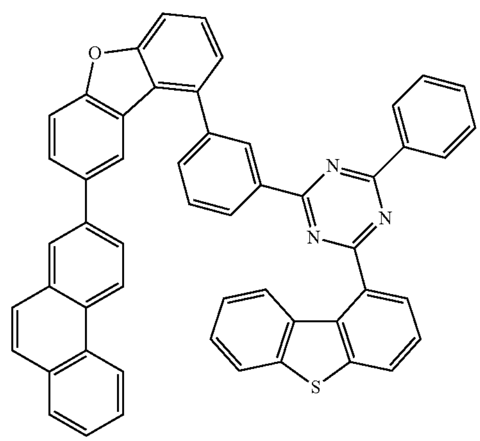
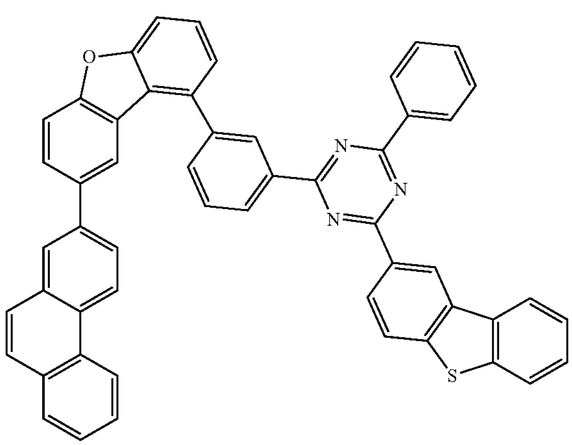
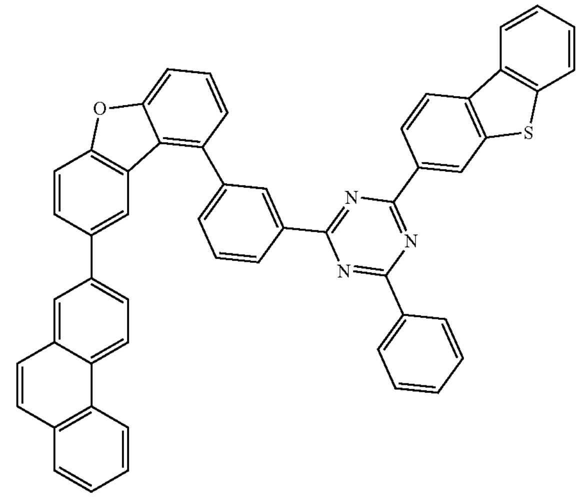
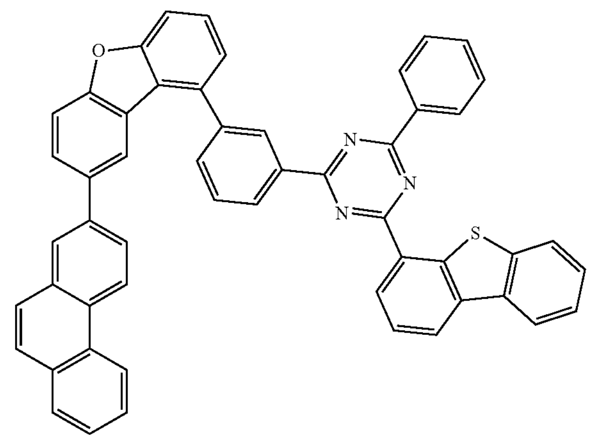
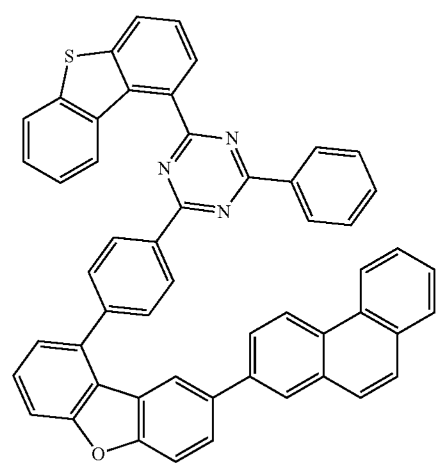

-continued
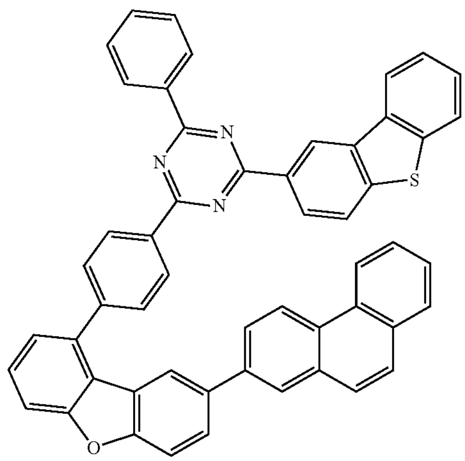
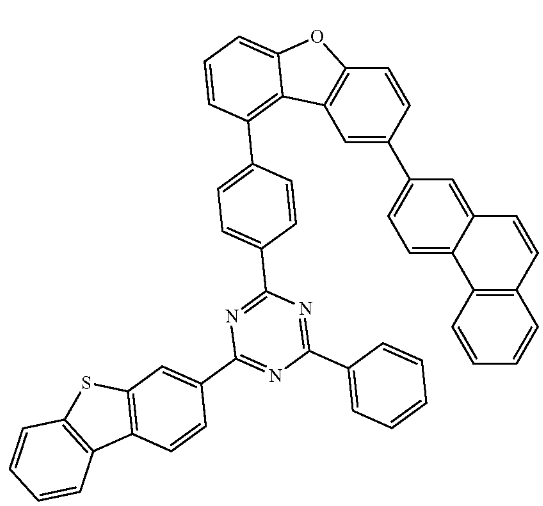
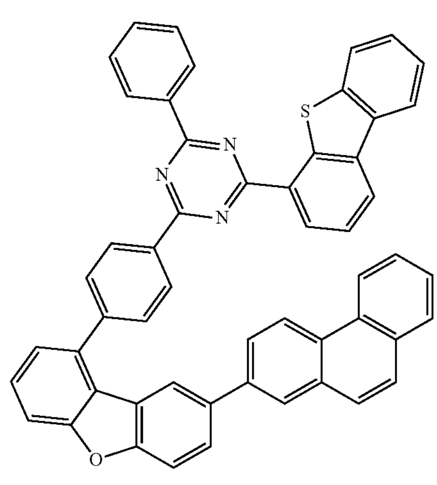
-continued
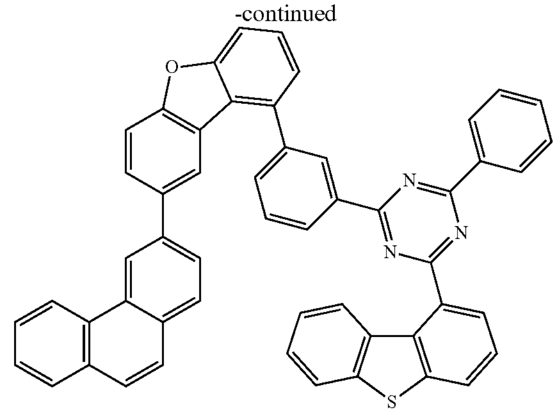
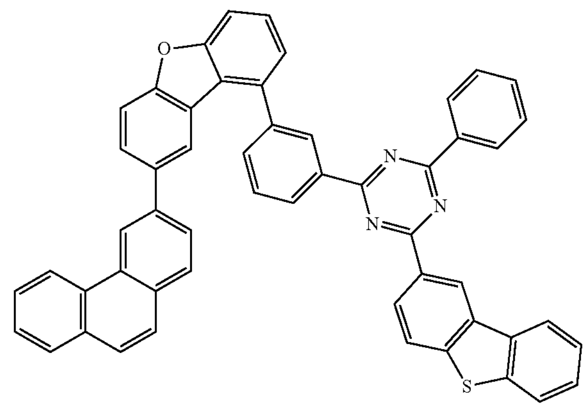
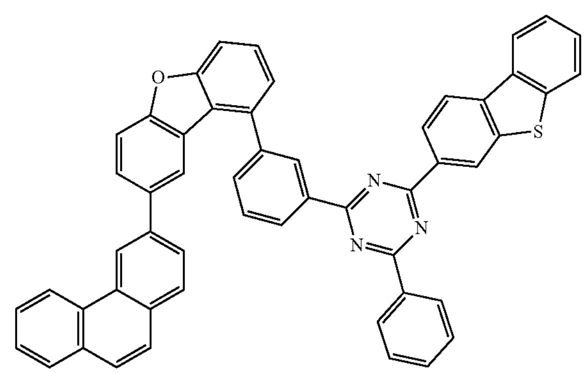
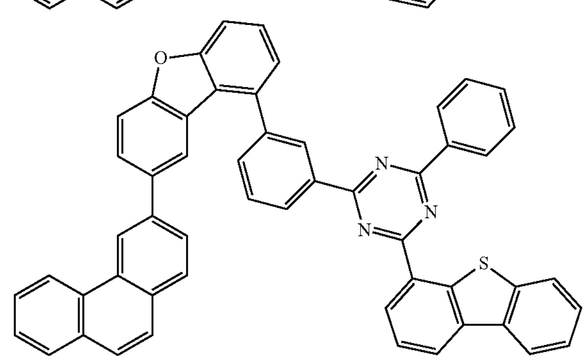

-continued
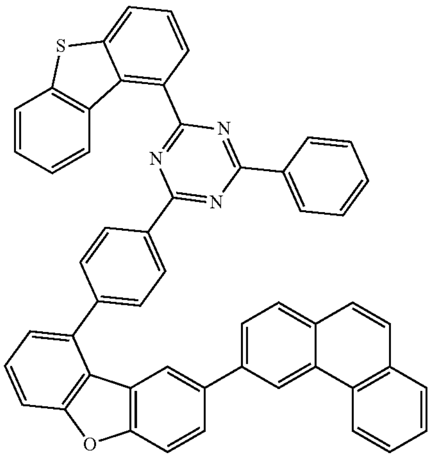
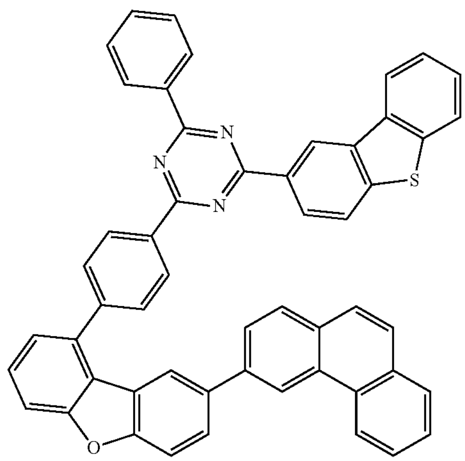
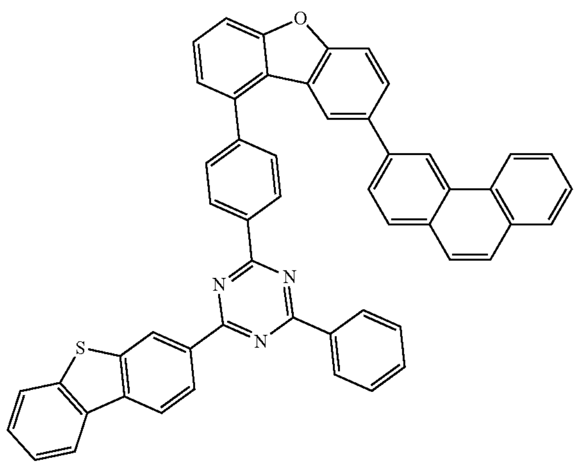
-continued
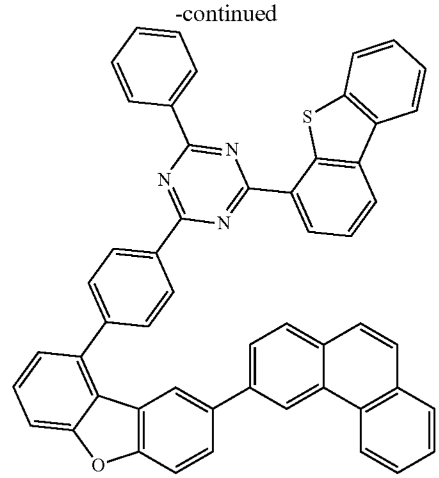
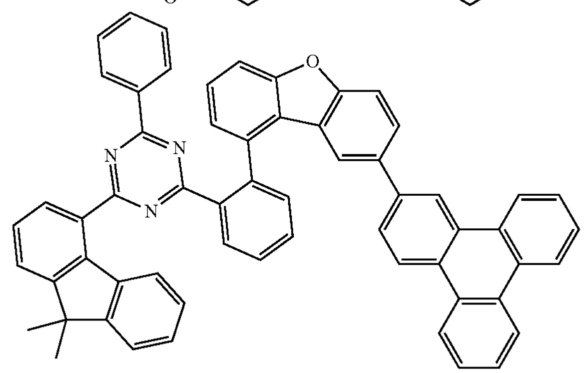
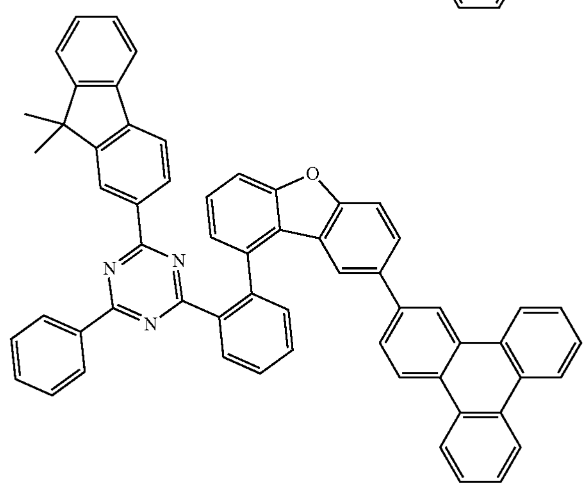
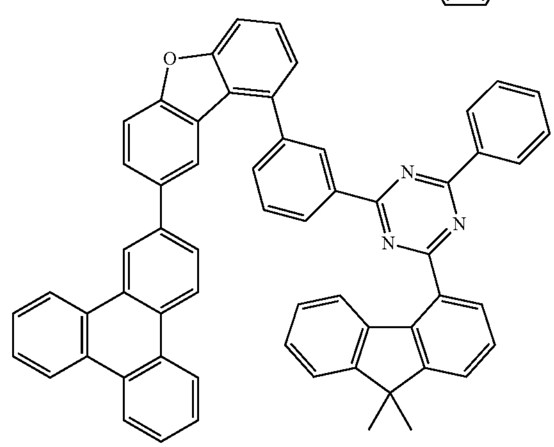

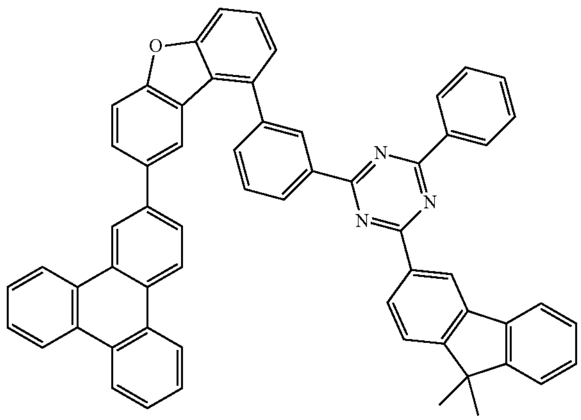
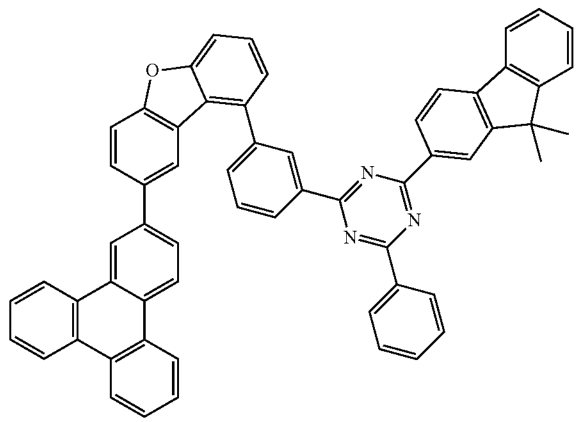
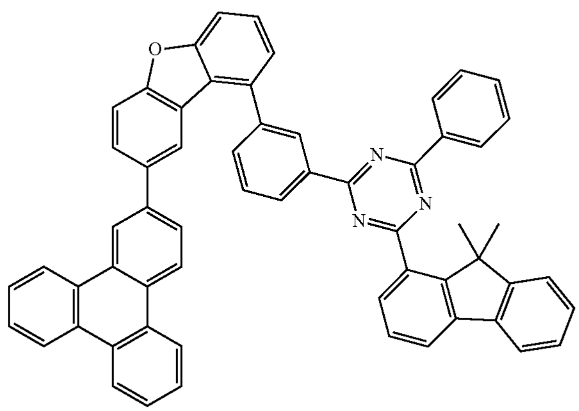
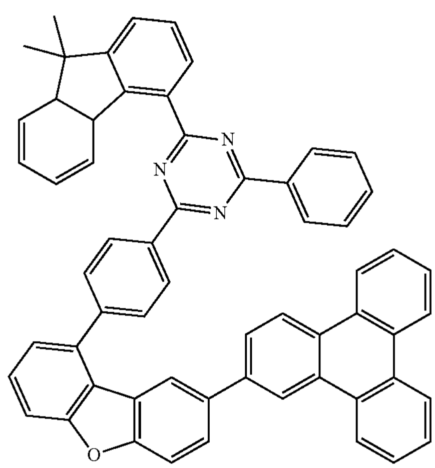
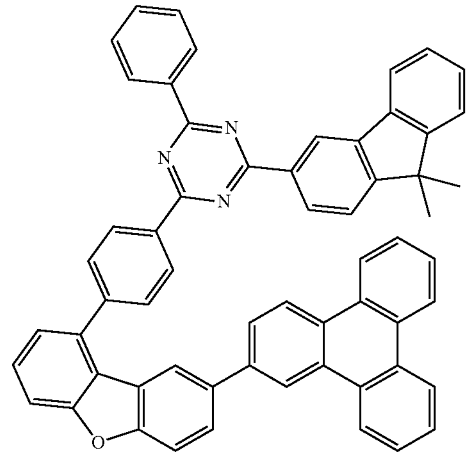
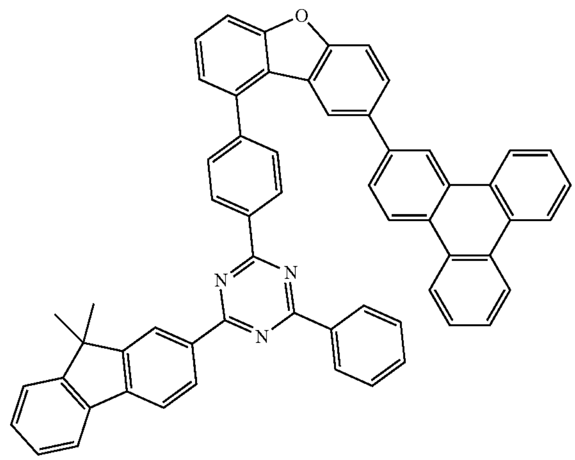
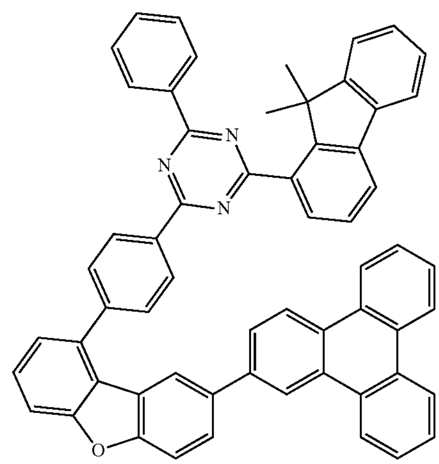
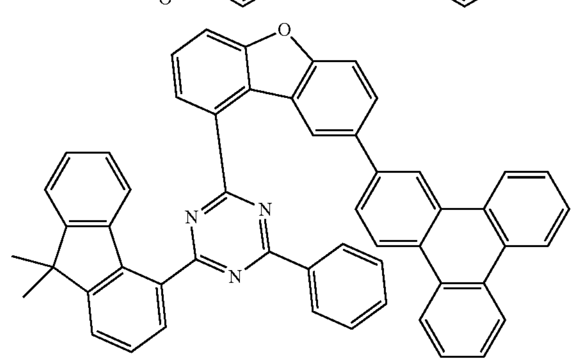

-continued
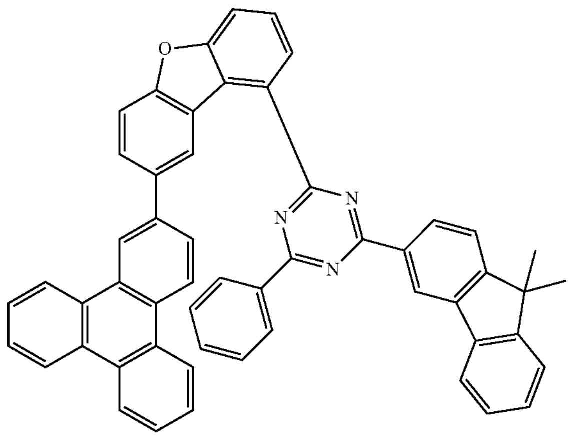
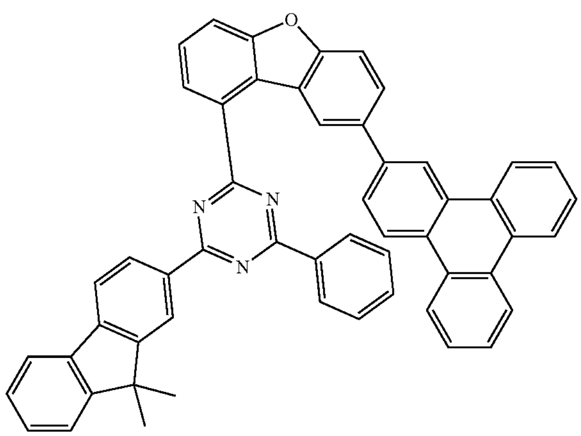
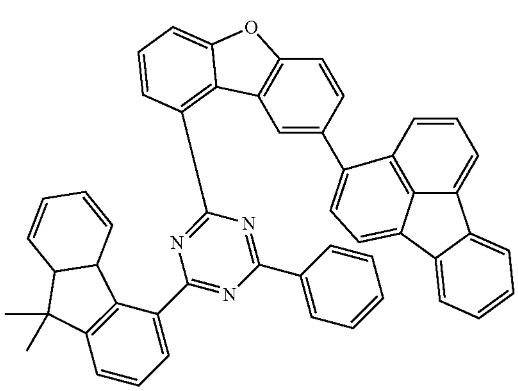
-continued
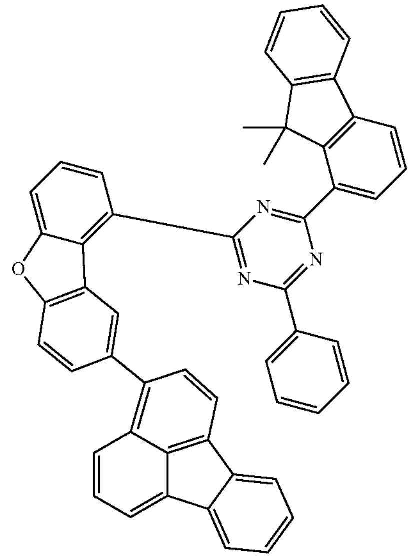
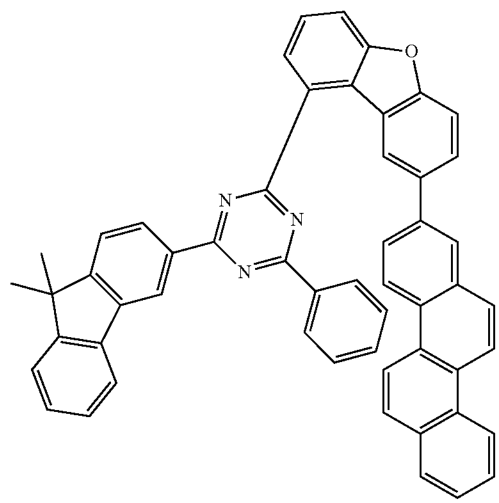
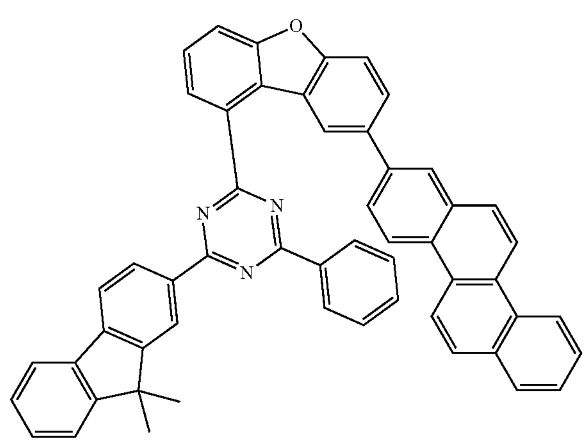

-continued
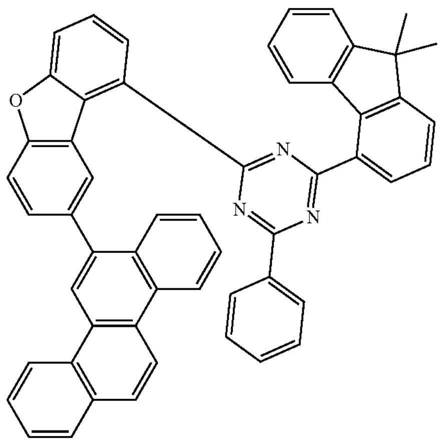
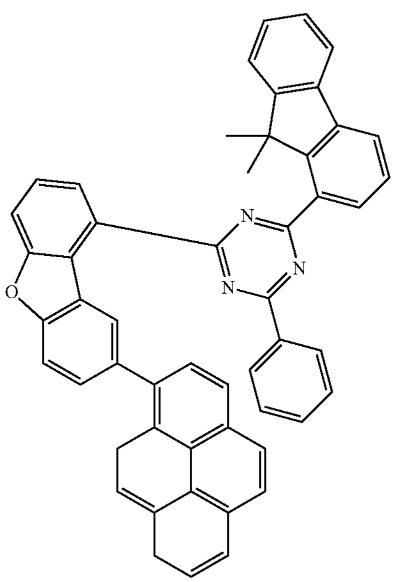
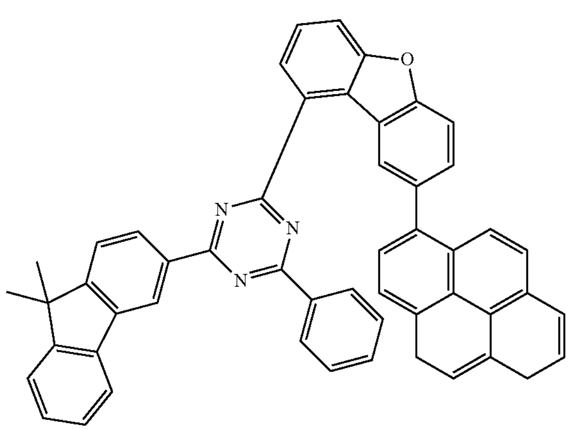
-continued
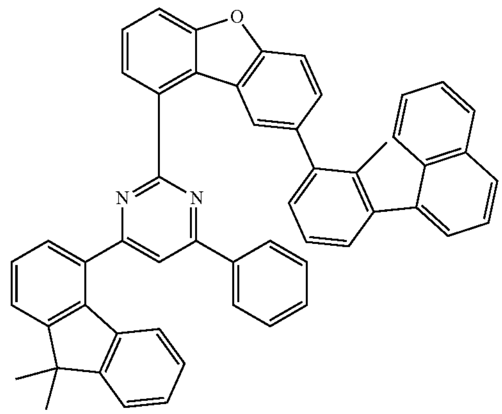
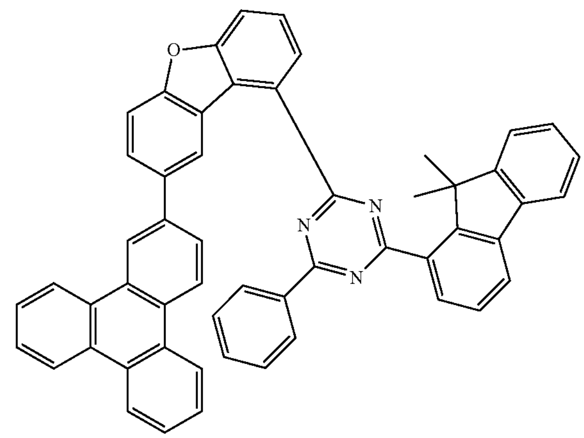
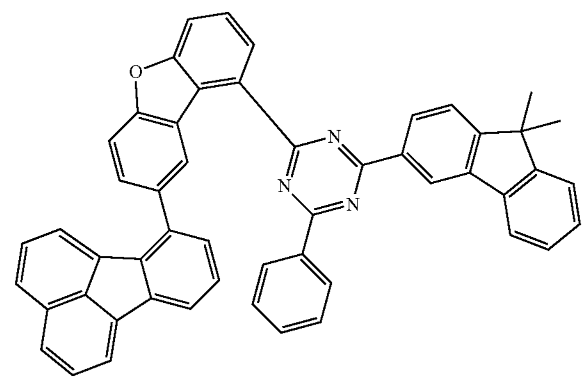
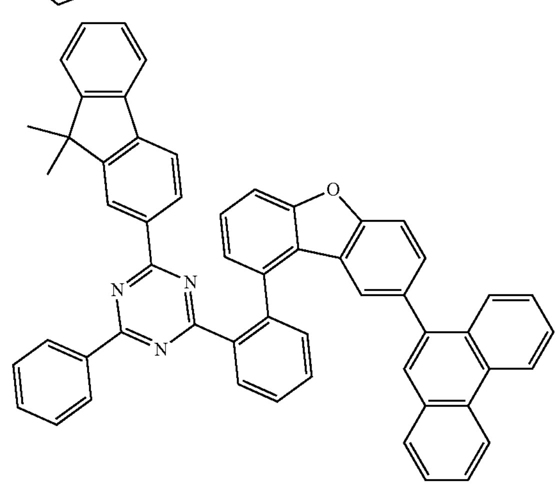

-continued
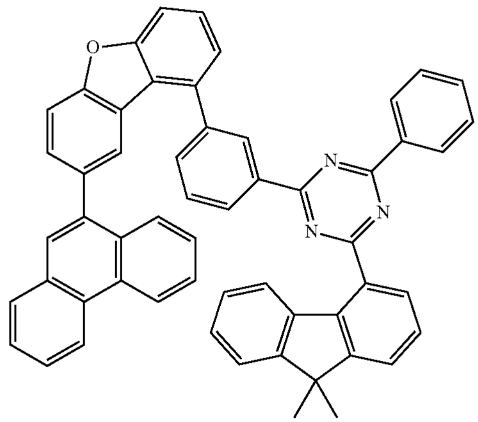
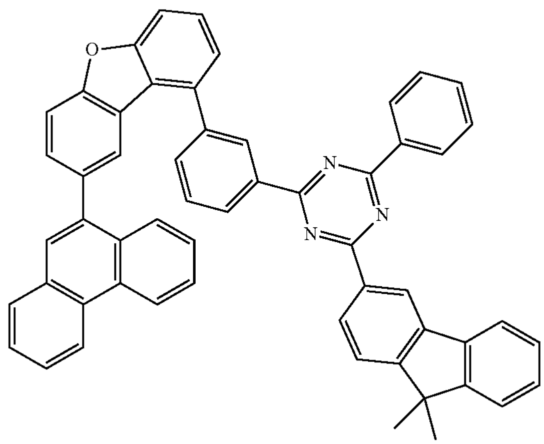
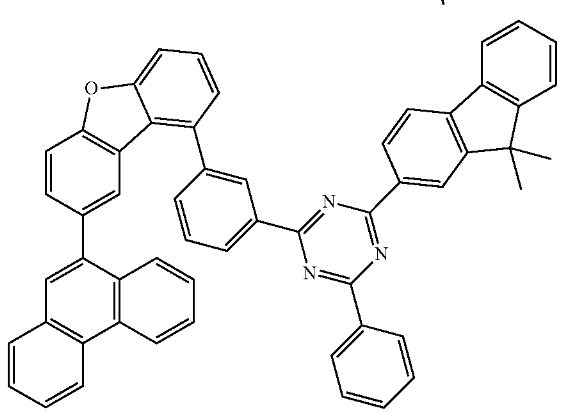
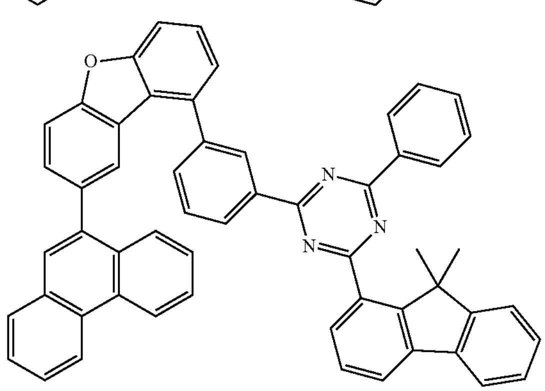
-continued
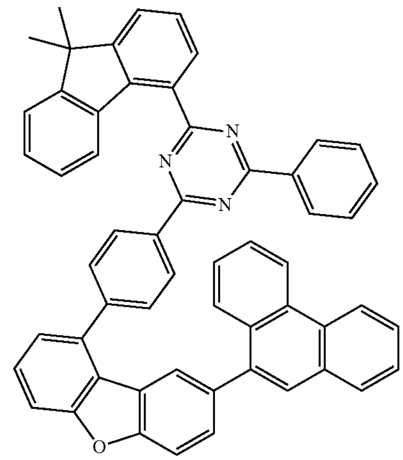
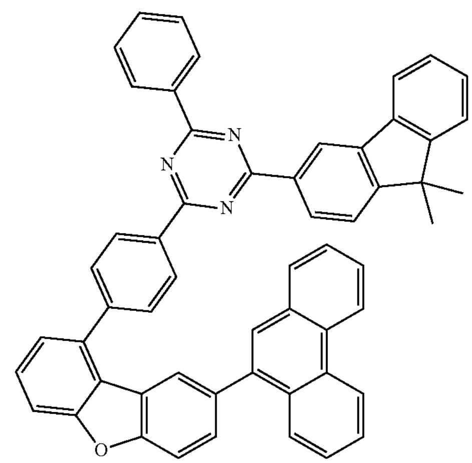
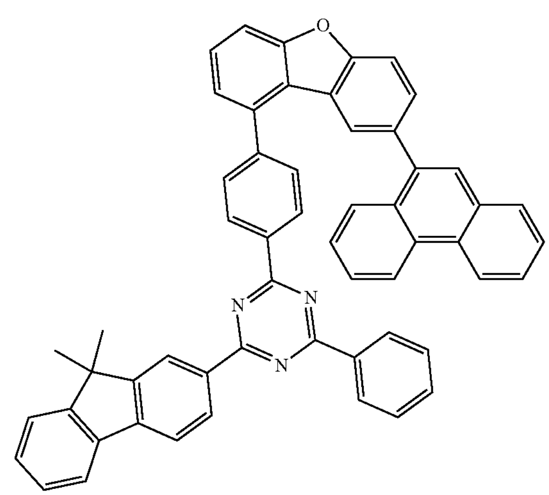

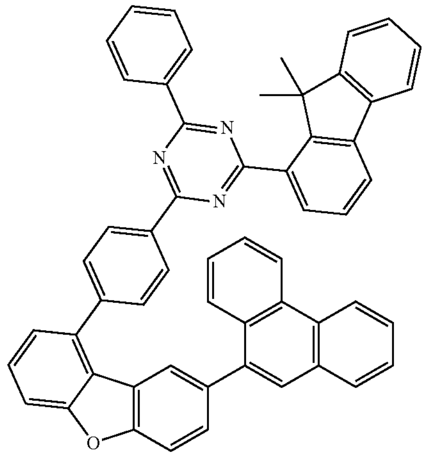
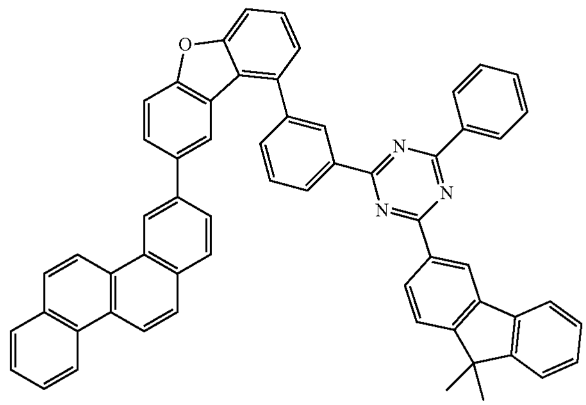
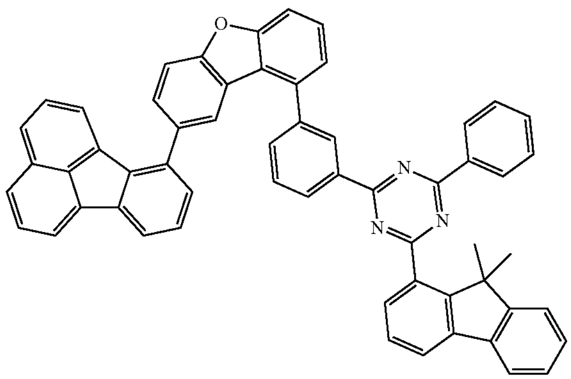
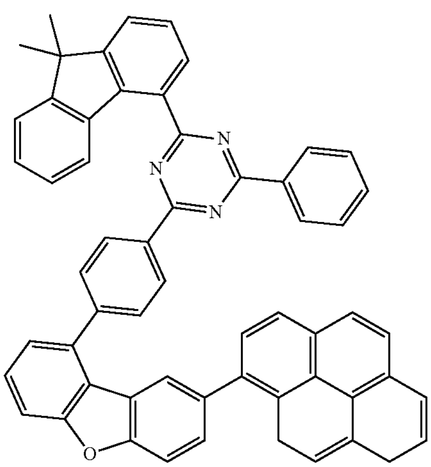
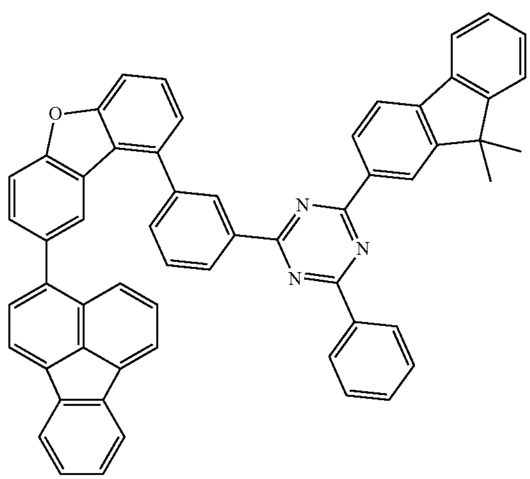
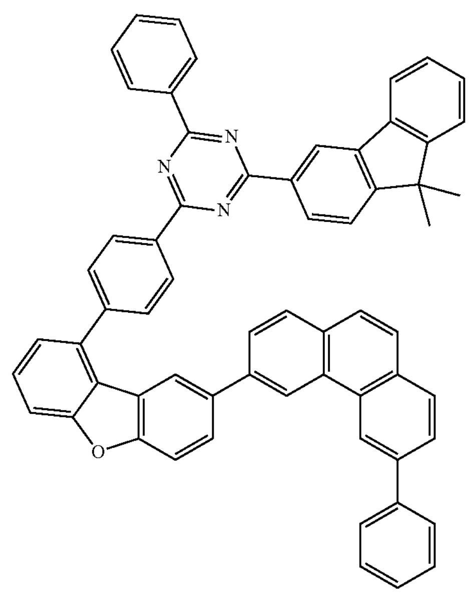
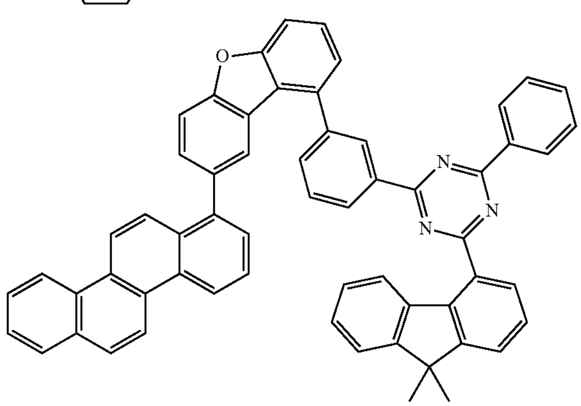

-continued
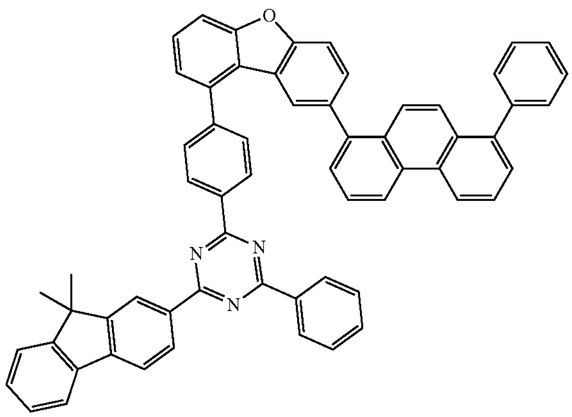
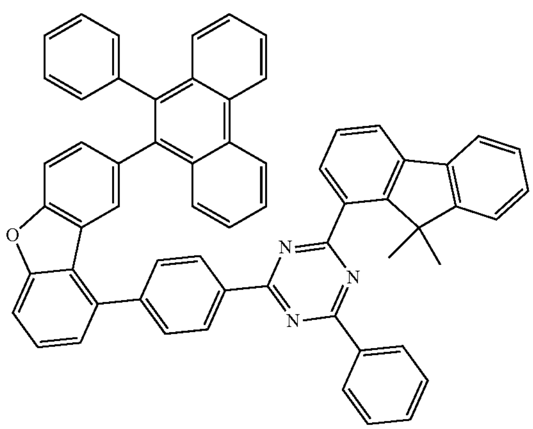
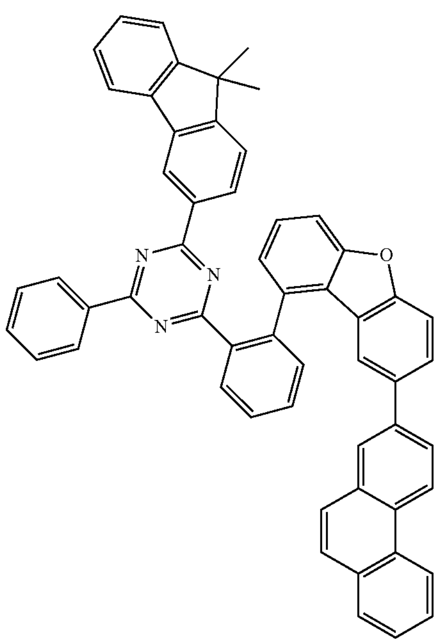
-continued
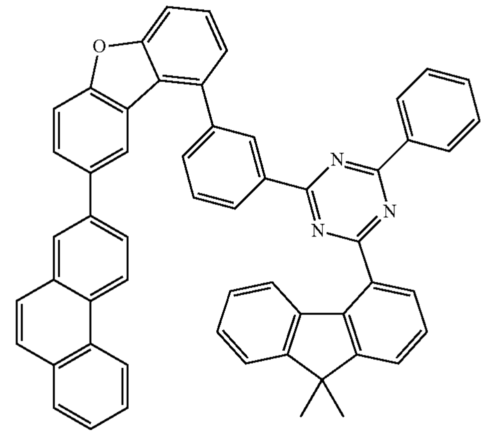
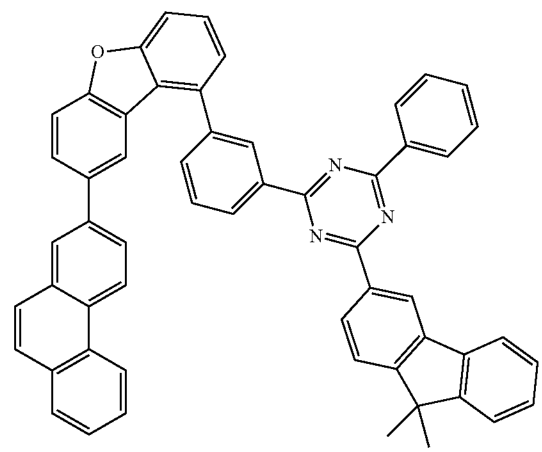
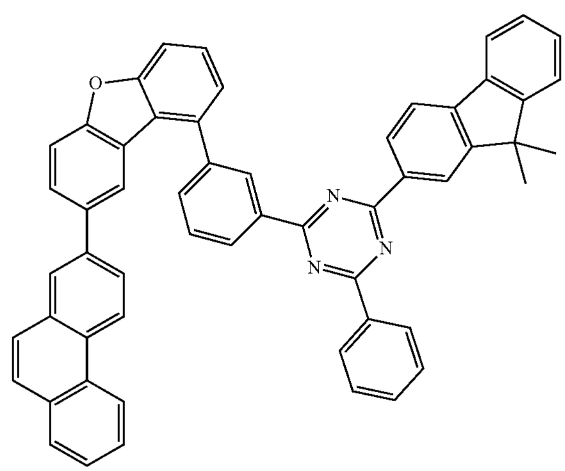

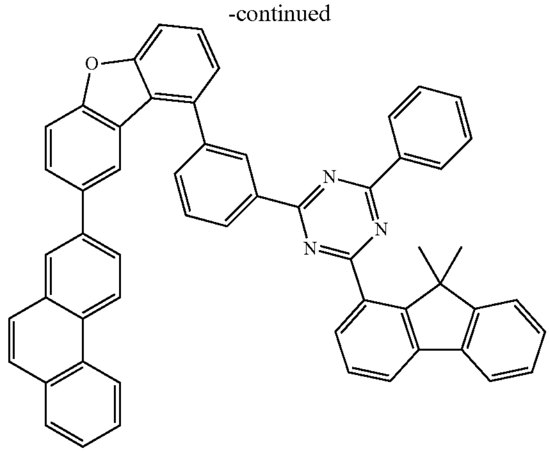
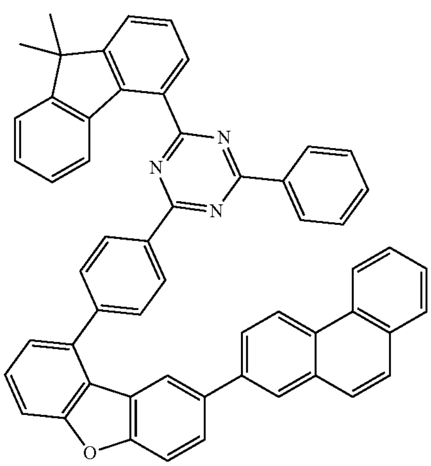
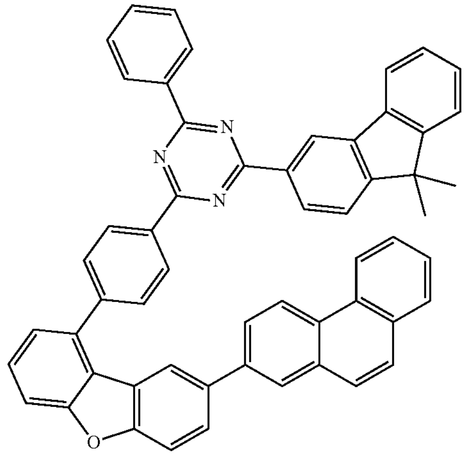
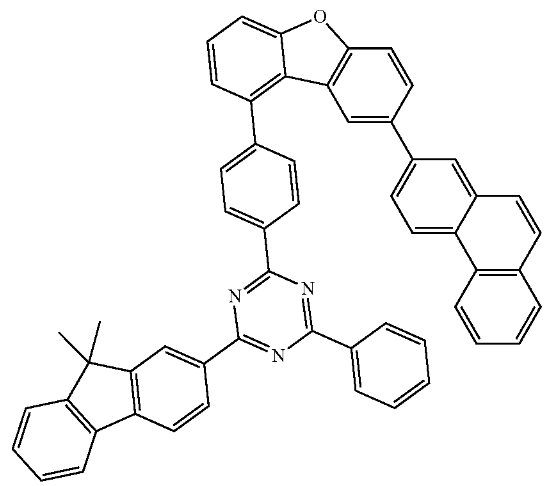
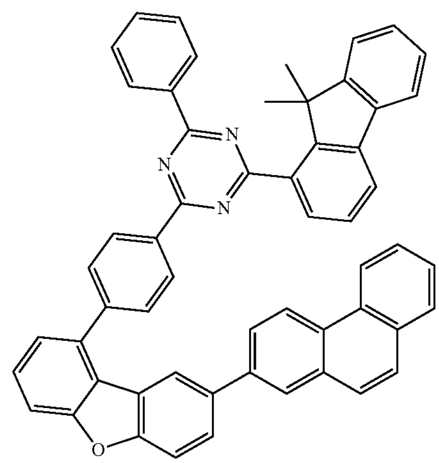
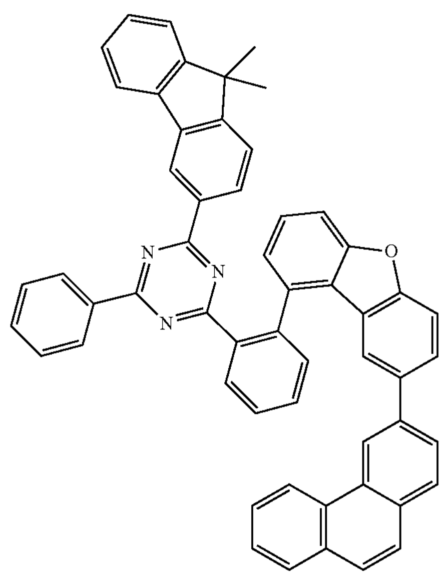

-continued
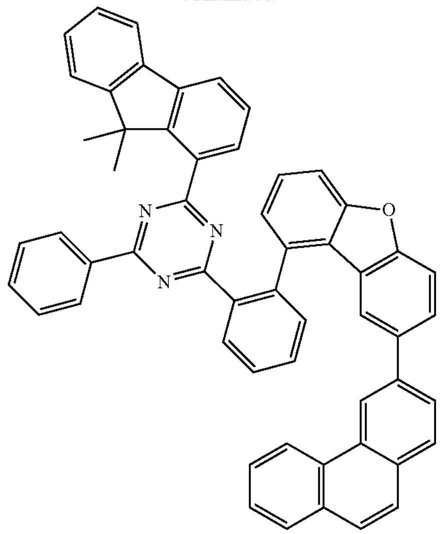
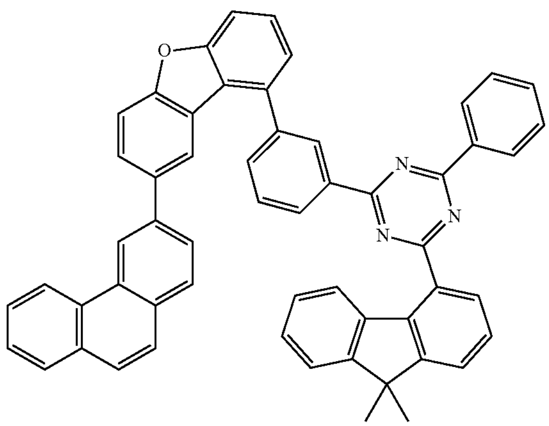
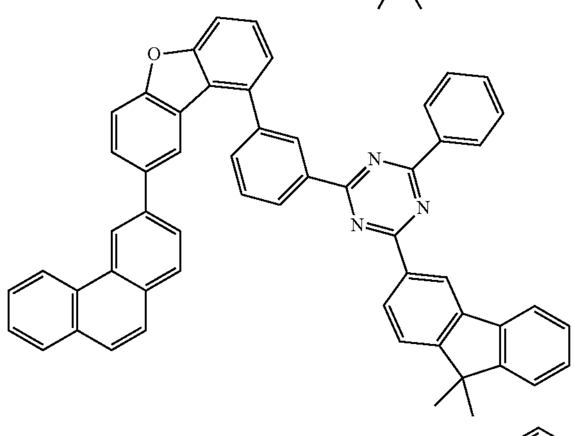
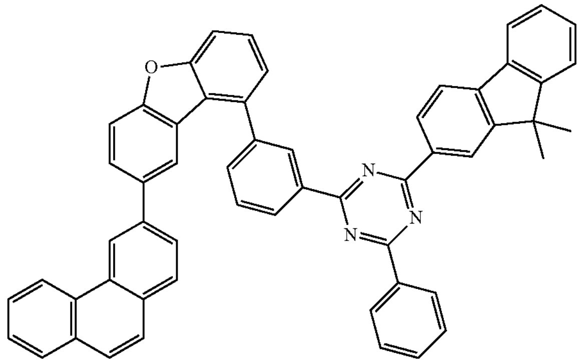
-continued
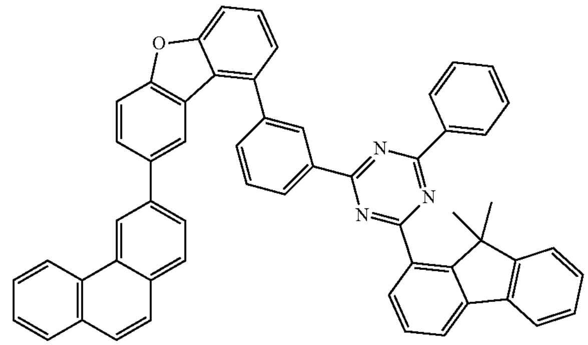
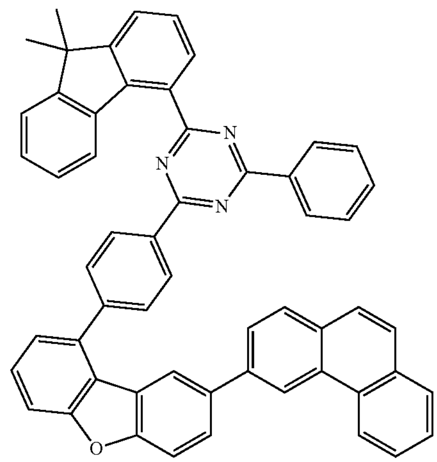
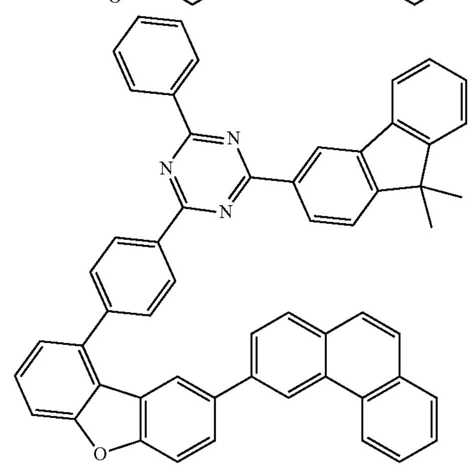
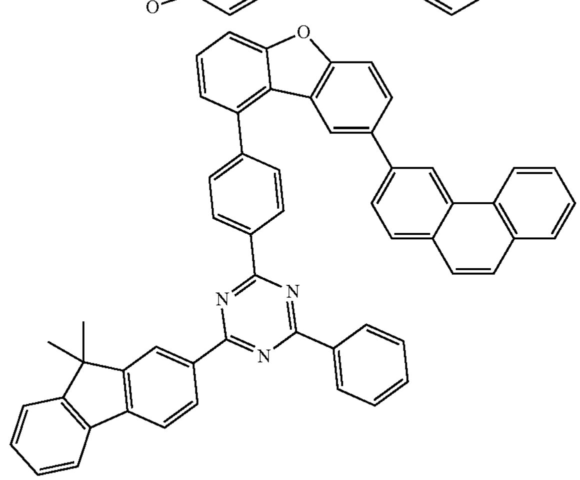

-continued
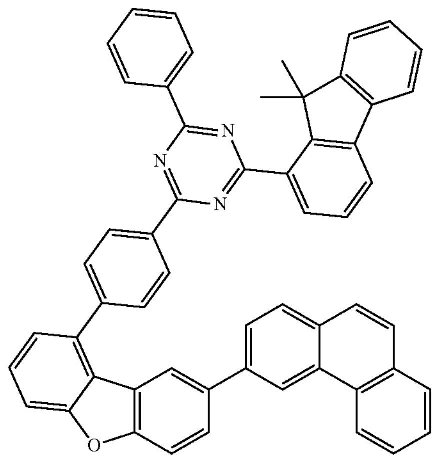
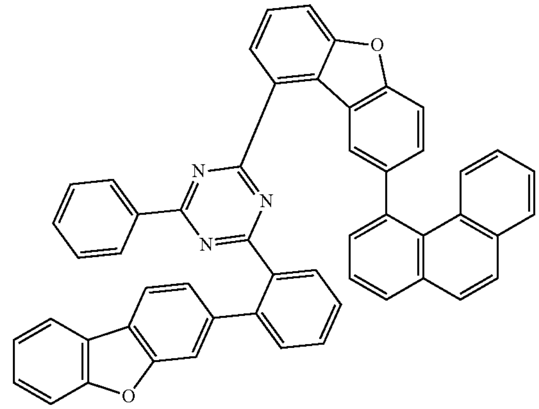
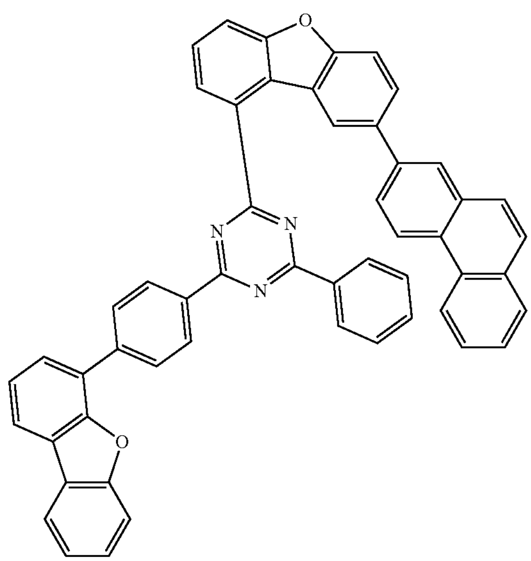
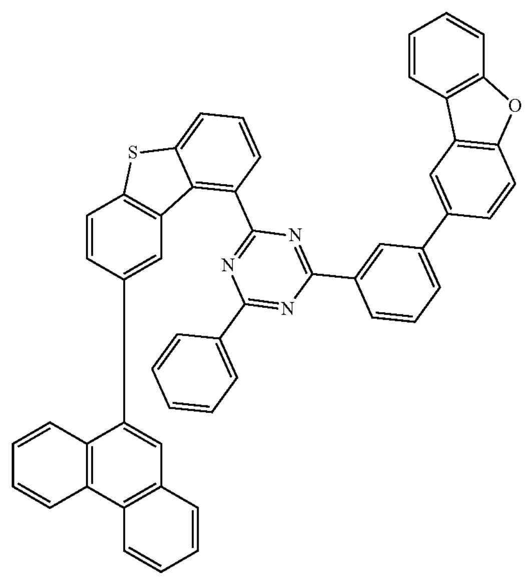
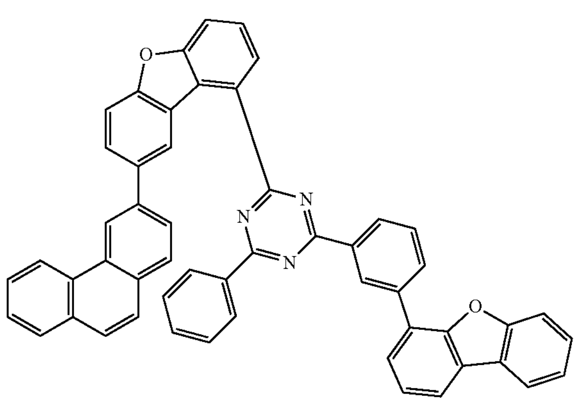
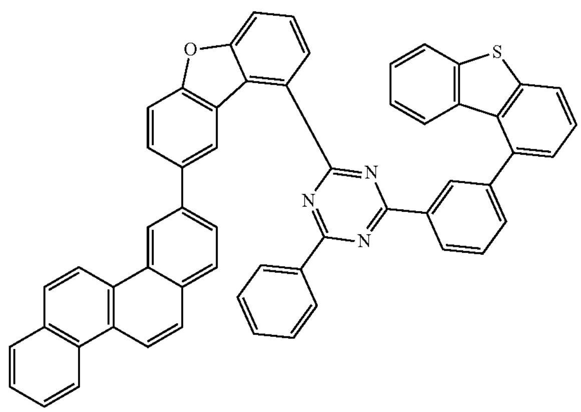

-continued
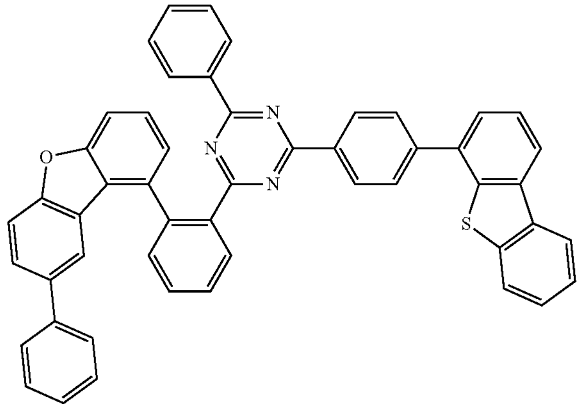
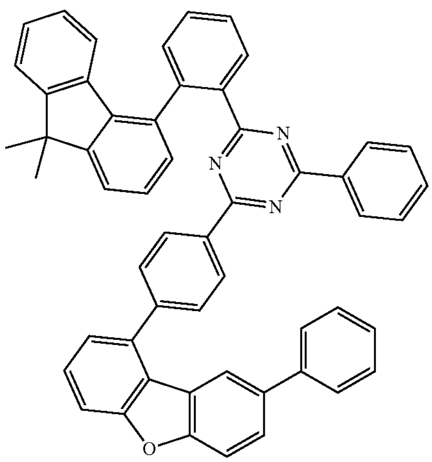
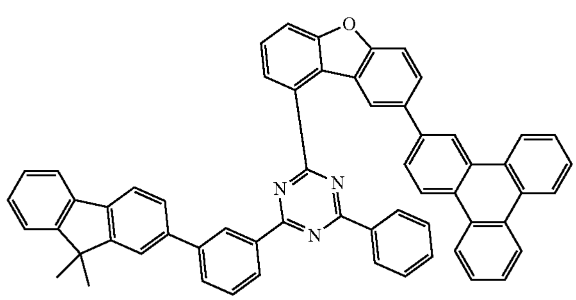
-continued
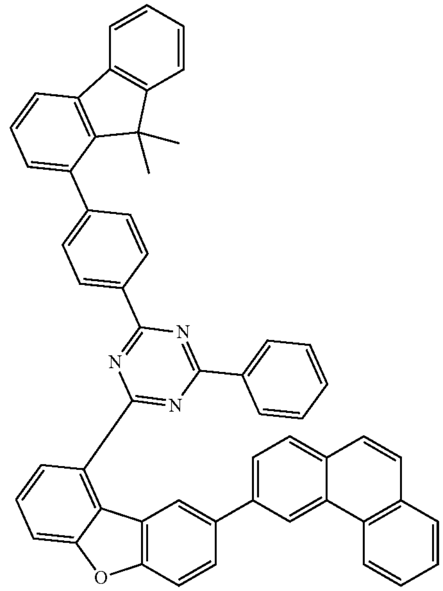
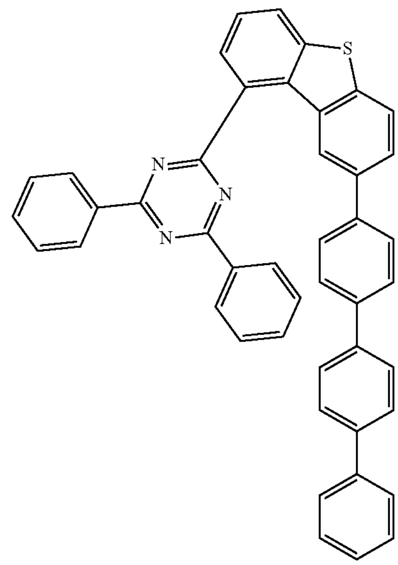
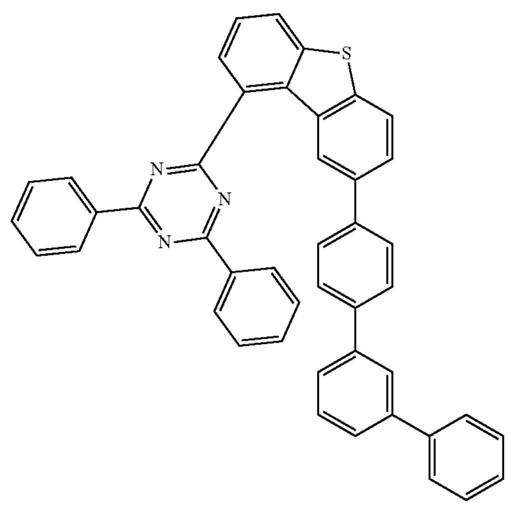

-continued
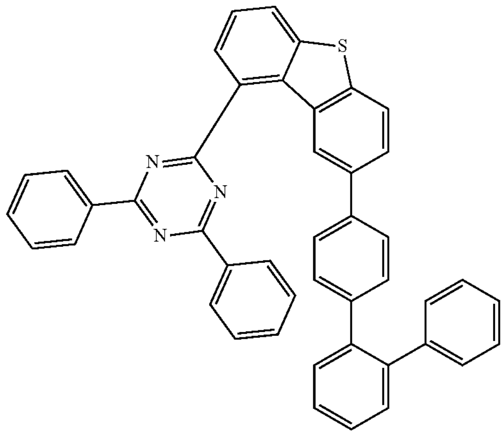
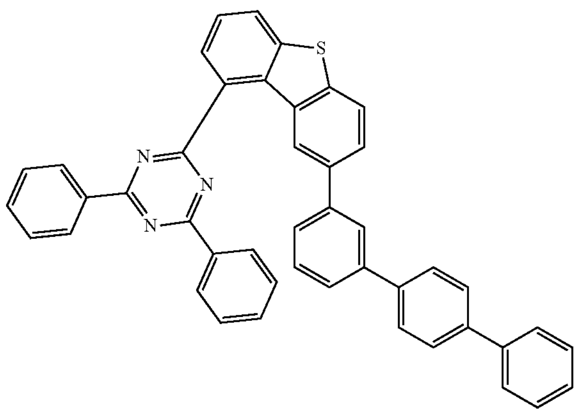
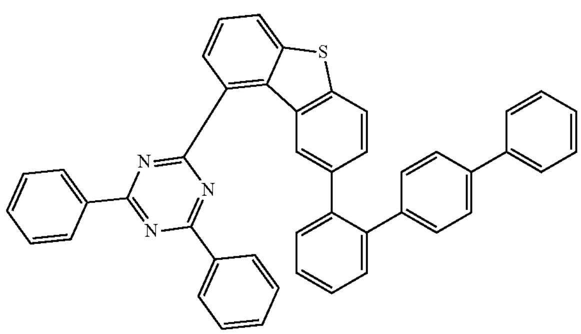
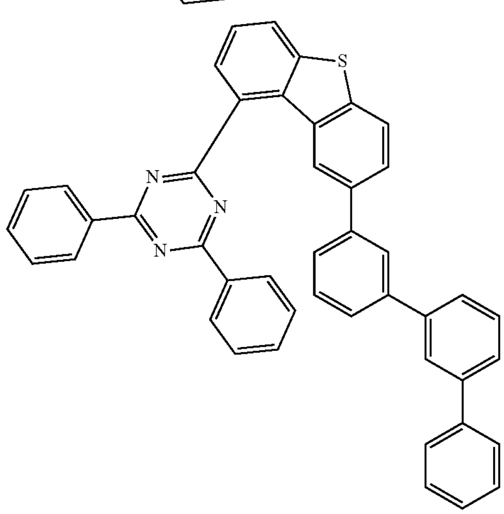
-continued
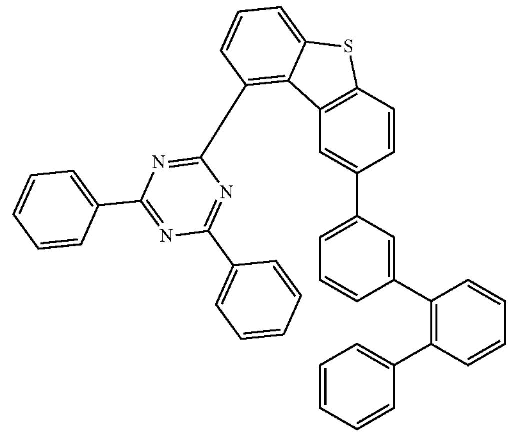
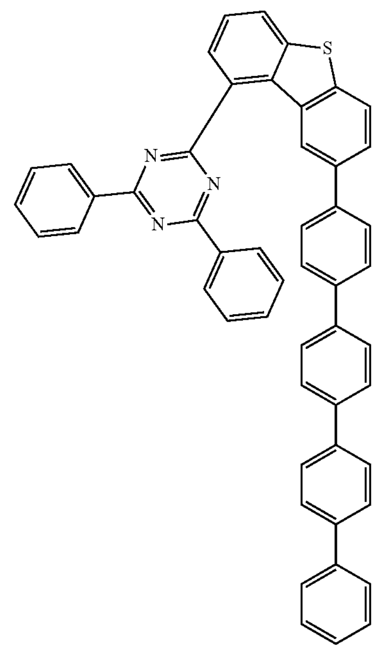
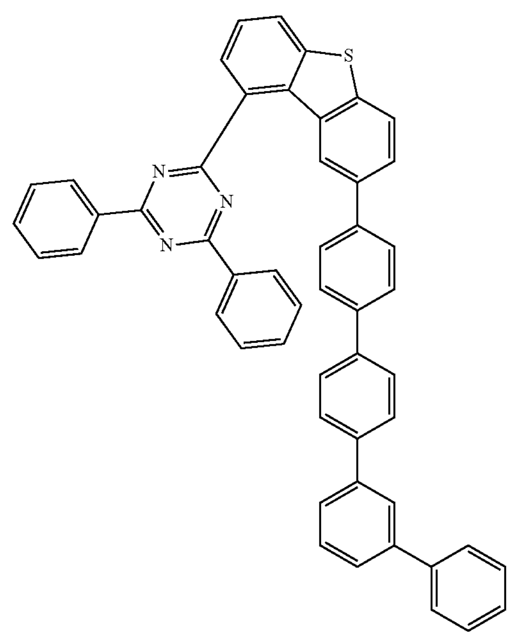

-continued
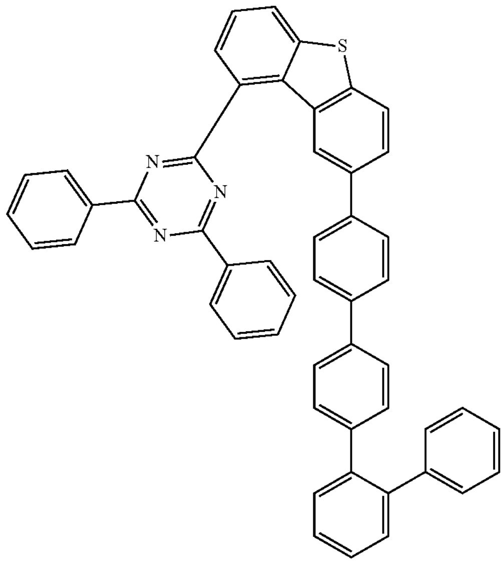
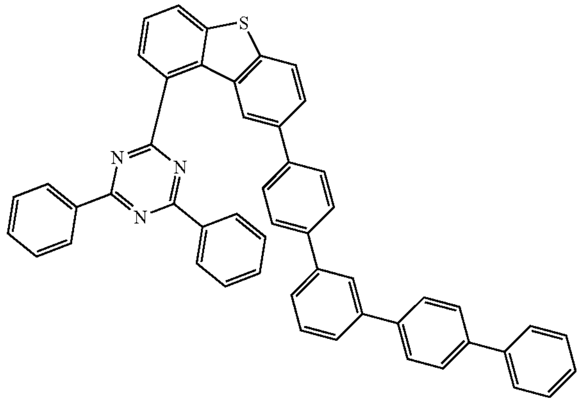
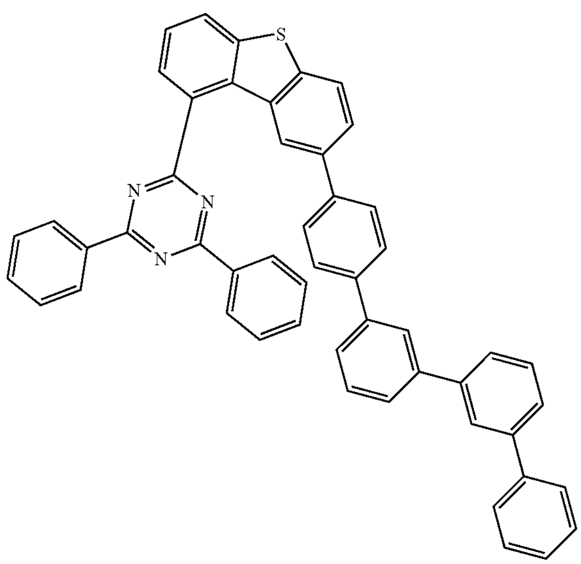
-continued
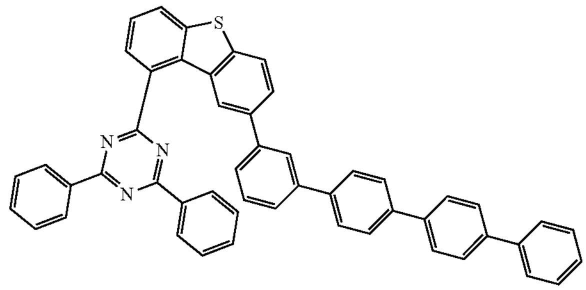
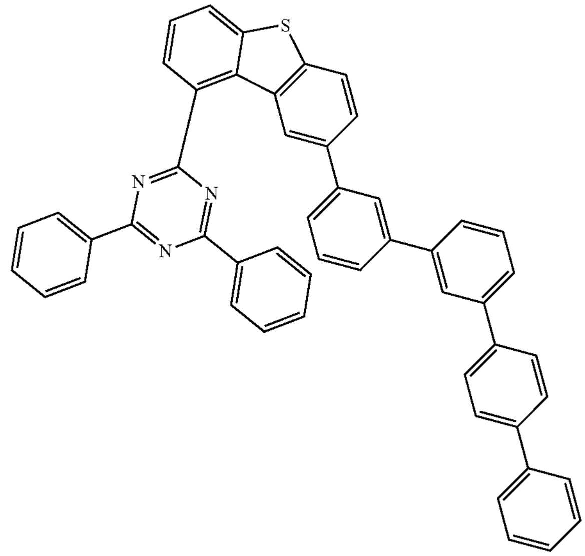
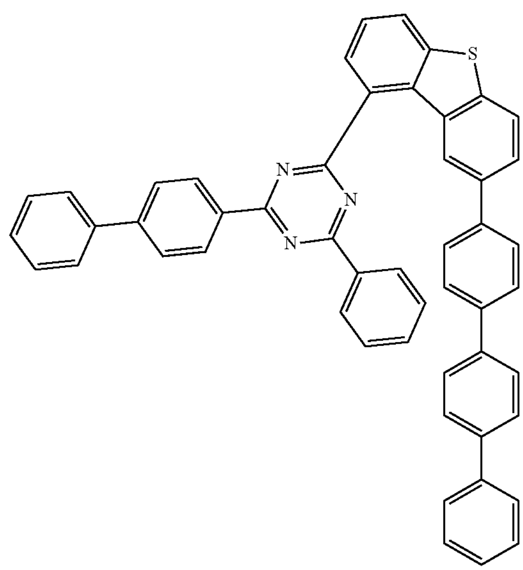

-continued
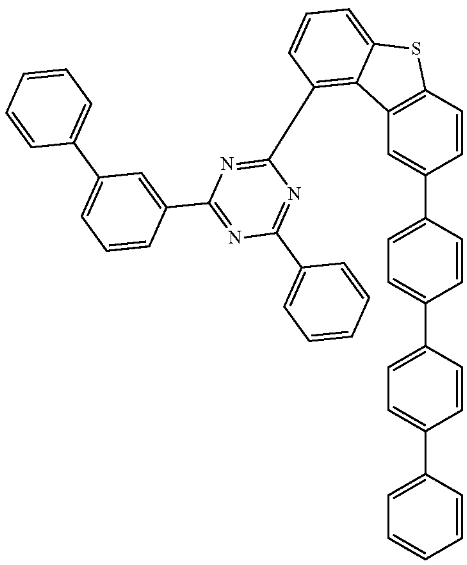
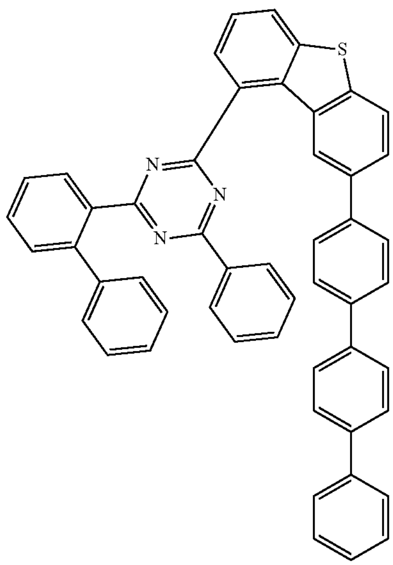
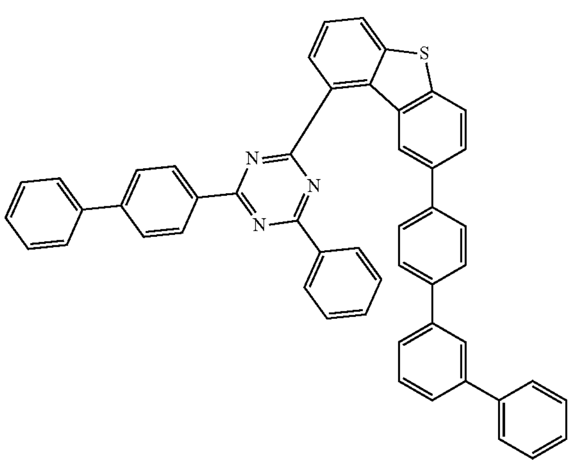
-continued
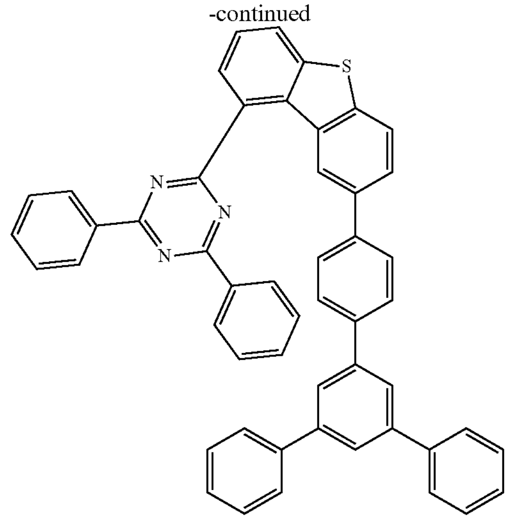
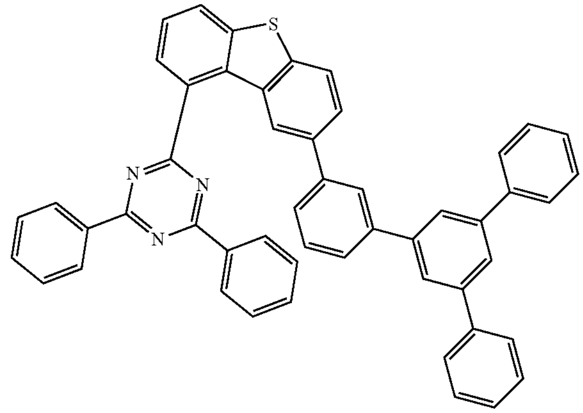
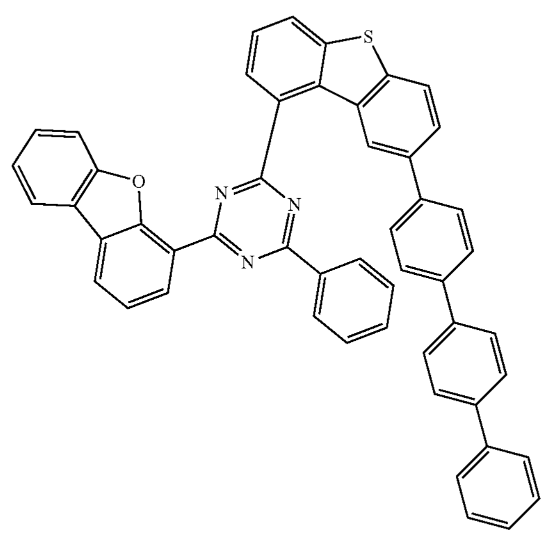

-continued
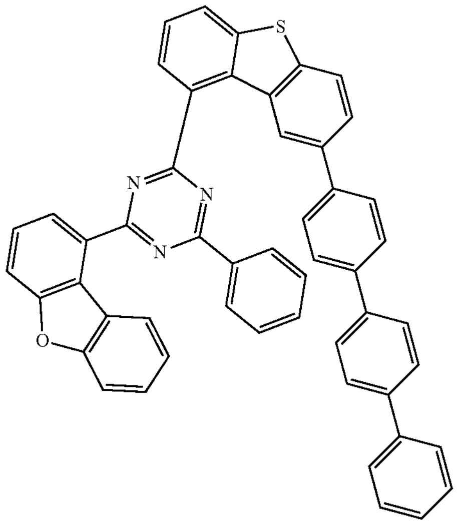
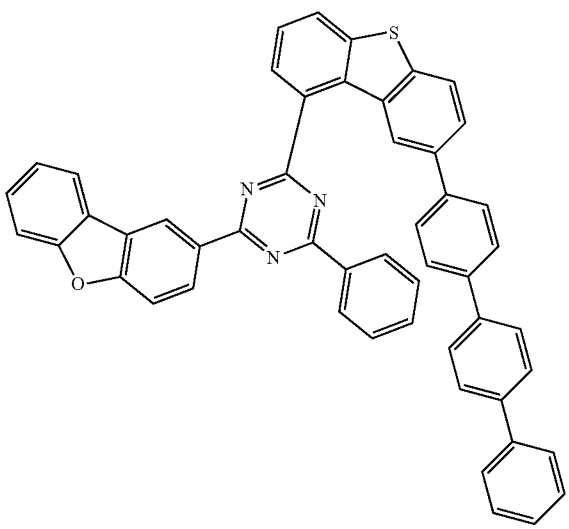
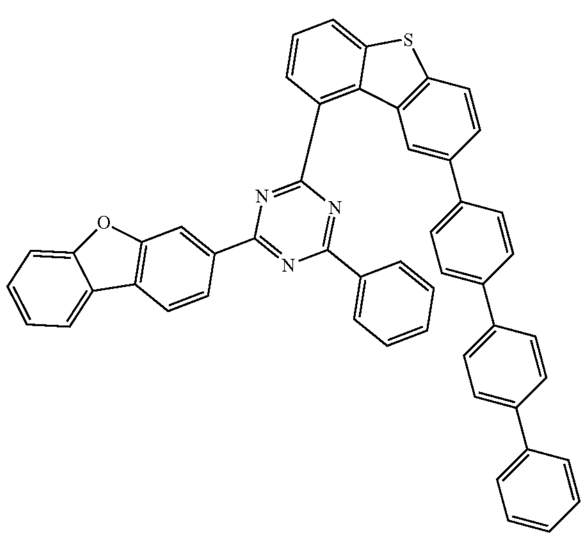
-continued
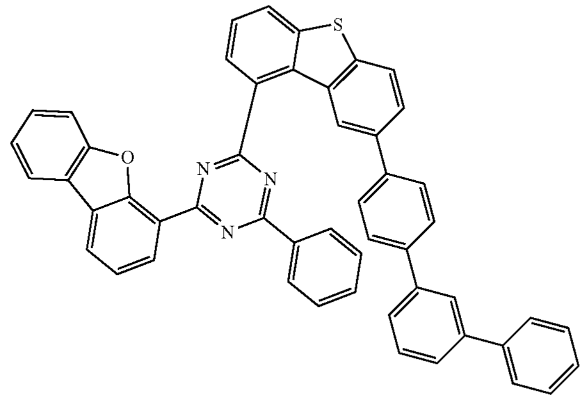
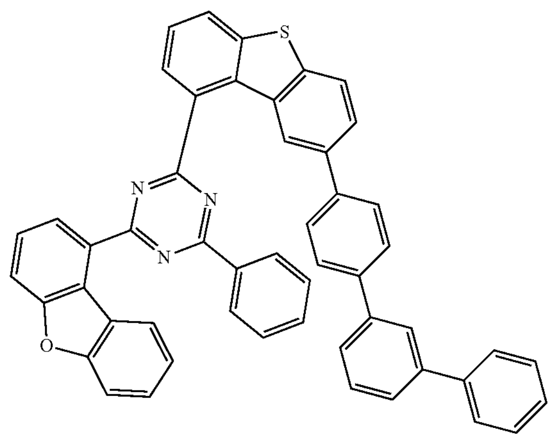
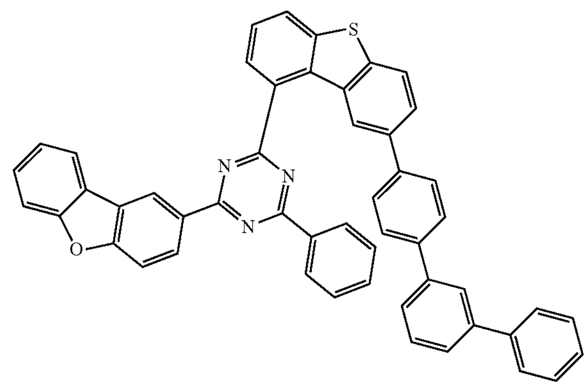
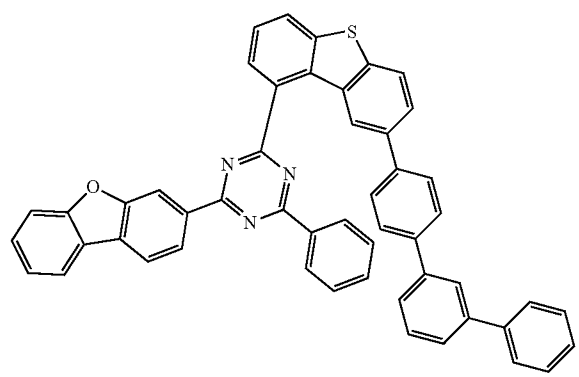

-continued
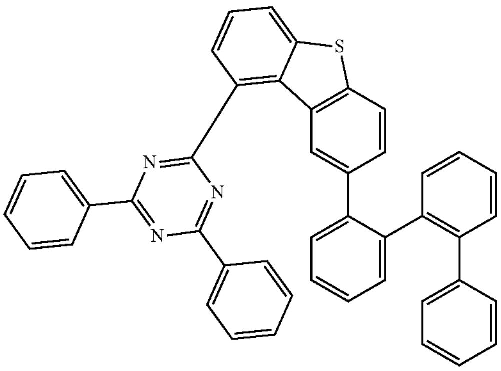
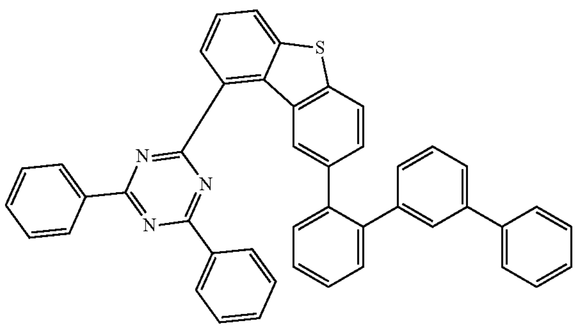
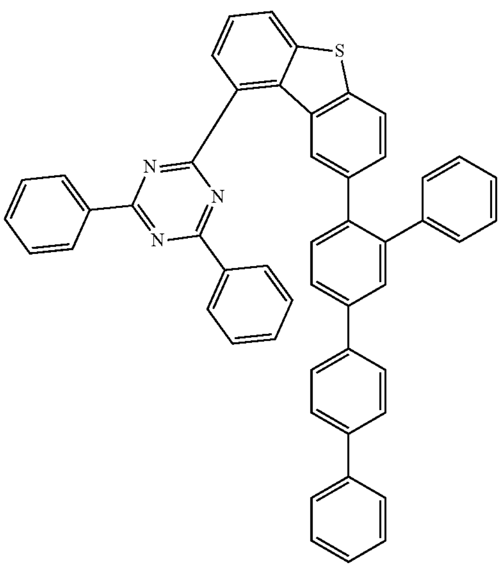
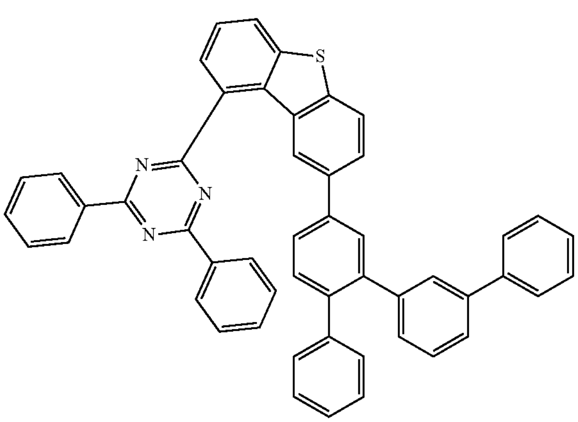
-continued
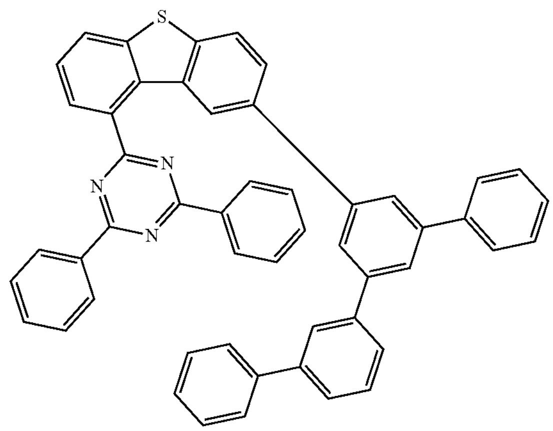
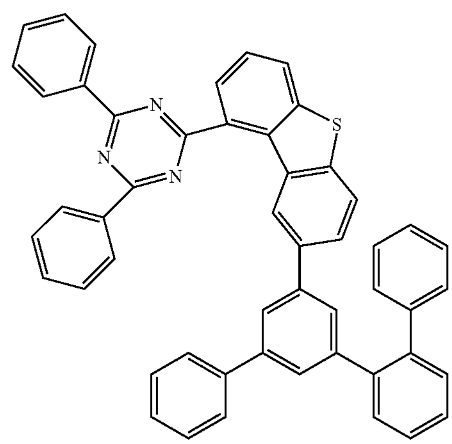
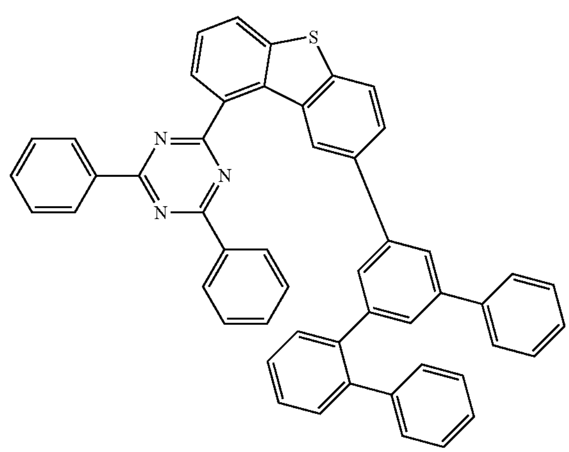

-continued
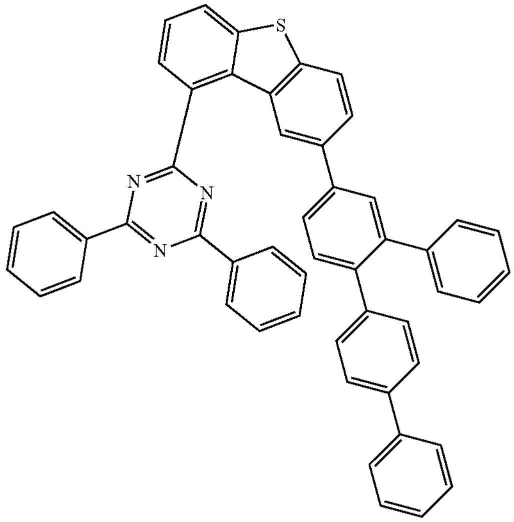
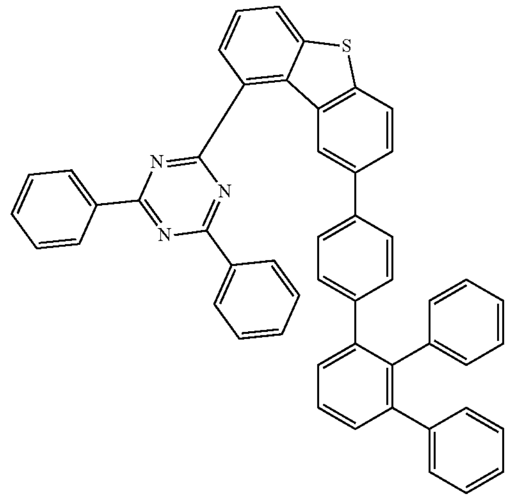
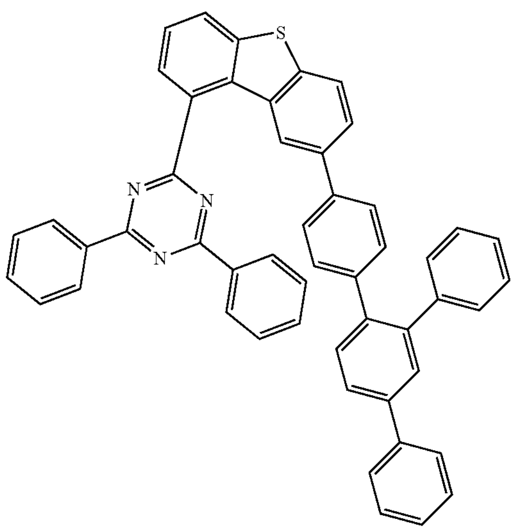
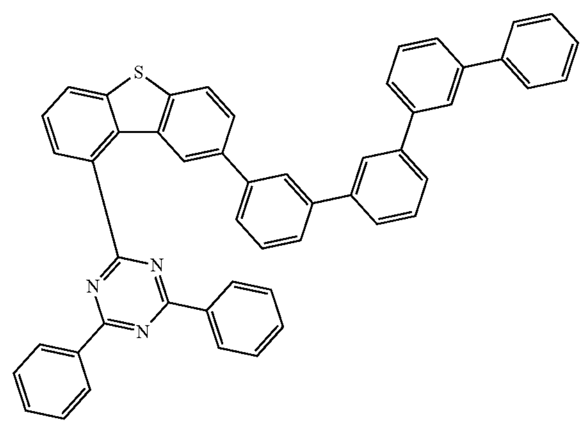
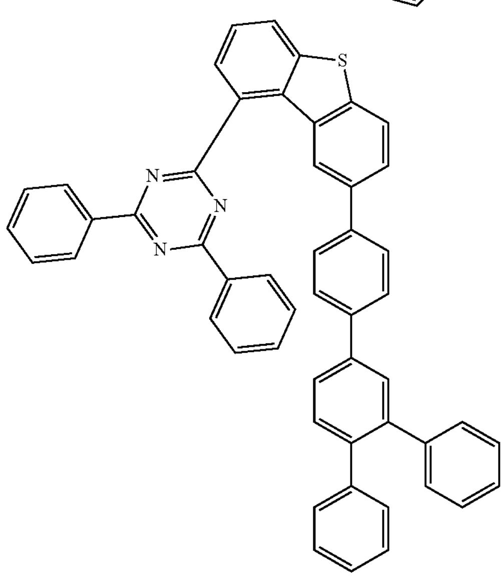
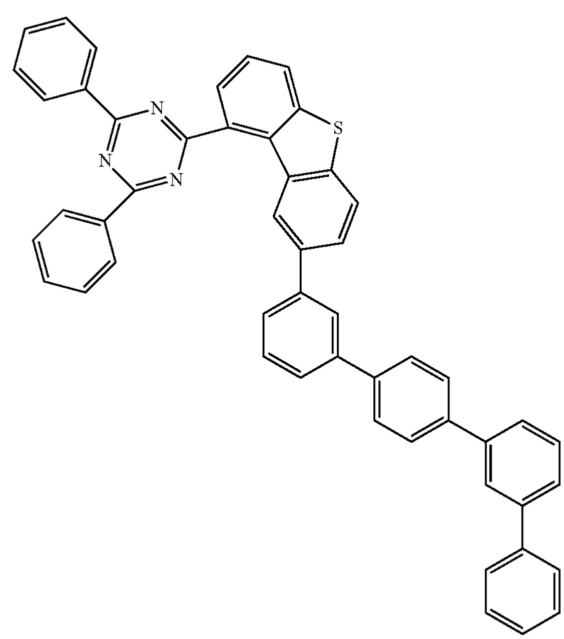
-continued -continued
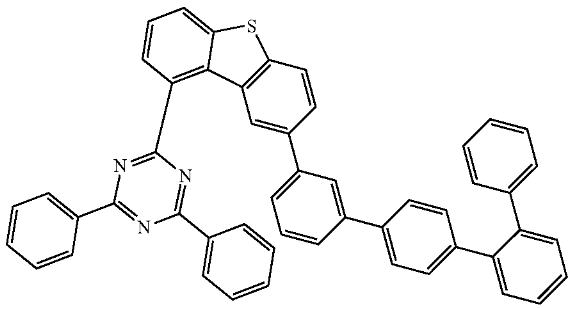
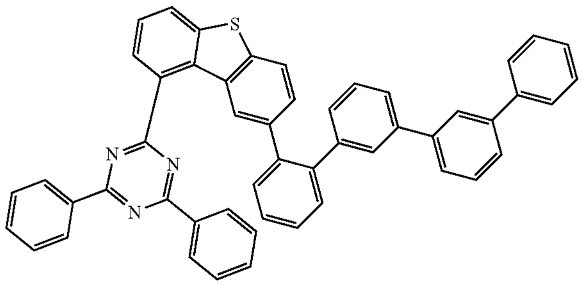
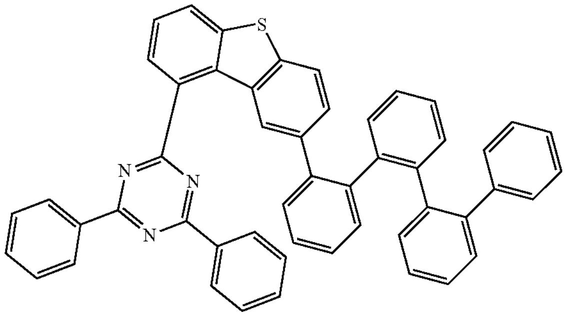
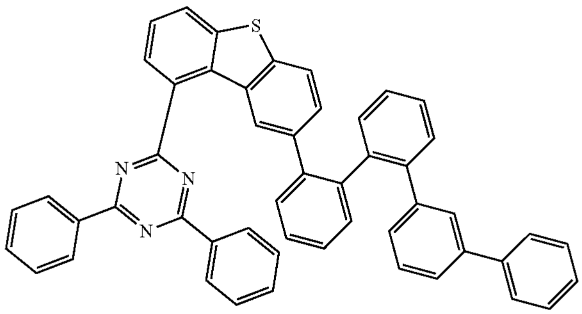
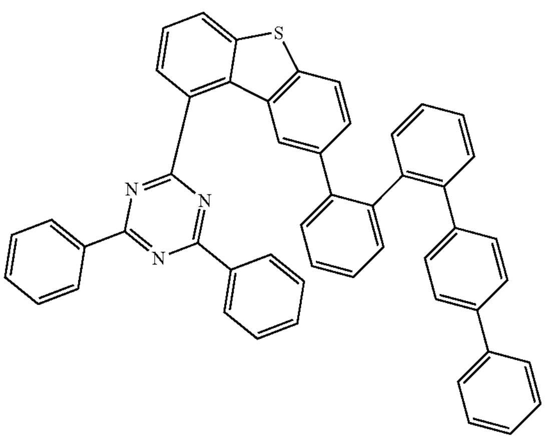
-continued
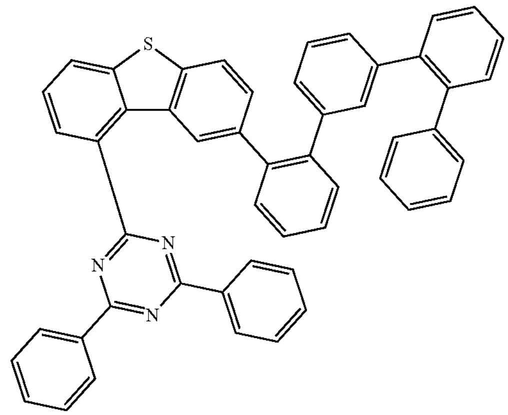
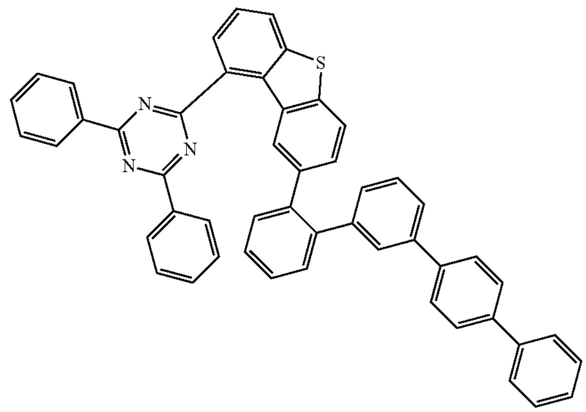
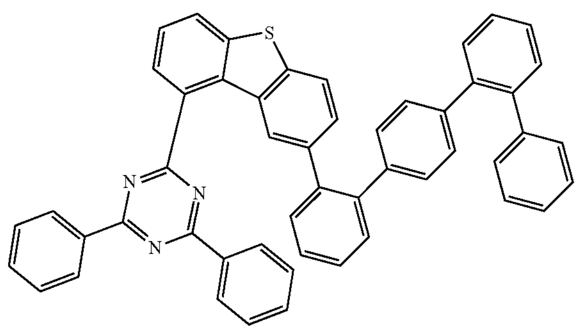
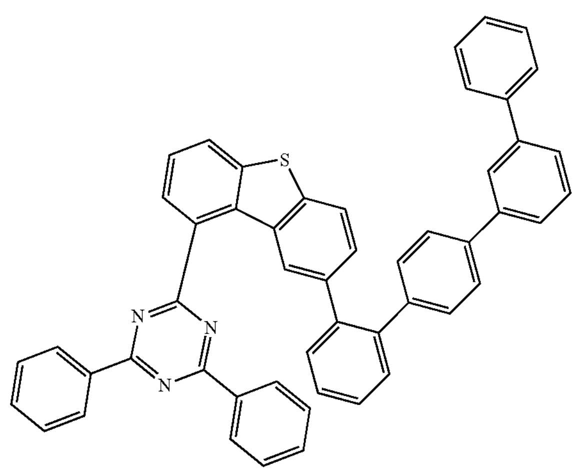

-continued
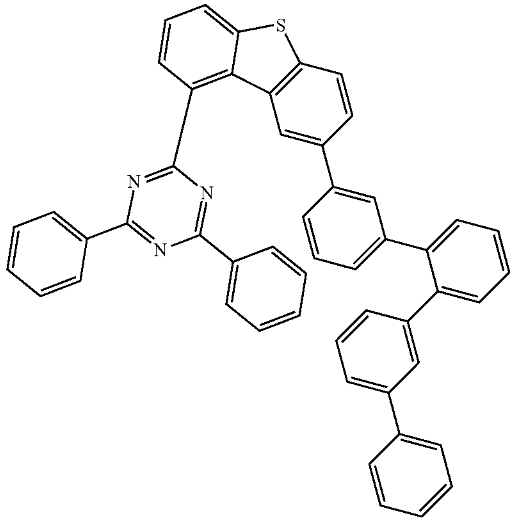
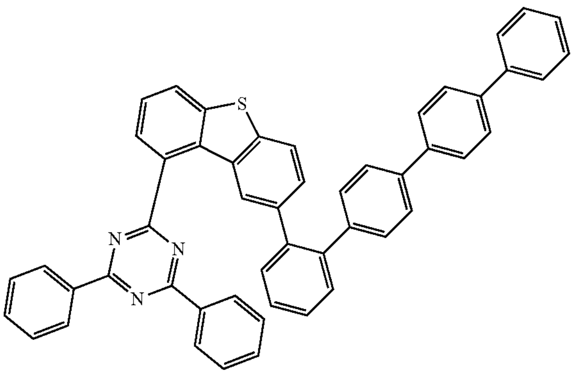
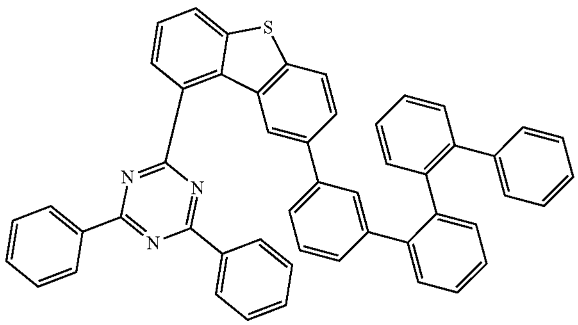
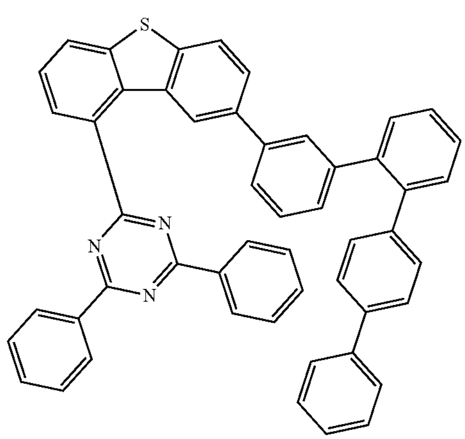
-continued
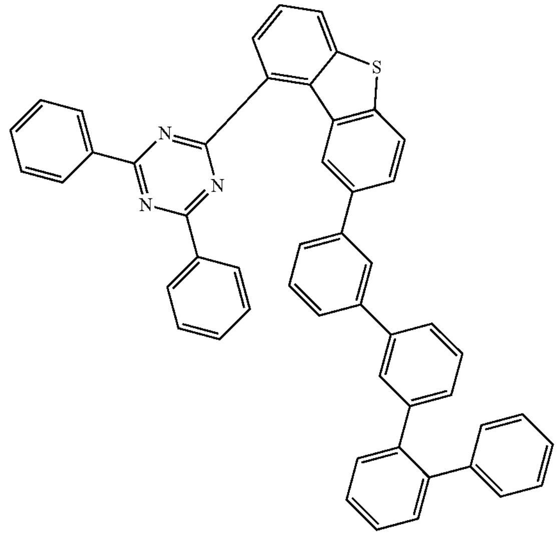
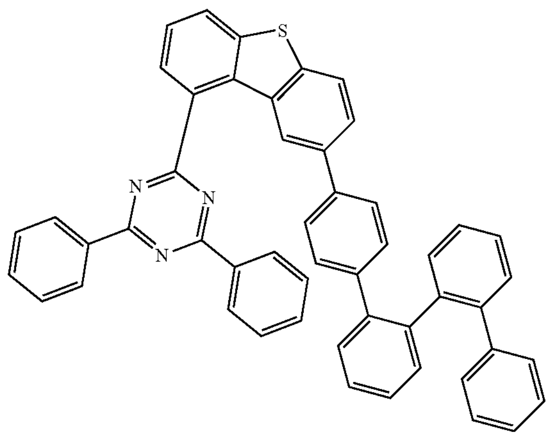
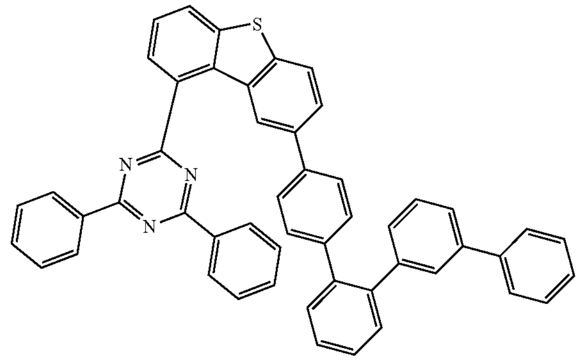
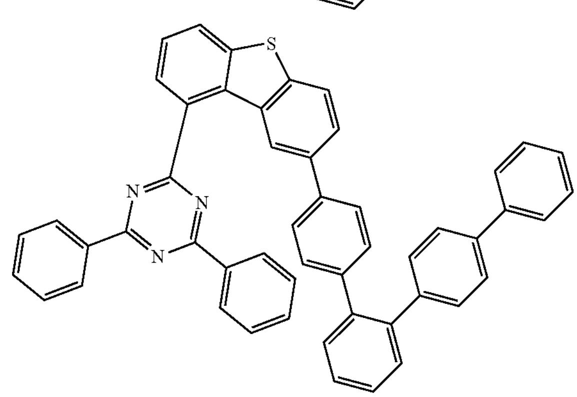

-continued
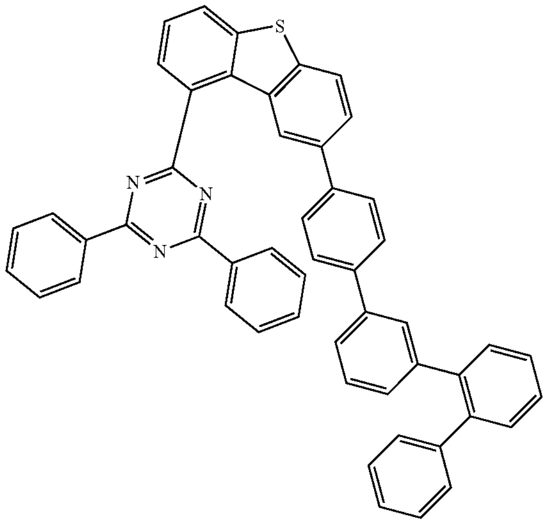
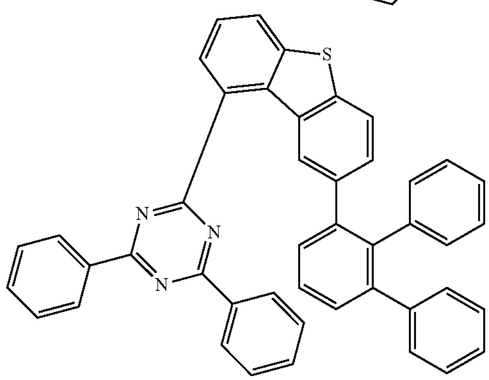
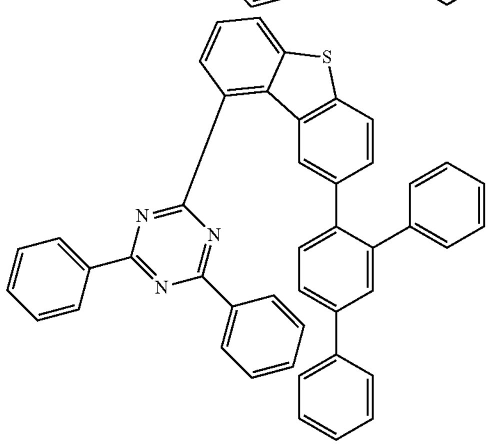
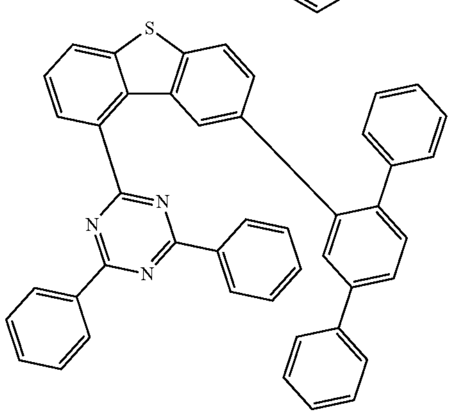
-continued
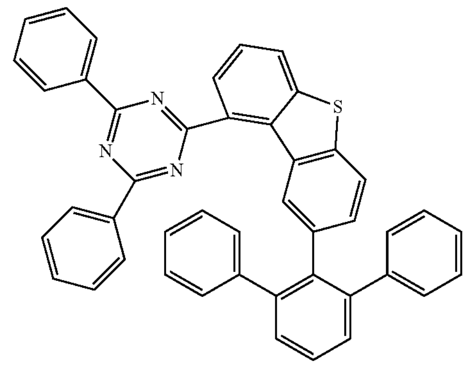
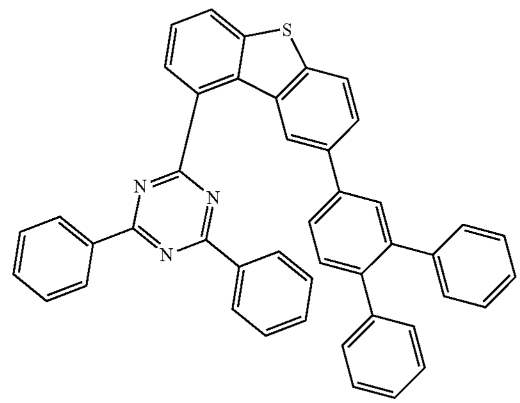
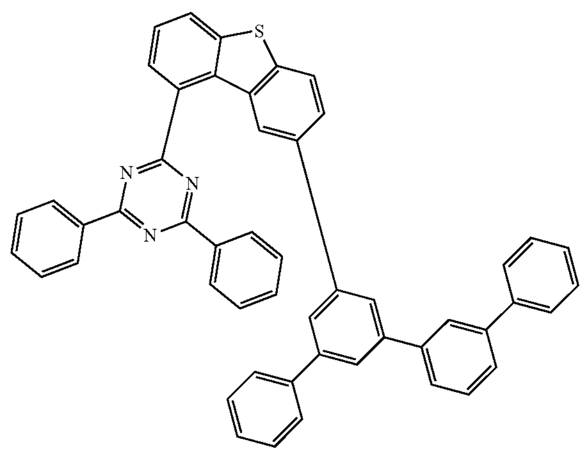
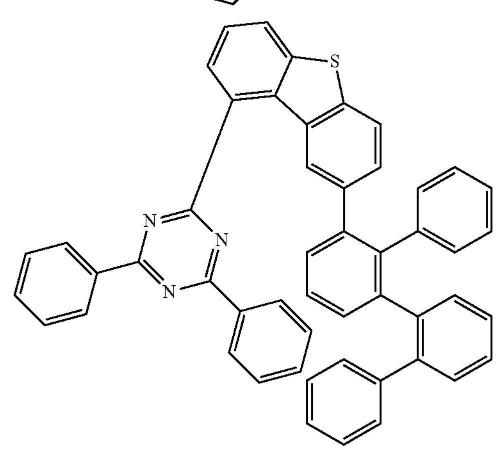

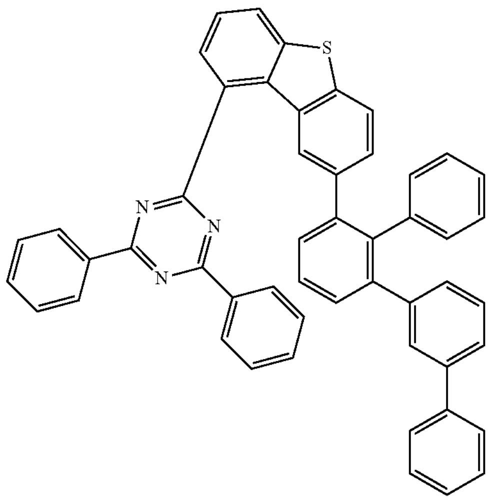
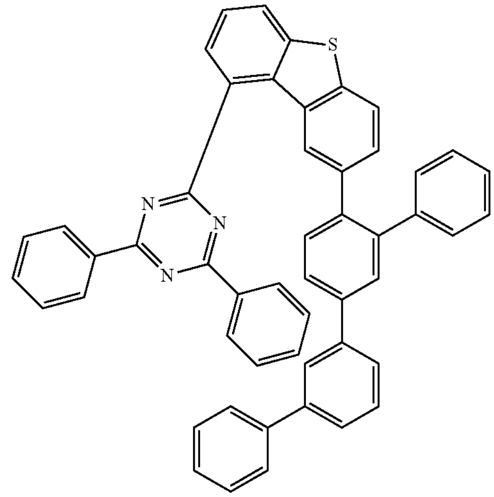
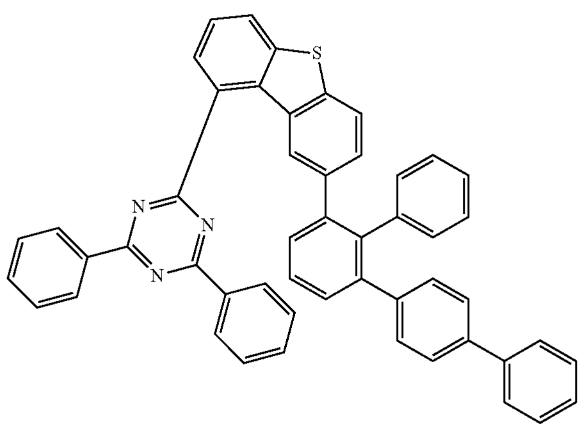
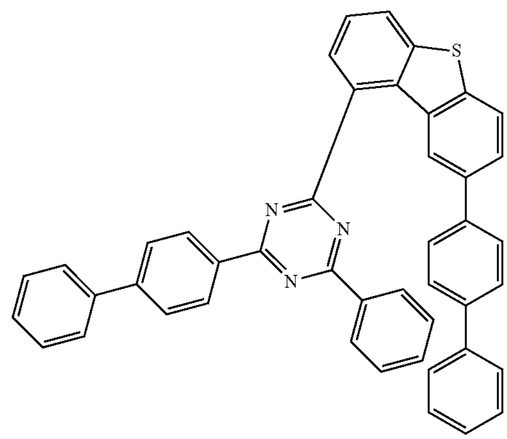
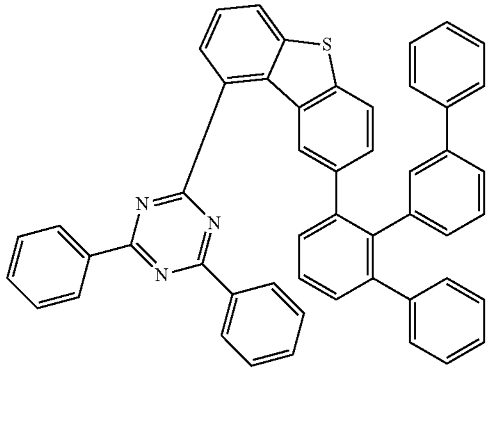
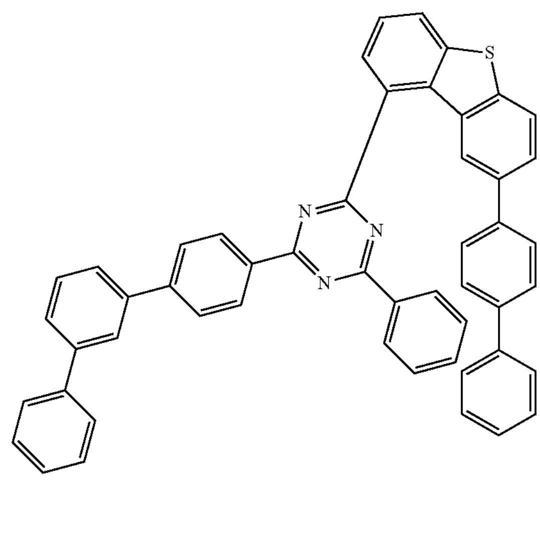
S
N
N
N -continued
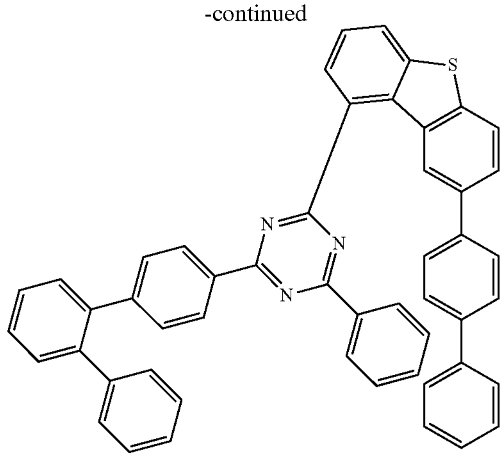
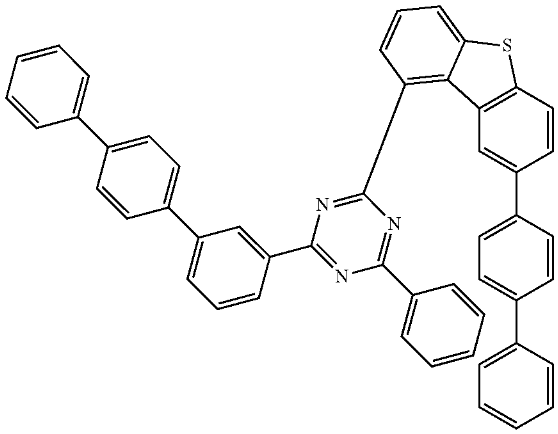
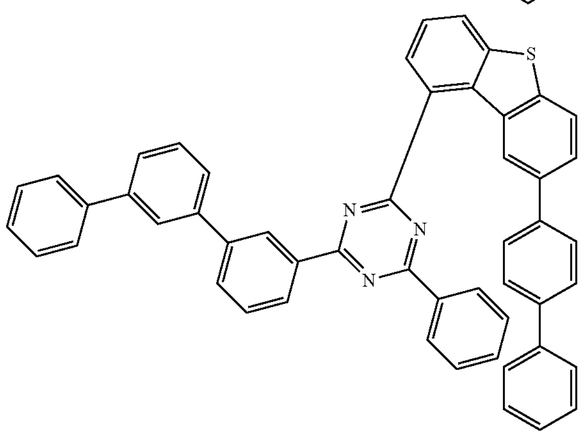
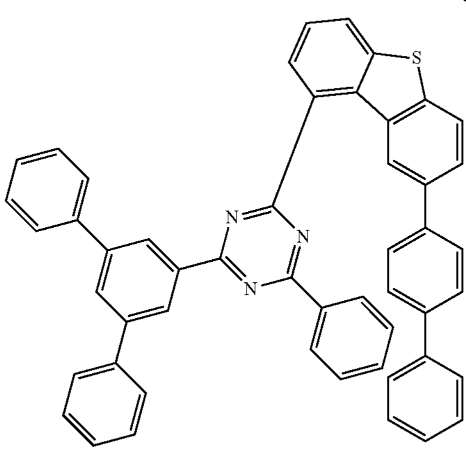
-continued
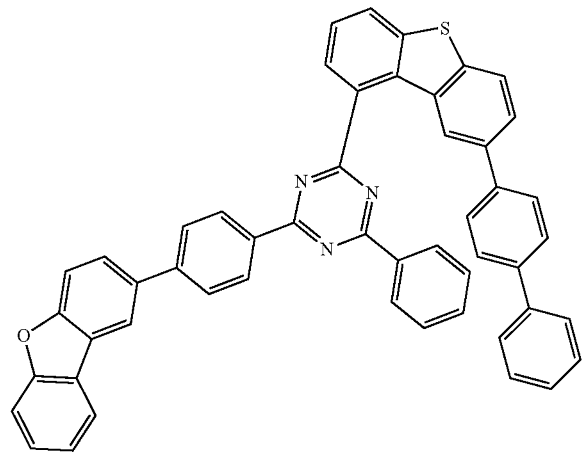
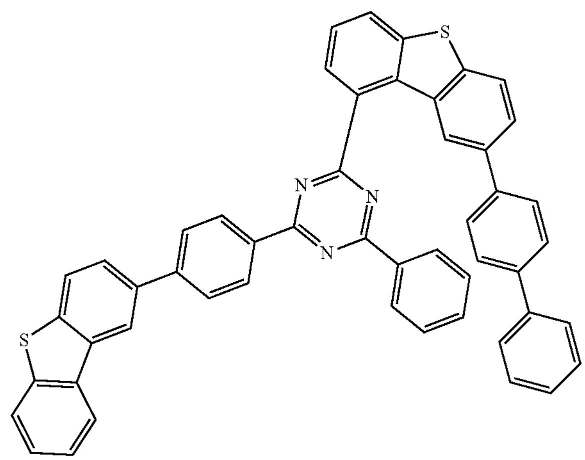
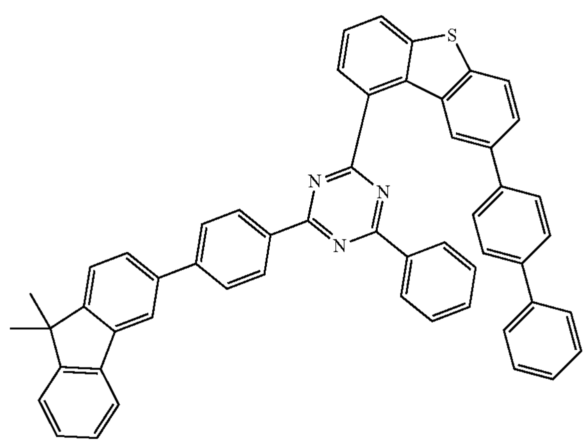

-continued
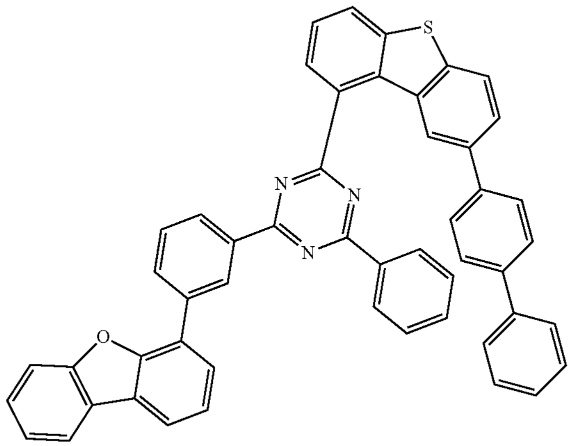
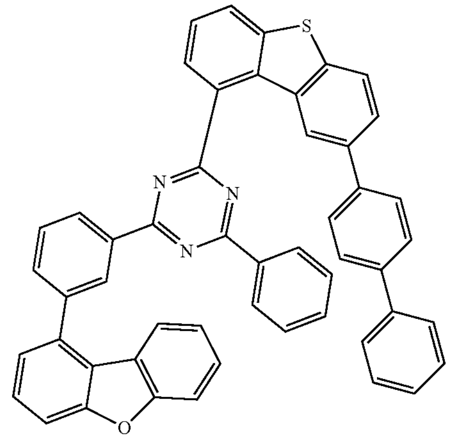
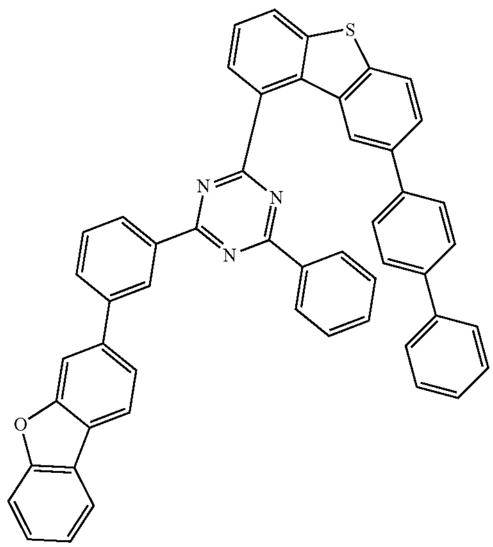
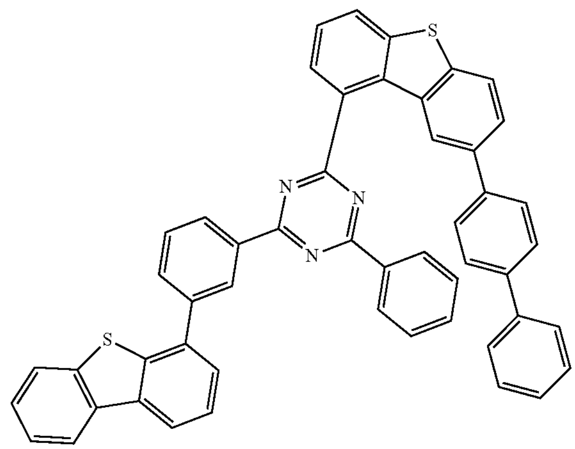
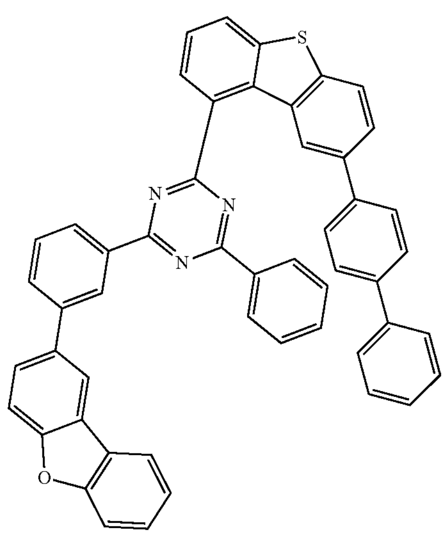
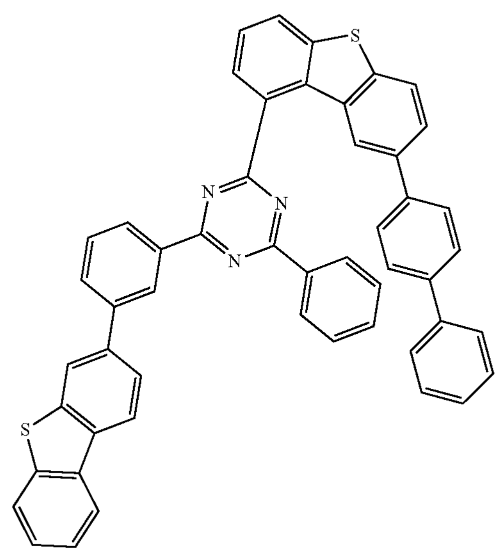
-continued

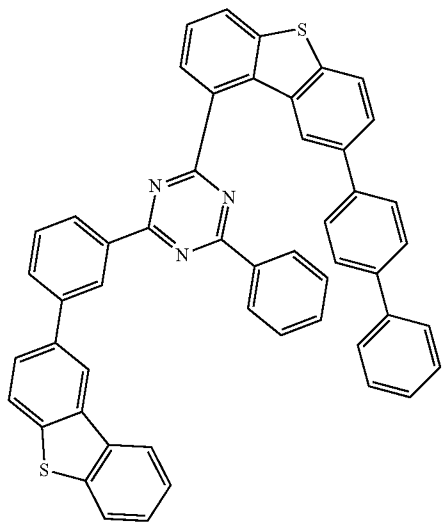
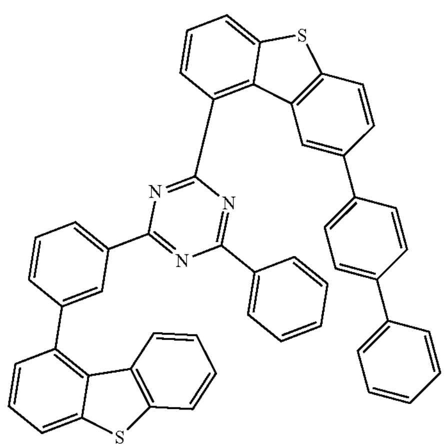
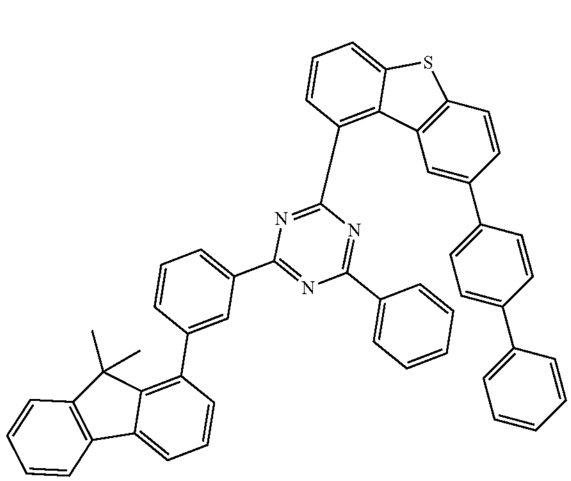
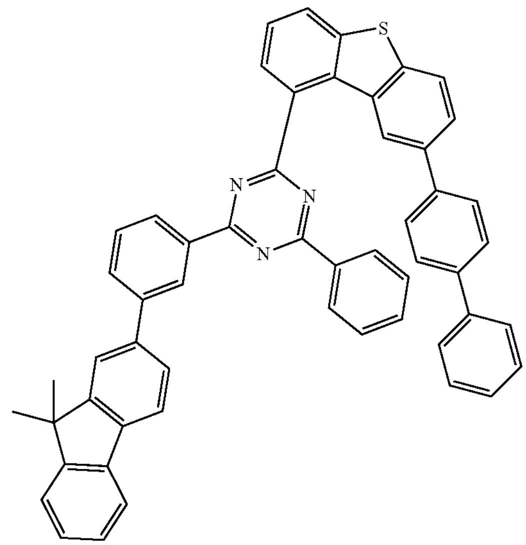
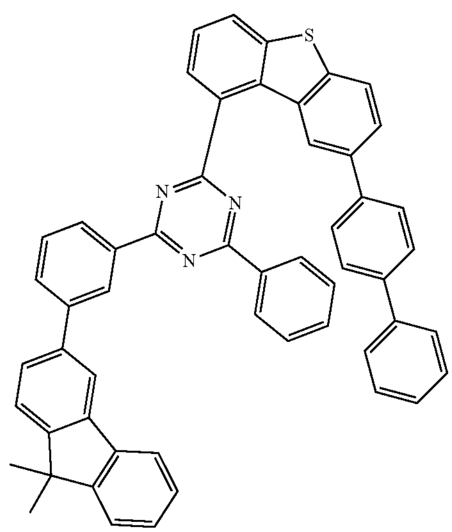
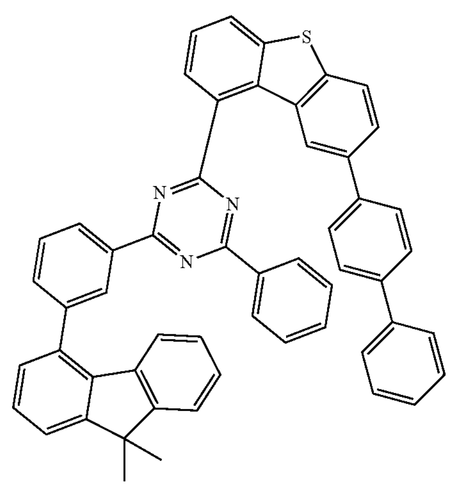

-continued
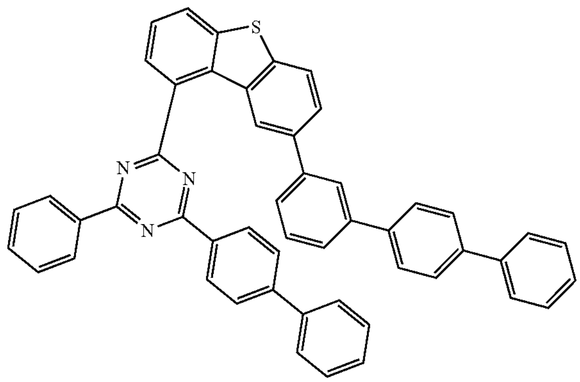
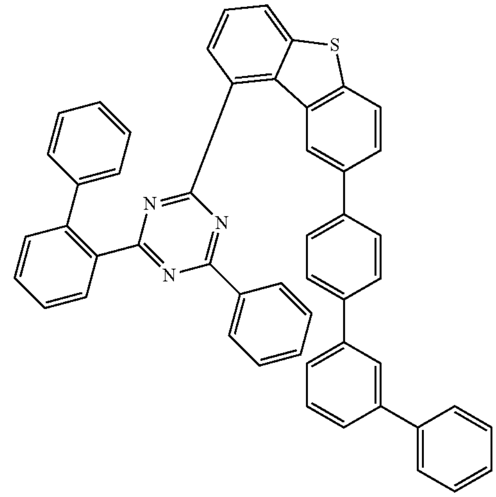
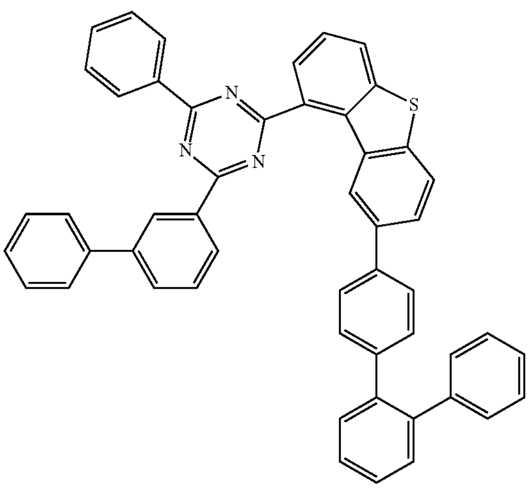
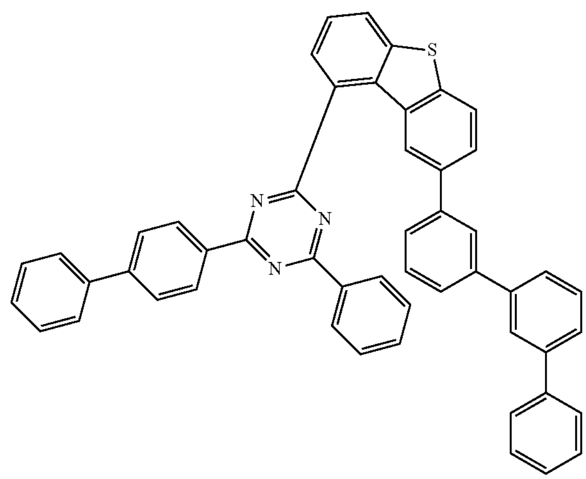
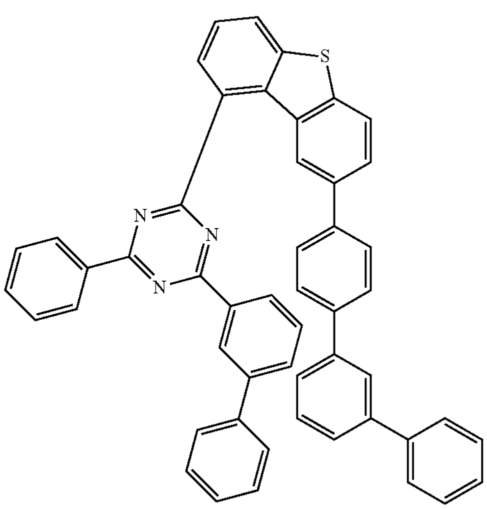
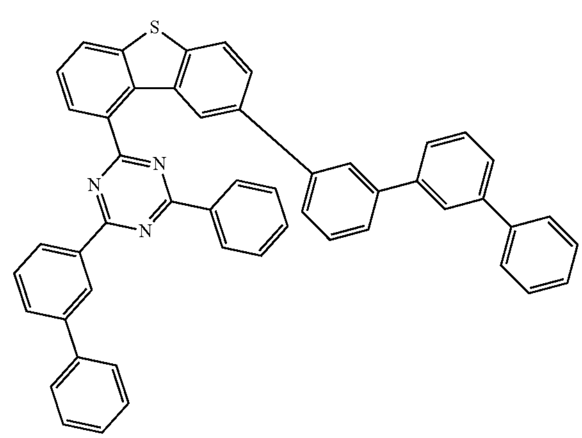
-continued -continued
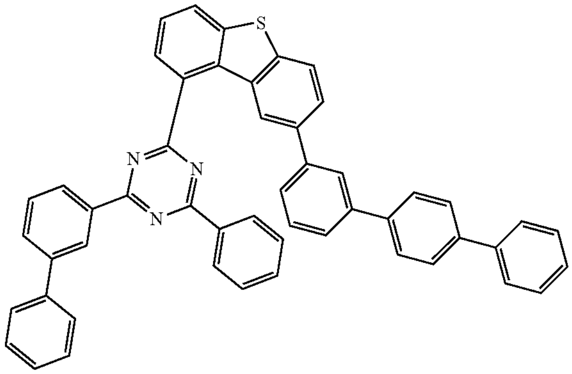
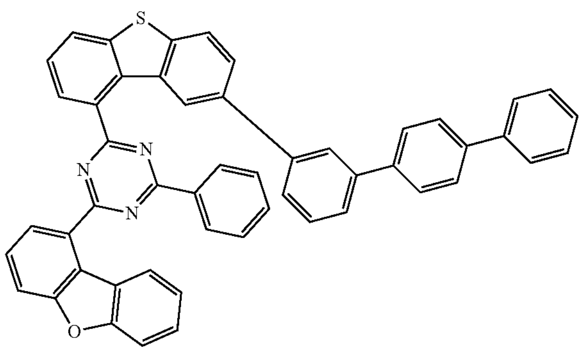
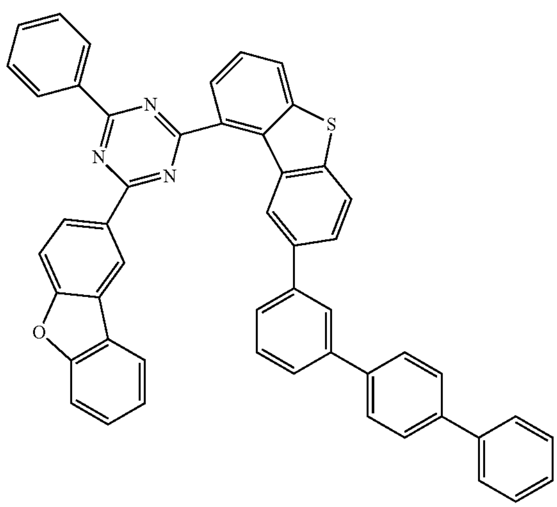
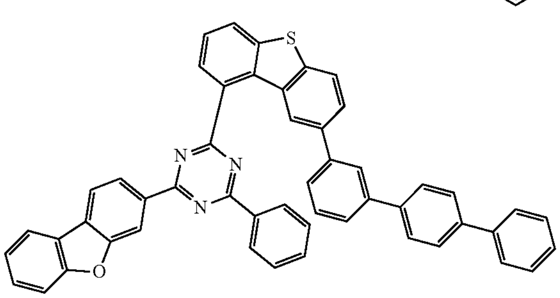
-continued
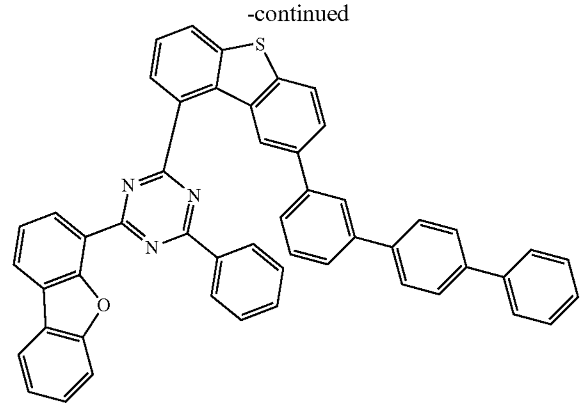
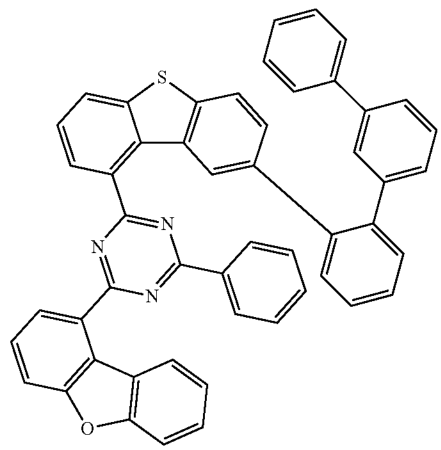
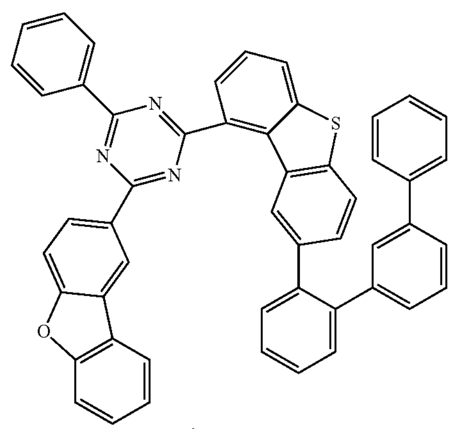
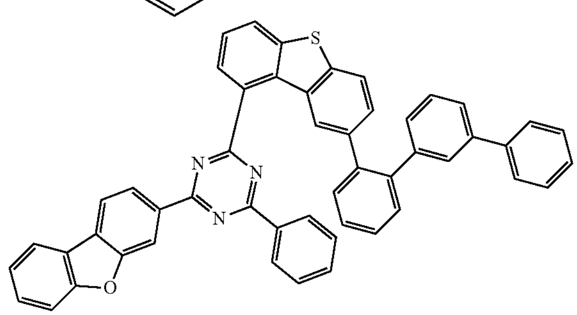

-continued
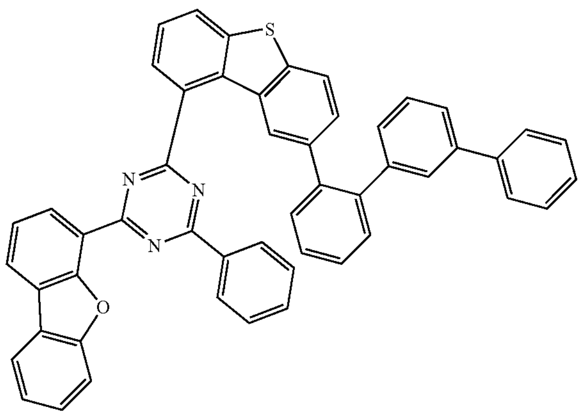
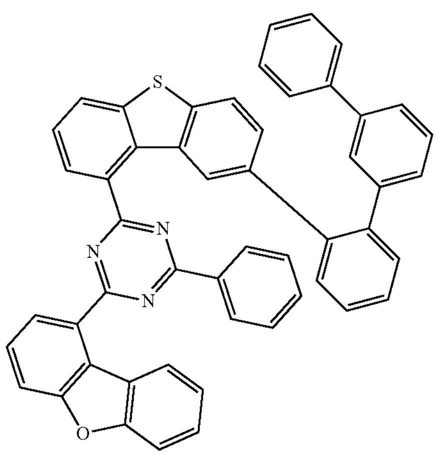
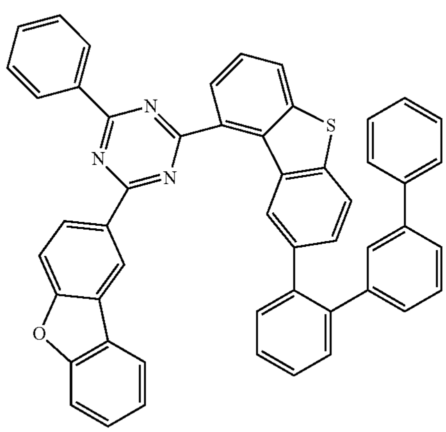
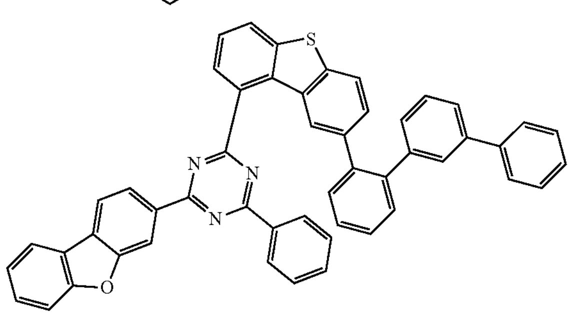
-continued
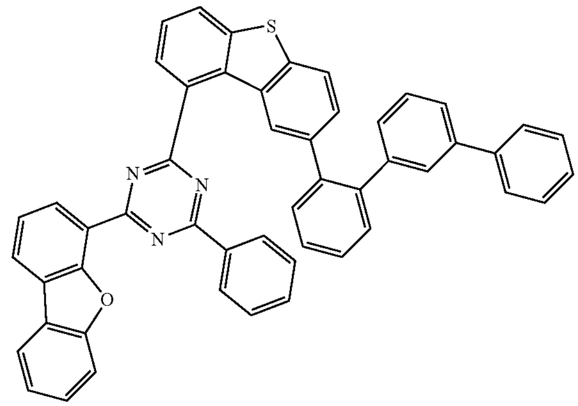
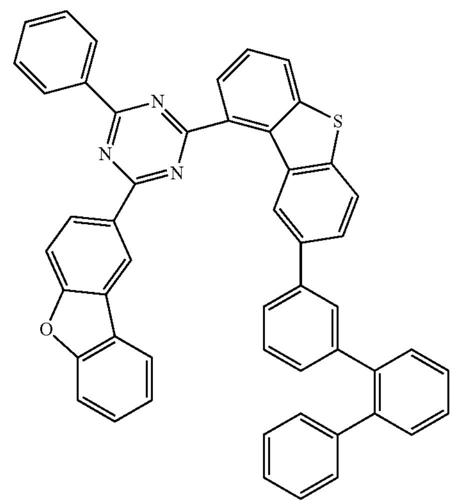
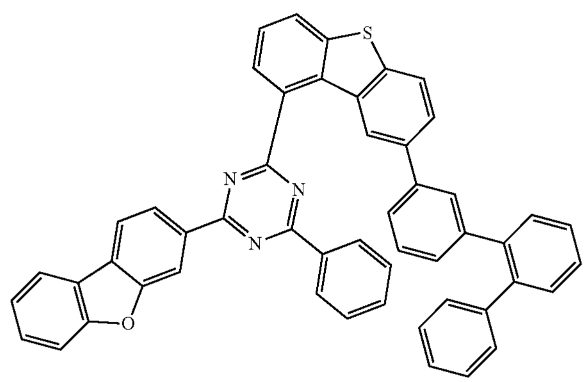
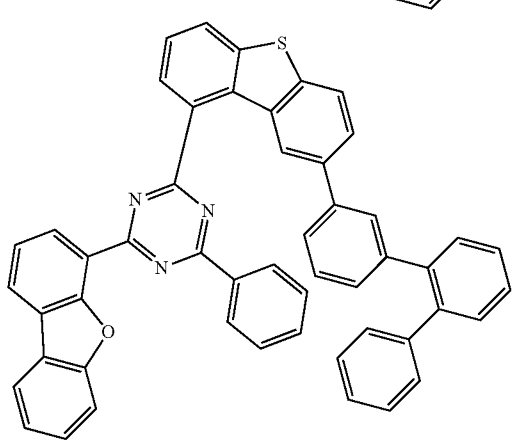

-continued
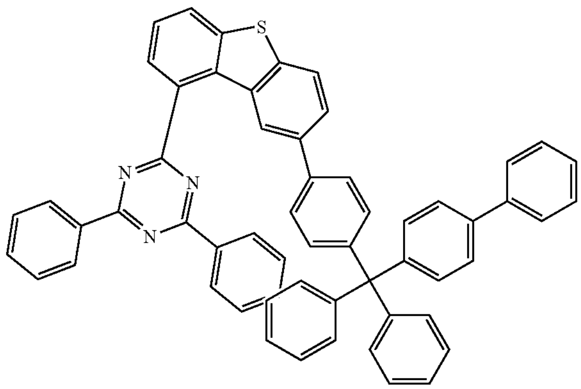
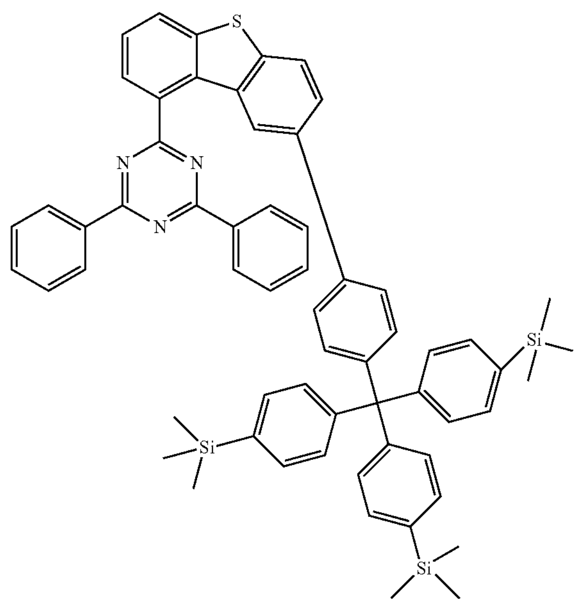
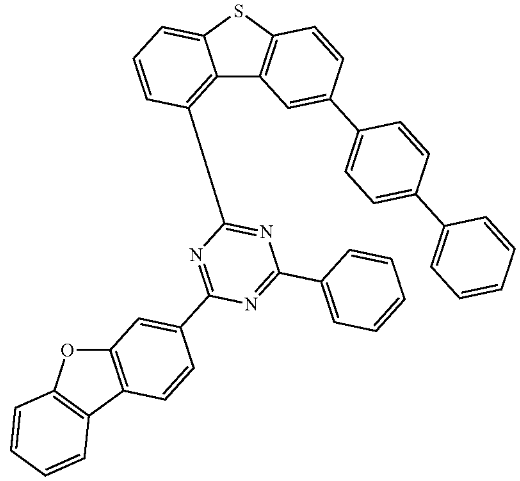
-continued
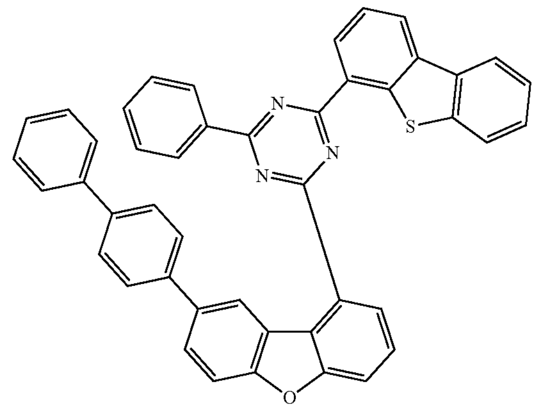
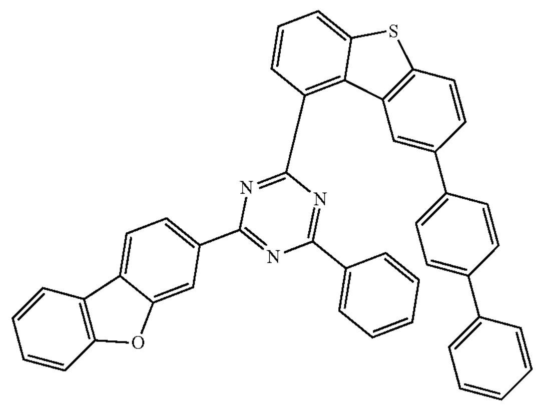
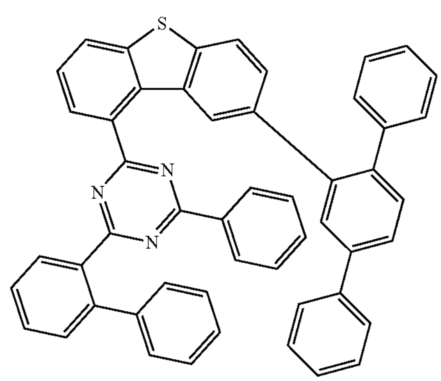
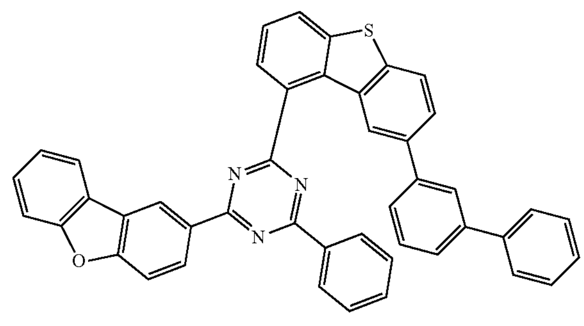

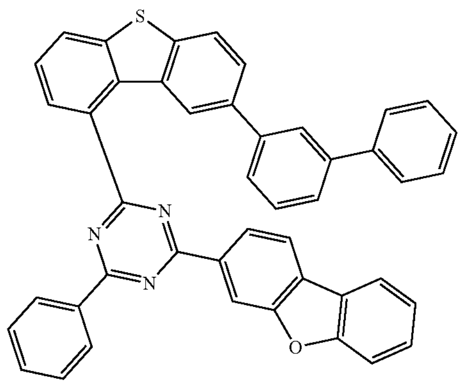
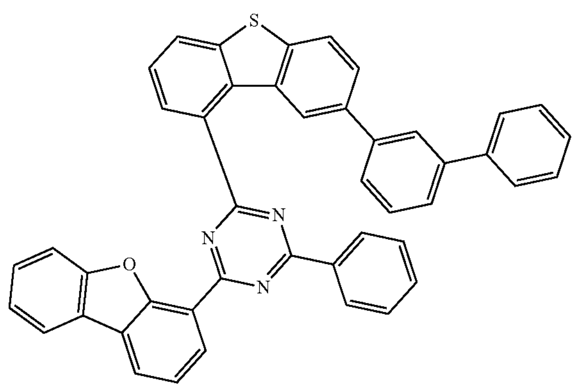
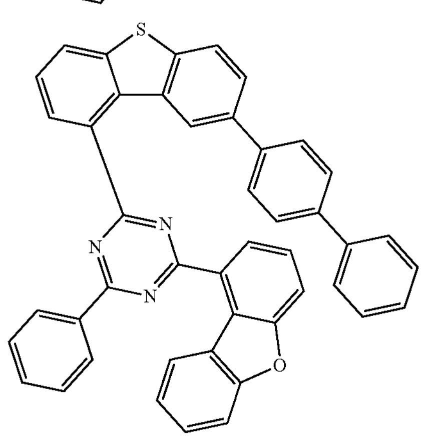
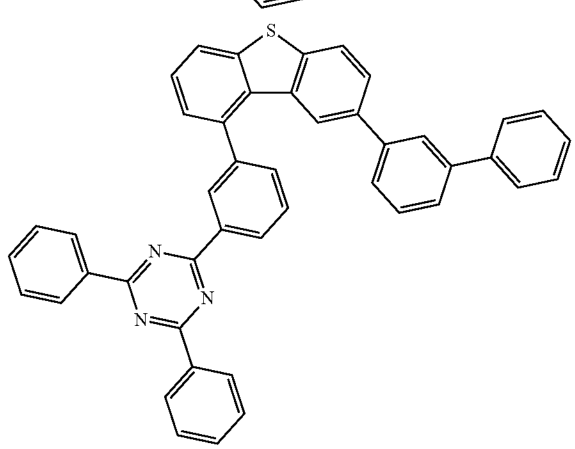
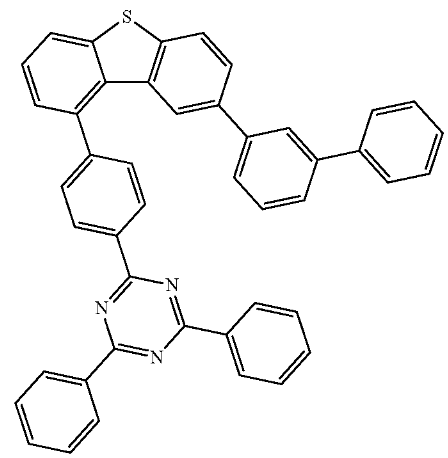
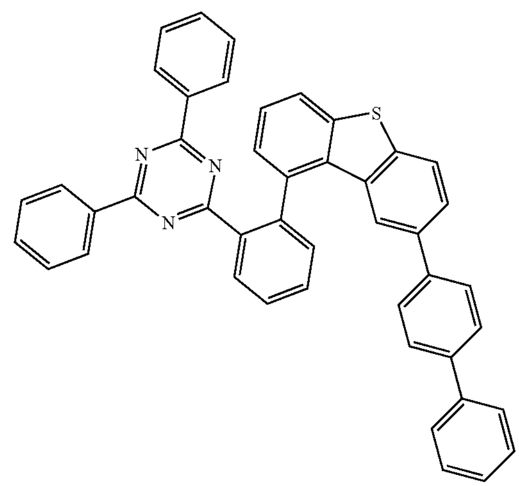
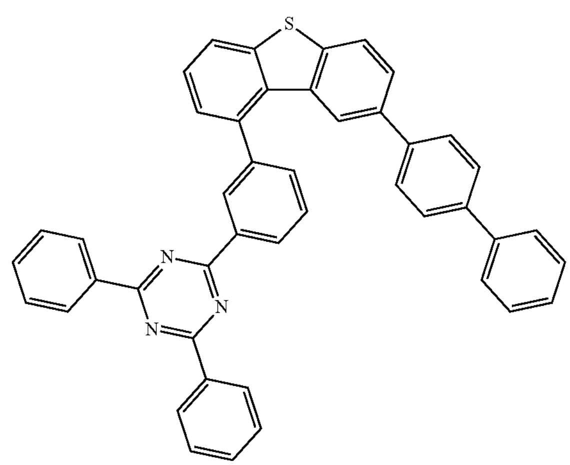

-continued
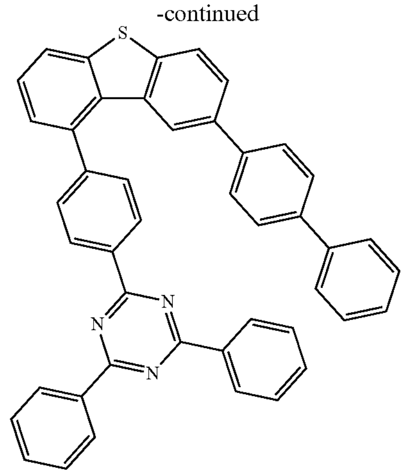
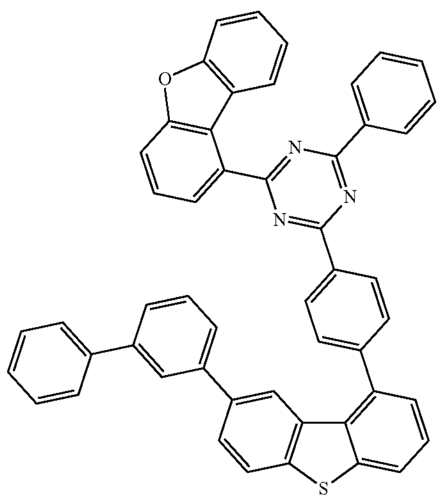
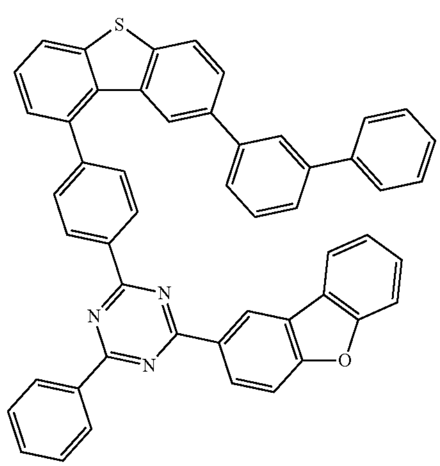
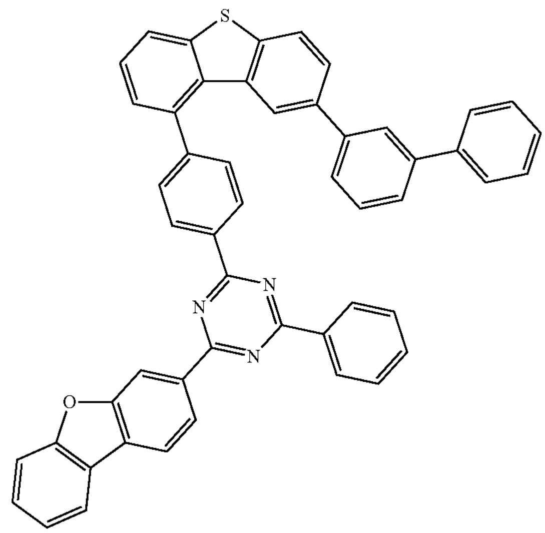
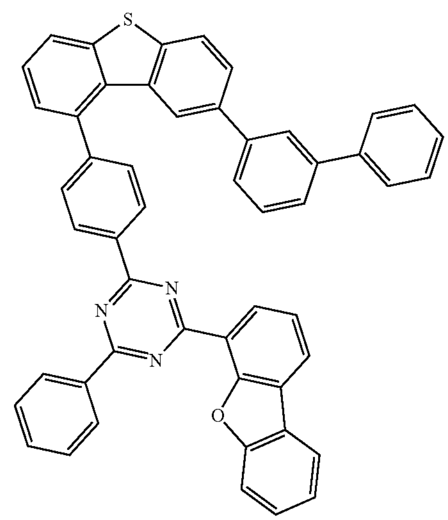
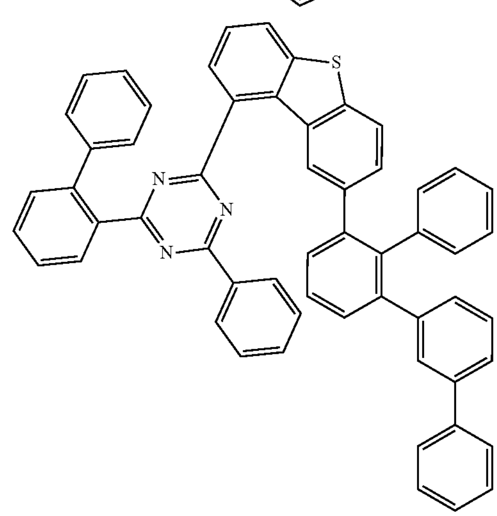

-continued
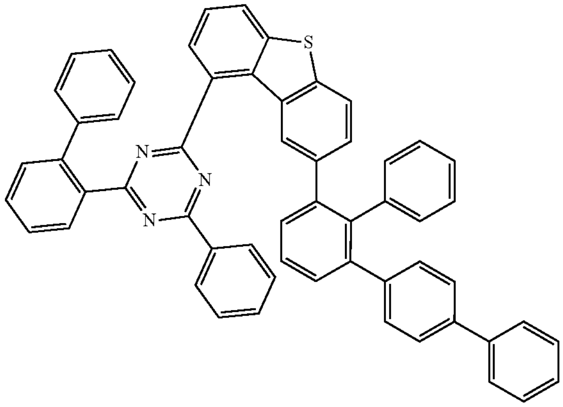
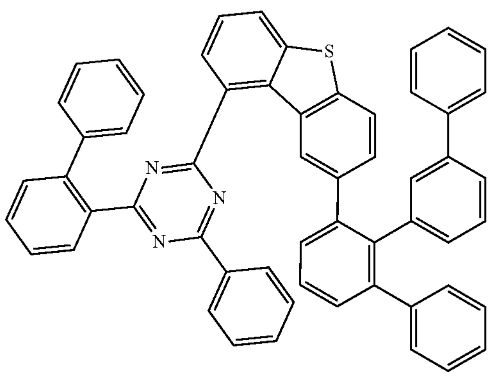
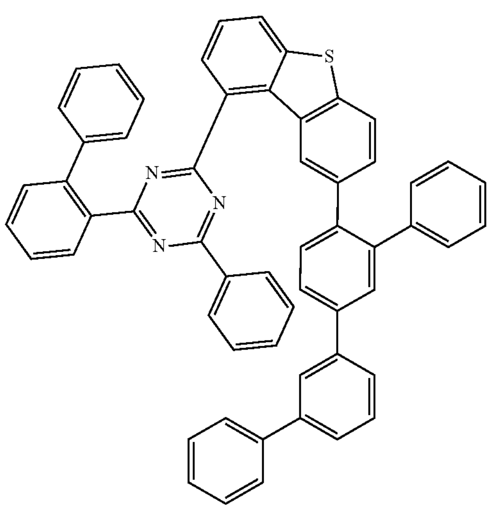
-continued
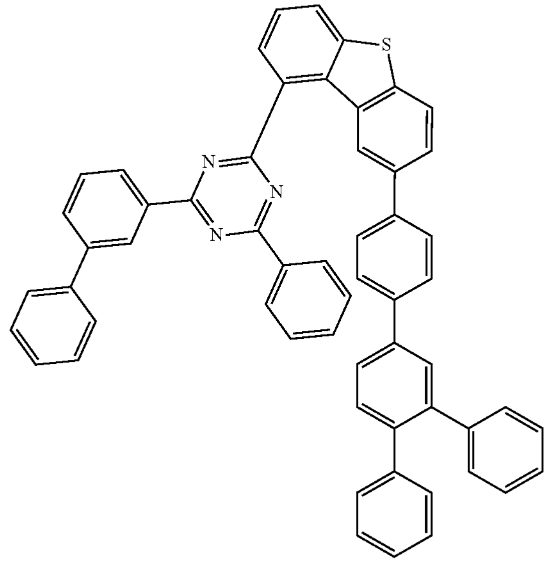
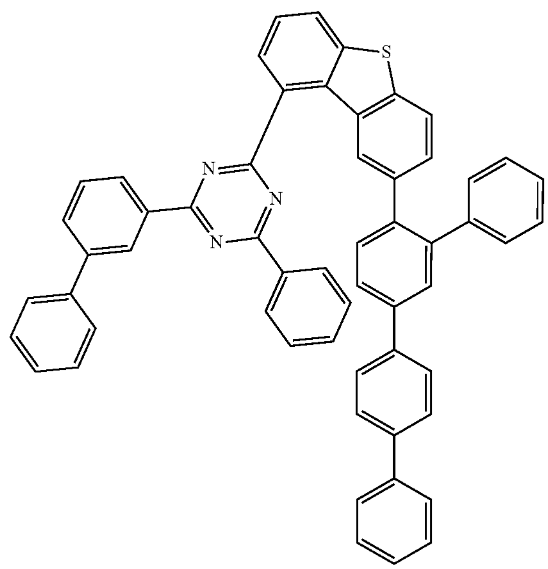
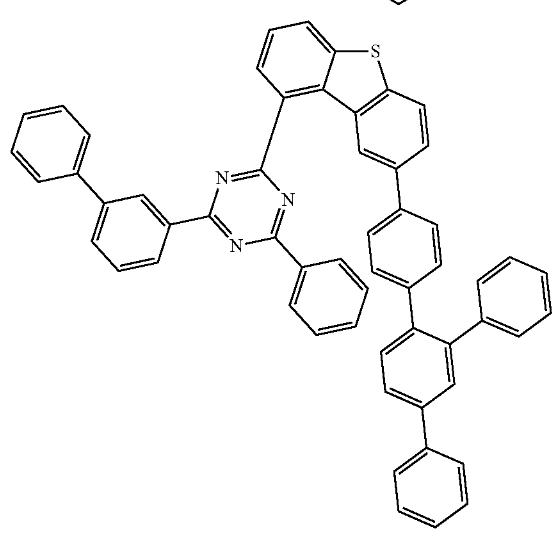

-continued
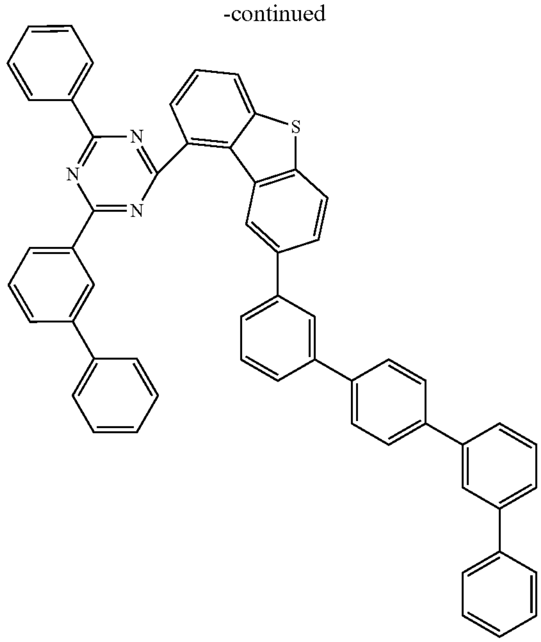
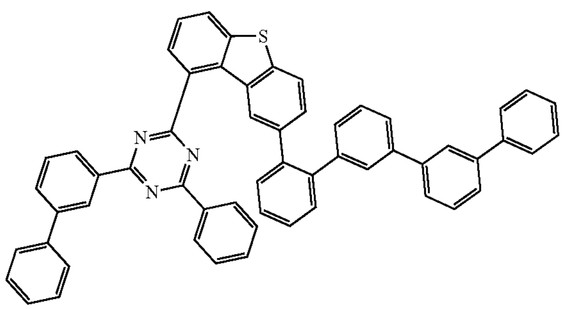
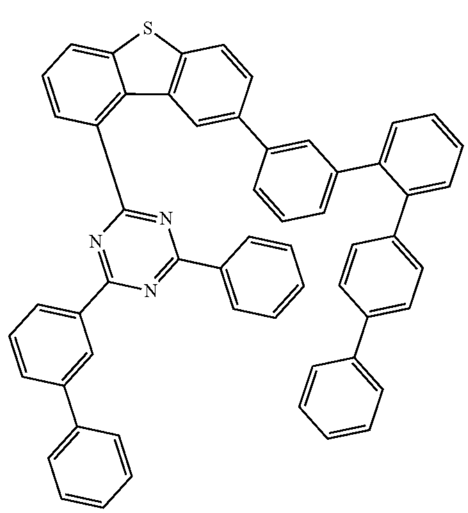
-continued
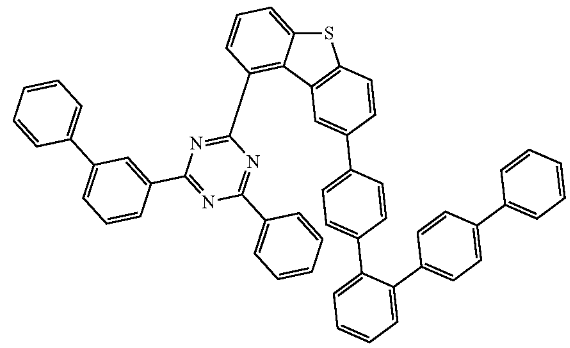
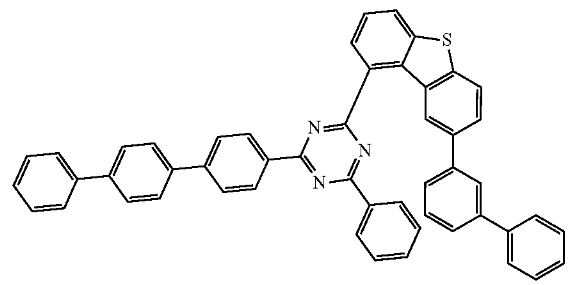
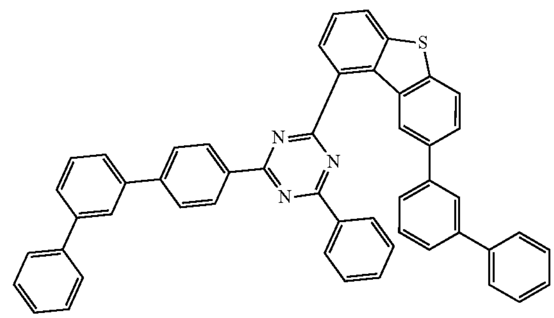
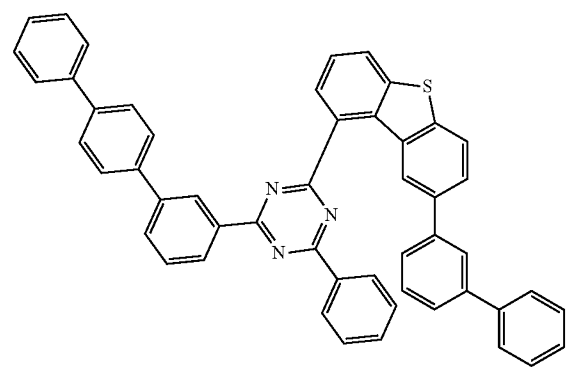
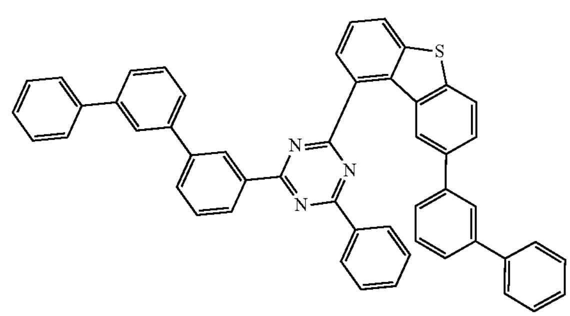

-continued
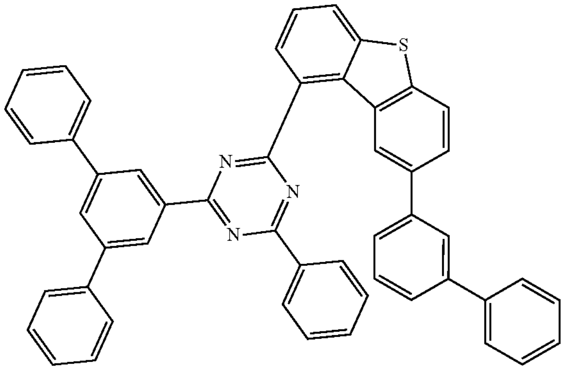
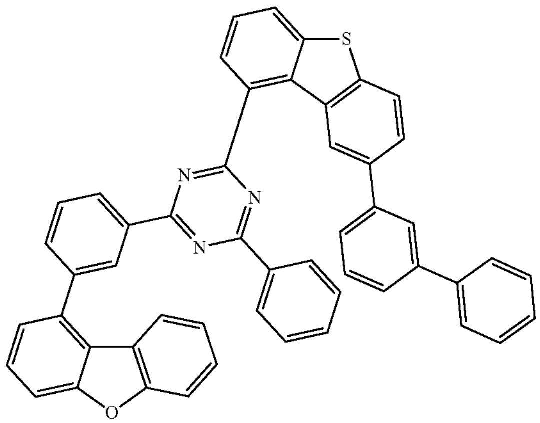
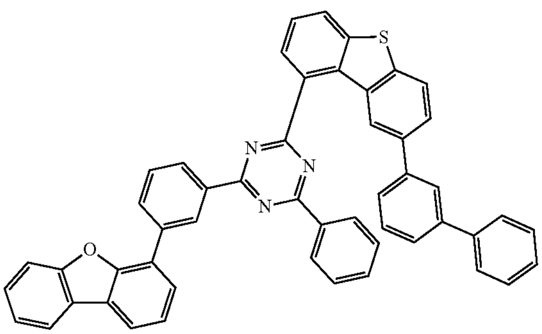
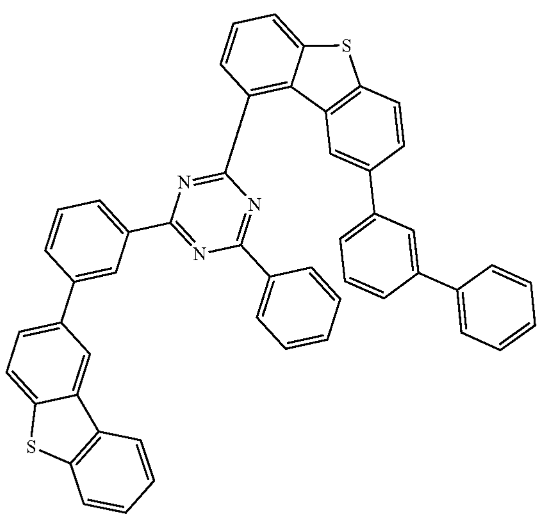
-continued
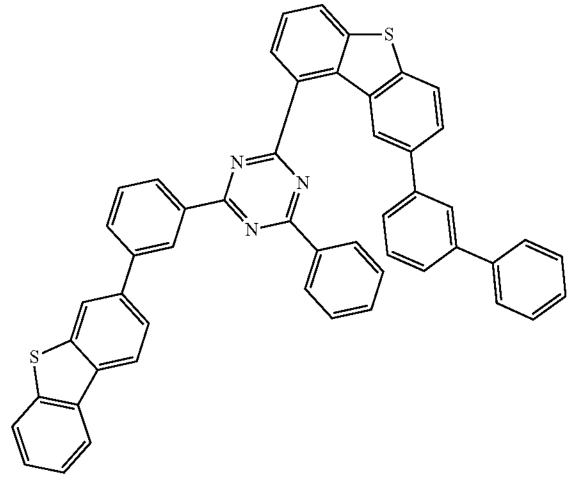
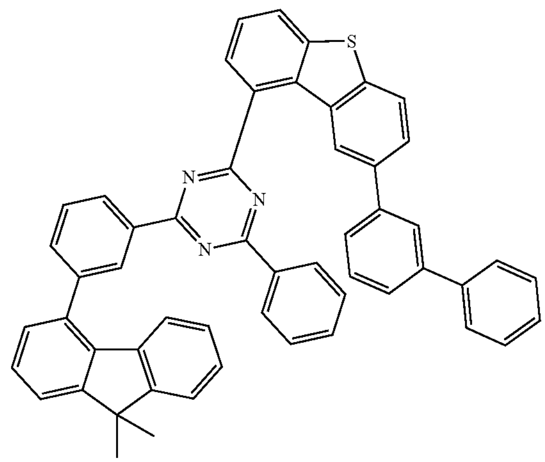
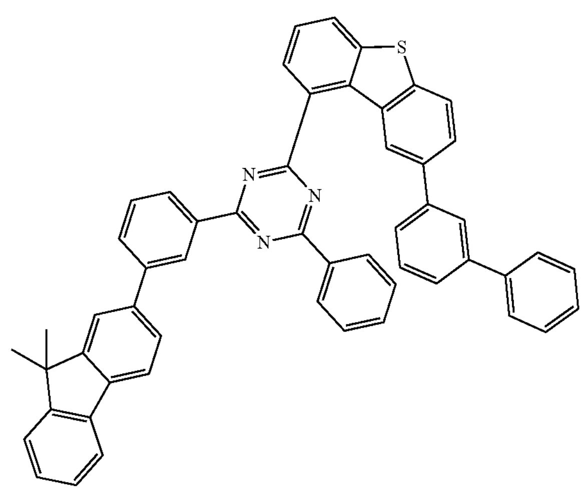

-continued
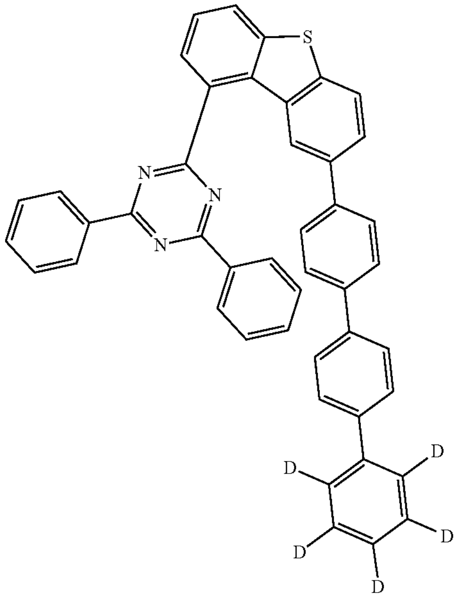
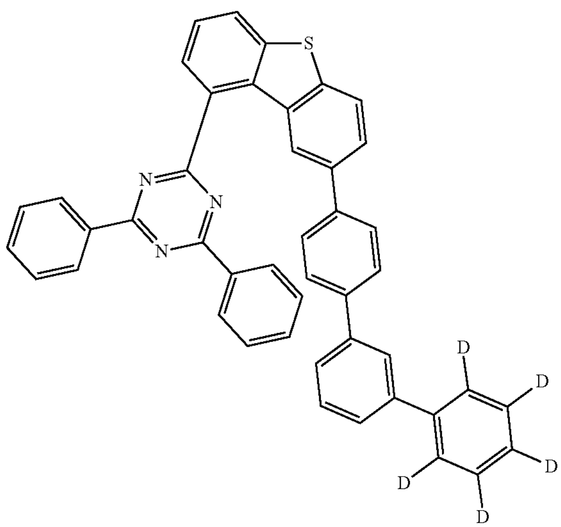
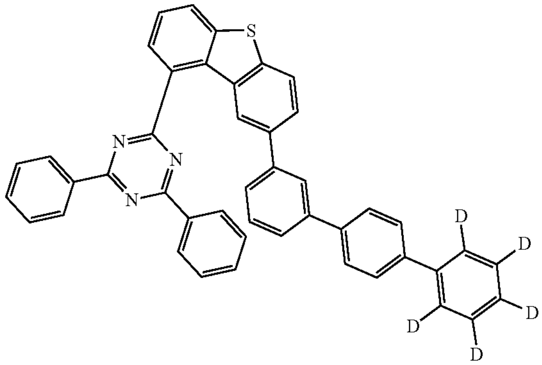
-continued
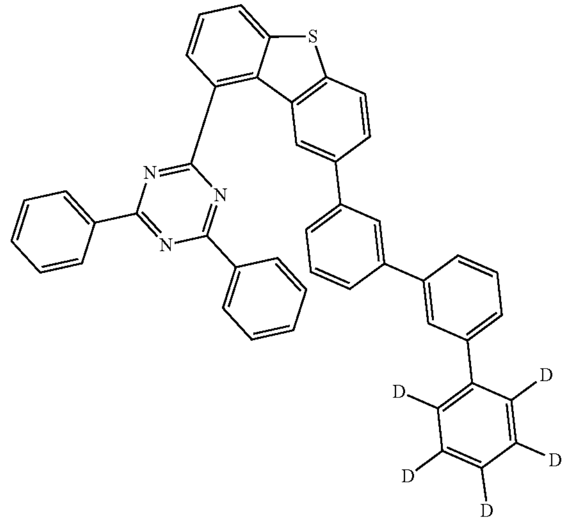
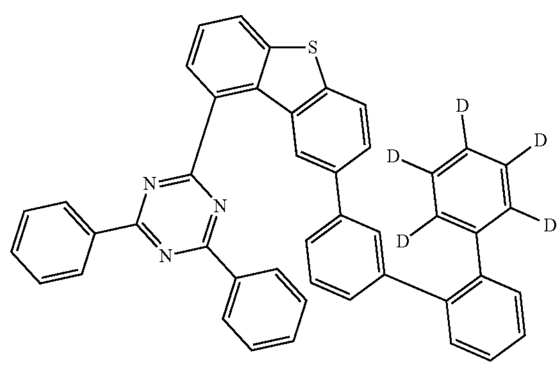
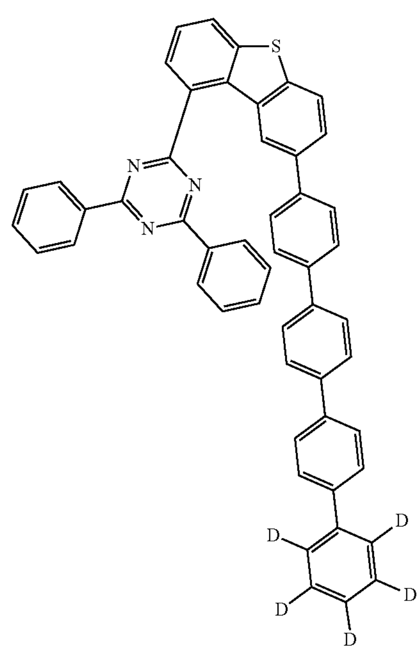

-continued
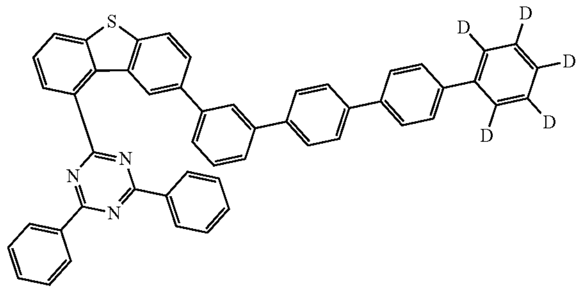
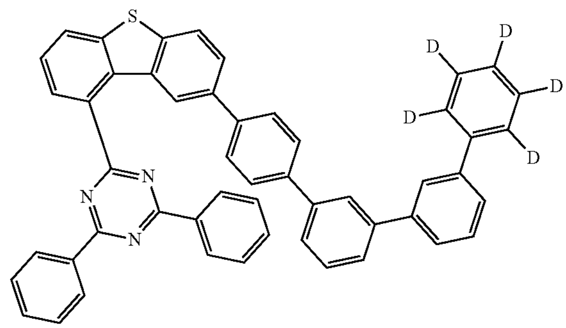
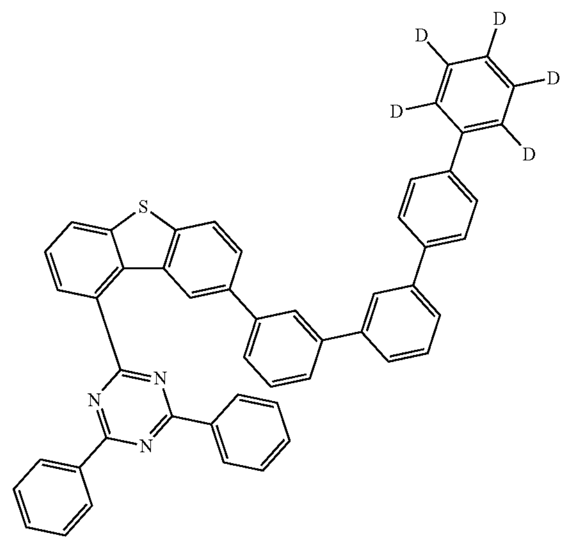
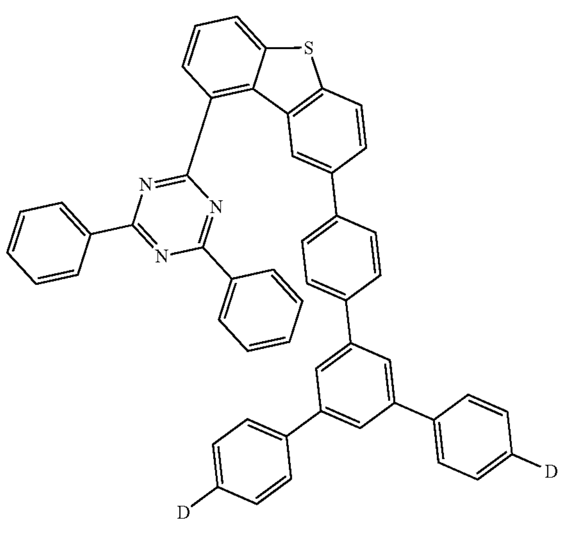
-continued
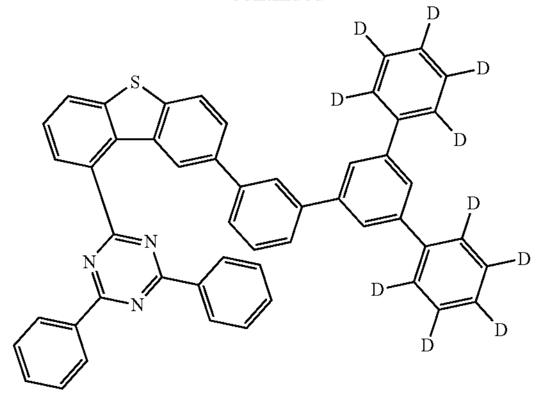
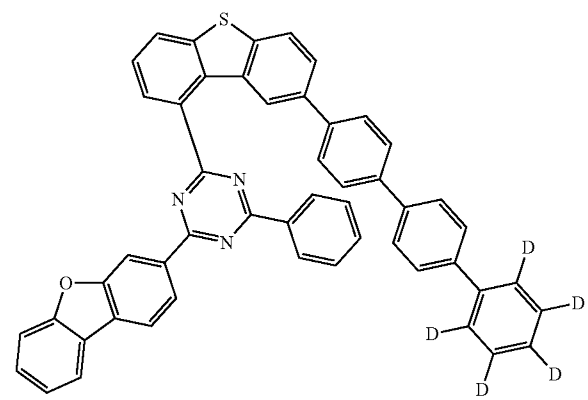
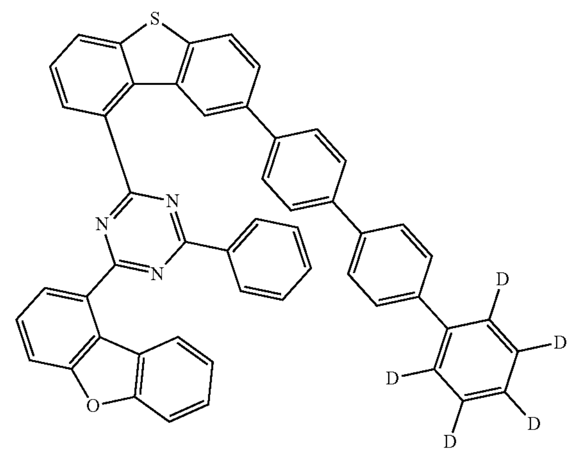
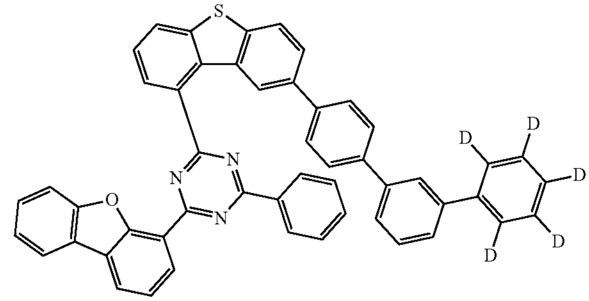

-continued
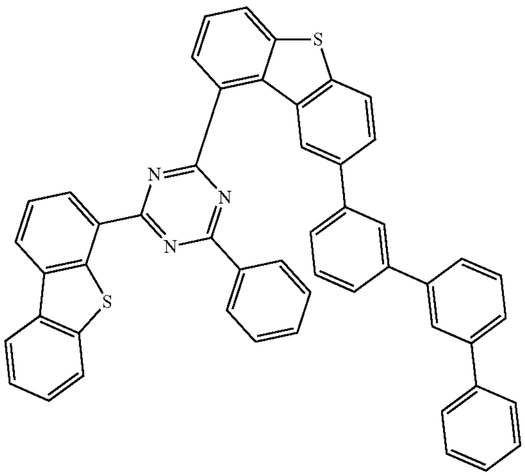
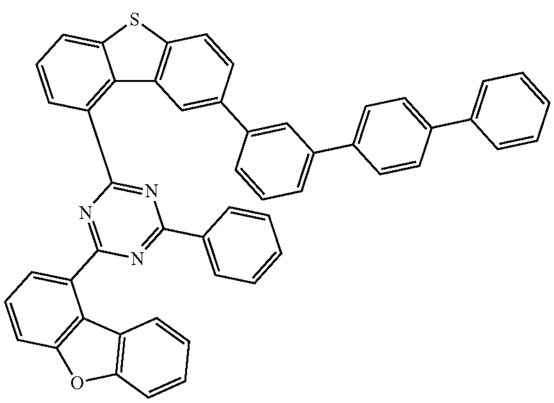
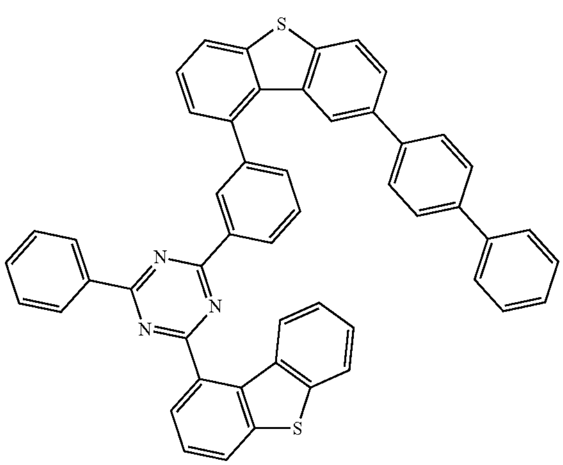
-continued
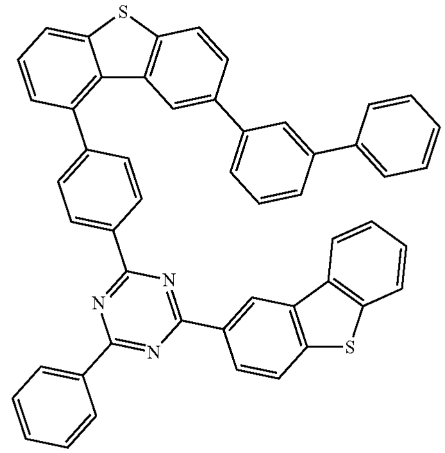
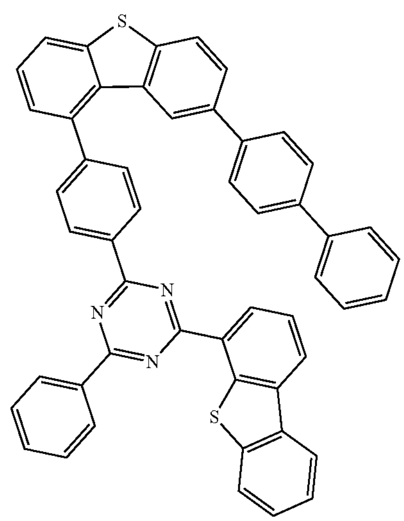
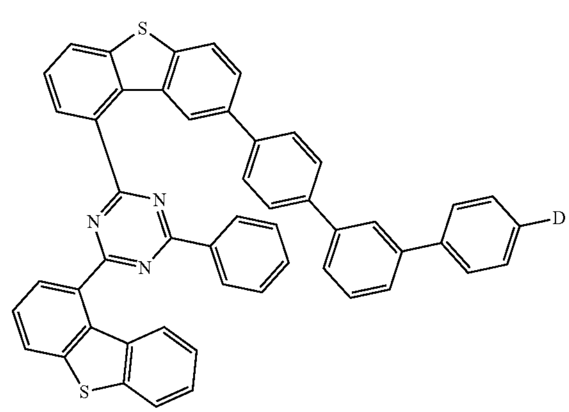

-continued
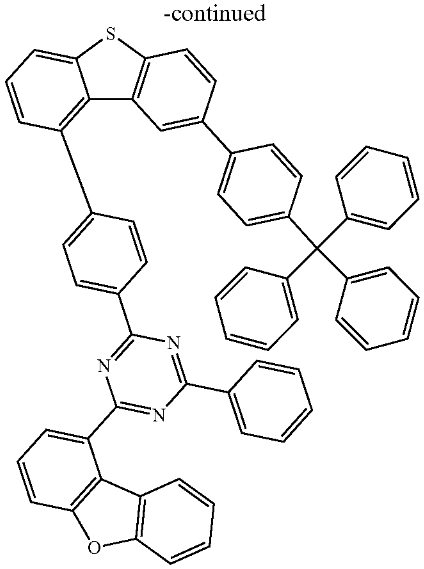
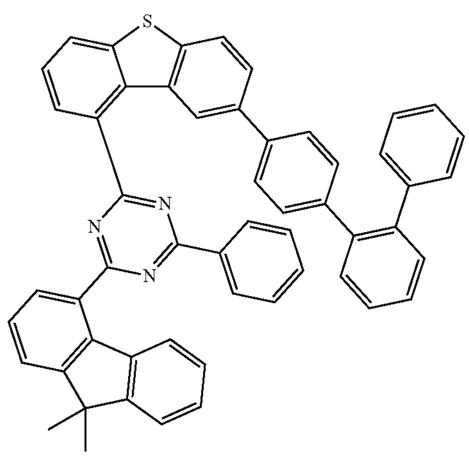
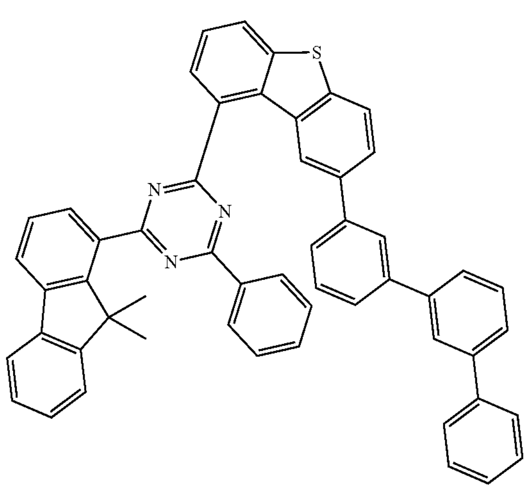
-continued
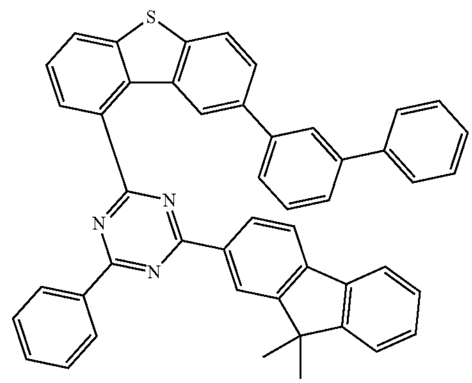
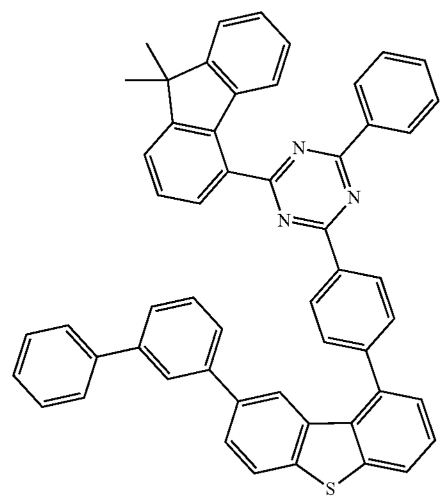
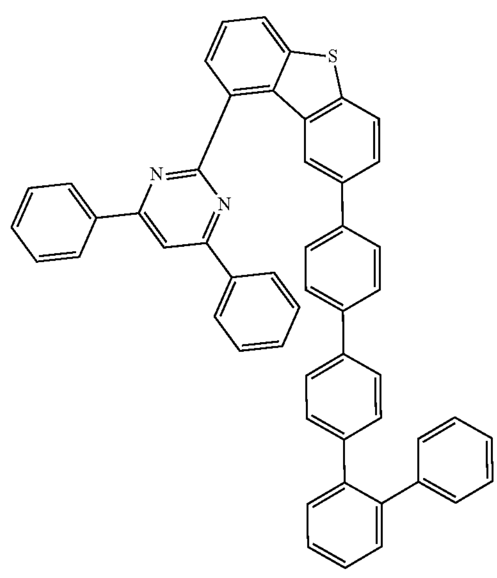

-continued
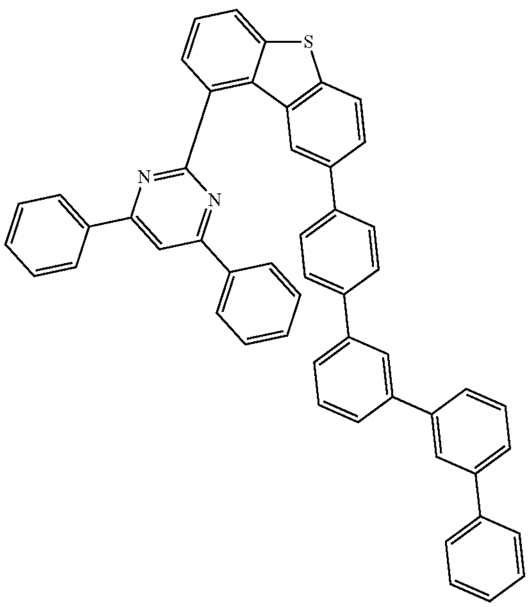
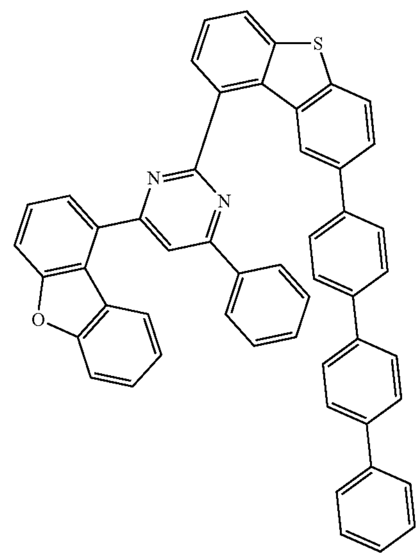
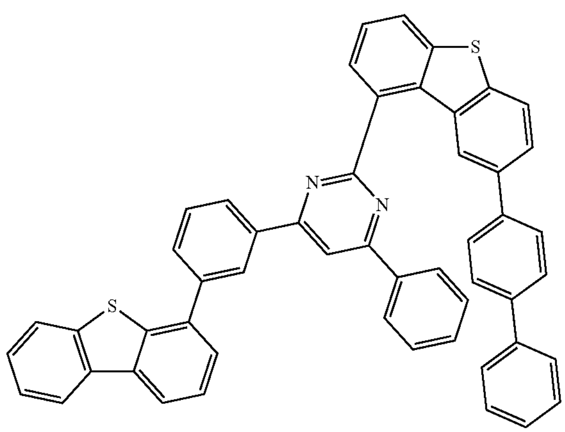
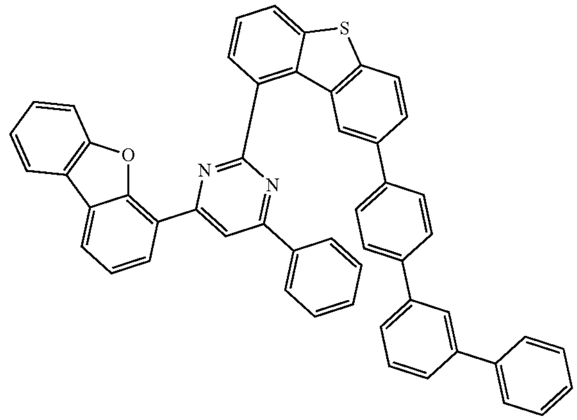
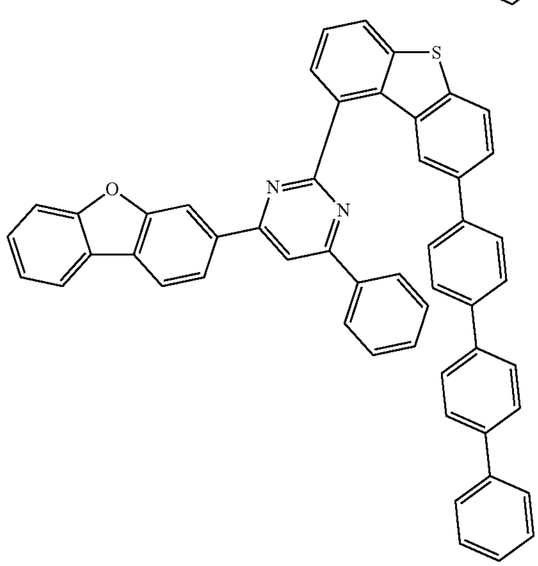
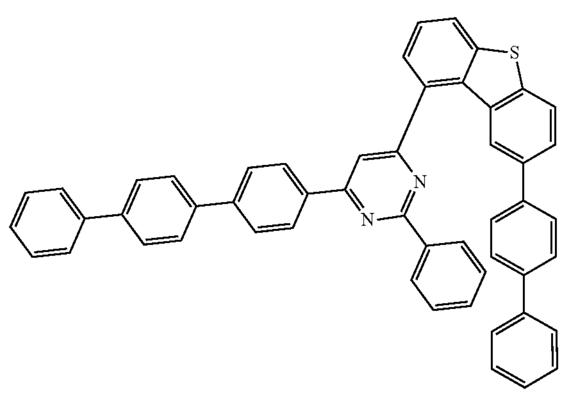

-continued
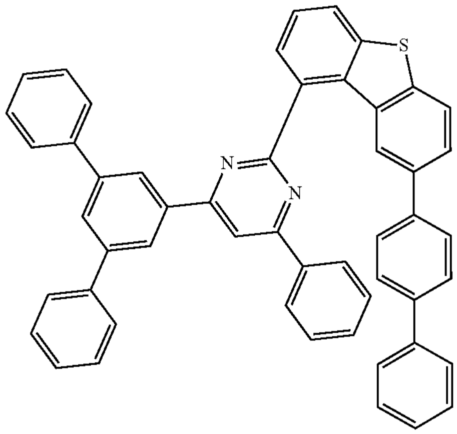
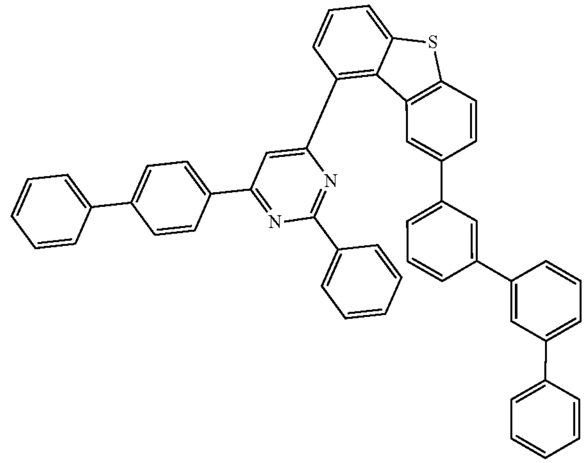
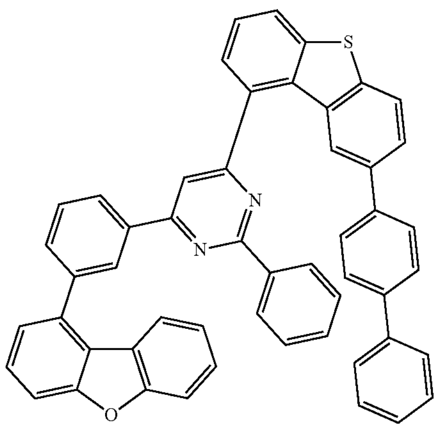
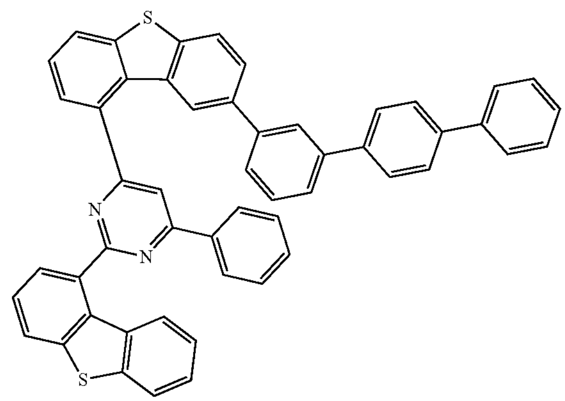
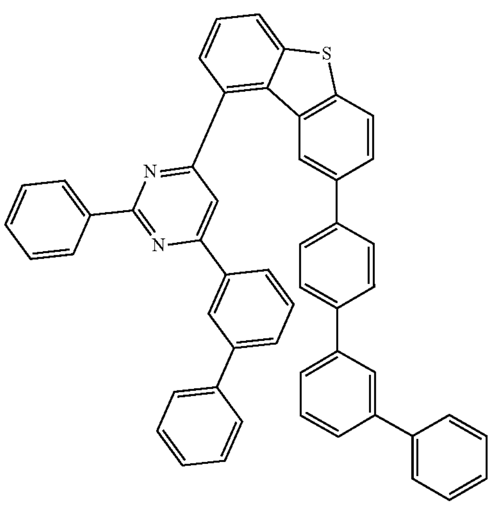
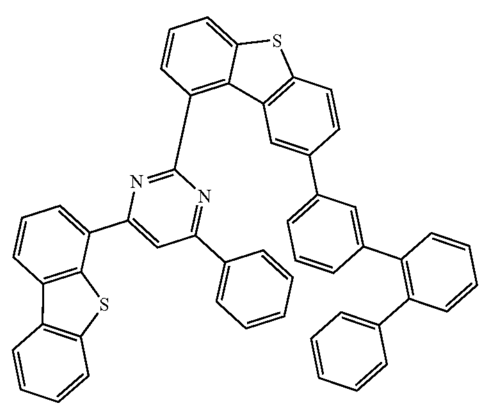

-continued
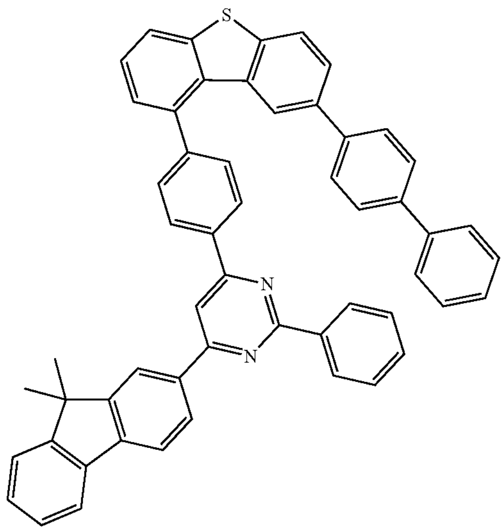
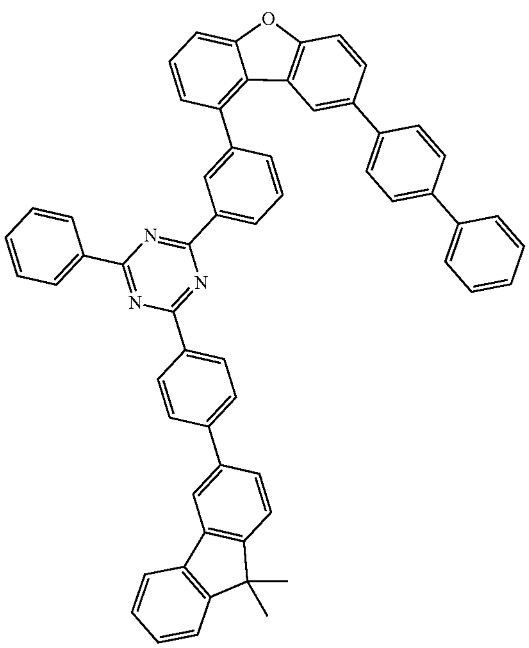
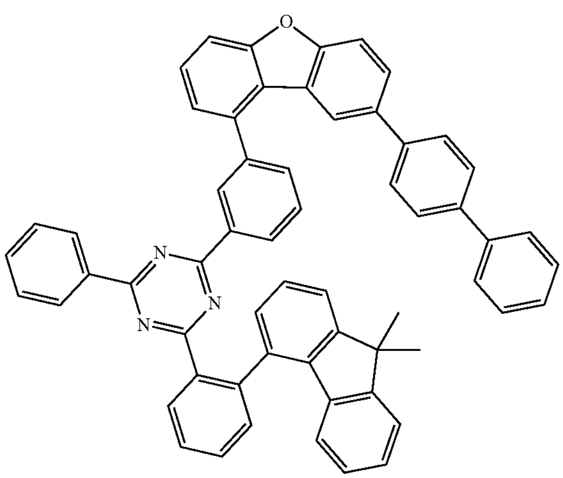
-continued
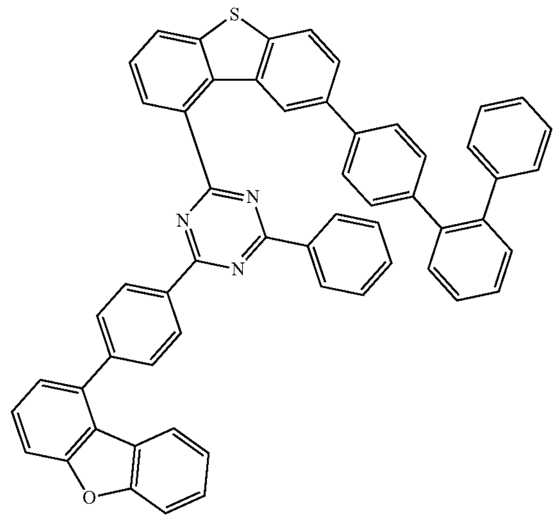
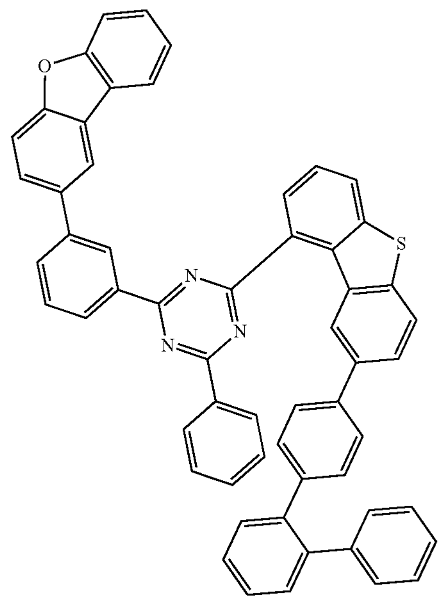
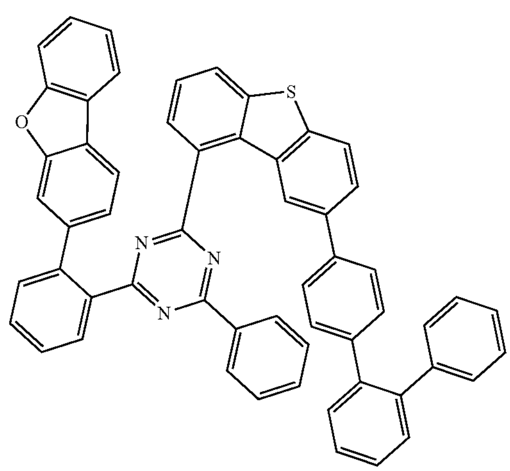

-continued
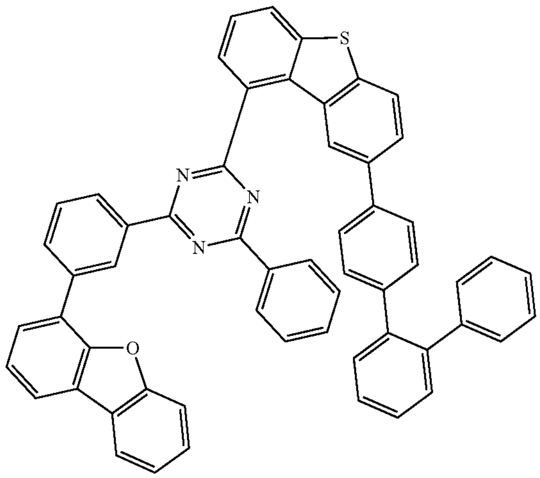
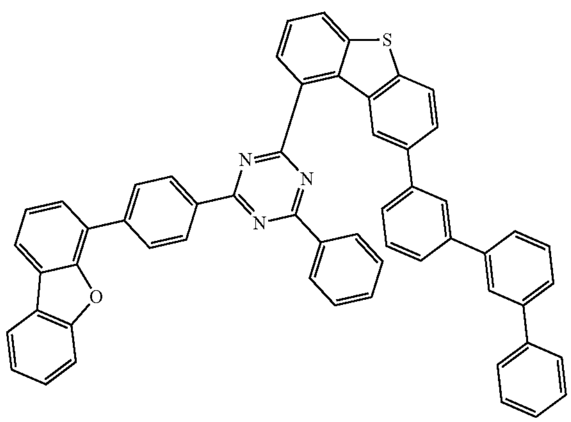
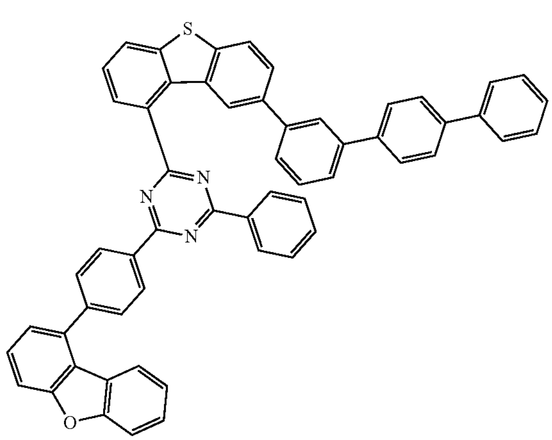
-continued
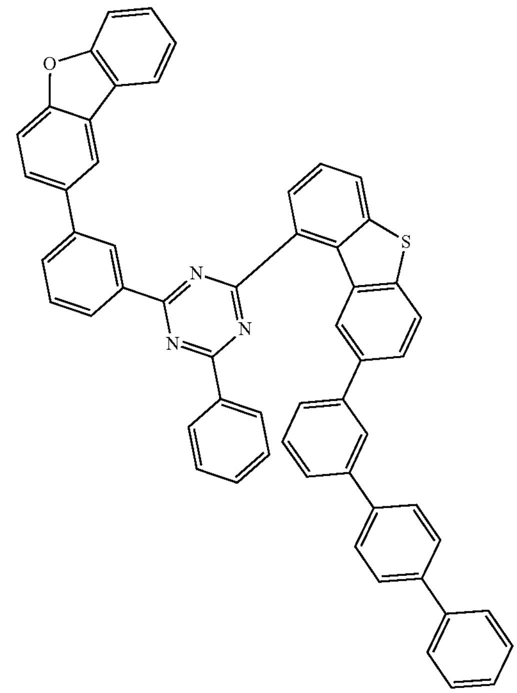
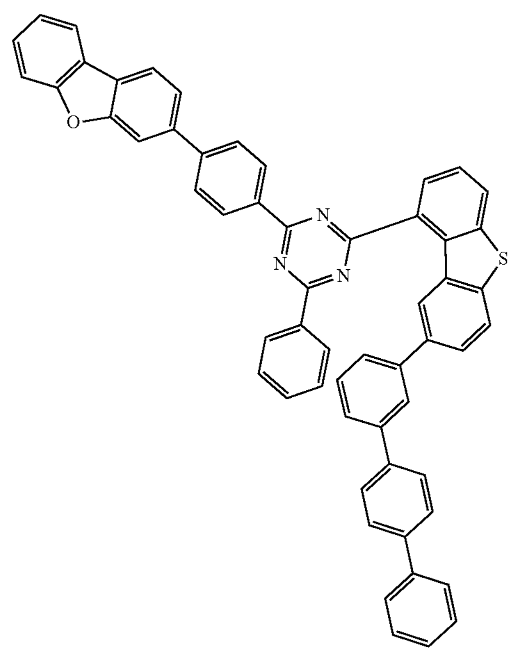

-continued
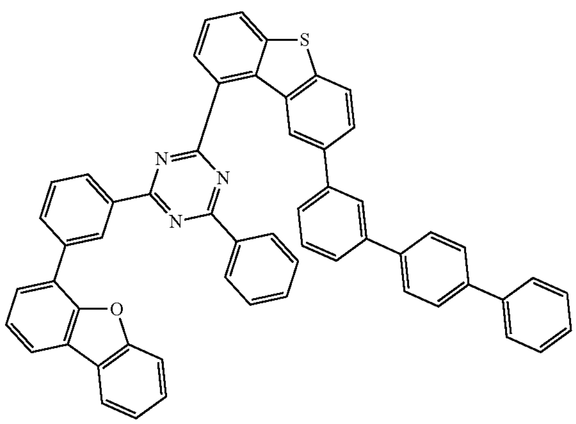
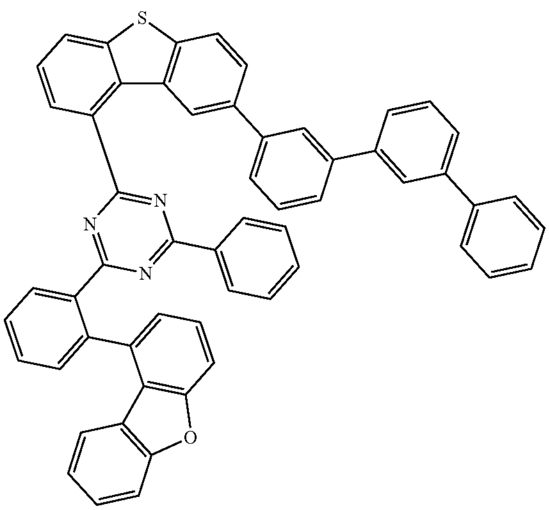
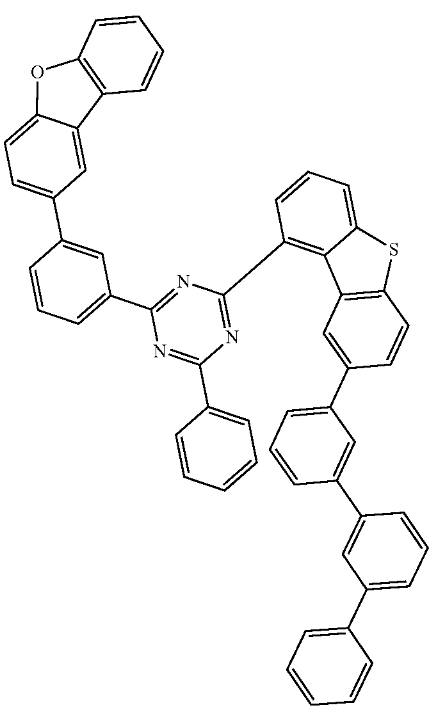
-continued
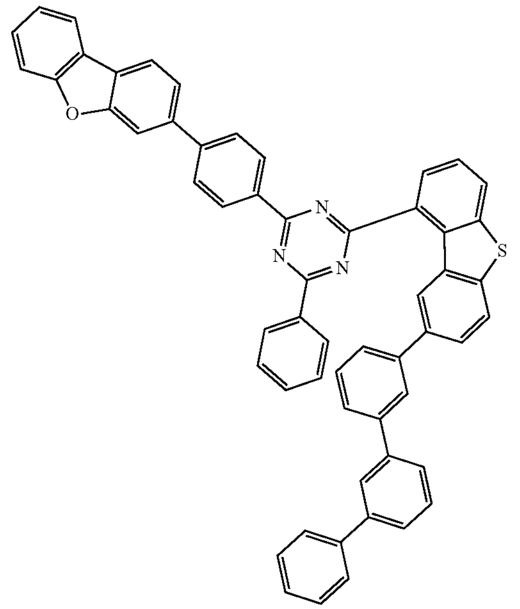
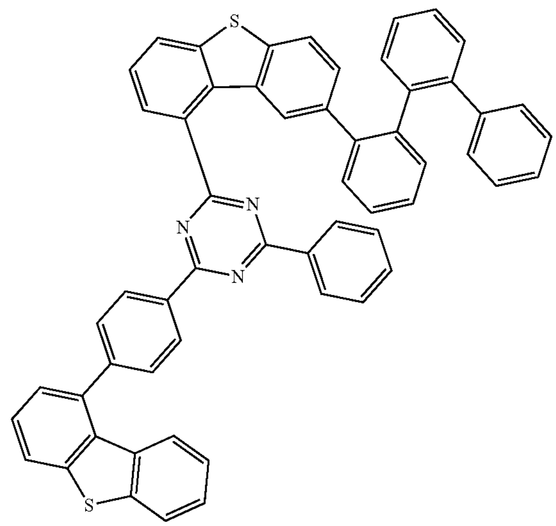
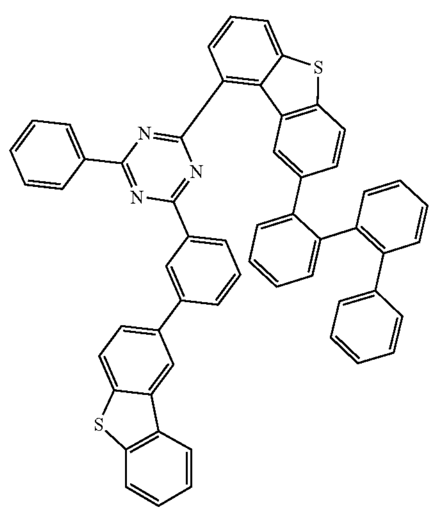

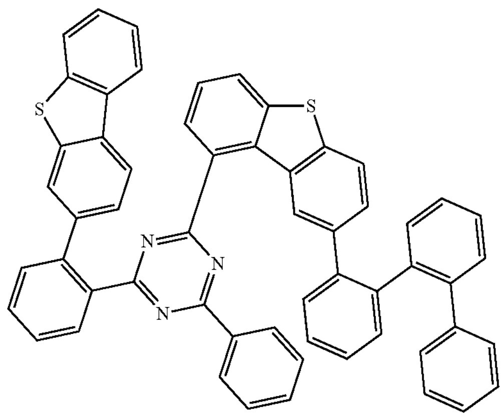
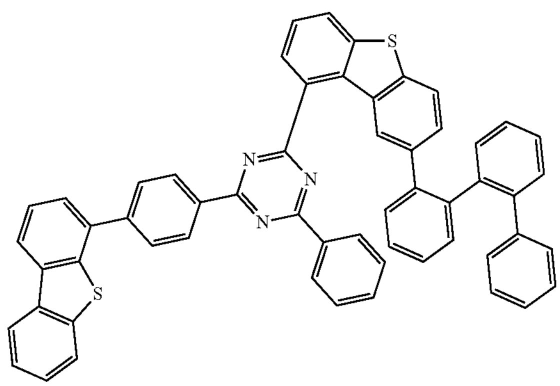
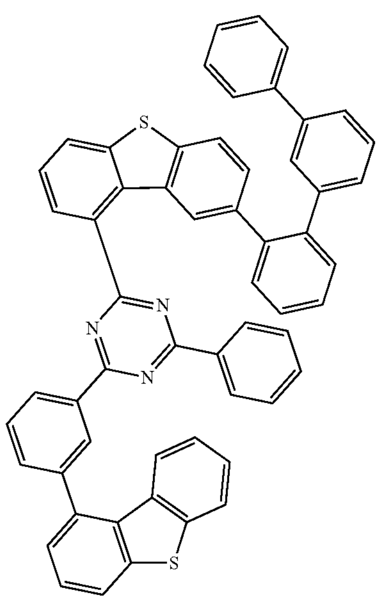
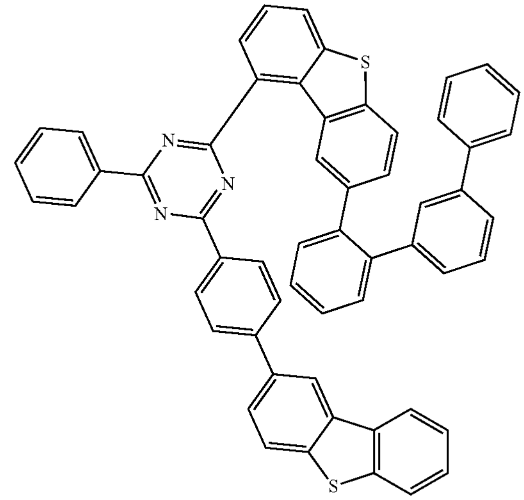
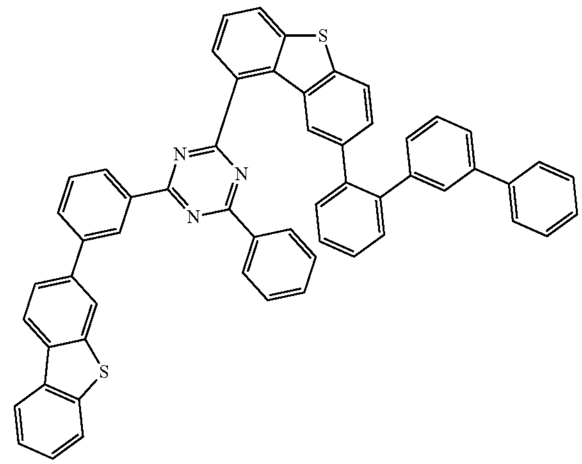
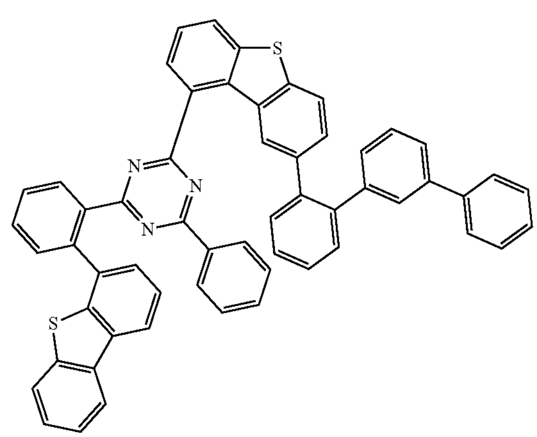

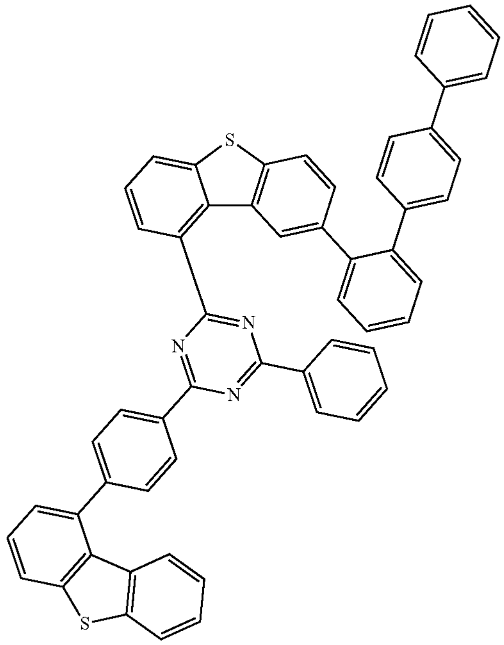
S
N
N
N
S
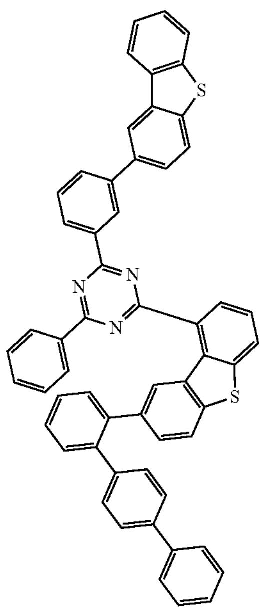
S
N
N
N
S
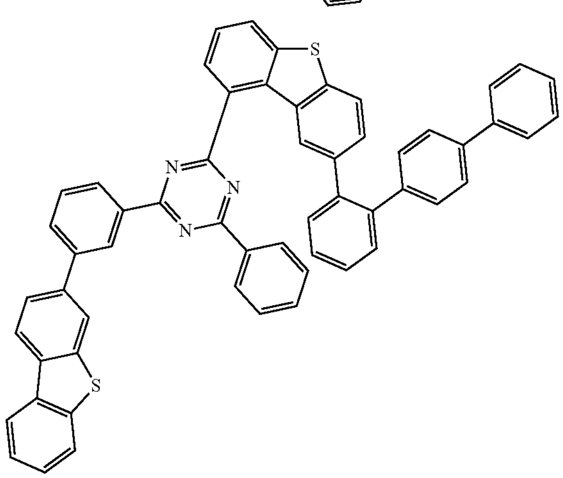
S
N
N
N
S
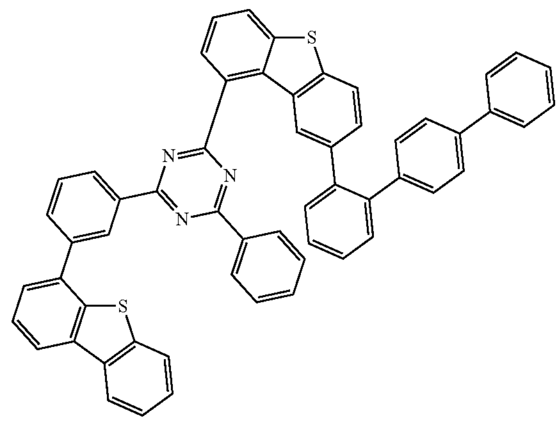
S
N
N
N
S
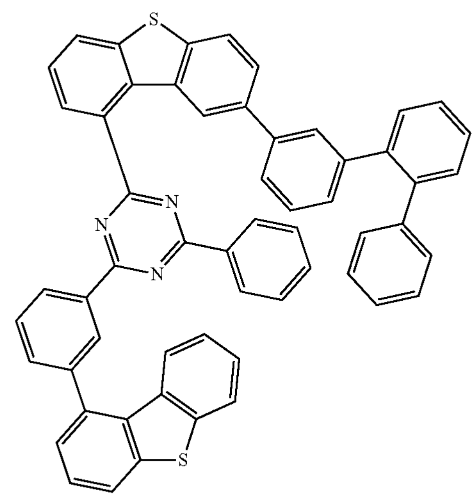
S
N
N
N
S
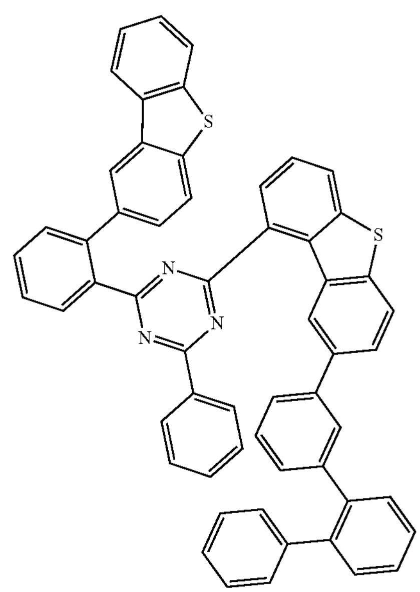
S
N
N
N
S

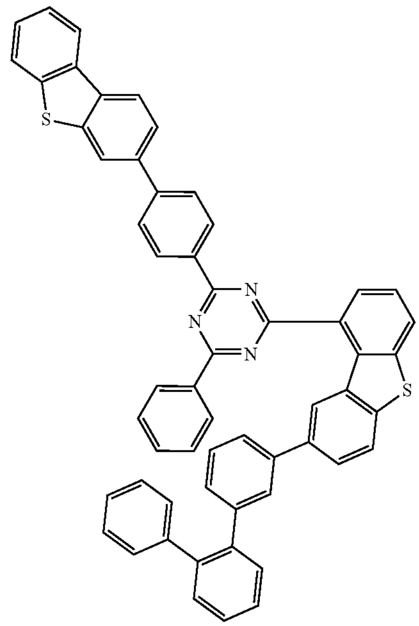
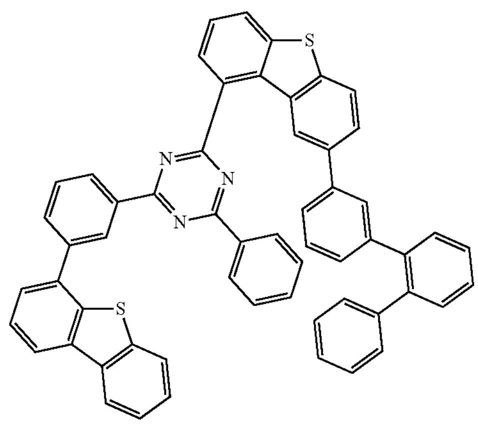
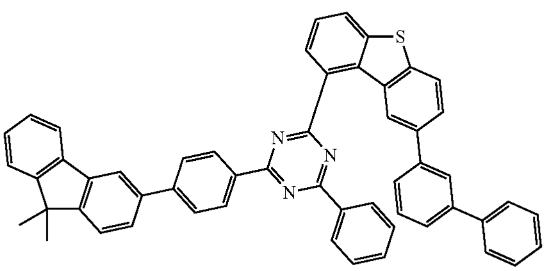
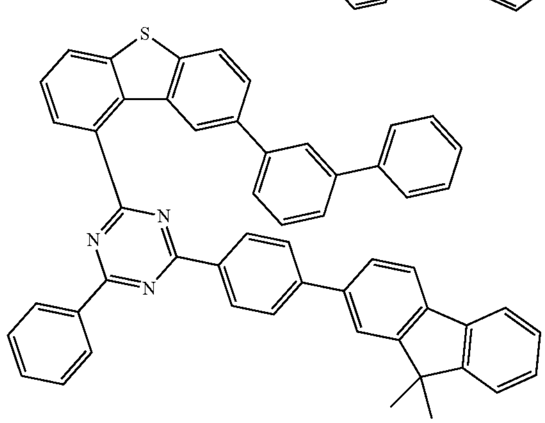
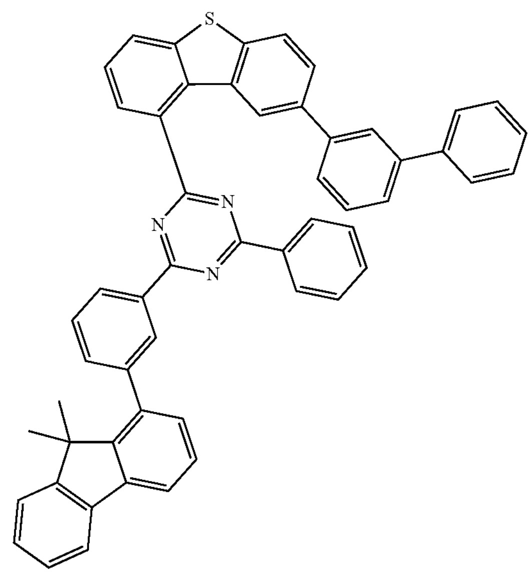
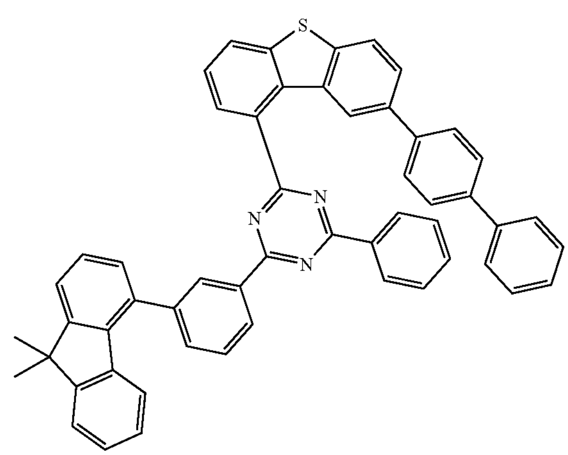
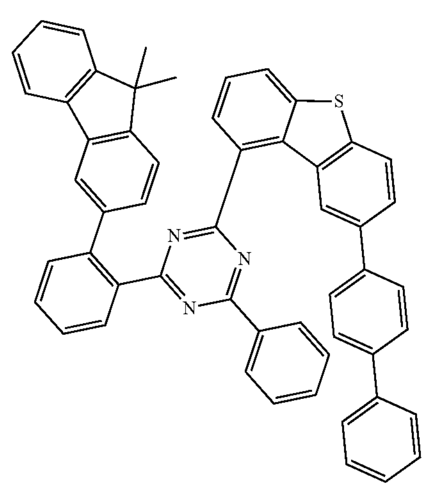

-continued
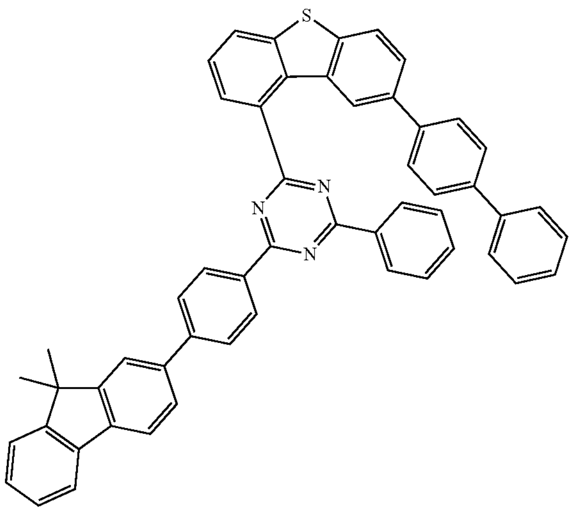
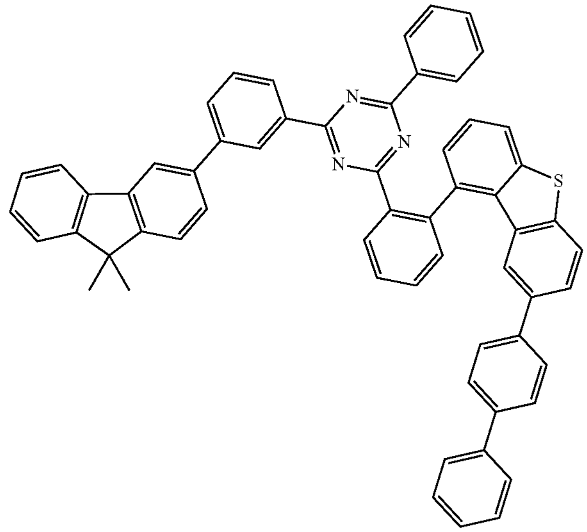
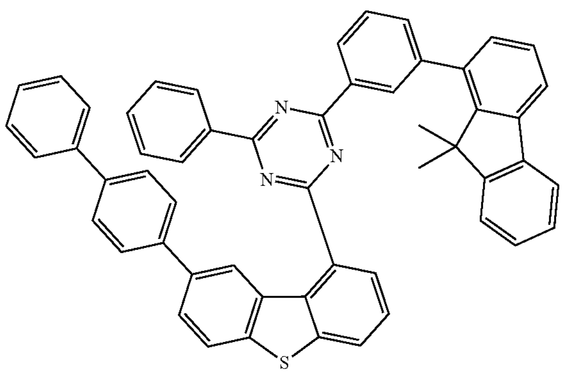
-continued
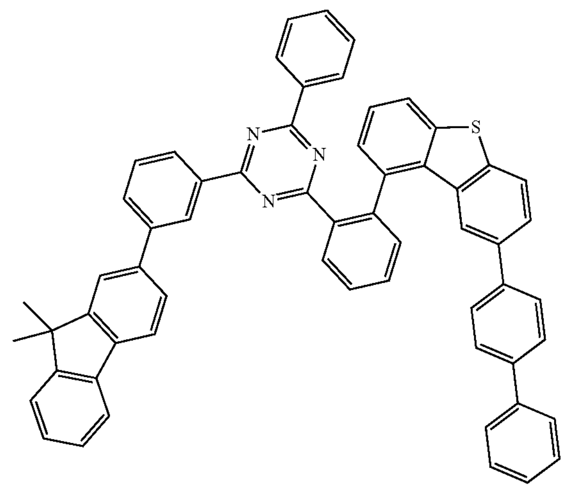
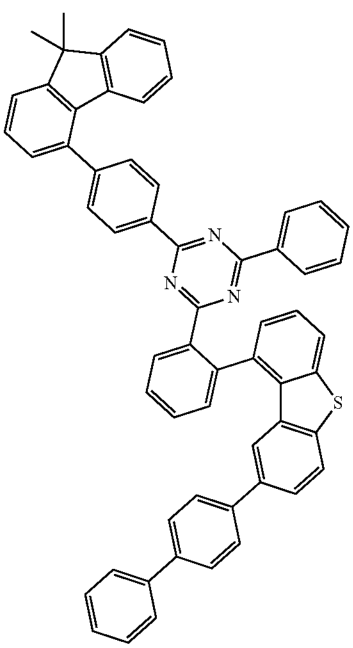
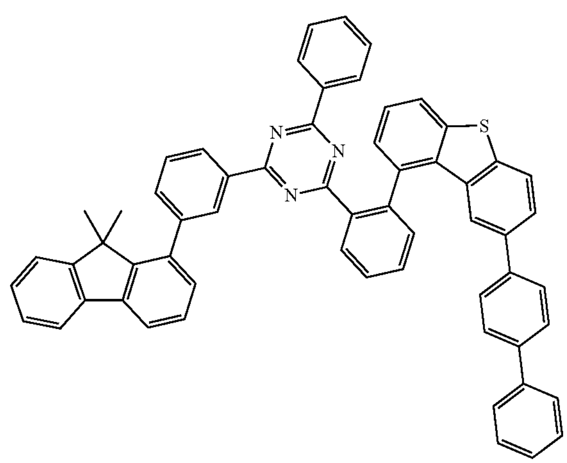

-continued
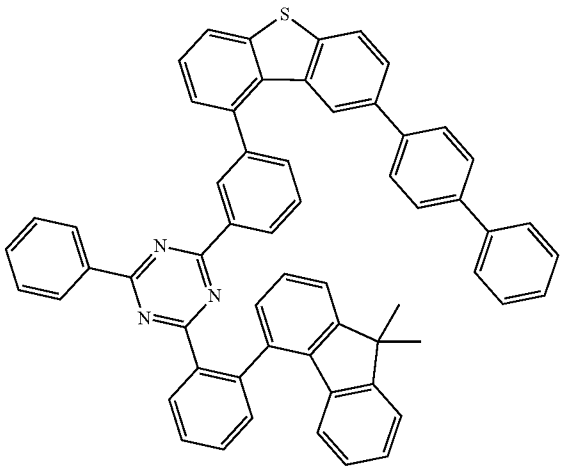
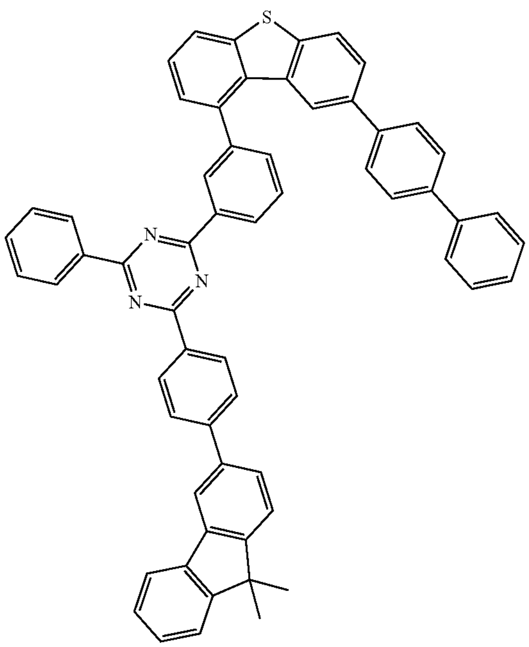
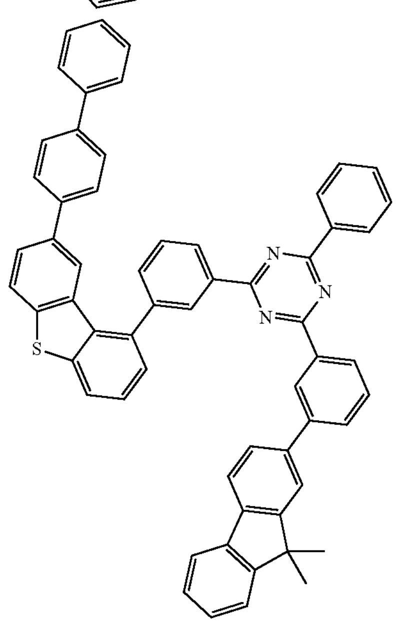
-continued
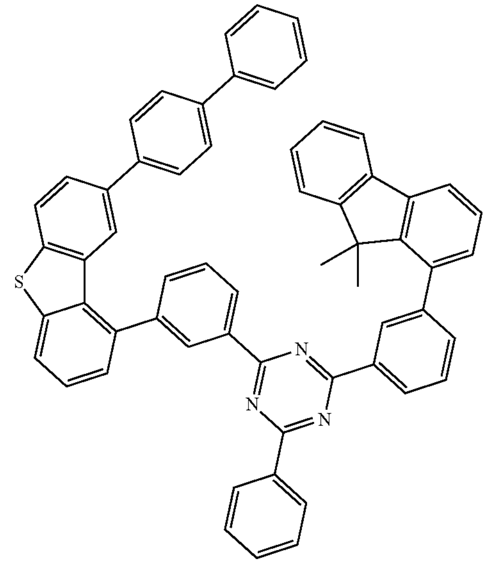
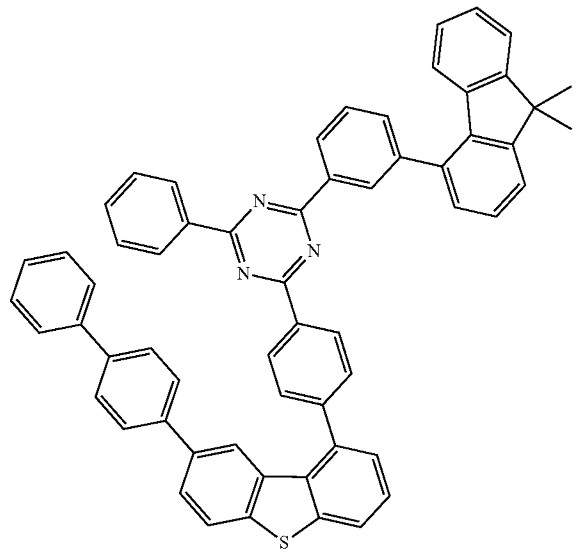
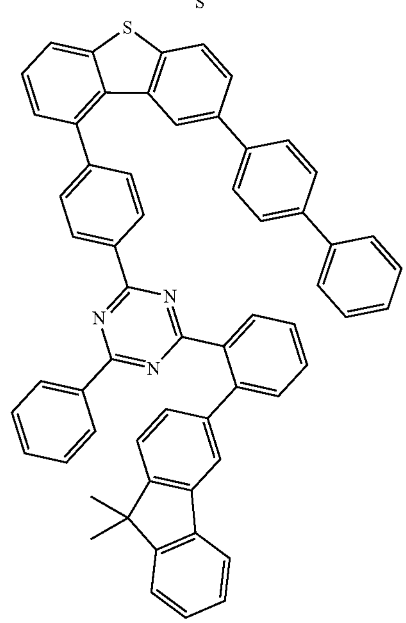

-continued
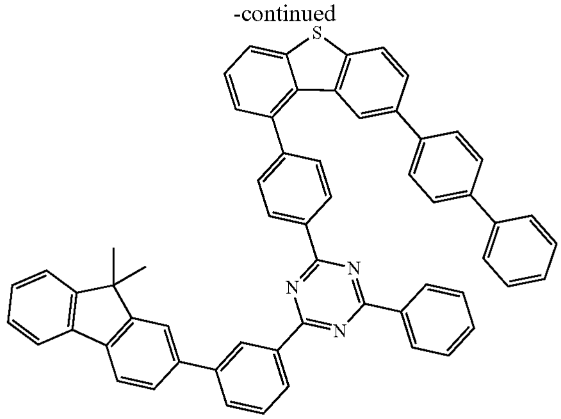
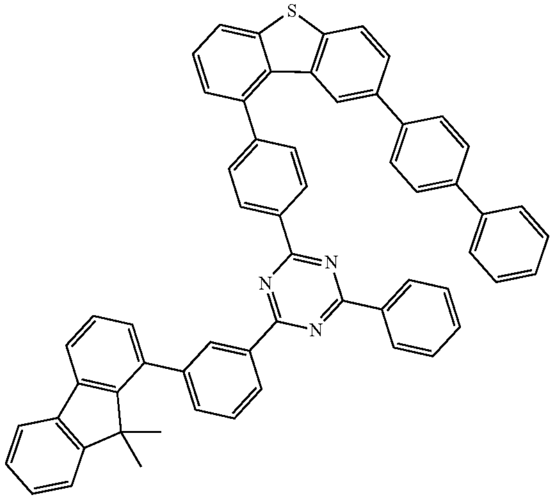
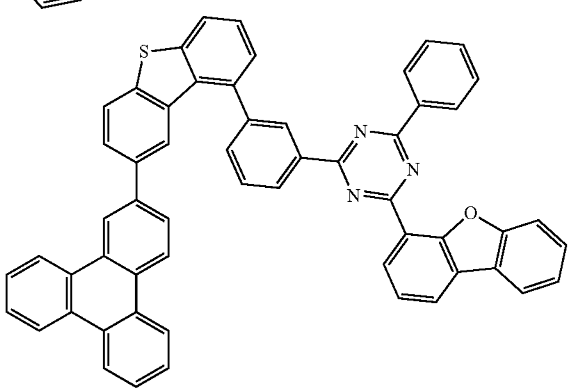
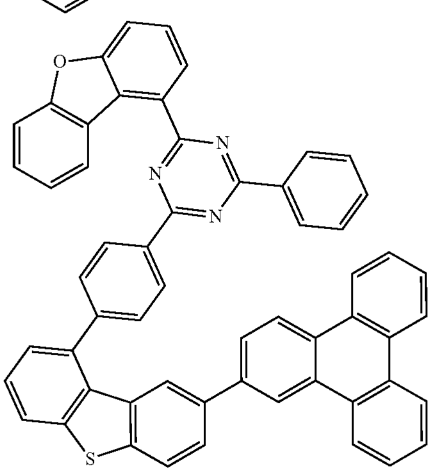
-continued
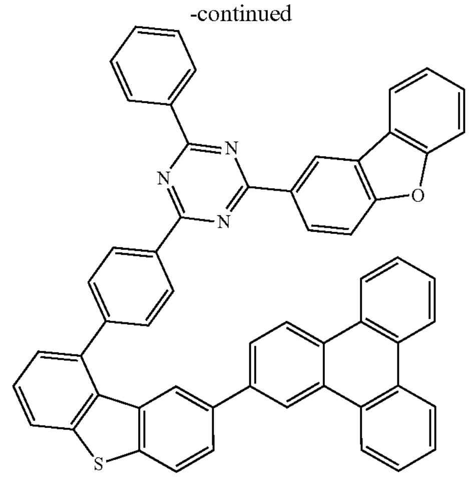
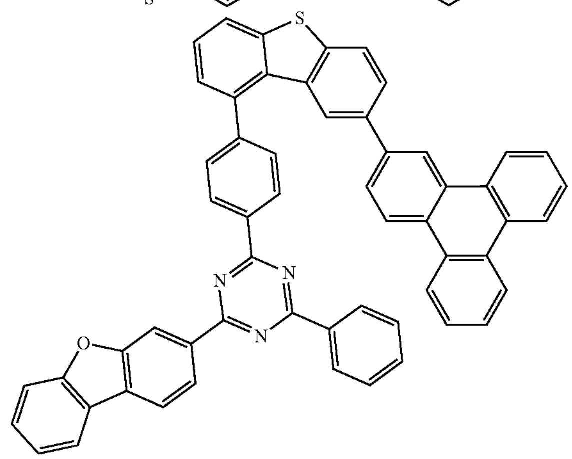
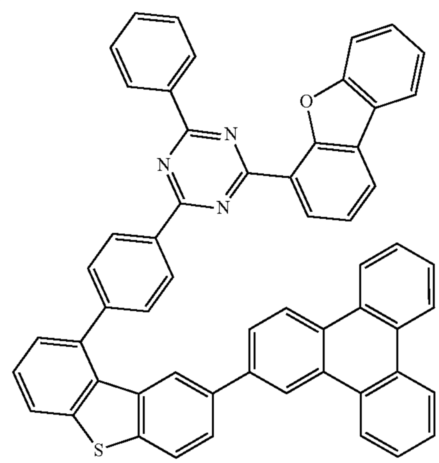
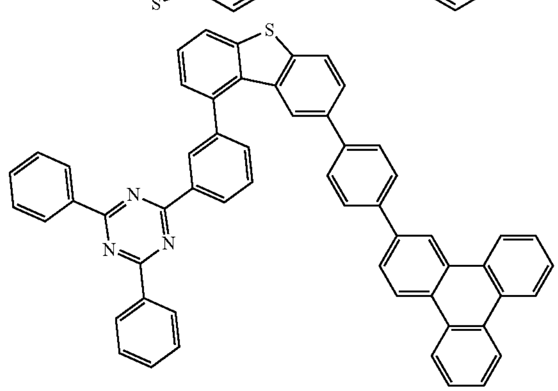

-continued
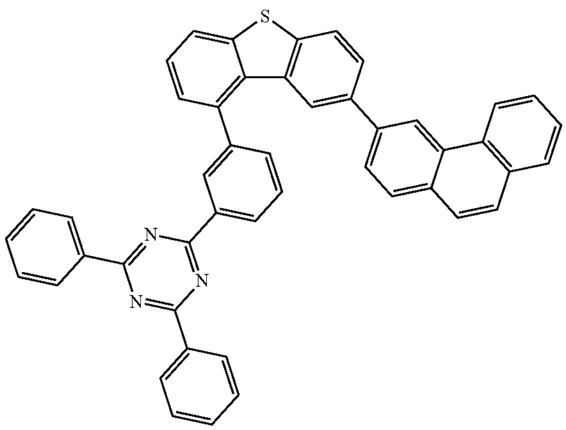
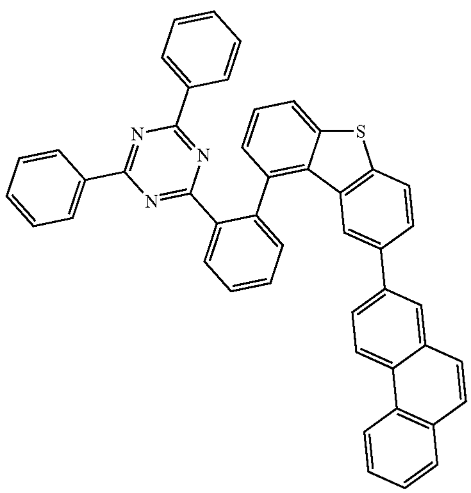
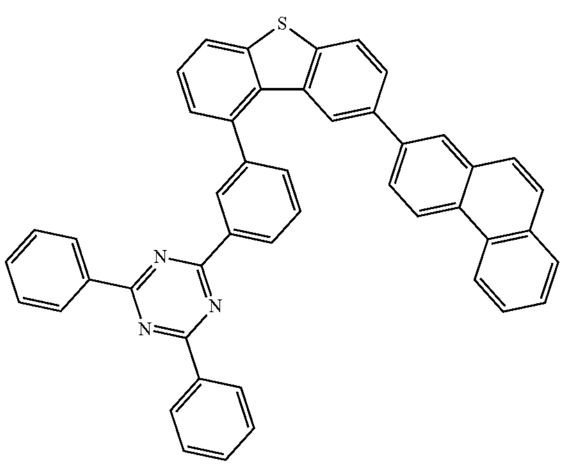
-continued
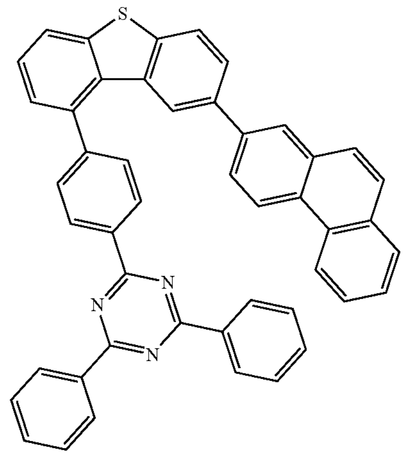
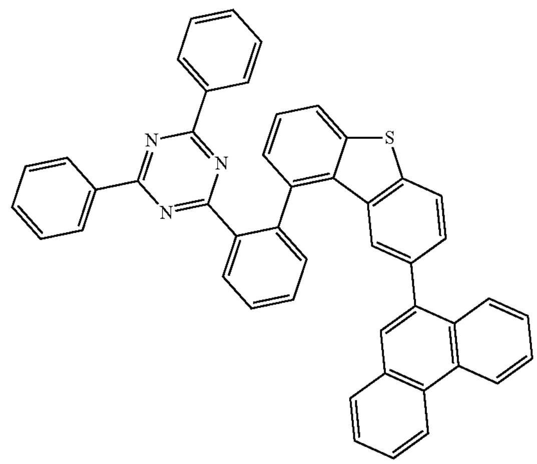
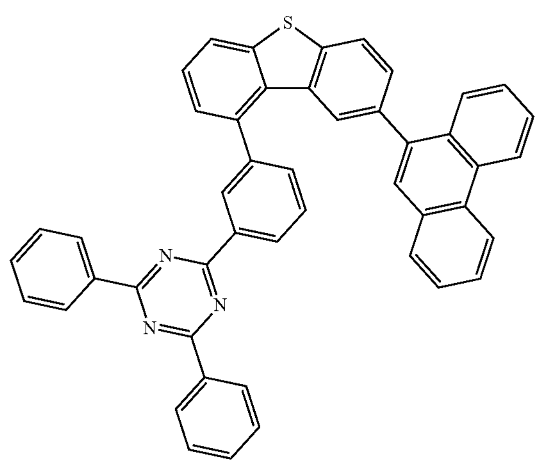

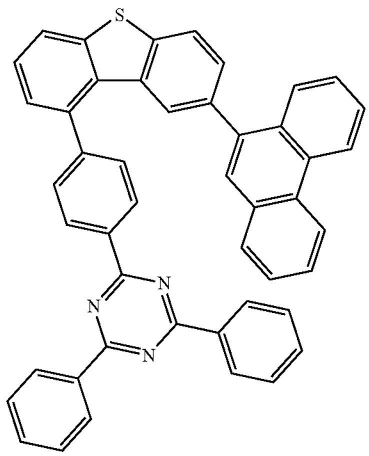
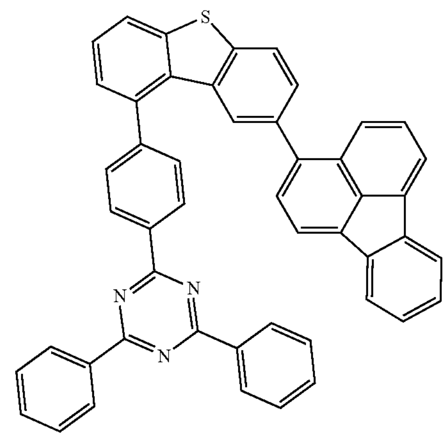
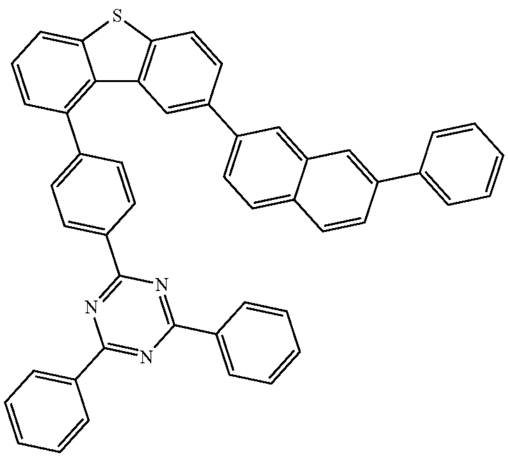
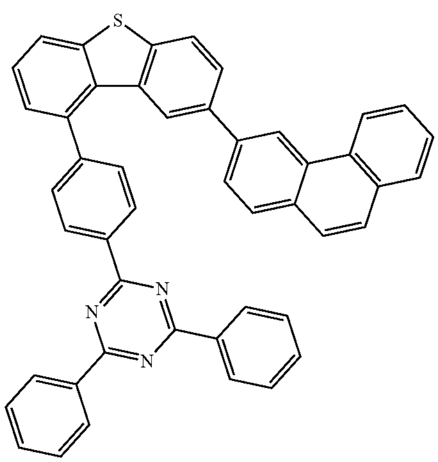
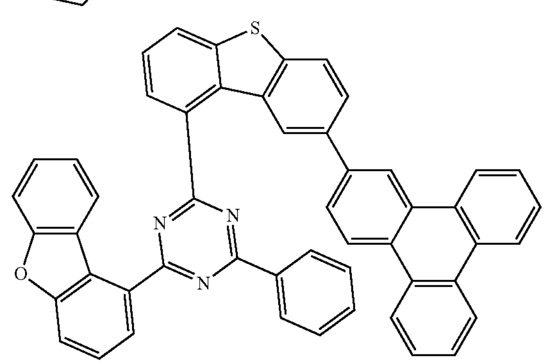
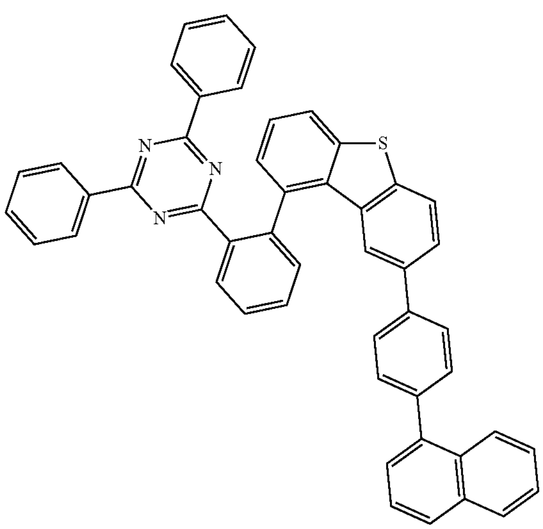
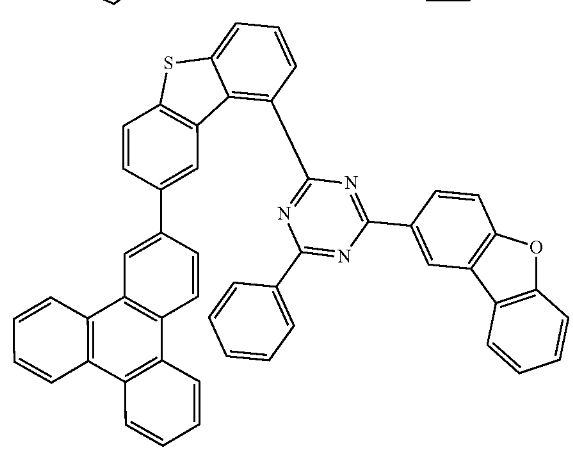

-continued
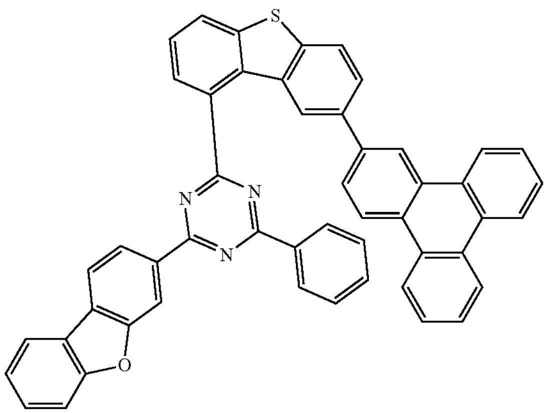
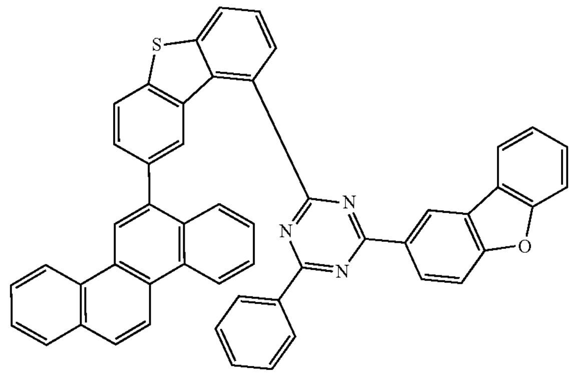
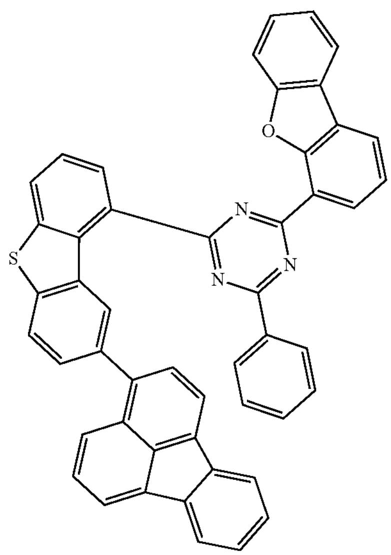
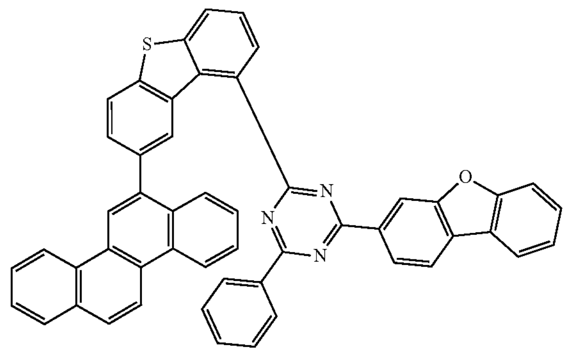
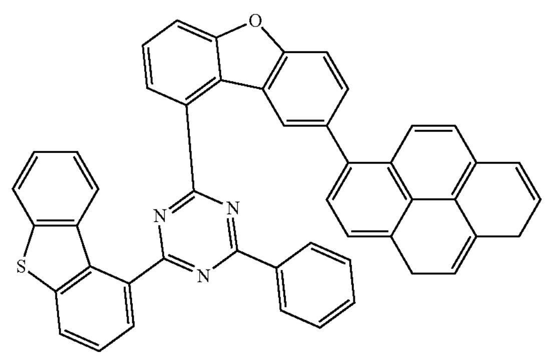
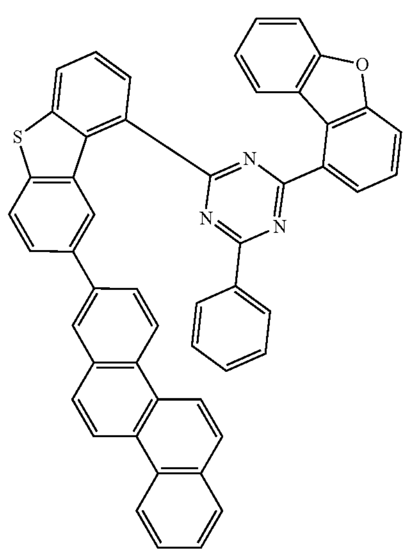
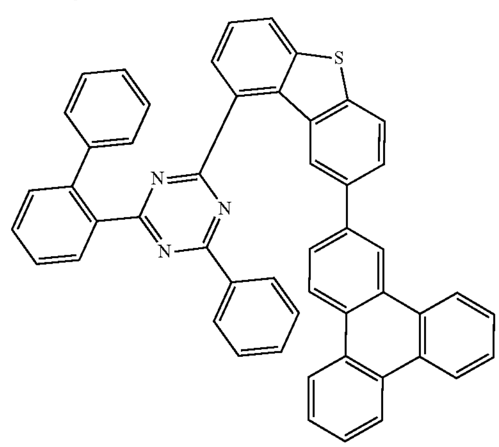

-continued
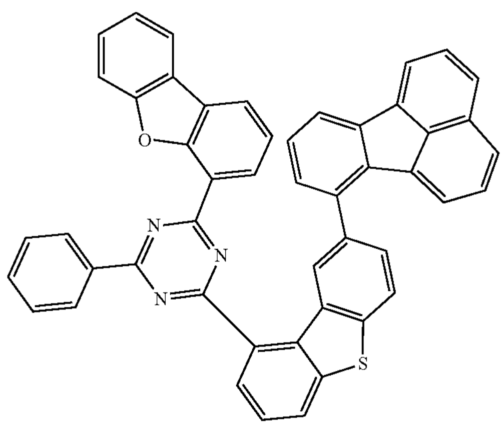
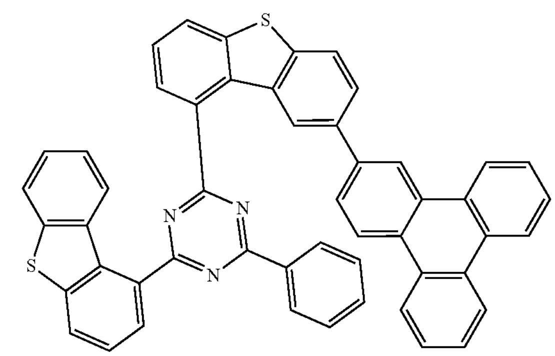
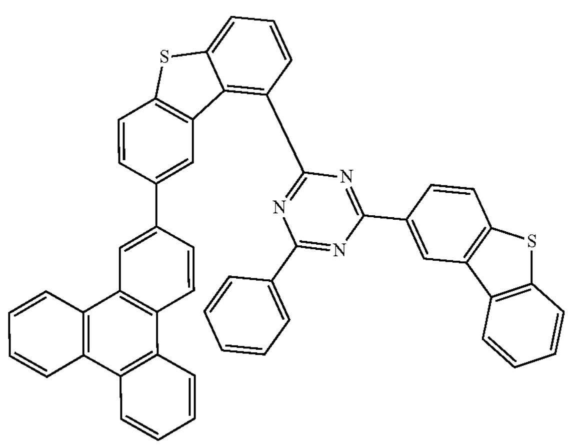
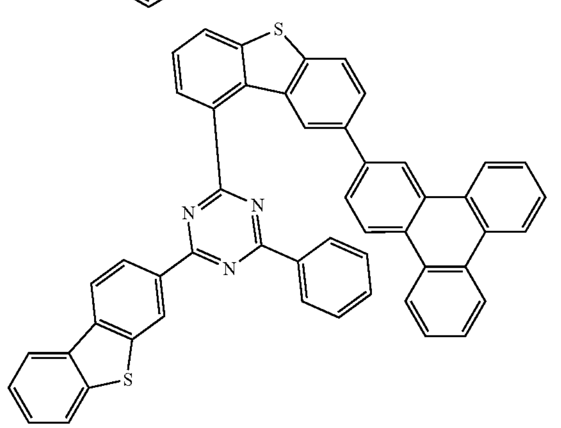
-continued
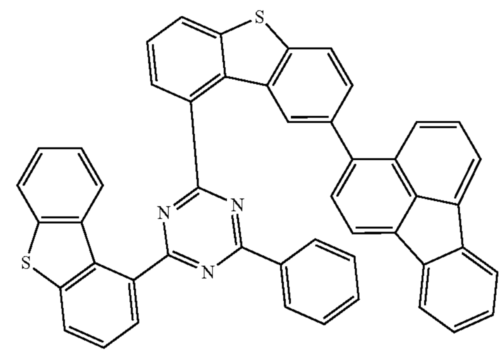
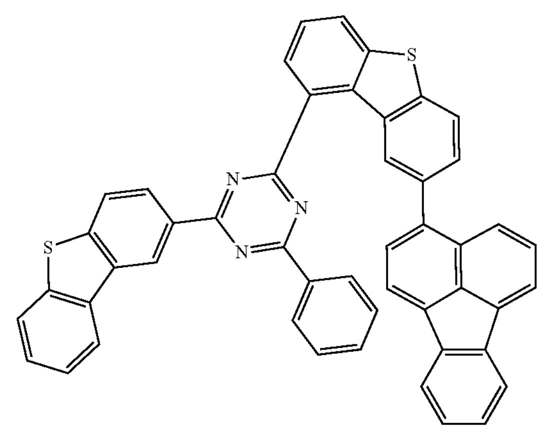
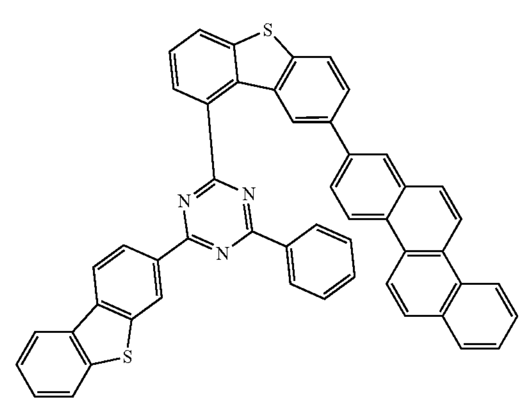

-continued
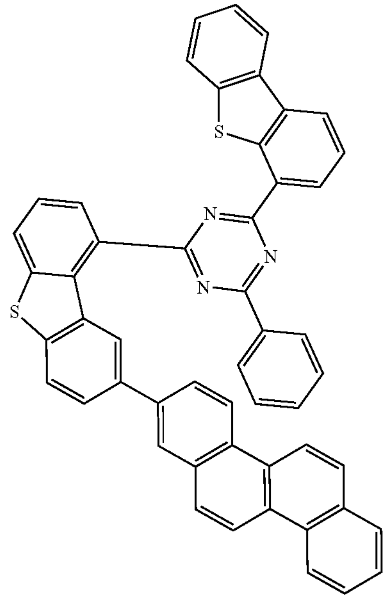
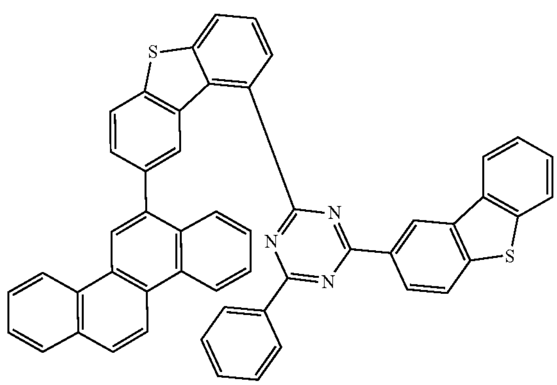
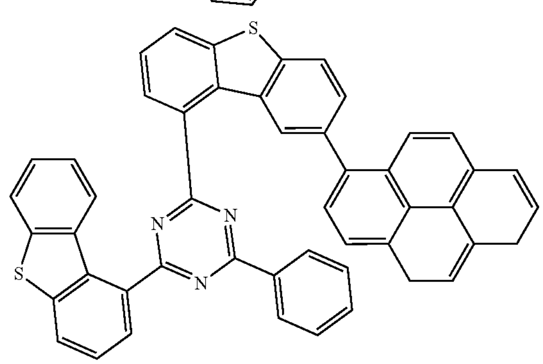
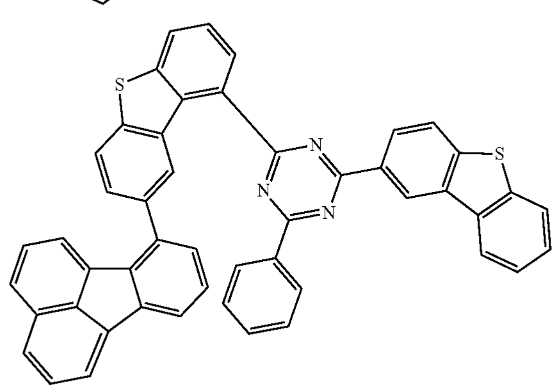
-continued
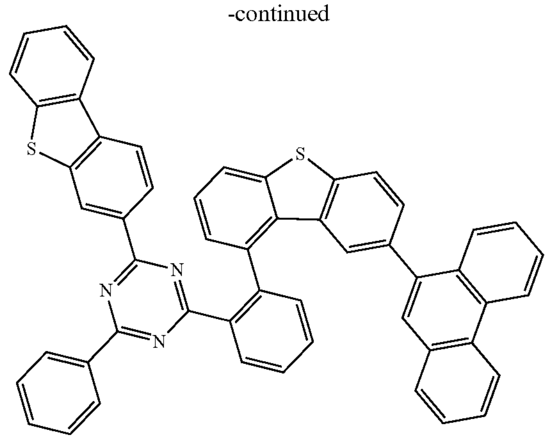
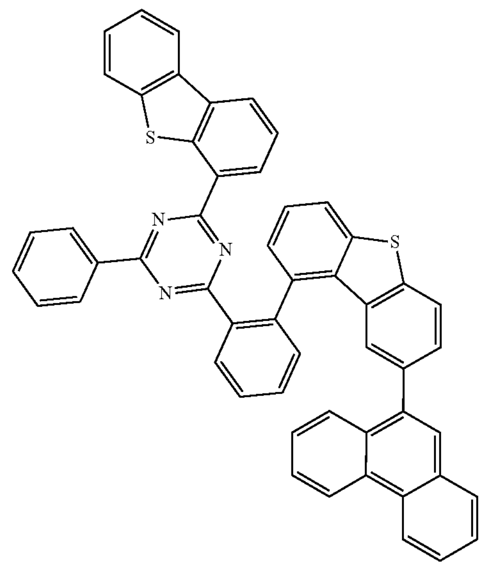
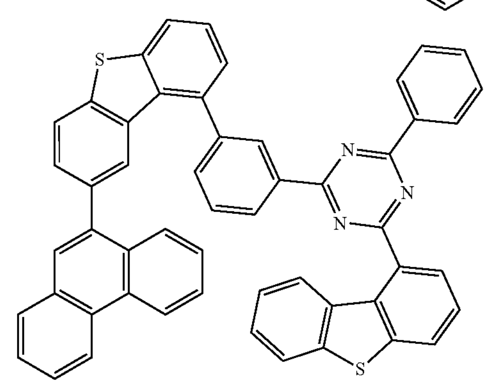
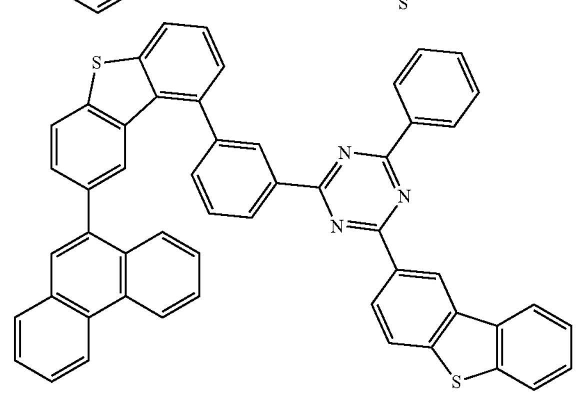

-continued
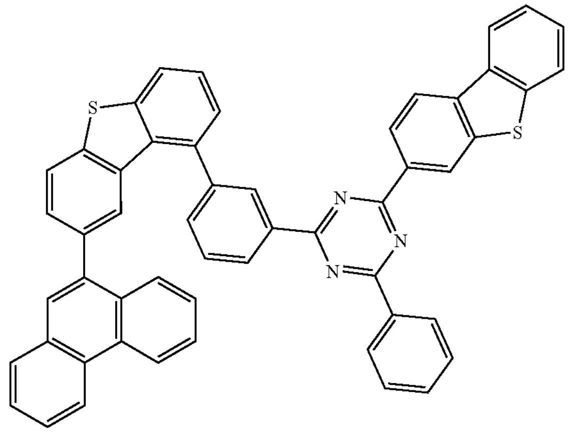
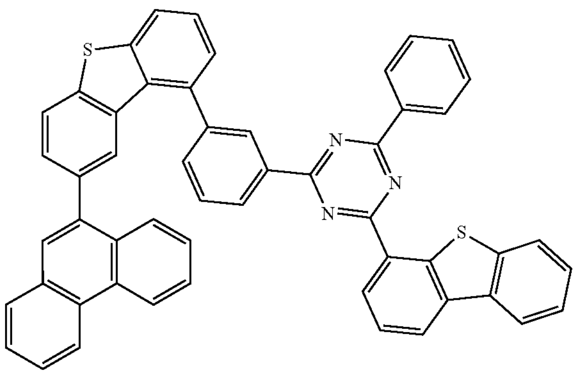
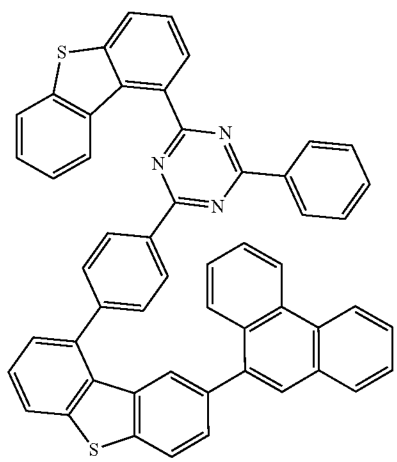
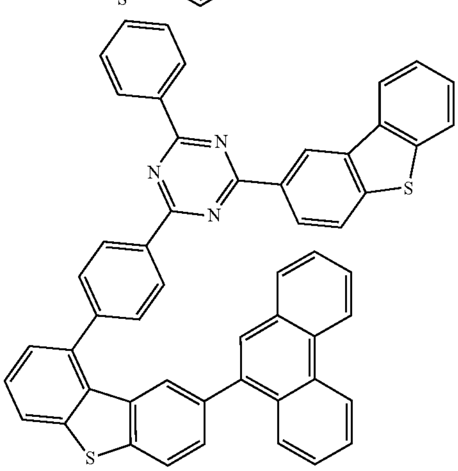
-continued
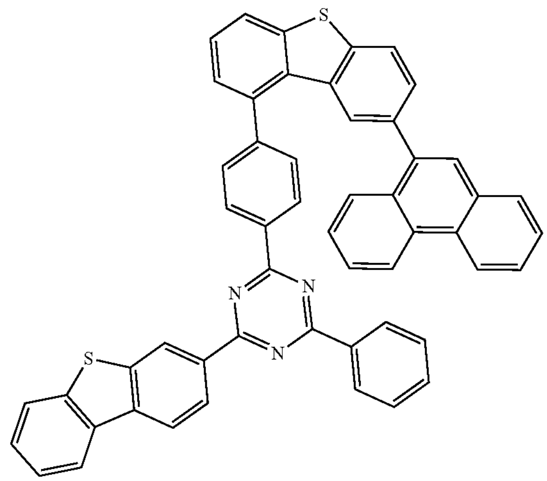
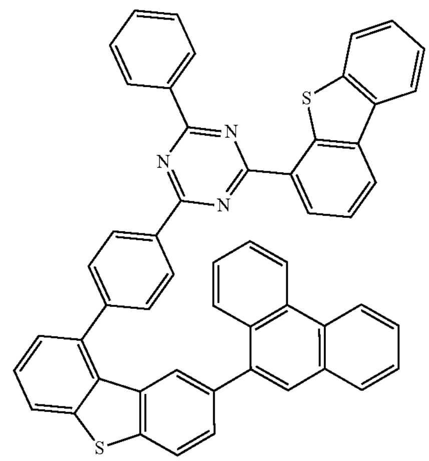
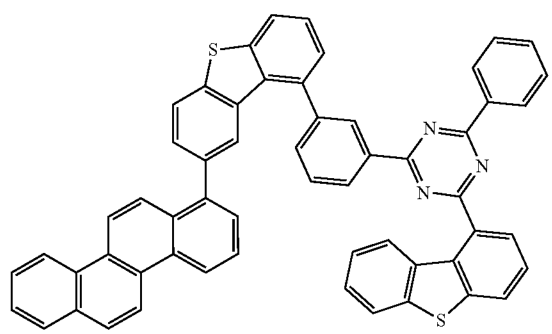
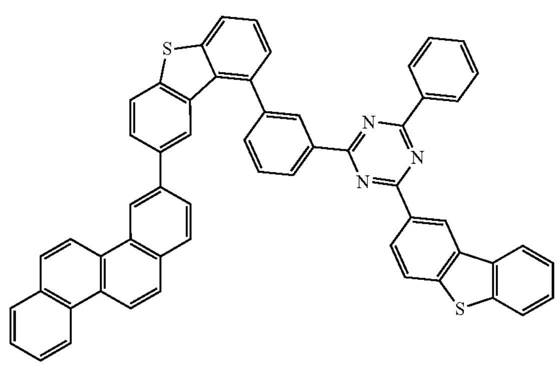

-continued
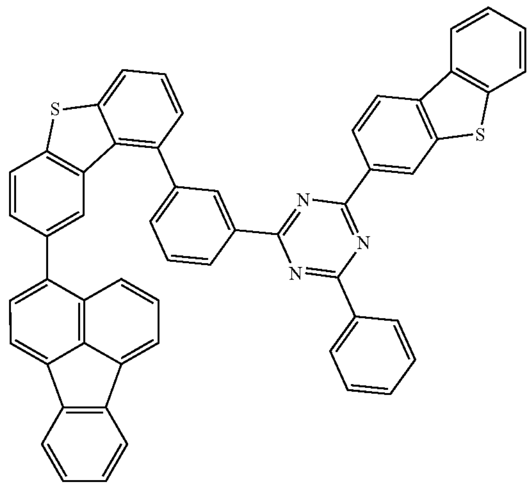
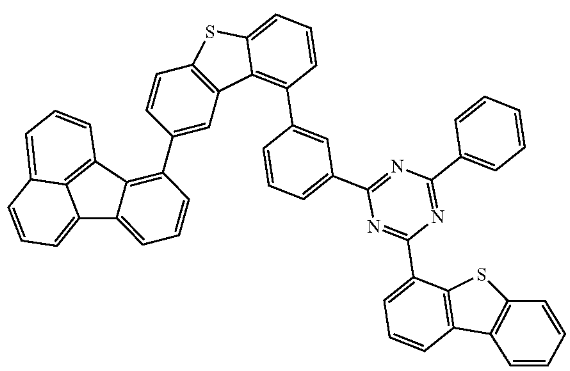
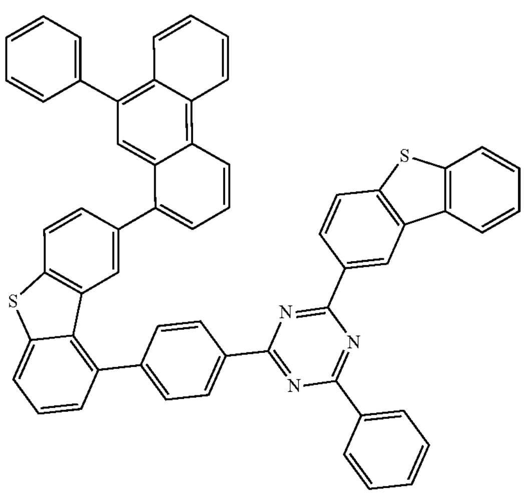
-continued
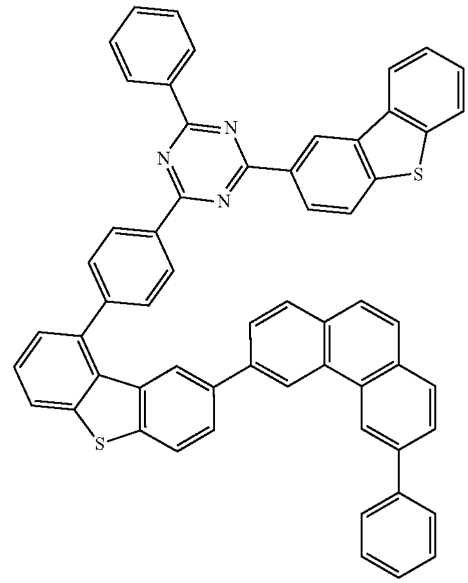
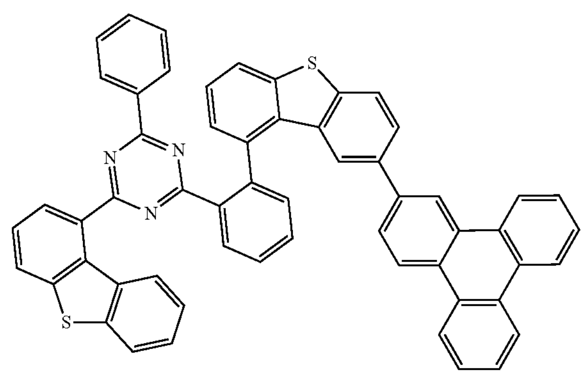
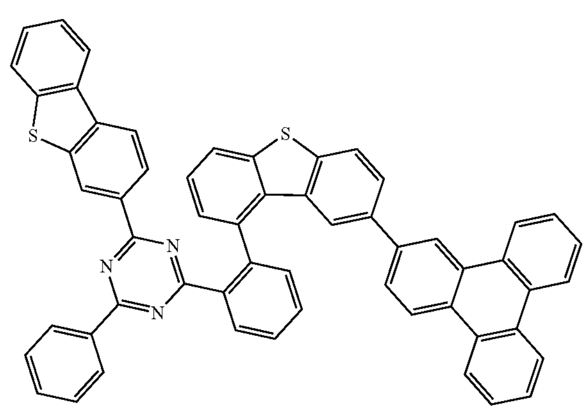

-continued
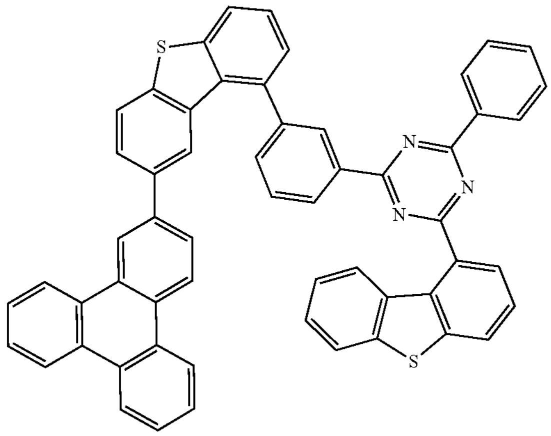
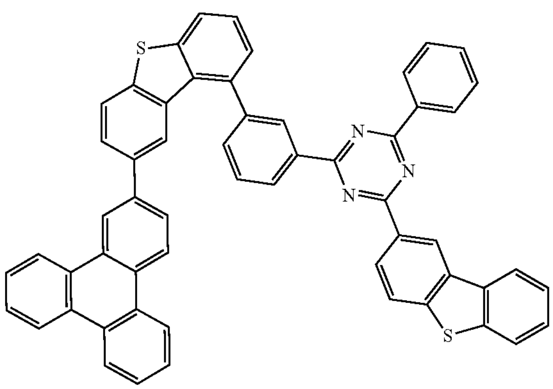
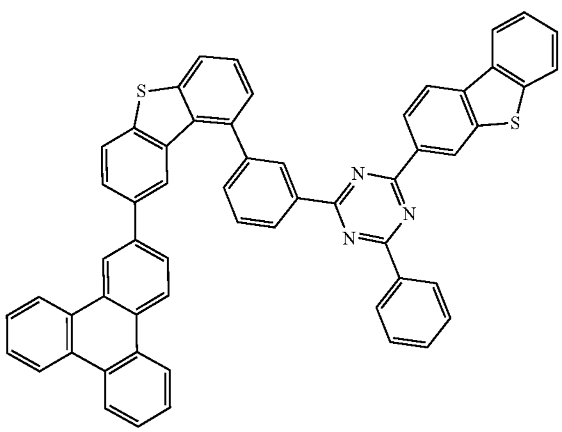
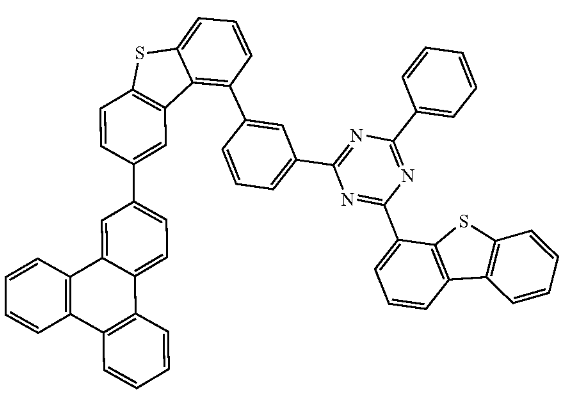
-continued
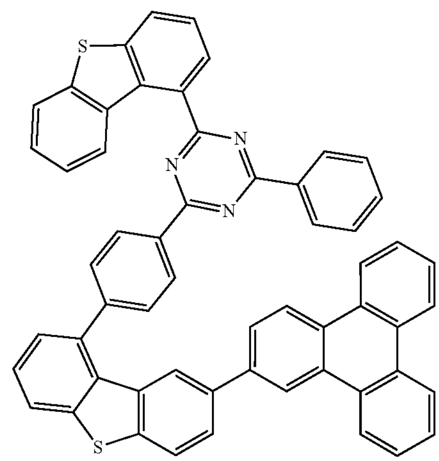
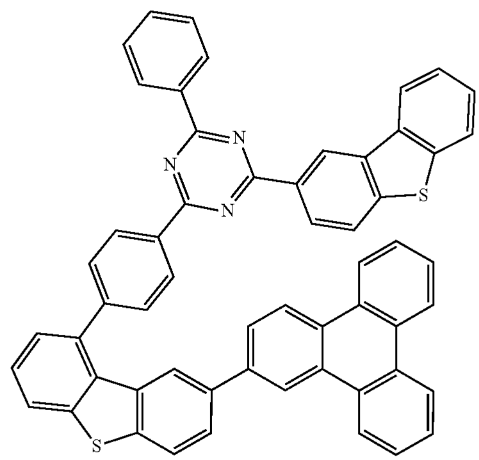
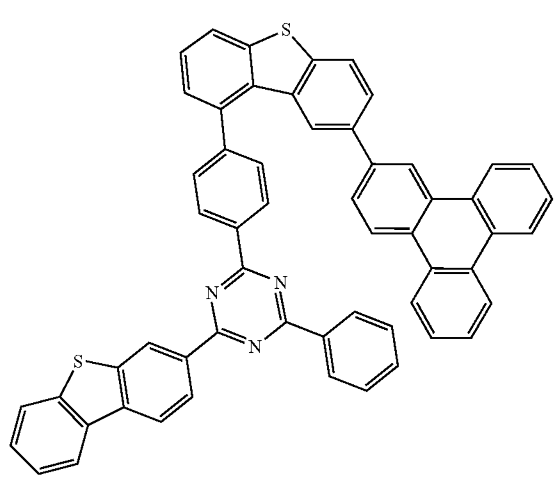

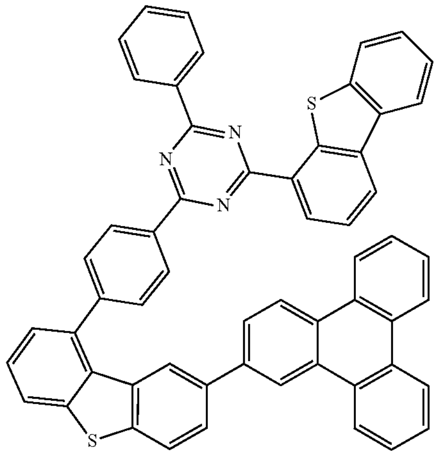
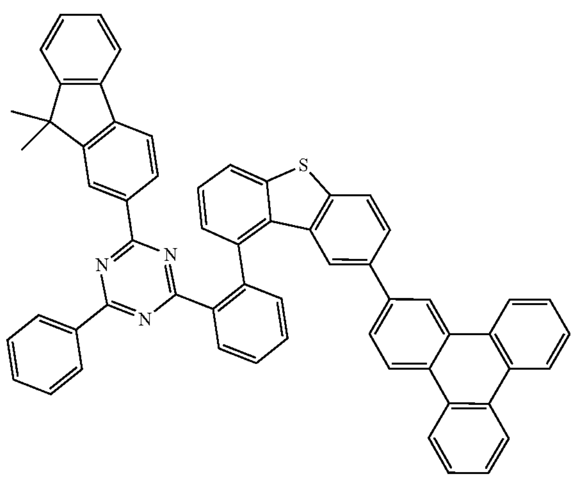
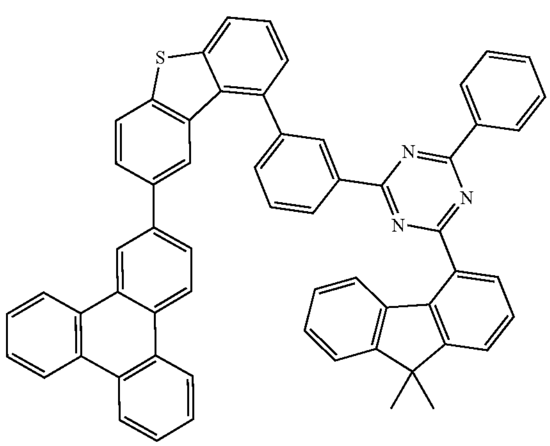
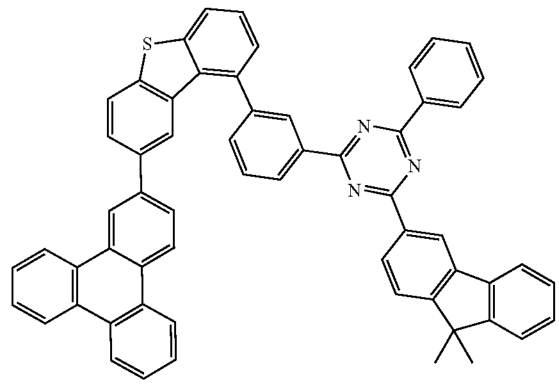
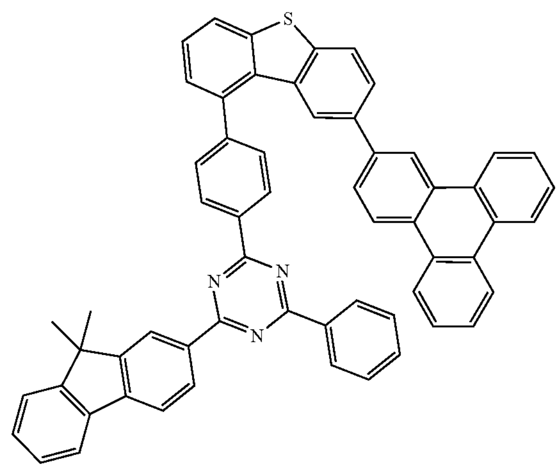
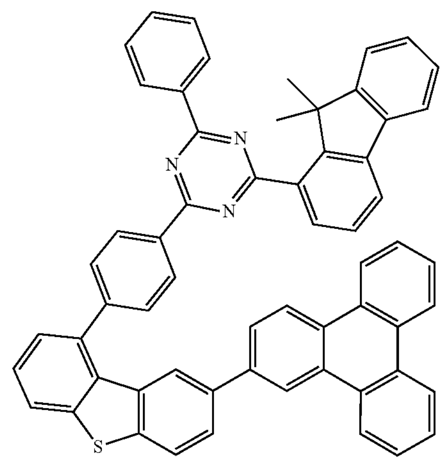
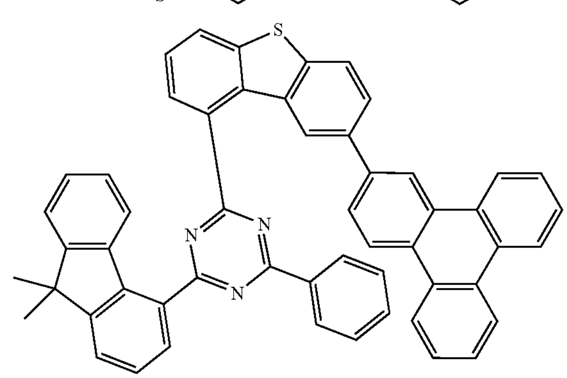

-continued
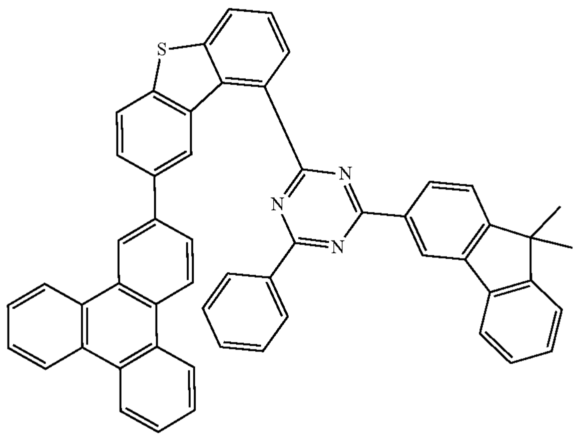
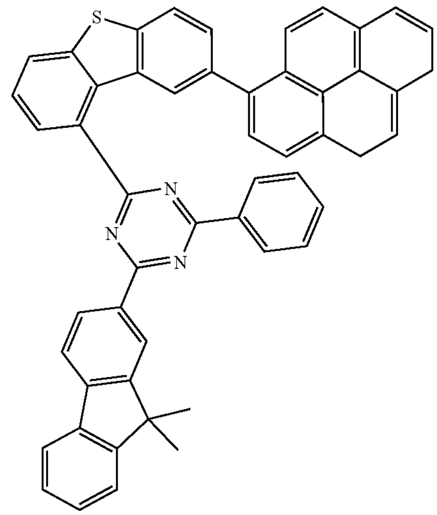
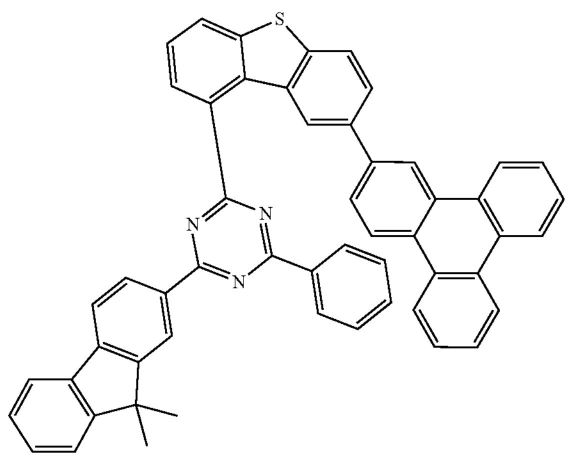
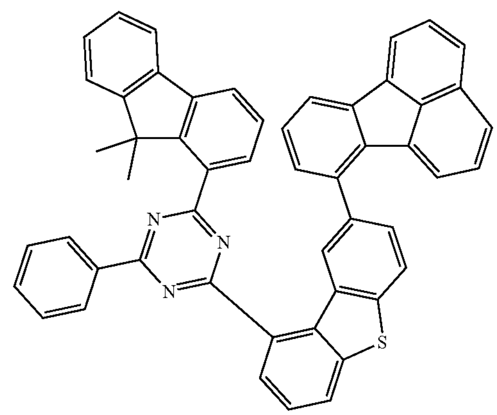
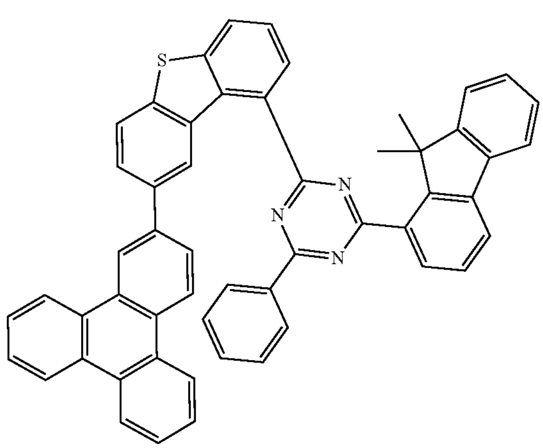
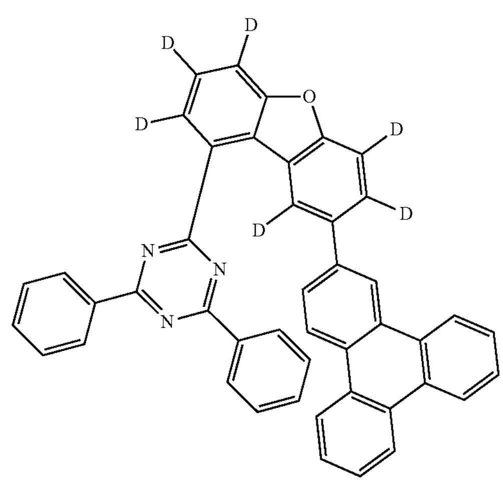

-continued
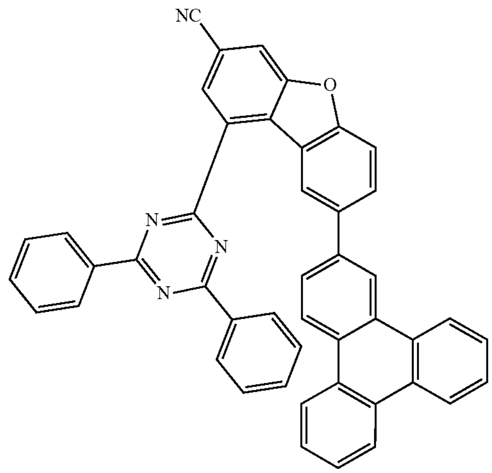
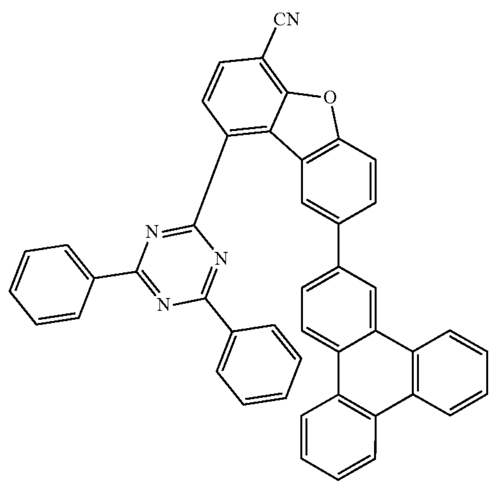
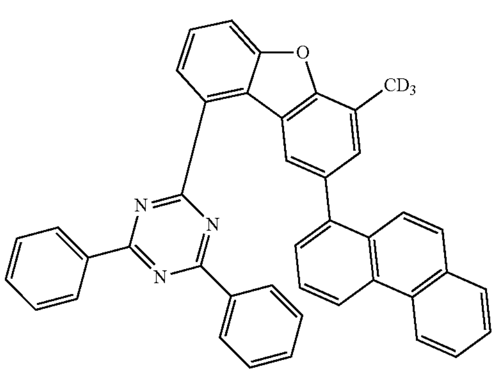
-continued
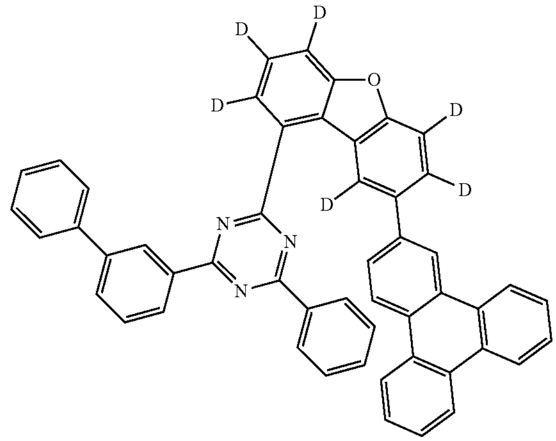
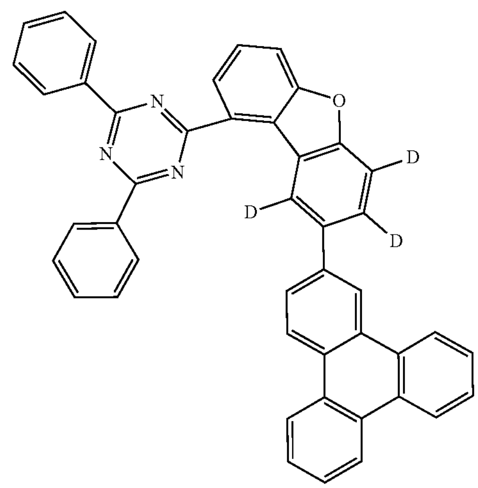
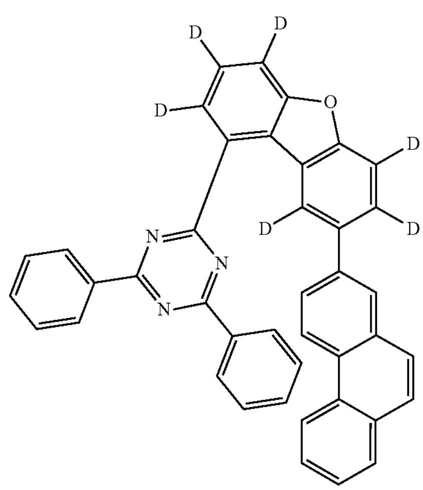

-continued
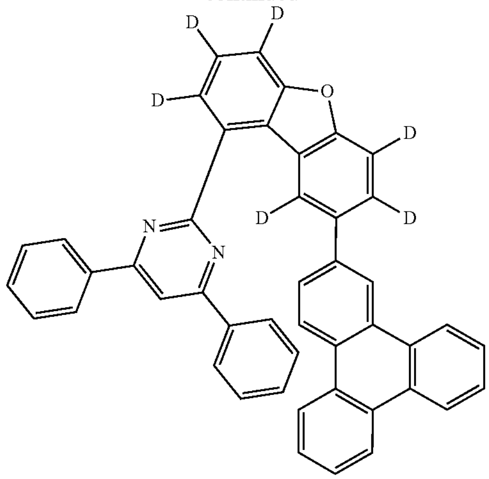
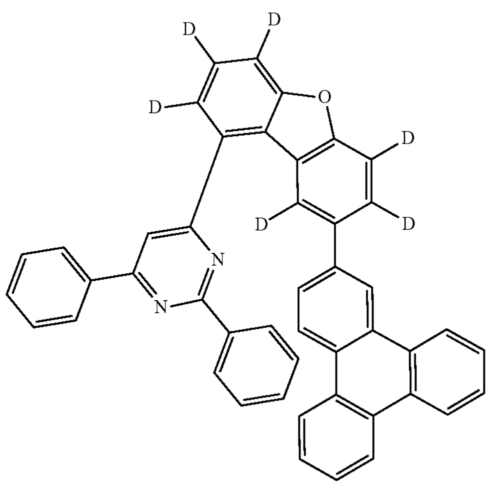
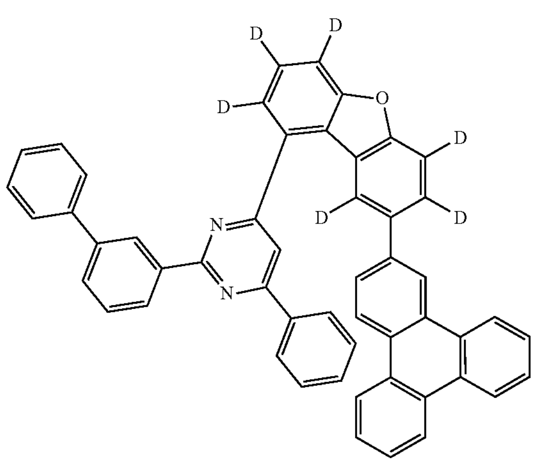
-continued
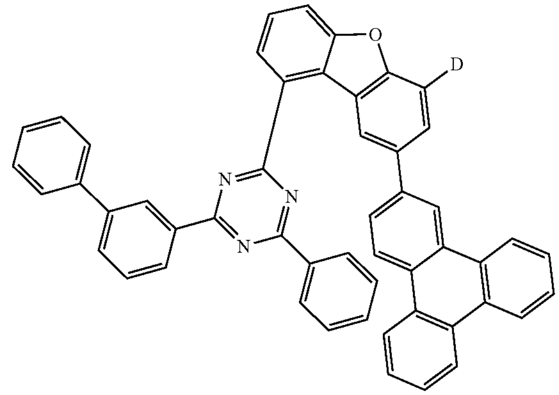
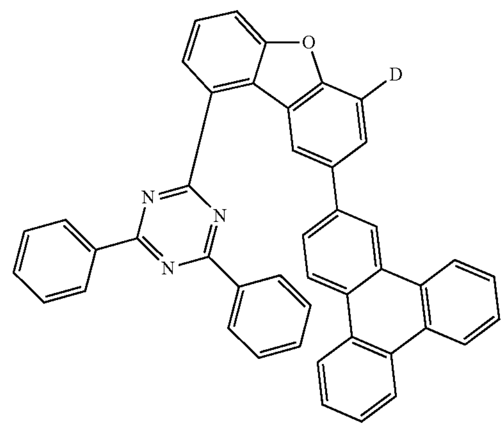
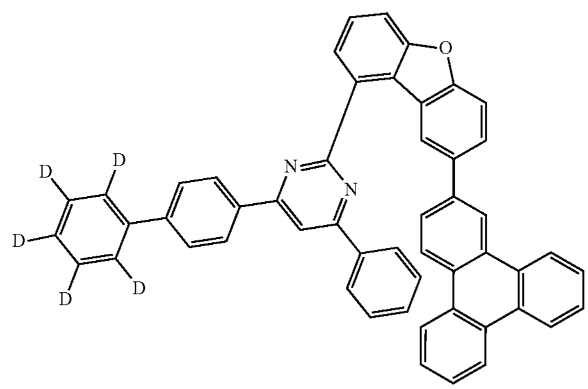
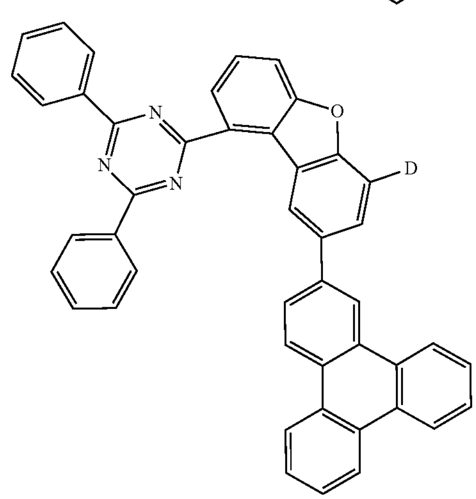

-continued
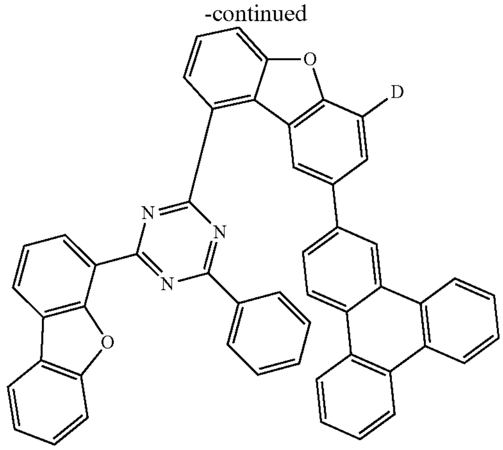
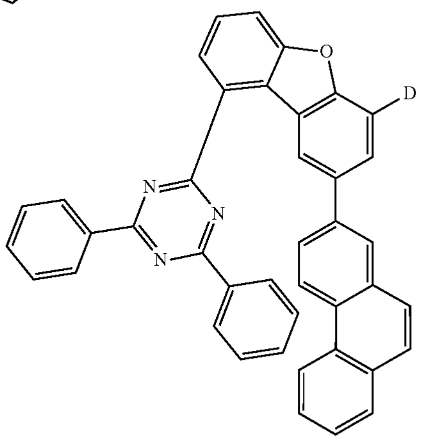
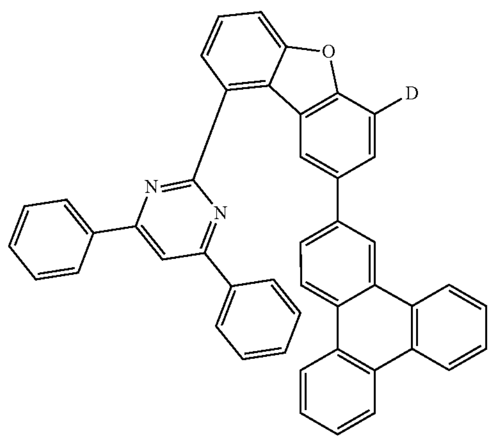
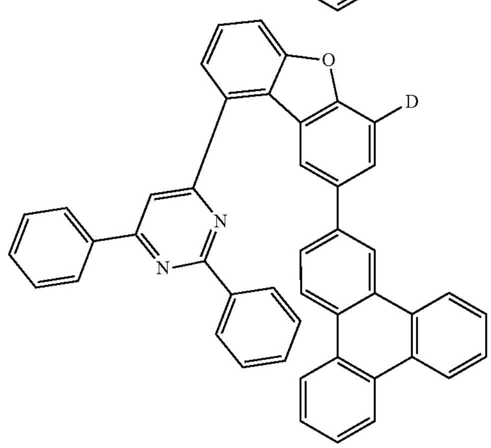
-continued
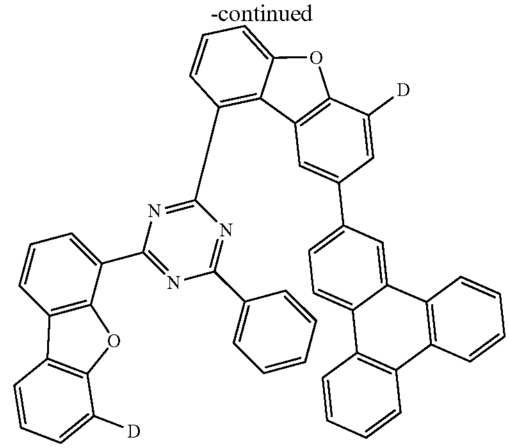
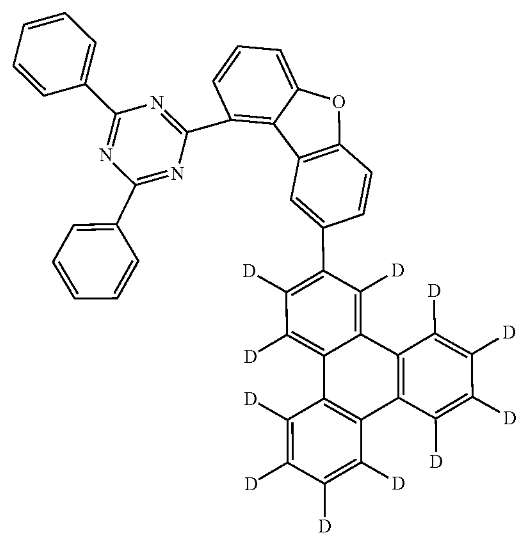
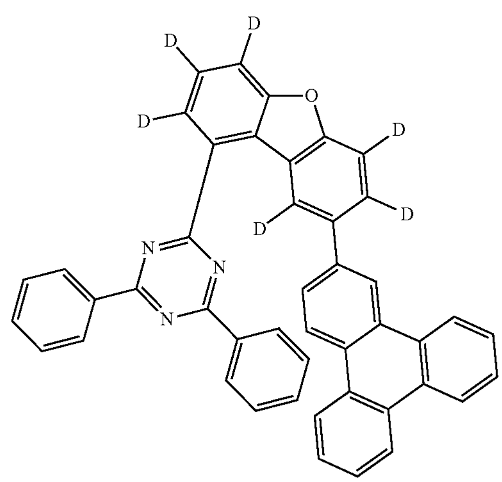

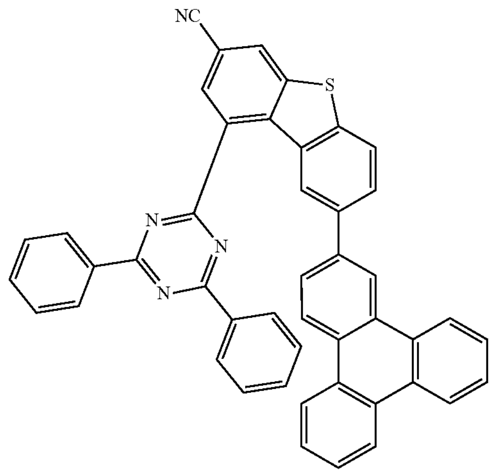
NC
S
N
N
N
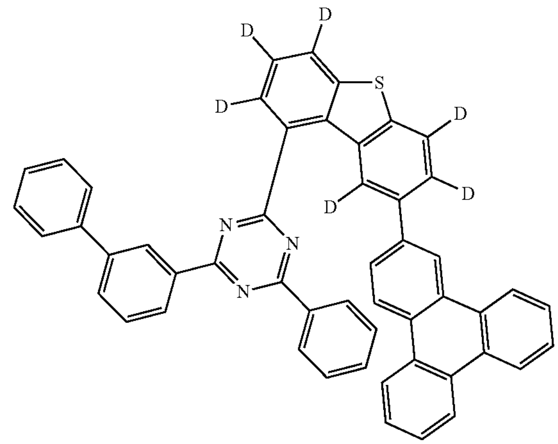
D
D
D
S
D
D
D
N
N
N
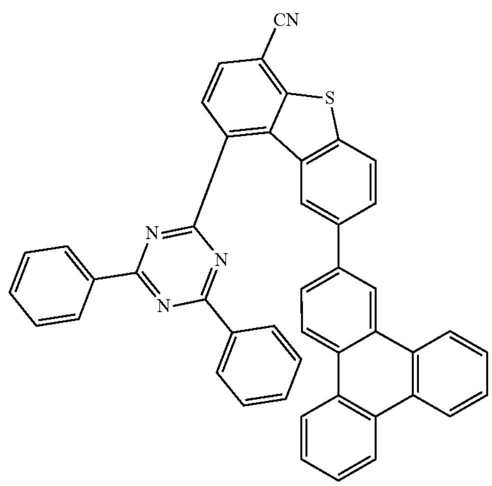
CN
S
N
N
N
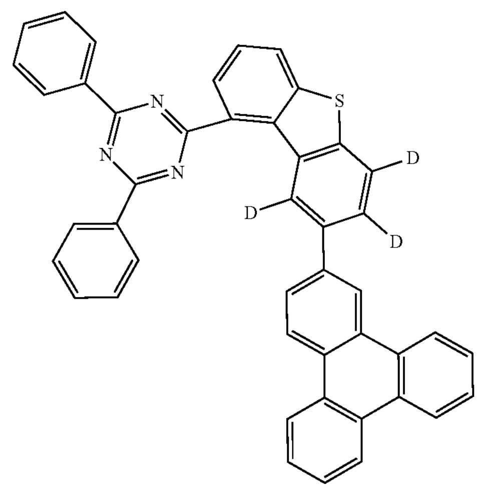
N
N
N
S
D
D
D
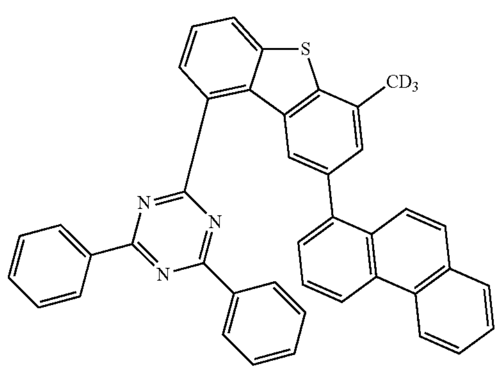
S
$CD_3$
N
N
N
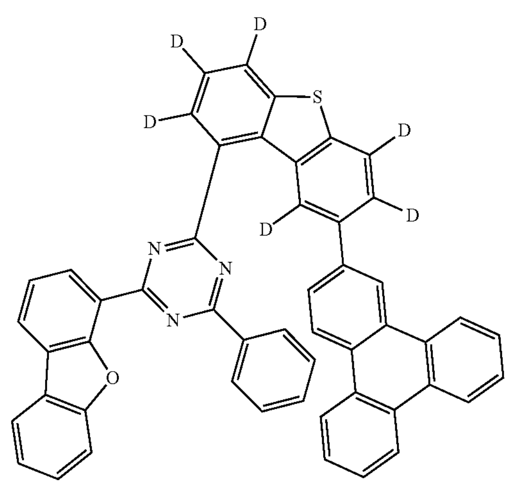
D
D
D
S
D
D
D
N
N
N
O -continued
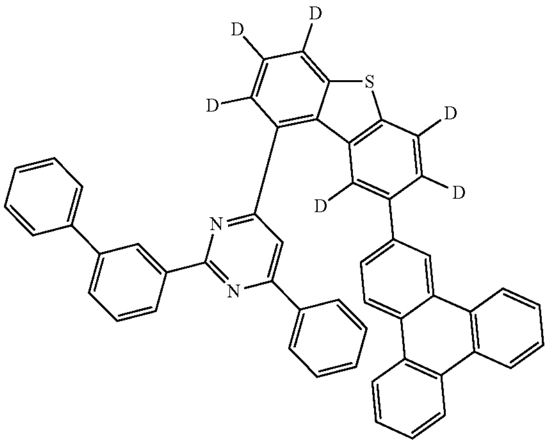
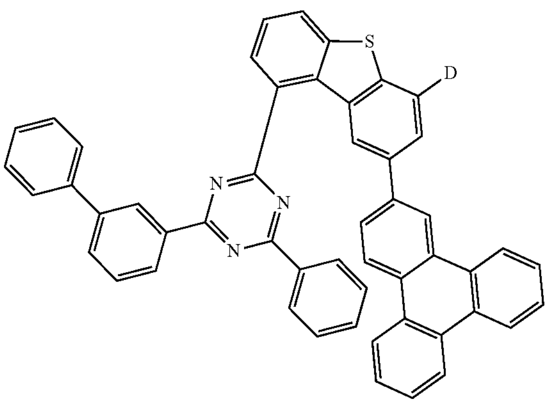
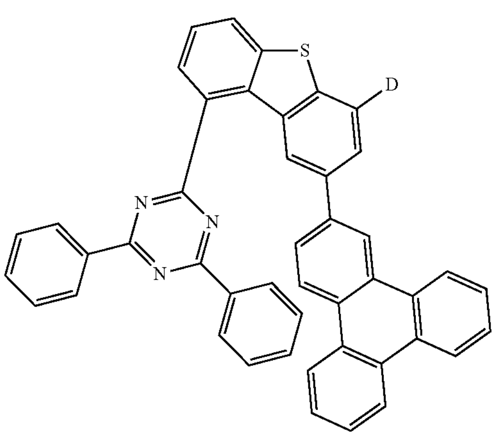
-continued
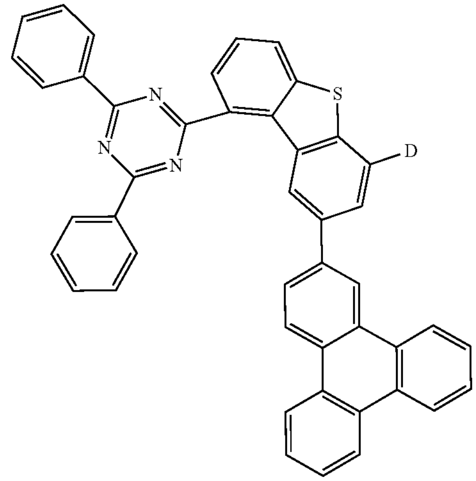
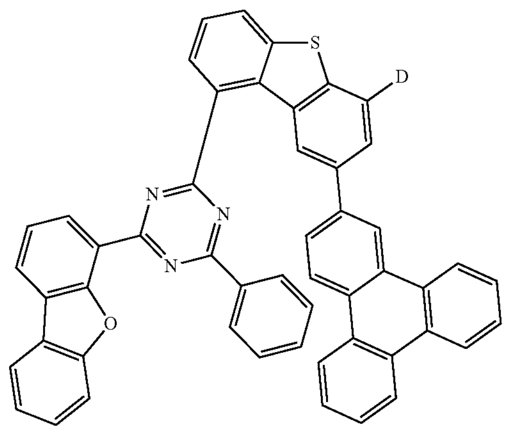
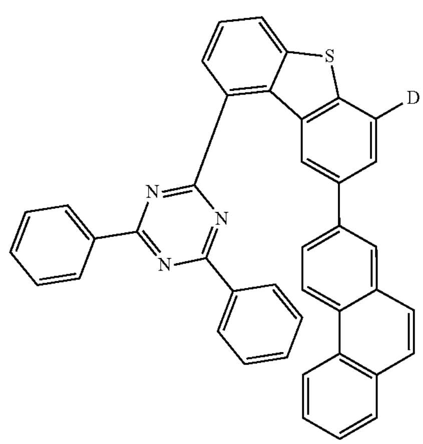

-continued

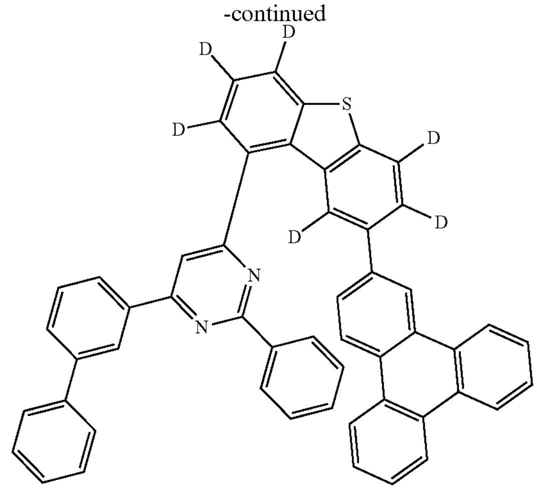

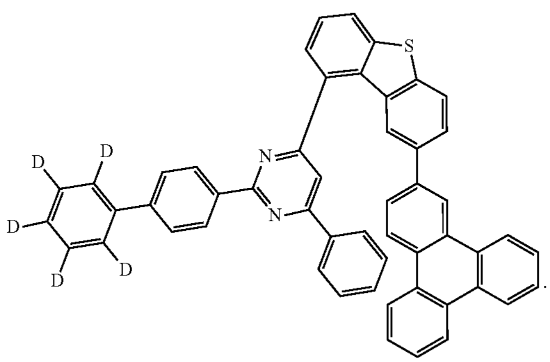

11. The organic light emitting device according to claim 1, wherein $L_{31}$ is a single bond or phenylene.

12. The organic light emitting device according to claim 1, wherein $L_{32}$ is a single bond or phenylene.

13. The organic light emitting device according to claim 1, wherein $R_{31}$ is cyclohexyl, phenyl, phenyl substituted with tert-butyl, phenyl substituted with cyano, biphenylyl, terphenylyl, naphthyl, phenanthrenyl, triphenylenyl, dimethylfluorenyl, dibenzofuranyl, dibenzothiophenyl, or 9-phenylcarbazolyl.

14. The organic light emitting device according to claim 1, wherein $R_{34}$ is phenyl, biphenylyl, terphenylyl, quaterphenylyl, naphthyl, or phenanthrenyl.

15. The organic light emitting device according to claim 1, wherein the compound of Chemical Formula 3 is any one compound selected from the group consisting of the following:

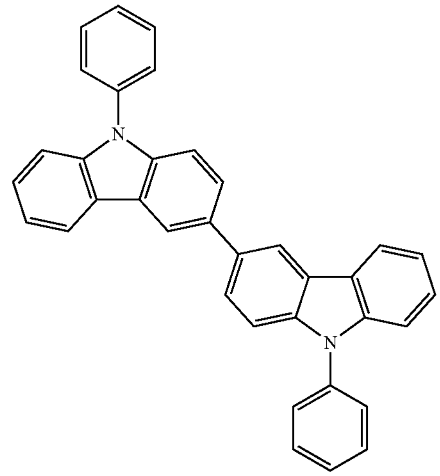

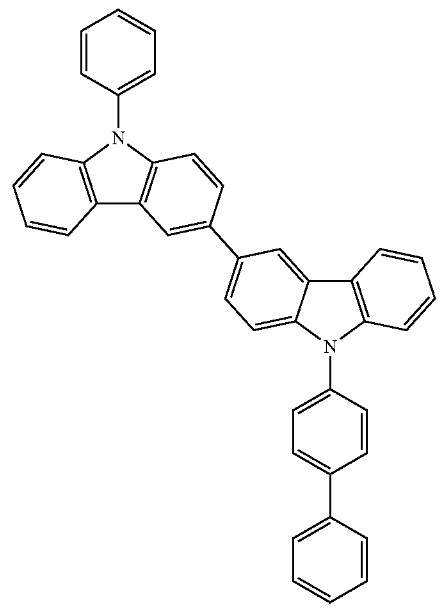

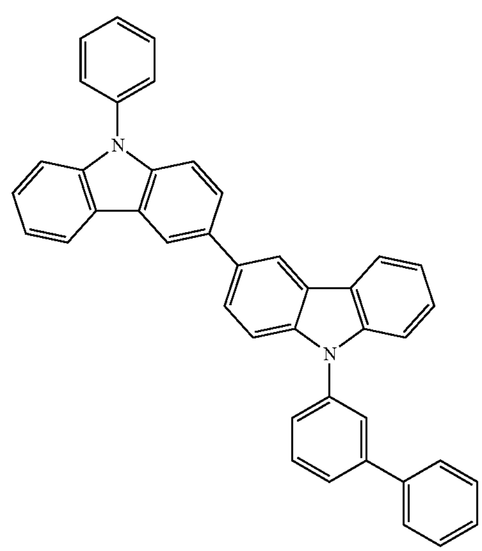

-continued
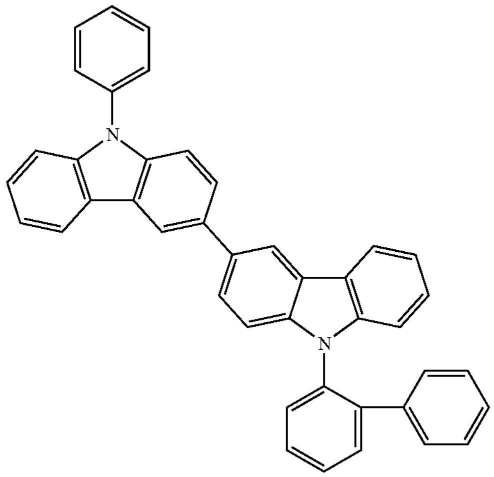
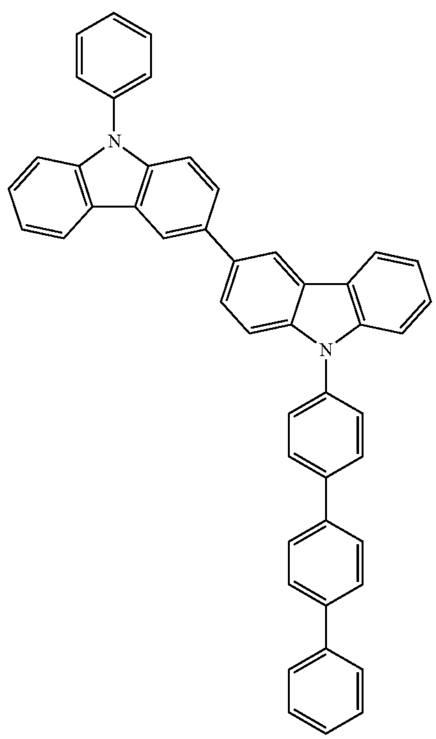
-continued
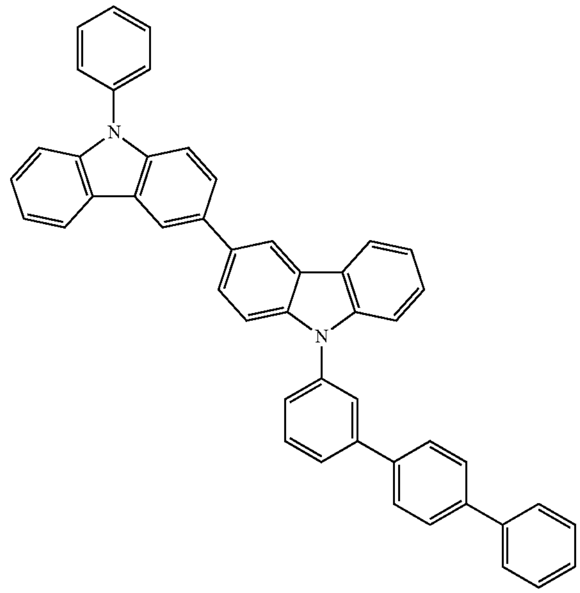
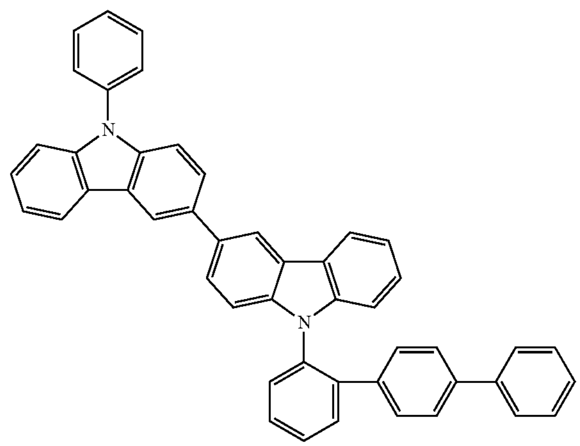
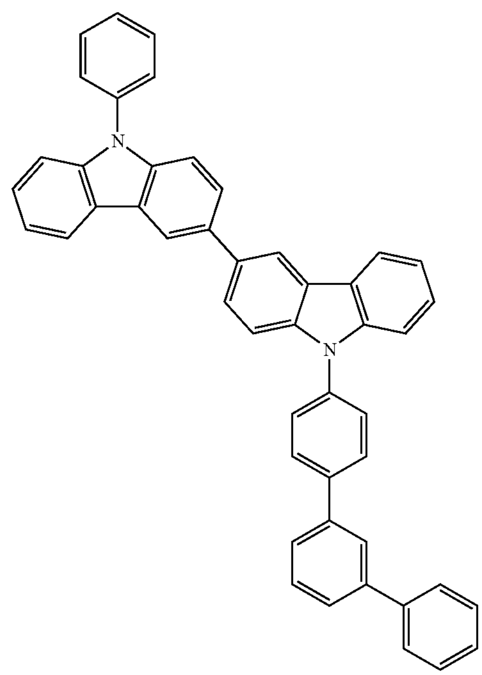

-continued
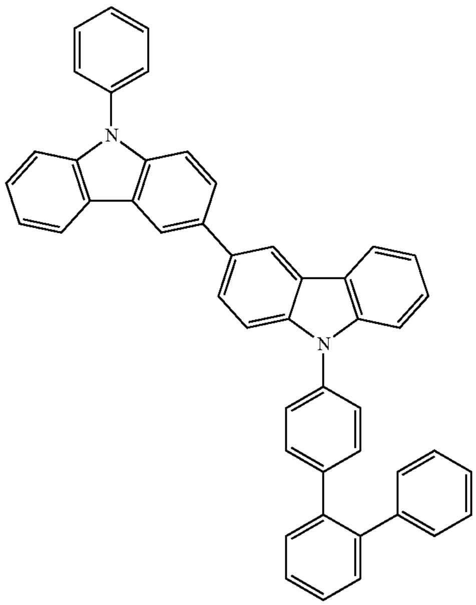
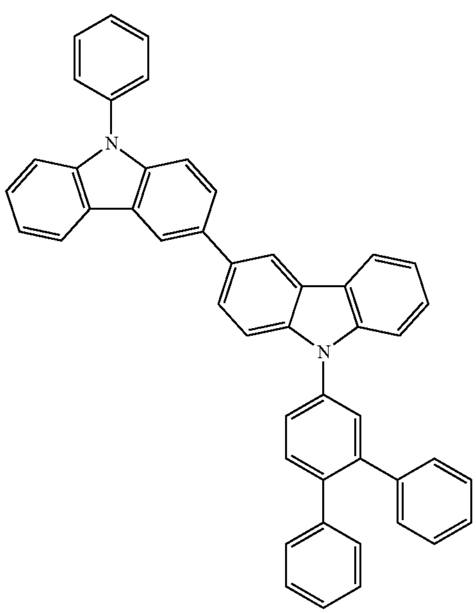
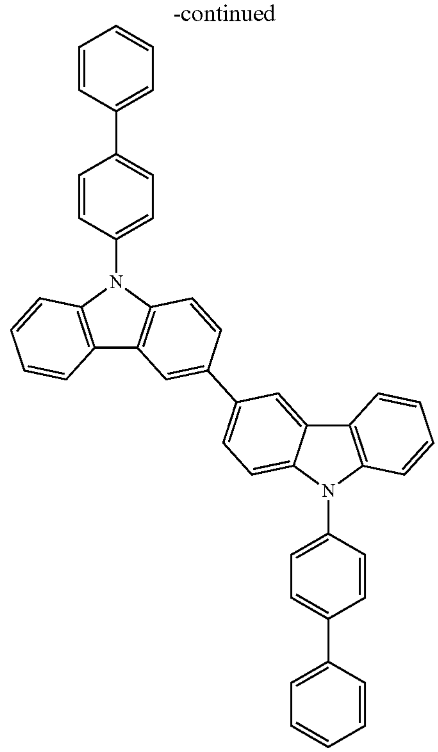
-continued
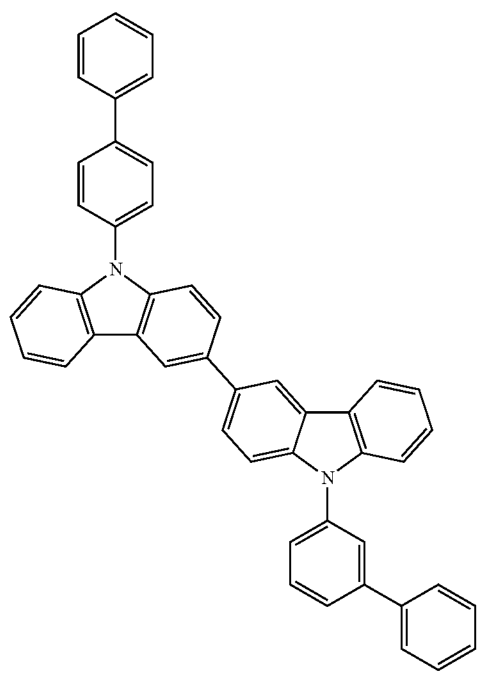

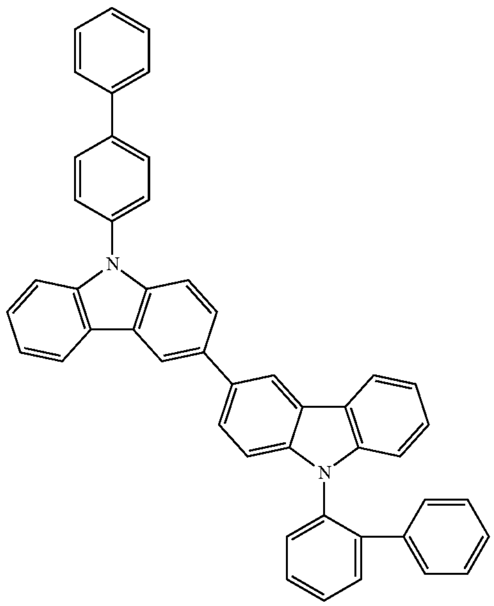
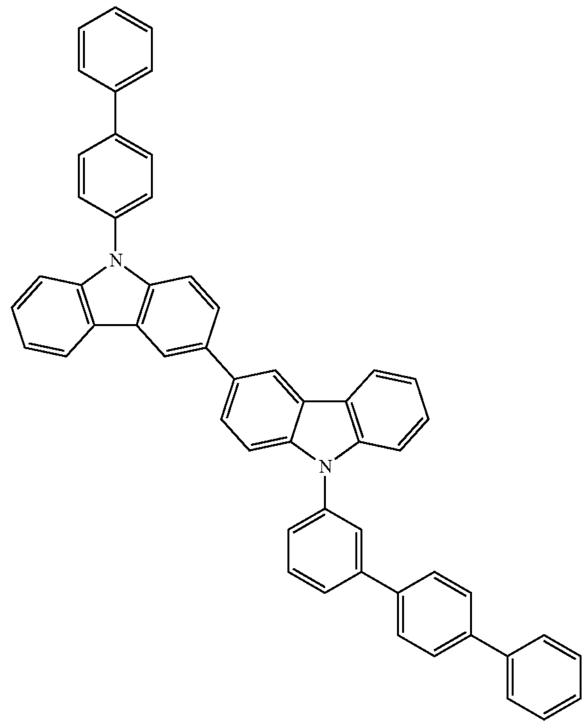
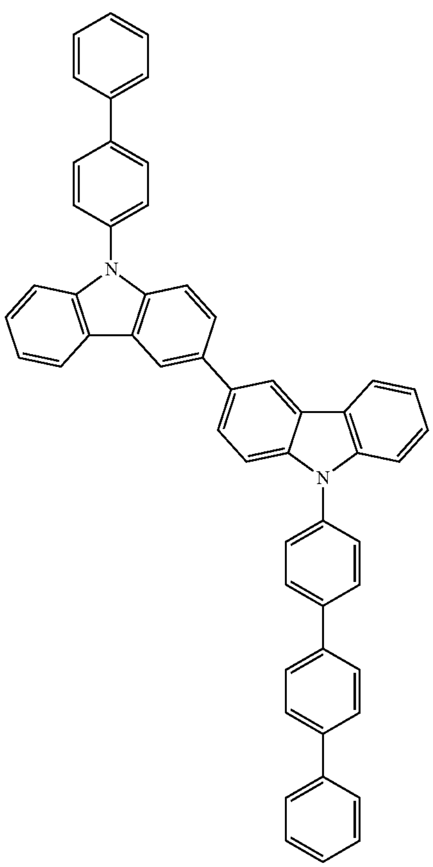
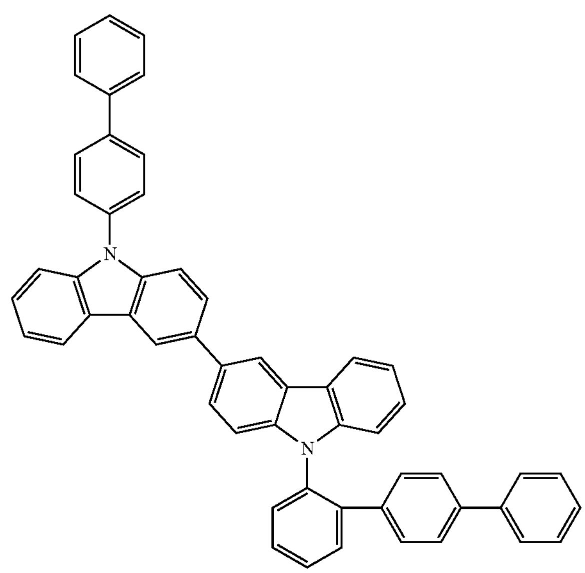

-continued
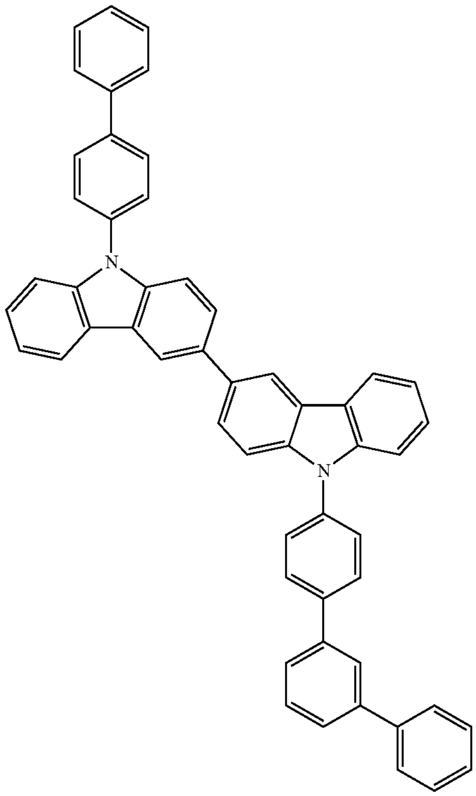
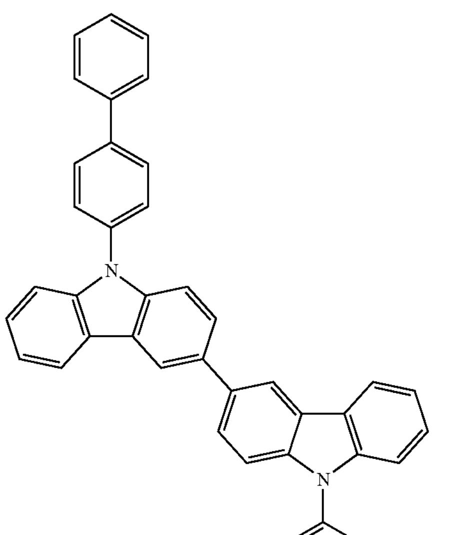
-continued
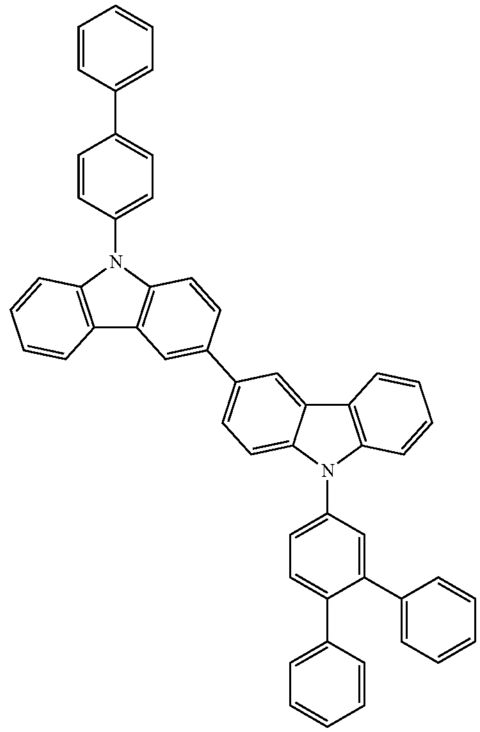
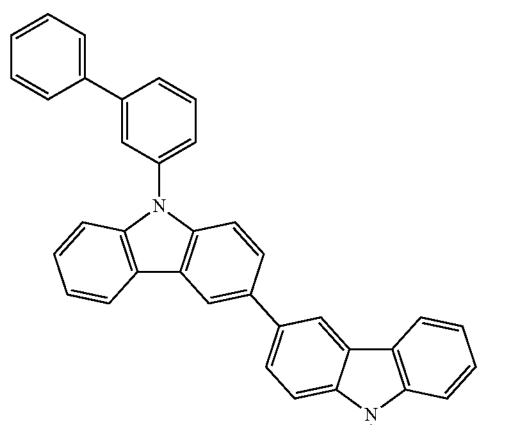

-continued
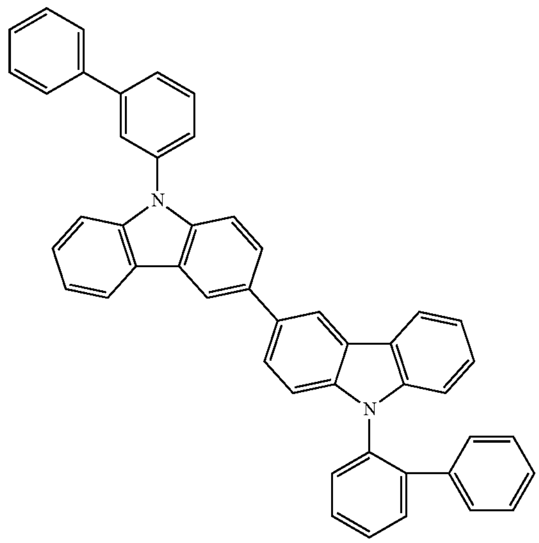
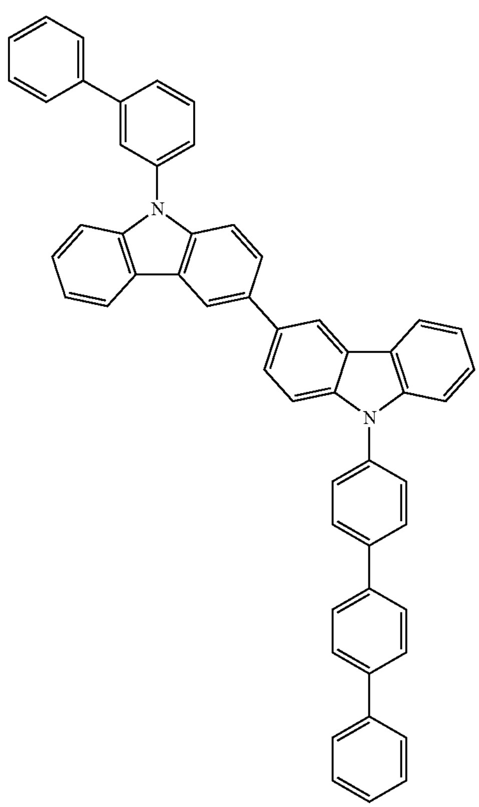
-continued
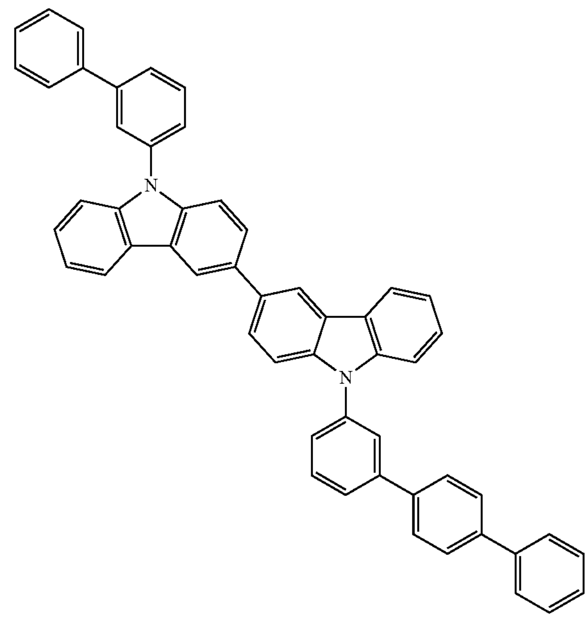
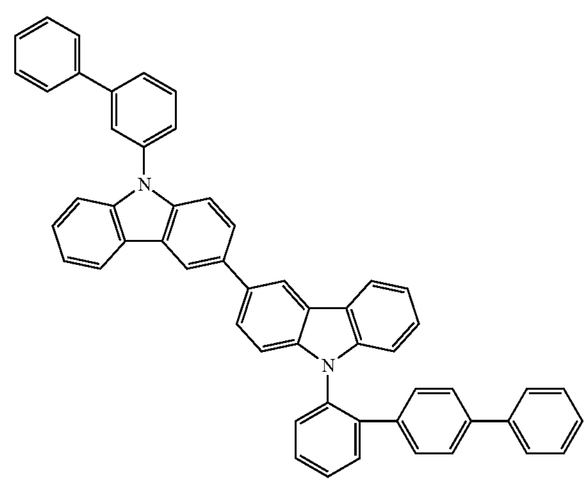

-continued
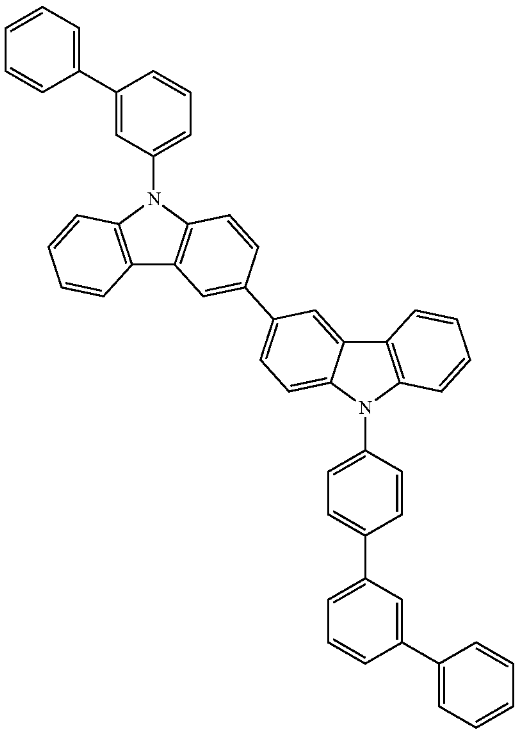
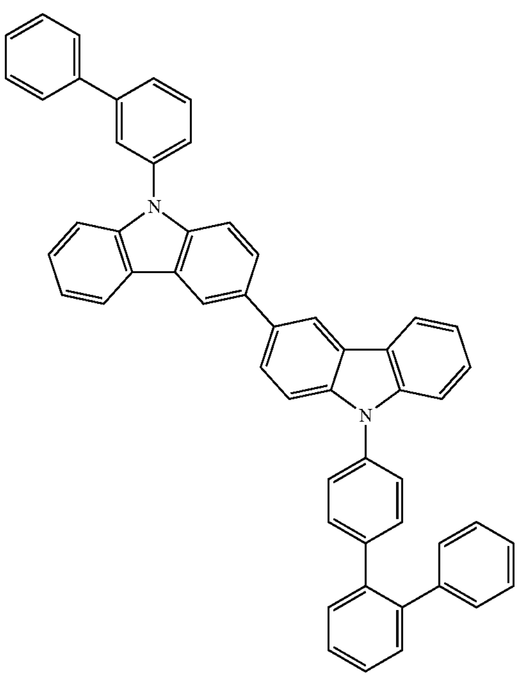
-continued
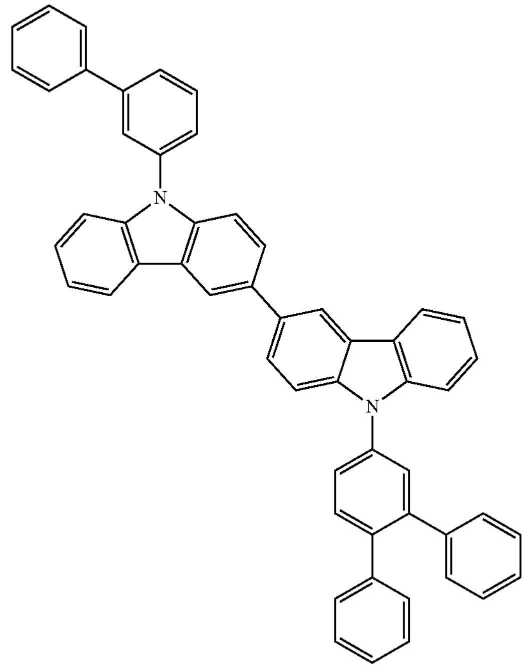
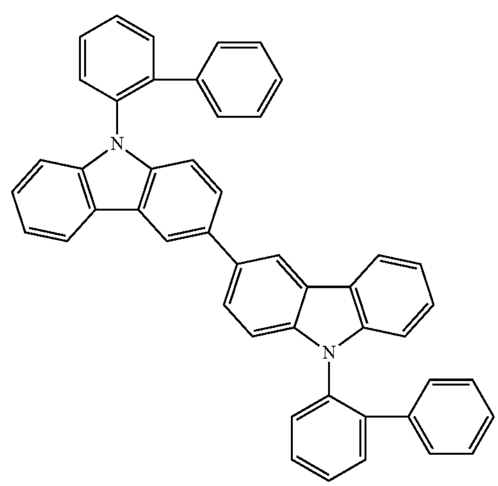

-continued
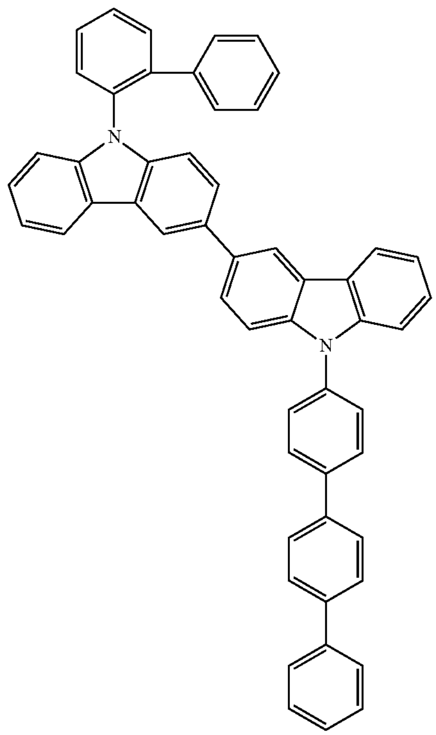
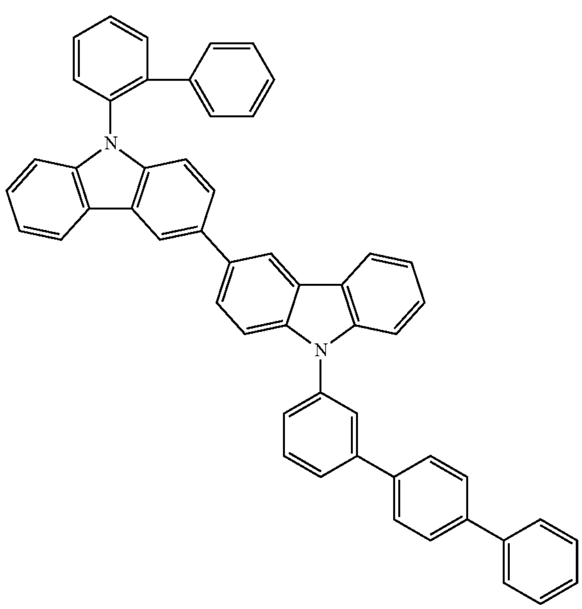
-continued
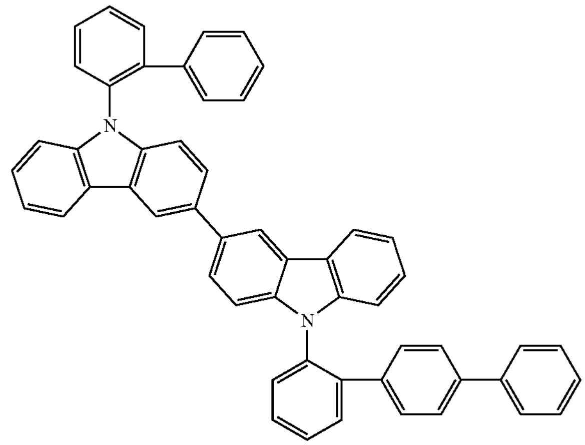
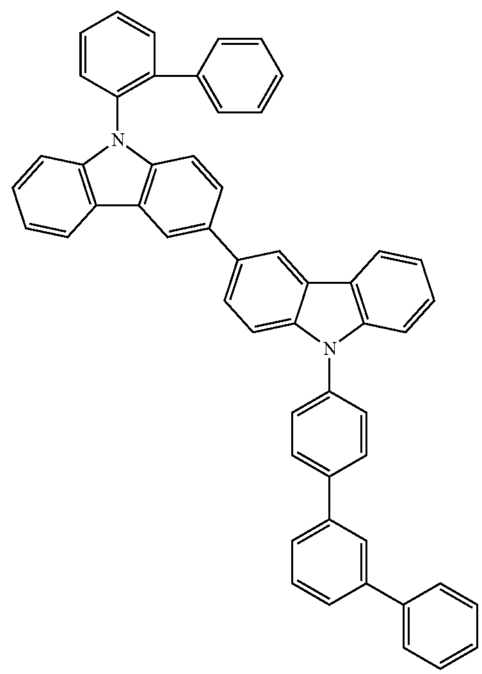
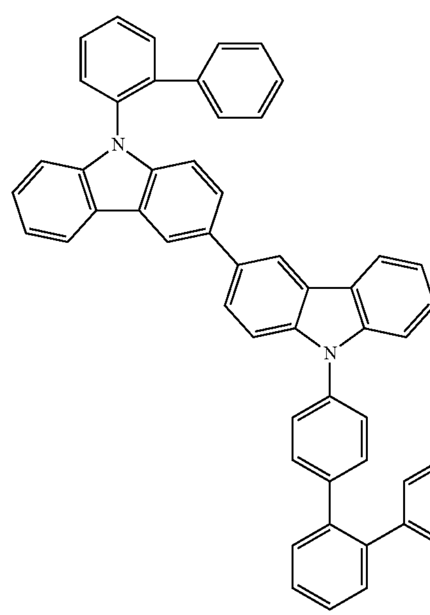

-continued
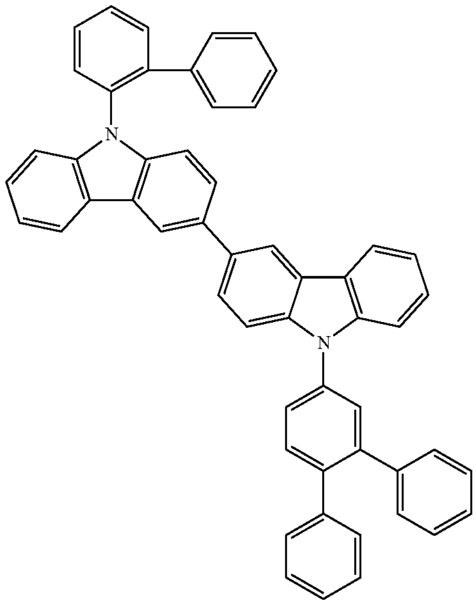
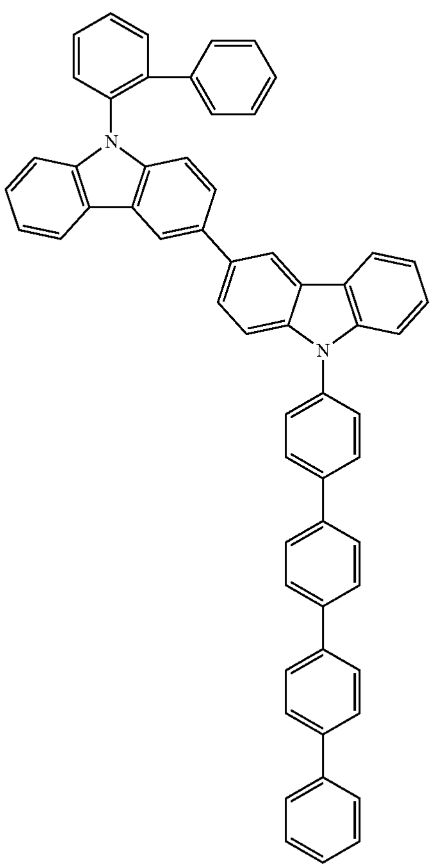
-continued
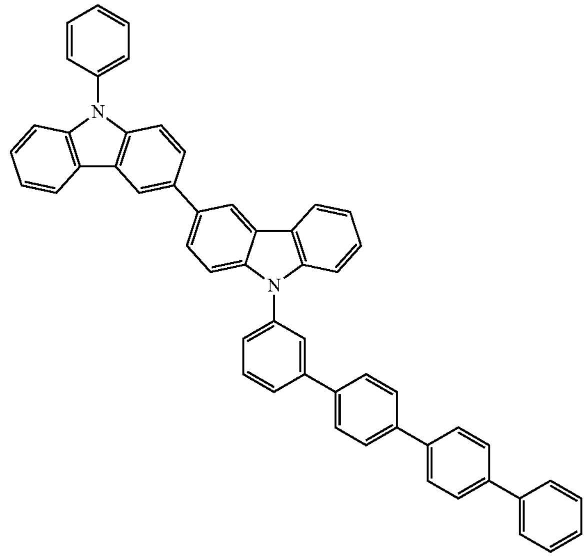
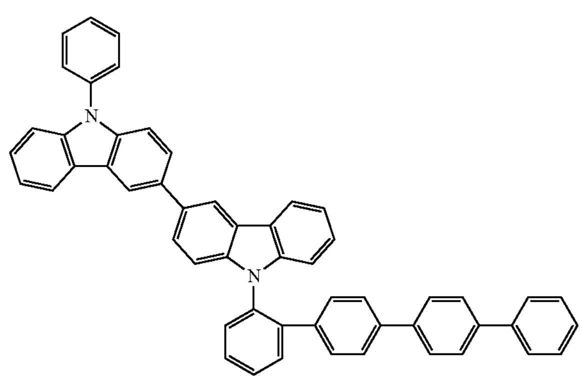

-continued
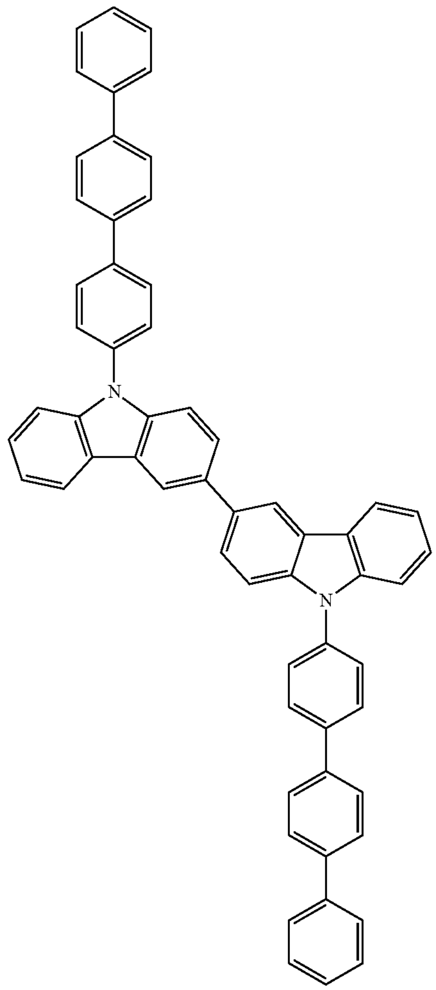
-continued
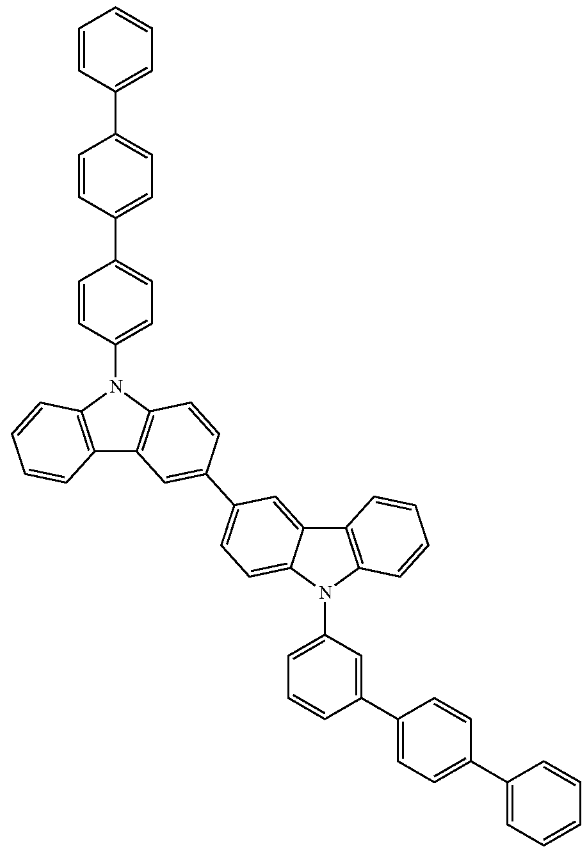
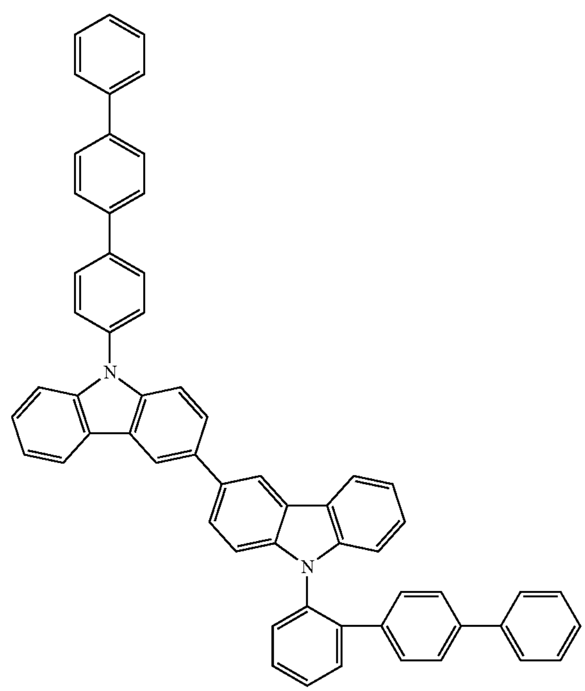

-continued
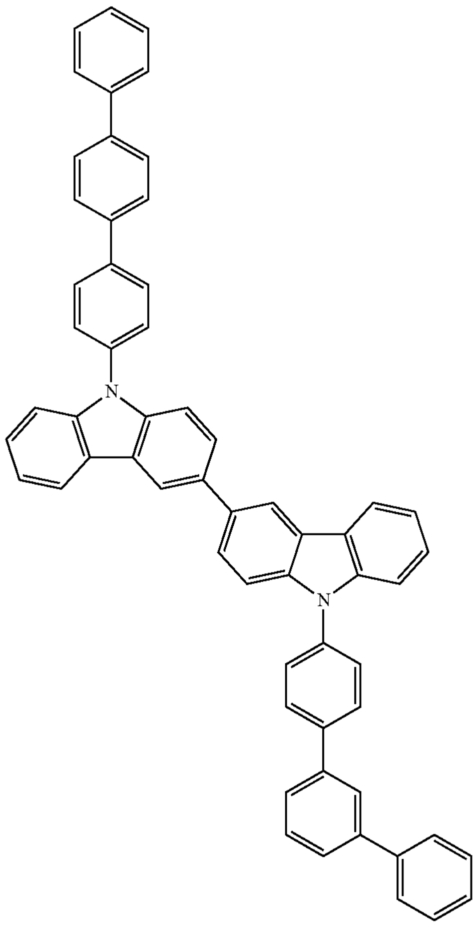
-continued
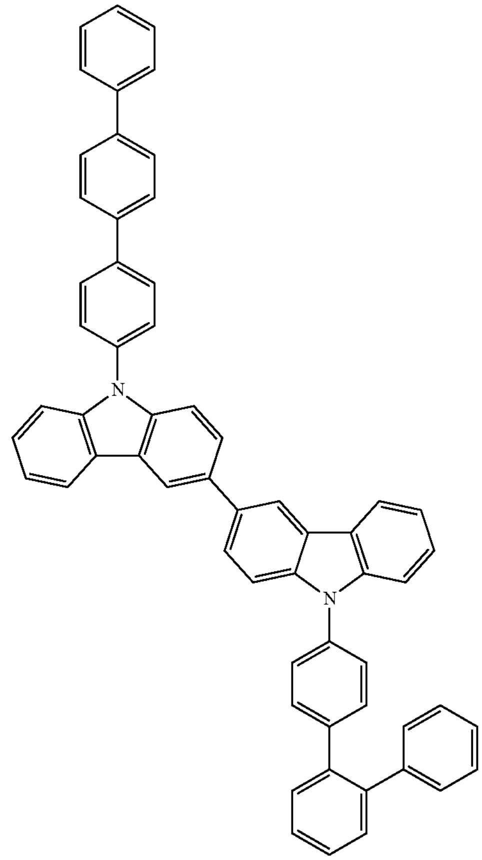
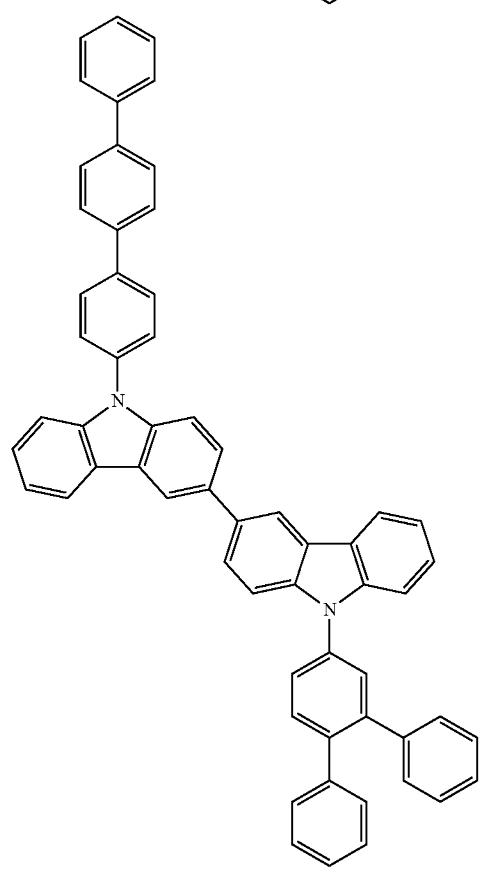

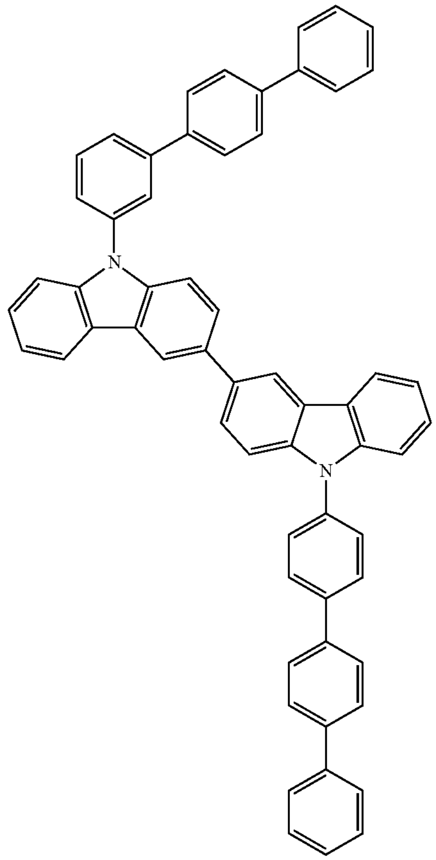
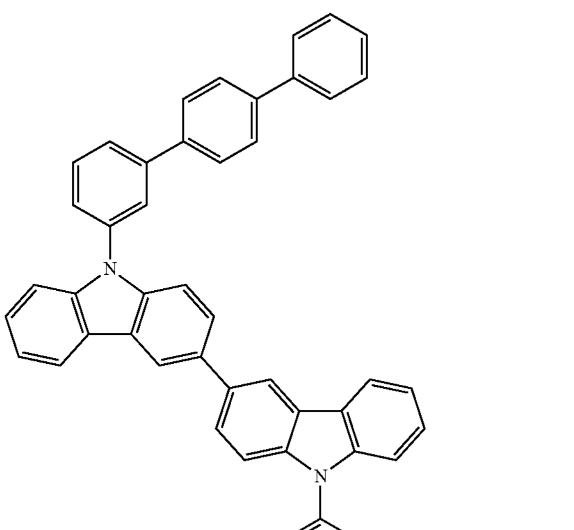
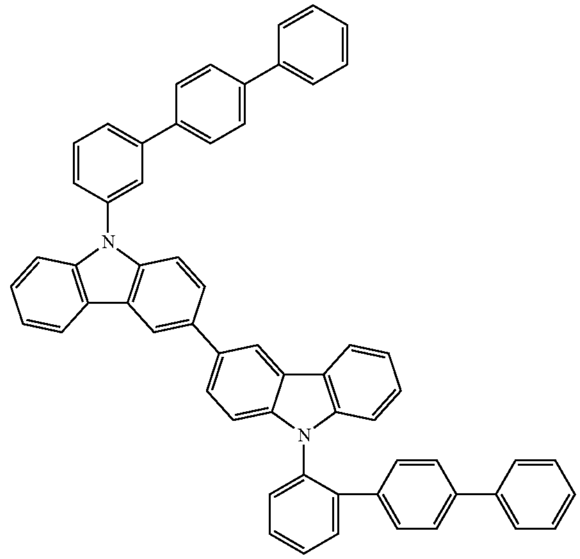
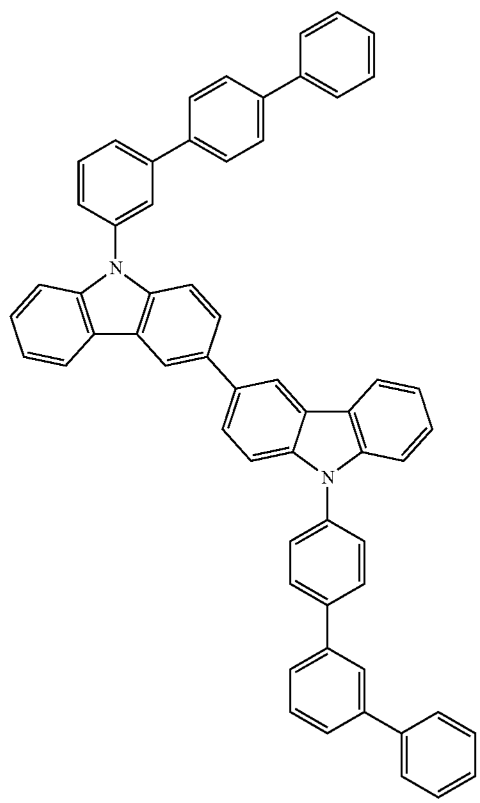

-continued
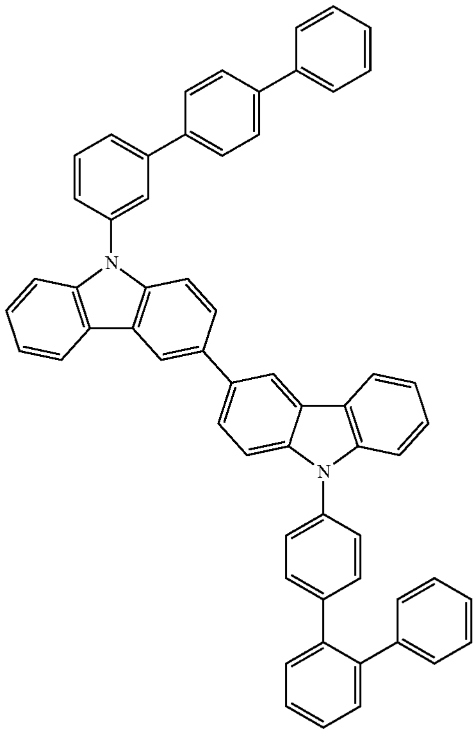
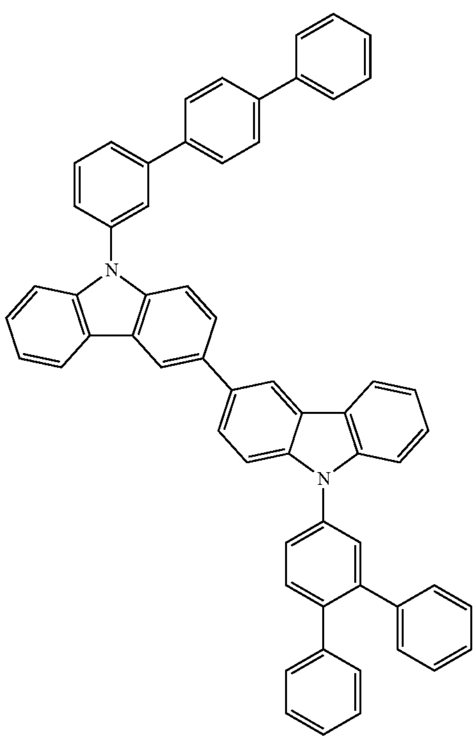
-continued
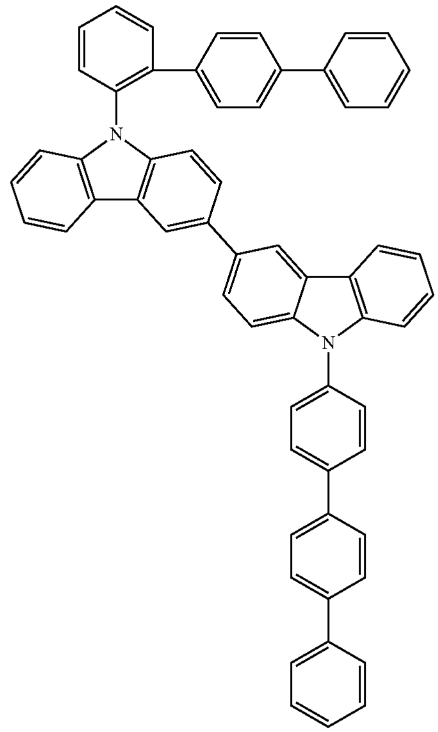
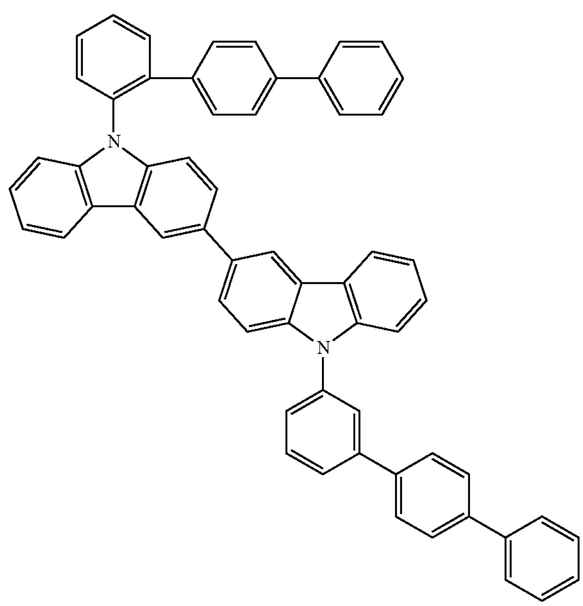

-continued
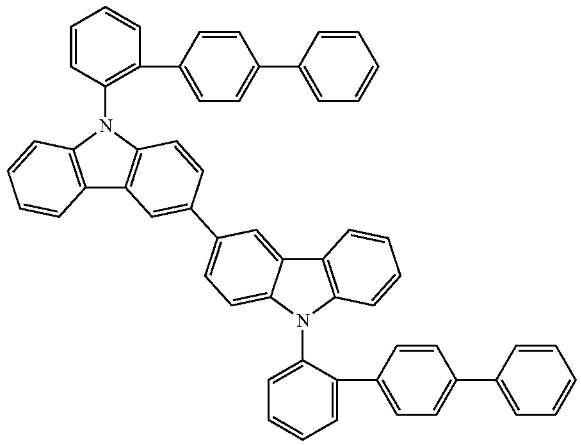
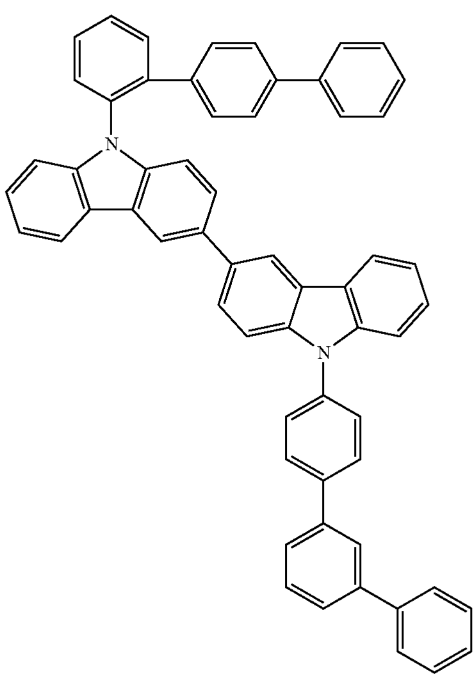
-continued
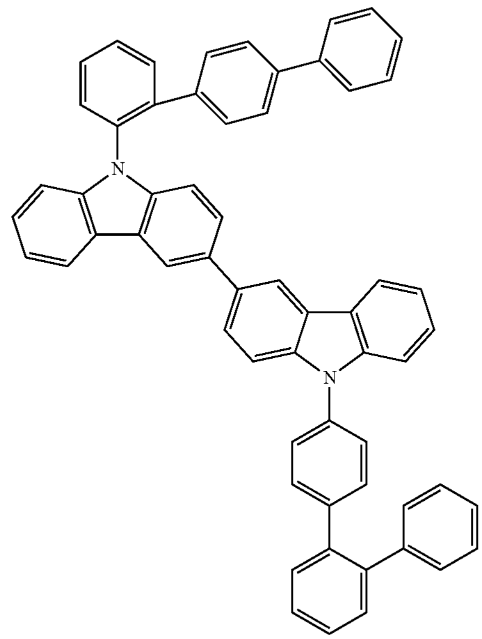
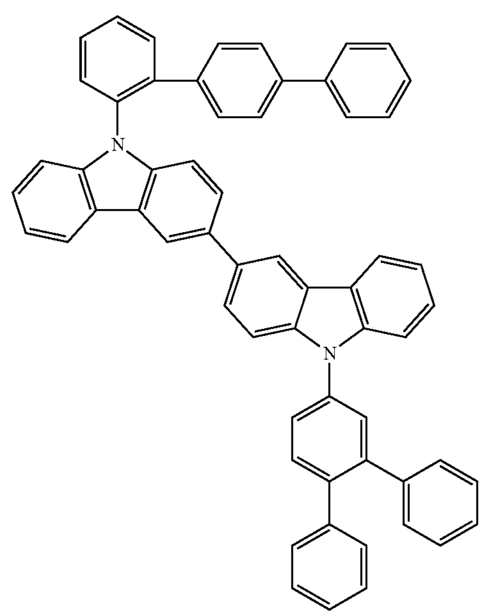

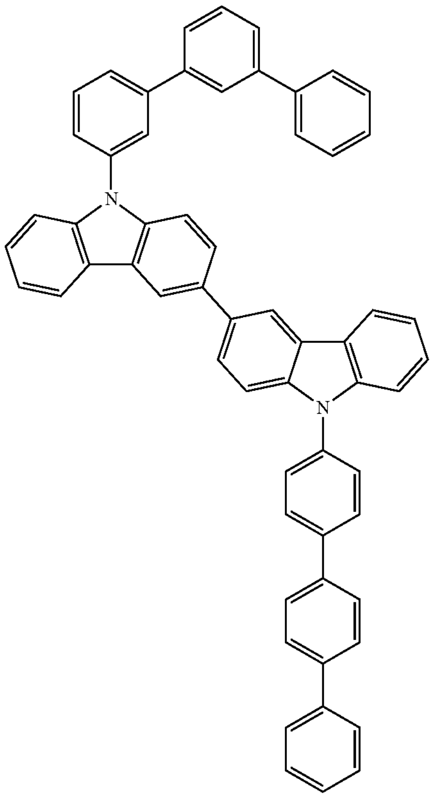
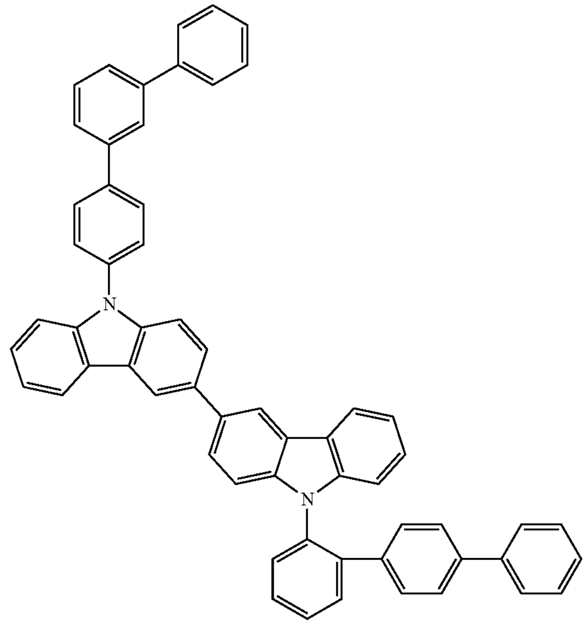
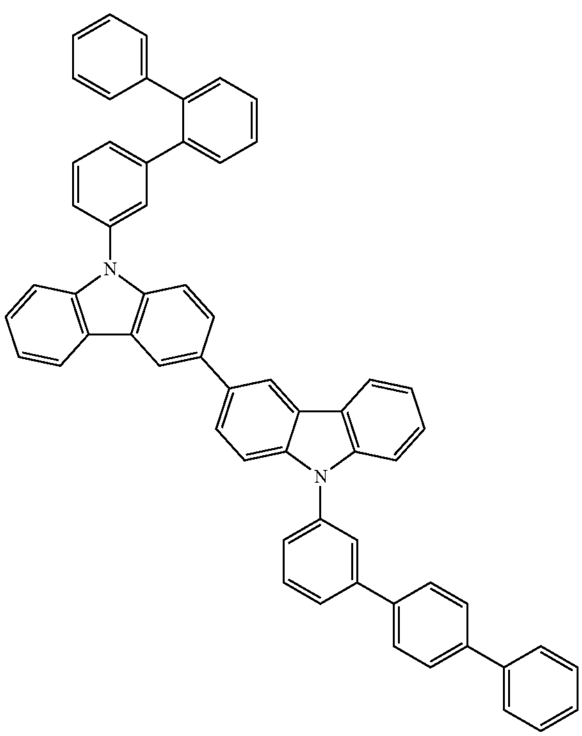
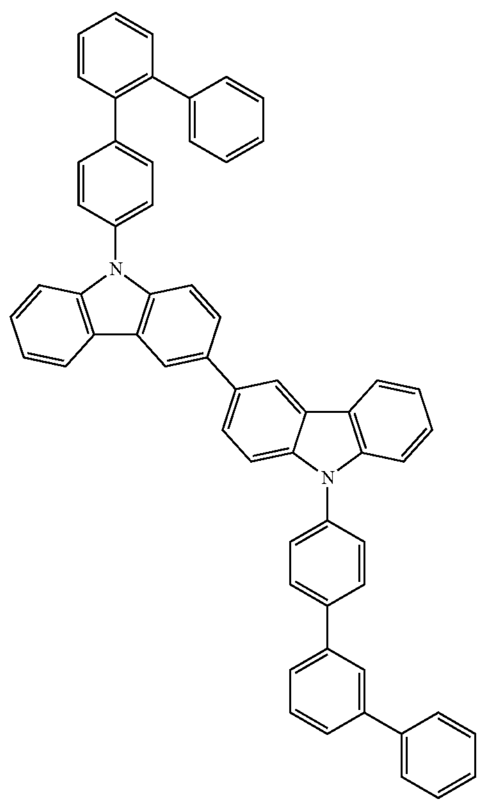

-continued
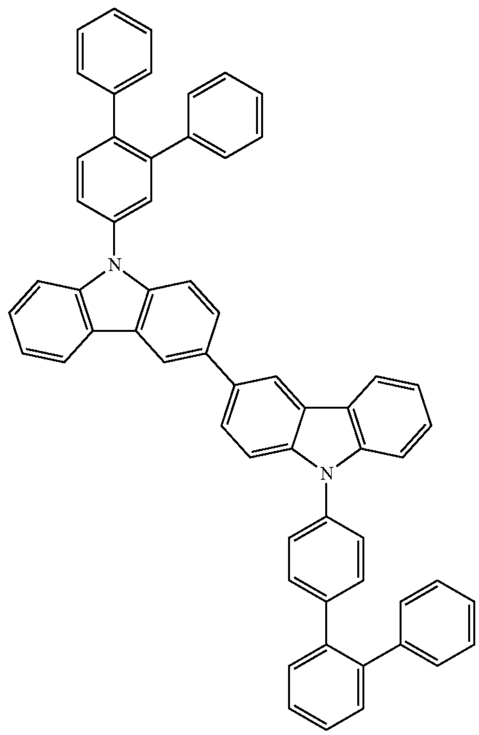
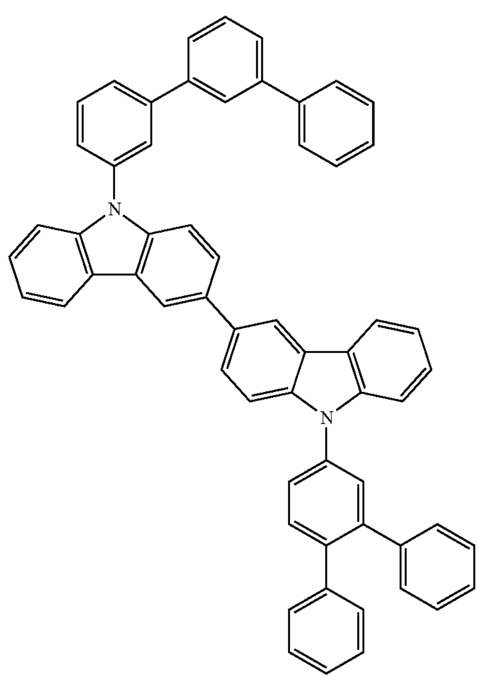
-continued
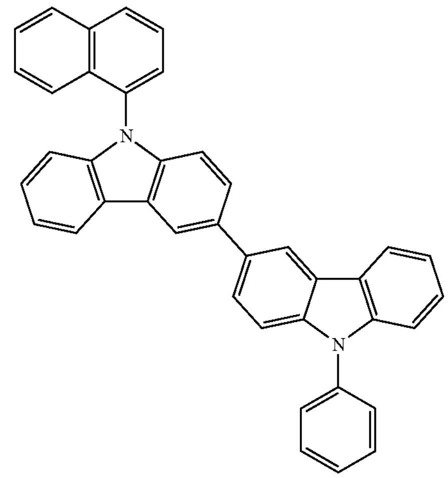
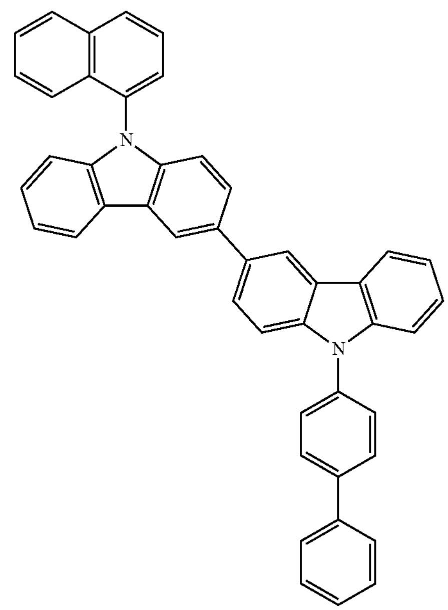
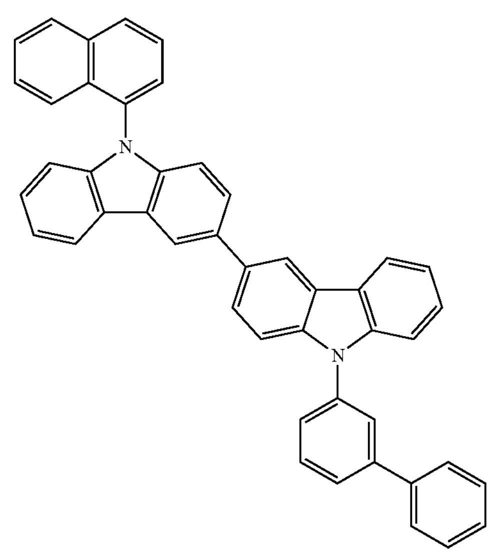

-continued
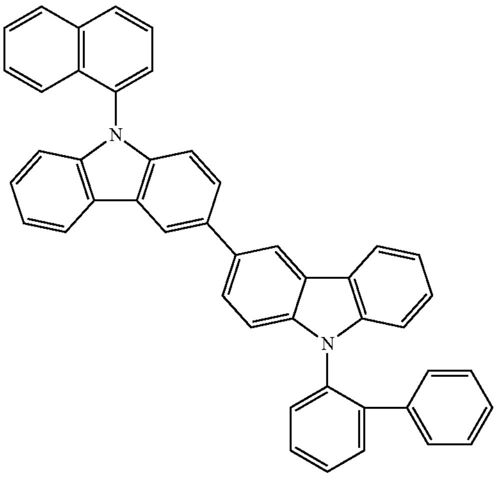
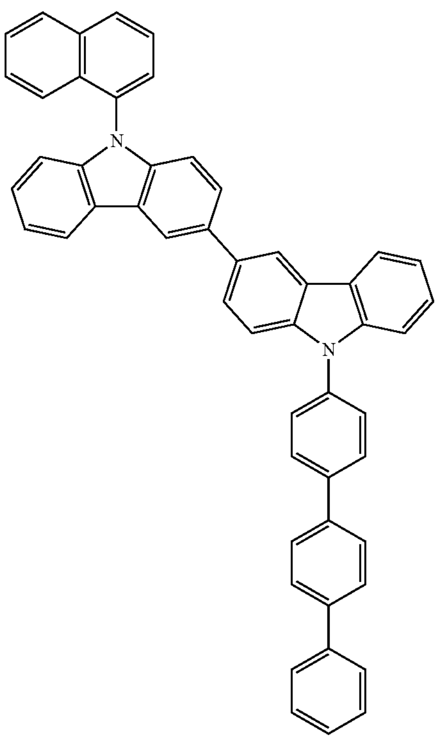
-continued
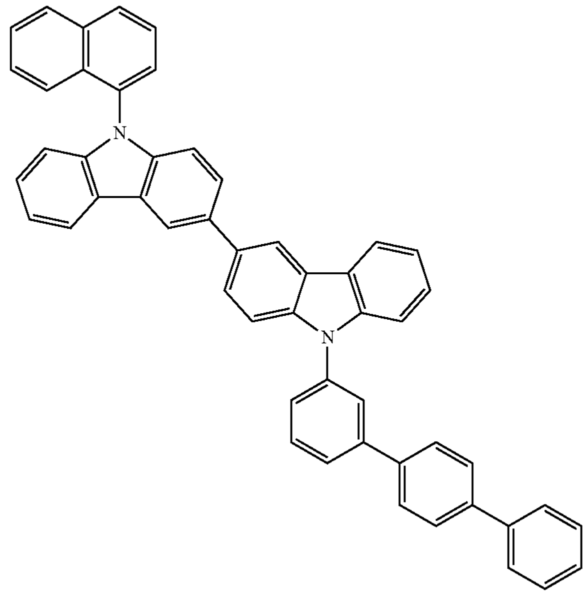
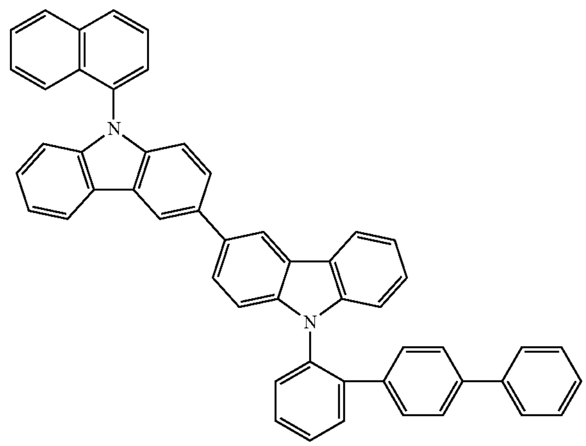
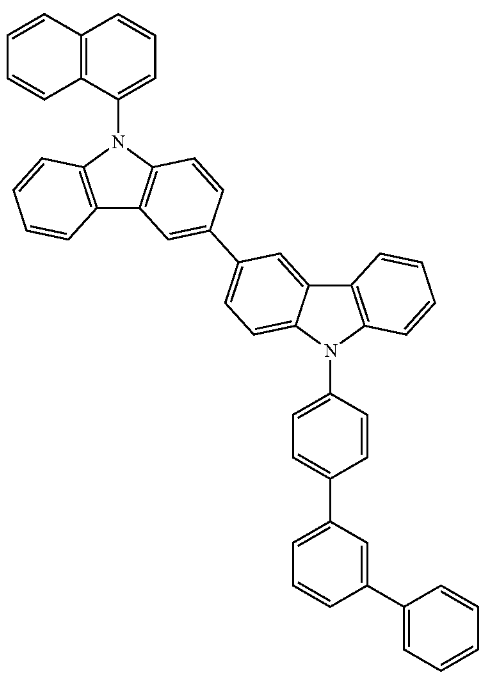

-continued
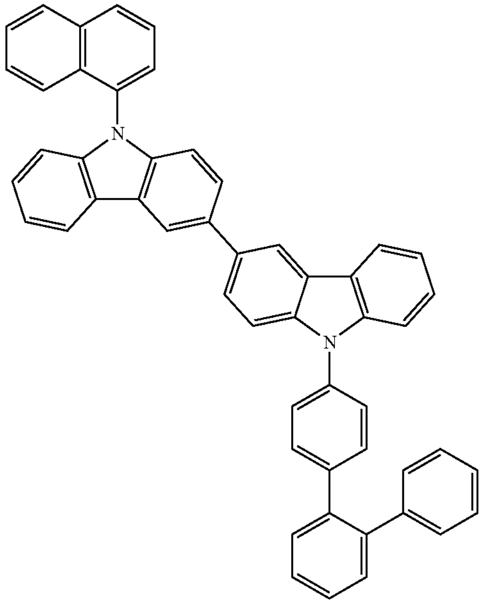
-continued
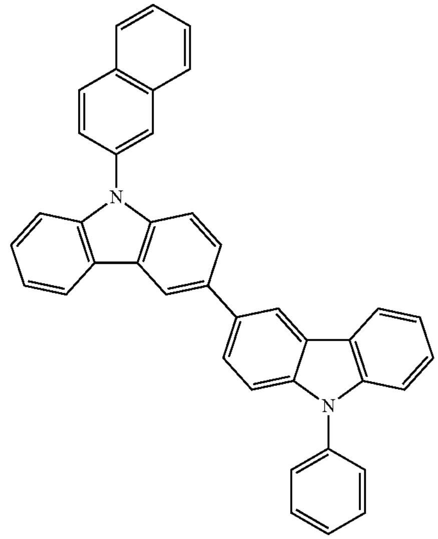
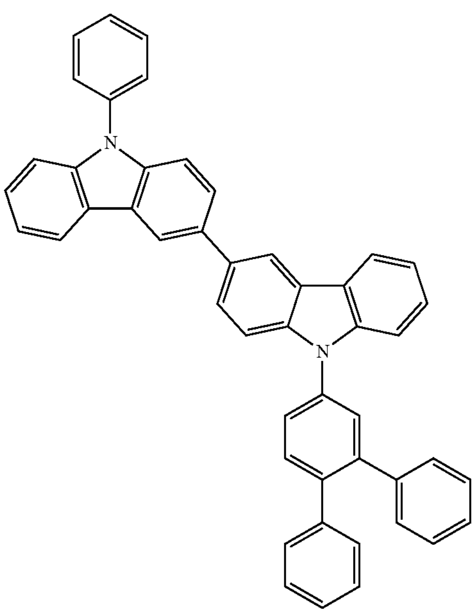
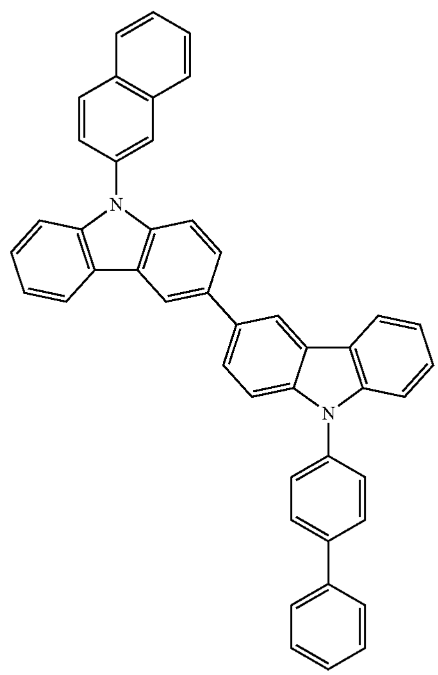

-continued
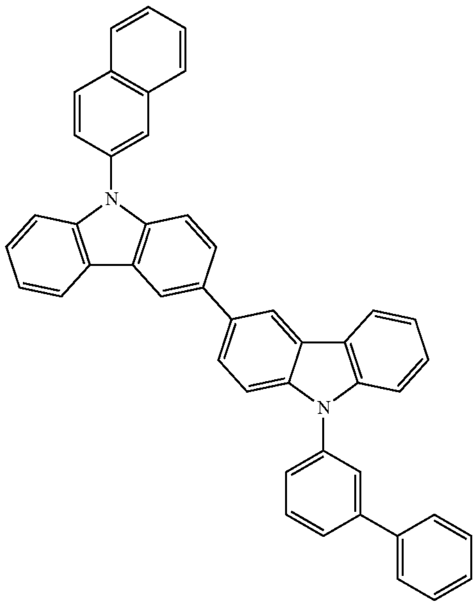 [SMILES: c1ccc(-c2cccc(-n3c4ccccc4c4cc(-c5ccc6c(c5)c5ccccc5n6-c5ccc6ccccc6c5)ccc43)c2)cc1]
-continued
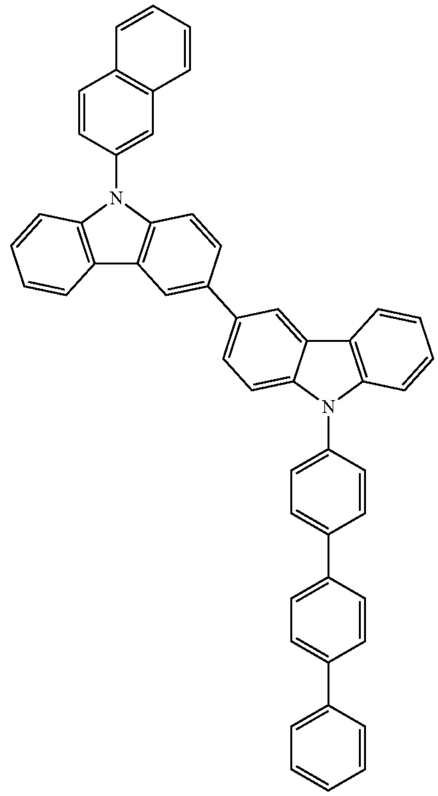
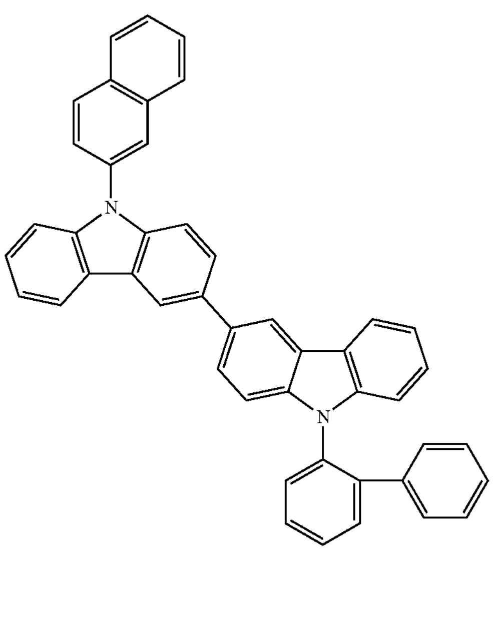
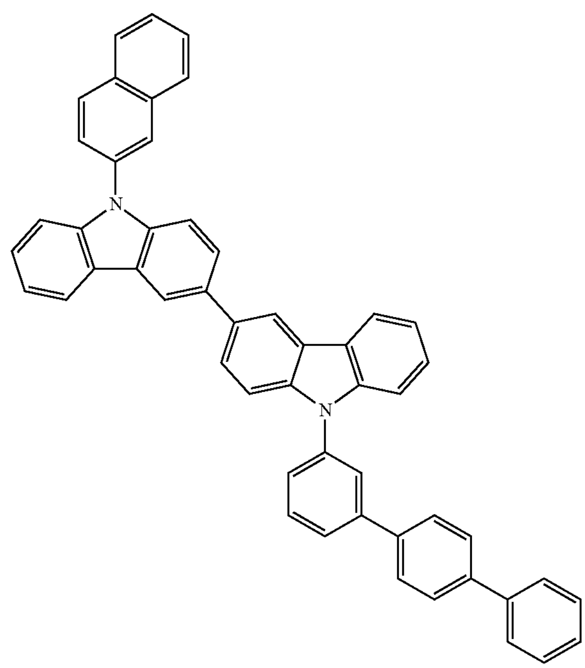

-continued
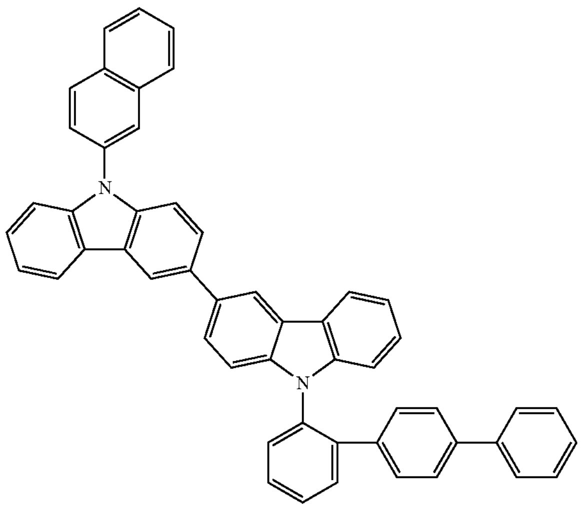
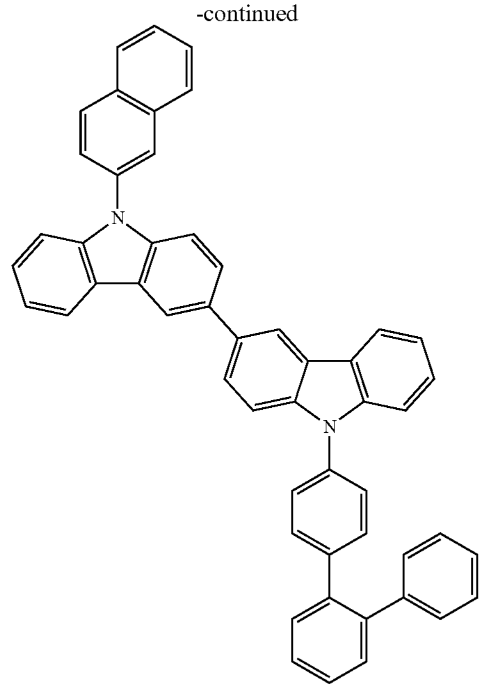
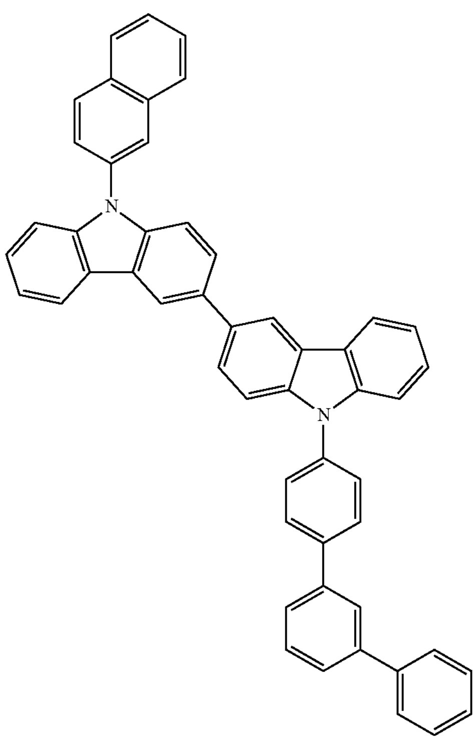
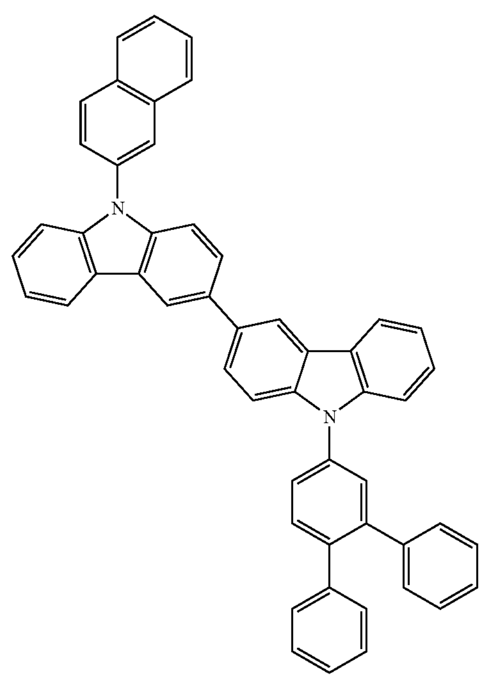

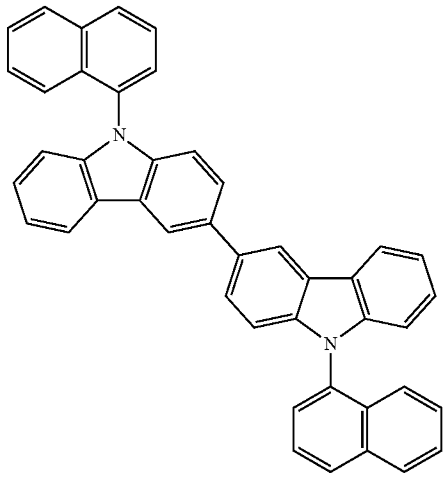
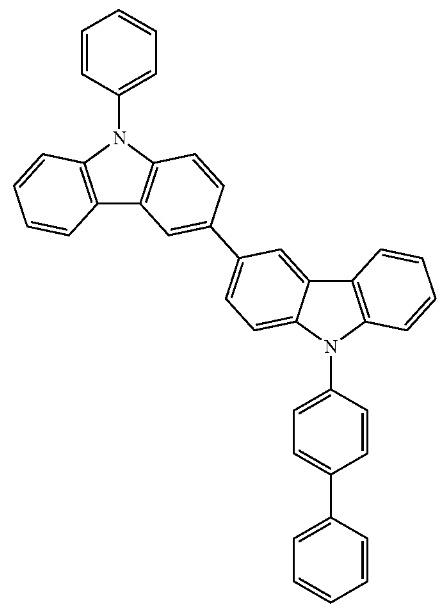
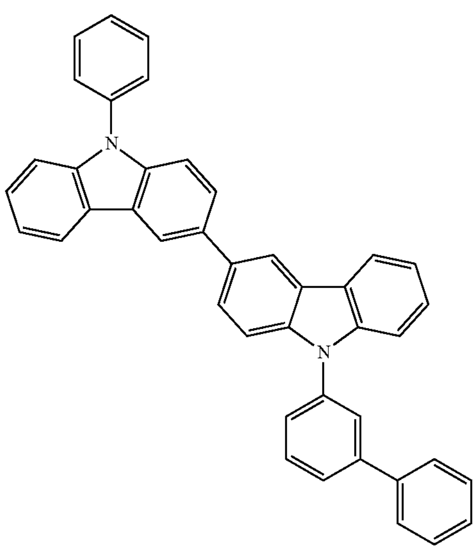
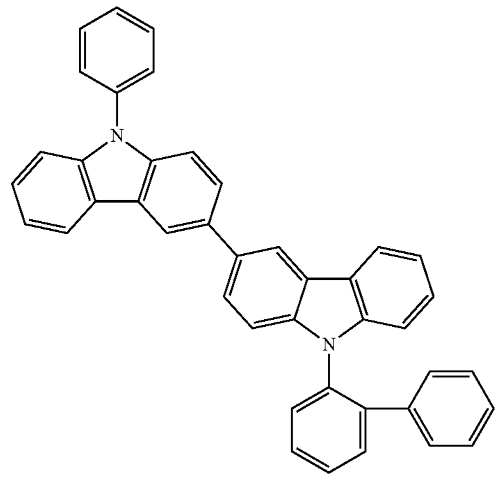
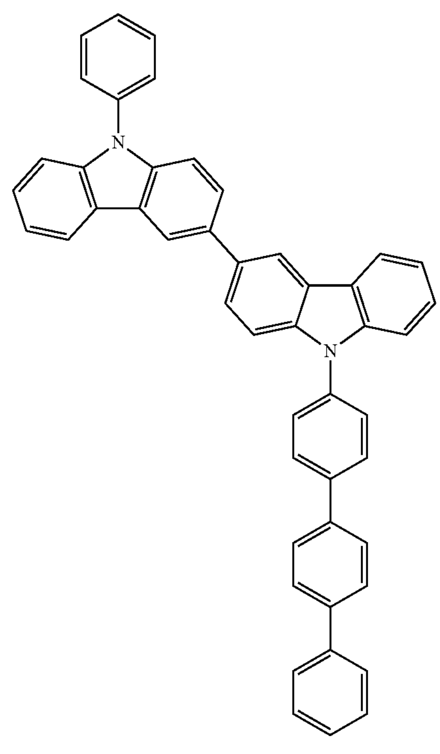
N
N

-continued
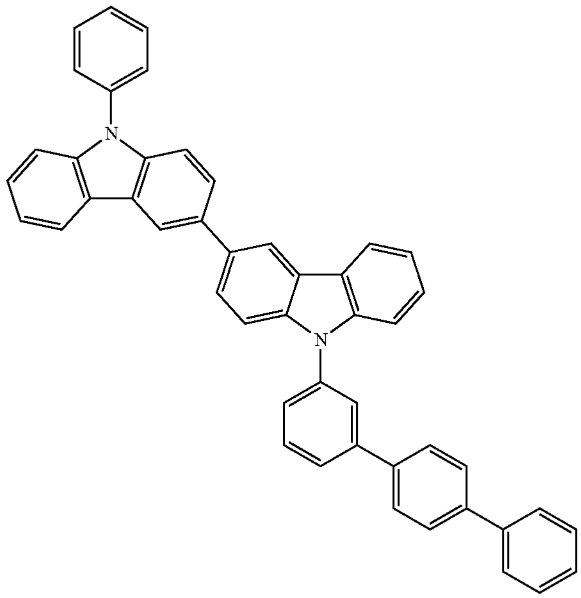
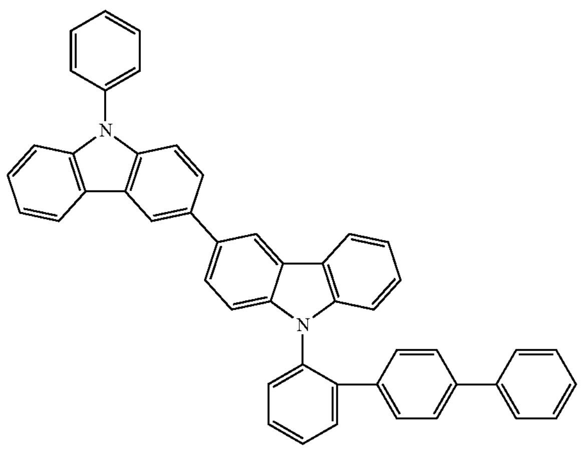
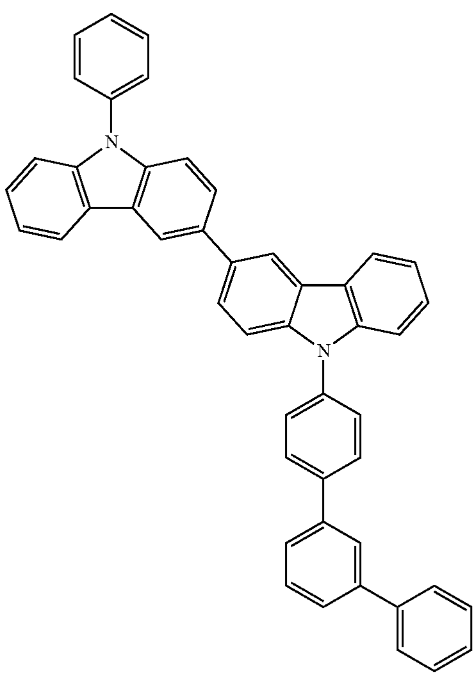
-continued
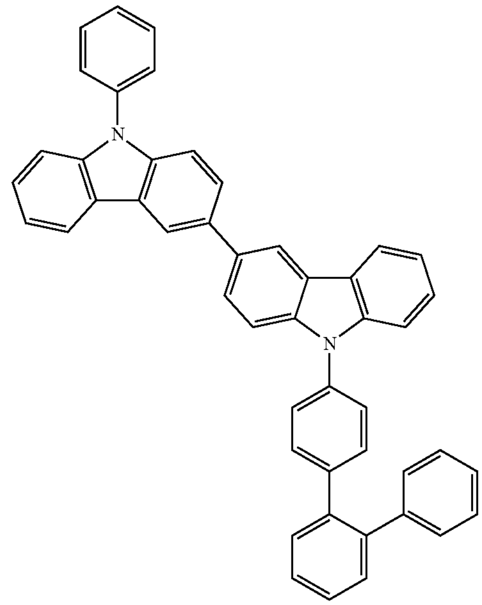
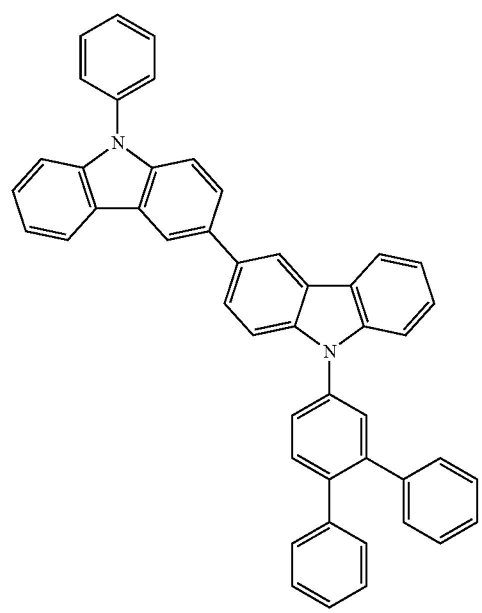

-continued
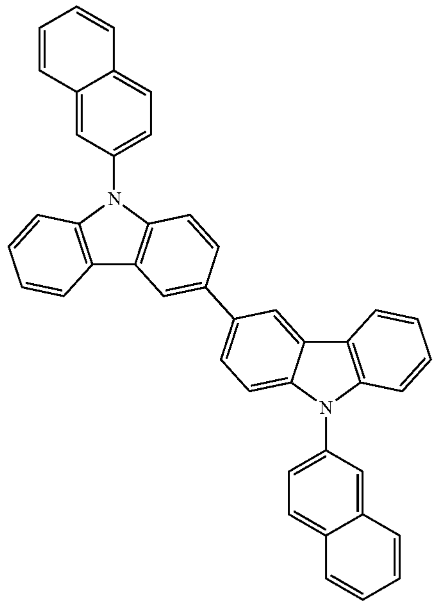
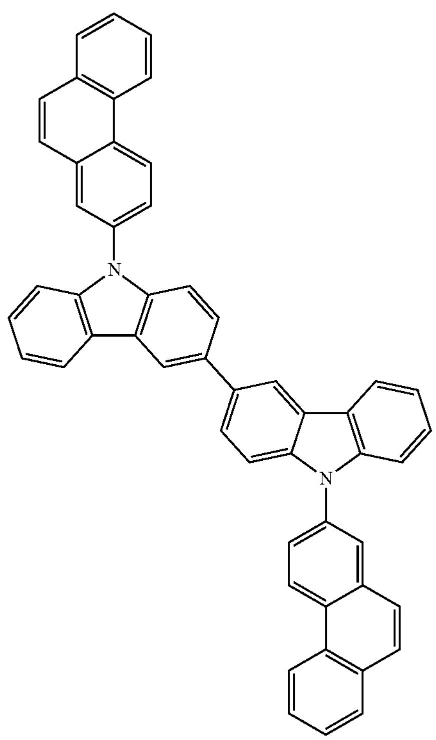
-continued
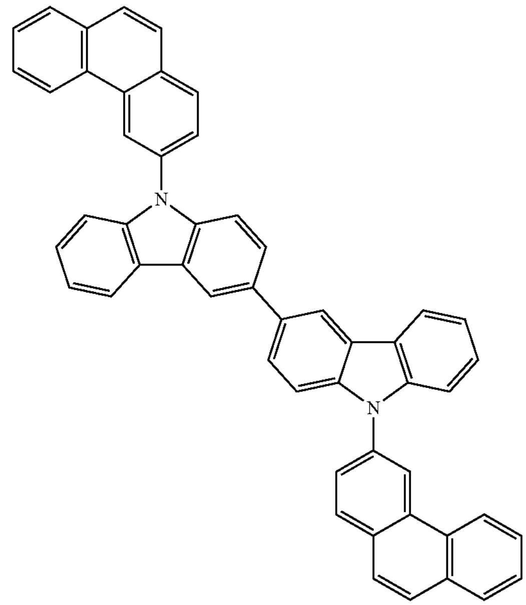
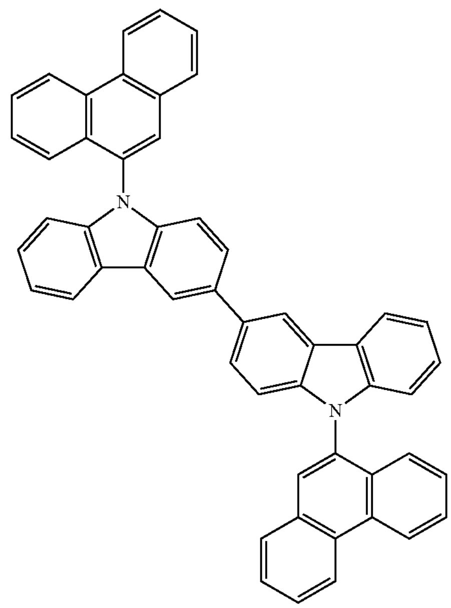
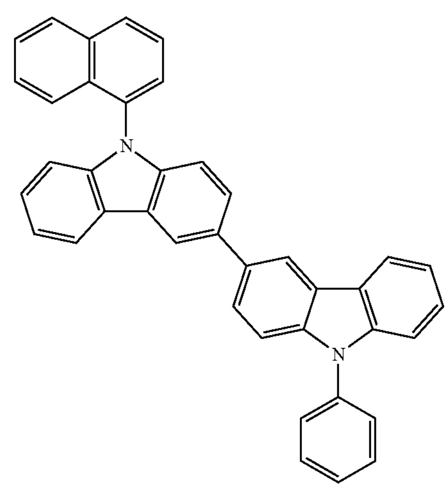

-continued
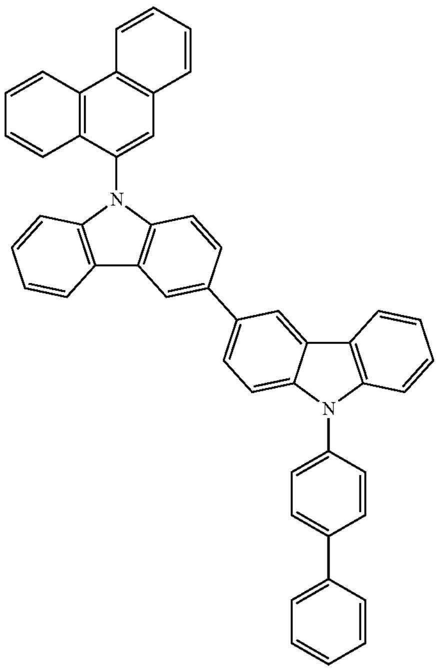
-continued
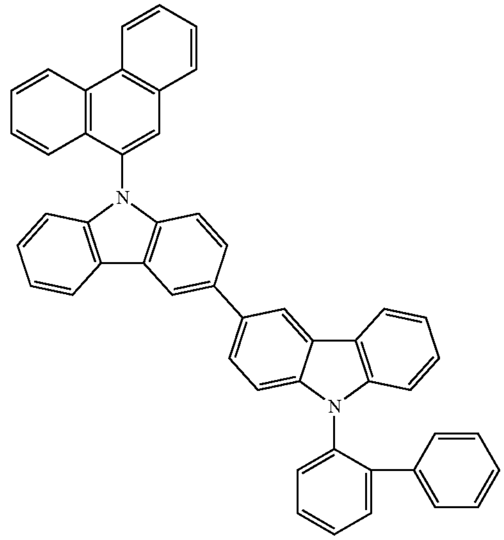
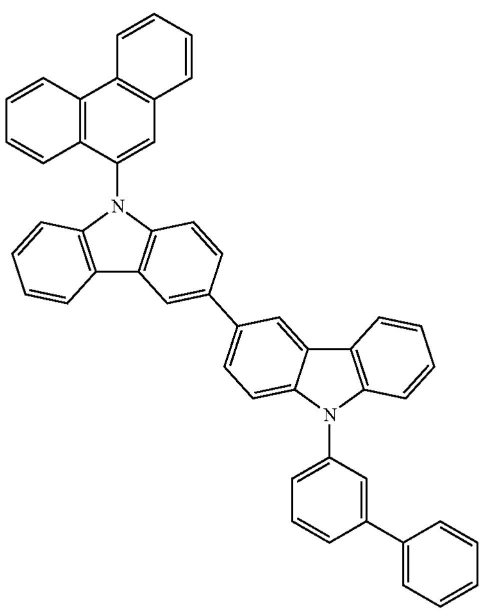
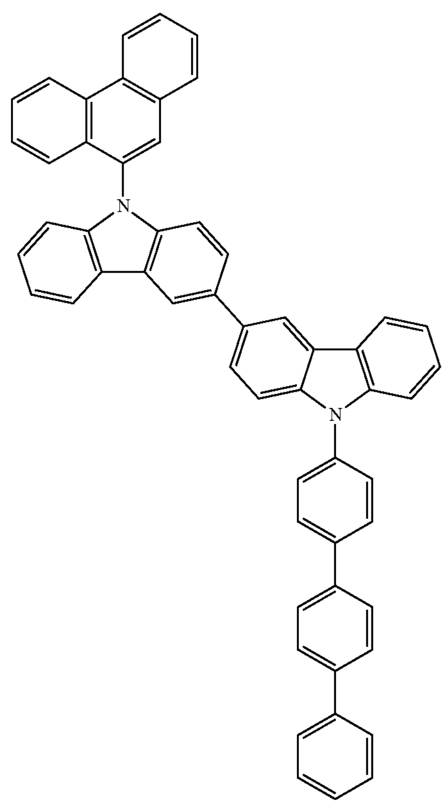

-continued
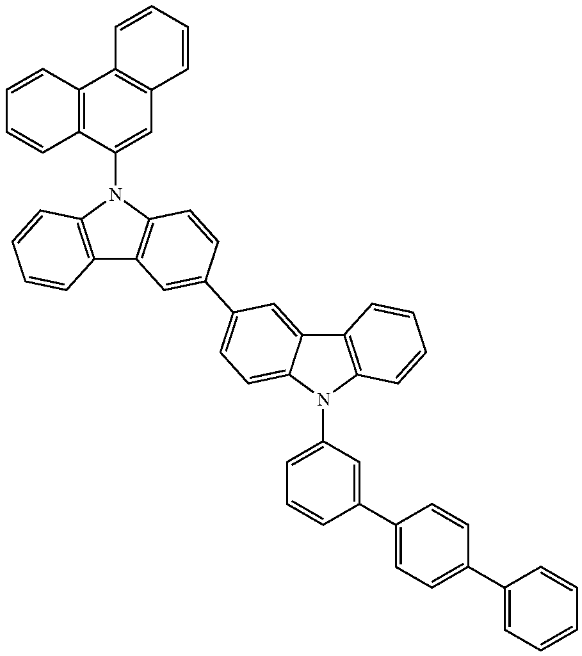
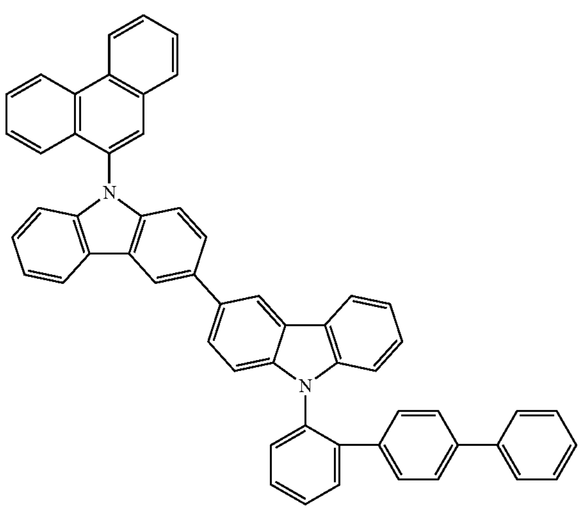
-continued
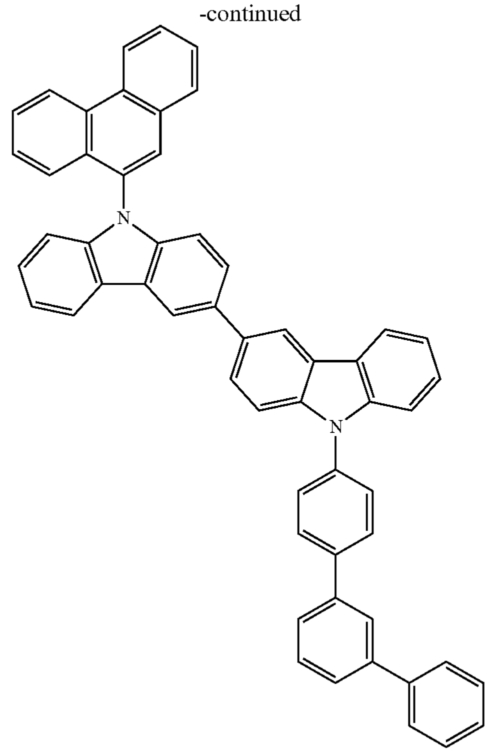
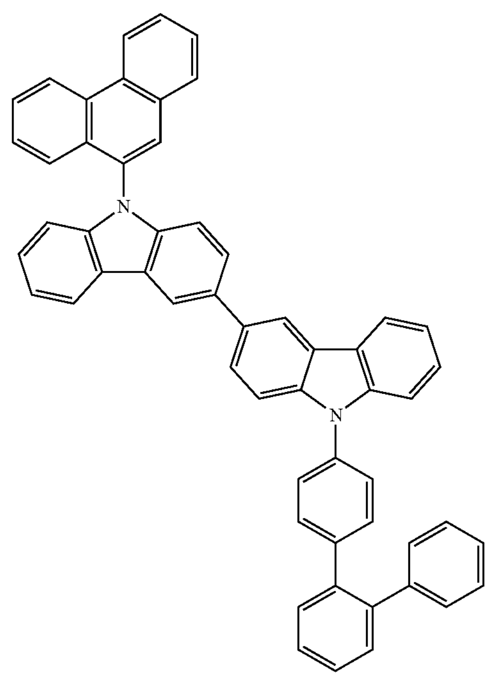

-continued
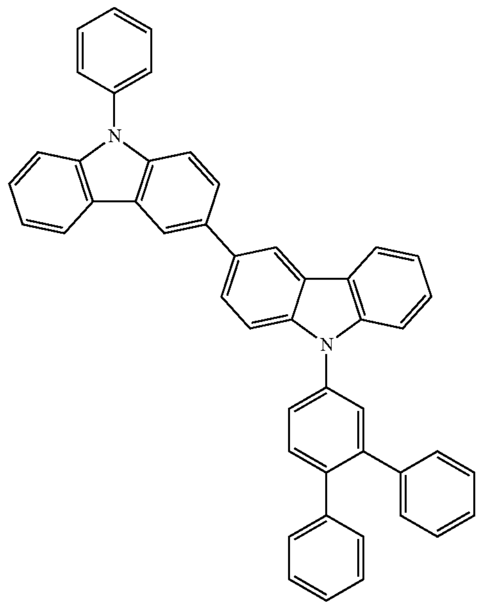
-continued
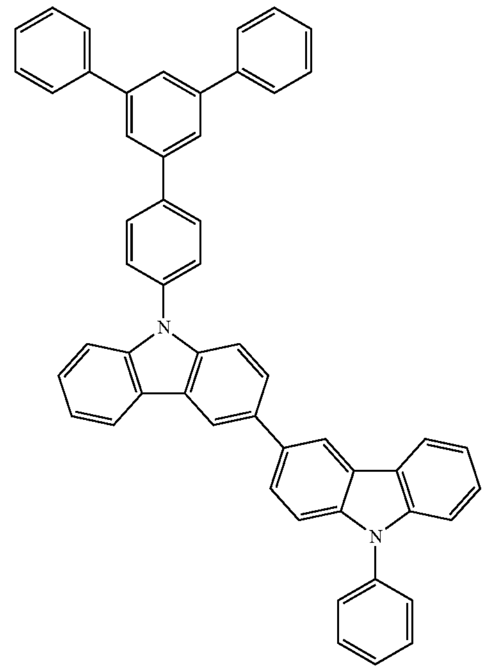
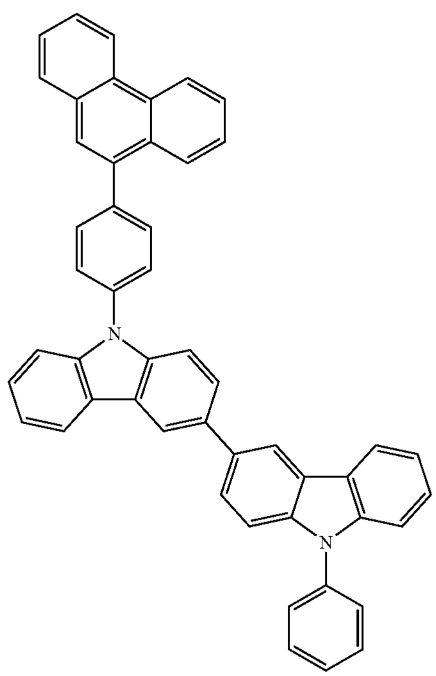
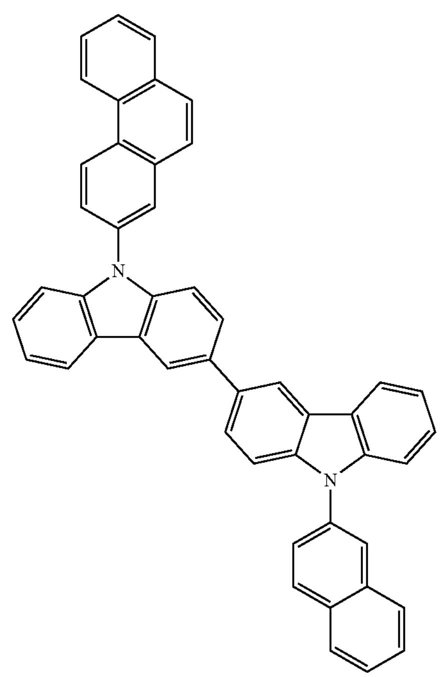

-continued
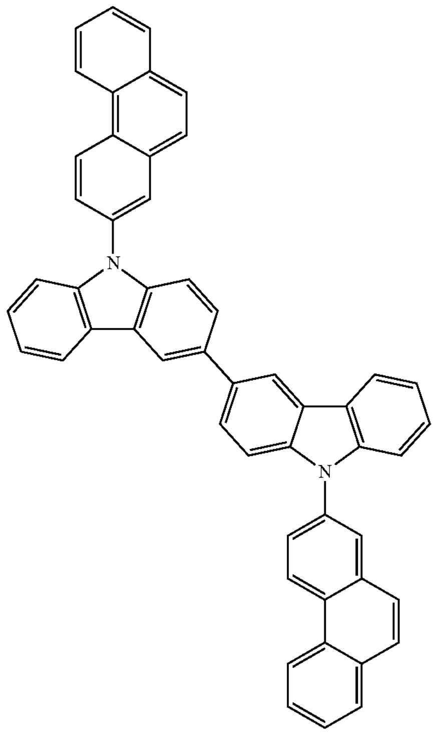
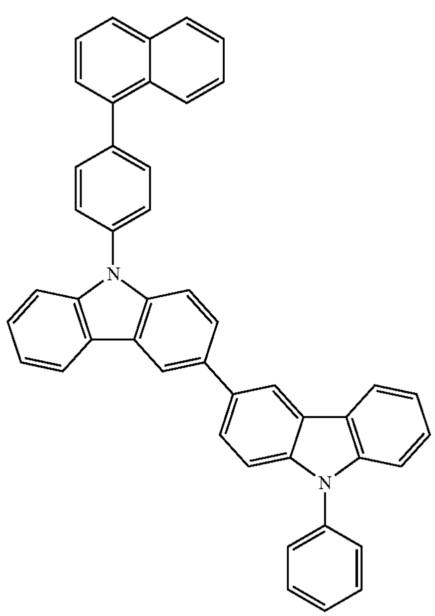
-continued
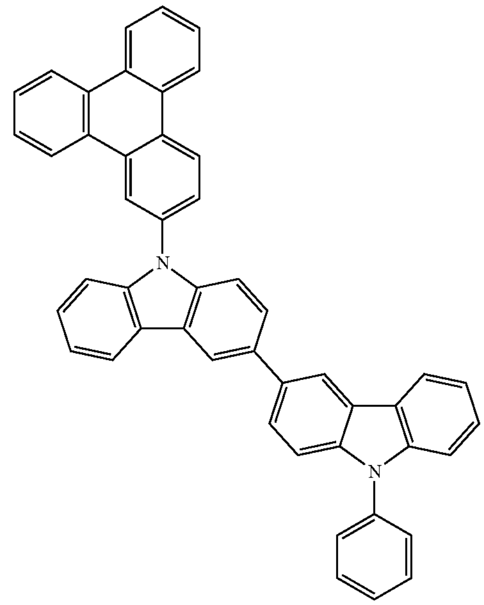
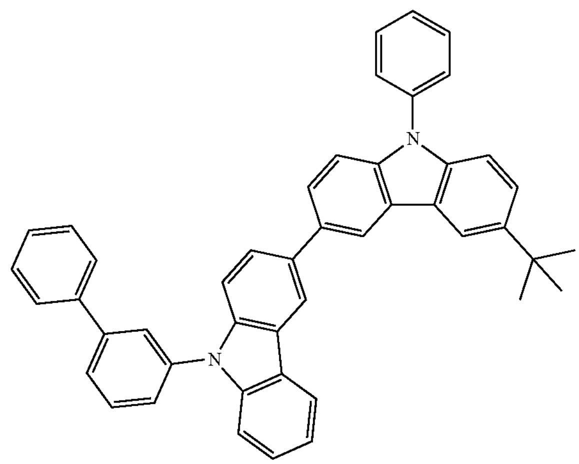
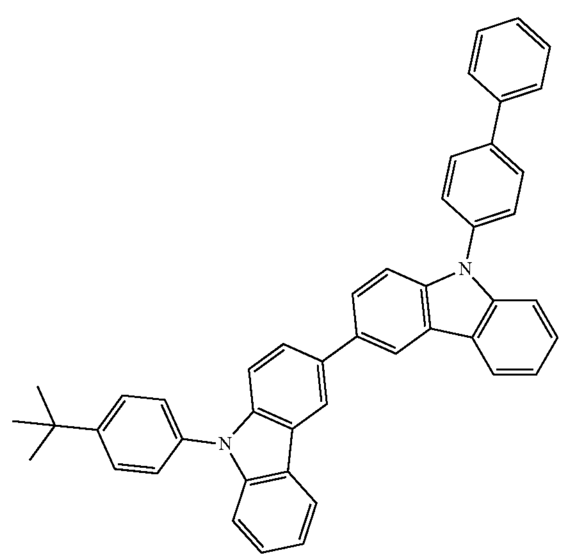

-continued
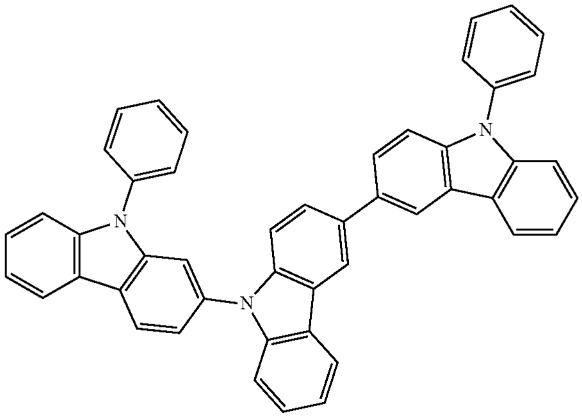
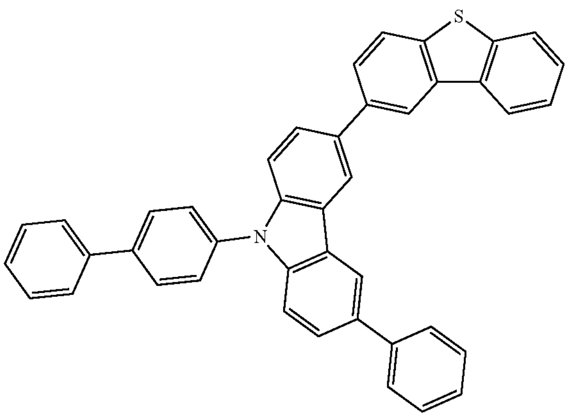
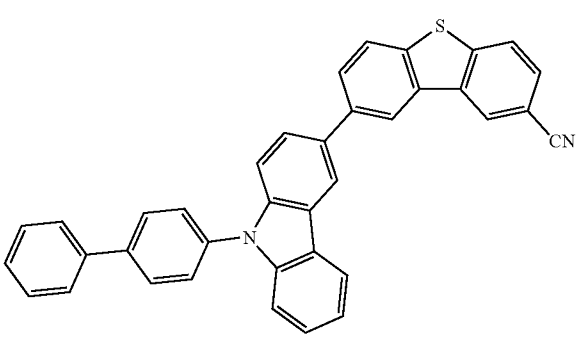
-continued
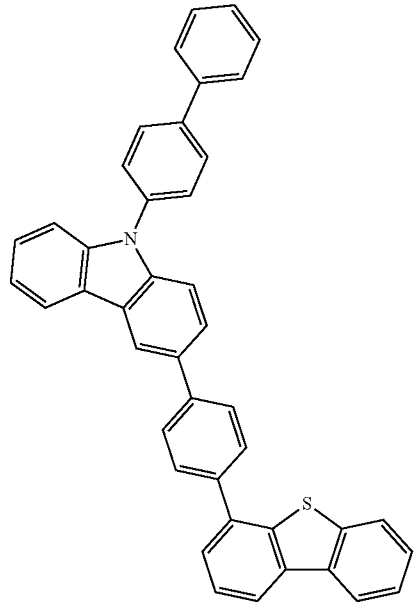
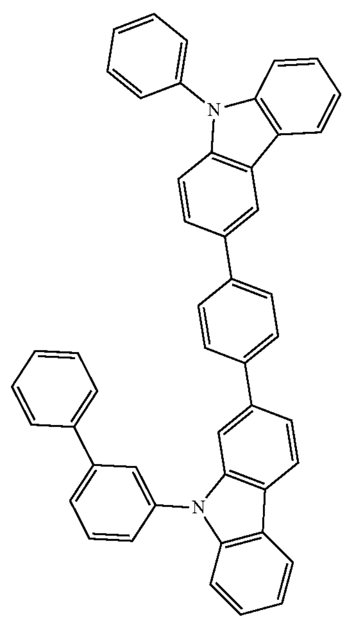

-continued
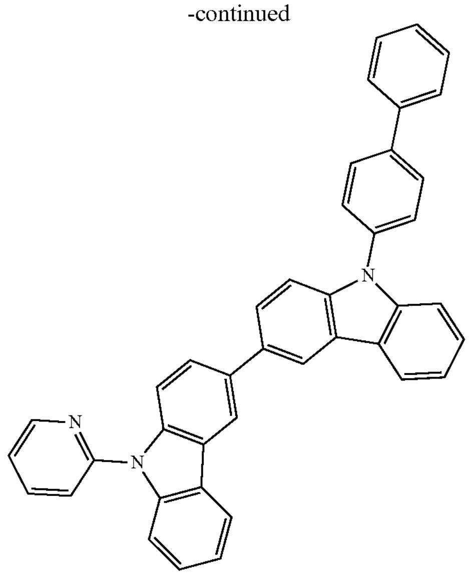
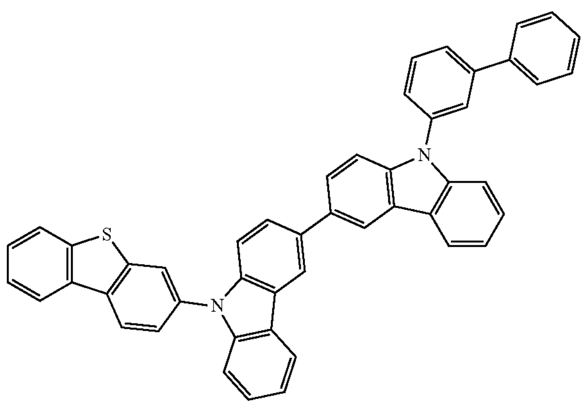
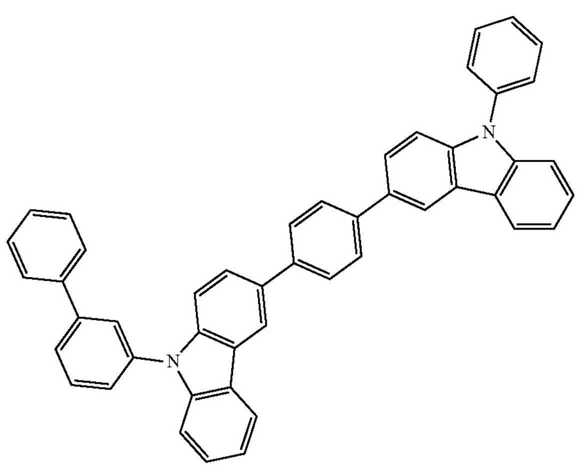
-continued
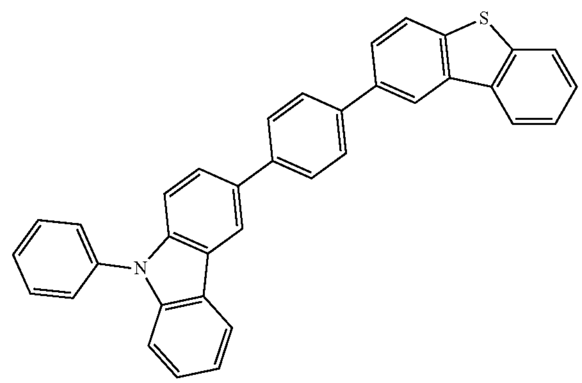
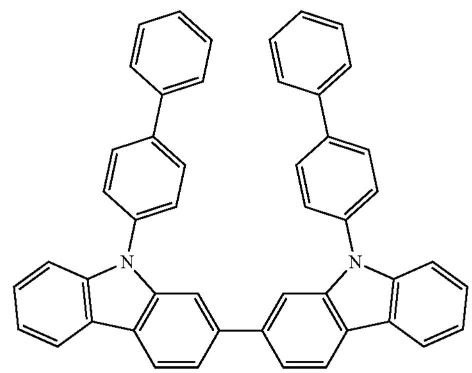
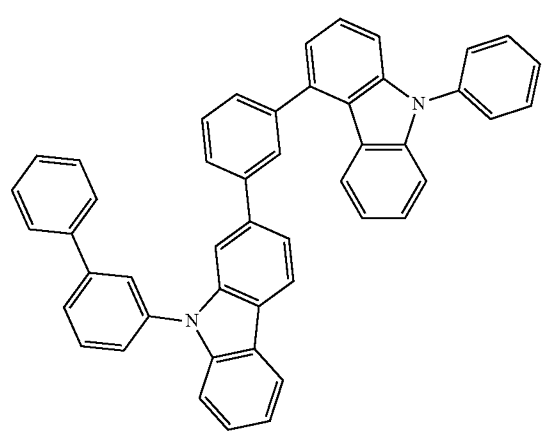

-continued
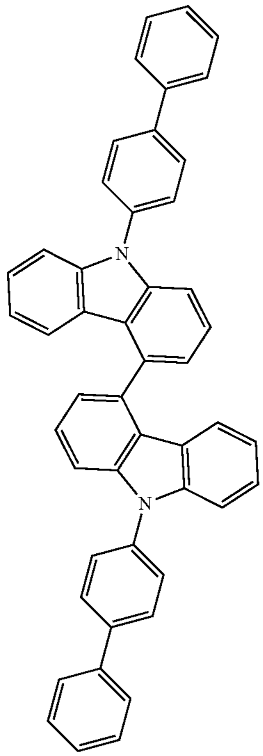
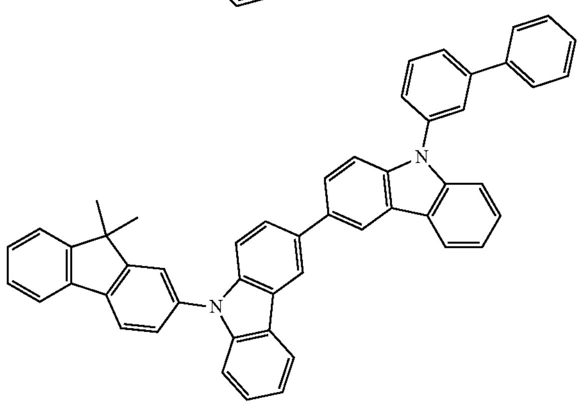
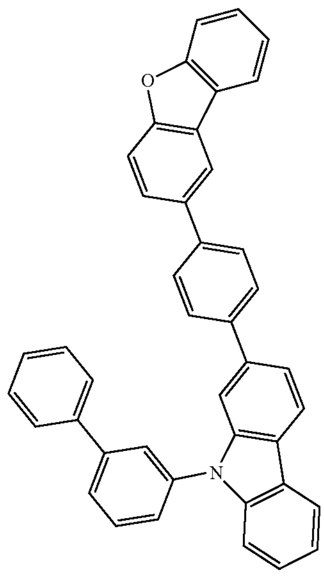
-continued
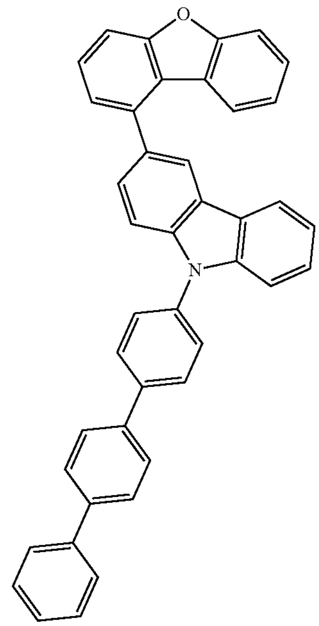
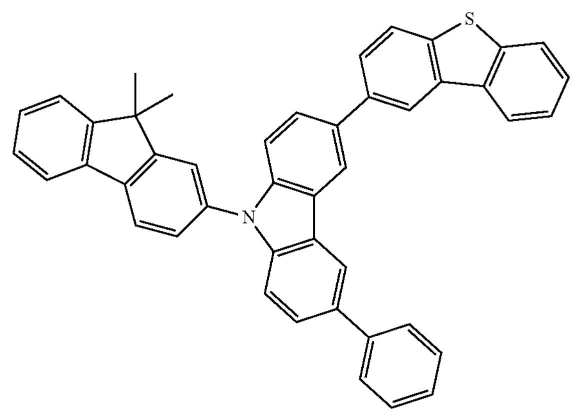
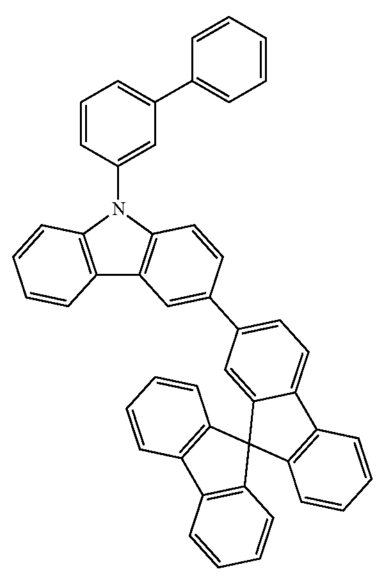

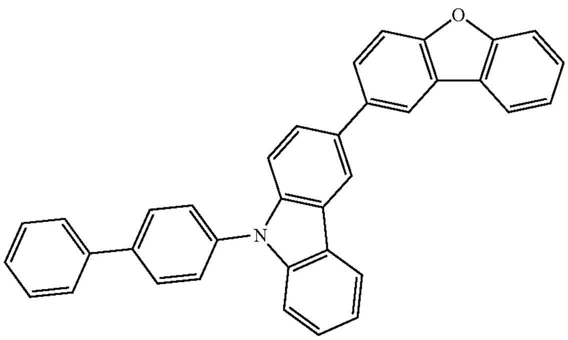
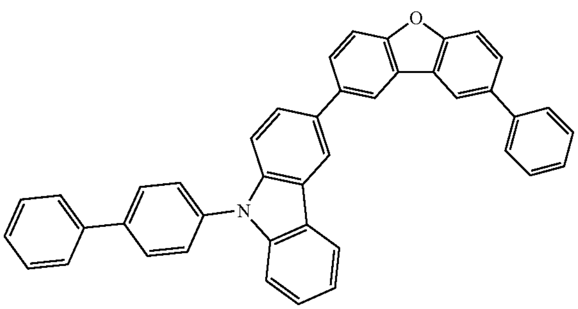
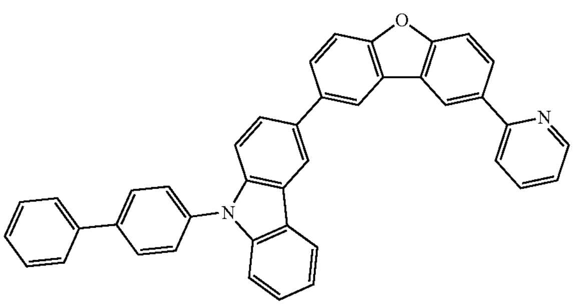
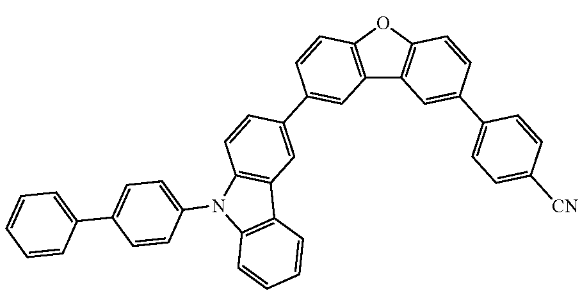
CN
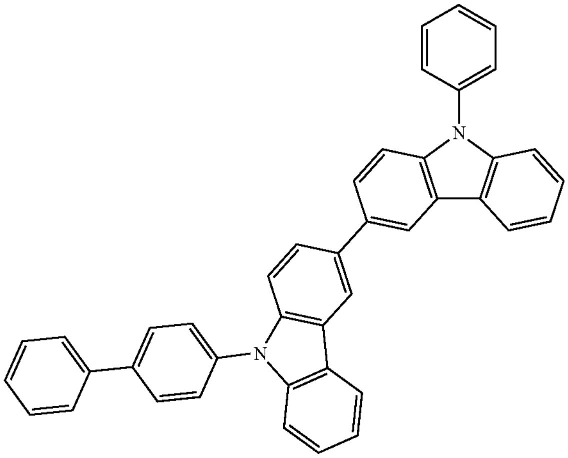
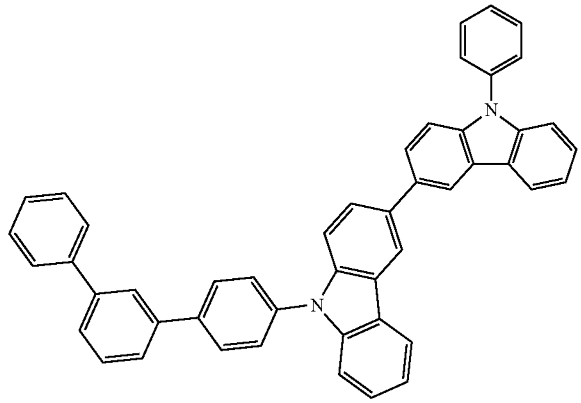
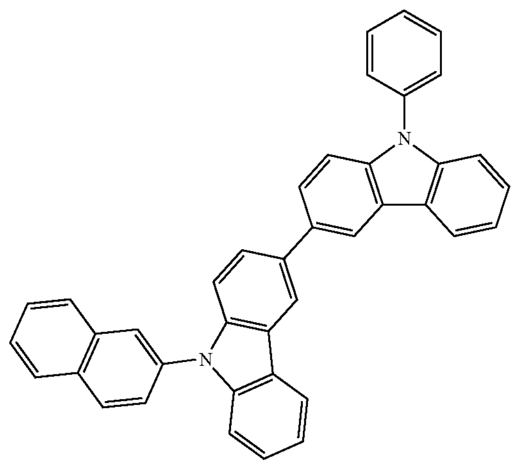
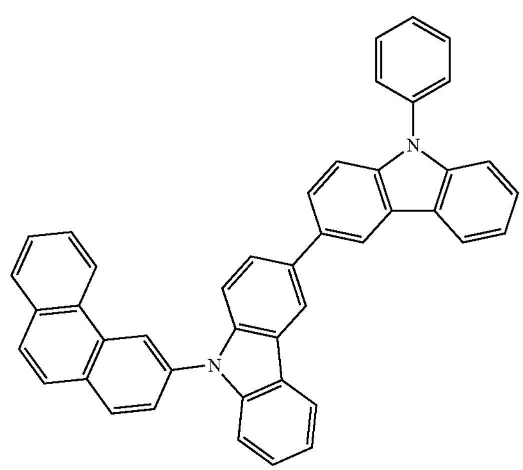

-continued
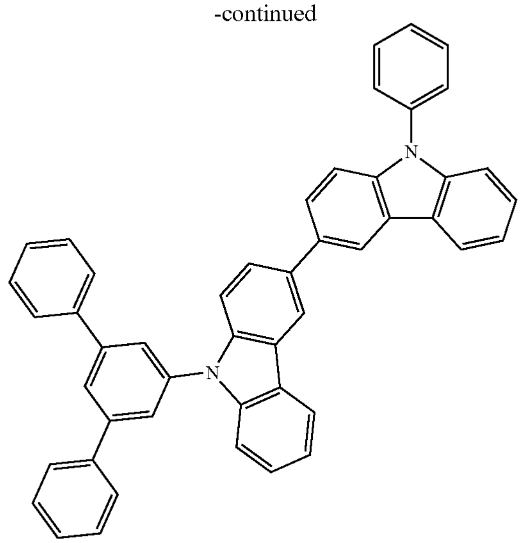
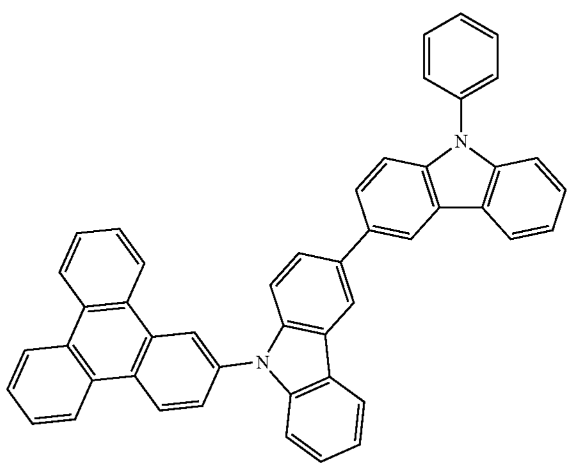
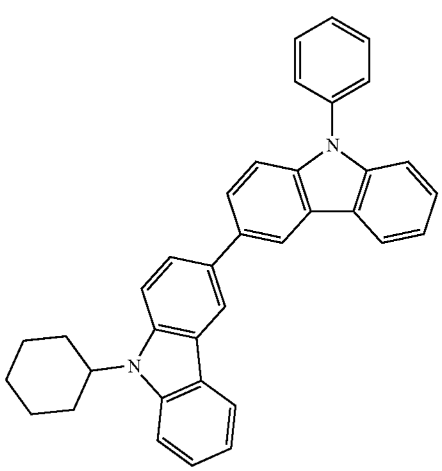
-continued
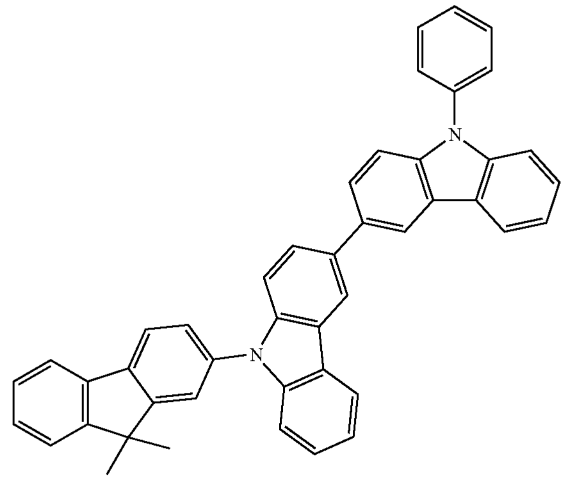
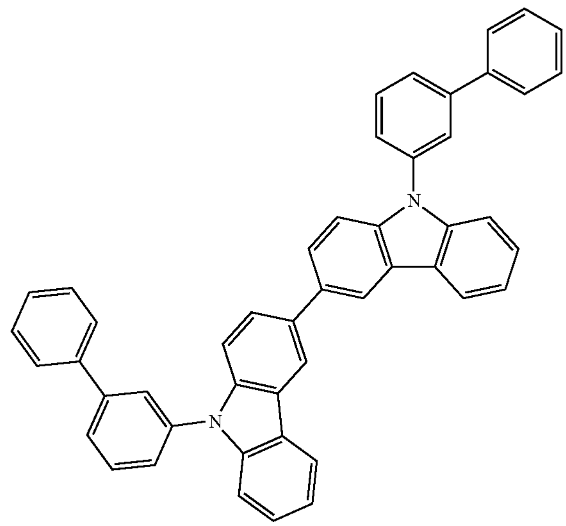
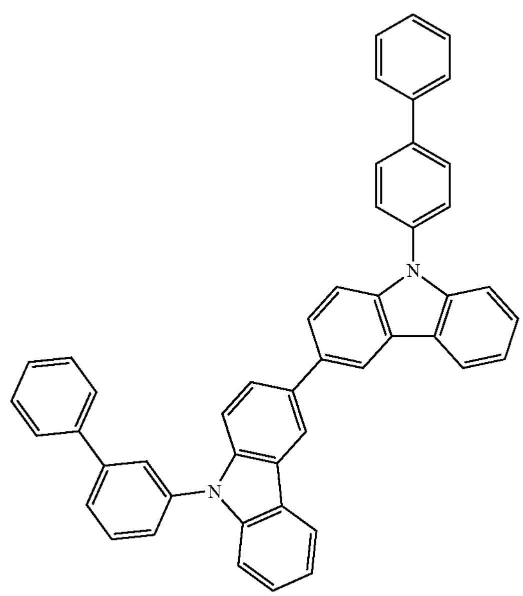

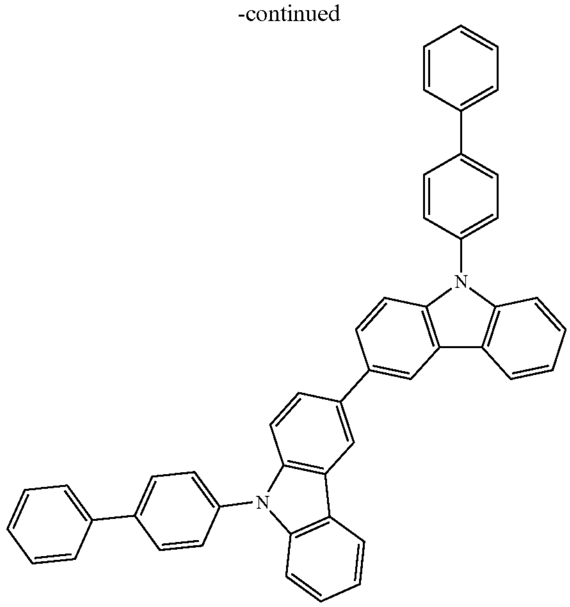
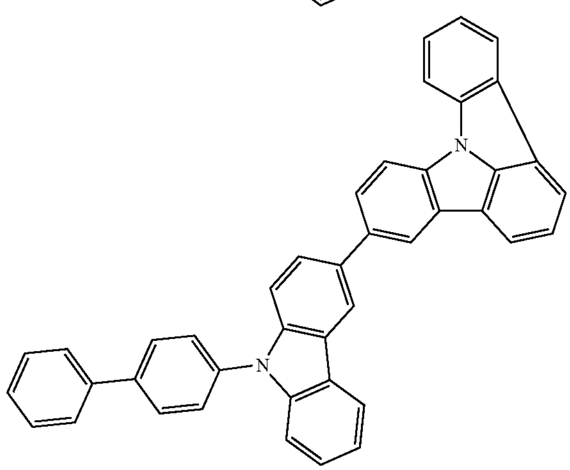
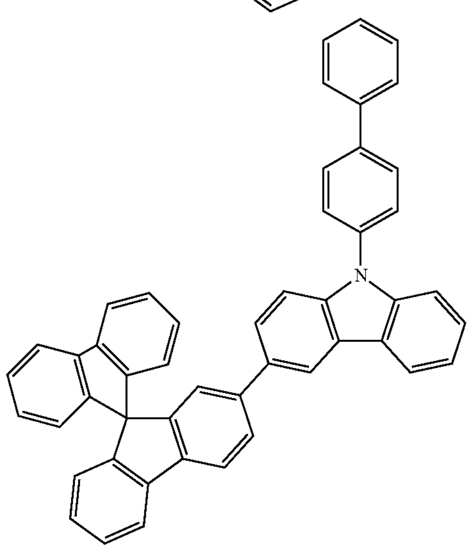
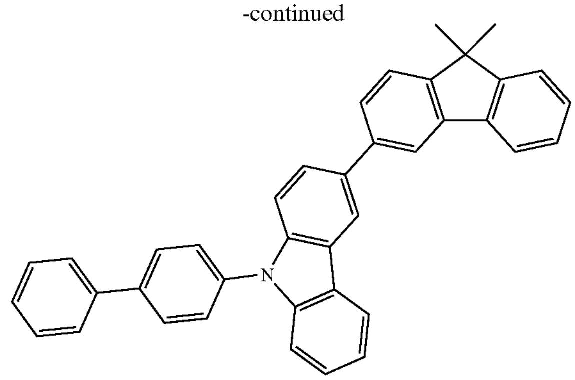
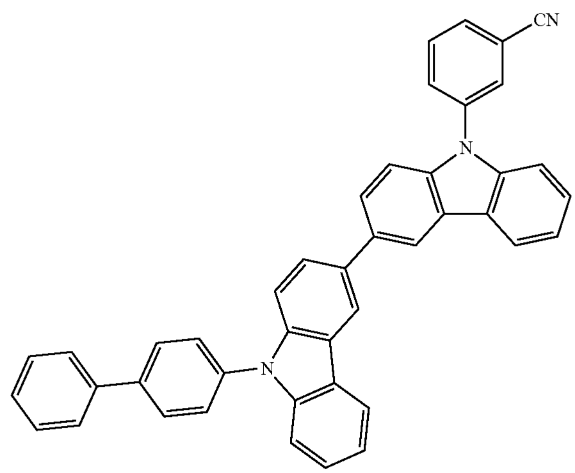
CN
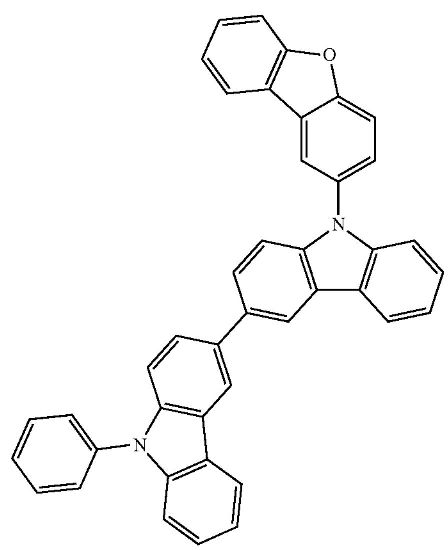
* * * * *

UNITED STATES PATENT AND TRADEMARK OFFICE

CERTIFICATE OF CORRECTION

PATENT NO. : 11,685,859 B2
APPLICATION NO. : 16/754904
DATED : June 27, 2023
INVENTOR(S) : Jae Seung Ha et al.

It is certified that error appears in the above-identified patent and that said Letters Patent is hereby corrected as shown below:

In the Claims

In Claim 1, at Column 513, Line 26 should recite:
—Chemical Formula 3—

In Claim 10, at Column 683, the second compound should appear as follows:

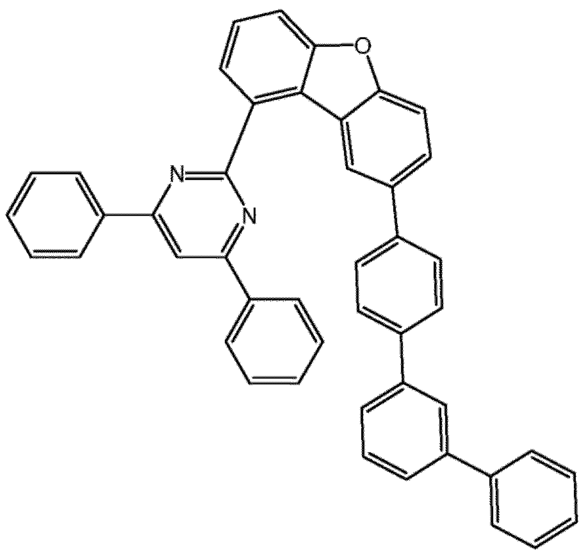

Signed and Sealed this
Twenty-third Day of January, 2024

Katherine Kelly Vidal
*Director of the United States Patent and Trademark Office*

In Claim 10, at Column 683, the third compound should appear as follows:
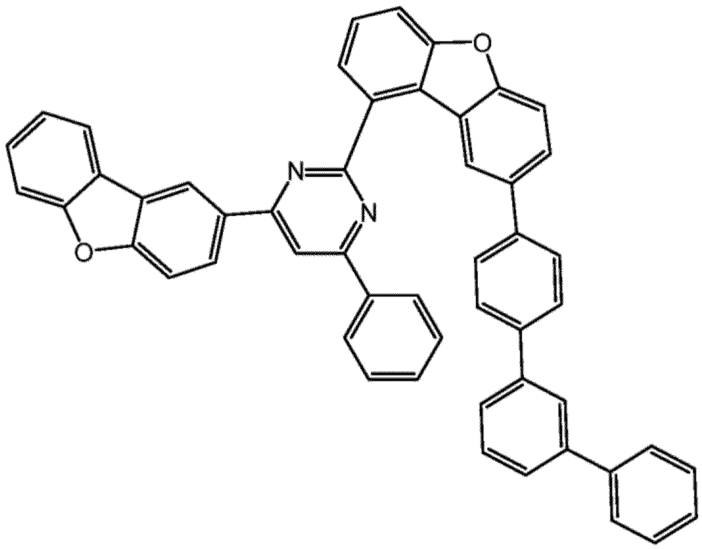
In Claim 10, at Column 684, the first compound should appear as follows:
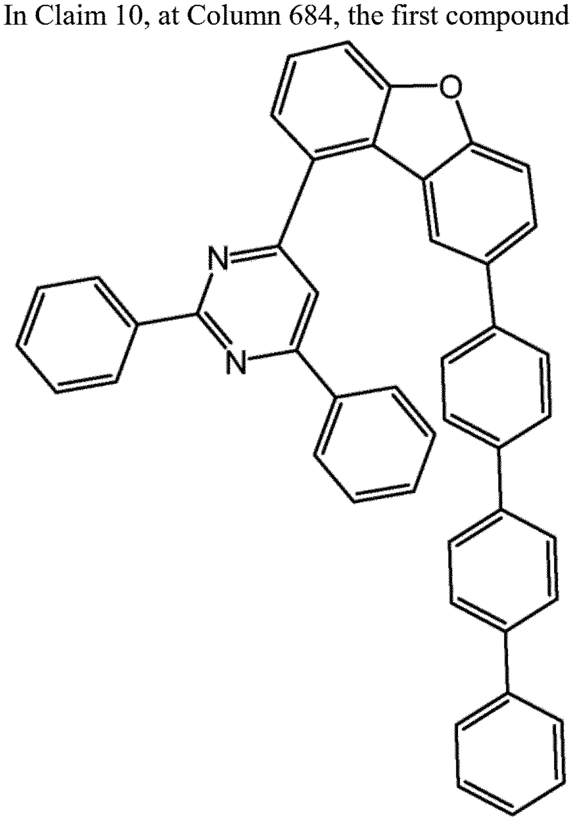

In Claim 10, at Column 684, the second compound should appear as follows:
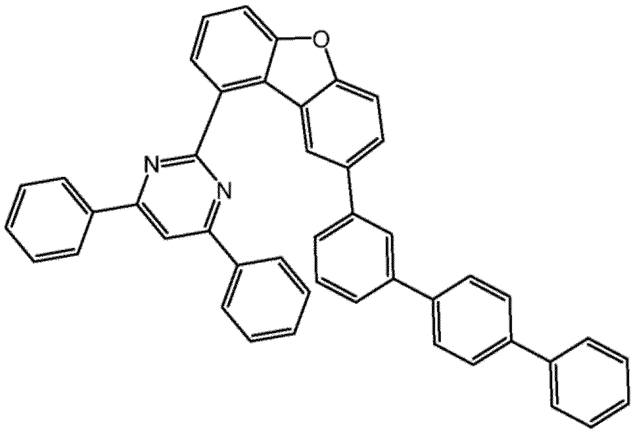
In Claim 10, at Column 762, the first compound should appear as follows:
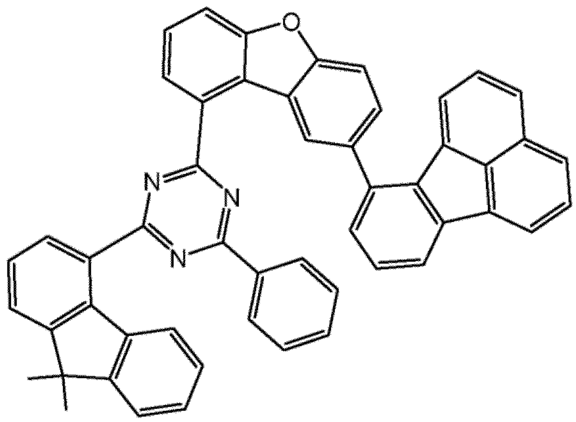
In Claim 10, at Column 806, the following compounds should be inserted after Line 18:
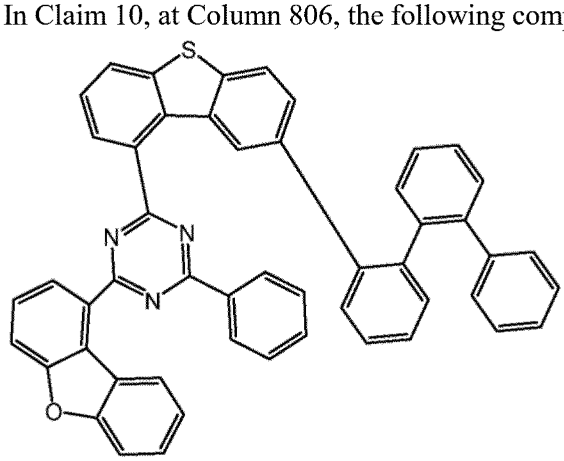

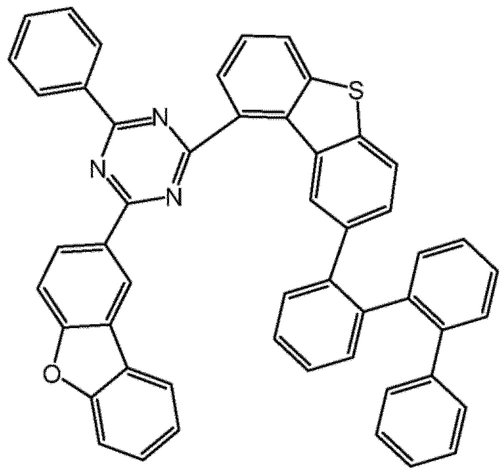
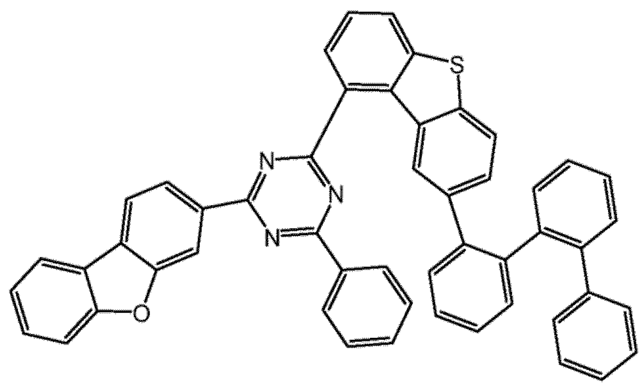
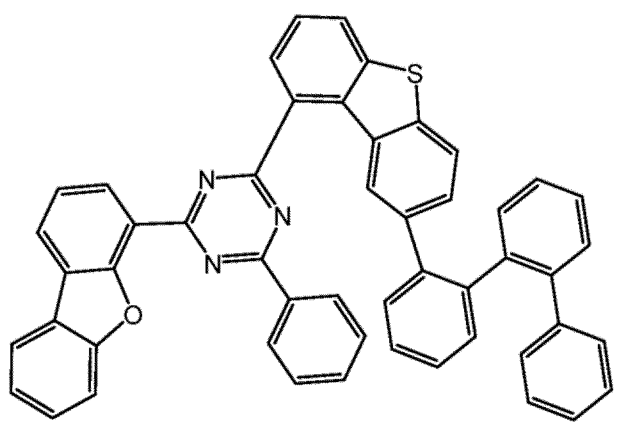
In Claim 10, at Column 807, the three compounds shown at Lines 21-65 should be deleted.
In Claim 10, at Column 808, the compound shown at Lines 2-17 should be deleted.